US012378468B2

(12) United States Patent
Hwang et al.

(10) Patent No.: US 12,378,468 B2
(45) **Date of Patent: *Aug. 5, 2025**

(54) ORGANOMETALLIC COMPOUND, ORGANIC LIGHT-EMITTING DEVICE INCLUDING THE SAME AND ELECTRONIC APPARATUS INCLUDING THE ORGANIC LIGHT-EMITTING DEVICE

(71) Applicant: Samsung Electronics Co., Ltd., Suwon-si (KR)

(72) Inventors: Kyuyoung Hwang, Anyang-si (KR); Byungjoon Kang, Seoul (KR); Seungyeon Kwak, Suwon-si (KR); Kum Hee Lee, Suwon-si (KR); Aram Jeon, Seoul (KR); Sukekazu Aratani, Hwaseong-si (KR); Banglin Lee, Suwon-si (KR); Kyuhyun Im, Seongnam-si (KR); Byoungki Choi, Hwaseong-si (KR); Yasushi Koishikawa, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/417,270

(22) Filed: Jan. 19, 2024

(65) Prior Publication Data

US 2024/0215433 A1 Jun. 27, 2024

Related U.S. Application Data

(63) Continuation of application No. 18/311,654, filed on May 3, 2023, now Pat. No. 12,069,940, which is a continuation of application No. 17/016,806, filed on Sep. 10, 2020, now Pat. No. 12,010,909.

(30) Foreign Application Priority Data

Sep. 11, 2019 (KR) ........................ 10-2019-0113025
Sep. 8, 2020 (KR) ........................ 10-2020-0114307

(51) Int. Cl.

| | |
|---|---|
| ***C07F 15/00*** | (2006.01) |
| ***C09K 11/02*** | (2006.01) |
| ***C09K 11/06*** | (2006.01) |
| ***H10K 85/30*** | (2023.01) |
| *H10K 50/11* | (2023.01) |
| *H10K 50/15* | (2023.01) |
| *H10K 50/16* | (2023.01) |
| *H10K 50/17* | (2023.01) |
| *H10K 50/18* | (2023.01) |
| *H10K 101/10* | (2023.01) |

(52) U.S. Cl.

CPC .......... *C09K 11/02* (2013.01); *C07F 15/0033* (2013.01); *C09K 11/06* (2013.01); *H10K 85/342* (2023.02); *C09K 2211/1007* (2013.01); *C09K 2211/1029* (2013.01); *C09K 2211/1044* (2013.01); *C09K 2211/1088* (2013.01); *C09K 2211/185* (2013.01); *H10K 50/11* (2023.02); *H10K 50/15* (2023.02); *H10K 50/16* (2023.02); *H10K 50/17* (2023.02); *H10K 50/171* (2023.02); *H10K 50/18* (2023.02); *H10K 2101/10* (2023.02)

(58) Field of Classification Search

None

See application file for complete search history.

(56) References Cited

U.S. PATENT DOCUMENTS

| | | | | |
|---|---|---|---|---|
| 7,429,426 | B2 | 9/2008 | Brown et al. | |
| 8,431,243 | B2 | 4/2013 | Kwong et al. | |
| 10,135,009 | B2 | 11/2018 | Hwang et al. | |
| 12,010,909 | B2 * | 6/2024 | Hwang | H10K 85/342 |
| 12,069,940 | B2 * | 8/2024 | Hwang | C09K 11/06 |
| 2013/0181190 | A1 | 7/2013 | Ma et al. | |
| 2013/0334521 | A1 | 12/2013 | Lee et al. | |
| 2014/0008617 | A1 | 1/2014 | Beers et al. | |
| 2015/0021585 | A1 | 1/2015 | Yu et al. | |
| 2015/0090974 | A1 | 4/2015 | Kim et al. | |
| 2015/0179959 | A1 | 6/2015 | Lin et al. | |
| 2016/0093814 | A1 | 3/2016 | Hwang et al. | |
| 2016/0111663 | A1 | 4/2016 | Kim et al. | |
| 2016/0111665 | A1 | 4/2016 | Kim et al. | |
| 2016/0118604 | A1 | 4/2016 | Choi et al. | |
| 2016/0155962 | A1 | 6/2016 | Hwang et al. | |
| 2016/0155963 | A1 | 6/2016 | Hwang et al. | |
| 2016/0164012 | A1 | 6/2016 | Lee et al. | |

(Continued)

FOREIGN PATENT DOCUMENTS

| | | | |
|---|---|---|---|
| CN | 106432345 | A | 2/2017 |
| CN | 107098938 | A | 8/2017 |

(Continued)

OTHER PUBLICATIONS

English Abstract of KR 10-2018-0020878.

(Continued)

*Primary Examiner* — Robert S Loewe

(74) *Attorney, Agent, or Firm* — CANTOR COLBURN LLP

(57) ABSTRACT

Provided are an organometallic compound represented by Formula 1, an organic light-emitting device including the same and an electronic apparatus including the organic light-emitting device:

$$M(L_1)_{n1}(L_2)_{n2} \quad \text{<Formula 1>}$$

wherein M, $L_1$, $L_2$, n1, and n2 in Formula 1 are the same as described in the detailed description.

20 Claims, 1 Drawing Sheet

(56) References Cited

U.S. PATENT DOCUMENTS

| | | | |
|---|---|---|---|
| 2016/0181530 | A1 | 6/2016 | Choi et al. |
| 2016/0268519 | A1 | 9/2016 | Choi et al. |
| 2016/0268521 | A1 | 9/2016 | Lee et al. |
| 2016/0268522 | A1 | 9/2016 | Hwang et al. |
| 2017/0054095 | A1 | 2/2017 | Choi et al. |
| 2017/0288157 | A1 | 10/2017 | Joseph |
| 2017/0346025 | A1 | 11/2017 | Hwang et al. |
| 2018/0013077 | A1 | 1/2018 | Boudreault et al. |
| 2018/0013078 | A1 | 1/2018 | Lee et al. |
| 2018/0097185 | A1 | 4/2018 | Su et al. |
| 2018/0114928 | A1 | 4/2018 | Lee et al. |
| 2018/0309070 | A1 | 10/2018 | Lee et al. |
| 2019/0074457 | A1 | 3/2019 | Choi et al. |
| 2019/0189934 | A1 | 6/2019 | Liou et al. |
| 2020/0161563 | A1 | 5/2020 | Jang et al. |
| 2020/0212323 | A1 | 7/2020 | Hwang et al. |
| 2020/0259107 | A1 | 8/2020 | Xia et al. |
| 2020/0287144 | A1 | 9/2020 | Hwang et al. |
| 2020/0358012 | A1 | 11/2020 | Lee et al. |
| 2021/0054010 | A1 | 2/2021 | Tsai et al. |
| 2021/0083207 | A1 | 3/2021 | Lee et al. |
| 2021/0179649 | A1 | 6/2021 | Liou et al. |
| 2022/0140259 | A1 | 5/2022 | Tsai et al. |
| 2022/0177492 | A1 | 6/2022 | Fleetham et al. |
| 2022/0181561 | A1 | 6/2022 | Fleetham et al. |
| 2022/0190259 | A1 | 6/2022 | Park et al. |
| 2022/0298191 | A1 | 9/2022 | Lee et al. |
| 2022/0344600 | A1 | 10/2022 | Lee et al. |
| 2022/0399517 | A1 | 12/2022 | Fleetham et al. |
| 2022/0402952 | A1 | 12/2022 | Kwak et al. |
| 2023/0128713 | A1 | 4/2023 | Lee et al. |

FOREIGN PATENT DOCUMENTS

| | | | |
|---|---|---|---|
| CN | 107573383 | A | 1/2018 |
| CN | 109422778 | A | 3/2019 |
| CN | 109928996 | A | 6/2019 |
| EP | 2465912 | A1 | 6/2012 |
| EP | 3010067 | A | 4/2016 |
| EP | 3010068 | A1 | 4/2016 |
| EP | 3904363 | A1 | 11/2021 |
| KR | 20120114030 | A | 10/2012 |
| KR | 20130084615 | A | 7/2013 |
| KR | 20160046296 | A | 4/2016 |
| KR | 1020160037007 | A | 4/2016 |
| KR | 1020160064955 | A | 6/2016 |
| KR | 20160109909 | A | 9/2016 |
| KR | 1020160109907 | A | 9/2016 |
| KR | 1020160109908 | A | 9/2016 |
| KR | 1020180020878 | A | 2/2018 |
| WO | 2014007565 | A1 | 1/2014 |

OTHER PUBLICATIONS

English Translation of Office Action dated Jun. 21, 2023, issued in corresponding KR Patent Application No. 10-2020-0114307, 6 pp.
English Translation of Office Action dated Nov. 29, 2023, issued in corresponding CN Patent Application No. 202010950227.8, 8 pp.
Extended European Search Report dated Jan. 14, 2021, issued in EP Patent Application No. 20195031.8.
Office Action dated Aug. 29, 2022 issued in corresponding EP Patent Application No. 20195031.8, 11 pp.
Office Action dated Jun. 21, 2023, issued in corresponding KR Patent Application No. 10-2020-0114307, 7 pp.
Office Action dated Nov. 29, 2023, issued in corresponding CN Patent Application No. 202010950227.8, 7 pp.
English Translation of Office Action dated Dec. 20, 2024, issued in corresponding KR Patent Application No. 10-2024-0000485, 4 pp.
English Translation of Office Action dated Dec. 20, 2024, issued in corresponding KR Patent Application No. 10-2024-0000486, 5 pp.
Office Action dated Dec. 20, 2024, issued in corresponding KR Patent Application No. 10-2024-0000486, 5 pp.
Office Action dated Dec. 20, 2024, issued in corresponding KR Patent Application No. 10-2024-0000485, 6 pp.

* cited by examiner

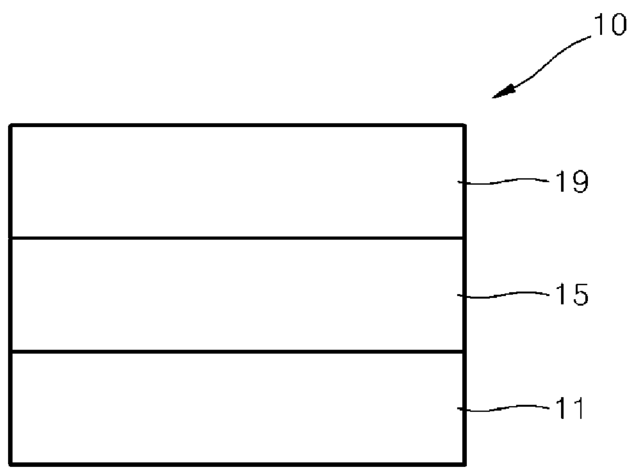
10
19
15
11

ORGANOMETALLIC COMPOUND, ORGANIC LIGHT-EMITTING DEVICE INCLUDING THE SAME AND ELECTRONIC APPARATUS INCLUDING THE ORGANIC LIGHT-EMITTING DEVICE

CROSS-REFERENCE TO RELATED APPLICATION

This is a continuation application of U.S. application Ser. No. 18/311,654, filed May 3, 2023, which is a continuation application of U.S. application Ser. No. 17/106,806, filed Sep. 10, 2020, which claims priority to and the benefit of Korean Patent Application Nos. 10-2019-0113025, filed on Sep. 11, 2019 and 10-2020-0114307, filed on Sep. 8, 2020, in the Korean Intellectual Property Office, the contents of which are incorporated herein in their entirety by reference.

BACKGROUND

1. Field

One or more embodiments relate to an organometallic compound, an organic light-emitting device including the same and an electronic apparatus including the organic light-emitting device.

2. Description of Related Art

Organic light-emitting devices are self-emission devices, which have improved characteristics in terms of viewing angle, response time, brightness, driving voltage, and response speed, and produce full-color images.

In an example, an organic light-emitting device includes an anode, a cathode, and an organic layer between the anode and the cathode, wherein the organic layer includes an emission layer. A hole transport region may be between the anode and the emission layer, and an electron transport region may be between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transition from an excited state to a ground state, thereby generating light.

SUMMARY

Provided are novel organometallic compounds, organic light-emitting devices using the same and an electronic apparatus including the organic light-emitting device.

Additional aspects will be set forth in part in the description which follows and, in part, will be apparent from the description, or may be learned by practice of the presented embodiments of the disclosure.

According to one aspect, an organometallic compound represented by Formula 1 is provided:

$$M(L_1)_{n1}(L_2)_{n2}$$ <Formula 1> wherein, in Formula 1,

M is a transition metal, $L_1$ is a ligand represented by Formula 2 below, $L_2$ is a ligand represented by Formula 3 below, n1 and n2 are each independently 1 or 2, wherein when n1 is 2, two $L_1$(s) may be identical to or different from each other, and when n2 is 2, two $L_2$(s) may be identical to or different from each other, <Formula 2>

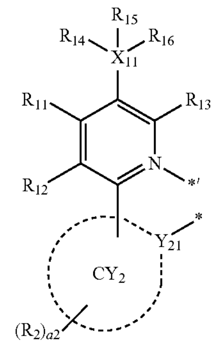

<Formula 3>

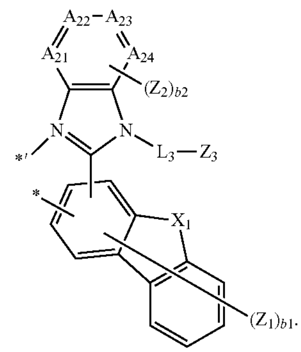

In Formulae 2 and 3, $Y_{21}$ is C or N, ring $CY_2$ is a $C_5$-$C_{30}$ carbocyclic group or a $C_1$-$C_{30}$ heterocyclic group, $X_{11}$ is Si or Ge, $X_1$ is O, S, Se, $N(Z_{19})$, $C(Z_{19})(Z_{20})$, or $Si(Z_{19})(Z_{20})$, $A_{21}$ to $A_{24}$ are each independently C or N, $L_3$ is a single bond, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, $R_2$, $R_{11}$ to $R_{16}$, $Z_1$ to $Z_3$, $Z_{19}$, and $Z_{20}$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—N(Q_1)(Q_2)$, $—Si(Q_3)(Q_4)(Q_5)$, $—Ge(Q_3)(Q_4)(Q_5)$, $—B(Q_6)(Q_7)$, $—P(═O)(Q_8)(Q_9)$, or $P(Q_8)(Q_9)$, a2 is an integer from 0 to 20, and when a2 is 2 or more, two or more $R_2$(s) are identical to or different from each other, b1 is an integer from 0 to 6, and when b1 is 2 or more, two or more $Z_1$ (s) are identical to or different from each other, b2 is an integer from 0 to 4, and when b2 is 2 or more, two or more $Z_2$(s) are identical to or different from each other, $R_{11}$ and $R_{12}$ are optionally linked to each other to form a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, two or more of a plurality of $R_2$(s) are optionally be linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two or more of a plurality of $Z_1$(s) are optionally linked to each other to form a plurality of $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, two or more of a plurality of $Z_2$(s) are optionally be linked to each other to form a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, $R_{10a}$ is the same as explained in connection with $Z_1$,

* and *' each indicate a binding site to M in Formula 1, a substituent of the substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_1$-$C_{60}$ alkylthio group, substituted $C_3$-$C_{10}$ cycloalkyl group, substituted $C_1$-$C_1$a heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group and substituted monovalent non-aromatic condensed heteropolycyclic group is: deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—Ge(Q_{13})(Q_{14})(Q_{15})$, $—B(Q_{16})(Q_{17})$, $—P(═O)(Q_{18})(Q_{19})$, $—P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—Ge(Q_{23})(Q_{24})(Q_{25})$, $—B(Q_{26})(Q_{27})$, $—P(═O)(Q_{28})(Q_{29})$, $P(Q_{28})(Q_{29})$, or any combination thereof;

$—N(Q_{31})(Q_{32})$, $—Si(Q_{33})(Q_{34})(Q_{35})$, $—Ge(Q_{33})(Q_{34})(Q_{35})$, $—B(Q_{36})(Q_{37})$, $—P(═O)(Q_{38})(Q_{39})$, or $—P(Q_{38})(Q_{39})$; or any combination thereof, wherein $Q_1$ to $Q_9$, $Q_{11}$ to $Q_{19}$, $Q_{21}$ to $Q_{29}$, and $Q_{31}$ to $Q_{39}$ are each independently: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group, unsubstituted or substituted with deuterium, —F, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group, unsubstituted or substituted with deuterium, —F, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

Another aspect provides an organic light-emitting device including a first electrode; a second electrode; and an organic layer including an emission layer between the first electrode and the second electrode, wherein the organic layer includes at least one of the organometallic compound.

The organometallic compound may be included in an emission layer, and the organometallic compound included in the emission layer may act as a dopant.

Another aspect provides an electronic apparatus including the organic light-emitting device.

BRIEF DESCRIPTION OF THE DRAWING

The above and other aspects, features, and advantages of certain embodiments of the disclosure will be more apparent from the following description taken in conjunction with FIGURE which shows a schematic cross-sectional view of an organic light-emitting device according to an embodiment.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the FIGURES. It will be understood that relative terms are intended to encompass different orientations of the device in addition to the orientation depicted in the FIGURES. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

DETAILED DESCRIPTION

An organometallic compound according to an embodiment is represented by Formula 1 below:

$$M(L_1)_{n1}(L_2)_{n2}$$ <Formula 1>

M in Formula 1 may be a transition metal.

For example, M may be a Period 1 transition metal, a Period 2 transition metal, or a Period 3 transition metal.

In one or more embodiments, M may be iridium (Ir), platinum (Pt), osmium (Os), titanium (Ti), zirconium (Zr), hafnium (Hf), europium (Eu), terbium (Tb), thulium (Tm), or rhodium (Rh).

In one or more embodiments, M may be Ir, Pt, Os, or Rh.

$L_1$ in Formula 1 may be a ligand represented by Formula 2 and $L_2$ in Formula 1 may be a ligand represented by Formula 3:

<Formula 2>

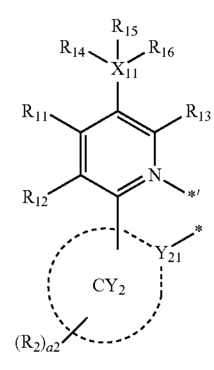

-continued

<Formula 3>

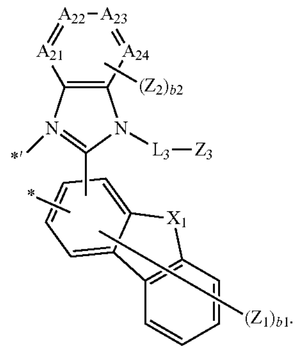

Formulae 2 and 3 are the same as described above.

$L_1$ and $L_2$ in Formula 1 may be different from each other.

n1 and n2 in Formula 1 indicate the number of $L_1$ and $L_2$, and may each independently be 1 or 2. When n1 is 2, two $L_1$(s) may be identical to or different from each other, and when n2 is 2, two $L_2$(s) may be identical to or different from each other.

For example, in Formula 1, i) n1 may be 2 and n2 may be 1; or ii) n1 may be 1 and n2 may be 2.

In one or more embodiments, in Formula 1, i) M may be Ir or Os and n1+n2 may be 3 or 4, or ii) M may be Pt and n1+n2 may be 2.

$Y_{21}$ in Formula 2 may be C or N.

For example, $Y_{21}$ may be C.

Ring $CY_2$ in Formula 2 may be a $C_5$-$C_{30}$ carbocyclic group or a $C_1$-$C_{30}$ heterocyclic group.

For example, ring $CY_2$ may be i) a first ring, ii) a second ring, iii) a condensed cyclic group in which two or more first rings are condensed with each other, iv) a condensed cyclic group in which two or more second rings are condensed with each other, or v) a condensed cyclic group in which at least one first ring is condensed with at least one second ring, the first ring may be a cyclopentane group, a cyclopentadiene group, a furan group, a thiophene group, a pyrrole group, a silole group, a germole group, a borole group, a selenophene group, a phosphole group, an oxazole group, an oxadiazole group, an oxatriazole group, a thiazole group, a thiadiazole group, a thiatriazole group, a pyrazole group, an imidazole group, a triazole group, a tetrazole group, an azasilole group, an azagermole group, an azaborole group, an azaselenophene group, or an azaphosphole group, and the second ring may be an adamantane group, a norbornane group (a bicyclo[2.2.1]heptane group), a norbornene group, a bicyclo[1.1.1]pentane group, a bicyclo[2.1.1]hexane group, a bicyclo[2.2.2]octane group, a cyclohexane group, a cyclohexene group, a benzene group, a pyridine group, a pyrimidine group, a pyrazine group, a pyridazine group, or a triazine group.

In one or more embodiments, ring $CY_2$ may be a cyclopentene group, a cyclohexane group, a cyclohexene group, a benzene group, a naphthalene group, an anthracene group, a phenanthrene group, a triphenylene group, a pyrene group, a chrysene group, cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group.

In one or more embodiments, ring $CY_2$ may be a benzene group, a naphthalene group, an anthracene group, a phenanthrene group, a 1,2,3,4-tetrahydronaphthalene group, an indole group, a carbazole group, a fluorene group, a dibenzosilole group, a dibenzothiophene group, a dibenzofuran group, an azabenzosilole group, a pyridine group, a benzimidazole group, a benzoxazole group, or a benzothiazole group.

In one or more embodiments, ring $CY_2$ may be a benzene group, a naphthalene group, an anthracene group, a phenanthrene group, a 1,2,3,4-tetrahydronaphthalene group, a carbazole group, a fluorene group, a dibenzosilole group, a dibenzothiophene group, or a dibenzofuran group.

$X_{11}$ in Formula 2 may be Si or Ge.

$X_1$ in Formula 3 may be O, S, Se, $N(Z_{19})$, $C(Z_{19})(Z_{20})$, or $Si(Z_{19})(Z_{20})$. $Z_{19}$ and $Z_{20}$ are the same as described above.

For example, $X_1$ may be O, S, or $N(Z_{19})$.

$A_{21}$ to $A_{24}$ in Formula 3 may each independently be C or N.

In one or more embodiments, $A_{21}$ to $A_{24}$ may each be C.

In one or more embodiments, at least one of $A_{21}$ to $A_{24}$ may be N.

In one or more embodiments, one of $A_{21}$ to $A_{24}$ may be N.

$L_3$ in Formula 3 may be a single bond, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$.

For example, $L_3$ may be:

a single bond; or a benzene group, a naphthalene group, an anthracene group, a phenanthrene group, a triphenylene group, a pyrene group, a chrysene group, cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, or a benzothiadiazole group, each unsubstituted or substituted with at least one $R_{10a}$.

In one or more embodiments, $L_3$ in Formula 1 may be:

a single bond; or a benzene group unsubstituted or substituted at least one $R_{10a}$.

In one or more embodiments, $L_3$ in Formula 1 may be:

a single bond; or a benzene group, a naphthalene group, a dibenzofuran group, or a dibenzothiophene group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated phenyl group, a fluorinated phenyl group, a ($C_1$-$C_{20}$ alkyl) phenyl group, a naphthyl group, a pyridinyl group, a furanyl group, a thiophenyl group, a benzofuranyl group, a benzothiophenyl group, a dibenzofuranyl group, a dibenzothiophenyl group, or any combination thereof.

$R_2$, $R_{11}$ to $R_{16}$, $Z_1$ to $Z_3$, $Z_{19}$, and $Z_{20}$ in Formulae 2 and 3 may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$), or —P($Q_8$)($Q_9$). $Q_1$ to $Q_9$ are the same as described above.

In one or more embodiments, $R_2$, $R_{11}$ to $R_{16}$, $Z_1$ to $Z_3$, $Z_{19}$, and $Z_{20}$ in Formulae 2 and 3 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_1$-$C_{20}$ alkyl group, a cyclopentyl group, a cyclohexyl group, a cycloheptyl group, a cyclooctyl group, an adamantanyl group, a norbornanyl group (a bicyclo[2.2.1]heptyl group), a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl) cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2] octyl group, a phenyl group, a ($C_1$-$C_{20}$ alkyl)phenyl group, a biphenyl group, a terphenyl group, a naphthyl group, a 1,2,3,4-tetrahydronaphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1] hexyl group, a bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo [2.1.1]hexyl group, a bicyclo[2.2.2]octyl group, a ($C_1$-$C_{20}$ alkyl)cyclopentyl group, a ($C_1$-$C_{20}$ alkyl) cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2] octyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, —Si($Q_{33}$)($Q_{34}$)($Q_{35}$), —Ge($Q_{33}$)($Q_{34}$)($Q_{35}$), or any combination thereof; or —N($Q_1$)($Q_2$), —Si($Q_3$)($Q_4$)($Q_5$), —Ge($Q_3$)($Q_4$)($Q_5$), —B($Q_6$)($Q_7$), —P(═O)($Q_8$)($Q_9$), or —P($Q_8$)($Q_9$), wherein $Q_1$ to $Q_9$ and $Q_{33}$ to $Q_{35}$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, 3-pentyl group, a sec-isopentyl group, a phenyl group, a biphenyl group, or a naphthyl group, each unsubstituted or substituted with deuterium, a $C_1$-$C_{20}$ alkyl group, a phenyl group, or any combination thereof.

In one or more embodiments, $R_2$, $R_{11}$ to $R_{13}$, $Z_1$ to $Z_3$, $Z_{19}$ and $Z_{20}$ in Formulae 2 and 3 may each independently be:

hydrogen, deuterium, —F, or a cyano group; or a $C_1$-$C_{20}$ alkyl group, a $C_3$-$C_{10}$ cycloalkyl group, a phenyl group, a naphthyl group, a pyridinyl group, a furanyl group, a thiophenyl group, a benzofuranyl group, a benzothiophenyl group, a dibenzofuranyl group, or a dibenzothiophenyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated phenyl group, a fluorinated phenyl group, a ($C_1$-$C_{20}$ alkyl) phenyl group, a naphthyl group, a pyridinyl group, a furanyl group, a thiophenyl group, a benzofuranyl group, a benzothiophenyl group, a dibenzofuranyl group, a dibenzothiophenyl group, —Si($Q_{33}$)($Q_{34}$)($Q_{35}$), —Ge($Q_{33}$)($Q_{34}$)($Q_{35}$), or any combination thereof.

In one or more embodiments, $R_{14}$ to $R_{16}$ in Formula 2 may each independently be a $C_1$-$C_{20}$ alkyl group, a $C_3$-$C_{10}$ cycloalkyl group, a phenyl group, a naphthyl group, a pyridinyl group, a furanyl group, a thiophenyl group, a benzofuranyl group, a benzothiophenyl group, a dibenzofuranyl group, or a dibenzothiophenyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated phenyl group, a fluorinated phenyl group, a ($C_1$-$C_{20}$ alkyl)phenyl group, a naphthyl group, a pyridinyl group, a furanyl group, a thiophenyl group, a benzofuranyl group, a benzothiophenyl group, a dibenzofuranyl group, a dibenzothiophenyl group, or any combination thereof.

In one or more embodiments, $R_{14}$ to $R_{16}$ in Formula 2 may each independently be —$CH_3$, —$CH_2CH_3$, —$CD_3$, —$CD_2H$, —$CDH_2$, —$CH_2CD_3$, or —$CD_2CH_3$.

In one or more embodiments, $R_{14}$ to $R_{16}$ in Formula 2 may be identical to or different from each other.

In one or more embodiments, $R_{11}$ in Formula 2 may not be hydrogen.

In one or more embodiments, $R_{11}$ in Formula 2 may not be hydrogen or a methyl group.

In one or more embodiments, $R_{11}$ in Formula 2 may not be hydrogen, a methyl group or a cyano group.

In one or more embodiments, in Formula 2, $R_{11}$ may not be hydrogen and $R_{12}$ and $R_{13}$ may be hydrogen.

In one or more embodiments, $R_{11}$ in Formula 2 may be a group including at least two carbons, at least three carbons or at least four carbons.

In one or more embodiments, $R_{11}$ in Formula 2 may be:

a methyl group, substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated phenyl group, a fluorinated phenyl group, a ($C_1$-$C_{20}$ alkyl)phenyl group, a naphthyl group, a pyridinyl group, a furanyl group, a thiophenyl group, a benzofuranyl group, a benzothiophenyl group, a dibenzofuranyl group, a dibenzothiophenyl group, or any combination thereof; or a $C_2$-$C_{20}$ alkyl group, a $C_3$-$C_{10}$ cycloalkyl group, a phenyl group, a naphthyl group, a pyridinyl group, a furanyl group, a thiophenyl group, a benzofuranyl group, a benzothiophenyl group, a dibenzofuranyl group, or a dibenzothiophenyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated phenyl group, a fluorinated phenyl group, a ($C_1$-$C_{20}$ alkyl)

phenyl group, a naphthyl group, a pyridinyl group, a furanyl group, a thiophenyl group, a benzofuranyl group, a benzothiophenyl group, a dibenzofuranyl group, a dibenzothiophenyl group, or any combination thereof.

In one or more embodiments, $Z_3$ may in Formula 3 be a $C_6$-$C_{20}$ aryl group substituted with at least one $C_1$-$C_{20}$ alkyl group and at least one $C_6$-$C_{20}$ aryl group at the same time.

In one or more embodiments, Formula 3 may satisfy at least one of <Condition A> and <Condition B>:

<Condition A>

$L_3$ is a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$;

<Condition B>

$Z_3$ is a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

In some embodiments, $R_2$, $R_{11}$ to $R_{16}$, $Z_1$ to $Z_3$, $Z_{19}$ and $Z_{20}$ in Formulae 2 and 3 may each independently be hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, —$OCH_3$, —$OCDH_2$, —$OCD_2H$, —$OCD_3$, —$SCH_3$, —$SCDH_2$, —$SCD_2H$, —$SCD_3$, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-230, a group represented by one of Formulae 9-201 to 9-230 in which at least one hydrogen is substituted with deuterium, a group represented by one of Formulae 9-201 to 9-230 in which at least one hydrogen is substituted with —F, a group represented by one of Formulae 10-1 to 10-145, a group represented by one of Formulae 10-1 to 10-145 in which at least one hydrogen is substituted with deuterium, a group represented by one of Formulae 10-1 to 10-145 in which at least one hydrogen is substituted with —F, a group represented by one of Formulae 10-201 to 10-354, a group represented by one of Formulae 10-201 to 10-354 in which at least one hydrogen is substituted with deuterium, a group represented by one of Formulae 10-201 to 10-354 in which at least one hydrogen is substituted with —F, —$Si(Q_3)(Q_4)(Q_5)$, or —$Ge(Q_3)(Q_4)(Q_5)$, wherein $Q_3$ to $Q_5$ may respectively be understood by referring to the descriptions of $Q_3$ to $Q_5$ provided herein.

In some embodiments, $R_{11}$ in Formula 2 may be a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-230, a group represented by one of Formulae 9-201 to 9-230 in which at least one hydrogen is substituted with deuterium, a group represented by one of Formulae 9-201 to 9-230 in which at least one hydrogen is substituted with —F, a group represented by one of Formulae 10-1 to 10-145, a group represented by one of Formulae 10-1 to 10-145 in which at least one hydrogen is substituted with deuterium, a group represented by one of Formulae 10-1 to 10-145 in which at least one hydrogen is substituted with —F, a group represented by one of Formulae 10-201 to 10-354, a group represented by one of Formulae 10-201 to 10-354 in which at least one hydrogen is substituted with deuterium, or a group represented by one of Formulae 10-201 to 10-354 in which at least one hydrogen is substituted with —F.

In some embodiments, $Z_3$ in Formula 3 may be a group represented by one of Formulae 10-12 to 10-145, a group represented by one of Formulae 10-12 to 10-145 in which at least one hydrogen is substituted with deuterium, a group represented by one of Formulae 10-12 to 10-145 in which at least one hydrogen is substituted with —F, a group represented by one of Formulae 10-201 to 10-354, a group represented by one of Formulae 10-201 to 10-354 in which at least one hydrogen is substituted with deuterium, or a group represented by one of Formulae 10-201 to 10-354 in which at least one hydrogen is substituted with —F:

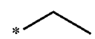
9-1

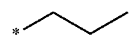
9-2

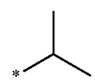
9-3

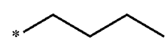
9-4

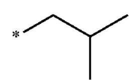
9-5

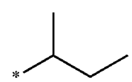
9-6

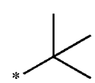
9-7

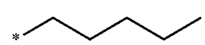
9-8

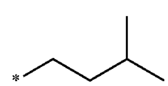
9-9

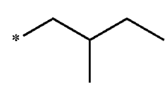
9-10

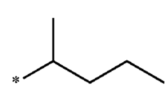
9-11

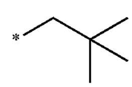
9-12

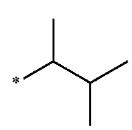
9-13

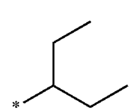
9-14

-continued
9-15
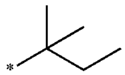
9-16
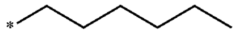
9-17
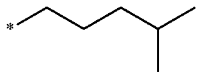
9-18
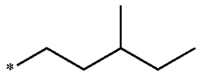
9-19
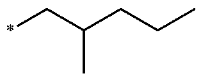
9-20
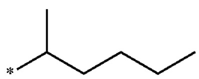
9-21
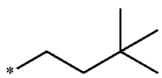
9-22
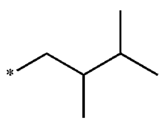
9-23
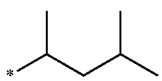
9-24
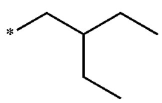
9-25
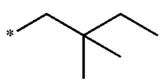
9-26
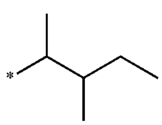
9-27
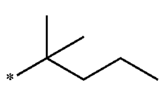
9-28
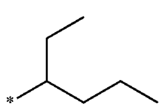
9-29
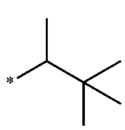
9-30
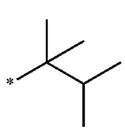
-continued
9-31
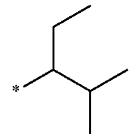
9-32
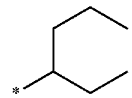
9-33
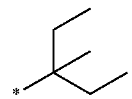
9-34
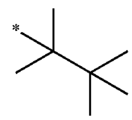
9-35
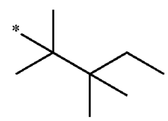
9-36
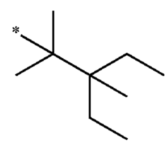
9-37
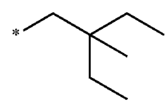
9-38
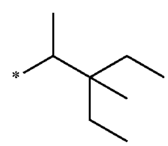
9-39
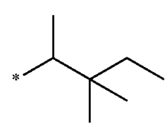
9-201
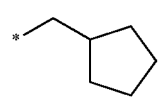
9-202
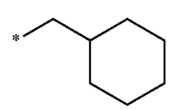
9-203
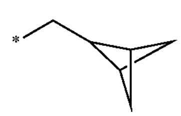

-continued
9-204
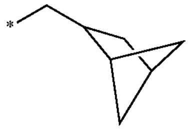
9-205
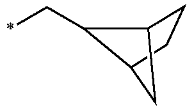
9-206
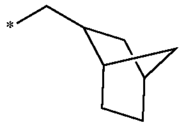
9-207
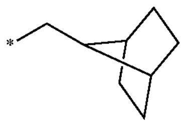
9-208
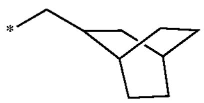
9-209
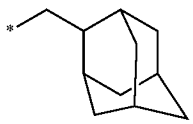
9-210
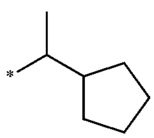
9-211
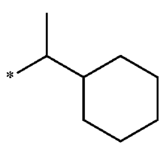
9-212
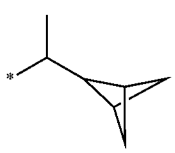
9-213
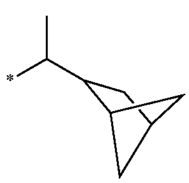
9-214
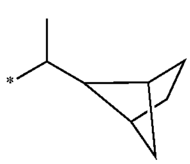
-continued
9-215
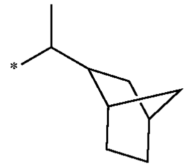
9-216
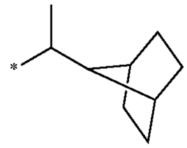
9-217
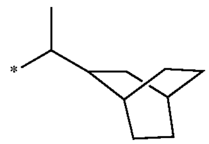
9-218
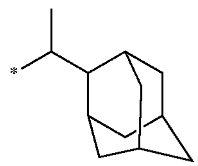
9-219
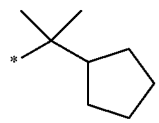
9-220
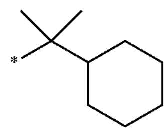
9-221
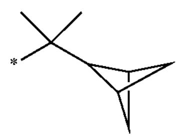
9-222
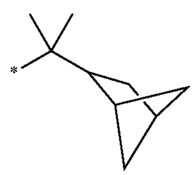
9-223
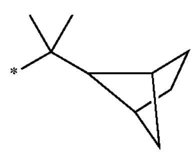
9-224
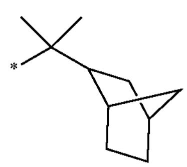

-continued
9-225
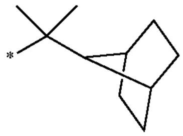
9-226
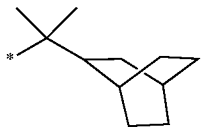
9-227
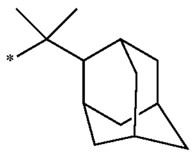
9-228
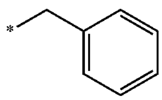
9-229
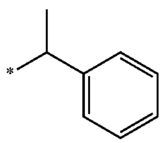
9-230
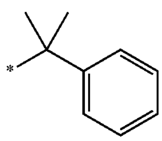
10-1
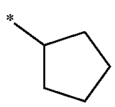
10-2
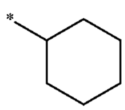
10-3
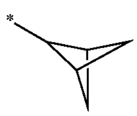
10-4
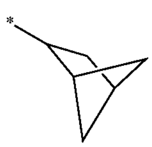
10-5
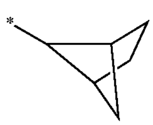
10-6
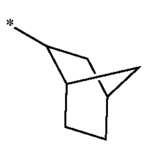
-continued
10-7
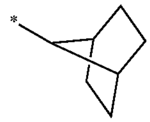
10-8
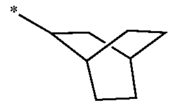
10-9
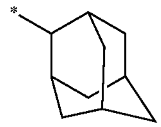
10-10
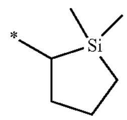
10-11
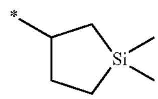
10-12
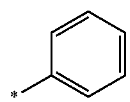
10-13
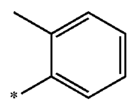
10-14
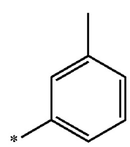
10-15
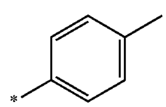
10-16
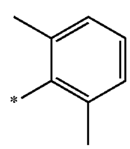
10-17
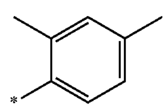
10-18
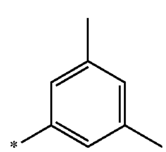

-continued
10-19
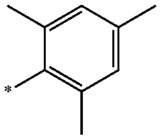
10-20
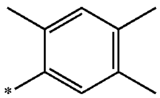
10-21
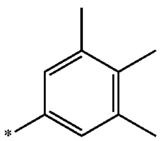
10-22
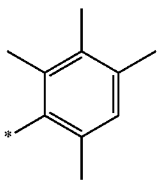
10-23
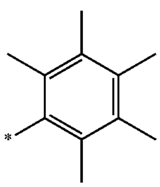
10-24
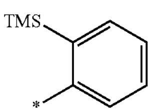
10-25
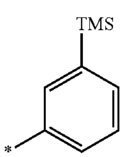
10-26
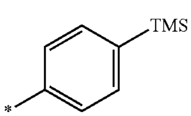
10-27
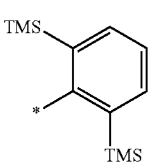
10-28
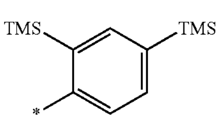
10-29
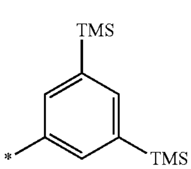
-continued
10-30
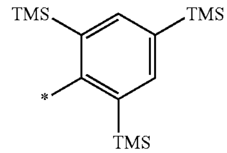
10-31
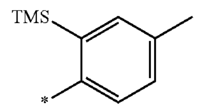
10-32
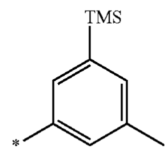
10-33
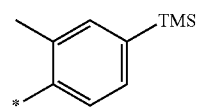
10-34
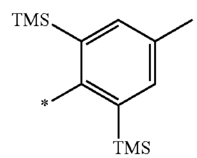
10-35
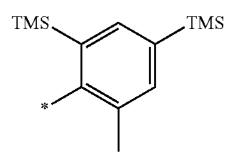
10-36
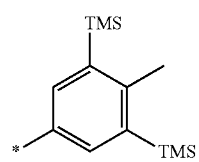
10-37
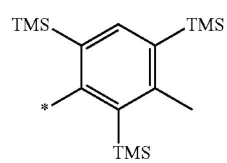
10-38
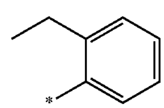
10-39
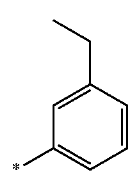
10-40
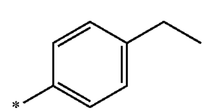

-continued
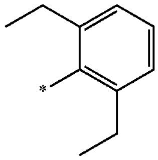
10-41
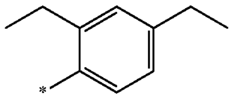
10-42
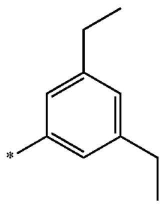
10-43
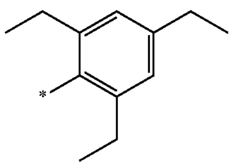
10-44
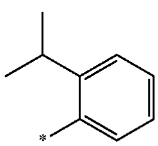
10-45
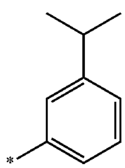
10-46
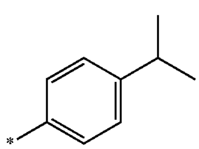
10-47
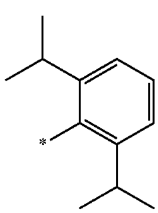
10-48
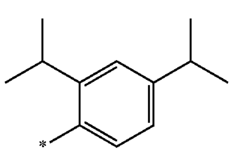
10-49
-continued
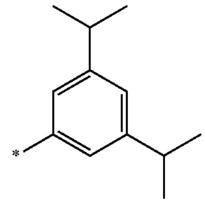
10-50
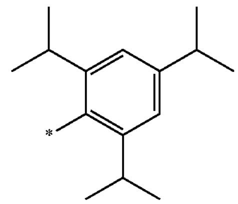
10-51
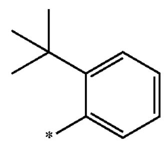
10-52
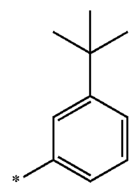
10-53
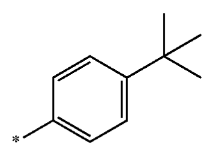
10-54
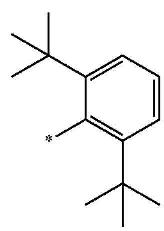
10-55
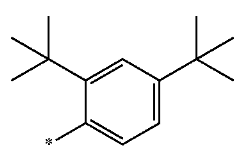
10-56
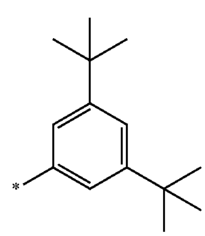
10-57

-continued
10-58
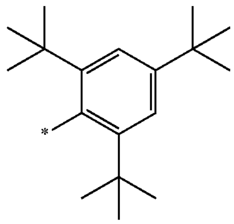
10-59
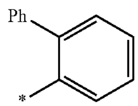
10-60
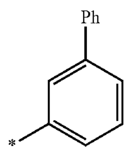
10-61
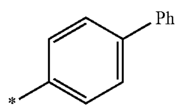
10-62
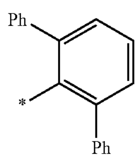
10-63
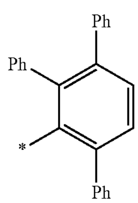
10-64
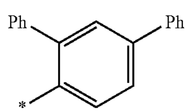
10-65
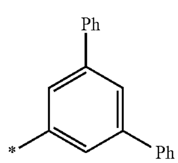
10-66
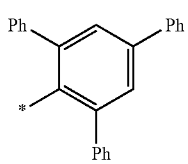
10-67
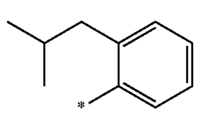
-continued
10-68
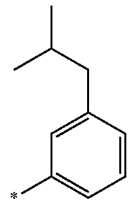
10-69
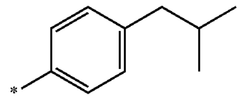
10-70
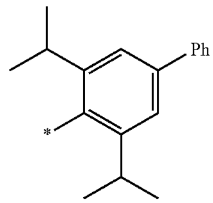
10-71
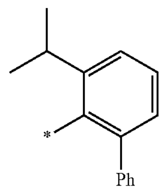
10-72
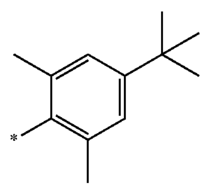
10-73
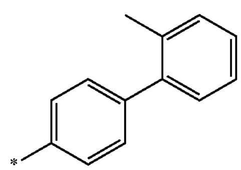
10-74
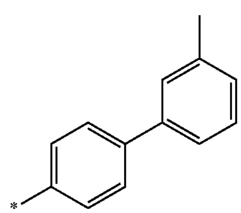
10-75
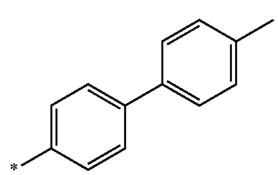

-continued
10-76
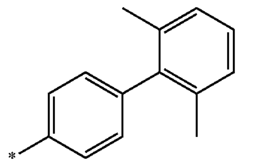
10-77
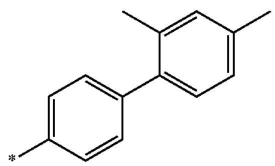
10-78
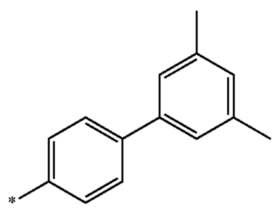
10-79
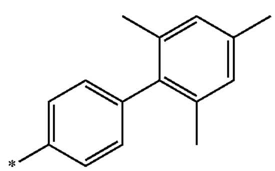
10-80
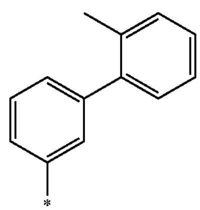
10-81
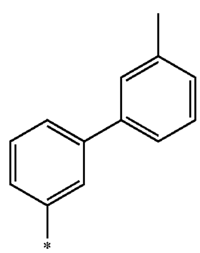
10-82
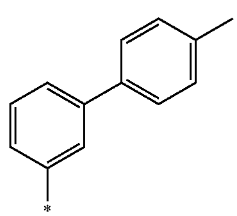
10-83
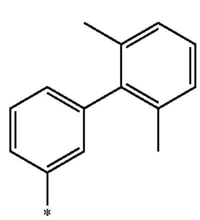
-continued
10-84
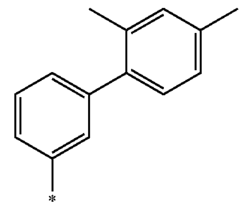
10-85
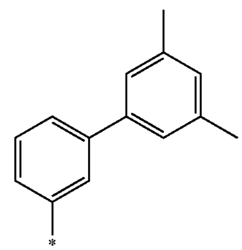
10-86
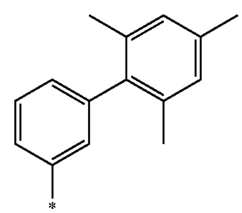
10-87
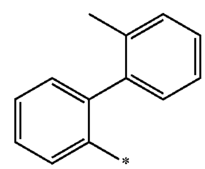
10-88
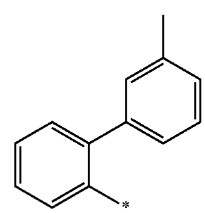
10-89
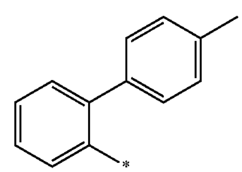
10-90
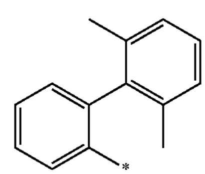
10-91
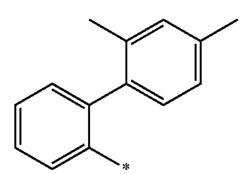

10-92
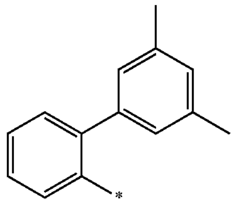
10-93
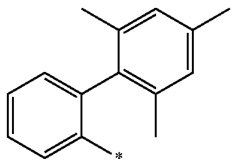
10-94
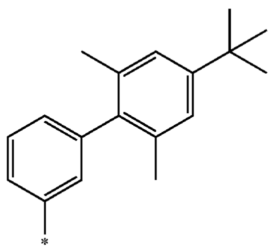
10-95
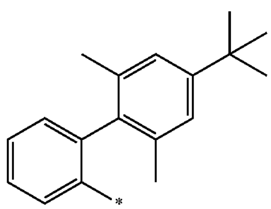
10-96
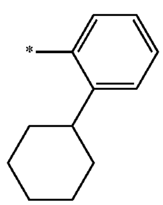
10-97
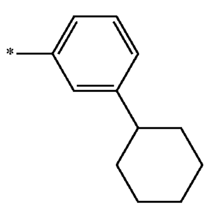
10-98
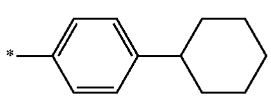
10-99
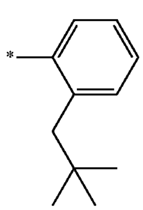
10-100
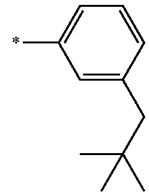
10-101
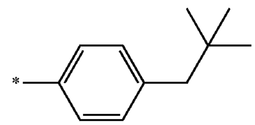
10-102
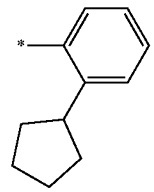
10-103
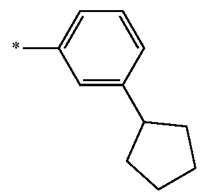
10-104
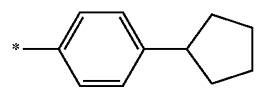
10-105
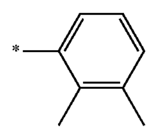
10-106
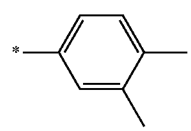
10-107
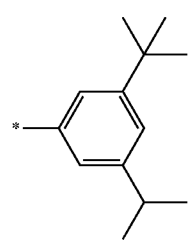
10-108
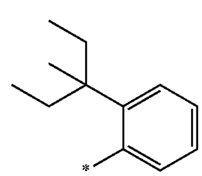

-continued
10-109
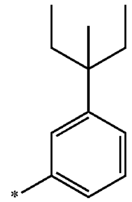
10-110
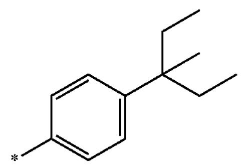
10-111
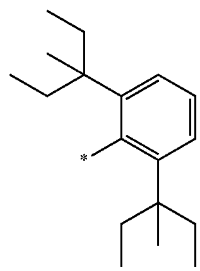
10-112
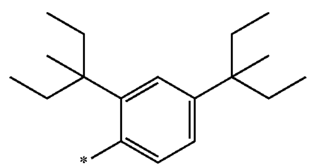
10-113
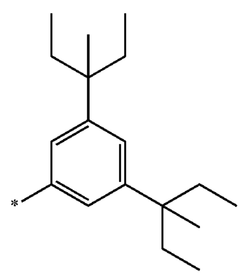
10-114
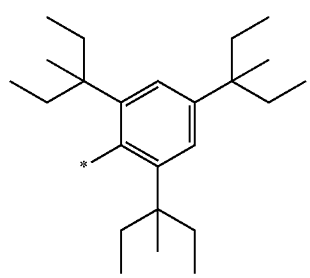
10-115
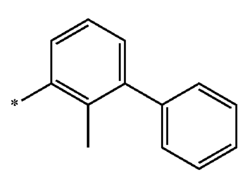
-continued
10-116
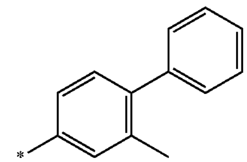
10-117
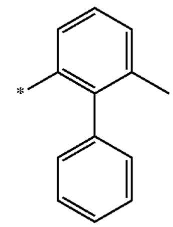
10-118
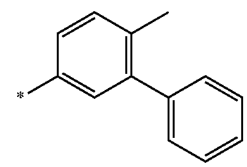
10-119
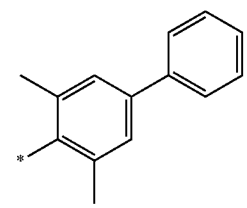
10-120
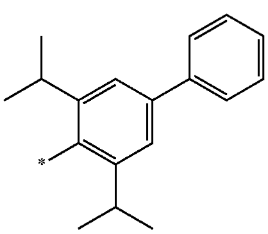
10-121
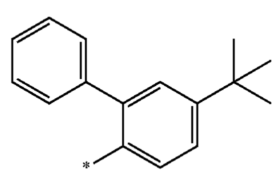
10-122
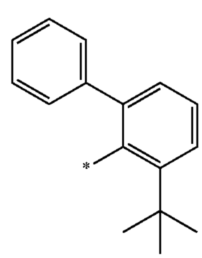

-continued
10-123
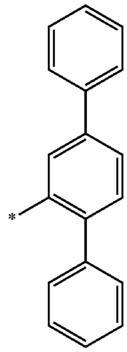
10-124
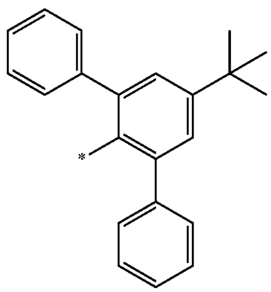
10-125
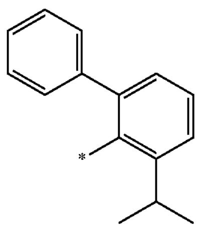
10-126
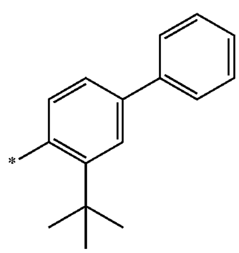
10-127
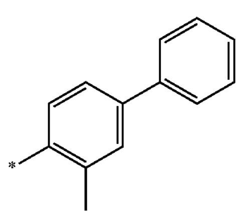
10-128
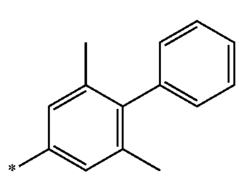
-continued
10-129
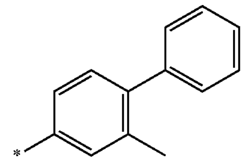
10-130
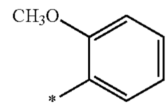
10-131
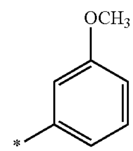
10-132
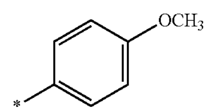
10-133
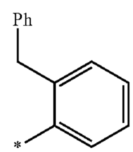
10-134
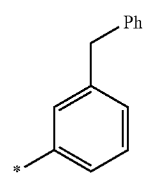
10-135
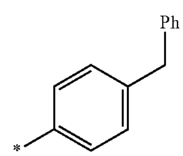
10-136
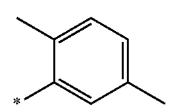
10-137
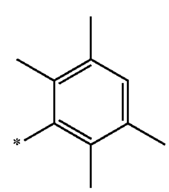
10-138
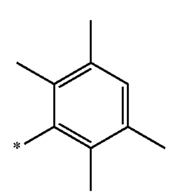

10-139
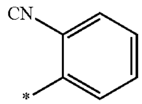
10-140
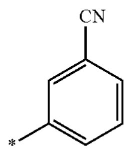
10-141
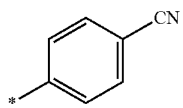
10-142
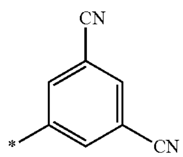
10-143
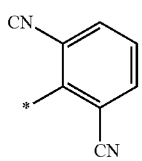
10-144
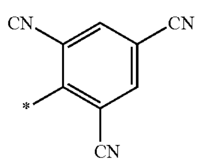
10-145
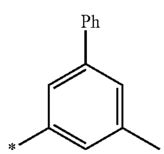
10-201
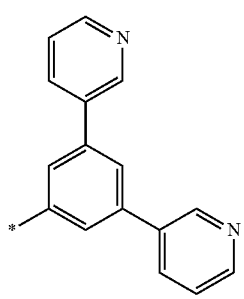
10-202
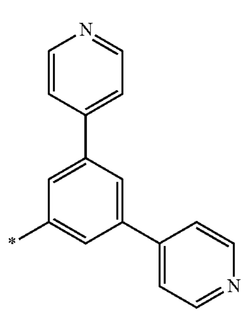
-continued
10-203
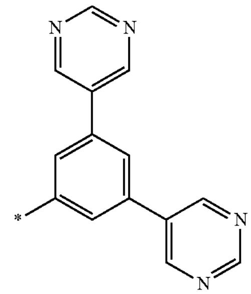
10-204
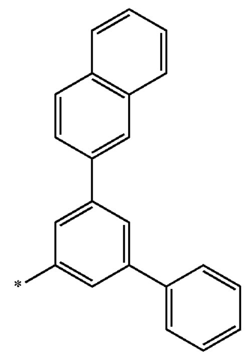
10-205
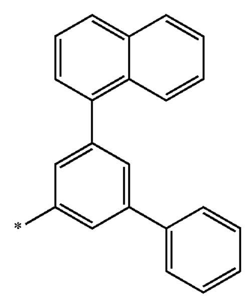
10-206
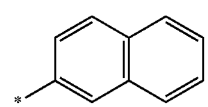
10-207
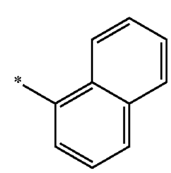
10-208
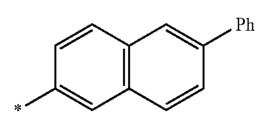
10-209
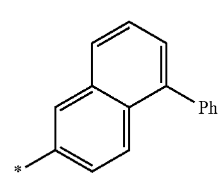

-continued
10-210
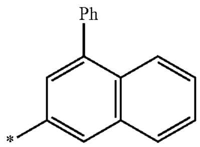
10-211
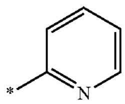
10-212
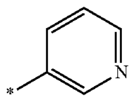
10-213
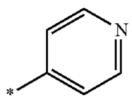
10-214
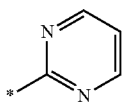
10-215
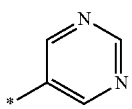
10-216
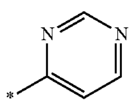
10-217
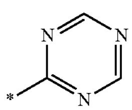
10-218
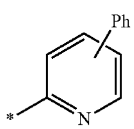
10-219
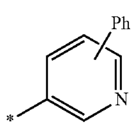
10-220
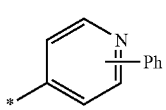
10-221
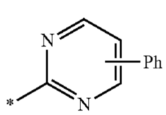
10-222
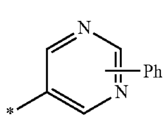
-continued
10-223
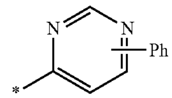
10-224
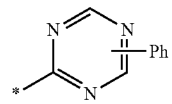
10-225
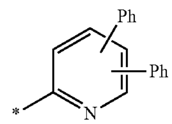
10-226
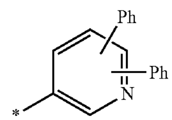
10-227
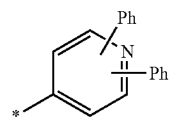
10-228
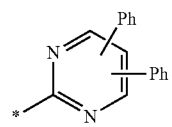
10-229
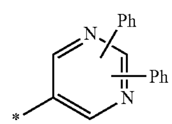
10-230
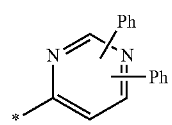
10-231
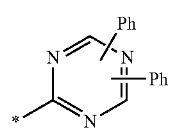
10-232
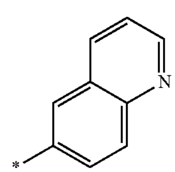
10-233
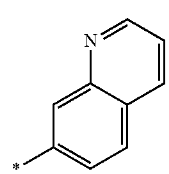

-continued
10-234
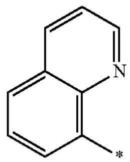
10-235
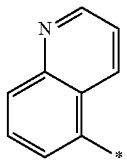
10-236
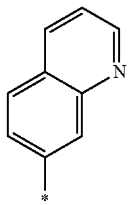
10-237
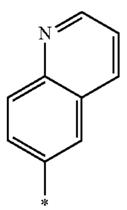
10-238
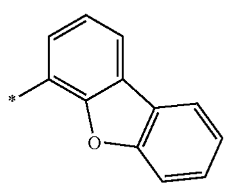
10-239
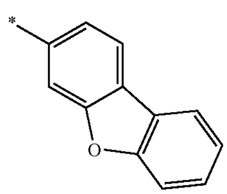
10-240
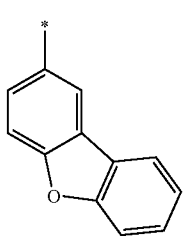
10-241
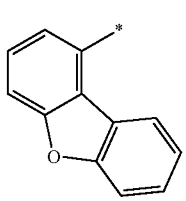
-continued
10-242
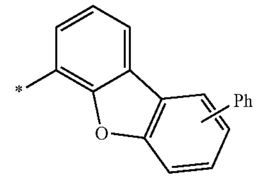
10-243
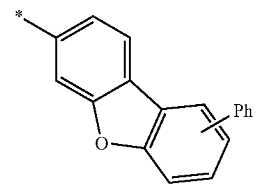
10-244
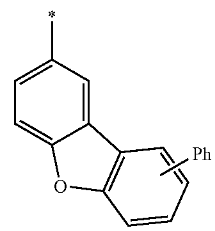
10-245
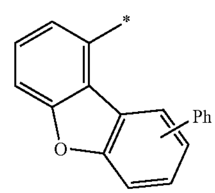
10-246
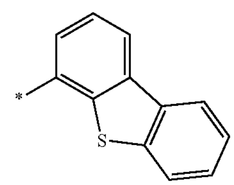
10-247
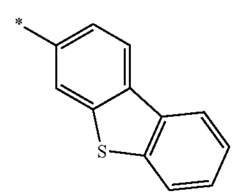
10-248
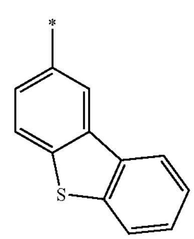
10-249
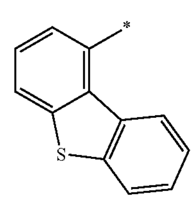

-continued
10-250
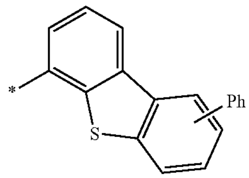
10-251
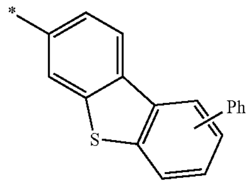
10-252
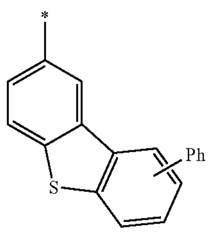
10-253
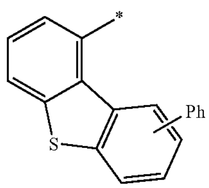
10-254
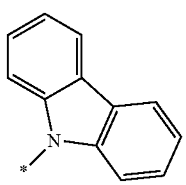
10-255
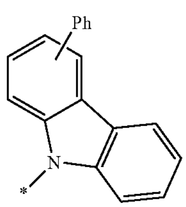
10-256
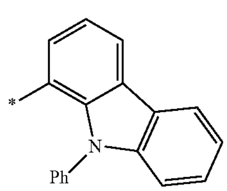
10-257
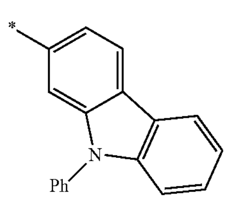
-continued
10-258
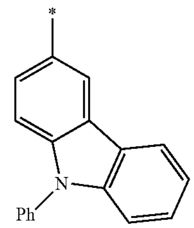
10-259
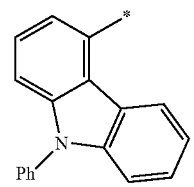
10-260
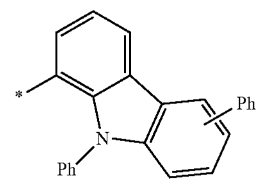
10-261
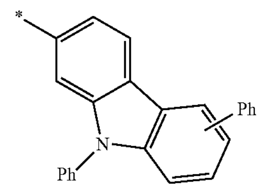
10-262
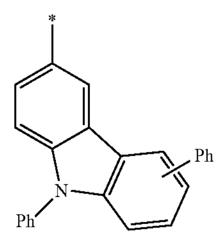
10-263
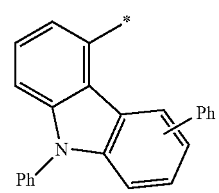
10-264
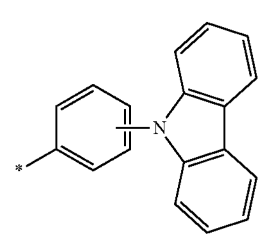

-continued
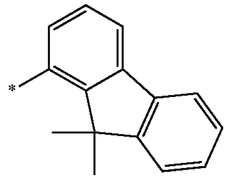
10-265
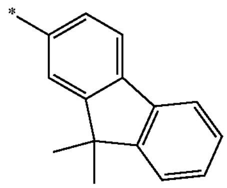
10-266
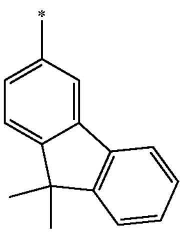
10-267
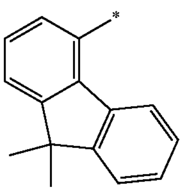
10-268
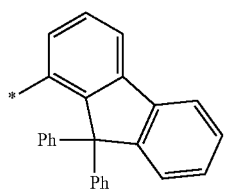
10-269
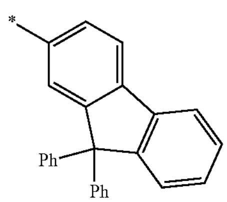
10-270
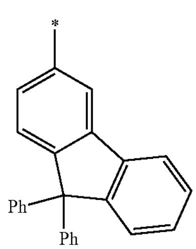
10-271
-continued
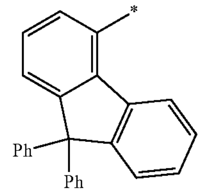
10-272
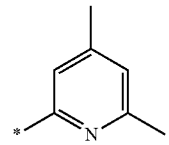
10-273
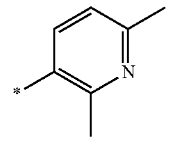
10-274
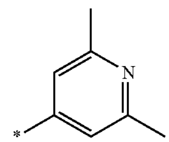
10-275
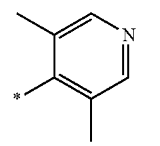
10-276
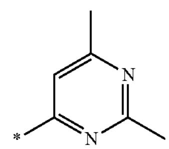
10-277
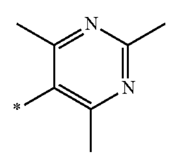
10-278
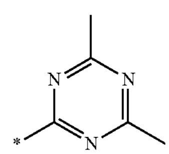
10-279
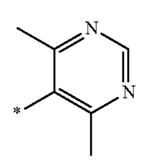
10-280
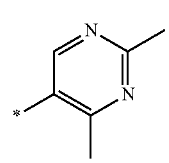
10-281

10-282
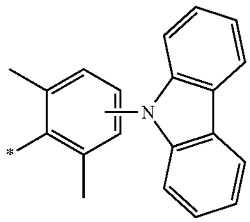
10-283
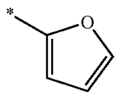
10-284
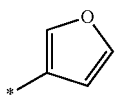
10-285
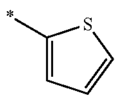
10-286
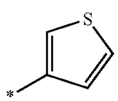
10-287
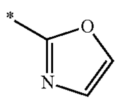
10-288
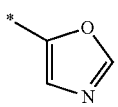
10-289
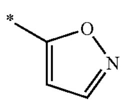
10-290
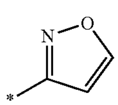
10-291
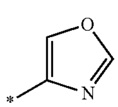
10-292
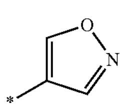
10-293
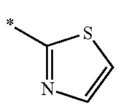
10-294
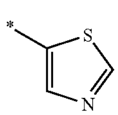
10-295
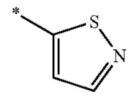
10-296
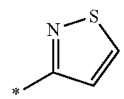
10-297
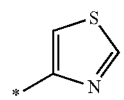
10-298
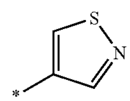
10-299
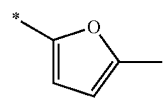
10-300
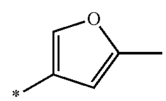
10-301
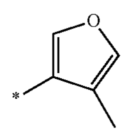
10-302
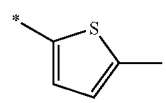
10-303
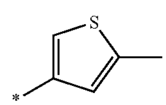
10-304
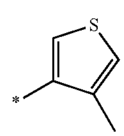
10-305
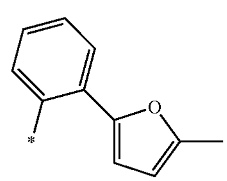
10-306
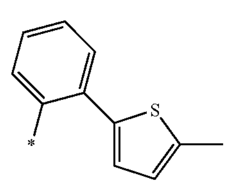

-continued
10-307
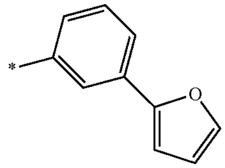
10-308
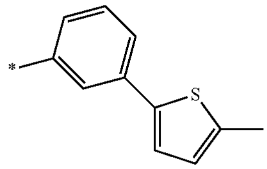
10-309
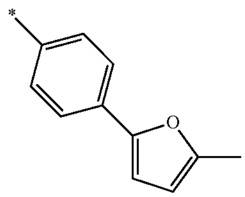
10-310
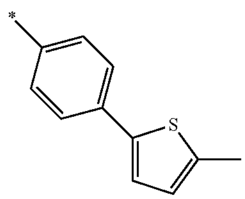
10-311
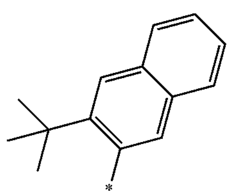
10-312
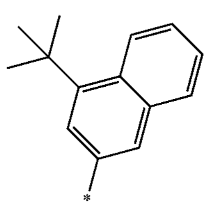
10-313
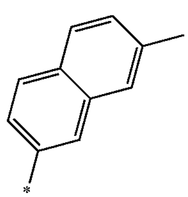
10-314
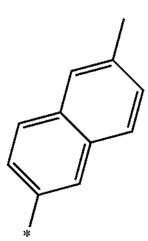
-continued
10-315
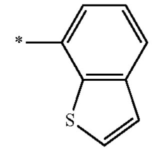
10-316
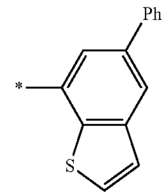
10-317
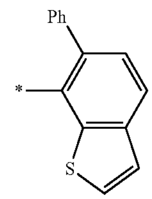
10-318
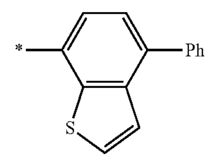
10-319
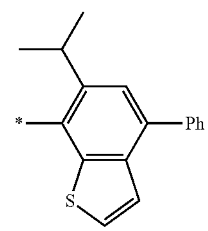
10-320
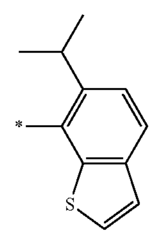
10-321
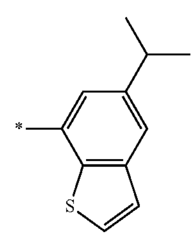
10-322
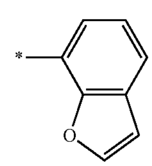

-continued
10-323
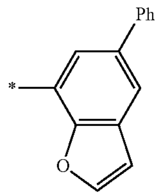
10-324
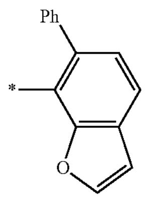
10-325
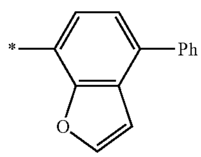
10-326
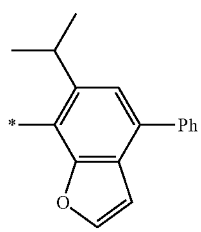
10-327
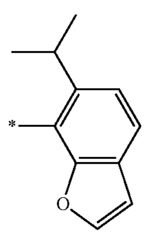
10-328
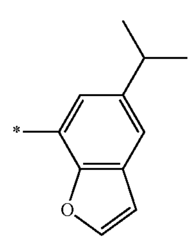
10-329
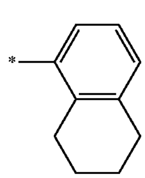
-continued
10-330
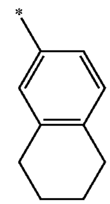
10-331
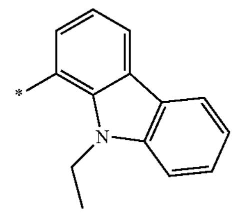
10-332
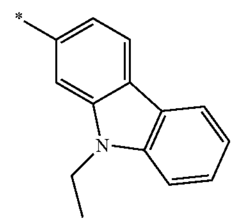
10-333
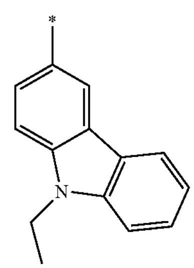
10-334
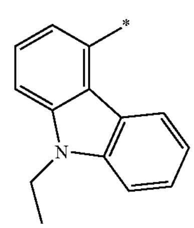
10-335
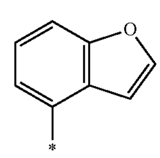
10-336
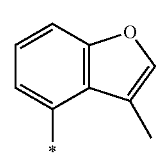
10-337
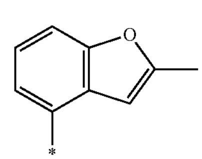

-continued 10-338

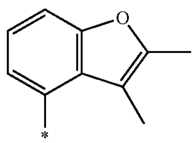

10-339

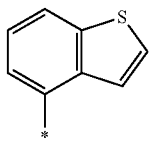

10-340

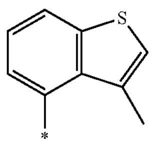

10-341

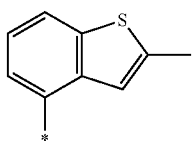

10-342

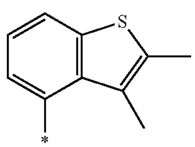

10-343

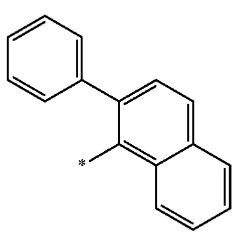

10-344

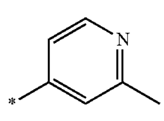

10-345

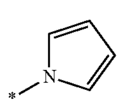

10-346

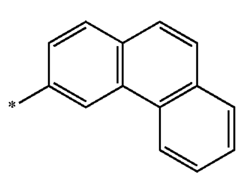

10-347

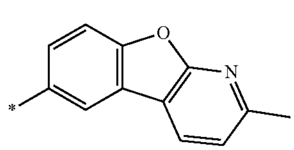

-continued 10-348

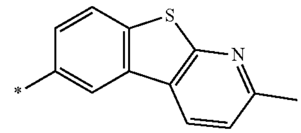

10-349

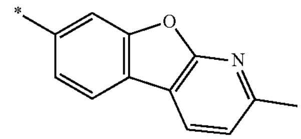

10-350

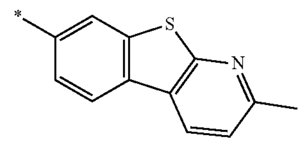

10-351

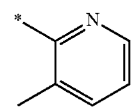

10-352

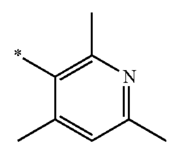

10-353

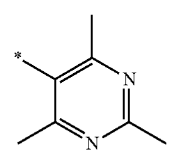

10-354

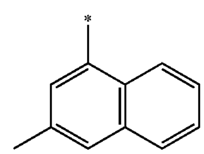

In Formulae 9-1 to 9-39, 9-201 to 9-230, 10-1 to 10-145, and 10-201 to 10-354,* indicates a binding site to an adjacent atom, "Ph" represents a phenyl group, "TMS" represents a trimethylsilyl group, "TMG" represents a trimethylgermyl group and "OMe" represents a methoxy group.

The "group represented by Formulae 9-1 to 9-39 in which at least one hydrogen is substituted with deuterium" and the "group represented by Formulae 9-201 to 9-230 in which at least one hydrogen is substituted with deuterium" may each be, for example, a group represented by one of Formulae 9-501 to 9-514 and 9-601 to 9-637:

9-501

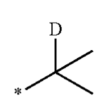

9-502

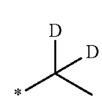

-continued
9-503
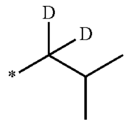
9-504
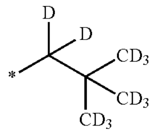
9-505
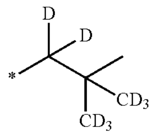
9-506
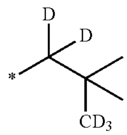
9-507
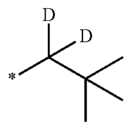
9-508
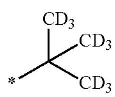
9-509
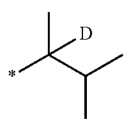
9-510
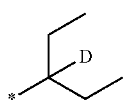
9-511
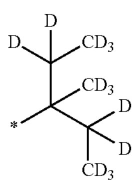
9-512
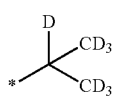
9-513
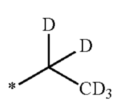
9-514
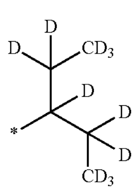
-continued
9-601
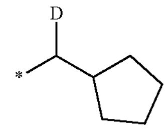
9-602
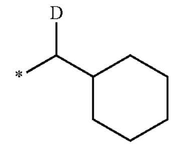
9-603
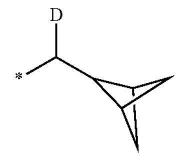
9-604
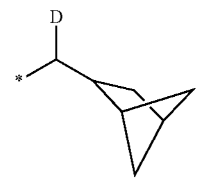
9-605
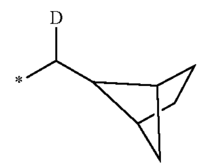
9-606
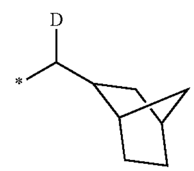
9-607
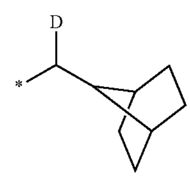
9-608
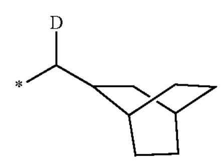
9-609
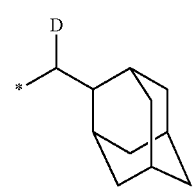

-continued
9-610
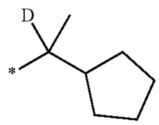
9-611
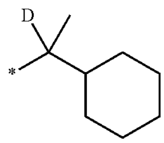
9-612
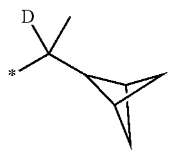
9-613
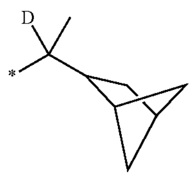
9-614
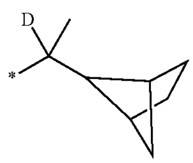
9-615
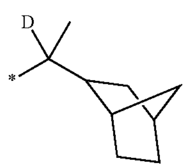
9-616
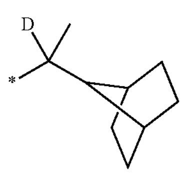
9-617
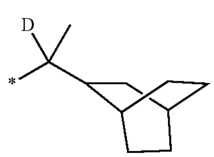
9-618
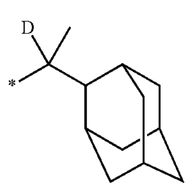
9-619
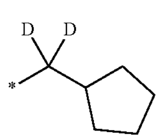
-continued
9-620
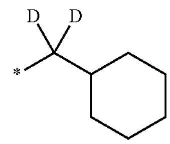
9-621
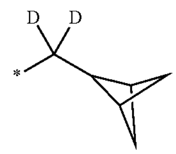
9-622
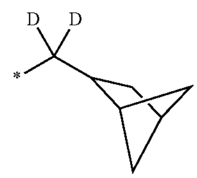
9-623
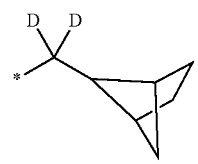
9-624
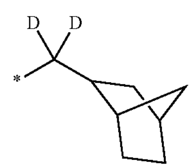
9-625
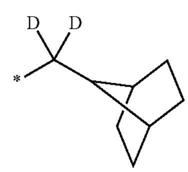
9-626
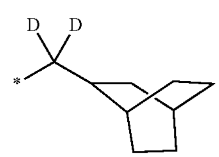
9-627
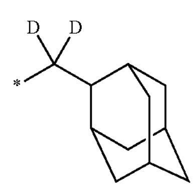
9-628
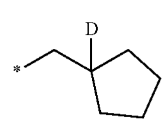
9-629
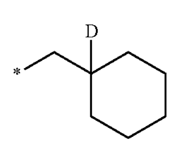

-continued 9-630

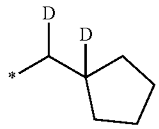

9-631

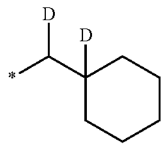

9-632

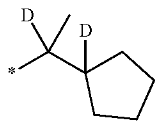

9-633

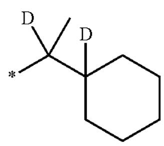

9-634

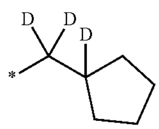

9-635

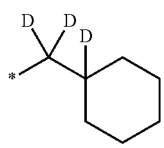

9-636

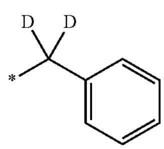

9-637

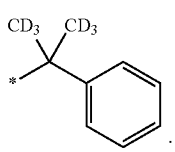

The “group represented by Formulae 9-1 to 9-39 in which at least one hydrogen is substituted with —F” and the “group represented by Formulae 9-201 to 9-230 in which at least one hydrogen is substituted with —F” may each be, for example, a group represented by one of Formulae 9-701 to 9-710:

9-701

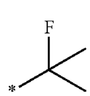

9-702

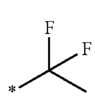

-continued 9-703

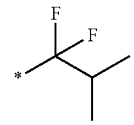

9-704

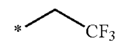

9-705

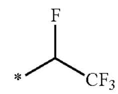

9-706

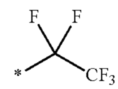

9-707

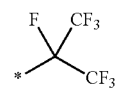

9-708

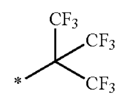

9-709

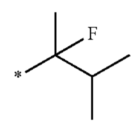

9-710

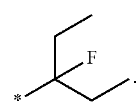

The “group represented by Formulae 10-1 to 10-145 in which at least one hydrogen is substituted with a deuterium” and the “group represented by Formulae 10-201 to 10-354 in which at least one hydrogen is substituted with deuterium” may each be, for example, a group represented by one of Formulae 10-501 to 10-553:

10-501

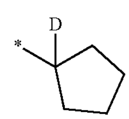

10-502

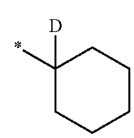

10-503

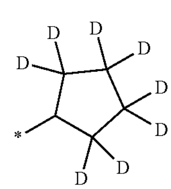

-continued
10-504
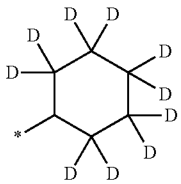
10-505
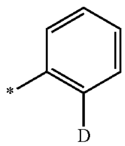
10-506
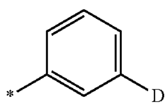
10-507
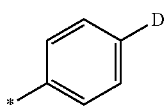
10-508
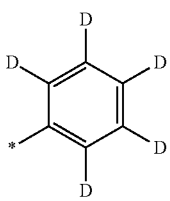
10-509
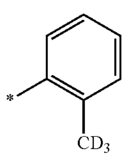
10-510
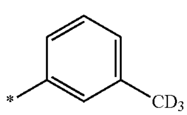
10-511
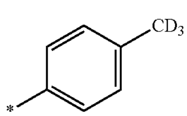
10-512
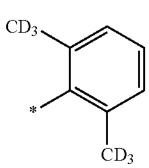
10-513
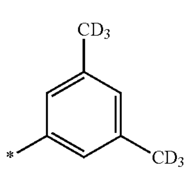
-continued
10-514
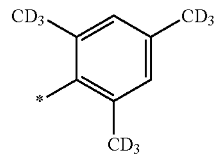
10-515
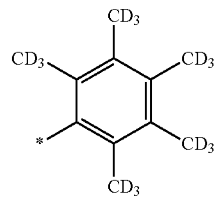
10-516
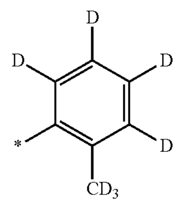
10-517
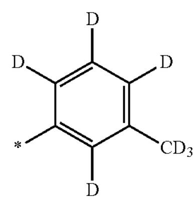
10-518
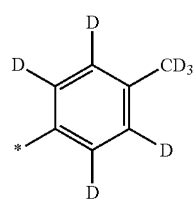
10-519
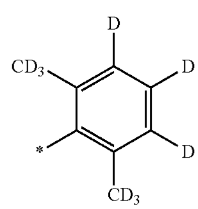
10-520
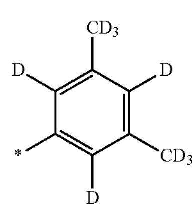
10-521
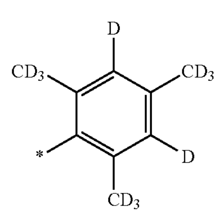

-continued
10-522
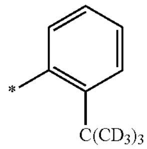
10-523
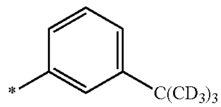
10-524
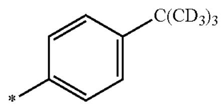
10-525
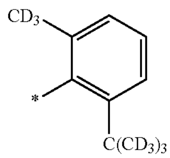
10-526
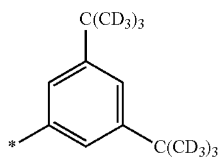
10-527
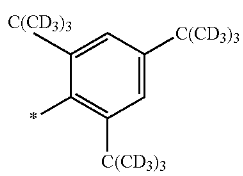
10-528
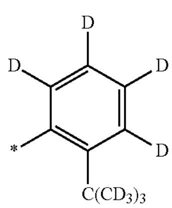
10-529
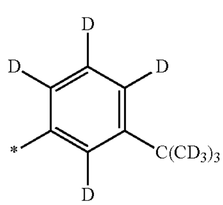
10-530
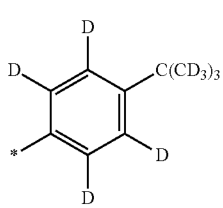
-continued
10-531
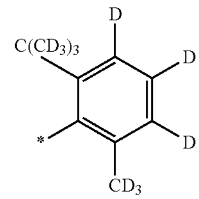
10-532
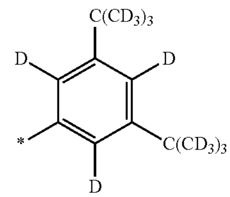
10-533
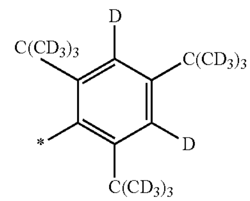
10-534
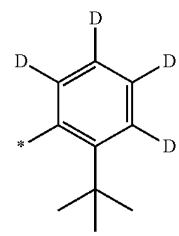
10-535
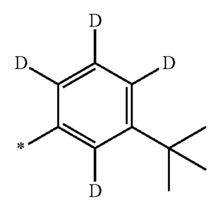
10-536
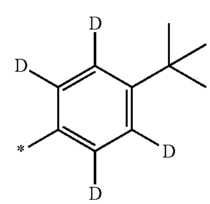
10-537
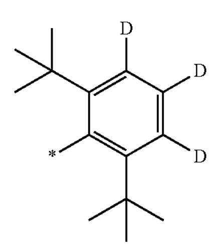

-continued
10-538
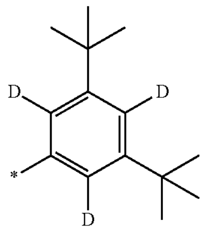
10-540
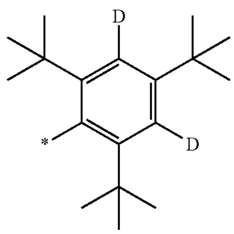
10-541
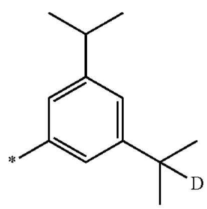
10-542
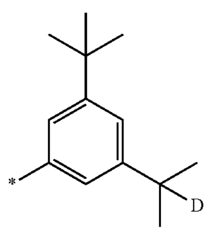
10-543
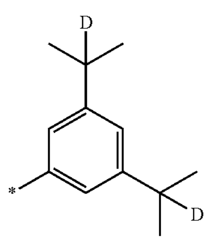
10-544
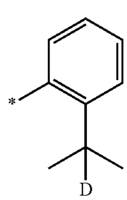
10-545
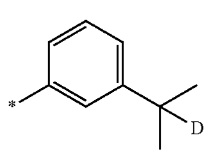
-continued
10-546
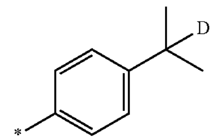
10-547
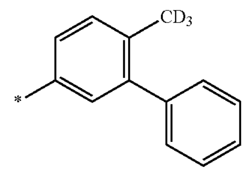
10-548
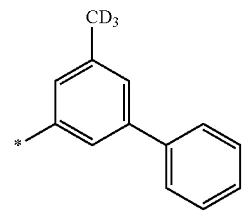
10-549
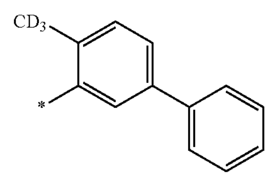
10-550
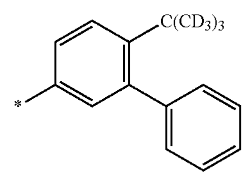
10-551
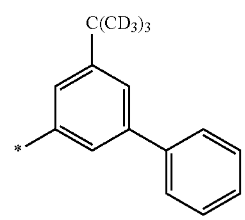
10-552
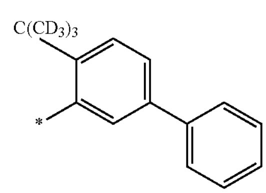
10-553
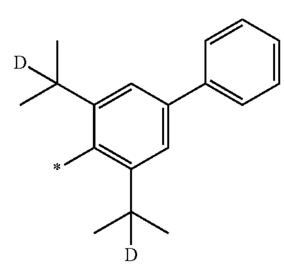
The "group represented by Formulae 10-1 to 10-145 in which at least one hydrogen is substituted with —F" and the "group represented by Formulae 10-201 to 10-354 in which at least one hydrogen is substituted with —F" may each be, for example, a group represented by one of Formulae 10-601 to 10-636:
10-601
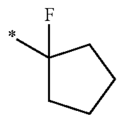
10-602
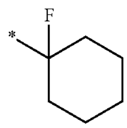
10-603
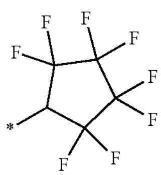
10-604
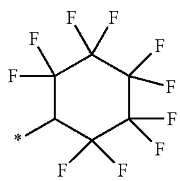
10-605
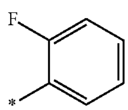
10-606
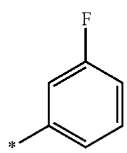
10-607
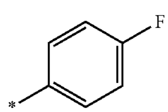
10-608
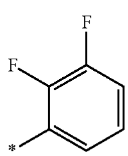
10-609
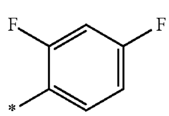
10-610
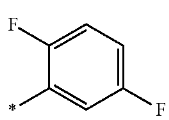
-continued
10-611
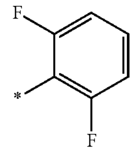
10-612
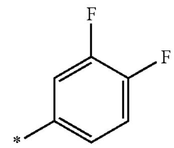
10-613
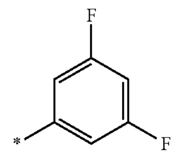
10-614
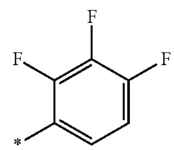
10-615
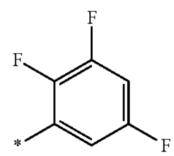
10-616
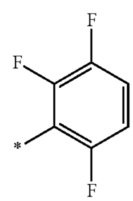
10-617
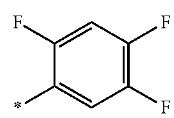
10-618
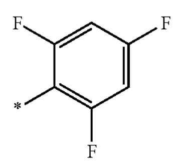
10-619
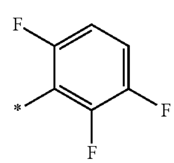
10-620
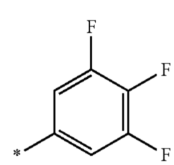

-continued 10-621
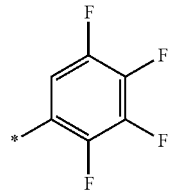

10-622
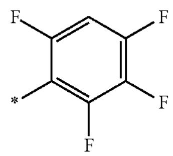

10-623
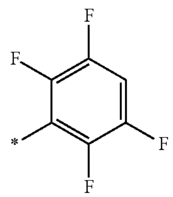

10-624
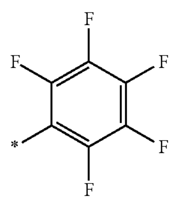

10-625
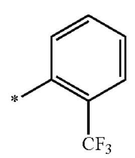

10-626
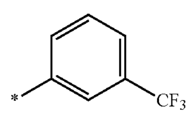

10-627
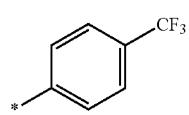

10-628
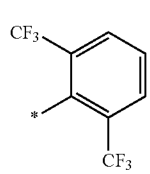

10-629
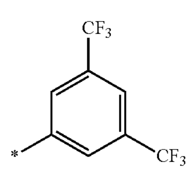

-continued 10-630
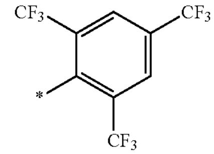

10-631
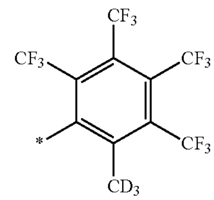

10-632
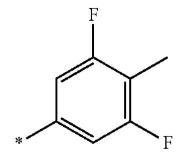

10-633
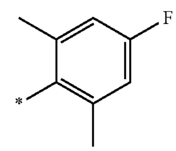

10-634
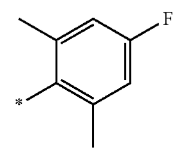

10-635
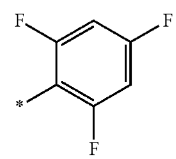

10-636
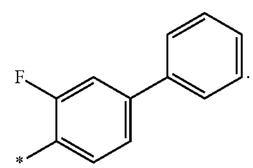

a2, b1, and b2 in Formulae 2 and 3 respectively indicate the number of $R_2$, $Z_1$, and $Z_2$, and a2 may be an integer from 0 to 20 (for example, an integer from 0 to 10), b1 may be an integer from 0 to 6, and b2 may be an integer from 0 to 4. When a2 is two or more, two or more of $R_2$(s) may be identical to or different from each other, and when b1 is two or more, two or more of $Z_1$(s) may be identical to or different from each other, and when b2 is two or more, two or more of $Z_2$(s) may be identical to or different from each other.

In one or more embodiments, in Formula 3, $Z_1$ may not be hydrogen and b1 may be an integer from 1 to 6.

In one or more embodiments, $Z_2$ in Formula 3 may not be hydrogen and b2 may be an integer from 1 to 4.

In one or more embodiments, the organometallic compound represented by Formula 1 may include deuterium, —F, or a combination thereof.

In one or more embodiments, the organometallic compound represented by Formula 1 may satisfy at least one of <Condition 1> to <Condition 12>:

<Condition 1>

$R_{11}$ is not hydrogen and includes at least one deuterium;

<Condition 2> at least one of $R_{11}$ to $R_{13}$ is not hydrogen and includes at least one deuterium;

<Condition 3> at least one of $R_2$(s) in the number of a2 is not hydrogen and includes at least one deuterium;

<Condition 4>

$L_3$ is not a single bond and may include at least one deuterium;

<Condition 5>

$Z_3$ is not hydrogen and includes at least one deuterium;

<Condition 6> at least one of $Z_1$(s) in the number of b1 is not hydrogen and includes at least one deuterium;

<Condition 7>

$R_{11}$ is not hydrogen and includes at least one flouro group (—F);

<Condition 8> at least one of $R_{11}$ to $R_{13}$ is not hydrogen and includes at least one flouro group;

<Condition 9> at least one of $R_2$(s) in the number of a2 is not hydrogen and includes at least one flouro group;

<Condition 10>

$L_3$ is not a single bond and may include at least one flouro group;

<Condition 11>

$Z_3$ is not hydrogen and includes at least one flouro group;

<Condition 12> at least one of $Z_1$(s) in the number of b1 is not hydrogen and includes at least one flouro group.

In Formulae 2 and 3, i) $R_{11}$ and $R_{12}$ may be optionally linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, ii) two or more of a plurality of $R_2$(s) may be optionally linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, iii) two or more of a plurality of $Z_1$ may be optionally linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$ (for example, ring $CY_{30}$ and ring $CY_{31}$, unsubstituted or substituted with at least one $R_{10a}$, described herein), iv) two or more of a plurality of $Z_2$(s) may be optionally linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$ (for example, ring $CY_{10}$ and ring $CY_{11}$, unsubstituted or substituted with at least one $R_{10a}$, described herein). $R_{10a}$ may be the same as described in connection with $Z_1$. For example, $R_{10a}$ may be the same as described in connection with $Z_1$, and may not be hydrogen.

Each of * and *' in Formula 2 and 3 may indicate a binding site to a neighboring atom.

In one or more embodiments, a group represented by

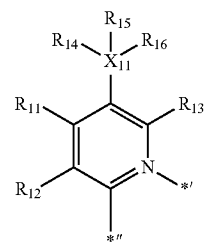

in Formula 2 may be a group represented by Formula 2-1 or 2-2:

2-1

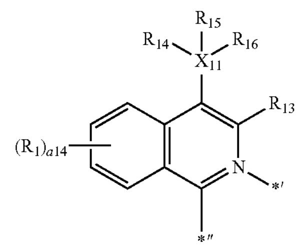

2-2

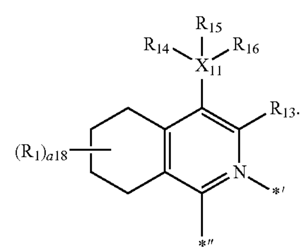

In Formulae 2-1 and 2-2, $X_{11}$, and $R_{13}$ to $R_{16}$ are the same as described above, $R_1$ may be the same as explained in connection with $R_{12}$, a14 may be an integer from 0 to 4, a18 may be an integer from 0 to 8,

*' indicates a binding site to M in Formula 1, and

*" indicates a binding site to a neighboring atom in Formula 2.

In one or more embodiments, a group represented by

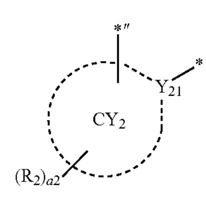

in Formula 2 may be a group represented by one of Formulae CY2-1 to CY2-33:
CY2-1
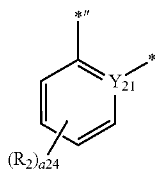
CY2-2
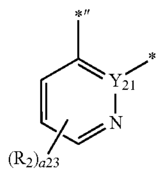
CY2-3
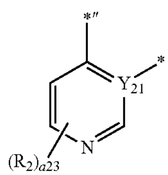
CY2-4
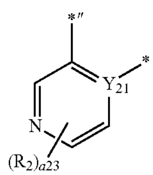
CY2-5
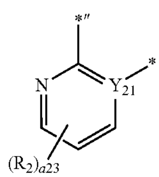
CY2-6
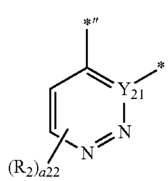
CY2-7
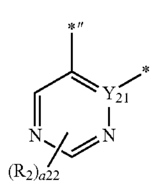
CY2-8
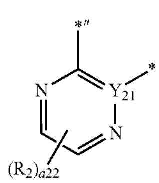
-continued
CY2-9
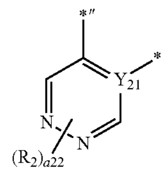
CY2-10
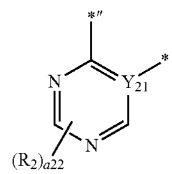
CY2-11
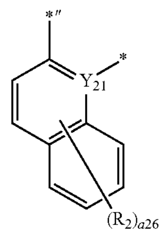
CY2-12
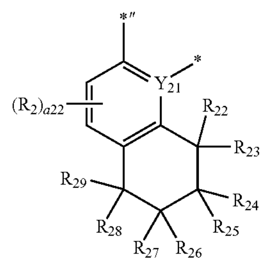
CY2-13
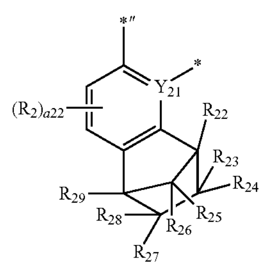
CY2-14
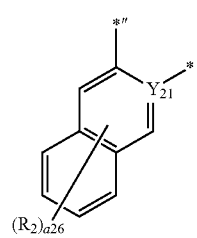
CY2-15
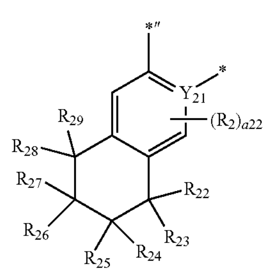

-continued
CY2-16
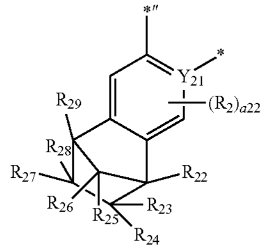
CY2-17
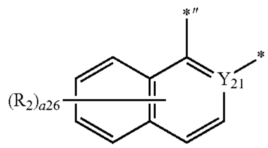
CY2-18
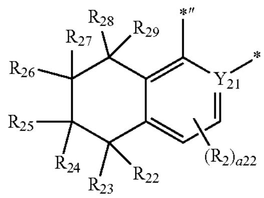
CY2-19
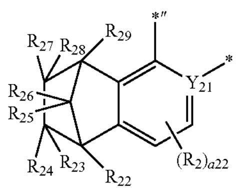
CY2-20
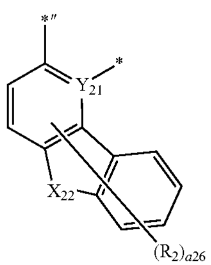
CY2-21
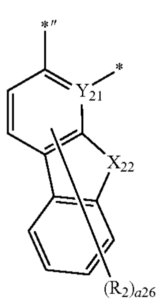
-continued
CY2-22
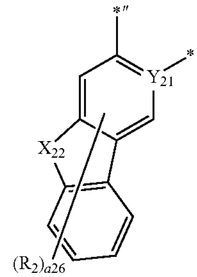
CY2-23
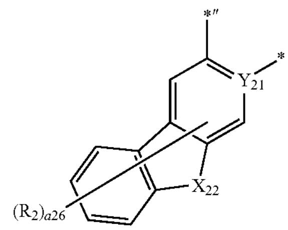
CY2-24
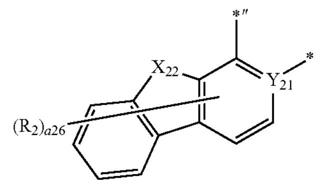
CY2-25
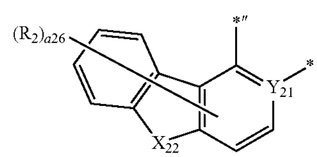
CY2-26
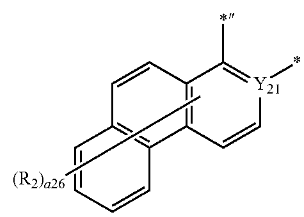
CY2-27
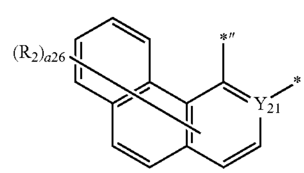
CY2-28
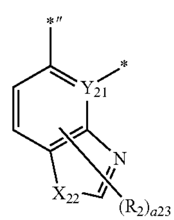

-continued

CY2-29

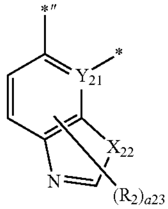

CY2-30

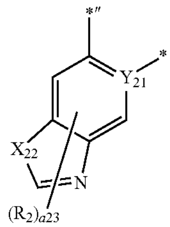

CY2-31

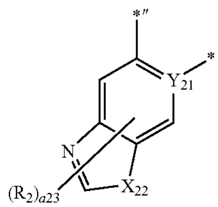

CY2-32

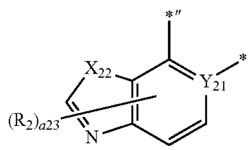

CY2-33

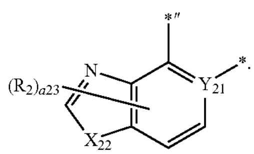

In Formulae CY2-1 to CY2-33, $Y_{21}$ and $R_2$ are the same as described above, $X_{22}$ may be $C(R_{22})(R_{23})$, $N(R_{22})$, O, S, or $Si(R_{22})(R_{23})$, $R_{22}$ to $R_{29}$ are the same as described in connection with $R_2$, a28 may be an integer from 0 to 8, a26 may be an integer from 0 to 6, a24 may be an integer from 0 to 4, a23 may be an integer from 0 to 3, a22 may be an integer from 0 to 2,

*" indicates a binding site to a neighboring atom in Formula 2, and

* indicates a binding site to M in Formula 1.

In one or more embodiments, a group represented by

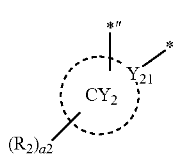

in Formula 2 may be a group represented by one of Formulae CY2(1) to CY2(56) or a group represented by one of Formulae CY2-20 to CY2-33:

CY2(1)

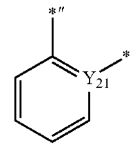

CY2(2)

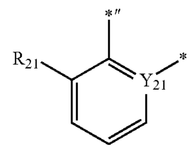

CY2(3)

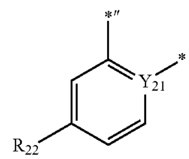

CY2(4)

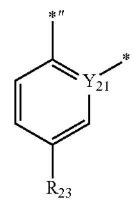

CY2(5)

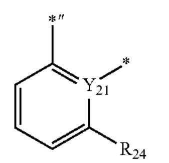

CY2(6)

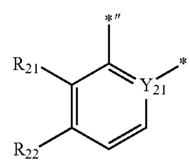

CY2(7)

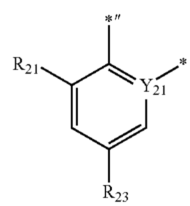

CY2(8)

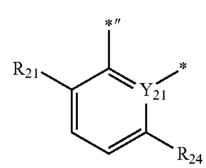

CY2(9)

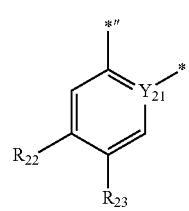

-continued
CY2(10)
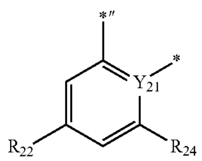
CY2(11)
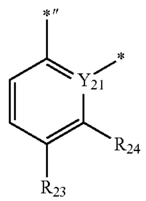
CY2(12)
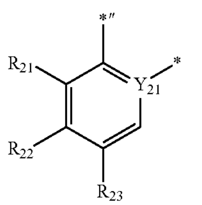
CY2(13)
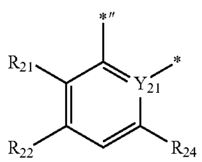
CY2(14)
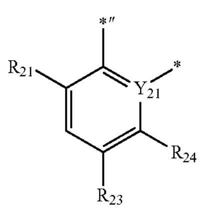
CY2(15)
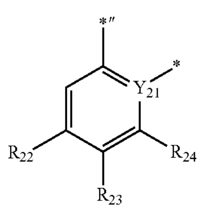
CY2(16)
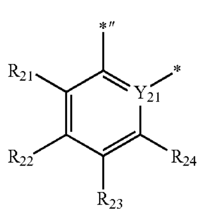
CY2(17)
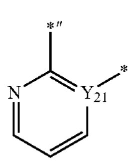
-continued
CY2(18)
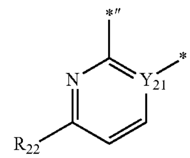
CY2(19)
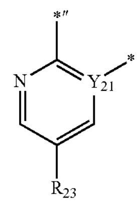
CY2(20)
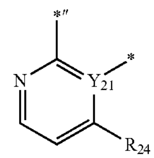
CY2(21)
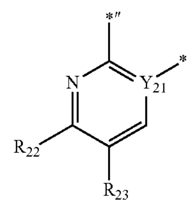
CY2(22)
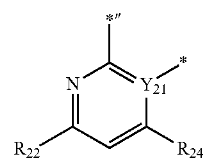
CY2(23)
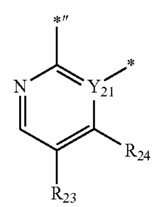
CY2(24)
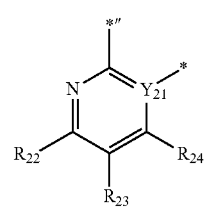
CY2(25)
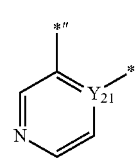
CY2(26)
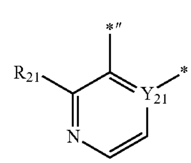

-continued
CY2(27)
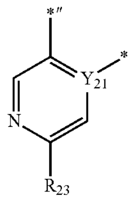
CY2(28)
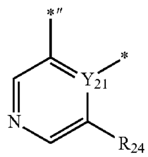
CY2(29)
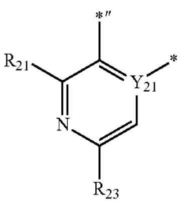
CY2(30)
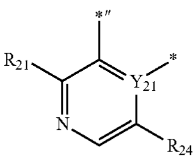
CY2(31)
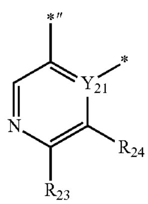
CY2(32)
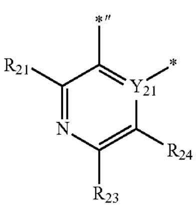
CY2(33)
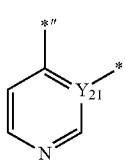
CY2(34)
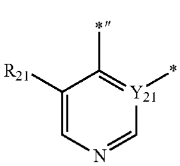
-continued
CY2(35)
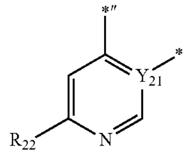
CY2(36)
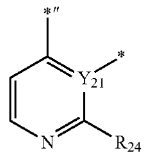
CY2(37)
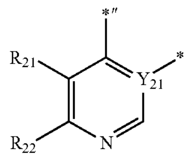
CY2(38)
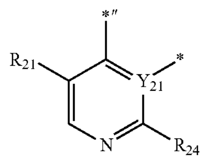
CY2(39)
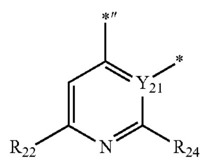
CY2(40)
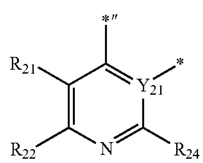
CY2(41)
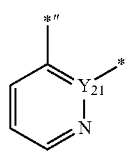
CY2(42)
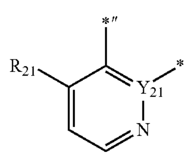
CY2(43)
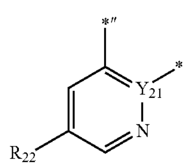

-continued
CY2(44)
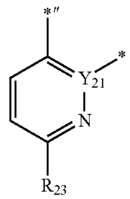
CY2(45)
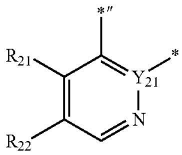
CY2(46)
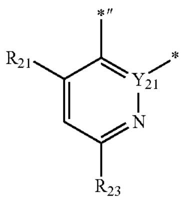
CY2(47)
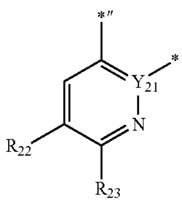
CY2(48)
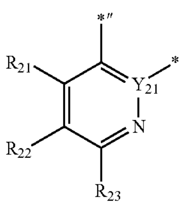
CY2(49)
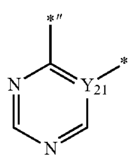
CY2(50)
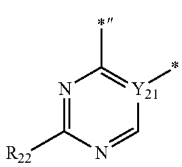
CY2(51)
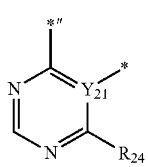
-continued
CY2(52)
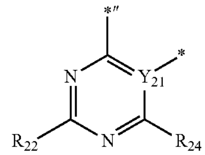
CY2(53)
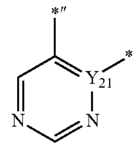
CY2(54)
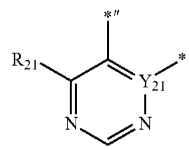
CY2(55)
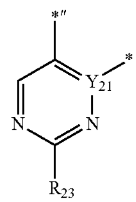
CY2(56)
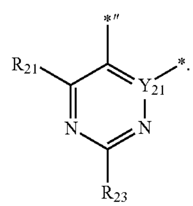
In Formula CY2(1) to CY2(56),
$Y_{21}$ may be C,
$R_{21}$ to $R_{24}$ are the same as described in connection with $R_2$, and $R_{21}$ to $R_{24}$ are each not hydrogen,
*" indicates a binding site to a neighboring atom in Formula 2, and
* indicates a binding site to M in Formula 1.
In one or more embodiments, a group represented by
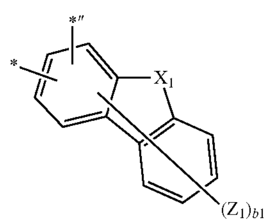

in Formula 3 may be a group represented by one of Formulae CY3-1 to CY3-6:

CY3-1

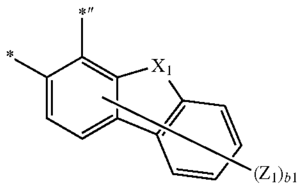

CY3-2

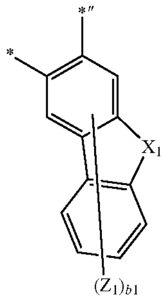

CY3-3

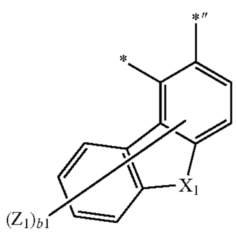

CY3-4

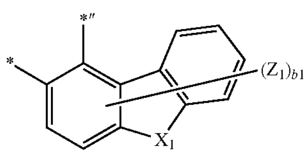

CY3-5

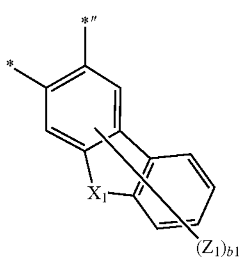

CY3-6

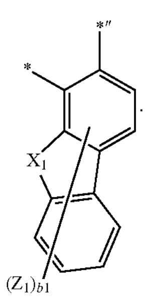

In Formulae CY3-1 to CY3-6, $X_1$, $Z_1$, and b1 are the same as described above,

* indicates a binding site to M in Formula 1, and

*" indicates a binding site to a neighboring atom in Formula 3.

In one or more embodiments, two or more of a plurality of $Z_1$(s) in a group represented by

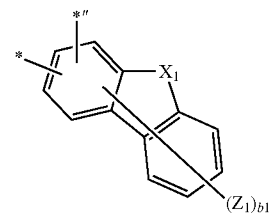

in Formula 3 may be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$. As a result, a group represented by

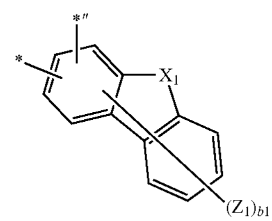

in Formula 3 may be a group represented by one of Formulae CY3-1 A to CY3-1 D, CY3-2 A to CY3-2D, CY3-3 A to CY3-3D, CY3-4A to CY3-4D, CY3-5A to CY3-5D, and CY3-6A to CY3-6D:

CY3-1A

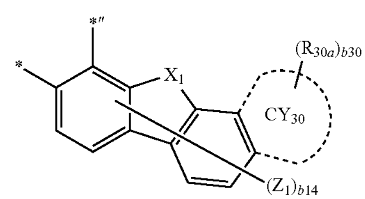

CY3-1B

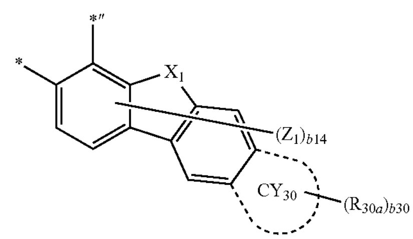

CY3-1C

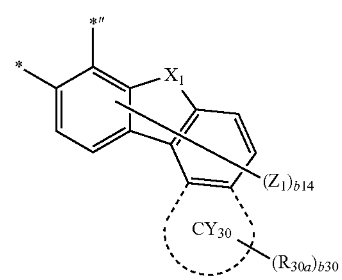

-continued
CY3-1D
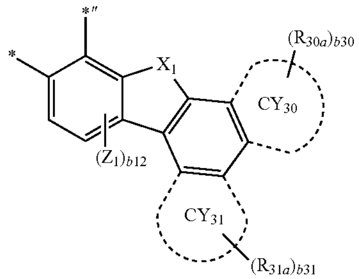
CY3-2A
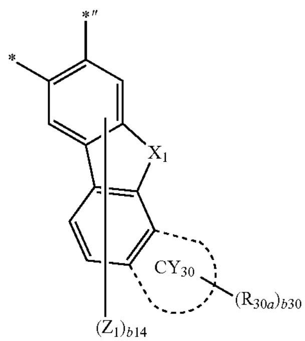
CY3-2B
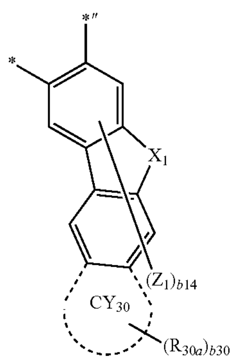
CY3-2C
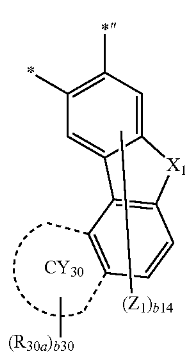
-continued
CY3-2D
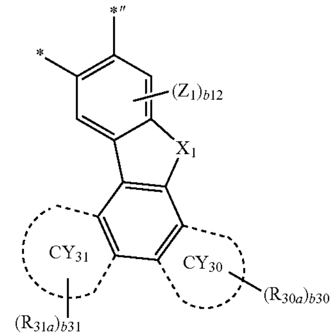
CY3-3A
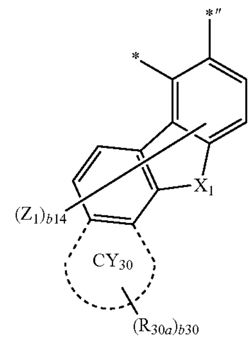
CY3-3B
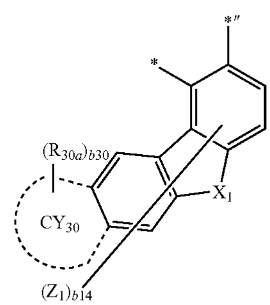
CY3-3C
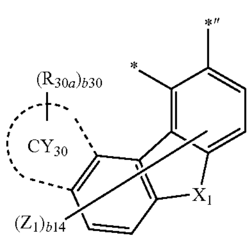
CY3-3D
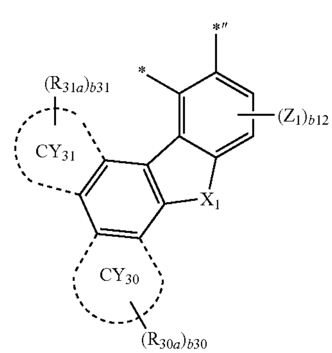

CY3-4A
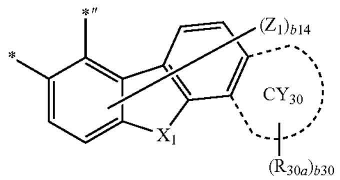
CY3-4B
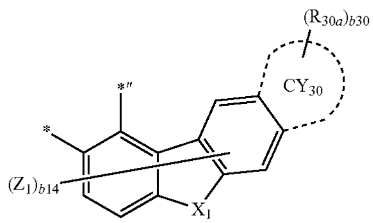
CY3-4C
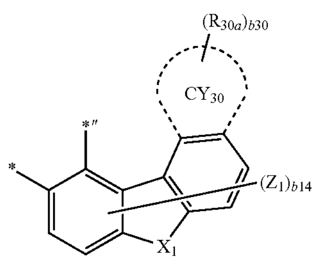
CY3-4D
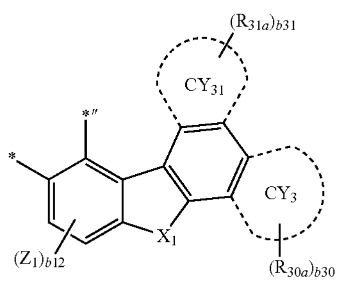
CY3-5A
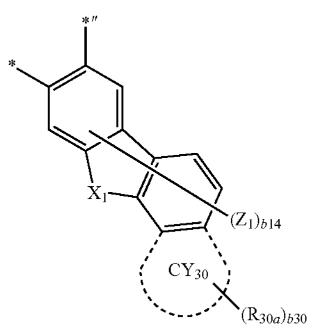
CY3-5B
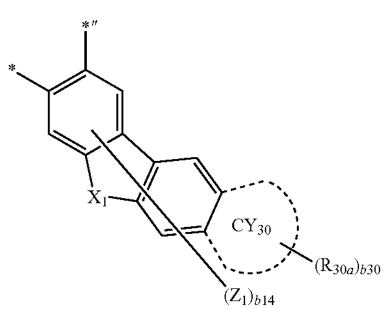
CY3-5C
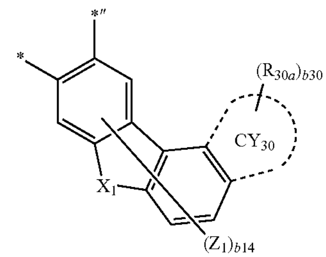
CY3-5D
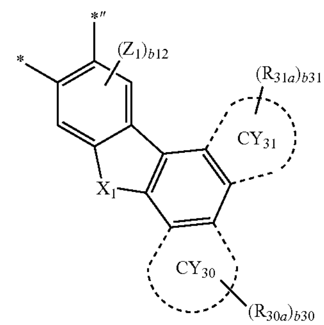
CY3-6A
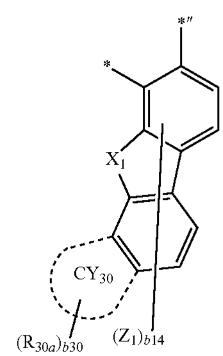
CY3-6B
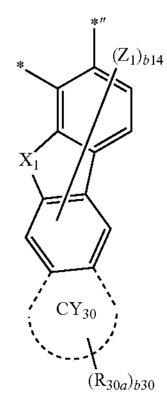

-continued

CY3-6C

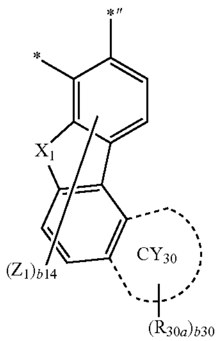

CY3-6D

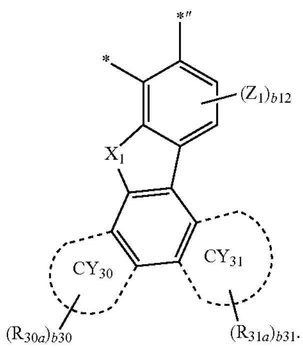

In Formulae CY3-1A to CY3-1 D, CY3-2A to CY3-21D, CY3-3A to CY3-31D, CY3-4A to CY3-4D, CY3-5A to CY3-5D, and CY3-6A to CY3-6D, $X_1$ and $Z_1$ are the same as described above, ring $CY_{30}$ and ring $CY_{31}$ may each independently be a $C_5$-$C_{30}$ carbocyclic group or a $C_1$-$C_{30}$ heterocyclic group, $R_{30a}$ and $R_{31a}$ may each be the same as explained in connection with $R_{10a}$, b12 may be an integer from 0 to 2, b14 may be an integer from 0 to 4, b30 and b31 may each independently be an integer from 0 to 20, when b30 is 2 or more, two or more $R_{30a}$(s) may be identical to or different from each other, and when b31 is 2 or more, two or more $R_{31a}$(s) may be identical to or different from each other,

* indicates a binding site to M in Formula 1, and

*" indicates a binding site to a neighboring atom in Formula 3.

For example, the ring $CY_{30}$ and ring $CY_{31}$ may each independently be a cyclohexane group, an adamantane group, a norbornane group, a benzene group, a naphthalene group, a phenanthrene group, a pyridine group, a pyrimidine group, a quinoline group, an isoquinoline group, a benzene group condented with a cyclohexane group, a benzene group condented with a norbornane group, a pyrimidine group condented with a cyclohexane group, or a pyrimidine group condented with a norbornane group.

In one or more embodiments, a group represented by

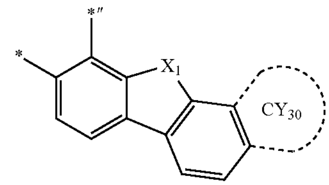

in Formula CY3-1A may be a group represented by one of Formulae CY3-1A-1 to CY3-1A-12:

CY3-1A-1

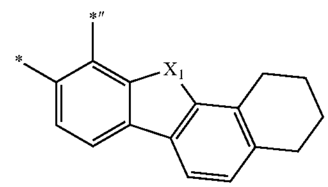

CY3-1A-2

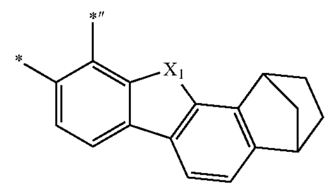

CY3-1A-3

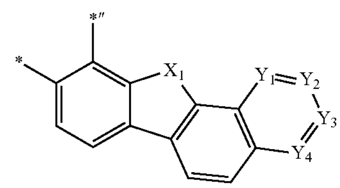

CY3-1A-4

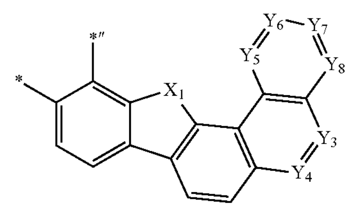

CY3-1A-5

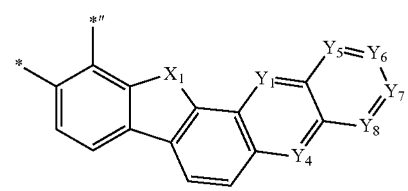

CY3-1A-6

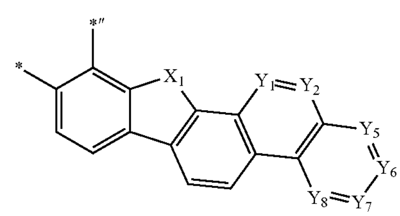

-continued
CY3-1A-7
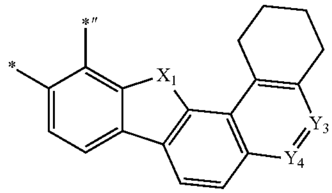
CY3-1A-8
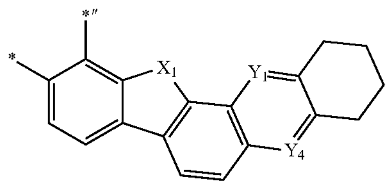
CY3-1A-9
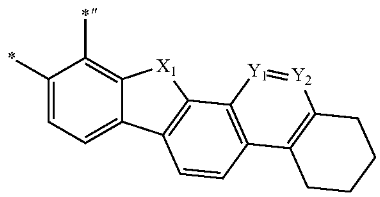
CY3-1A-10
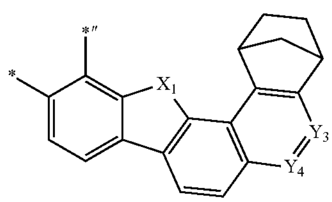
CY3-1A-11
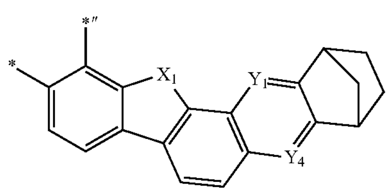
CY3-1A-12
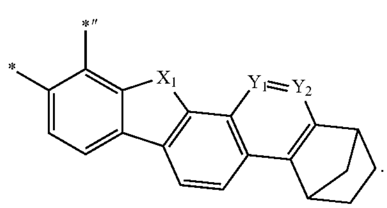
In one or more embodiments, a group represented by
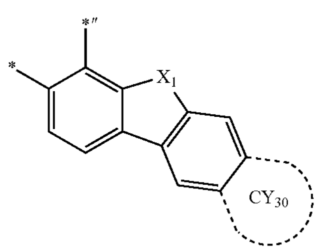
in Formula CY3-1B may be a group represented by one of Formulae CY3-1B-1 to CY3-1B-12:
CY3-1B-1
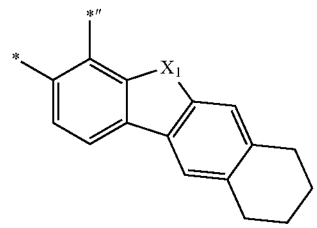
CY3-1B-2
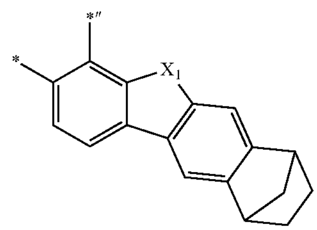
CY3-1B-3
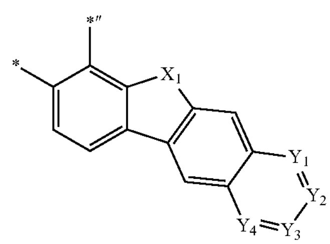
CY3-1B-4
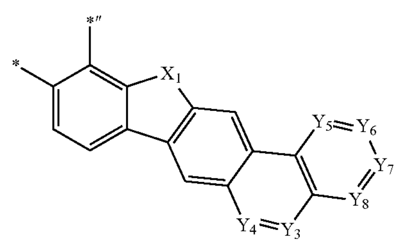
CY3-1B-5
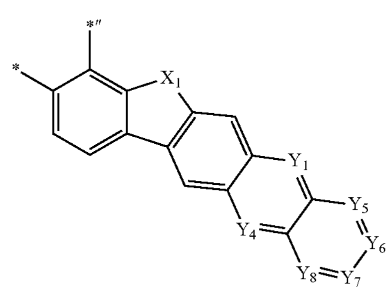
CY3-1B-6
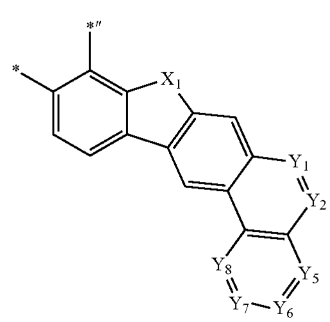

-continued
CY3-1B-7
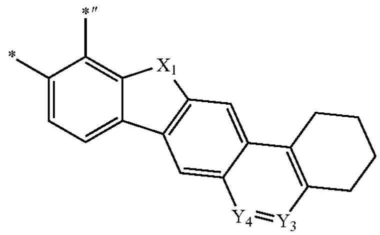
CY3-1B-8
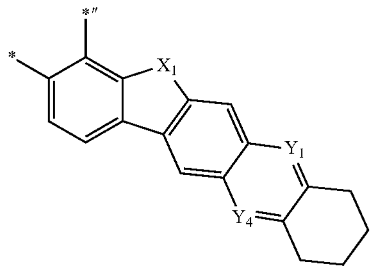
CY3-1B-9
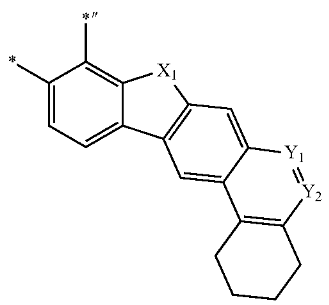
CY3-1B-10
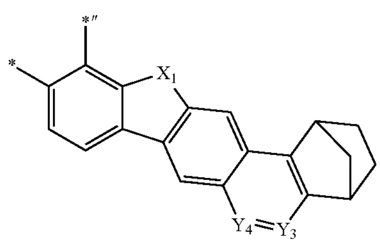
CY3-1B-11
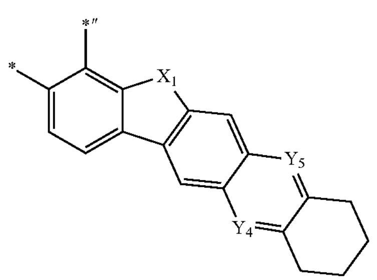
-continued
CY3-1B-12
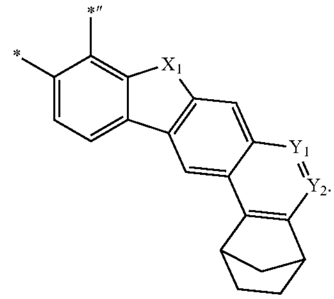
In one or more embodiments, a group represented by
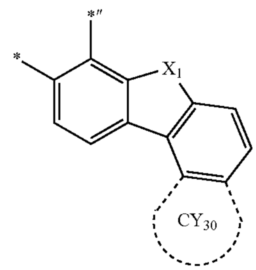
in Formula CY3-1C may be a group represented by one of Formulae CY3-1C-1 to CY3-1C-12:
CY3-1C-1
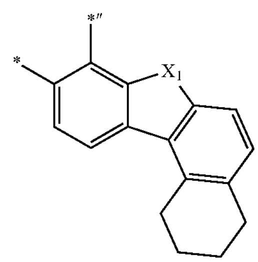
CY3-1C-2
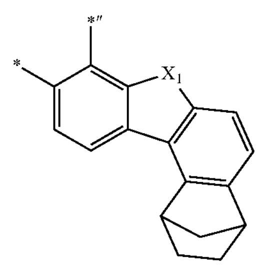
CY3-1C-3
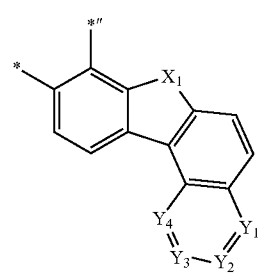

-continued
CY3-1C-4
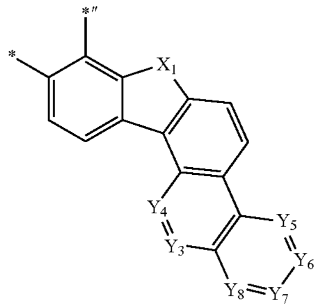
CY3-1C-5
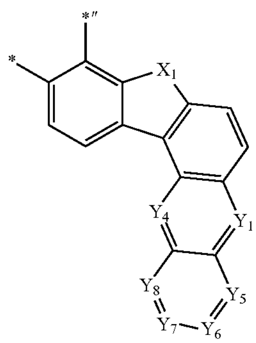
CY3-1C-6
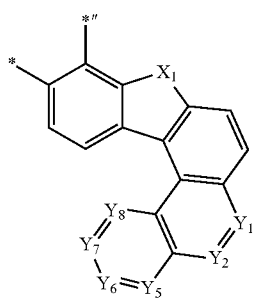
CY3-1C-7
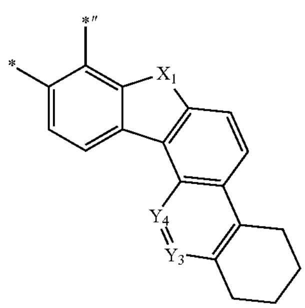
CY3-1C-8
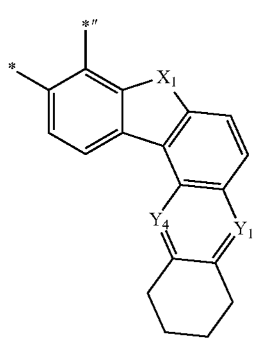
-continued
CY3-1C-9
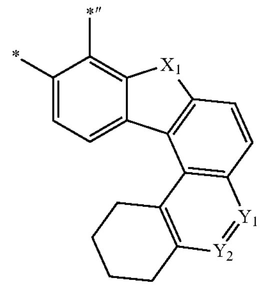
CY3-1C-10
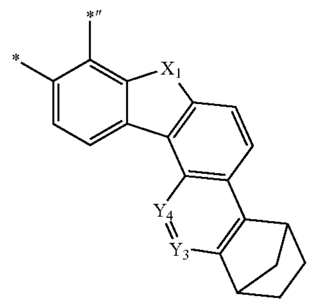
CY3-1C-11
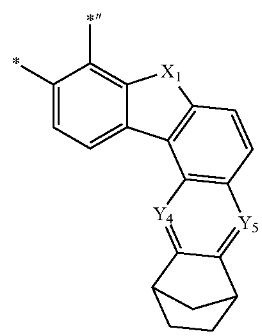
CY3-1C-12
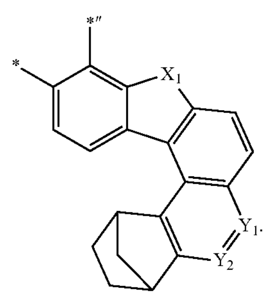
In one or more embodiments, a group represented by
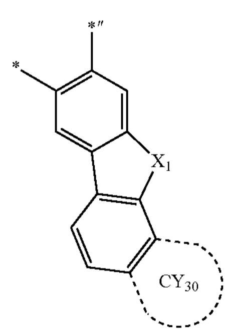

in Formula CY3-2A may be a group represented by one of Formulae CY3-2A-1 to CY3-2A-12:
CY3-2A-1
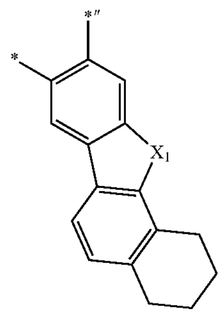
CY3-2A-2
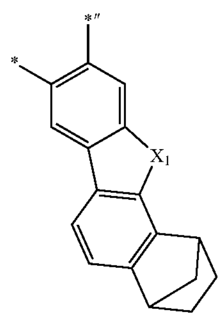
CY3-2A-3
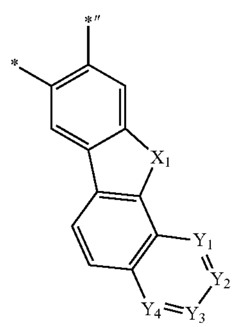
CY3-2A-4
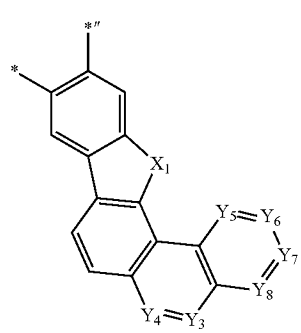
-continued
CY3-2A-5
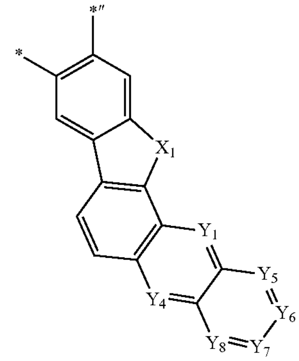
CY3-2A-6
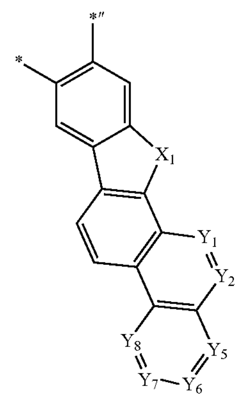
CY3-2A-7
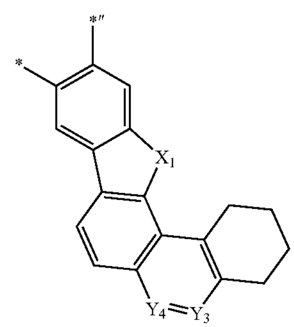
CY3-2A-8
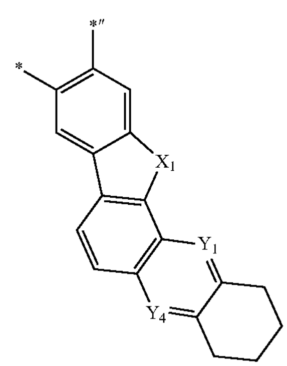

-continued
CY3-2A-9
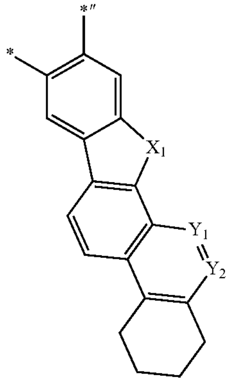
CY3-2A-10
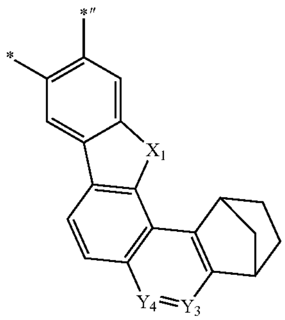
CY3-2A-11
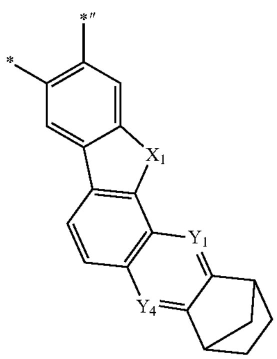
CY3-2A-12
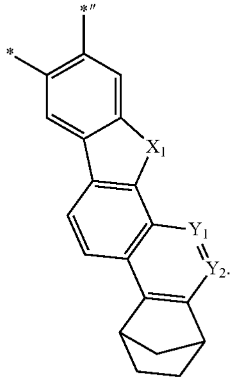
In one or more embodiments, a group represented by
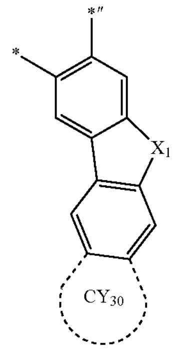
in Formula CY3-2B may be a group represented by one of Formulae CY3-2B-1 to CY3-2B-12:
CY3-2B-1
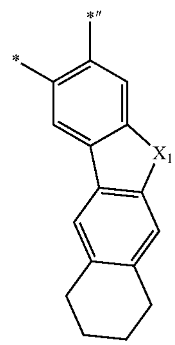
CY3-2B-2
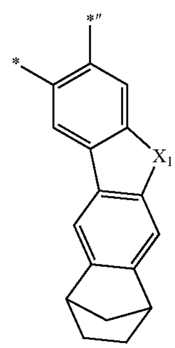
CY3-2B-3
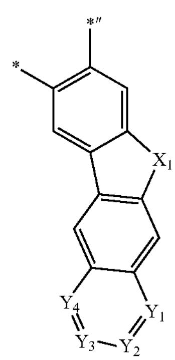

-continued
CY3-2B-4
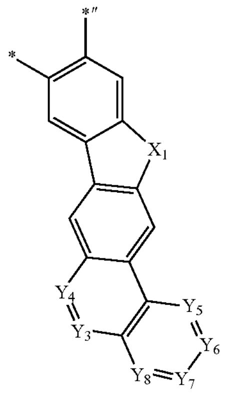
CY3-2B-5
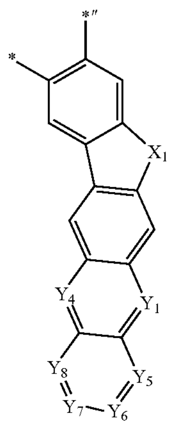
CY3-2B-6
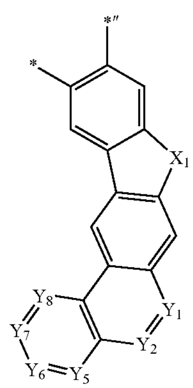
CY3-2B-7
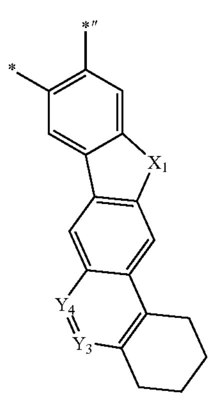
-continued
CY3-2B-8
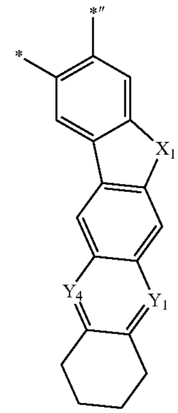
CY3-2B-9
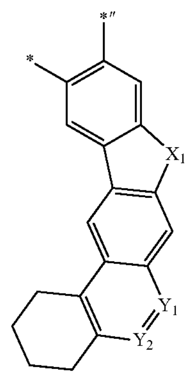
CY3-2B-10
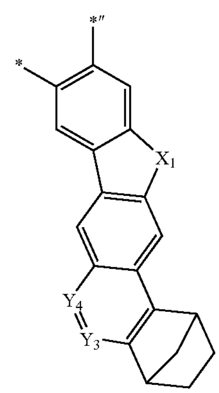
CY3-2B-11
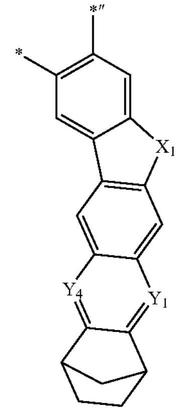

-continued
CY3-2B-12
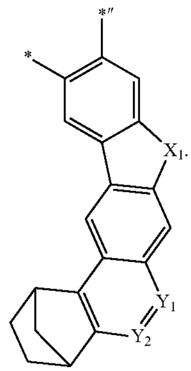
In one or more embodiments, a group represented by
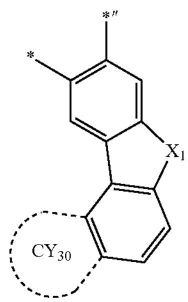
in Formula CY3-2C may be a group represented by one of Formulae CY3-2C-1 to CY3-2C-12:
CY3-2C-1
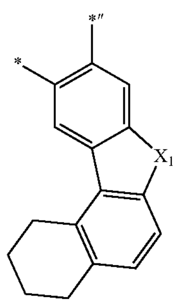
CY3-2C-2
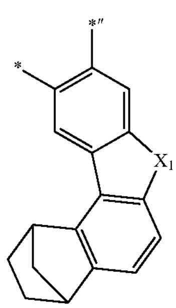
-continued
CY3-2C-3
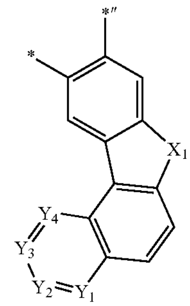
CY3-2C-4
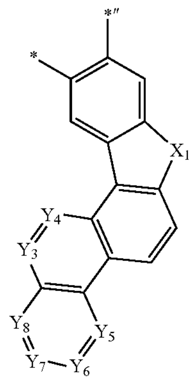
CY3-2C-5
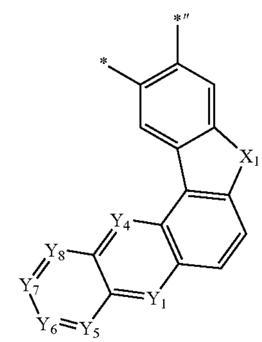
CY3-2C-6
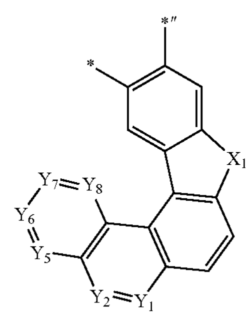

-continued
CY3-2C-7
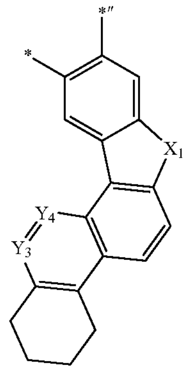
CY3-2C-8
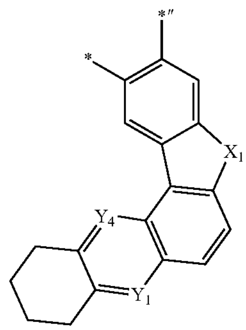
CY3-2C-9
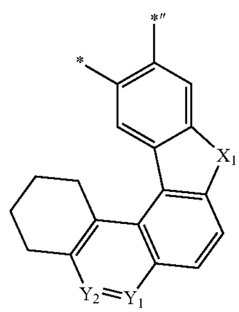
CY3-2C-10
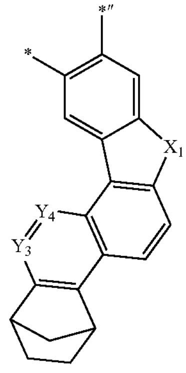
-continued
CY3-2C-11
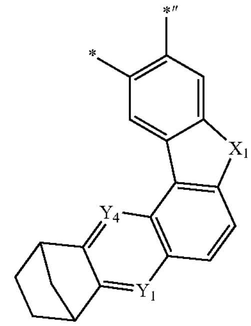
CY3-2C-12
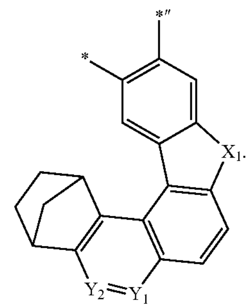
In one or more embodiments, a group represented by
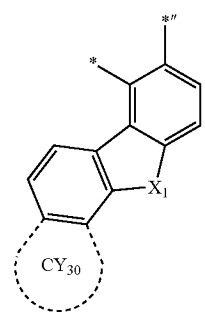
in Formula CY3-3A may be a group represented by one of Formulae CY3-3A-1 to CY3-3A-12:
CY3-3A-1
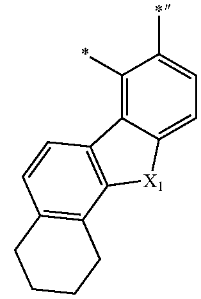

-continued
CY3-3A-2
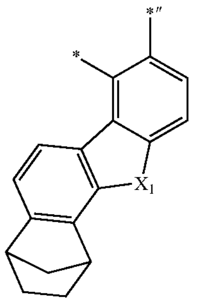
CY3-3A-3
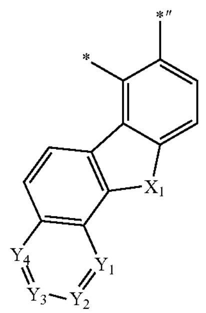
CY3-3A-4
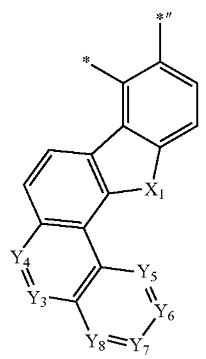
CY3-3A-5
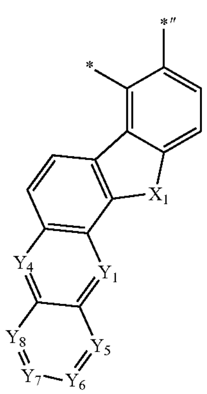
-continued
CY3-3A-6
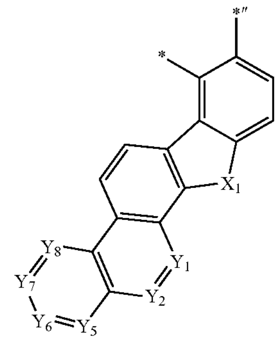
CY3-3A-7
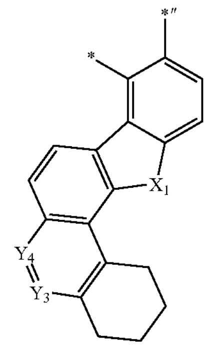
CY3-3A-8
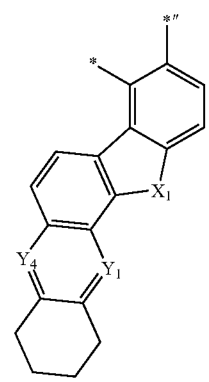
CY3-3A-9
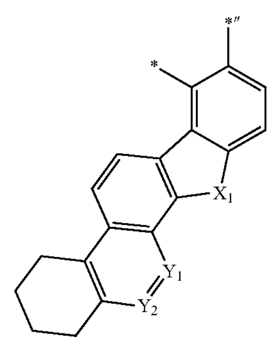

-continued
CY3-3A-10
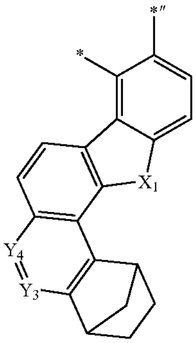
CY3-3A-11
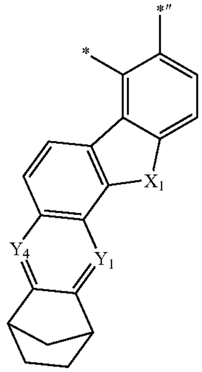
CY3-3A-12
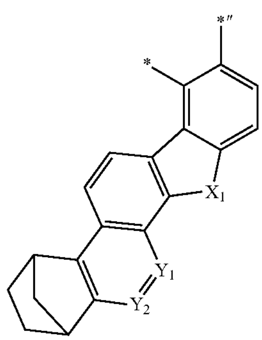
In one or more embodiments, a group represented by
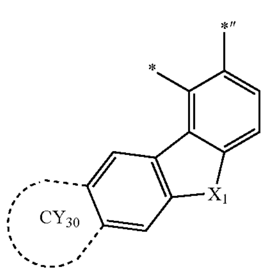
in Formula CY3-3B may be a group represented by one of Formulae CY3-3B3-1 to CY3-3B-12:
CY3-3B-1
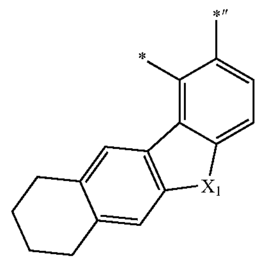
CY3-3B-2
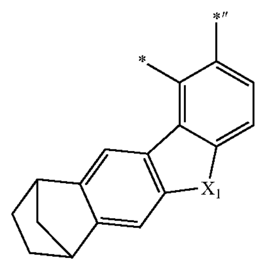
CY3-3B-3
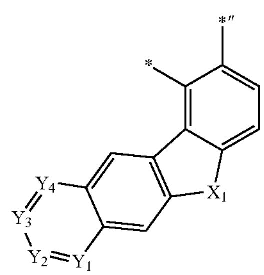
CY3-3B-4
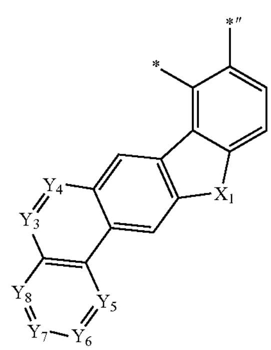
CY3-3B-5
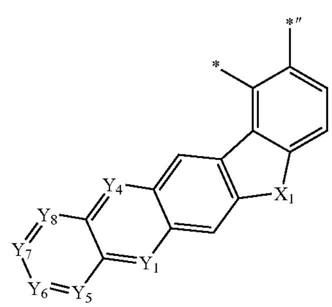

-continued
CY3-3B-6
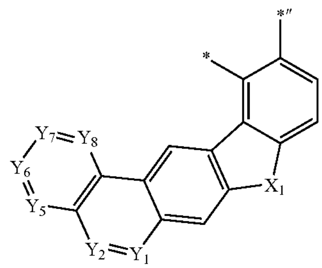
CY3-3B-7
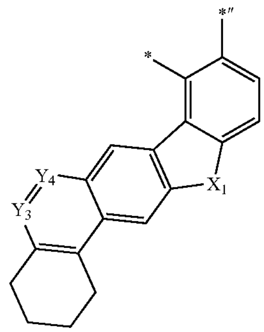
CY3-3B-8
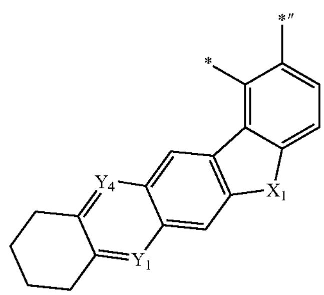
CY3-3B-9
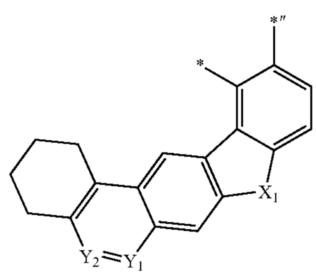
CY3-3B-10
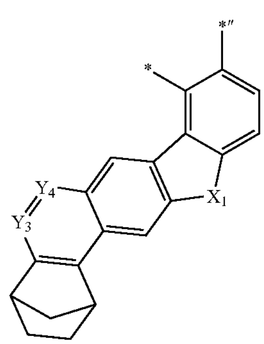
-continued
CY3-3B-11
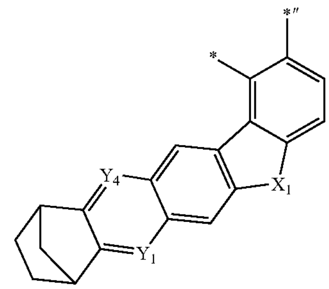
CY3-3B-12
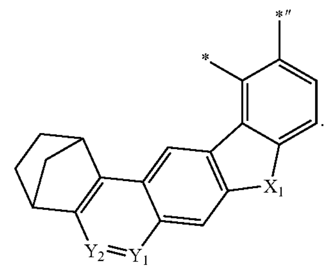
In one or more embodiments, a group represented by
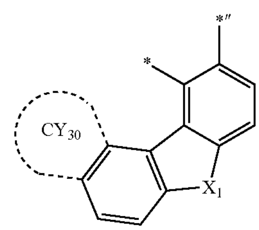
in Formula CY3-3C may be a group represented by one of Formulae CY3-3C-1 to CY3-3C-12:
CY3-3C-1
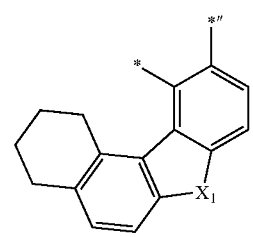
CY3-3C-2
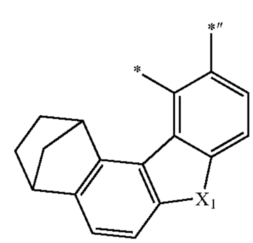

-continued
CY3-3C-3
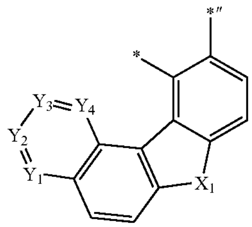
CY3-3C-4
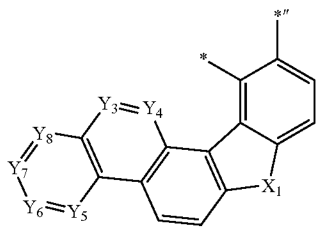
CY3-3C-5
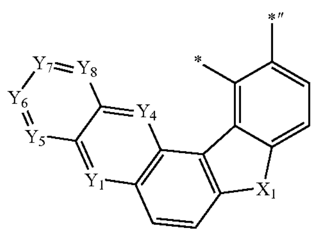
CY3-3C-6
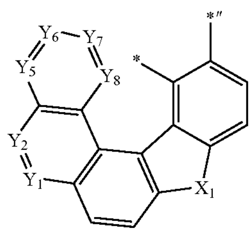
CY3-3C-7
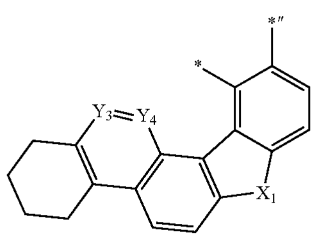
CY3-3C-8
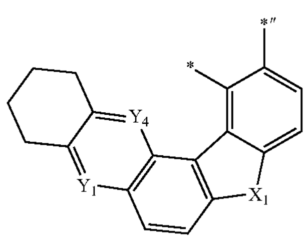
CY3-3C-9
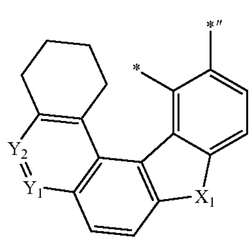
-continued
CY3-3C-10
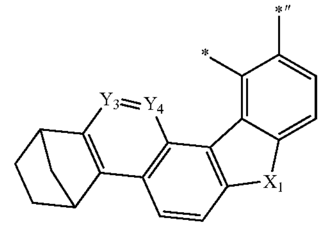
CY3-3C-11
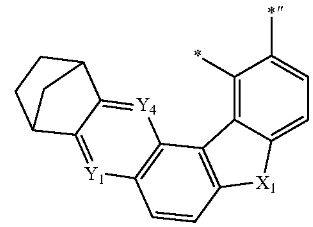
CY3-3C-12
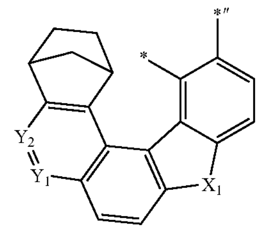
In one or more embodiments, a group represented by
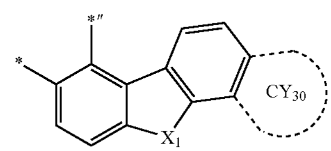
in Formula CY3-4A may be a group represented by one of Formulae CY3-4A-1 to CY3-4A-12:
CY3-4A-1
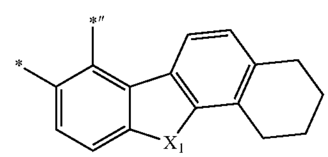
CY3-4A-2
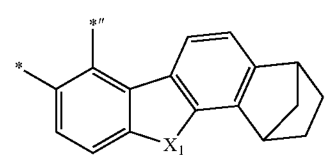
CY3-4A-3
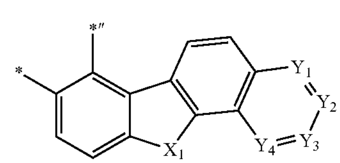

-continued
CY3-4A-4
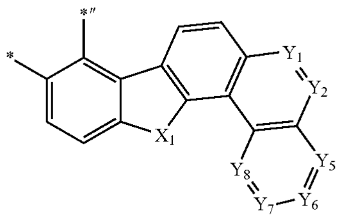
CY3-4A-5
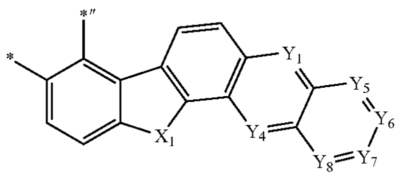
CY3-4A-6
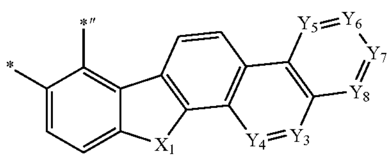
CY3-4A-7
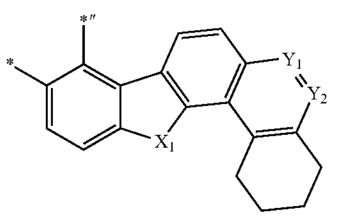
CY3-4A-8
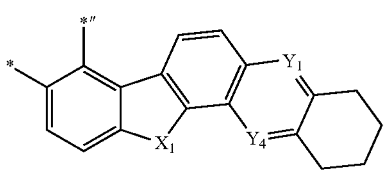
CY3-4A-9
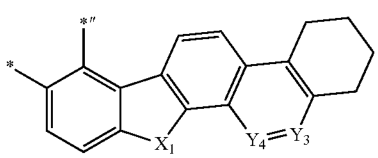
CY3-4A-10
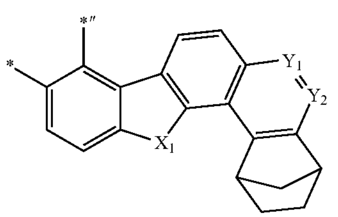
CY3-4A-11
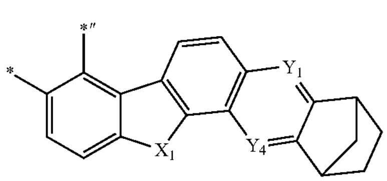
-continued
CY3-4A-12
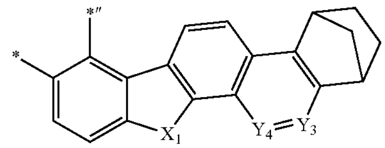
In one or more embodiments, a group represented by
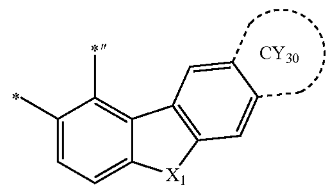
in Formula CY3-41B may be a group represented by one of Formulae CY3-41B-1 to CY3-4B-12:
CY3-4B-1
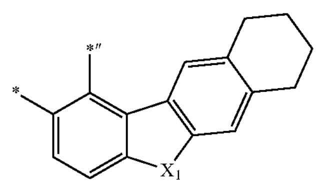
CY3-4B-2
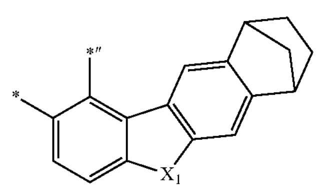
CY3-4B-3
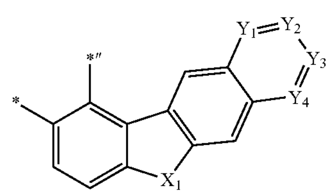
CY3-4B-4
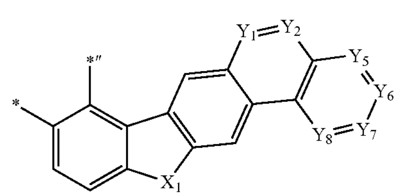
CY3-4B-5
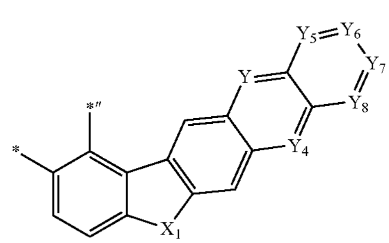

-continued
CY3-4B-6
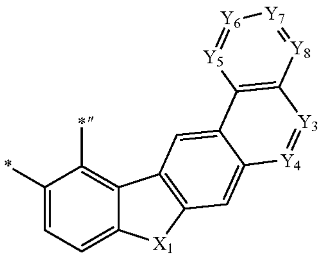
CY3-4B-7
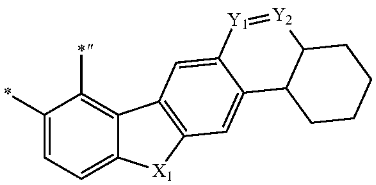
CY3-4B-8
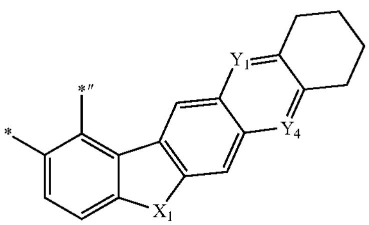
CY3-4B-9
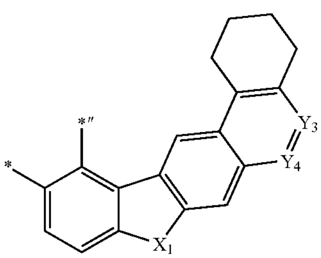
CY3-4B-10
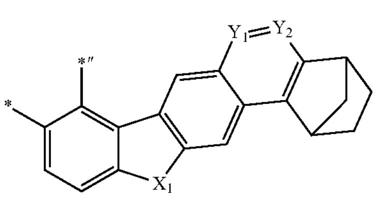
CY3-4B-11
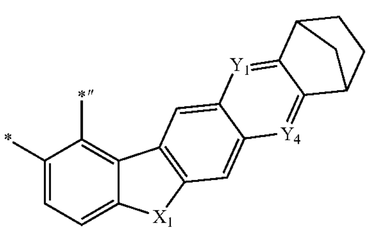
CY3-4B-12
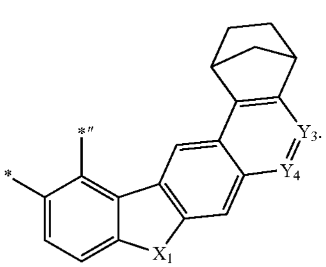
In one or more embodiments, a group represented by
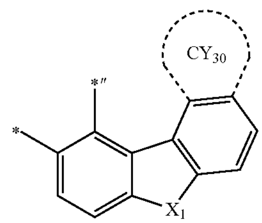
in Formula CY3-4C may be a group represented by one of Formulae CY3-4C-1 to CY3-4C-12:
CY3-4C-1
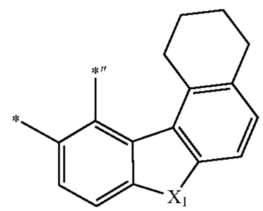
CY3-4C-2
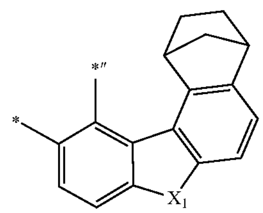
CY3-4C-3
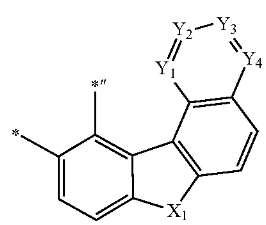
CY3-4C-4
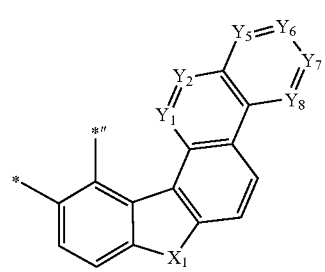
CY3-4C-5
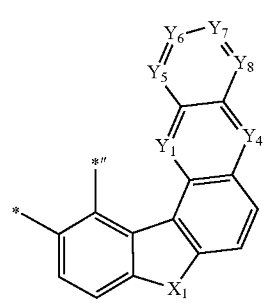

-continued
CY3-4C-6
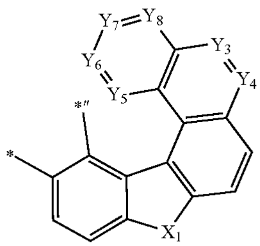
CY3-4C-7
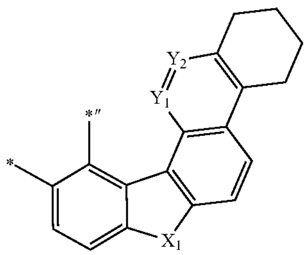
CY3-4C-8
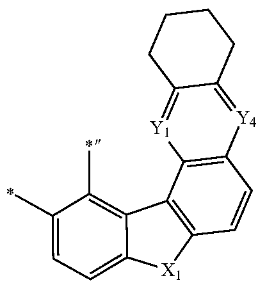
CY3-4C-9
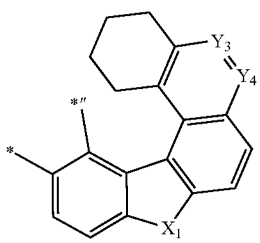
CY3-4C-10
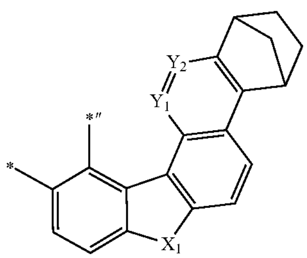
CY3-4C-11
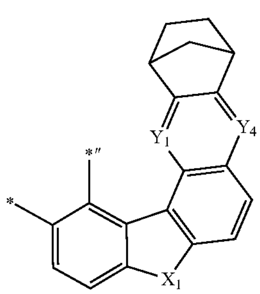
-continued
CY3-4C-12
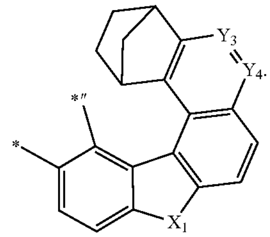
In one or more embodiments, a group represented by
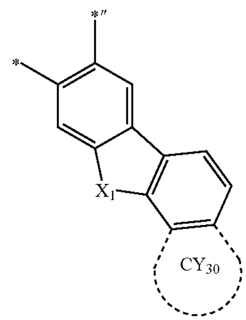
in Formula CY3-5A may be a group represented by one of Formulae CY3-5A-1 to CY3-5A-12:
CY3-5A-1
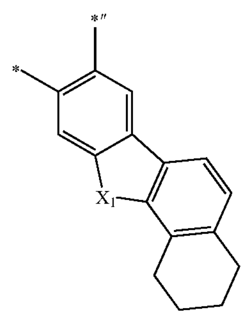
CY3-5A-2
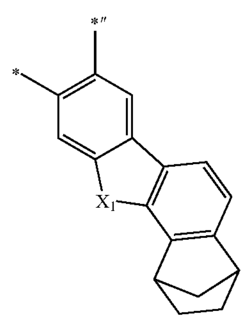

CY3-5A-3
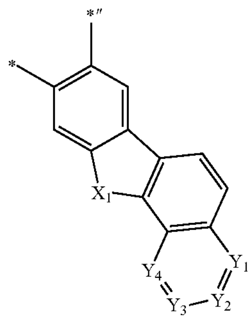
CY3-5A-4
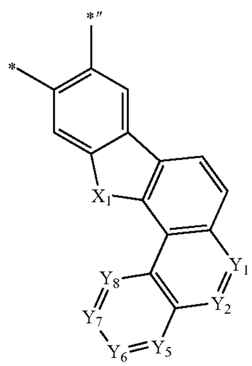
CY3-5A-5
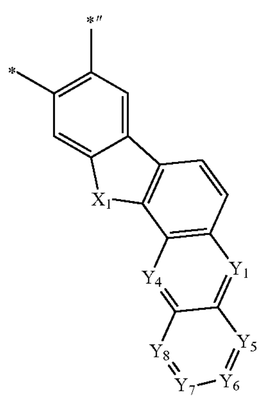
CY3-5A-6
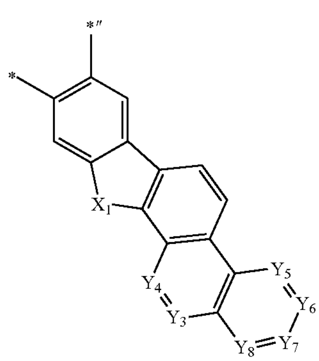
CY3-5A-7
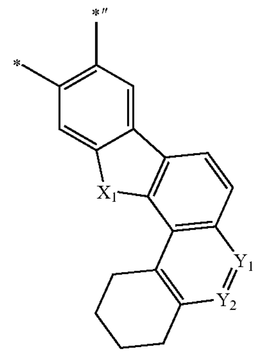
CY3-5A-8
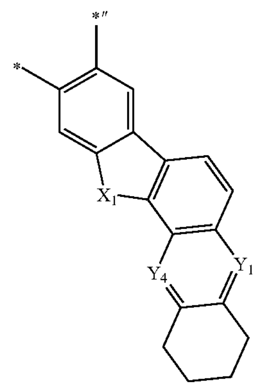
CY3-5A-9
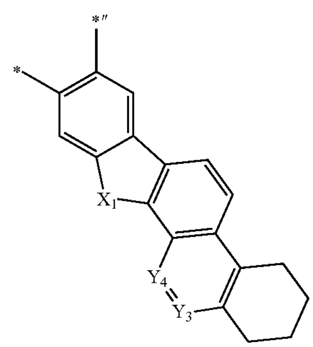
CY3-5A-10
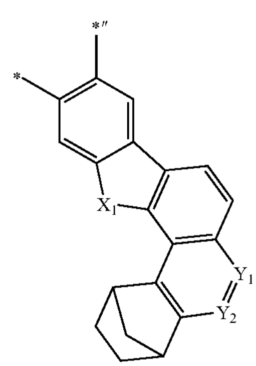

CY3-5A-11
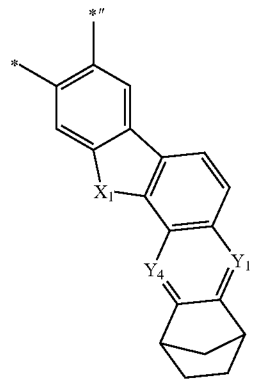
CY3-5A-12
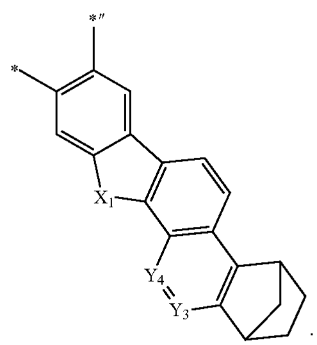
In one or more embodiments, a group represented by
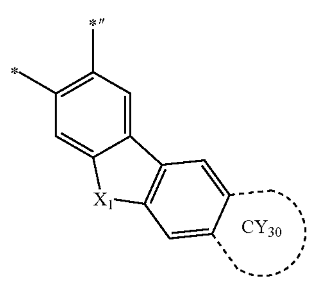
in Formula CY3-5B may be a group represented by one of Formulae CY3-5B-1 to CY3-5B-12:
CY3-5B-1
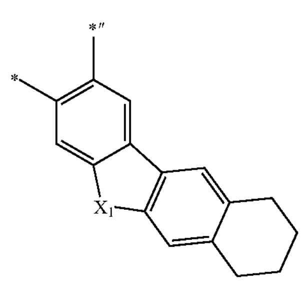
CY3-5B-2
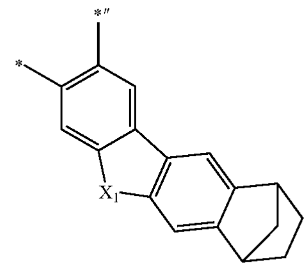
CY3-5B-3
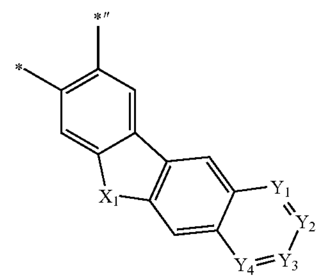
CY3-5B-4
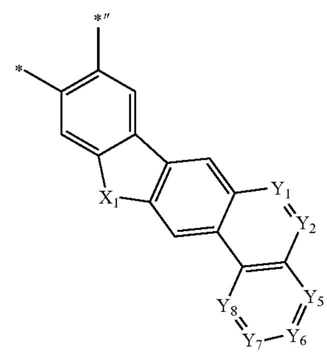
CY3-5B-5
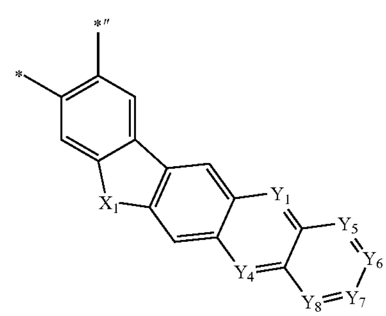
CY3-5B-6
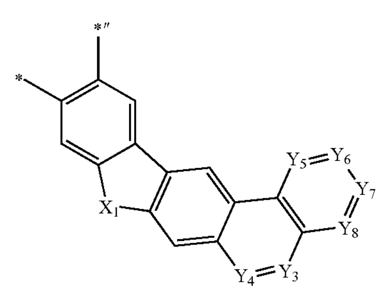

CY3-5B-7
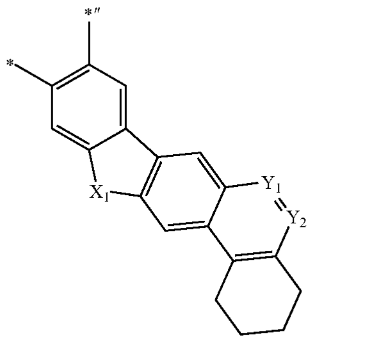
CY3-5B-8
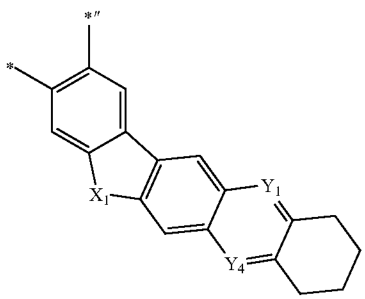
CY3-5B-9
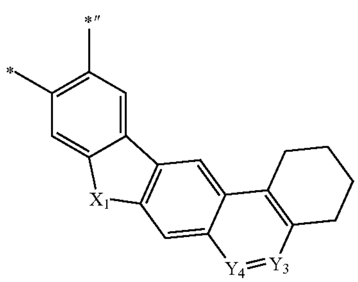
CY3-5B-10
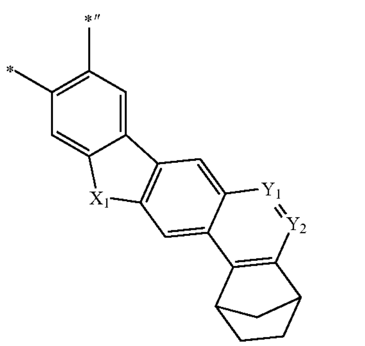
CY3-5B-11
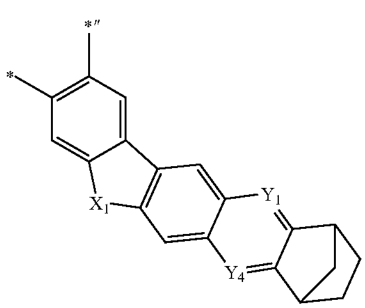
CY3-5B-12
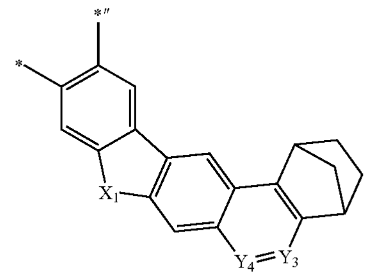
In one or more embodiments, a group represented by
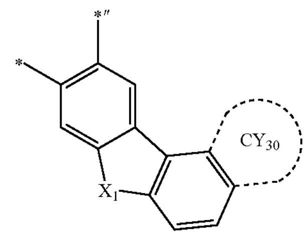
in Formula CY3-5C may be a group represented by one of Formulae CY3-5C-1 to CY3-5C-12:
CY3-5C-1
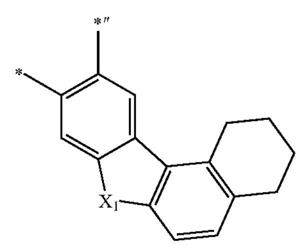
CY3-5C-2
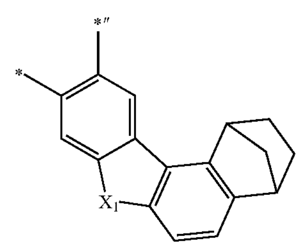
CY3-5C-3
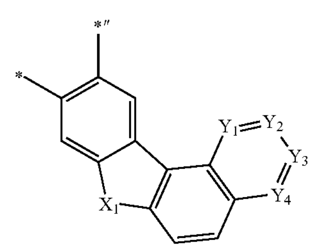

-continued
CY3-5C-4
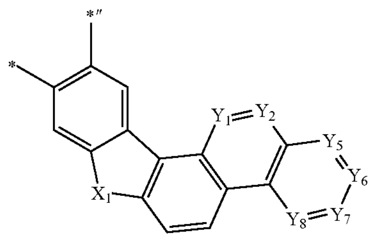
CY3-5C-5
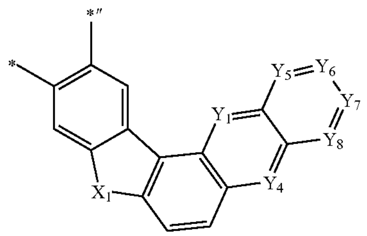
CY3-5C-6
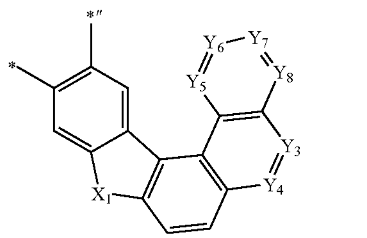
CY3-5C-7
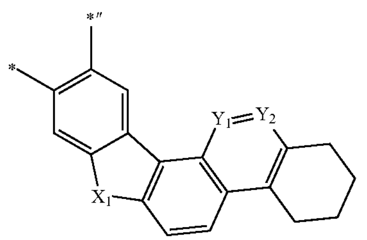
CY3-5C-8
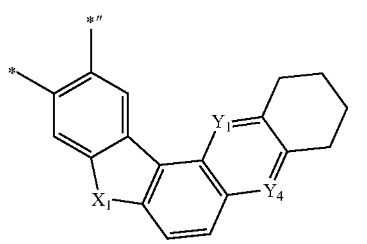
CY3-5C-9
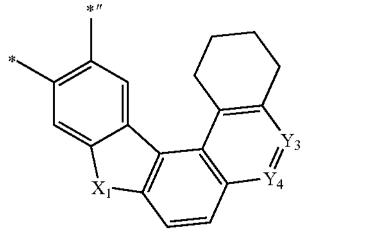
-continued
CY3-5C-10
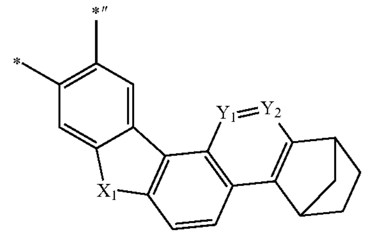
CY3-5C-11
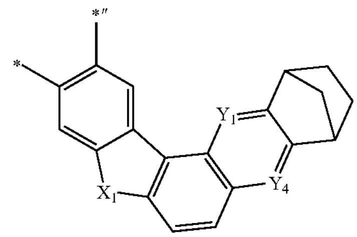
CY3-5C-12
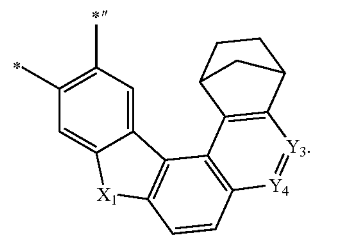
In one or more embodiments, a group represented by
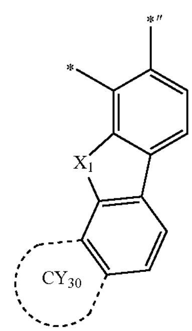
in Formula CY3-6A may be a group represented by one of Formulae CY3-6A-1 to CY3-6A-12:
CY3-6A-1
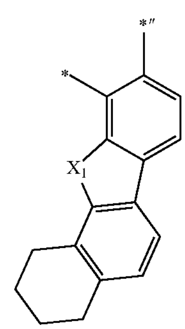

-continued
CY3-6A-2
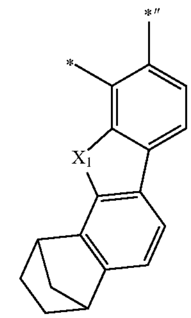
CY3-6A-3
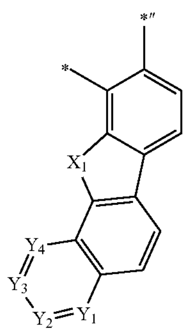
CY3-6A-4
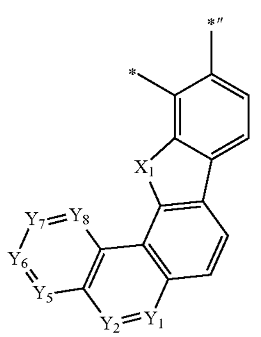
CY3-6A-5
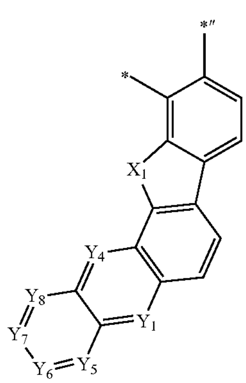
-continued
CY3-6A-6
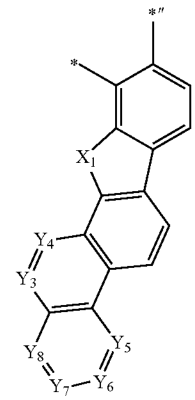
CY3-6A-7
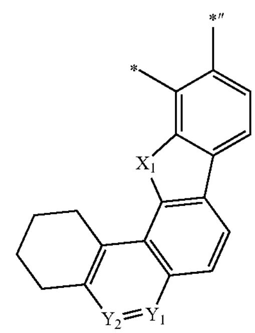
CY3-6A-8
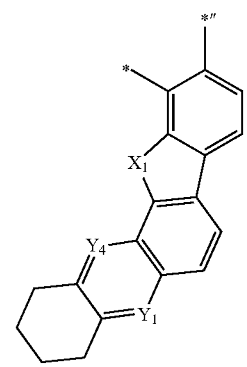
CY3-6A-9
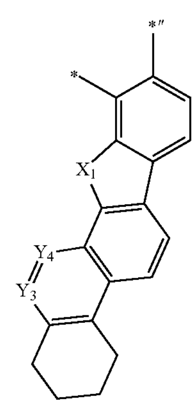

-continued
CY3-6A-10
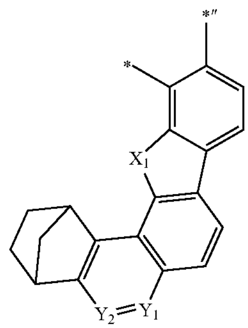
CY3-64-11
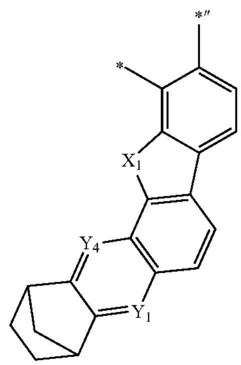
CY3-6A-12
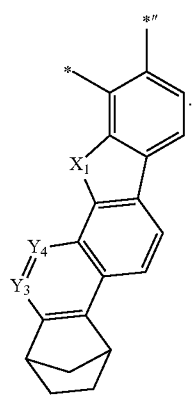
In one or more embodiments, a group represented by
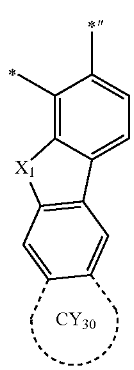
in Formula CY3-6B may be a group represented by one of Formulae CY3-6B-1 to CY3-6B-12:
CY3-6B-1
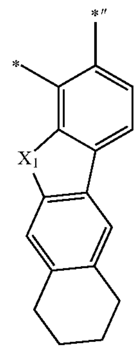
CY3-6B-2
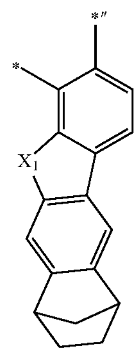
CY3-6B-3
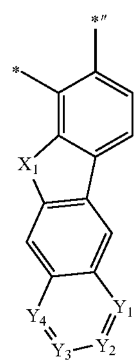
CY3-6B-4
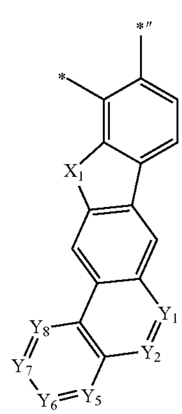

-continued
CY3-6B-5
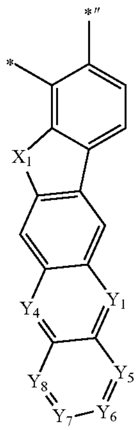
CY3-6B-6
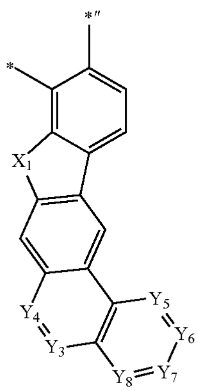
CY3-6B-7
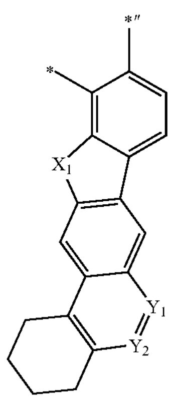
CY3-6B-8
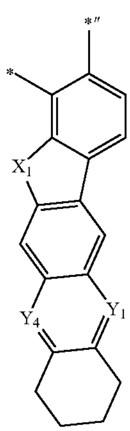
-continued
CY3-6B-9
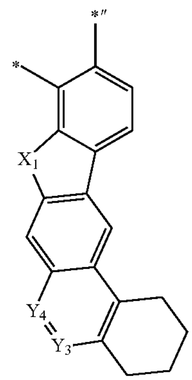
CY3-6B-10
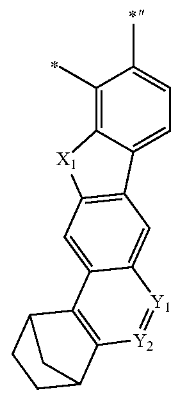
CY3-6B-11
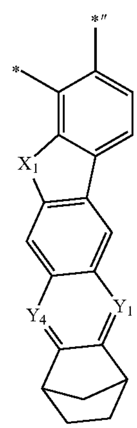
CY3-6B-12
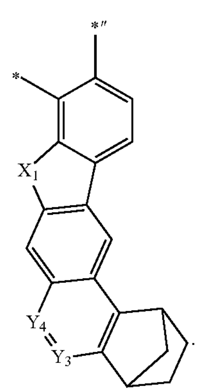

In one or more embodiments, a group represented by
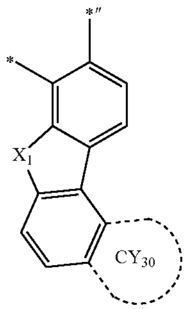
in Formula CY3-6C may be a group represented by one of Formulae CY3-6-1 to CY3-6C-12:
CY3-6C-1
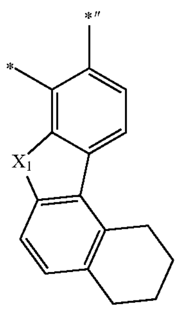
CY3-6C-2
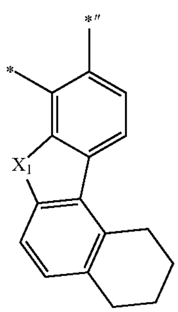
CY3-6C-3
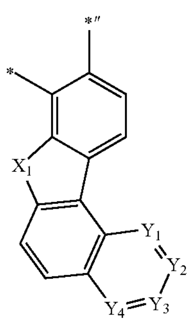
-continued
CY3-6C-4
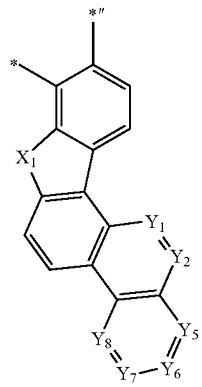
CY3-6C-5
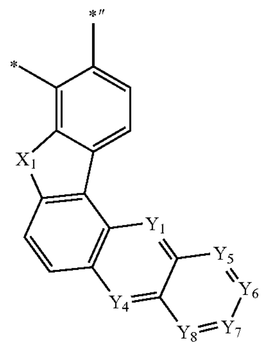
CY3-6C-6
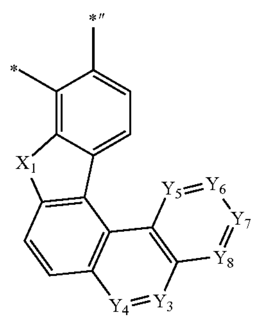
CY3-6C-7
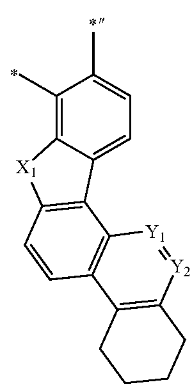

-continued

CY3-6C-8

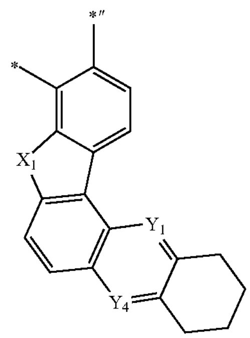

CY3-6C-9

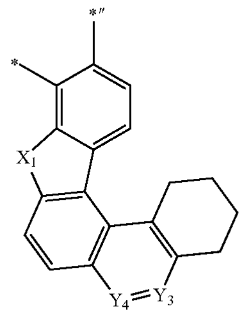

CY3-6C-10

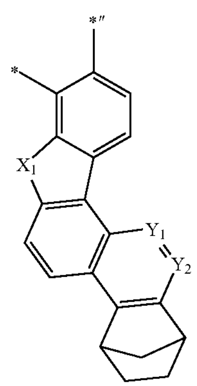

CY3-6C-11

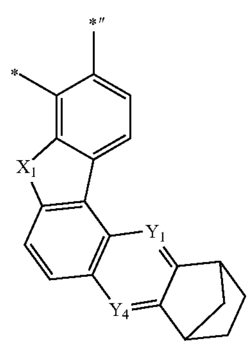

-continued

CY3-6C-12

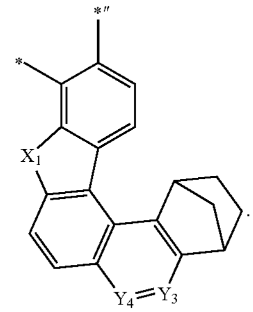

In the Formulae CY3-1A-1 to CY3-1A-12, CY3-1B-1 to CY3-1B-12, CY3-1C-1 to CY3-1C-12, CY3-2A-1 to CY3-2A-12, CY3-2-1 to CY3-2-12, CY3-2C-1 to CY3-2C-12, CY3-3A-1 to CY3-3A-12, CY3-3-1 to CY3-3-12, CY3-3C-1 to CY3-3C-12, CY3-4A-1 to CY3-4A-12, CY3-41B-1 to CY3-41B-12, CY3-4C-1 to CY3-4C-12, CY3-5A-1 to CY3-5A-12, CY3-51B-1 to CY3-51B-12, CY3-5C-1 to CY3-5C-12, CY3-6A-1 to CY3-6A-12, CY3-6B-1 to CY3-6B-12, and CY3-6C-1 to CY3-6C-12, $X_1$ may be the same as described above, $Y_1$ to $Y_8$ may each independently be C or N,

* indicates a binding site to M in Formula 1, and

*" indicates a binding site to a neighboring atom in Formula 3.

For example, $Y_1$ to $Y_8$ may each independently be C.

For example, one of $Y_1$ to $Y_8$ may be N and reminders may be C.

In one or more embodiments, a group represented by

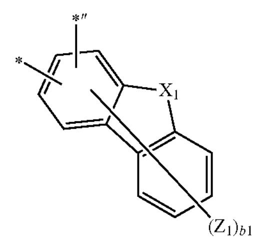

in Formula 3 may be a group represented by one of Formulae CY3(1) to CY3(132):

CY3(1)

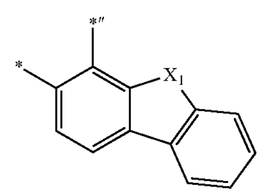

CY3(2)

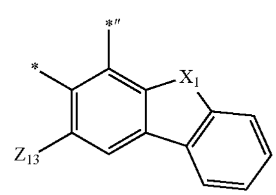

-continued
CY3(3)
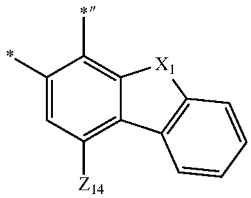
CY3(4)
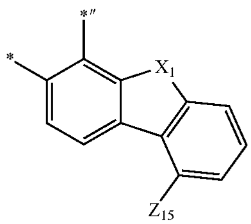
CY3(5)
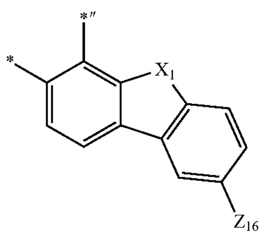
CY3(6)
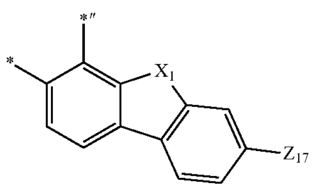
CY3(7)
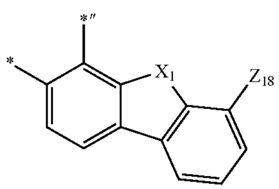
CY3(8)
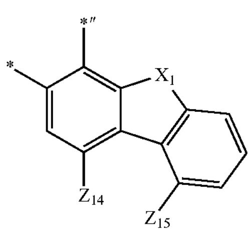
CY3(9)
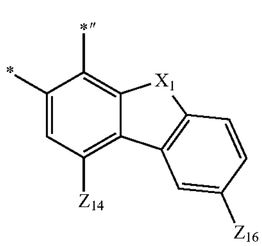
-continued
CY3(10)
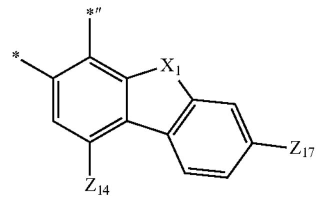
CY3(11)
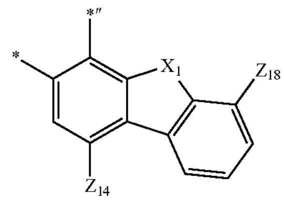
CY3(12)
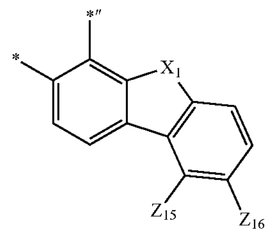
CY3(13)
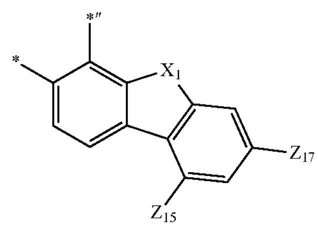
CY3(14)
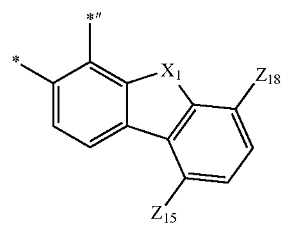
CY3(15)
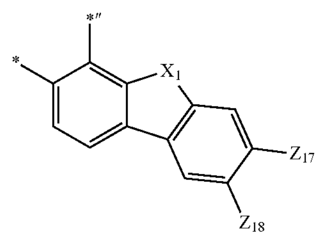
CY3(16)
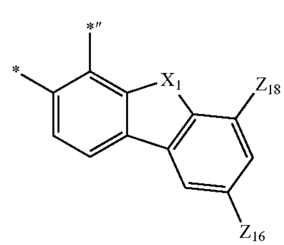

-continued
CY3(17)
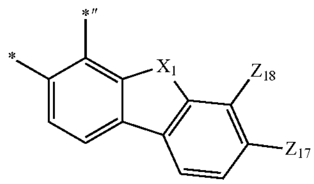
CY3(18)
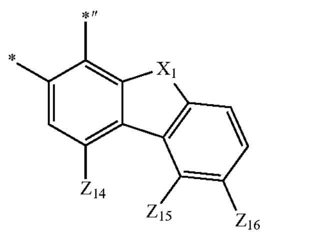
CY3(19)
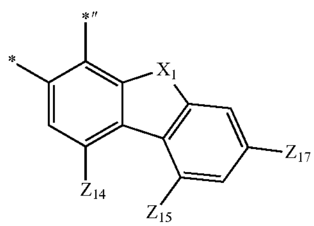
CY3(20)
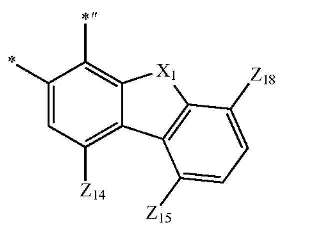
CY3(21)
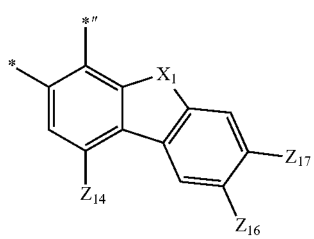
CY3(22)
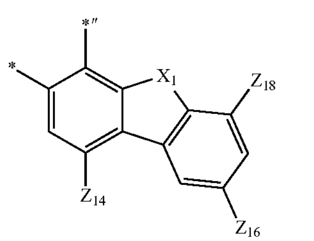
CY3(23)
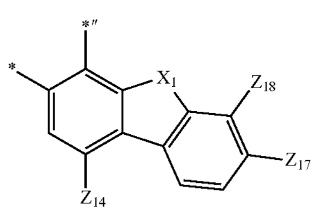
-continued
CY3(24)
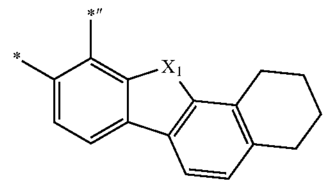
CY3(25)
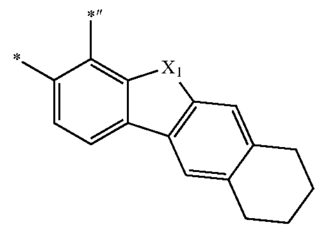
CY3(26)
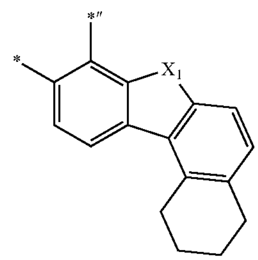
CY3(27)
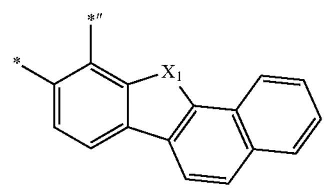
CY3(28)
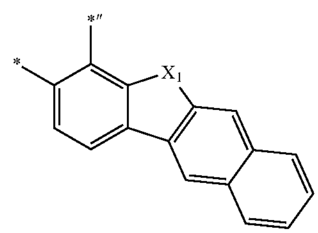
CY3(29)
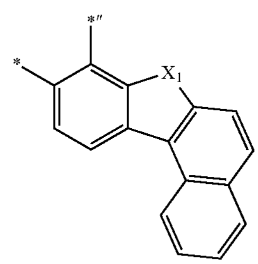
CY3(30)
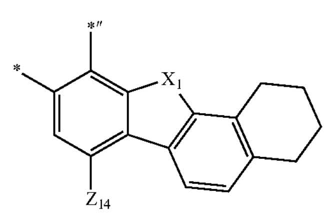

-continued
CY3(31)
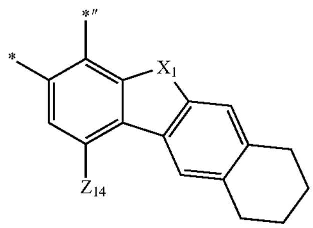
CY3(32)
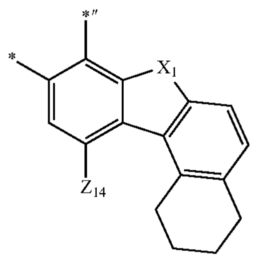
CY3(33)
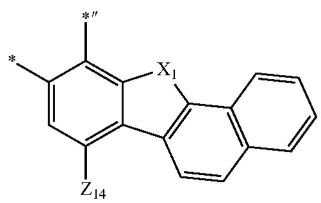
CY3(34)
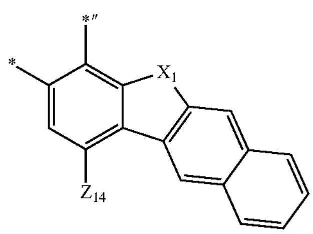
CY3(35)
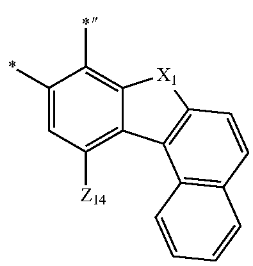
CY3(36)
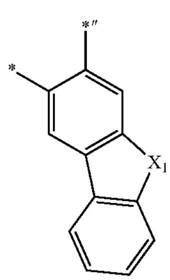
-continued
CY3(37)
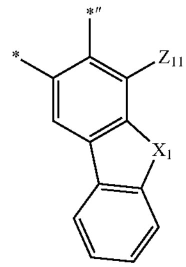
CY3(38)
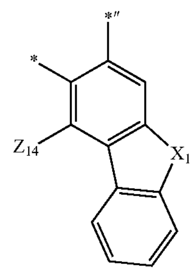
CY3(39)
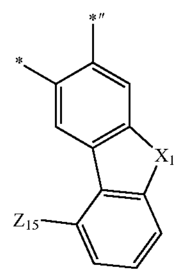
CY3(40)
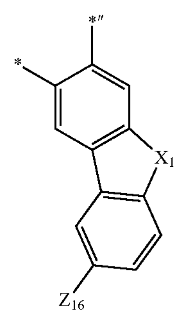
CY3(41)
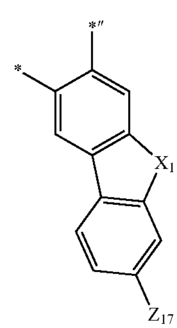

-continued
CY3(42)
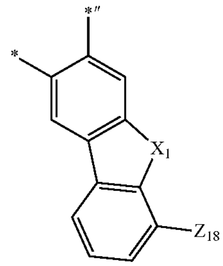
CY3(43)
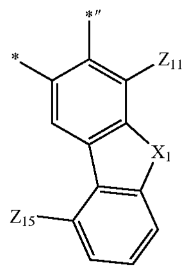
CY3(44)
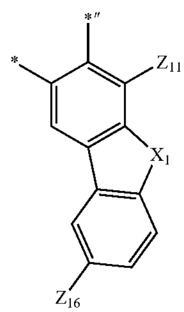
CY3(45)
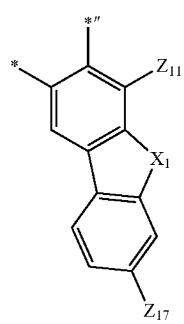
CY3(46)
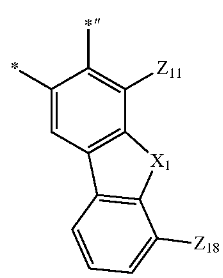
-continued
CY3(47)
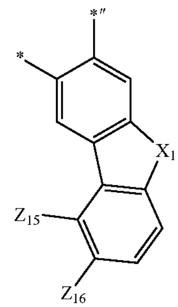
CY3(48)
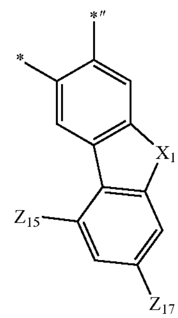
CY3(49)
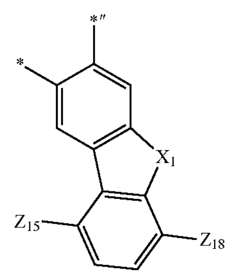
CY3(50)
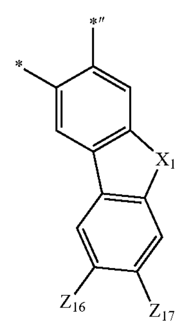
CY3(51)
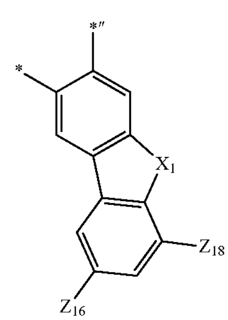

-continued
CY3(52)
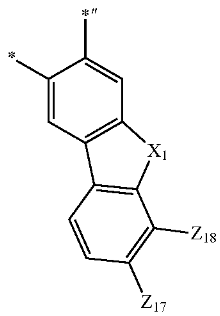
CY3(53)
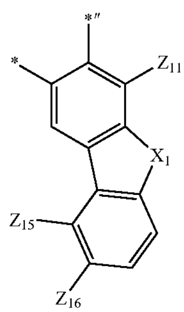
CY3(54)
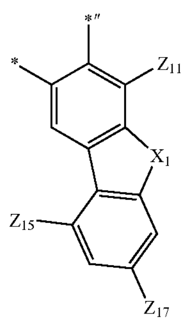
CY3(55)
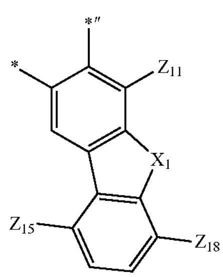
CY3(56)
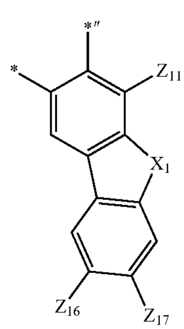
-continued
CY3(57)
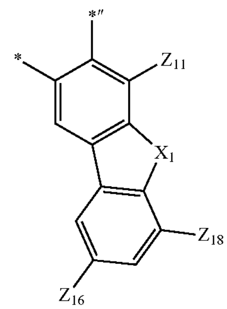
CY3(58)
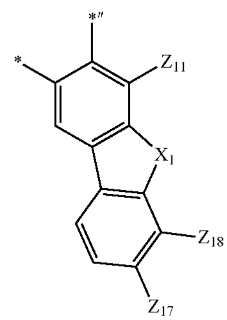
CY3(59)
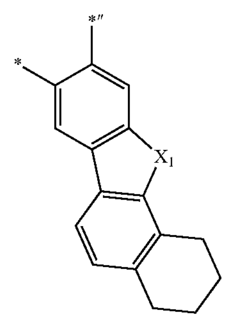
CY3(60)
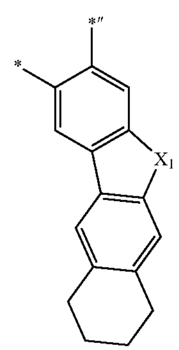
CY3(61)
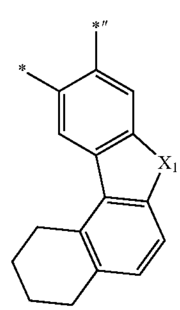

-continued
CY3(62)
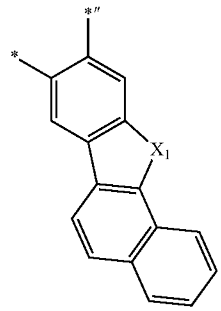
CY3(63)
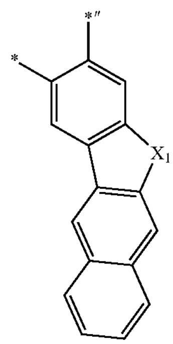
CY3(64)
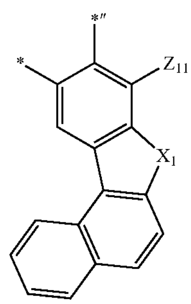
CY3(65)
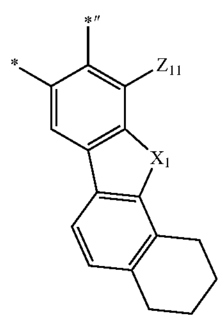
CY3(66)
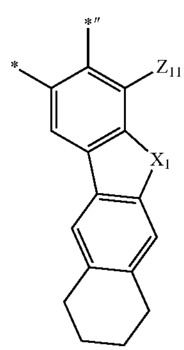
-continued
CY3(67)
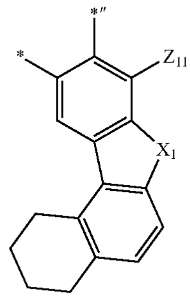
CY3(68)
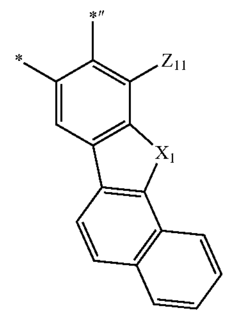
CY3(69)
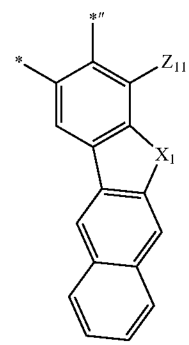
CY3(70)
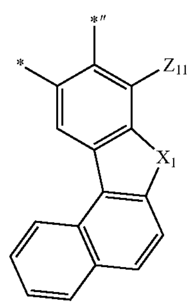
CY3(71)
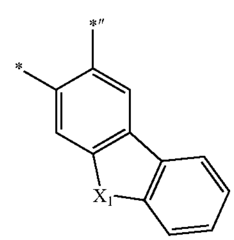

-continued
CY3(72)
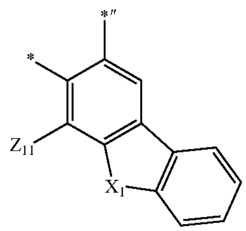
CY3(73)
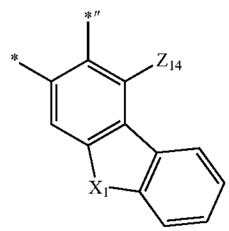
CY3(74)
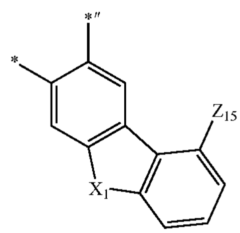
CY3(75)
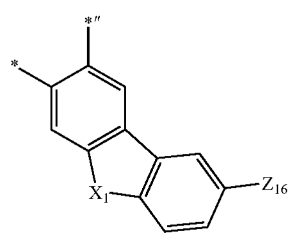
CY3(76)
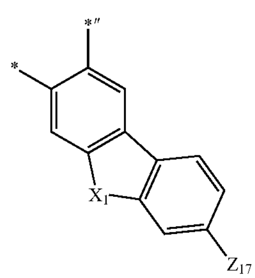
CY3(77)
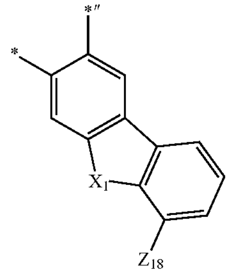
-continued
CY3(78)
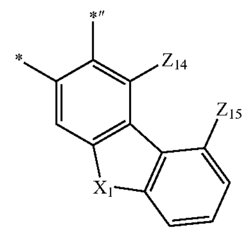
CY3(79)
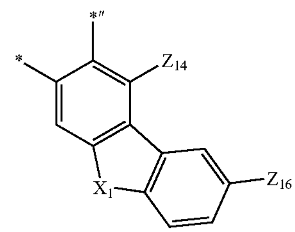
CY3(80)
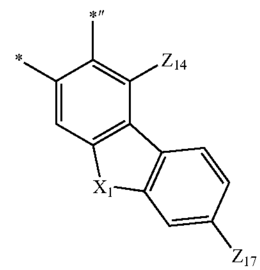
CY3(81)
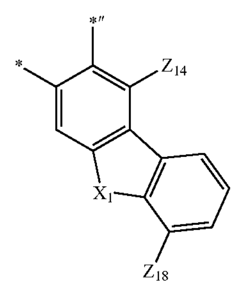
CY3(82)
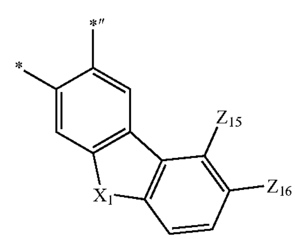
CY3(83)
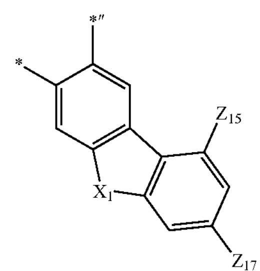

-continued
CY3(84)
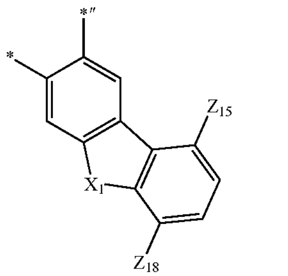
CY3(85)
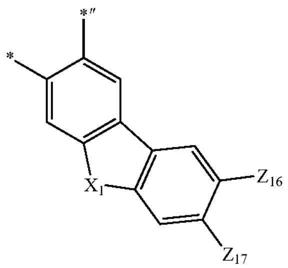
CY3(86)
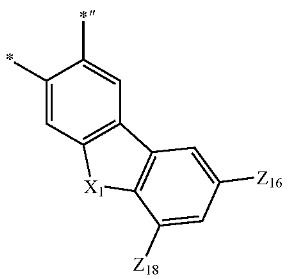
CY3(87)
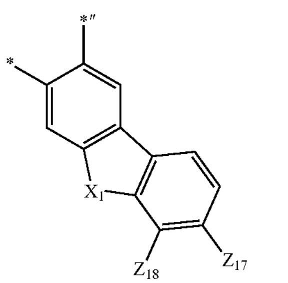
CY3(88)
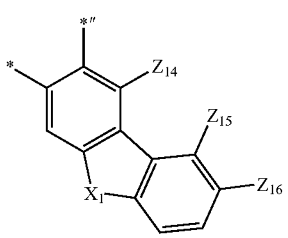
CY3(89)
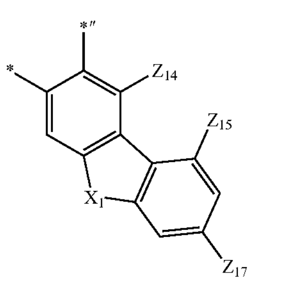
-continued
CY3(90)
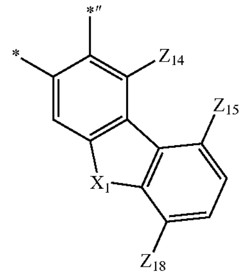
CY3(91)
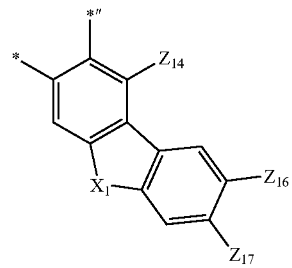
CY3(92)
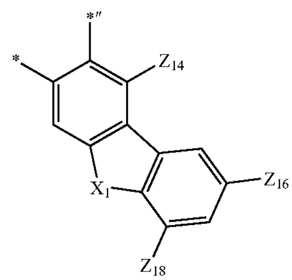
CY3(93)
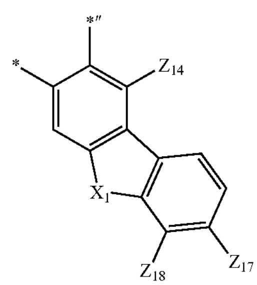
CY3(94)
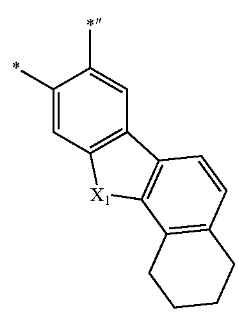

-continued
CY3(95)
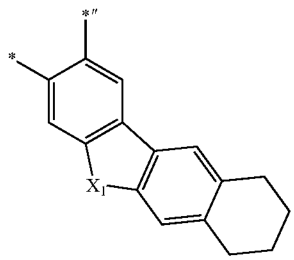
CY3(96)
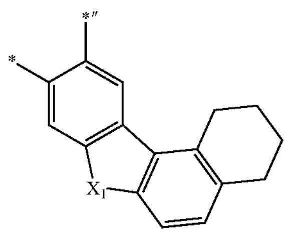
CY3(97)
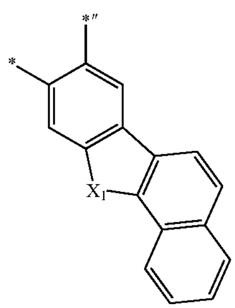
CY3(98)
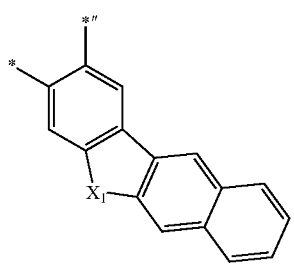
CY3(99)
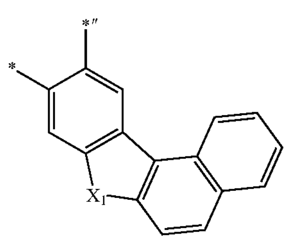
CY3(100)
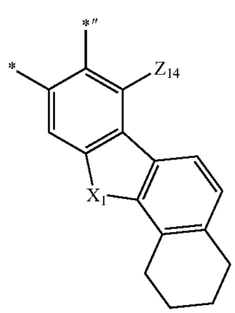
-continued
CY3(101)
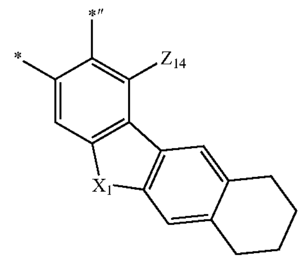
CY3(102)
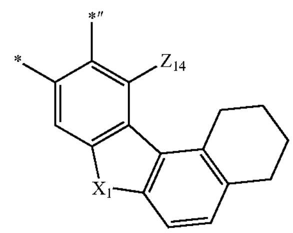
CY3(103)
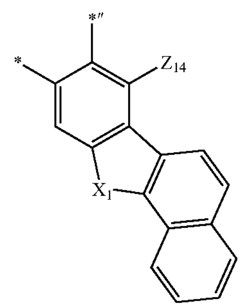
CY3(104)
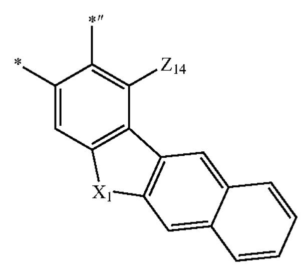
CY3(105)
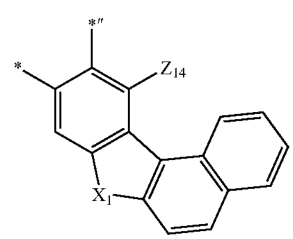
CY3(106)
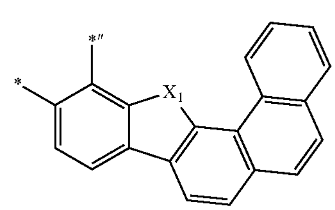

-continued
CY3(107)
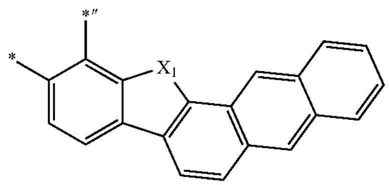
CY3(108)
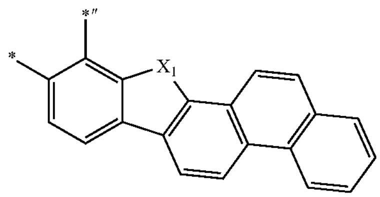
CY3(109)
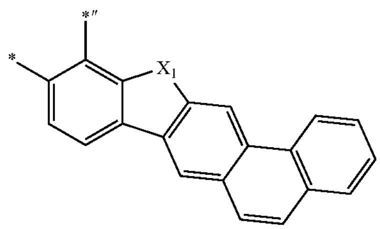
CY3(110)
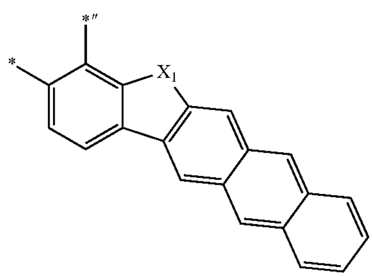
CY3(111)
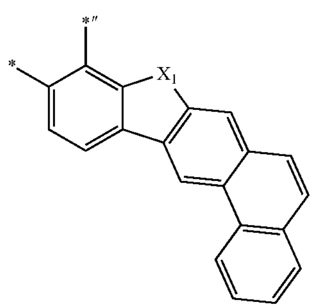
CY3(112)
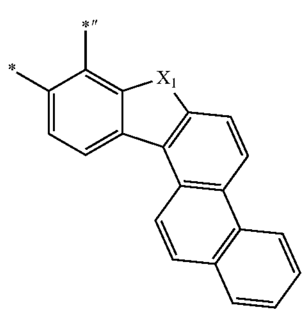
-continued
CY3(113)
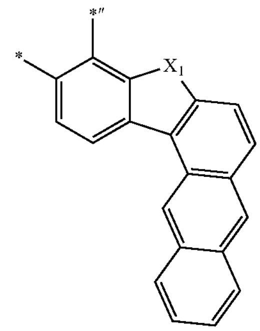
CY3(114)
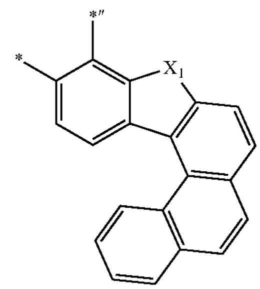
CY3(115)
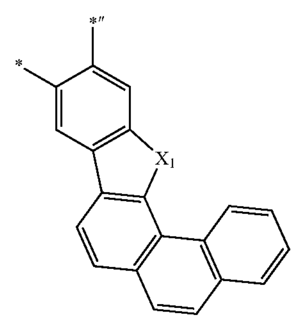
CY3(116)
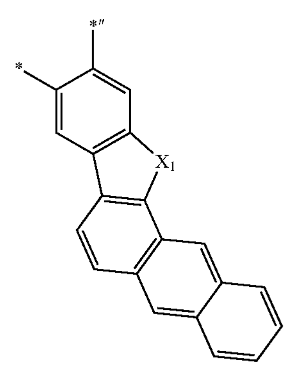

-continued
CY3(117)
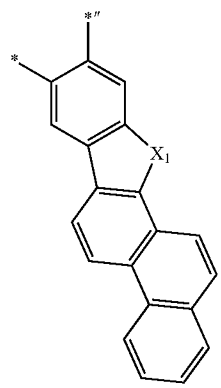
CY3(118)
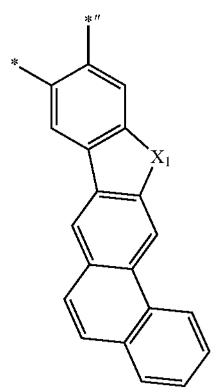
CY3(119)
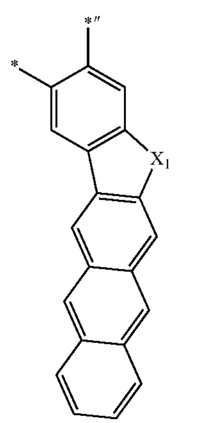
CY3(120)
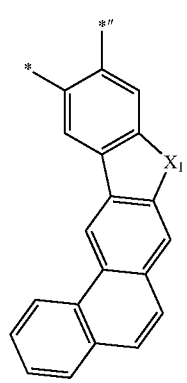
-continued
CY3(121)
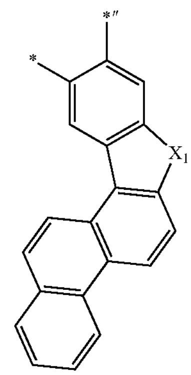
CY3(122)
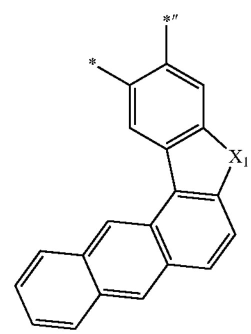
CY3(123)
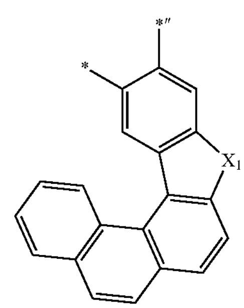
CY3(124)
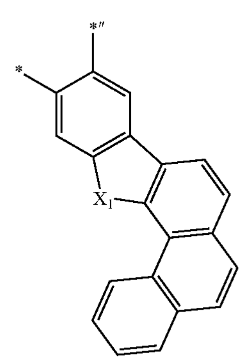

-continued

CY3(125)

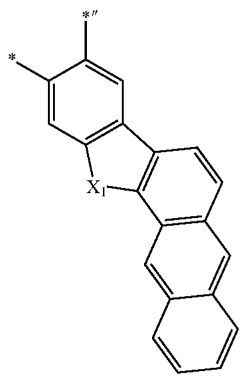

CY3(126)

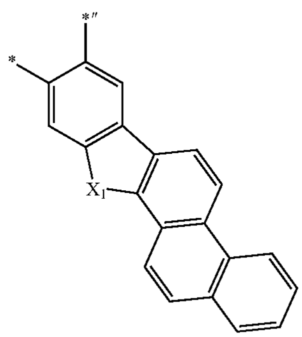

CY3(127)

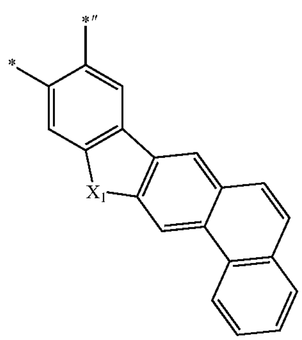

CY3(128)

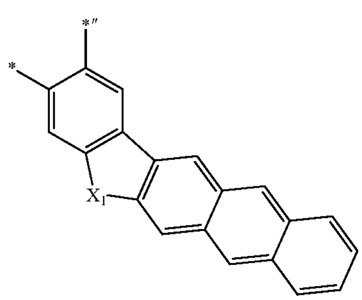

CY3(129)

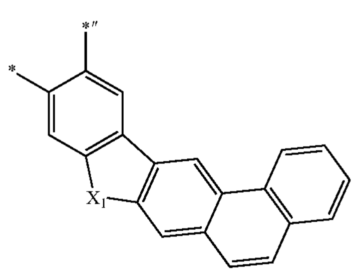

-continued

CY3(130)

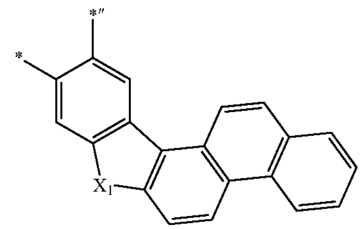

CY3(131)

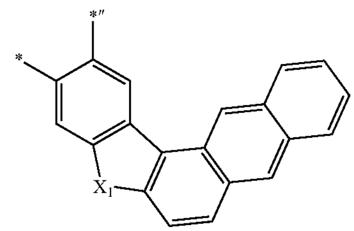

CY3(132)

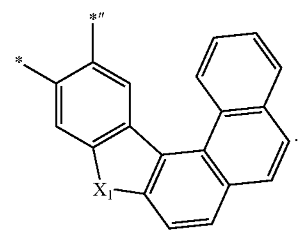

In Formulae CY3(1) to CY3(132), $X_1$ is the same as described above, $Z_{11}$ to $Z_{18}$ are the same as described in connection with $Z_1$, and each of $Z_{11}$ to $Z_{18}$ is not hydrogen,

* indicates a binding site to M in Formula 1, and

*" indicates a binding site to a neighboring atom in Formula 3.

In one or more embodiments, a group represented by

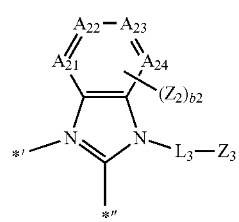

in Formula 3 may be a group represented by one of Formulae CY4-1 to CY4-60:

CY4-1

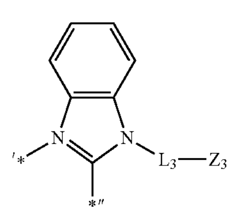

-continued
CYR-2
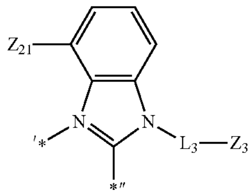
CY4-3
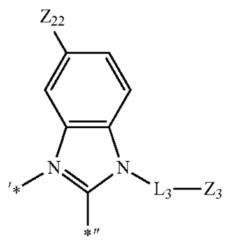
CY4-4
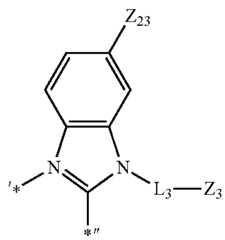
CY4-5
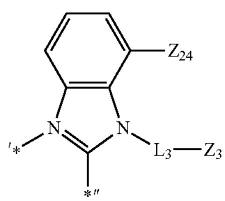
CY4-6
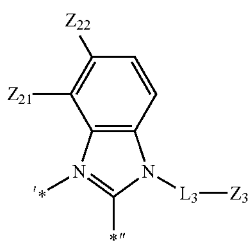
CY4-7
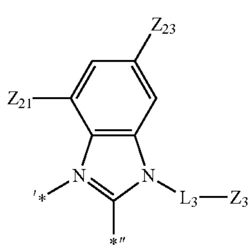
CY4-8
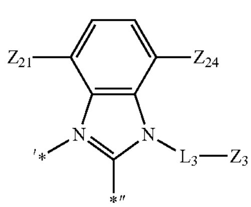
-continued
CY4-9
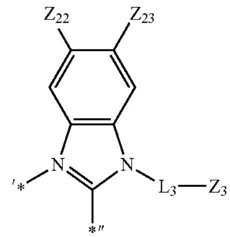
CY4-10
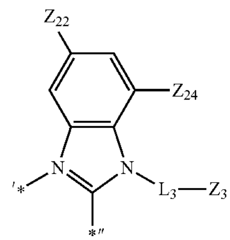
CY4-11
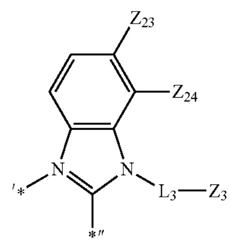
CY4-12
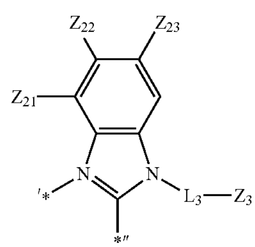
CY4-13
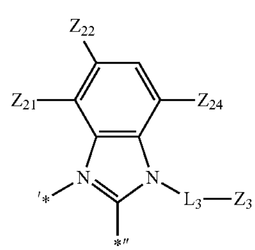
CY4-14
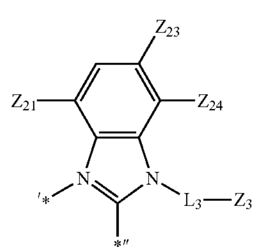

CY4-15
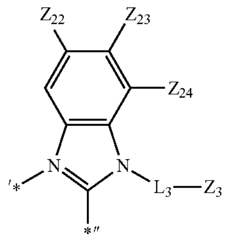
CY4-16
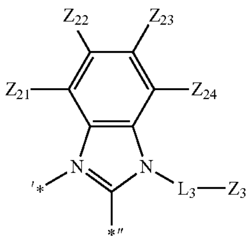
CY4-17
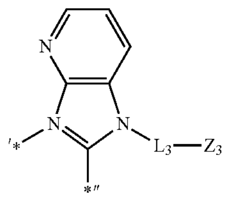
CY4-18
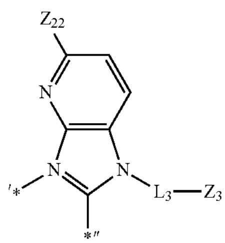
CY4-19
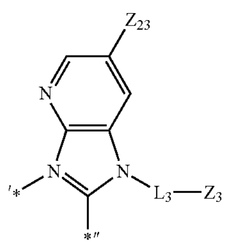
CY4-20
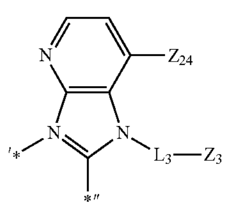
CY4-21
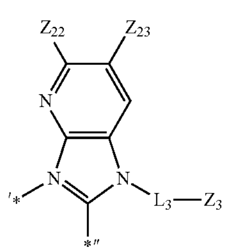
CY4-22
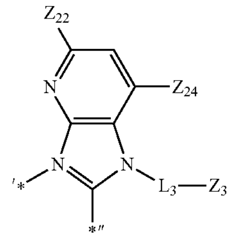
CY4-23
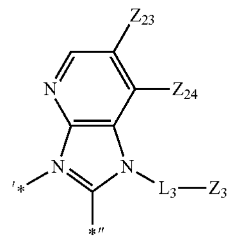
CY4-24
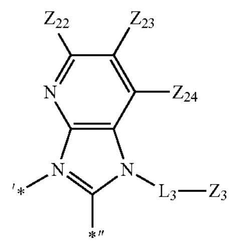
CY4-25
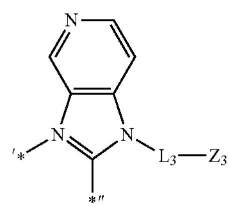
CY4-26
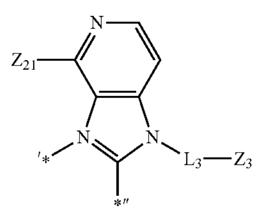
CY4-27
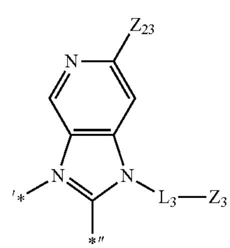
CY4-28
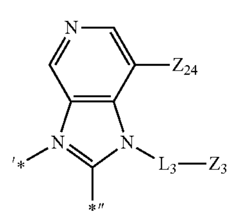

-continued
CY4-29
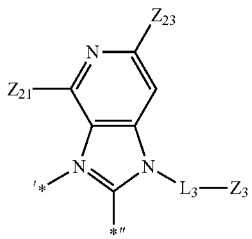
CY4-30
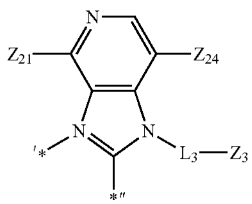
CY4-31
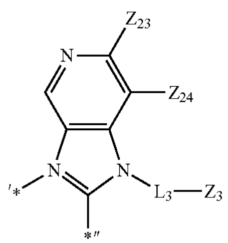
CY4-32
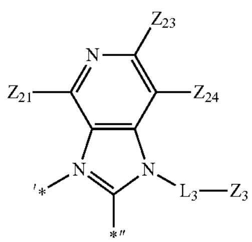
CY4-33
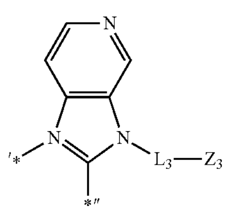
CY4-34
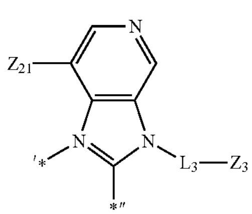
CY4-35
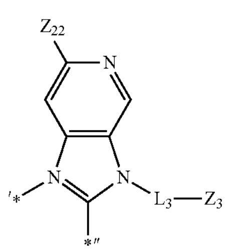
-continued
CY4-36
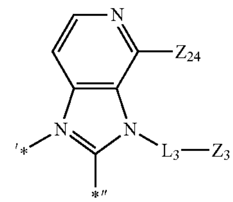
CY4-37
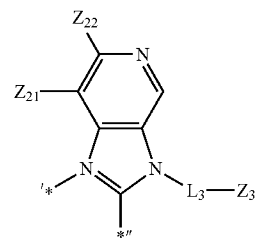
CY4-38
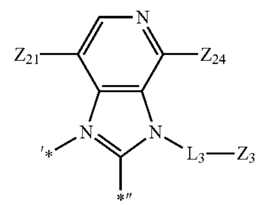
CY4-39
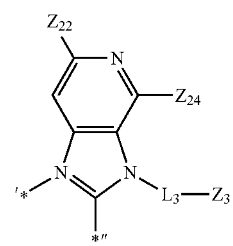
CY4-40
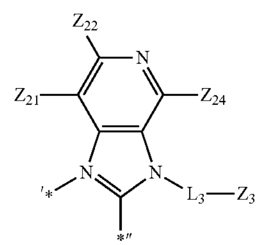
CY4-41
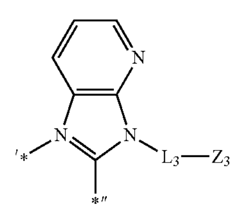
CY4-42
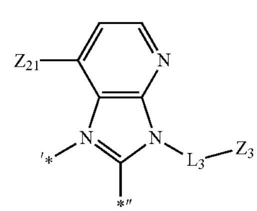

-continued
CY4-43
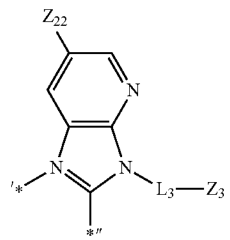
CY4-44
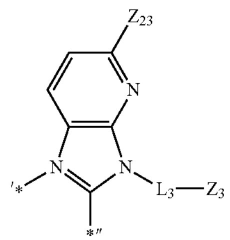
CY4-45
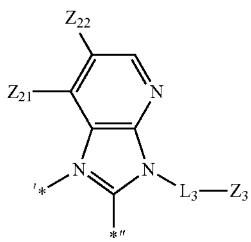
CY4-46
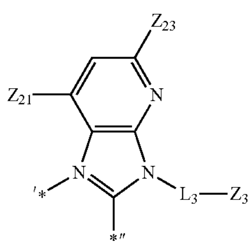
CY4-47
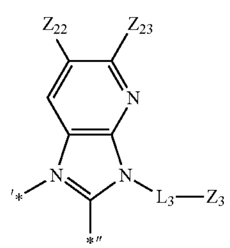
CY4-48
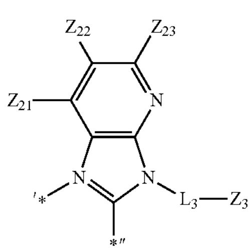
-continued
CY4-49
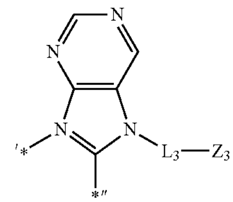
CY4-50
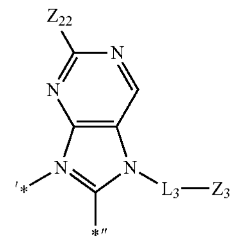
CY4-51
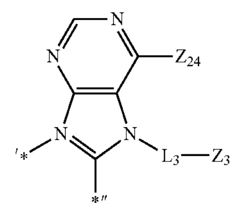
CY4-52
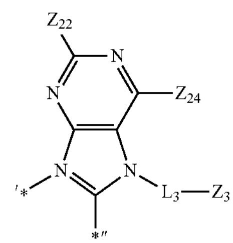
CY4-53
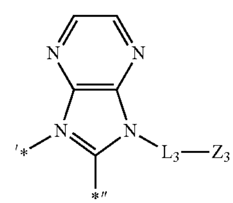
CY4-54
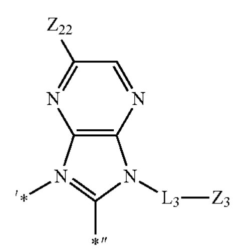
CY4-55
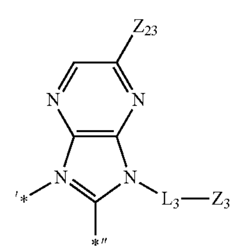

-continued

CY4-56

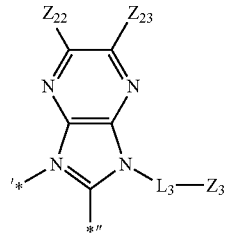

CY4-57

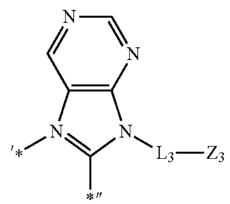

CY4-58

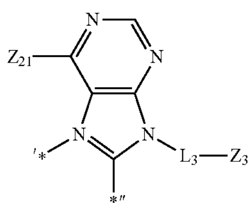

CY4-59

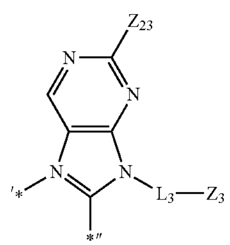

CY4-60

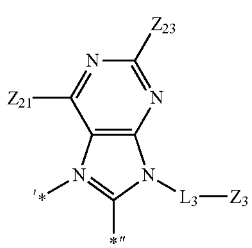

In Formulae CY4-1 to CY4-60, $L_3$ and $Z_3$ are the same as described above, $Z_{21}$ to $Z_{24}$ are the same as described in connection with $Z_2$, and each of $Z_{21}$ to $Z_{24}$ is not hydrogen,

*' indicates a binding site to M in Formula 1, and

*" indicates a binding site to a neighboring atom in Formula 3.

In one or more embodiments, two or more of a plurality of $Z_2$(s) in a group represented by

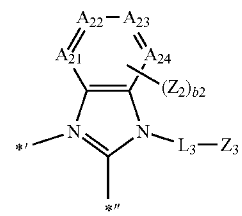

in Formula 3 may be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$. As a result, a group represented by

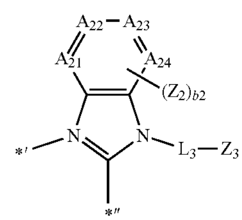

in Formula 3 may be a group represented by one of Formulae CY4(1) to CY4(4):

CY4(1)

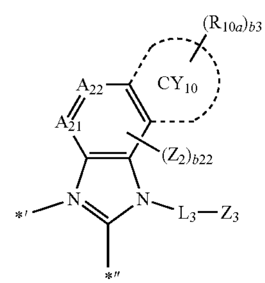

CY4(2)

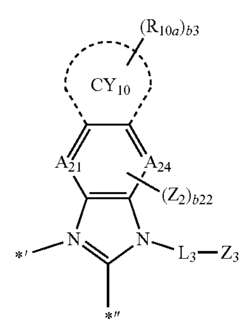

-continued

CY4(3)

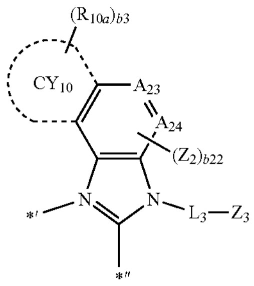

CY4(4)

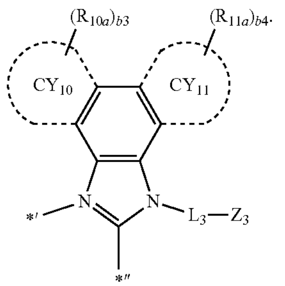

In Formulae CY4(1) to CY4(4), $A_{21}$ to $A_{24}$, $L_3$, $Z_2$, $Z_3$ and $R_{10a}$ are the same as described above, b22 may be an integer from 0 to 2, ring $CY_{10}$ and ring $CY_{11}$ may each independently be a $C_5$-$C_{30}$ carbocyclic group or a $C_1$-$C_{30}$ heterocyclic group, $R_{11a}$ is the same as described in connection with $R_{10a}$, b3 and b4 may each independently be an integer from 0 to 20, when b3 is 2 or more, two or more $R_{10a}$(s) may be identical to or different from each other, and when b4 is 2 or more, two or more $R_{11a}$(s) may be identical to or different from each other,

*' indicates a binding site to M in Formula 1, and

*" indicates a binding site to a neighboring atom in Formula 3.

For example, ring $CY_{10}$ and ring $CY_{11}$ in Formulae CY4(1) to CY4(4) may each independently be a benzene group or a naphthalene group.

In one or more embodiments, a group represented by

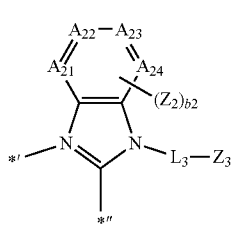

in Formula 3 may be a group represented by one of Formulae CY4(1)-1 to CY4(1)-4, CY4(2)-1 to CY4(2)-4, CY4(3)-1 to CY4(3)-4 and CY4(4)-1:

CY4(1)-1

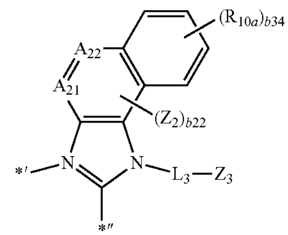

CY4(1)-2

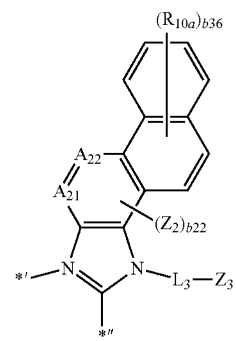

CY4(1)-3

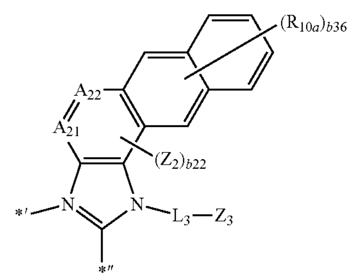

CY4(1)-4

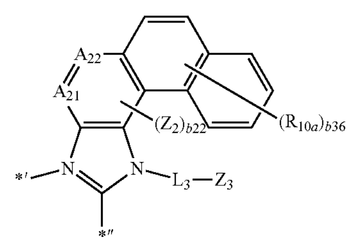

CY4(2)-1

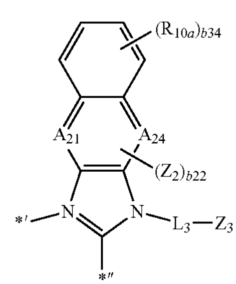

-continued

CY4(2)-2

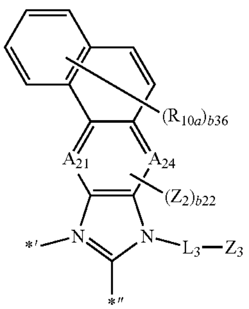

CY4(2)-3

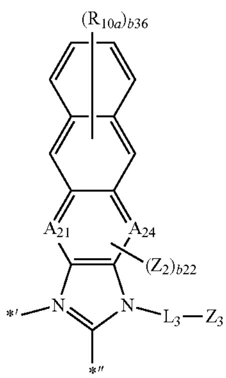

CY4(2)-4

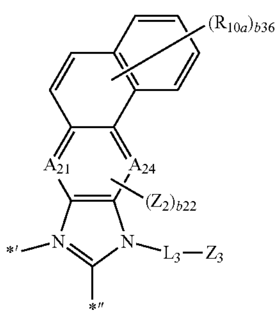

CY4(3)-1

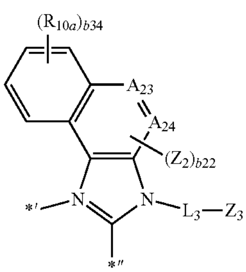

CY4(3)-2

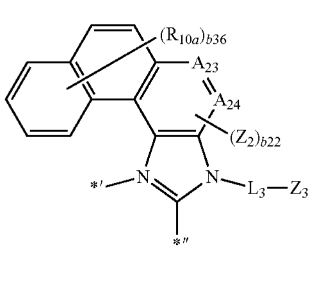

-continued

CY4(3)-3

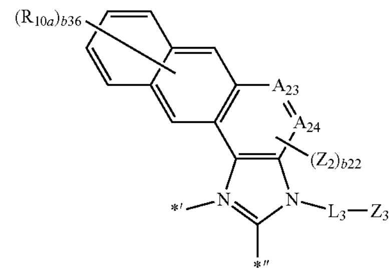

CY4(3)-4

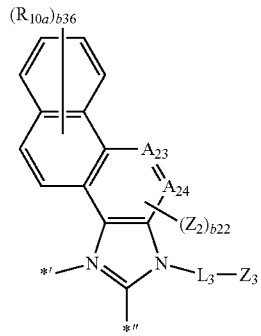

CY4(4)-1

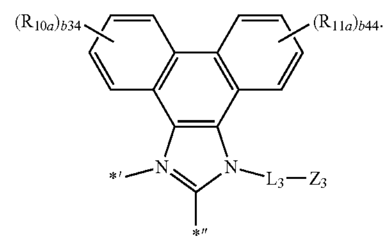

In Formulae CY4(1)-1 to CY4(1)-4, CY4(2)-1 to CY4(2)-4, CY4(3)-1 to CY4(3)-4 and CY4(4)-1, $A_{21}$ to $A_{24}$, $L_3$, $Z_2$, $Z_3$ and $R_{10a}$ are the same as described above, b22 may be an integer from 0 to 2, $R_{11a}$ is the same as described in connection with $R_{10a}$, b34 and b44 may each independently be an integer from 0 to 4, when b34 is 2 or more, two or more $R_{10a}$(s) may be identical to or different from each other, and when b44 is 2 or more, two or more $R_{11a}$(s) may be identical to or different from each other, b36 may be an integer from 0 to 6, when b36 is 2 or more, two or more $R_{10a}$(s) may be identical to or different from each other,

*' indicates a binding site to M in Formula 1, and

*" indicates a binding site to a neighboring atom in Formula 3.

In one or more embodiments, the organometallic compound represented by Formula 1 may emit red light or green light, for example, red light or green light, each having a maximum emission wavelength of about 500 nm or more, for example, from about 500 nm or more and about 850 nm or less. For example, the organometallic compound may emit green light.

For example, the organometallic compound may be one of Compounds 1 to 3350 below:
1
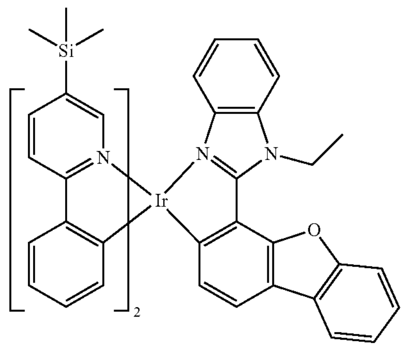
2
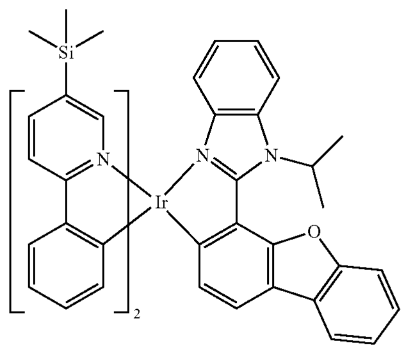
3
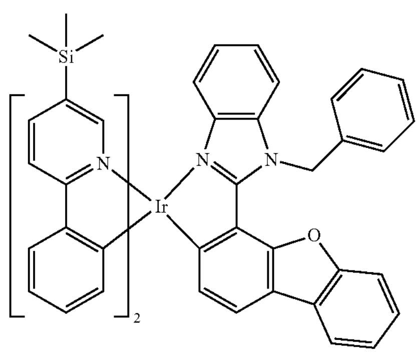
4
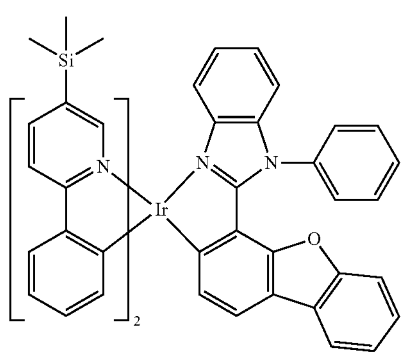
-continued
5
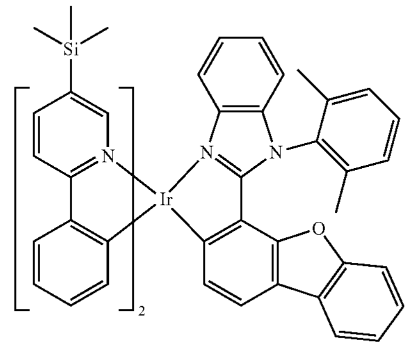
6
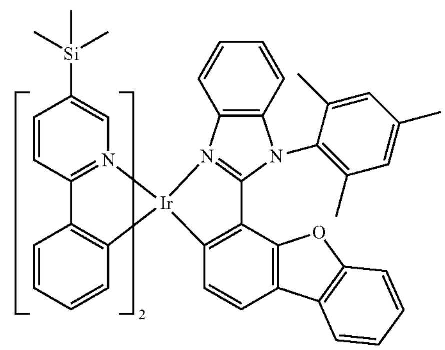
7
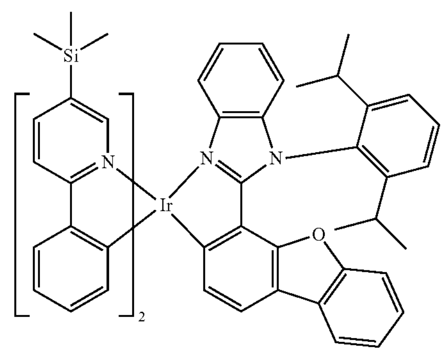
8
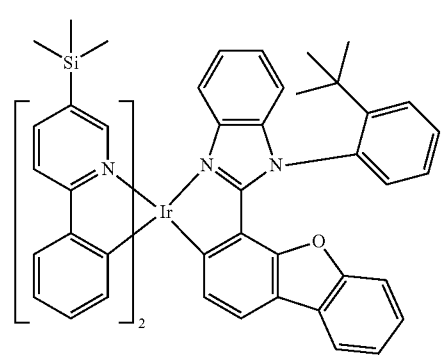

-continued
9
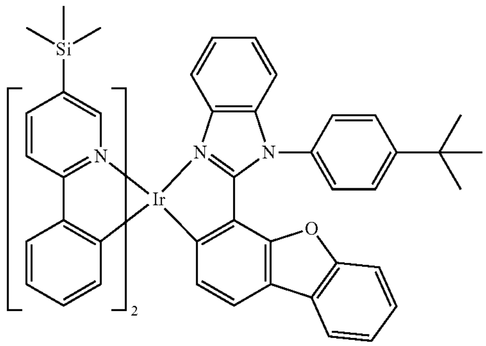
10
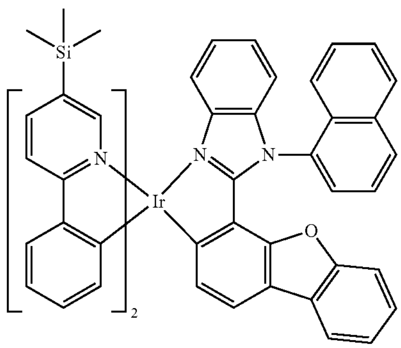
11
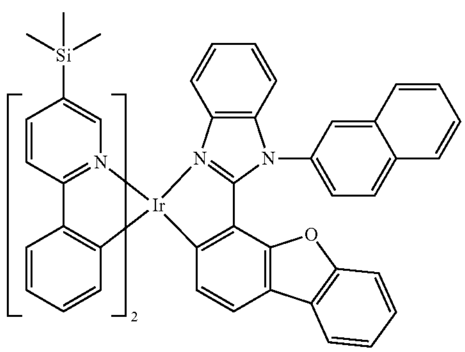
12
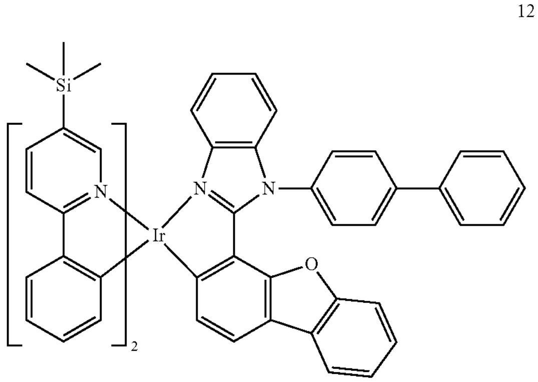
-continued
13
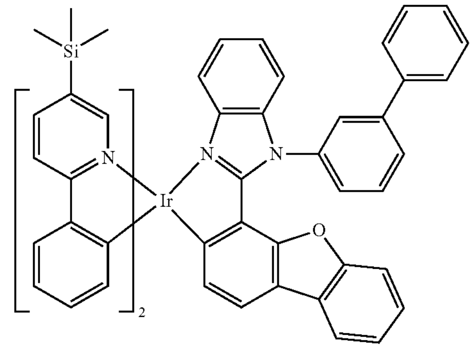
14
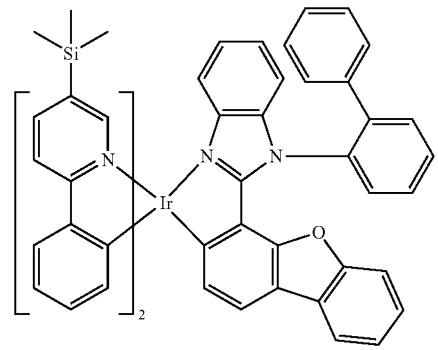
15
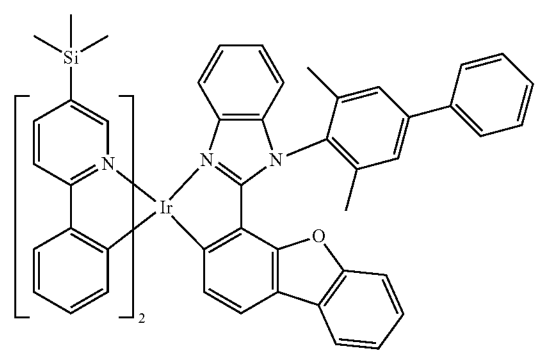
16
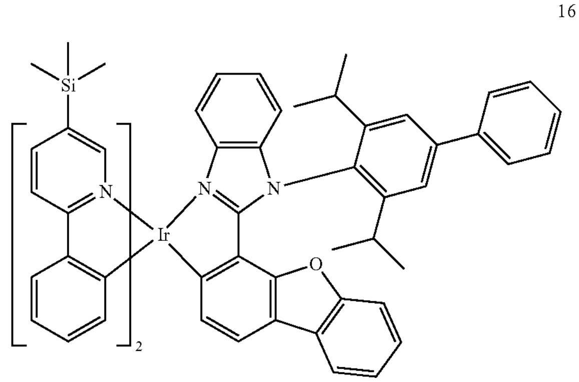

-continued
17
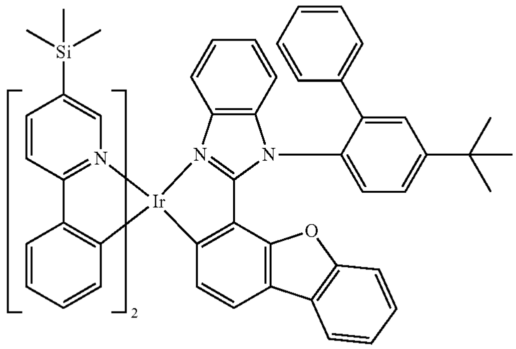
18
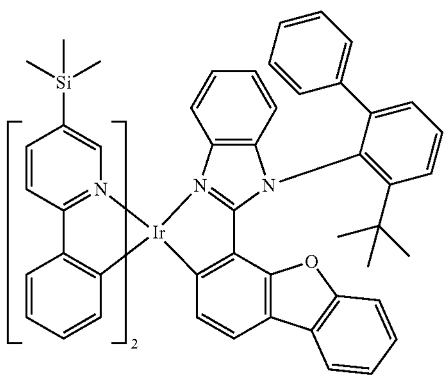
19
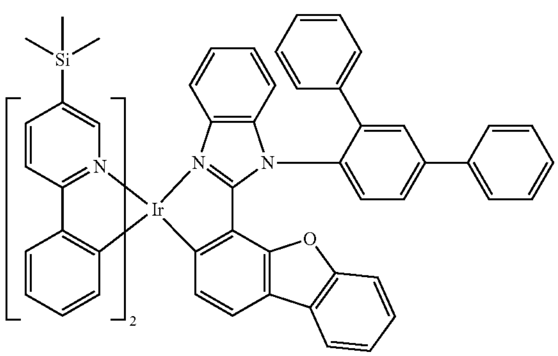
20
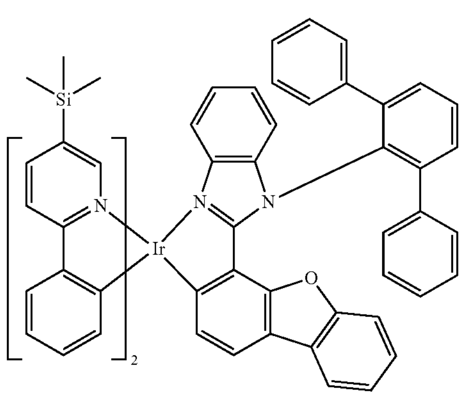
-continued
21
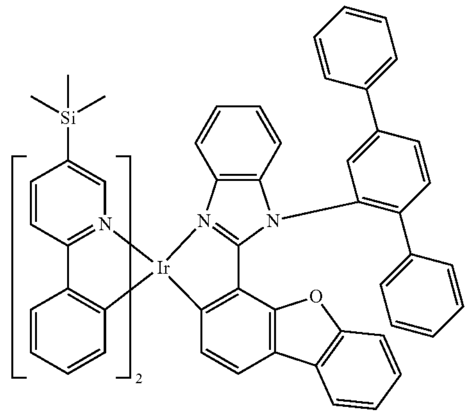
22
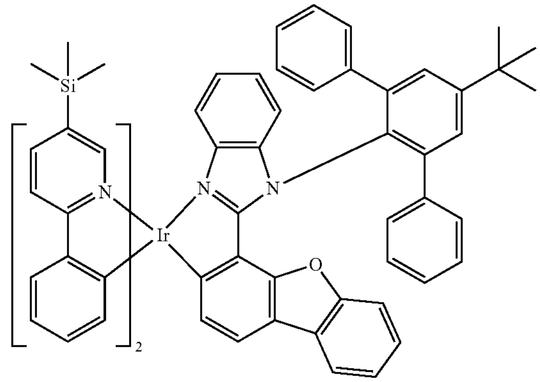
23
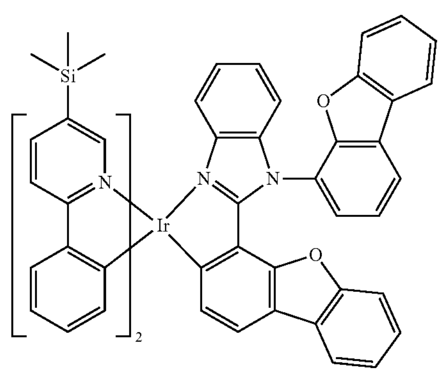
24
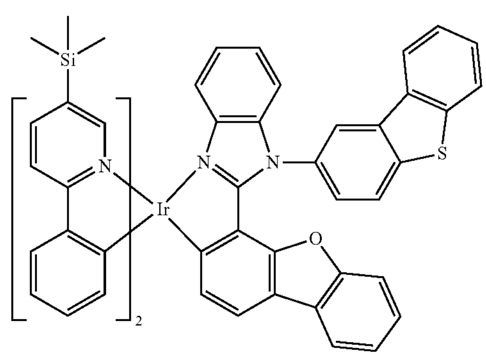

-continued
25
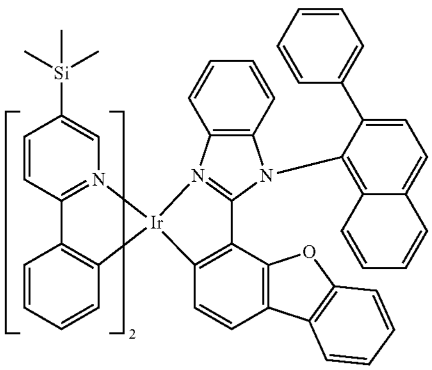
26
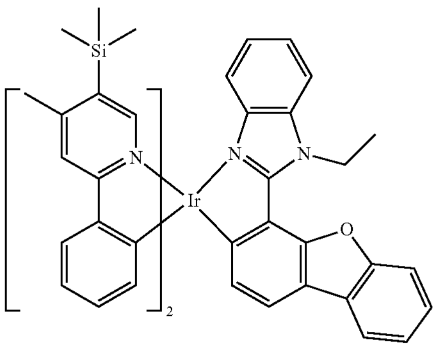
27
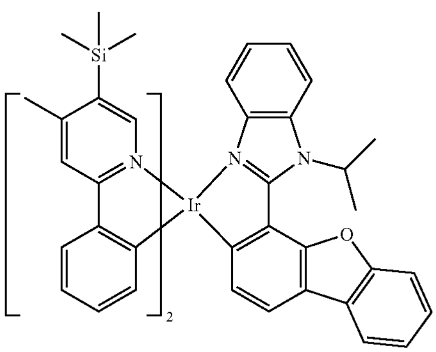
28
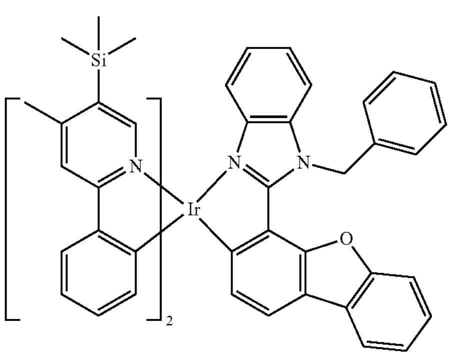
-continued
29
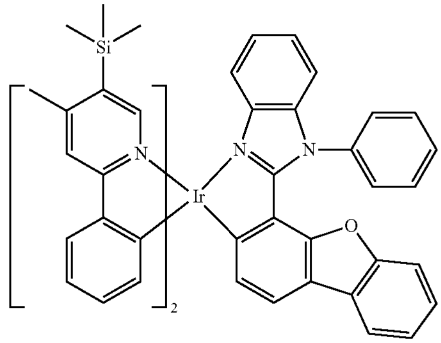
30
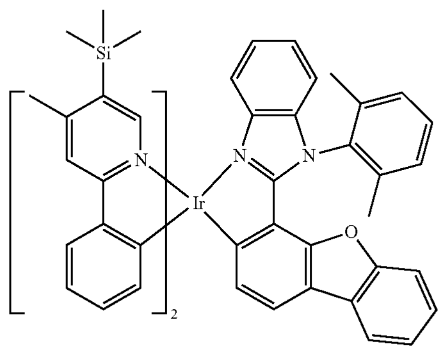
31
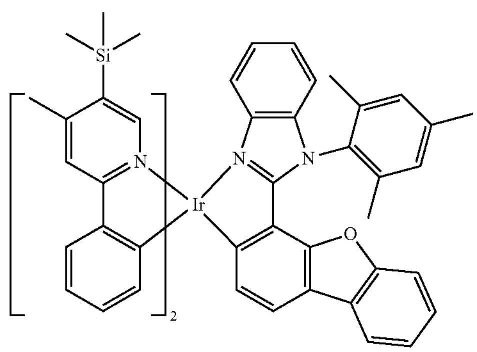
32
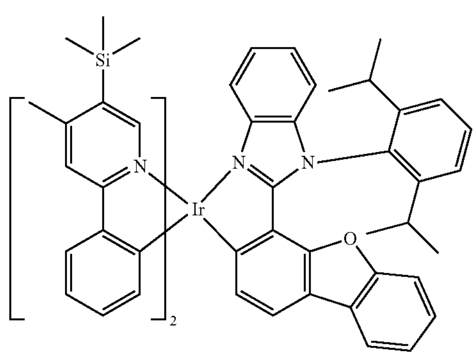

-continued
33
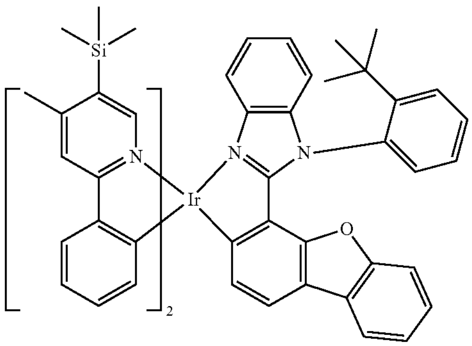
34
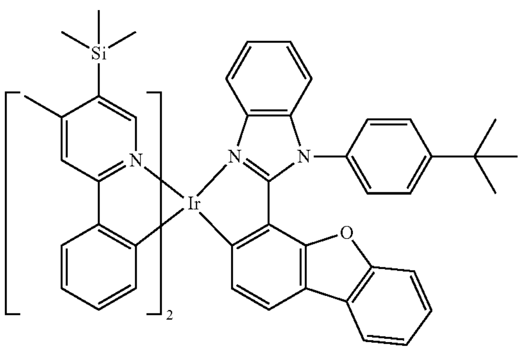
35
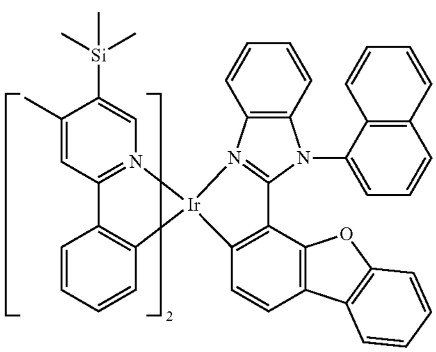
36
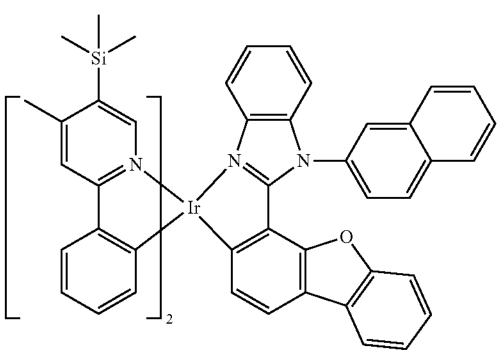
-continued
37
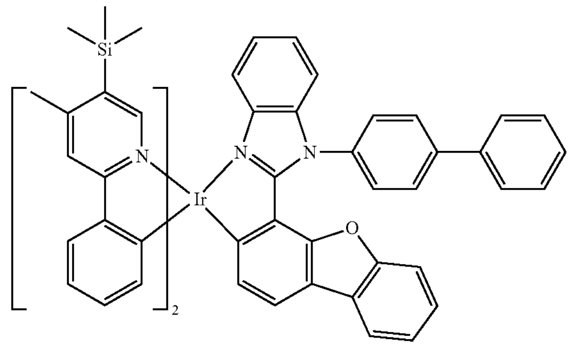
38
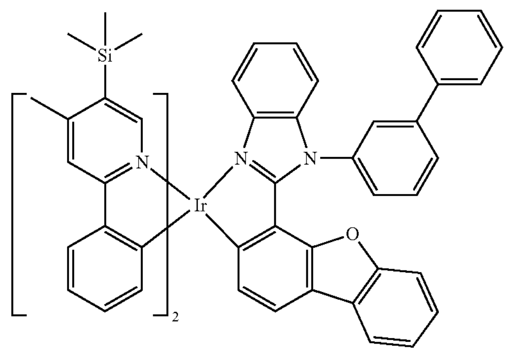
39
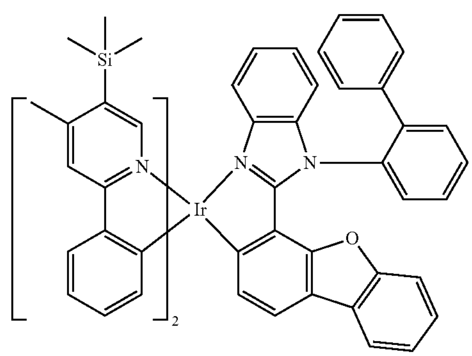
40
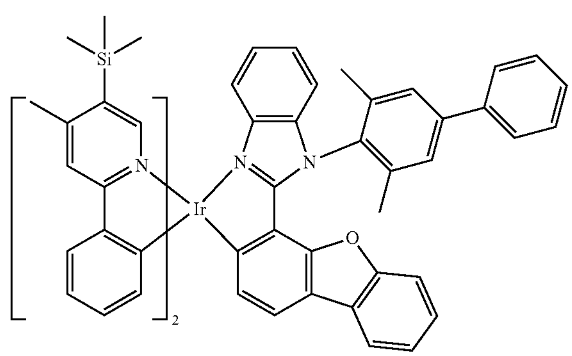

-continued
41
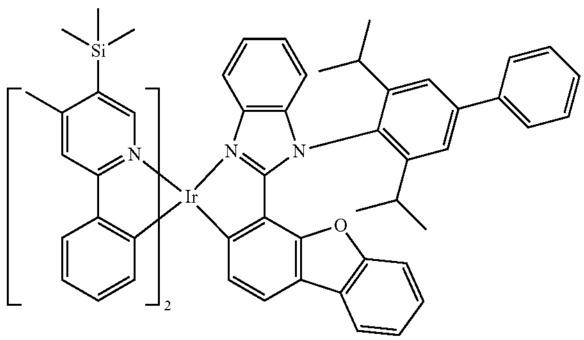
42
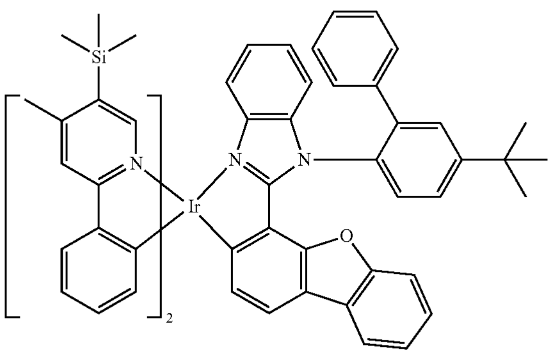
43
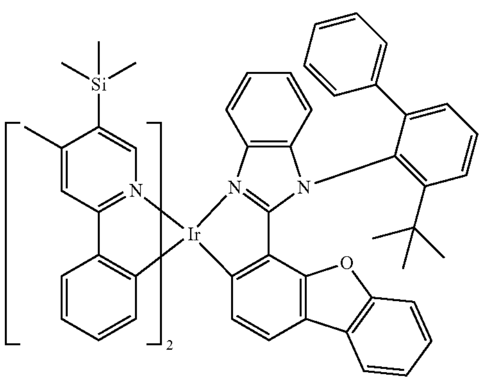
44
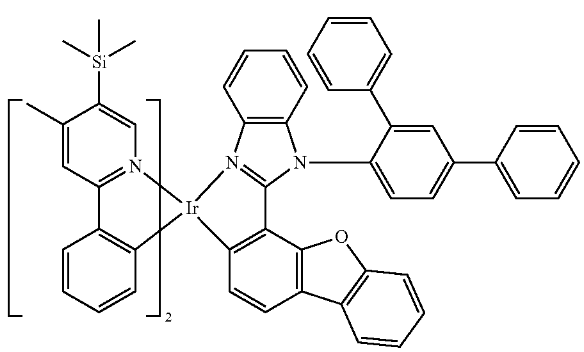
-continued
45
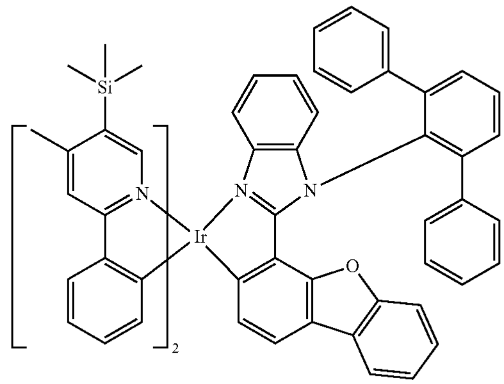
46
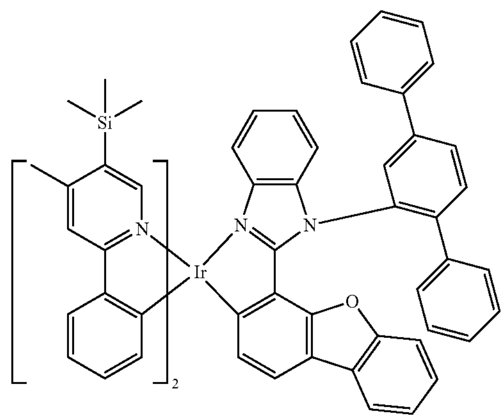
47
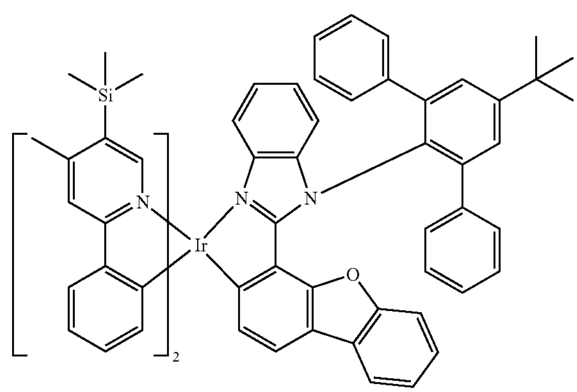
48
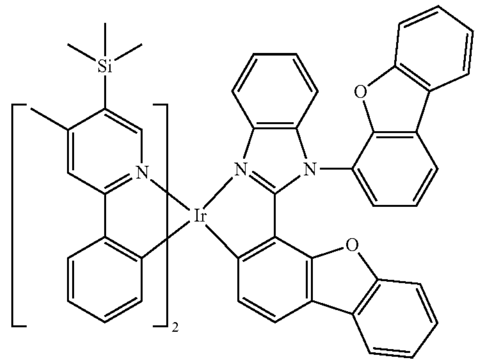

-continued
49
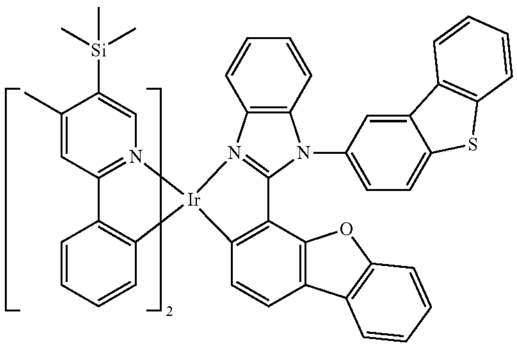
50
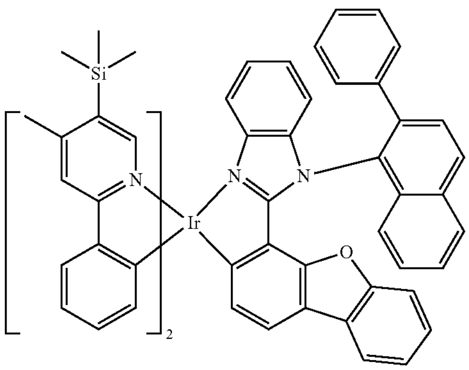
51
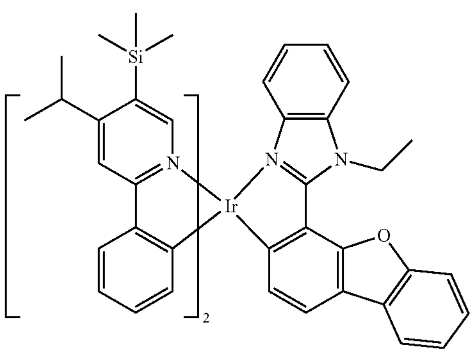
52
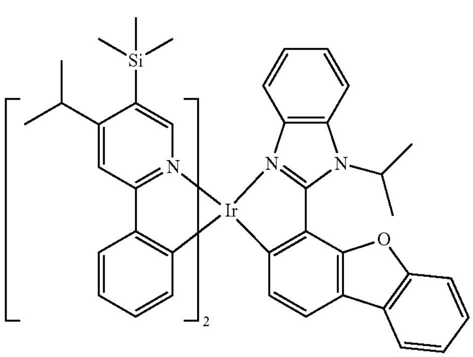
-continued
53
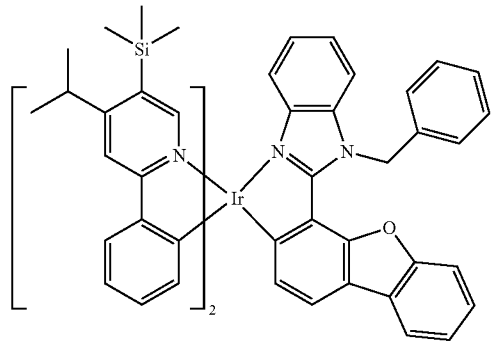
54
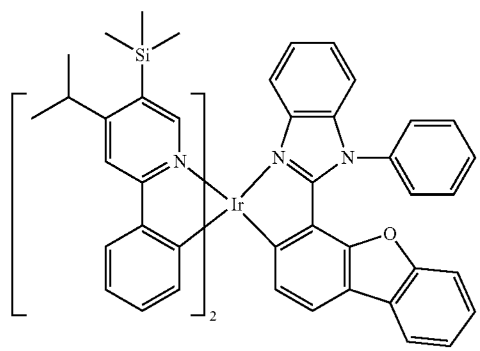
55
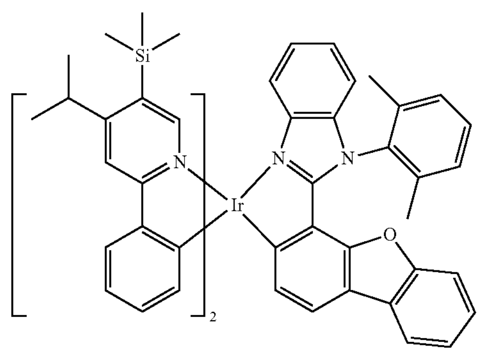
56
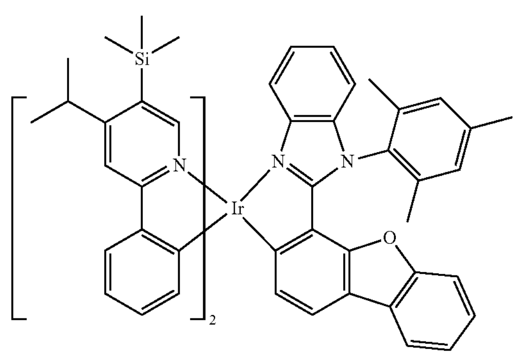

57
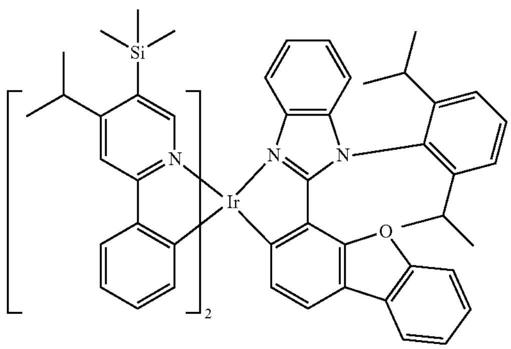
58
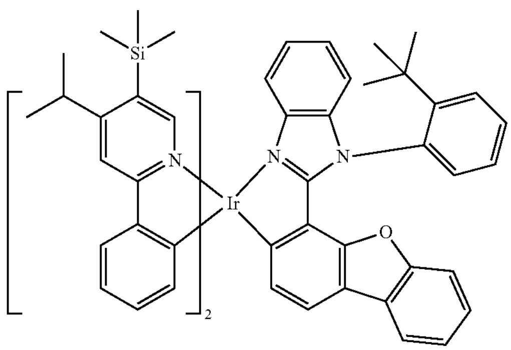
59
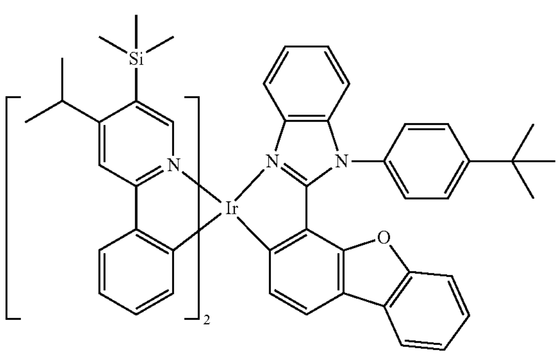
60
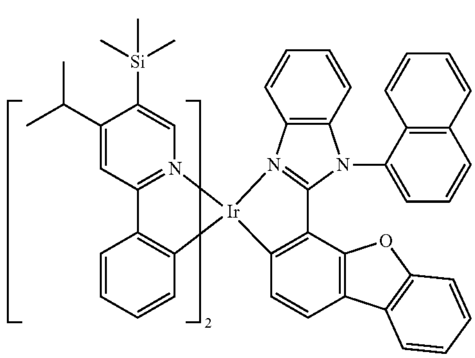
61
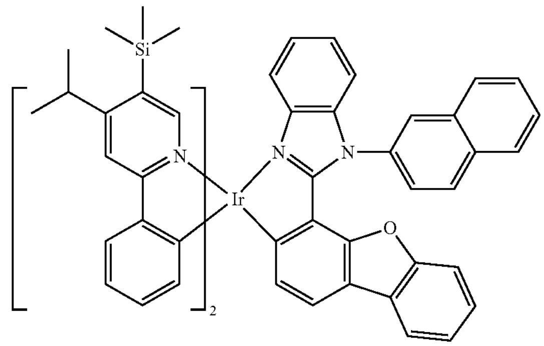
62
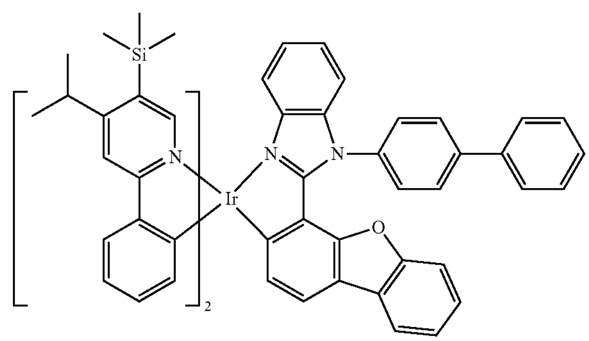
63
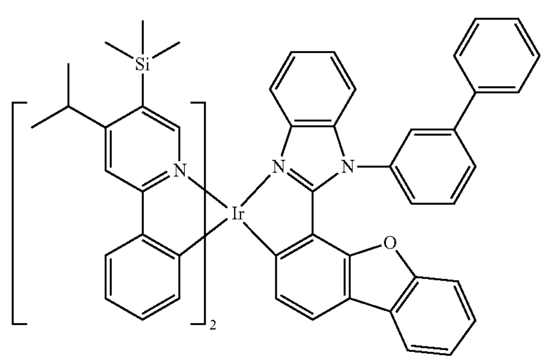
64
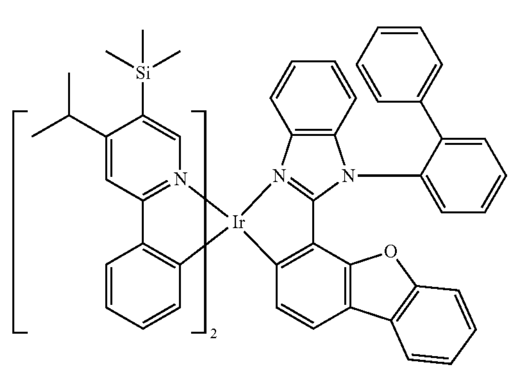

-continued
65
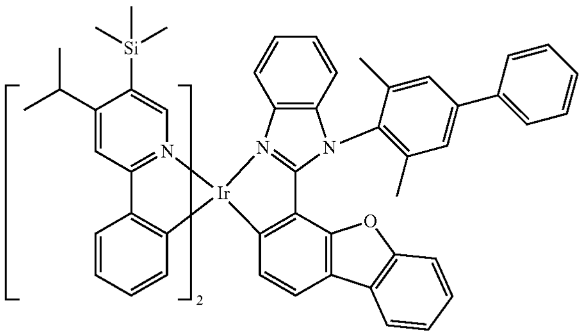
66
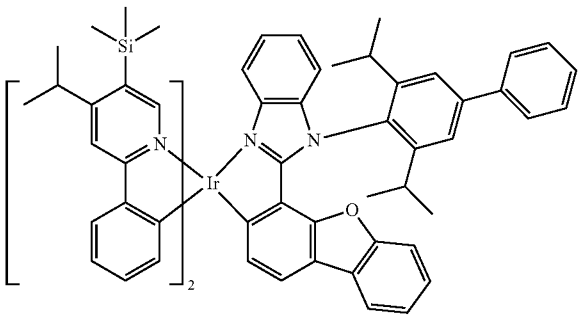
67
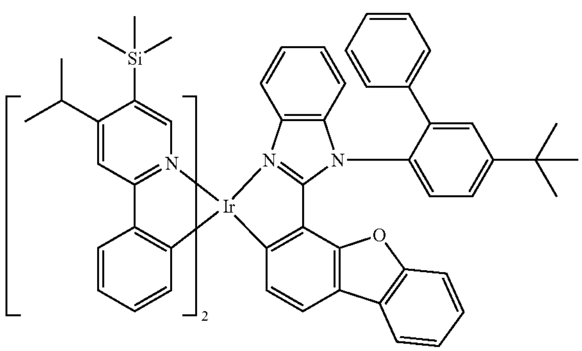
68
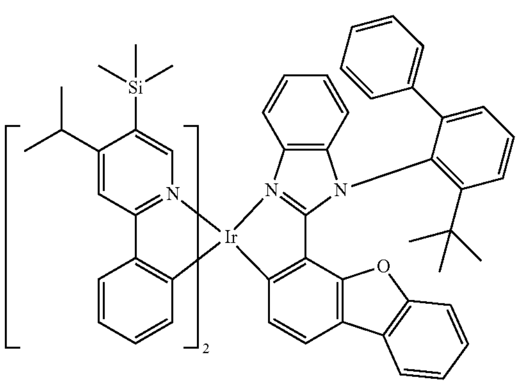
-continued
69
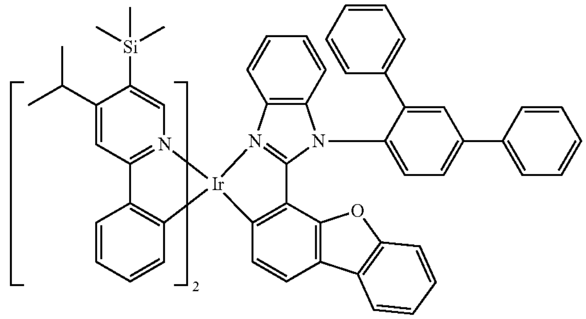
70
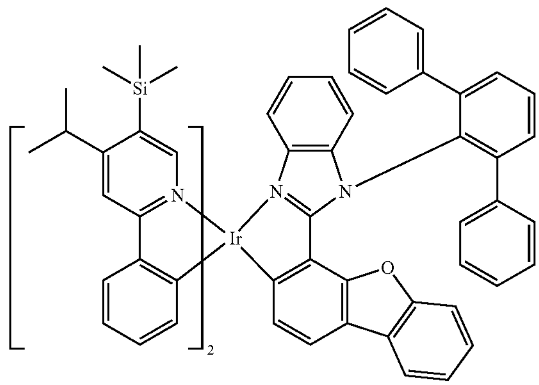
71
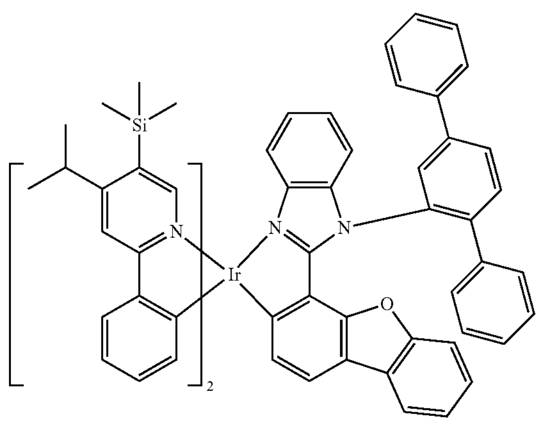
72
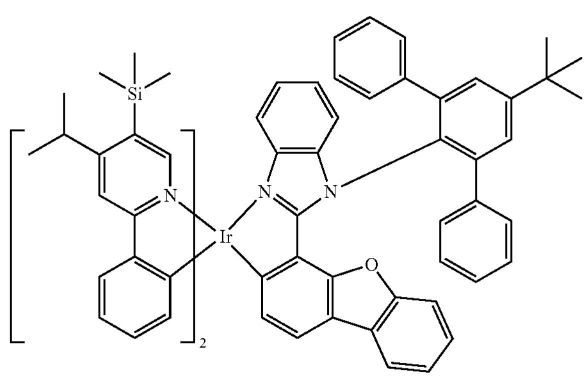

73
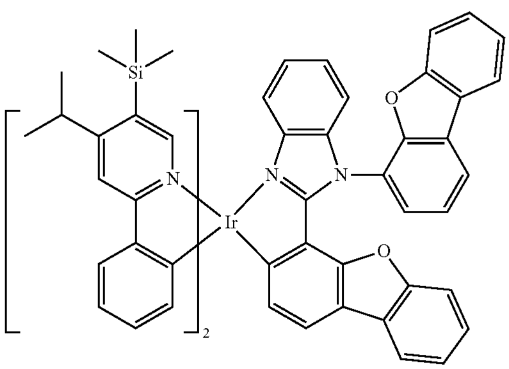
74
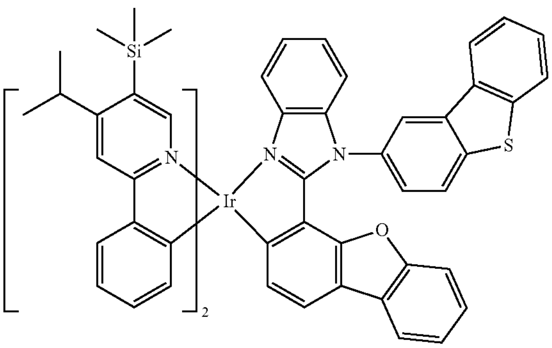
75
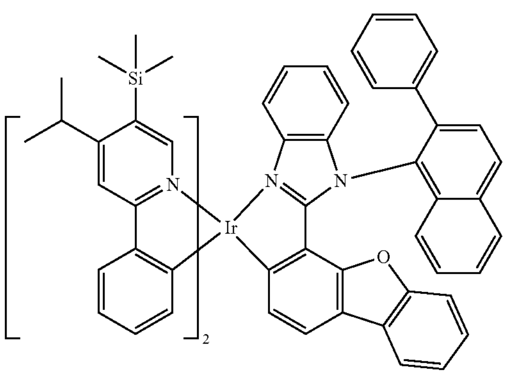
76
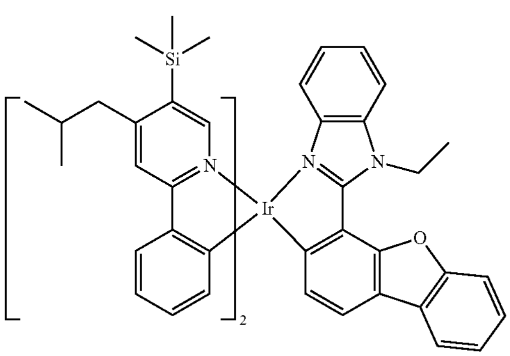
77
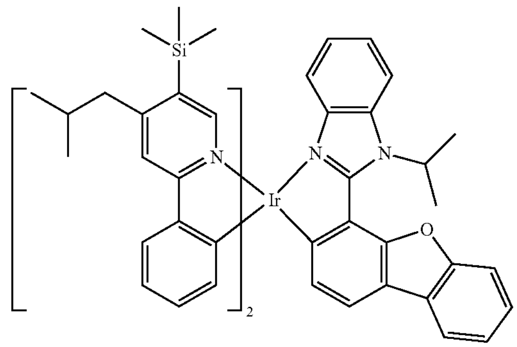
78
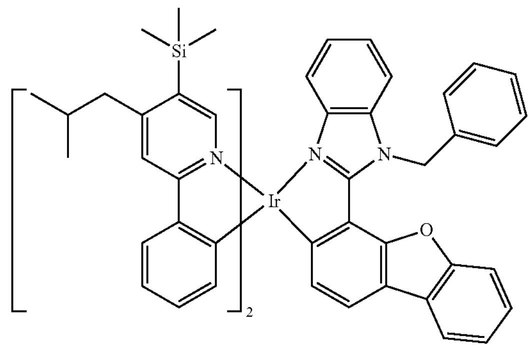
79
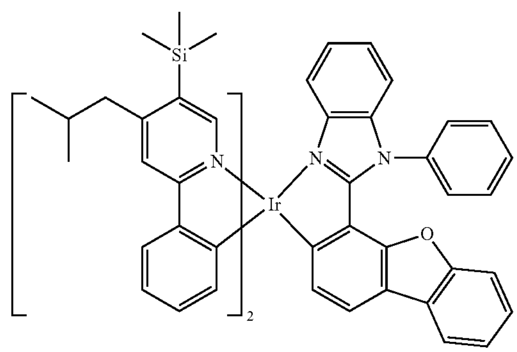
80
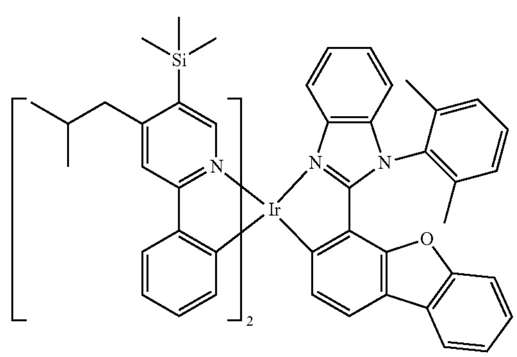

-continued
81
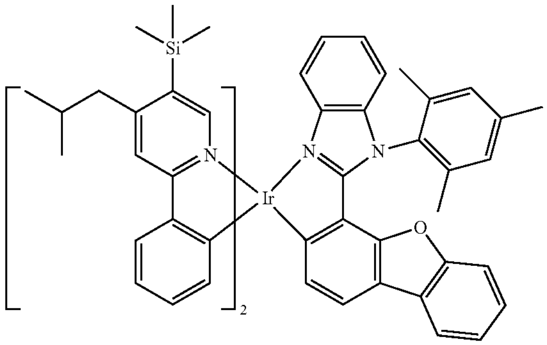
82
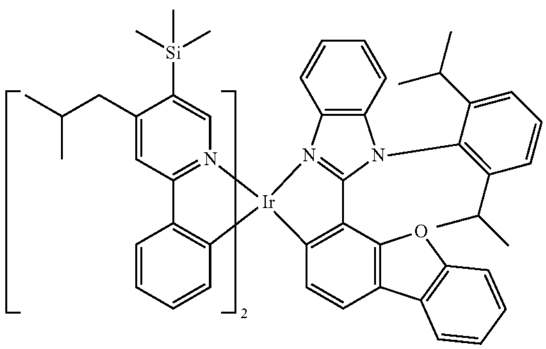
83
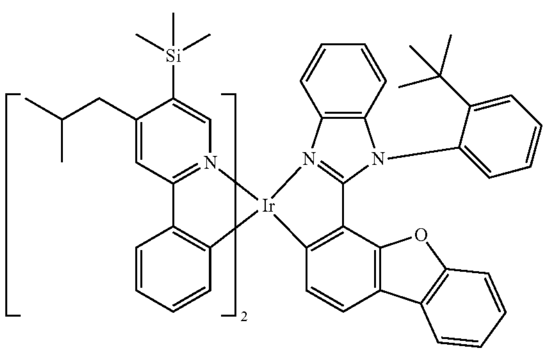
84
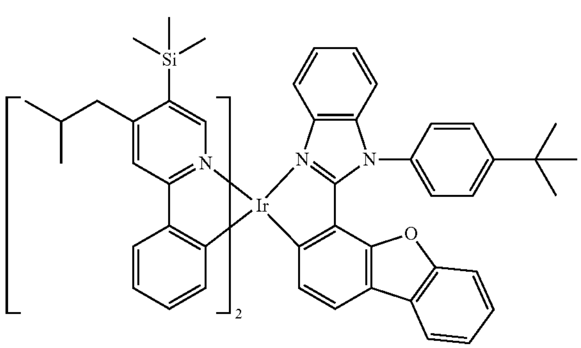
-continued
85
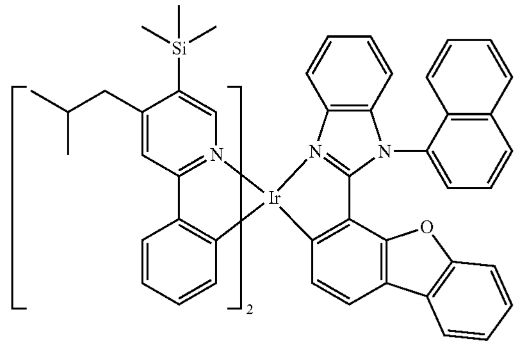
86
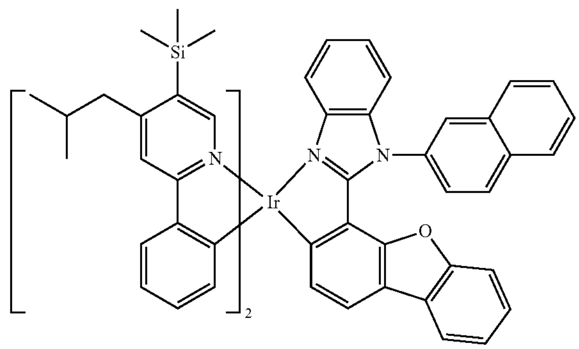
87
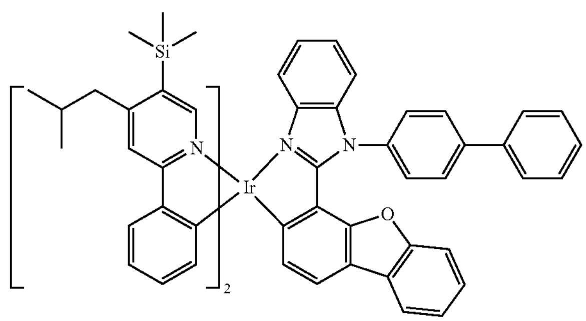
88
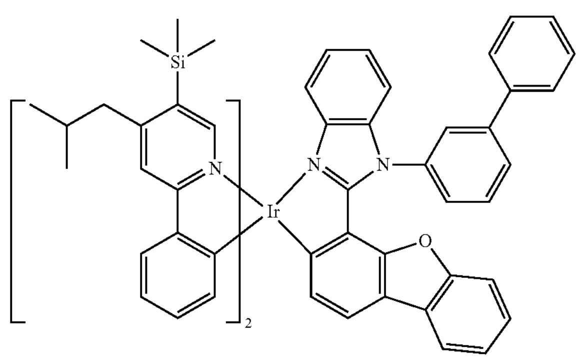

-continued
89
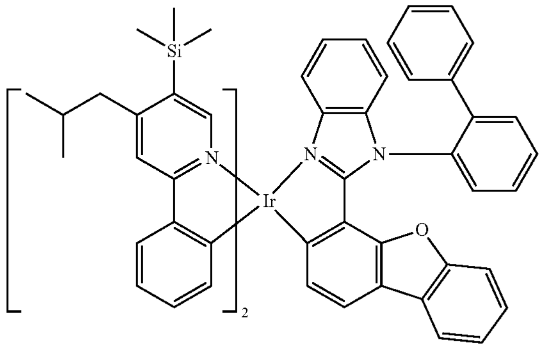
90
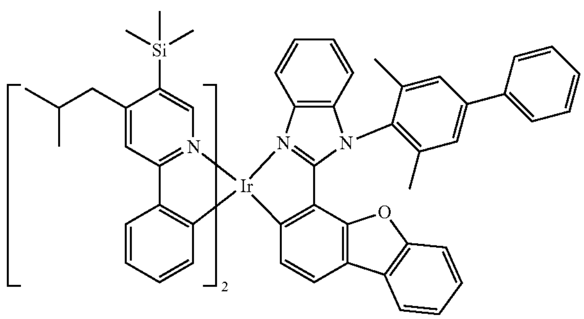
91
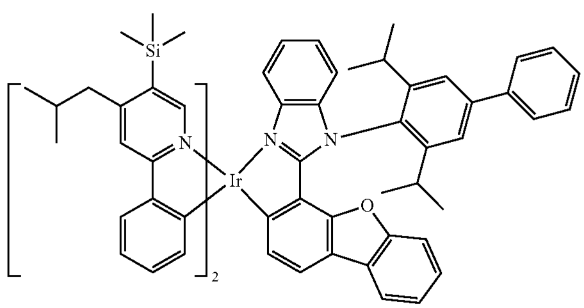
92
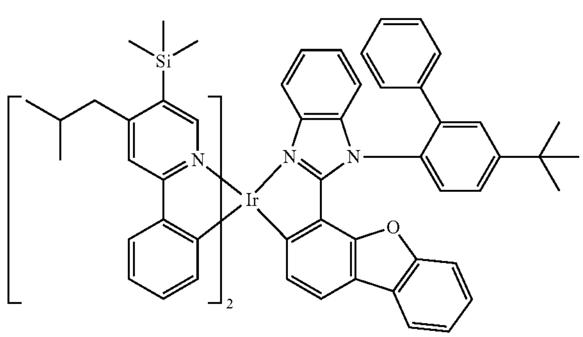
-continued
93
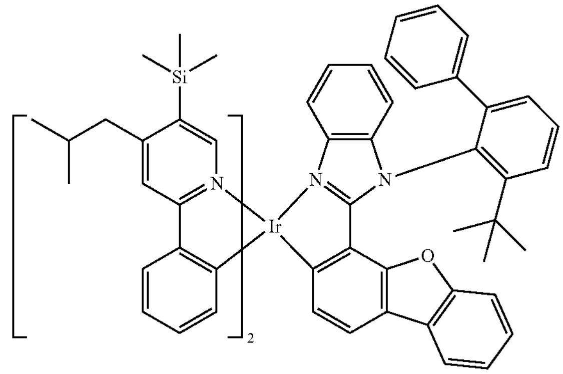
94
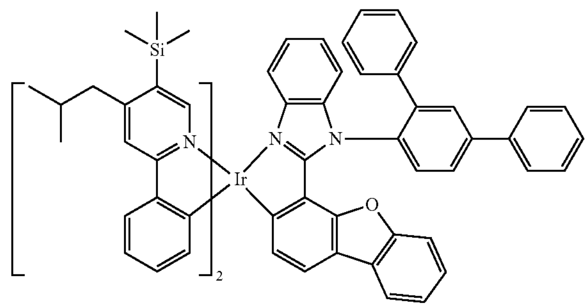
95
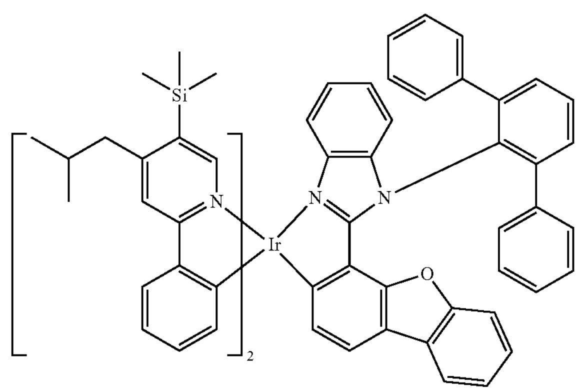
96
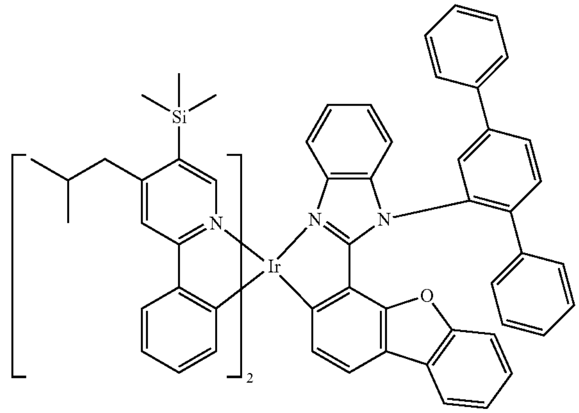

-continued
97
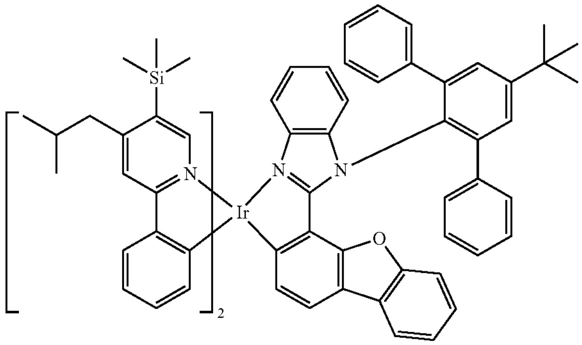
98
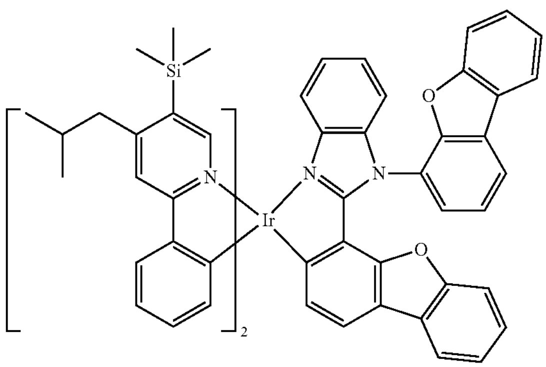
99
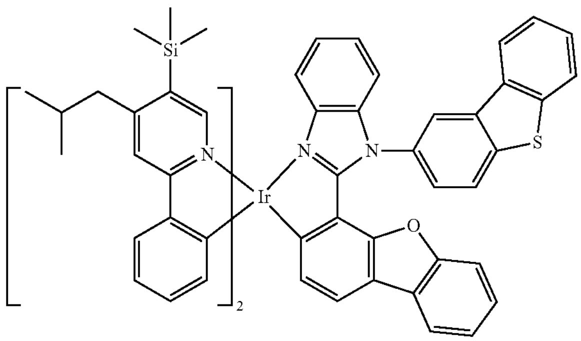
100
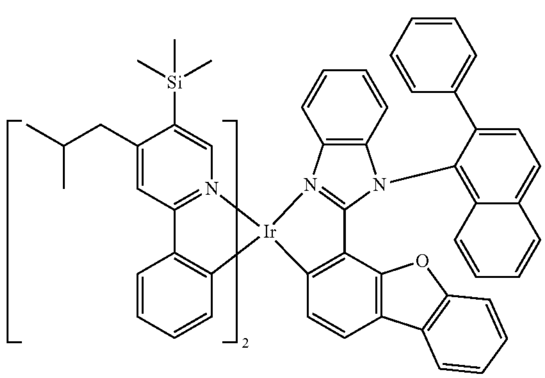
-continued
101
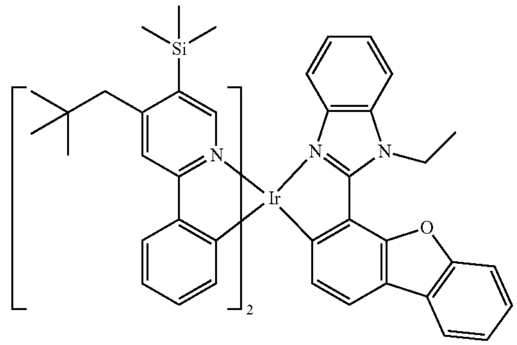
102
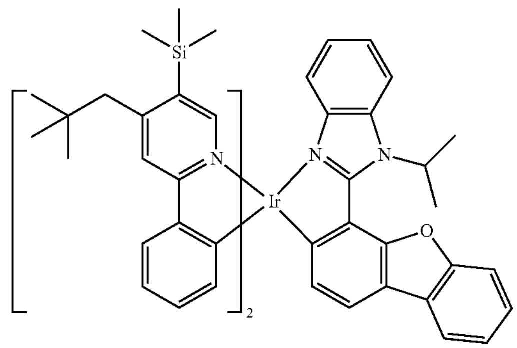
103
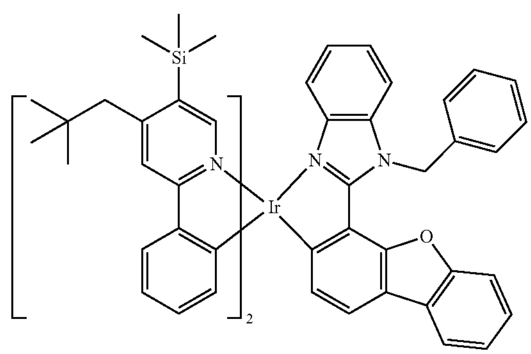
104
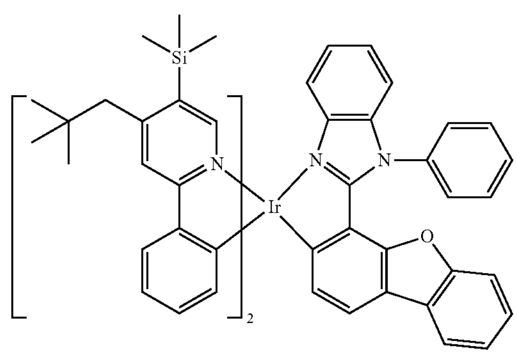

-continued
105
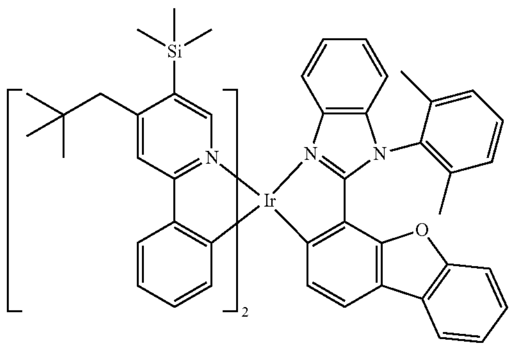
106
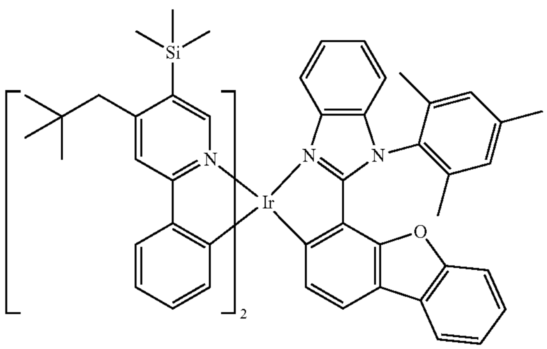
107
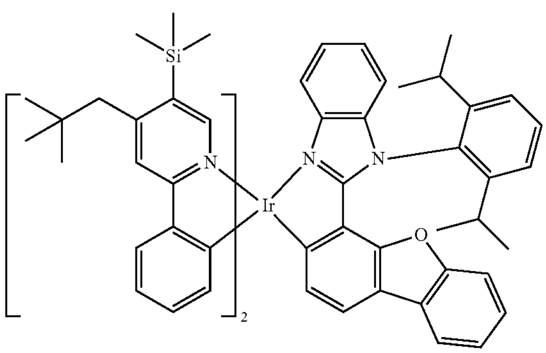
108
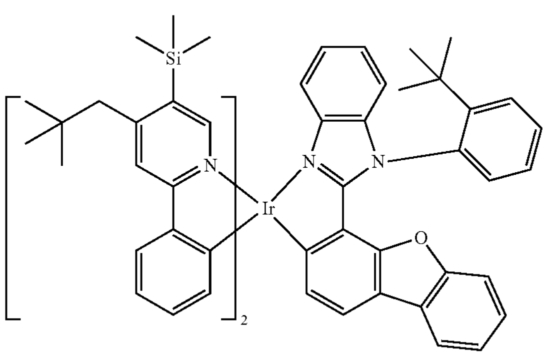
-continued
109
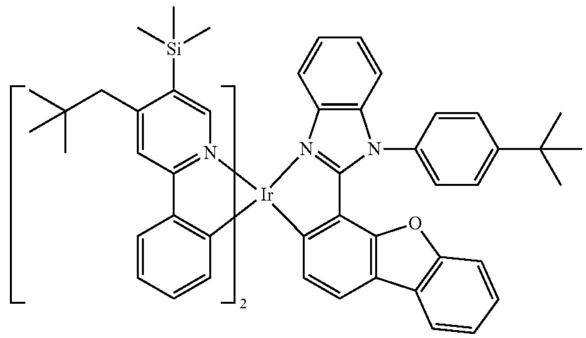
110
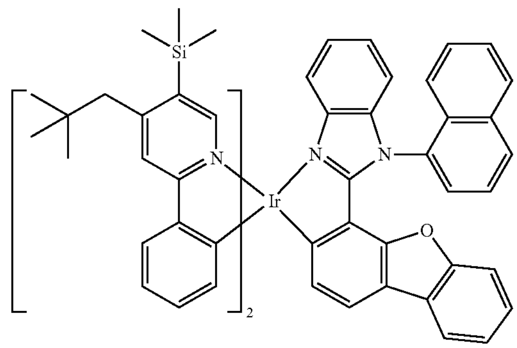
111
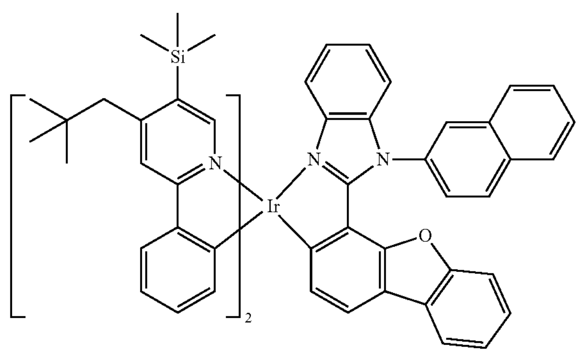
112
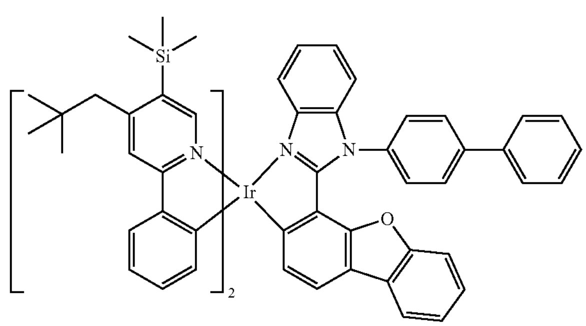

113
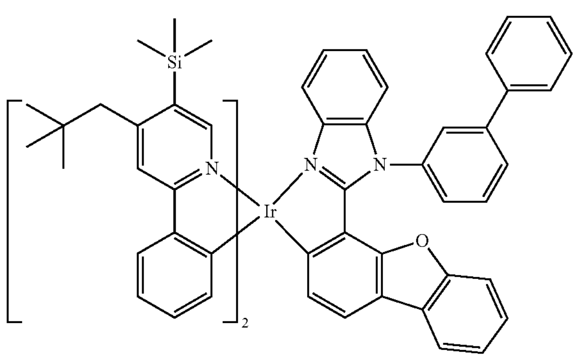
114
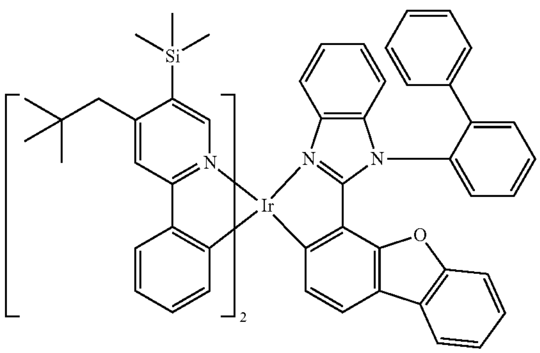
115
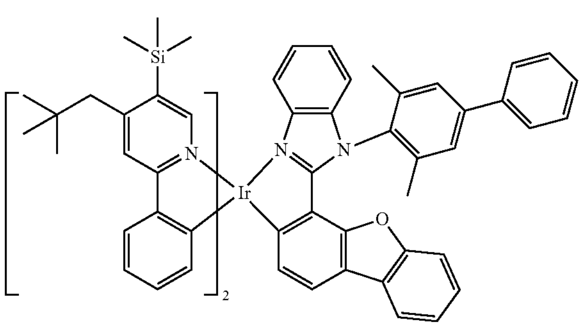
116
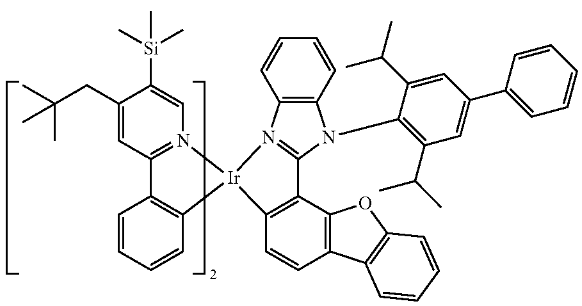
117
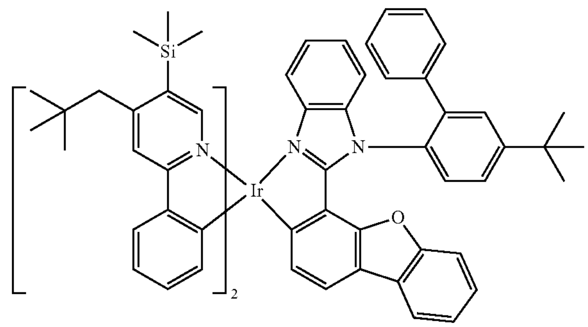
118
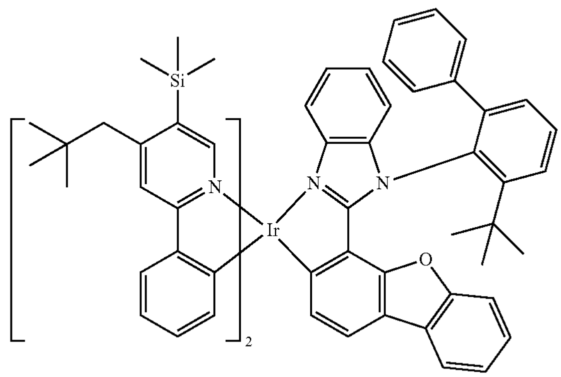
119
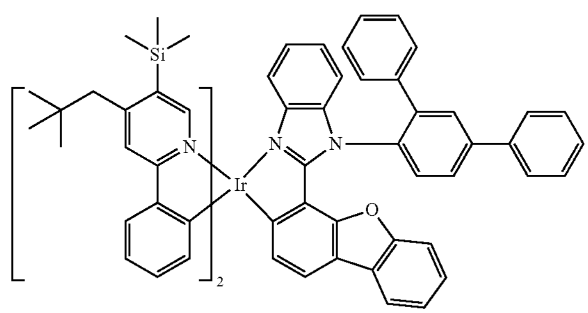
120
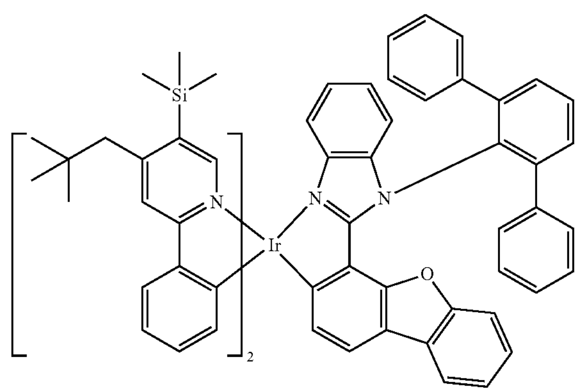

-continued
121
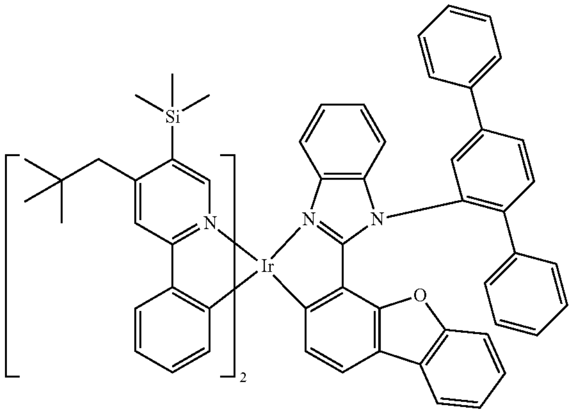
122
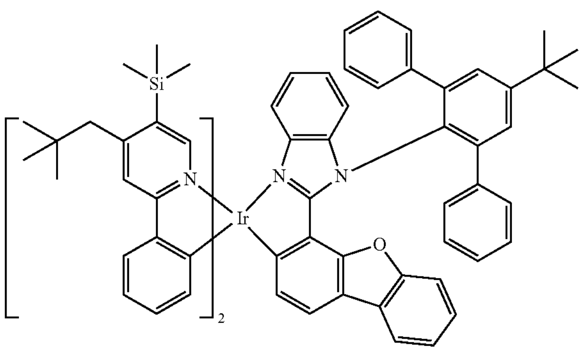
123
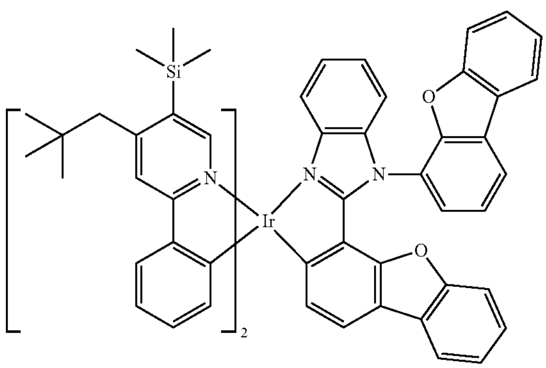
124
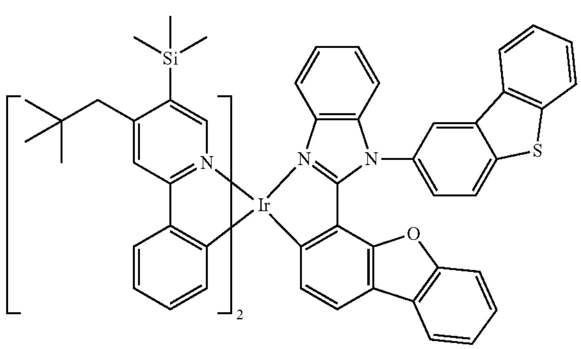
-continued
125
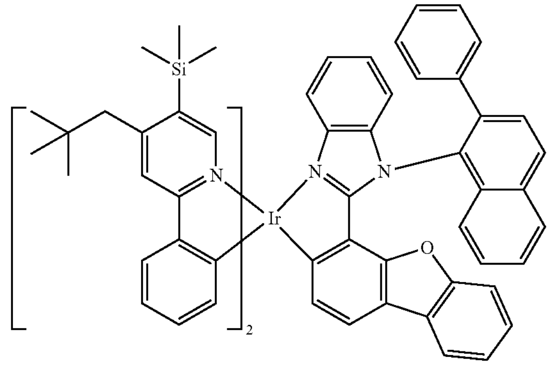
126
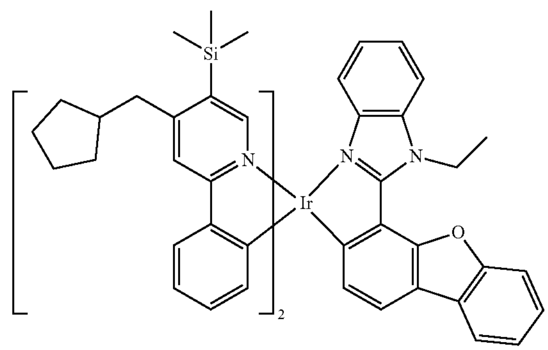
127
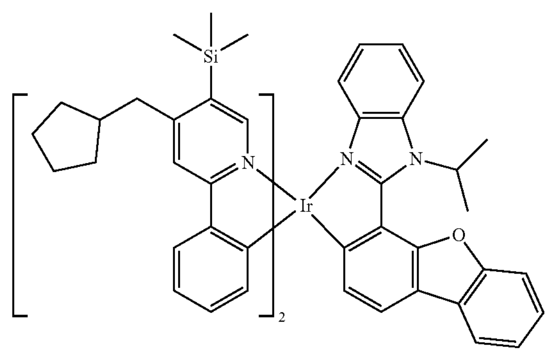
128
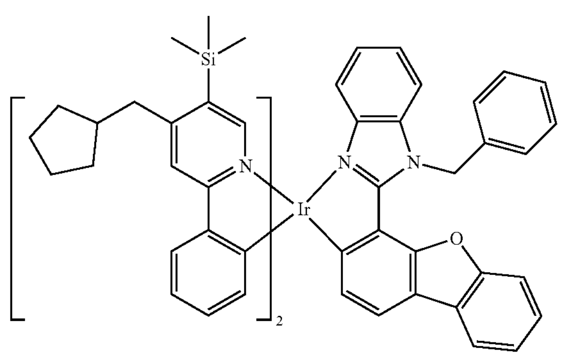

-continued
129
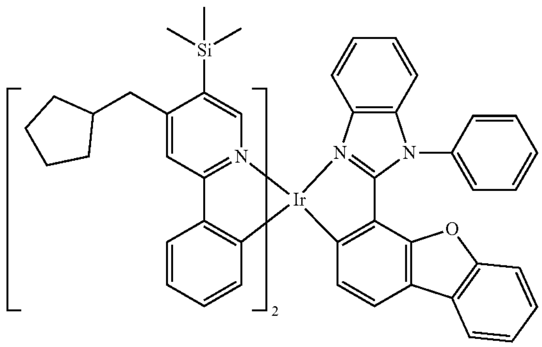
130
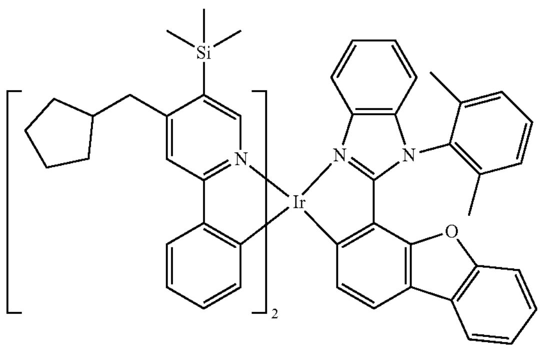
131
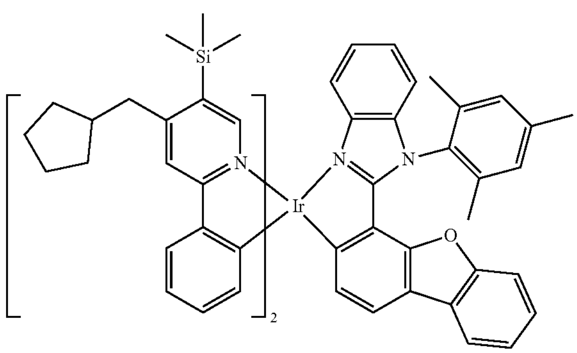
132
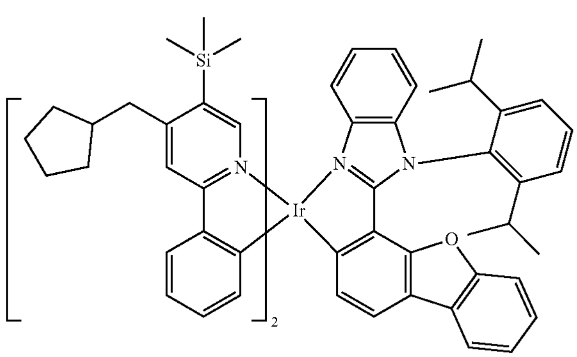
-continued
133
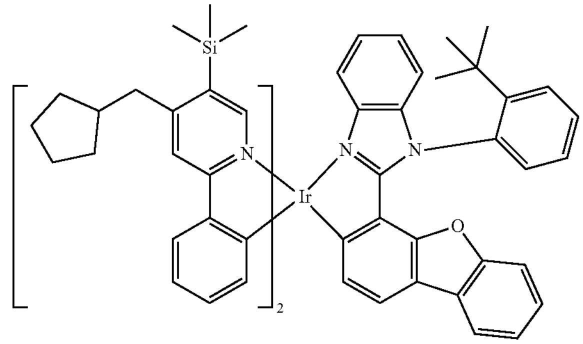
134
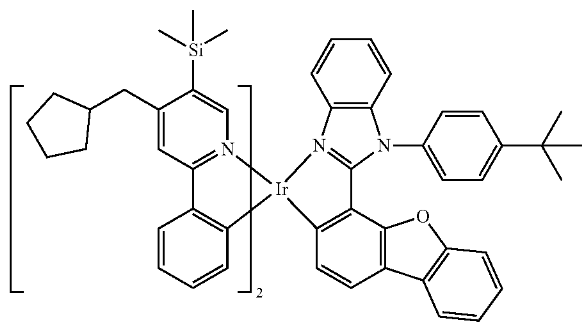
135
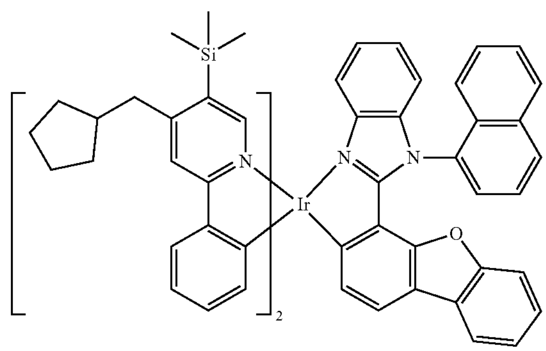
136
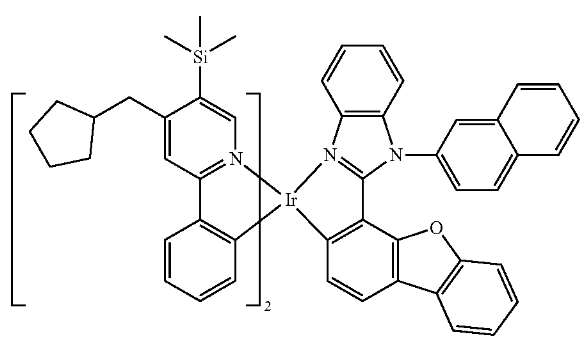

-continued
137
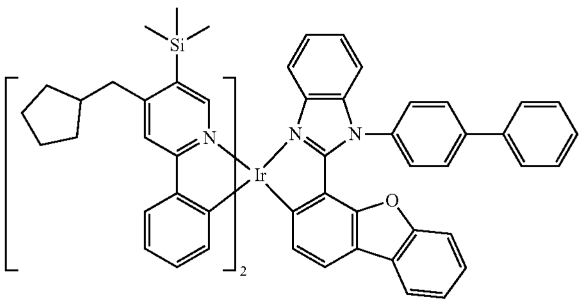
138
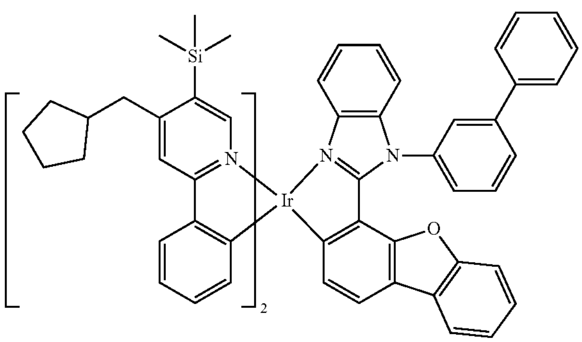
139
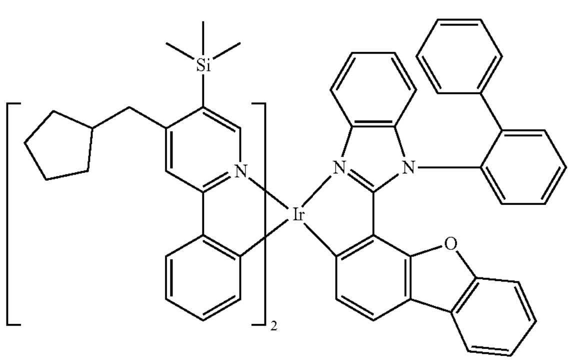
140
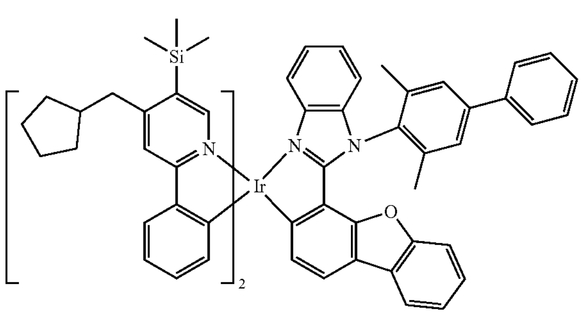
-continued
141
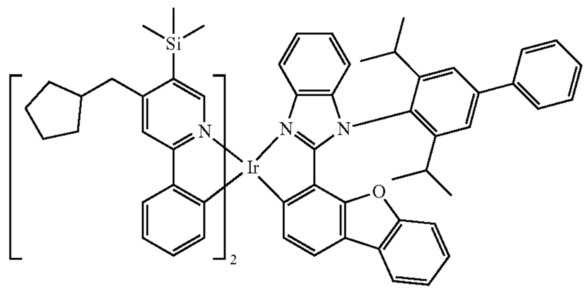
142
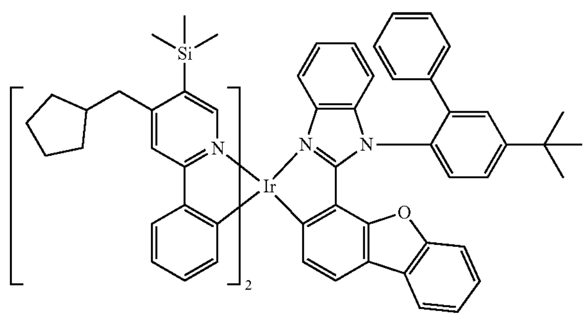
143
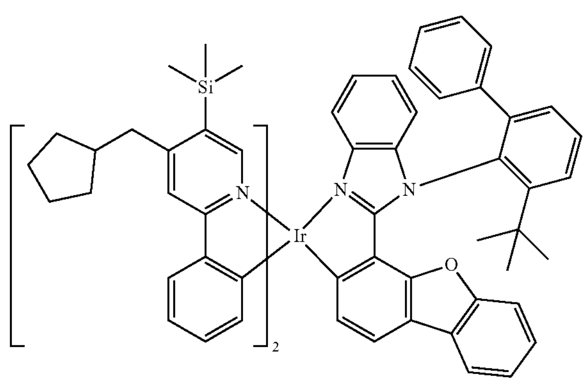
144
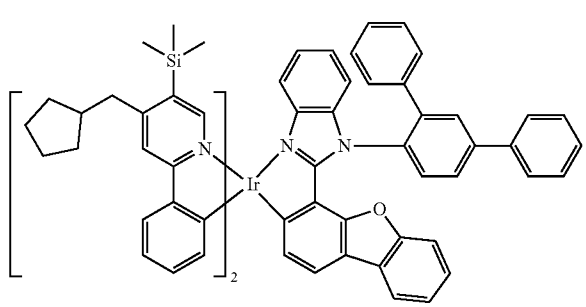

-continued
145
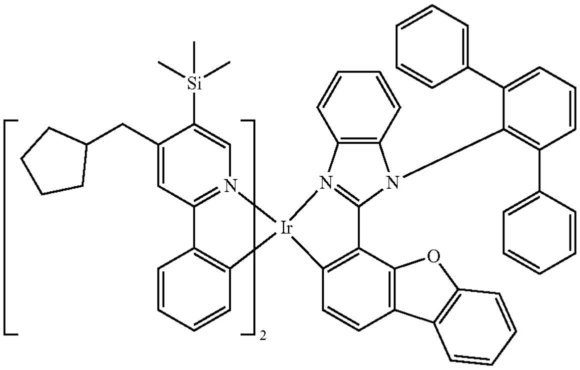
146
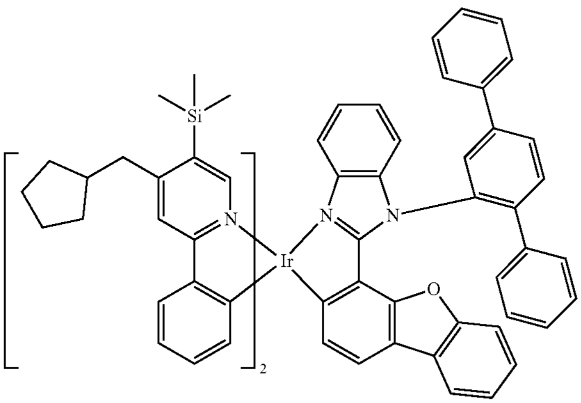
147
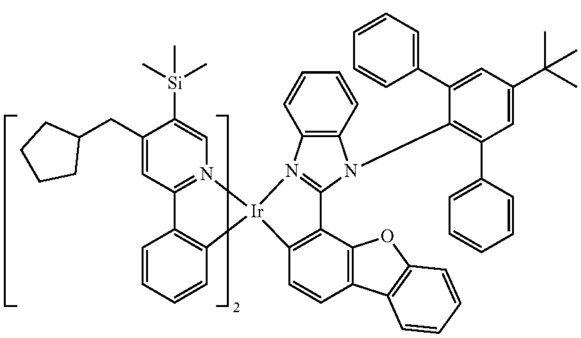
148
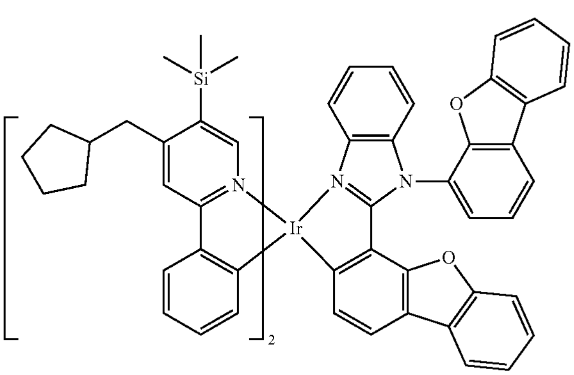
-continued
149
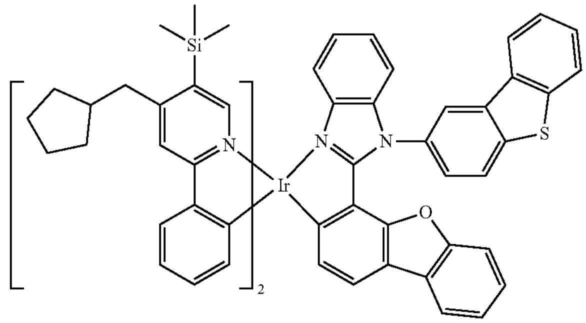
150
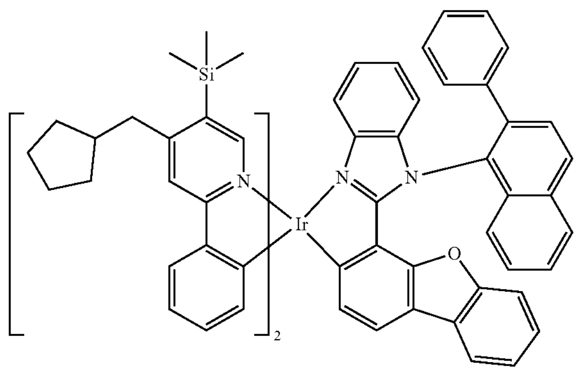
151
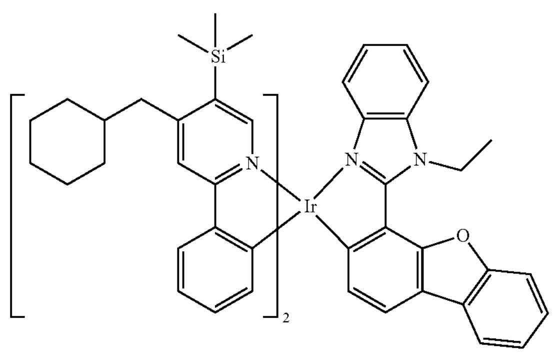
152
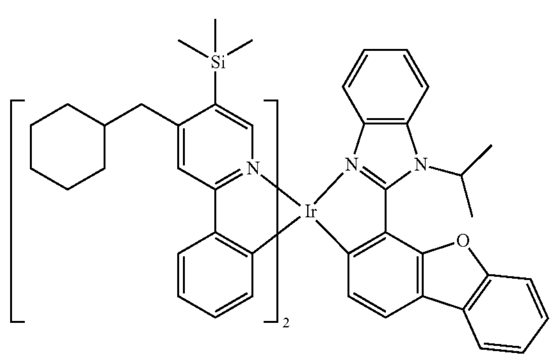

-continued
153
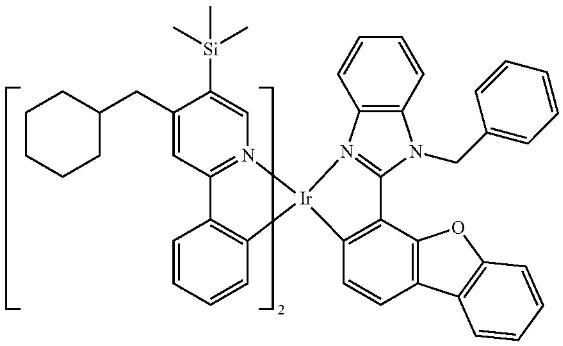
154
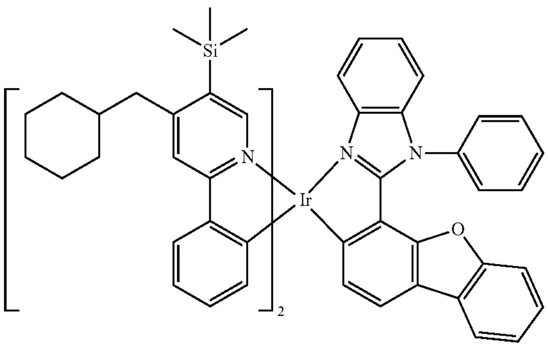
155
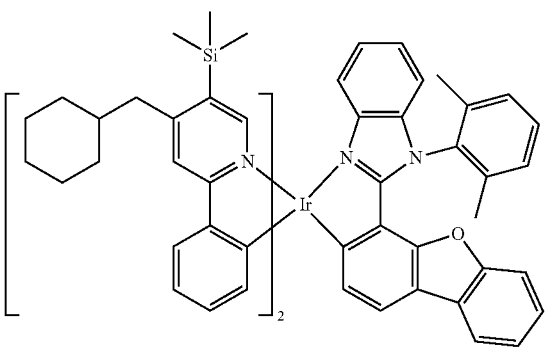
156
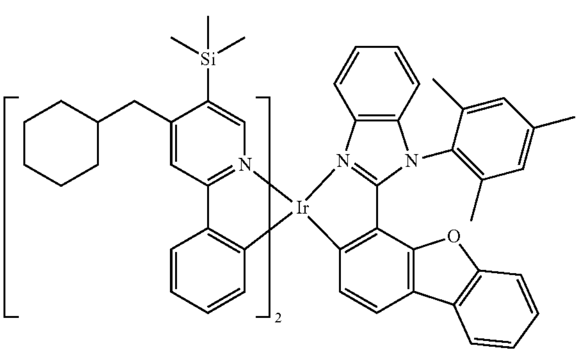
-continued
157
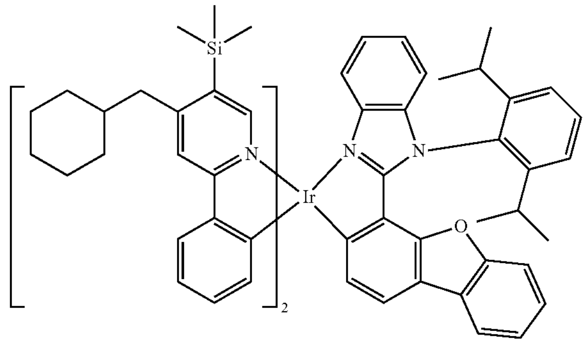
158
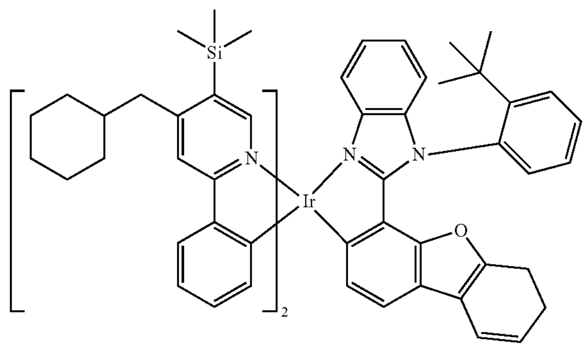
159
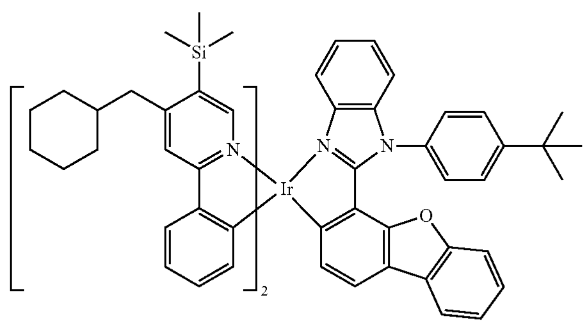
160
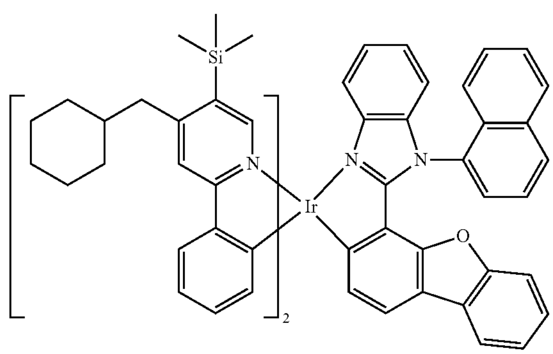

-continued
161
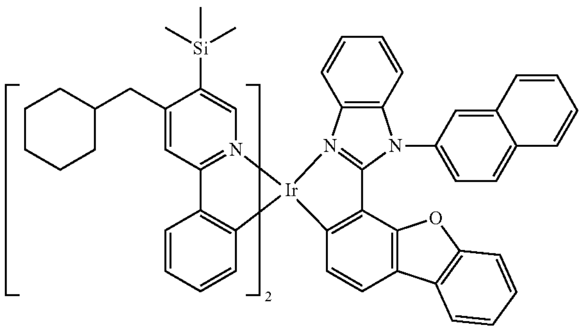
162
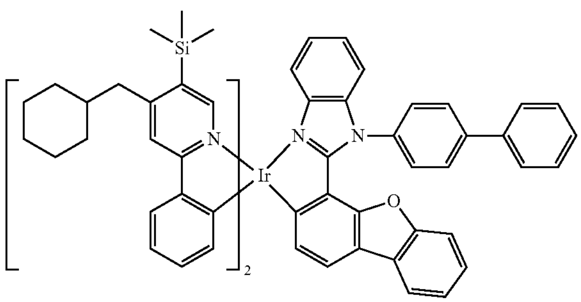
163
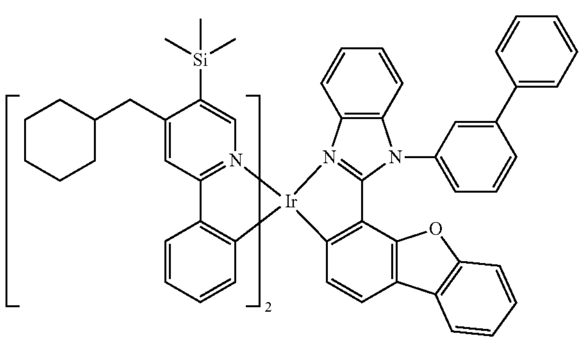
164
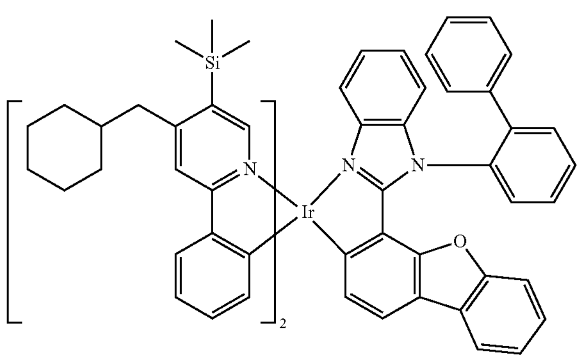
-continued
165
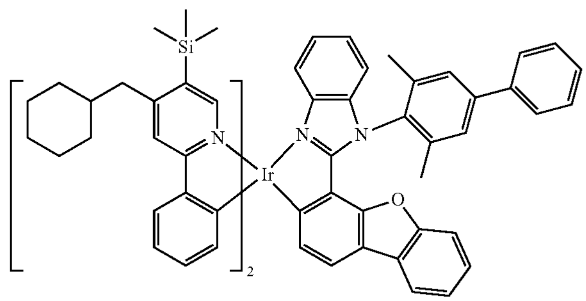
166
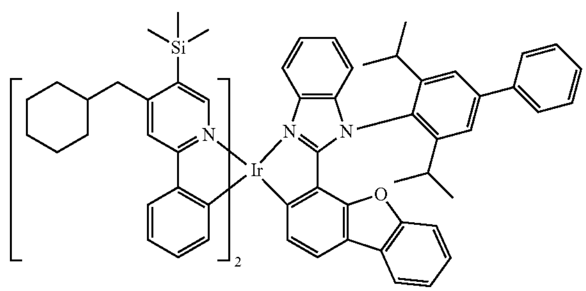
167
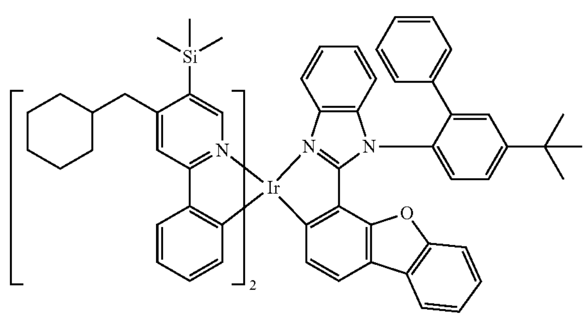
168
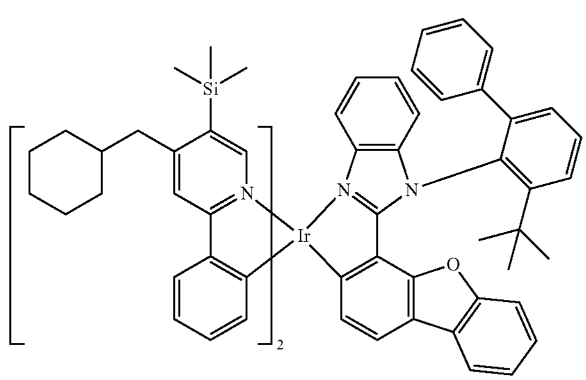

-continued
169
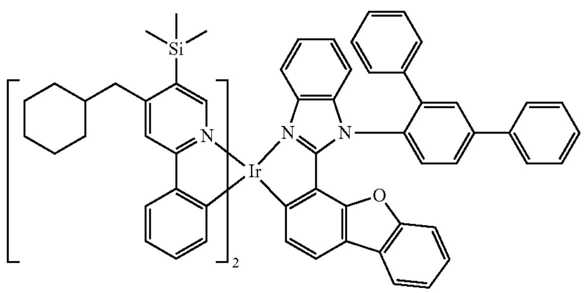
170
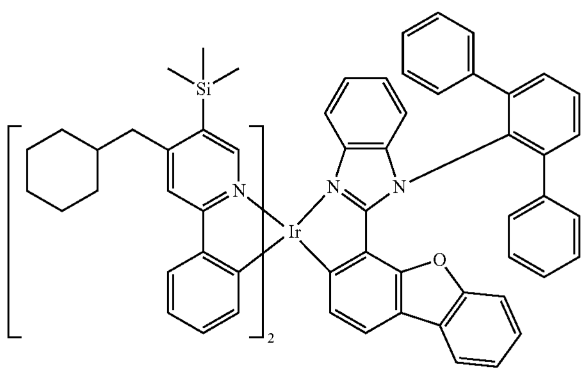
171
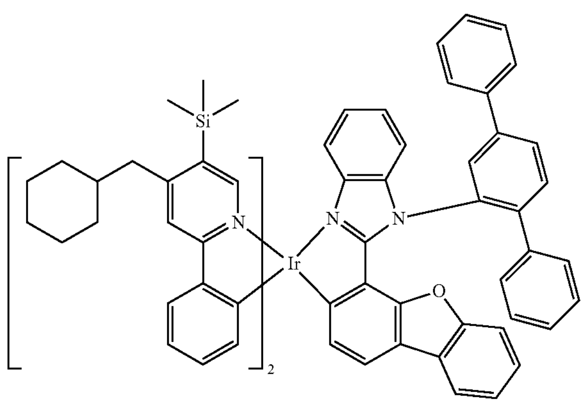
172
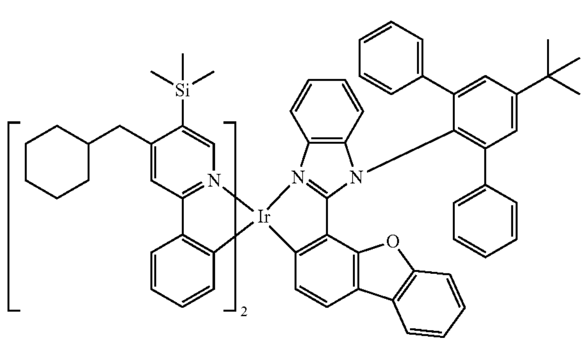
-continued
173
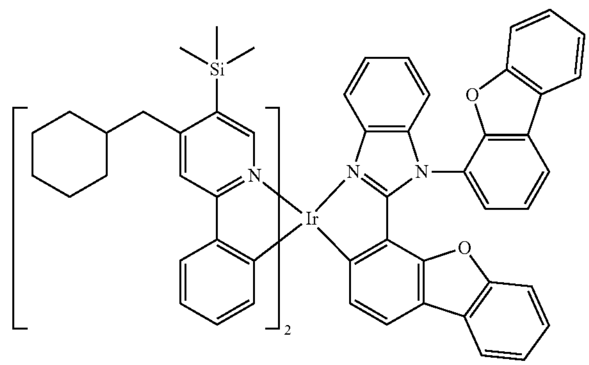
174
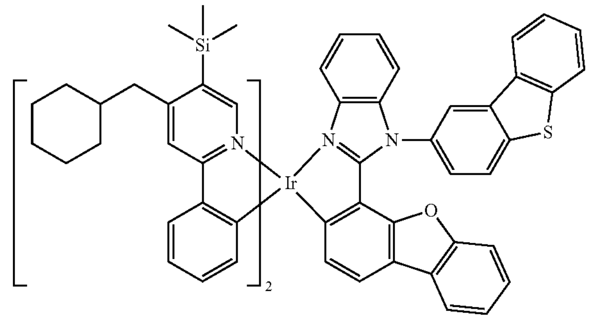
175
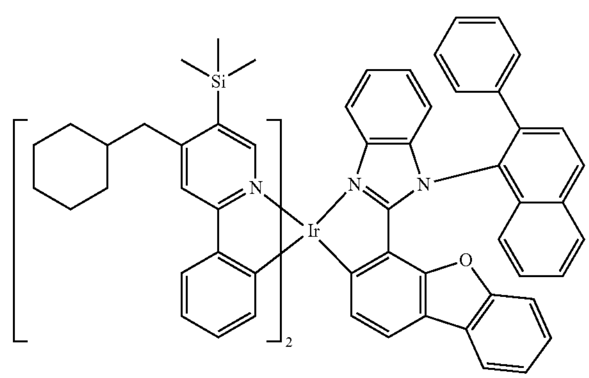
176
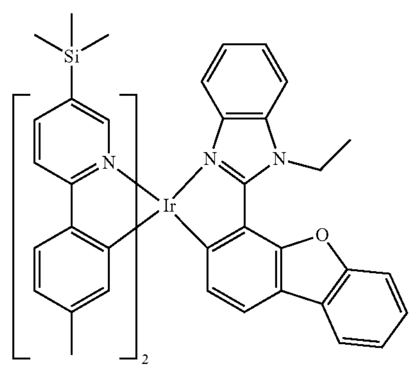

-continued
177
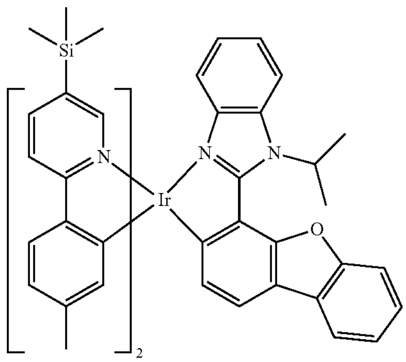
181
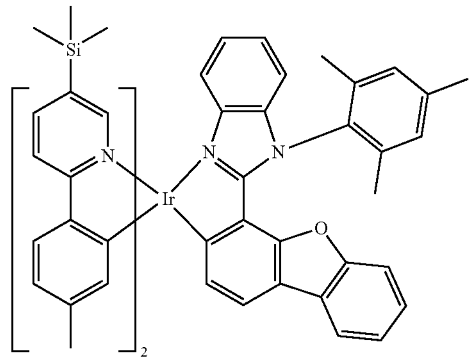
178
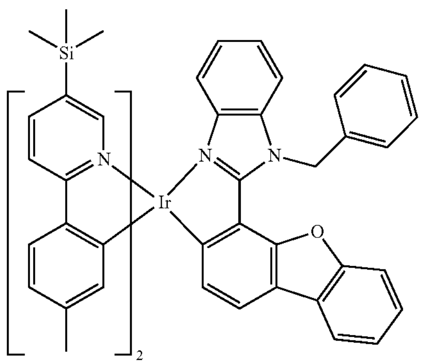
182
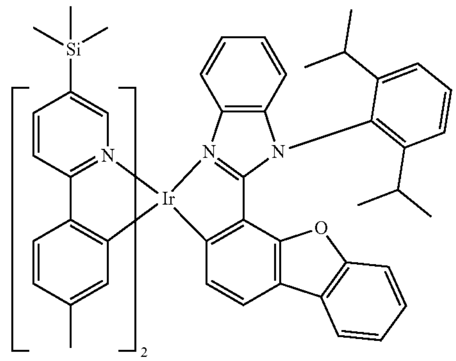
179
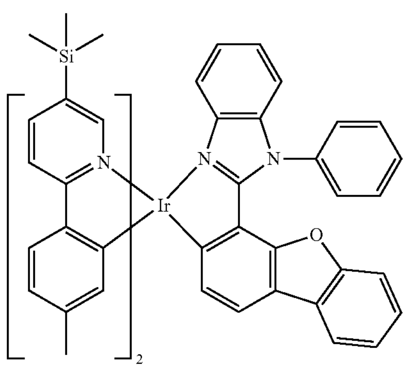
183
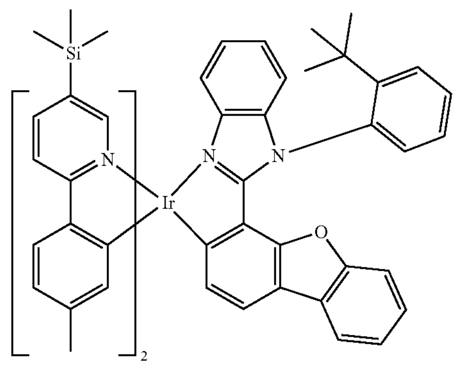
180
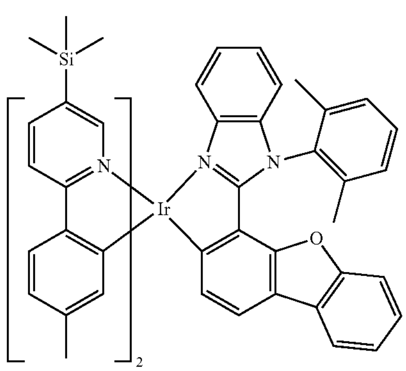
184
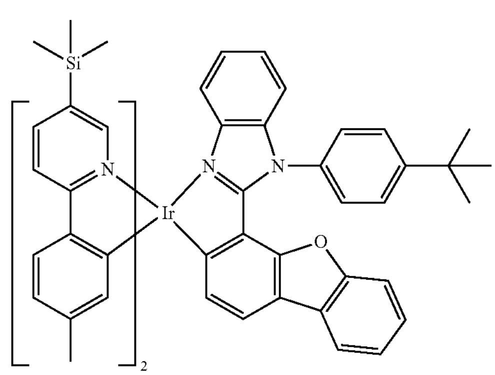

-continued
185
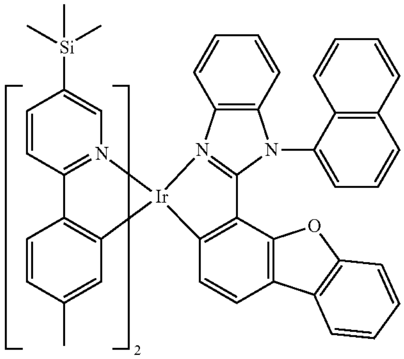
186
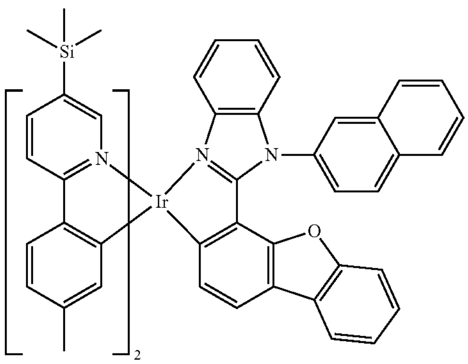
187
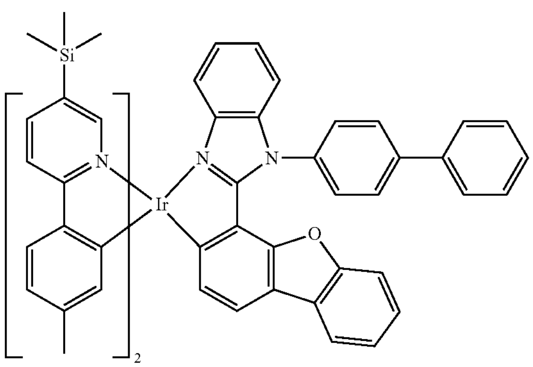
188
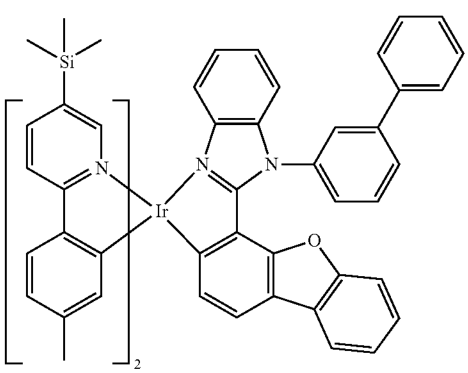
-continued
189
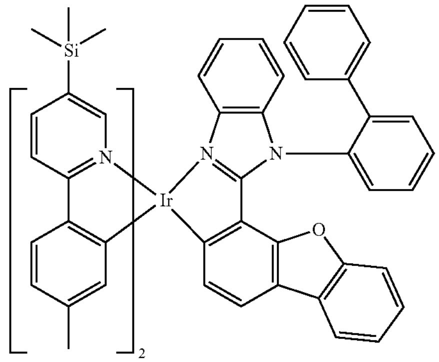
190
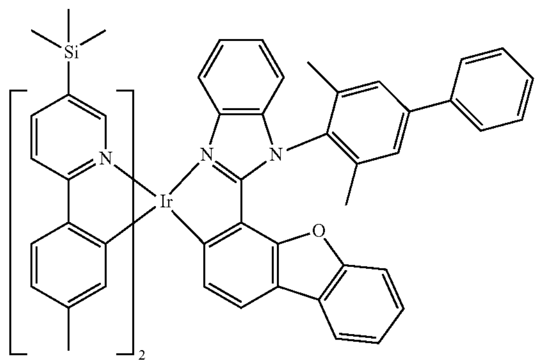
191
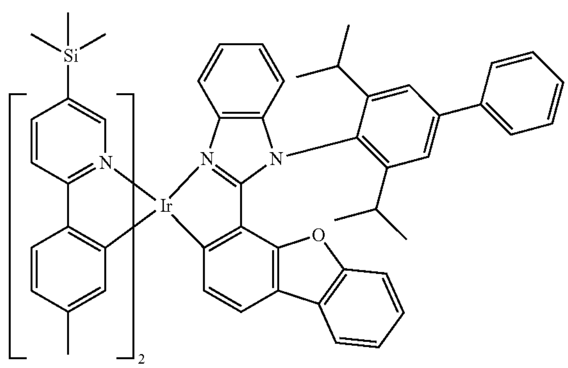
192
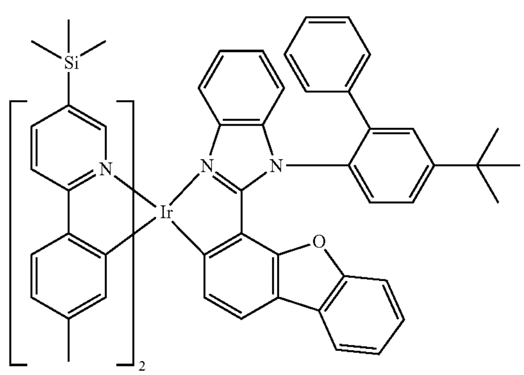

-continued
193
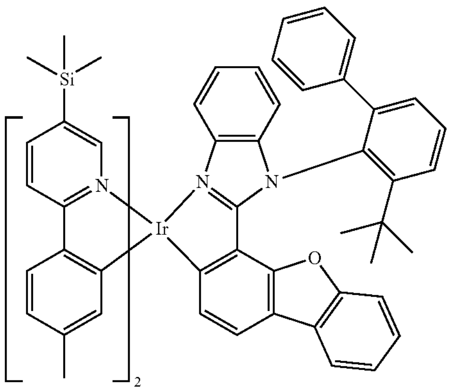
194
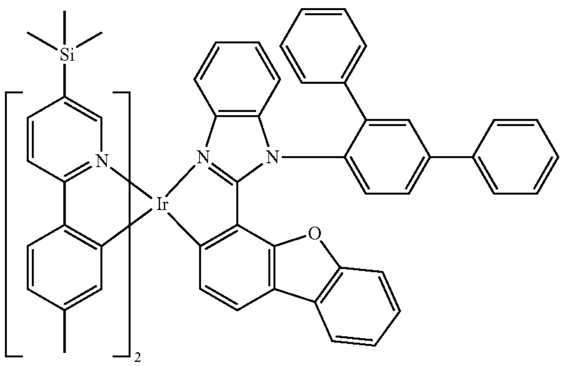
195
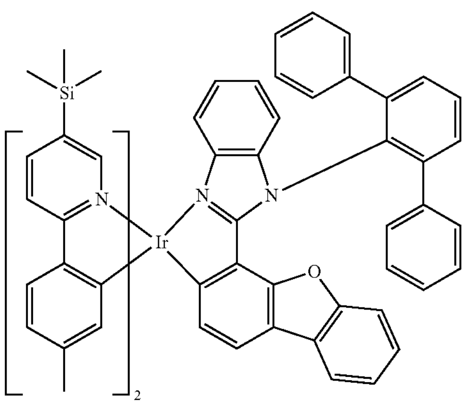
196
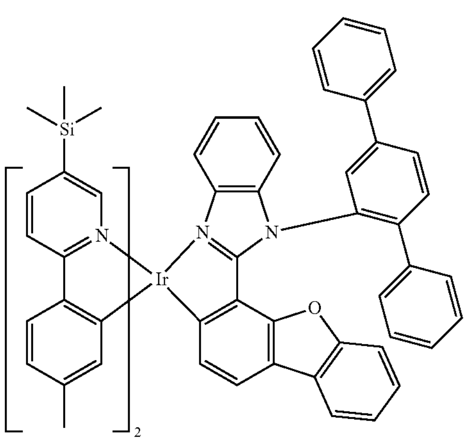
-continued
197
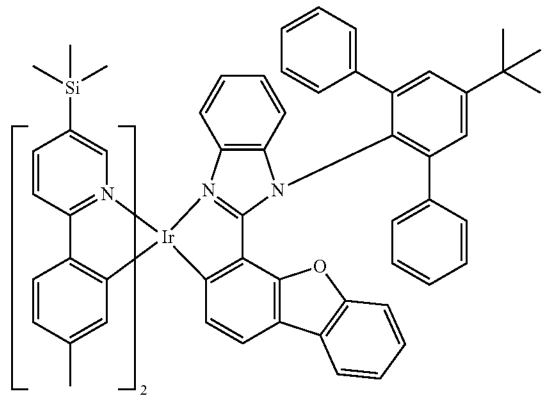
198
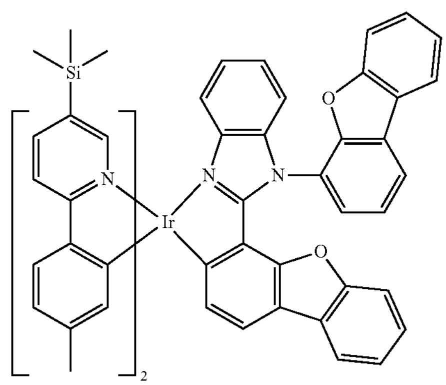
199
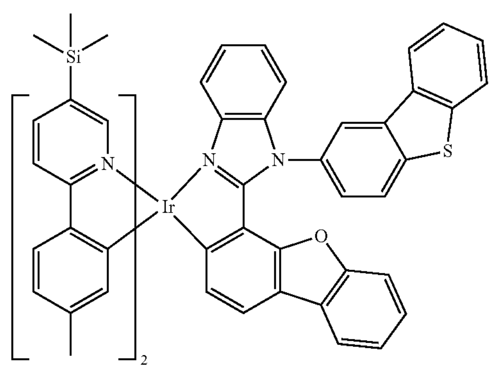
200
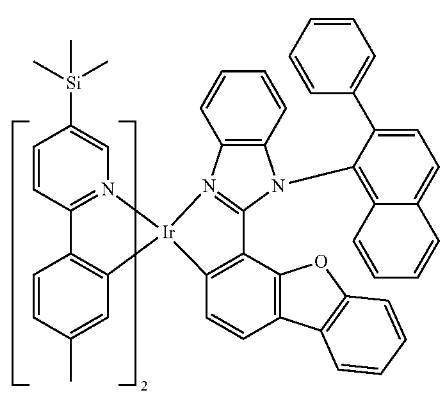

201
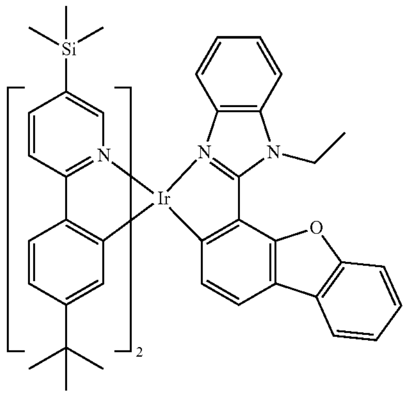
202
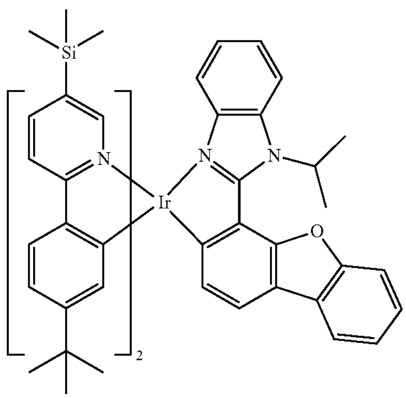
203
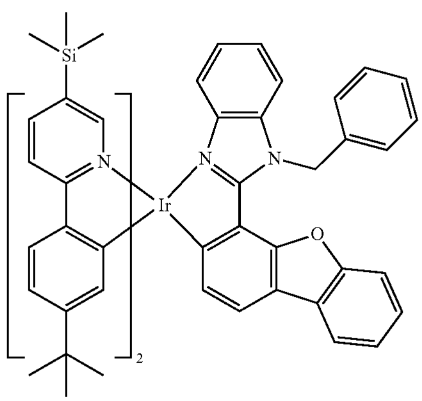
204
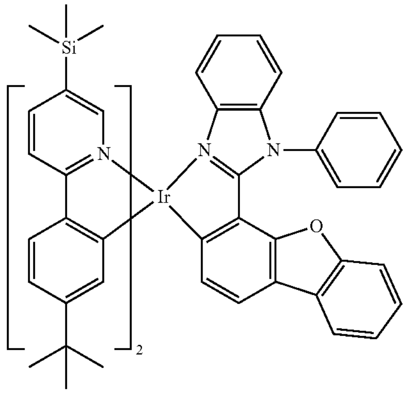
205
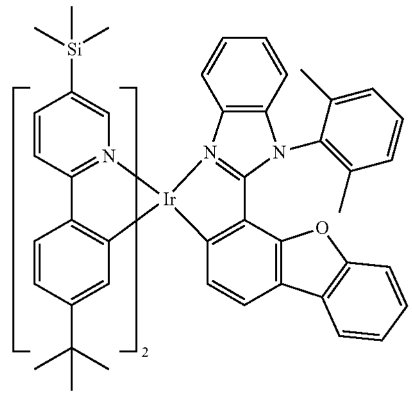
206
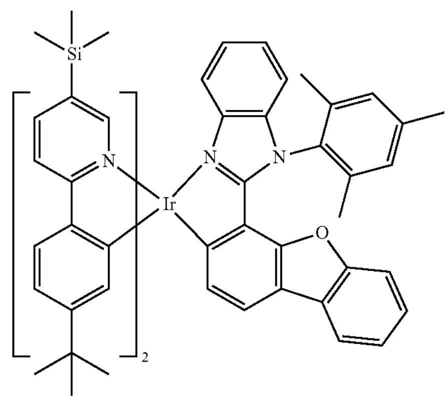
207
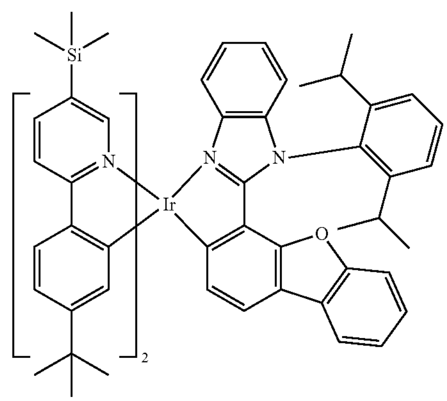
208
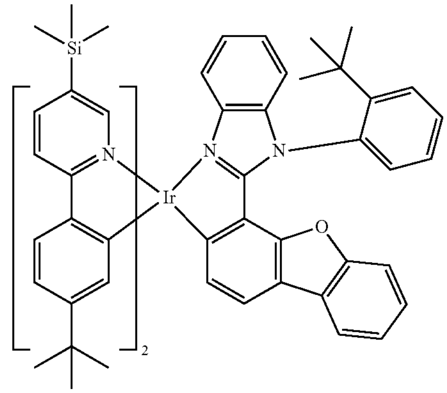

-continued
209
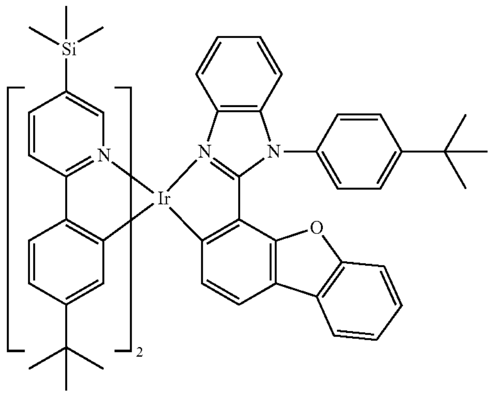
210
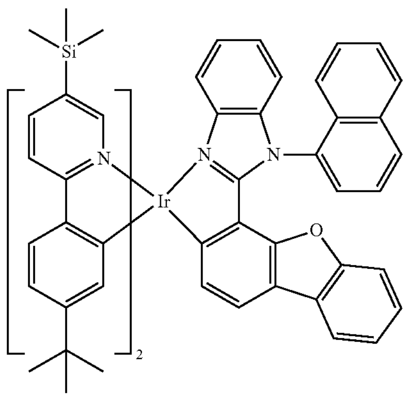
211
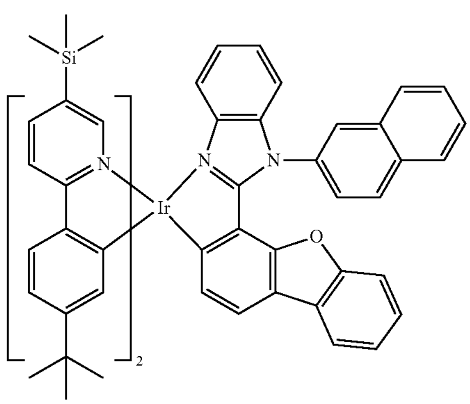
212
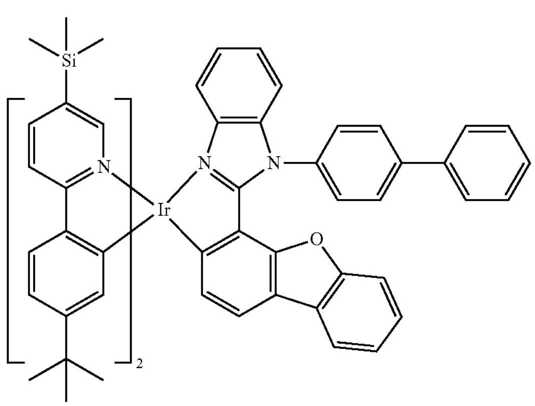
-continued
213
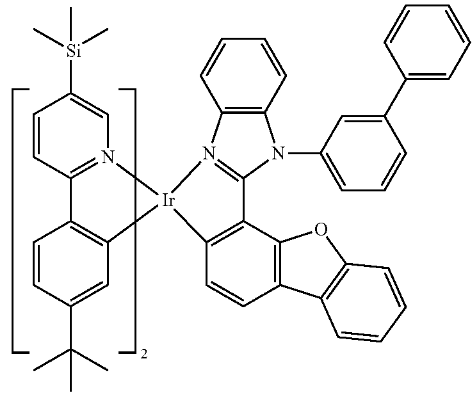
214
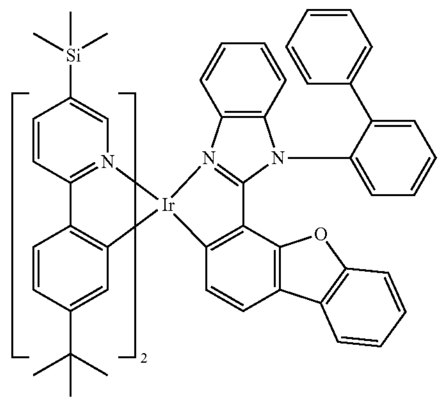
215
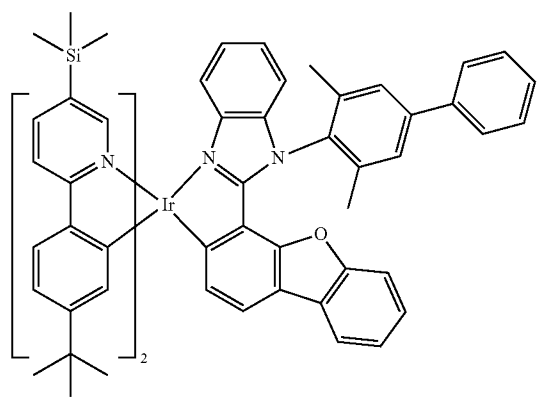
216
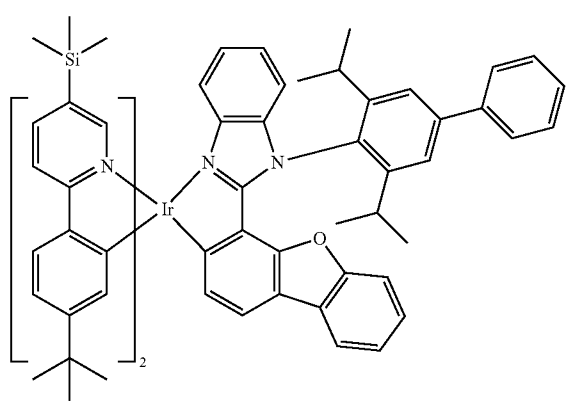

-continued
217
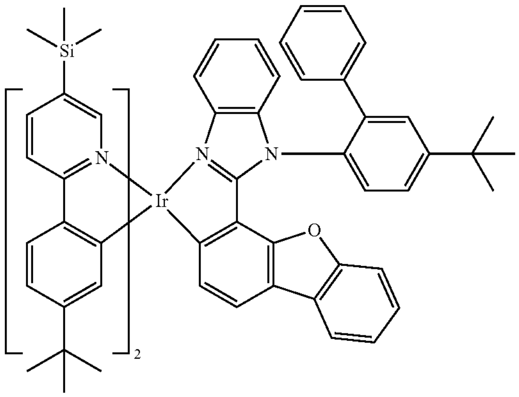
218
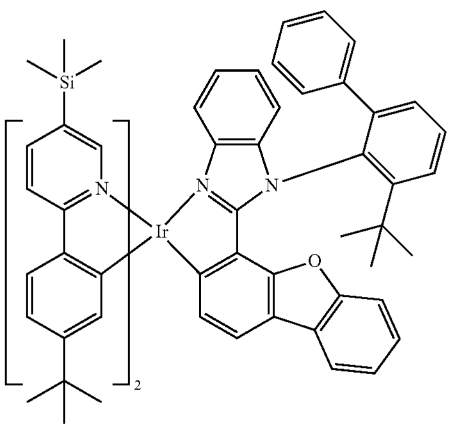
219
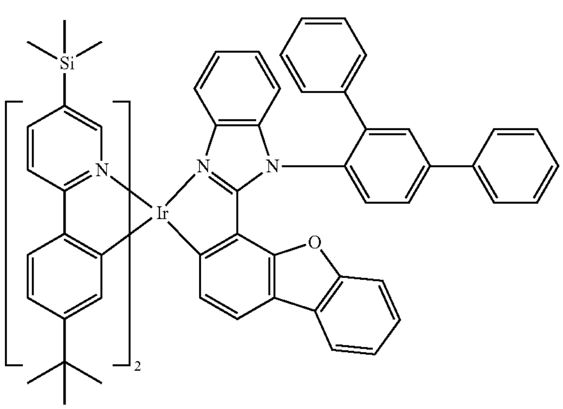
-continued
220
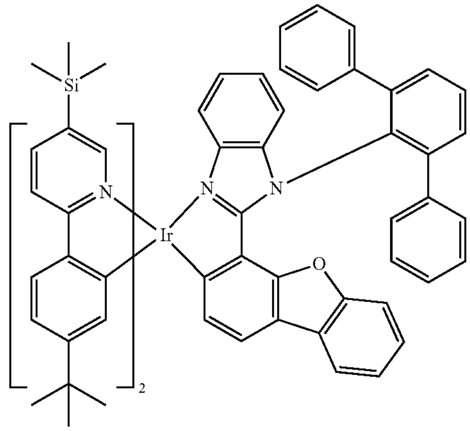
221
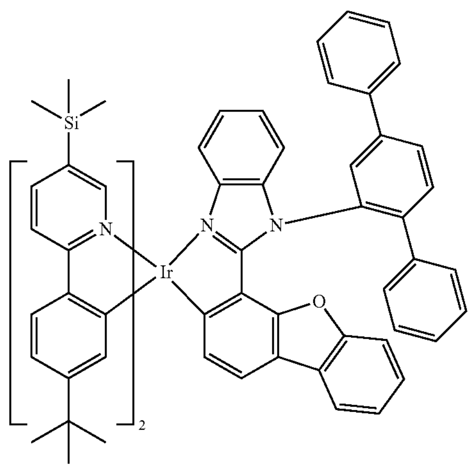
222
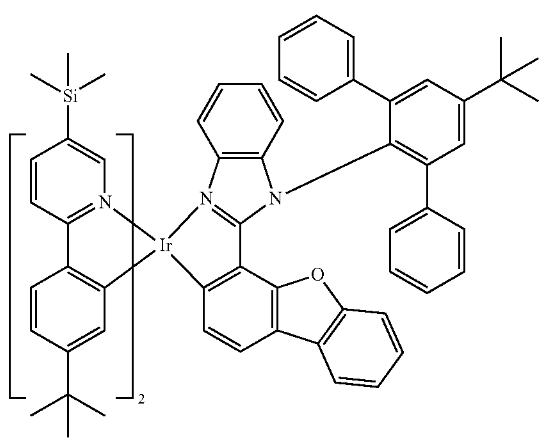

223
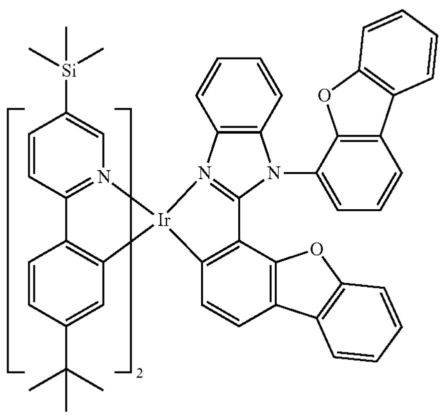
224
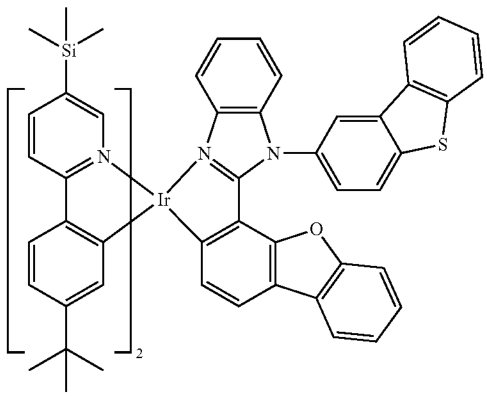
225
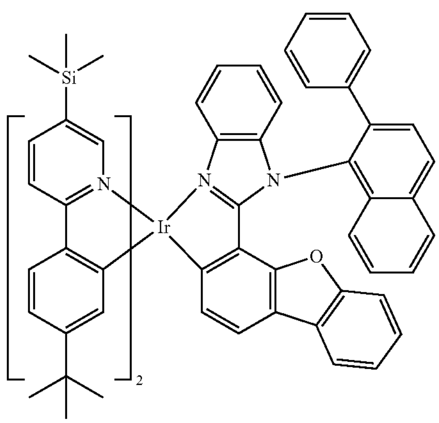
226
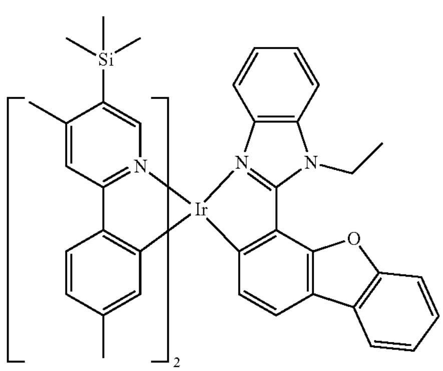
227
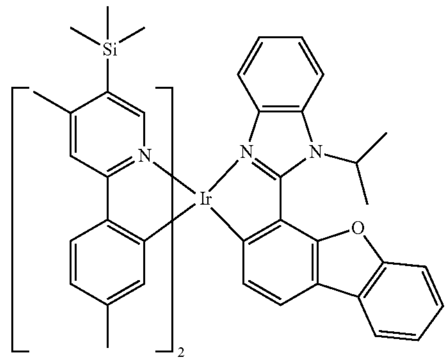
228
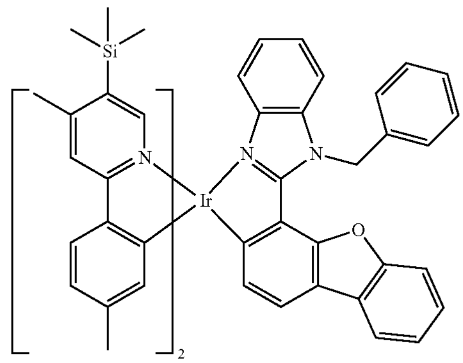
229
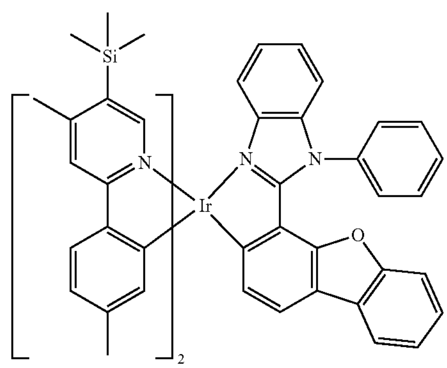
230
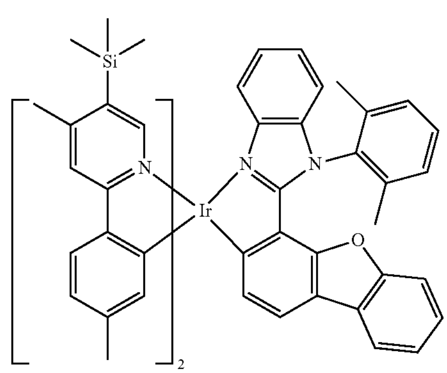

-continued
231
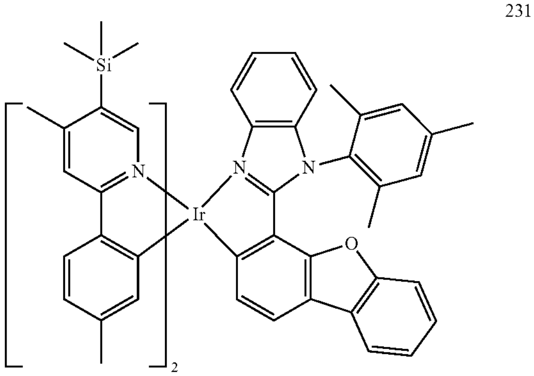
232
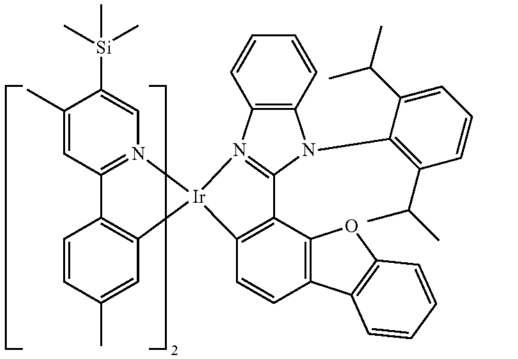
233
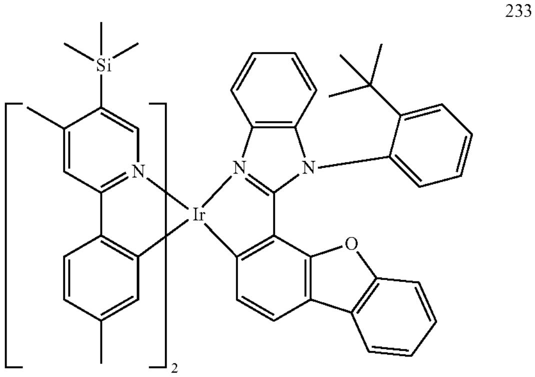
234
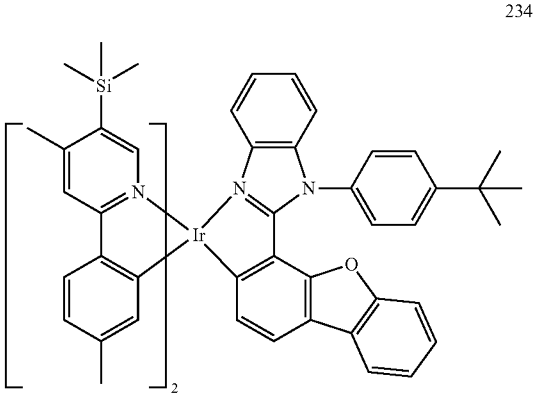
-continued
235
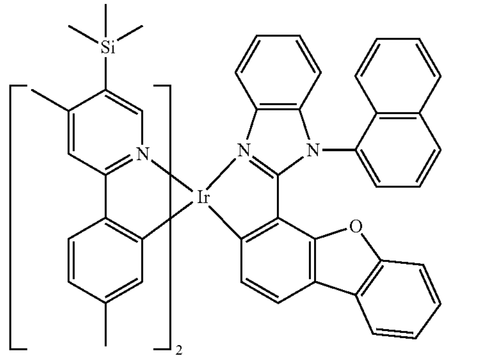
236
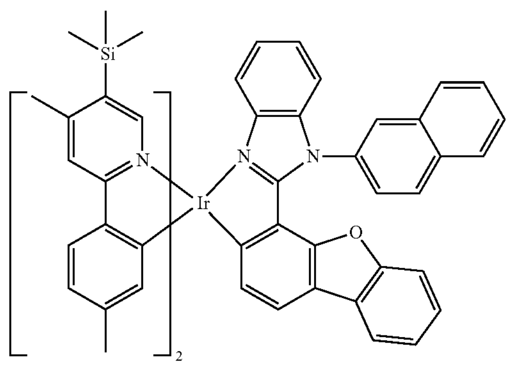
237
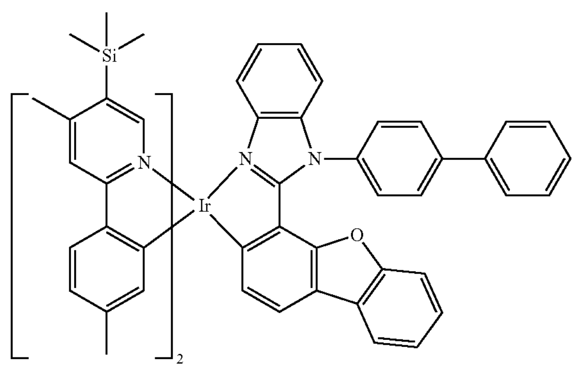
238
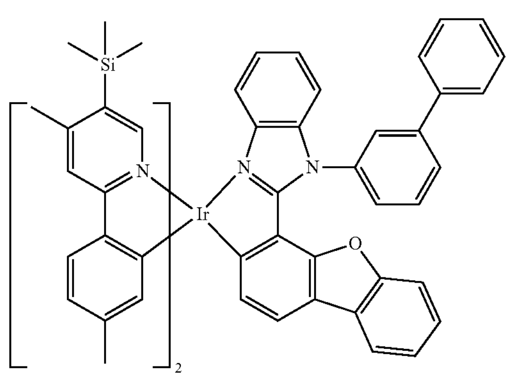

239
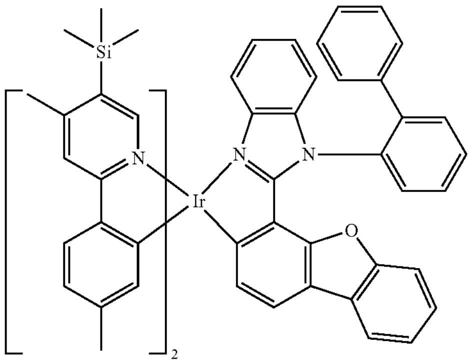
240
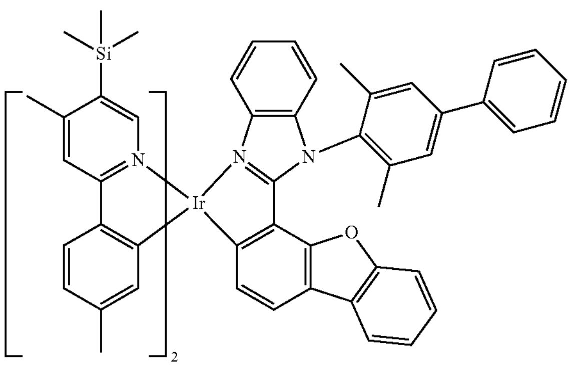
241
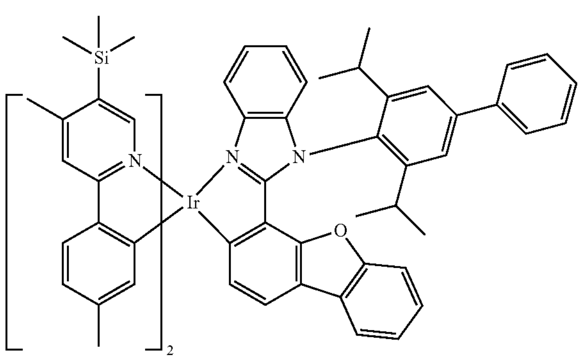
242
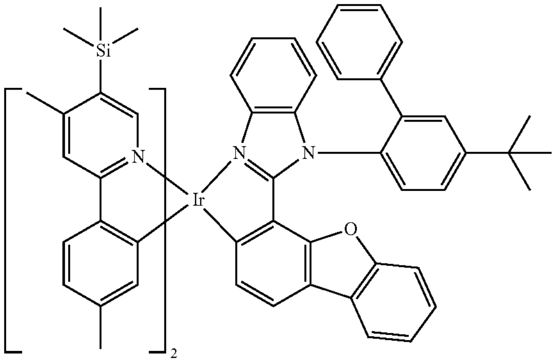
243
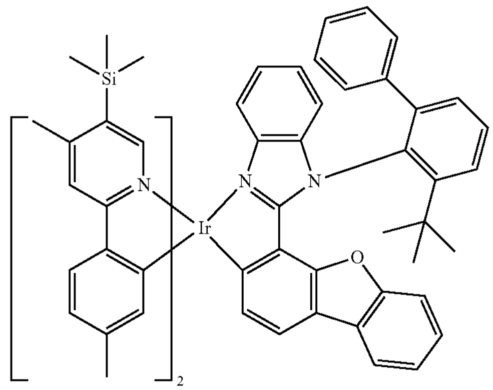
244
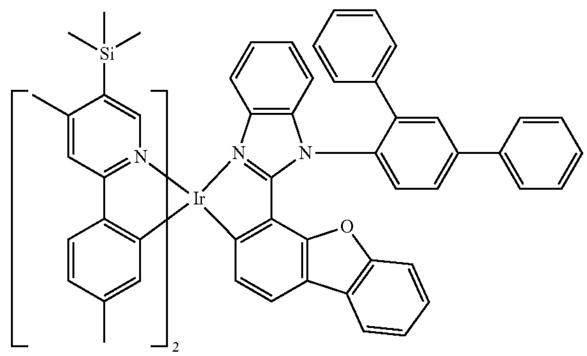
245
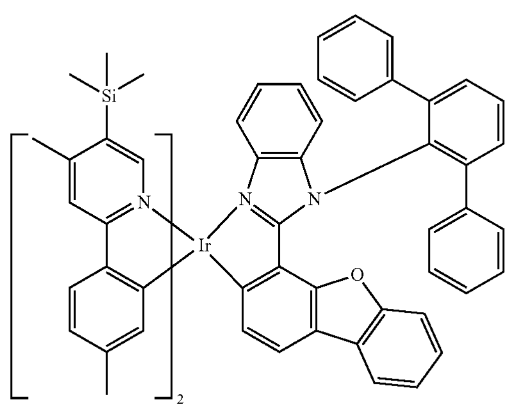
246
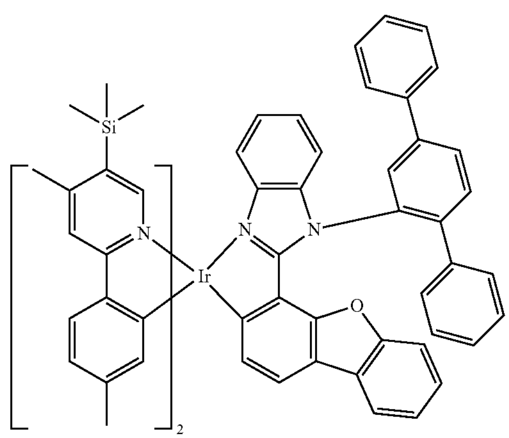

-continued
247
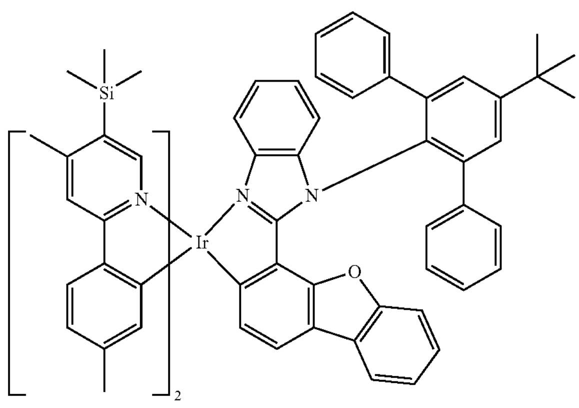
248
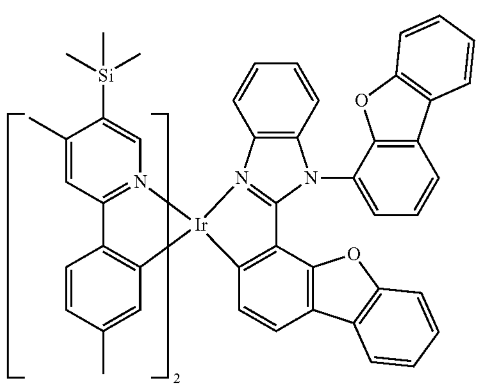
249
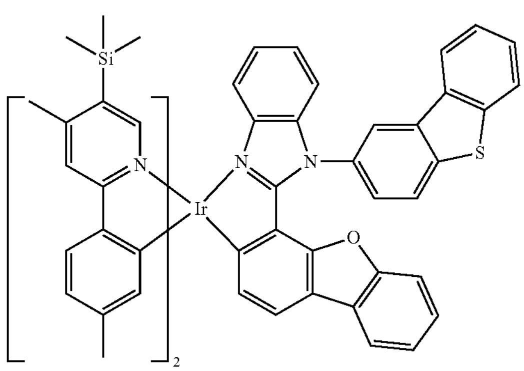
250
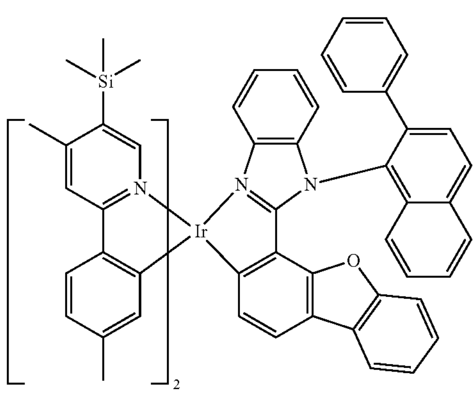
-continued
251
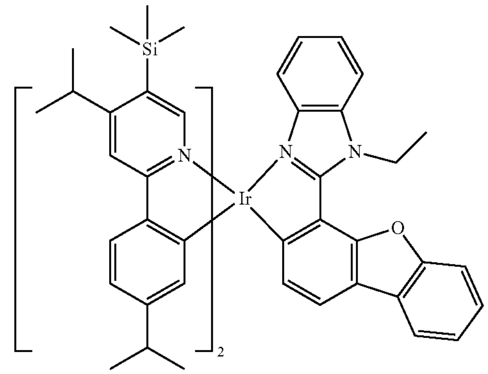
252
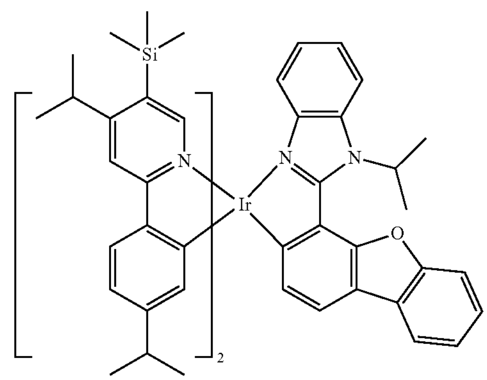
253
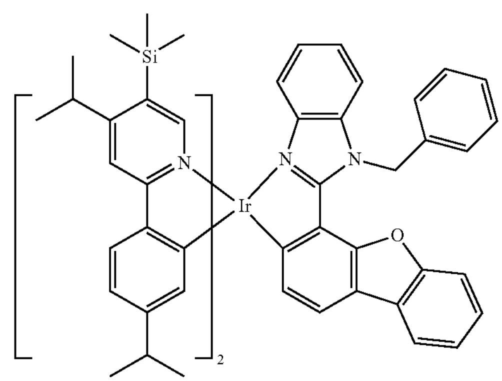
254
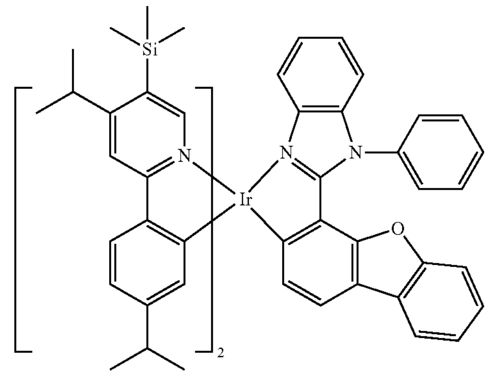

-continued
255
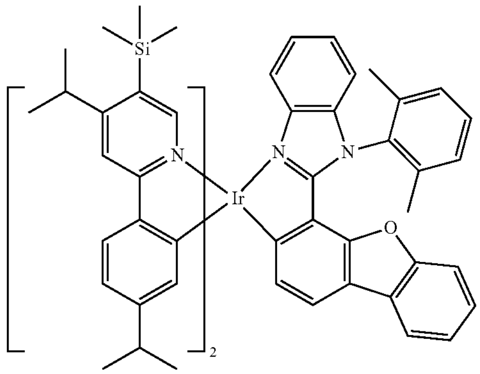
256
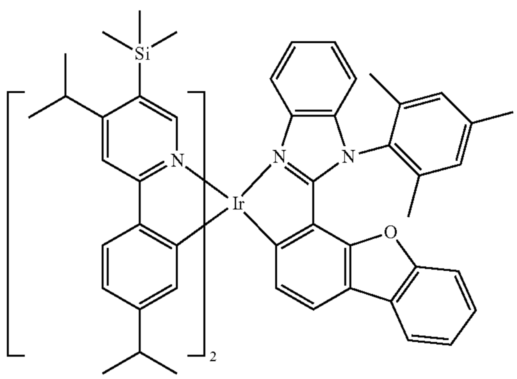
257
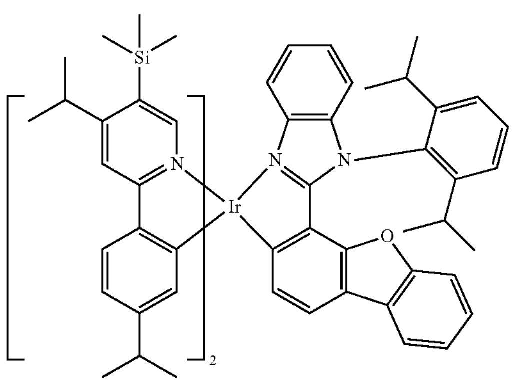
258
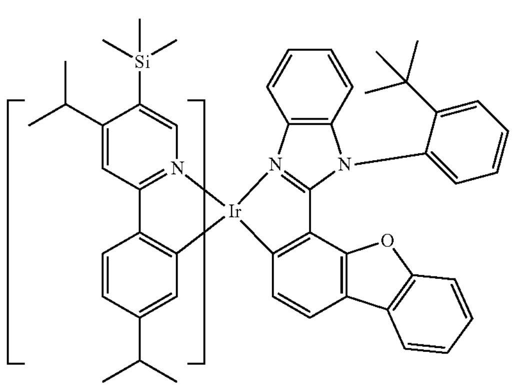
-continued
259
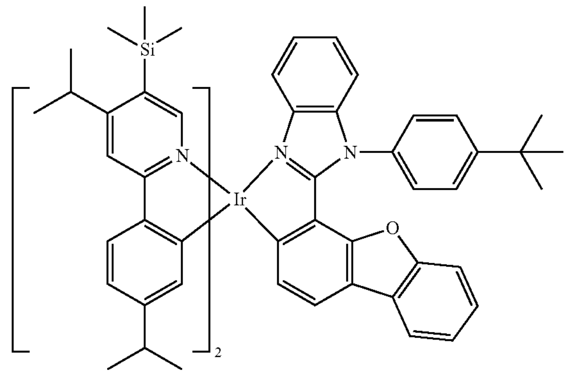
260
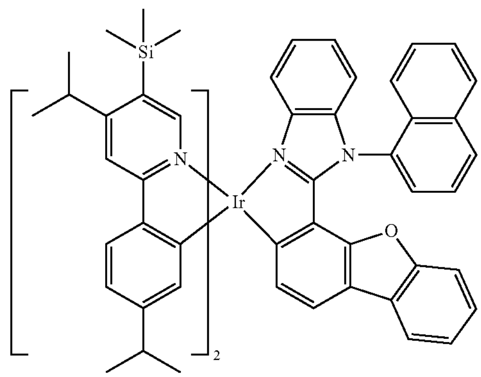
261
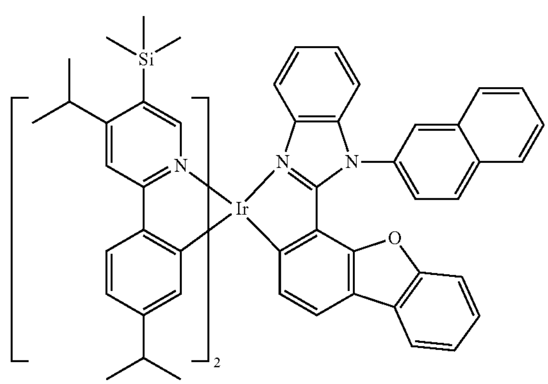
262
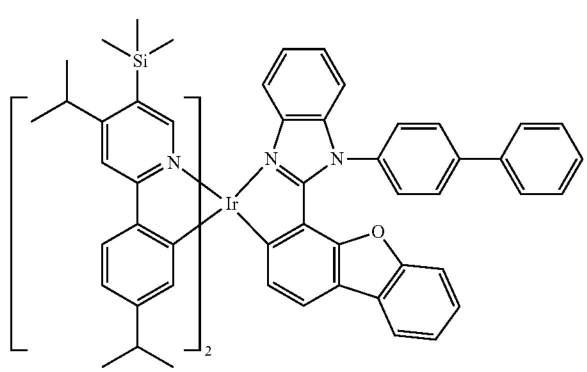

-continued
263
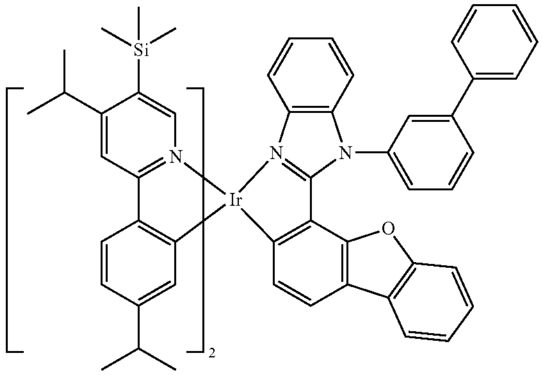
264
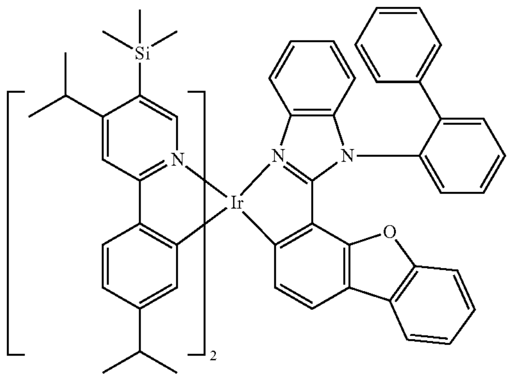
265
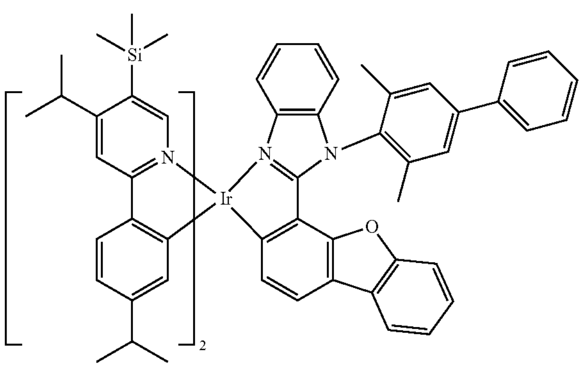
266
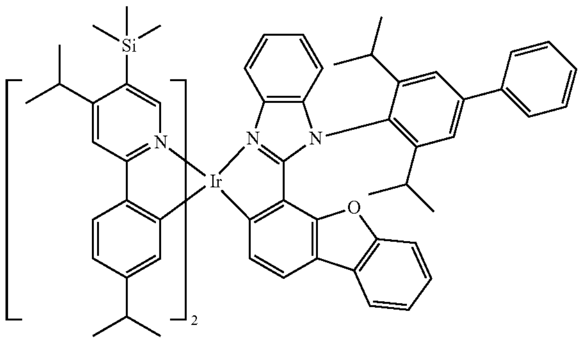
-continued
267
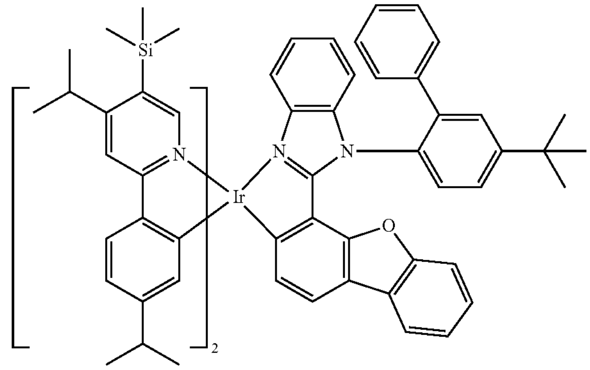
268
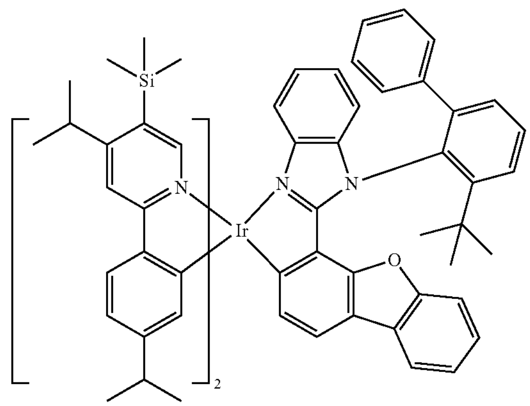
269
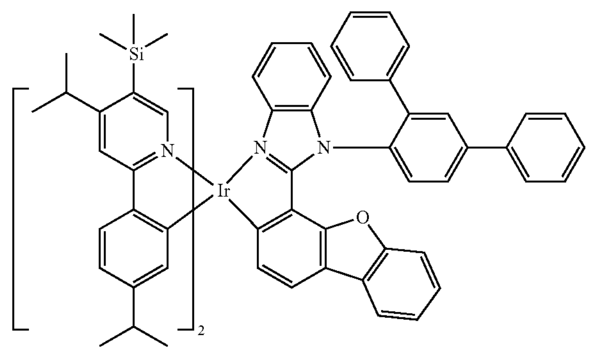
270
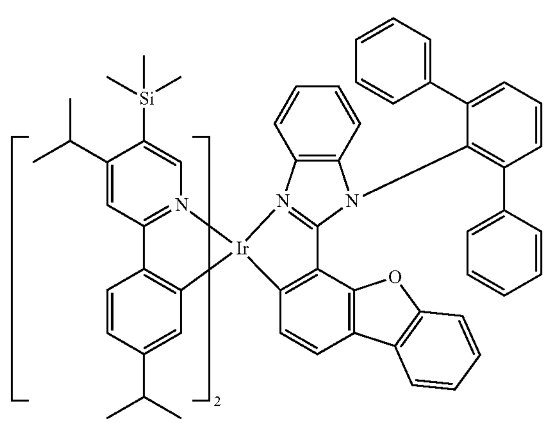

-continued
271
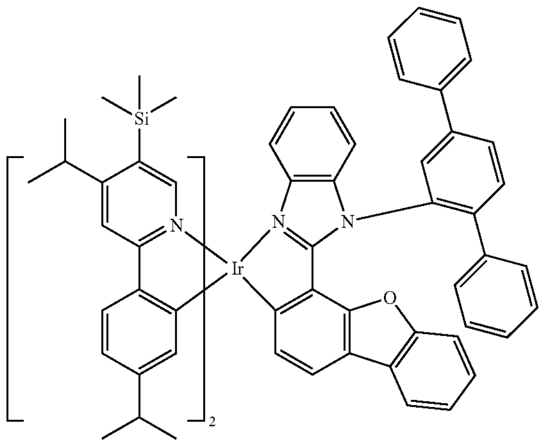
272
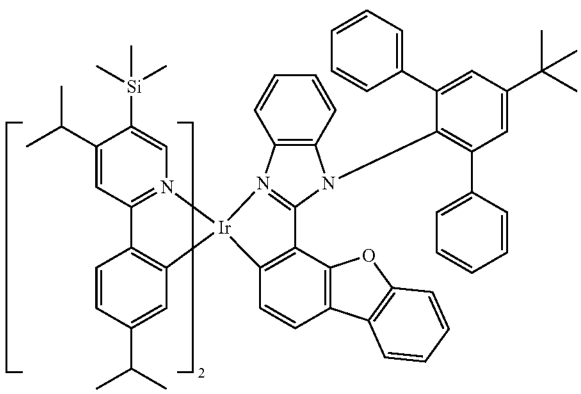
273
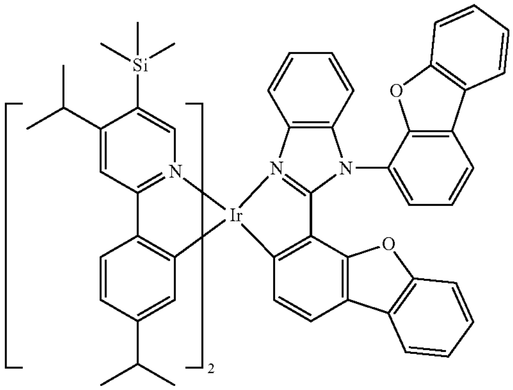
-continued
274
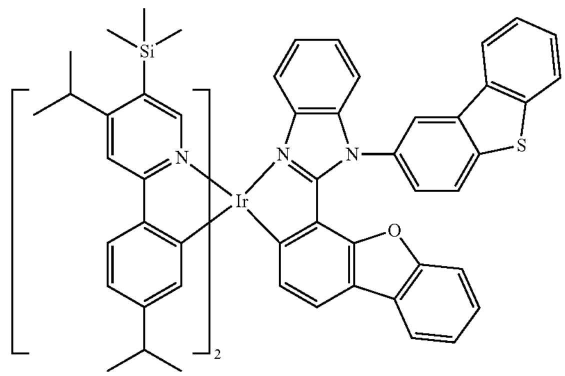
275
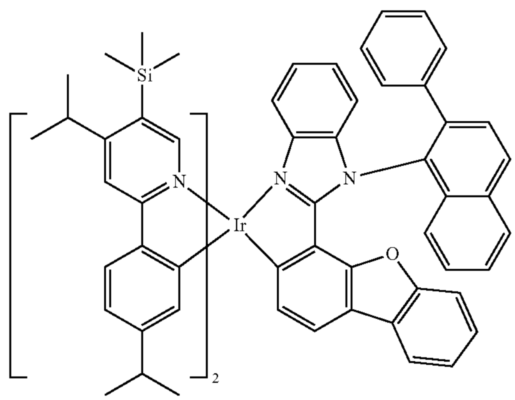
276
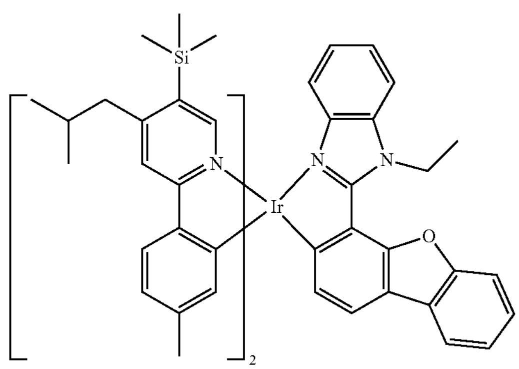
277
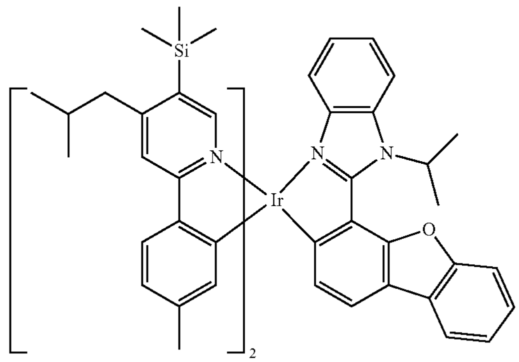

-continued
278
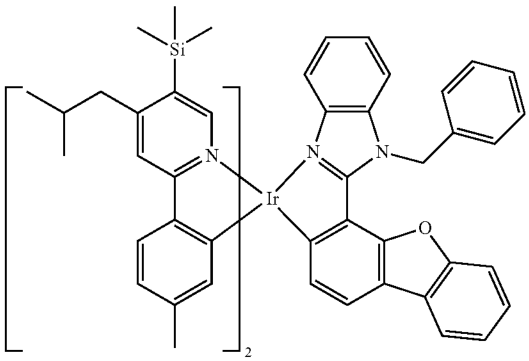
279
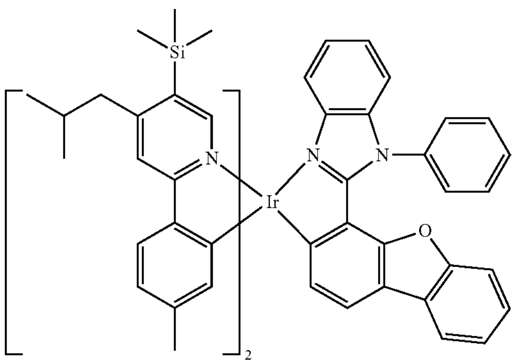
280
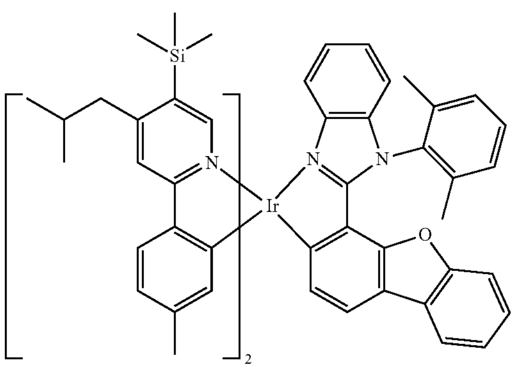
281
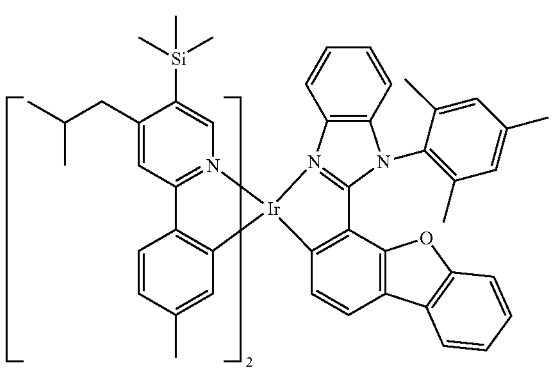
-continued
282
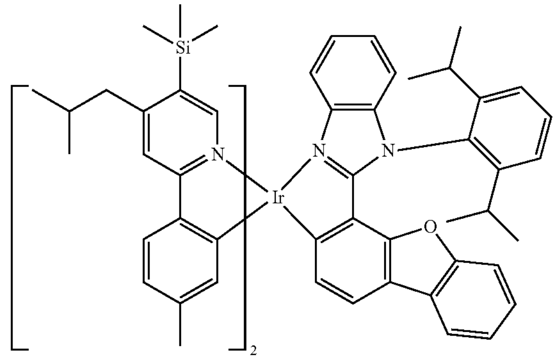
283
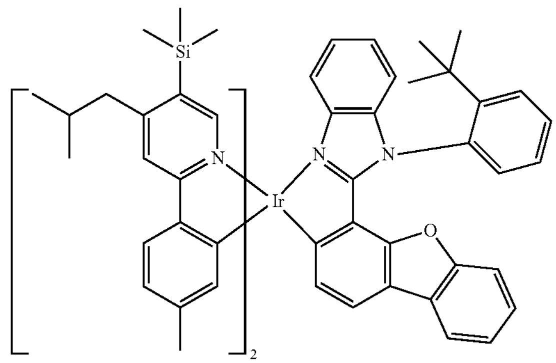
284
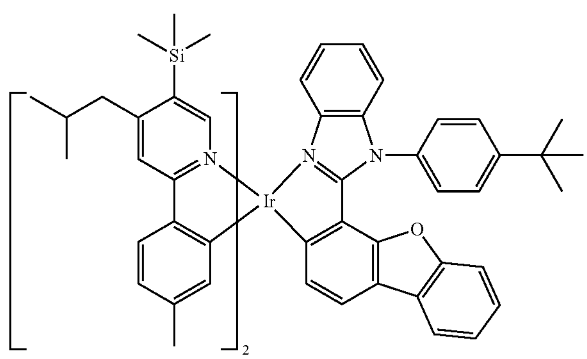
285
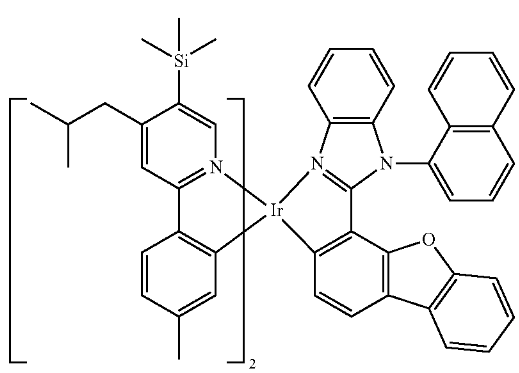

-continued
286
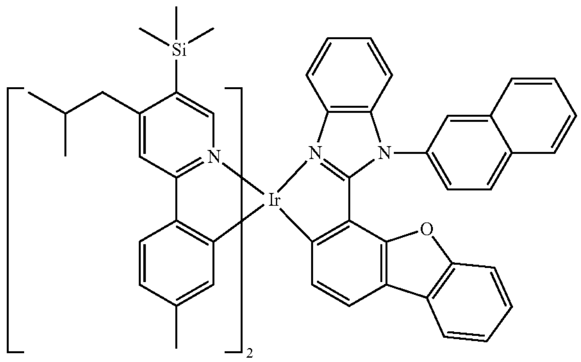
287
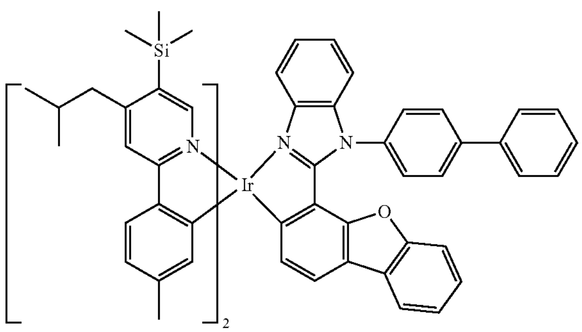
288
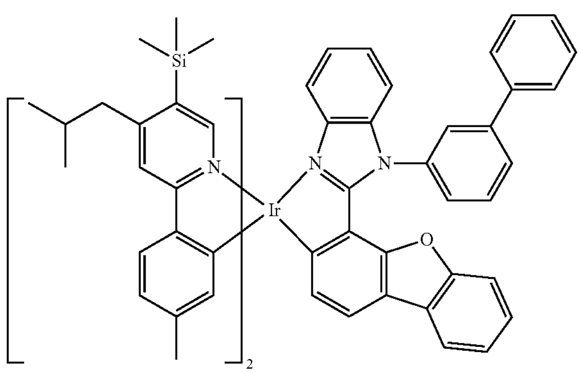
289
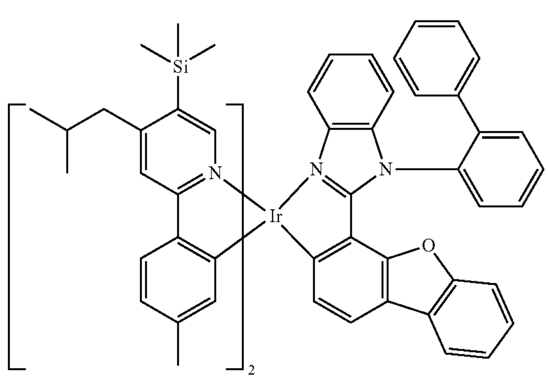
-continued
290
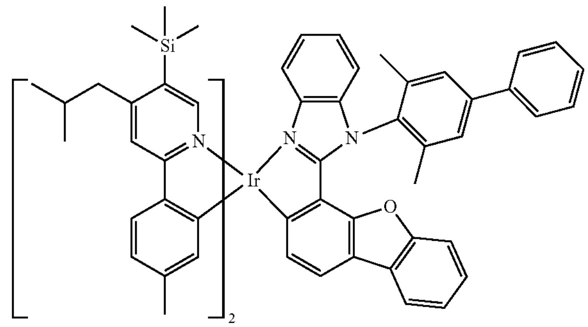
291
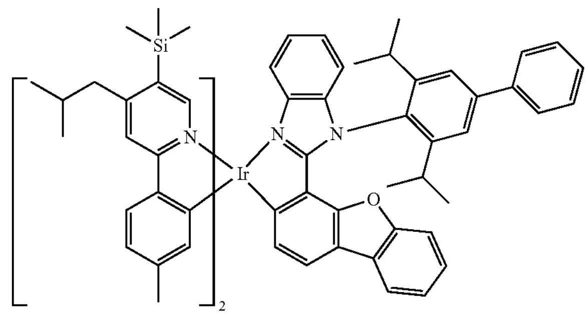
292
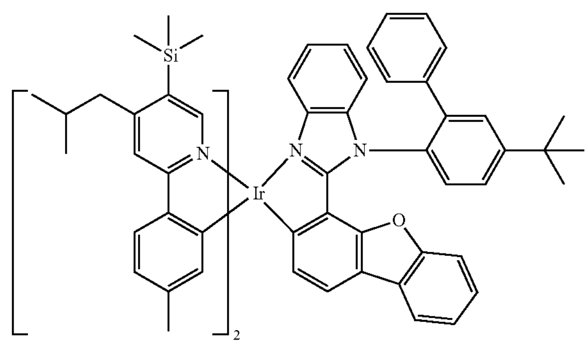
293
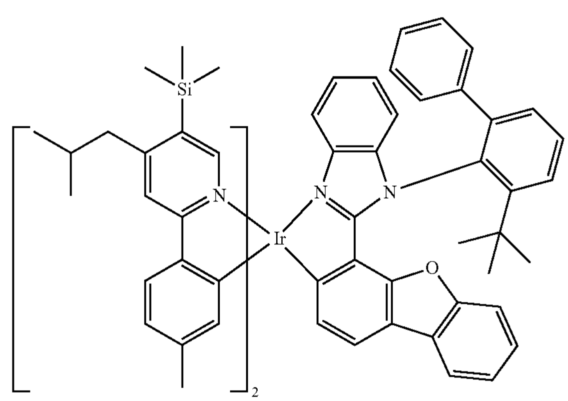

-continued
294
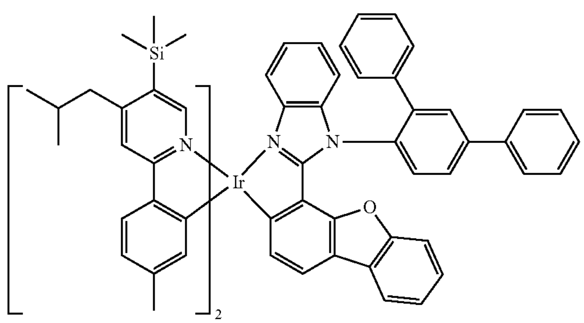
295
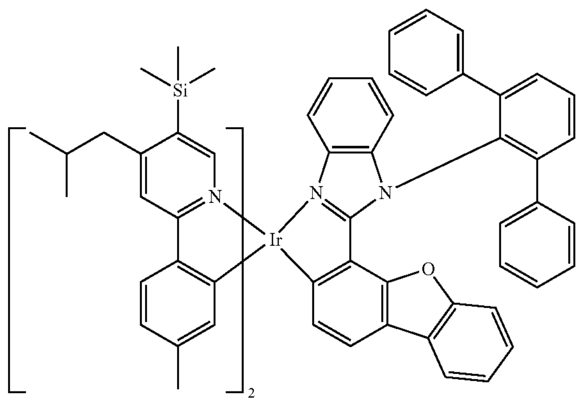
296
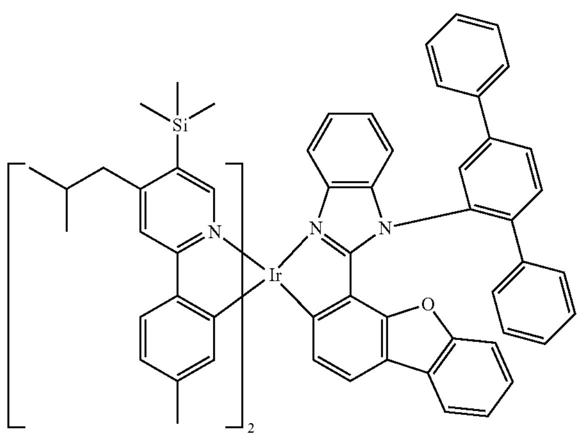
297
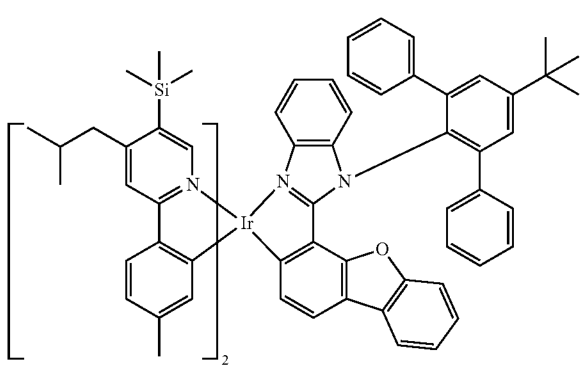
-continued
298
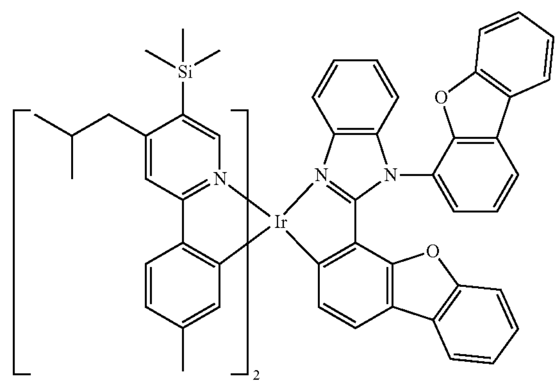
299
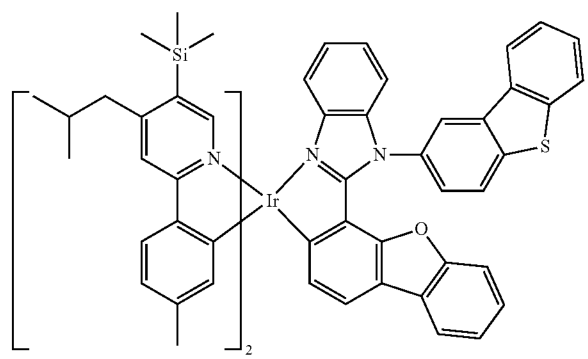
300
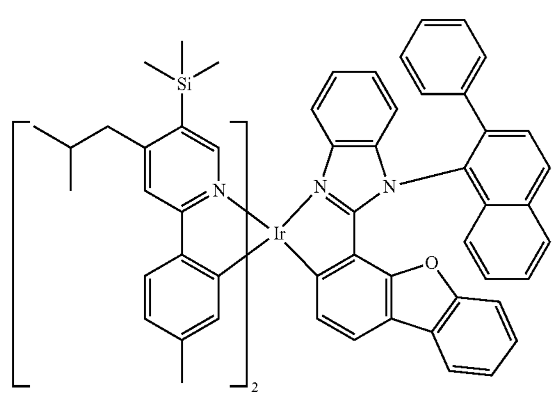

-continued
301
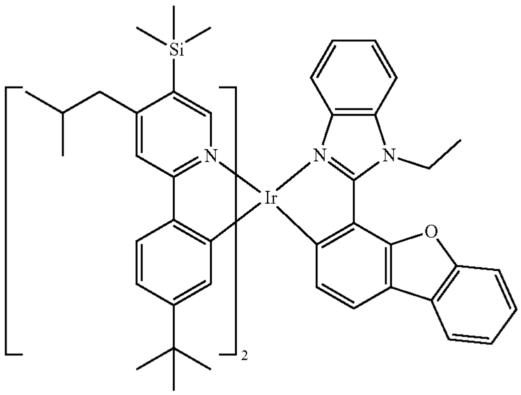
302
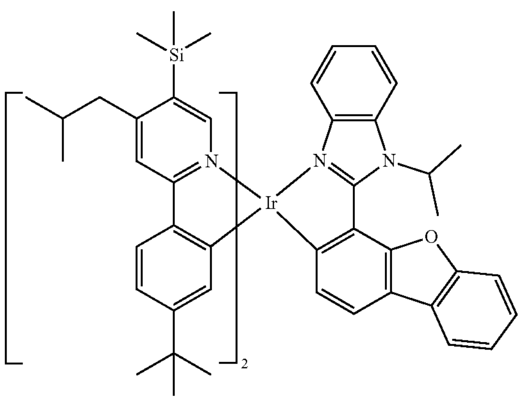
303
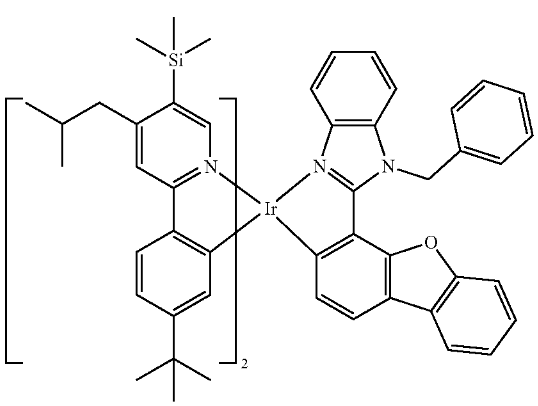
304
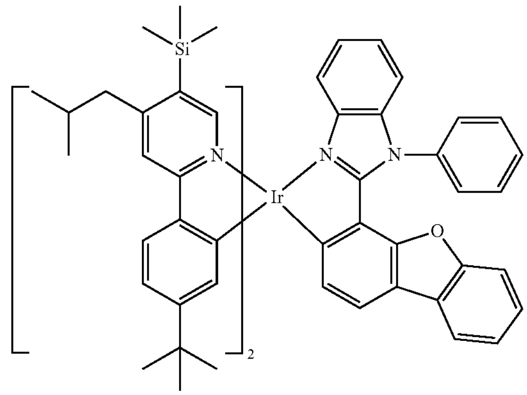
305
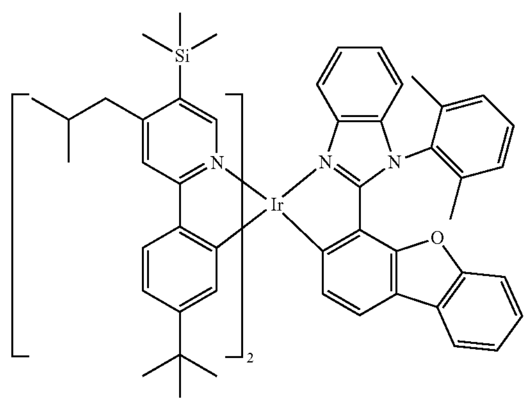
306
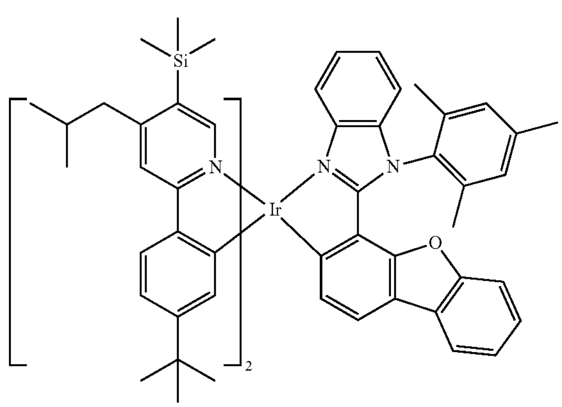

-continued
307
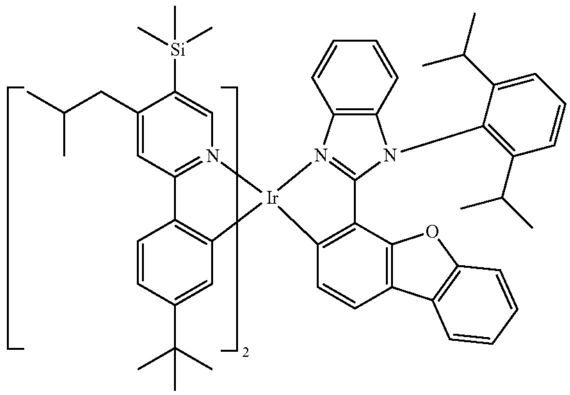
308
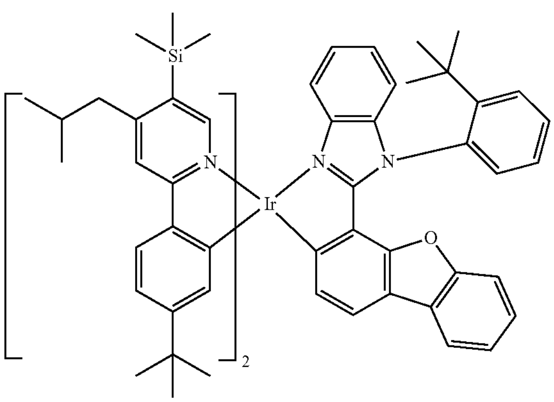
309
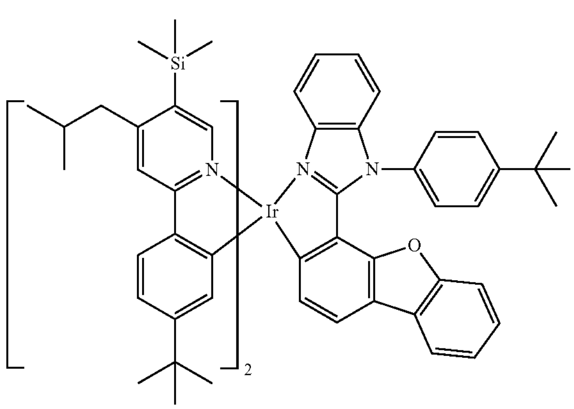
-continued
310
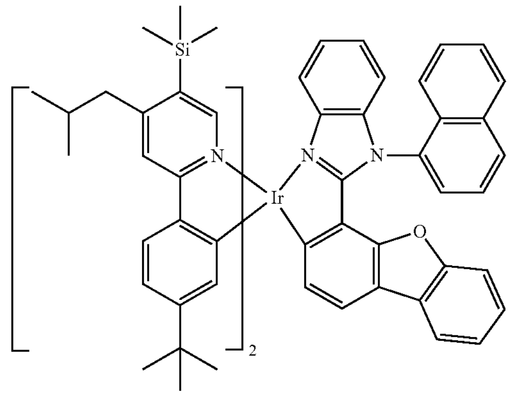
311
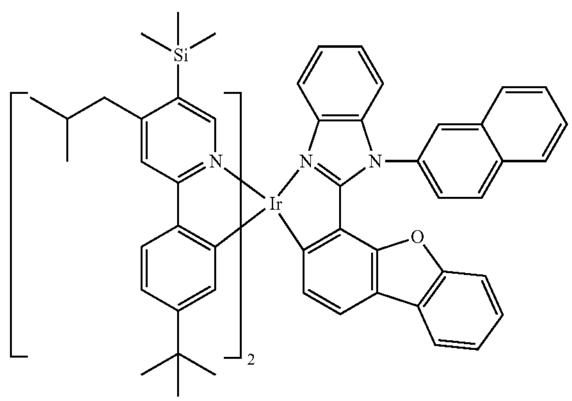
312
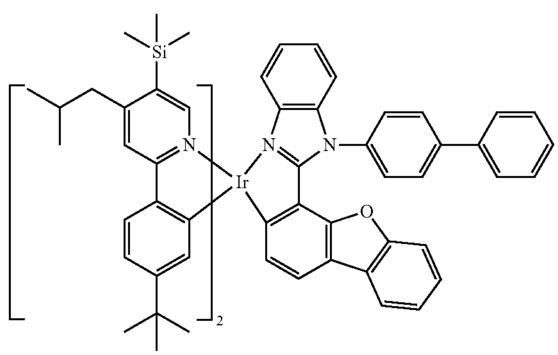
313
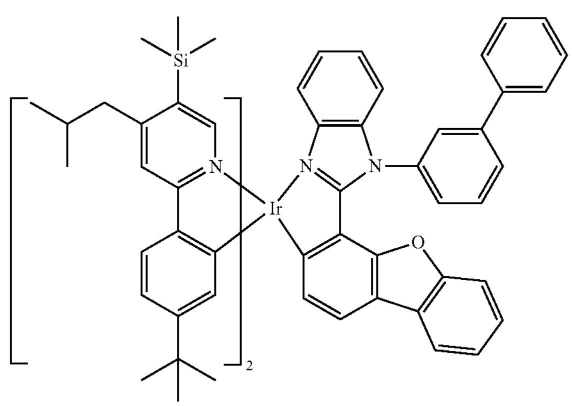

314
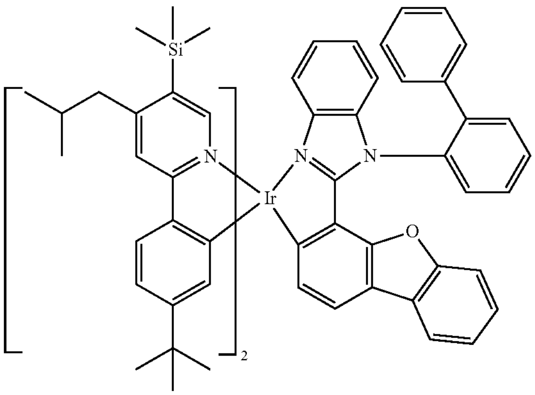
315
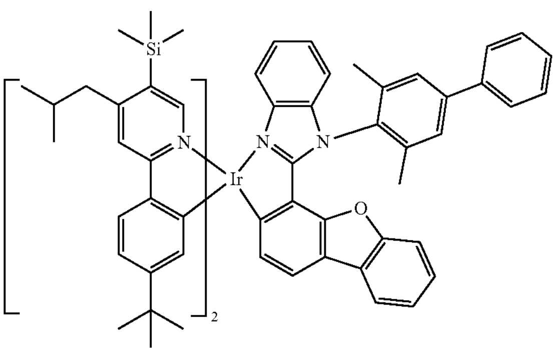
316
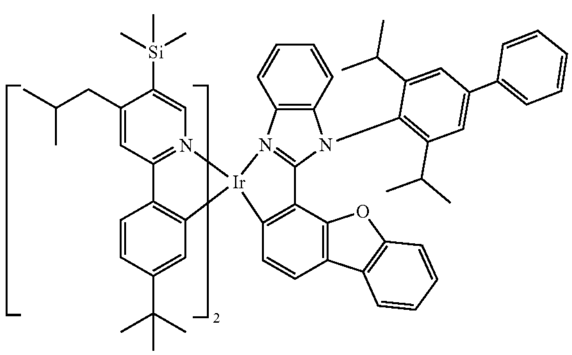
317
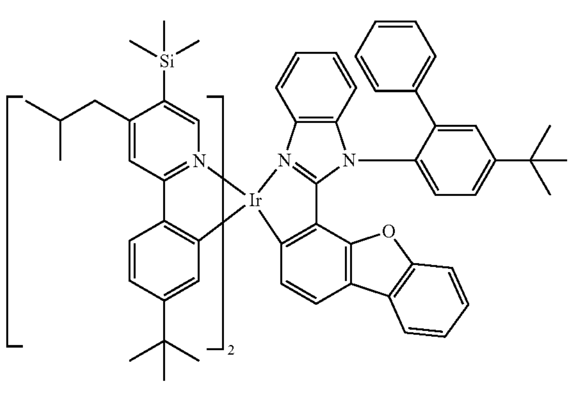
318
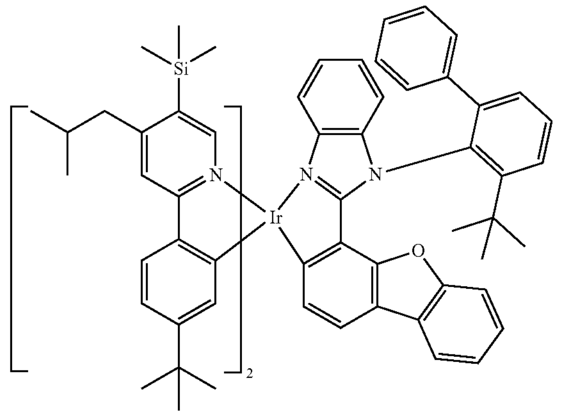
319
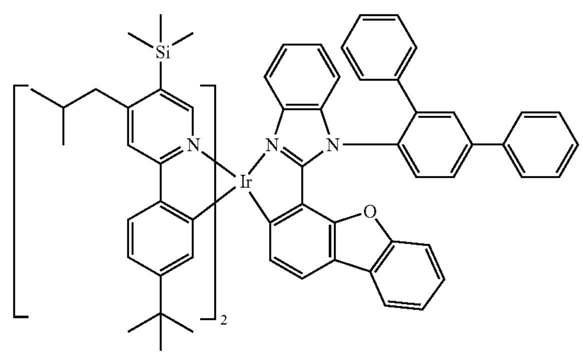
320
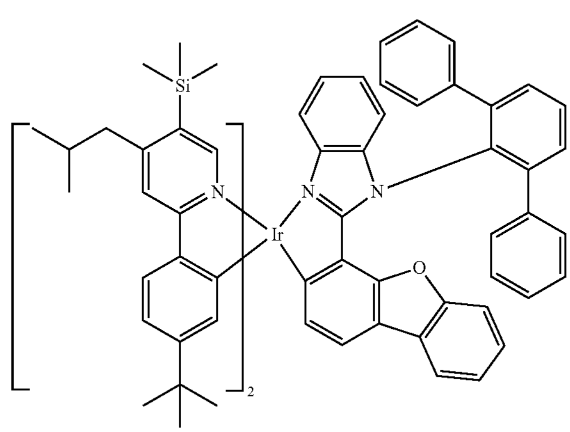

321
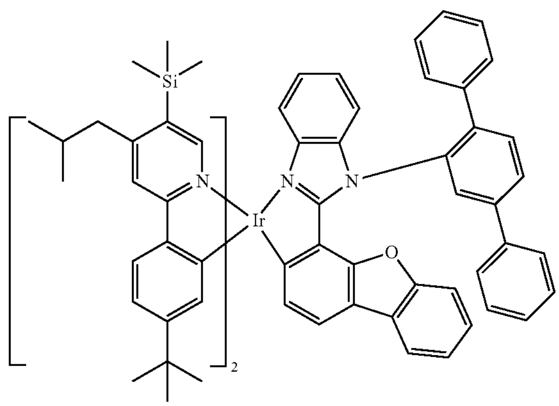
322
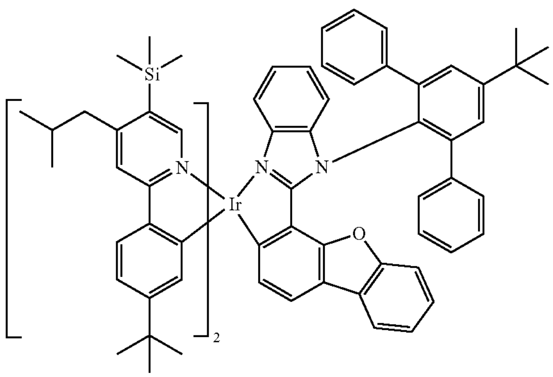
323
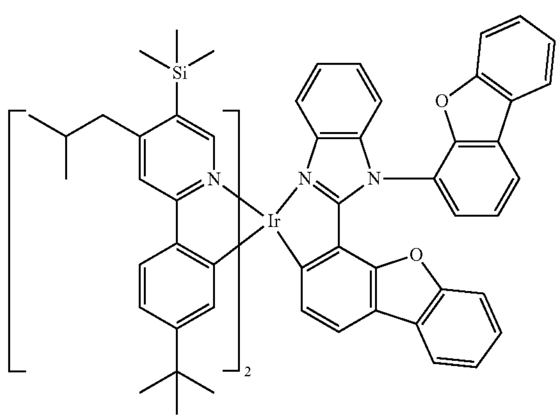
324
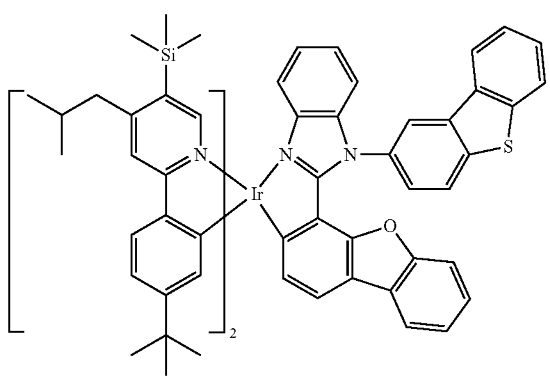
325
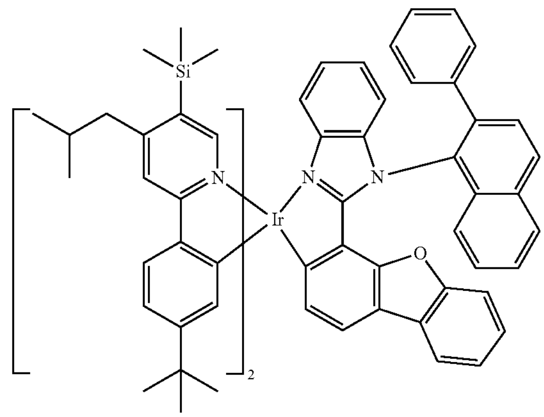
326
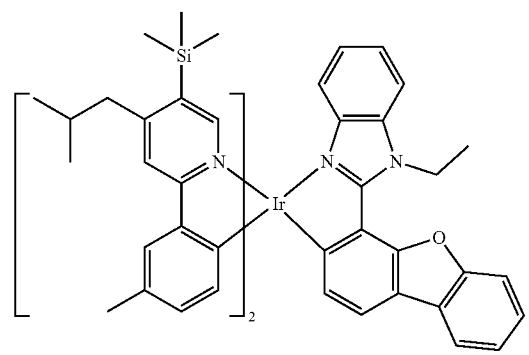
327
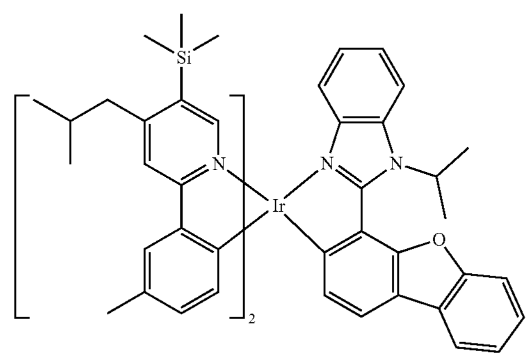
328
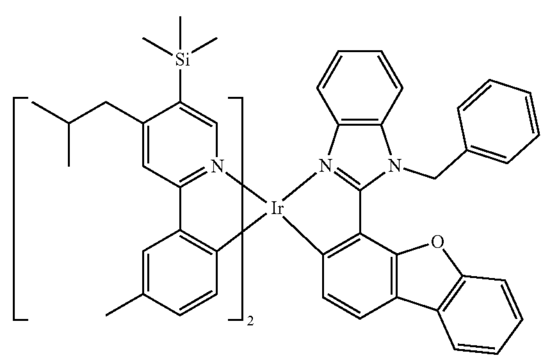

329
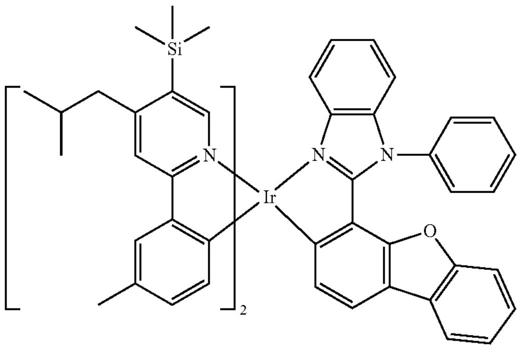
330
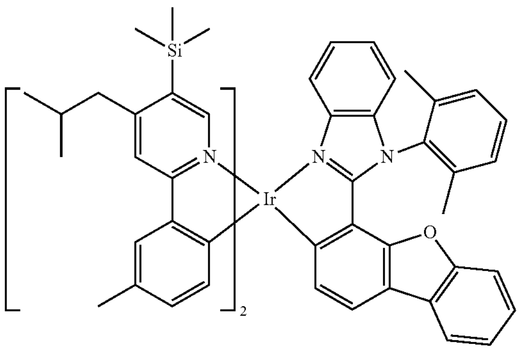
331
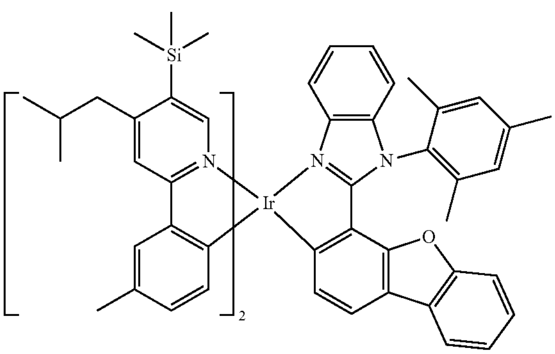
332
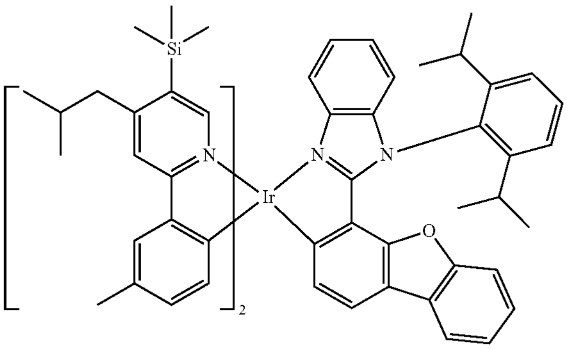
333
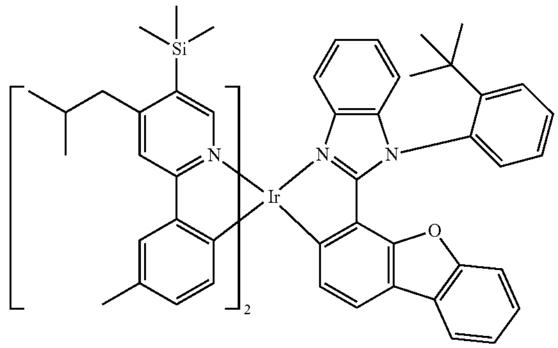
334
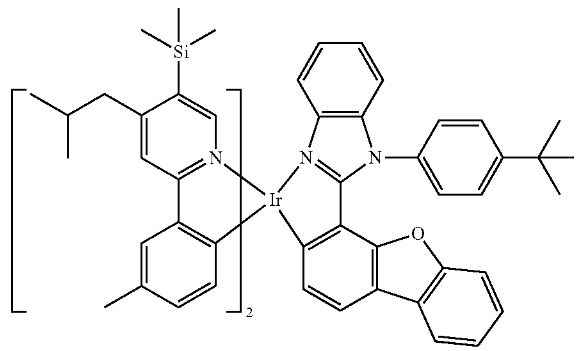
335
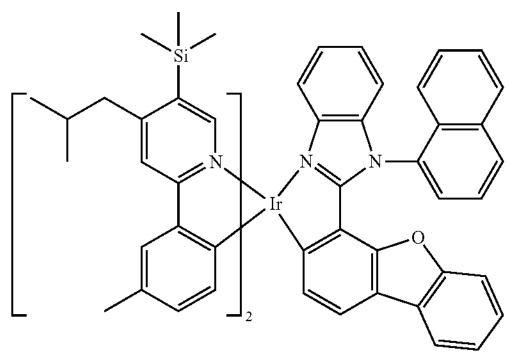
336
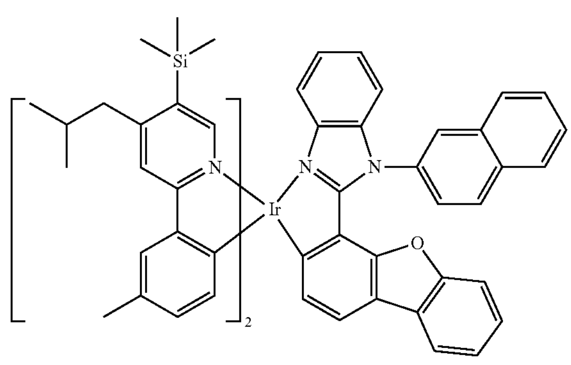

-continued
337
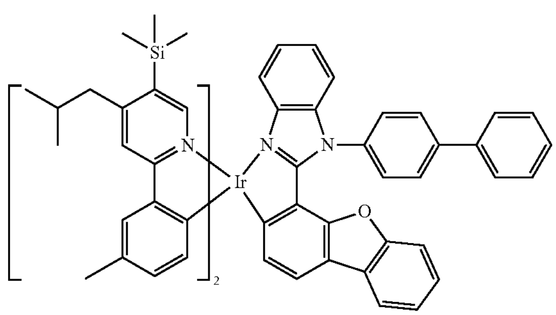
338
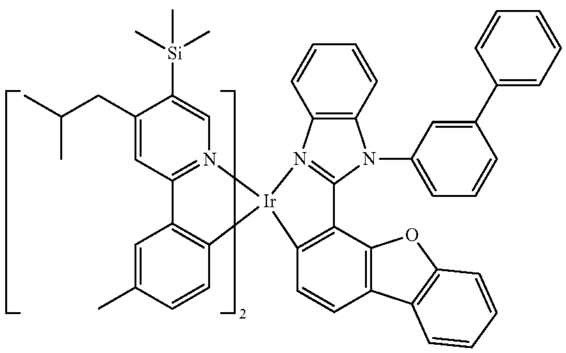
339
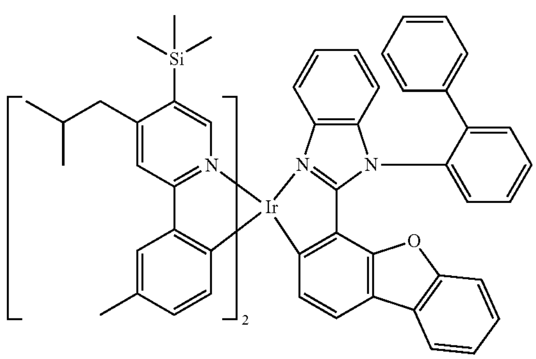
340
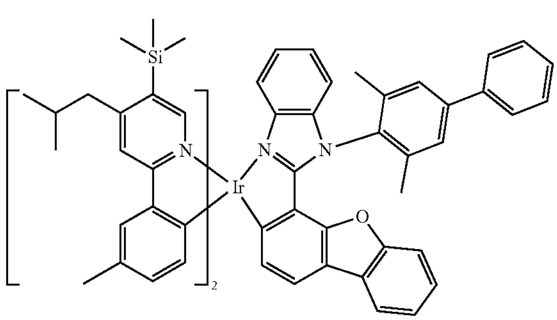
-continued
341
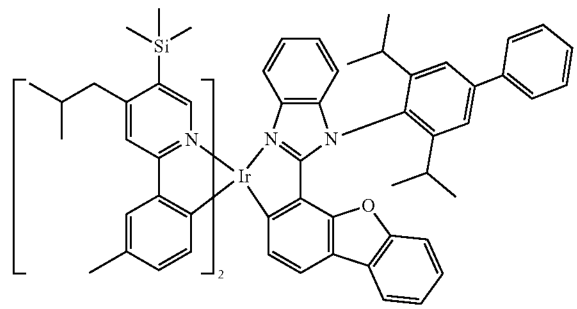
342
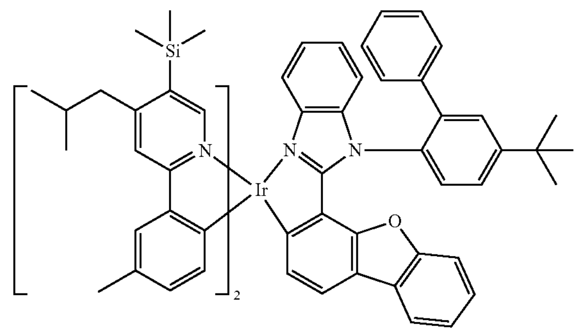
343
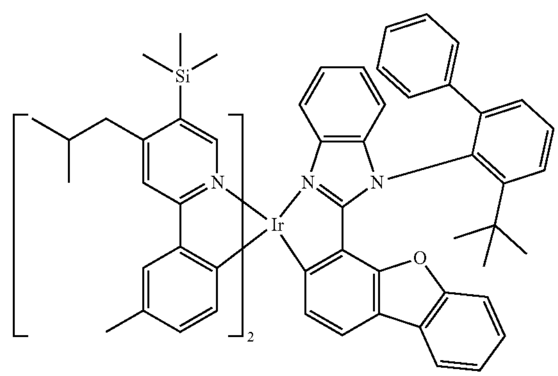
344
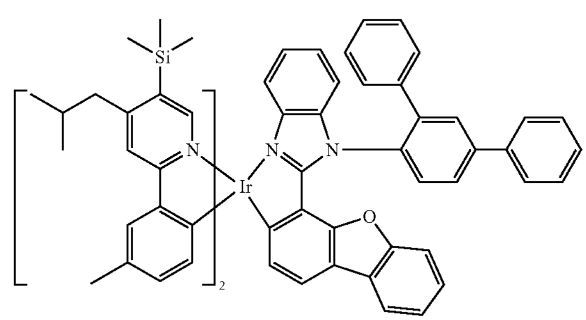

-continued
345
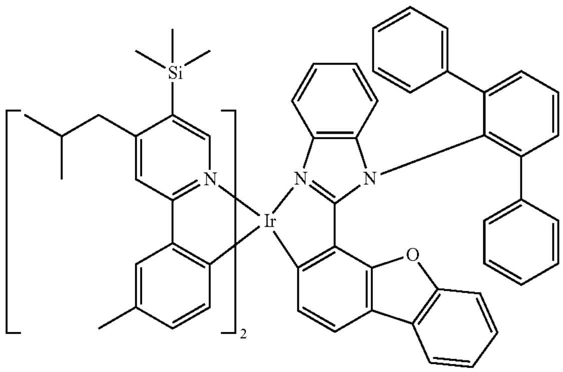
346
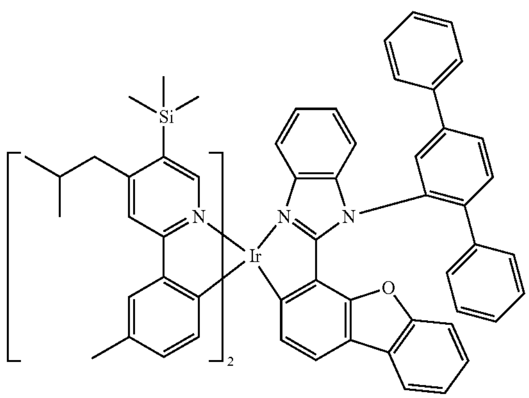
347
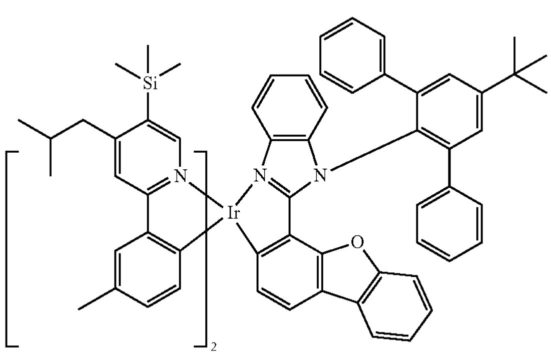
348
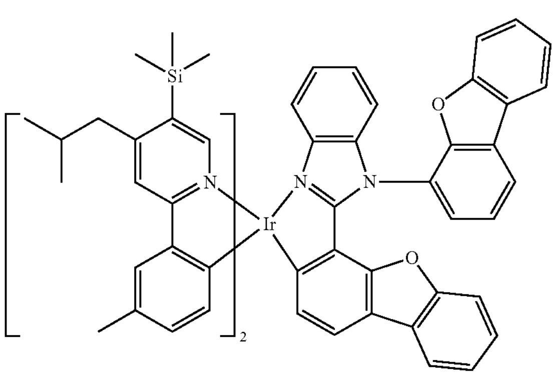
-continued
349
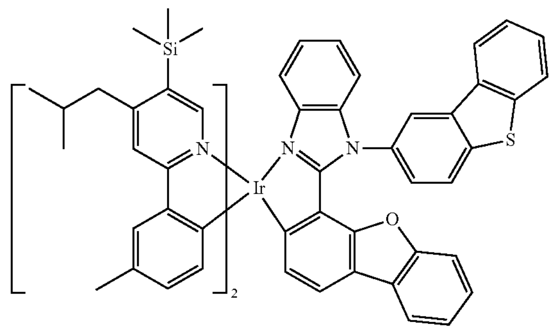
350
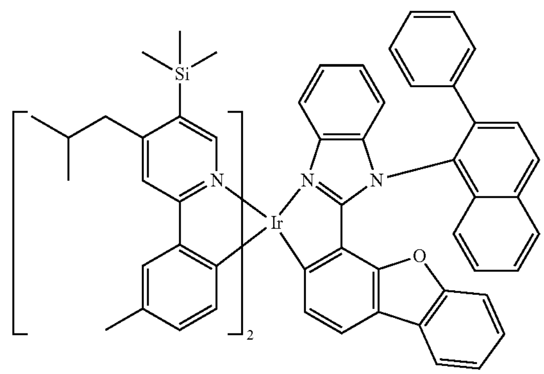
351
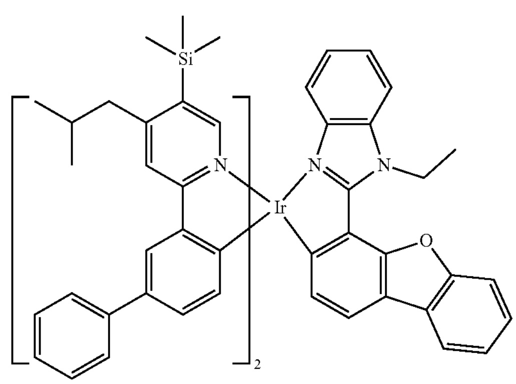
352
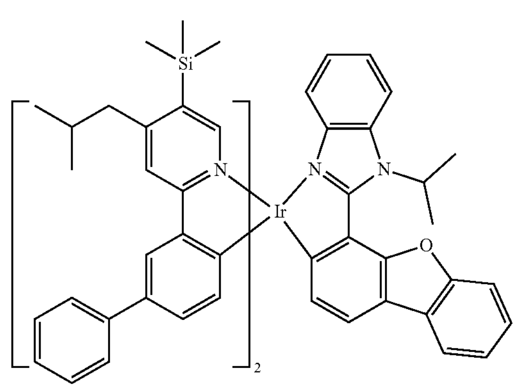

-continued
353
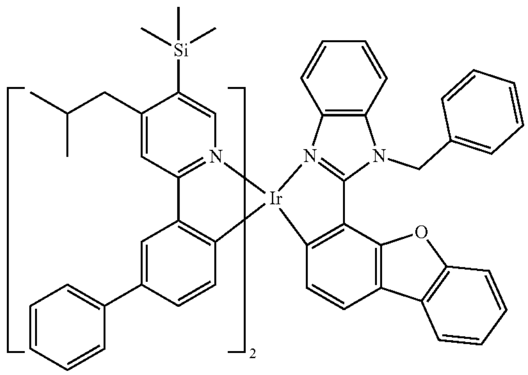
354
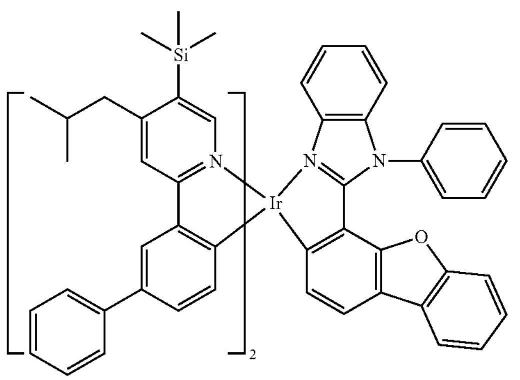
355
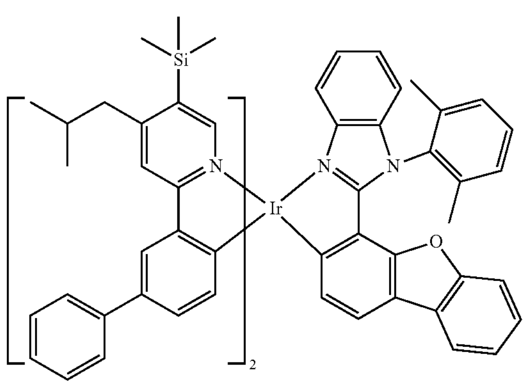
356
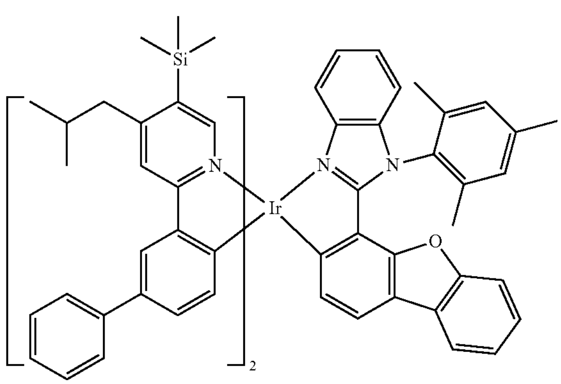
-continued
357
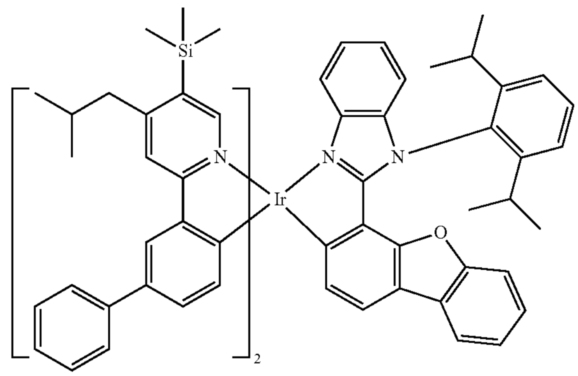
358
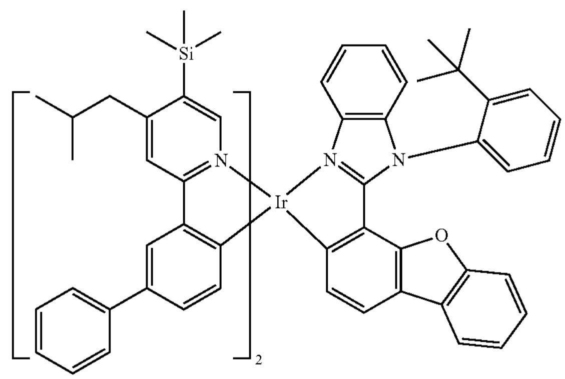
359
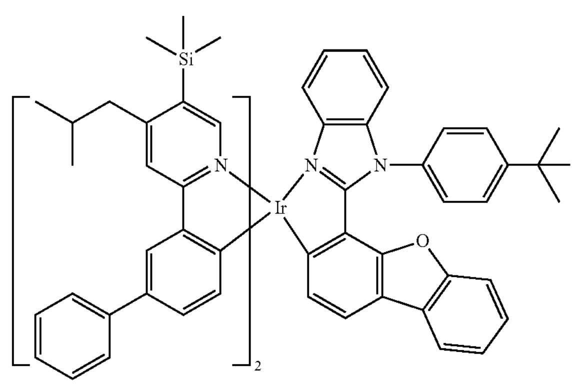
360
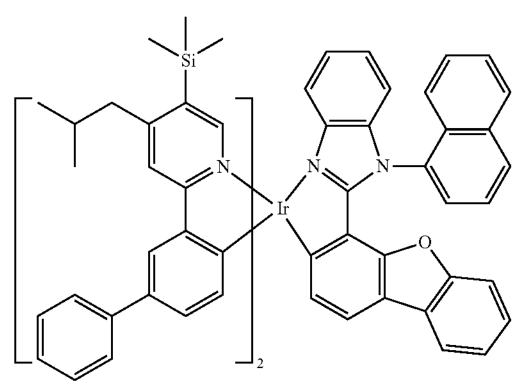

-continued
361
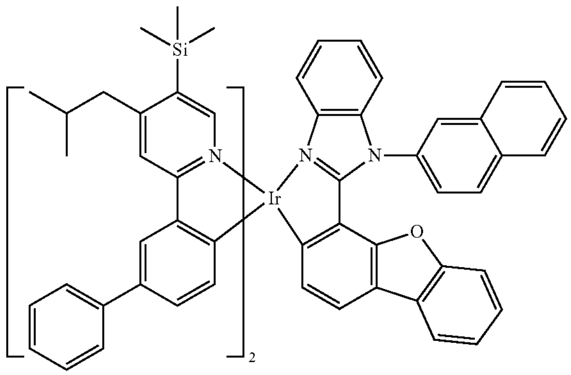
362
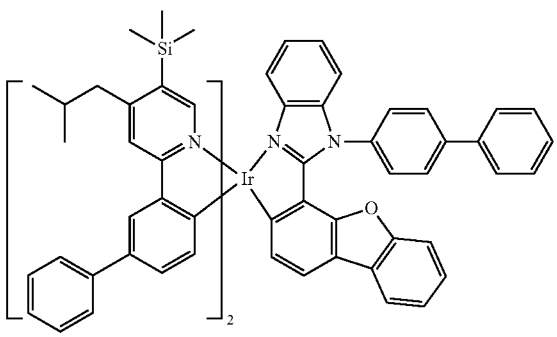
363
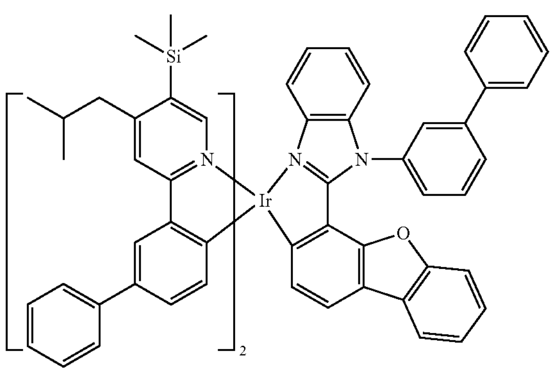
364
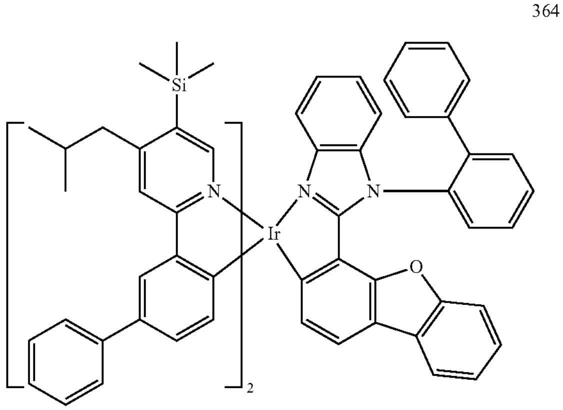
-continued
365
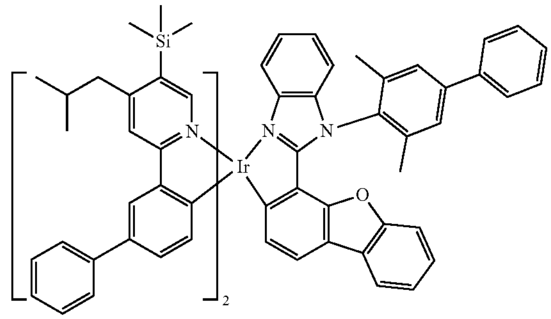
366
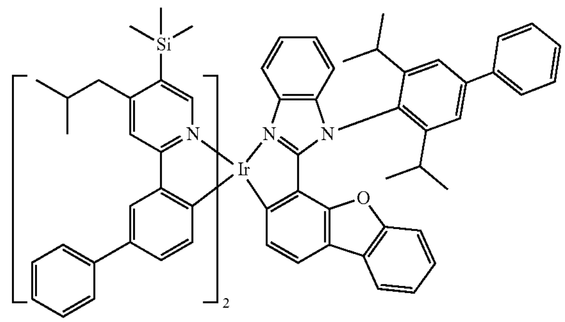
367
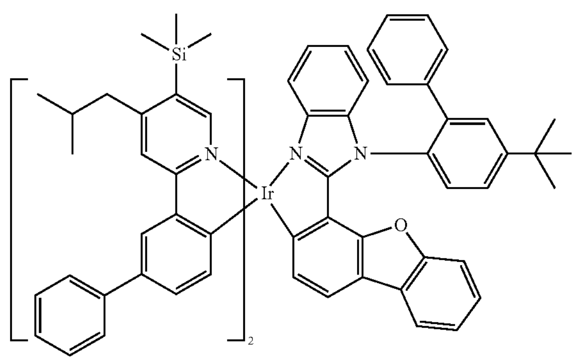
368
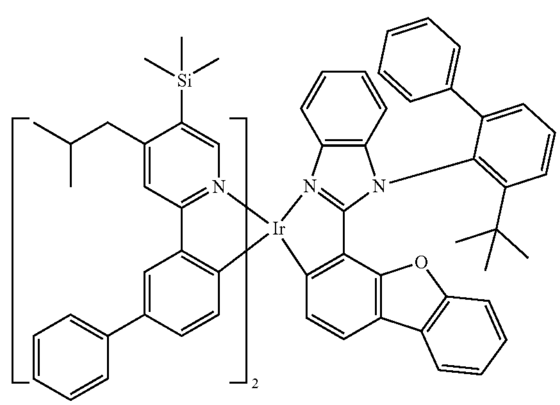

369
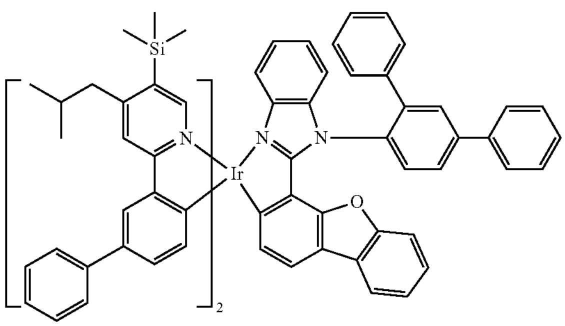
370
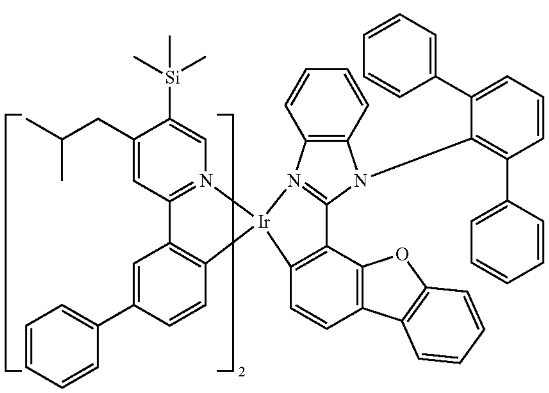
371
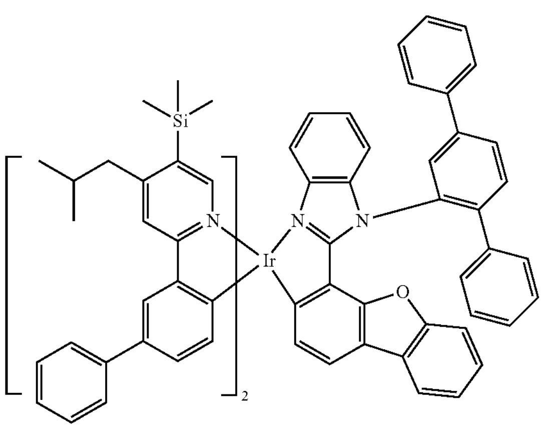
372
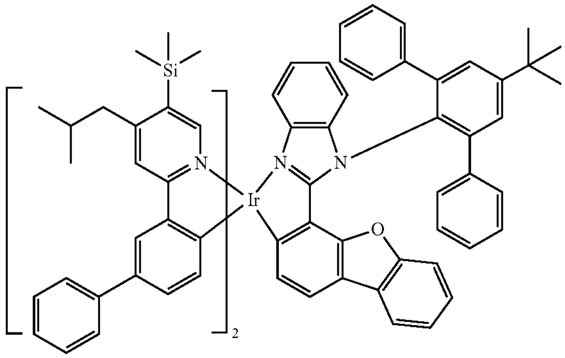
373
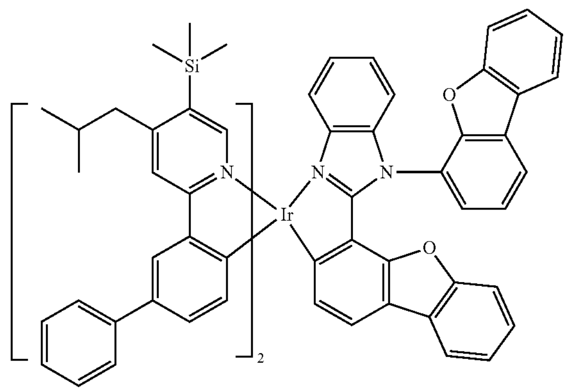
374
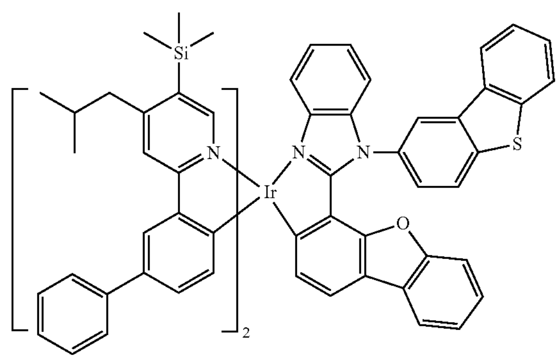
375
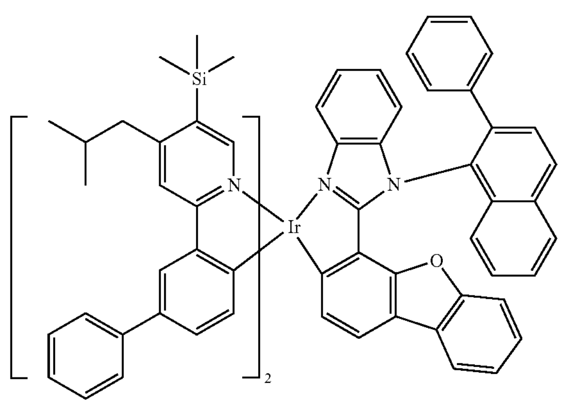
376
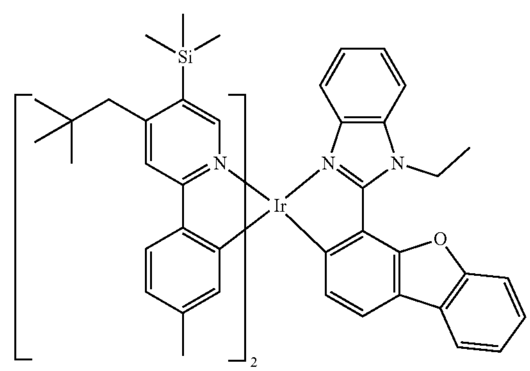

-continued
377
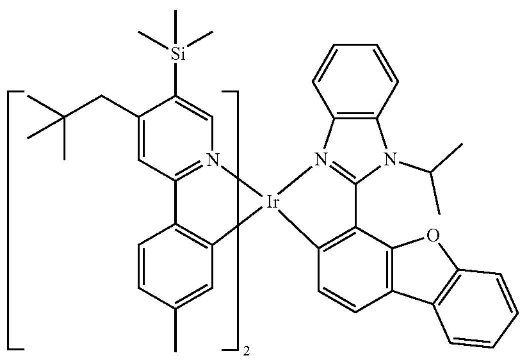
378
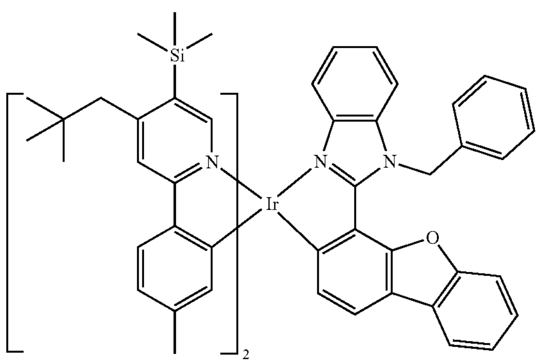
379
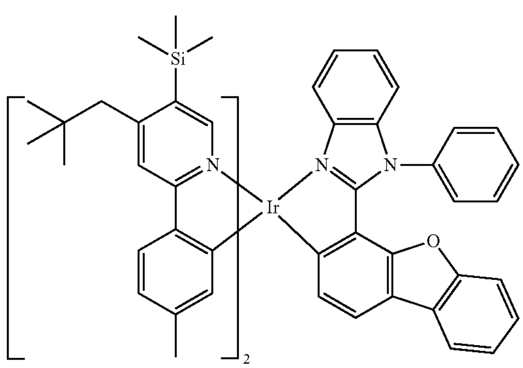
380
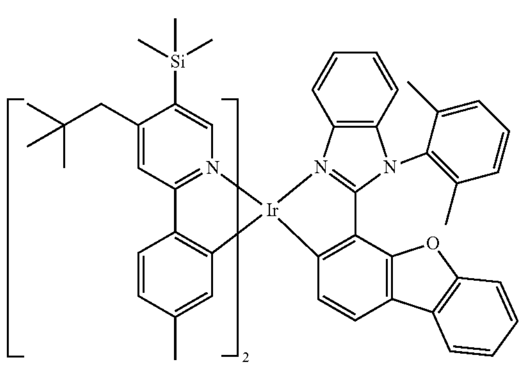
-continued
381
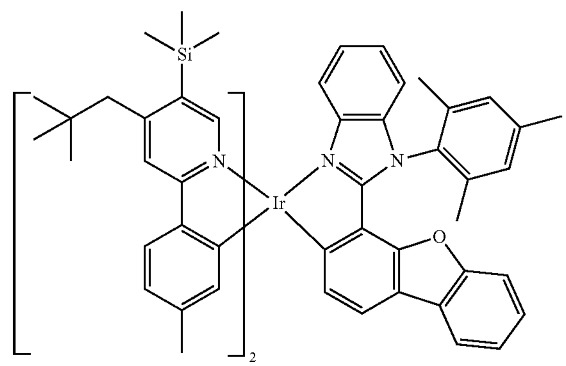
382
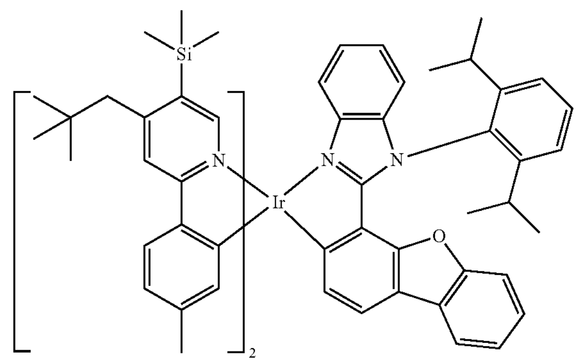
383
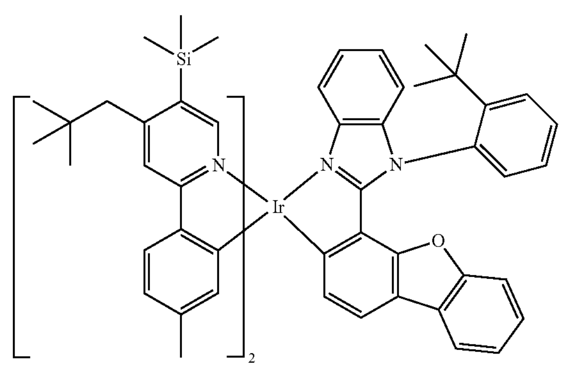
384
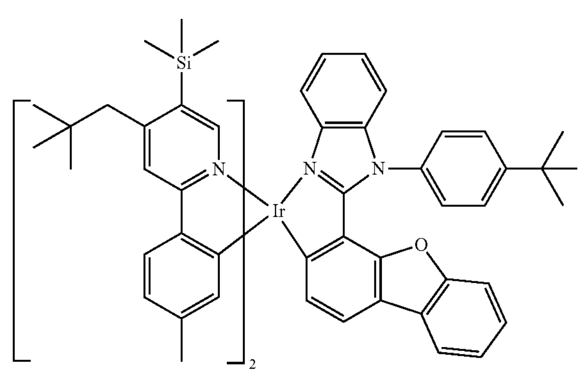

-continued
385
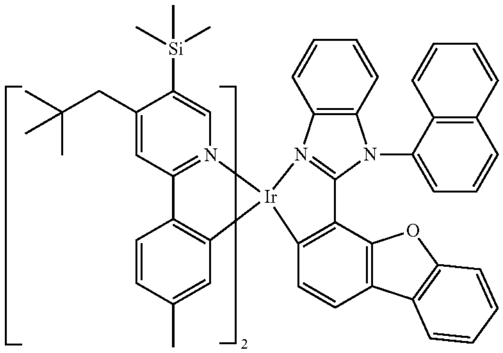
386
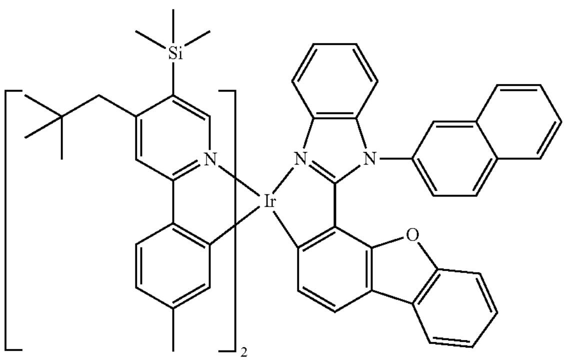
387
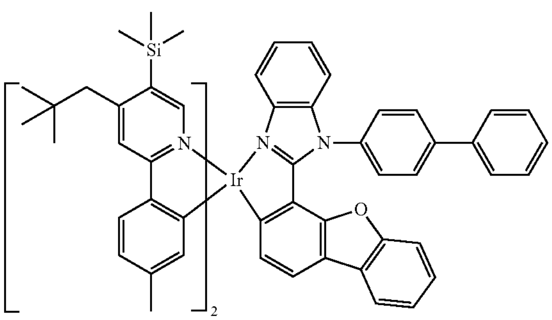
388
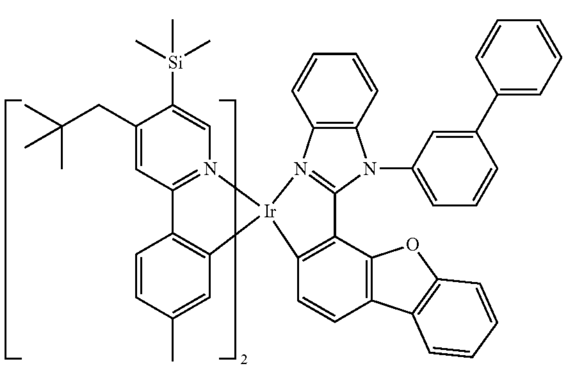
-continued
389
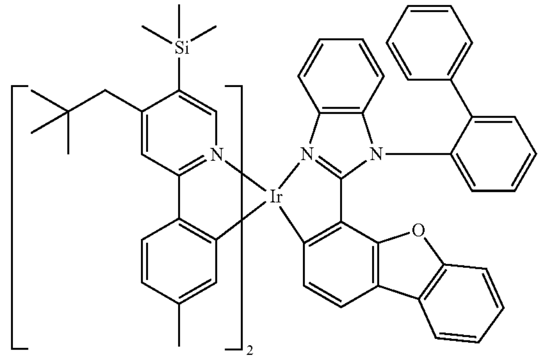
390
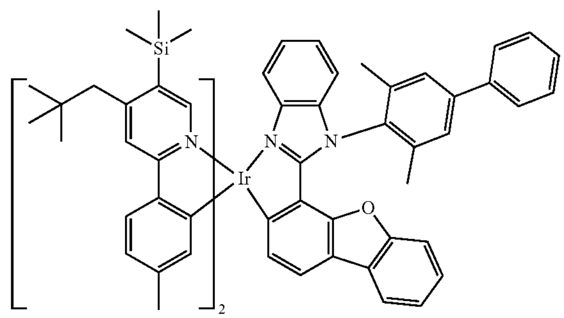
391
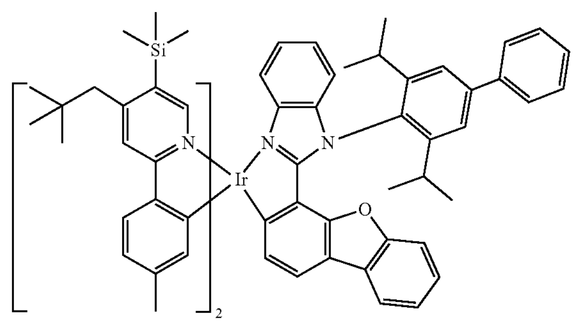
392
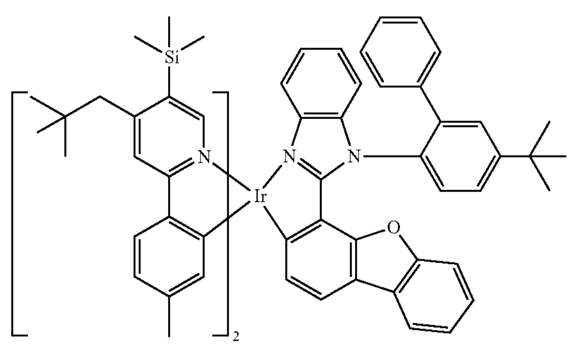

393
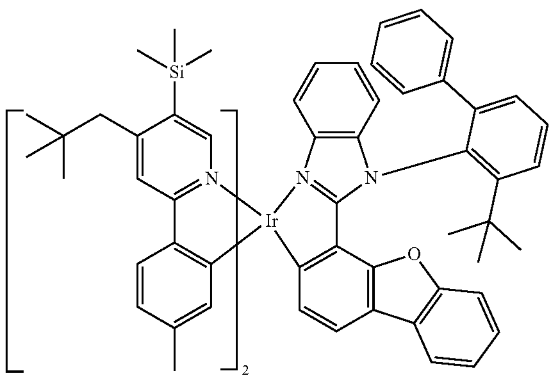
394
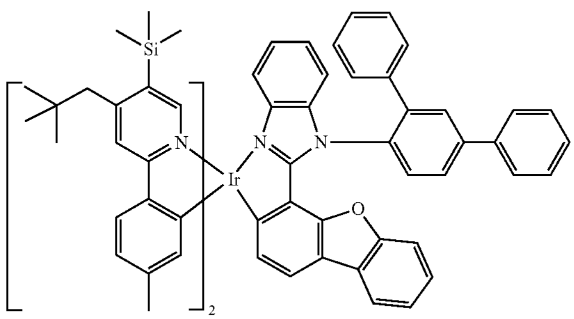
395
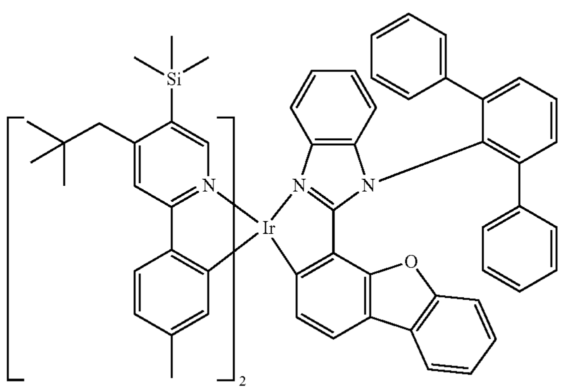
396
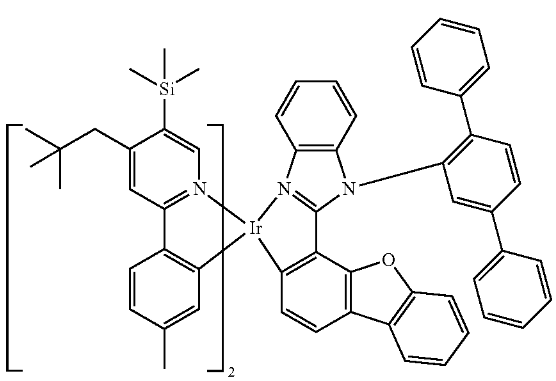
397
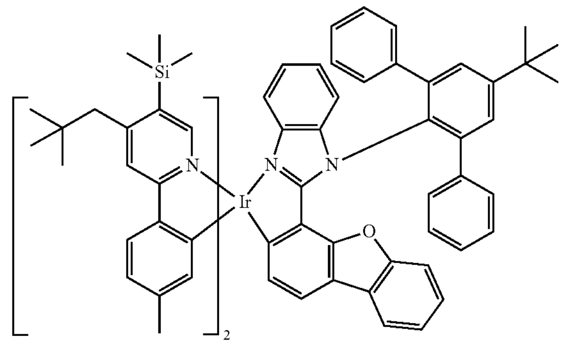
398
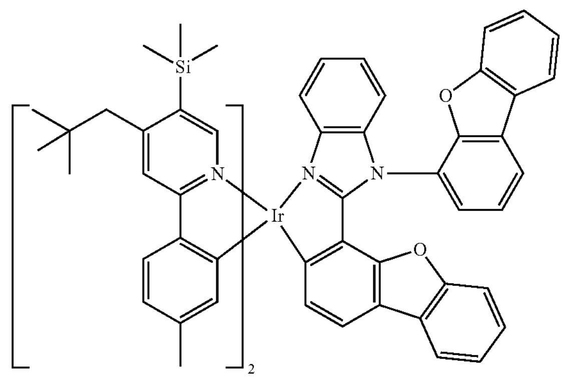
399
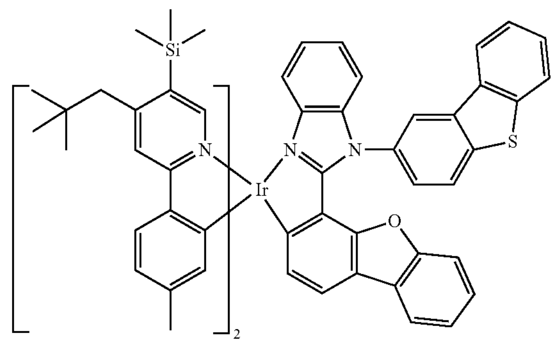
400
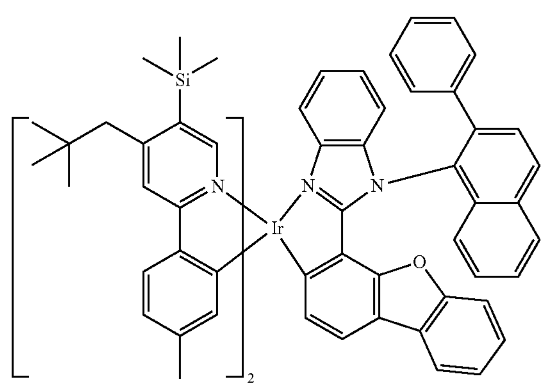

401
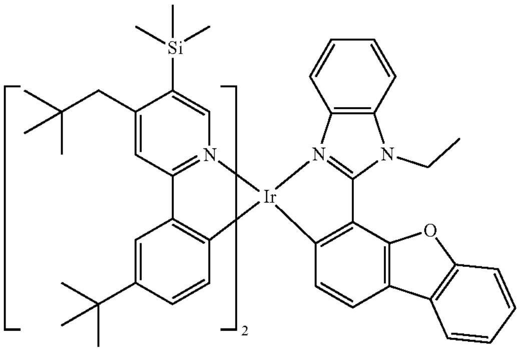
402
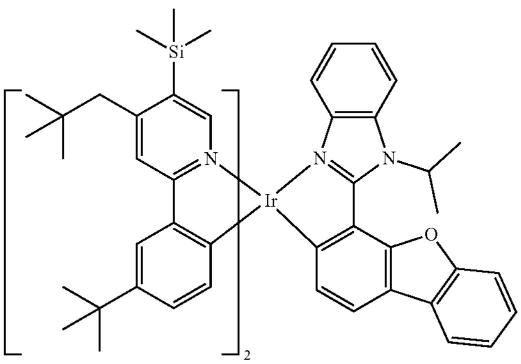
403
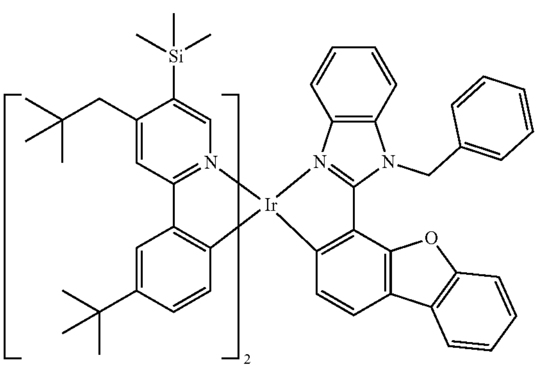
404
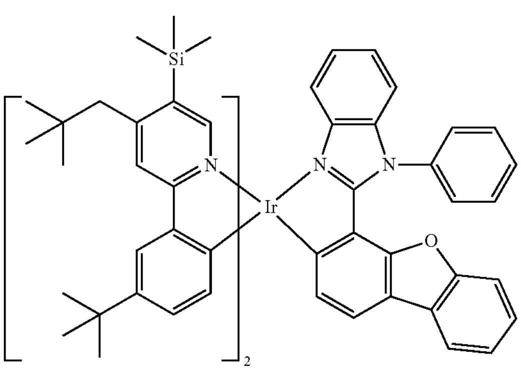
405
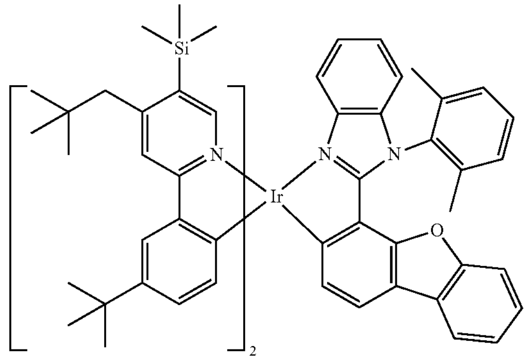
406
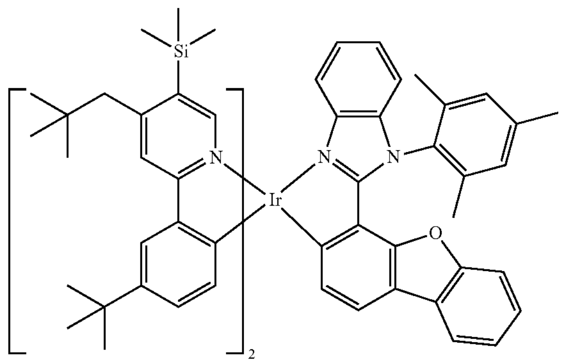
407
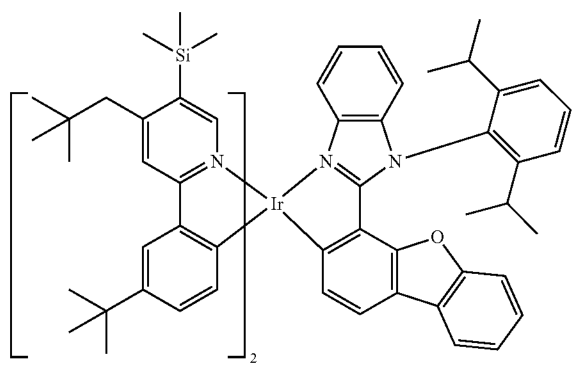
408
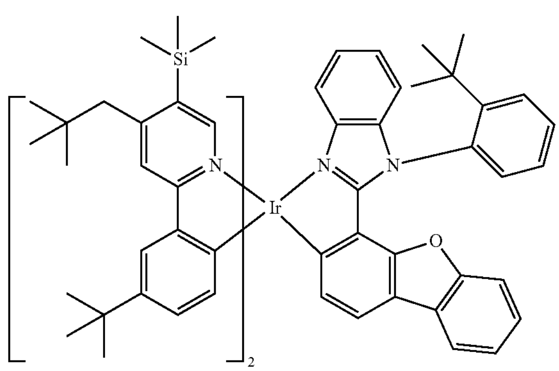

409
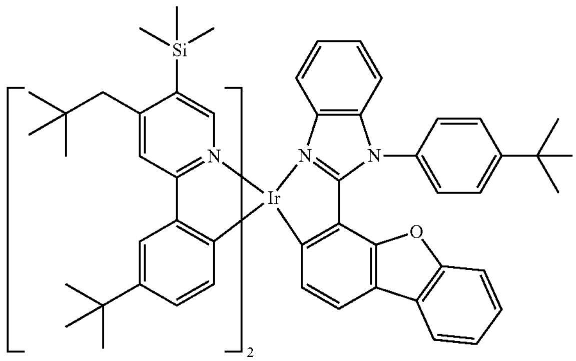
410
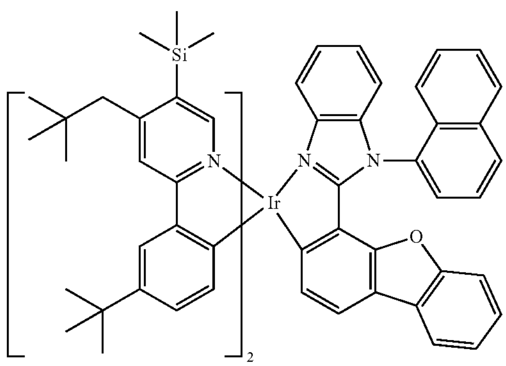
411
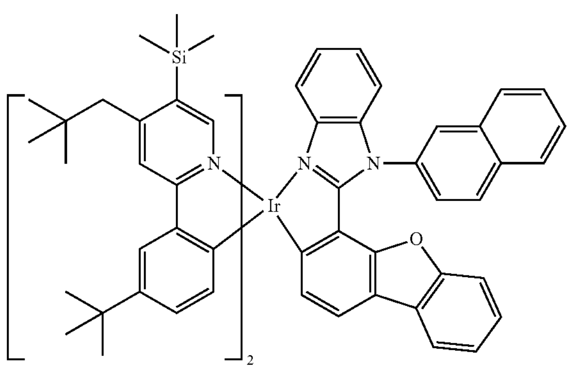
412
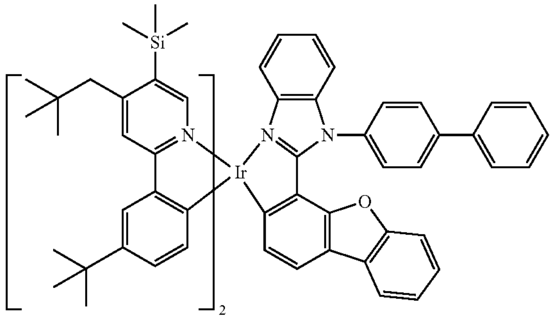
413
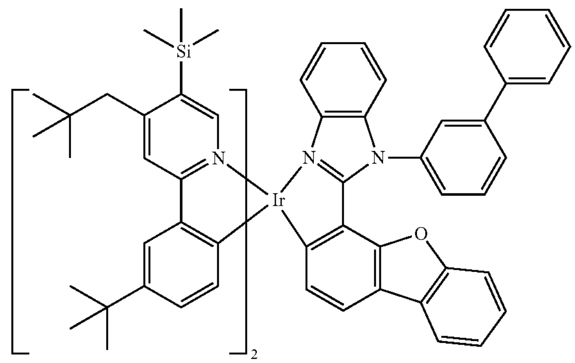
414
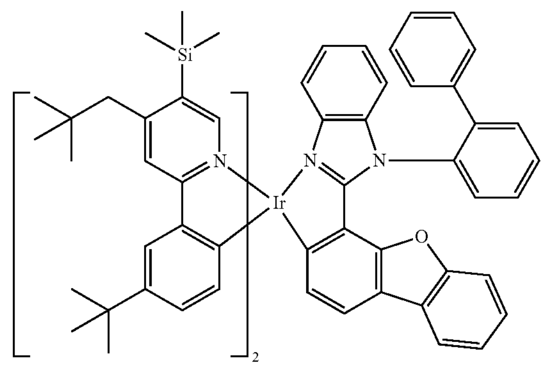
415
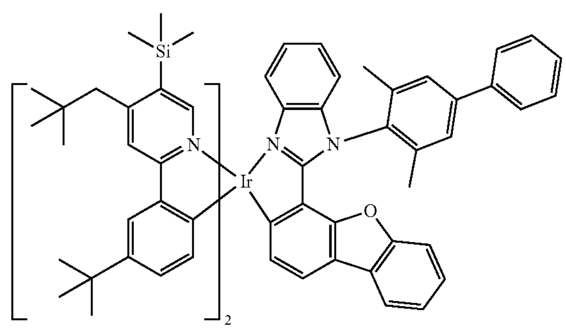
416
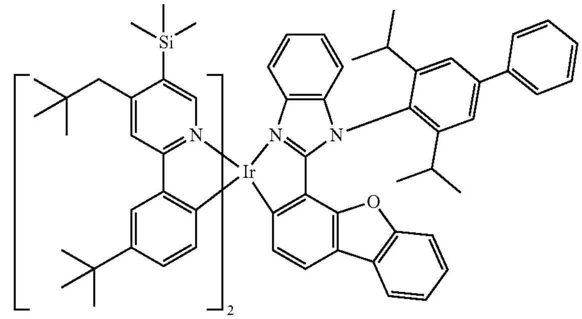

-continued
417
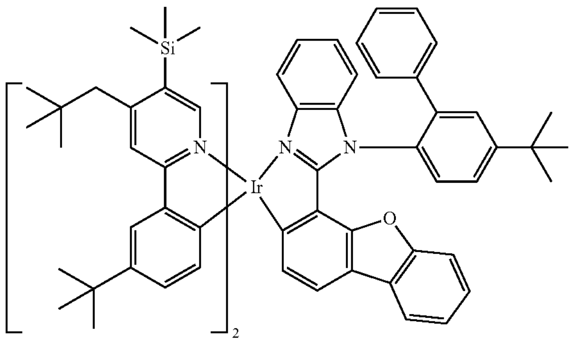
418
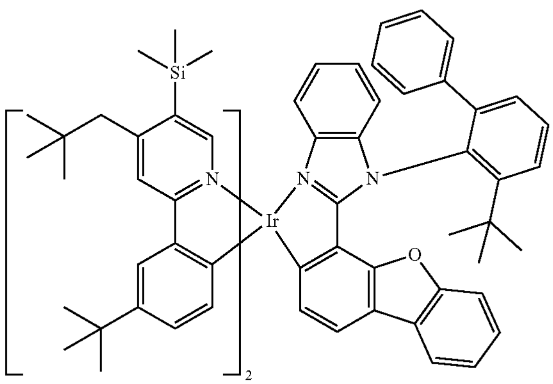
419
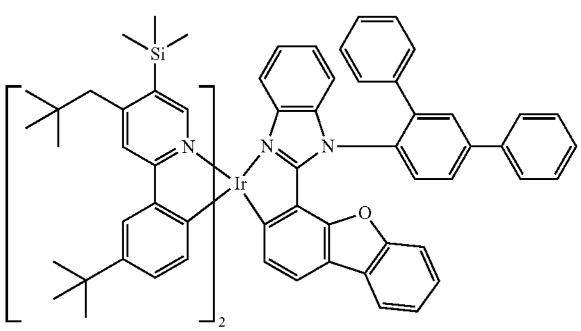
420
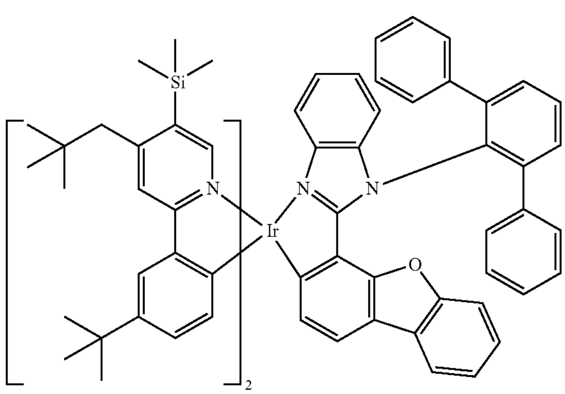
-continued
421
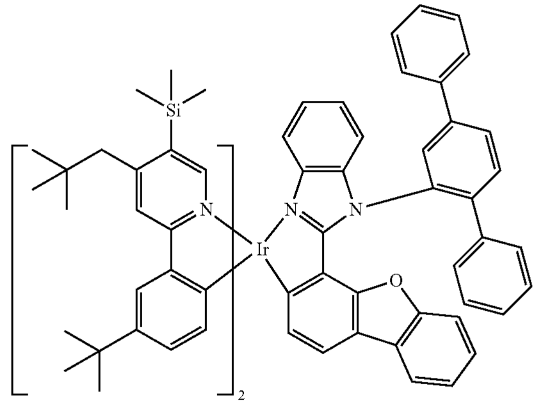
422
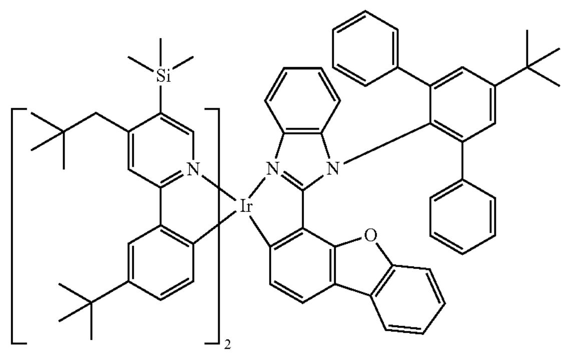
423
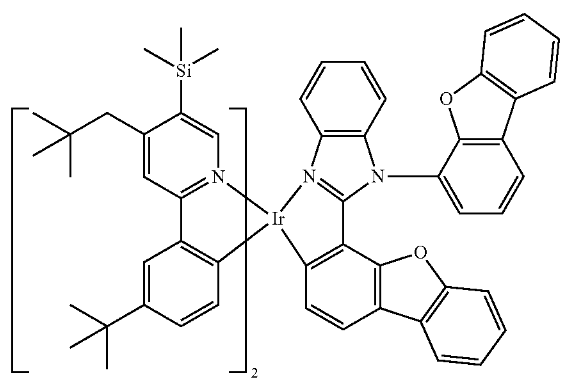
424
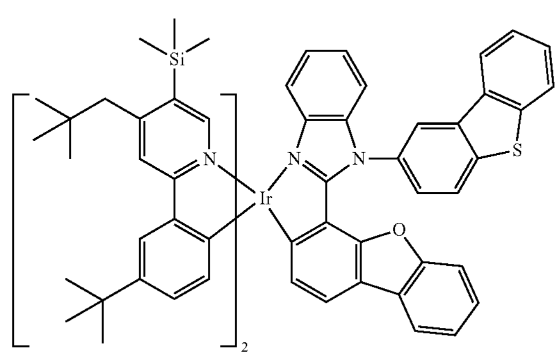

-continued
425
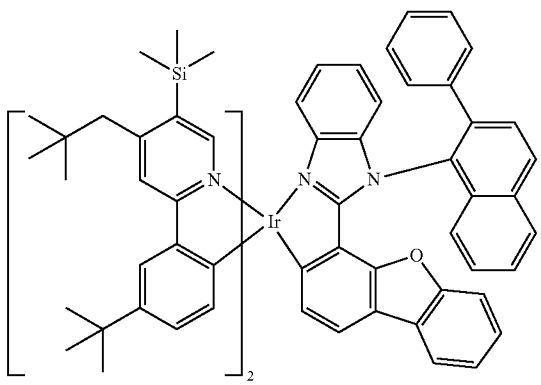
426
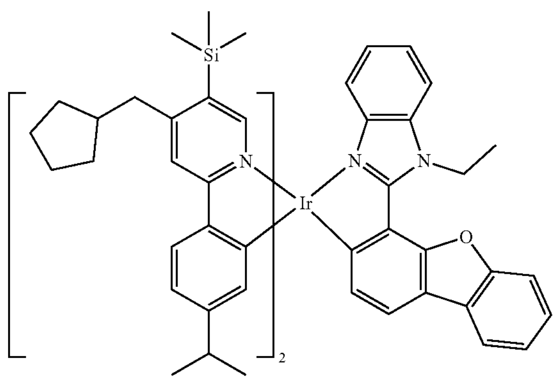
427
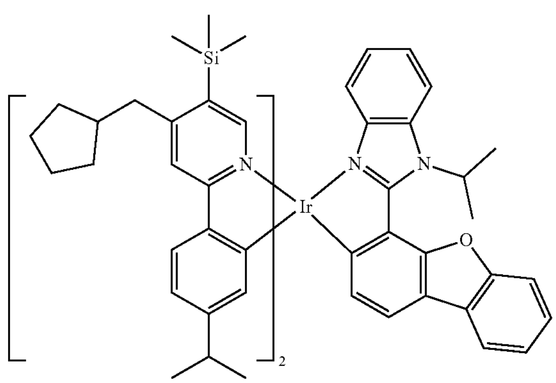
428
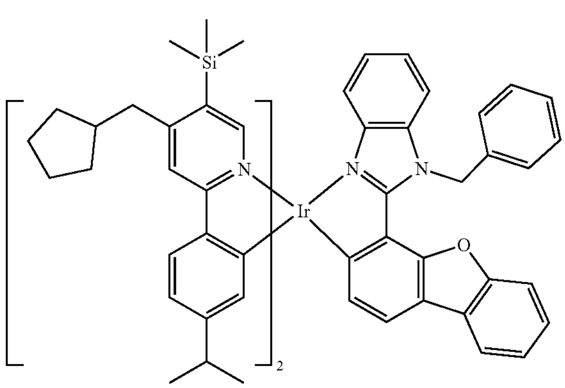
-continued
429
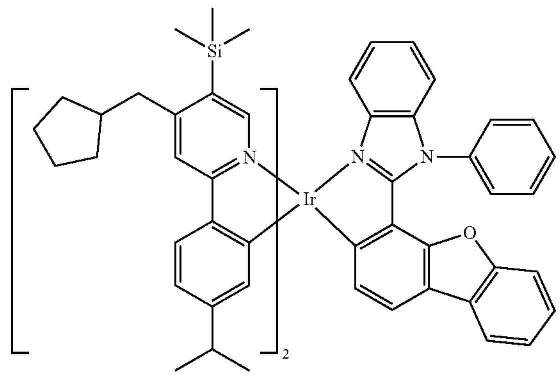
430
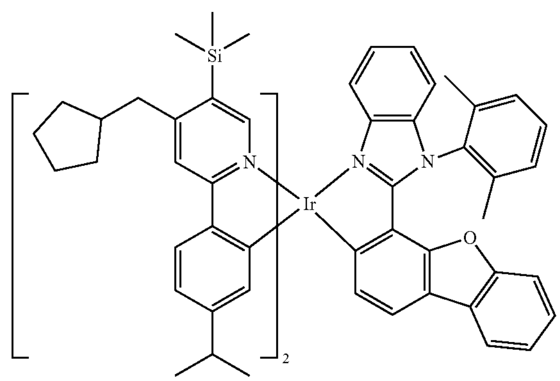
431
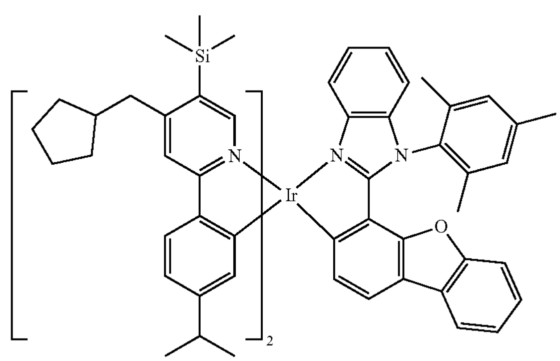
432
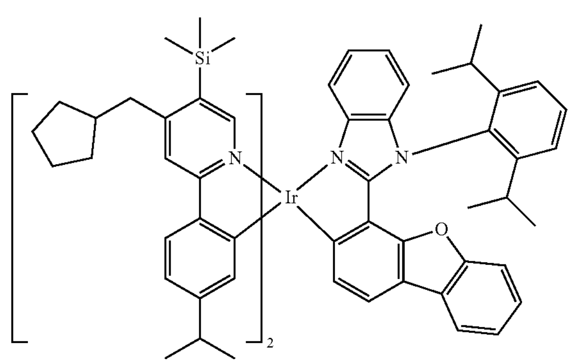

-continued
433
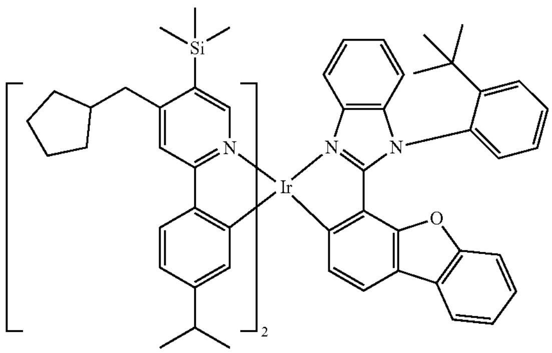
434
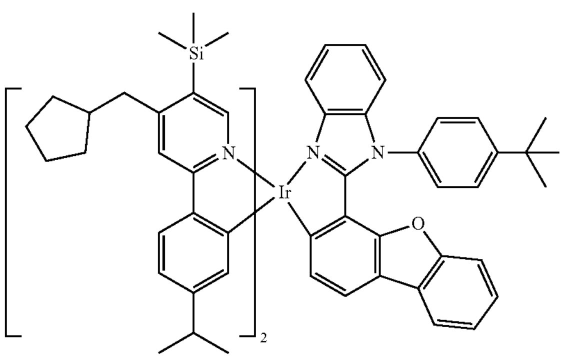
435
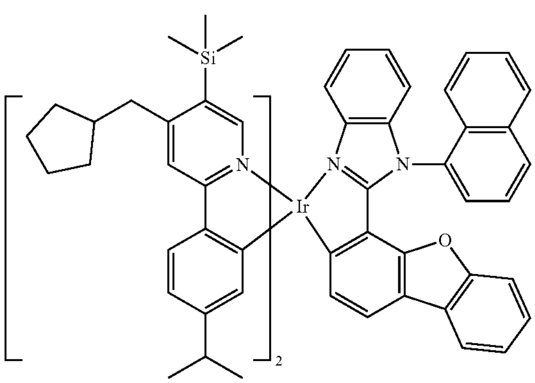
436
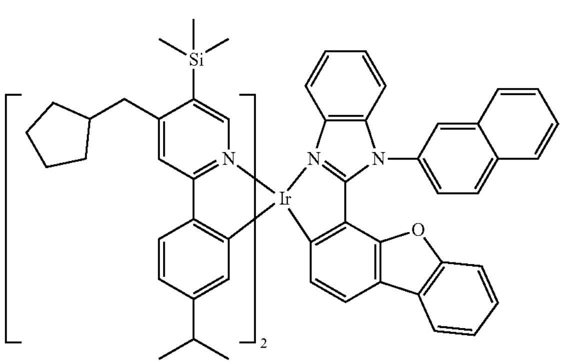
-continued
437
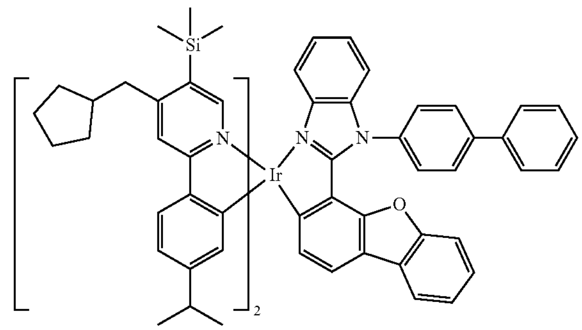
438
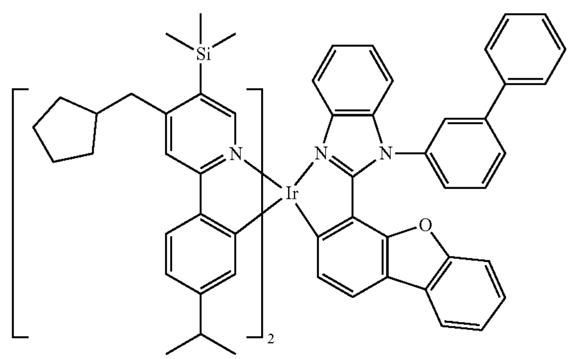
439
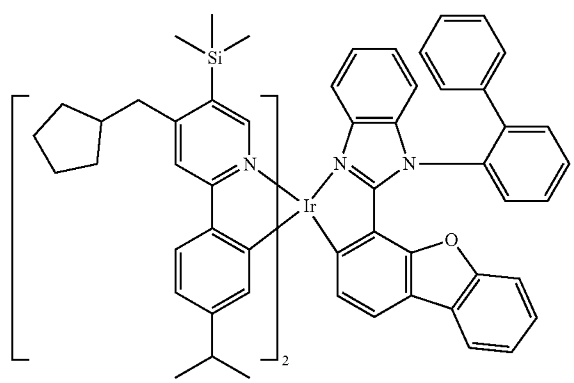
440
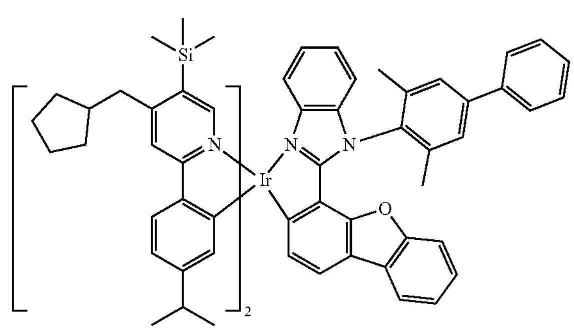

-continued
441
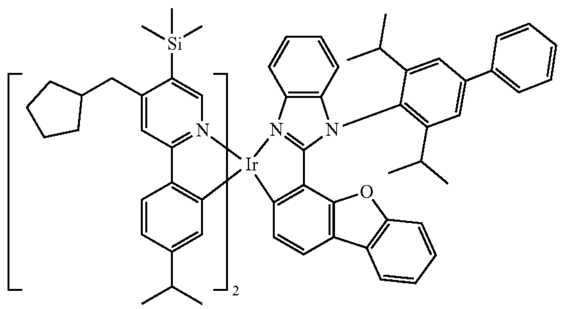
442
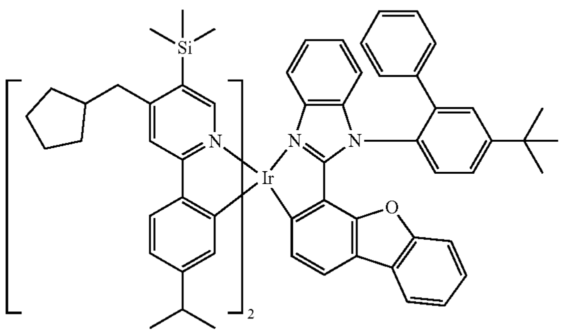
443
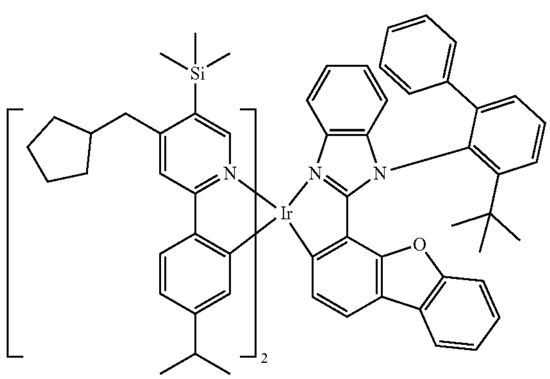
444
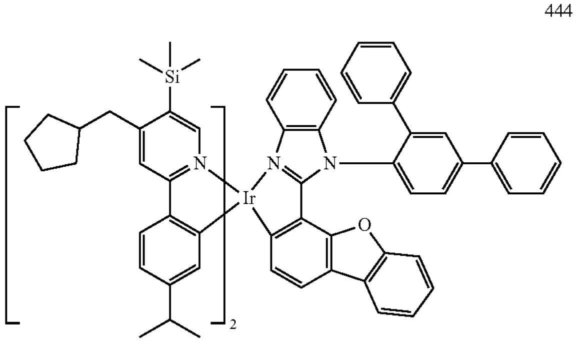
-continued
445
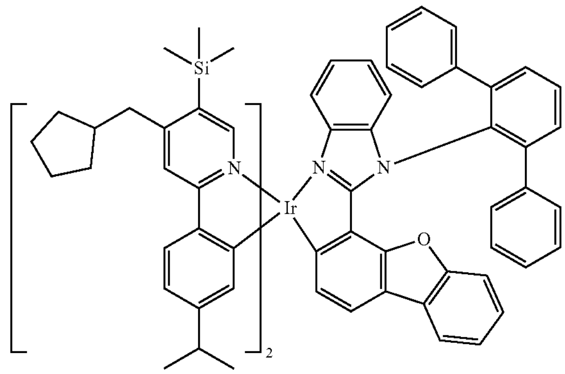
446
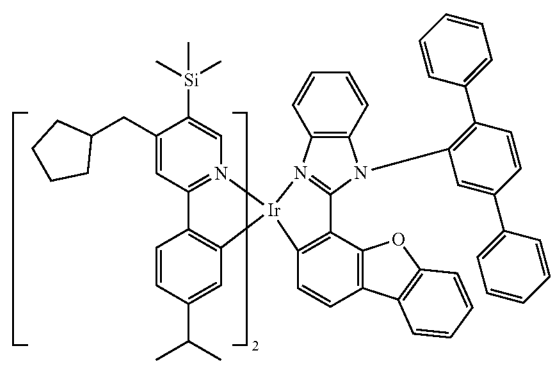
447
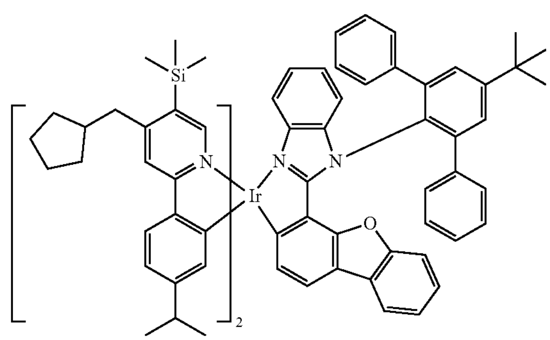
448
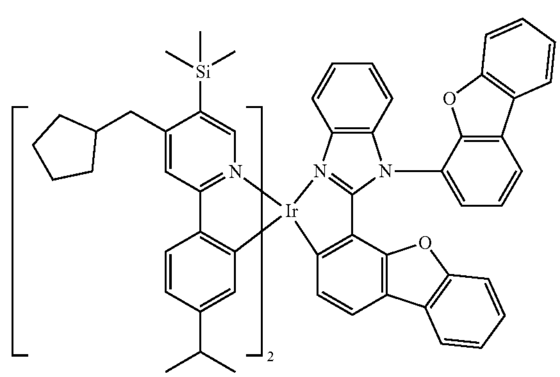

449
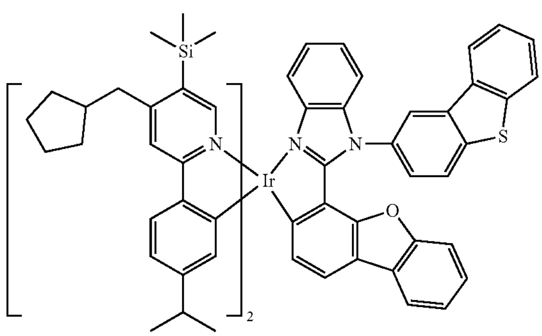
450
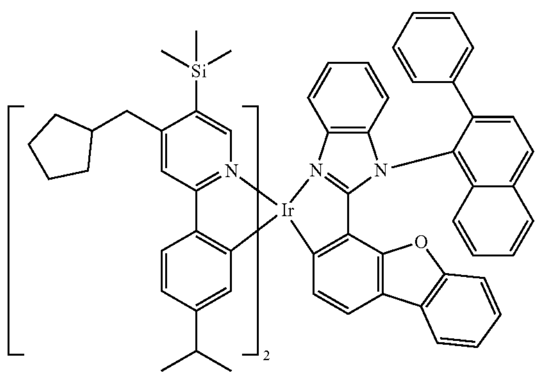
451
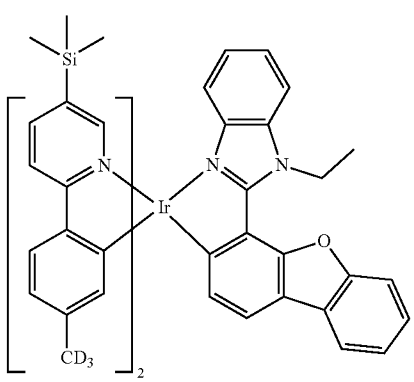
452
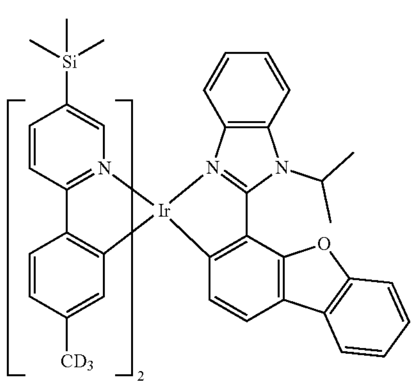
453
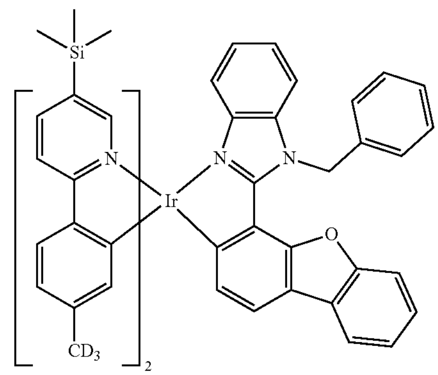
454
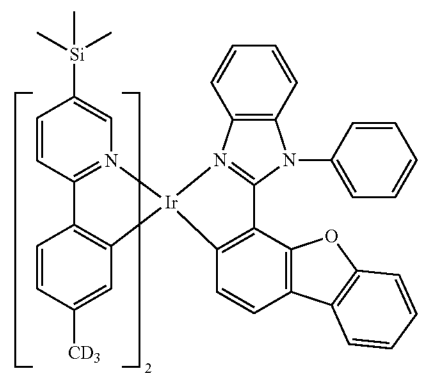
455
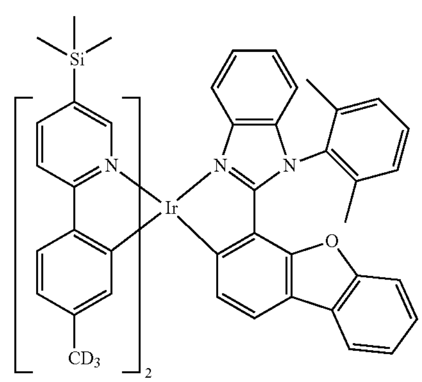
456
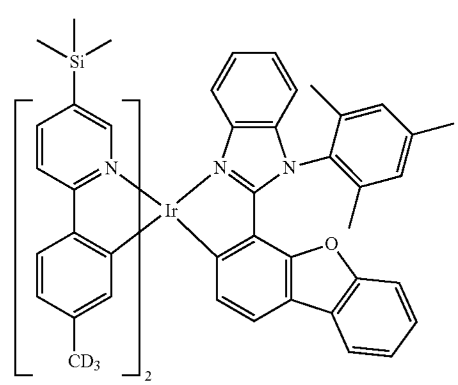

-continued
457
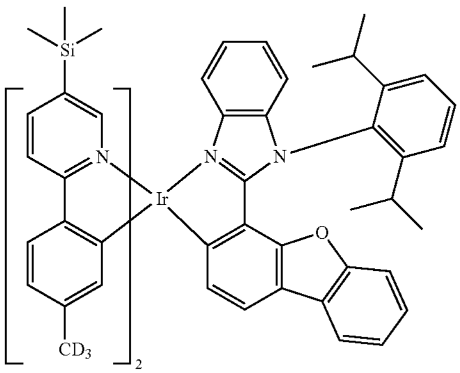
458
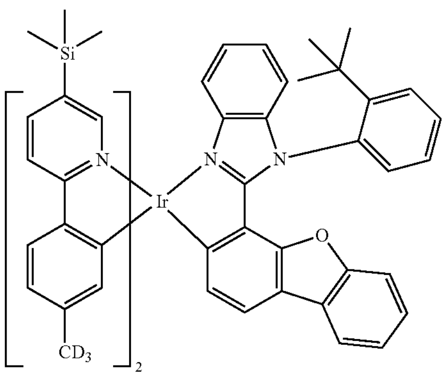
459
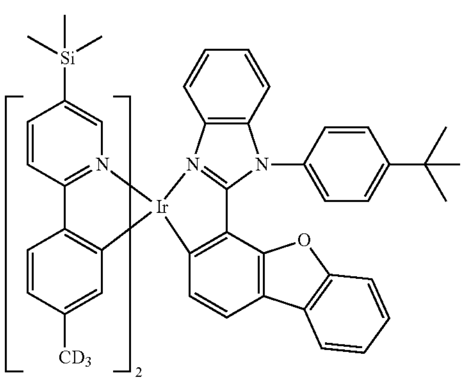
460
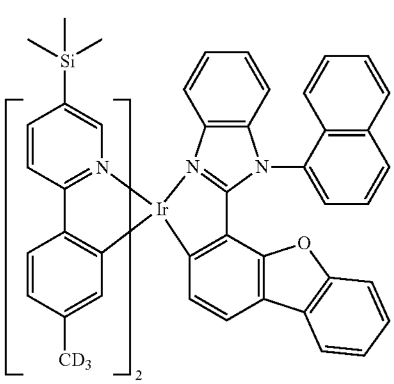
-continued
461
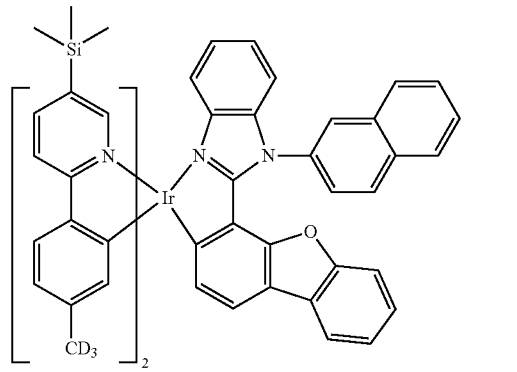
462
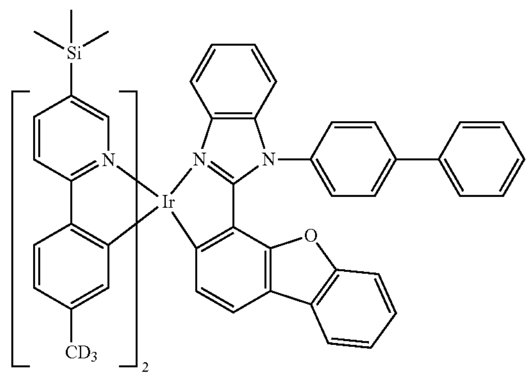
463
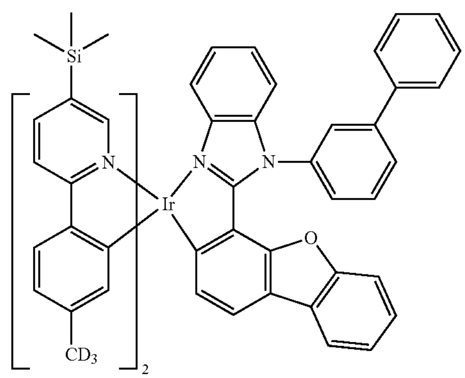
464
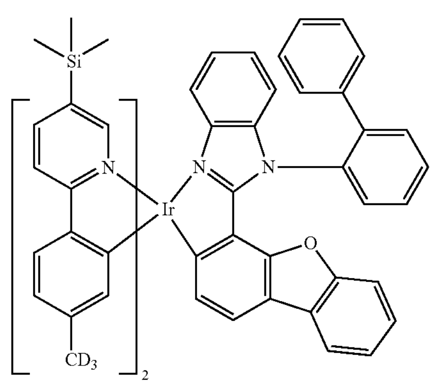

-continued
465
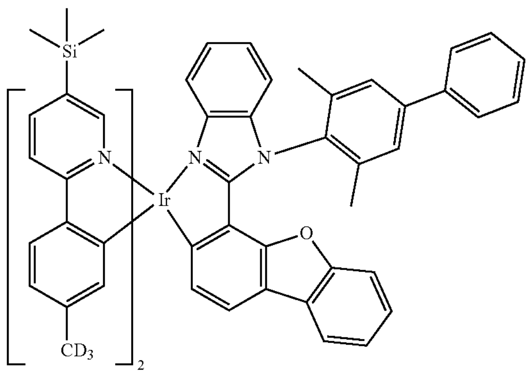
466
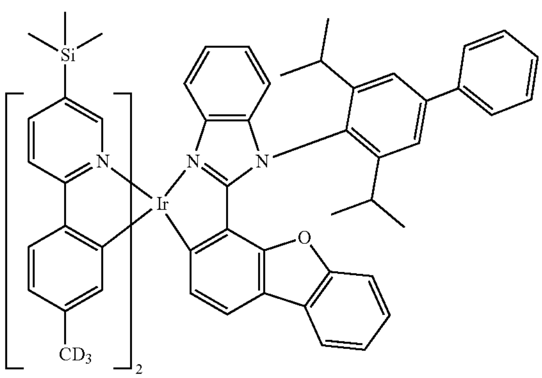
467
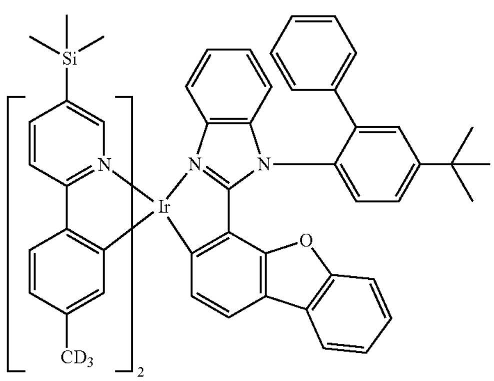
468
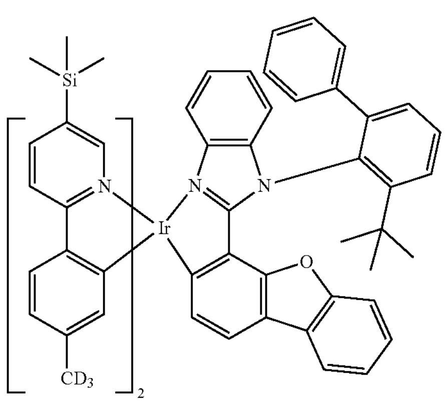
-continued
469
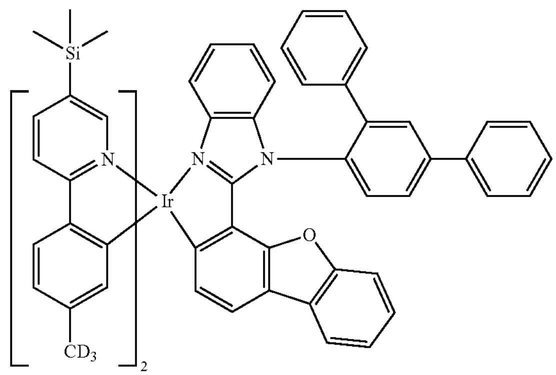
470
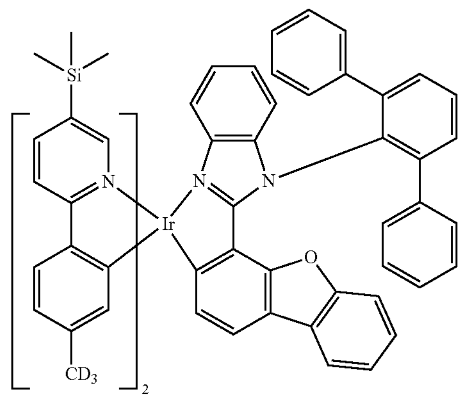
471
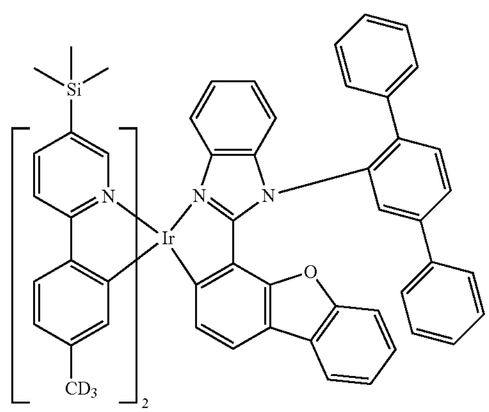
472
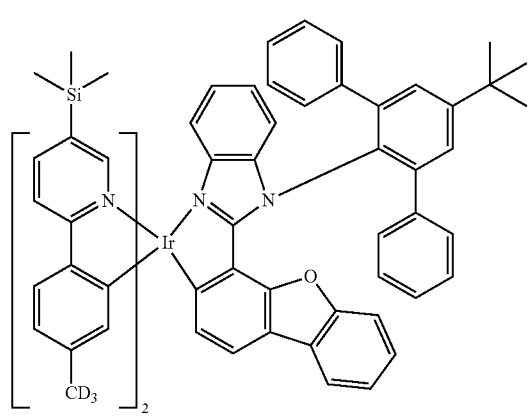

-continued
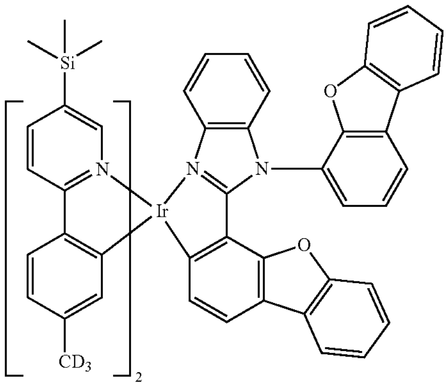
473
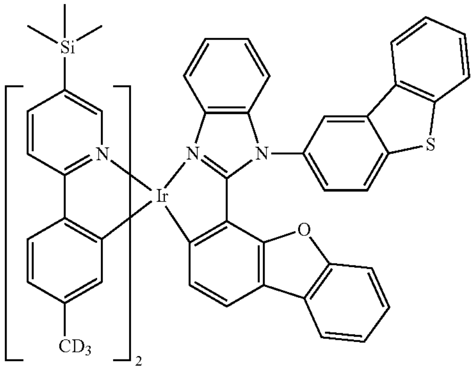
474
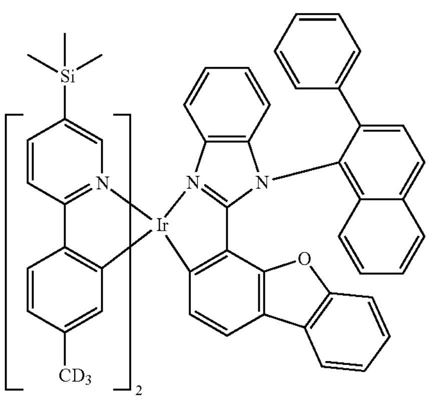
475
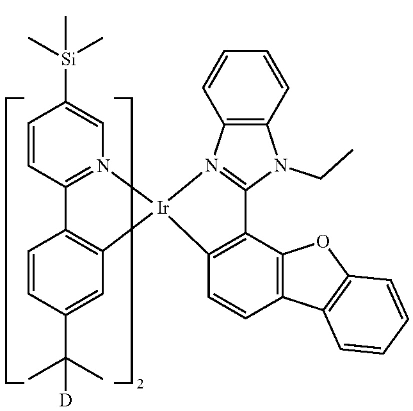
476
-continued
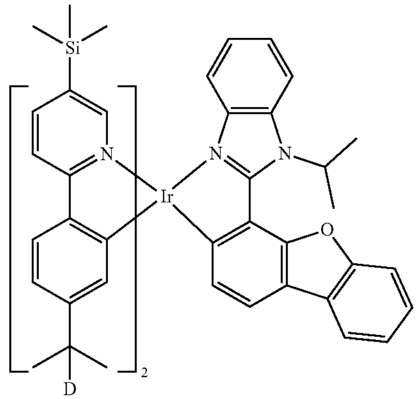
477
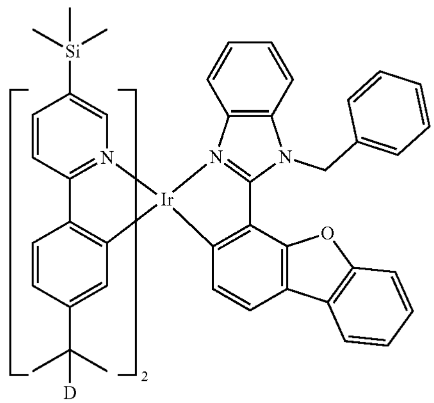
478
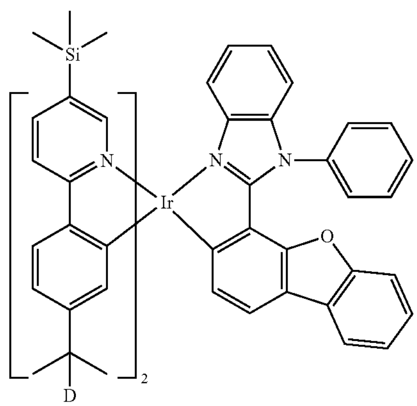
479
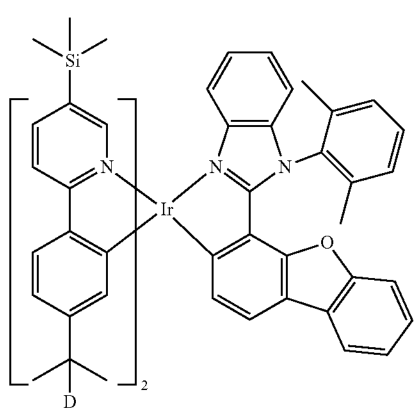
480

-continued
481
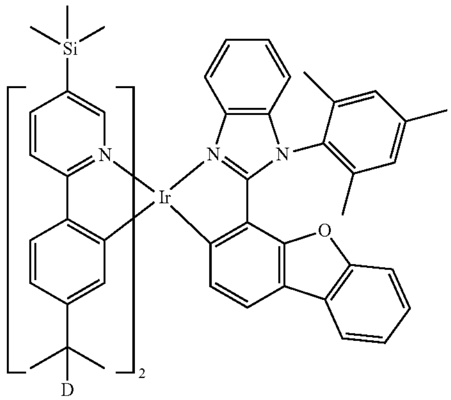
482
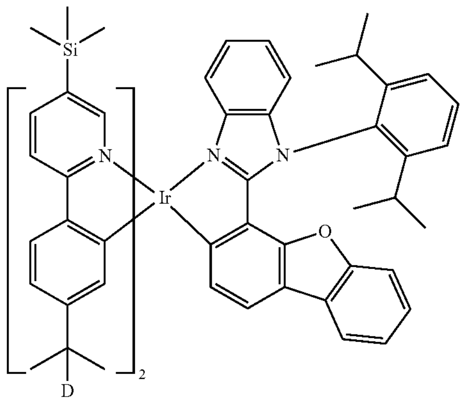
483
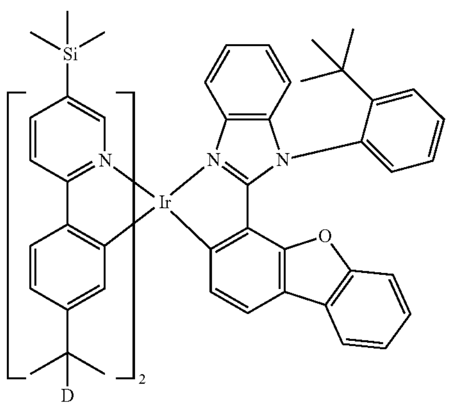
484
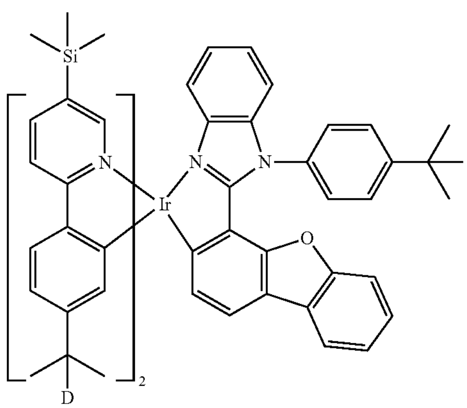
-continued
485
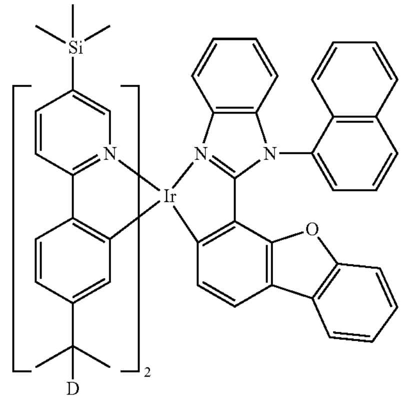
486
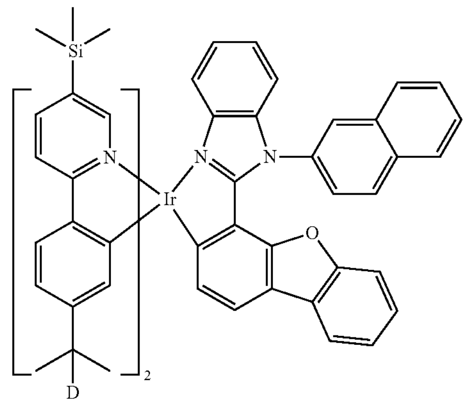
487
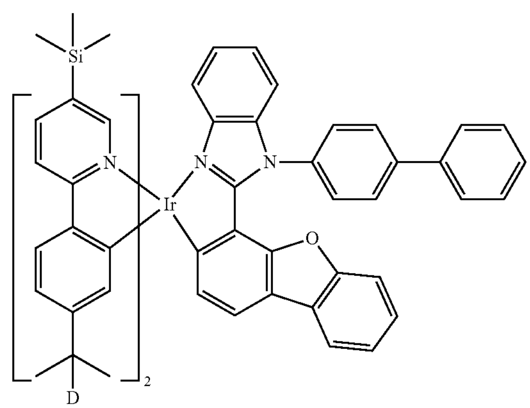
488
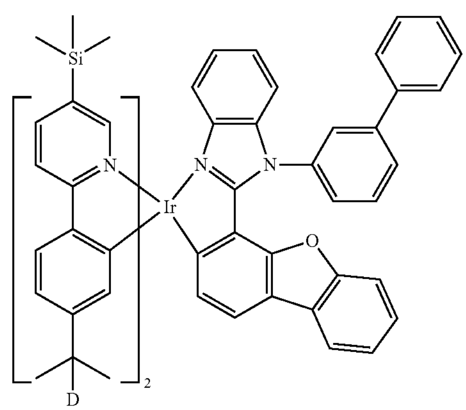

-continued
489
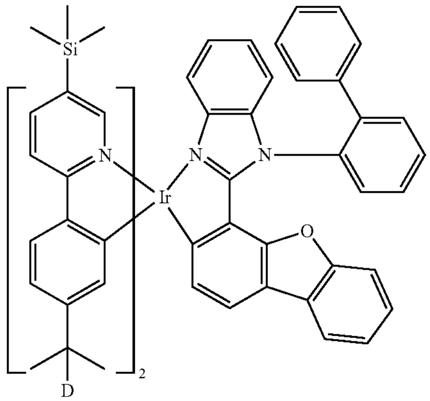
490
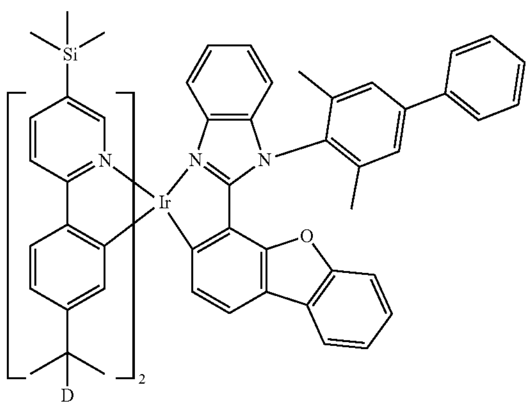
491
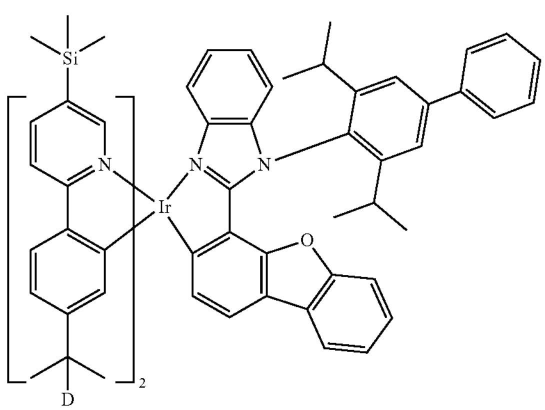
-continued
492
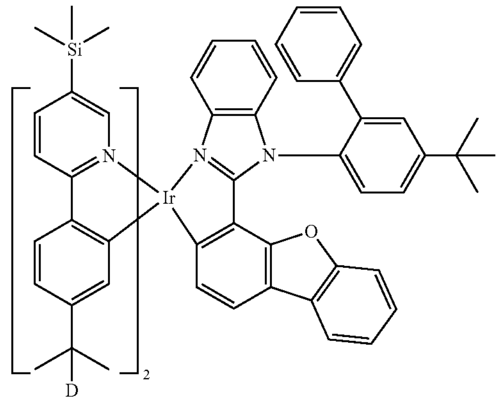
493
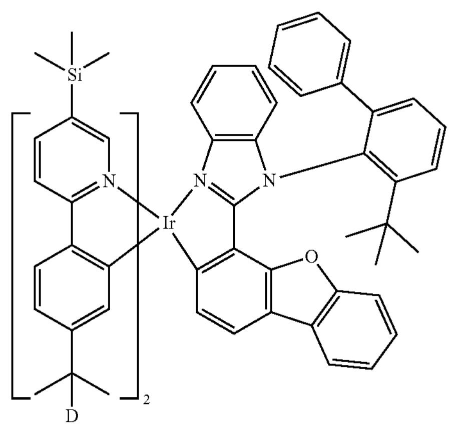
494
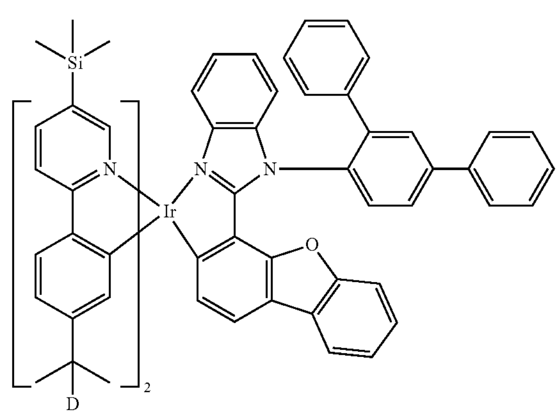

-continued
495
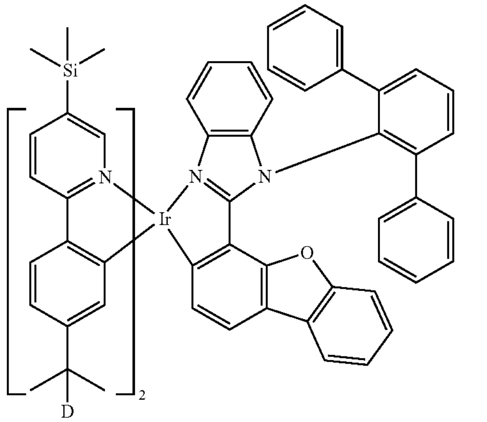
496
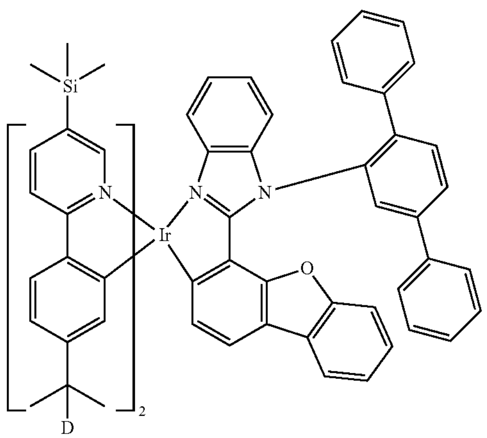
497
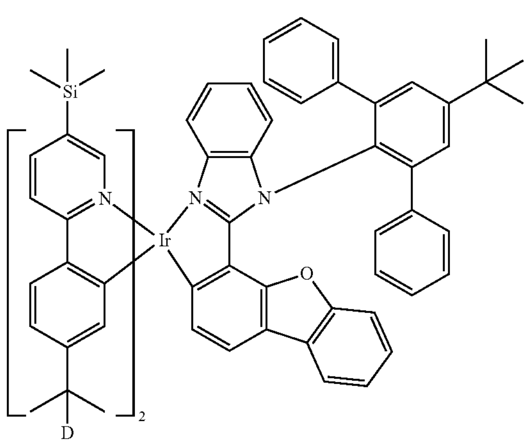
-continued
498
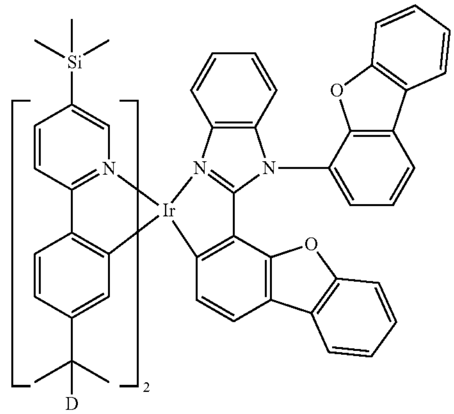
499
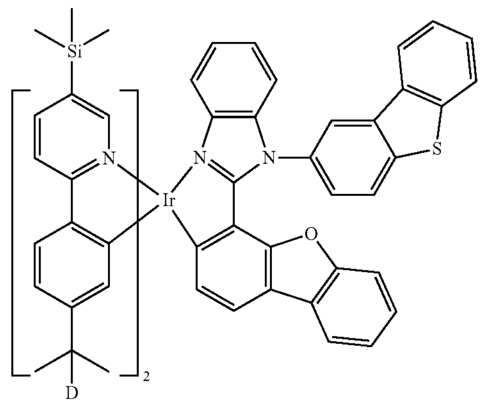
500
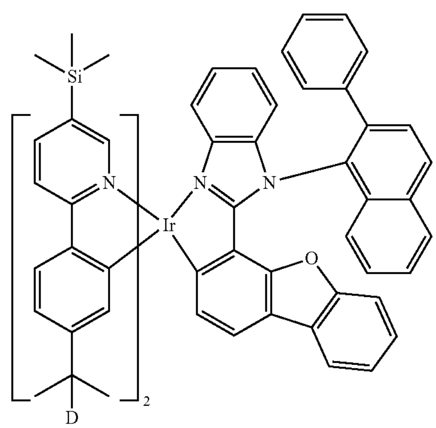
501
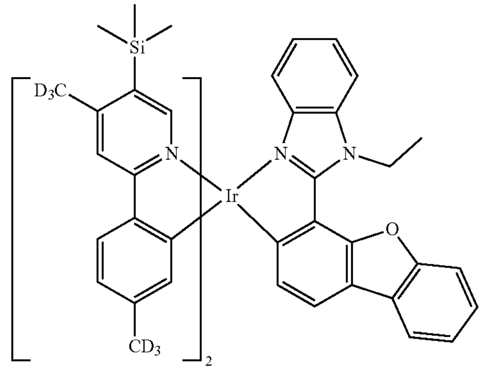

-continued
502
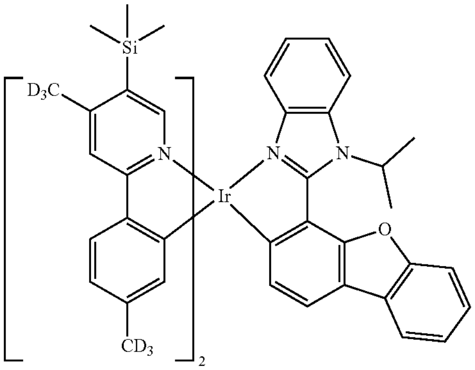
503
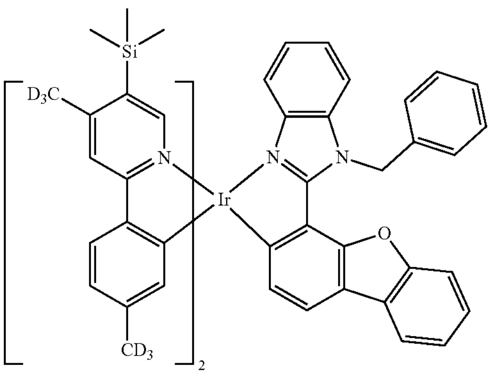
504
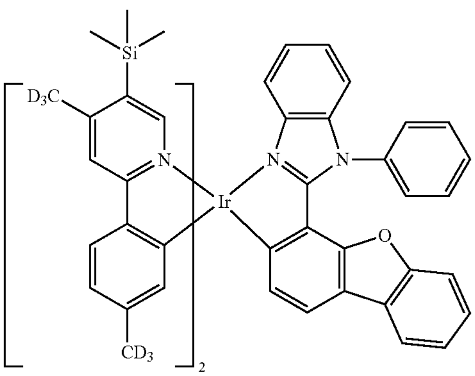
505
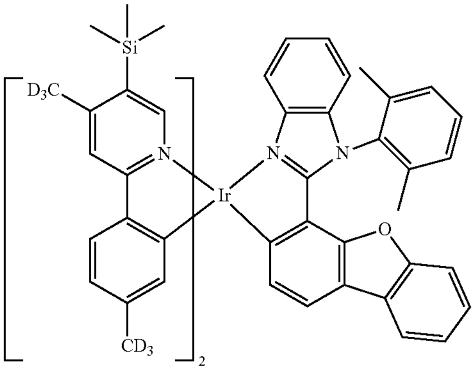
-continued
506
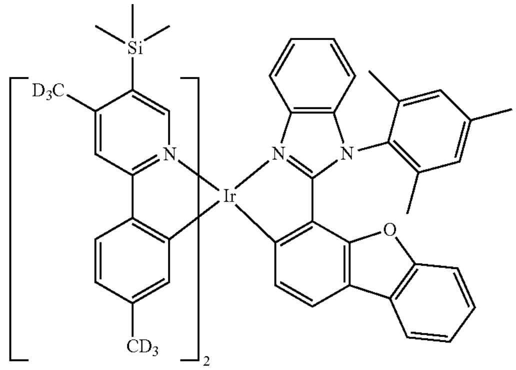
507
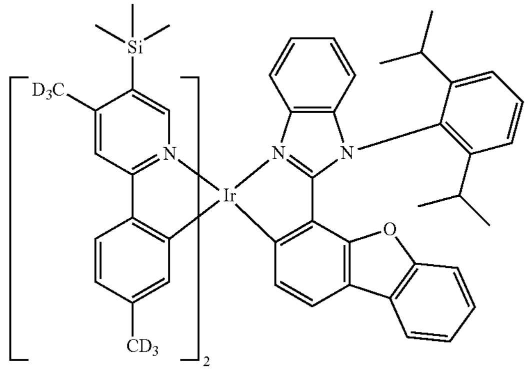
508
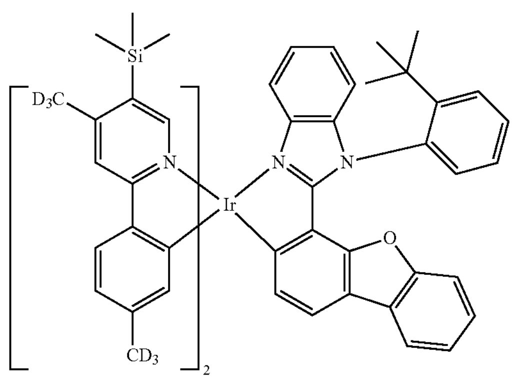
509
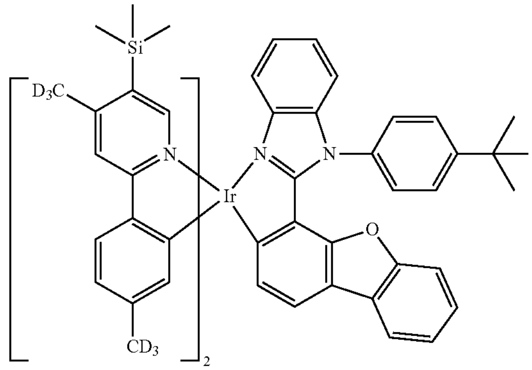

-continued
510
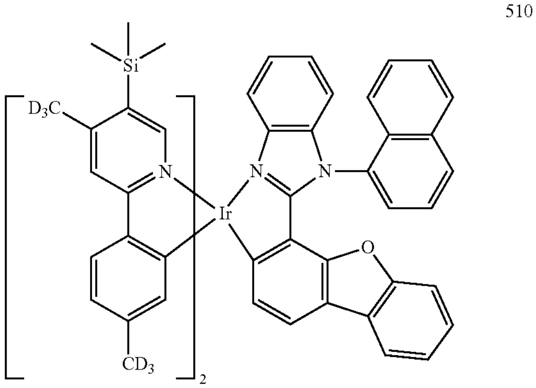
511
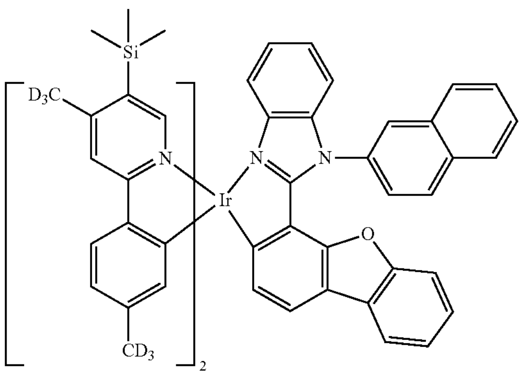
512
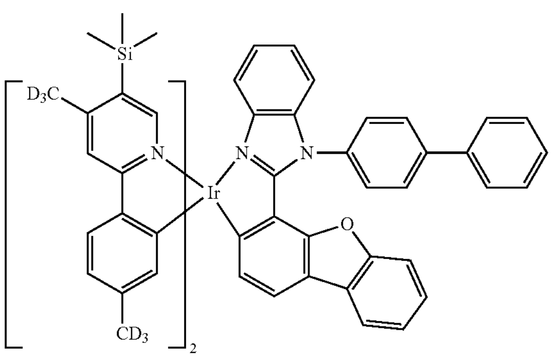
513
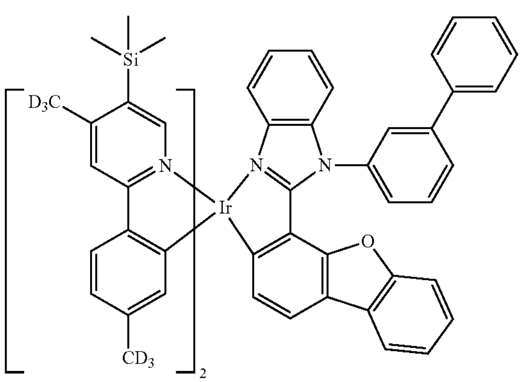
-continued
514
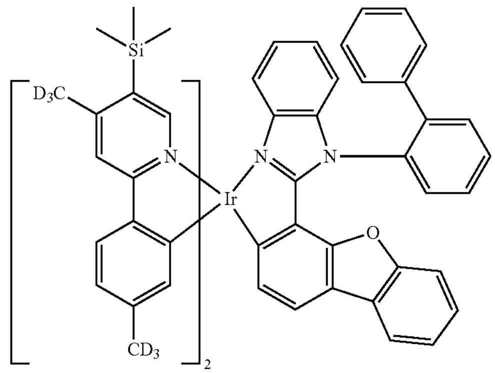
515
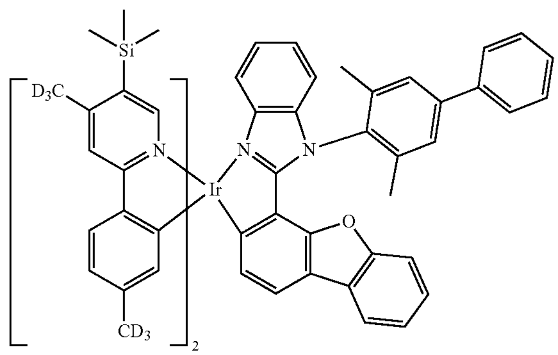
516
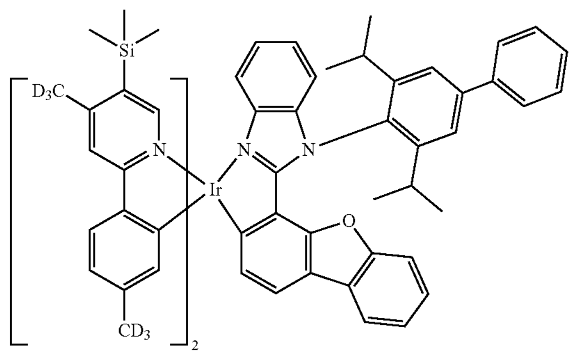
517
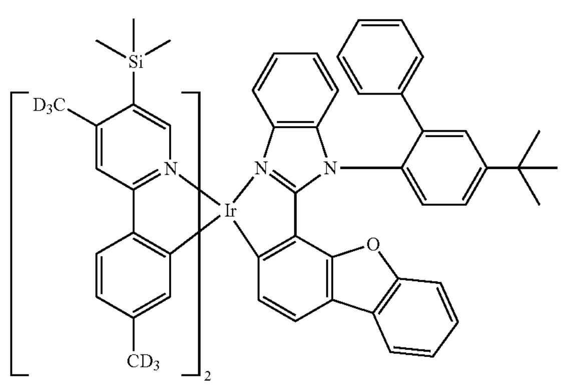

-continued
518
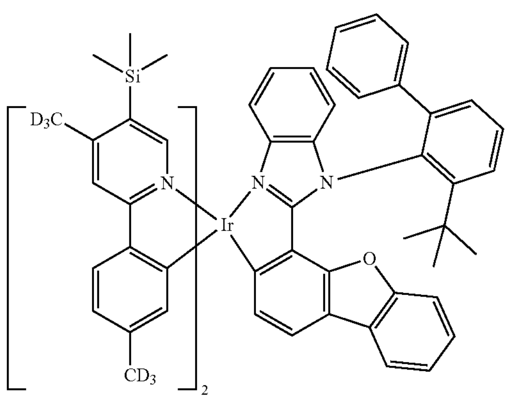
519
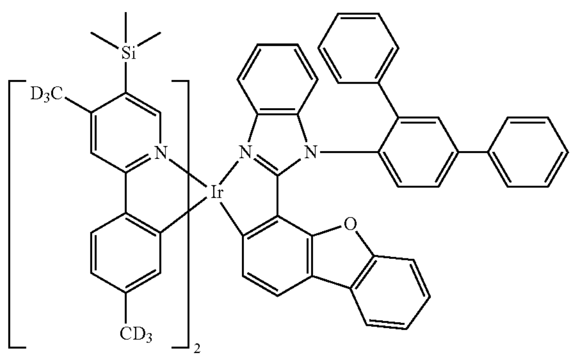
520
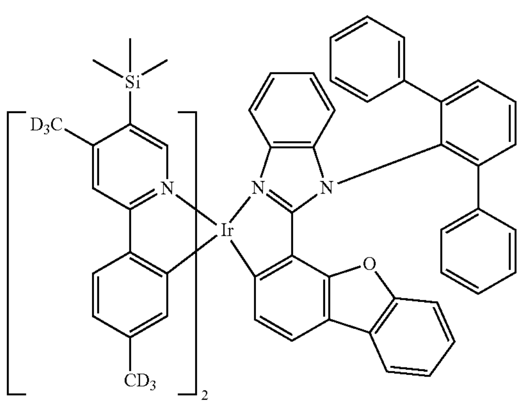
521
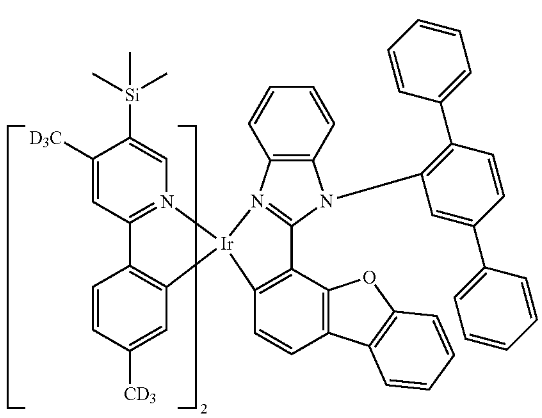
-continued
522
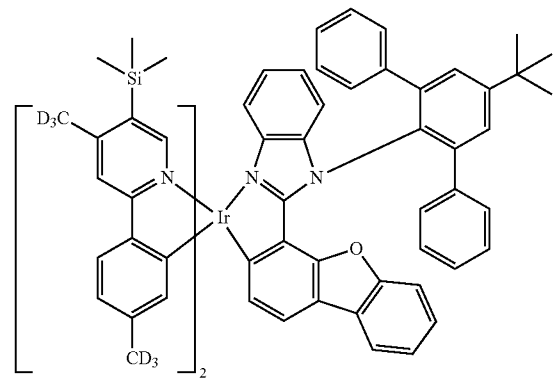
523
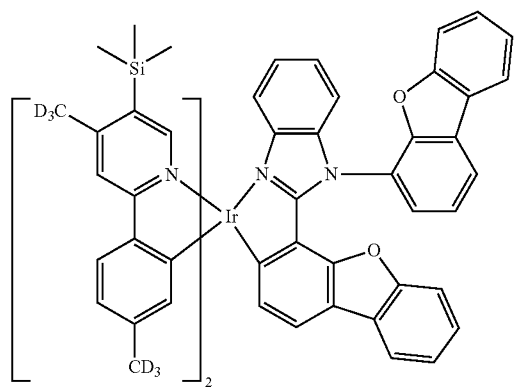
524
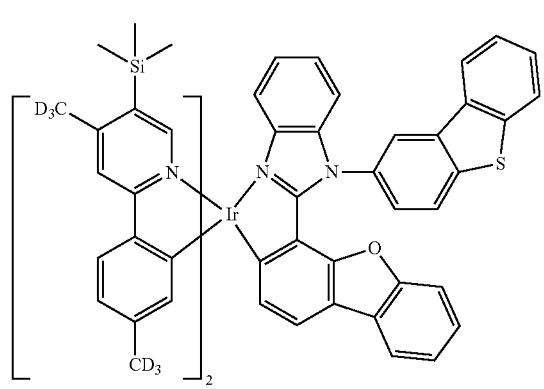
525
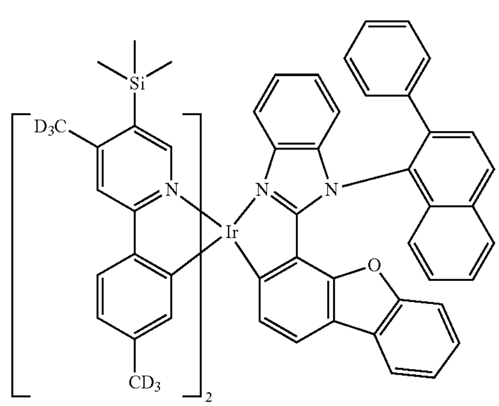

-continued
526
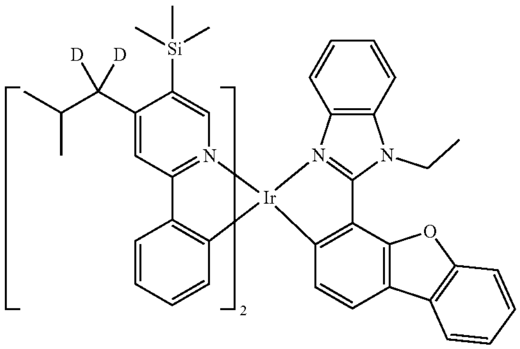
527
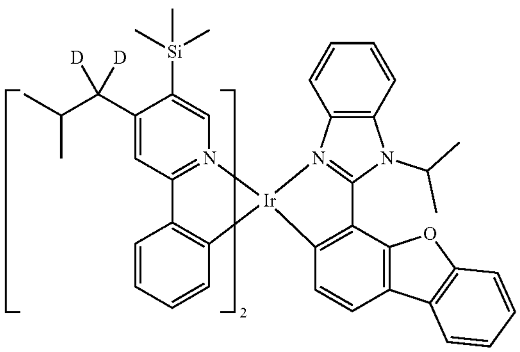
528
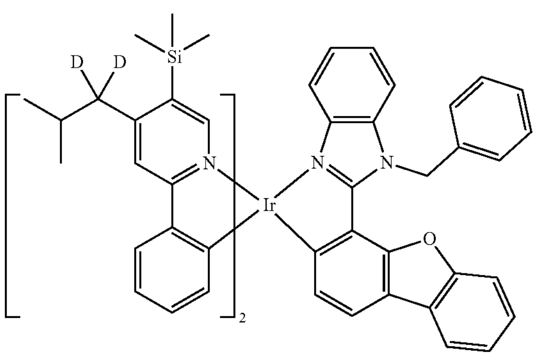
529
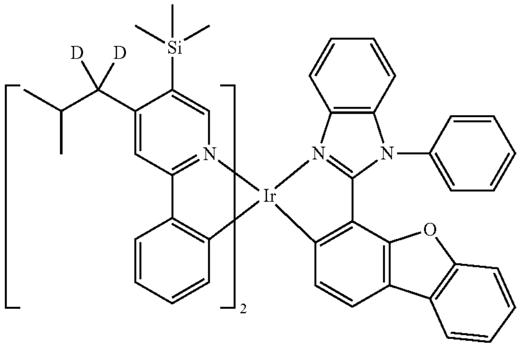
-continued
530
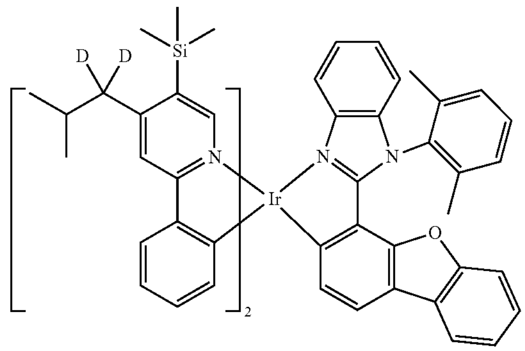
531
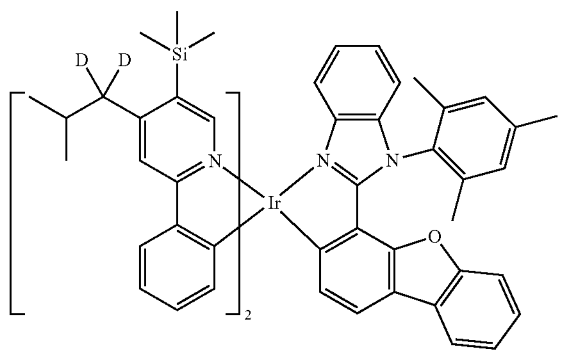
532
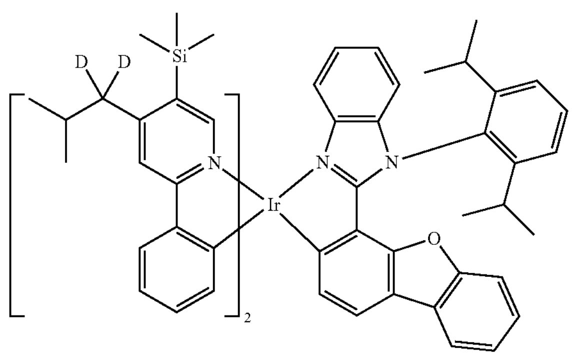
533
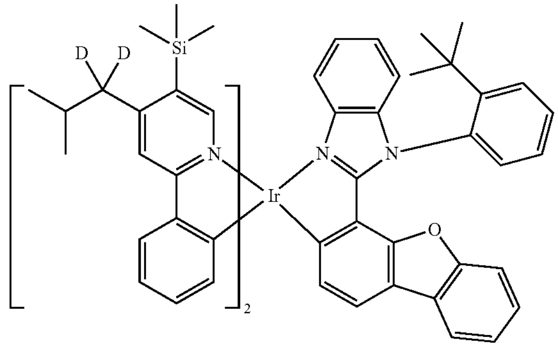

-continued
534
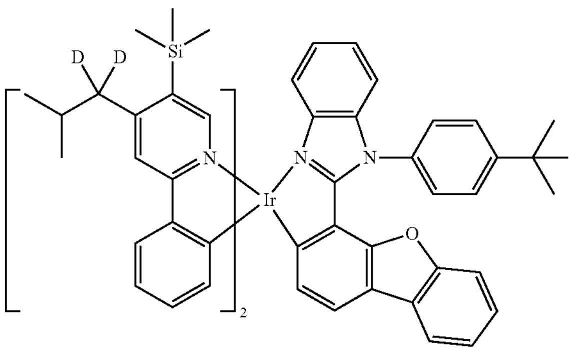
535
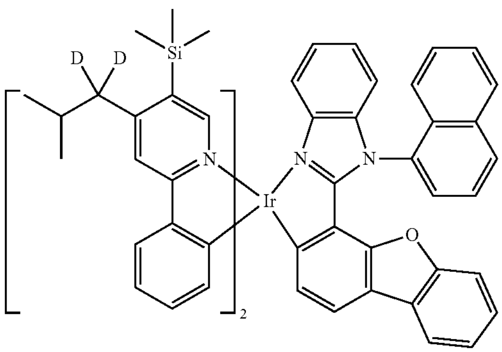
536
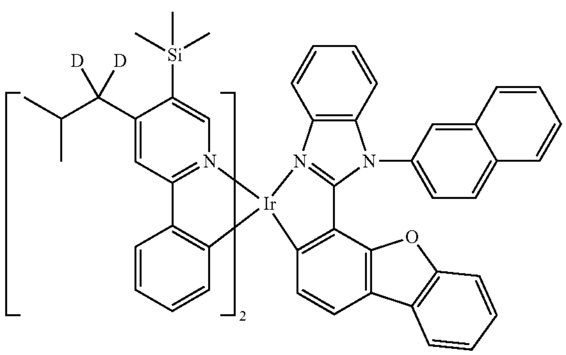
537
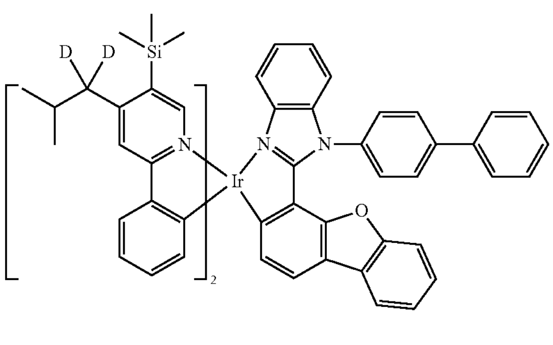
-continued
538
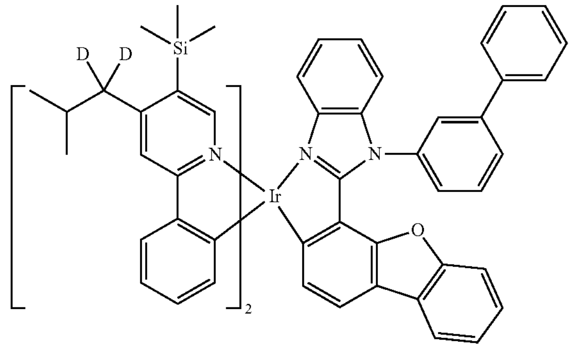
539
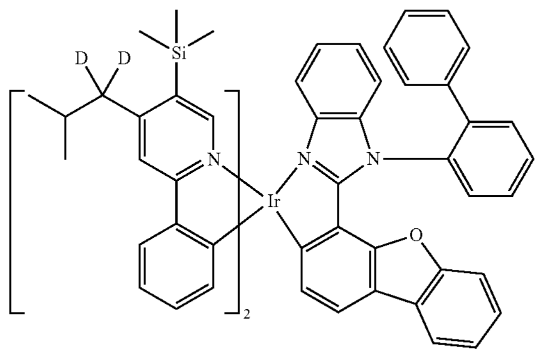
540
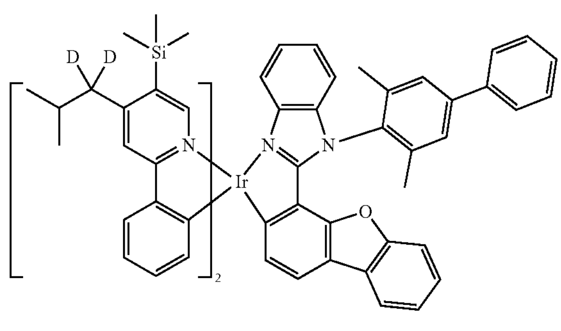
541
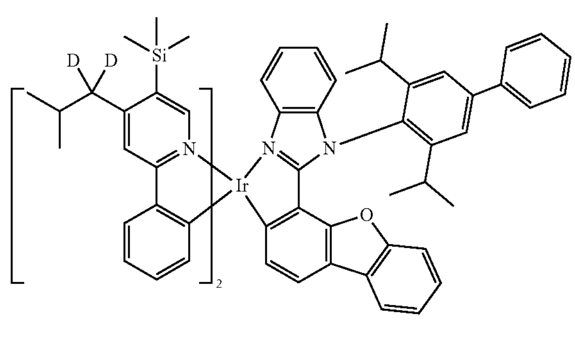

-continued
542
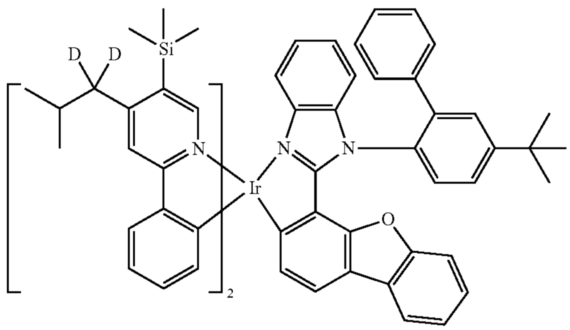
543
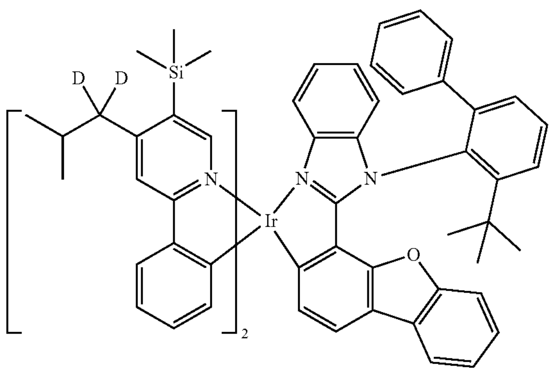
544
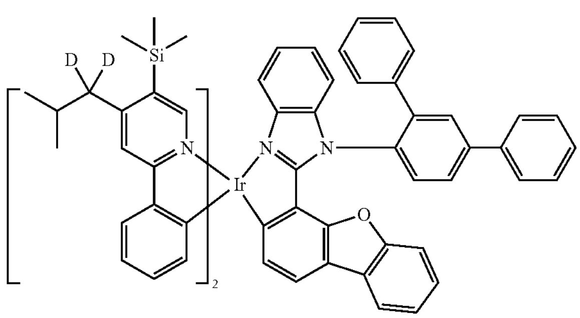
545
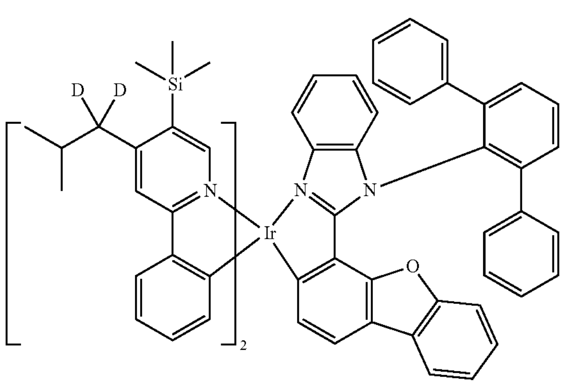
-continued
546
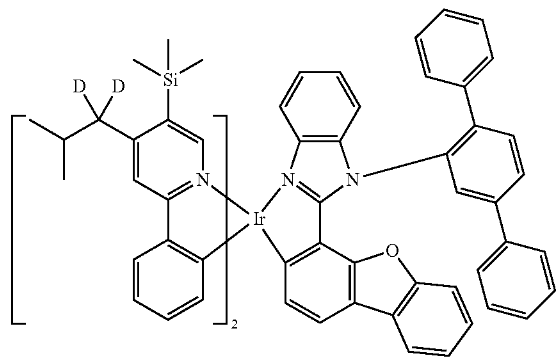
547
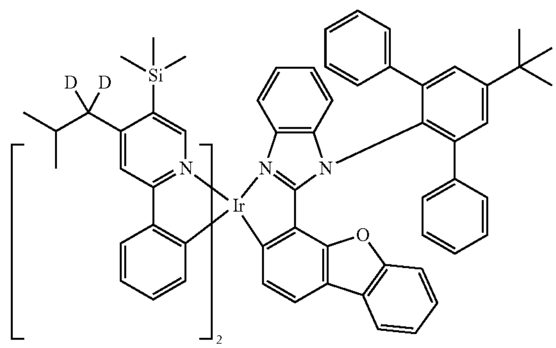
548
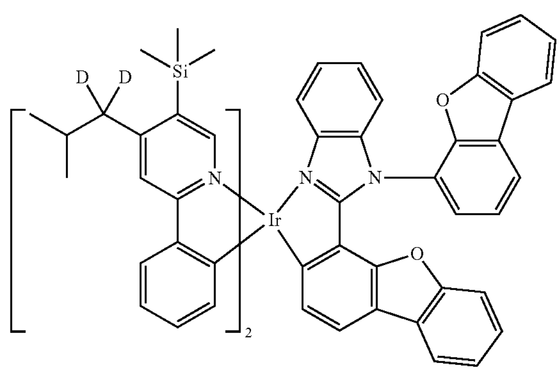
549
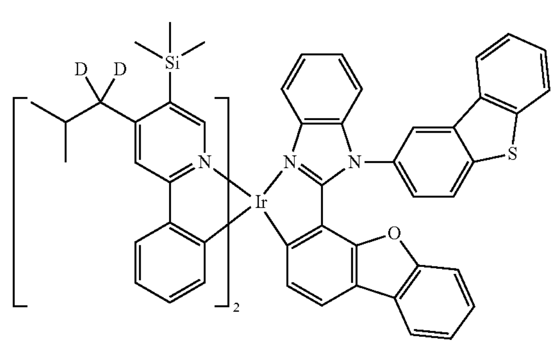

-continued
550
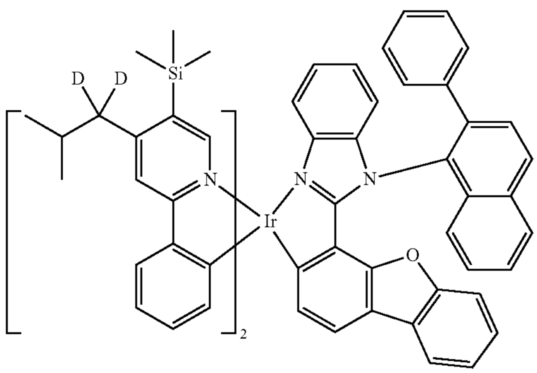
551
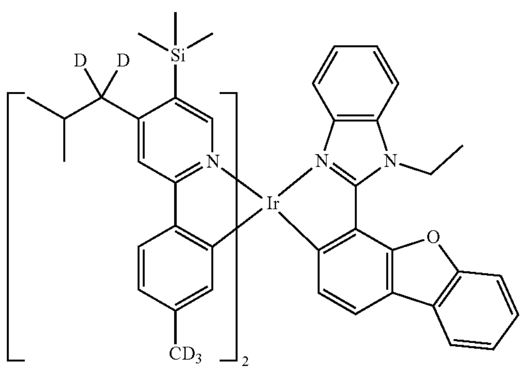
552
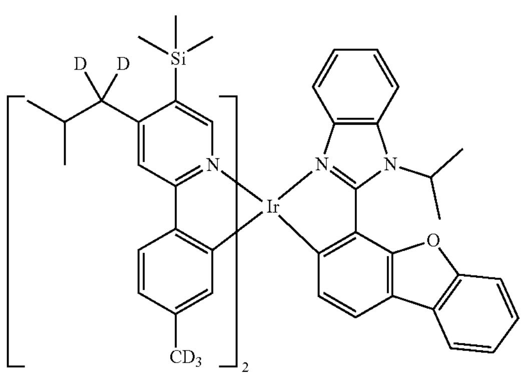
553
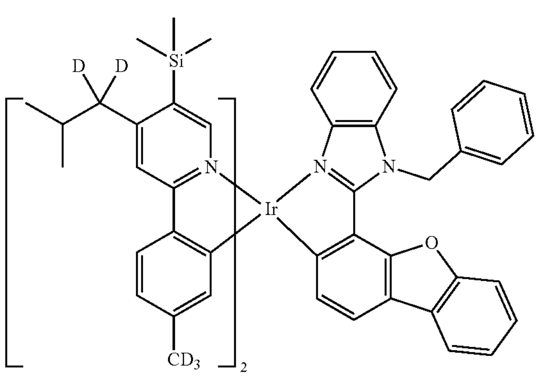
-continued
554
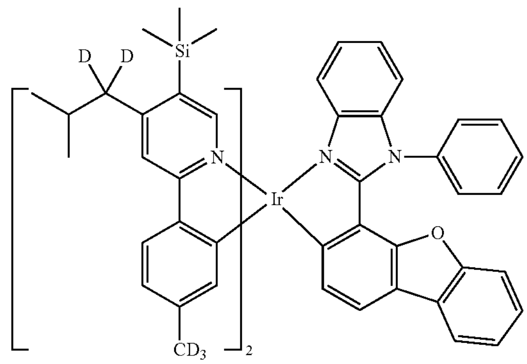
555
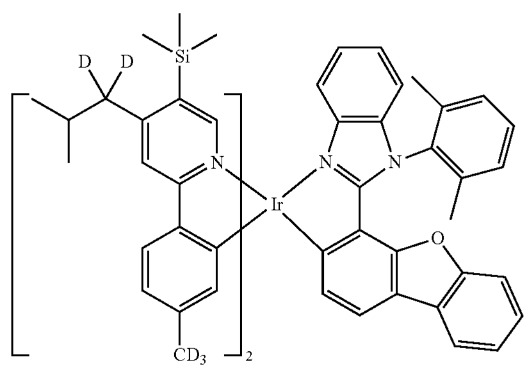
556
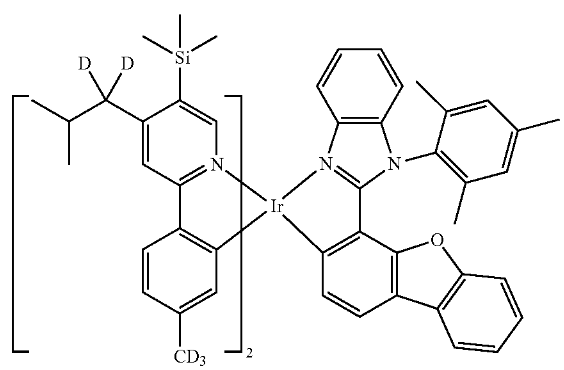
557
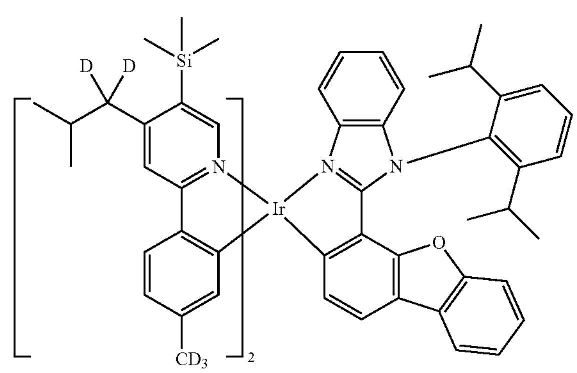

-continued
558
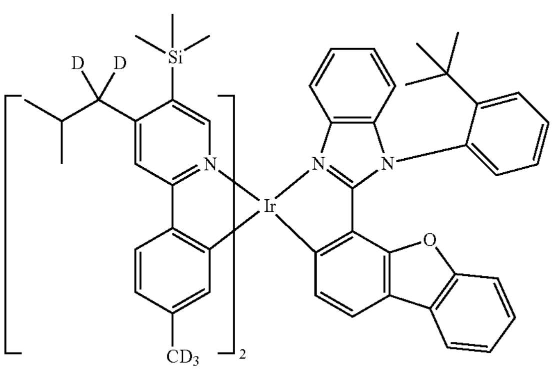
559
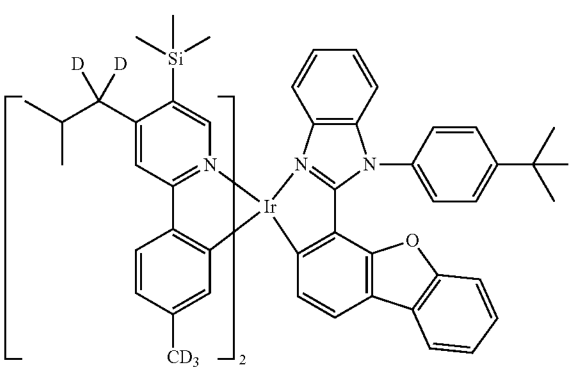
560
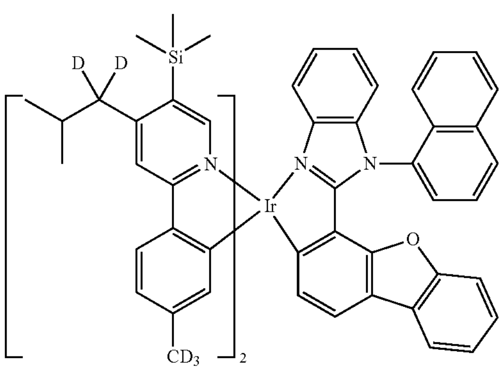
561
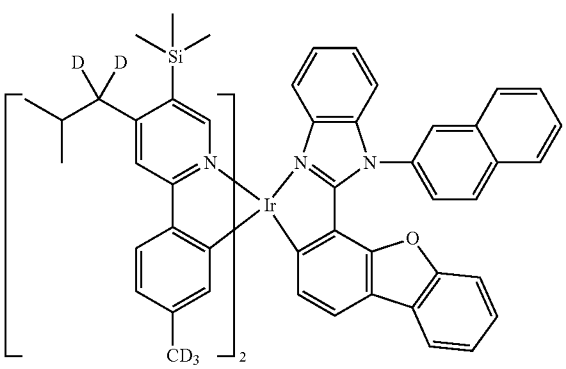
-continued
562
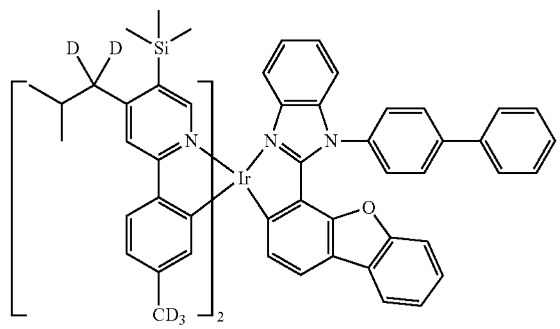
563
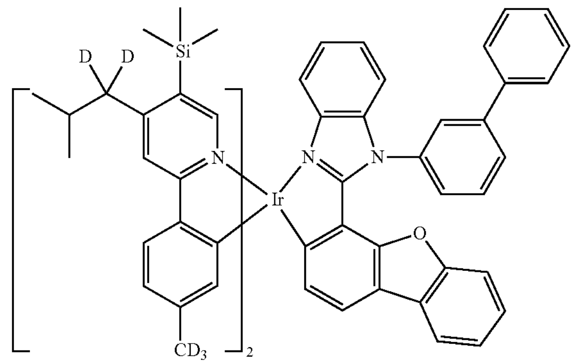
564
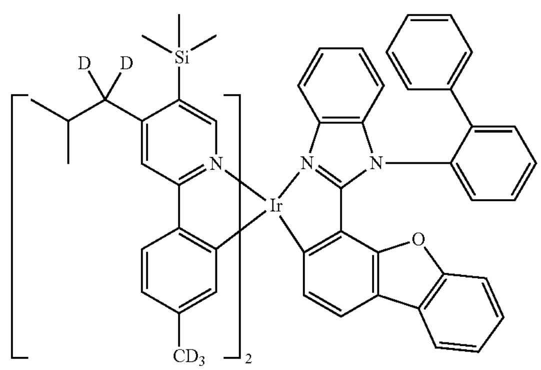
565
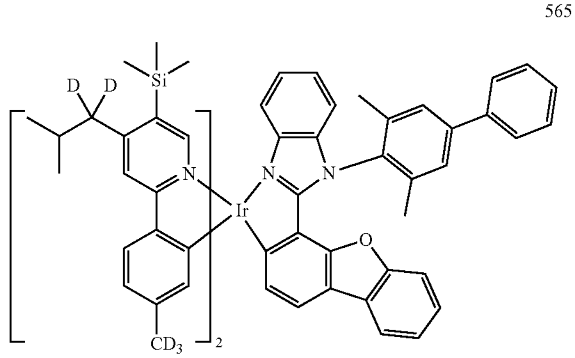

-continued
566
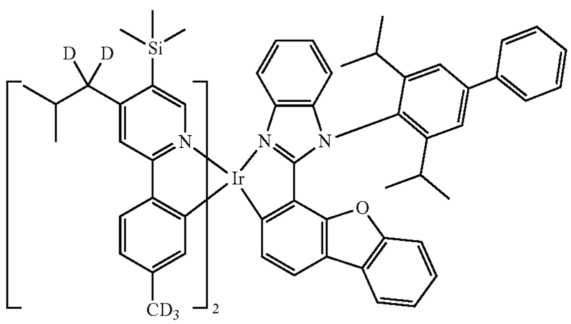
567
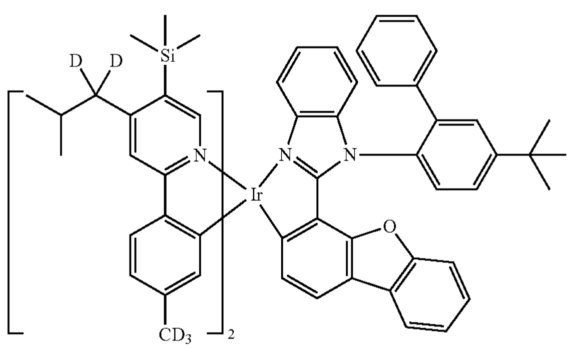
568
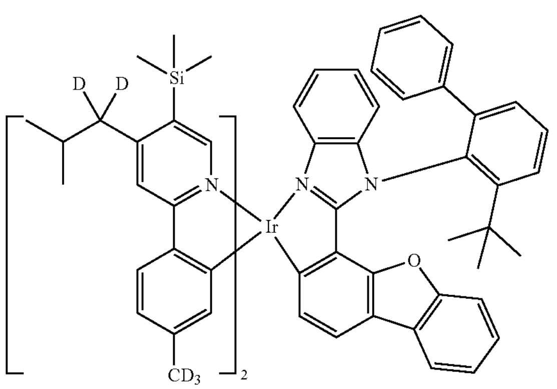
569
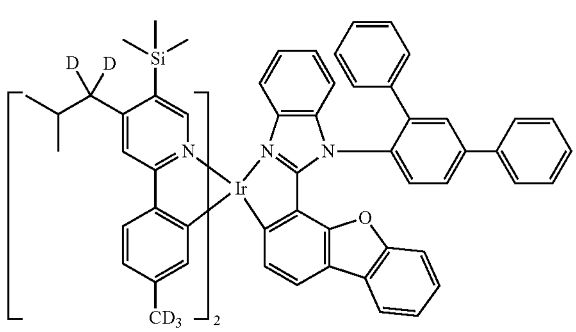
-continued
570
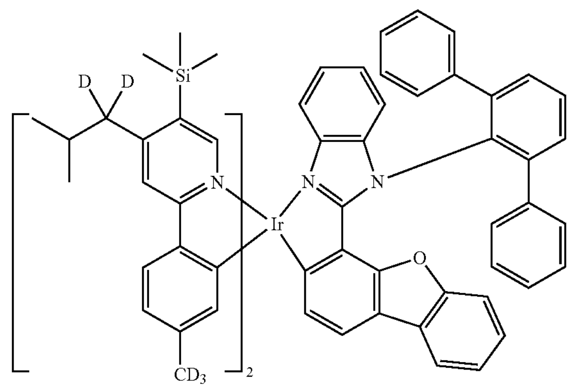
571
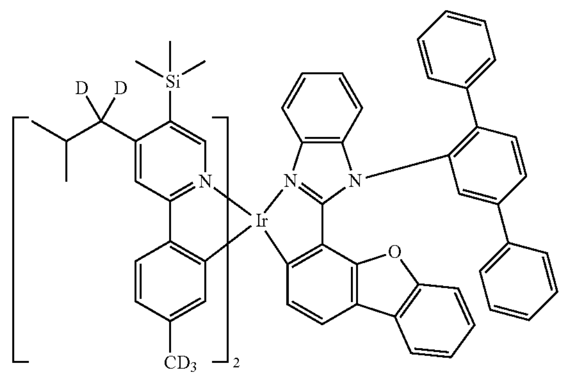
572
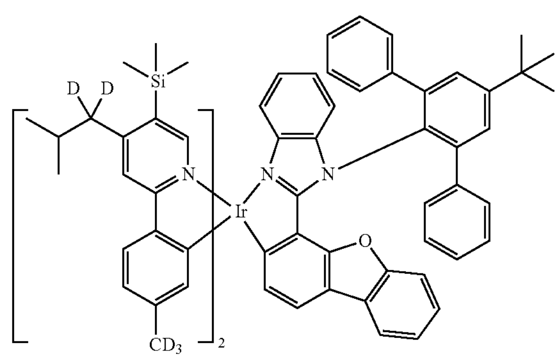
573
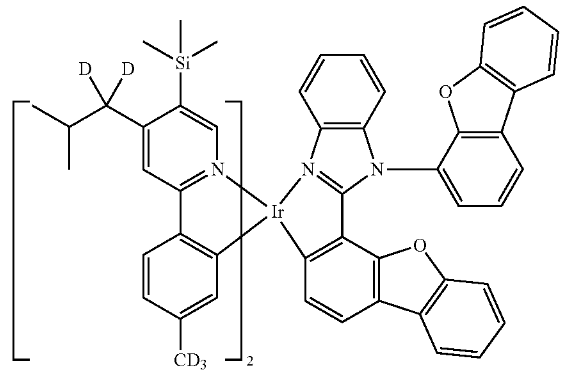

-continued
574
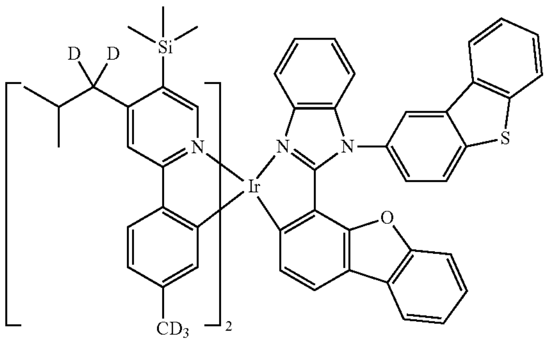
575
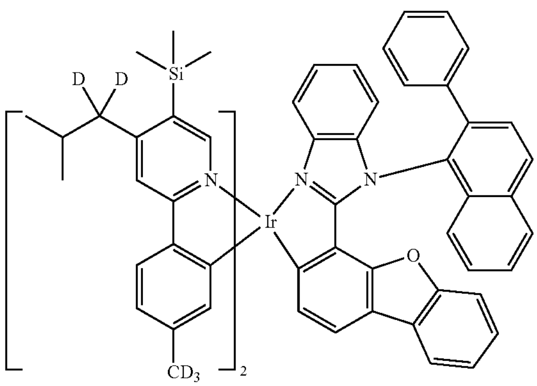
576
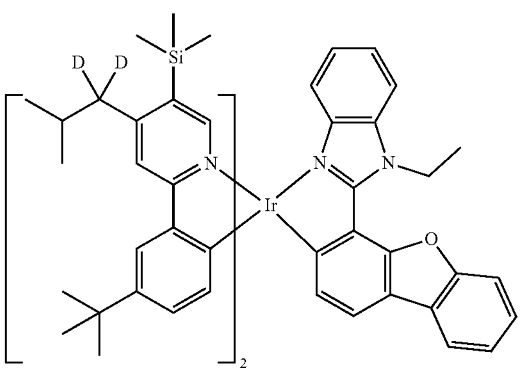
577
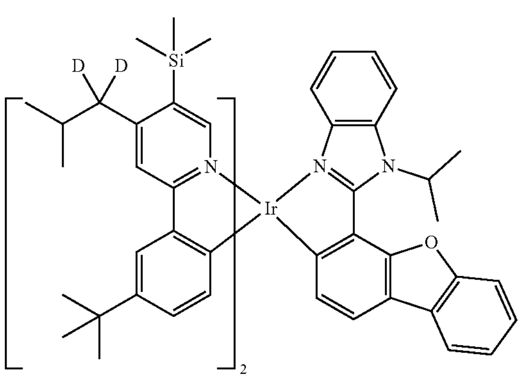
-continued
578
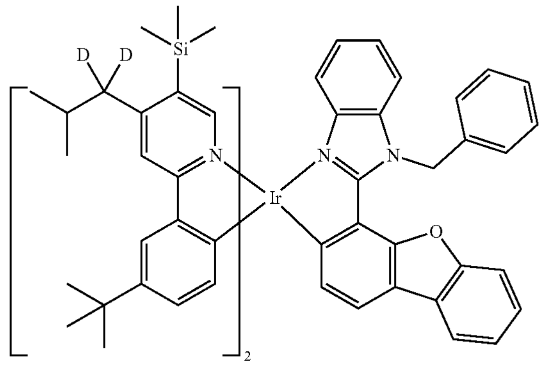
579
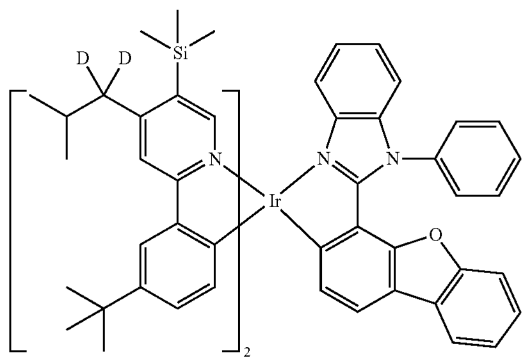
580
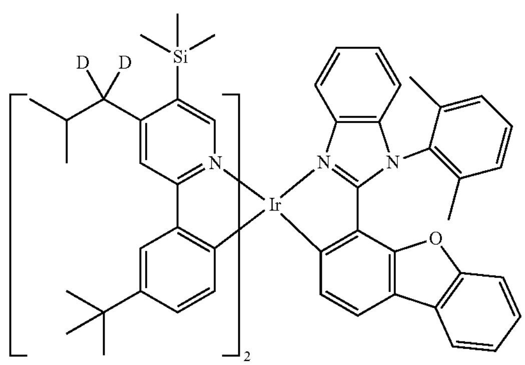
581
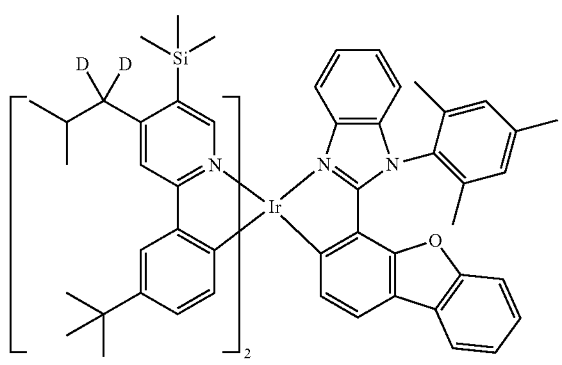

-continued
582
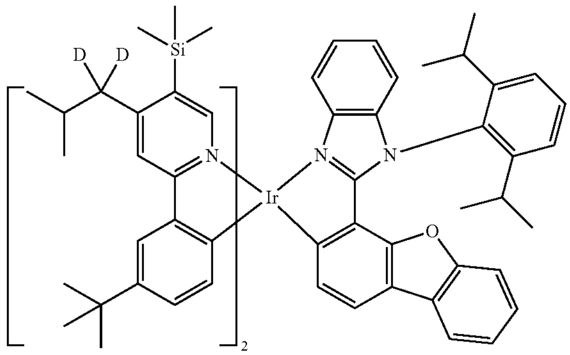
583
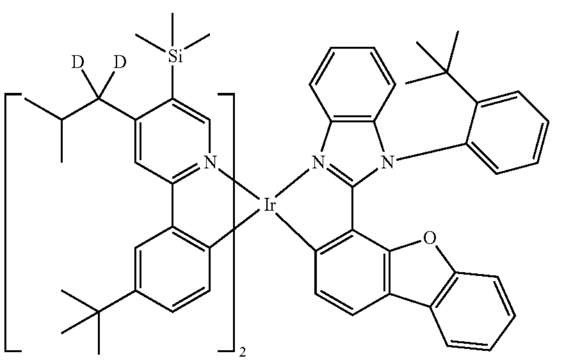
584
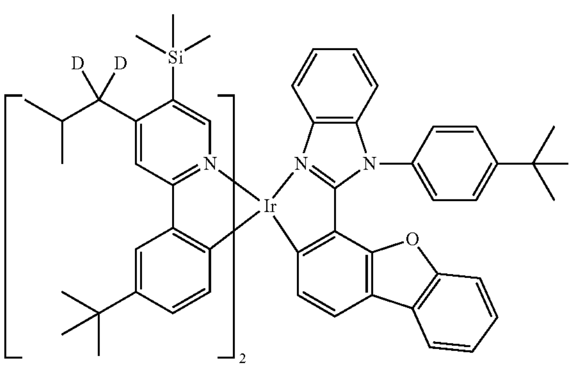
585
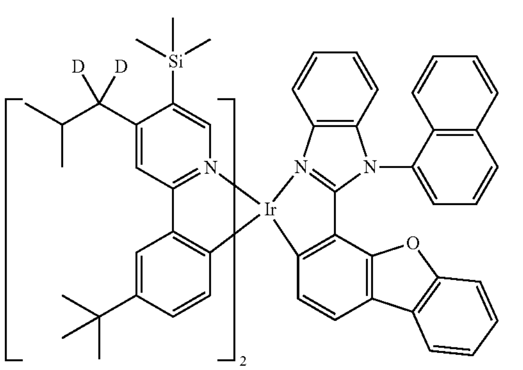
-continued
586
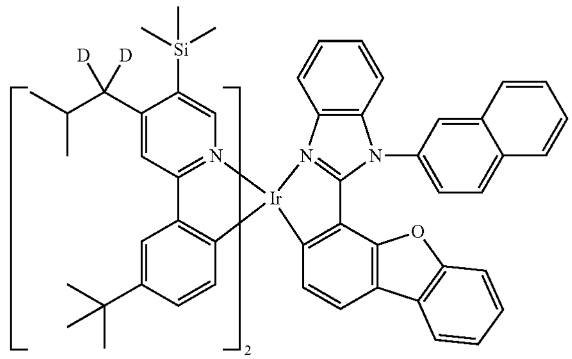
587
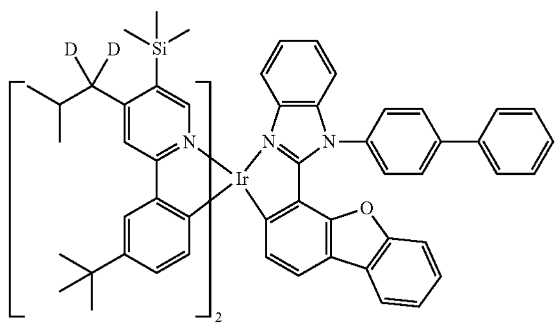
588
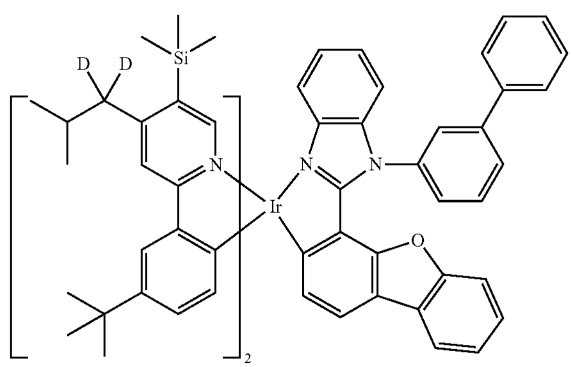
589
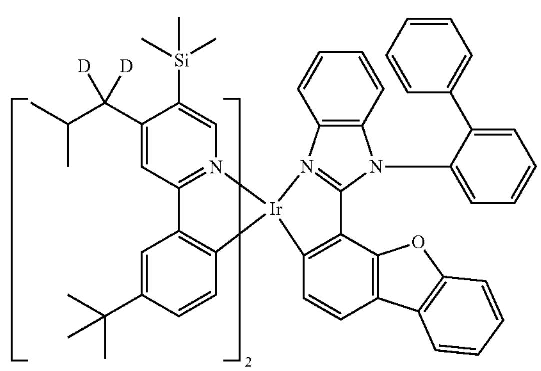

-continued
590
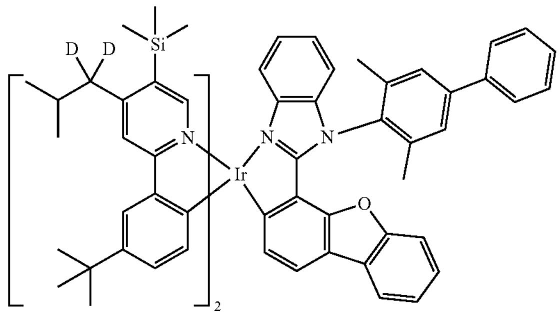
591
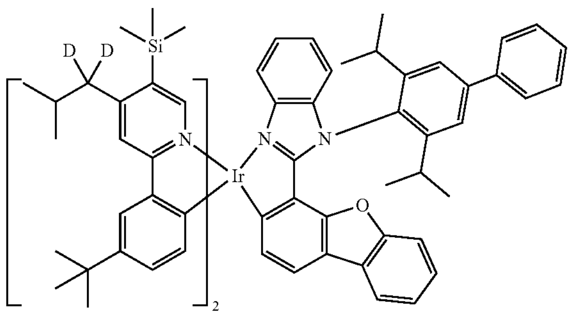
592
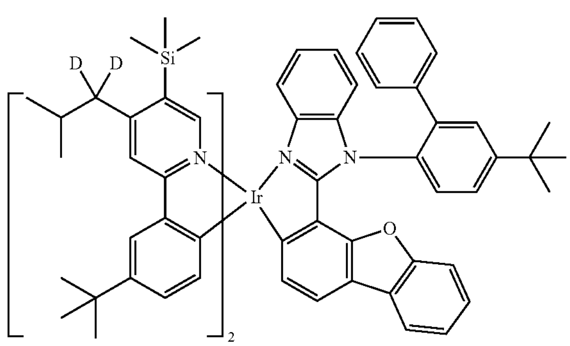
593
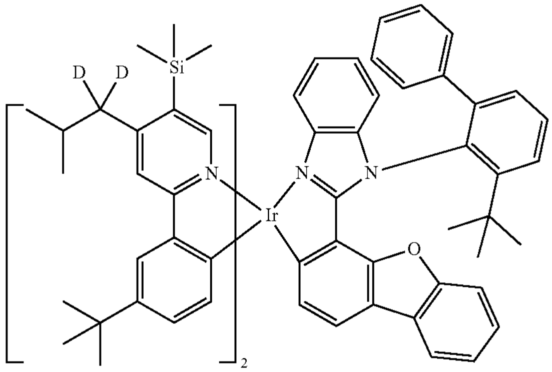
-continued
594
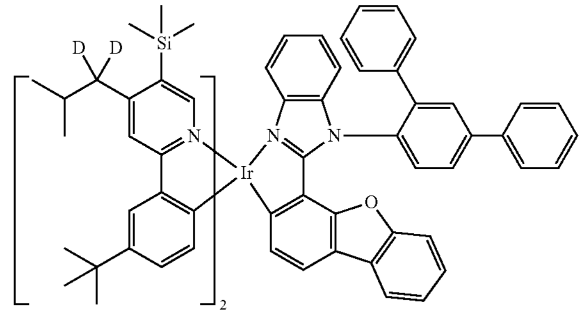
595
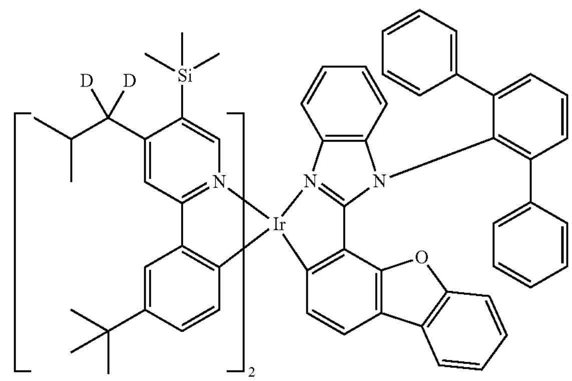
596
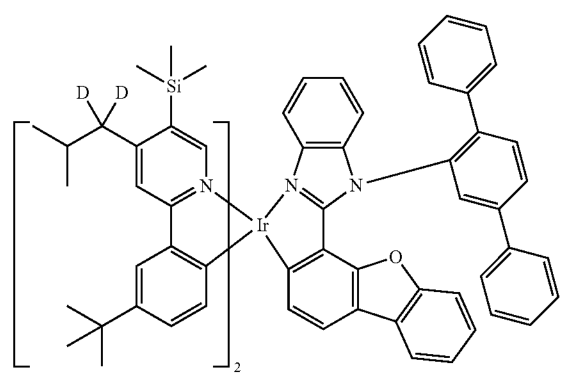
597
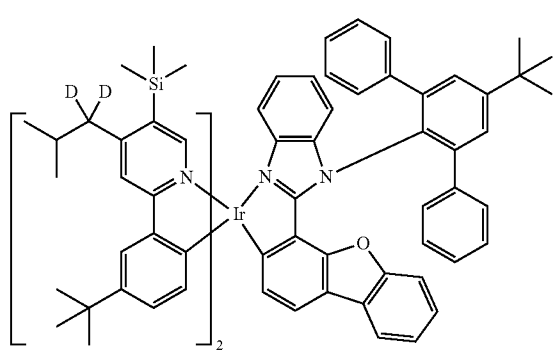

598
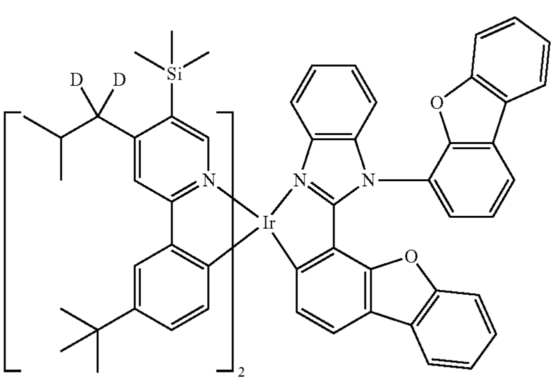
599
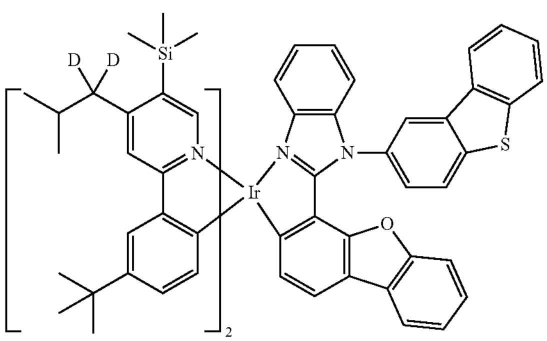
600
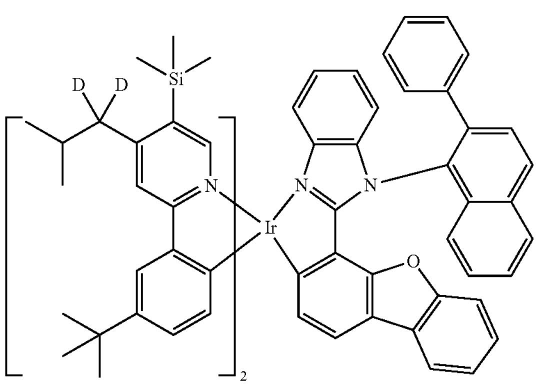
601
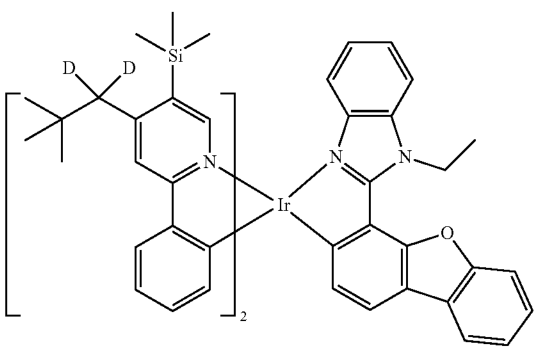
602
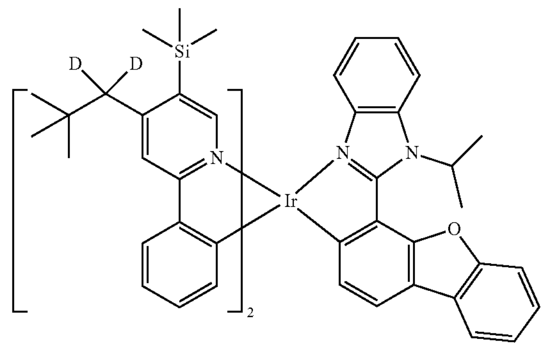
603
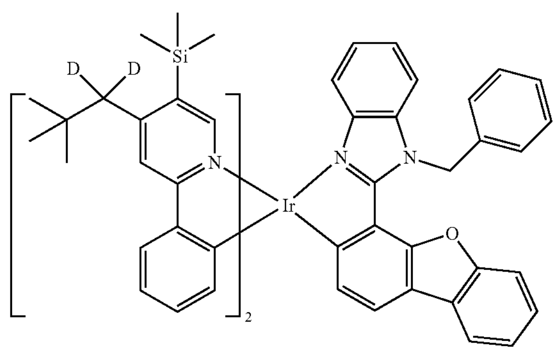
604
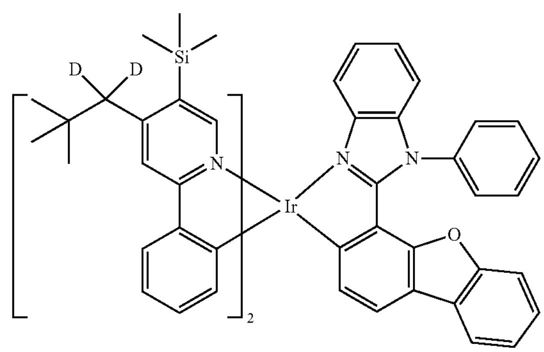
605
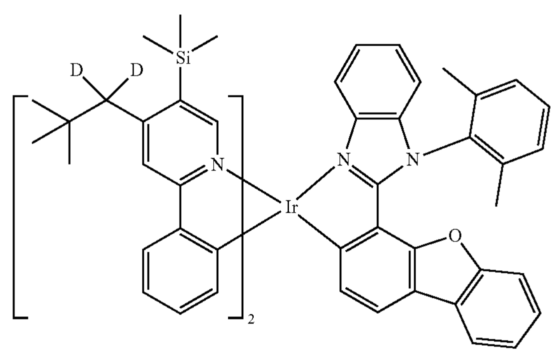

-continued
606
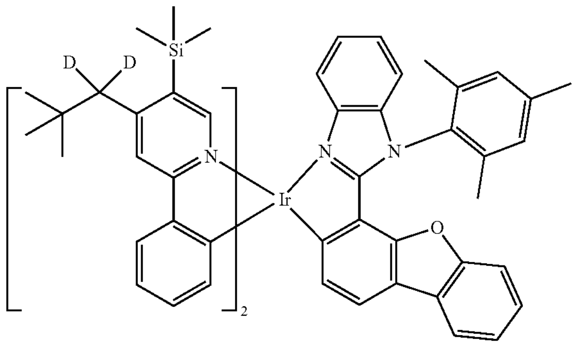
607
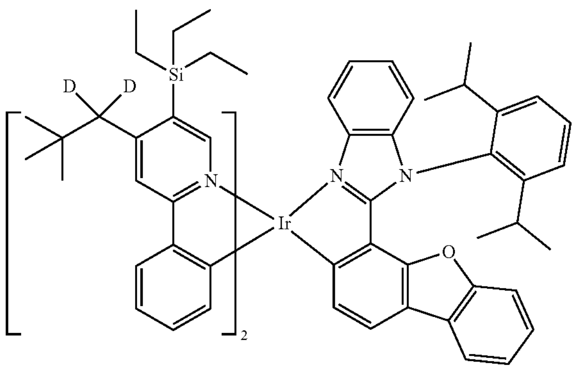
608
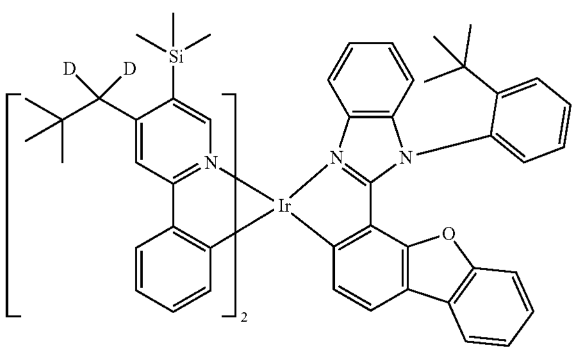
609
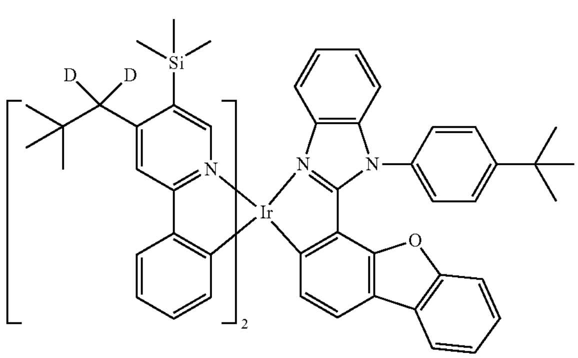
-continued
610
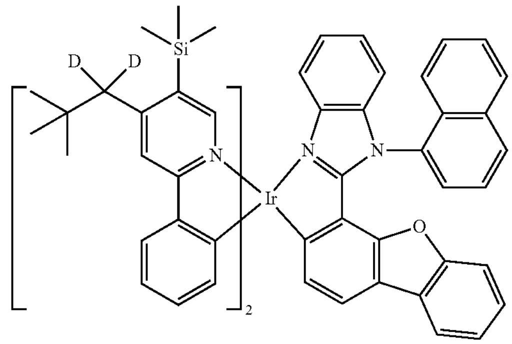
611
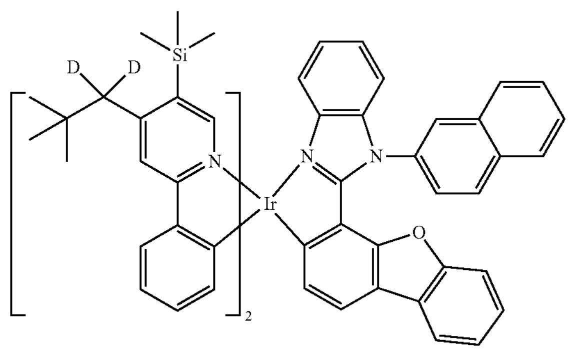
612
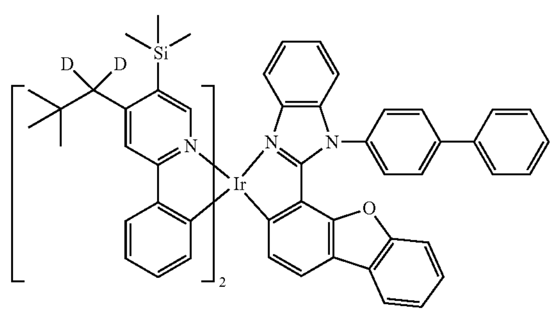
613
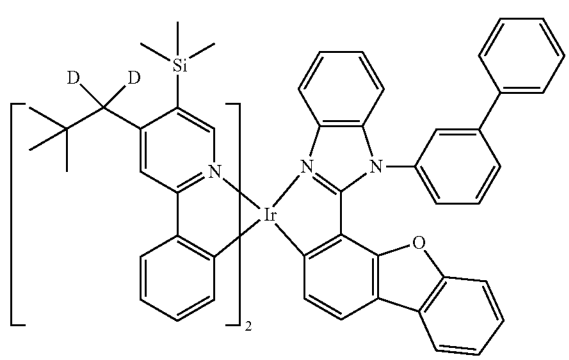

-continued
614
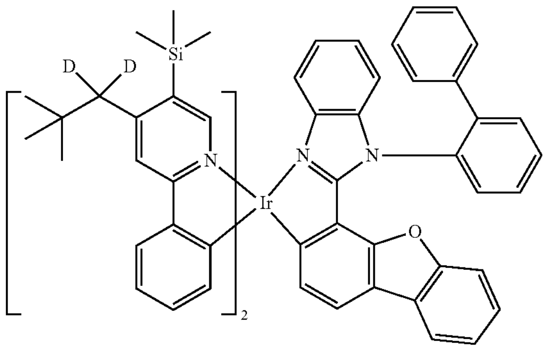
615
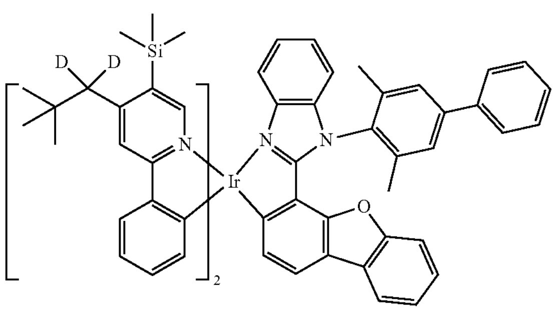
616
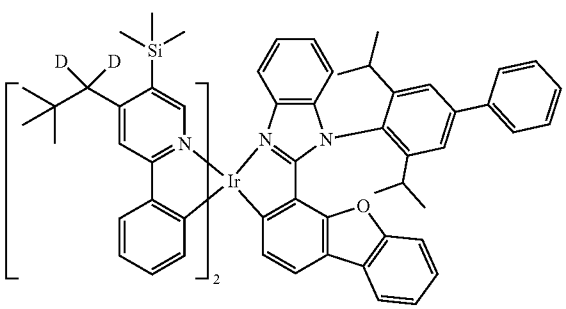
617
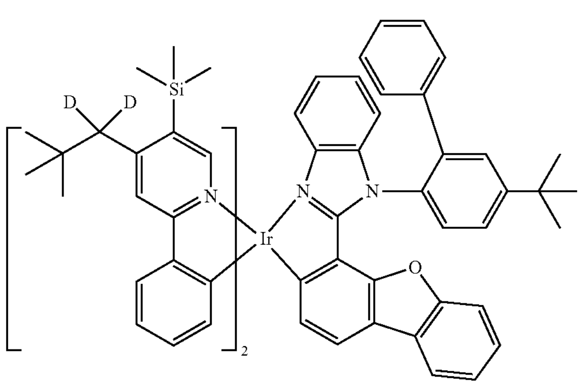
-continued
618
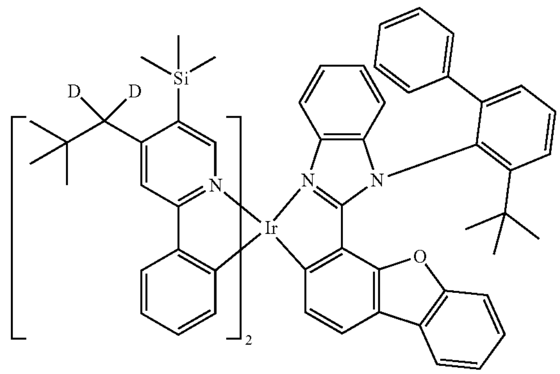
619
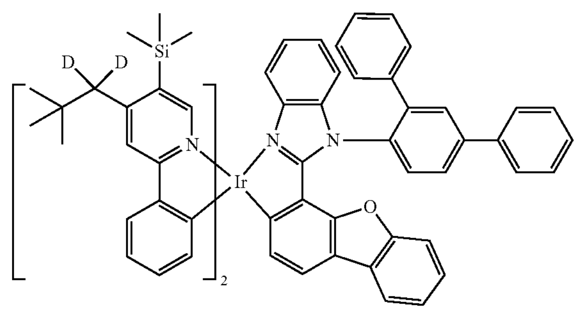
620
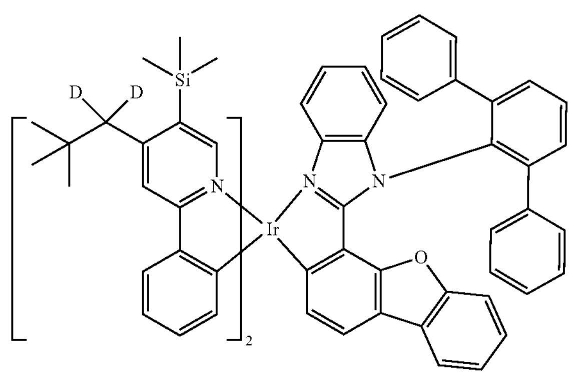
621
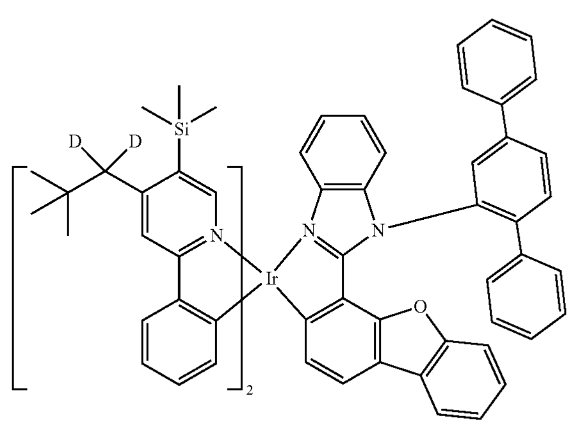

-continued
622
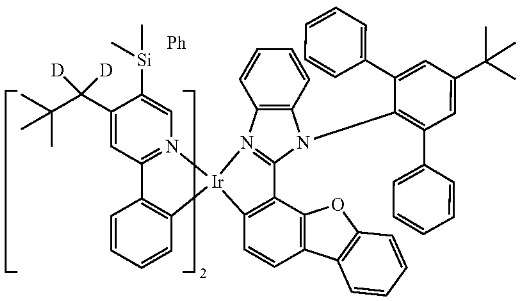
623
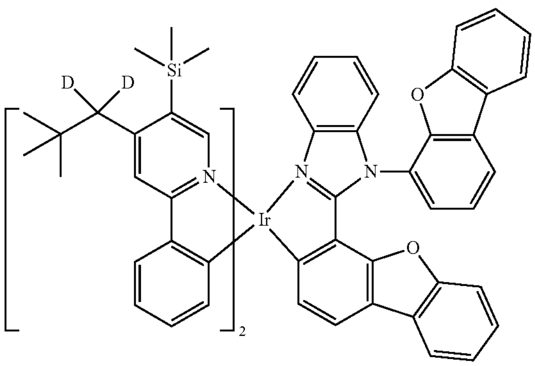
624
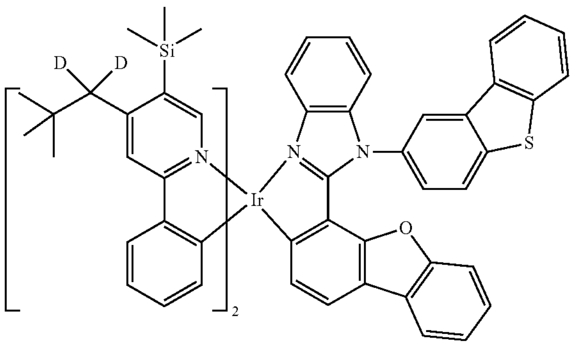
625
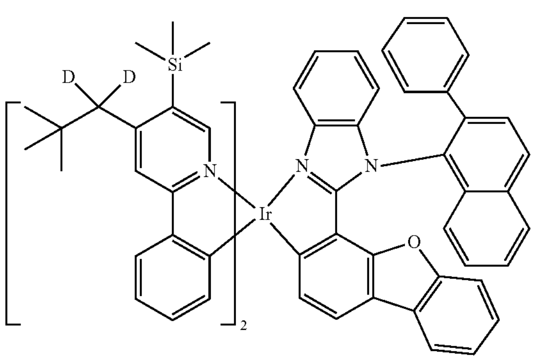
-continued
626
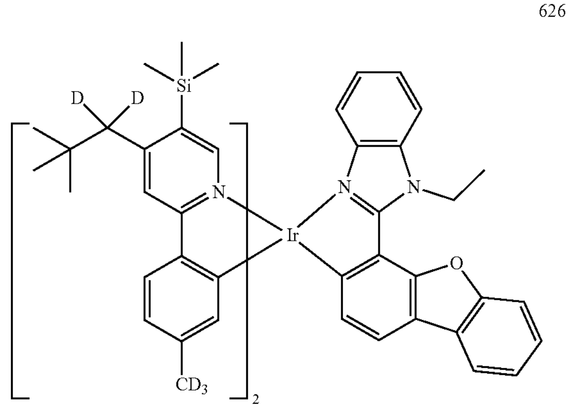
627
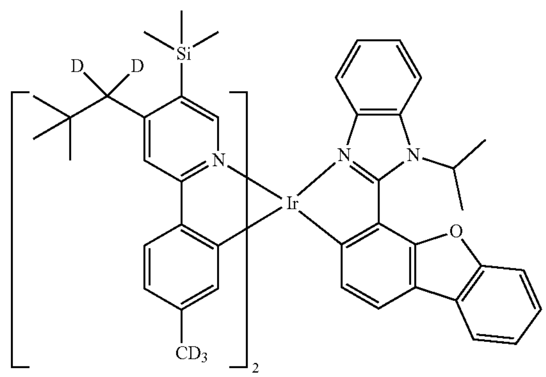
628
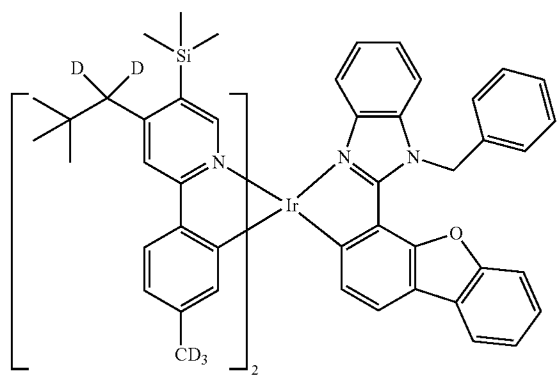
629
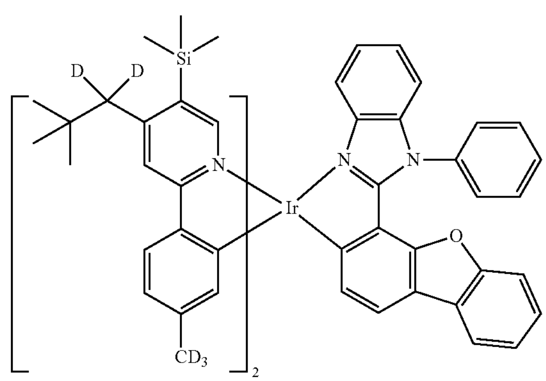

-continued
630
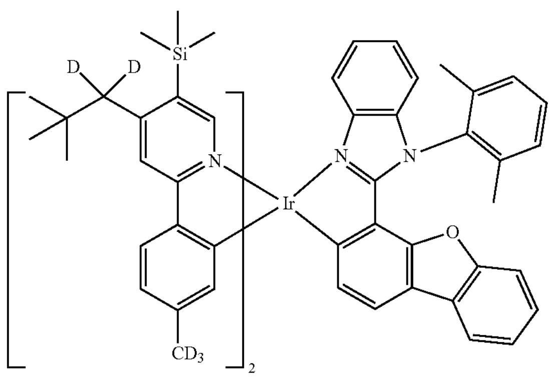
631
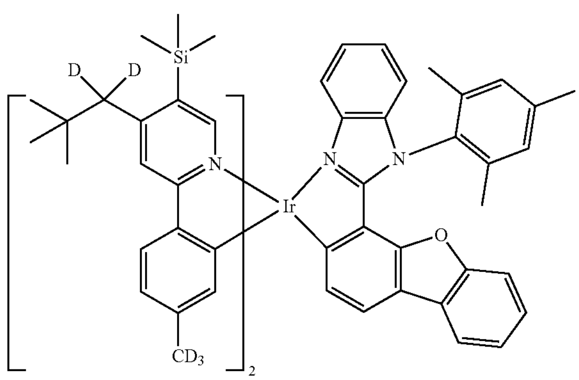
632
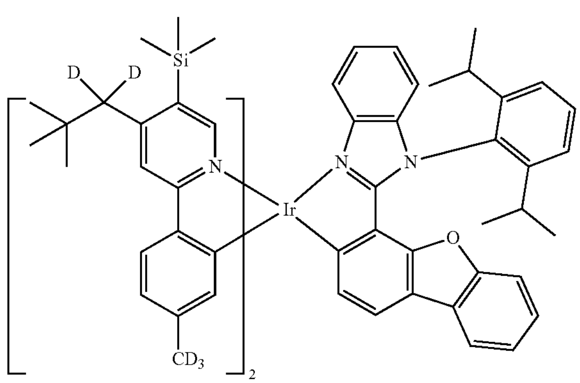
633
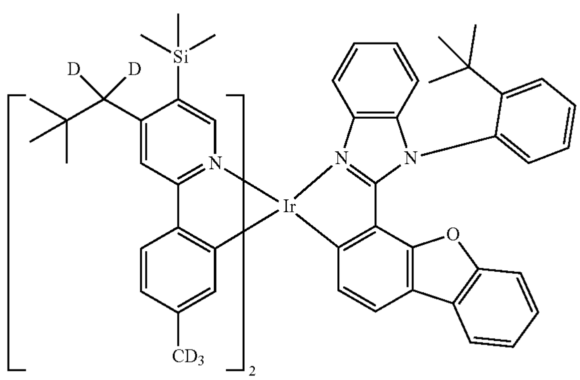
-continued
634
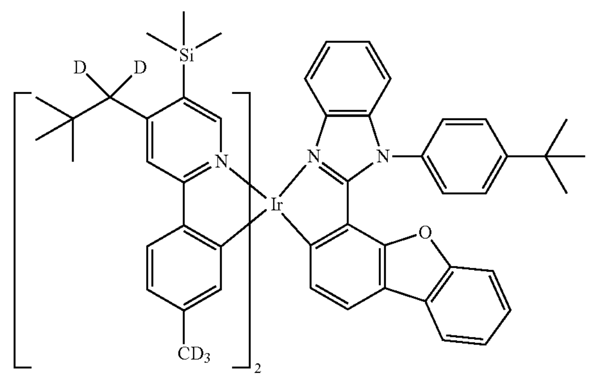
635
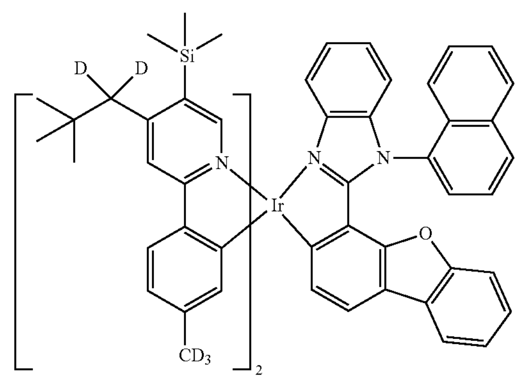
636
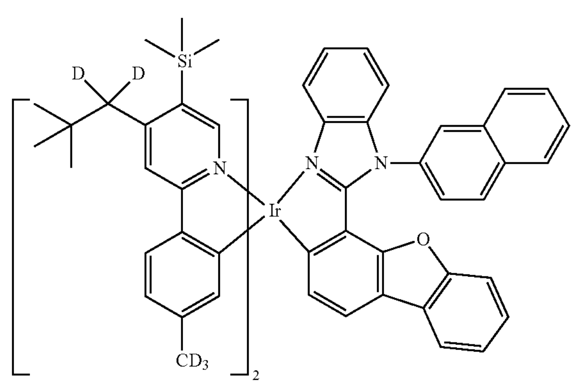
637
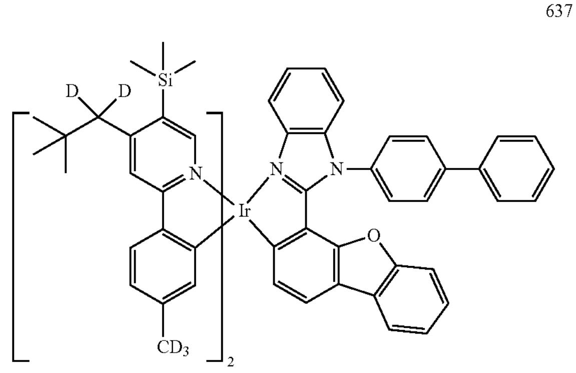

-continued
638
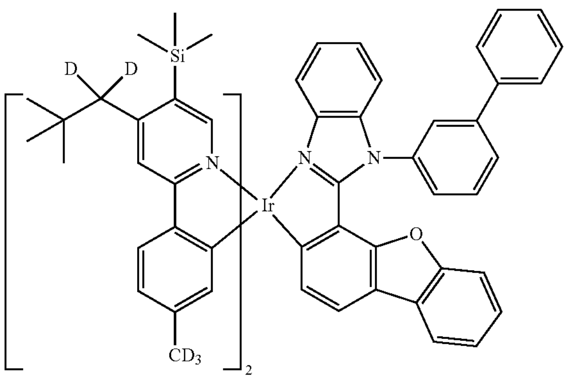
639
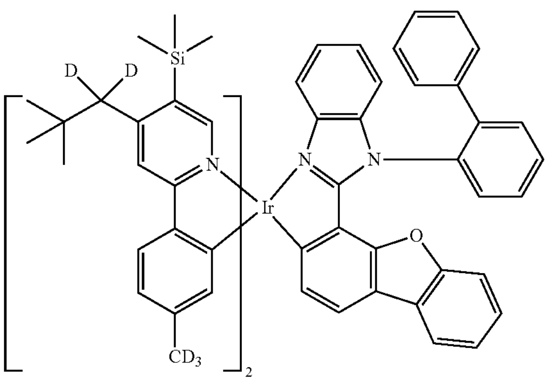
640
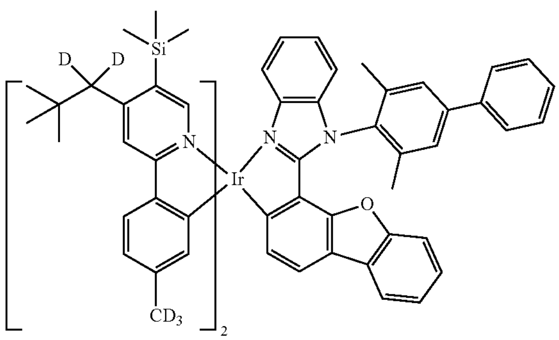
641
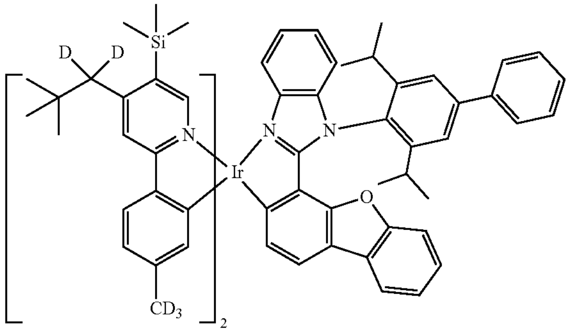
-continued
642
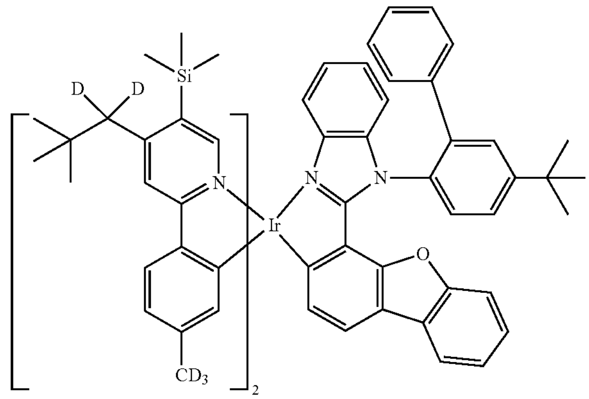
643
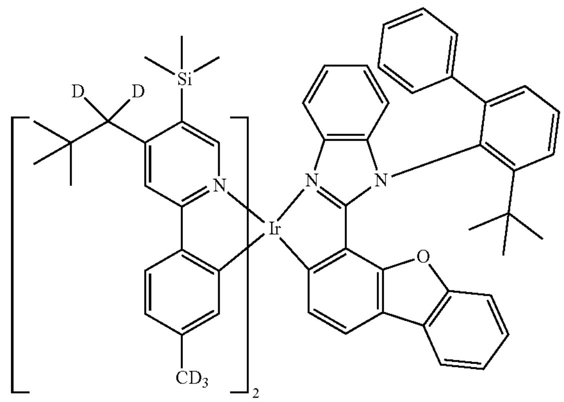
644
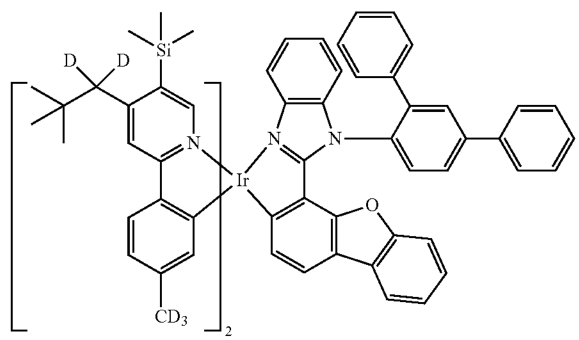
645
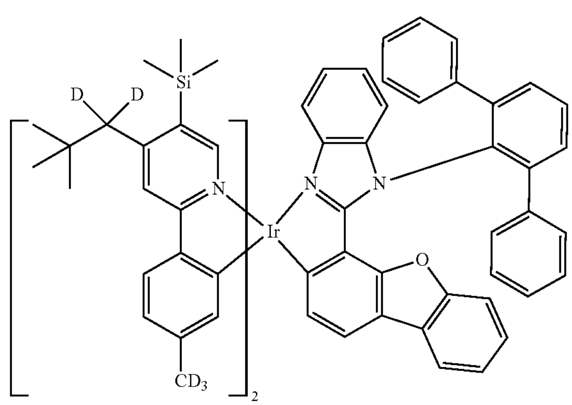

-continued
646
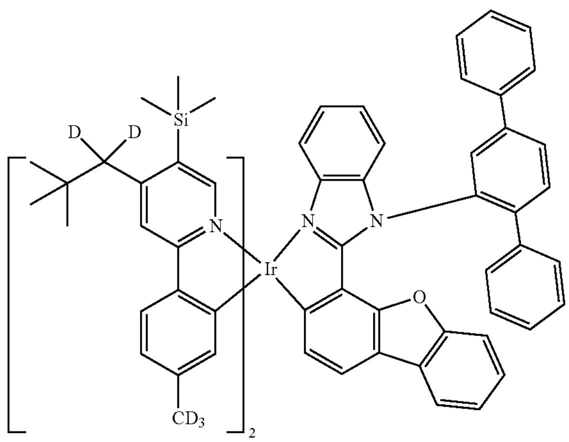
647
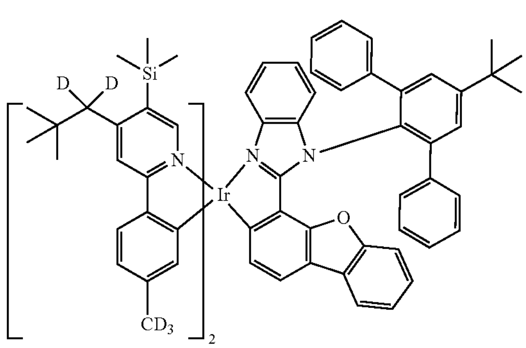
648
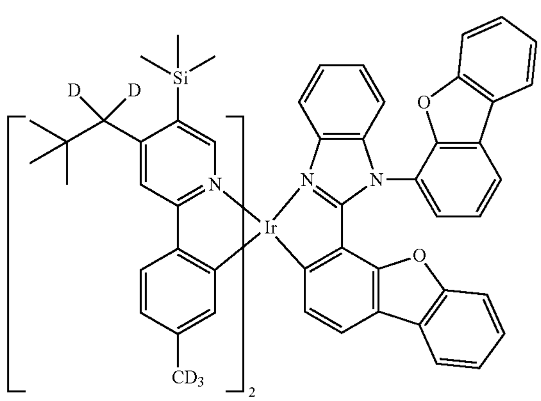
649
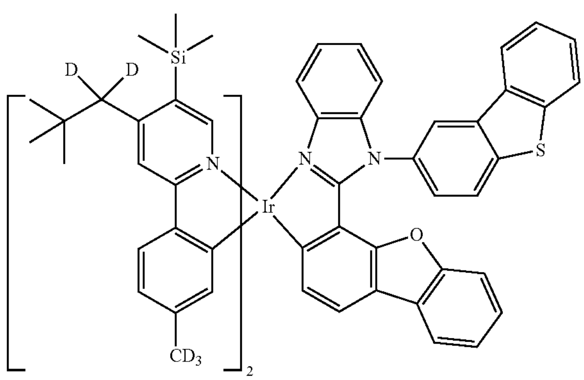
-continued
650
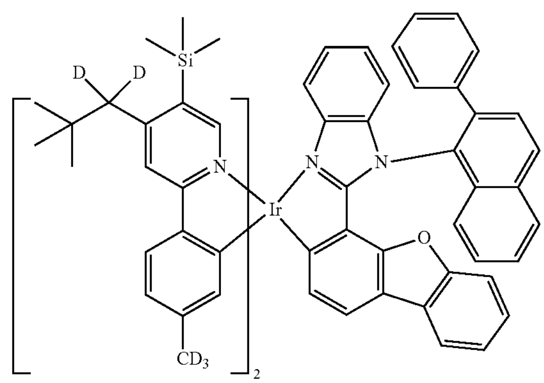
651
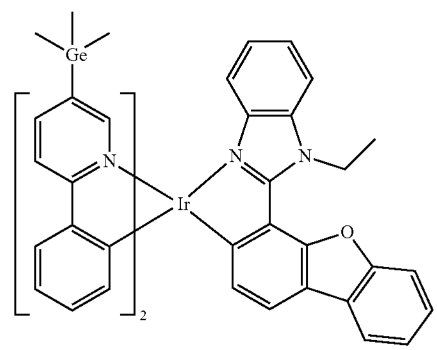
652
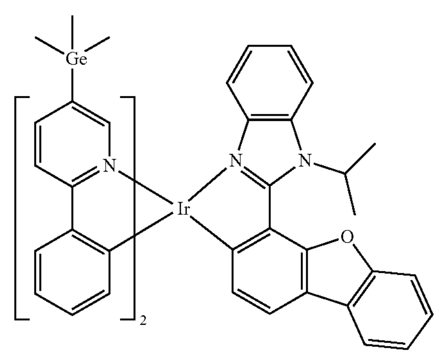
653
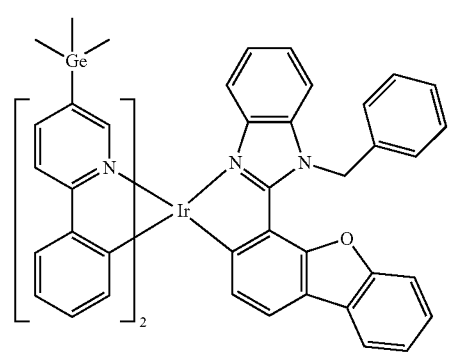

-continued
654
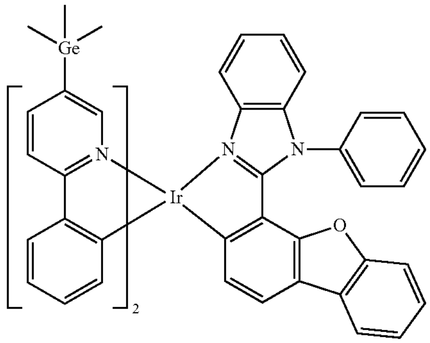
655
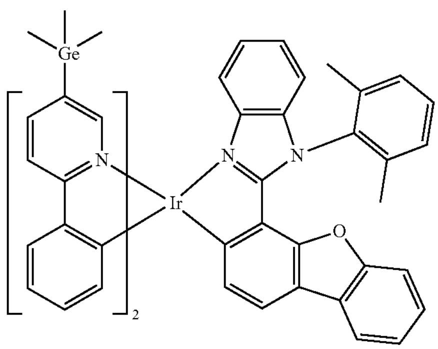
656
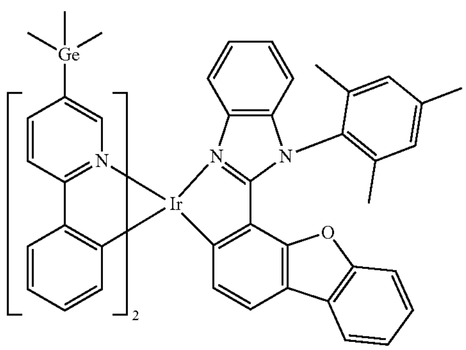
657
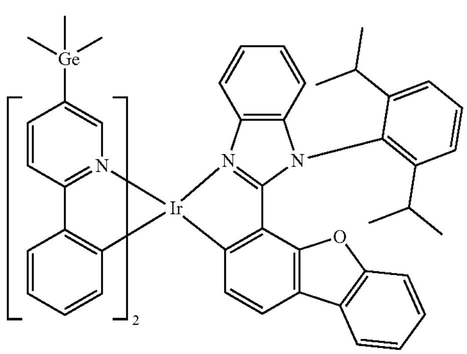
-continued
658
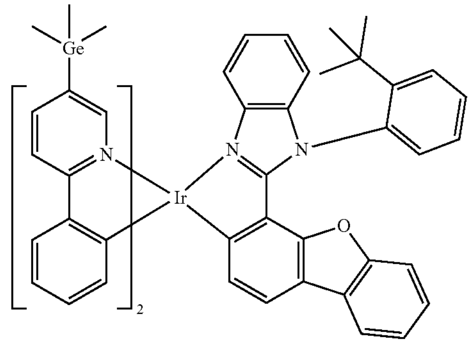
659
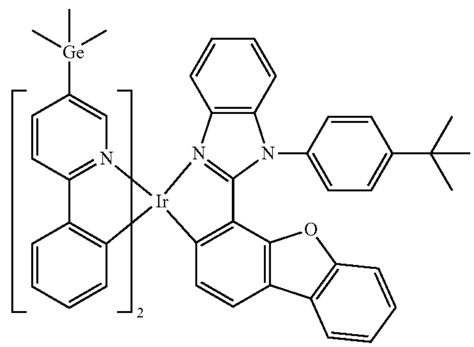
660
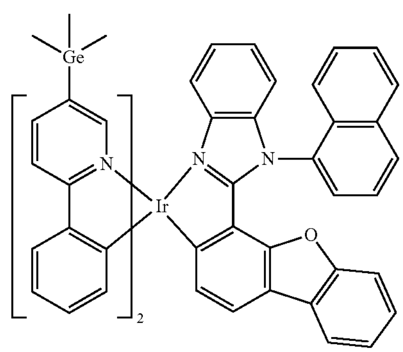
661
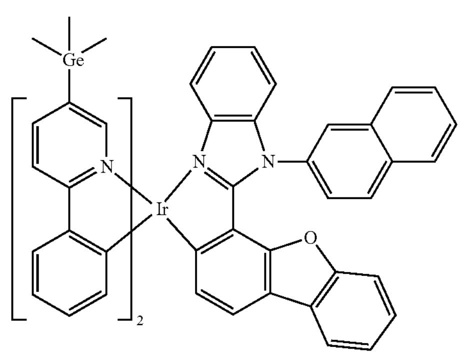

-continued
662
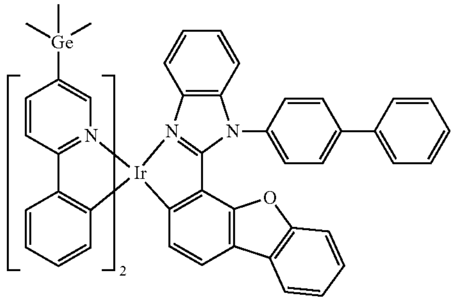
663
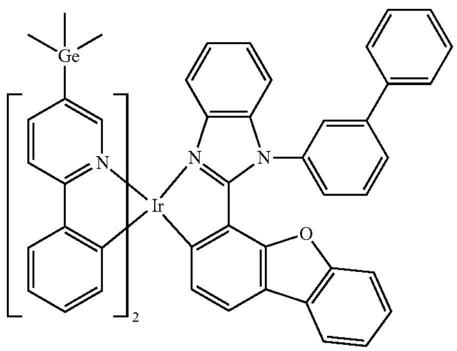
664
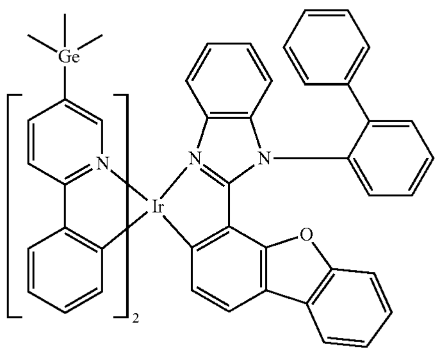
665
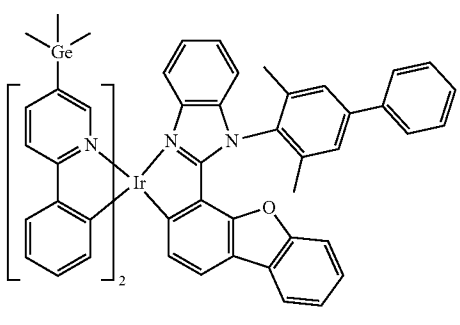
666
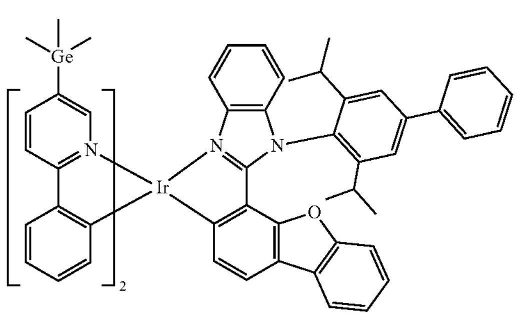
-continued
667
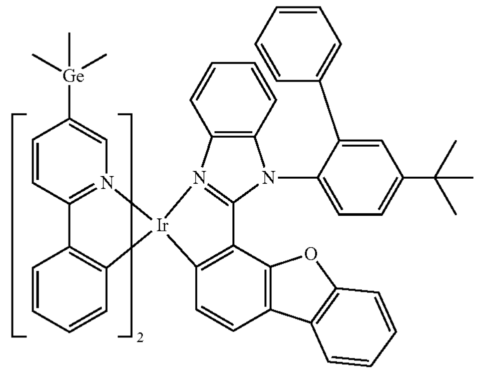
668
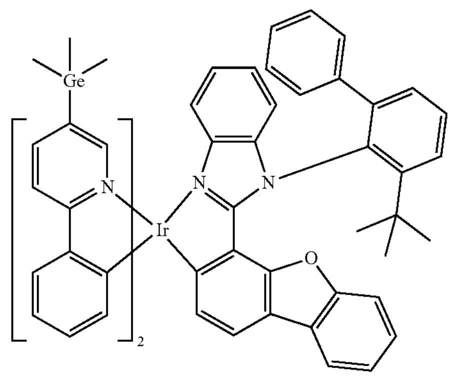
669
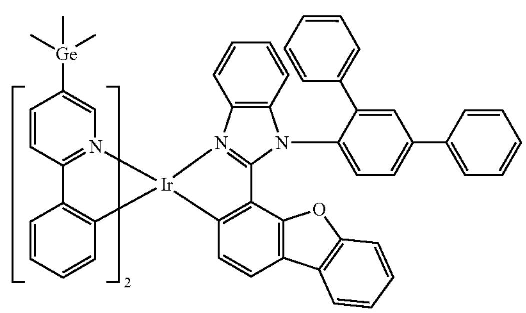
670
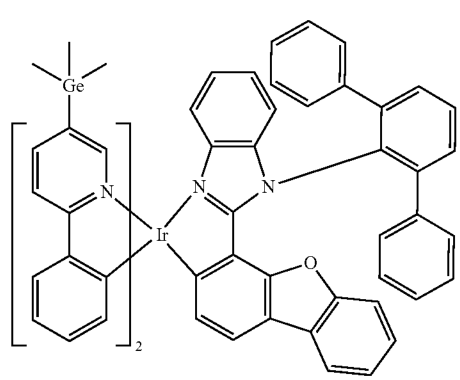

-continued
671
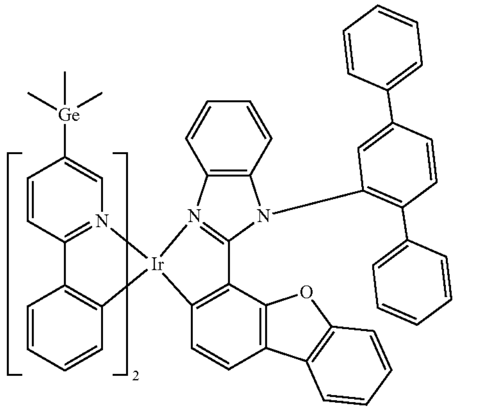
672
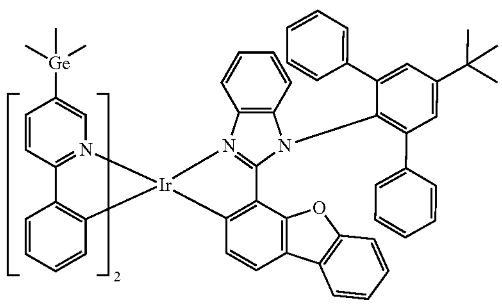
673
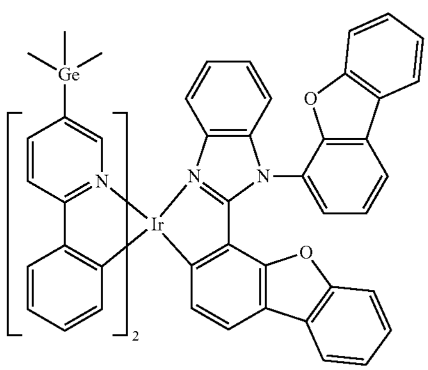
674
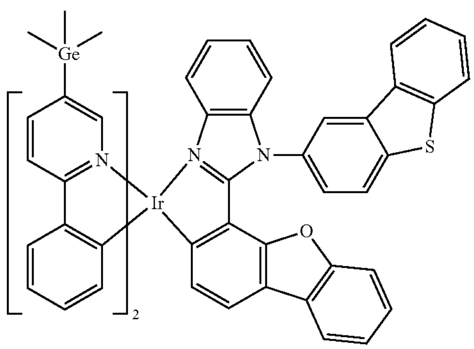
-continued
675
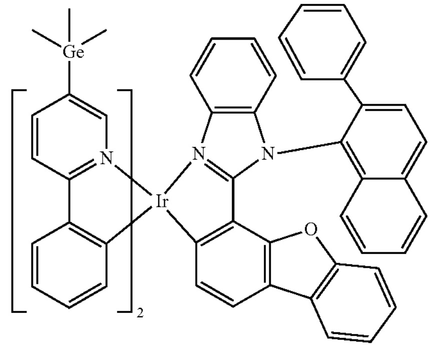
676
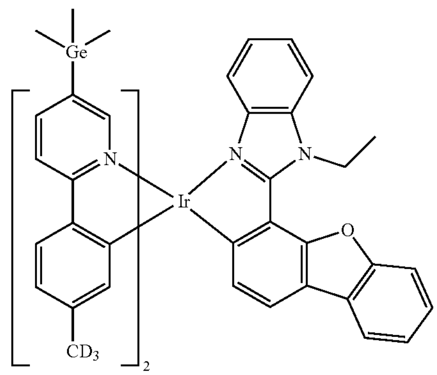
677
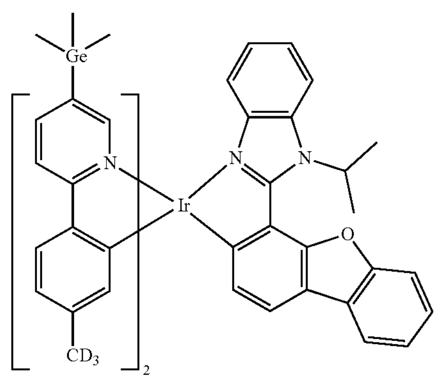
678
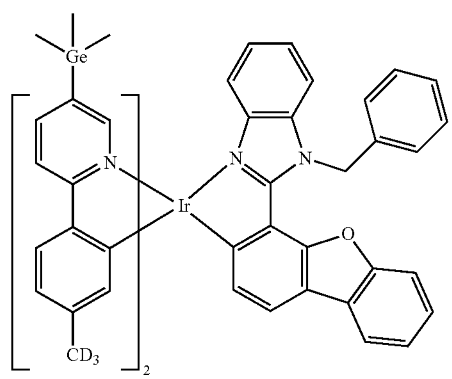

-continued
679
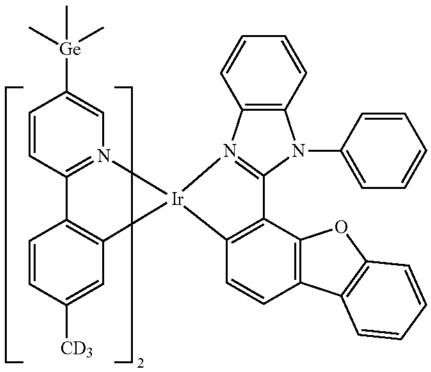
680
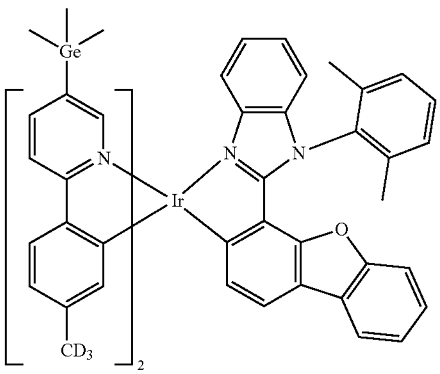
681
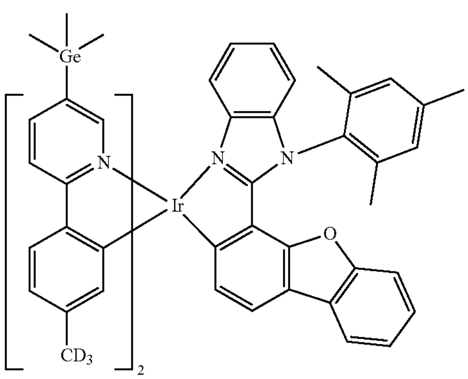
682
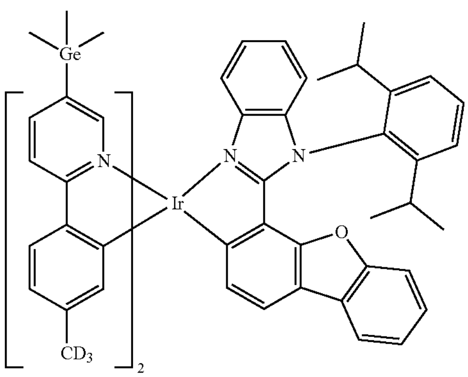
-continued
683
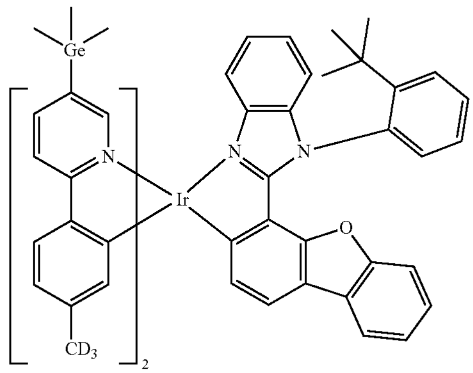
684
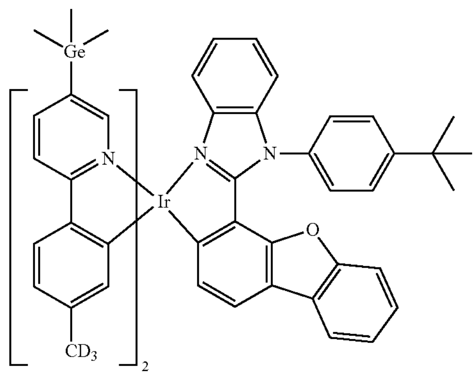
685
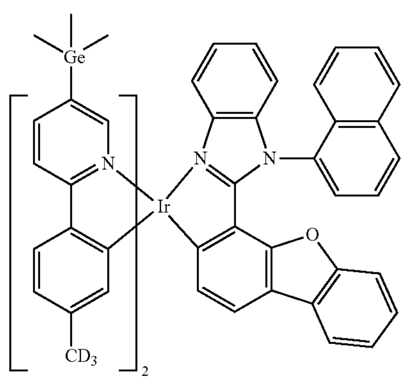
686
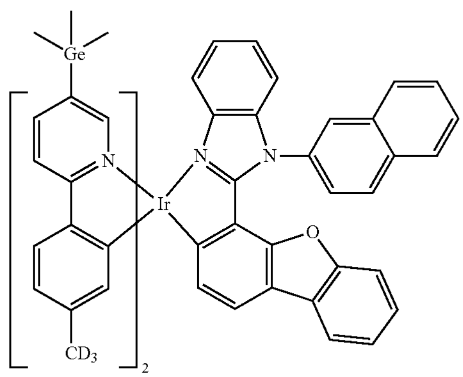

-continued
687
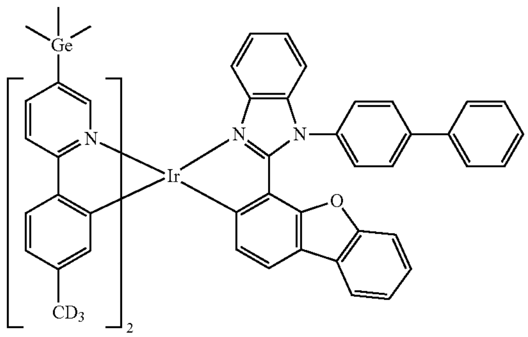
688
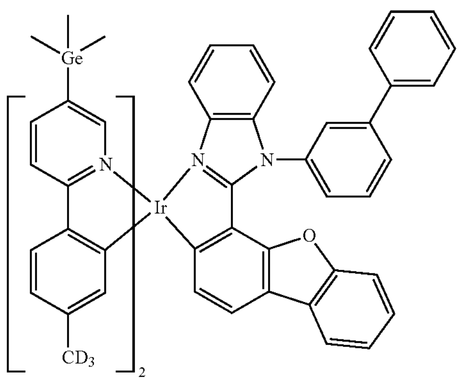
689
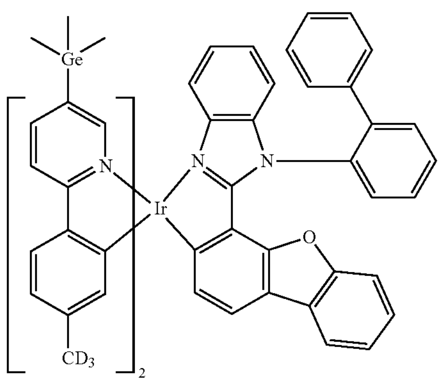
690
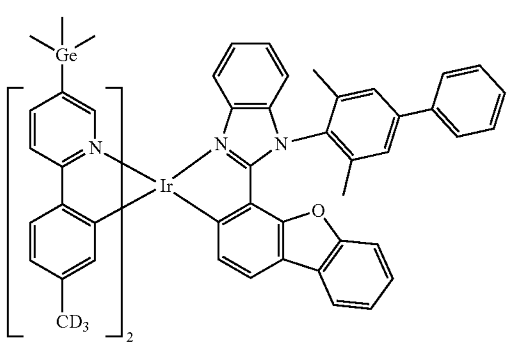
-continued
691
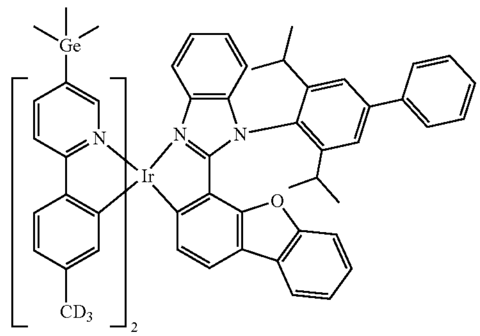
692
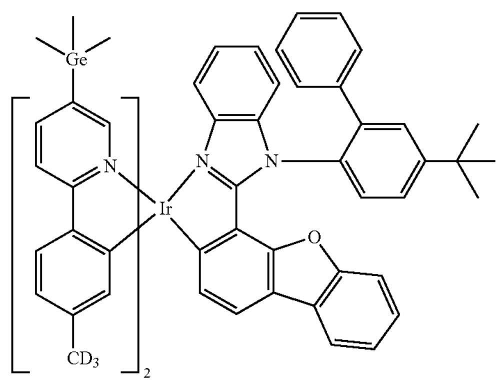
693
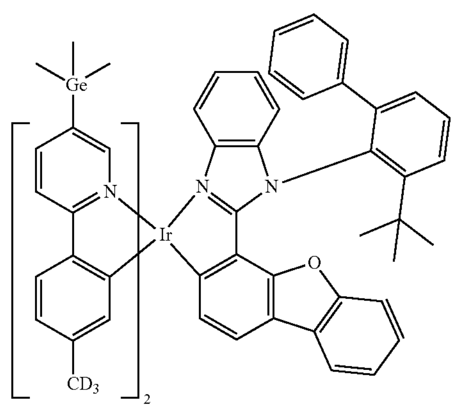
694
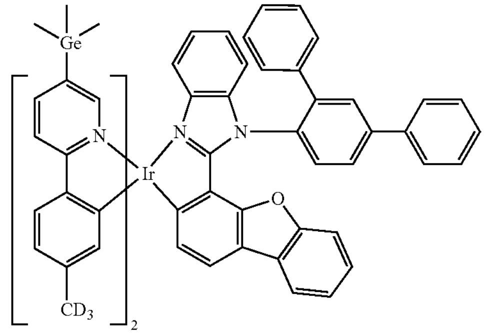

-continued
695
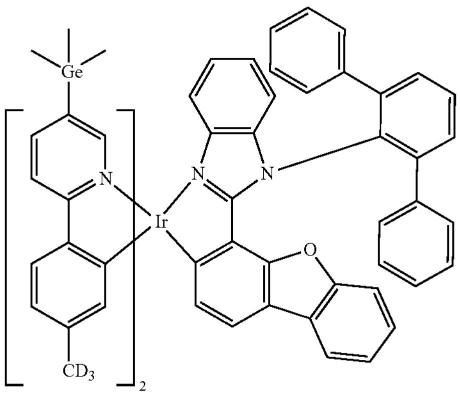
696
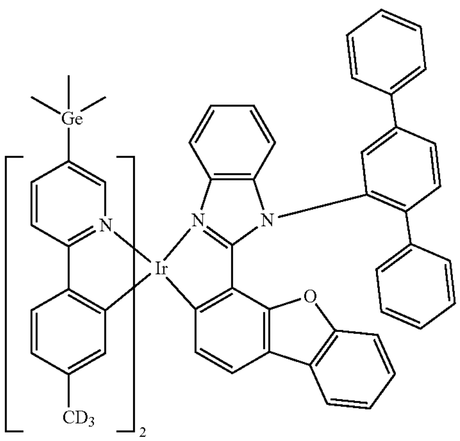
697
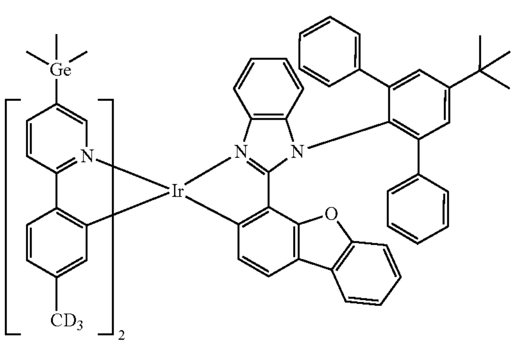
698
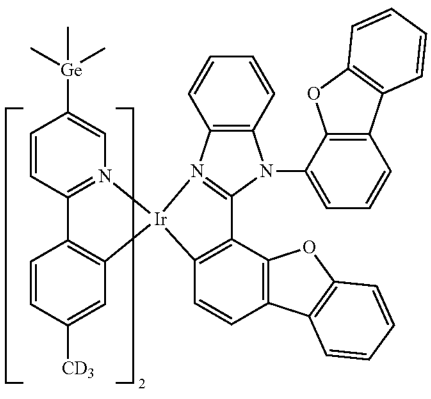
-continued
699
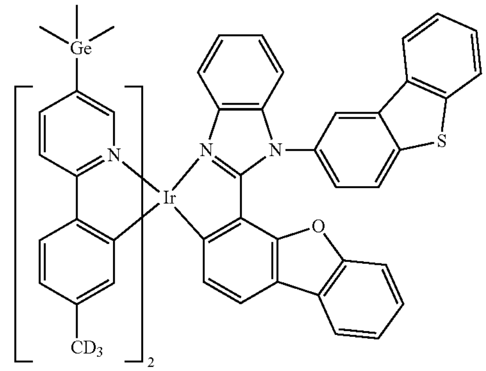
700
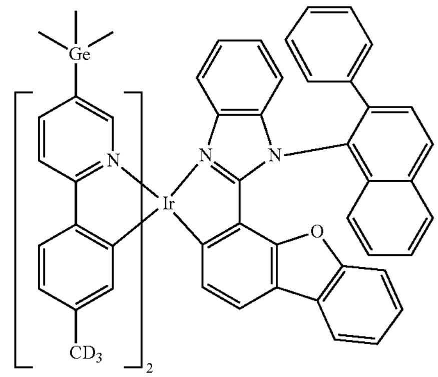
701
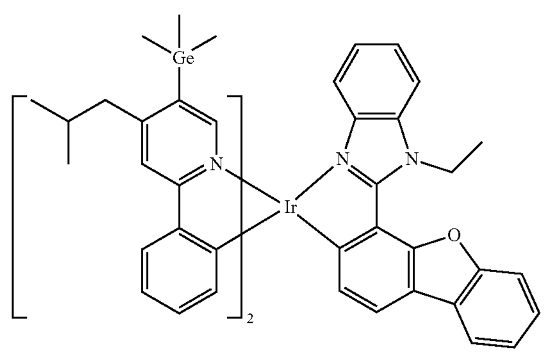
702
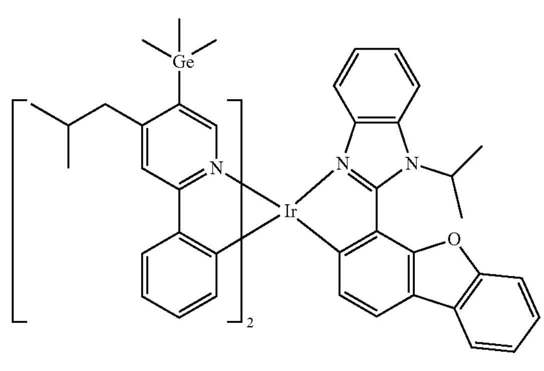

-continued
703
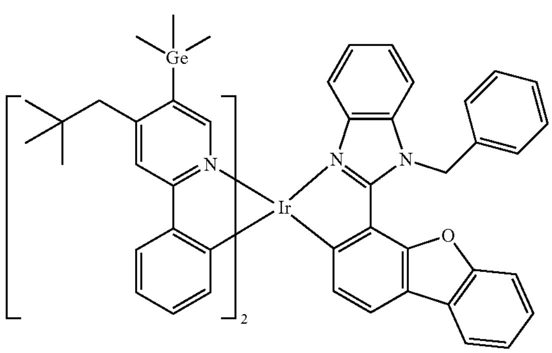
704
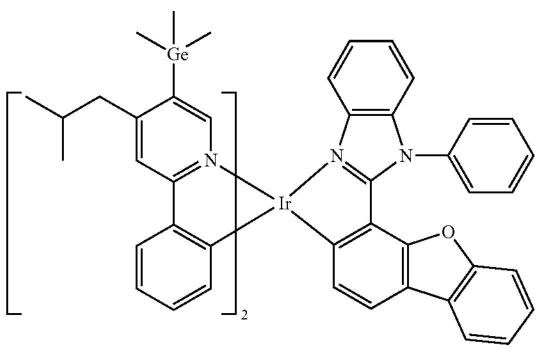
705
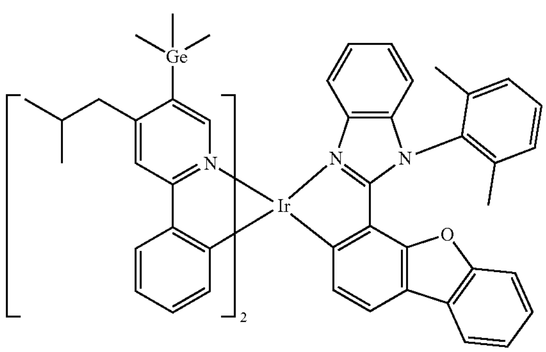
706
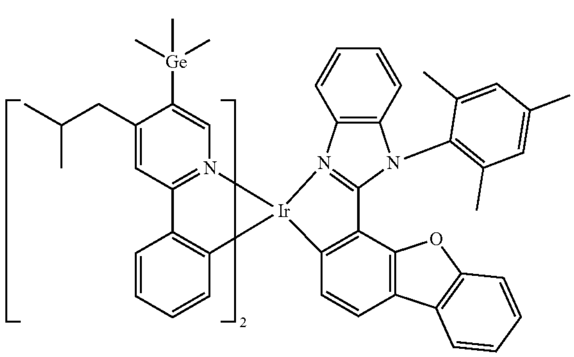
-continued
707
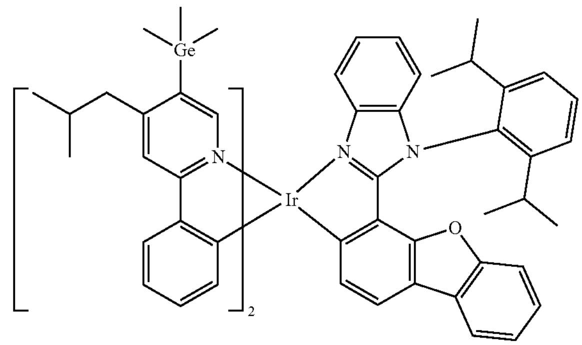
708
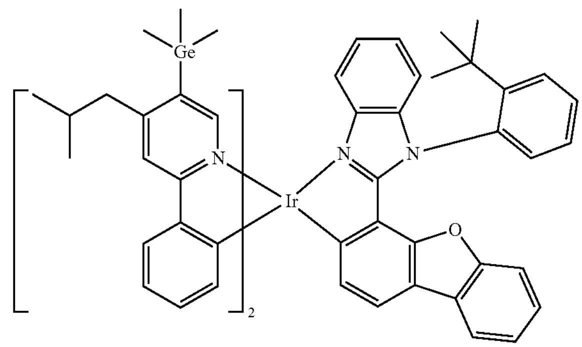
709
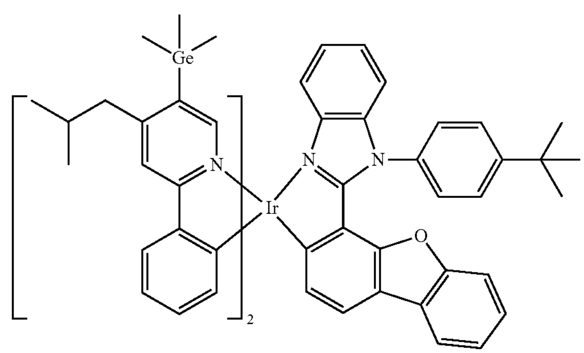
710
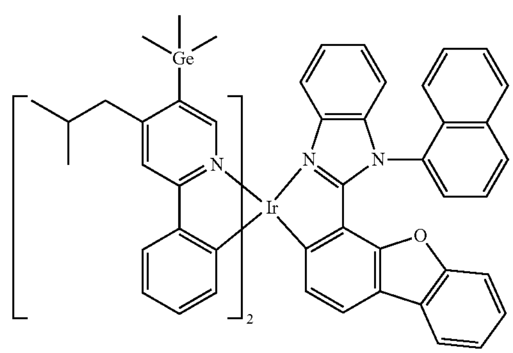

-continued
711
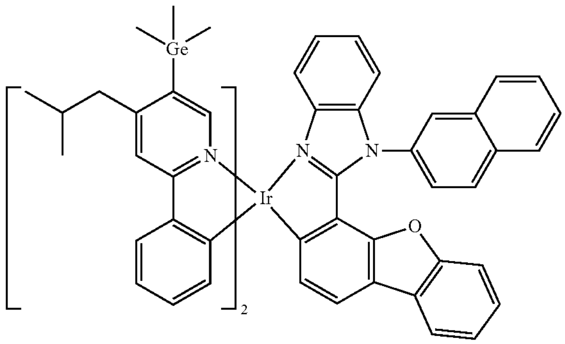
712
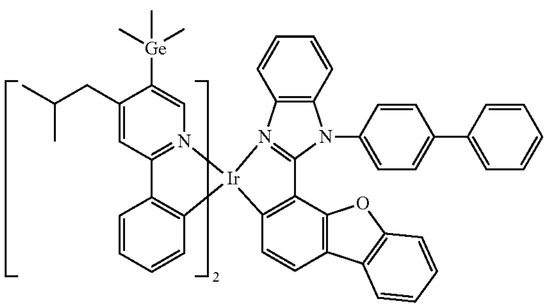
713
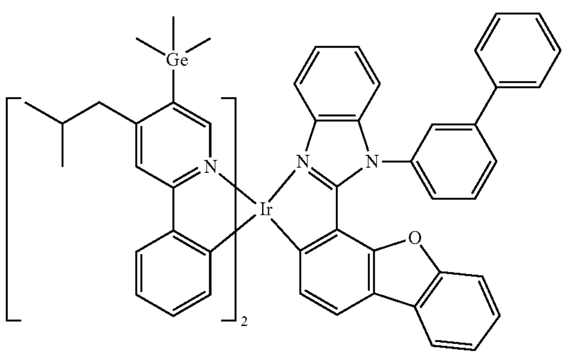
714
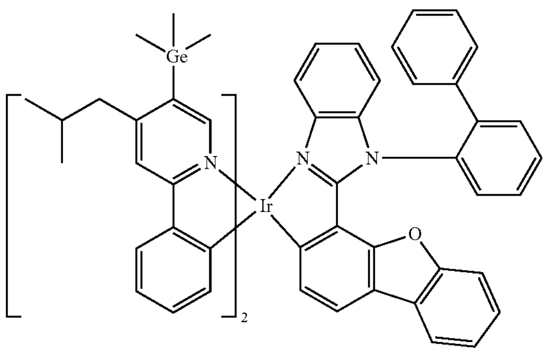
-continued
715
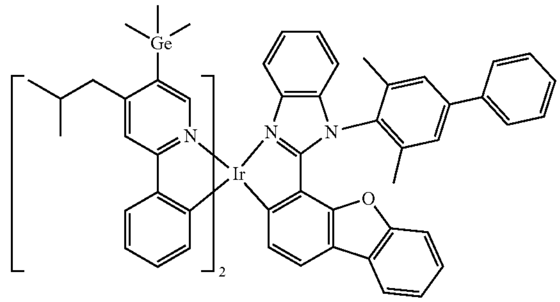
716
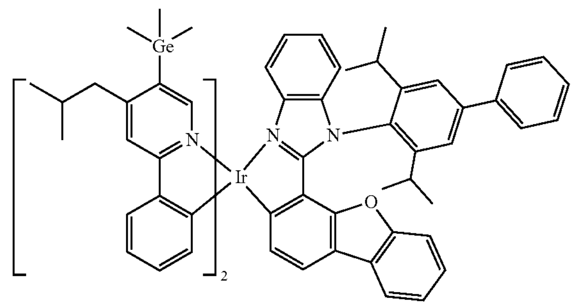
717
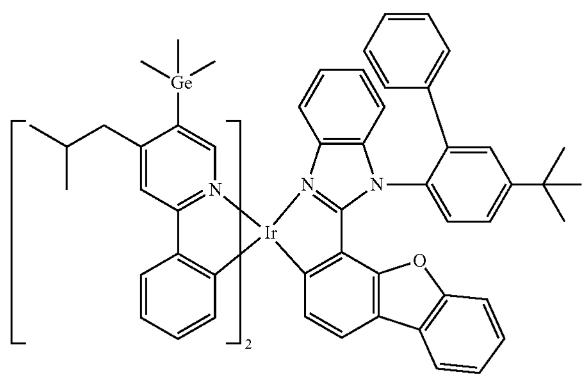
718
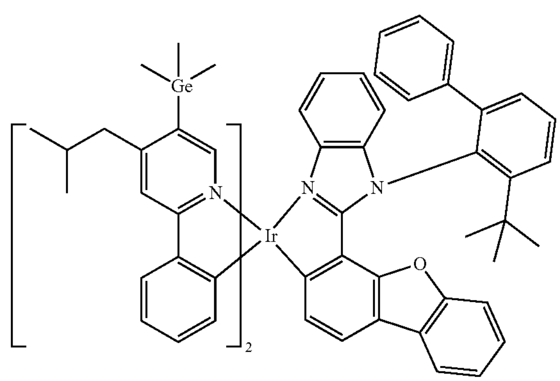

-continued
719
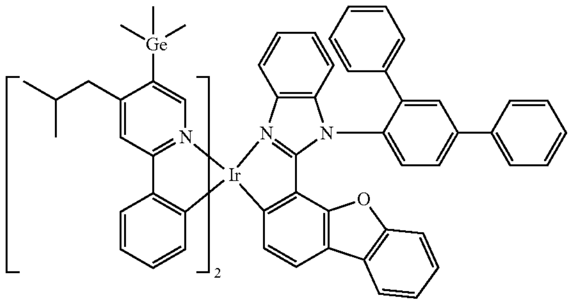
720
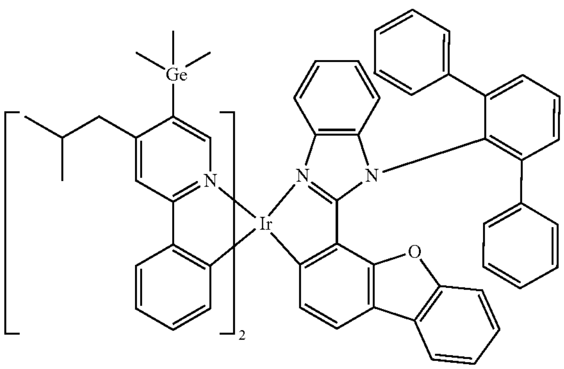
721
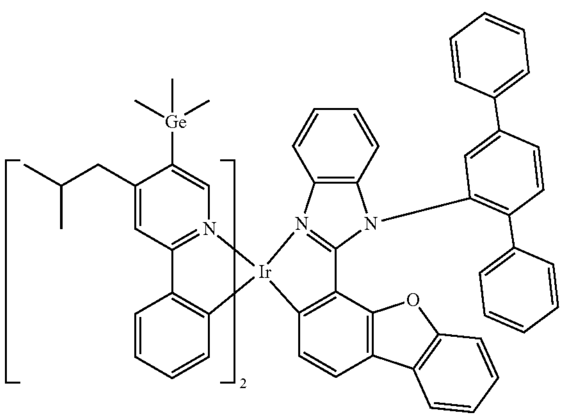
722
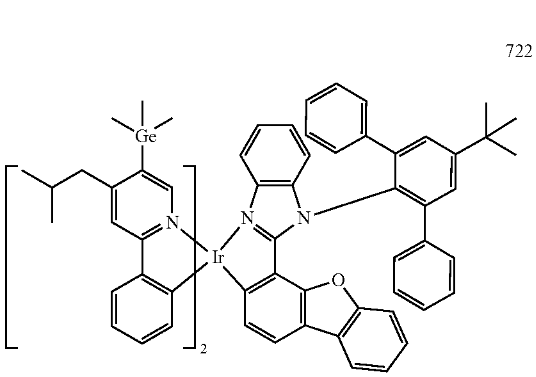
-continued
723
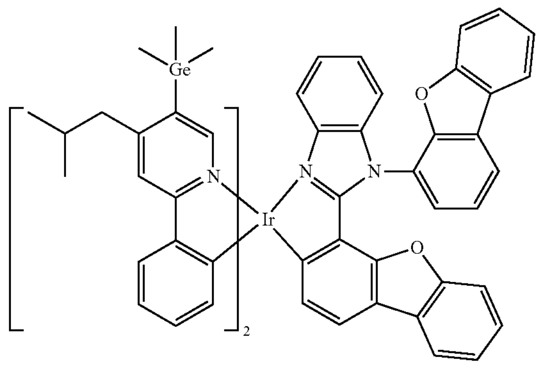
724
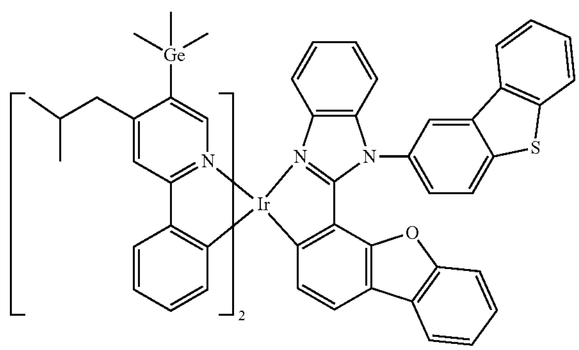
725
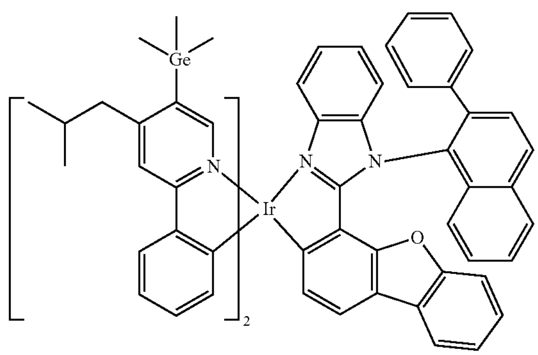
726
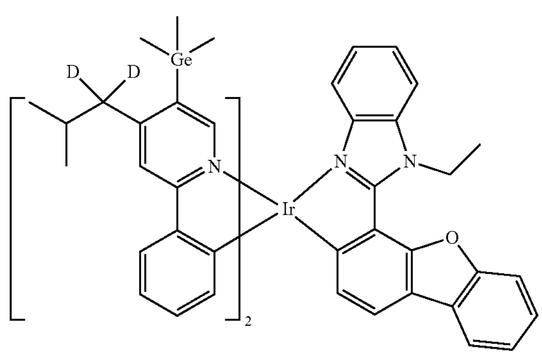

727
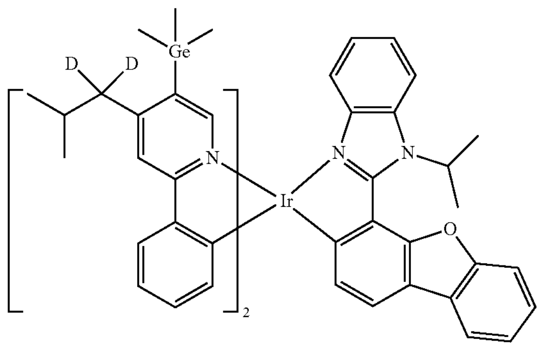
728
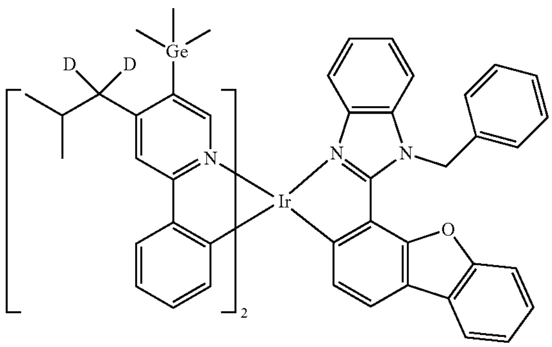
729
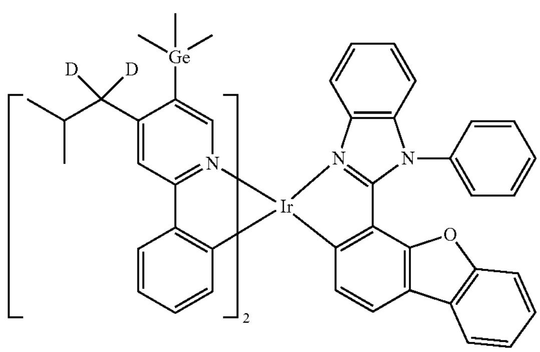
730
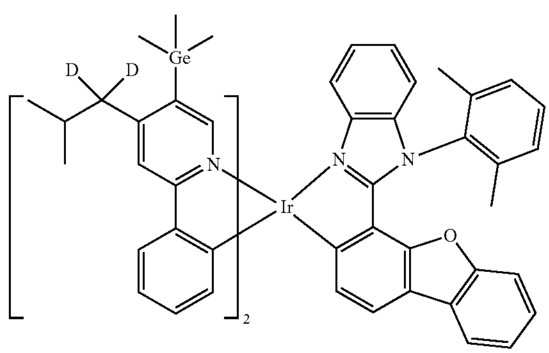
731
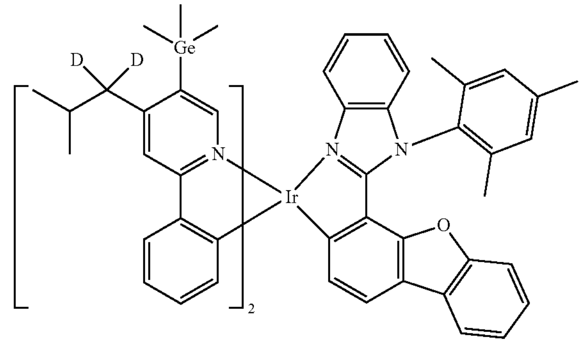
732
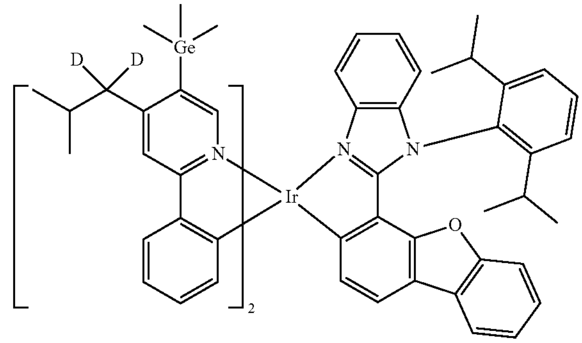
733
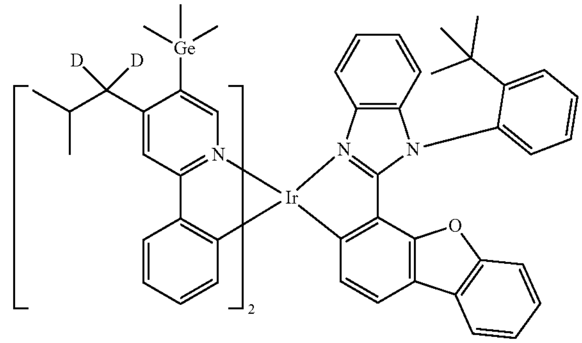
734
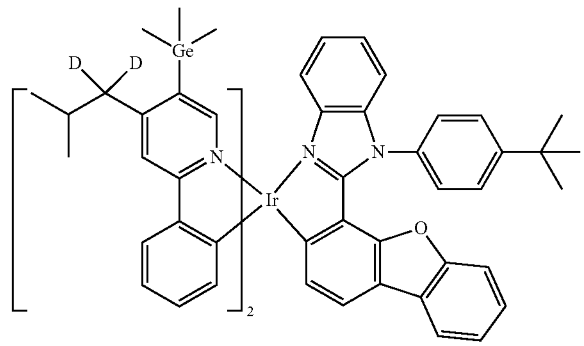

735
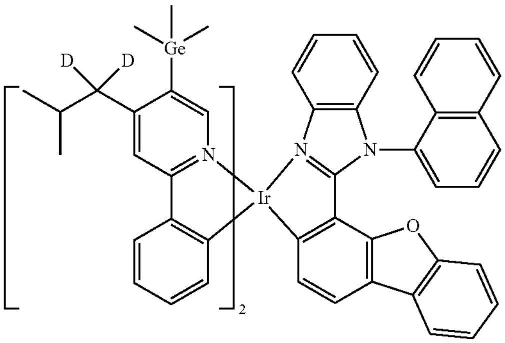
736
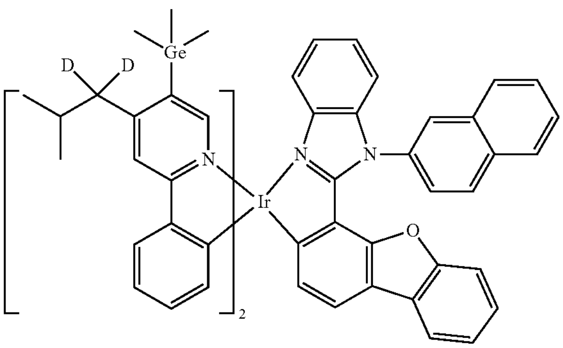
737
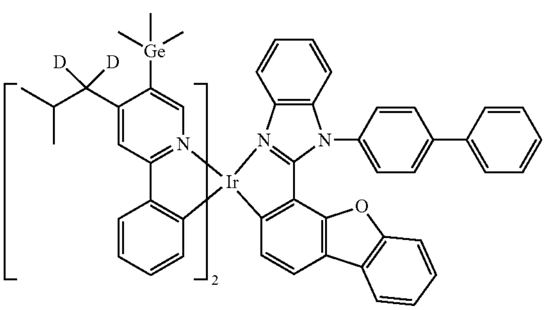
738
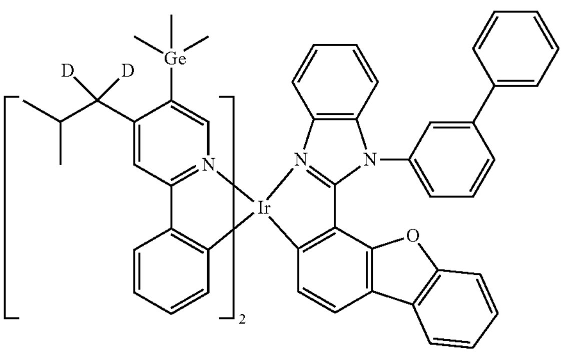
739
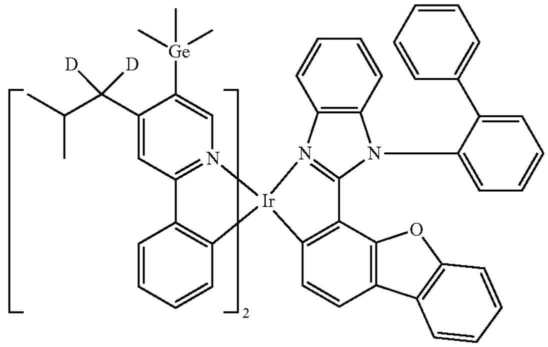
740
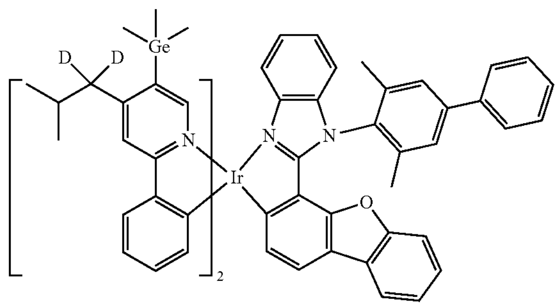
741
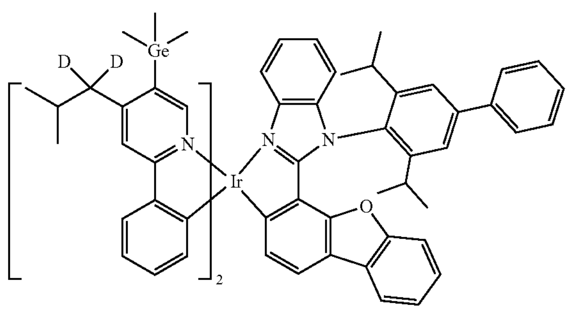
742
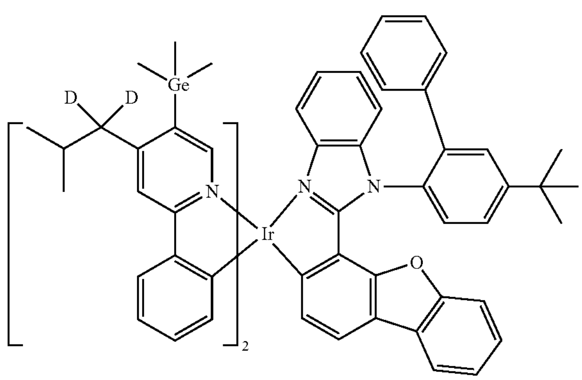

-continued
743
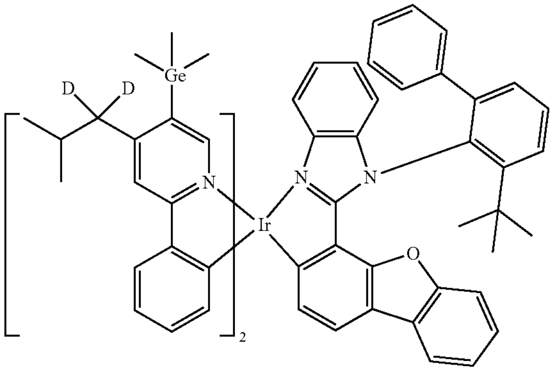
744
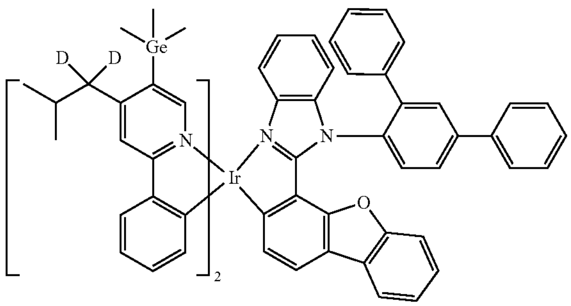
745
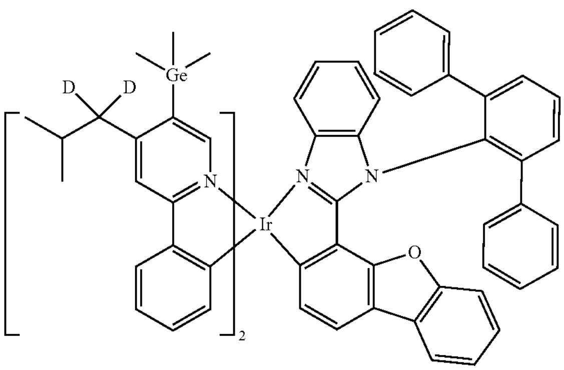
746
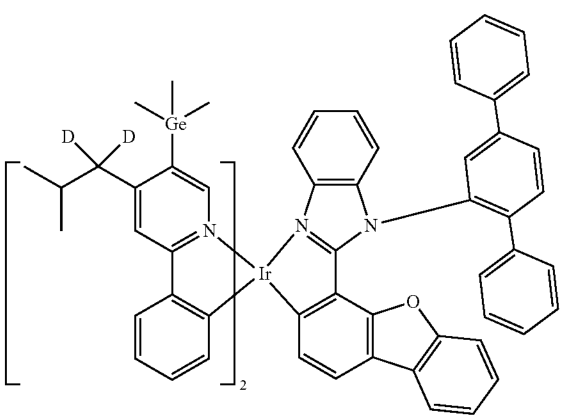
-continued
747
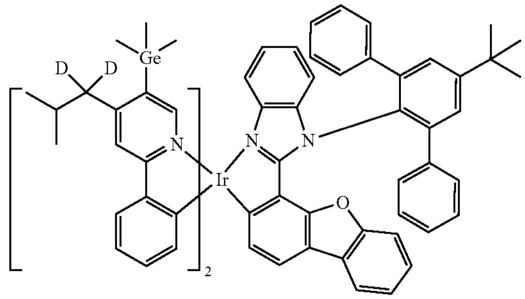
748
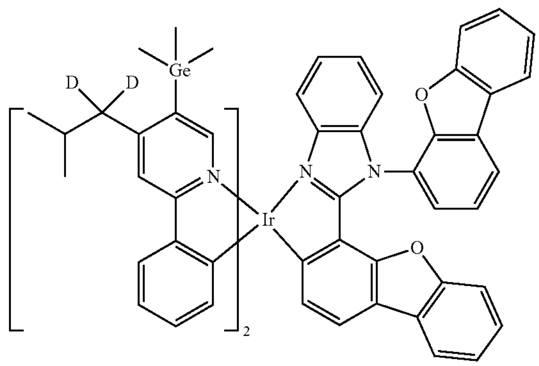
749
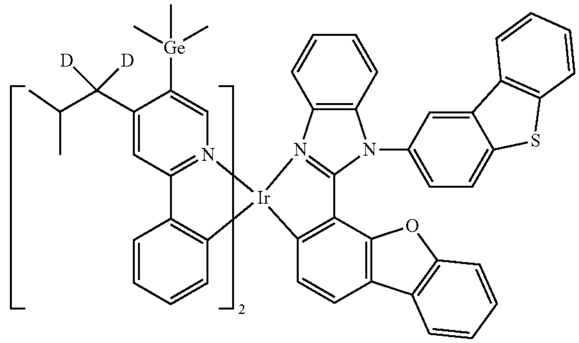
750
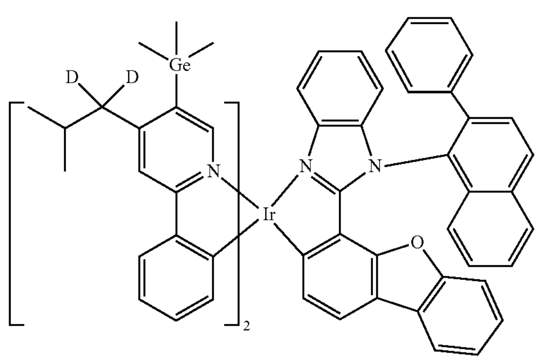

751
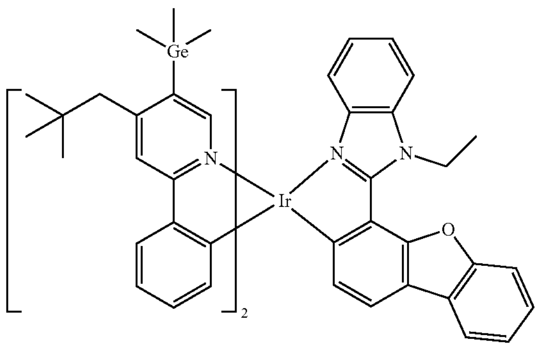
752
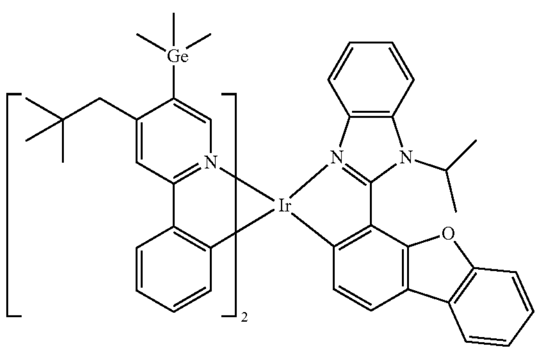
753
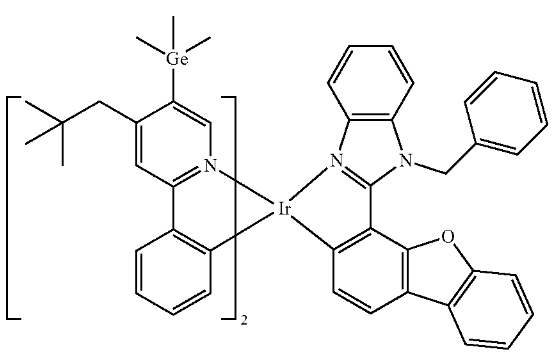
754
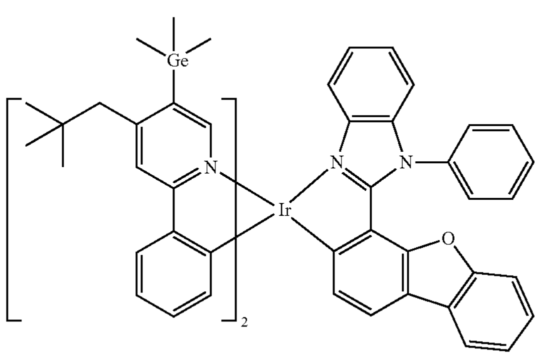
755
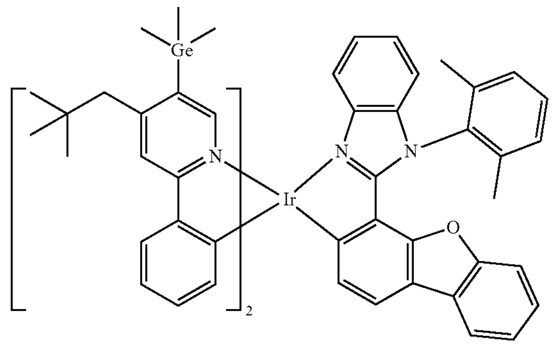
756
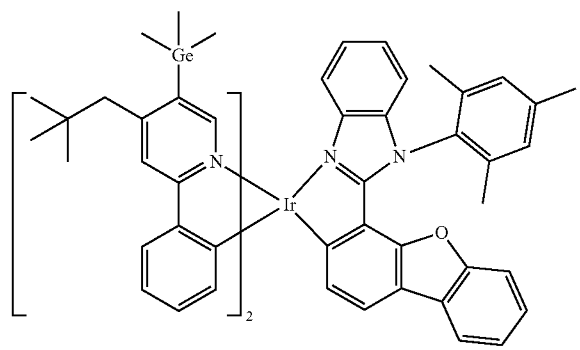
757
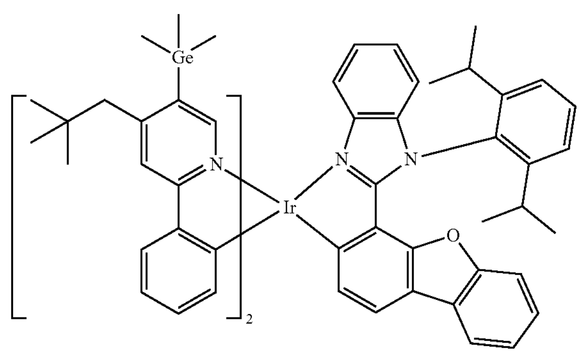
758
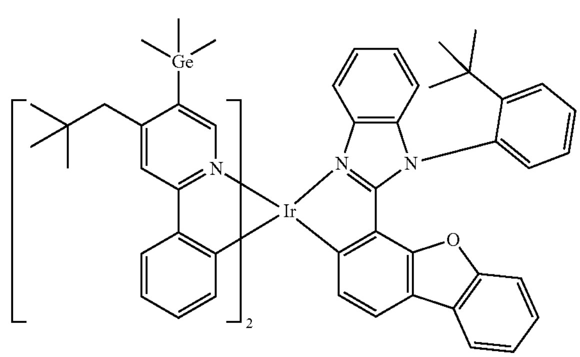

-continued
759
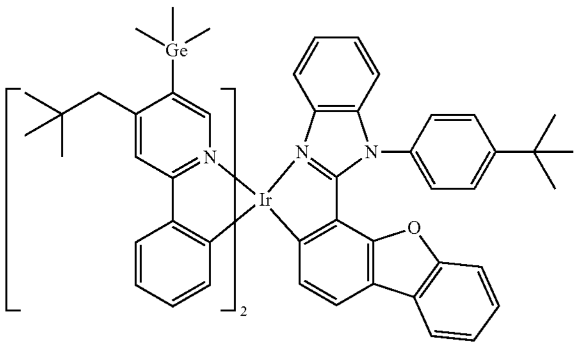
760
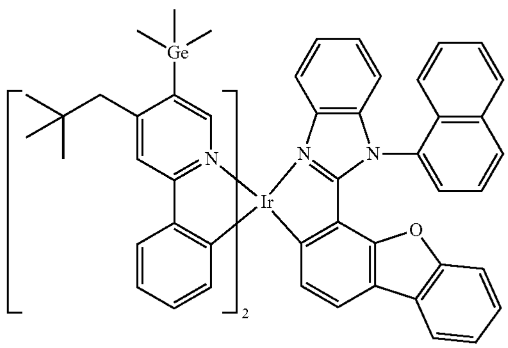
761
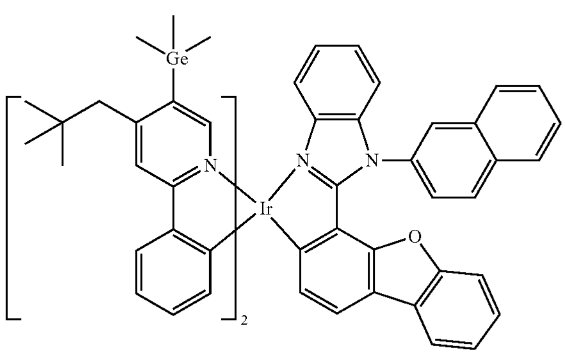
762
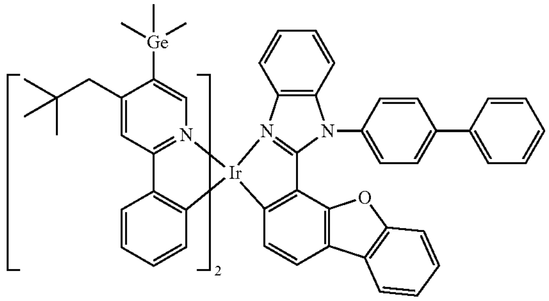
-continued
763
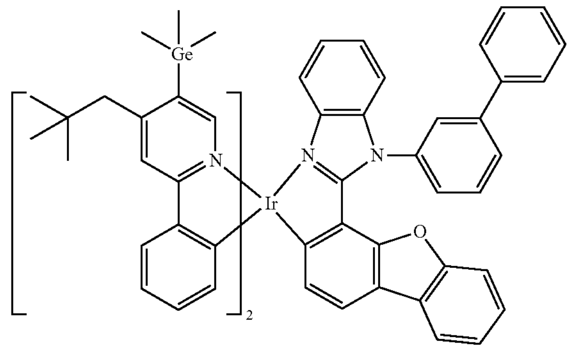
764
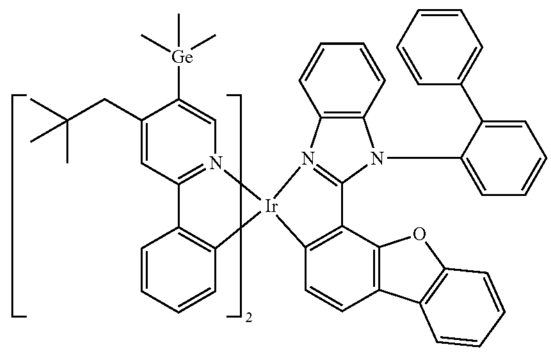
765
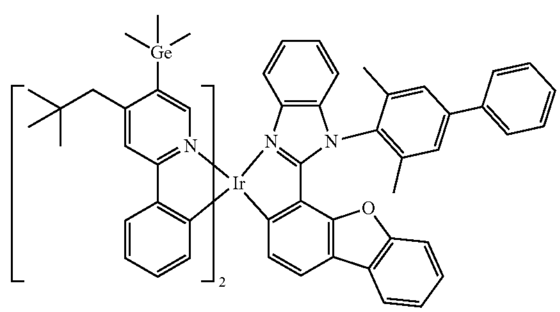
766
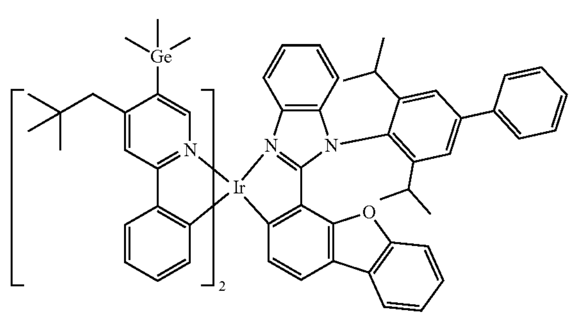

-continued
767
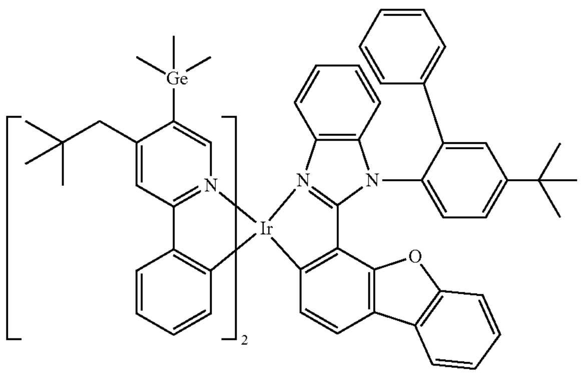
768
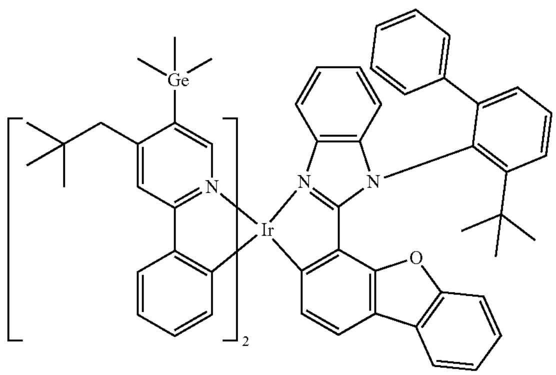
769
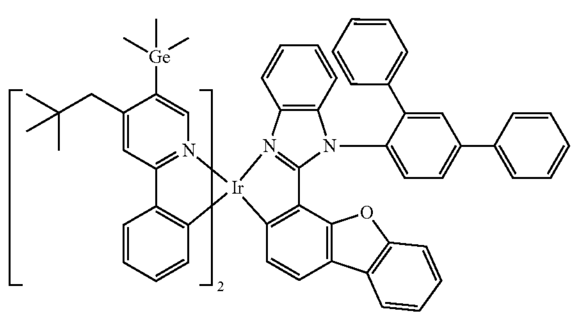
770
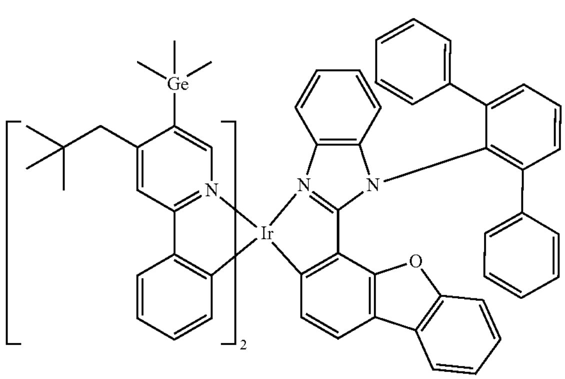
-continued
771
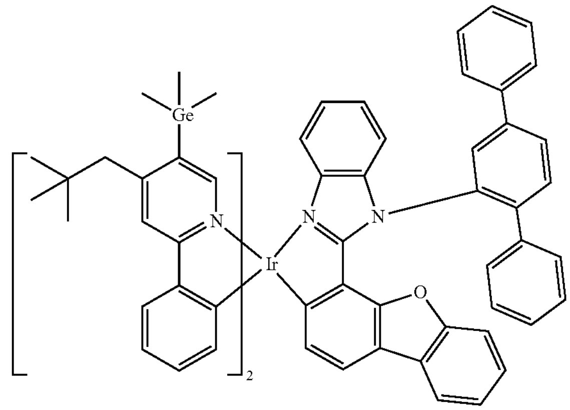
772
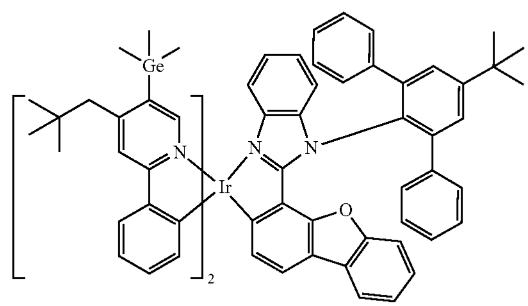
773
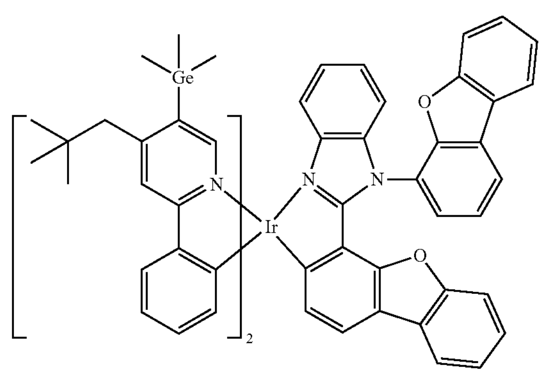
774
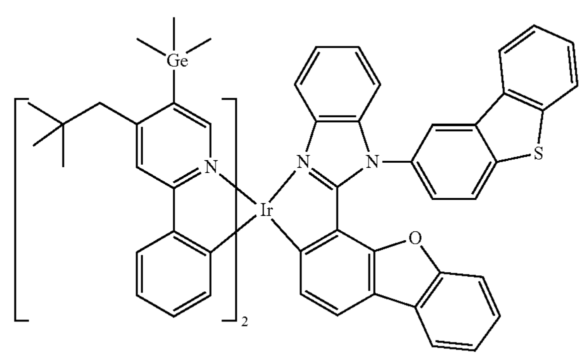

-continued
775
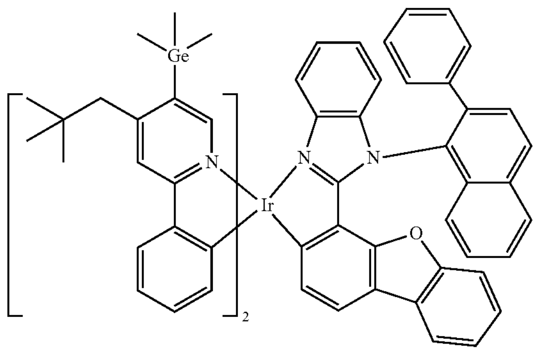
776
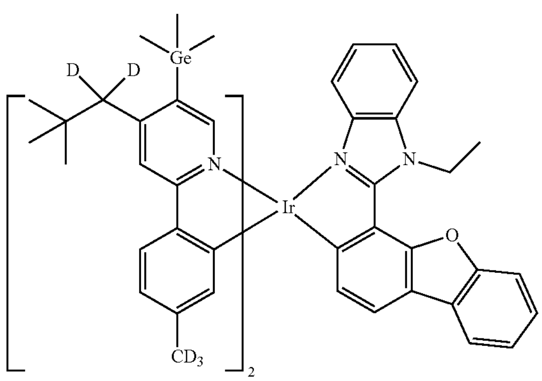
777
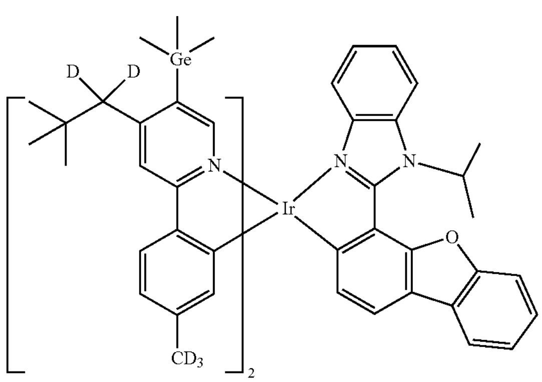
778
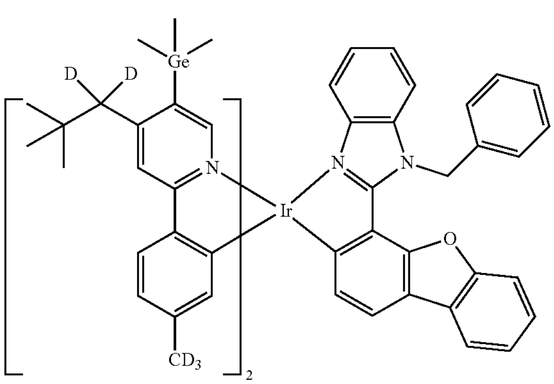
-continued
779
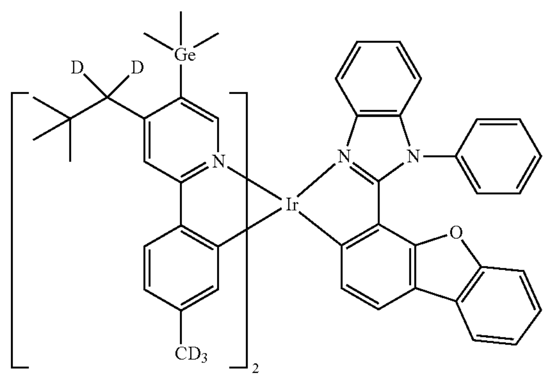
780
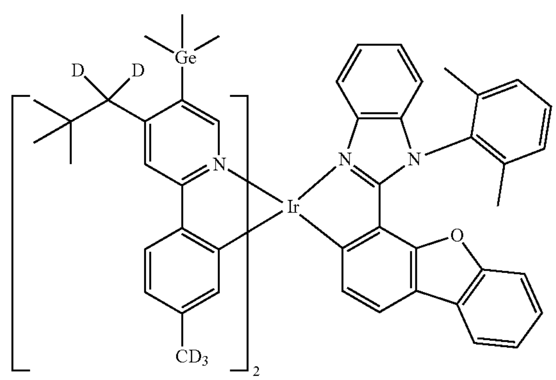
781
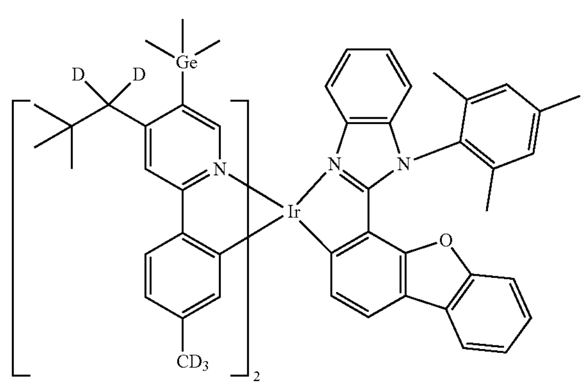
782
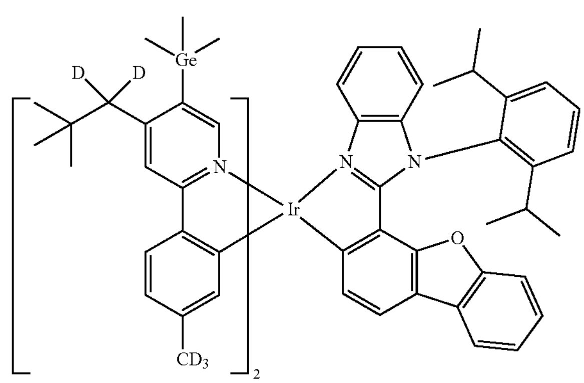

783
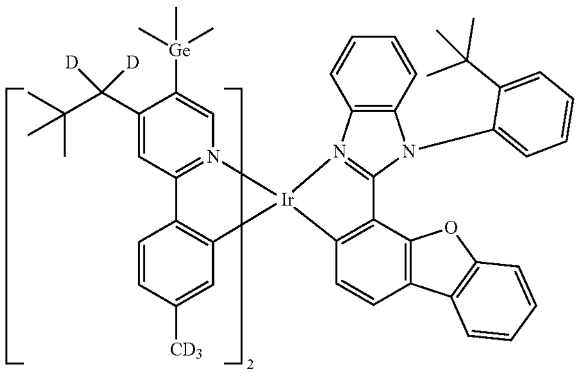
784
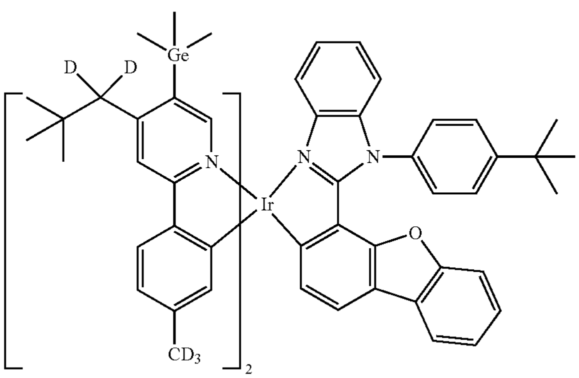
785
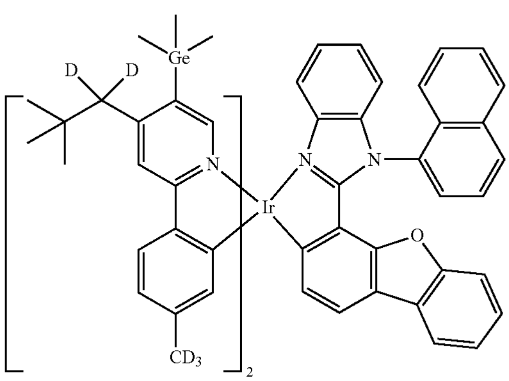
786
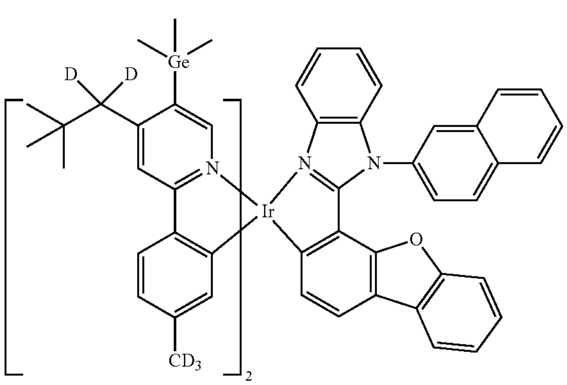
787
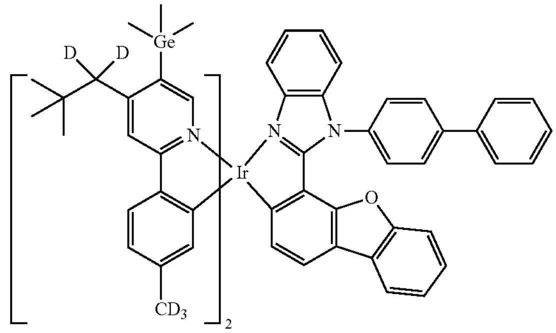
788
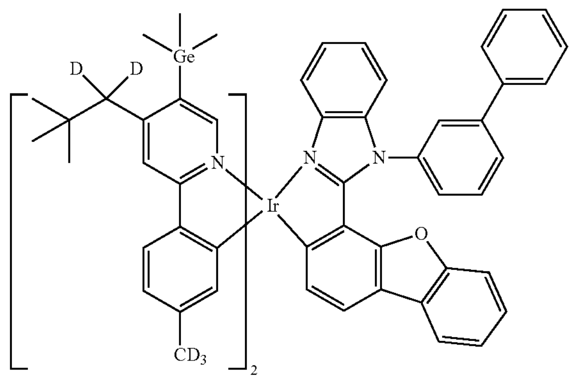
789
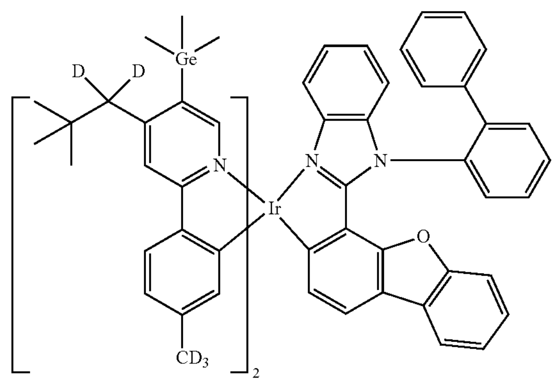
790
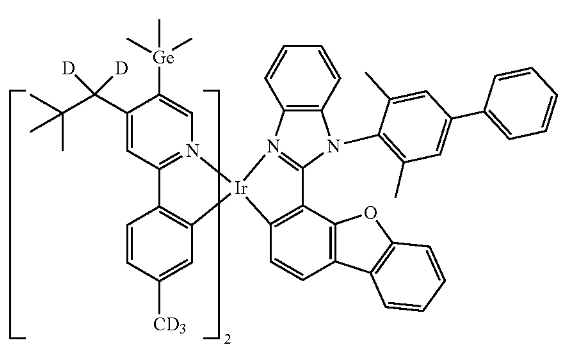

-continued
791
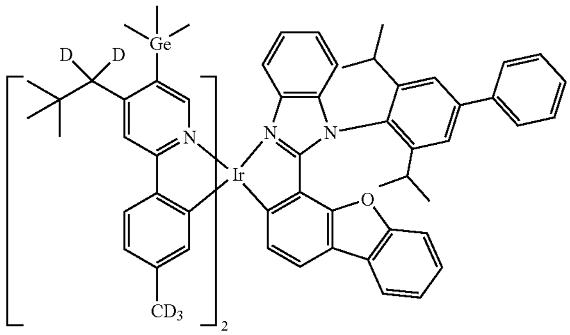
792
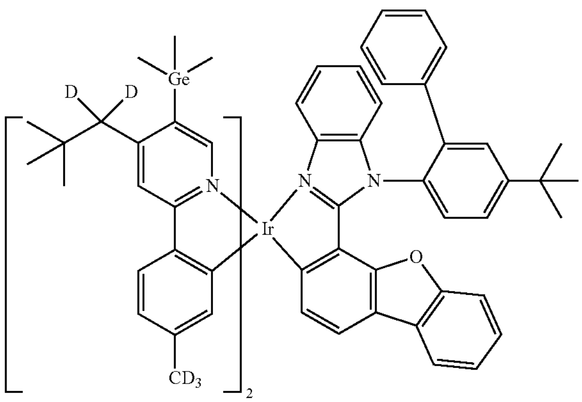
793
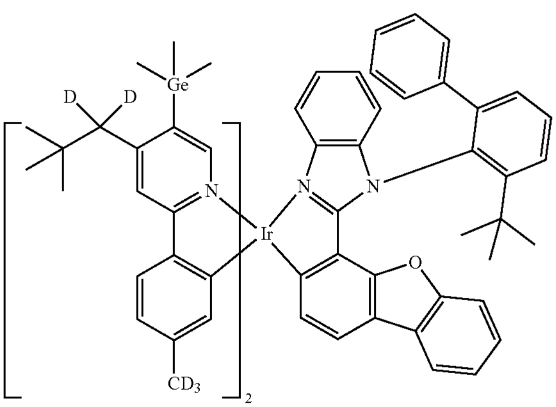
794
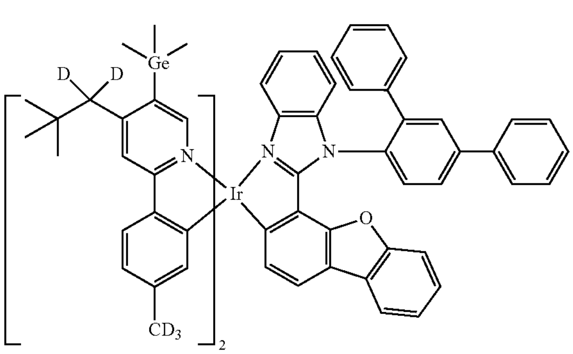
-continued
795
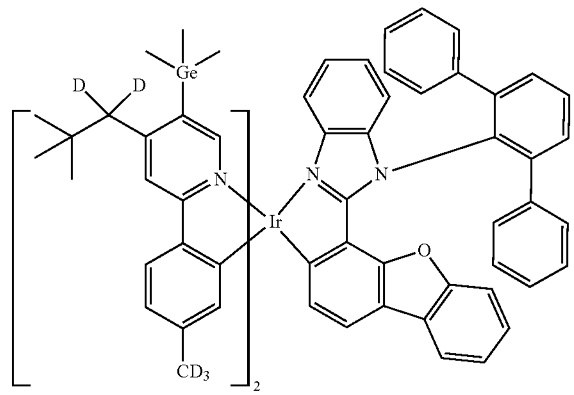
796
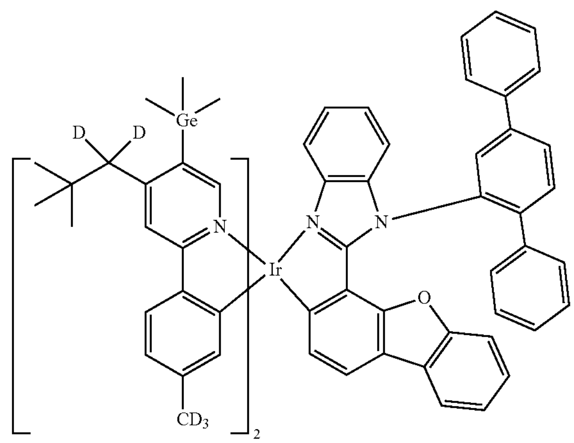
797
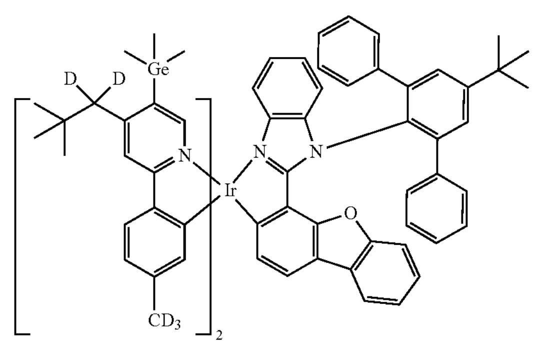
798
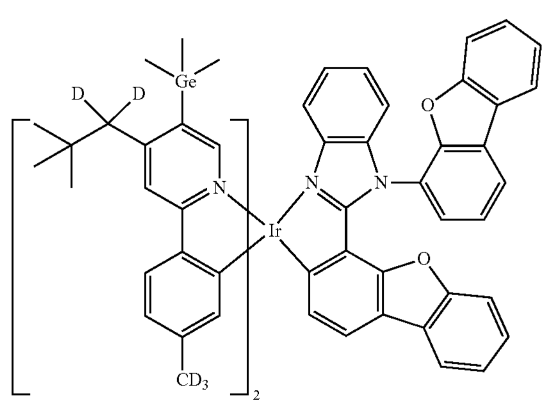

-continued
799
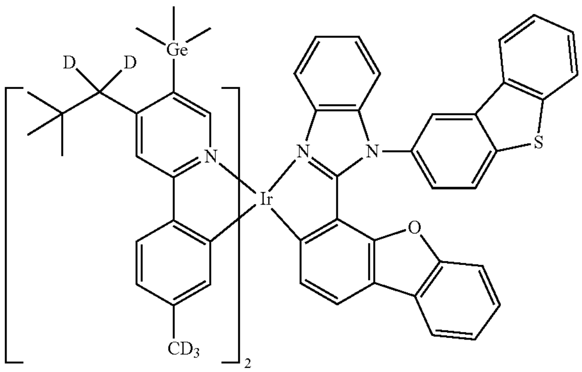
800
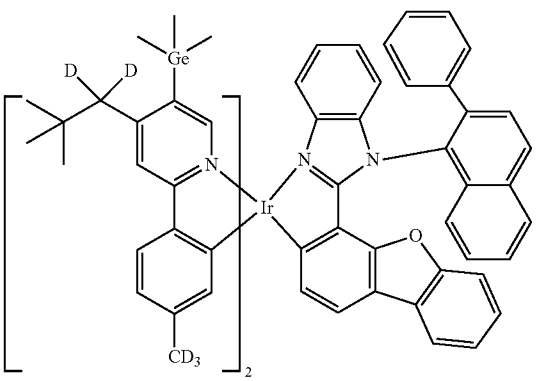
801
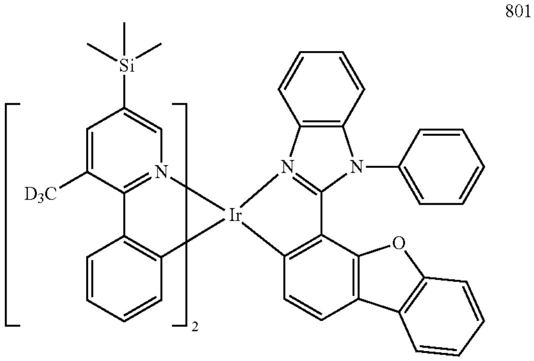
802
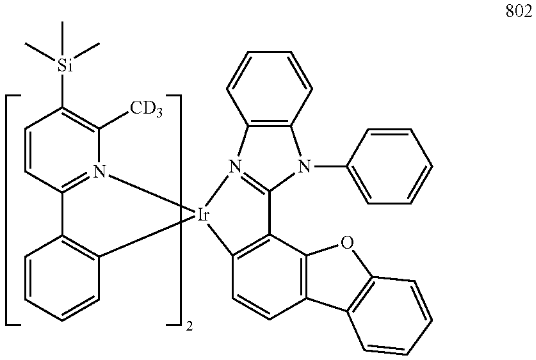
-continued
803
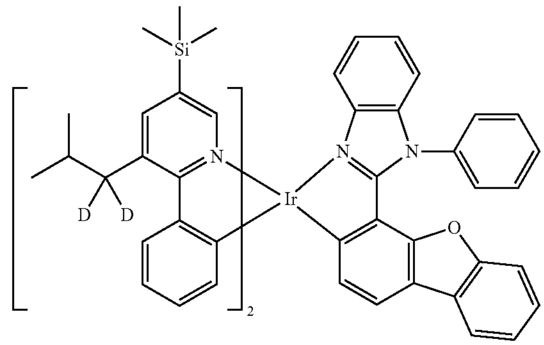
804
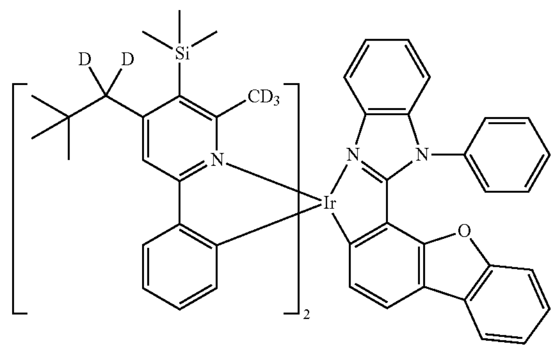
805
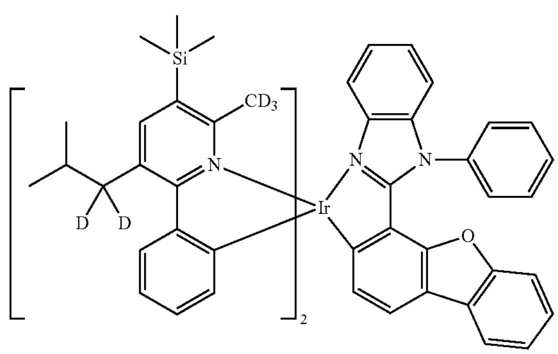
806
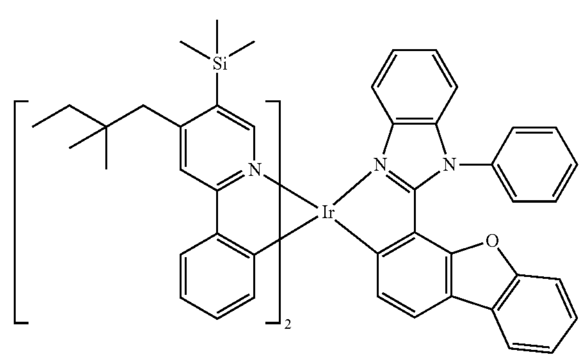

-continued
807
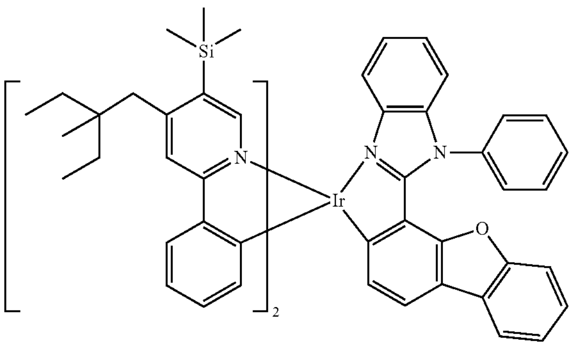
808
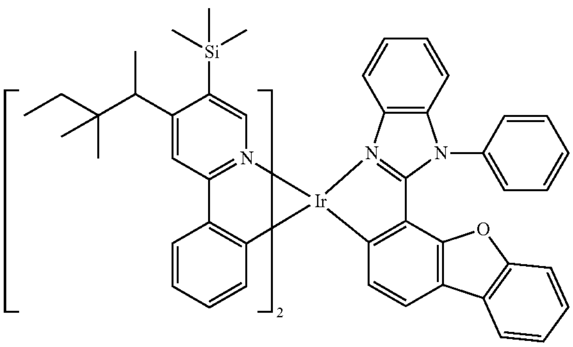
809
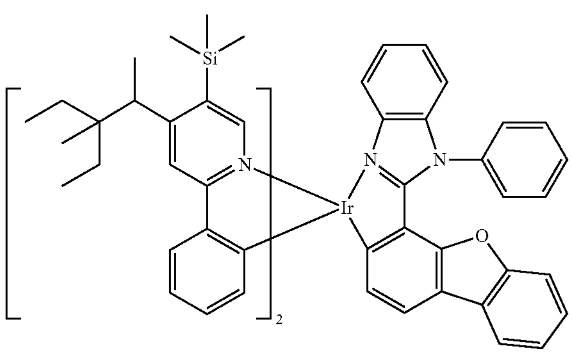
810
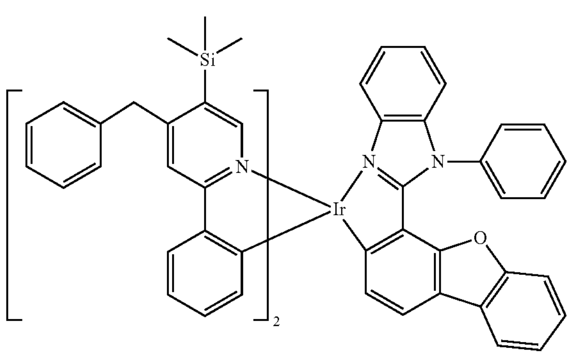
-continued
811
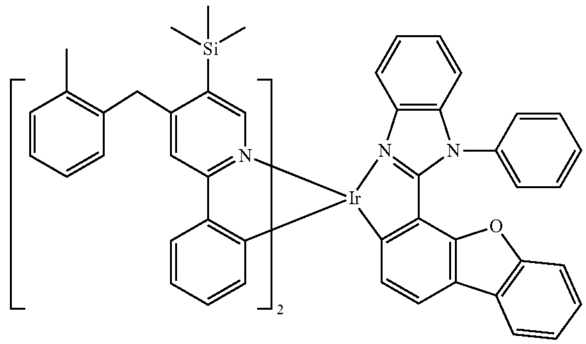
812
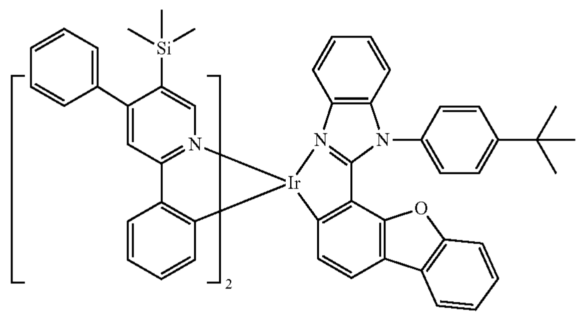
813
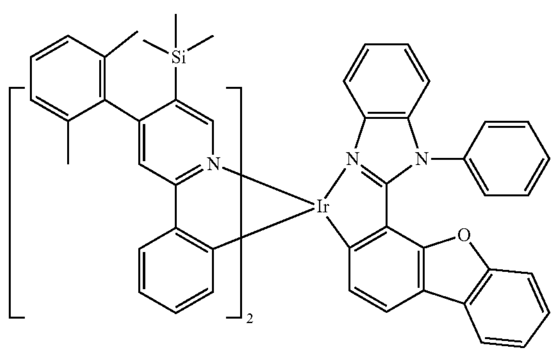
814
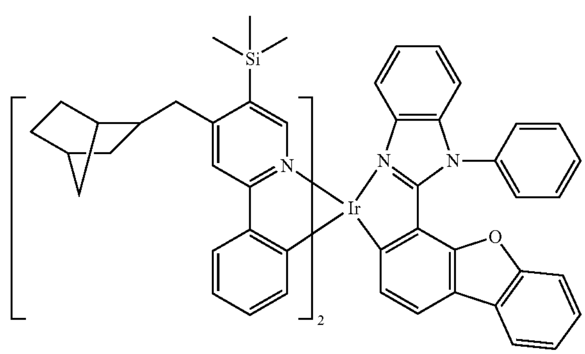

-continued
815
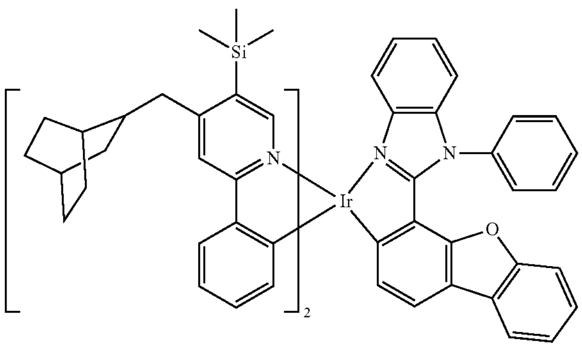
816
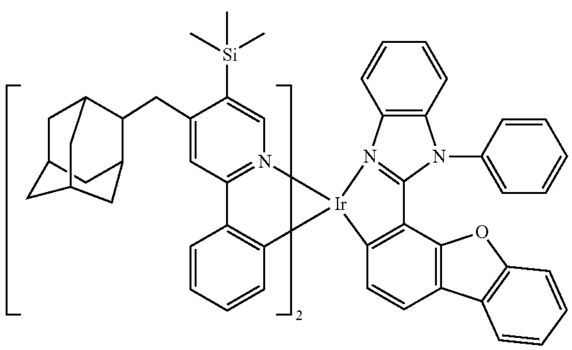
817
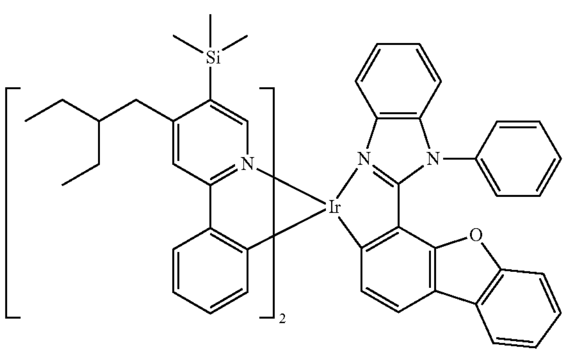
818
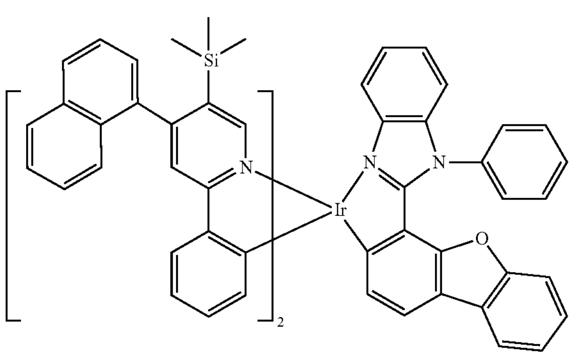
-continued
819
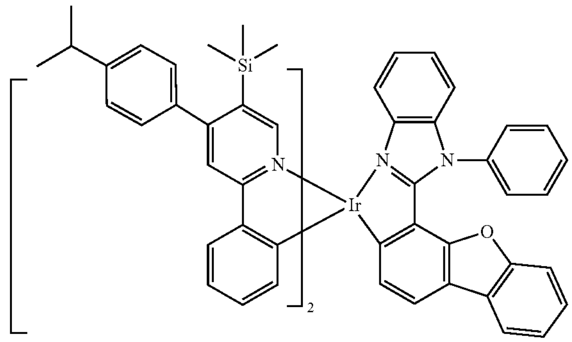
820
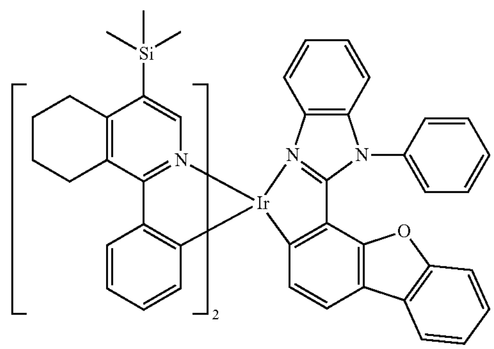
821
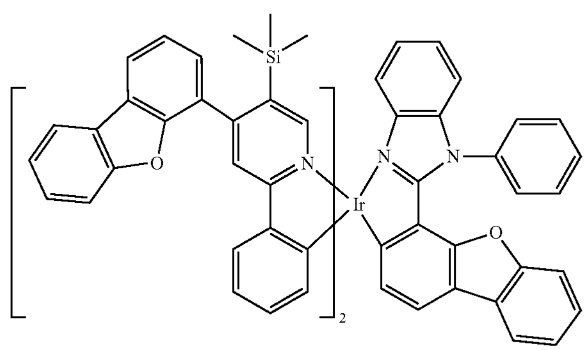
822
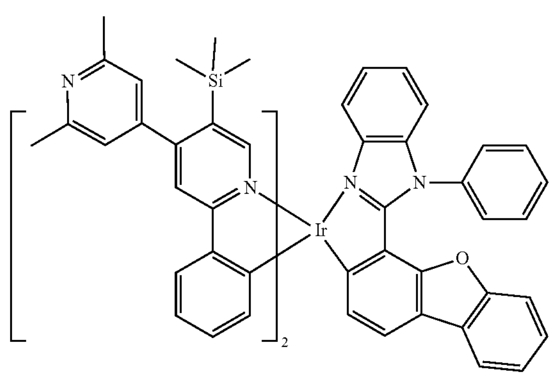

-continued
823
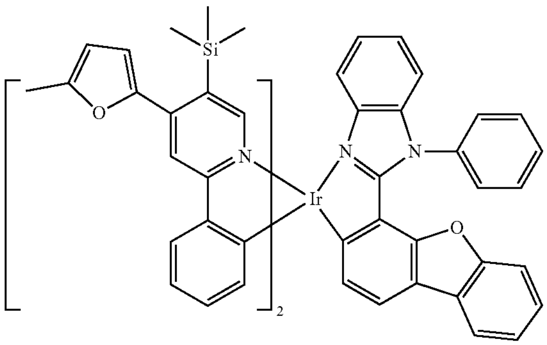
824
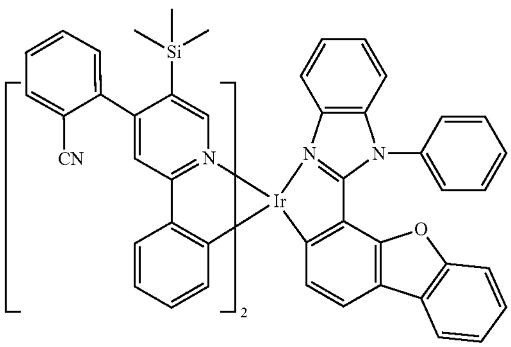
825
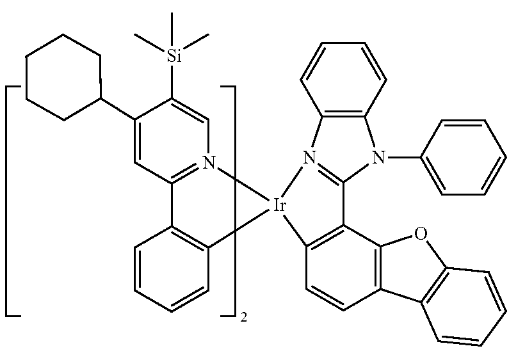
826
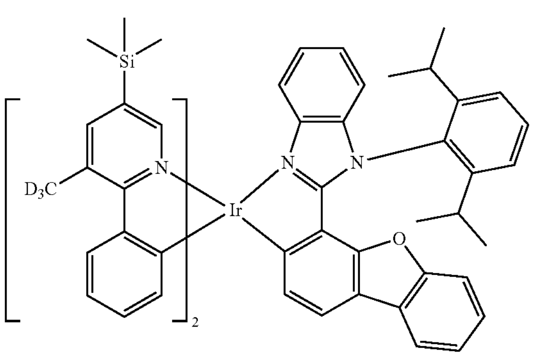
-continued
827
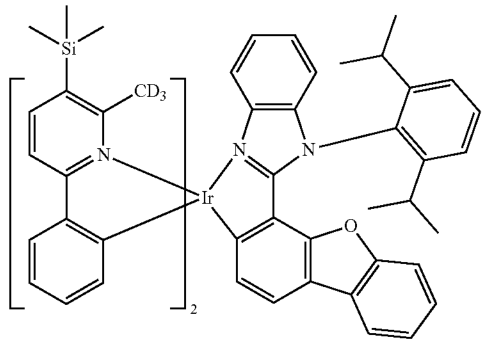
828
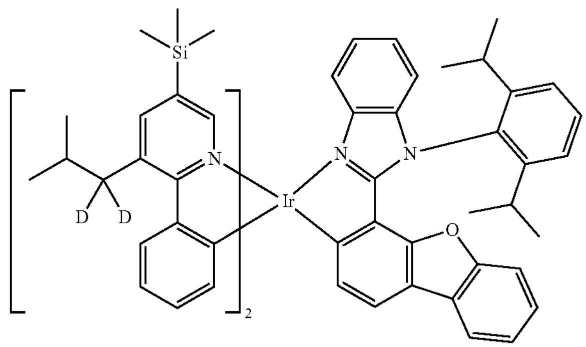
829
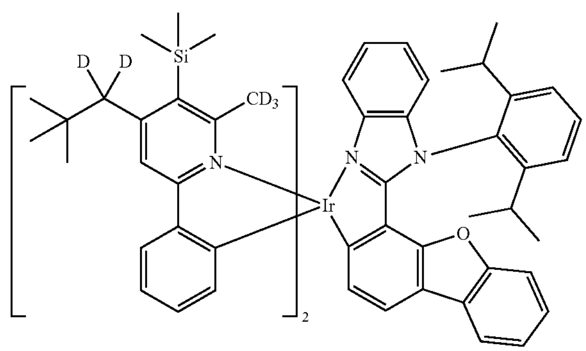
830
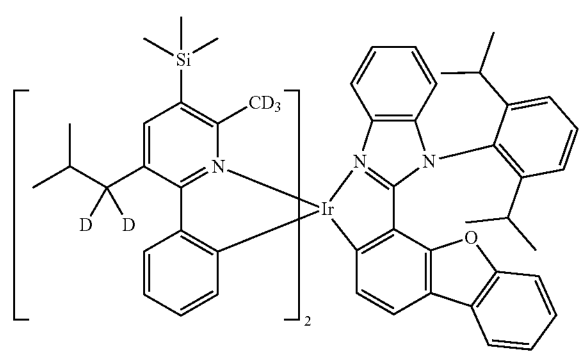

-continued
831
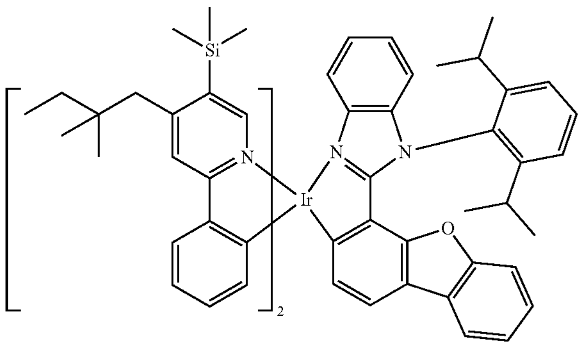
832
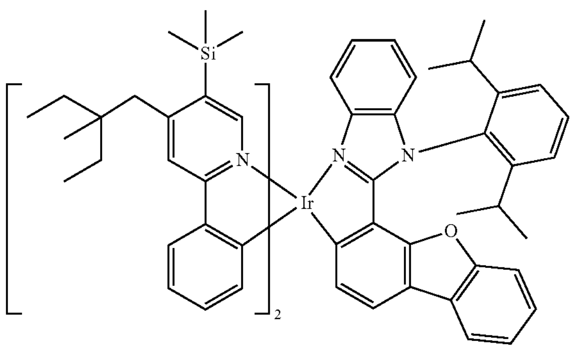
833
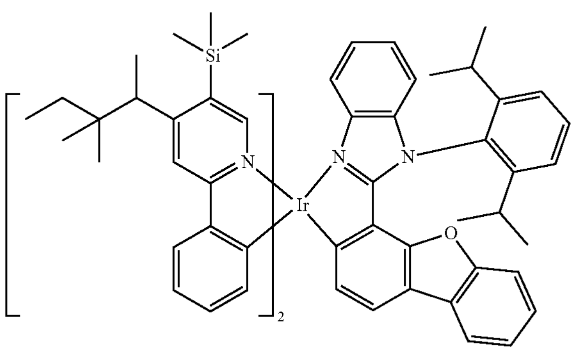
834
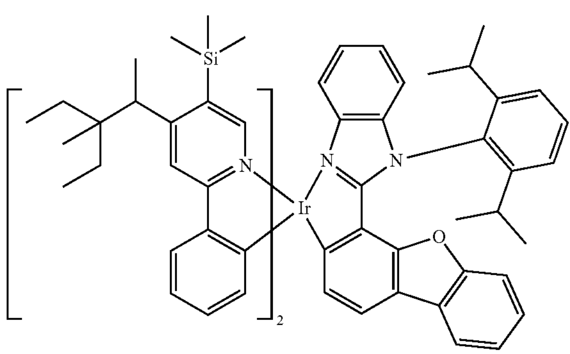
-continued
835
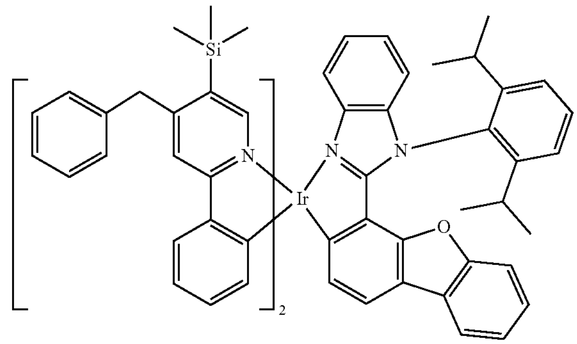
836
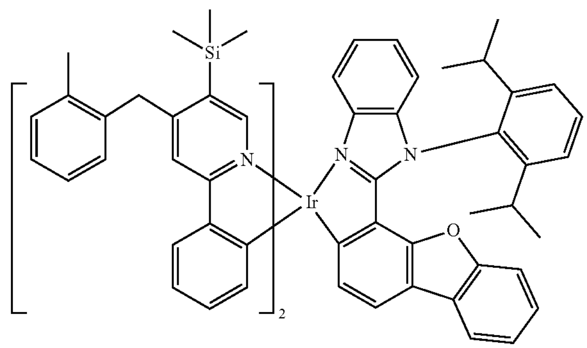
837
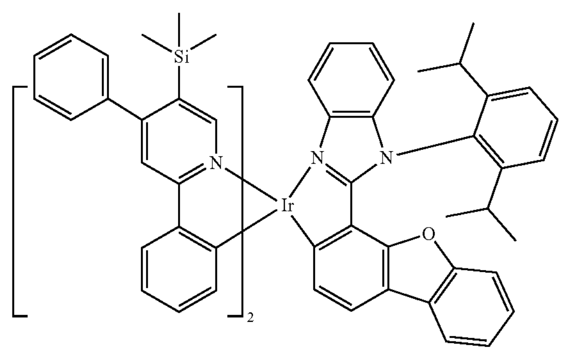
838
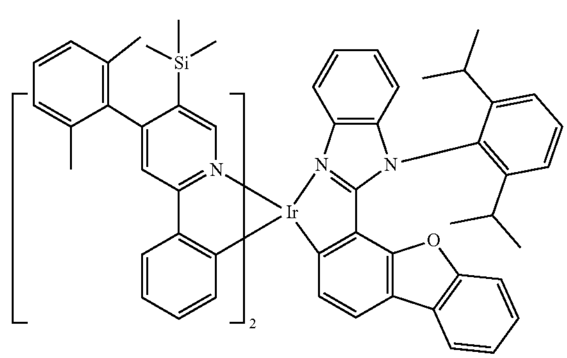

-continued
839
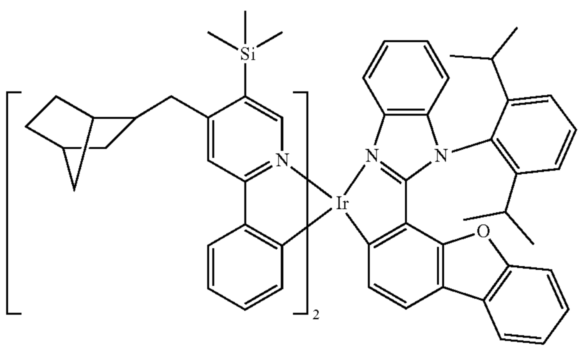
840
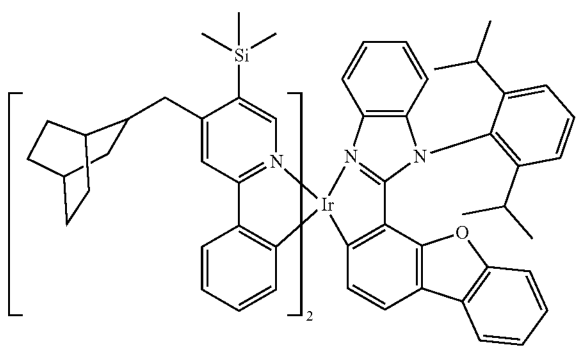
841
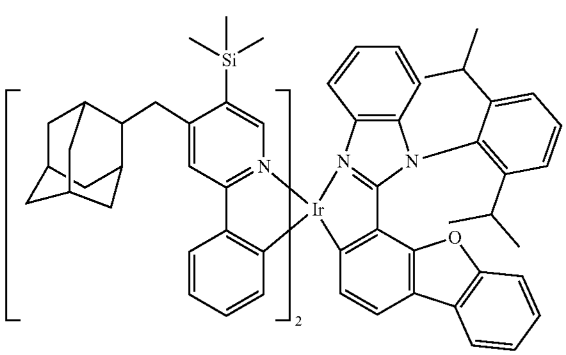
842
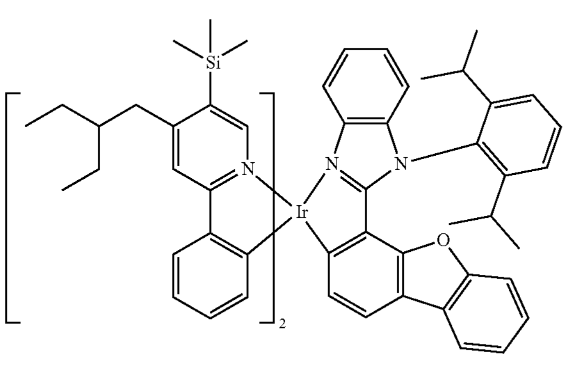
-continued
843
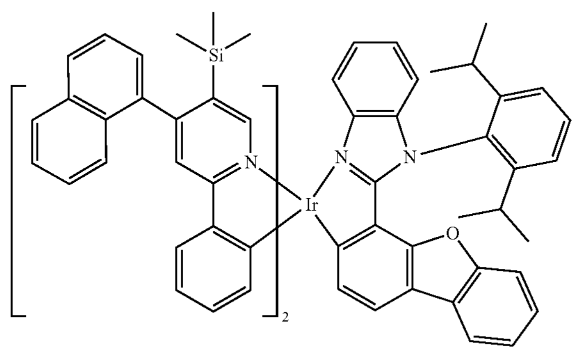
844
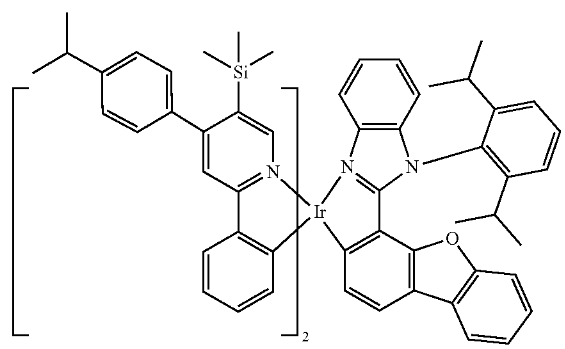
845
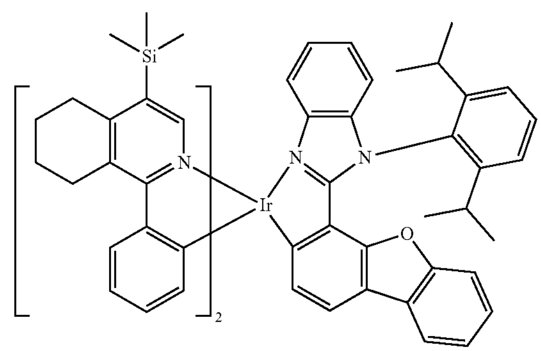
846
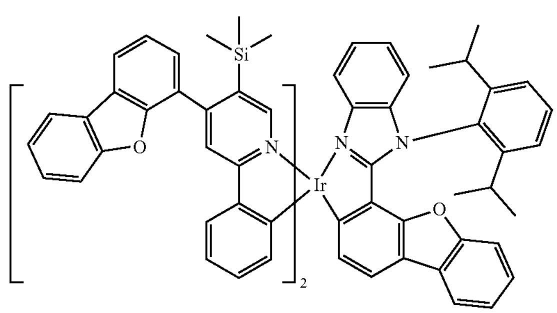

847
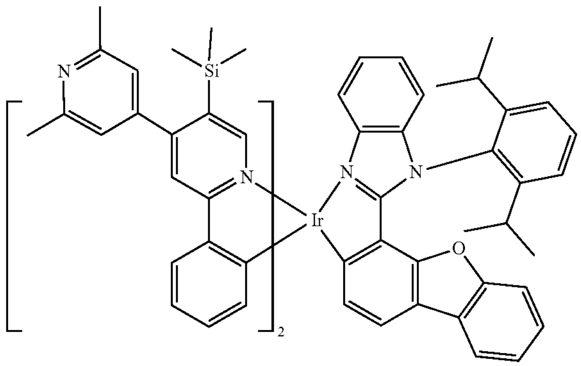
848
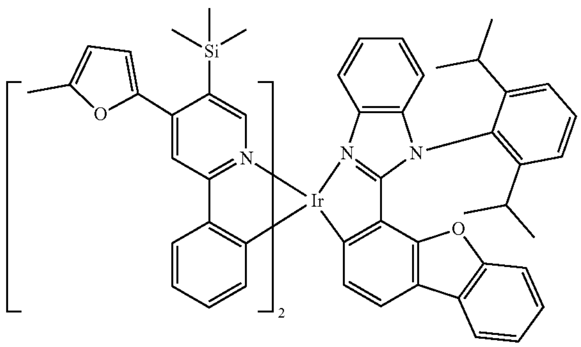
849
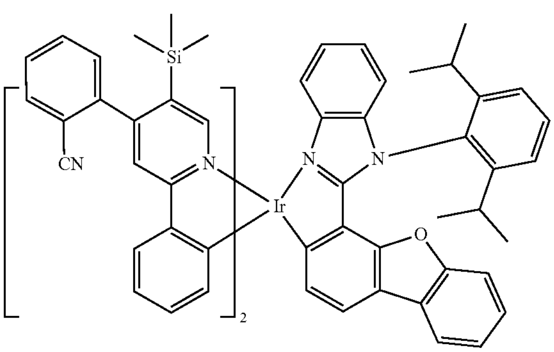
850
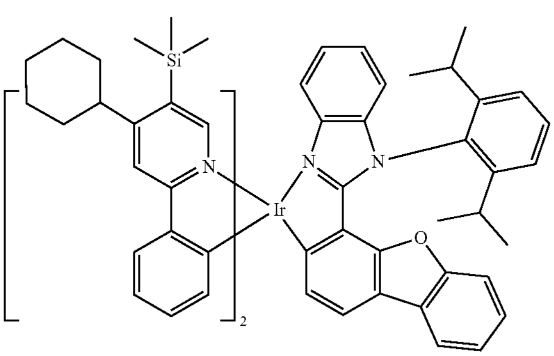
851
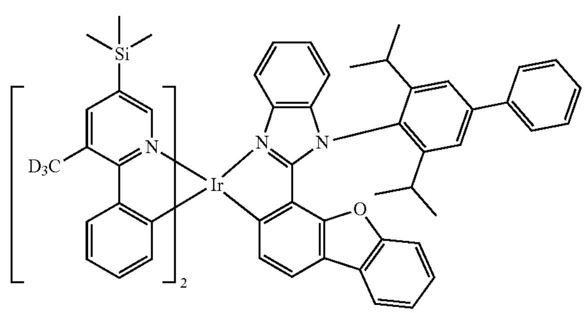
852
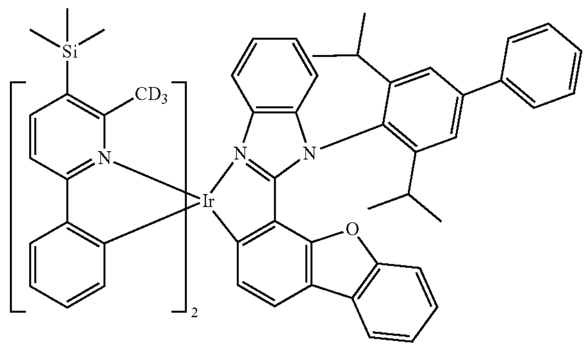
853
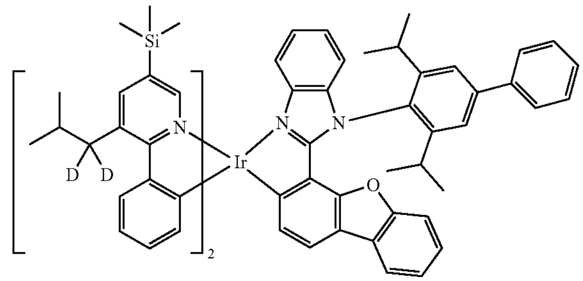
854
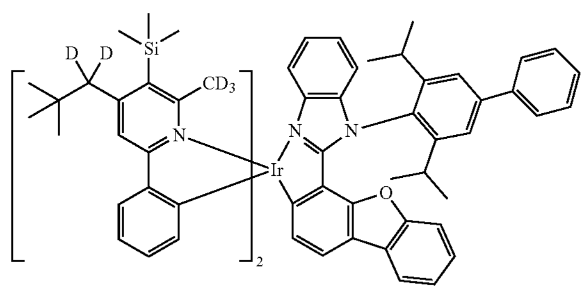
855
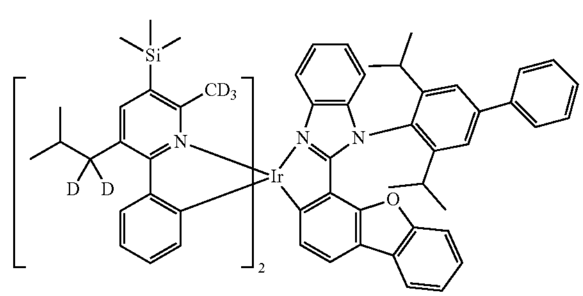

-continued
856
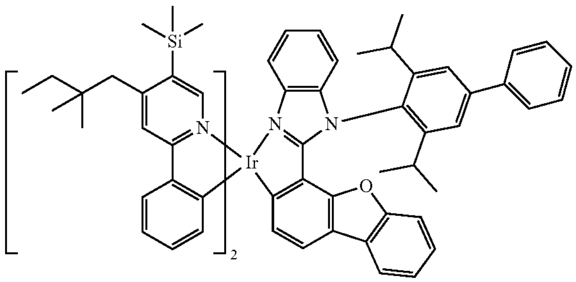
857
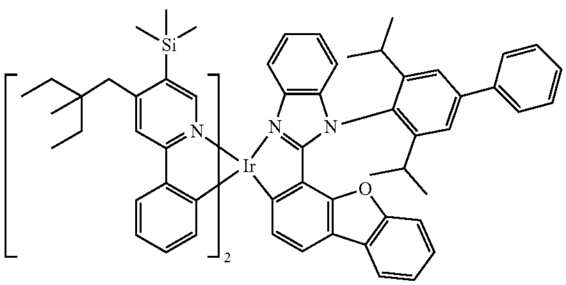
858
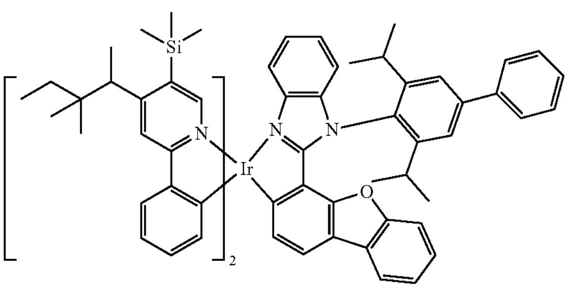
859
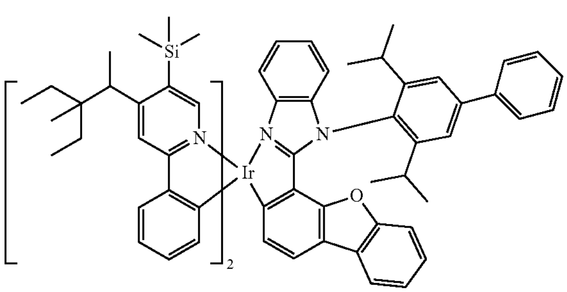
860
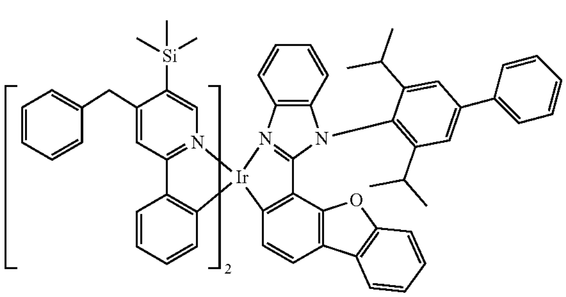
-continued
861
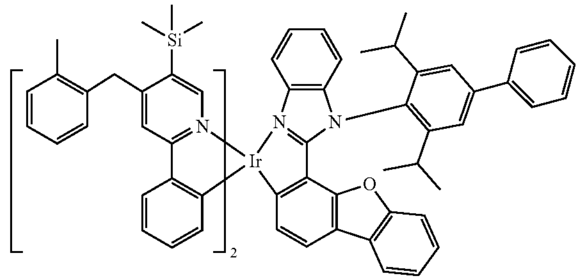
862
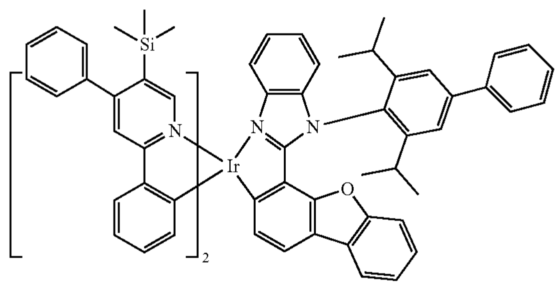
863
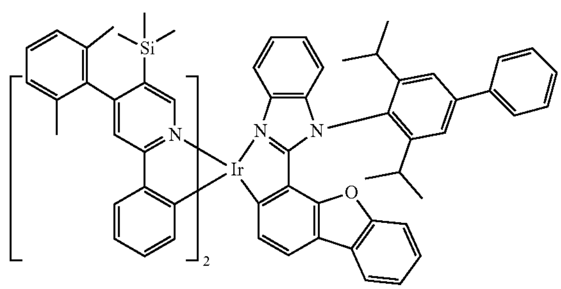
864
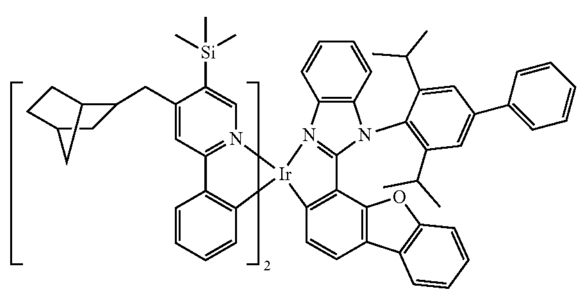
865
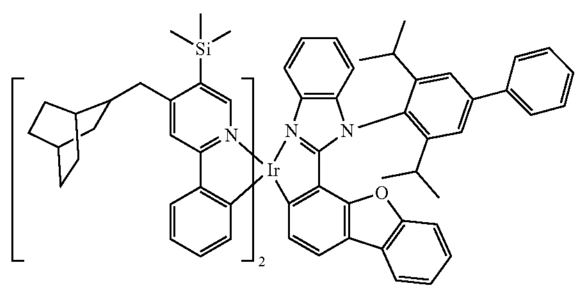

-continued
866
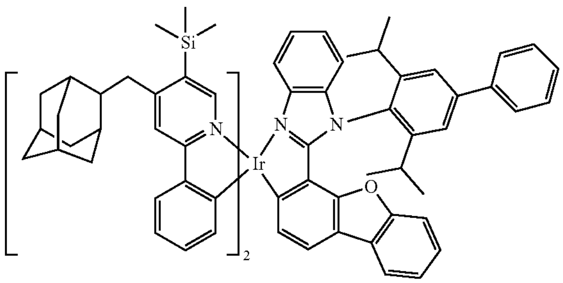
867
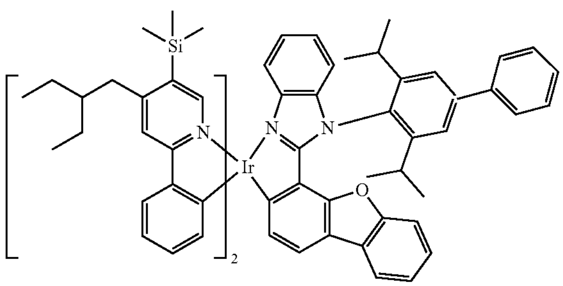
868
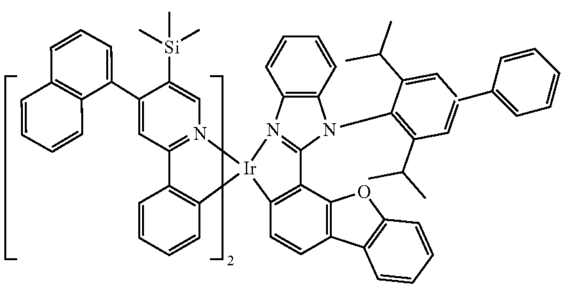
869
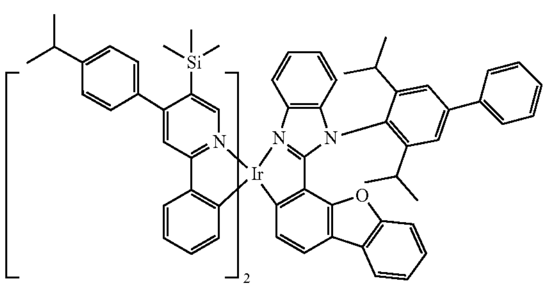
870
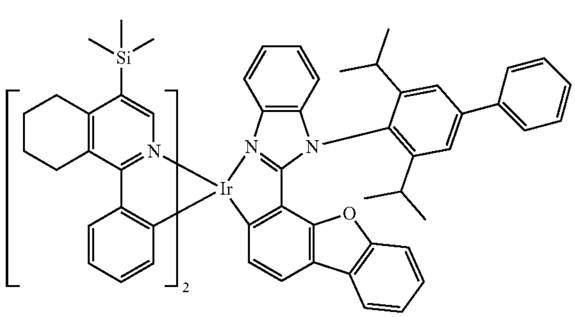
-continued
871
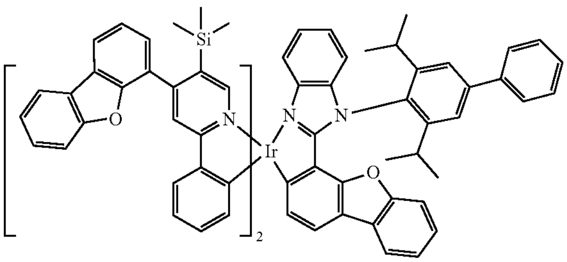
872
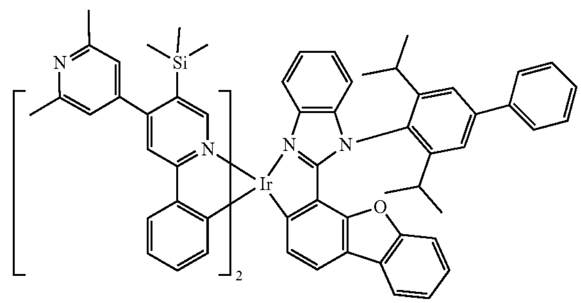
873
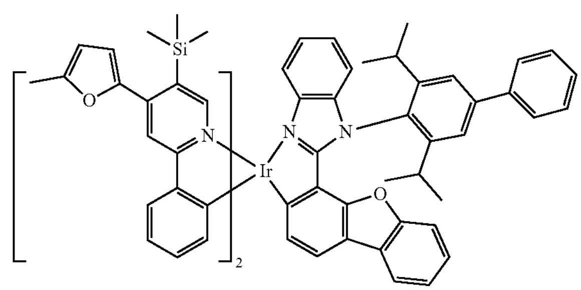
874
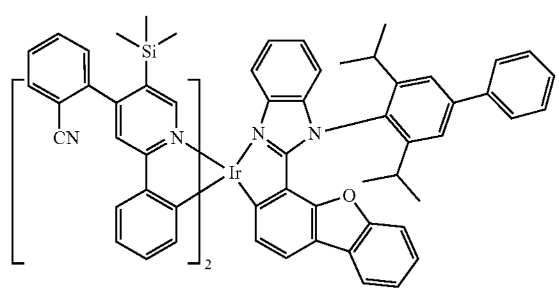
875
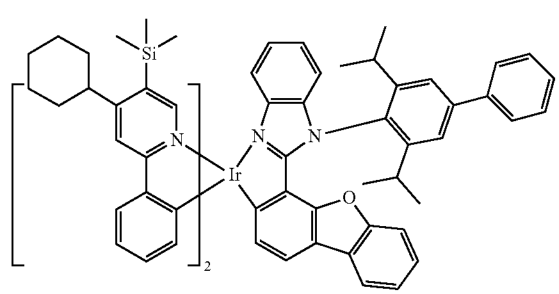

-continued
876
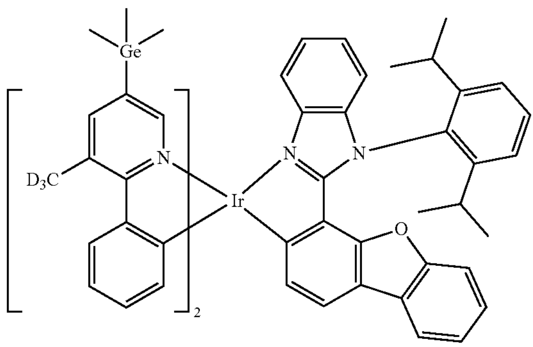
877
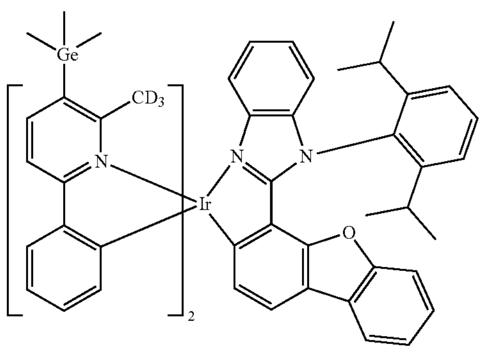
878
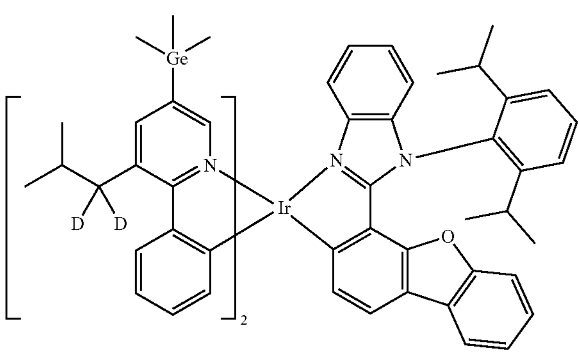
879
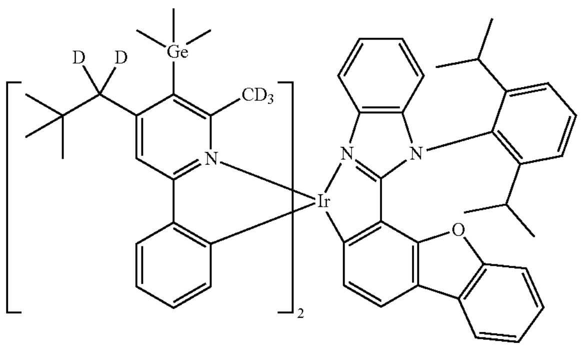
-continued
880
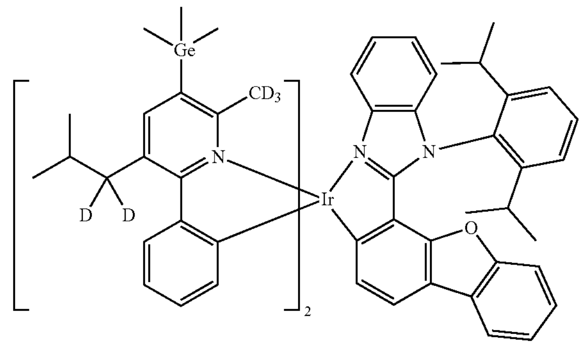
881
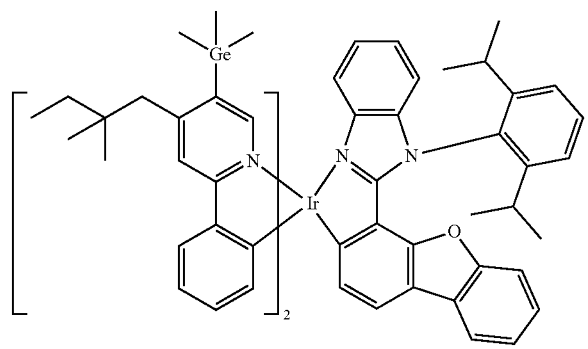
882
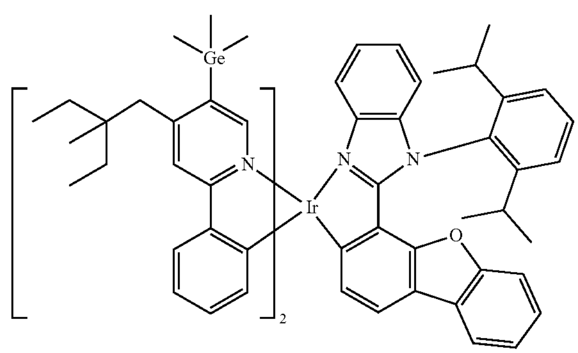
883
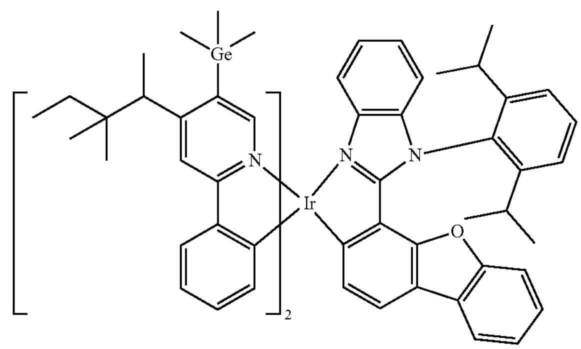

-continued
884
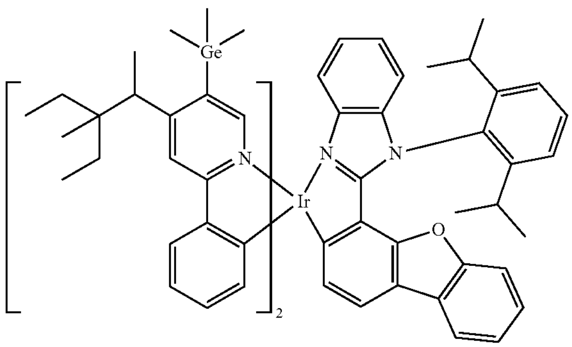
885
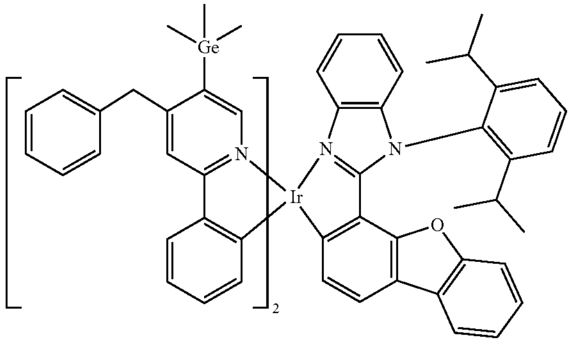
886
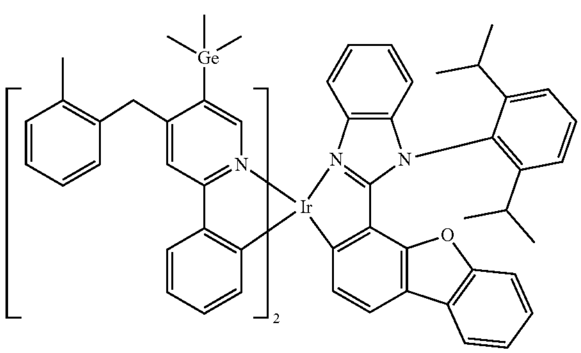
887
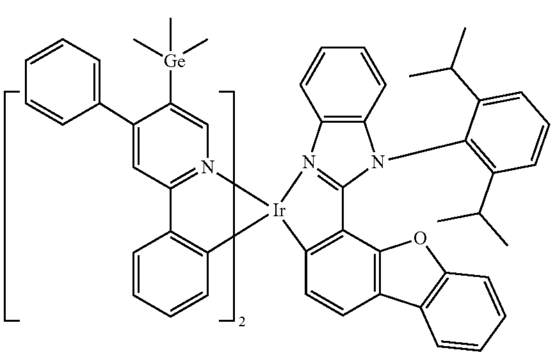
-continued
888
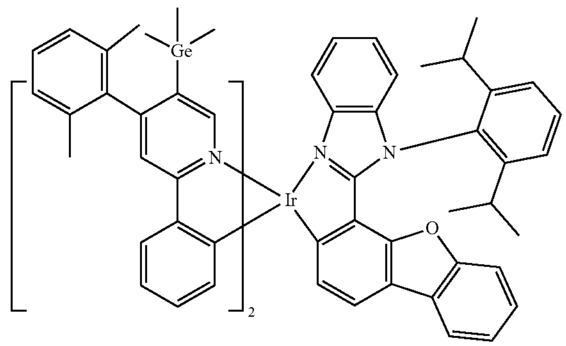
889
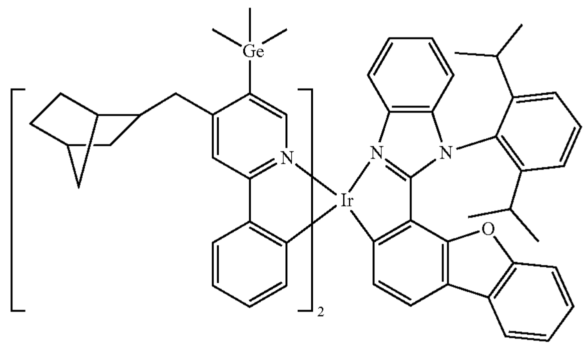
890
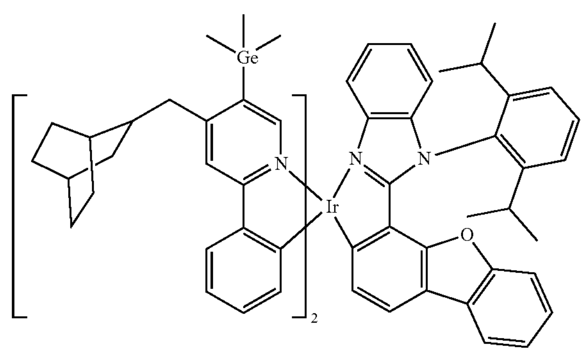
891
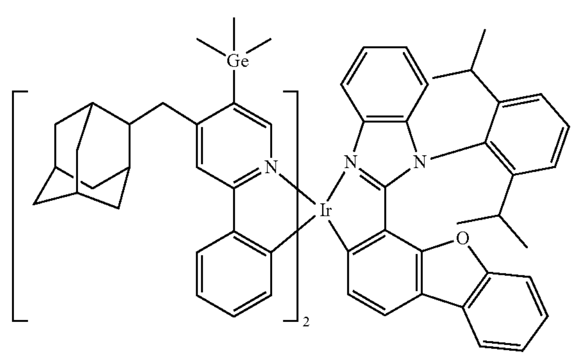

-continued
892
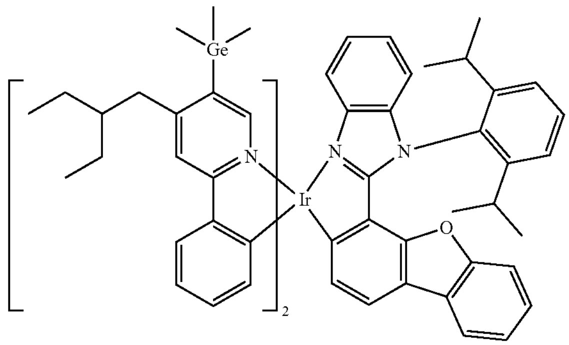
893
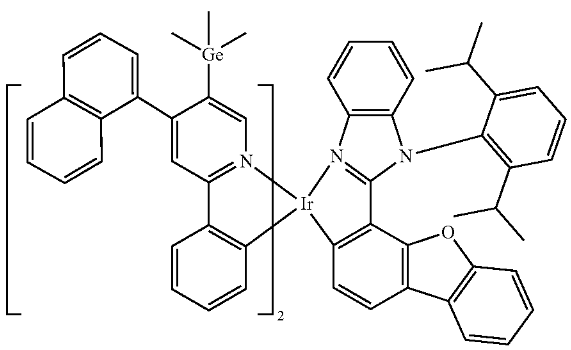
894
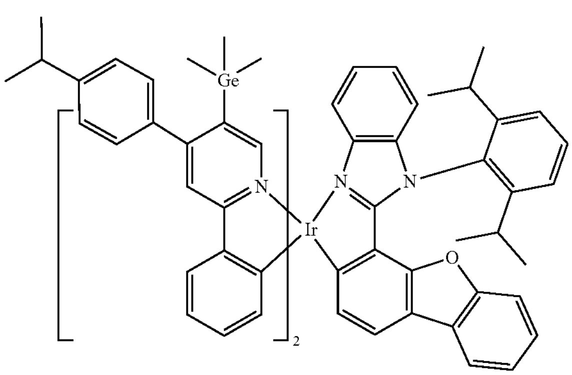
895
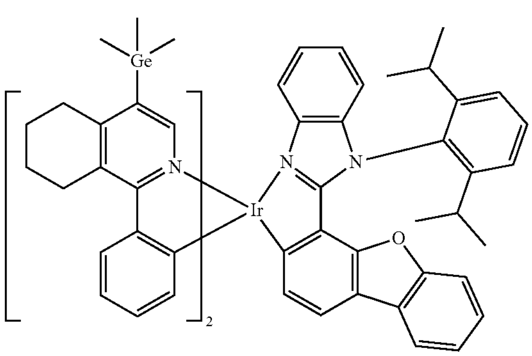
-continued
896
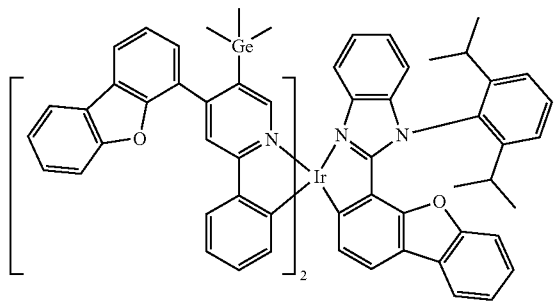
897
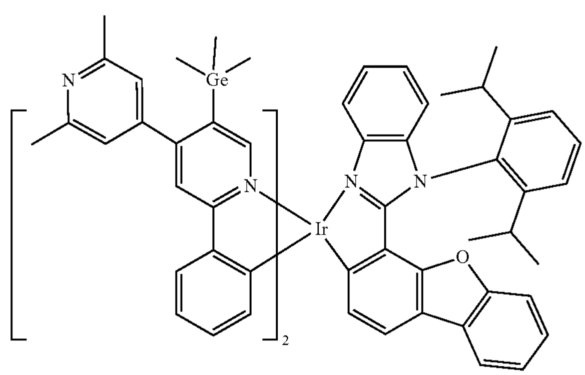
898
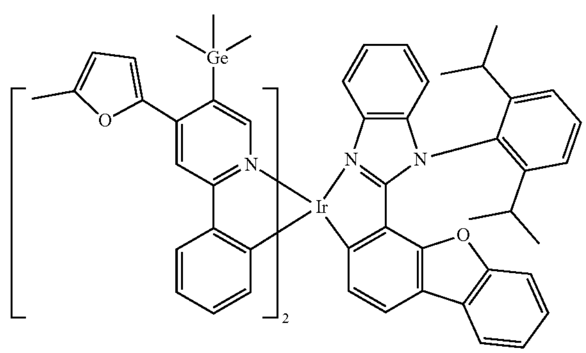
899
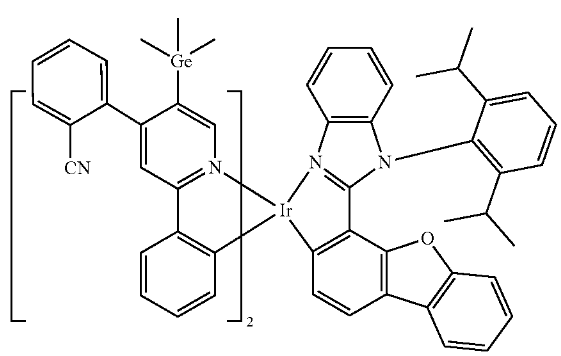

-continued
900
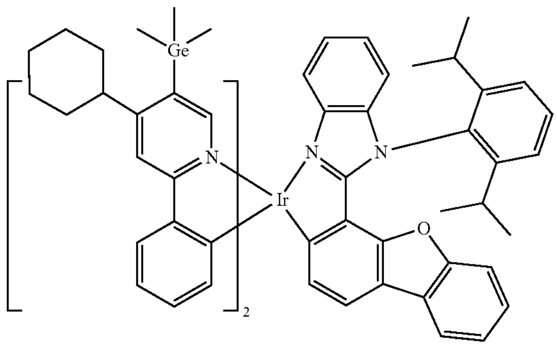
901
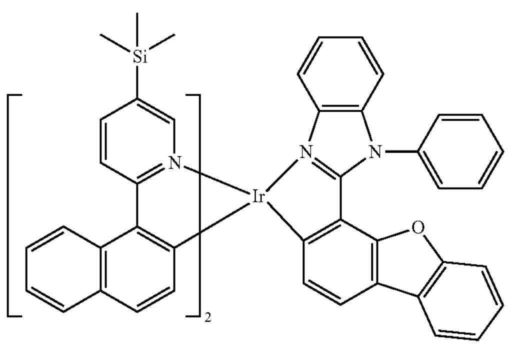
902
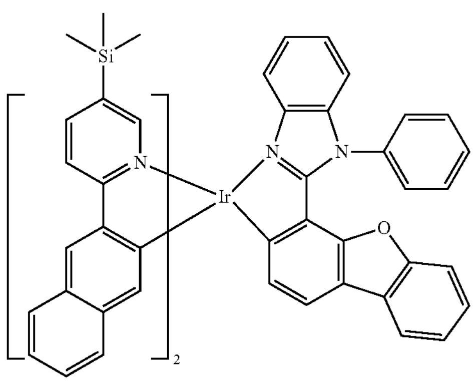
903
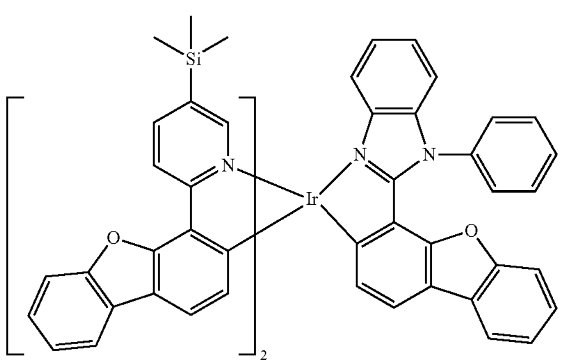
-continued
904
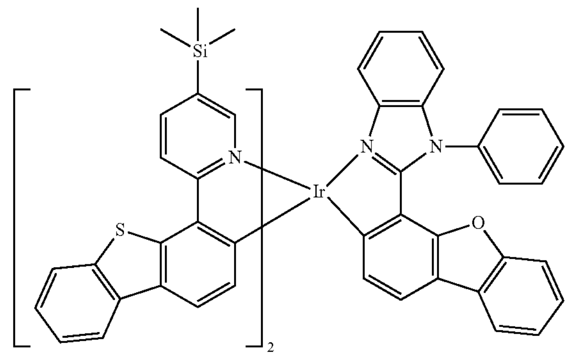
905
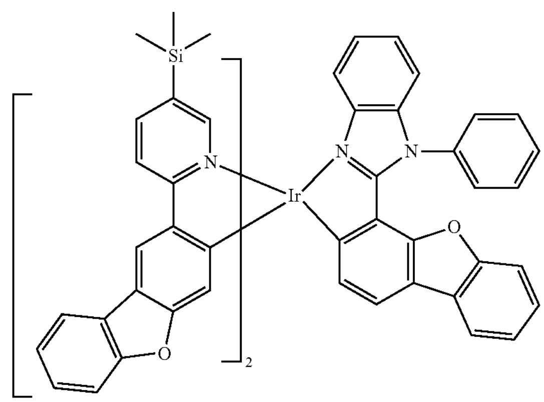
906
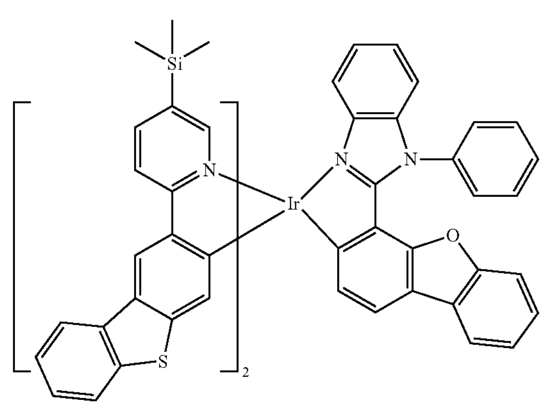

907
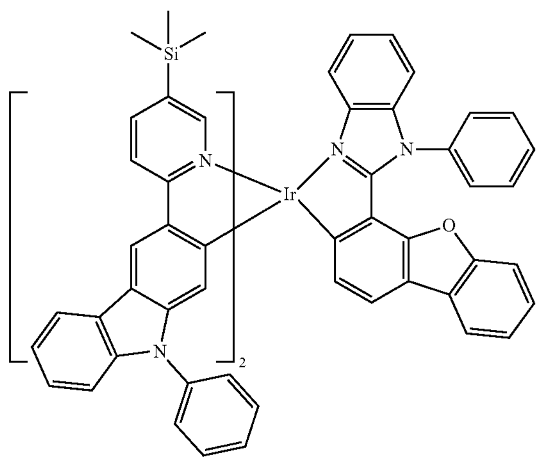
908
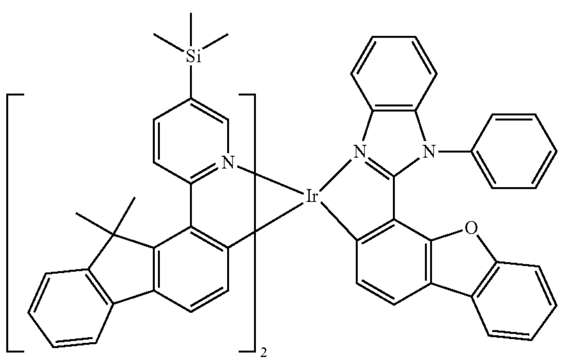
909
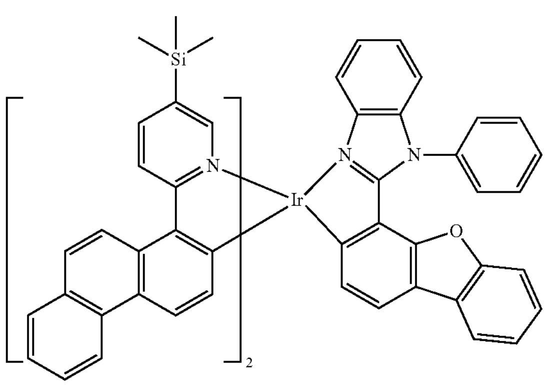
910
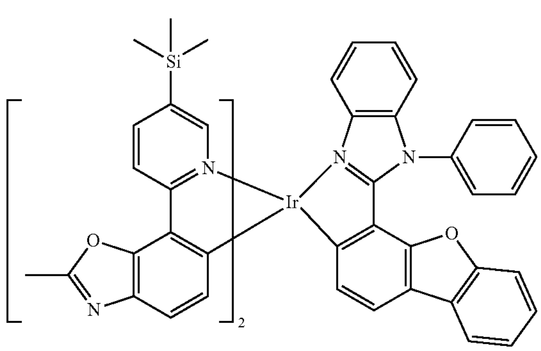
911
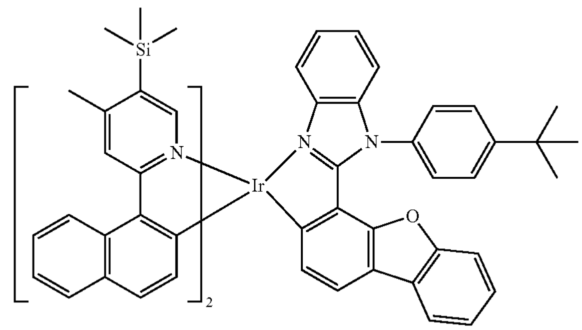
912
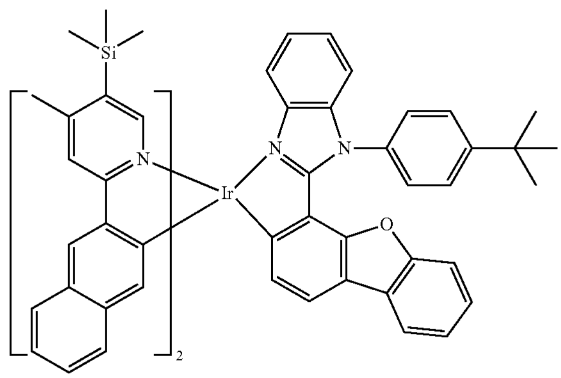
913
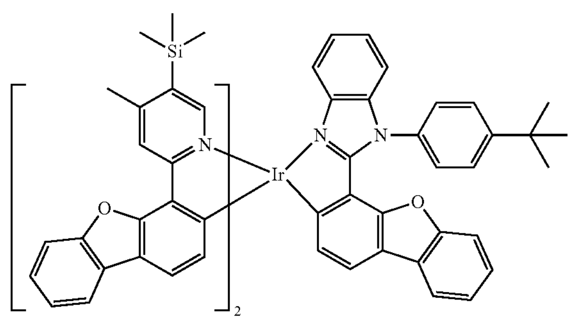
914
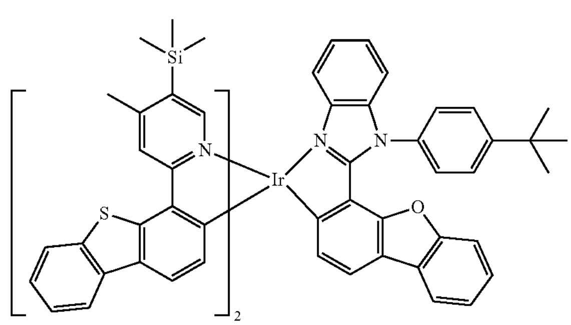

-continued
915
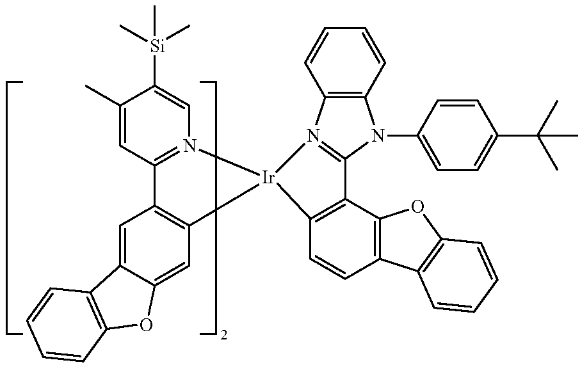
916
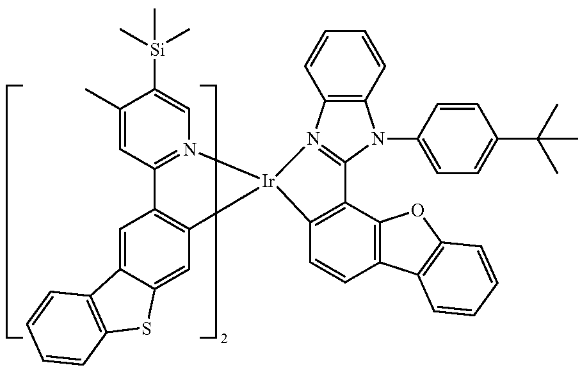
917
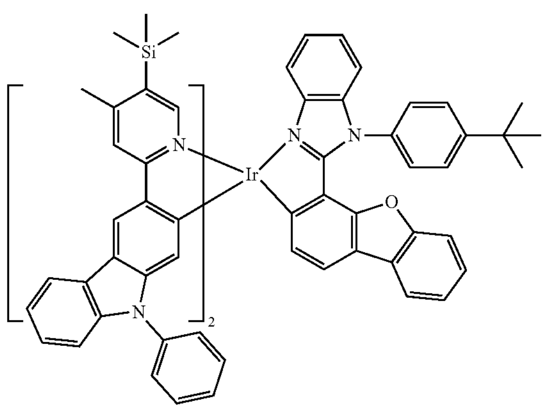
918
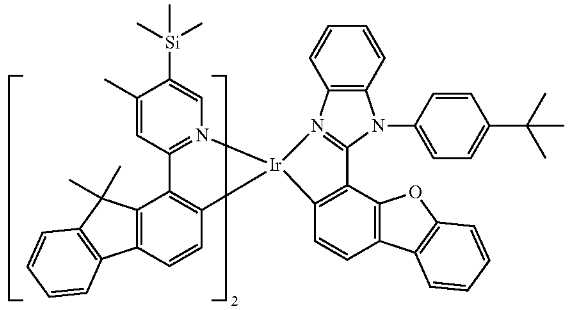
-continued
919
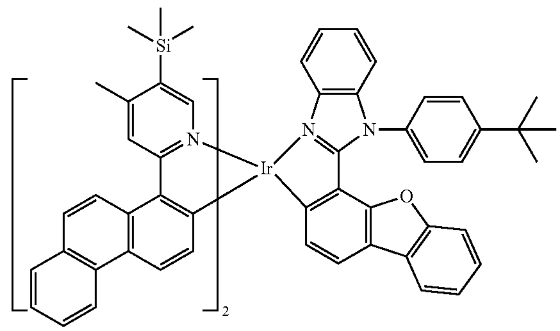
920
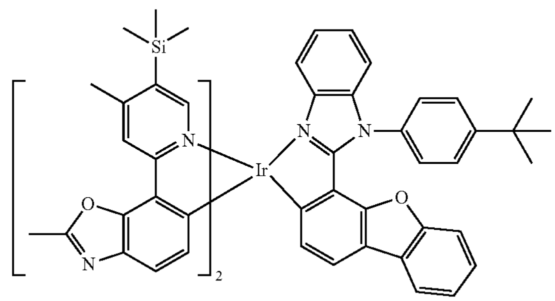
921
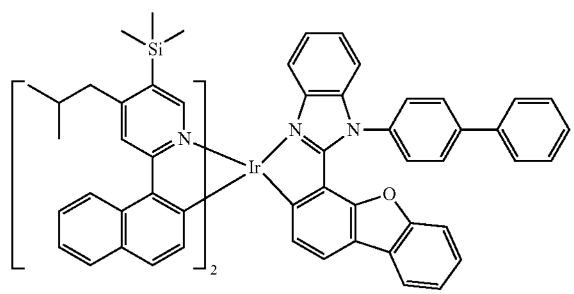
922
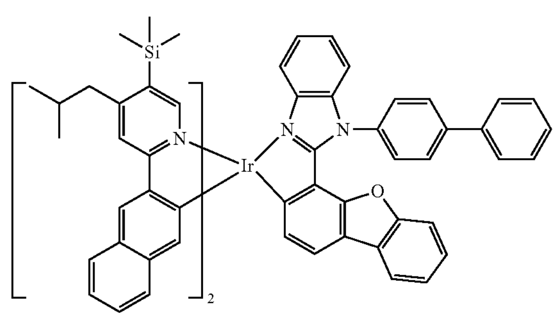
923
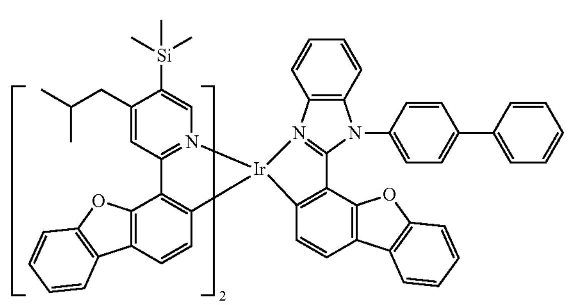

-continued
924
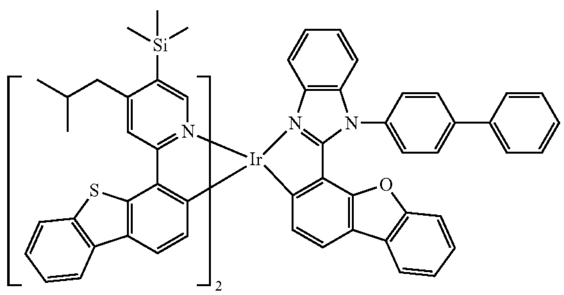
925
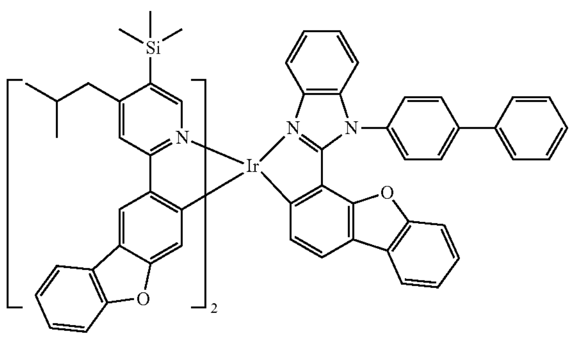
926
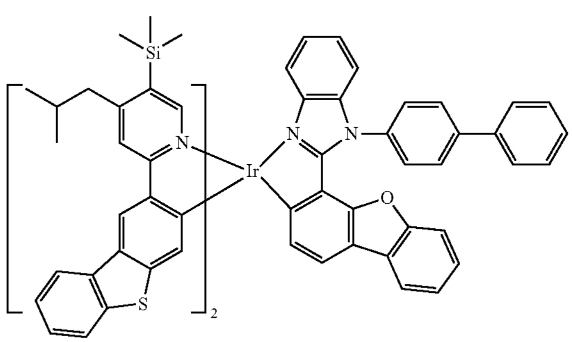
927
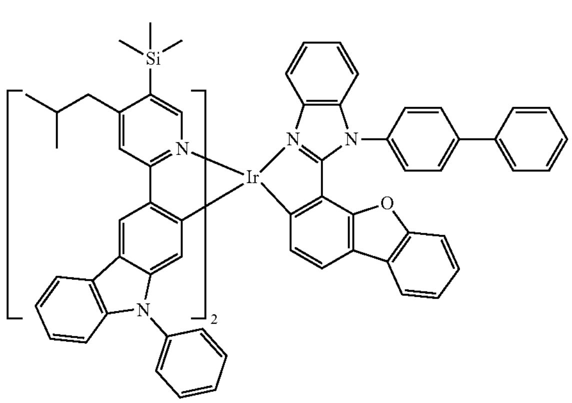
-continued
928
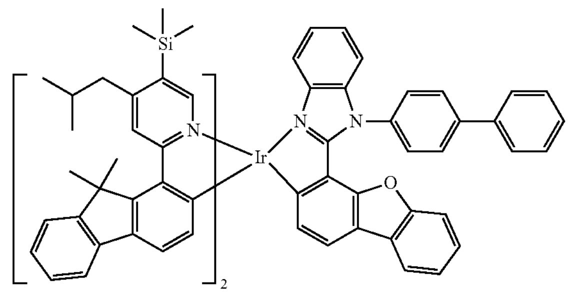
929
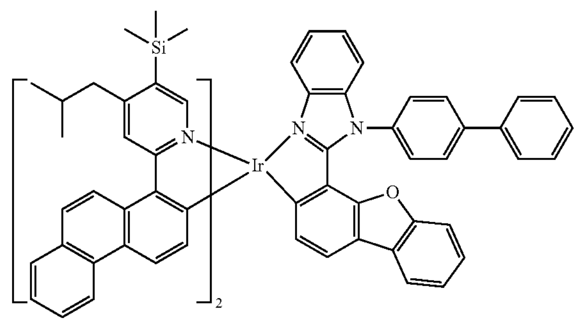
930
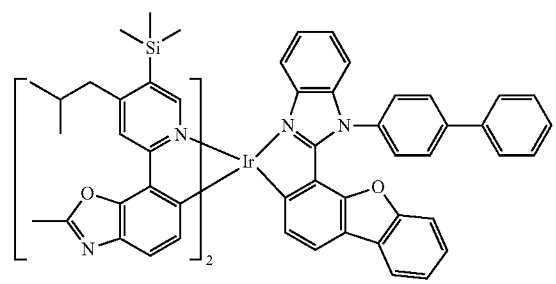
931
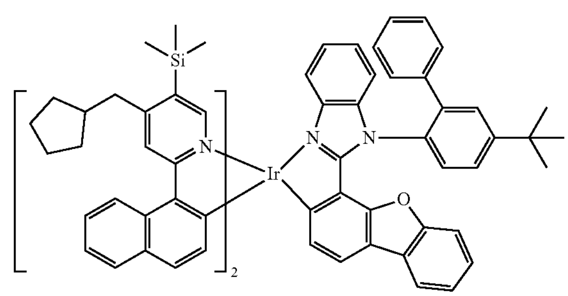
932
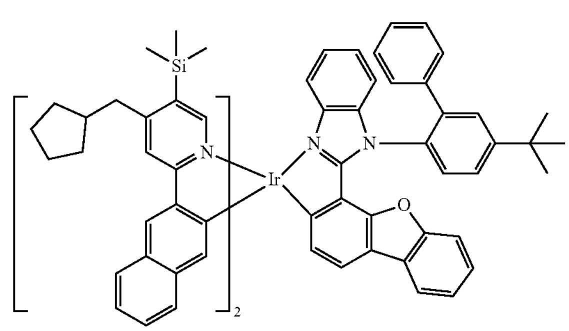

-continued
933
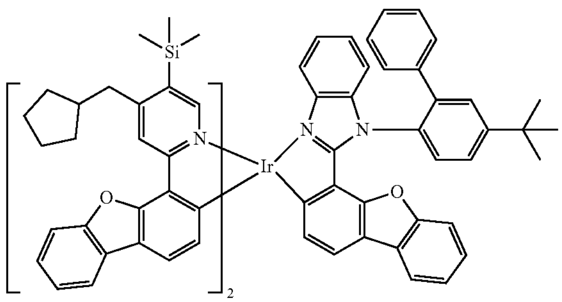
934
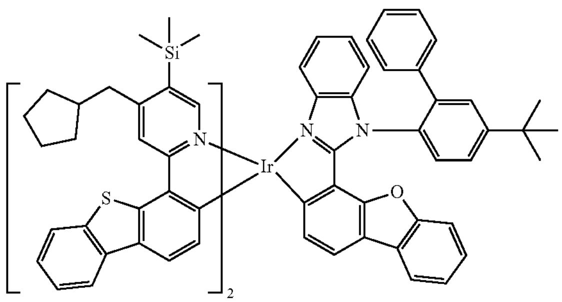
935
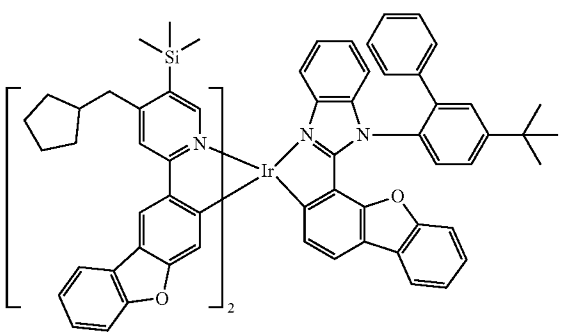
936
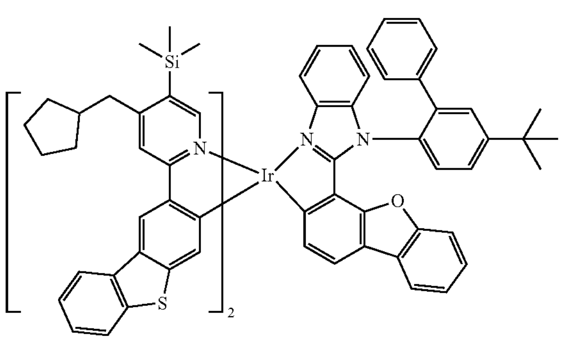
-continued
937
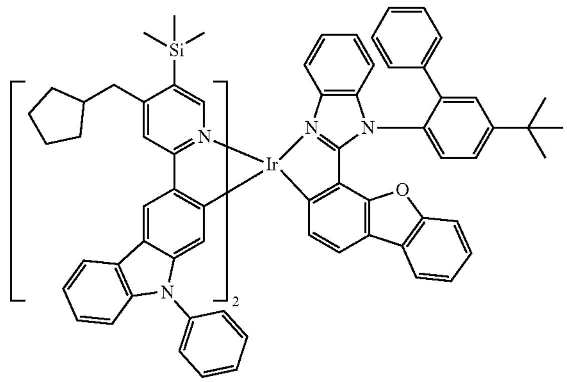
938
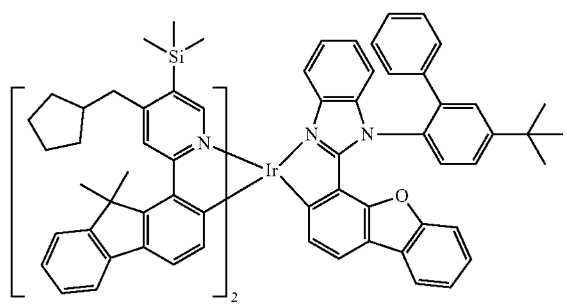
939
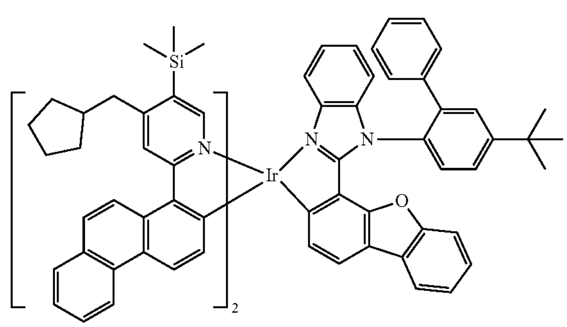
940
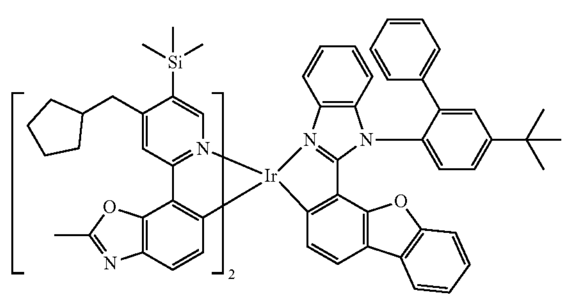

-continued
941
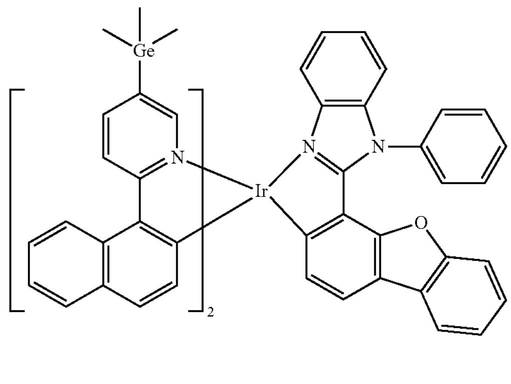
942
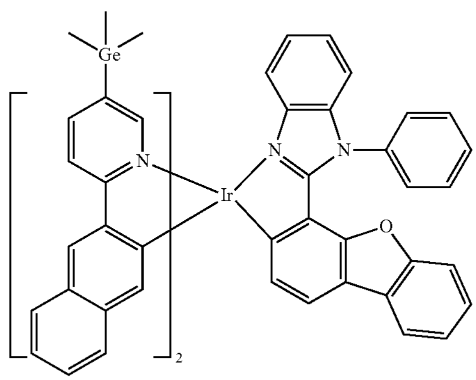
943
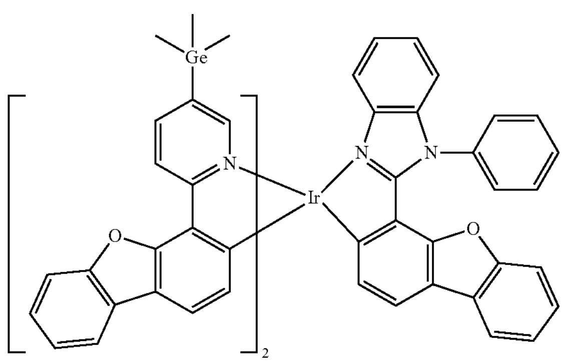
944
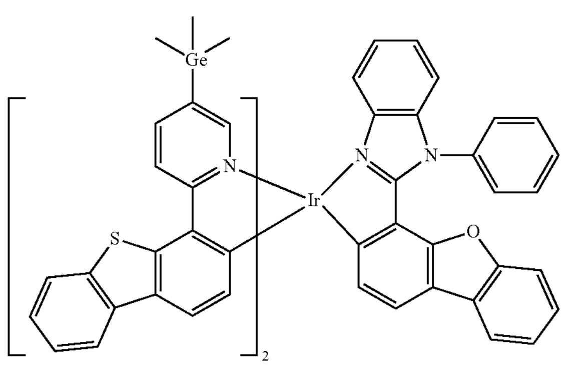
-continued
945
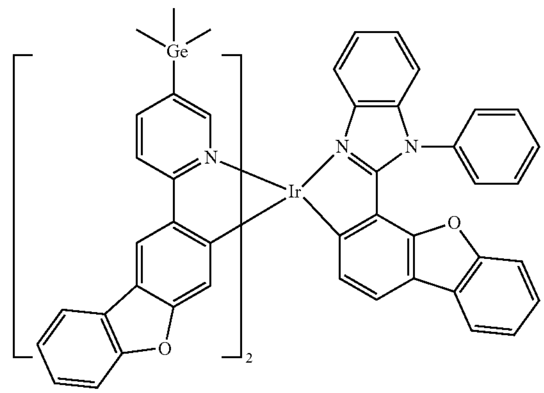
946
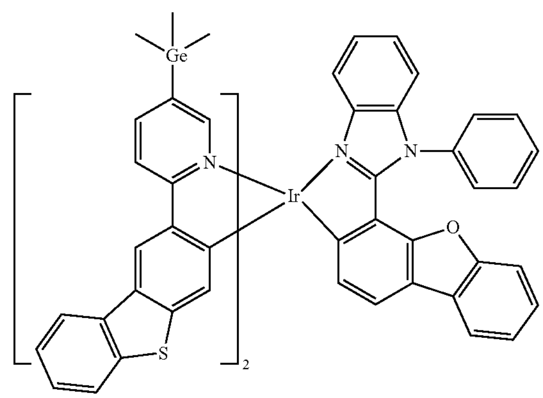
947
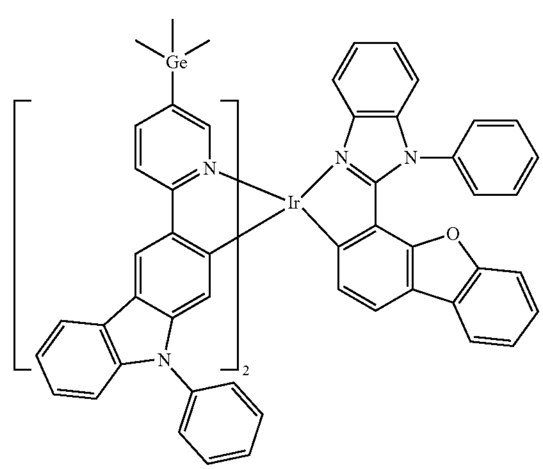

-continued
948
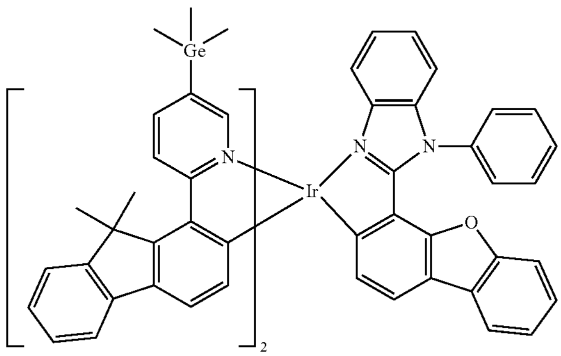
949
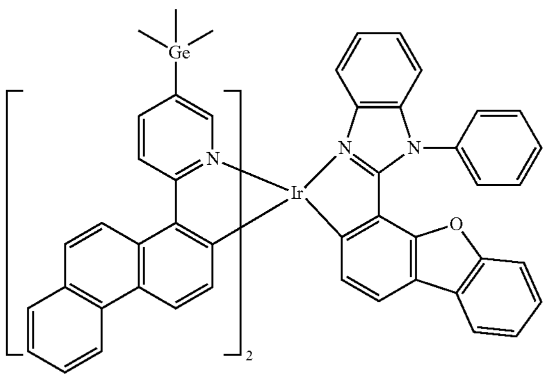
950
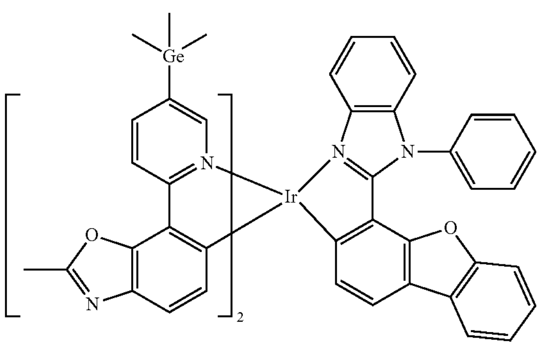
951
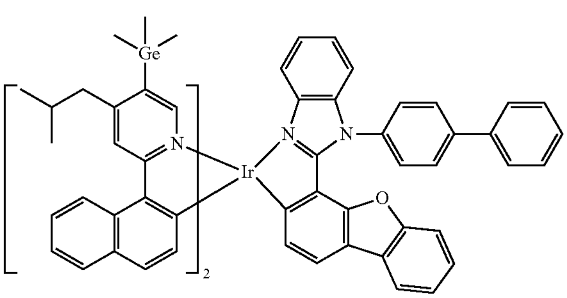
-continued
952
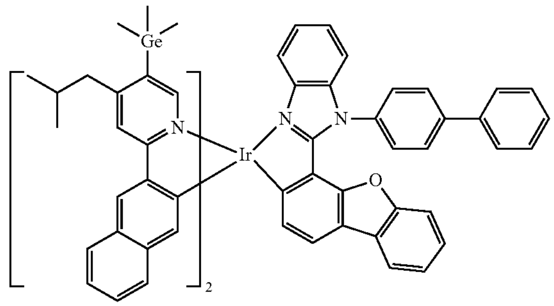
953
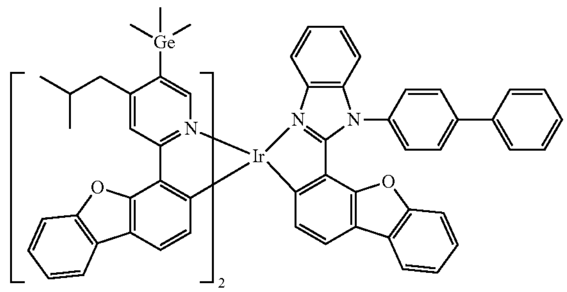
954
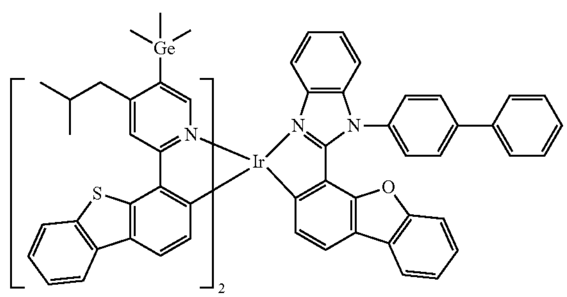
955
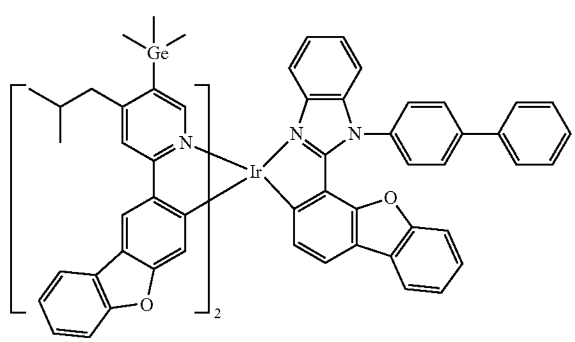

-continued
956
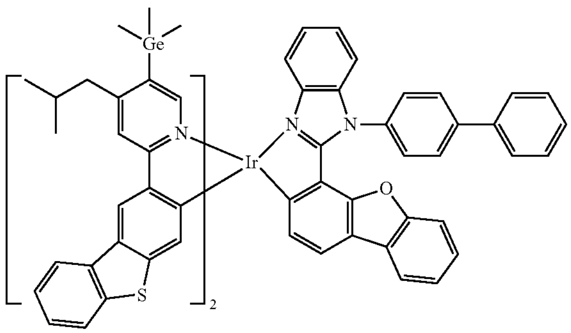
957
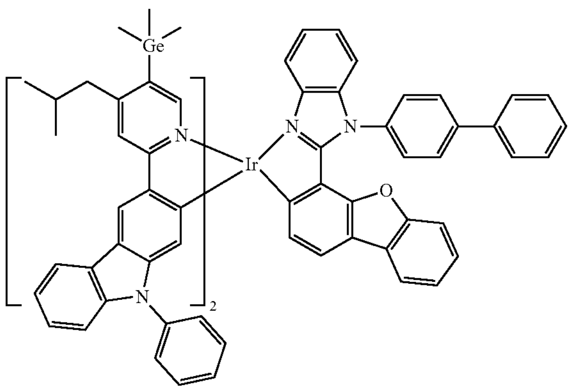
958
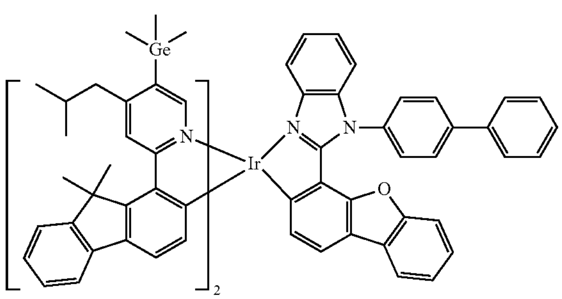
959
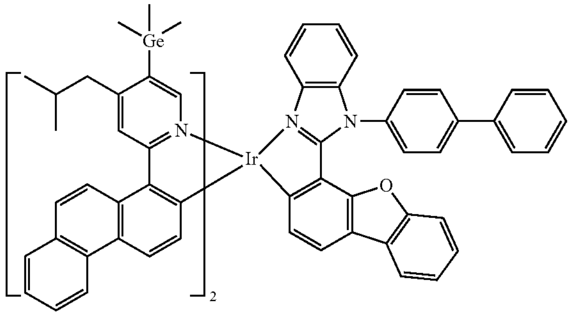
-continued
960
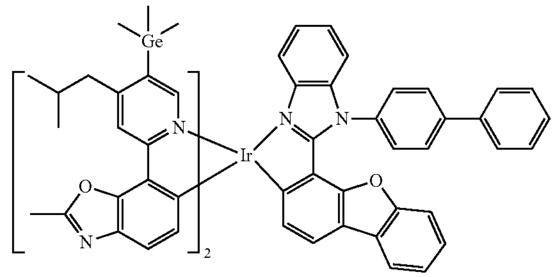
961
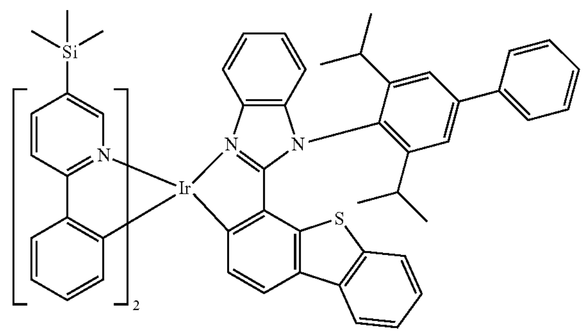
962
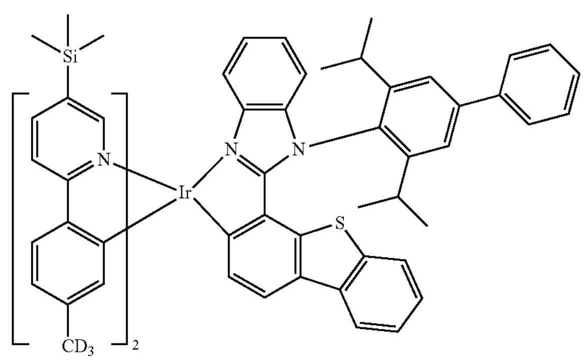
963
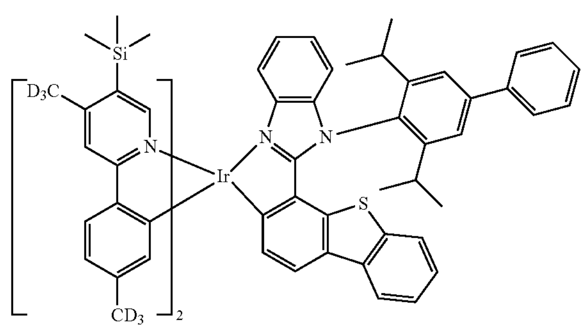

-continued
964
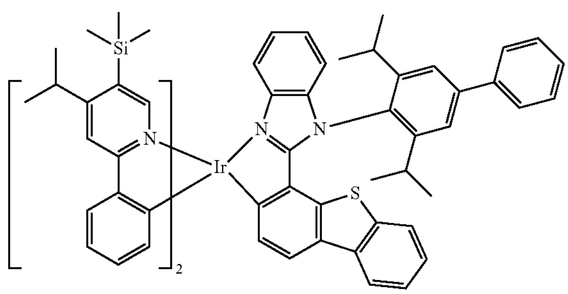
965
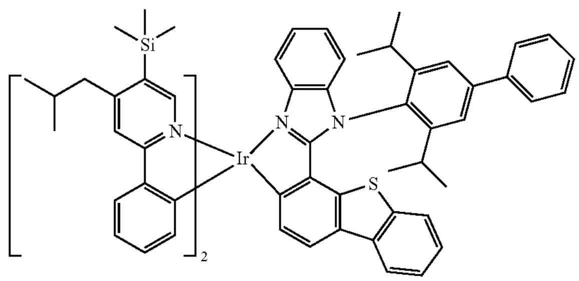
966
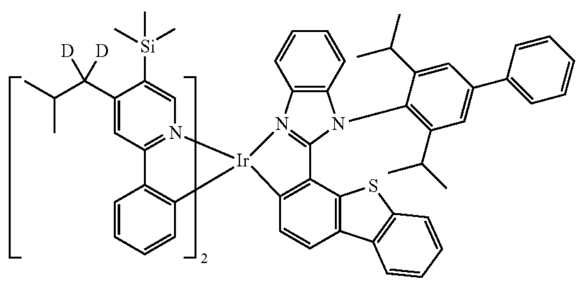
967
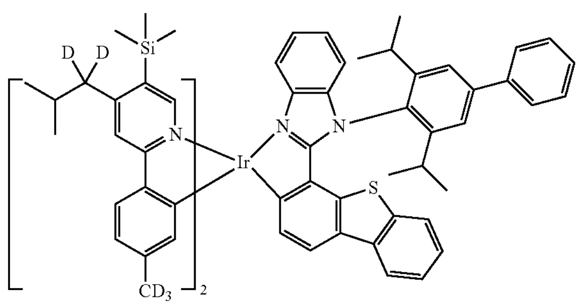
968
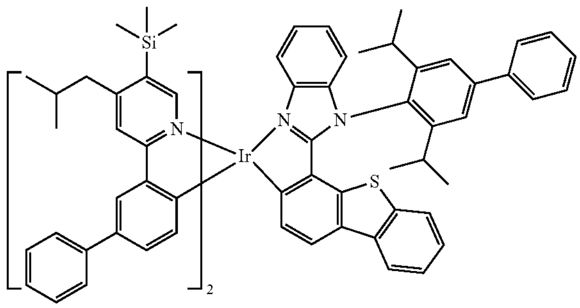
-continued
969
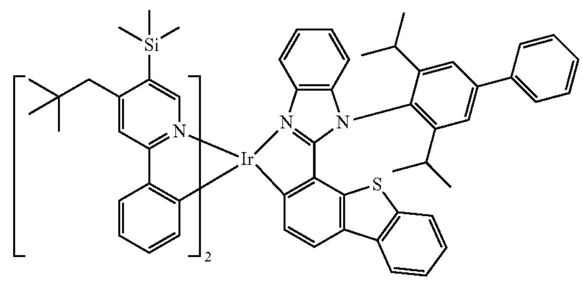
970
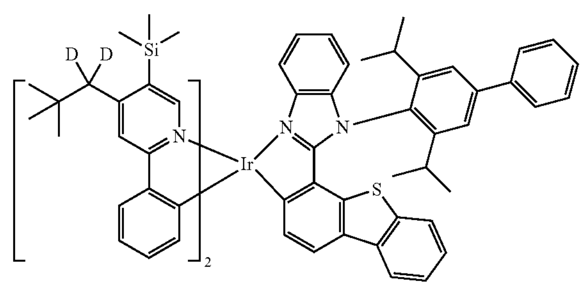
971
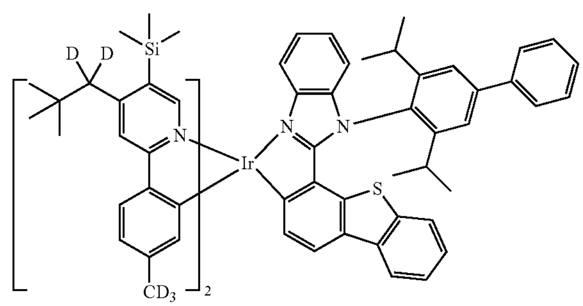
972
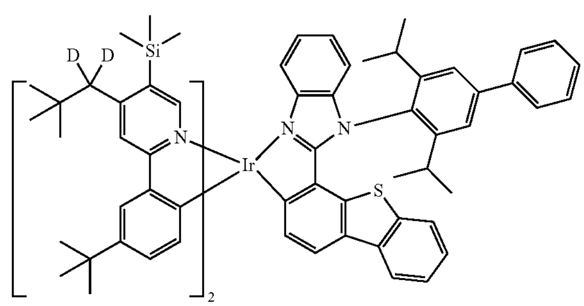
973
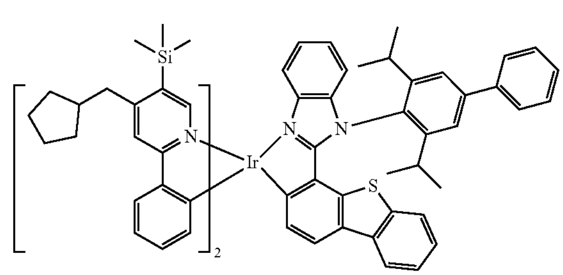

974
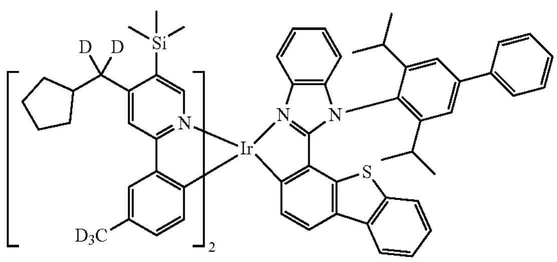
975
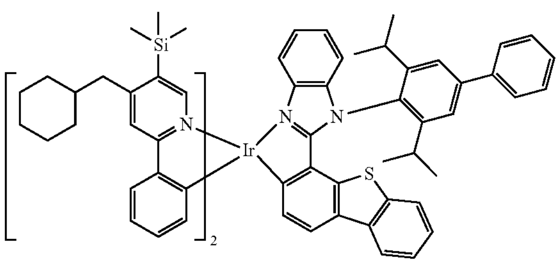
976
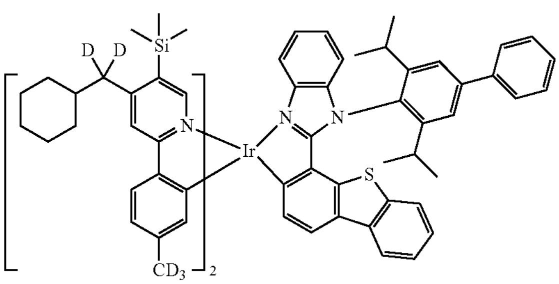
977
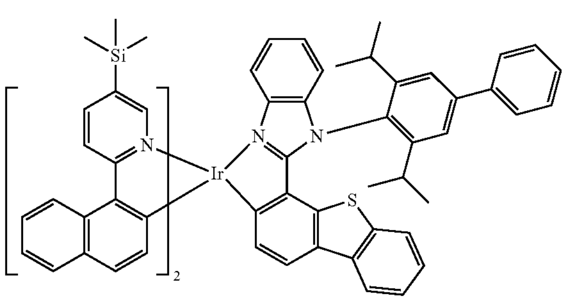
978
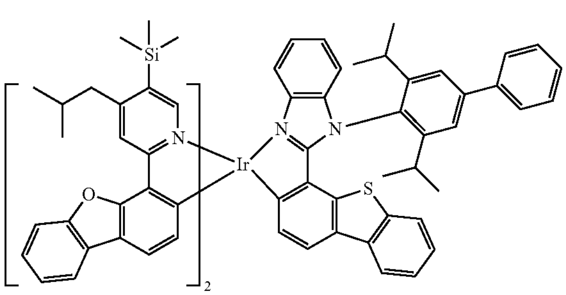
979
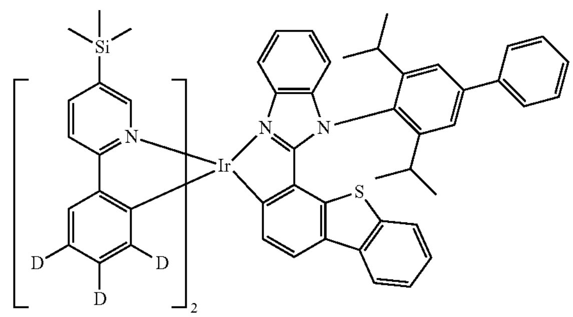
980
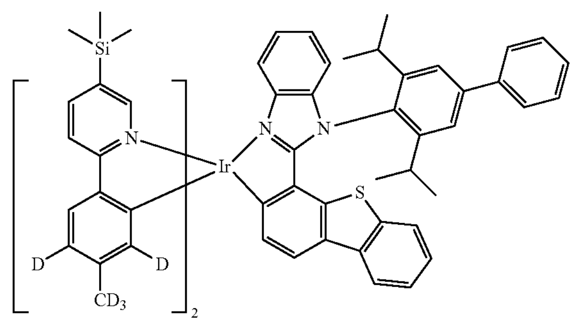
981
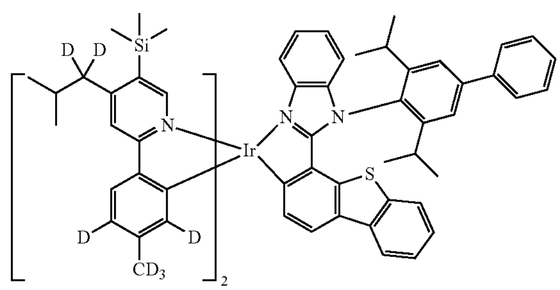
982
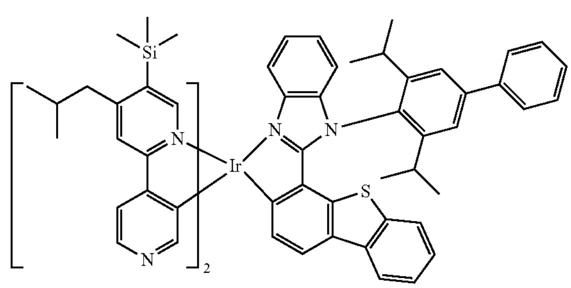
983
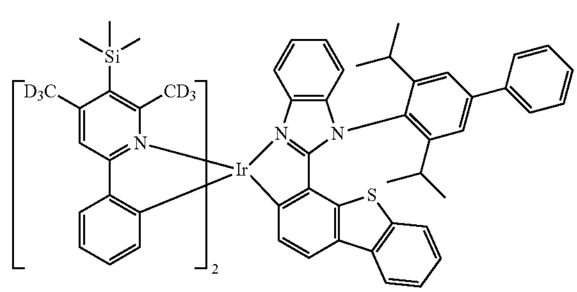

984
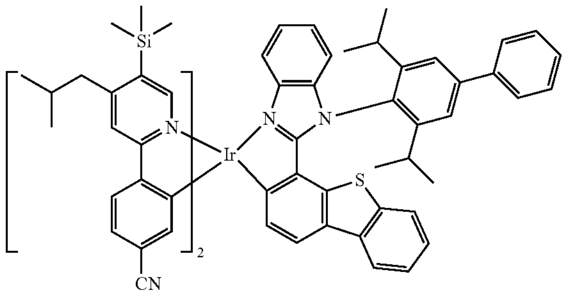
985
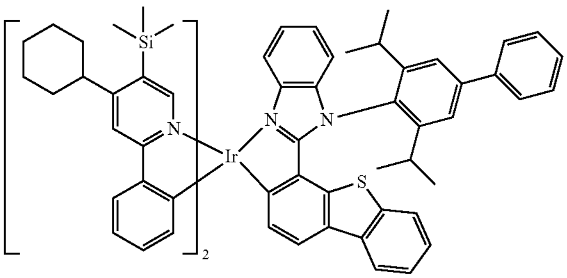
986
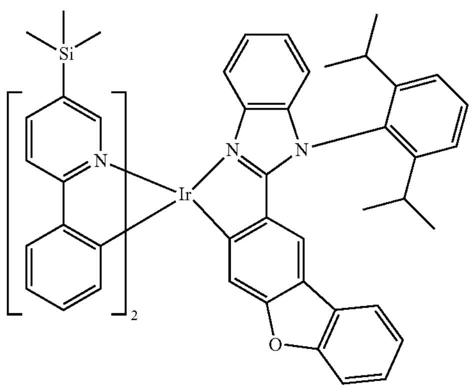
987
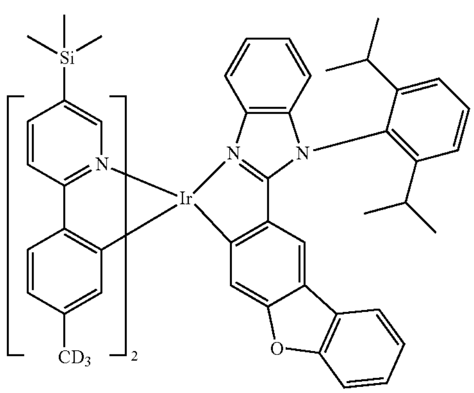
988
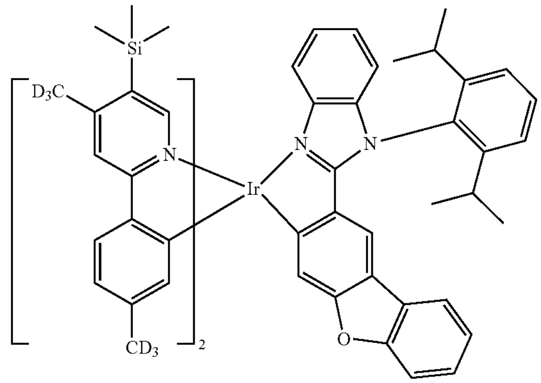
989
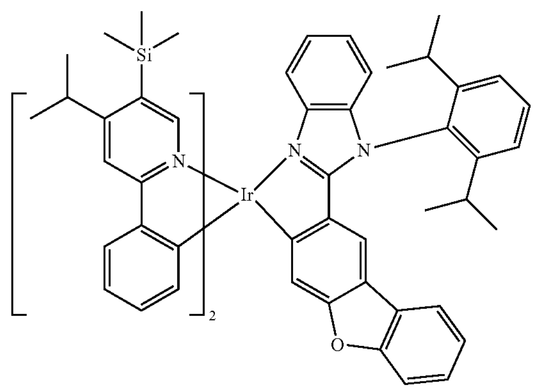
990
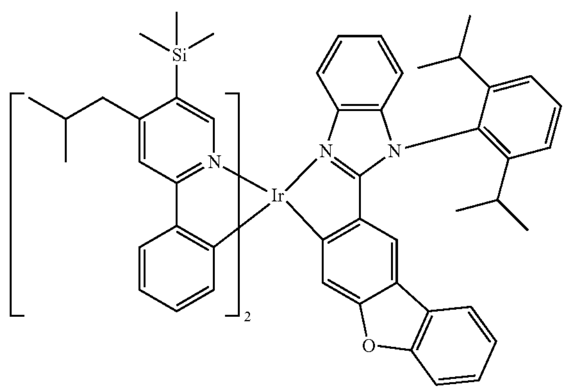
991
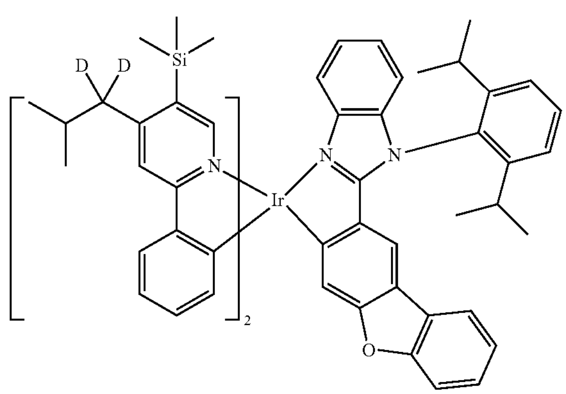

-continued
992
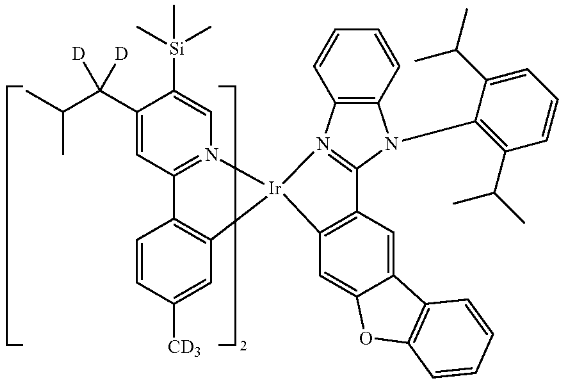
993
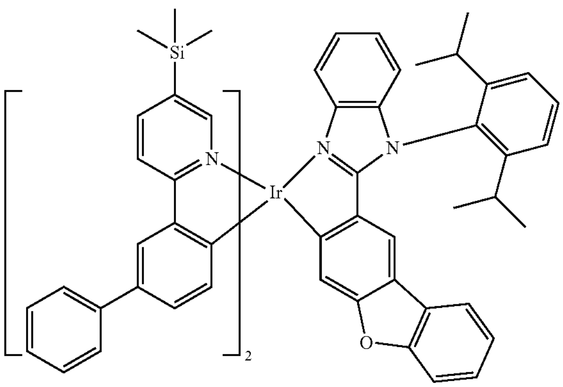
994
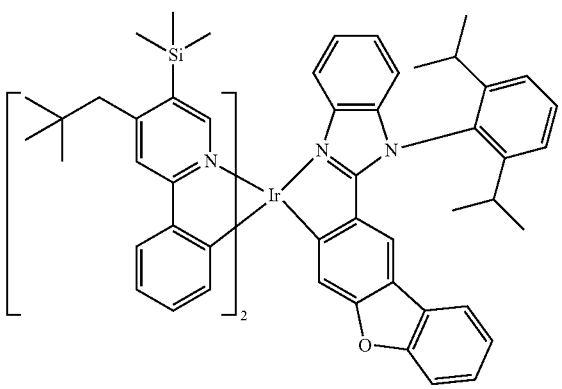
995
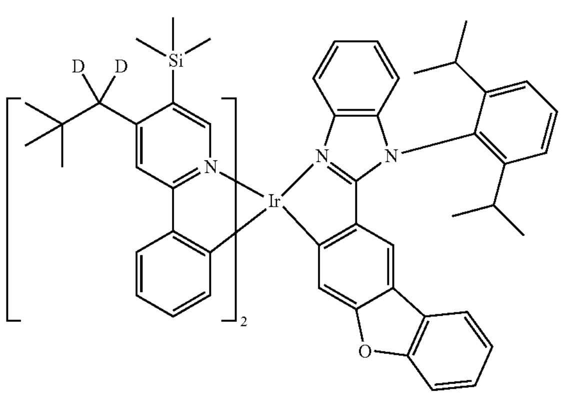
-continued
996
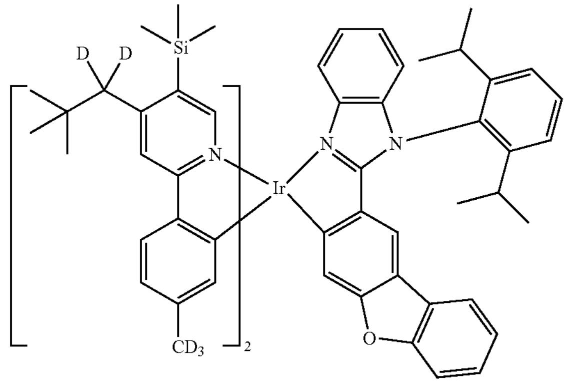
997
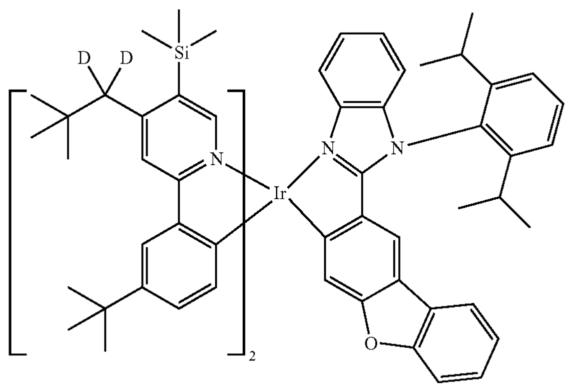
998
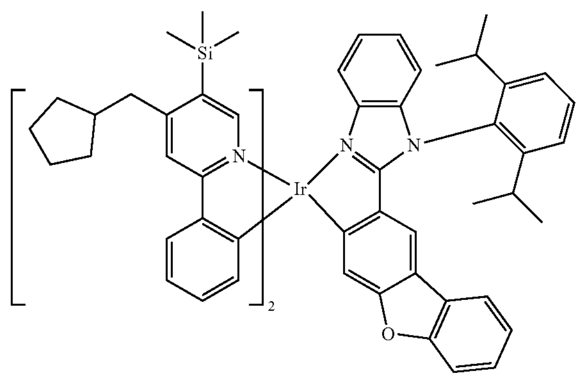
999
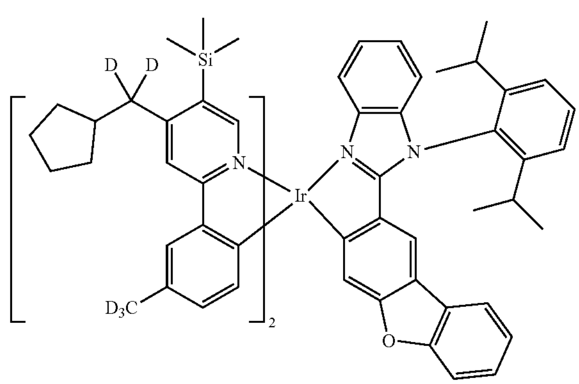

-continued
1000
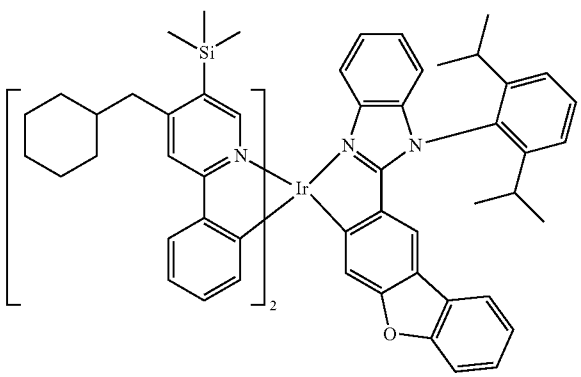
1001
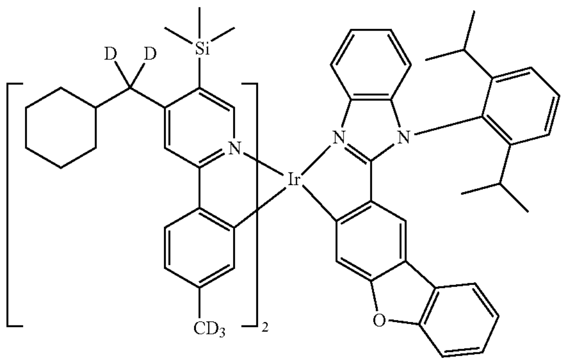
1002
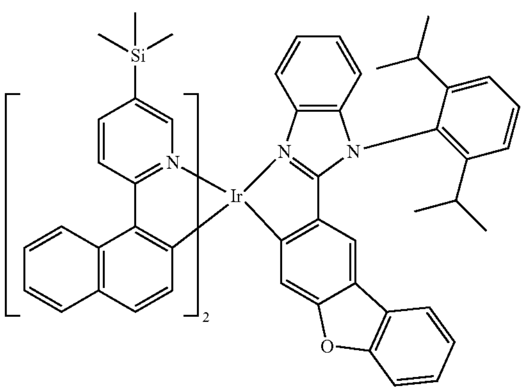
1003
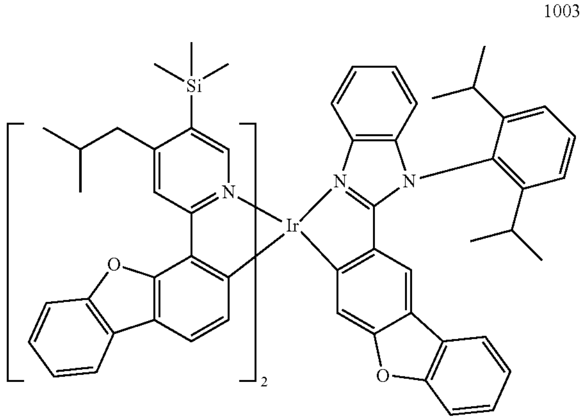
-continued
1004
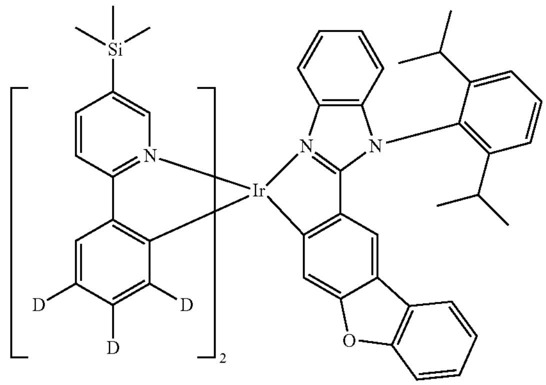
1005
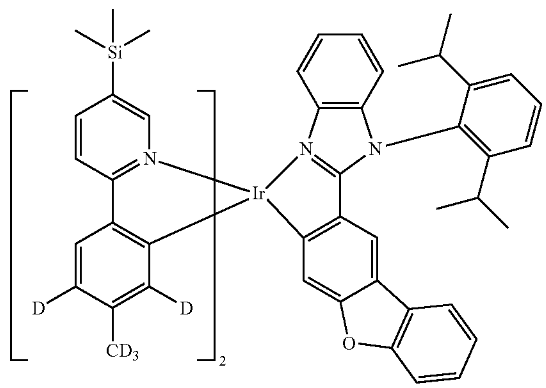
1006
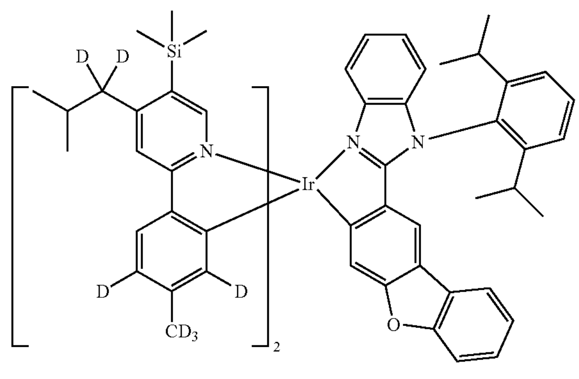
1007
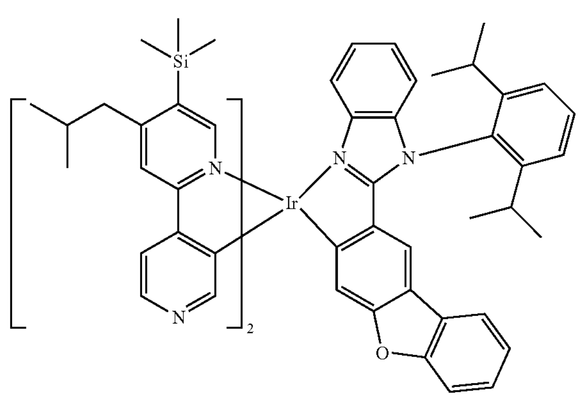

-continued
1008
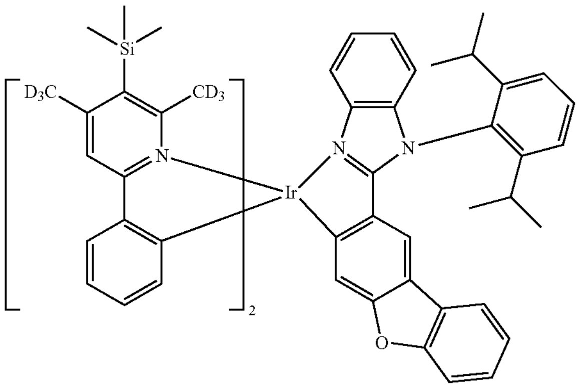
1009
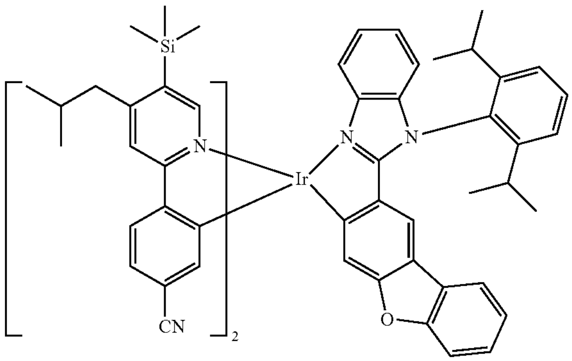
1010
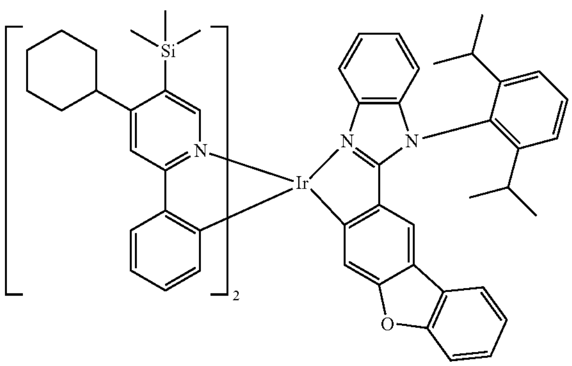
1011
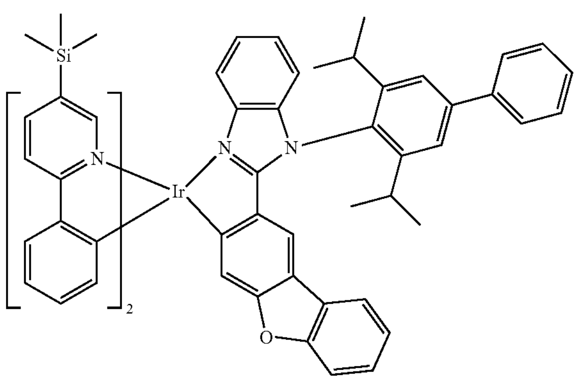
-continued
1012
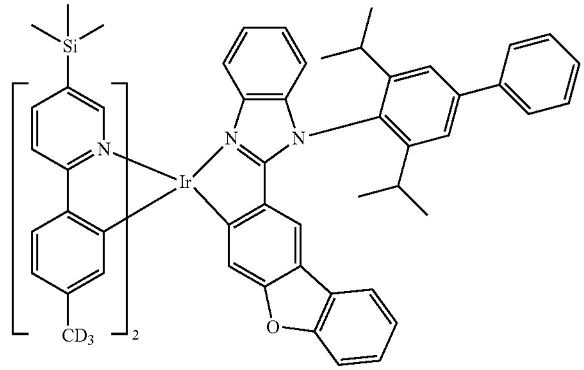
1013
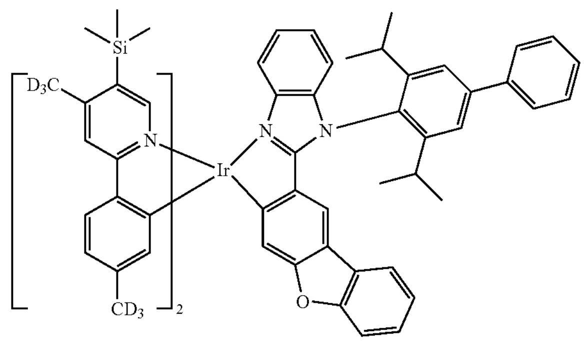
1014
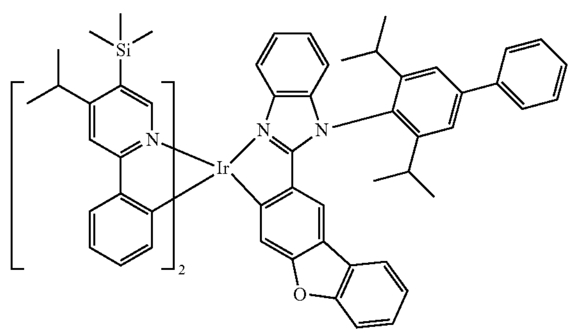
1015
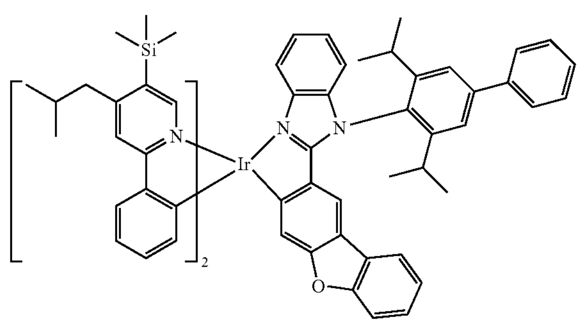

-continued
1016
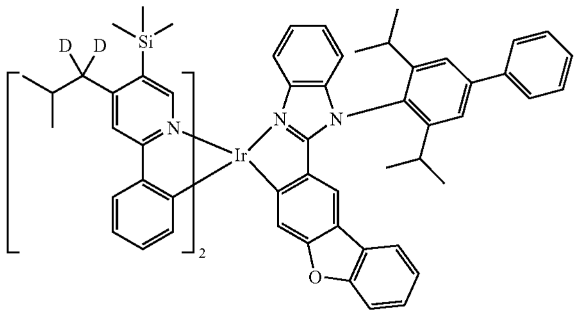
1017
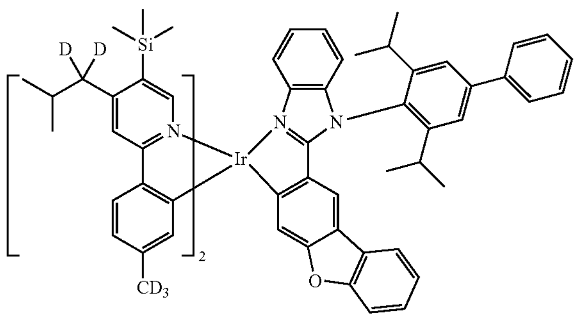
1018
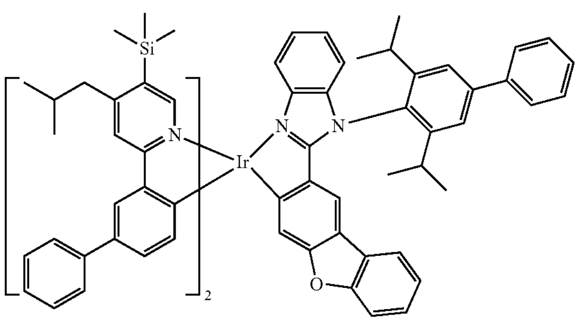
1019
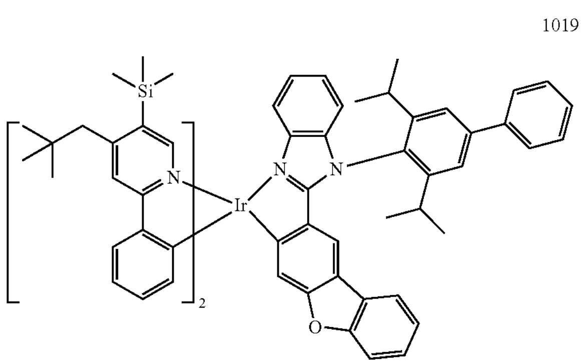
-continued
1020
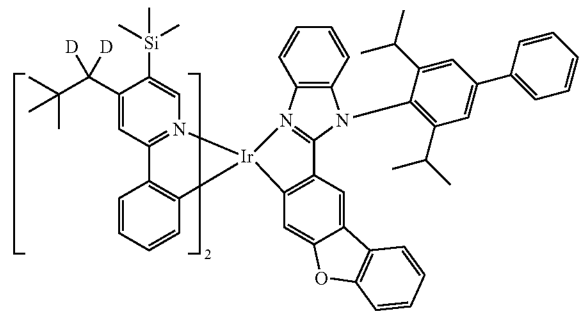
1021
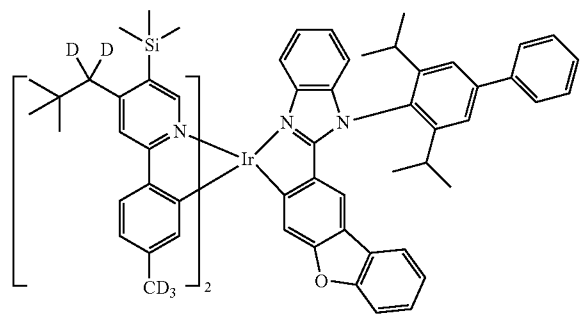
1022
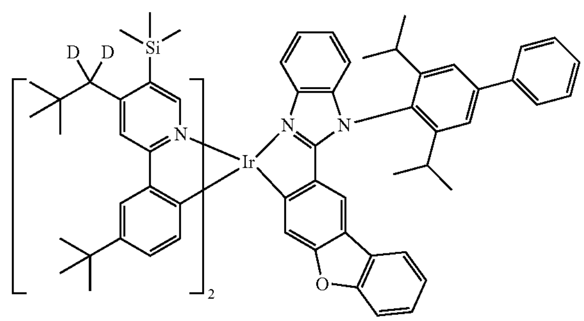
1023
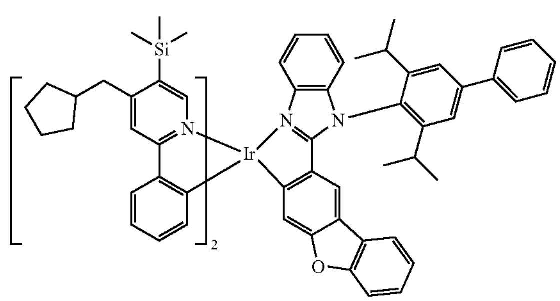
1024
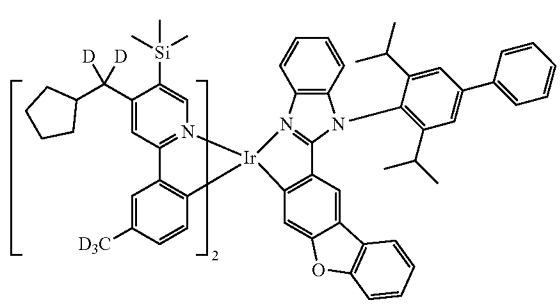

-continued
1025
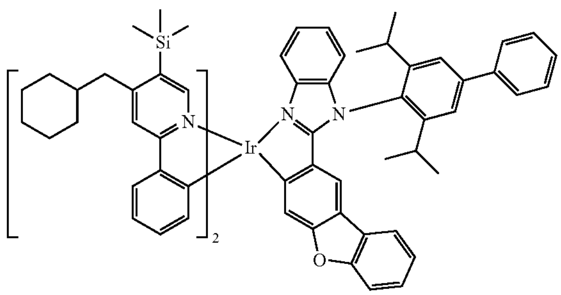
1026
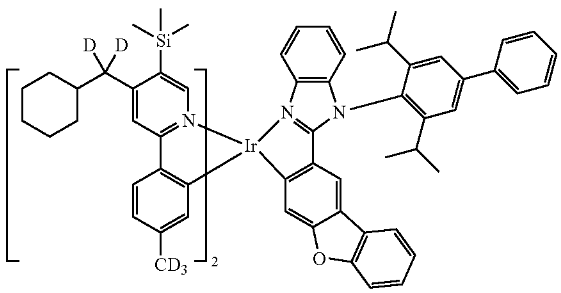
1027
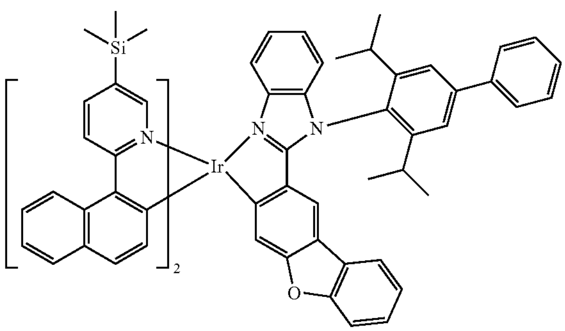
1028
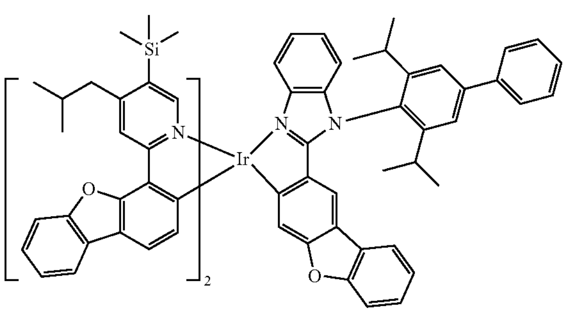
1029
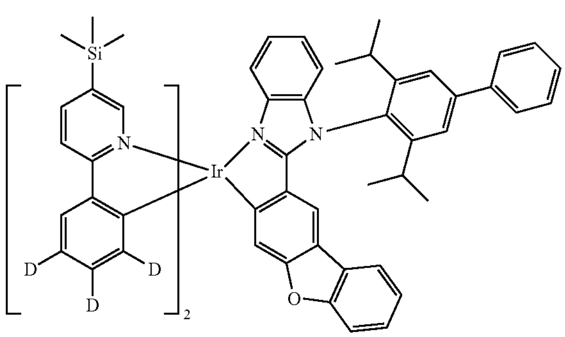
-continued
1030
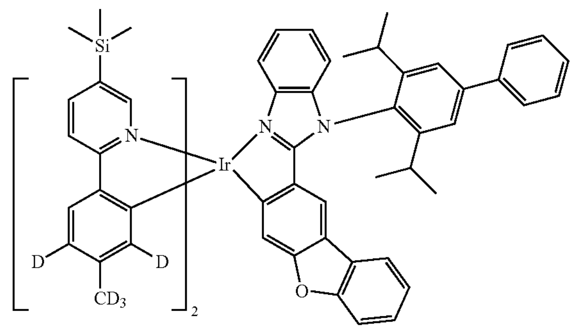
1031
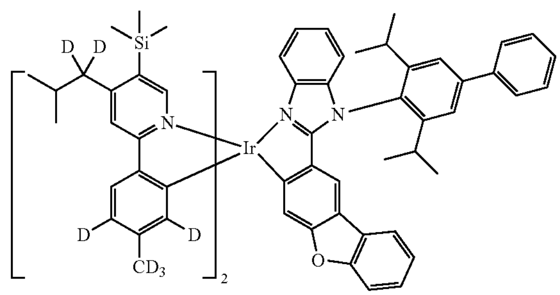
1032
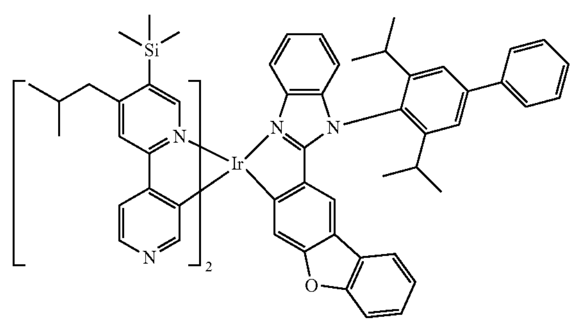
1033
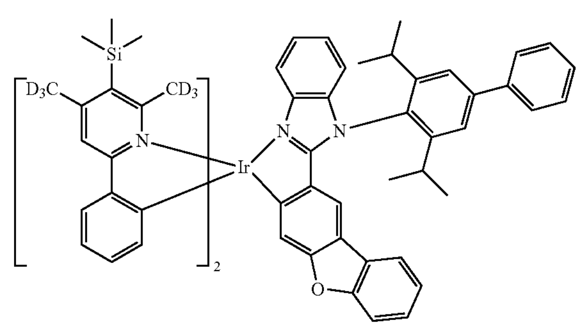

1034
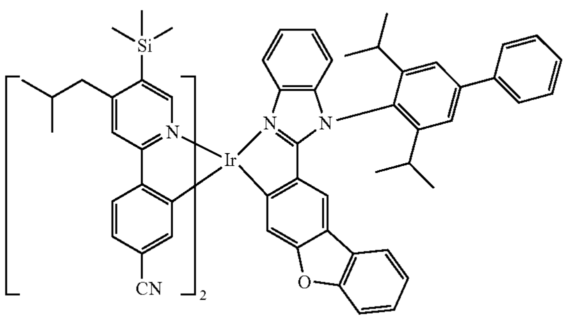
1035
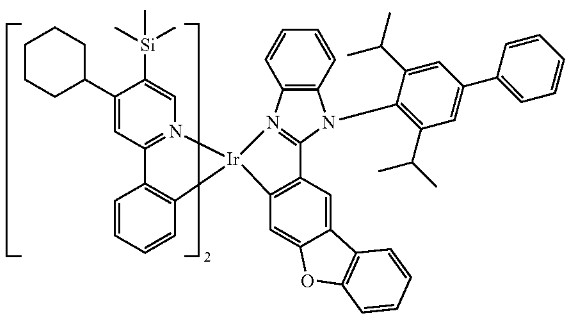
1036
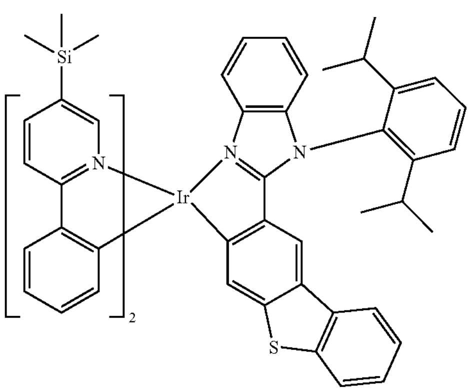
1037
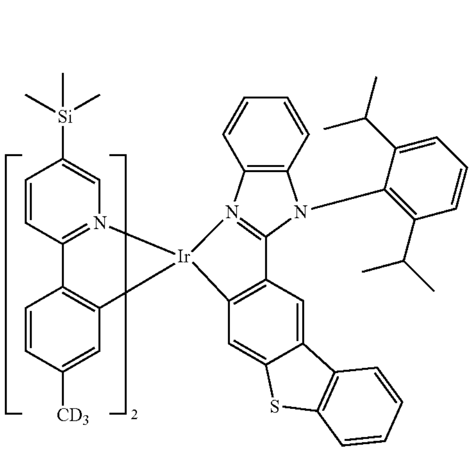
1038
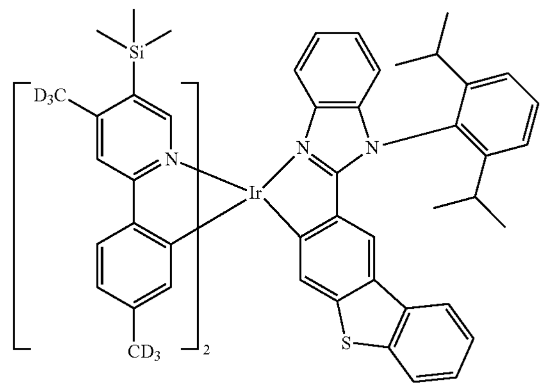
1039
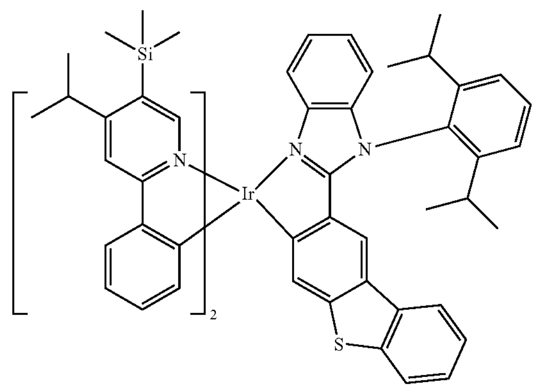
1040
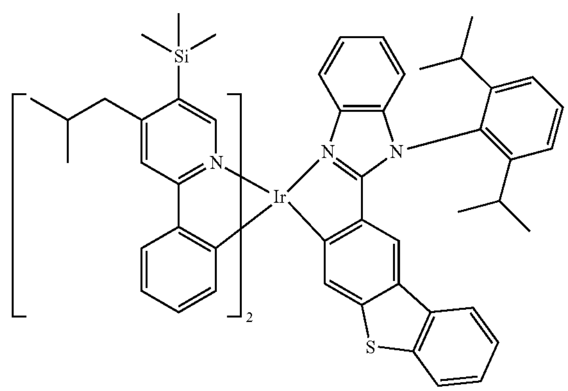
1041
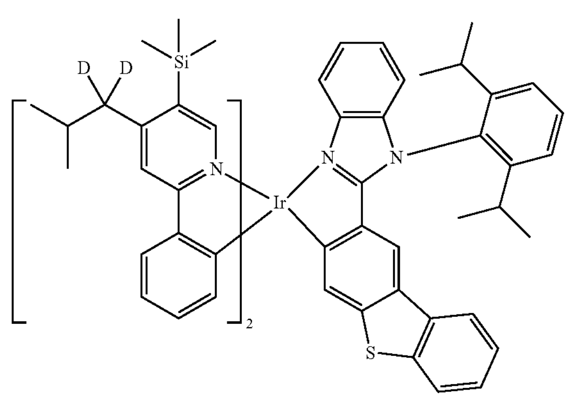

-continued
1042
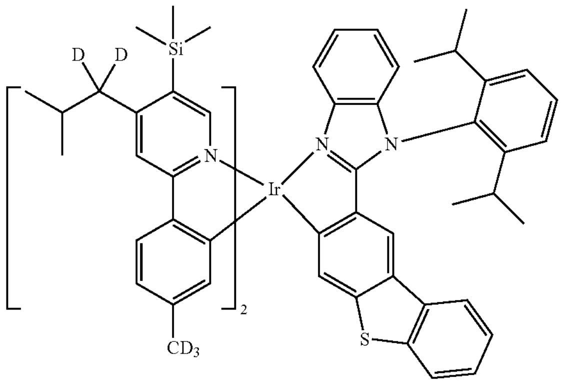
1043
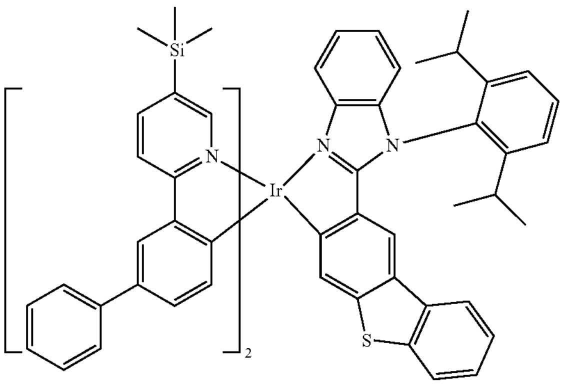
1044
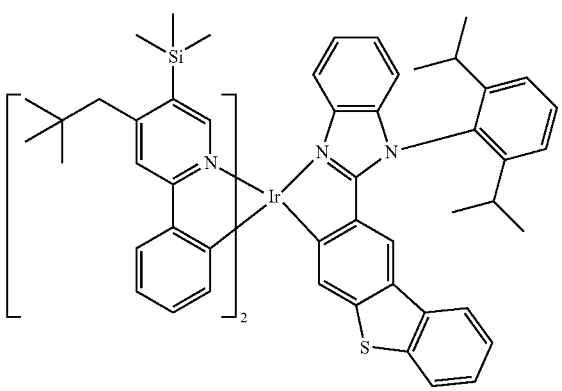
1045
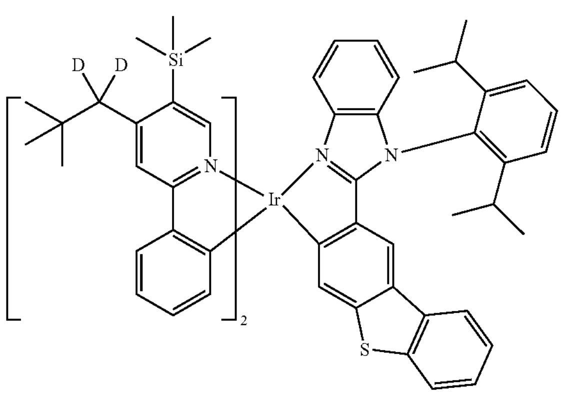
-continued
1046
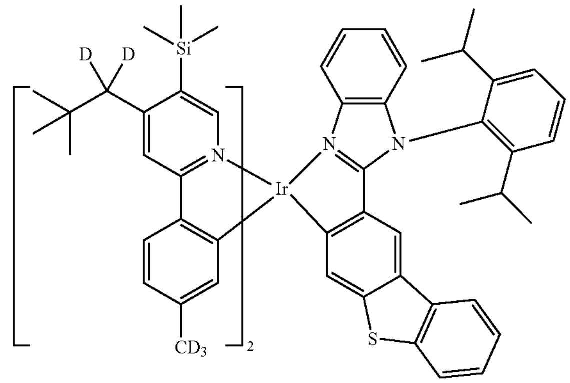
1047
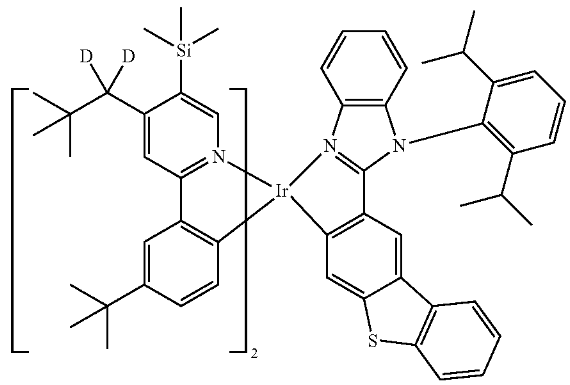
1048
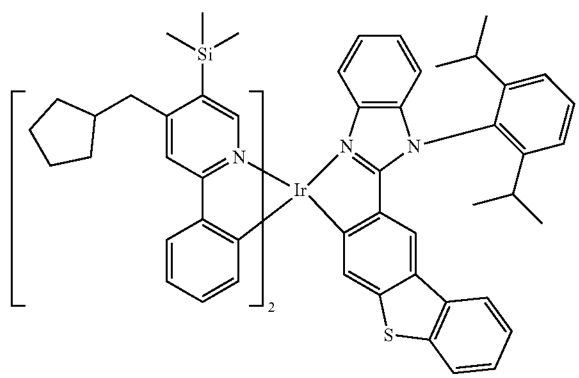
1049
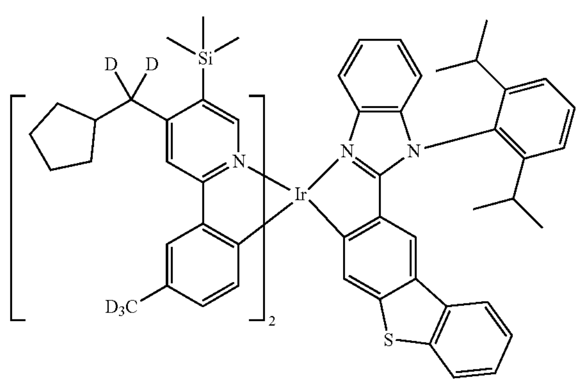

-continued
1050
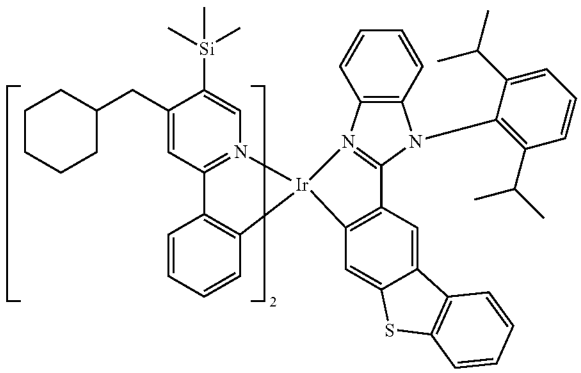
1051
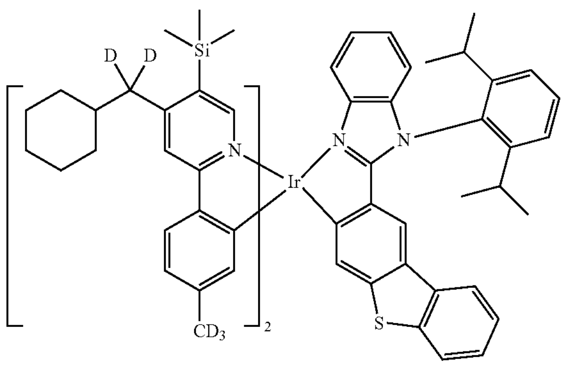
1052
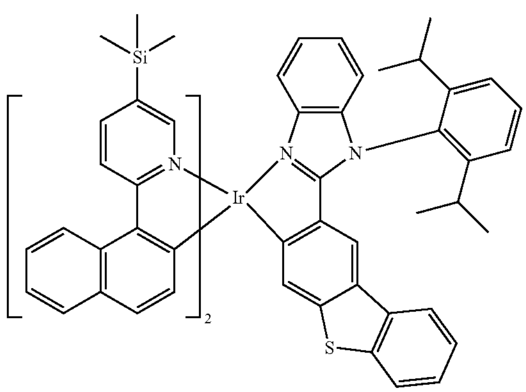
1053
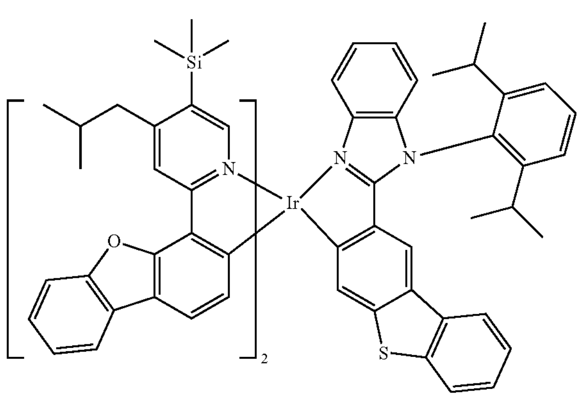
-continued
1054
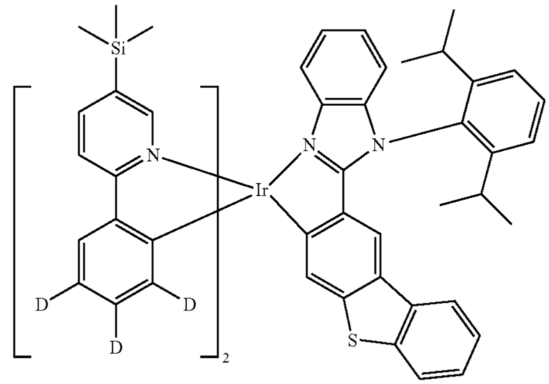
1055
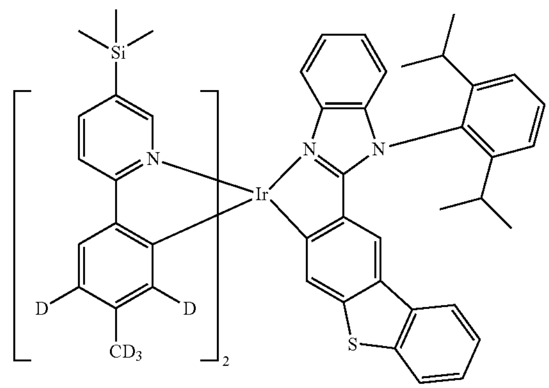
1056
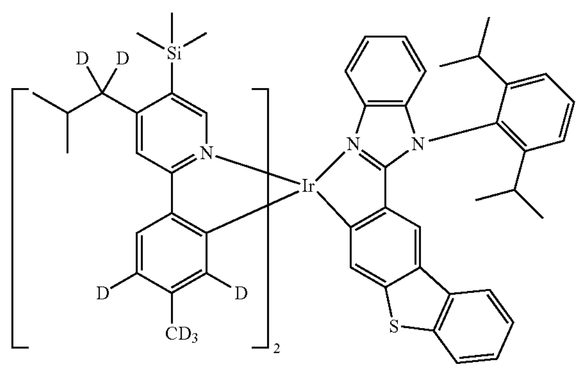
1057
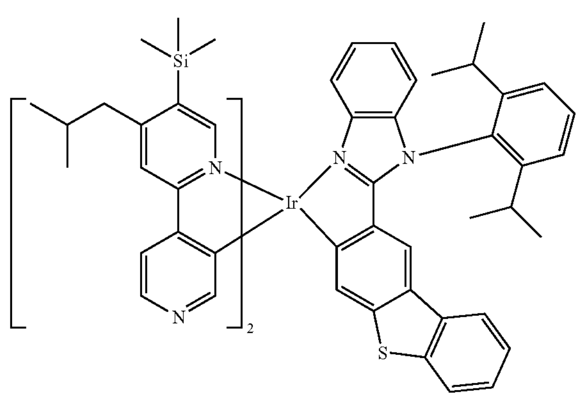

1058
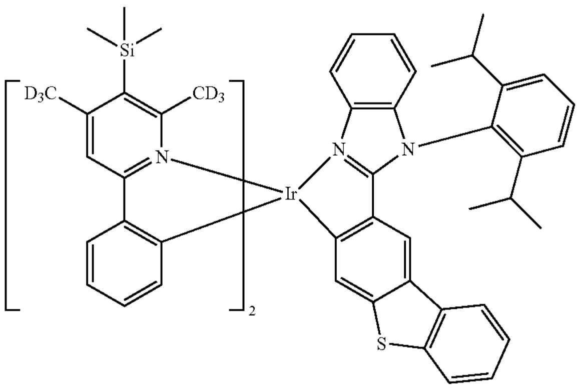
1059
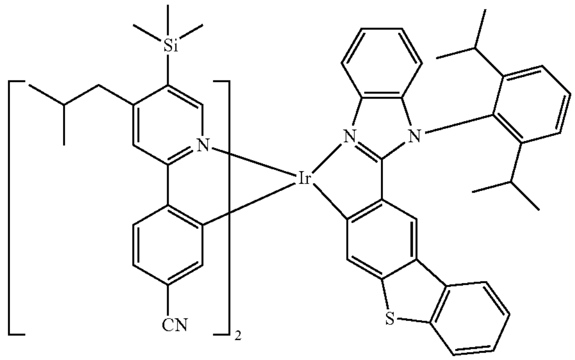
1060
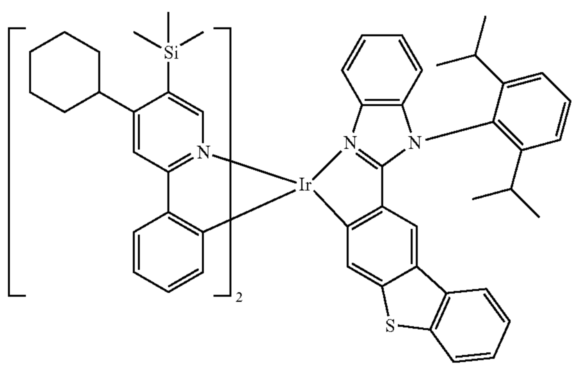
1061
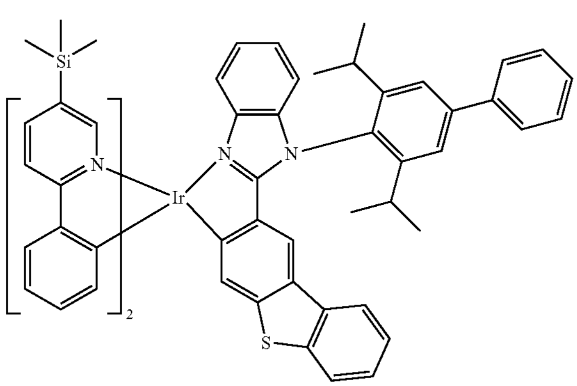
1062
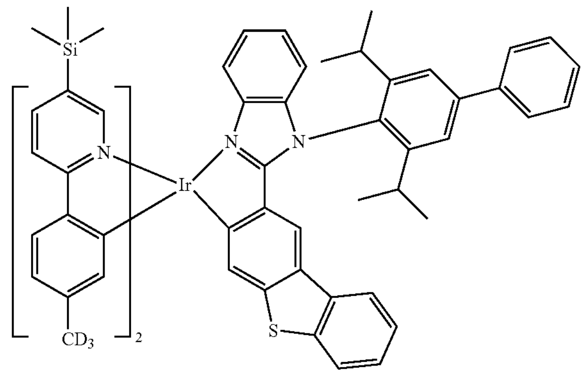
1063
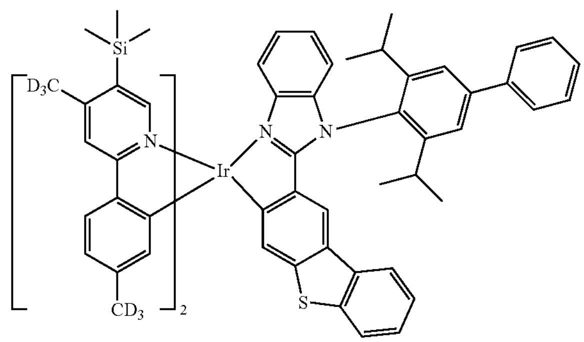
1064
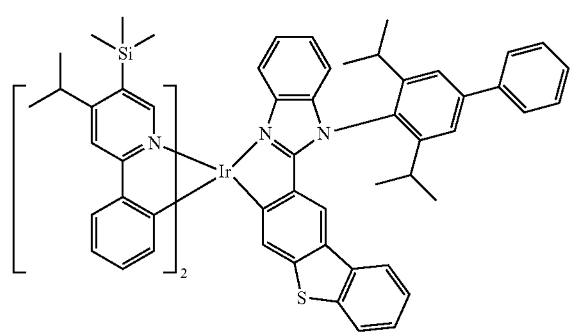
1065
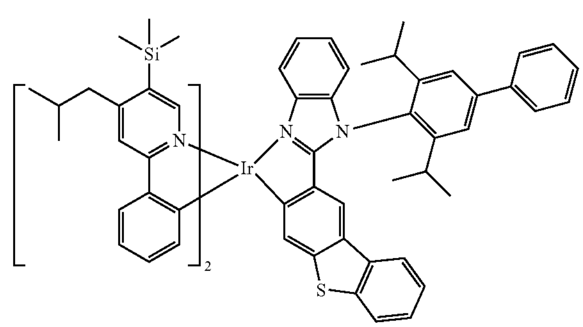

-continued
1066
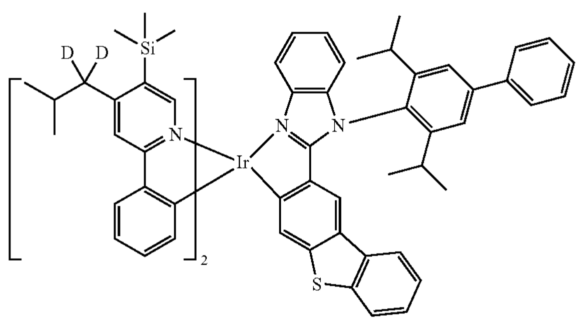
1067
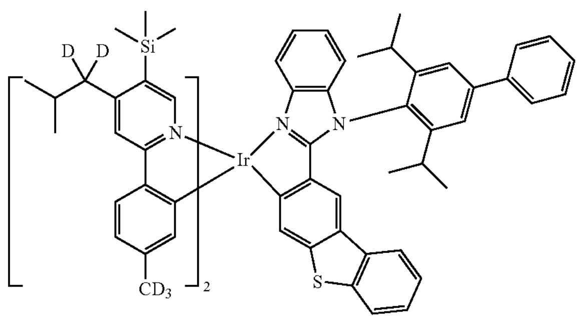
1068
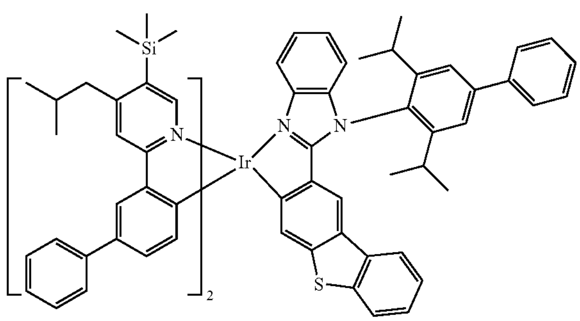
1069
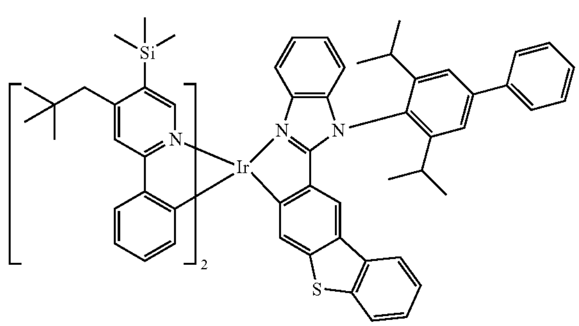
-continued
1070
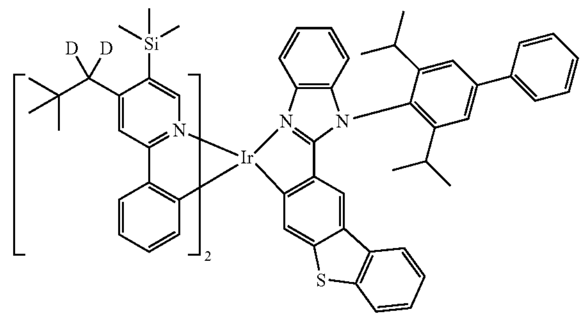
1071
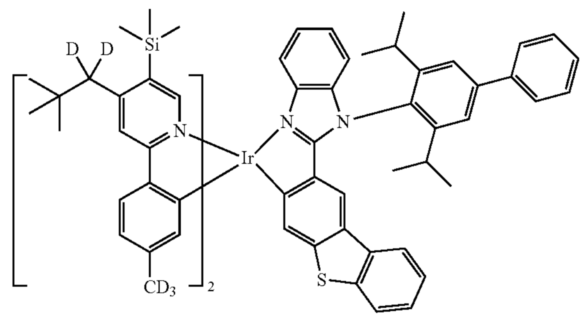
1072
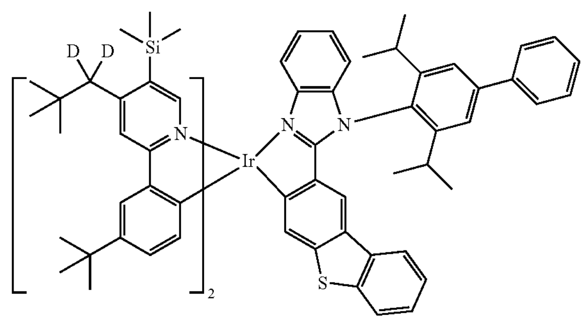
1073
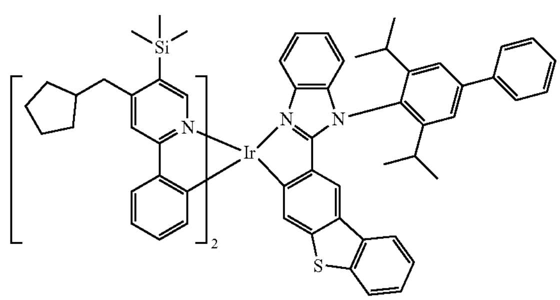
1074
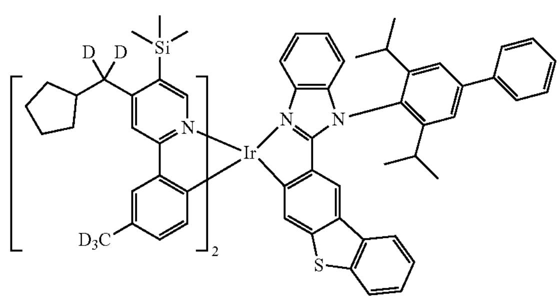

-continued
1075
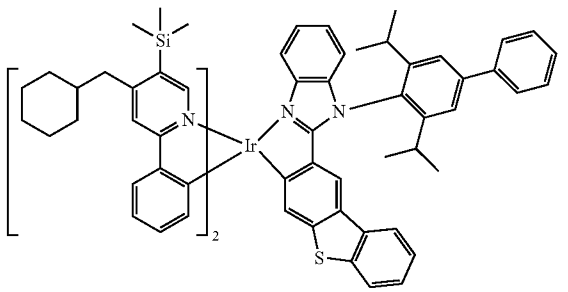
1076
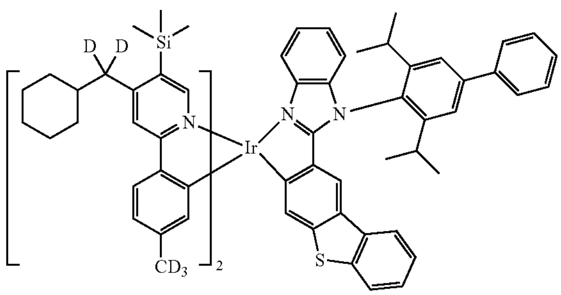
1077
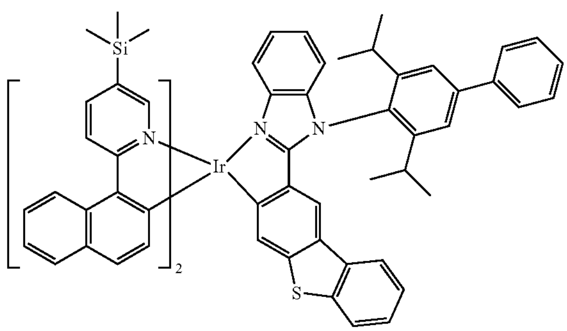
1078
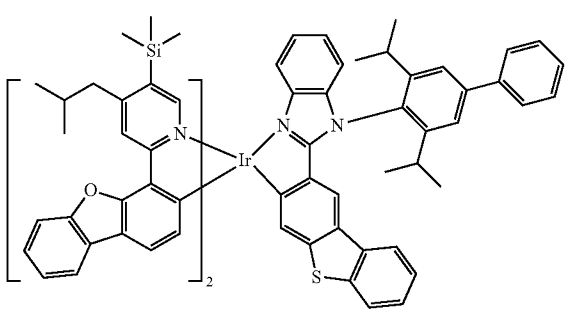
1079
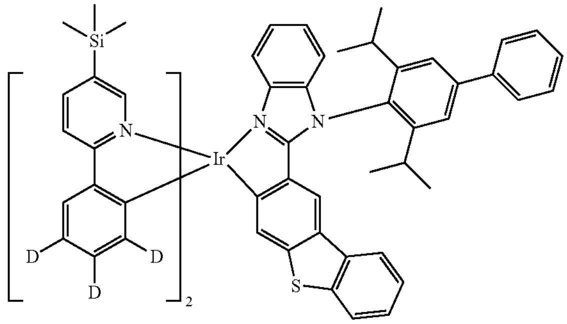
-continued
1080
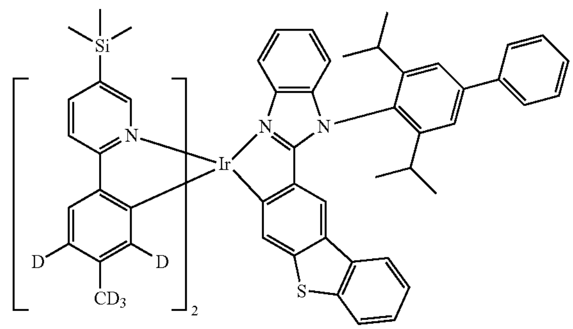
1081
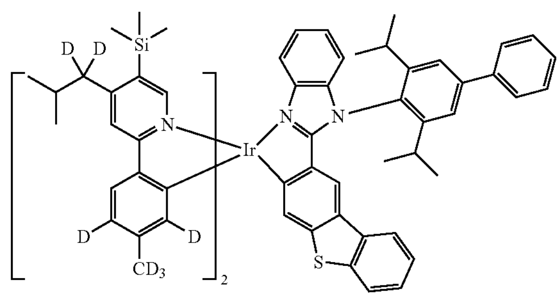
1082
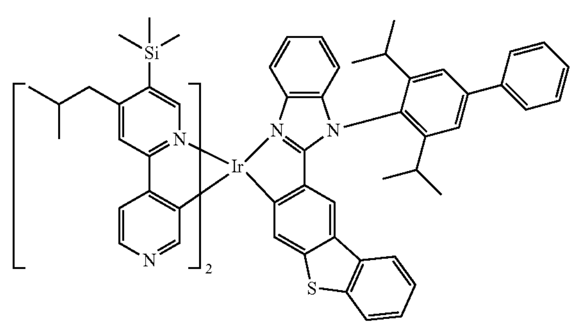
1083
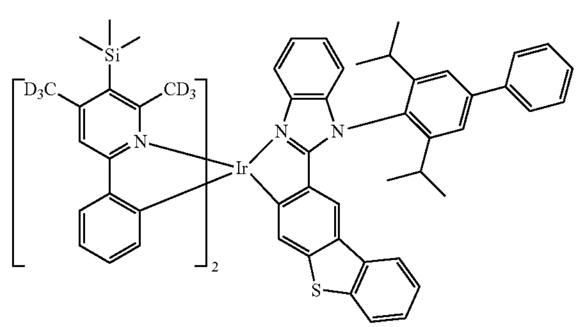

-continued
1084
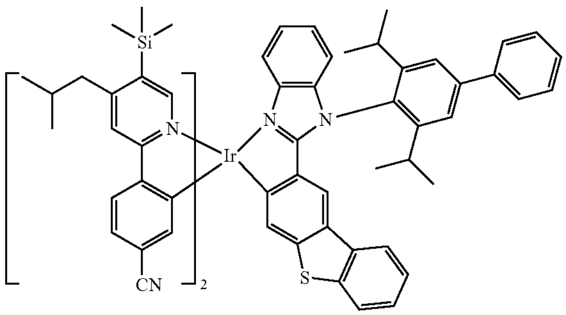
1085
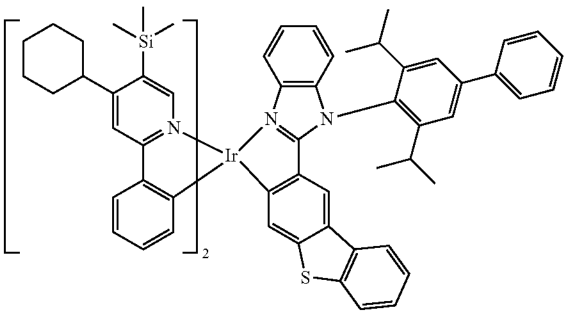
1086
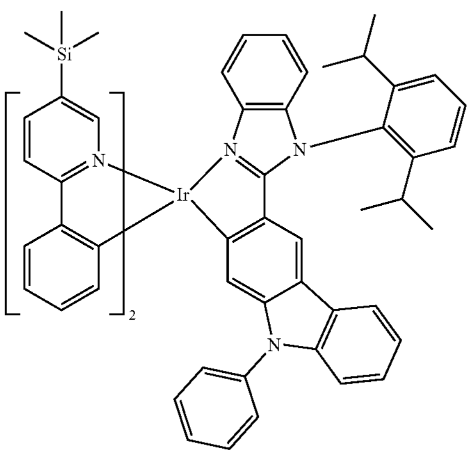
1087
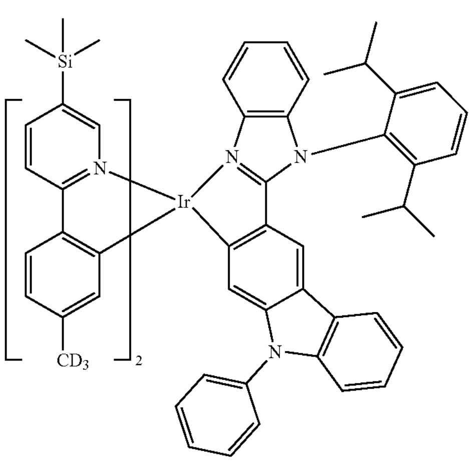
-continued
1088
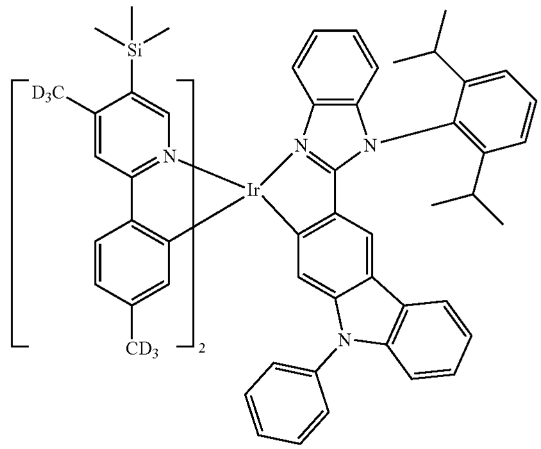
1089
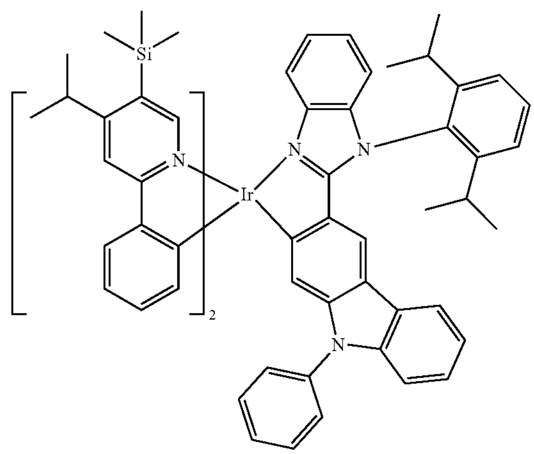
1090
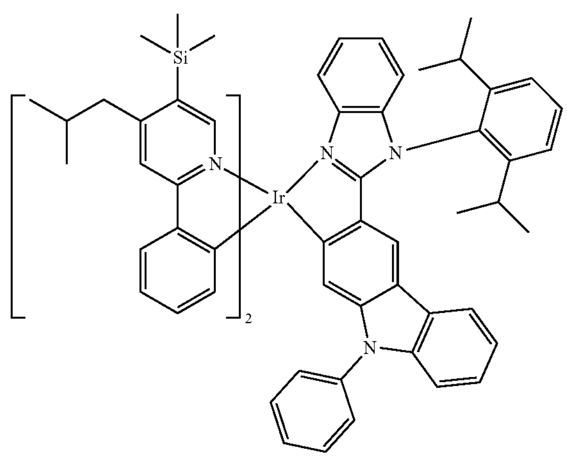

-continued
1091
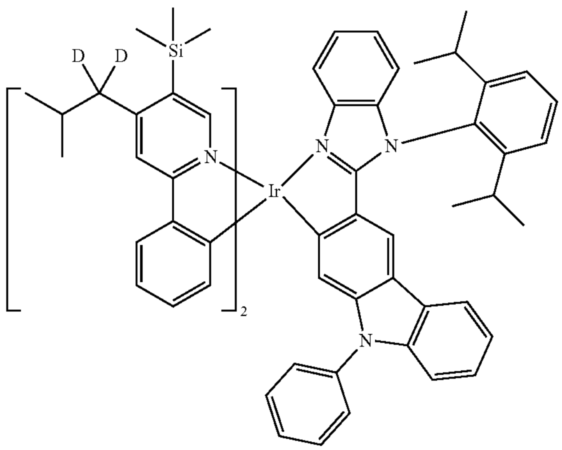
1092
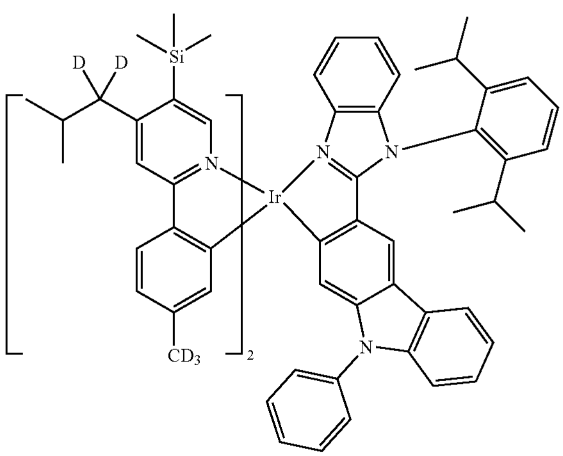
1093
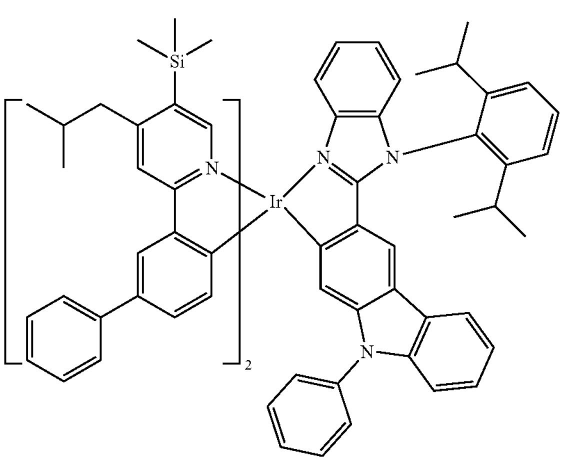
-continued
1094
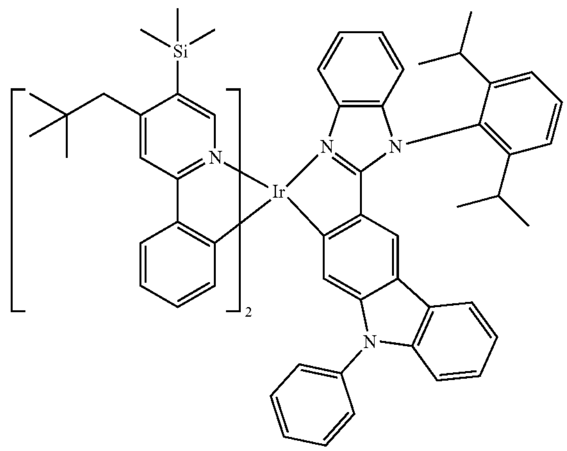
1095
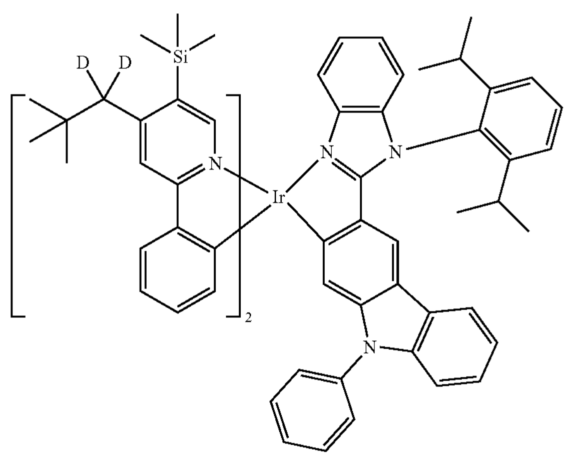
1096
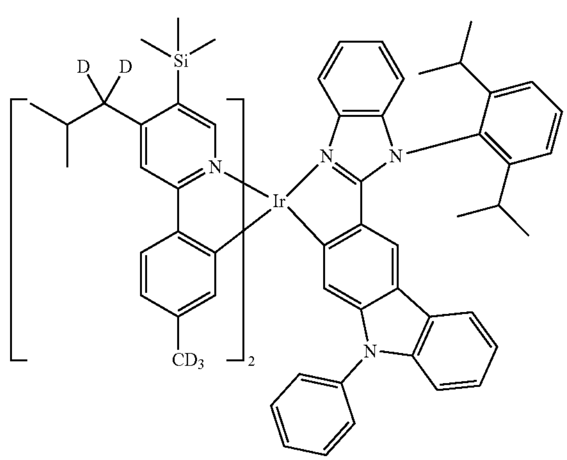

-continued
1097
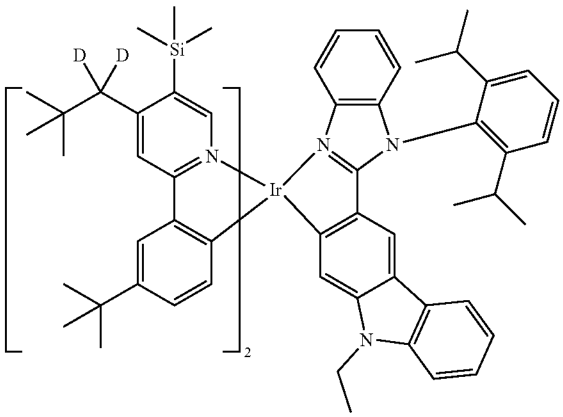
1098
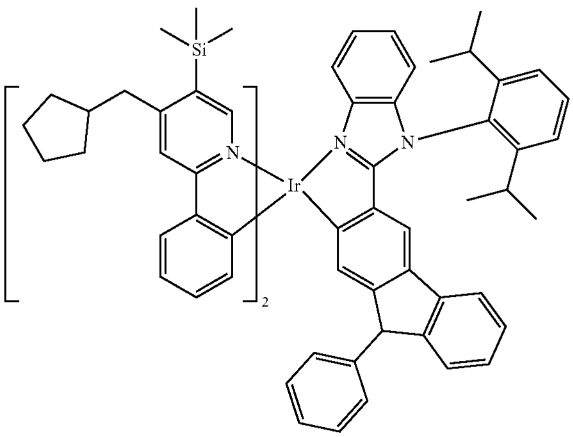
1099
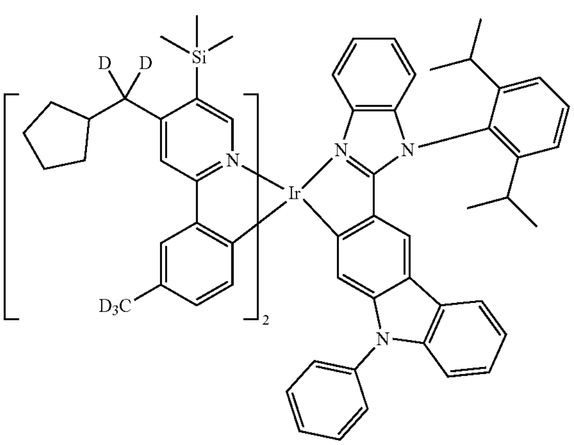
-continued
1100
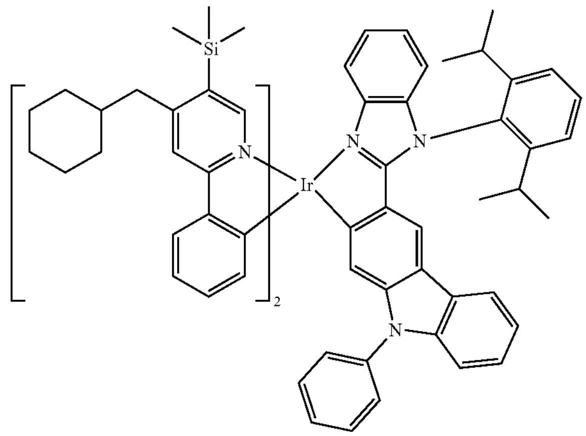
1101
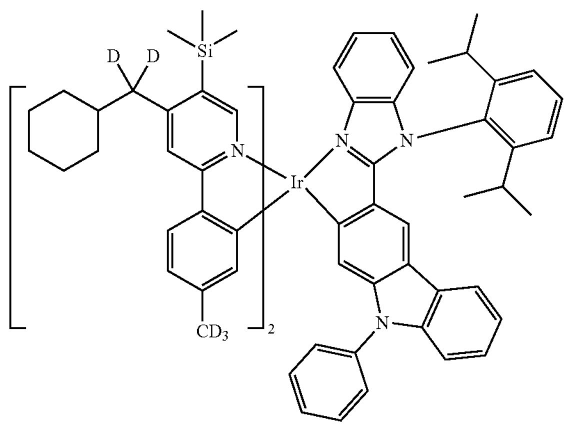
1102
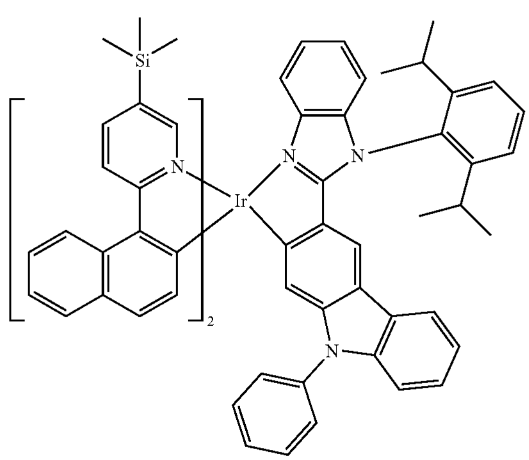

-continued
1103
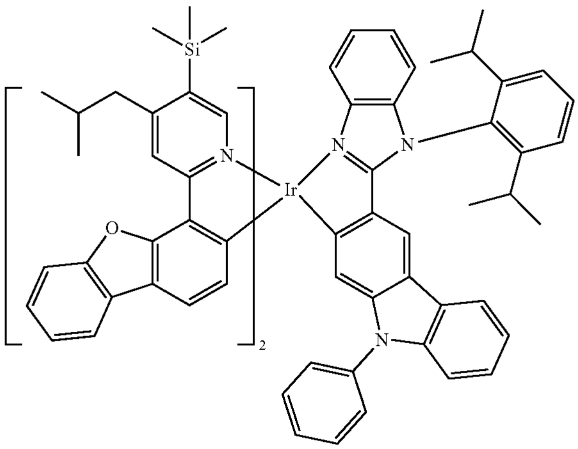
1104
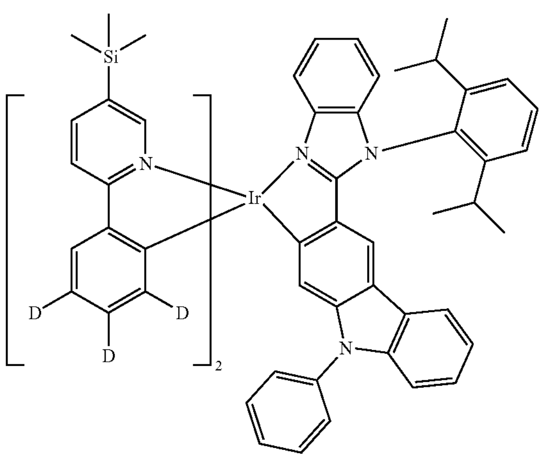
1105
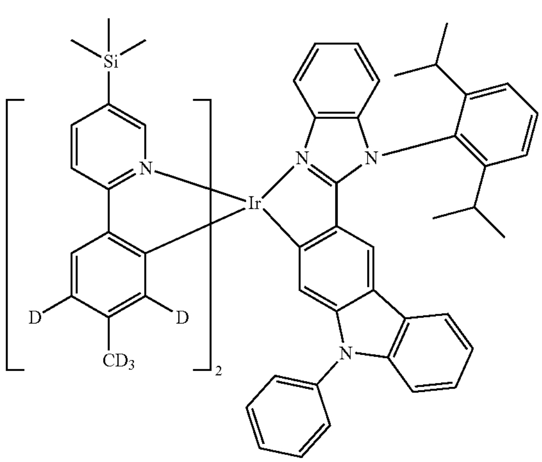
-continued
1106
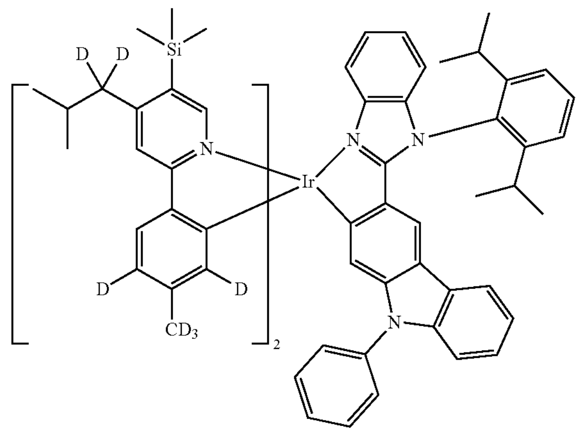
1107
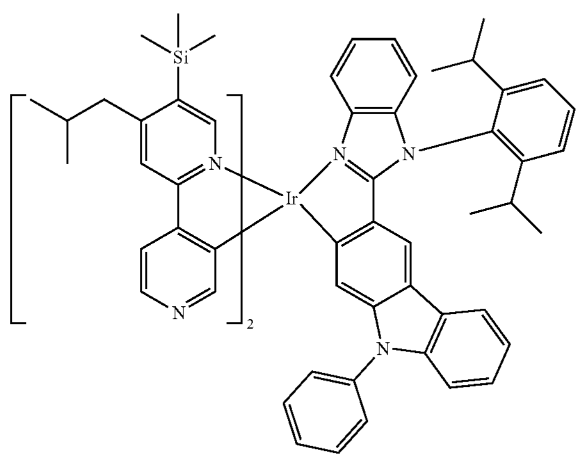
1108
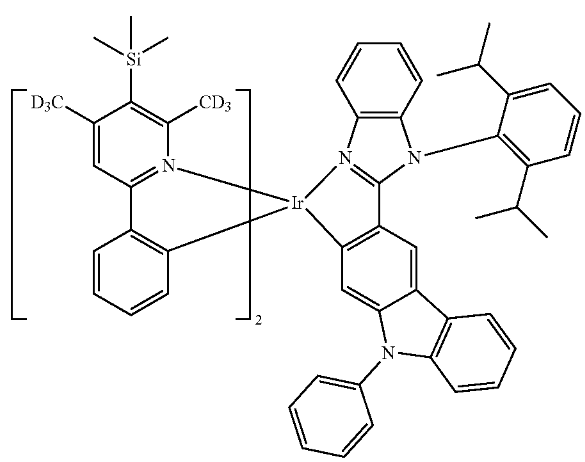

-continued
1109
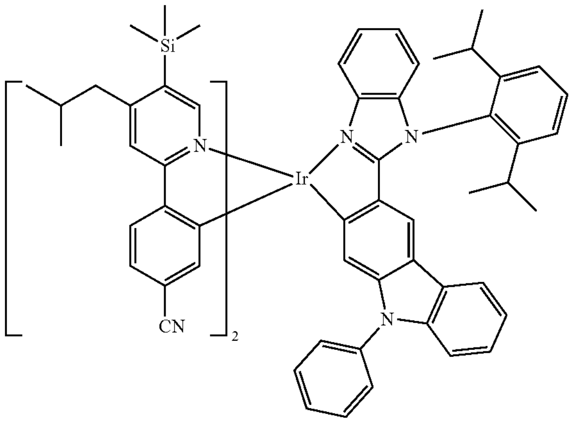
1110
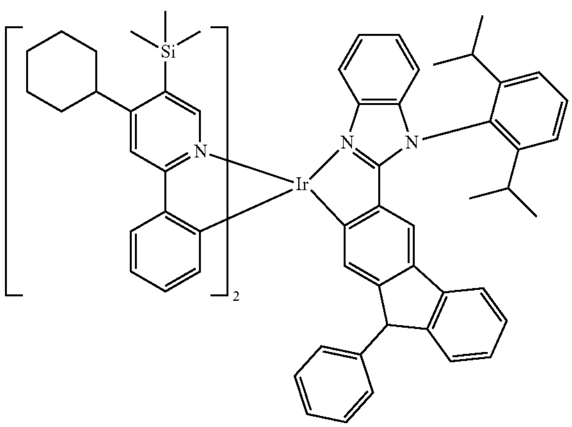
1111
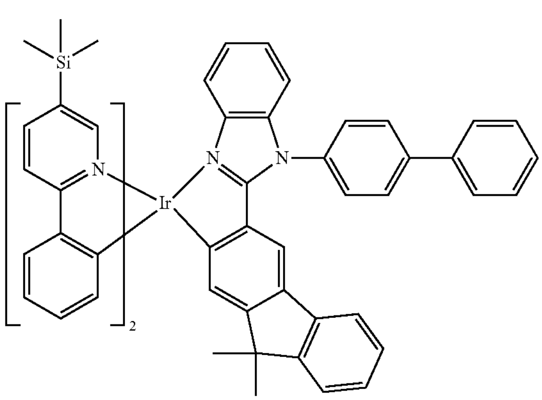
-continued
1112
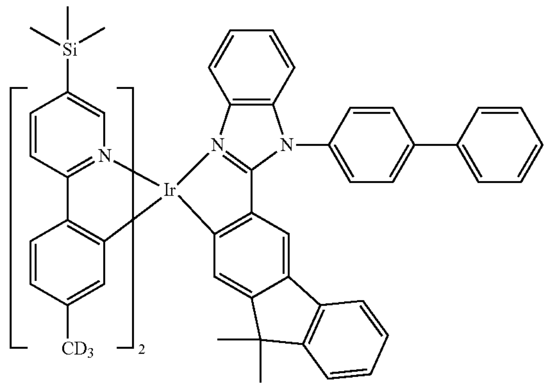
1113
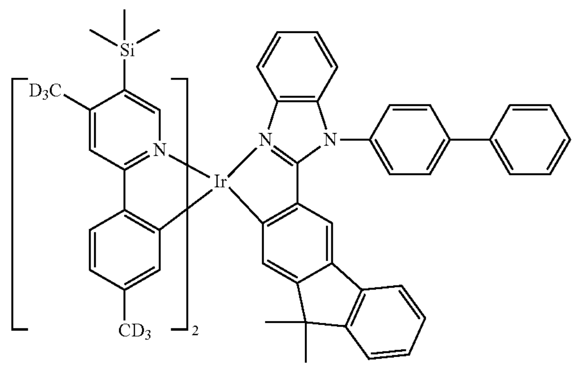
1114
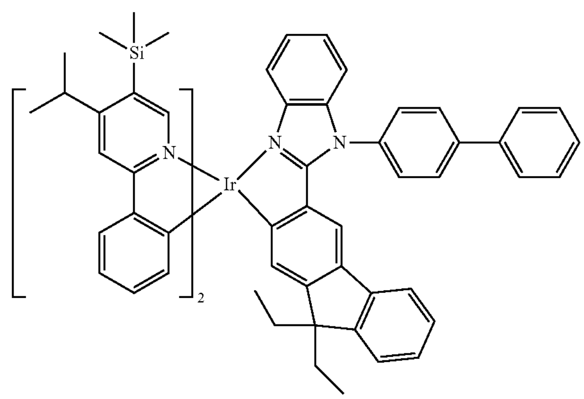
1115
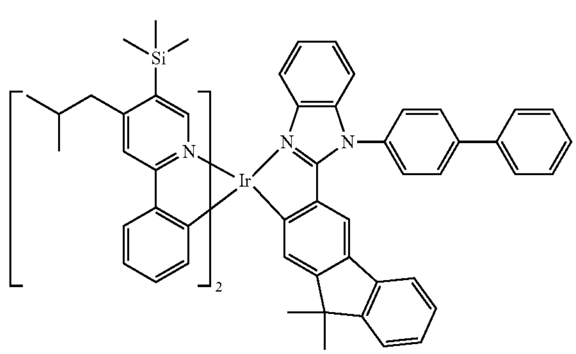

-continued
1116
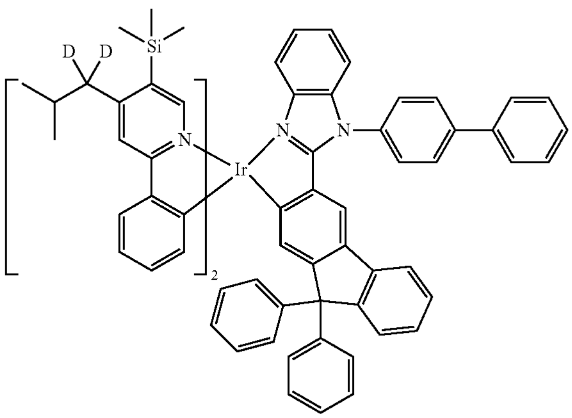
1117
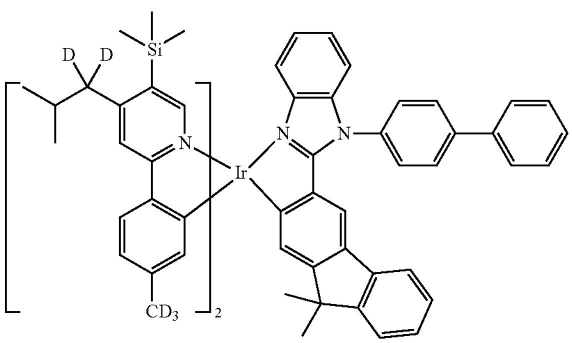
1118
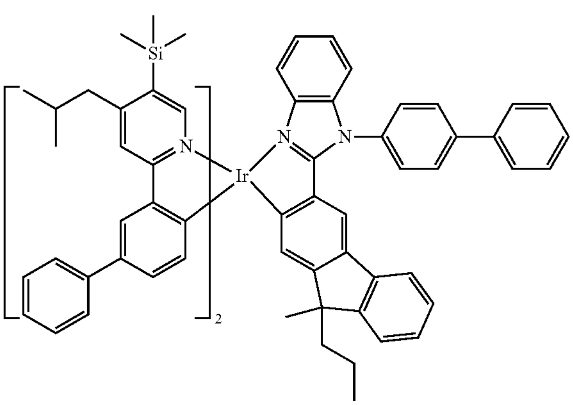
1119
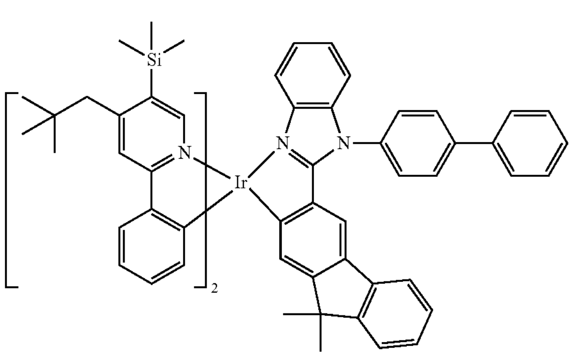
-continued
1120
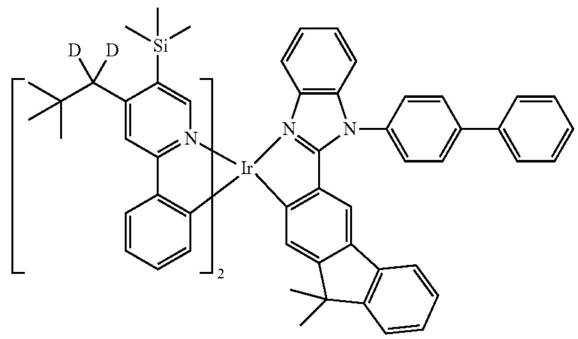
1121
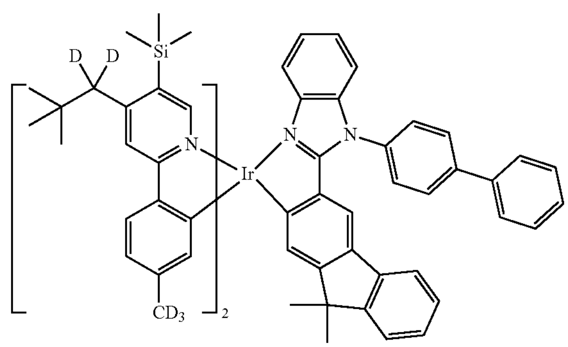
1122
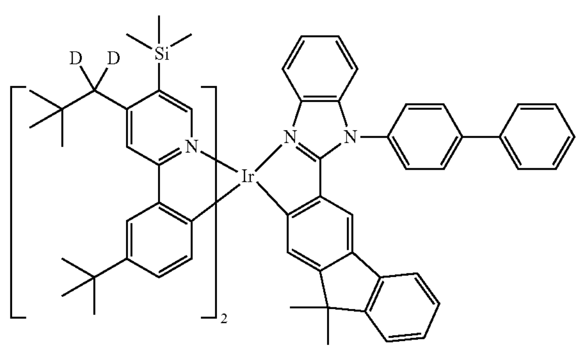
1123
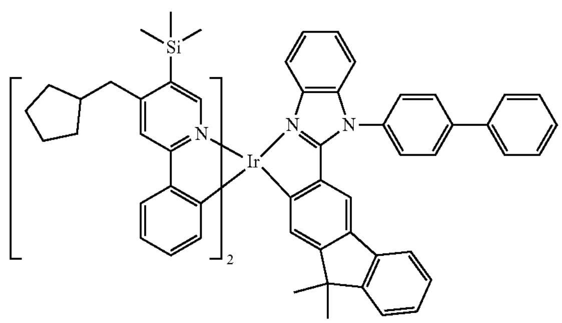

1124
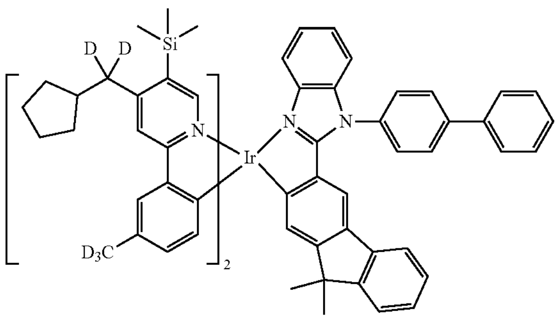
1125
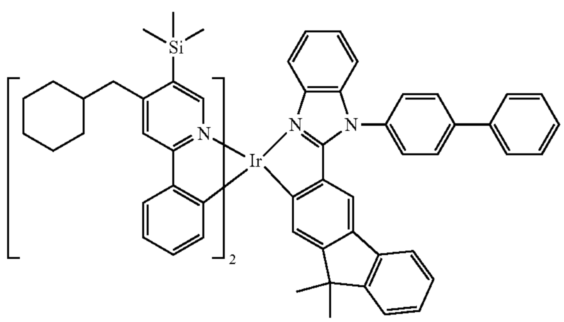
1126
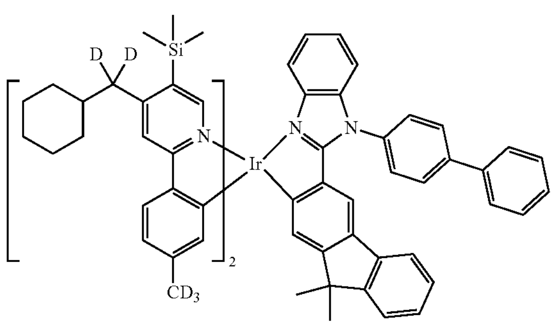
1127
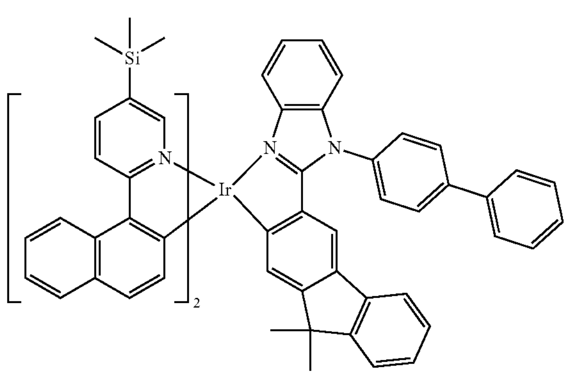
1128
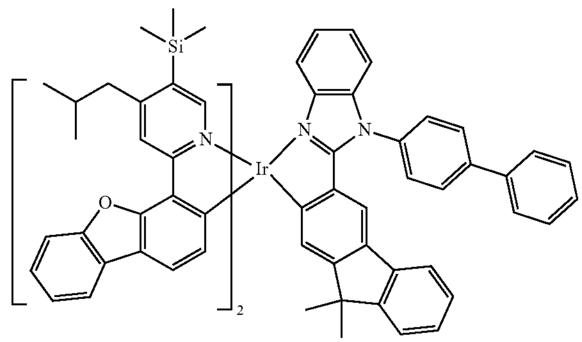
1129
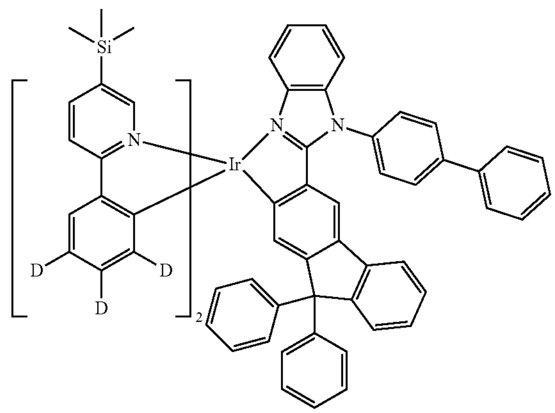
1130
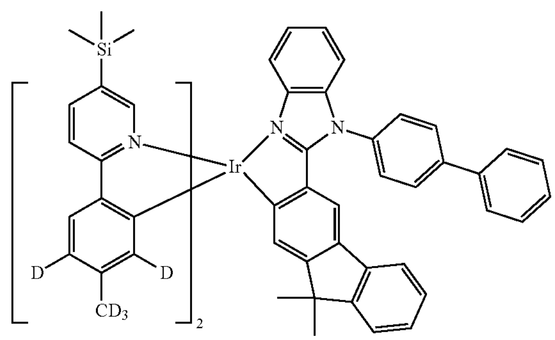
1131
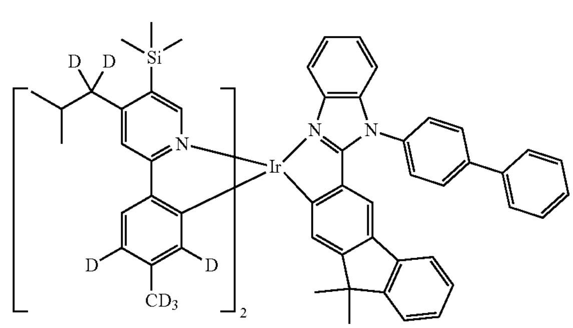

1132
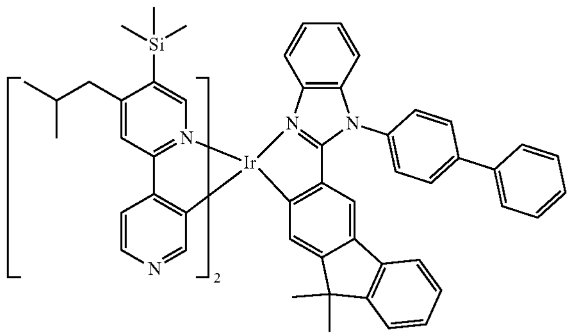
1133
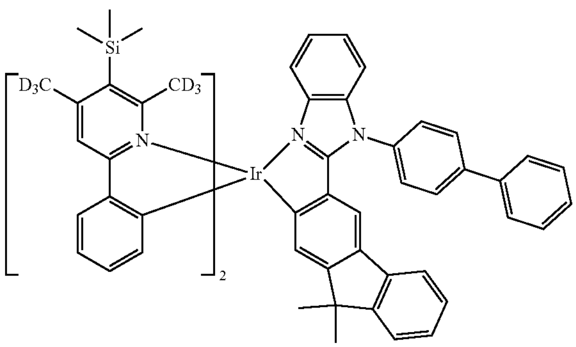
1134
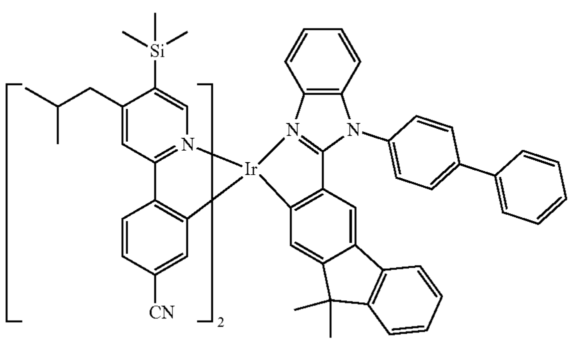
1135
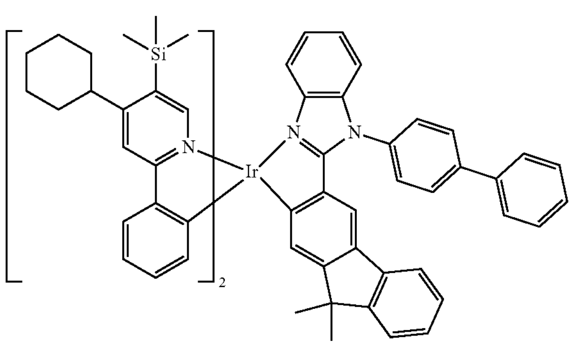
1136
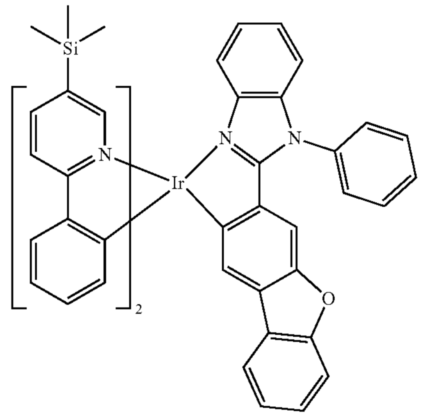
1137
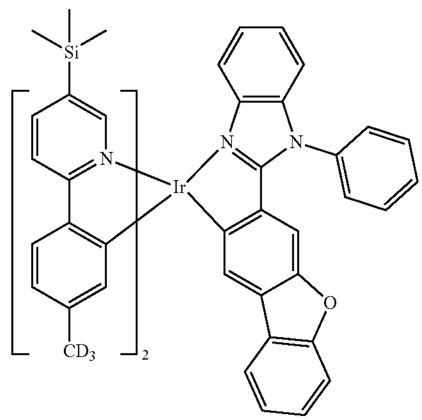
1138
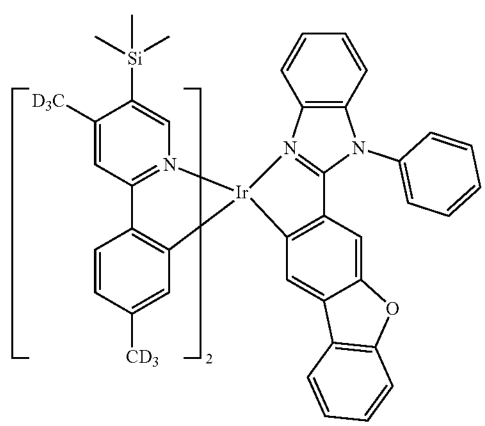

-continued
1139
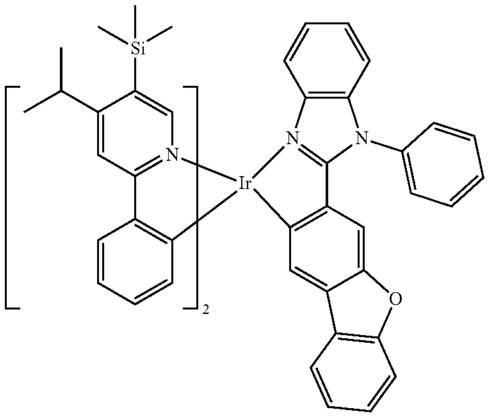
1140
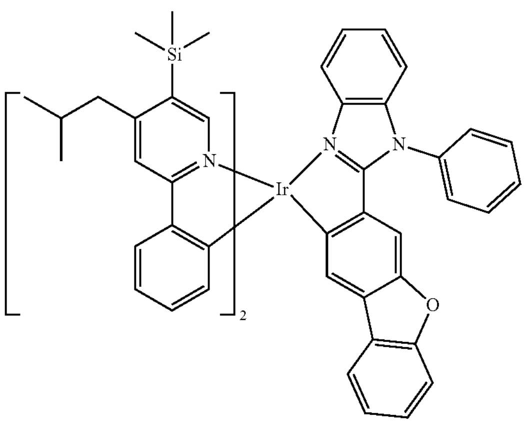
1141
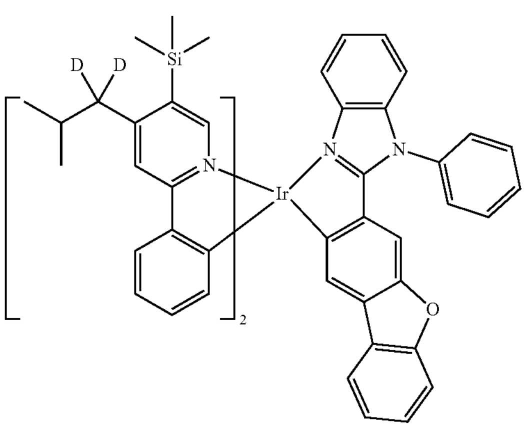
-continued
1142
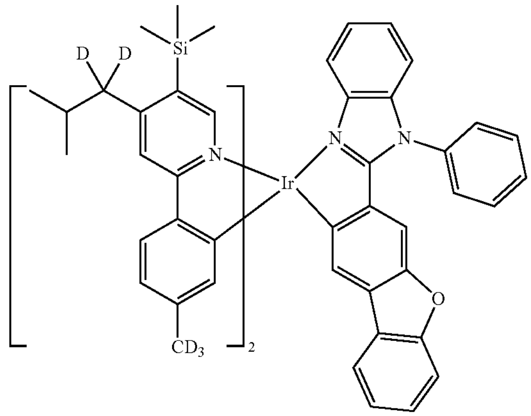
1143
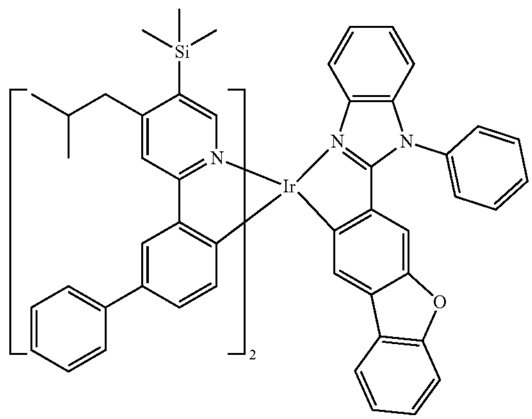
1144
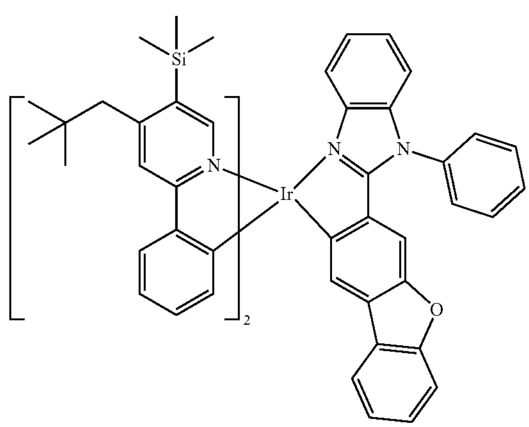

-continued
1145
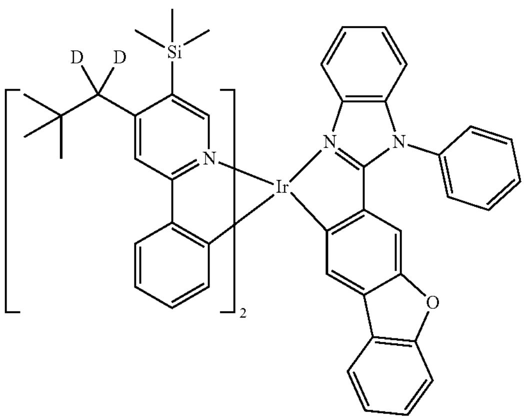
1146
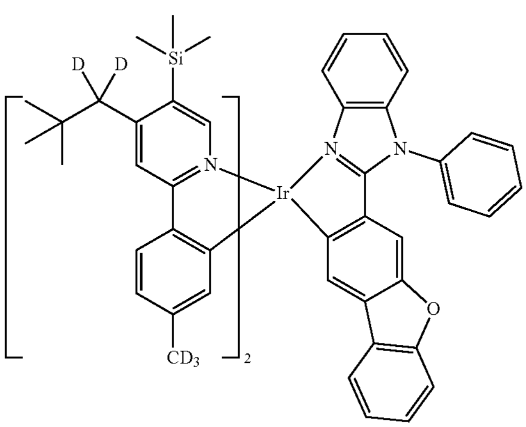
1147
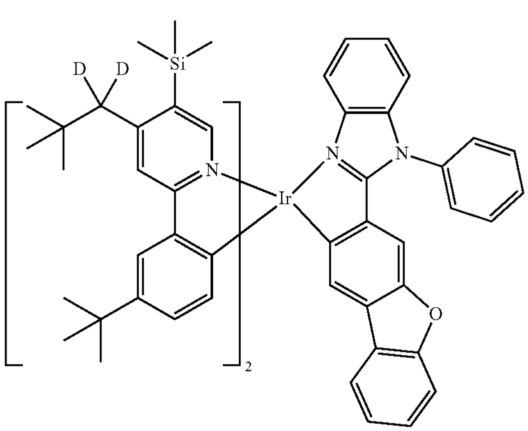
-continued
1148
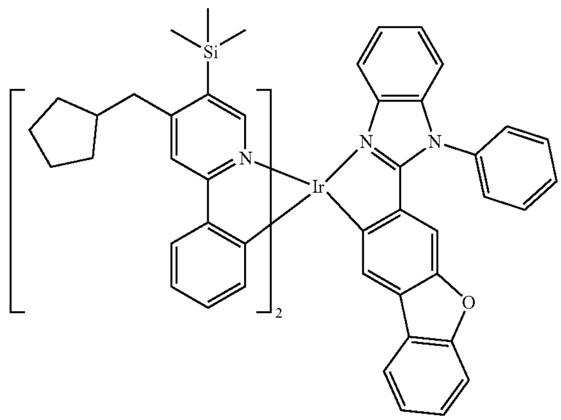
1149
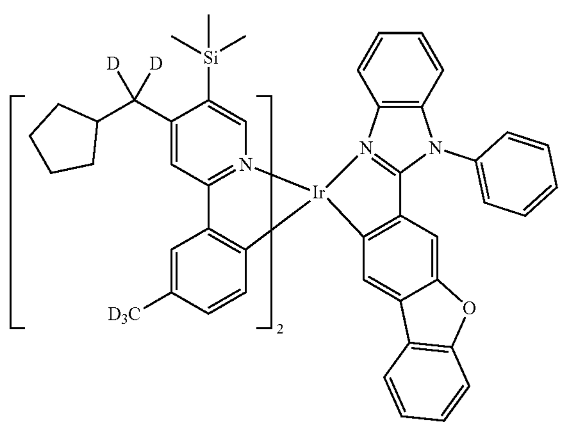
1150
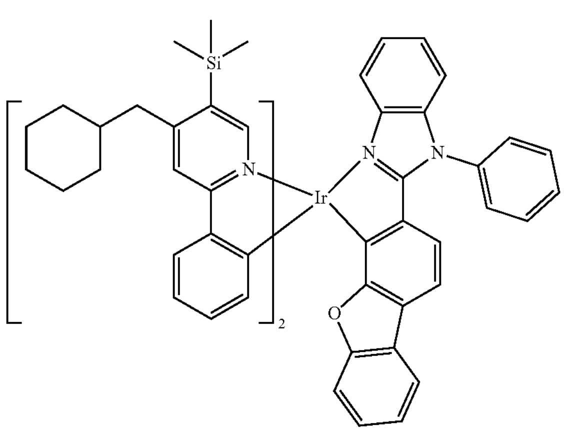

-continued
1151
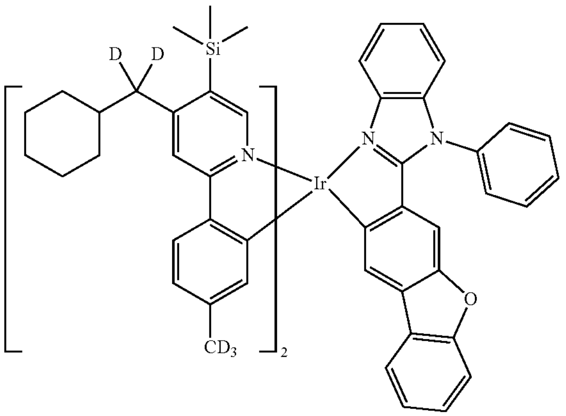
1152
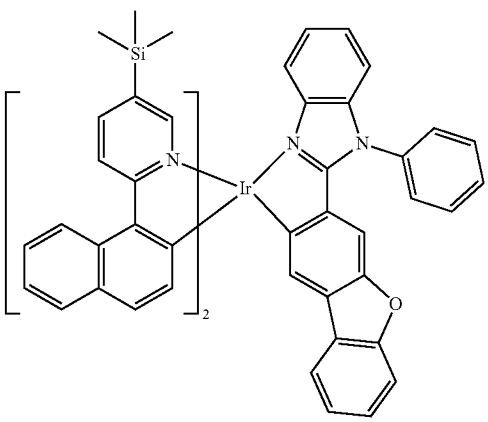
1153
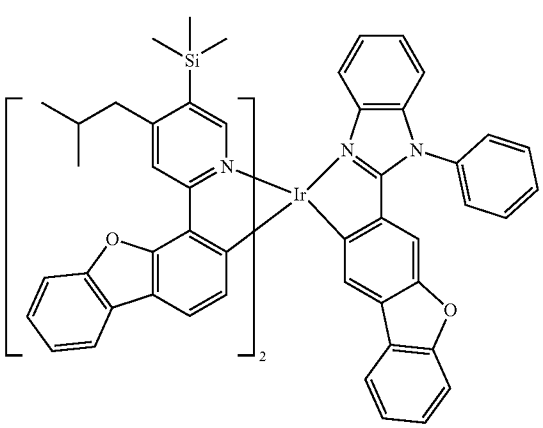
-continued
1154
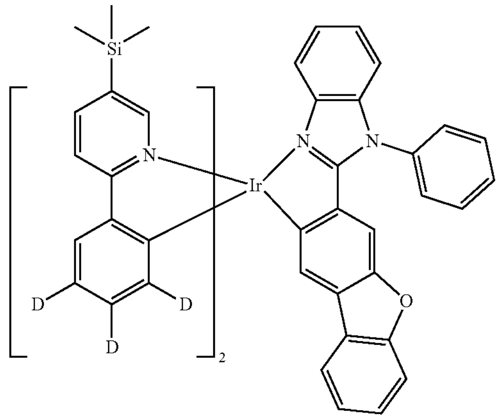
1155
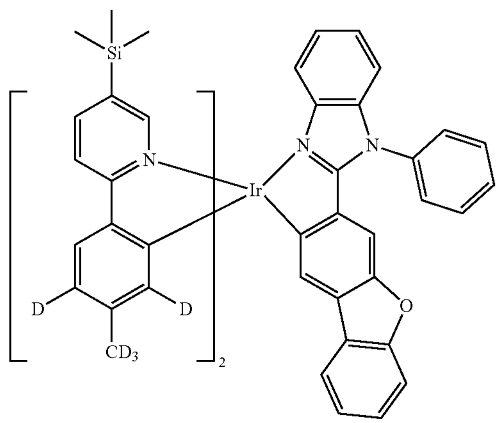
1156
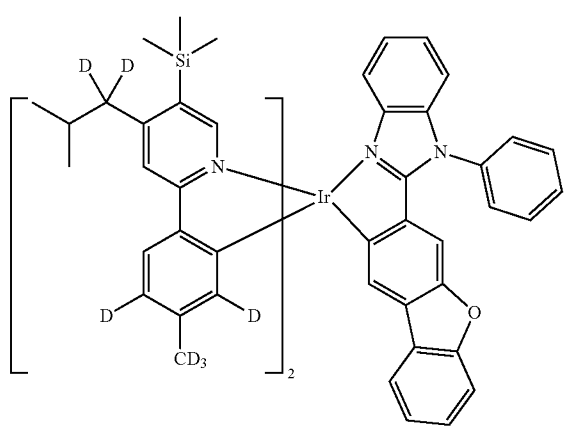

-continued
1157
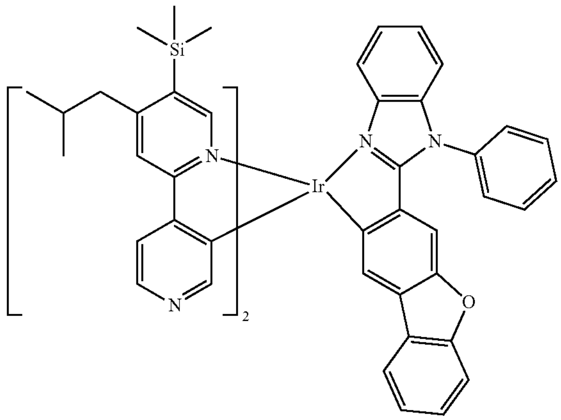
1158
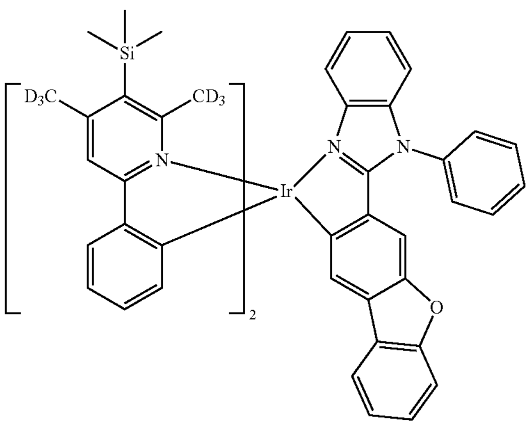
1159
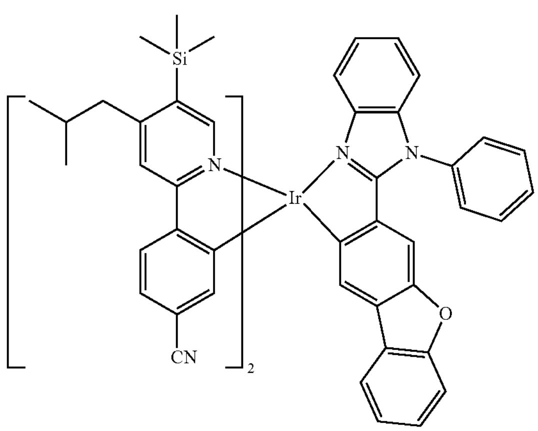
-continued
1160
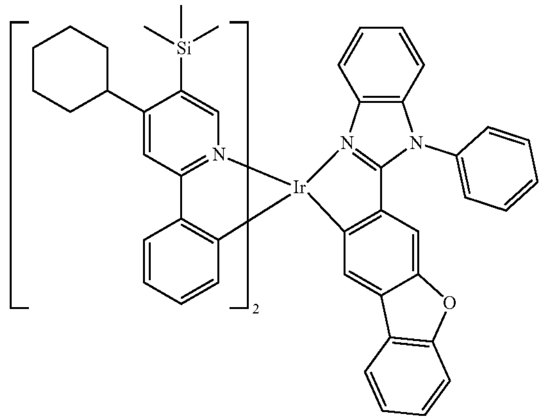
1161
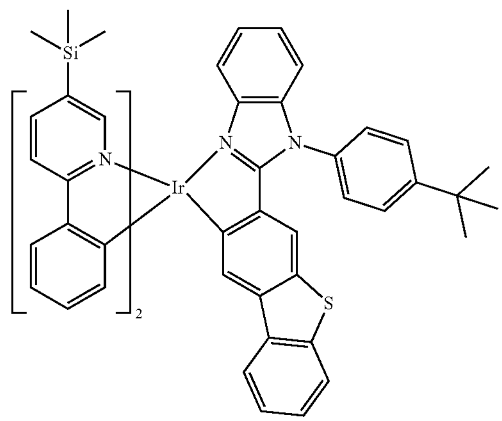
1162
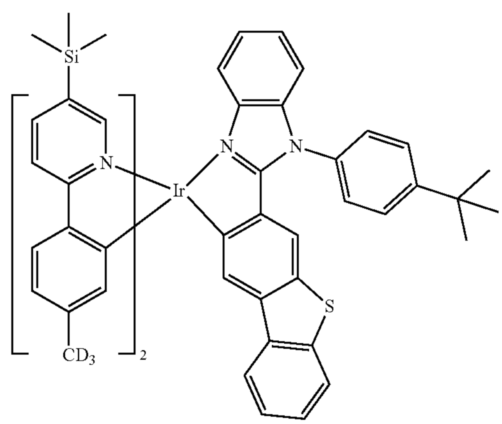

1163
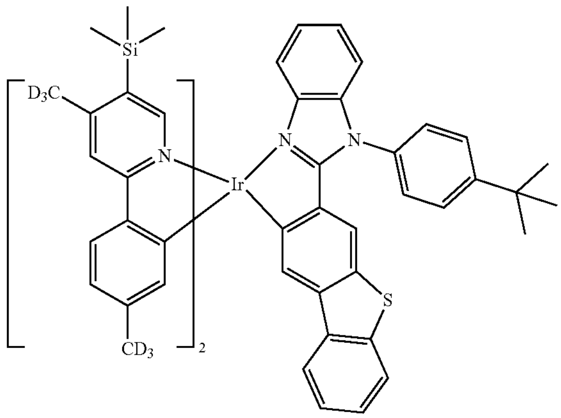
1164
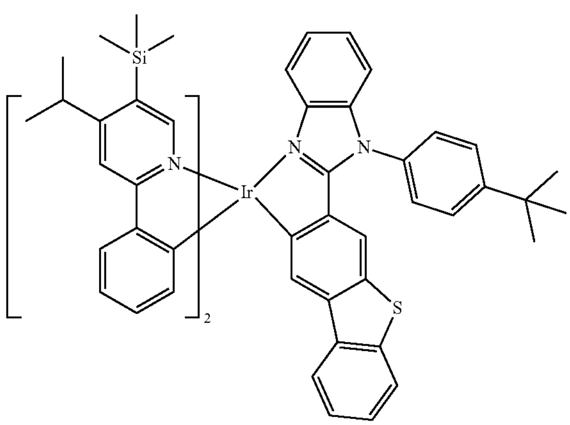
1165
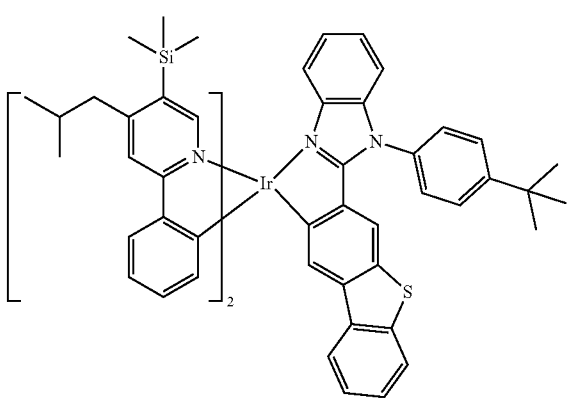
1166
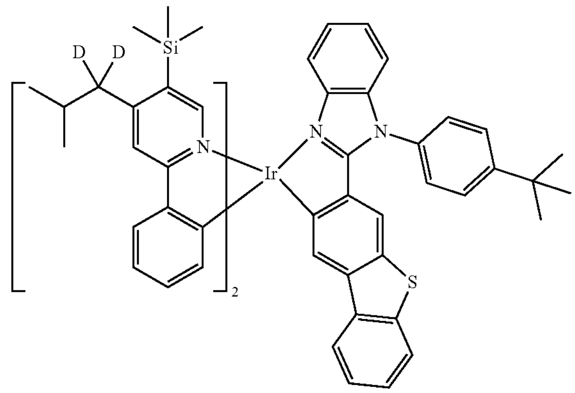
1167
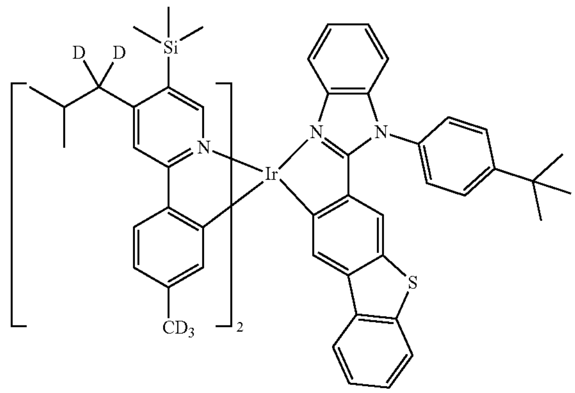
1168
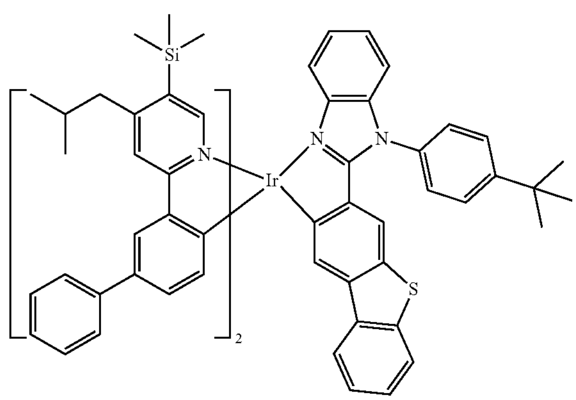
1169
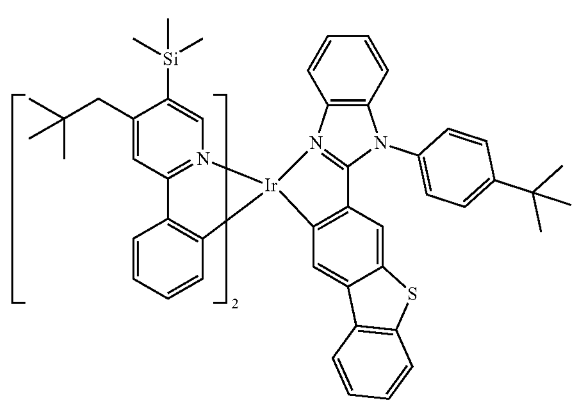

-continued
1170
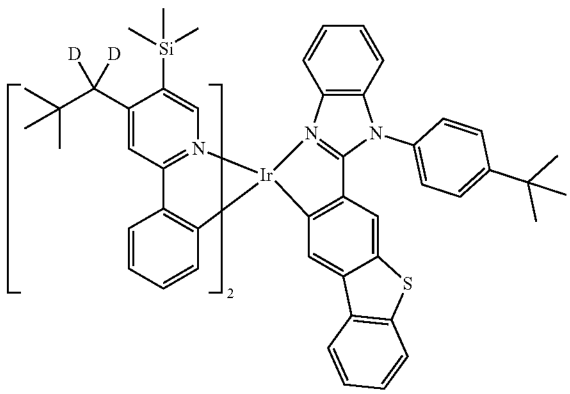
1171
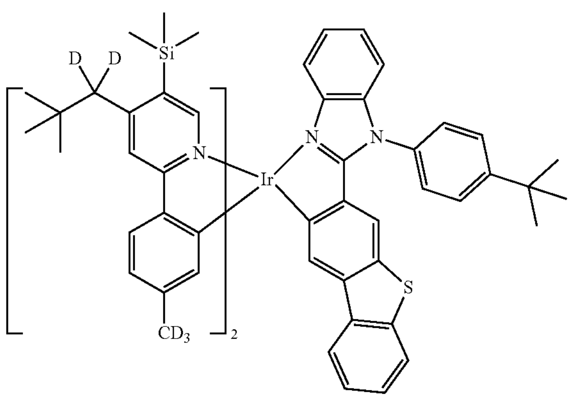
1172
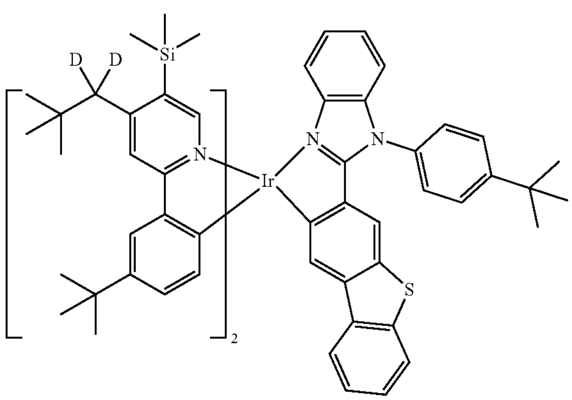
1173
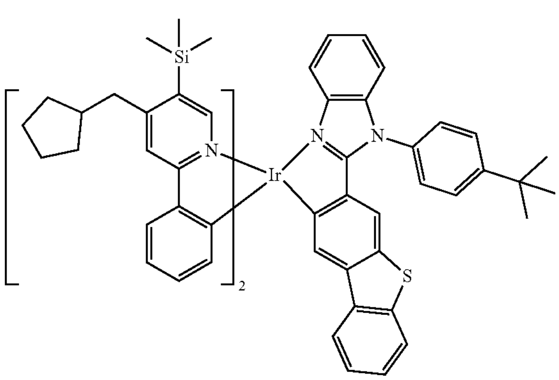
-continued
1174
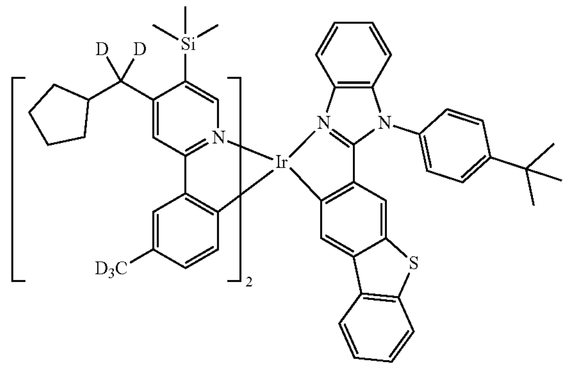
1175
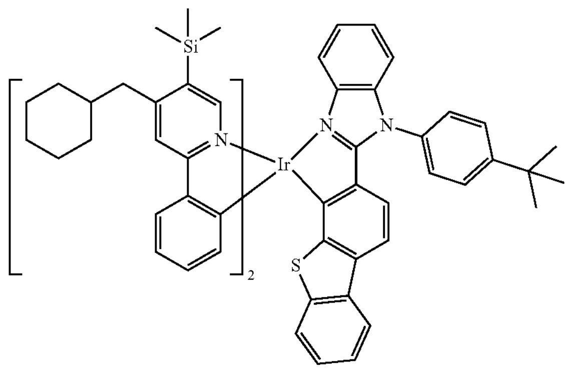
1176
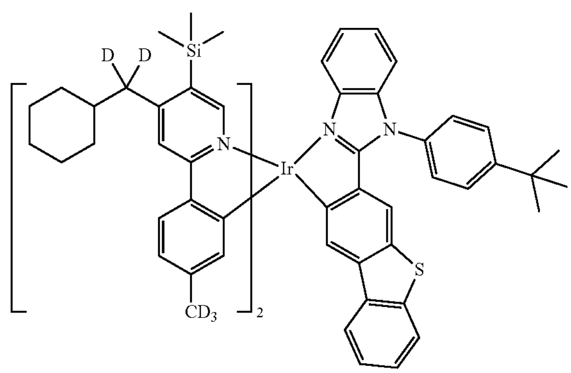
1177
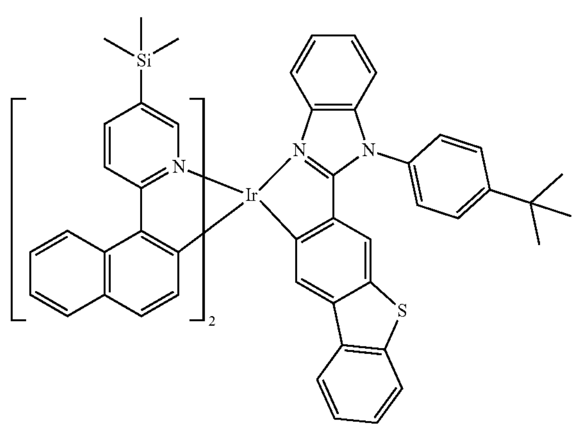

-continued
1178
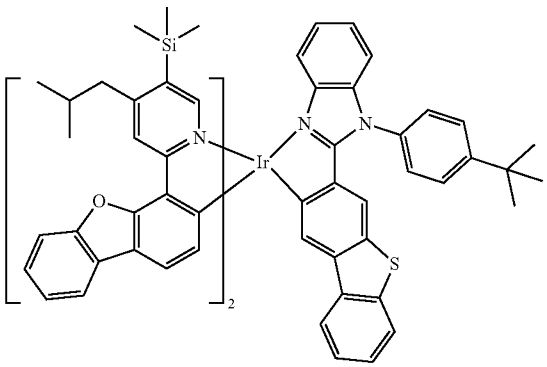
1179
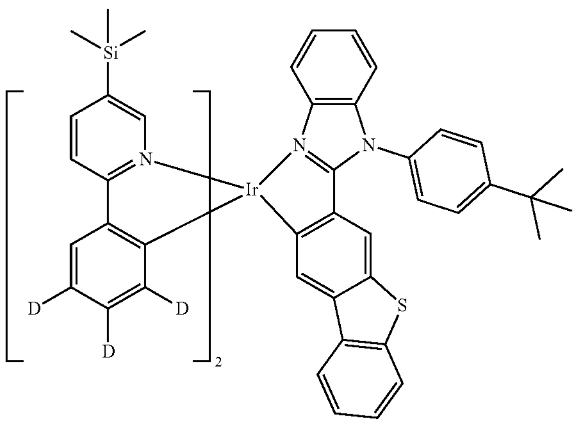
1180
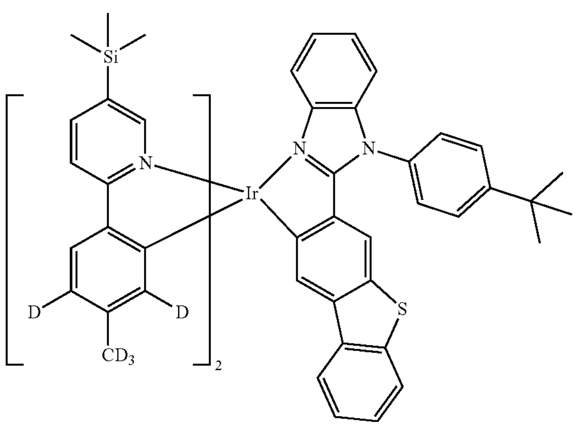
1181
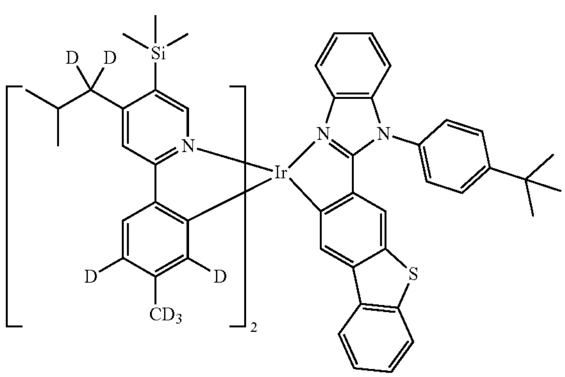
-continued
1182
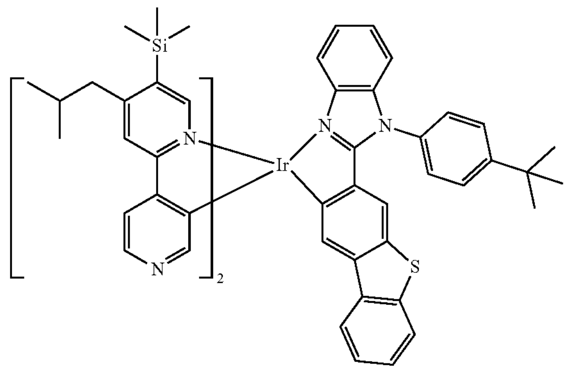
1183
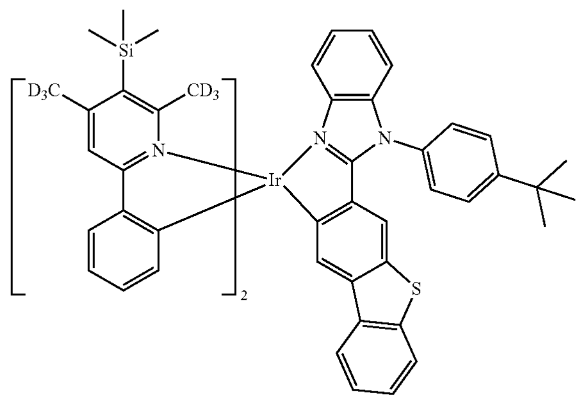
1184
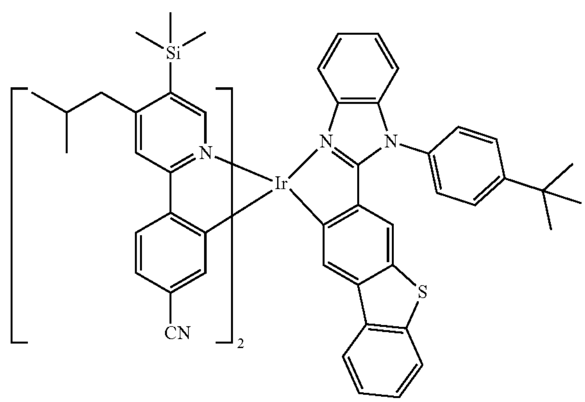
1185
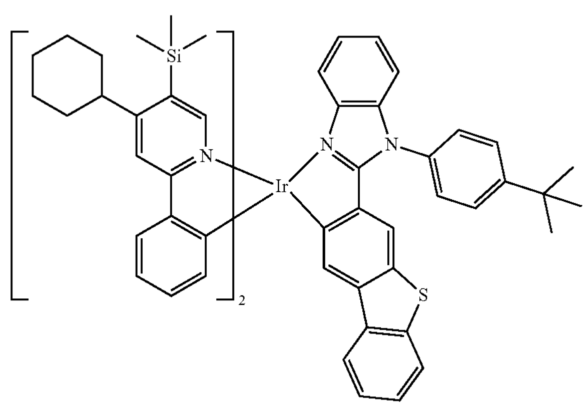

-continued
1186
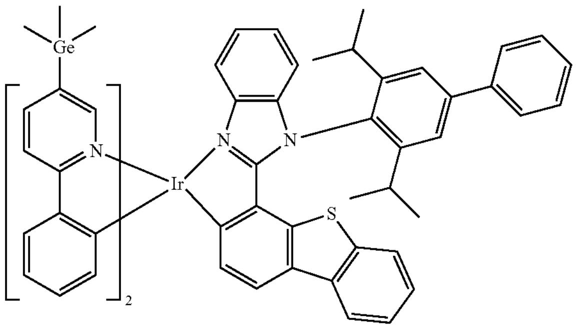
1187
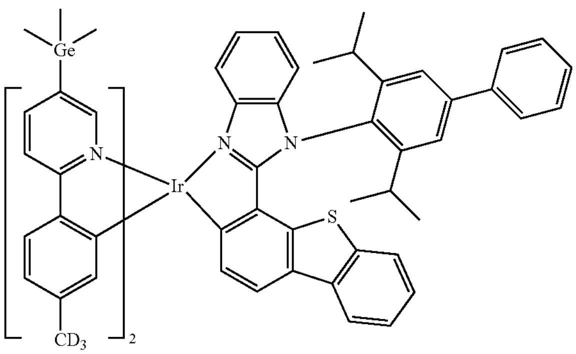
1188
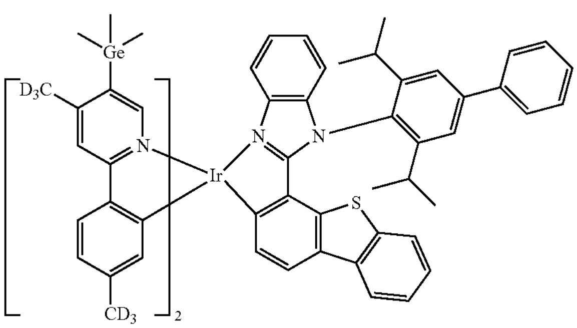
1189
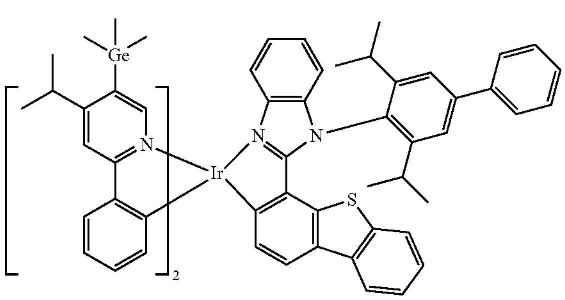
-continued
1190
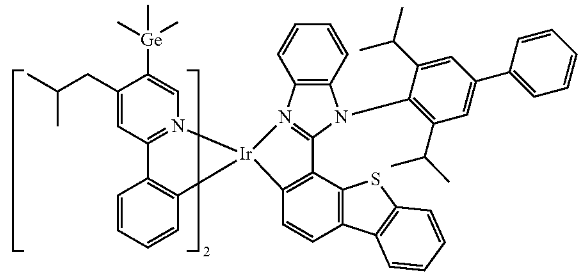
1191
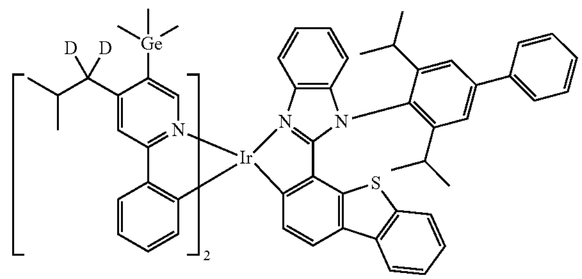
1192
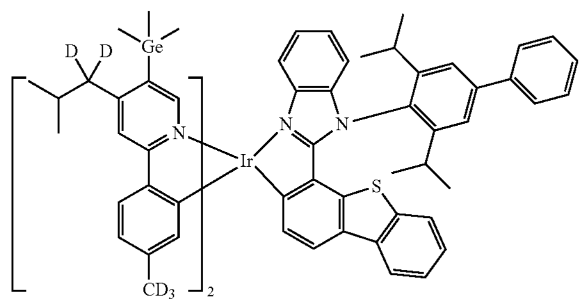
1193
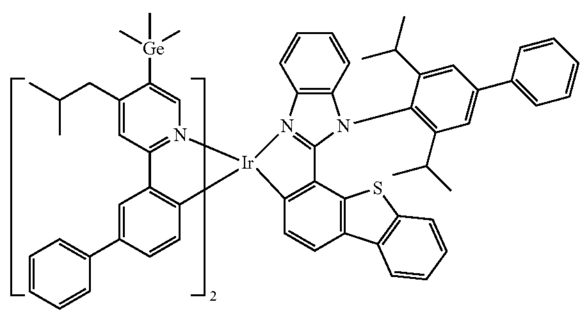
1194
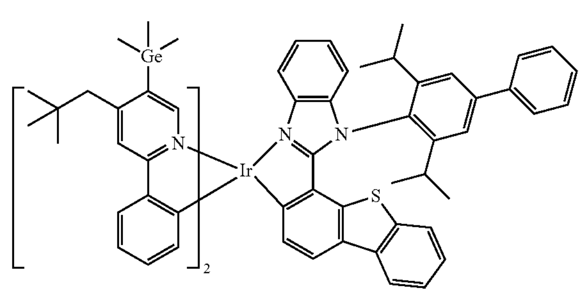

-continued
1195
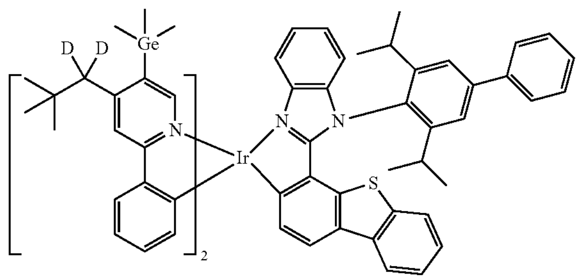
1196
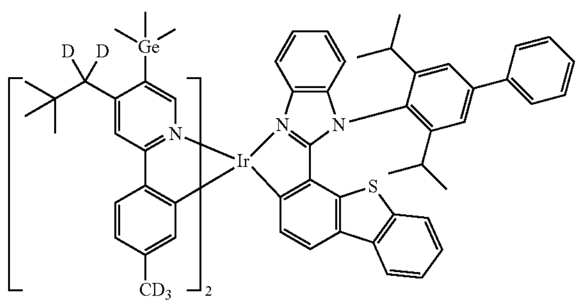
1197
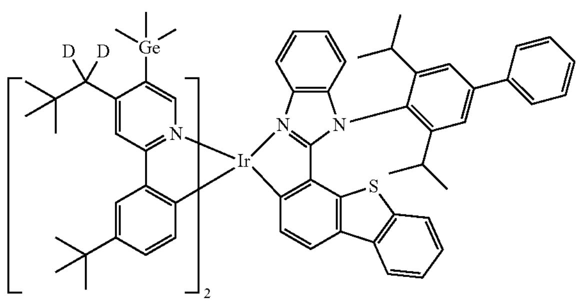
1198
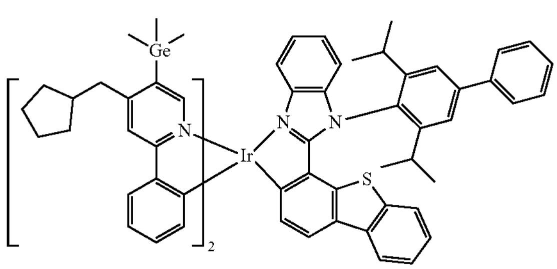
1199
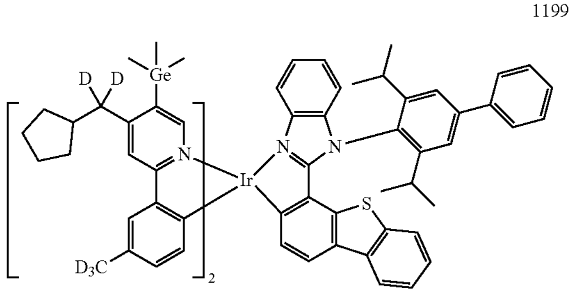
-continued
1200
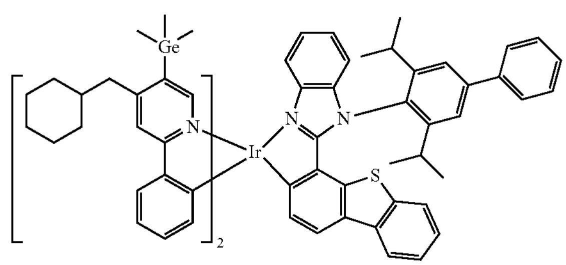
1201
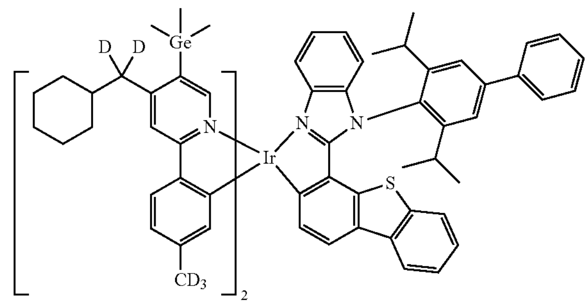
1202
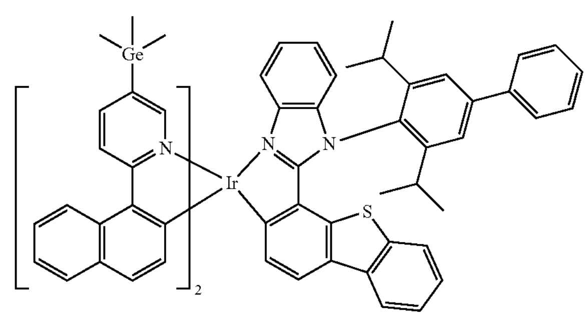
1203
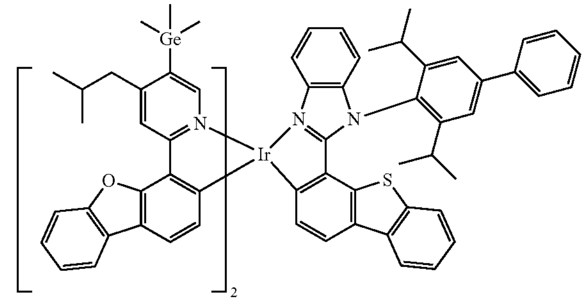

-continued
1204
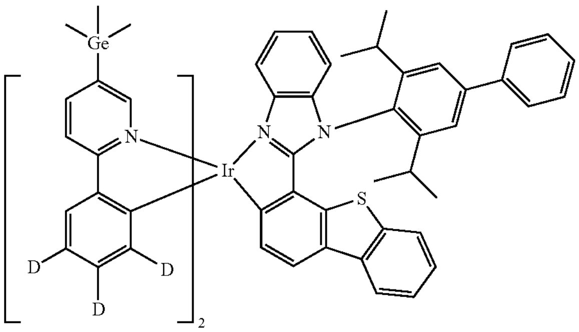
1205
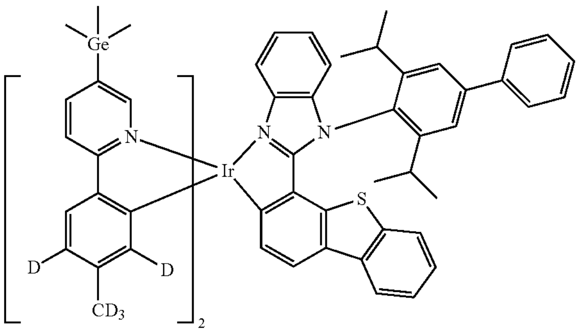
1206
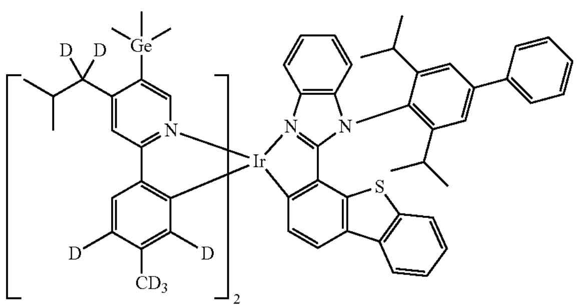
1207
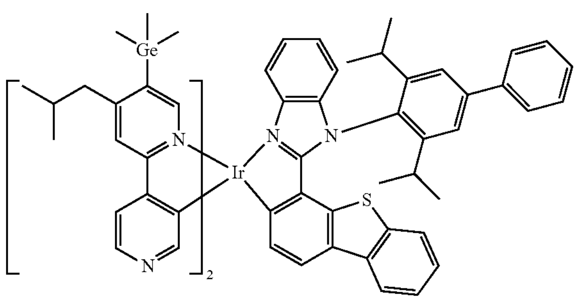
1208
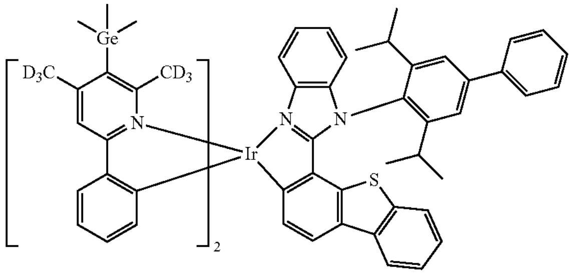
-continued
1209
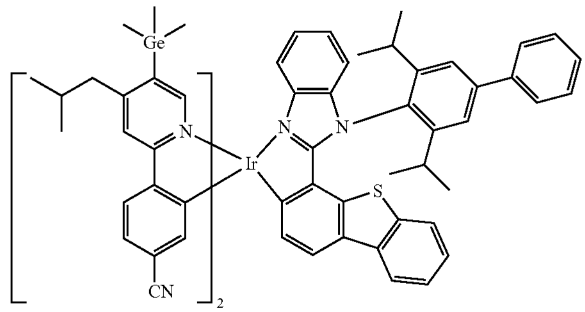
1210
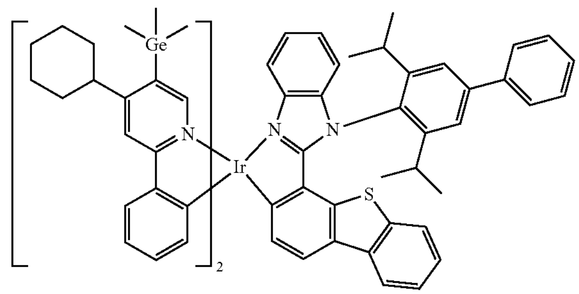
1211
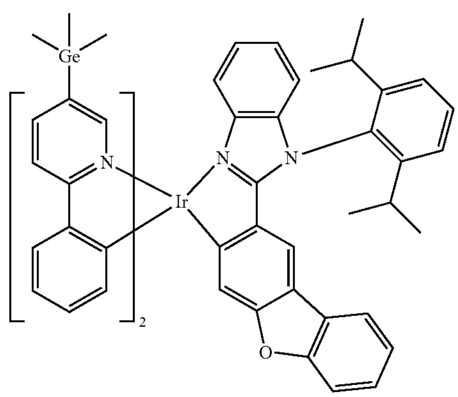
1212
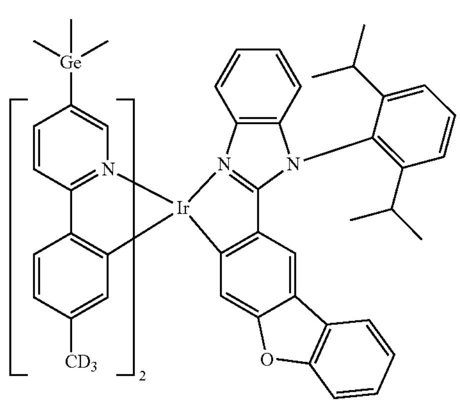

1213
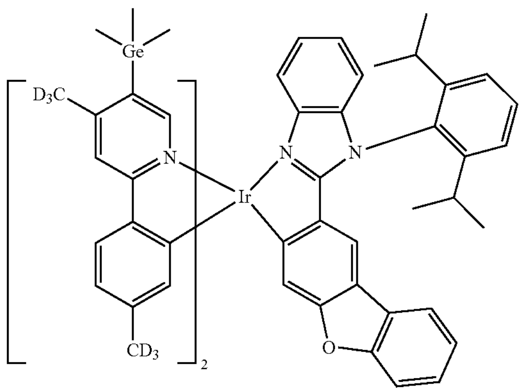
1214
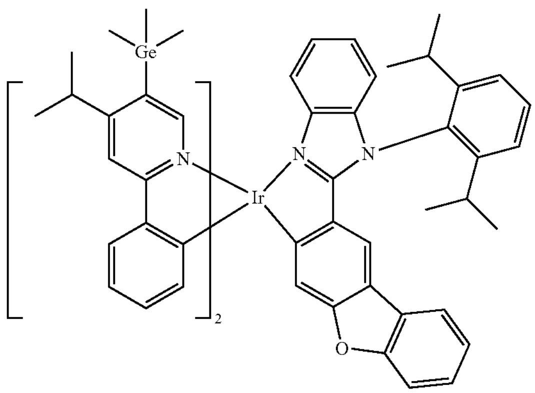
1215
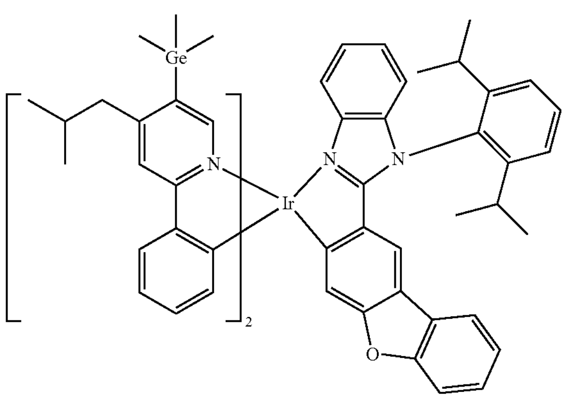
1216
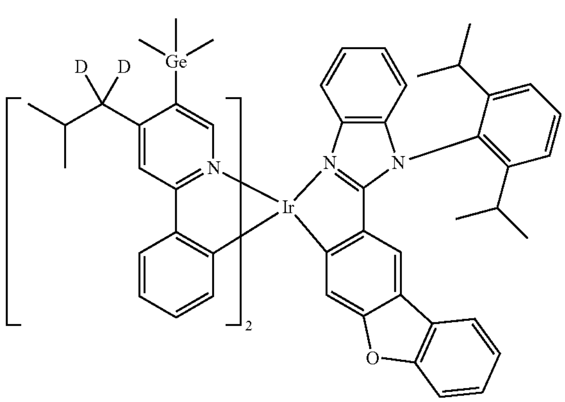
1217
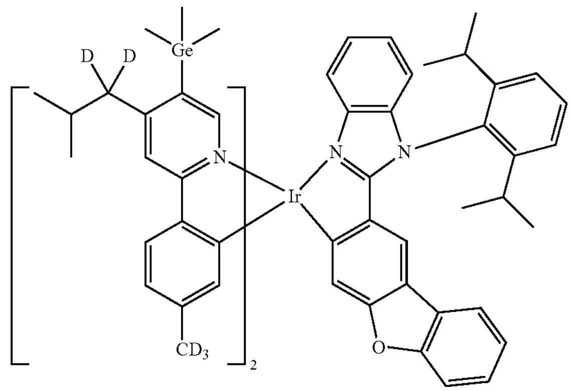
1218
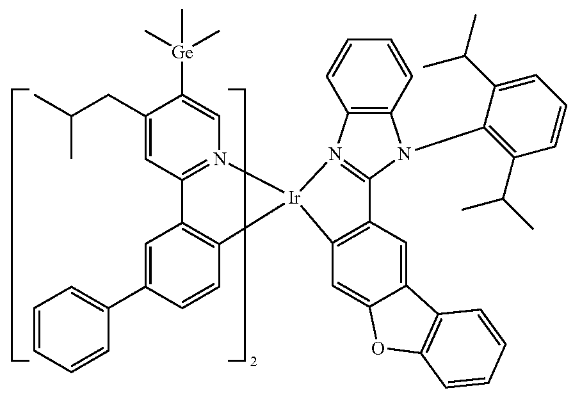
1219
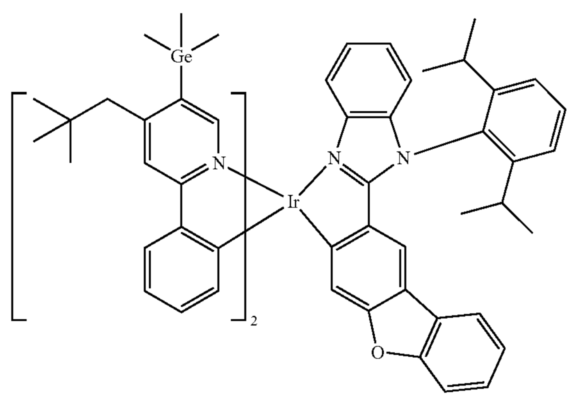
1220
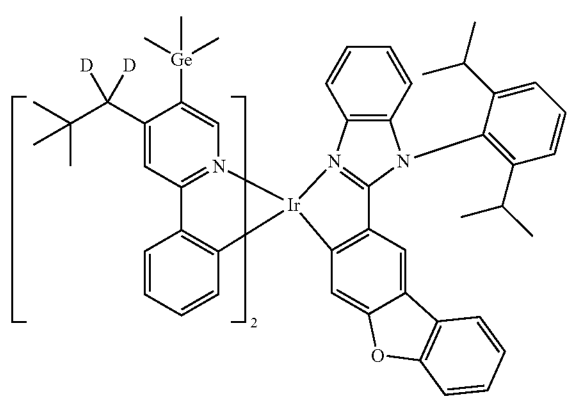

-continued
1221
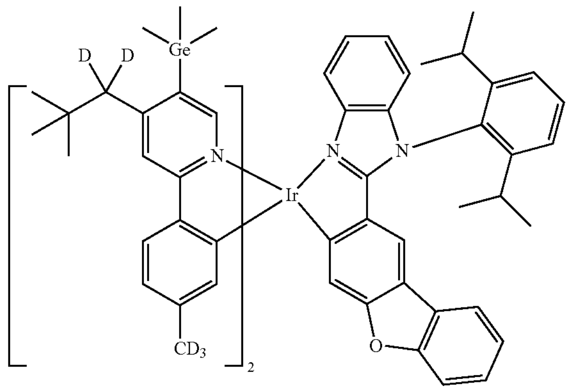
1222
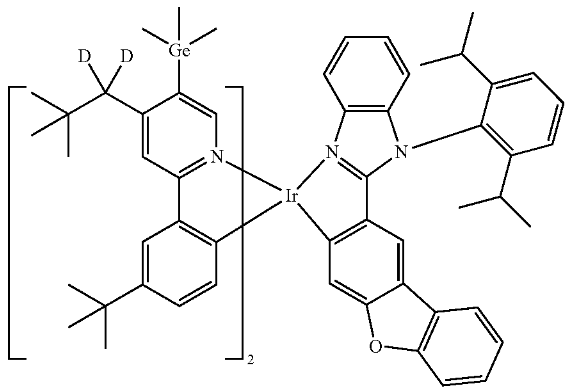
1223
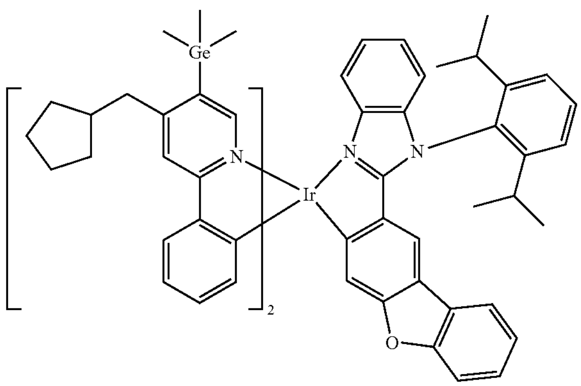
1224
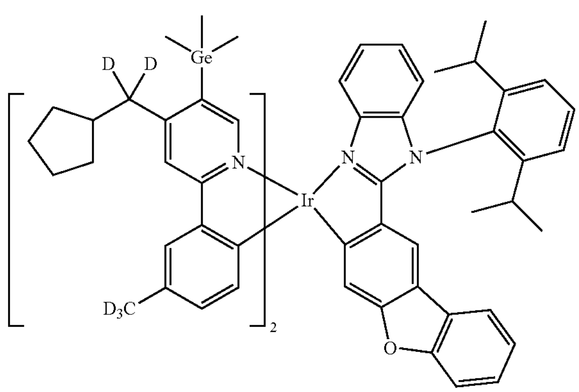
-continued
1225
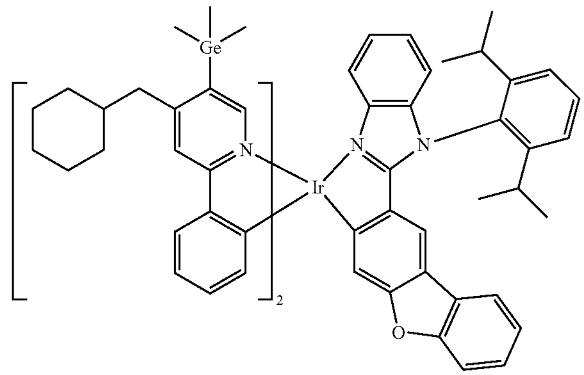
1226
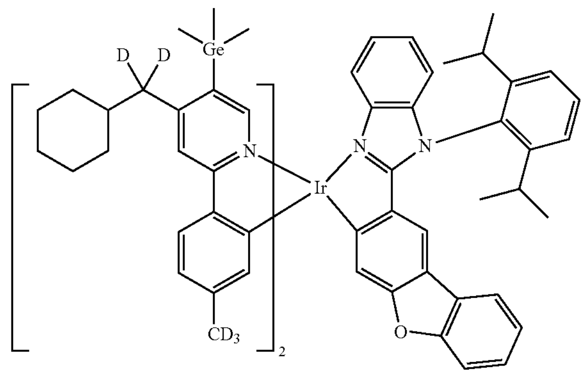
1227
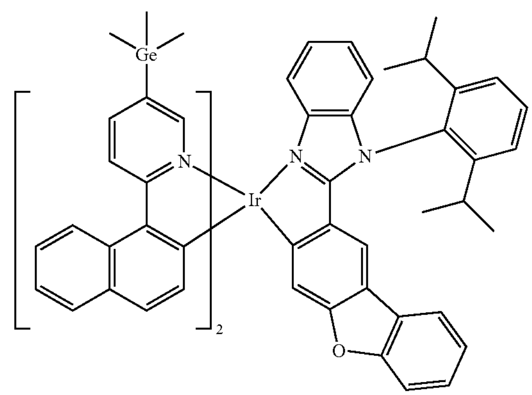
1228
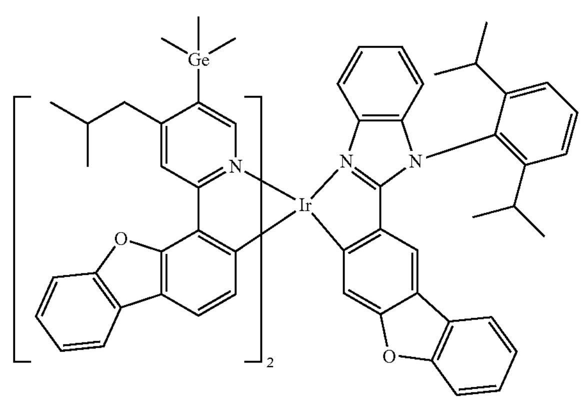

-continued
1229
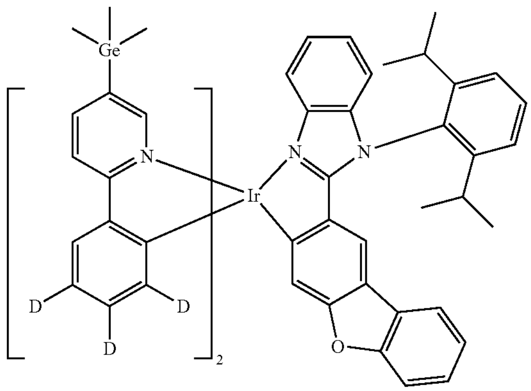
1230
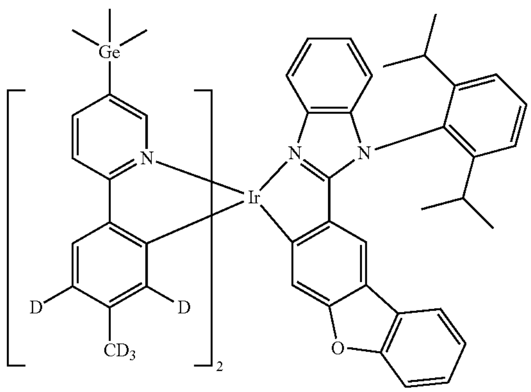
1231
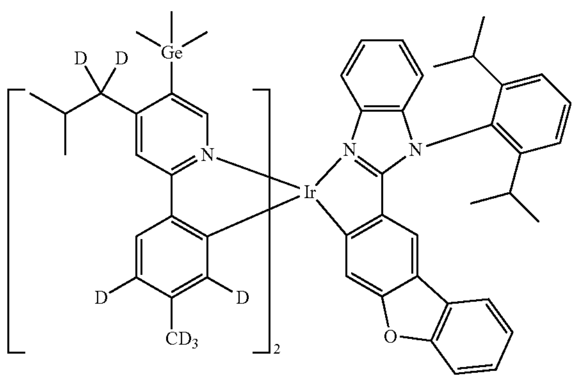
1232
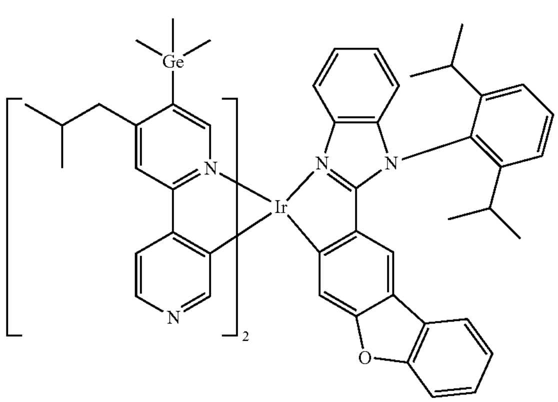
-continued
1233
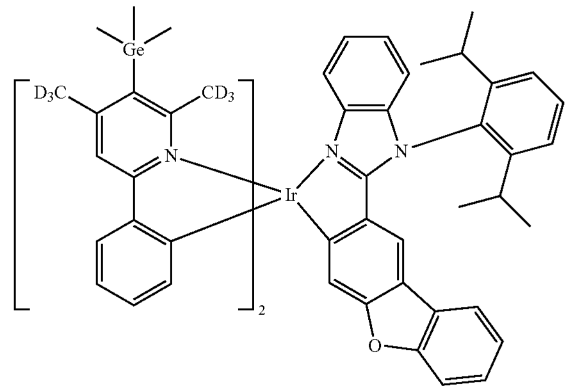
1234
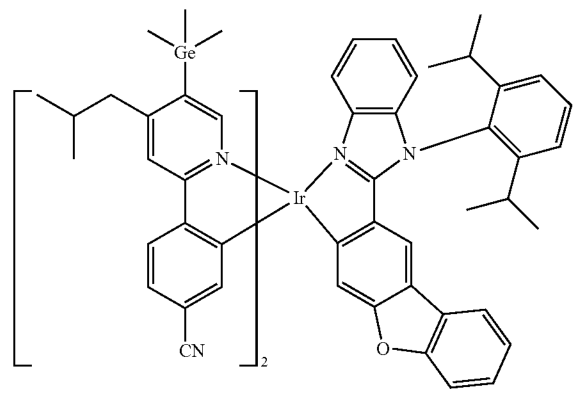
1235
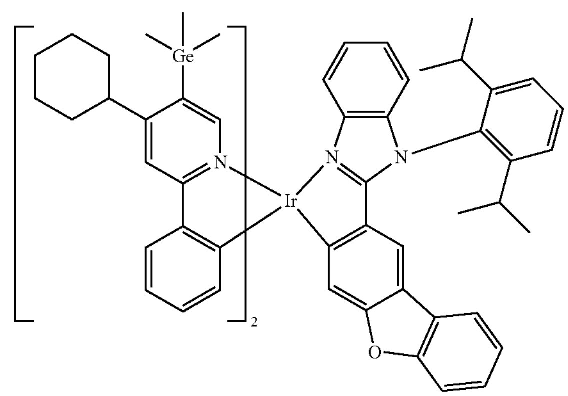
1236
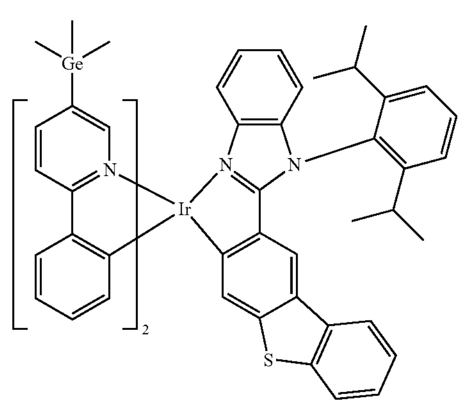

-continued
1237
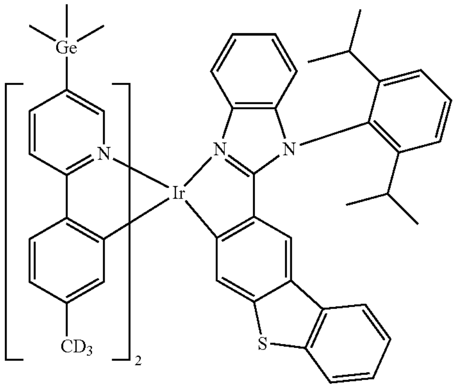
1238
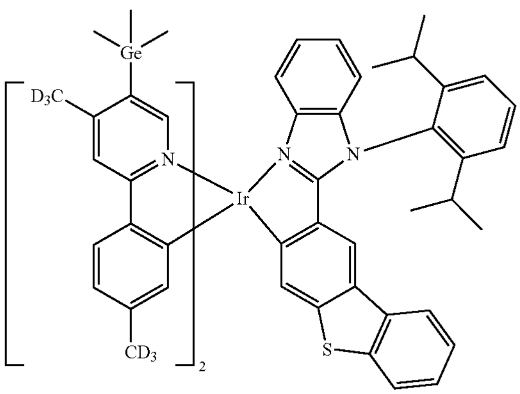
1239
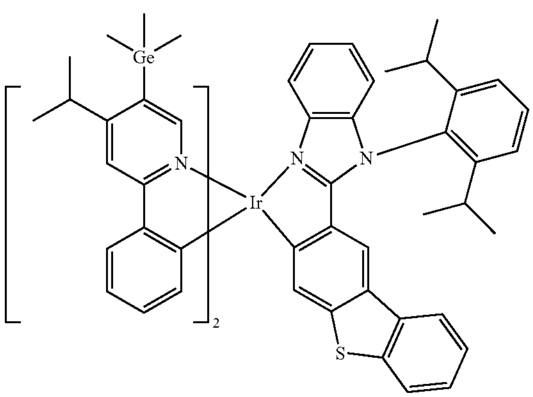
1240
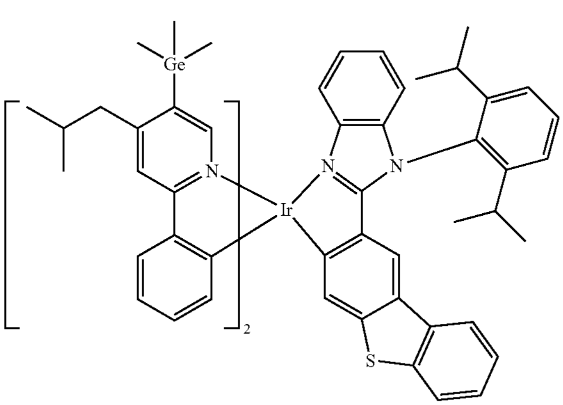
-continued
1241
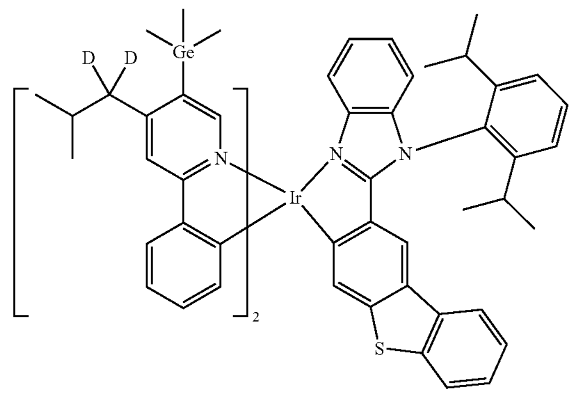
1242
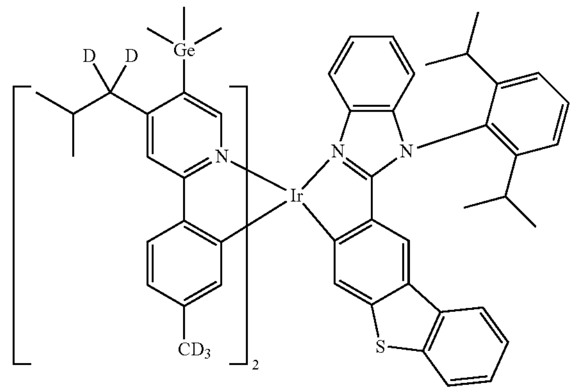
1243
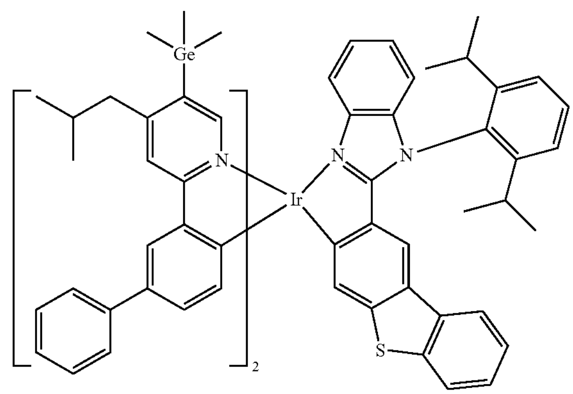
1244
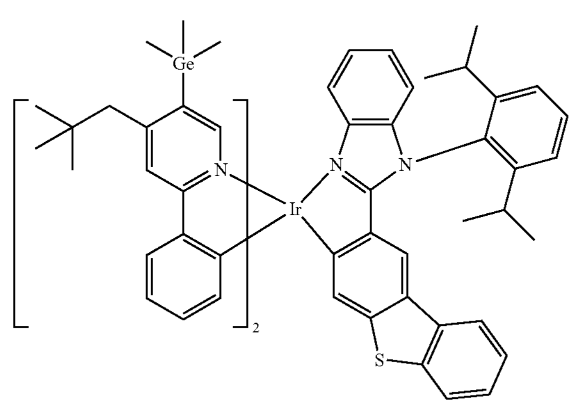

-continued
1245
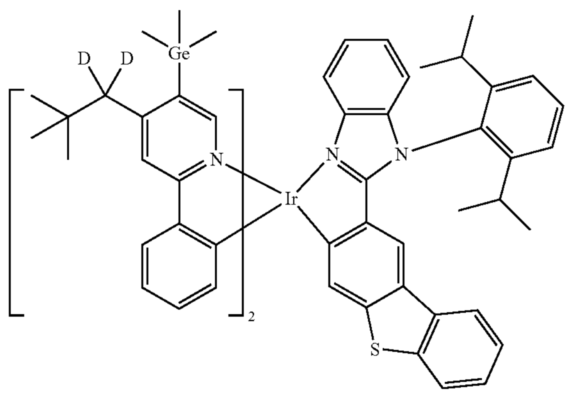
1246
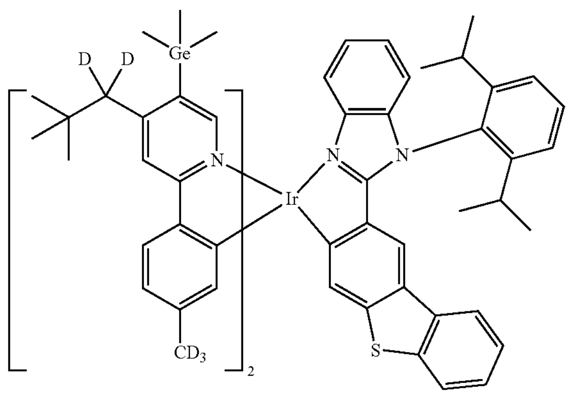
1247
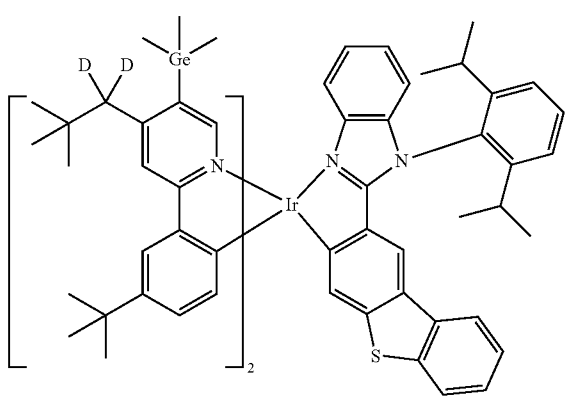
1248
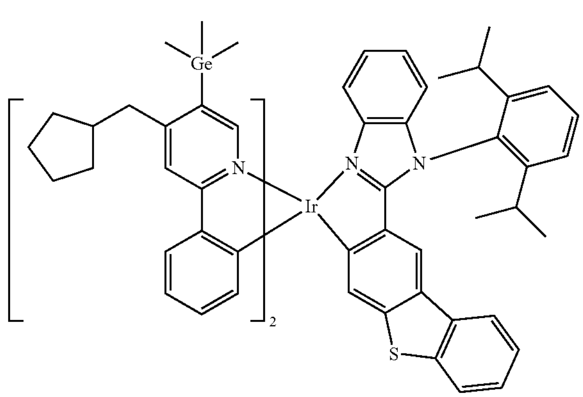
-continued
1249
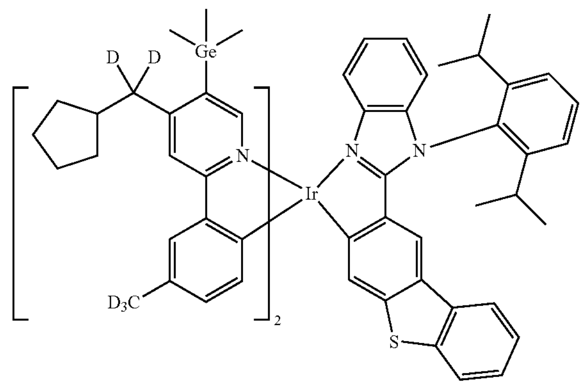
1250
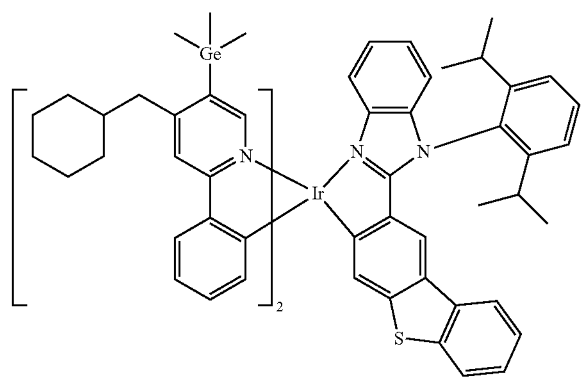
1251
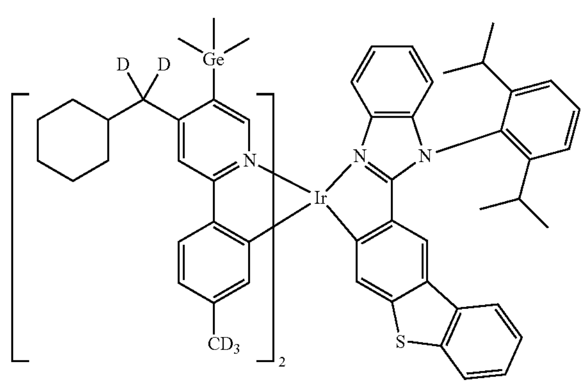
1252
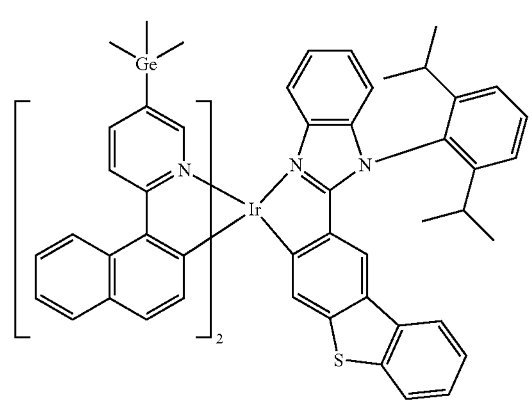

-continued
1253
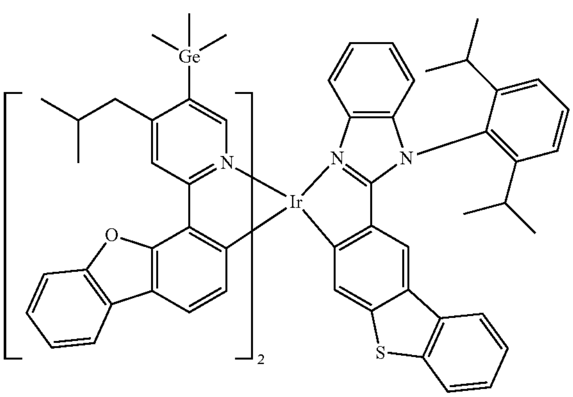
1254
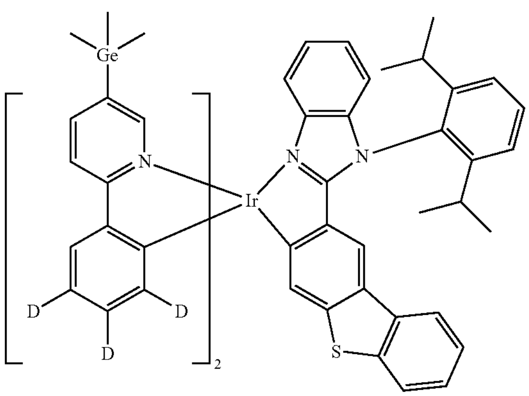
1255
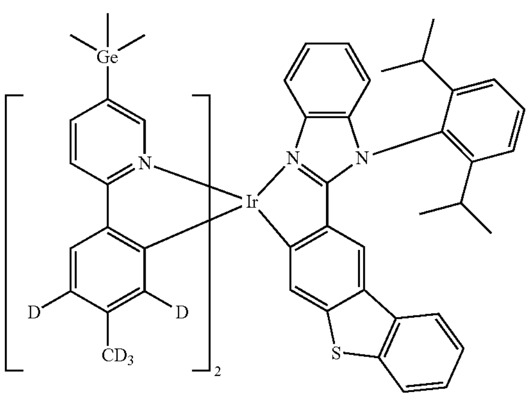
1256
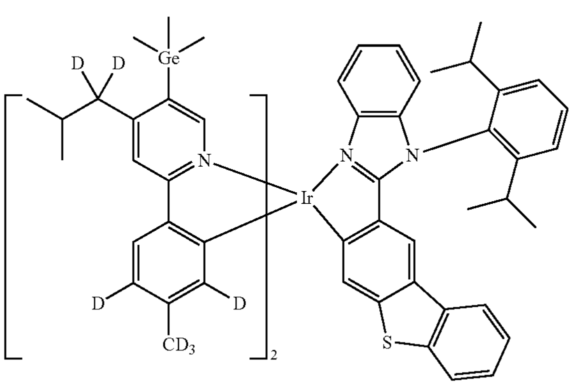
-continued
1257
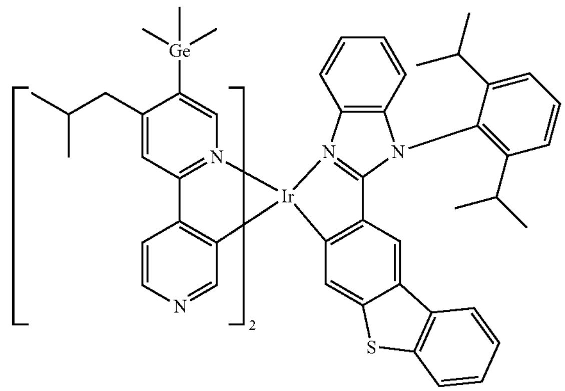
1258
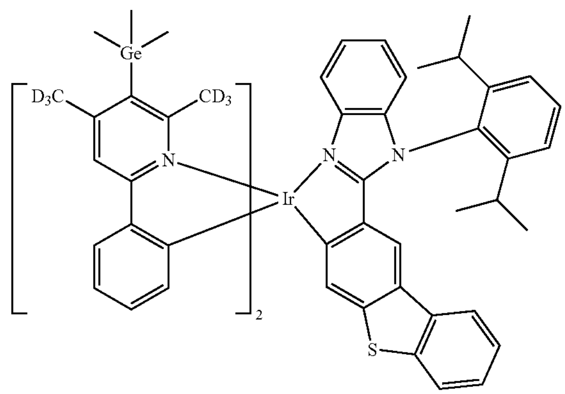
1259
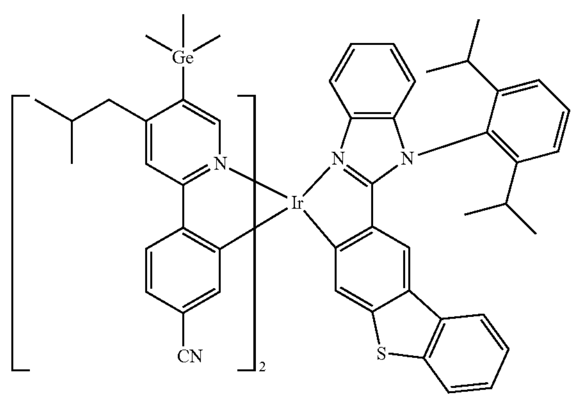
1260
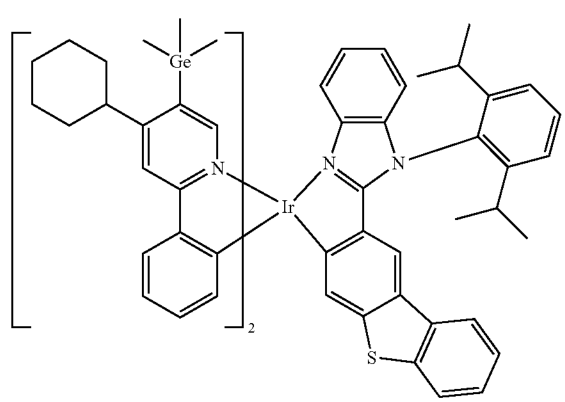

-continued
1261
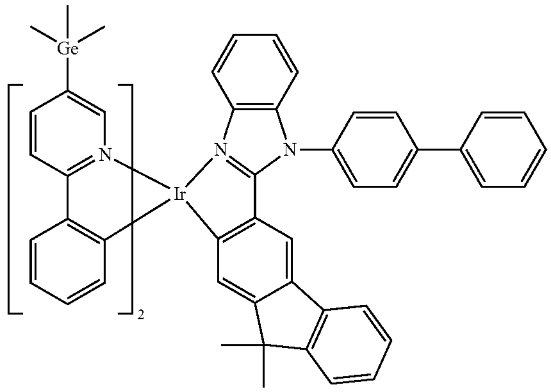
1262
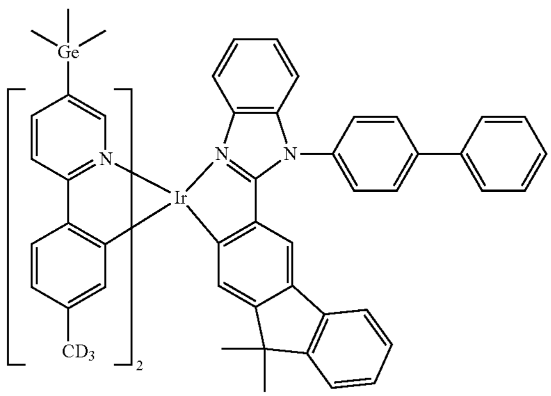
1263
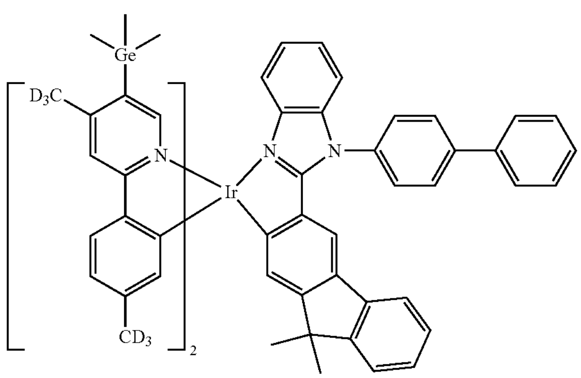
1264
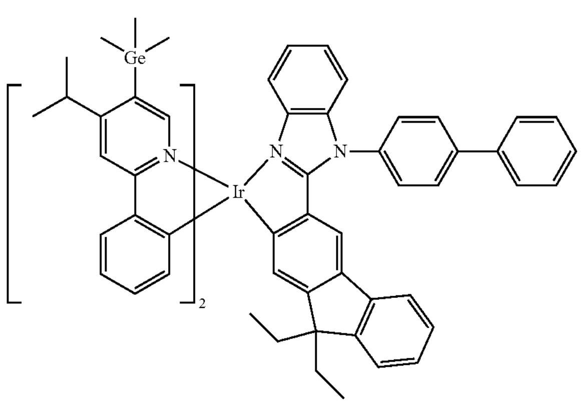
-continued
1265
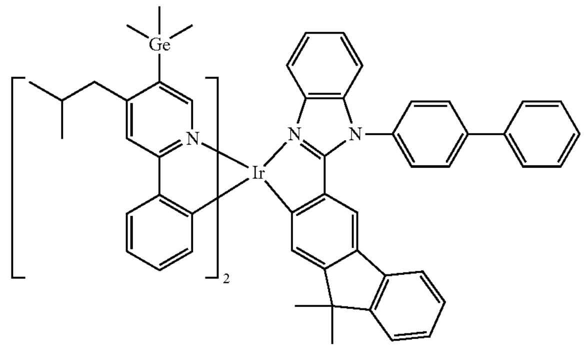
1266
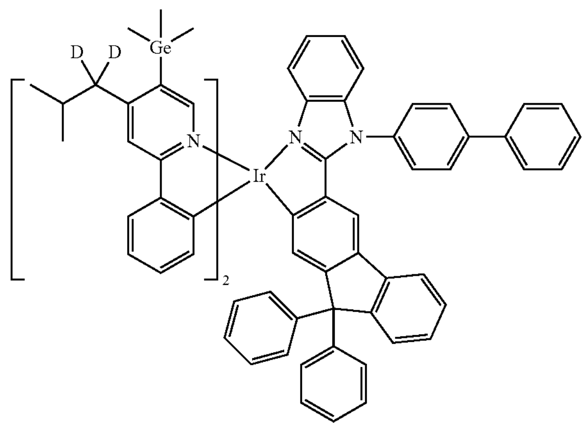
1267
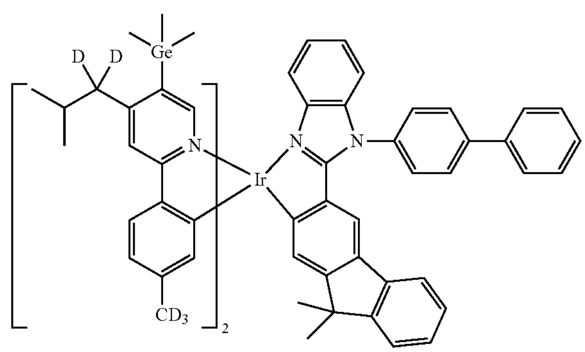
1268
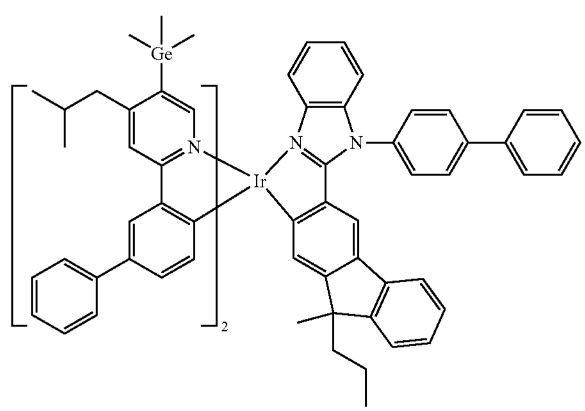

-continued
1269
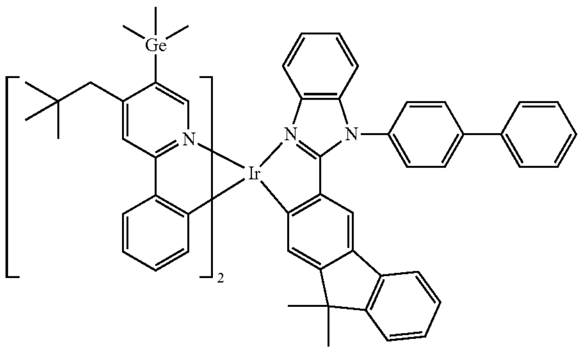
1270
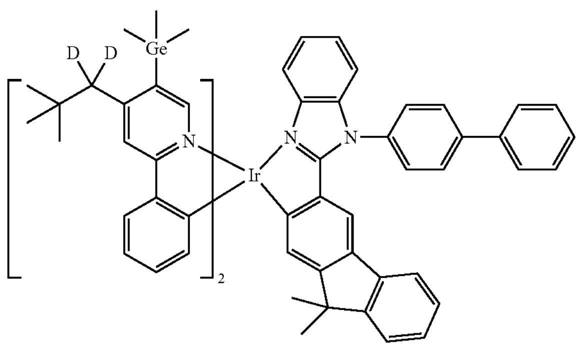
1271
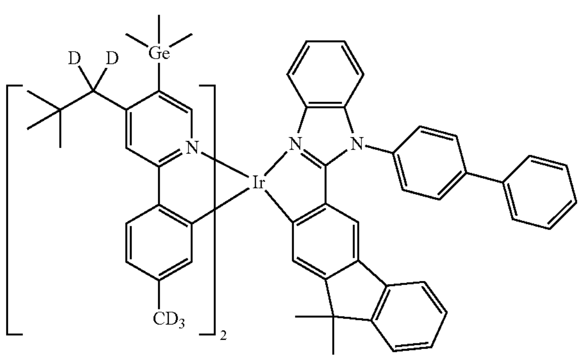
1272
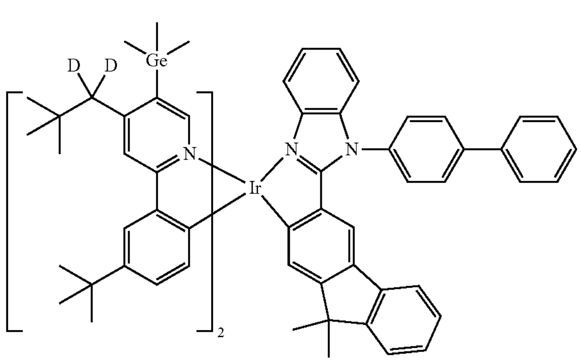
-continued
1273
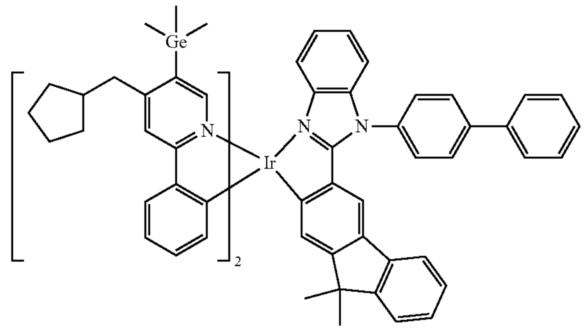
1274
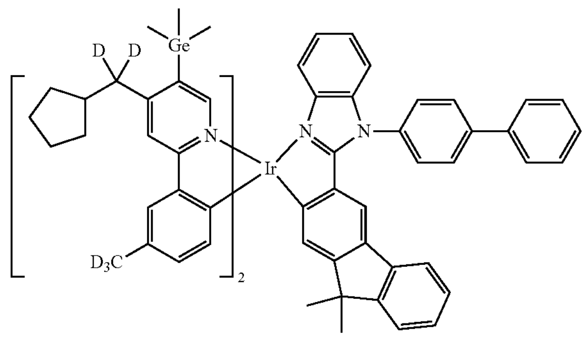
1275
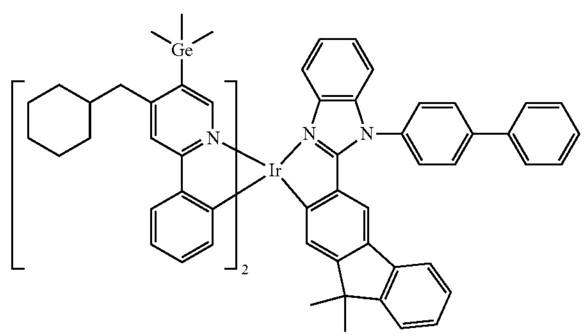
1276
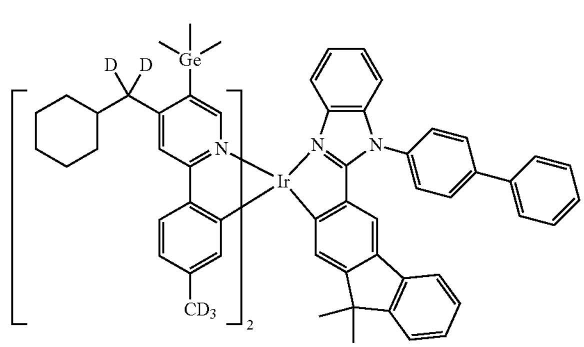

-continued
1277
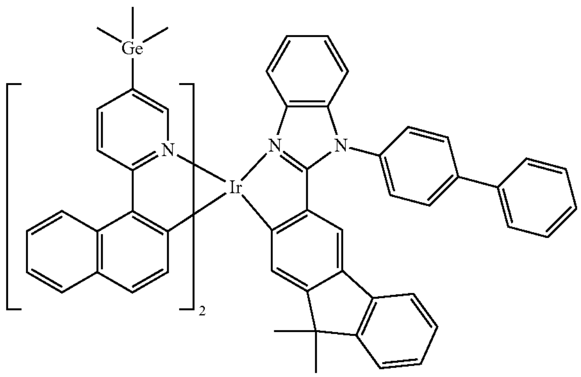
1278
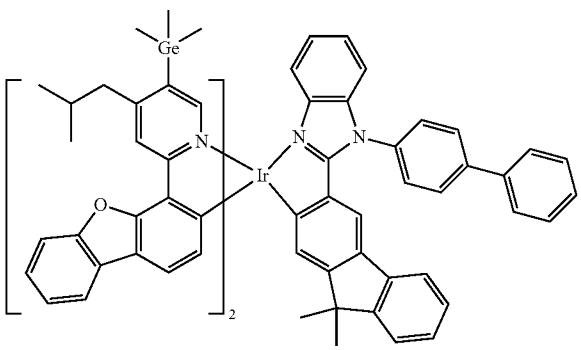
1279
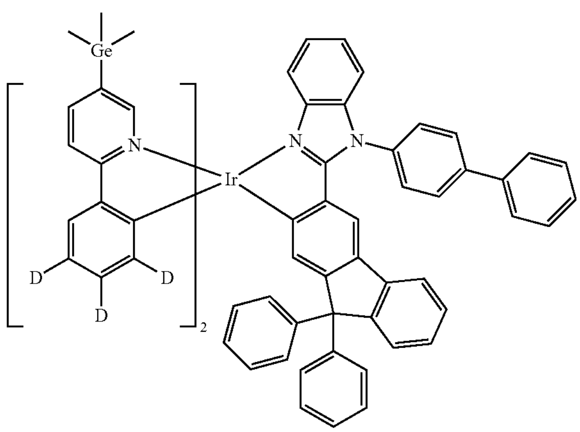
1280
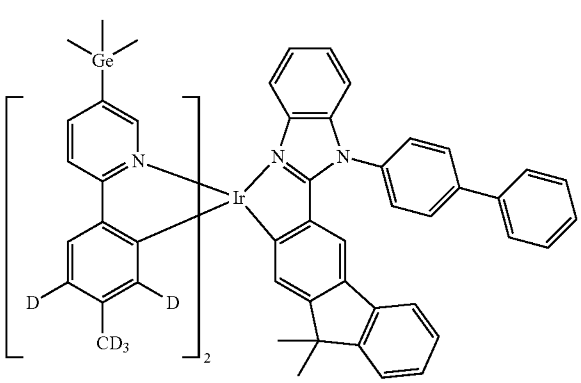
-continued
1281
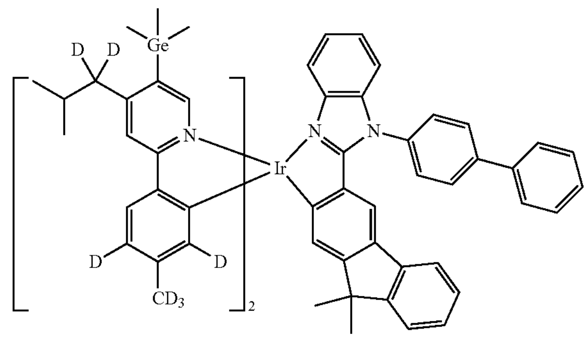
1282
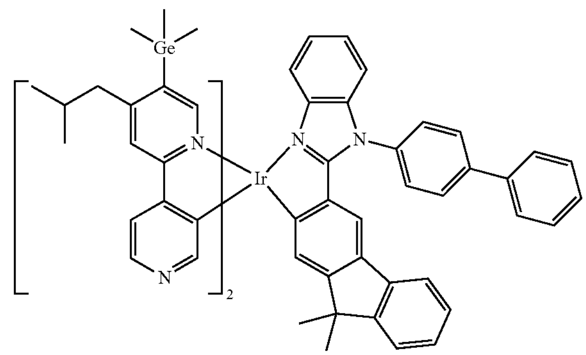
1283
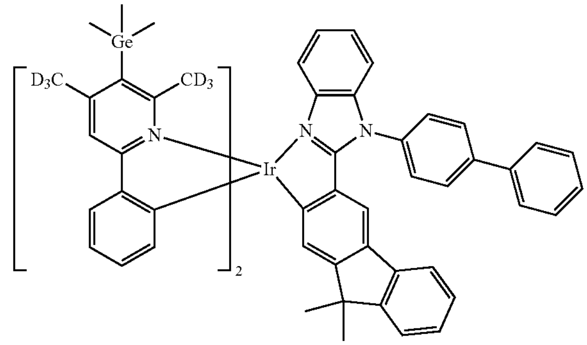
1284
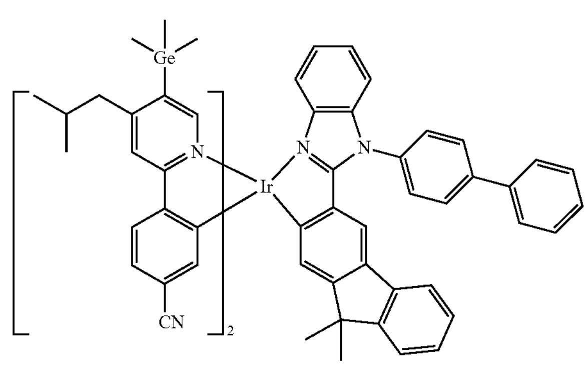

-continued
1285
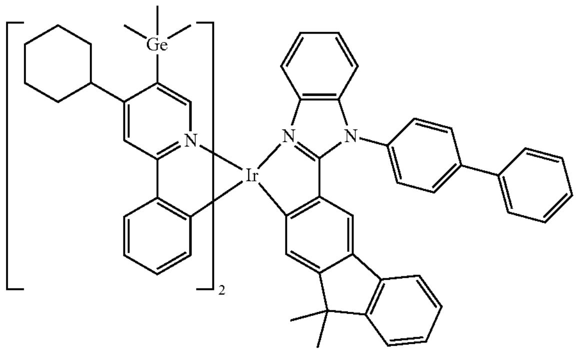
1286
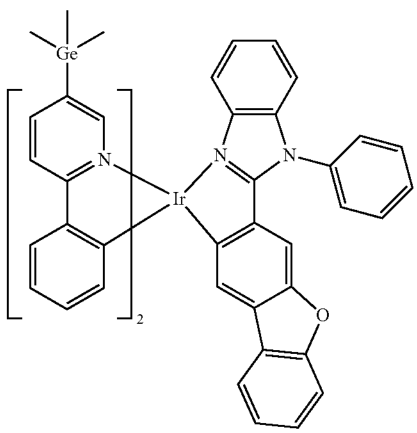
1287
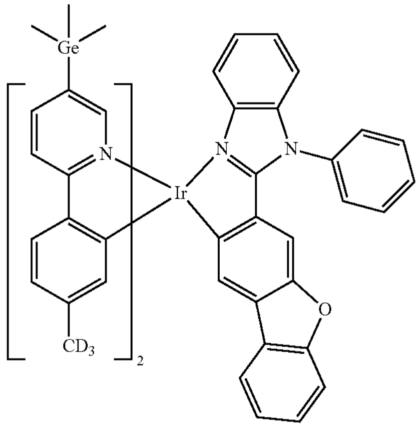
-continued
1288
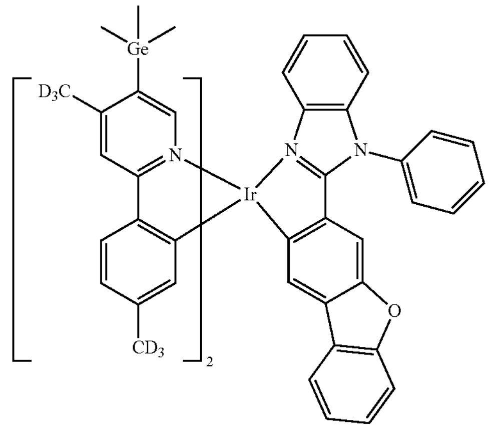
1289
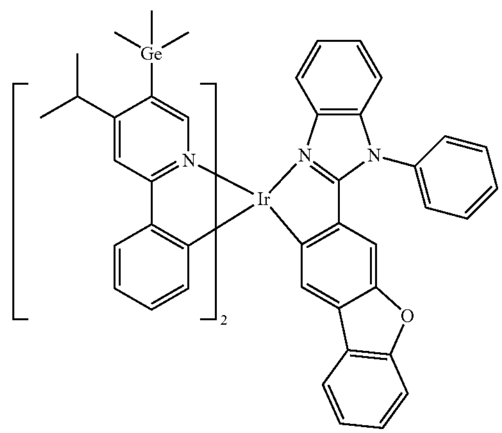
1290
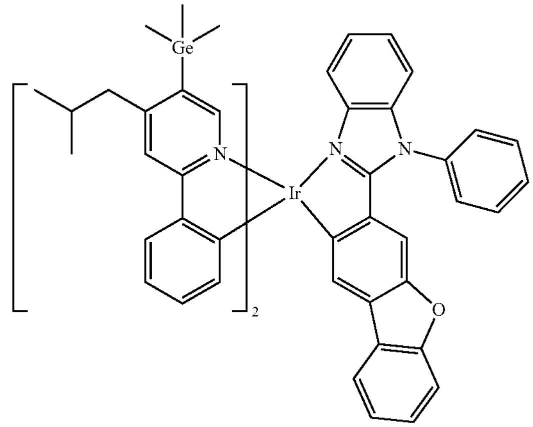

-continued
1291
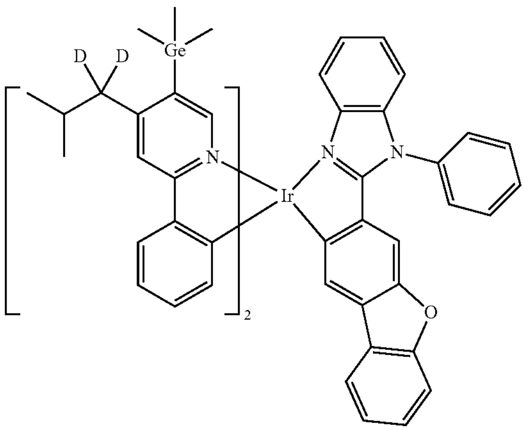
1292
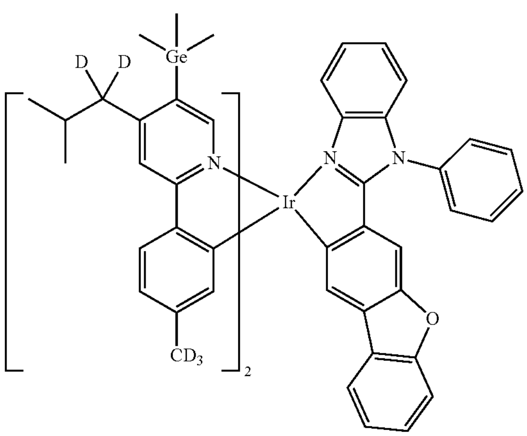
1293
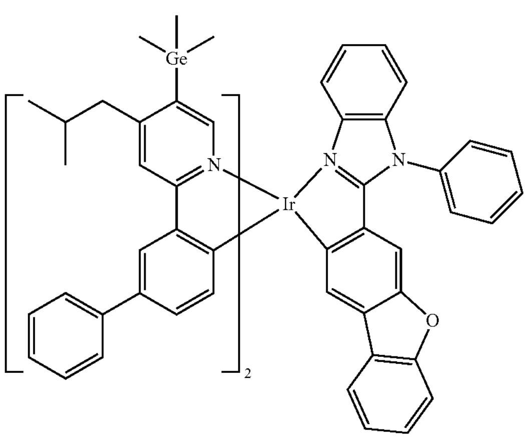
-continued
1294
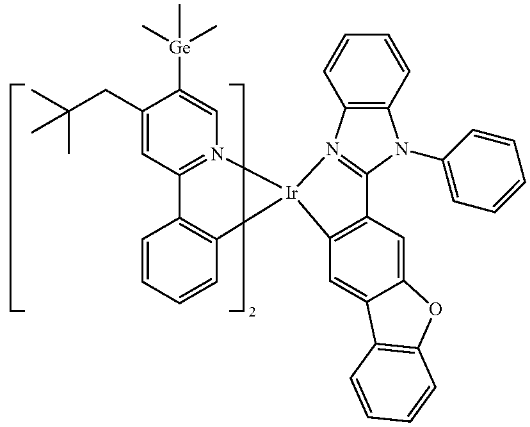
1295
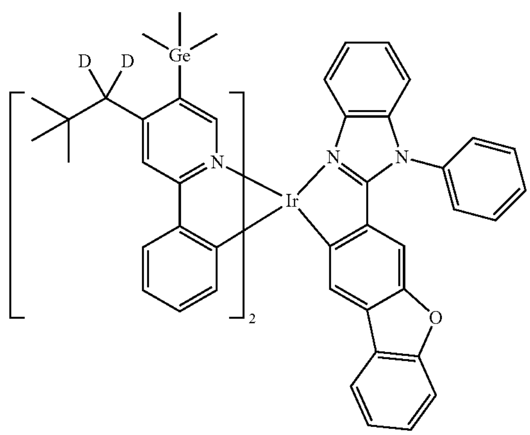
1296
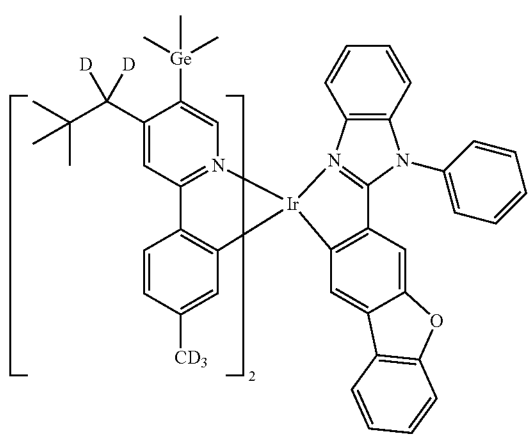

-continued
1297
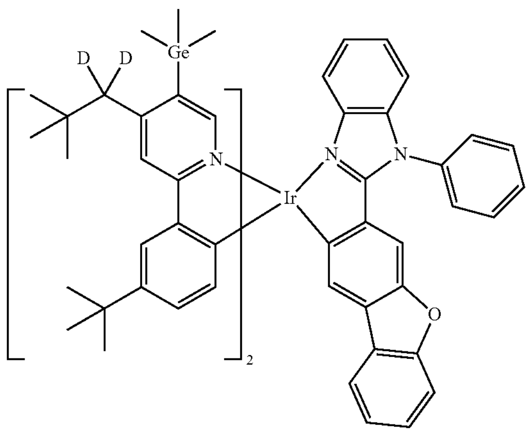
1298
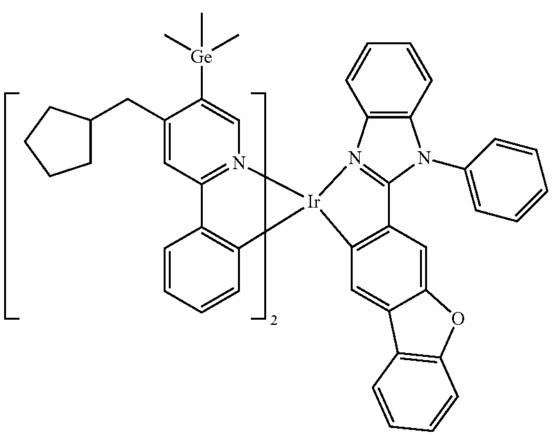
1299
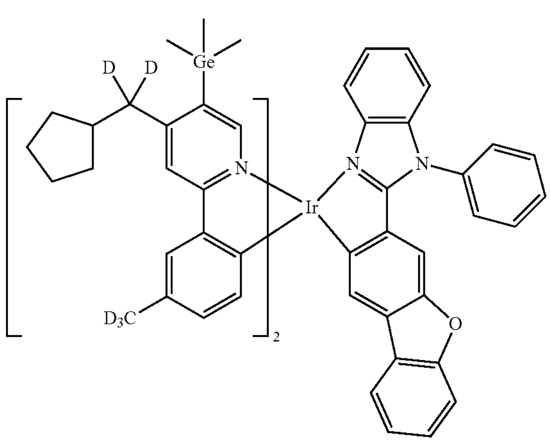
-continued
1300
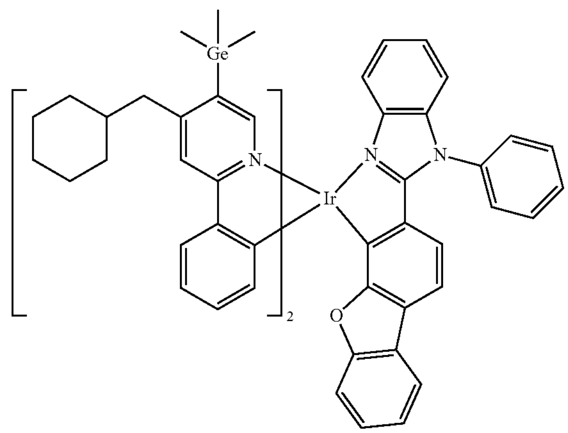
1301
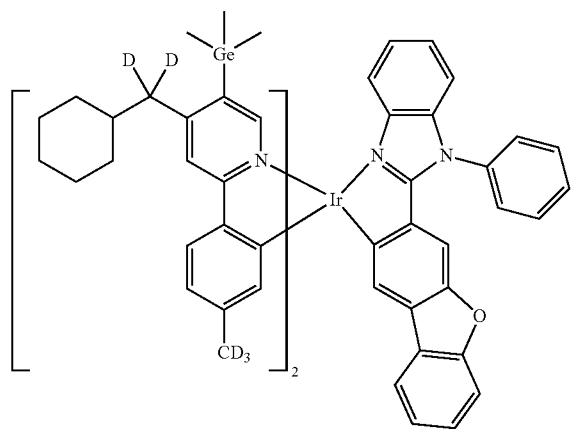
1302
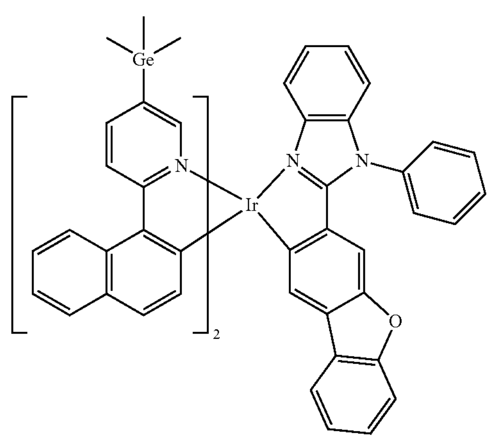

1303
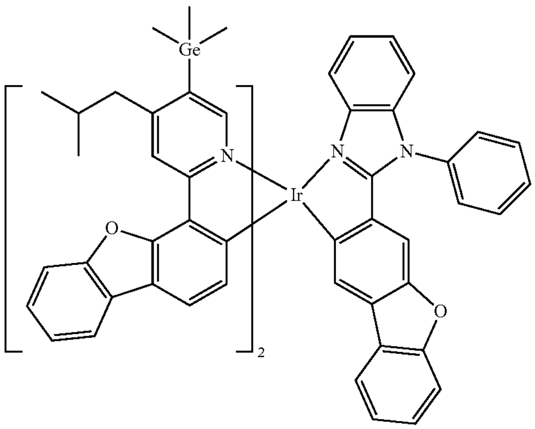
1304
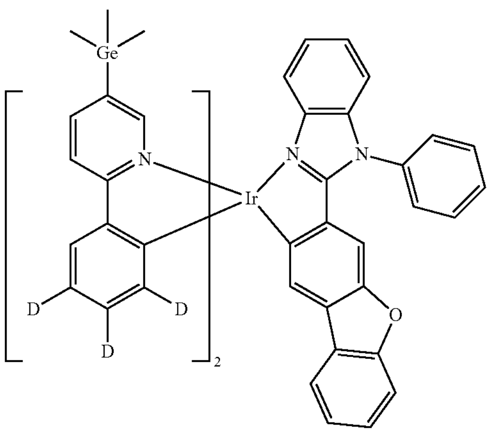
1305
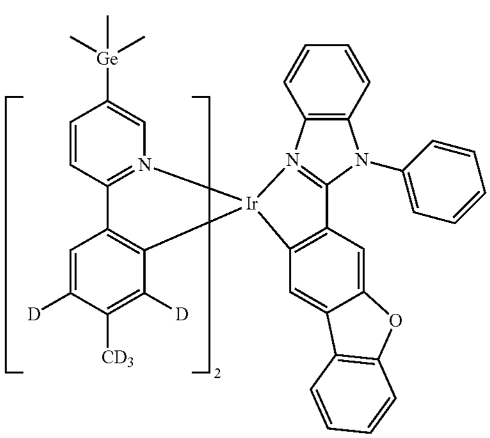
1306
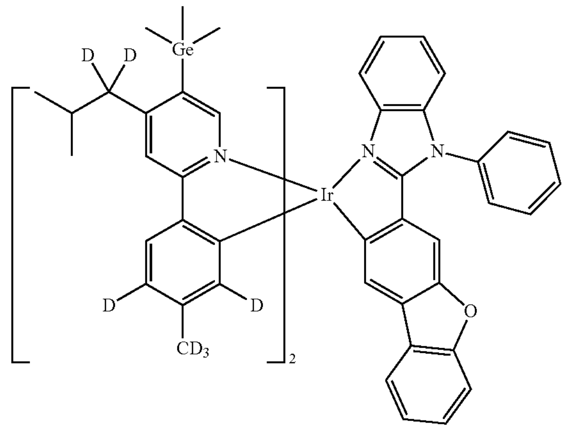
1307
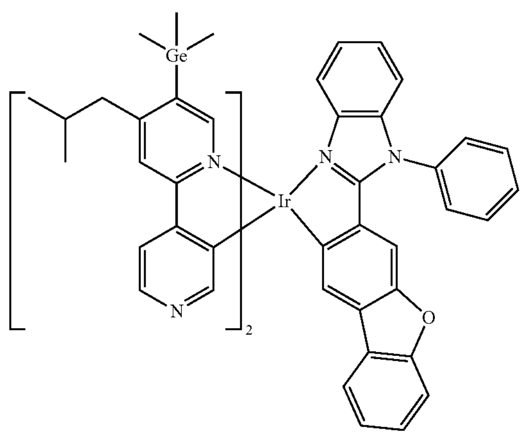
1308
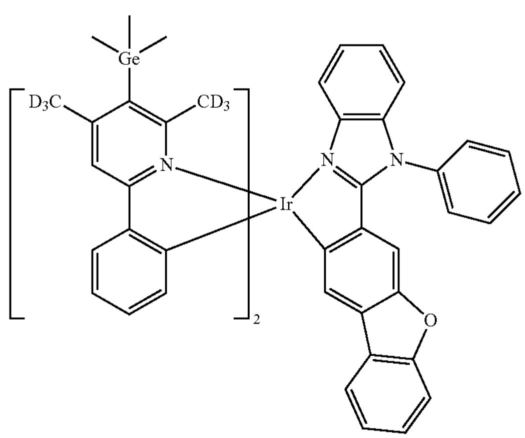

-continued
1309
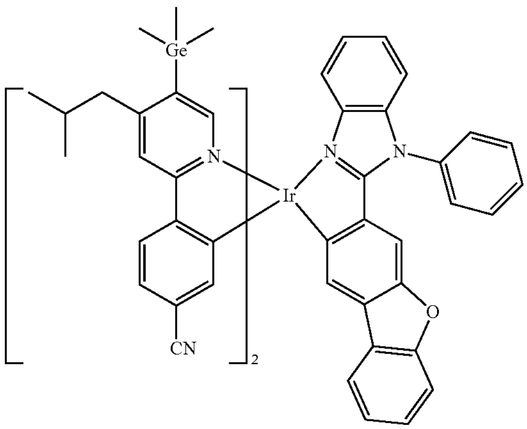
1310
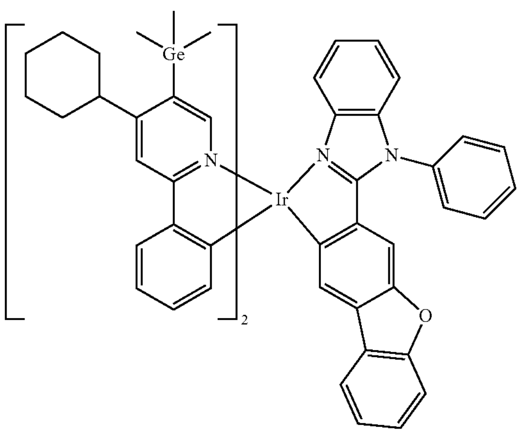
1311
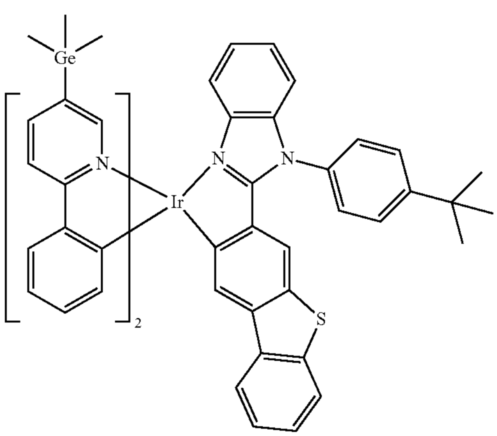
-continued
1312
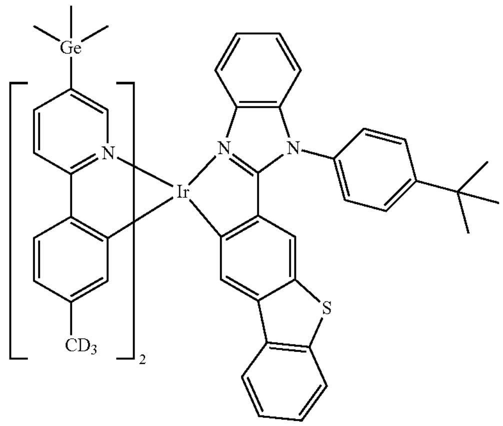
1313
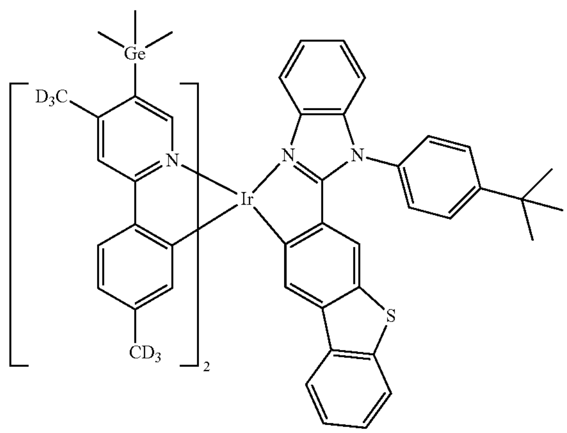
1314
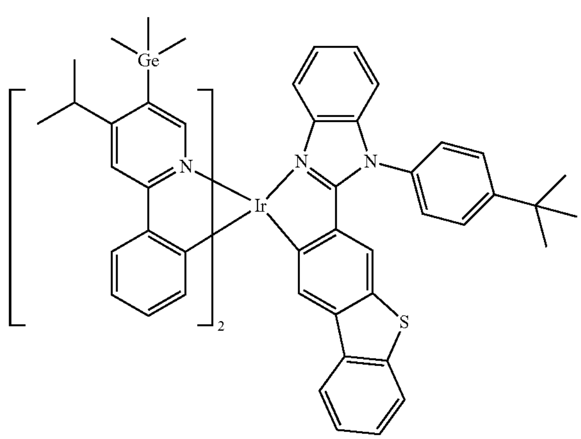

-continued
1315
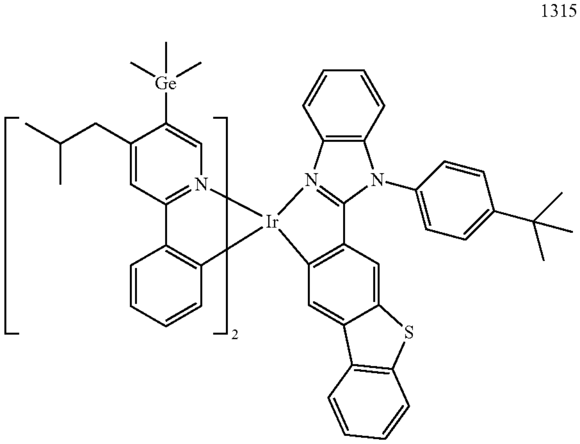
1316
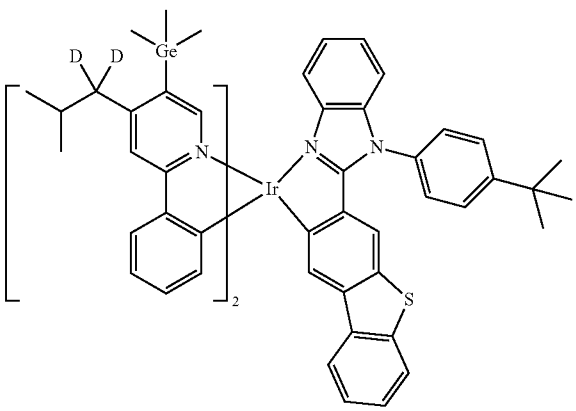
1317
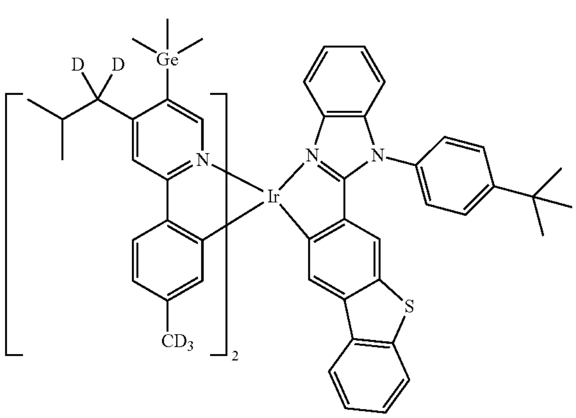
-continued
1318
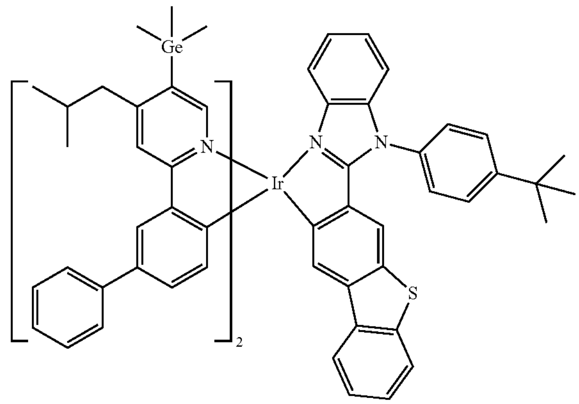
1319
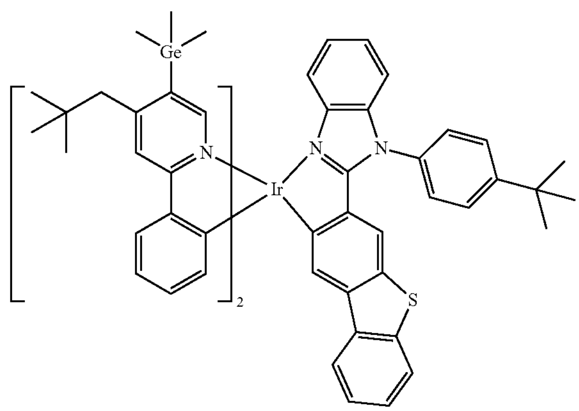
1320
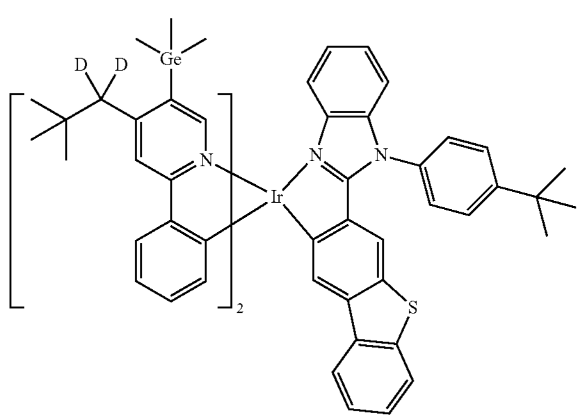

-continued
1321
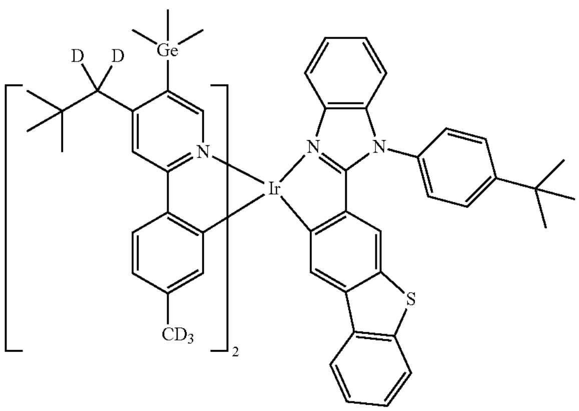
1322
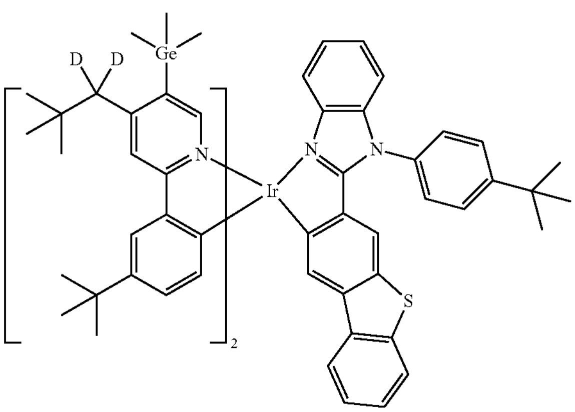
1323
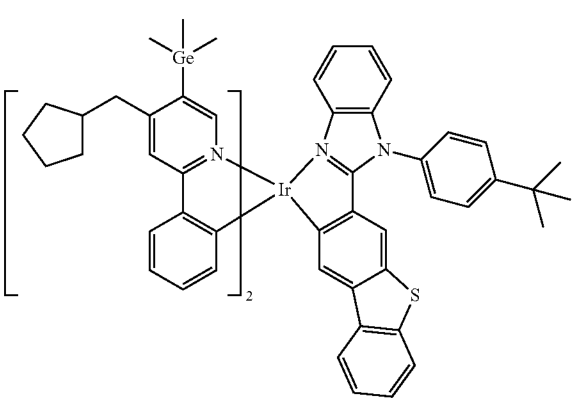
-continued
1324
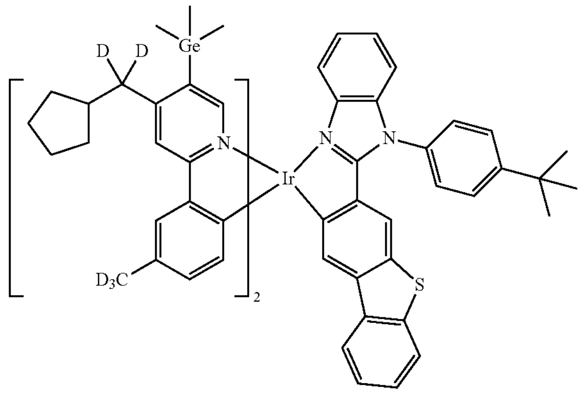
1325
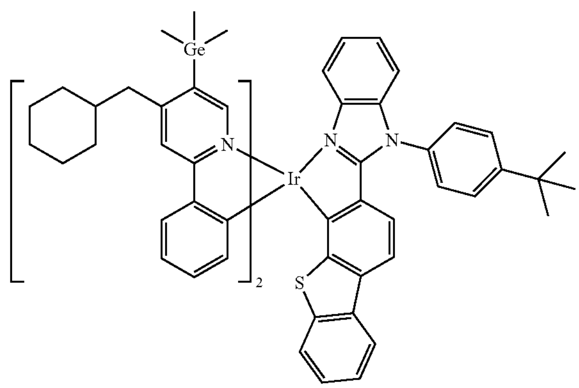
1326
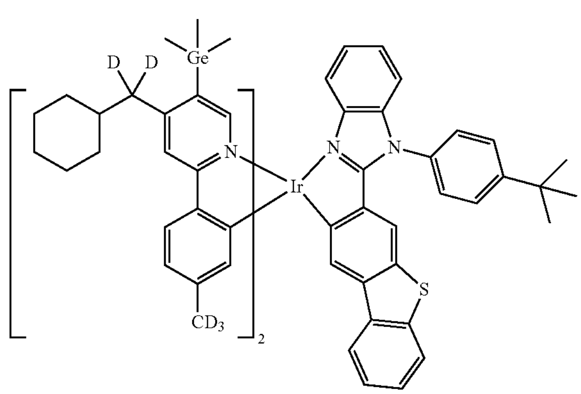

-continued
1327
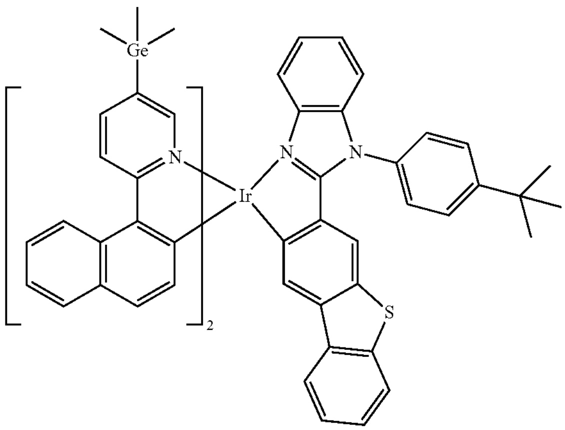
1328
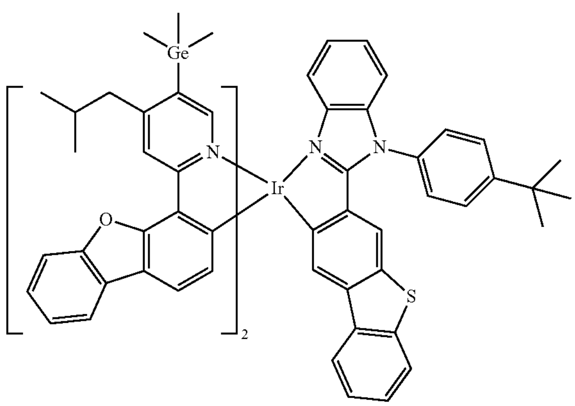
1329
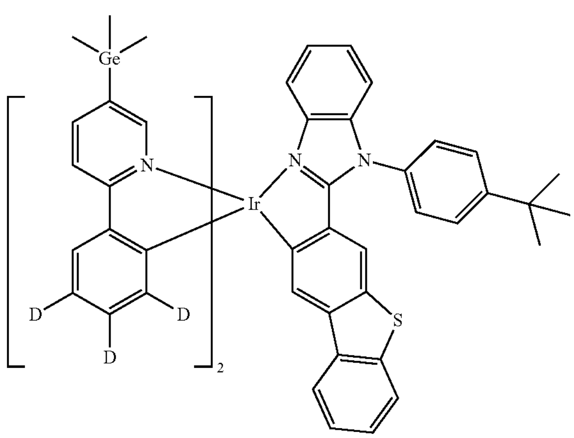
-continued
1330
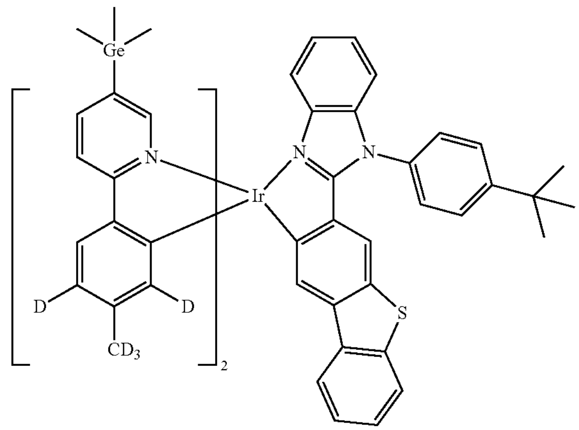
1331
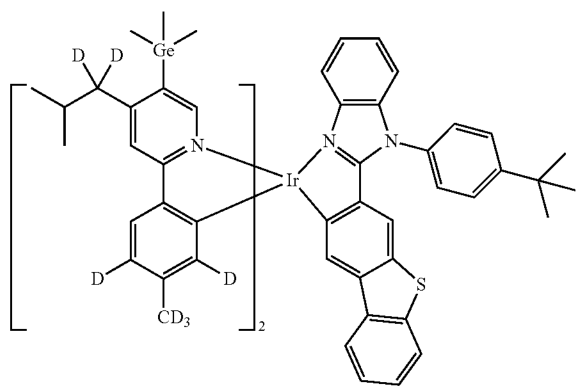
1332
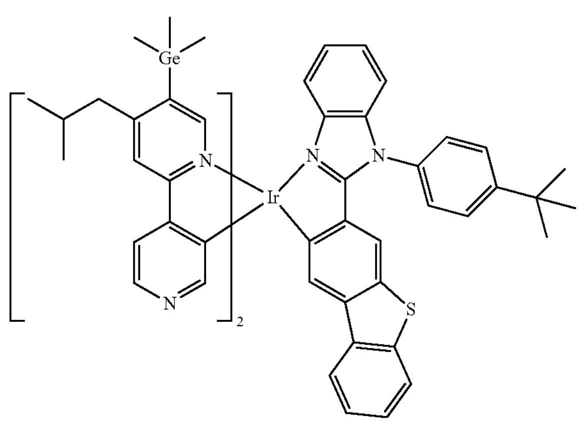

-continued
1333
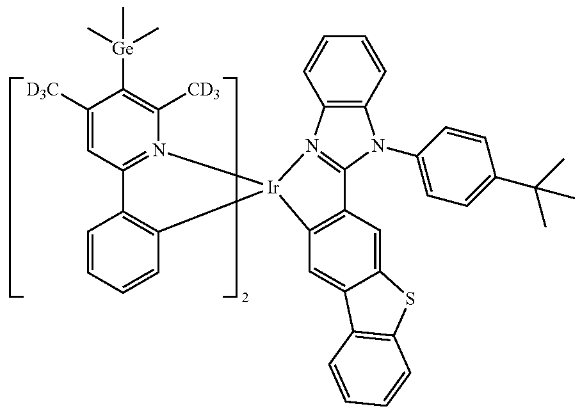
1334
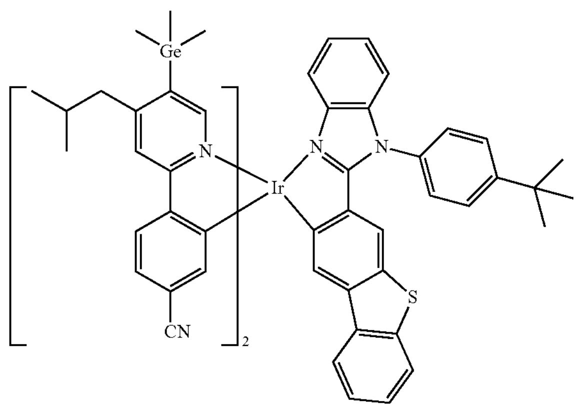
1335
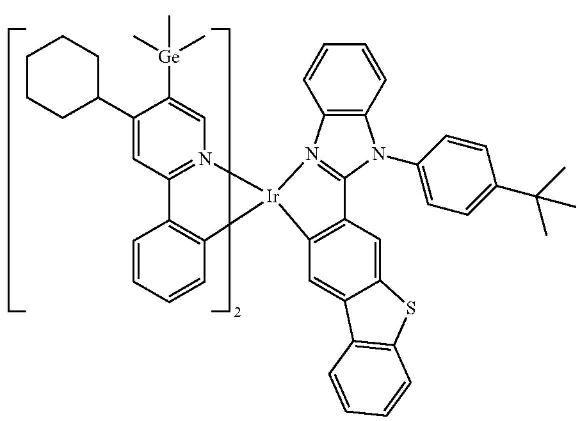
1336
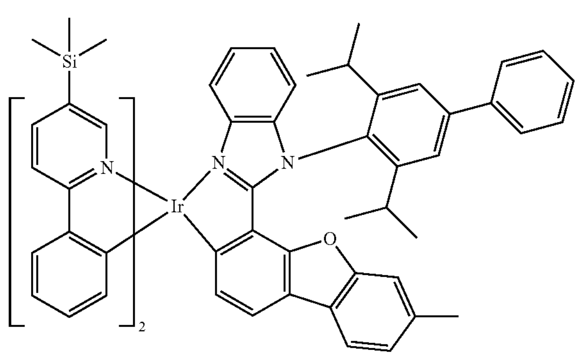
-continued
1337
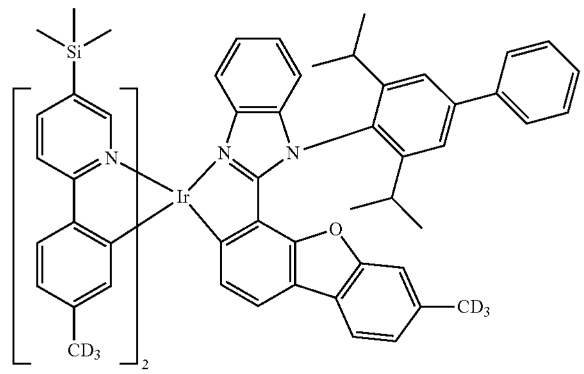
1338
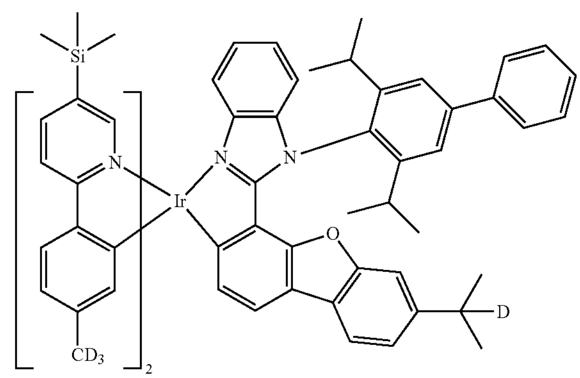
1339
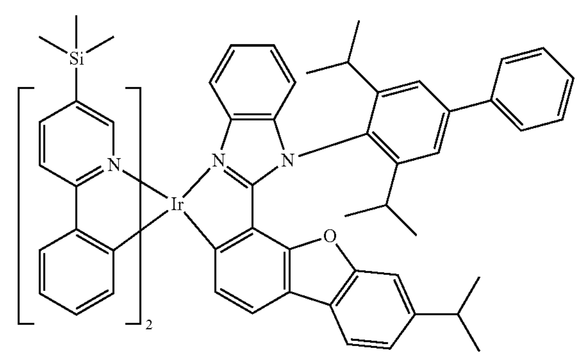
1340
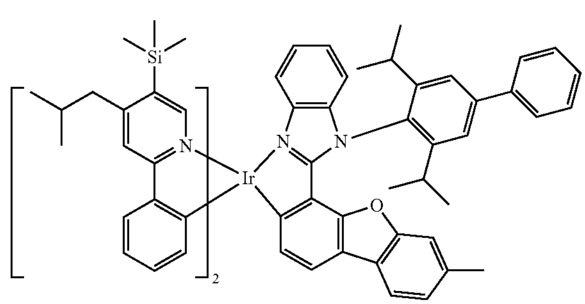

-continued
1341
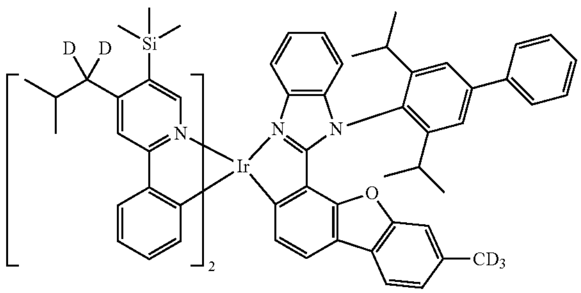
1342
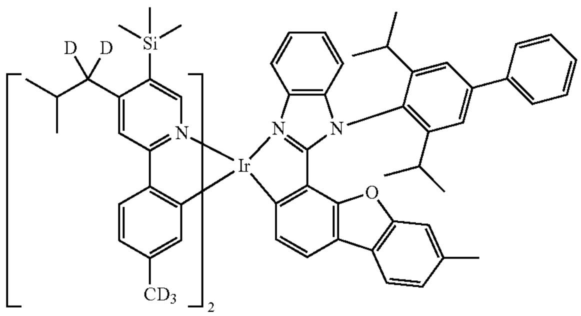
1343
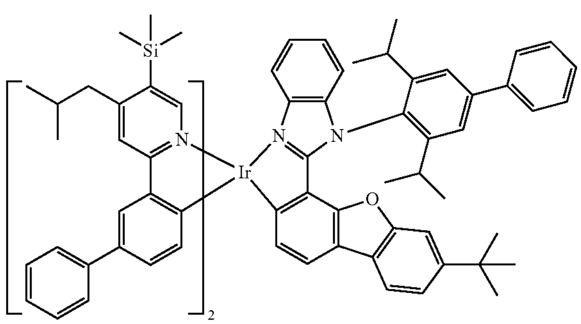
1344
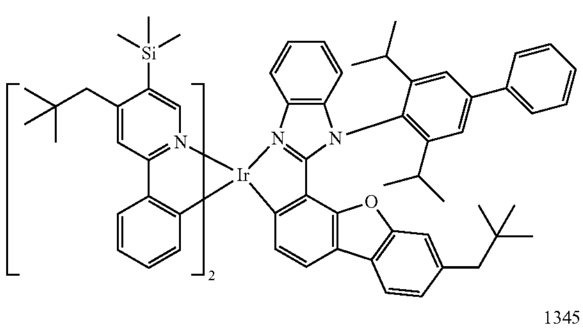
1345
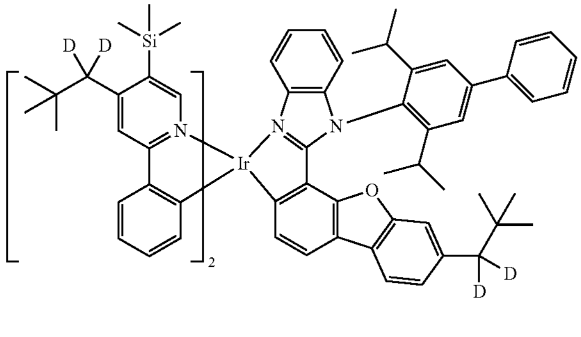
-continued
1346
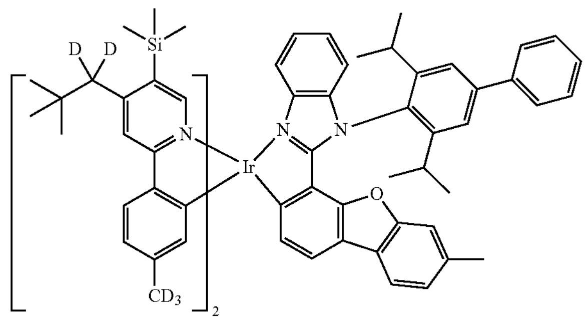
1347
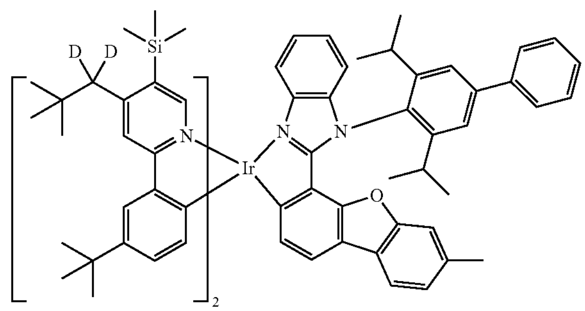
1348
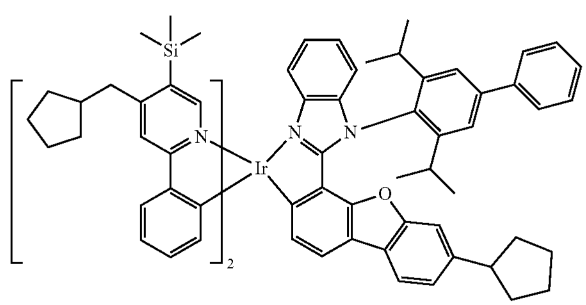
1349
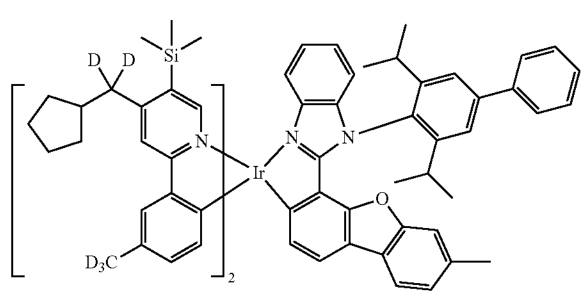
1350
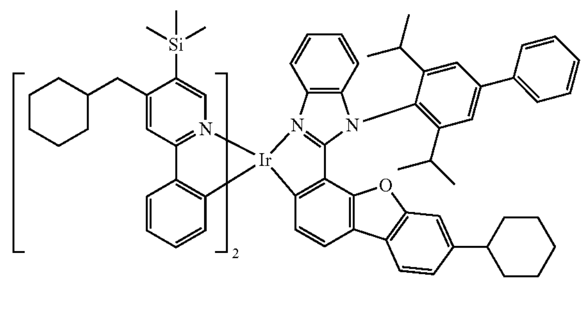

-continued
1351
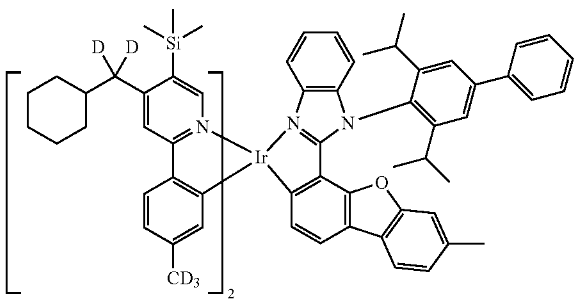
1352
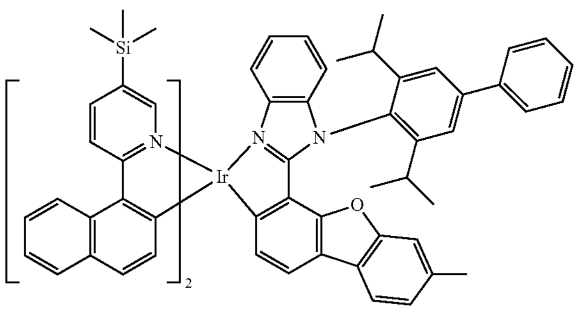
1353
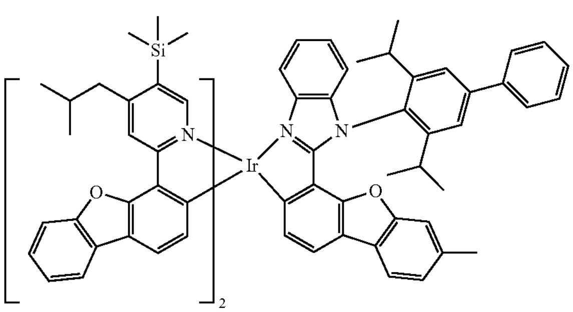
1354
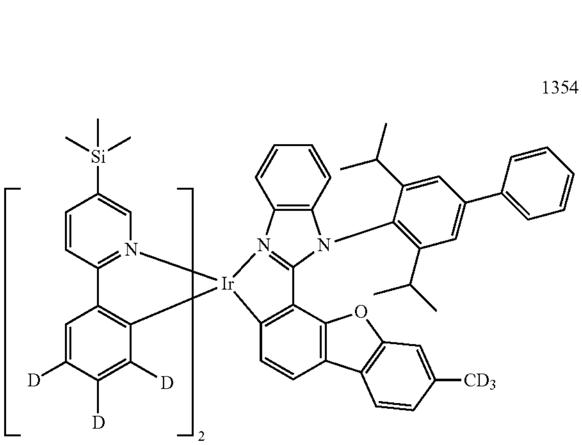
-continued
1355
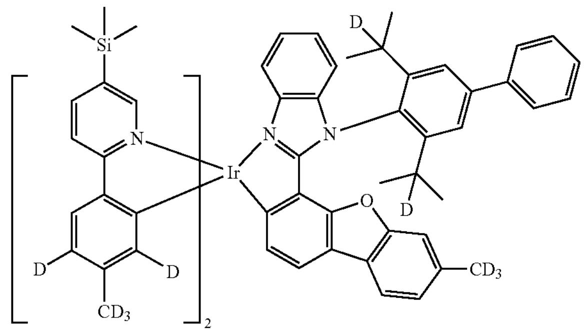
1356
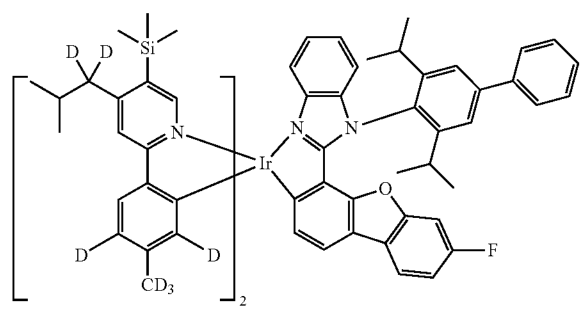
1357
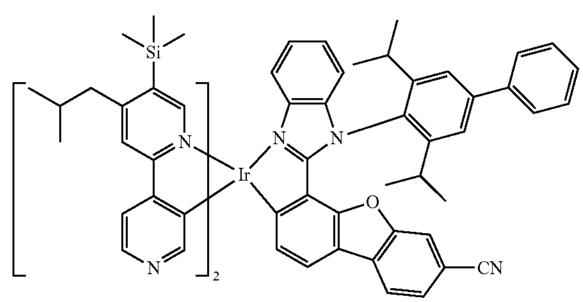
1358
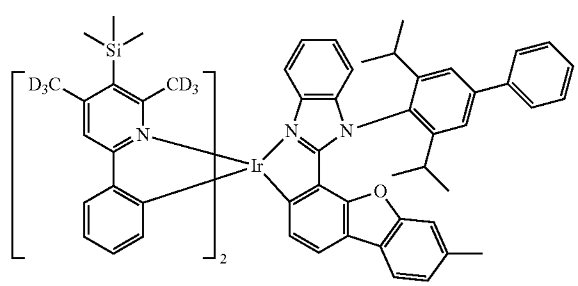
1359
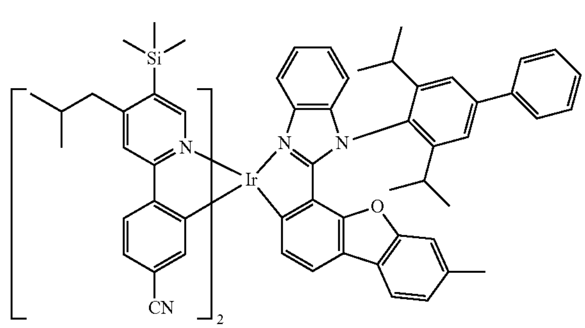

-continued
1360
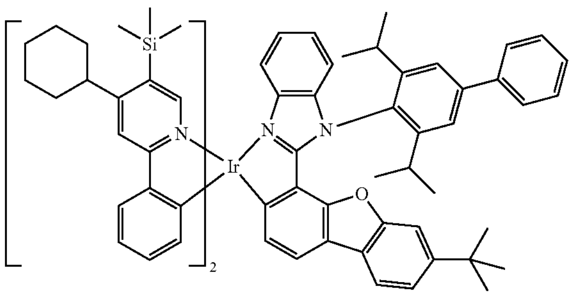
1361
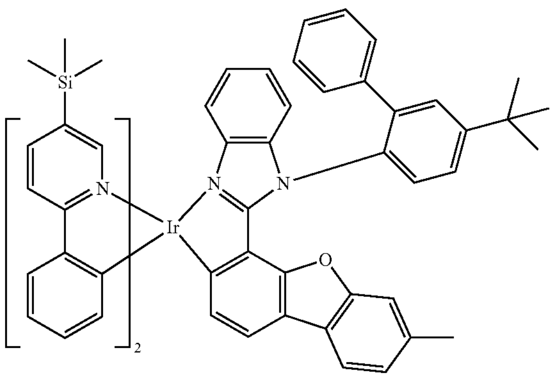
1362
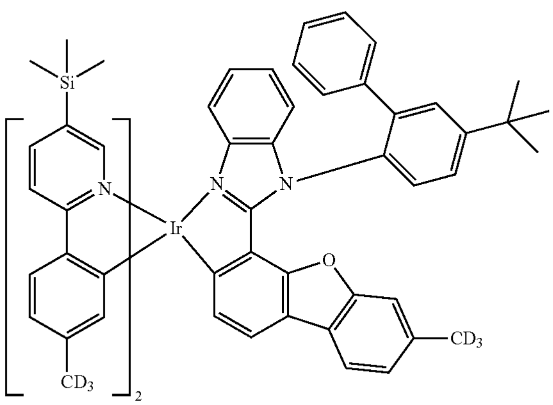
1363
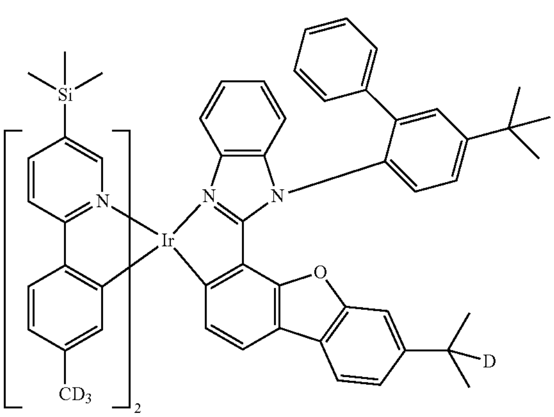
-continued
1364
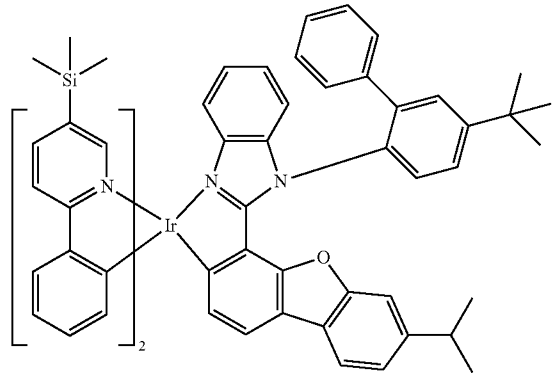
1365
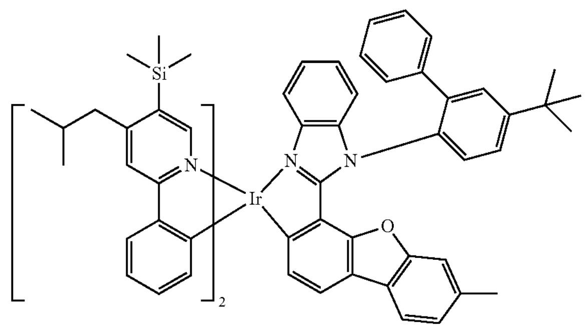
1366
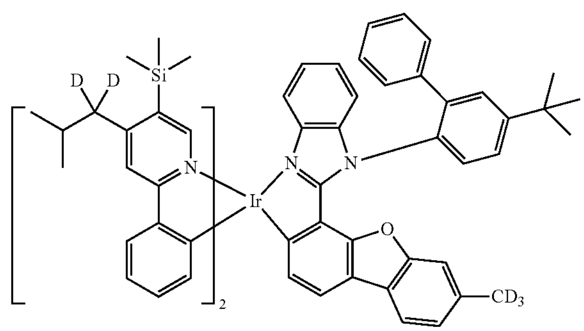
1367
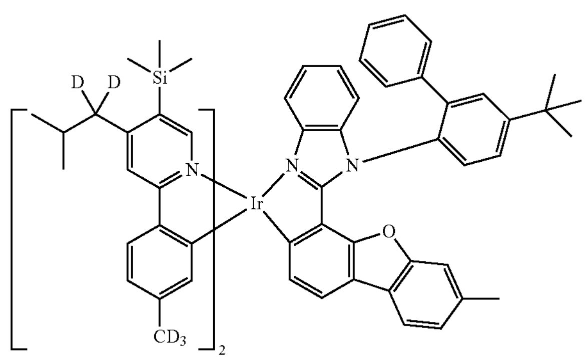

-continued
1368
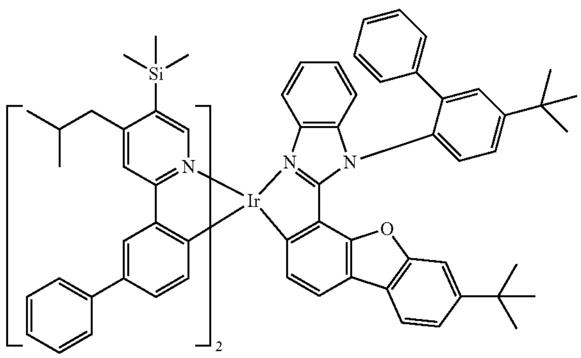
1369
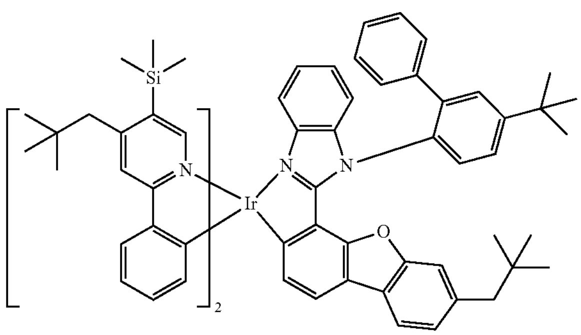
1370
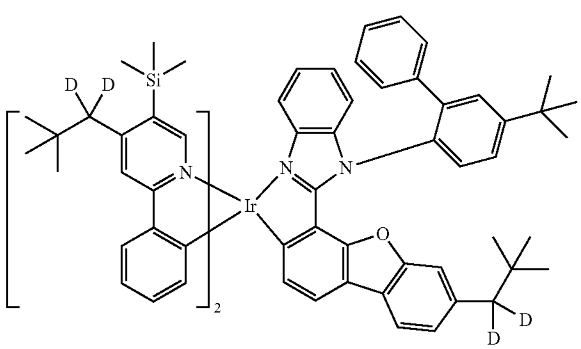
1371
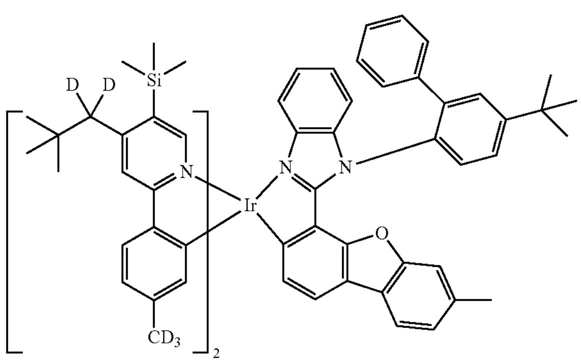
-continued
1372
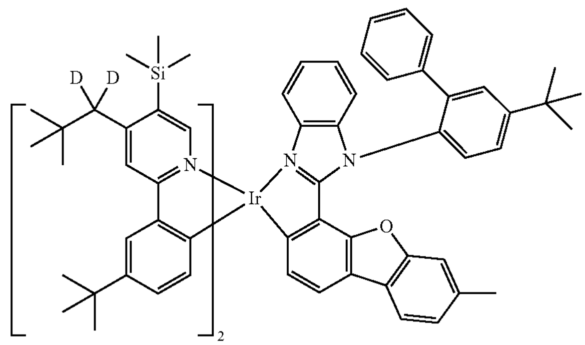
1373
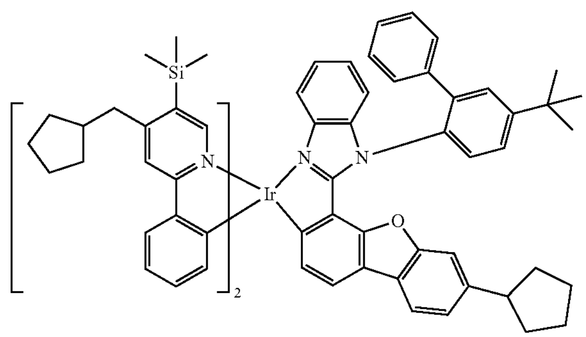
1374
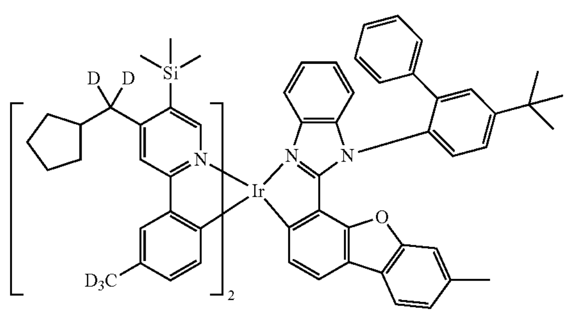
1375
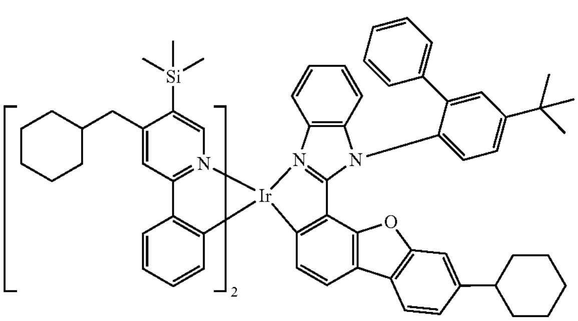

-continued
1376
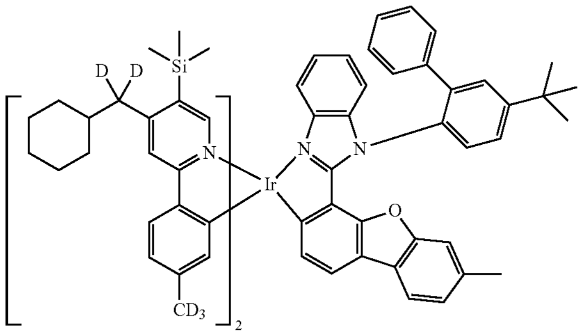
1377
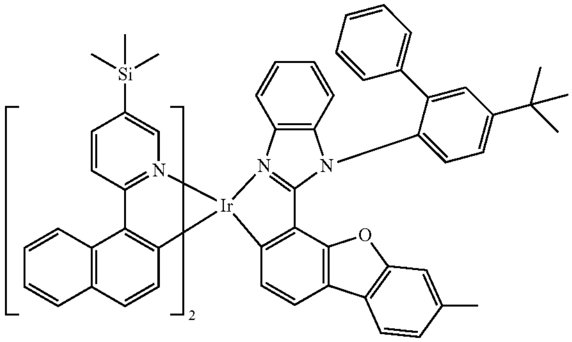
1378
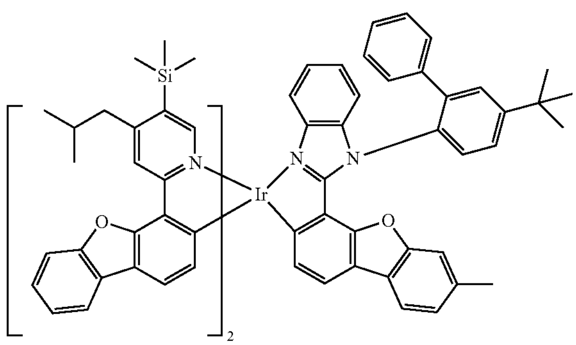
1379
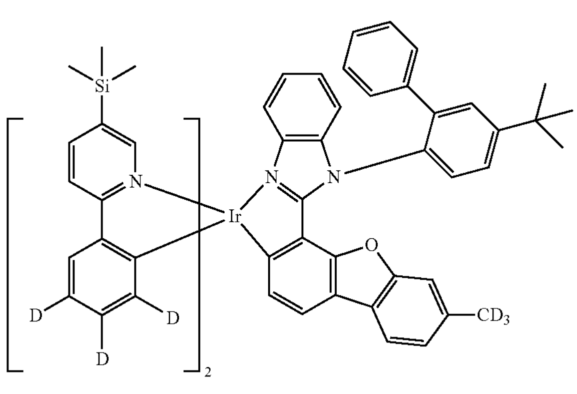
-continued
1380
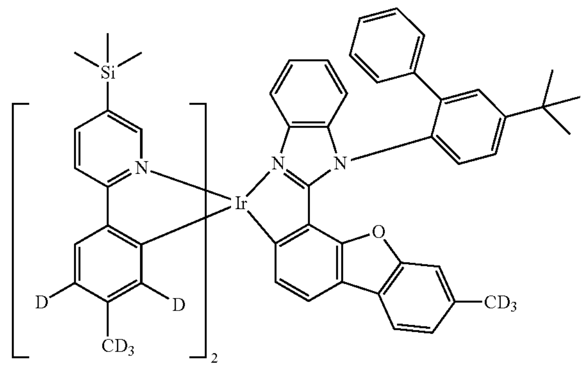
1381
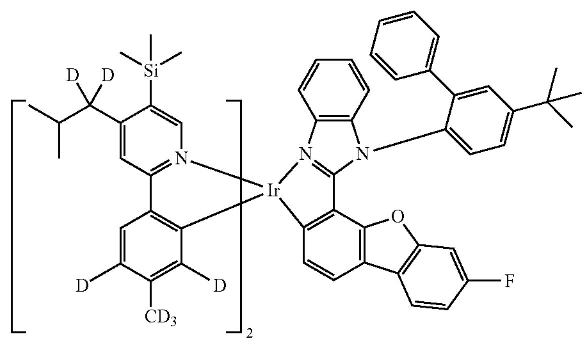
1382
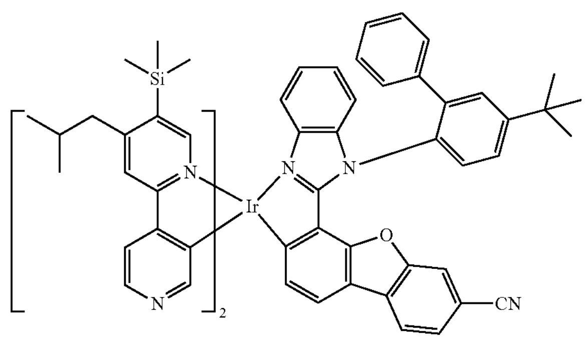
1383
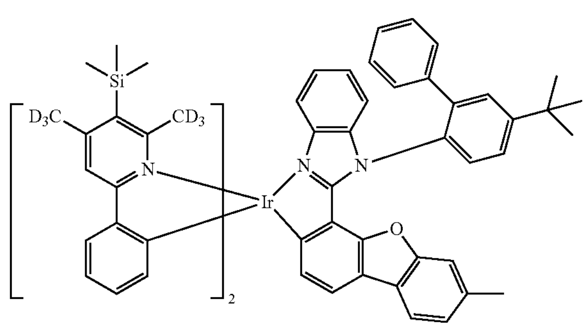

-continued
1384
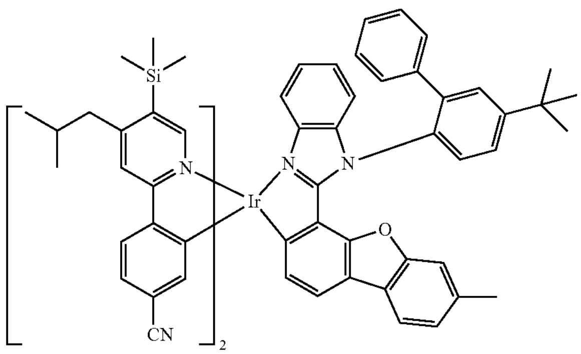
1385
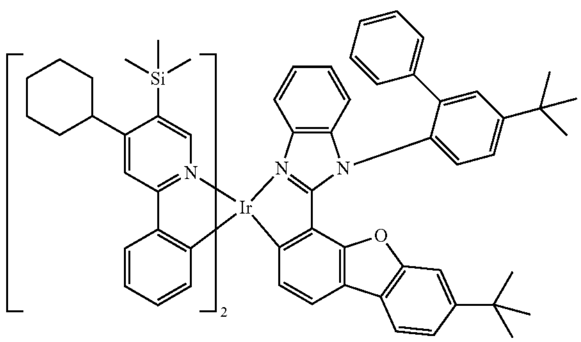
1386
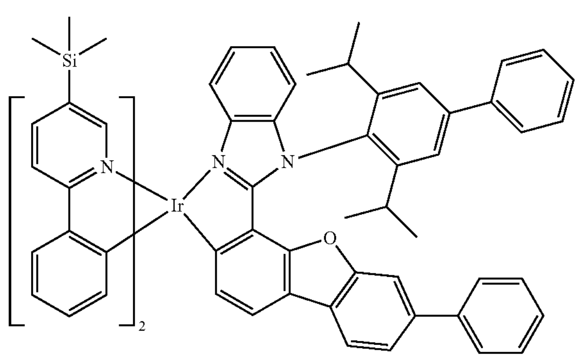
1387
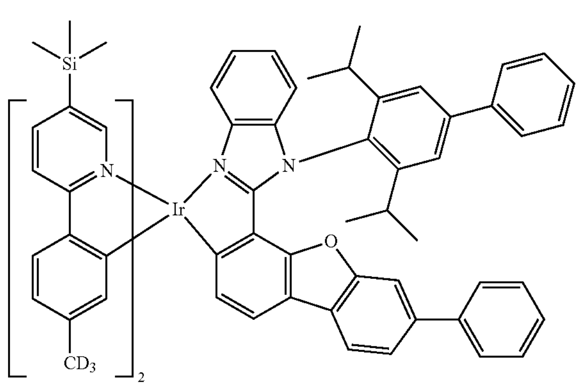
-continued
1388
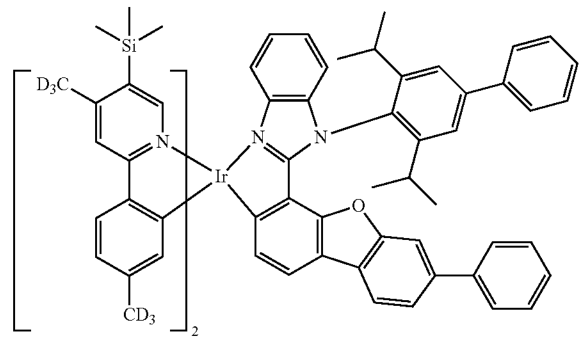
1389
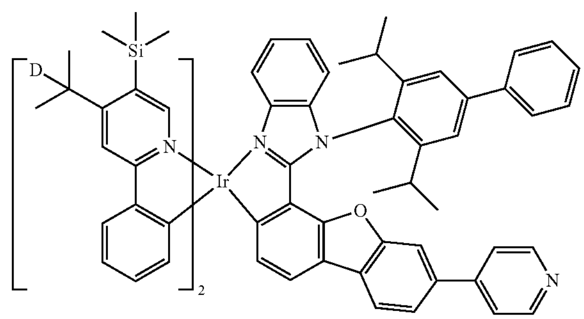
1390
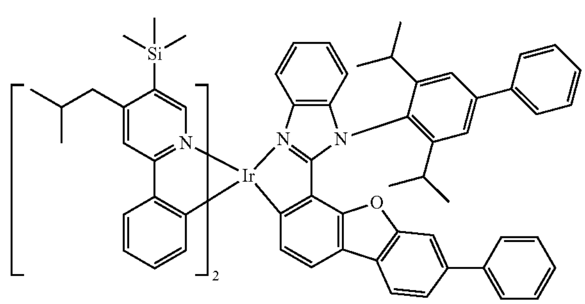
1391
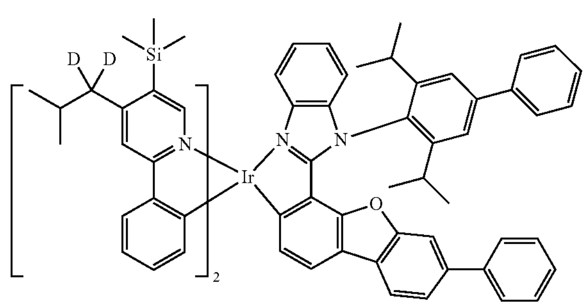

-continued
1392
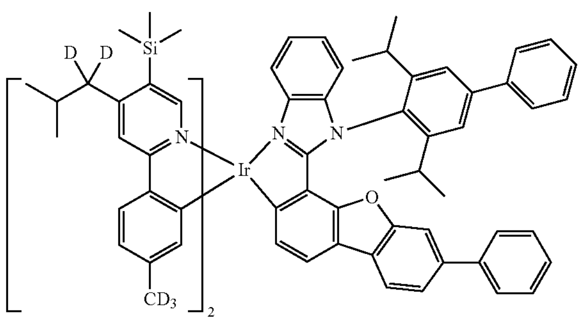
1393
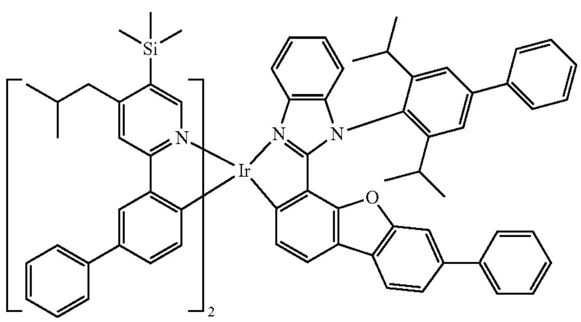
1394
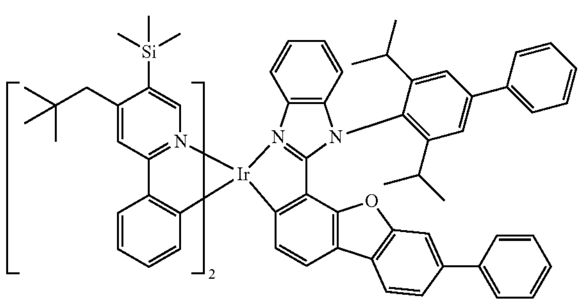
1395
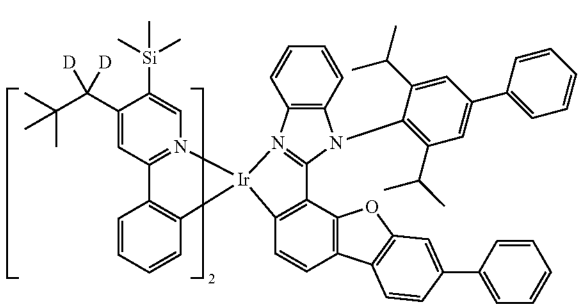
-continued
1396
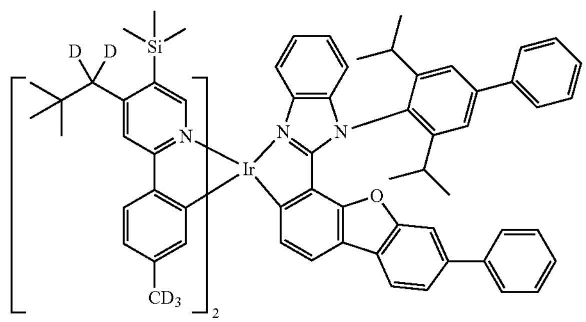
1397
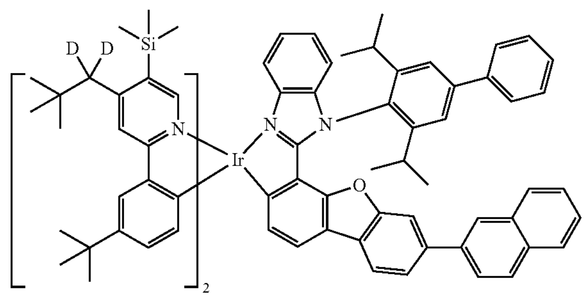
1398
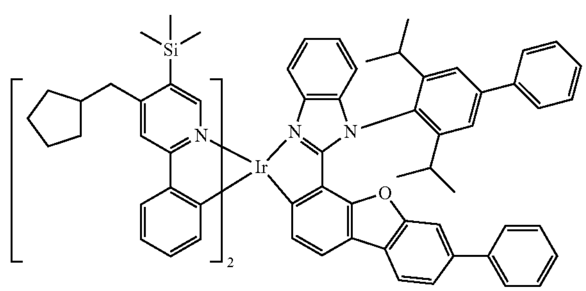
1399
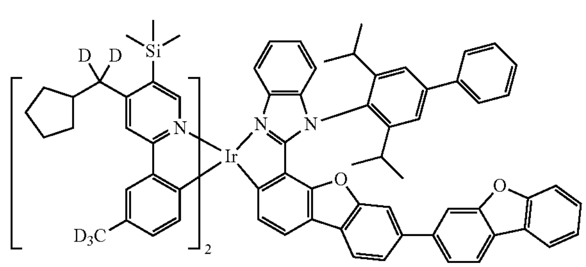
1400
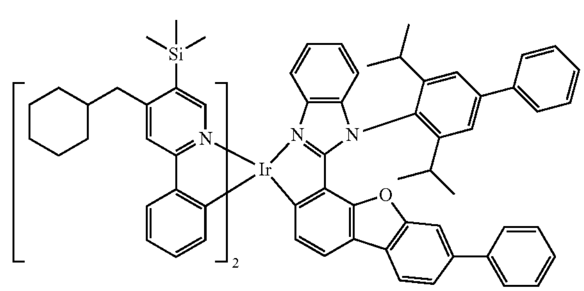

-continued
1401
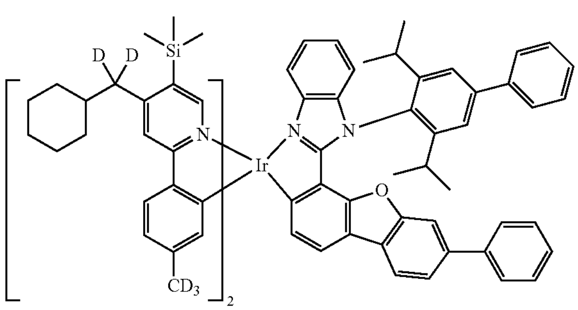
1402
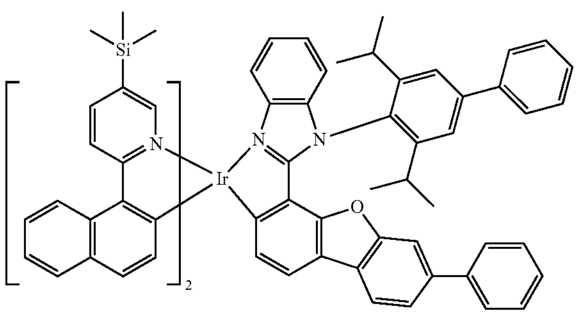
1403
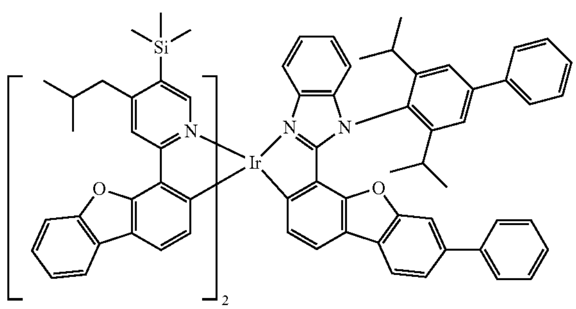
1404
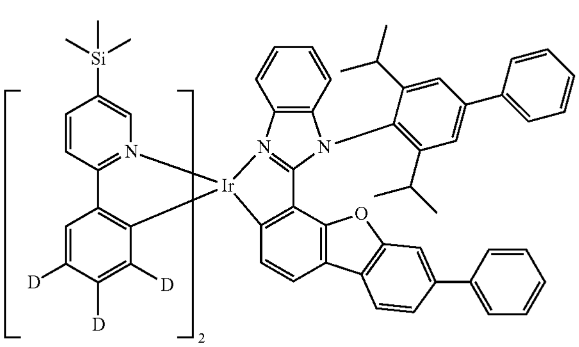
-continued
1405
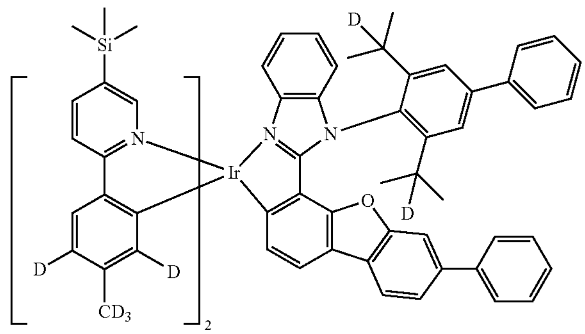
1406
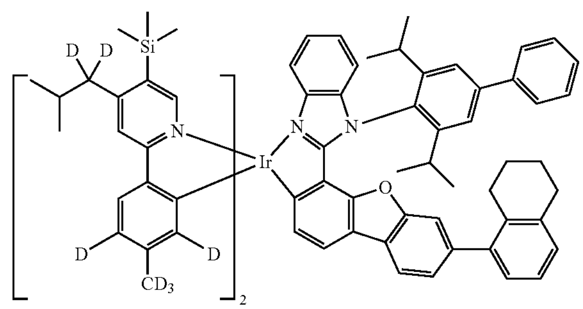
1407
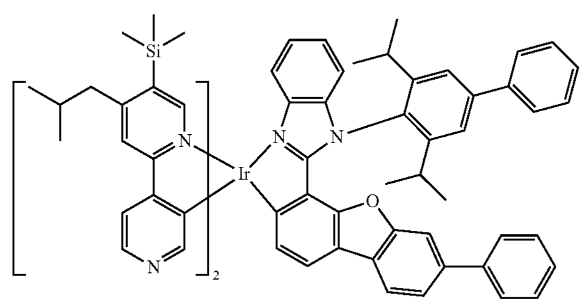
1408
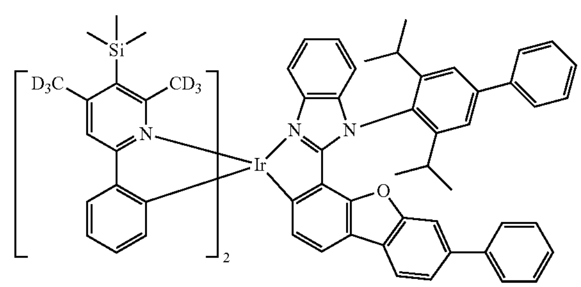
1409
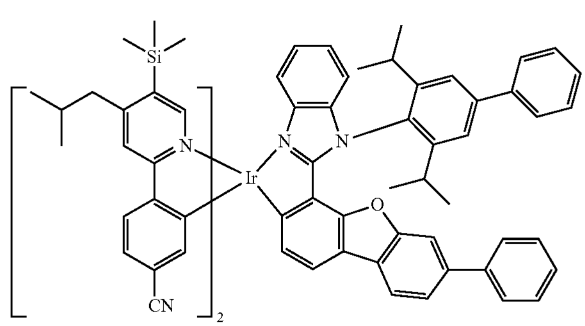

-continued
1410
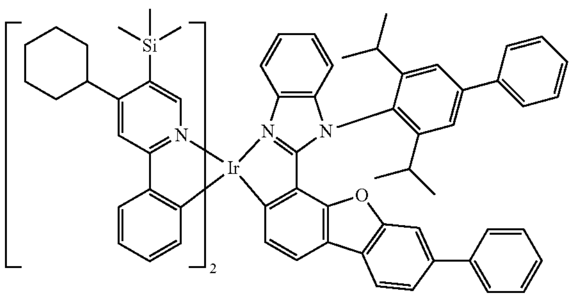
1411
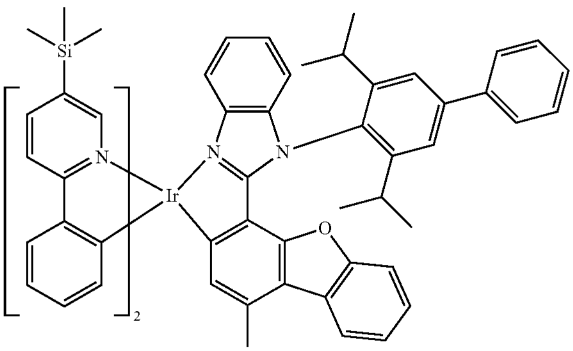
1412
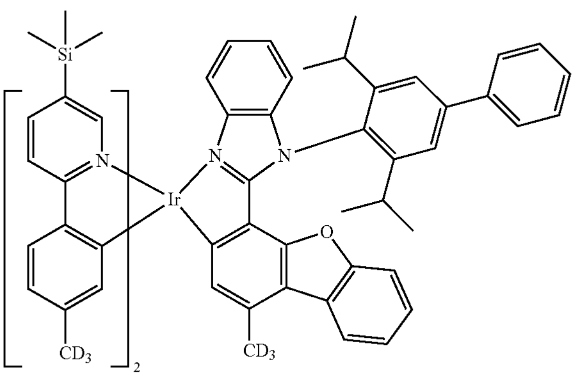
1413
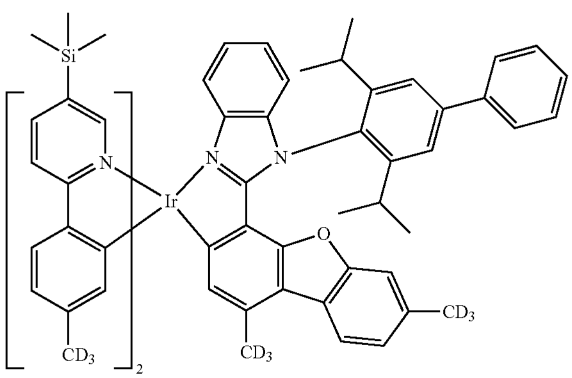
-continued
1414
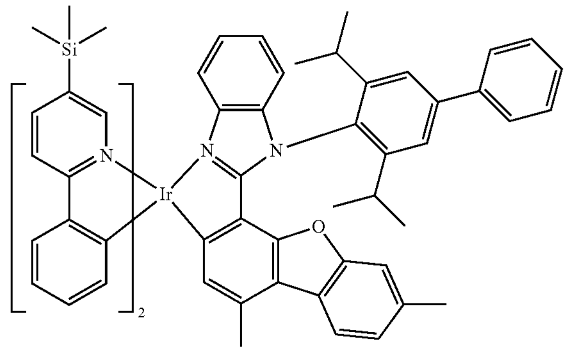
1415
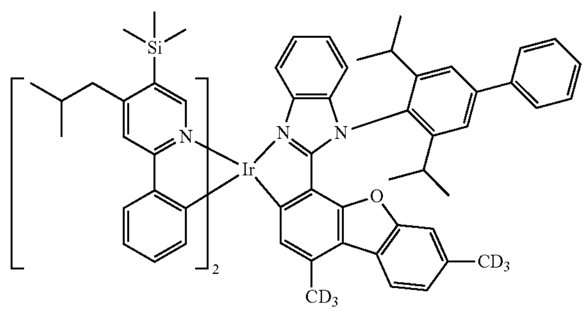
1416
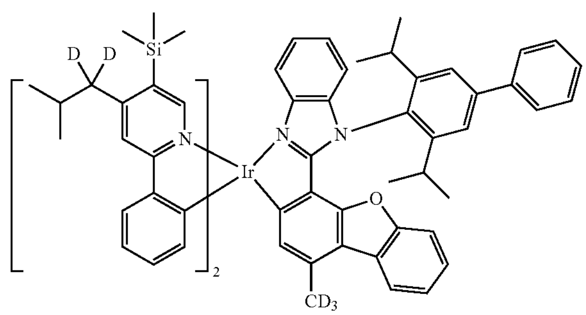
1417
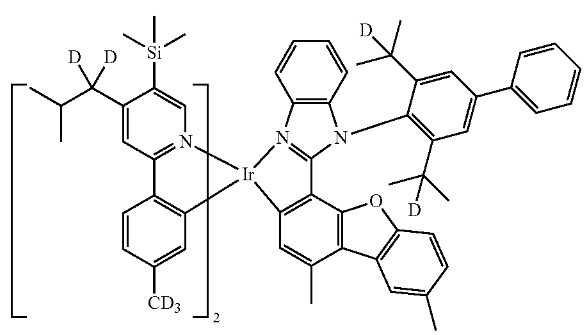

-continued
1418
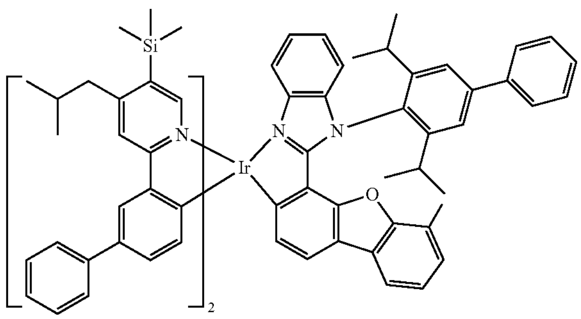
1419
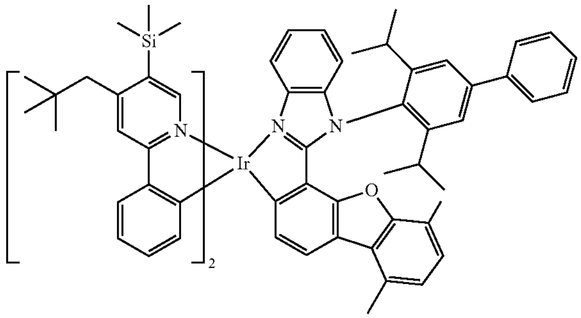
1420
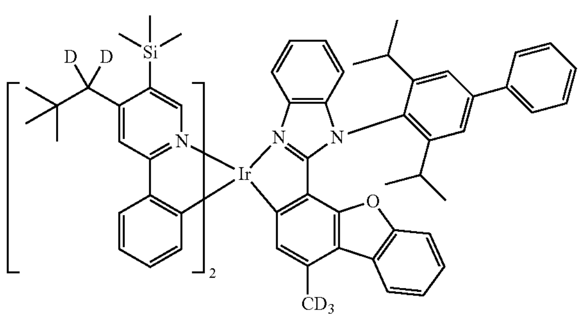
1421
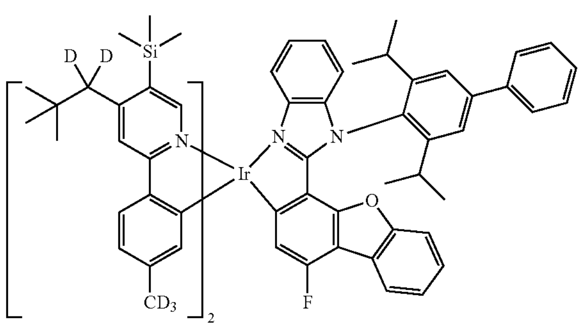
-continued
1422
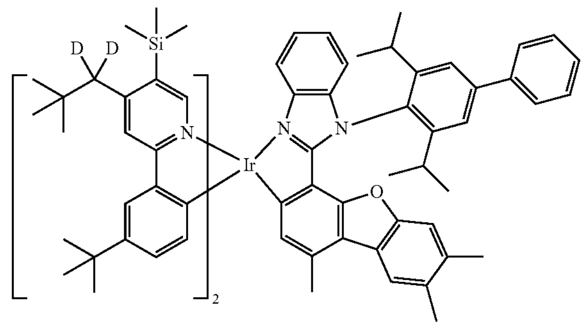
1423
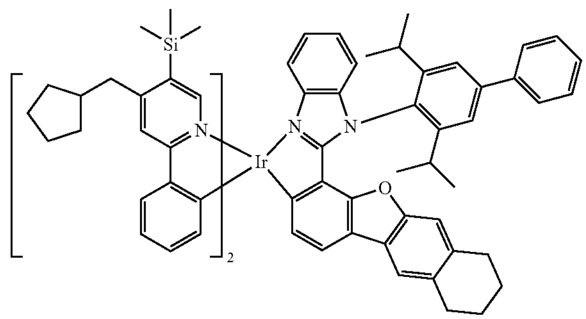
1424
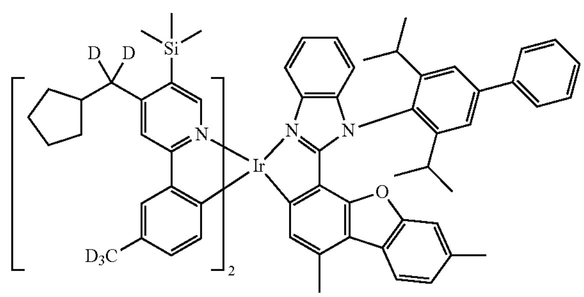
1425
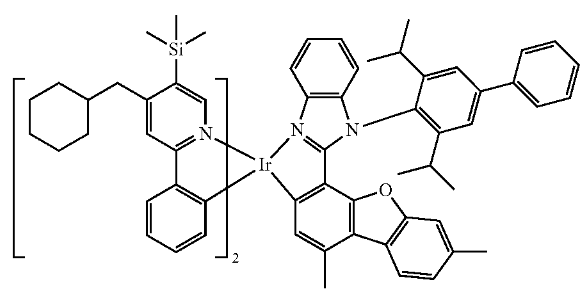
1426
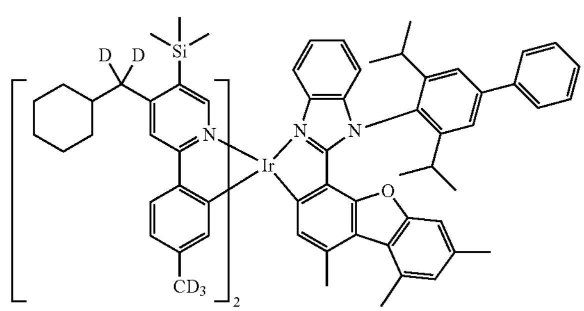

-continued
1427
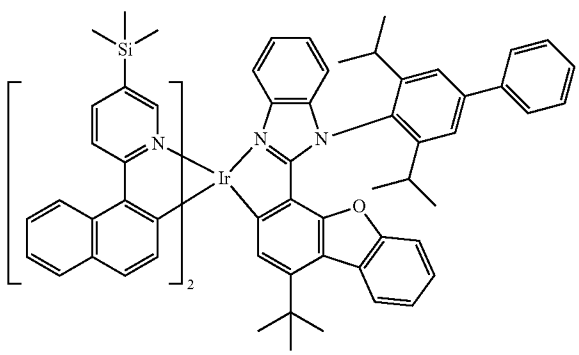
1428
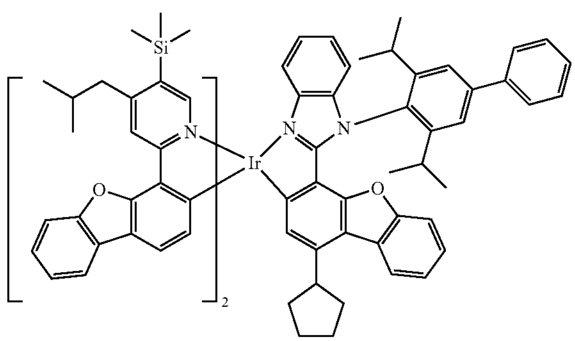
1429
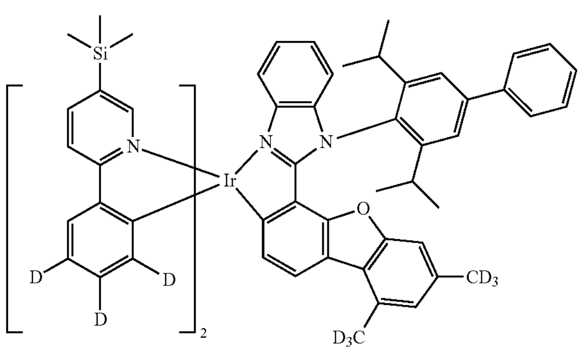
1430
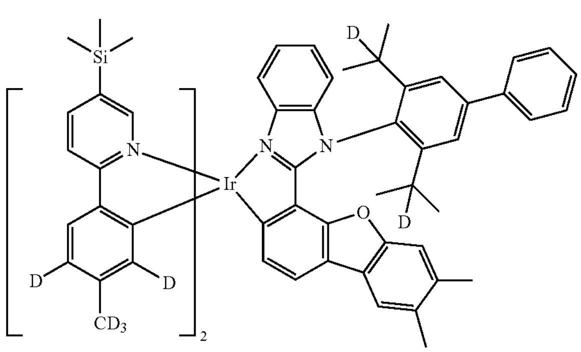
-continued
1431
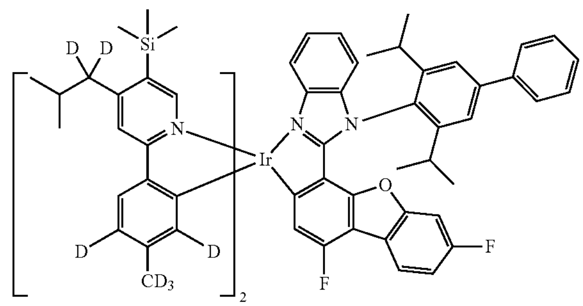
1432
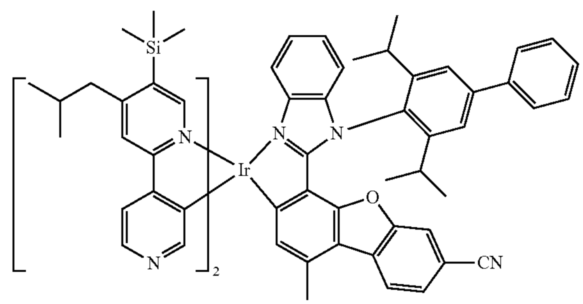
1433
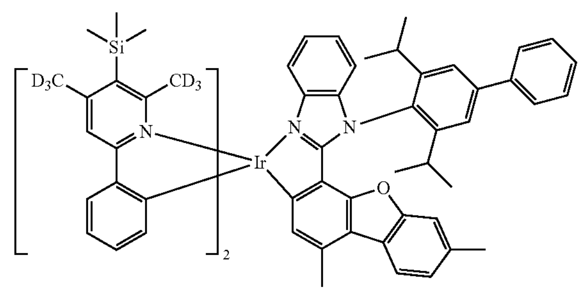
1434
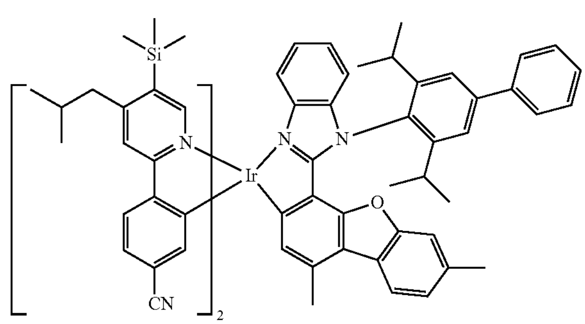
1435
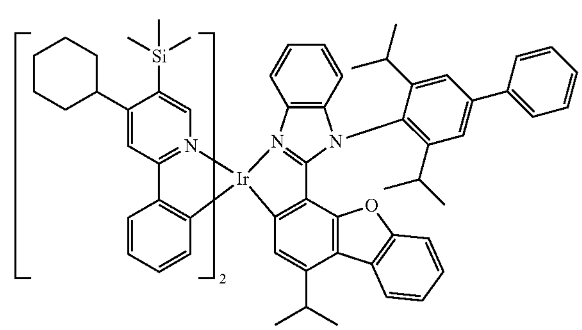

-continued
1436
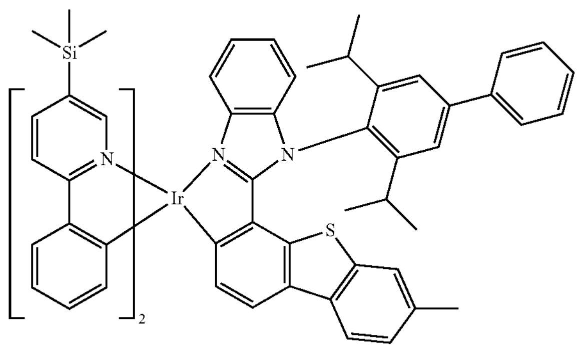
1437
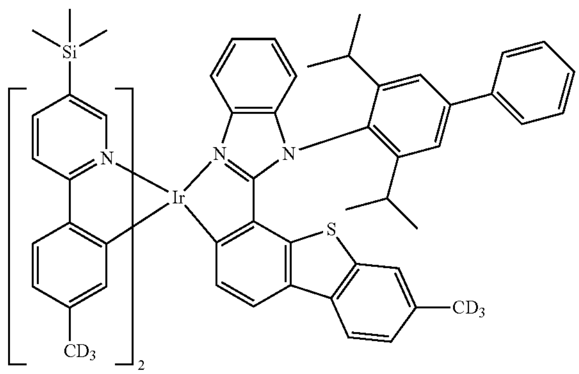
1438
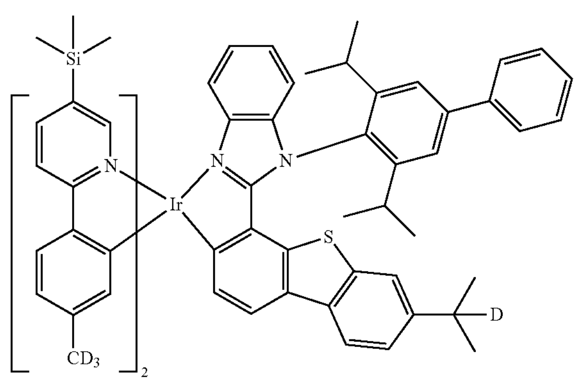
1439
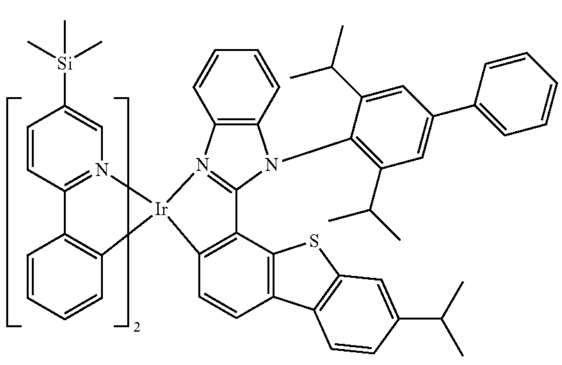
-continued
1440
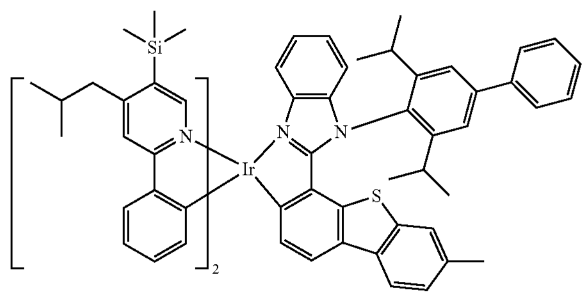
1441
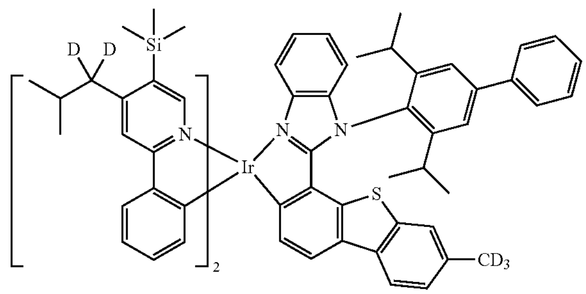
1442
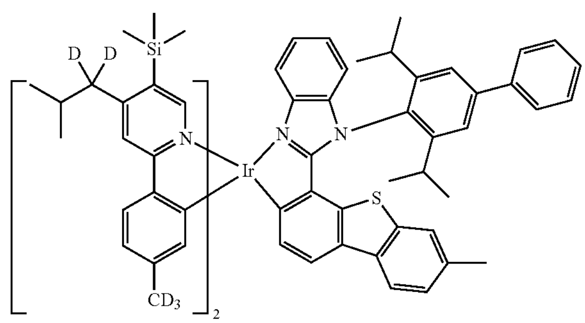
1443
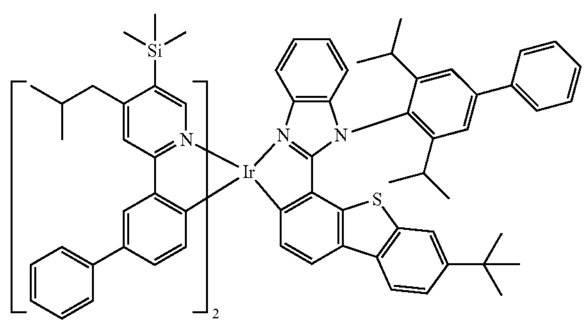
1444
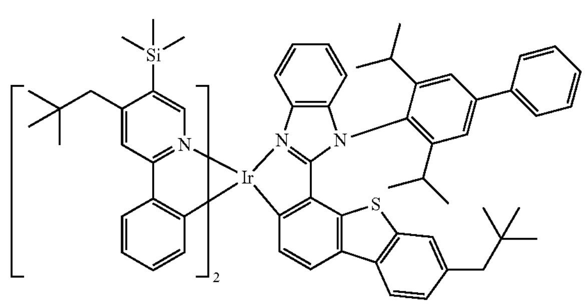

-continued
1445
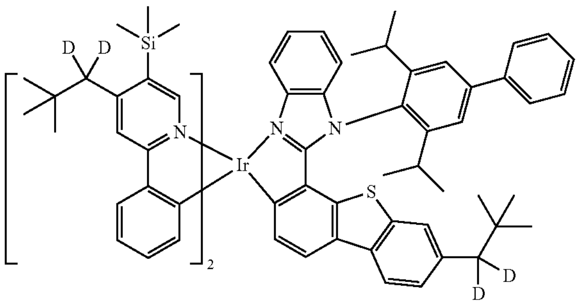
1446
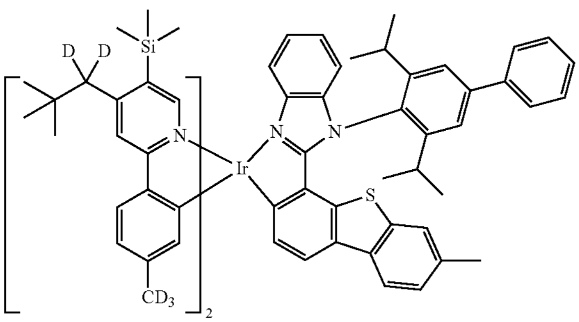
1447
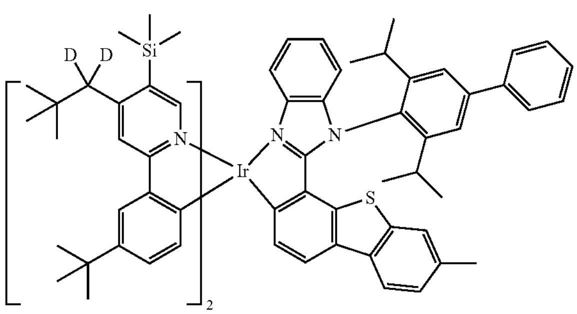
1448
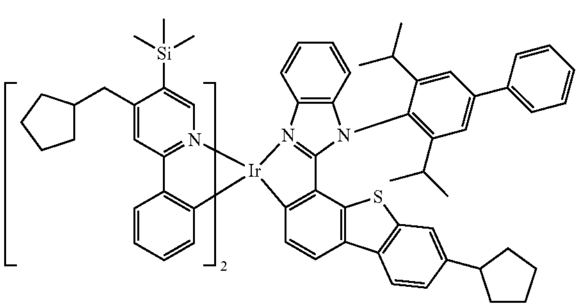
1449
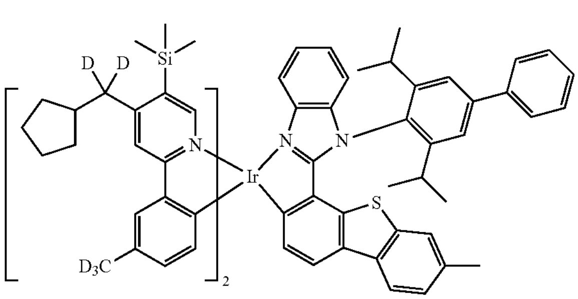
-continued
1450
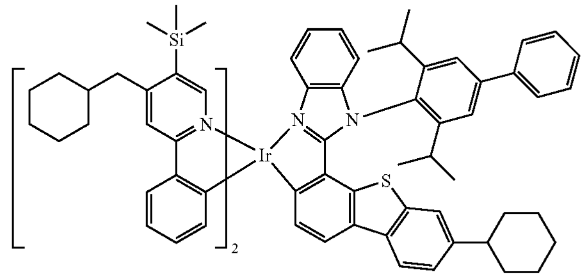
1451
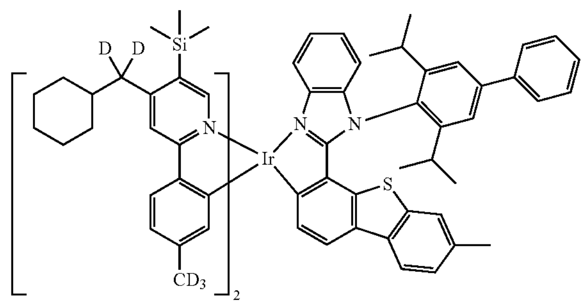
1452
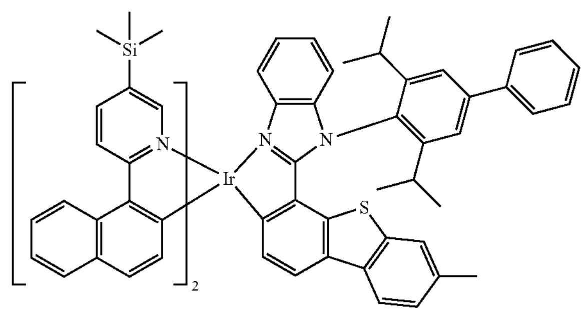
1453
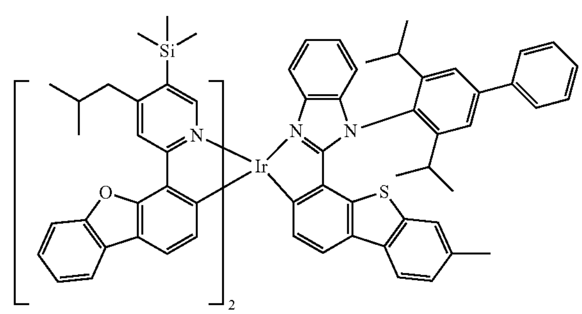
1454
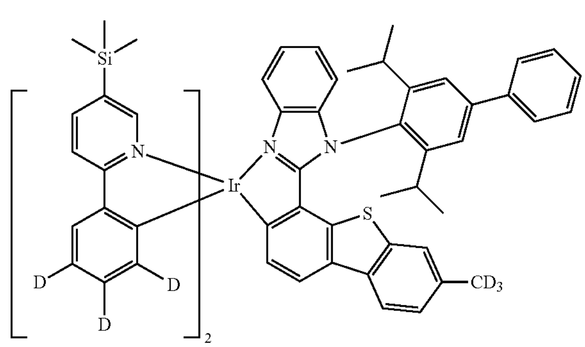

-continued
1455
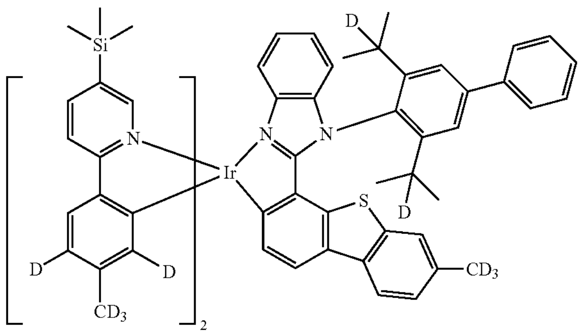
1456
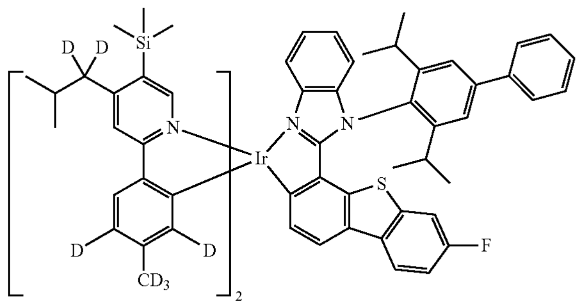
1457
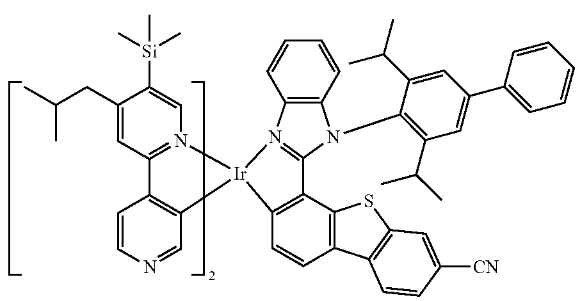
1458
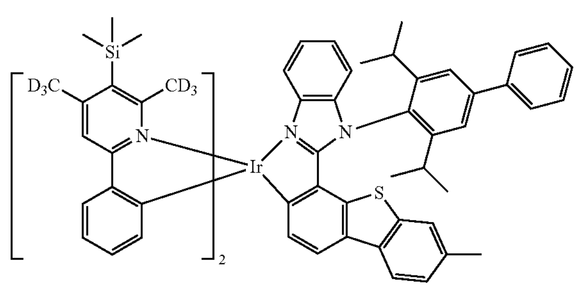
1459
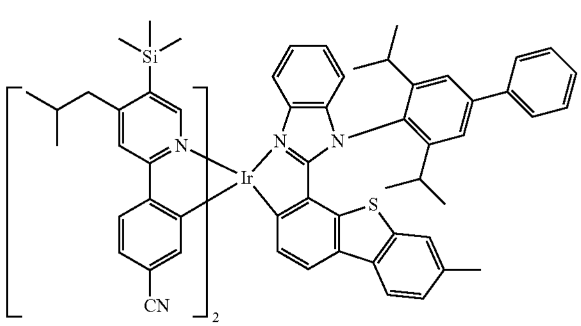
-continued
1460
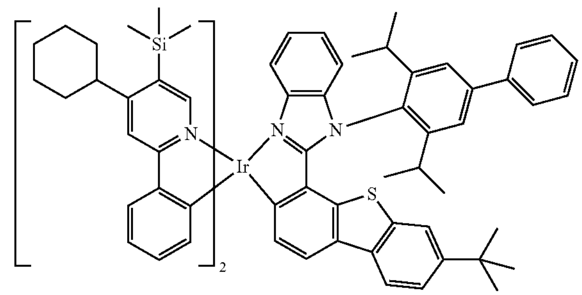
1461
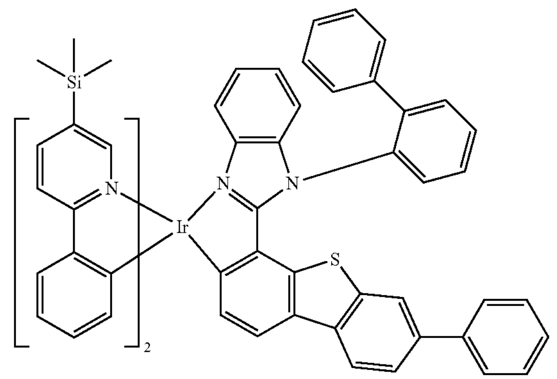
1462
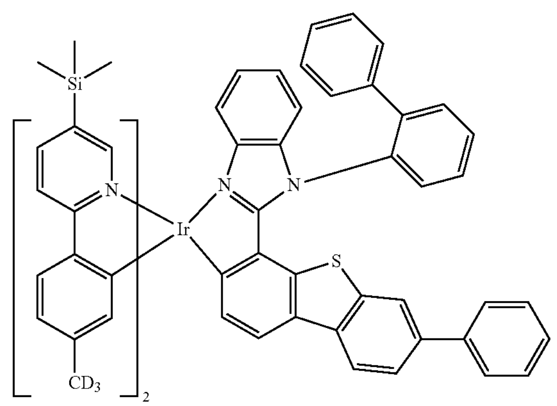
1463
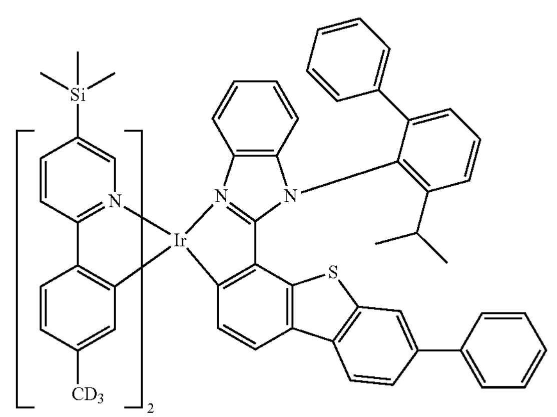

-continued
1464
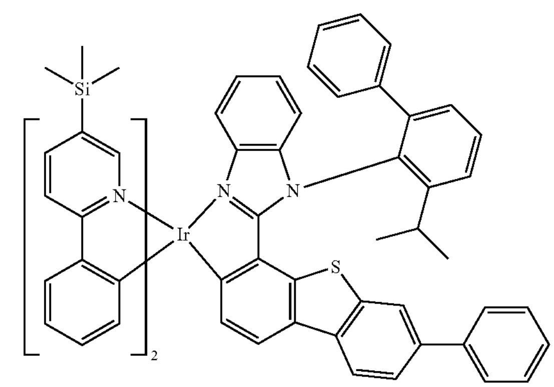
1465
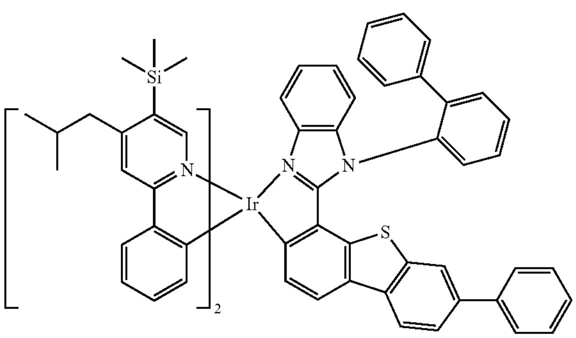
1466
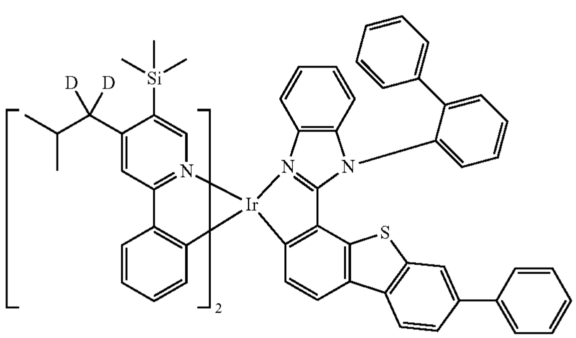
1467
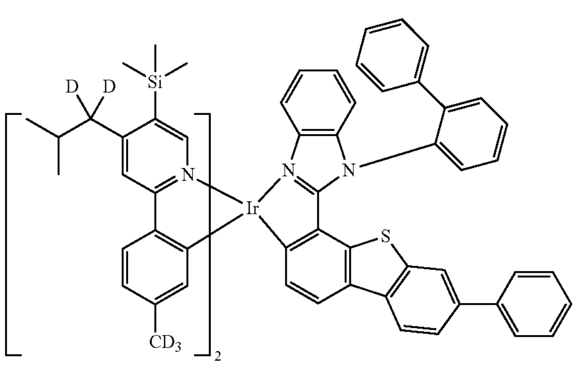
-continued
1468
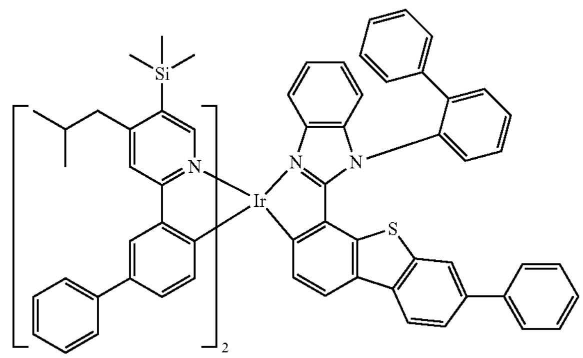
1469
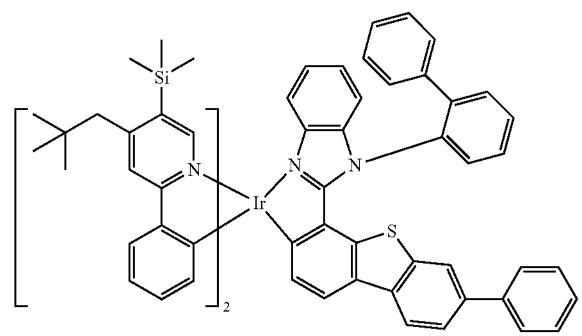
1470
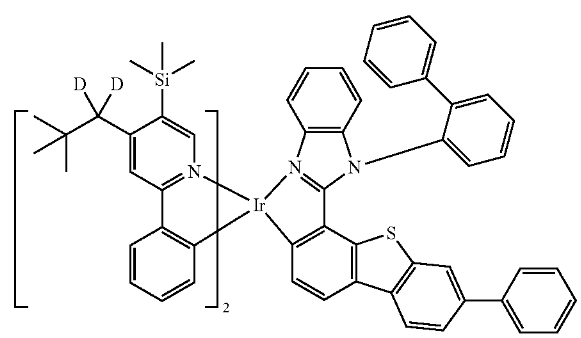
1471
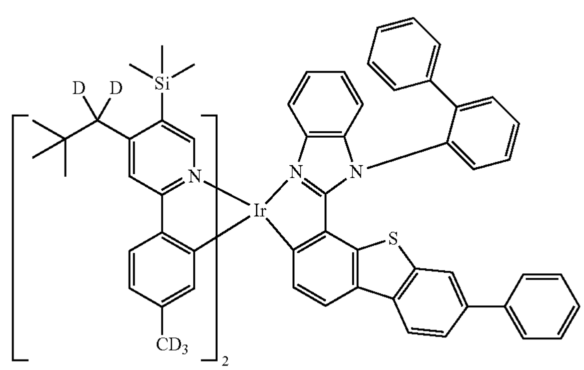

-continued
1472
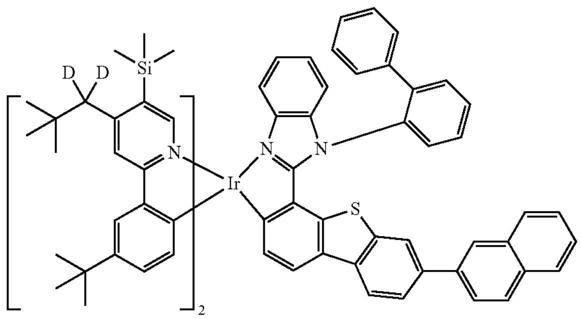
1473
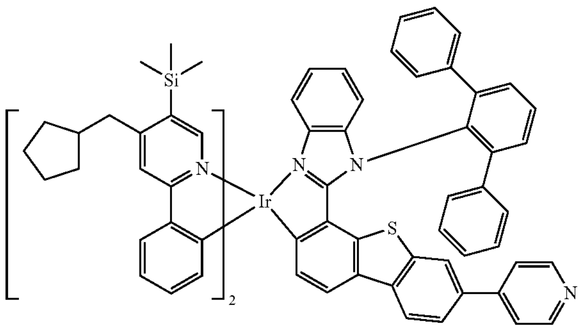
1474
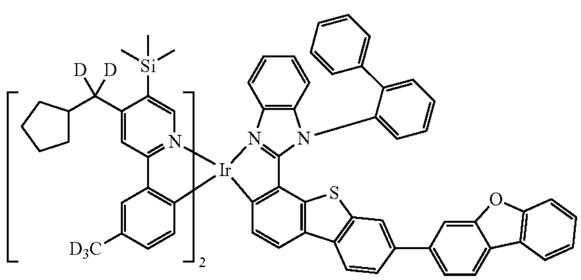
1475
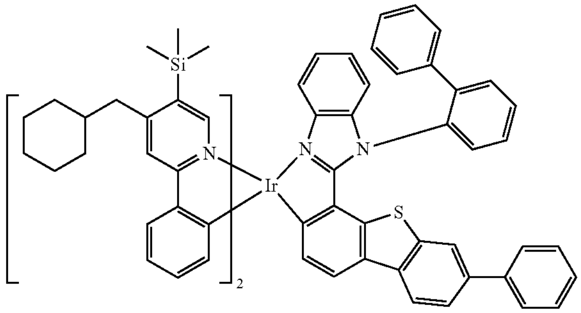
-continued
1476
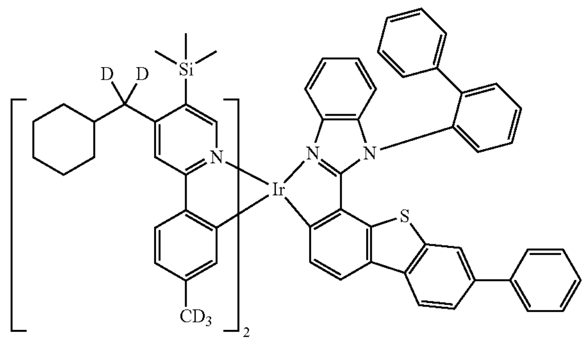
1477
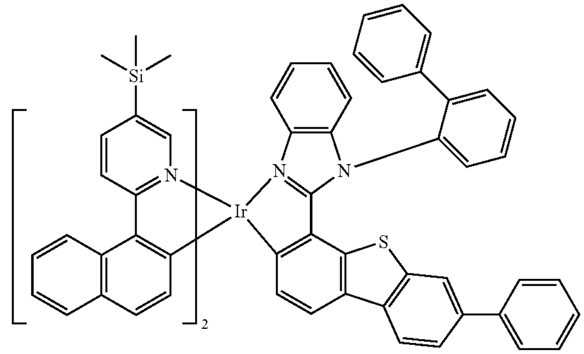
1478
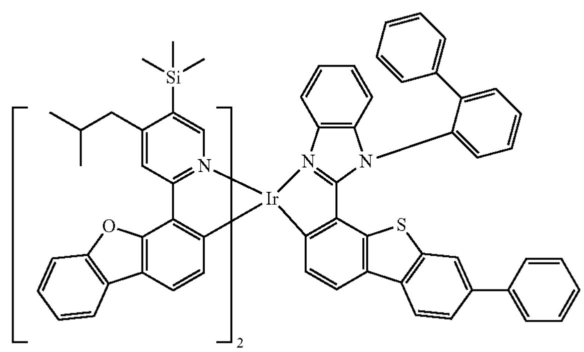
1479
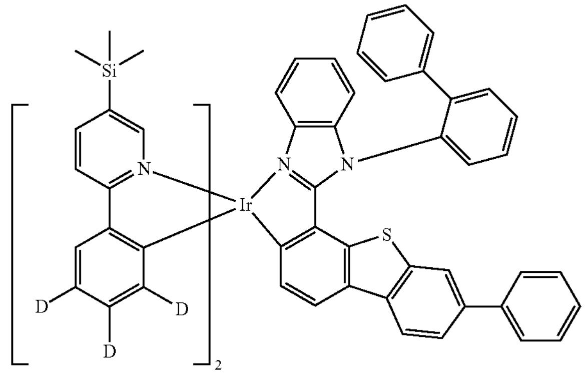

1480
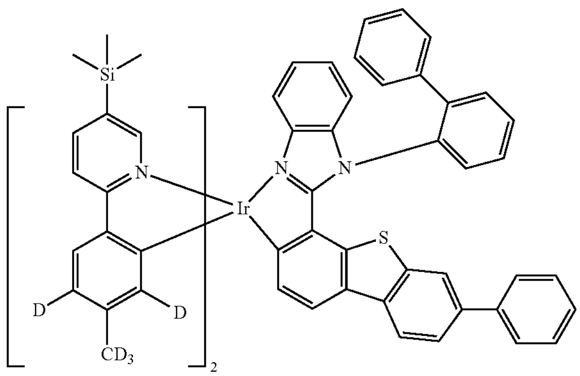
1481
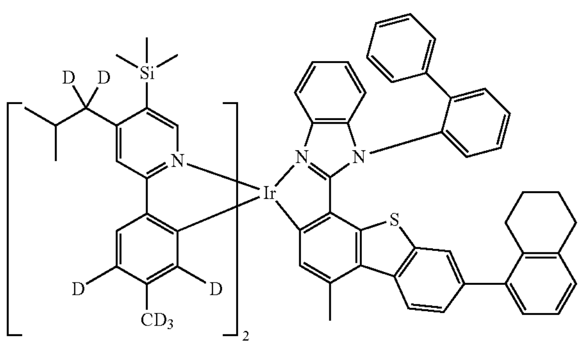
1482
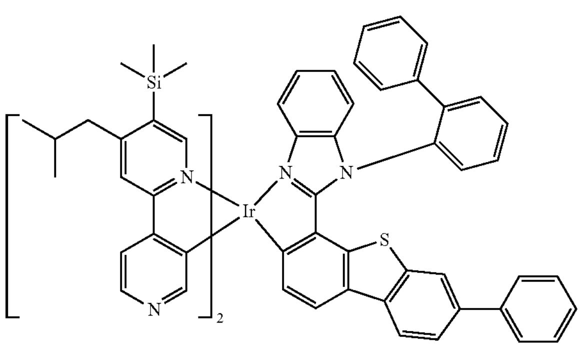
1483
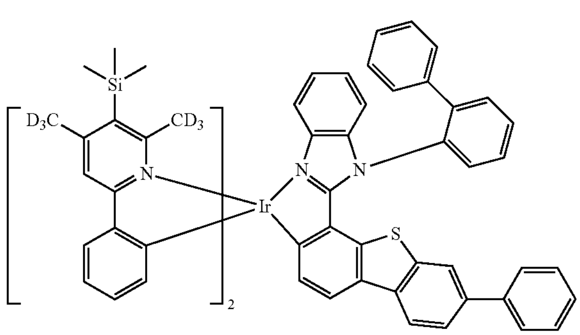
1484
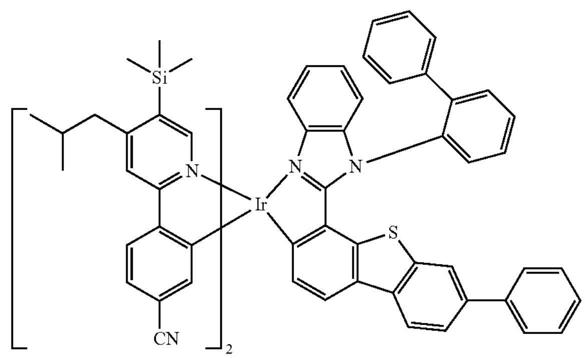
1485
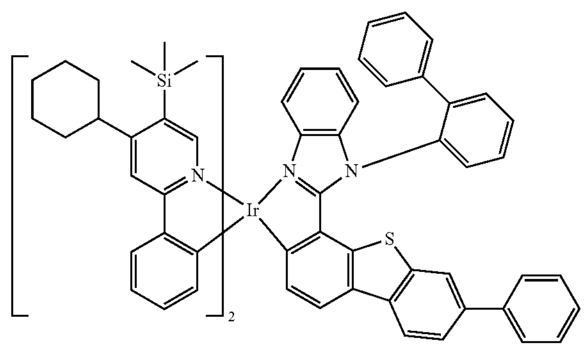
1486
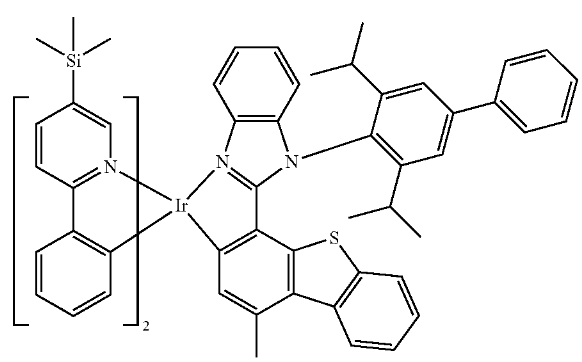
1487
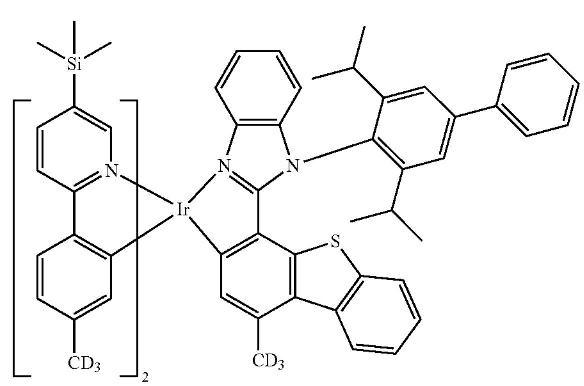

-continued
1488
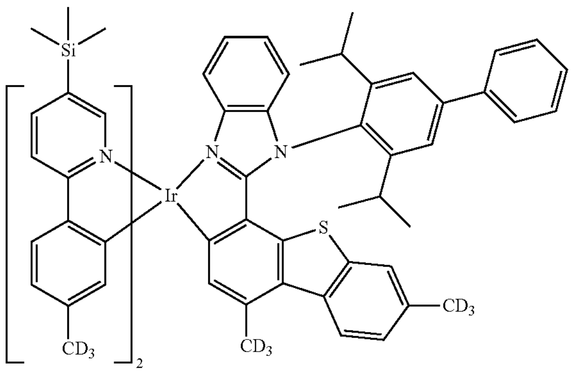
1489
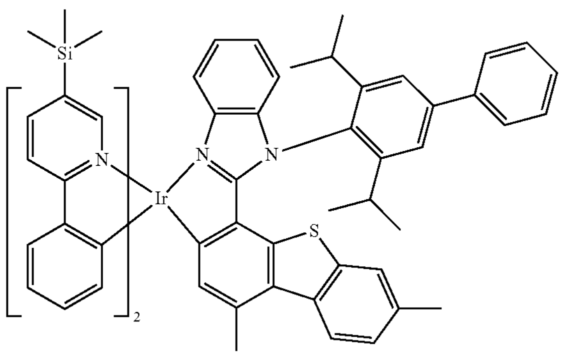
1490
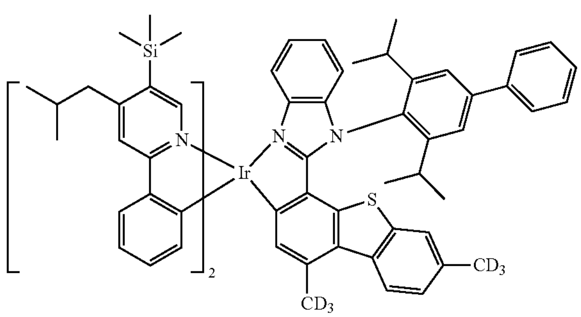
1491
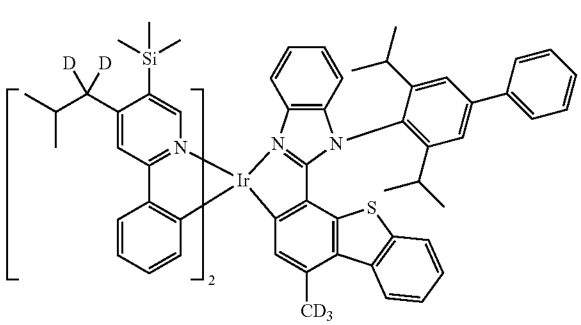
-continued
1492
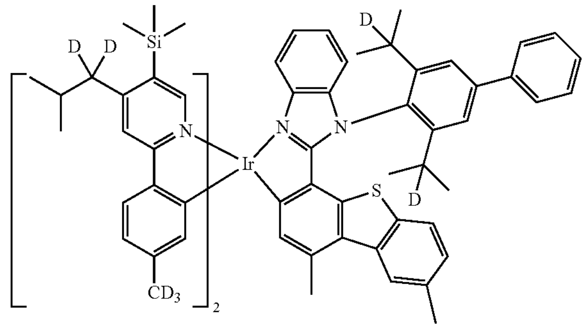
1493
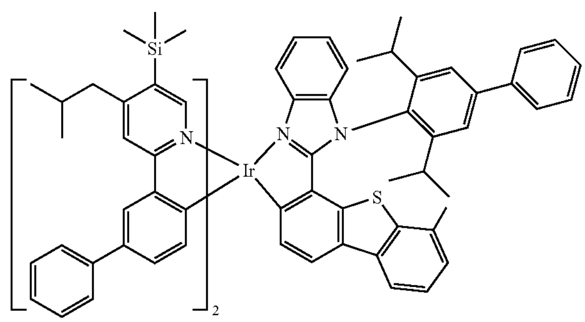
1494
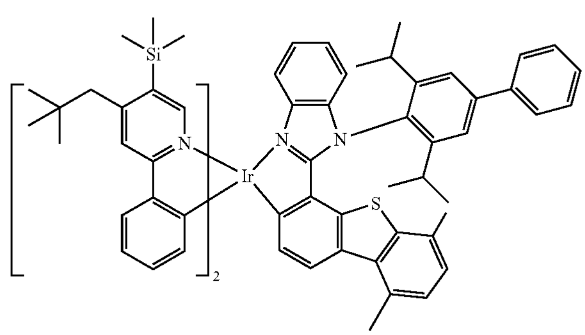
1495
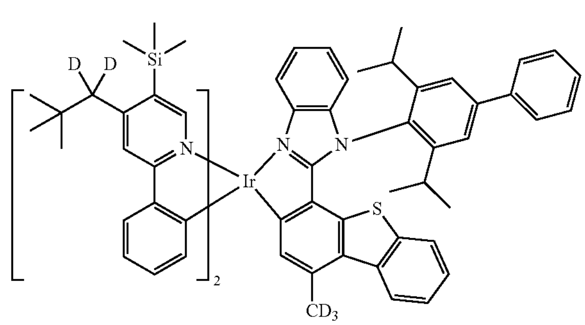

1496
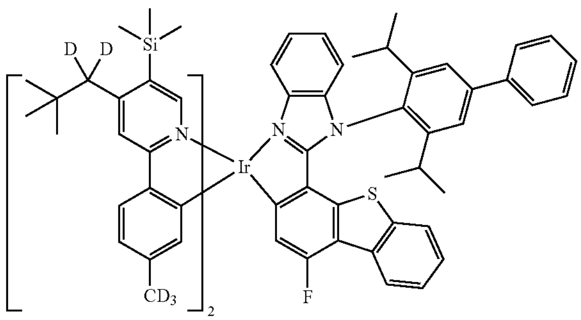
1497
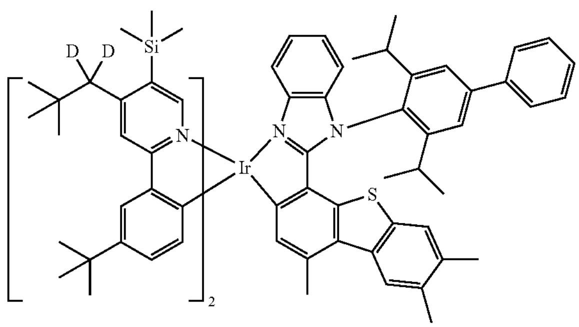
1498
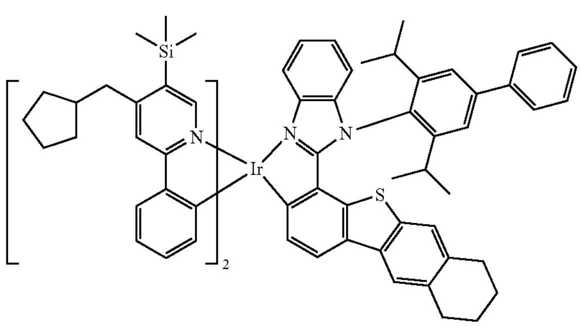
1499
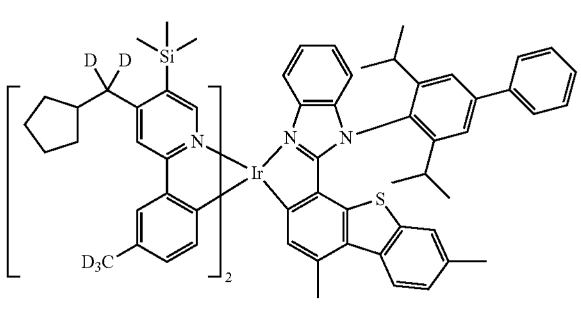
1500
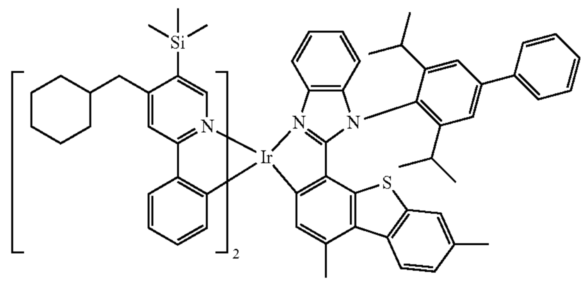
1501
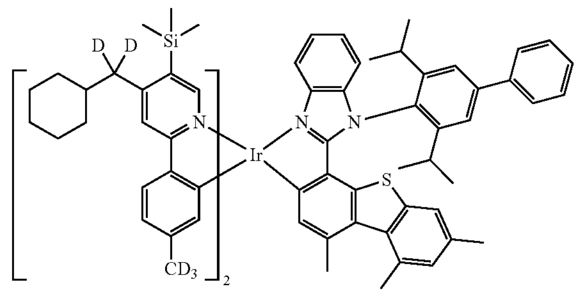
1502
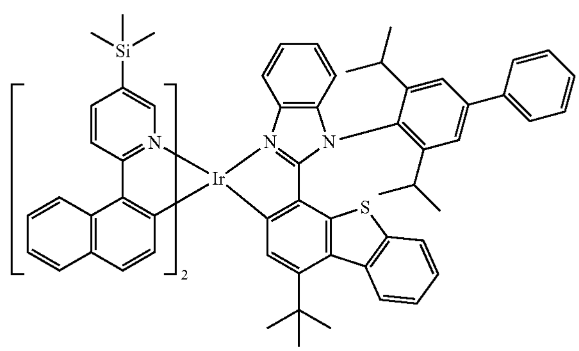
1503
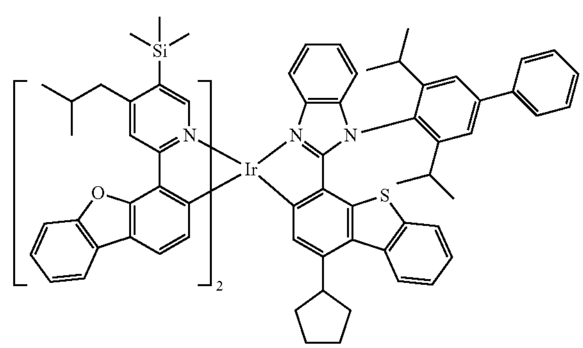

-continued
1504
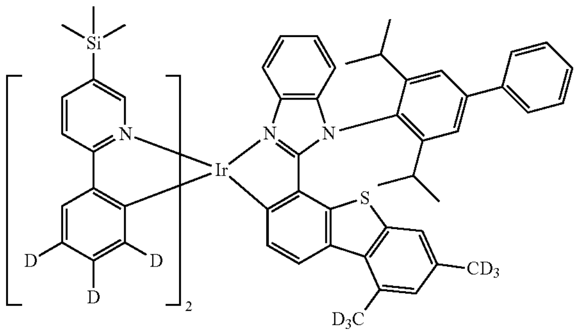
1505
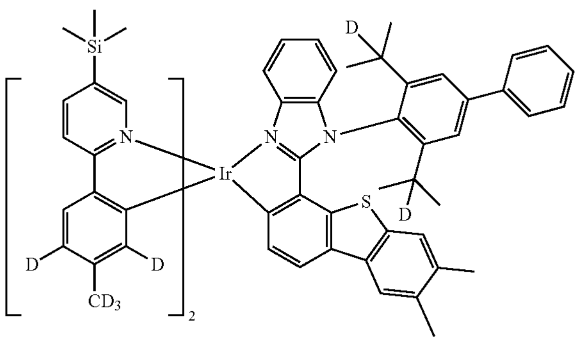
1506
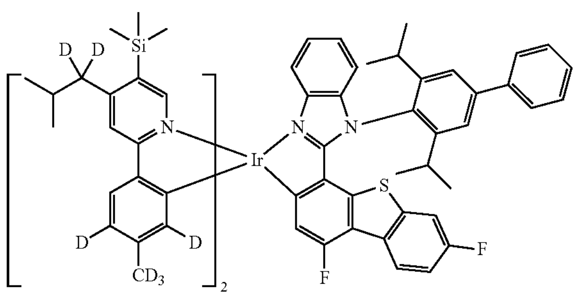
1507
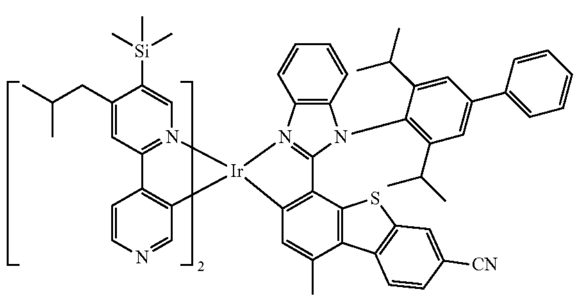
1508
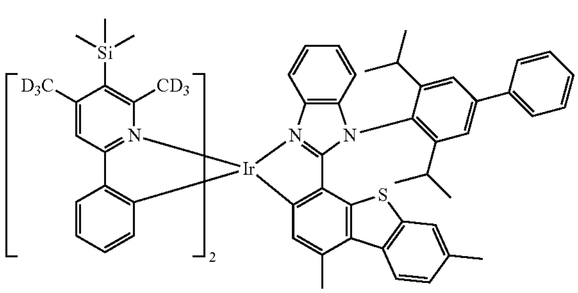
-continued
1509
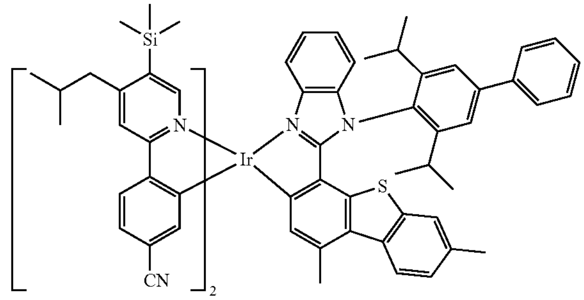
1510
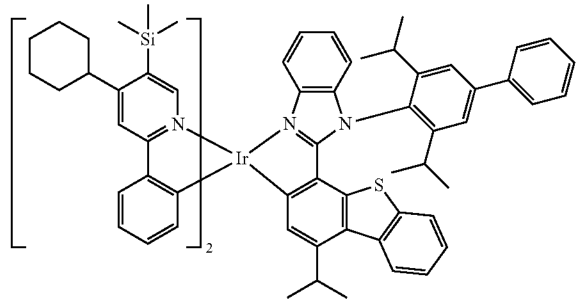
1511
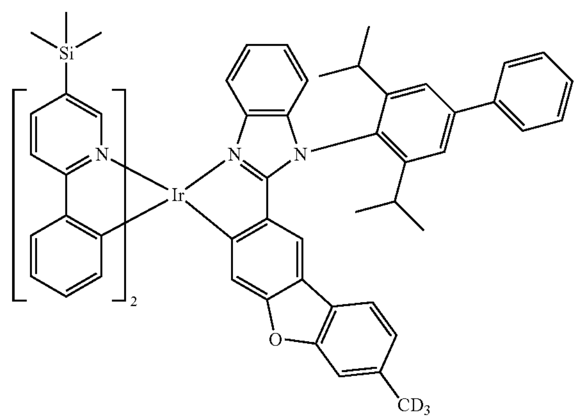
1512
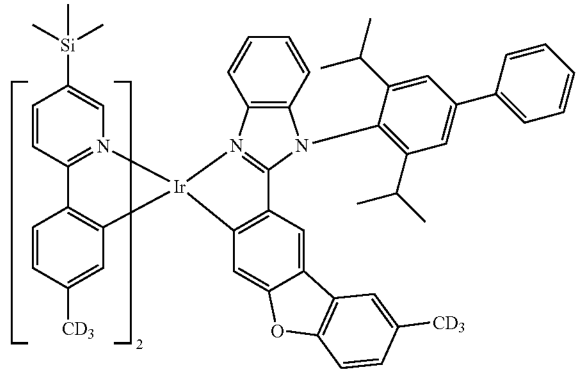

-continued
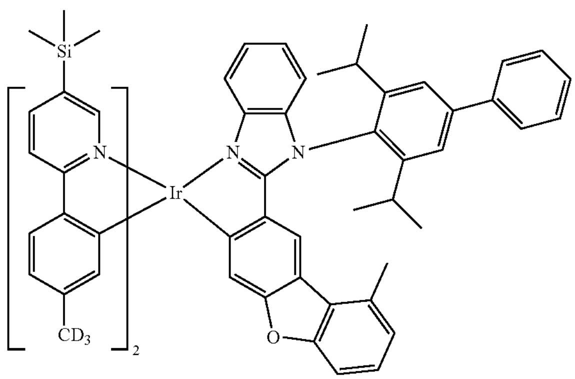
1513
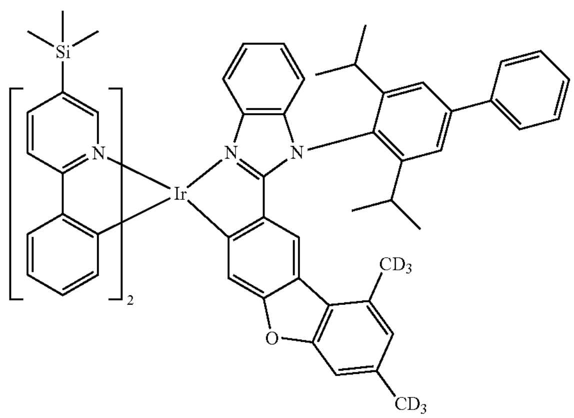
1514
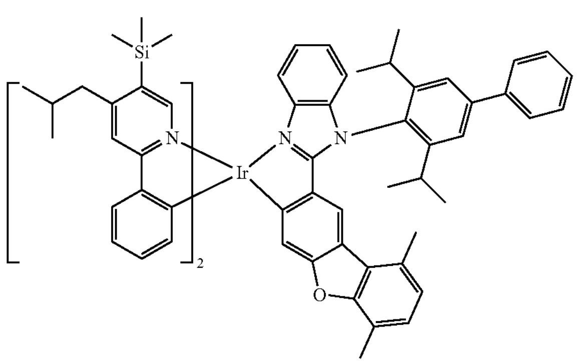
1515
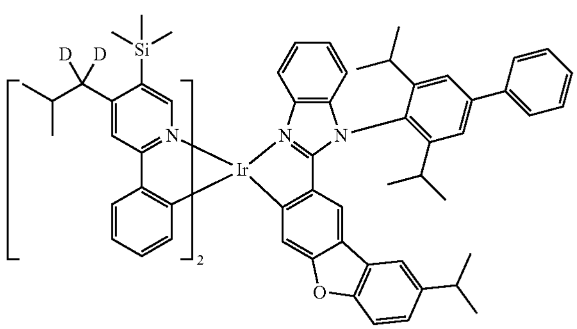
1516
-continued
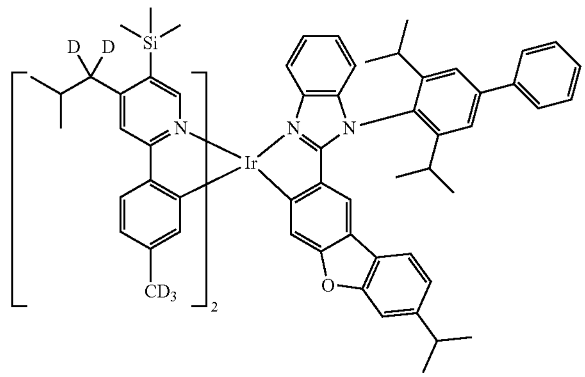
1517
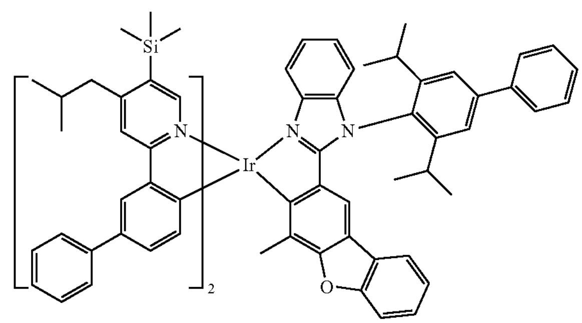
1518
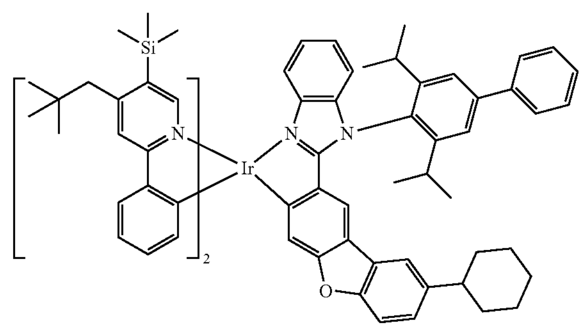
1519
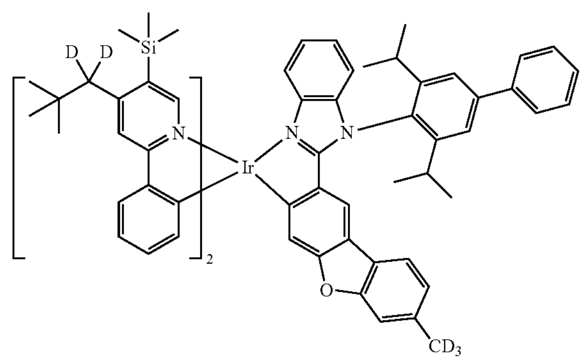
1520

-continued
1521
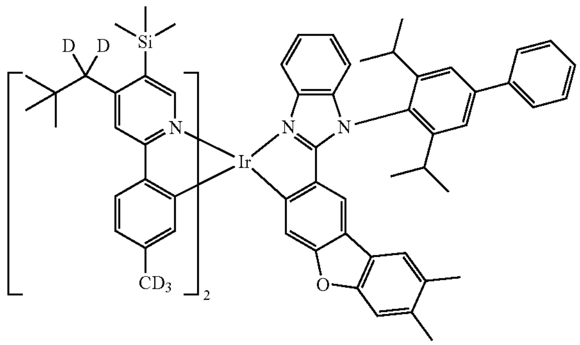
1522
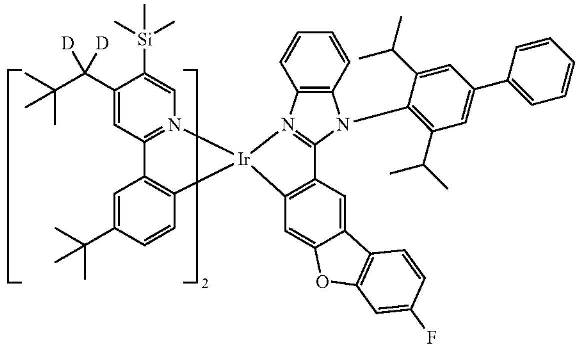
1523
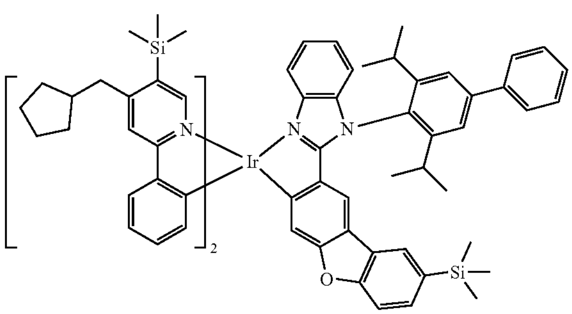
1524
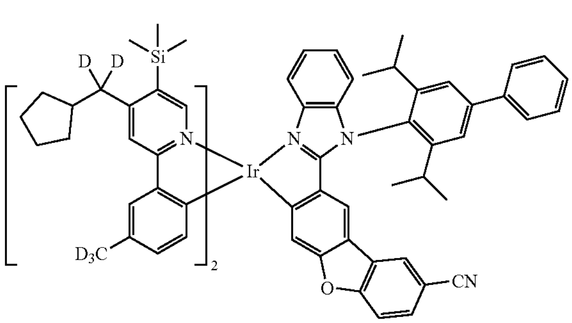
-continued
1525
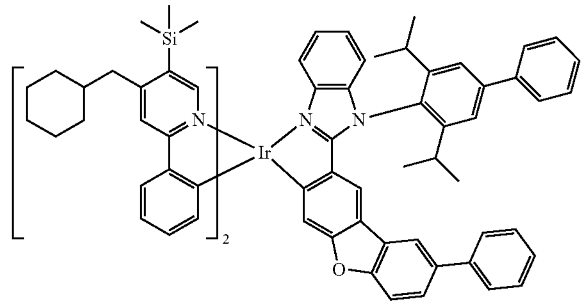
1526
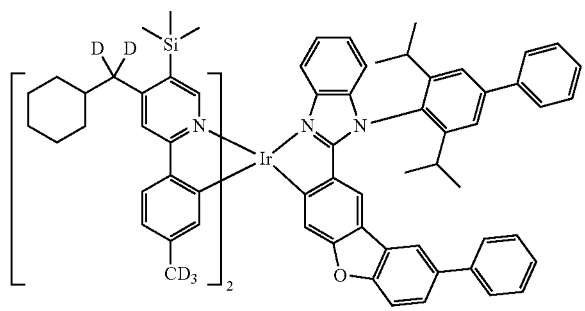
1527
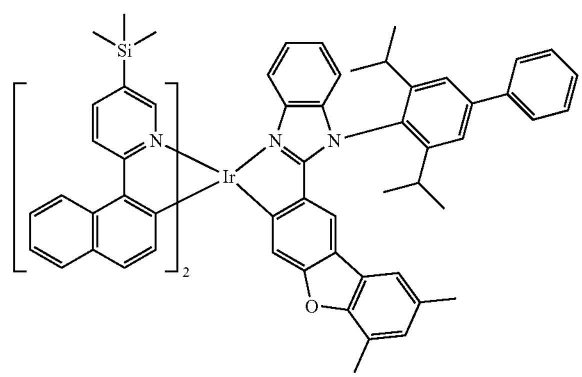
1528
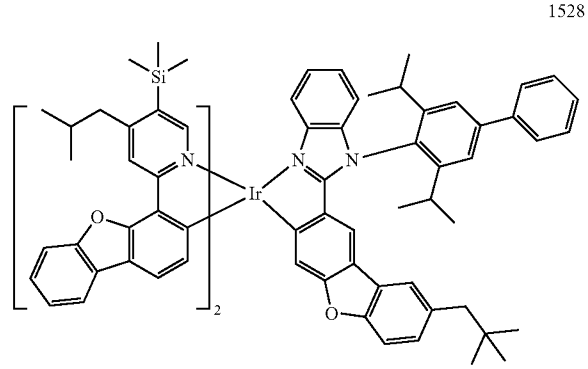

1529
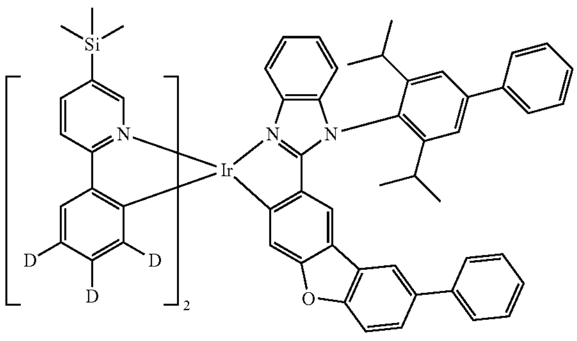
1530
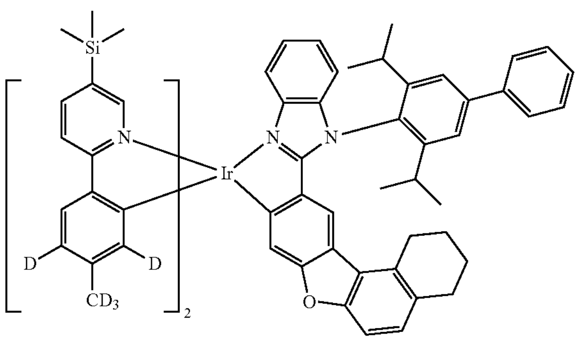
1531
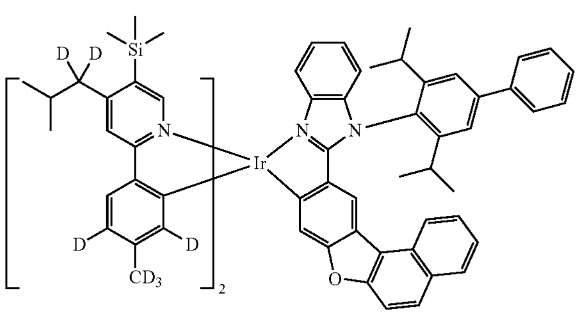
1532
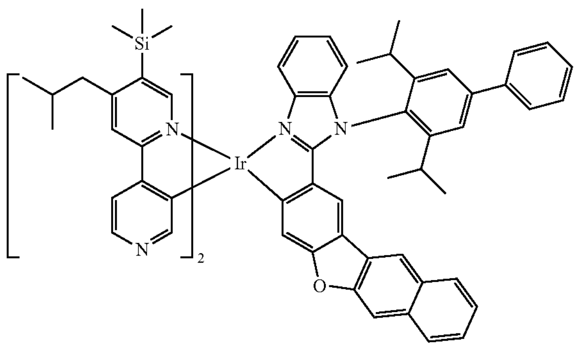
1533
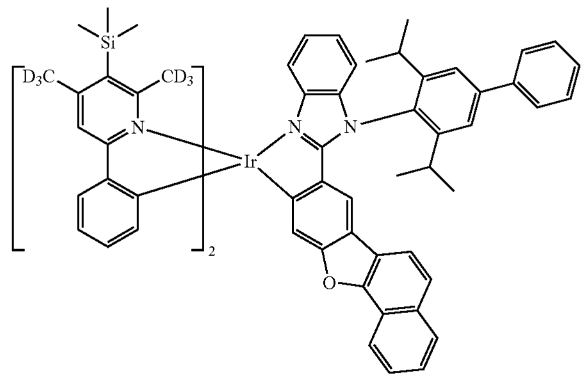
1534
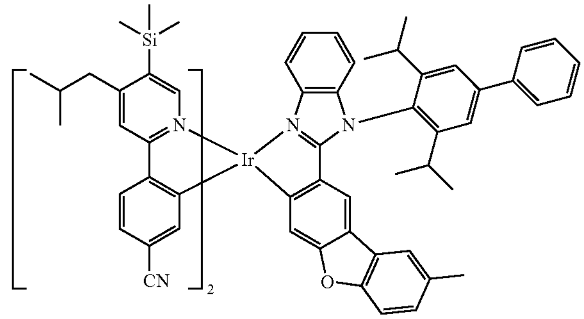
1535
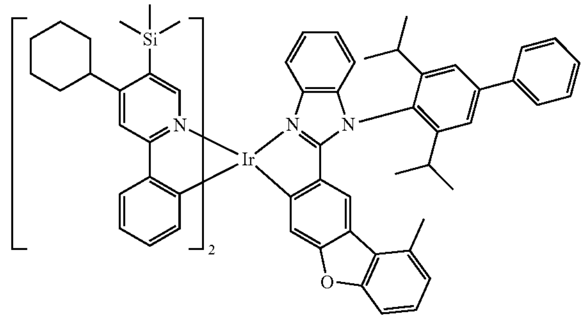
1536
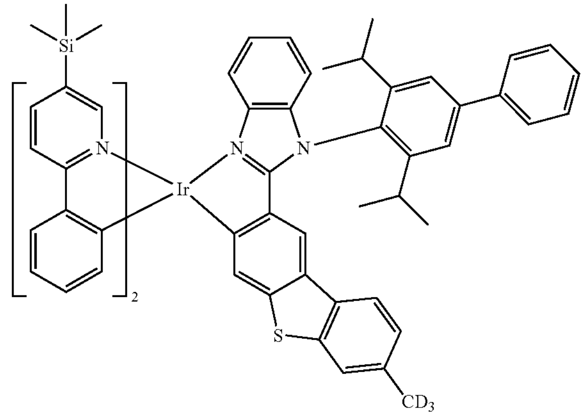

-continued
1537
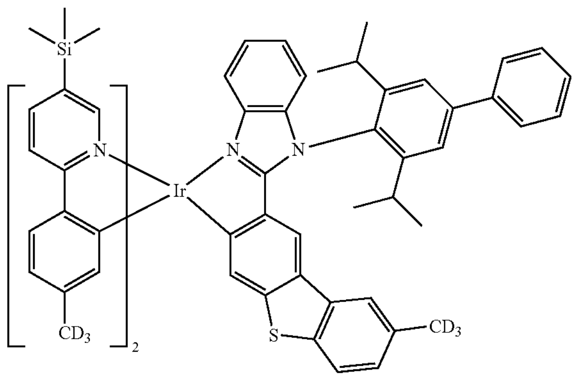
1538
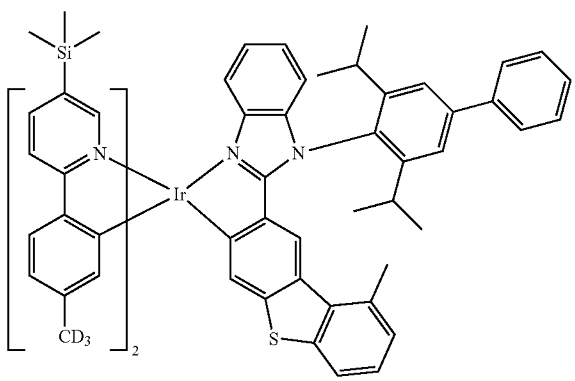
1539
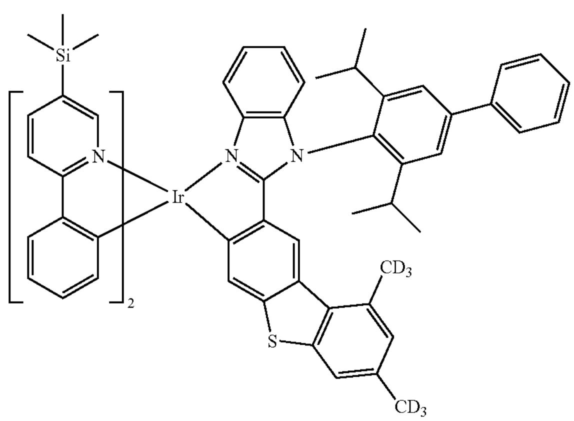
1540
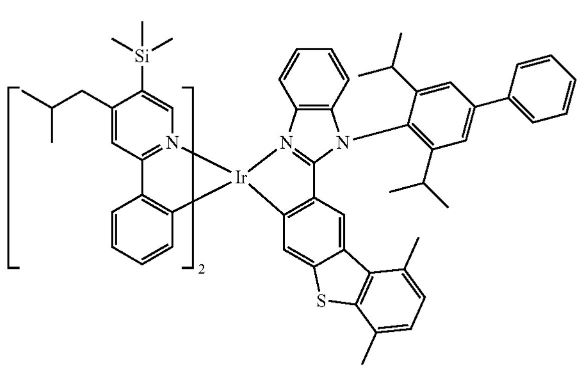
-continued
1541
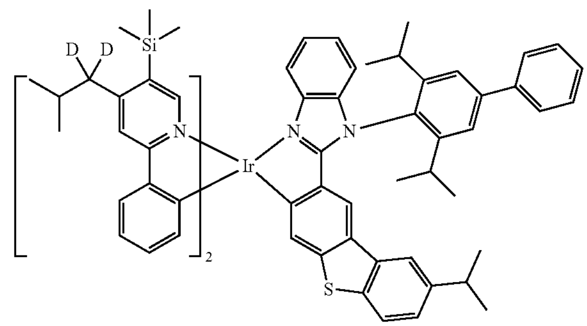
1542
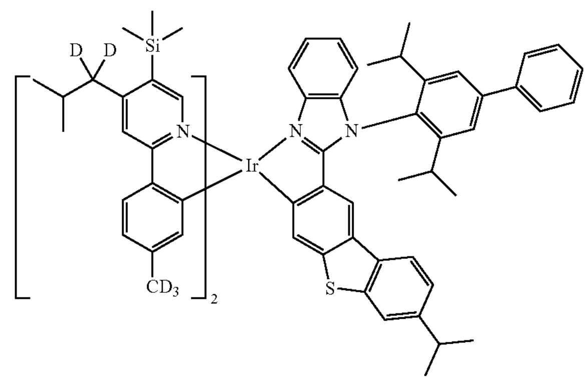
1543
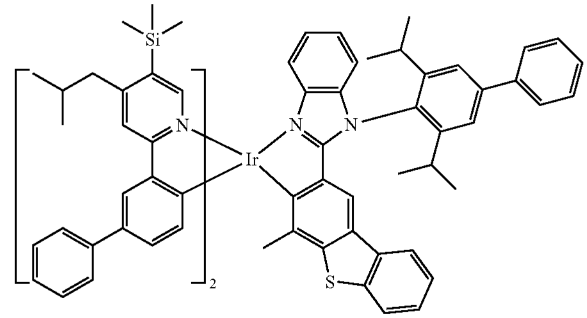
1544
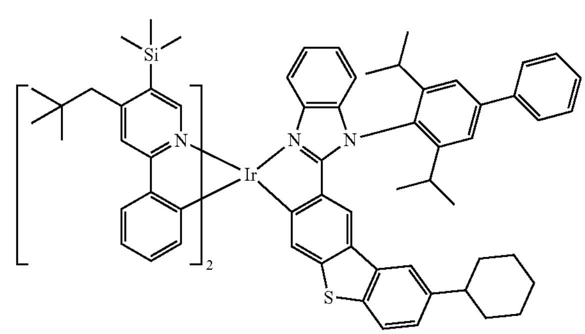

-continued
1545
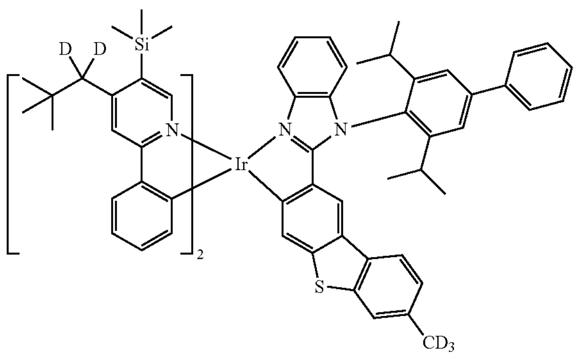
1546
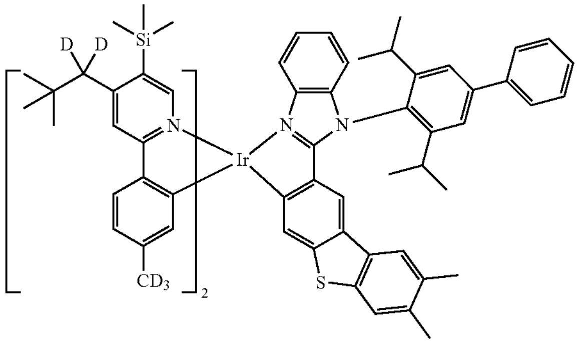
1547
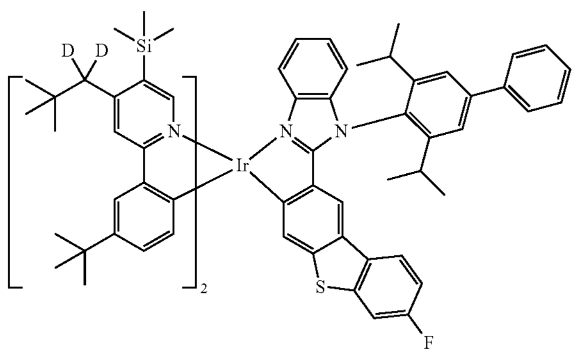
1548
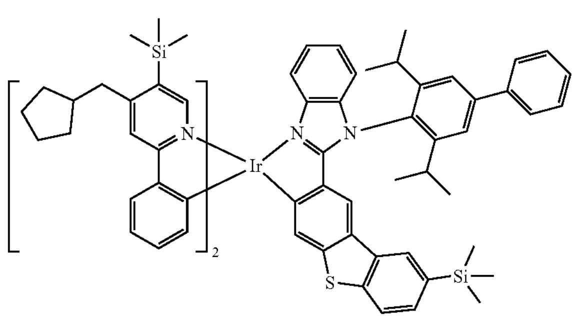
-continued
1549
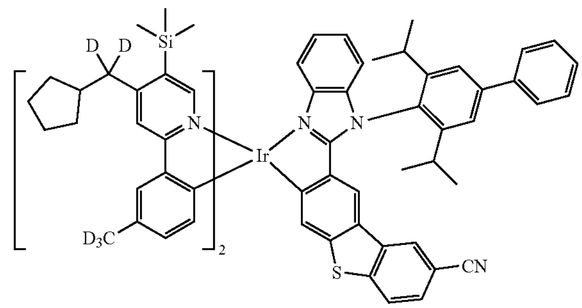
1550
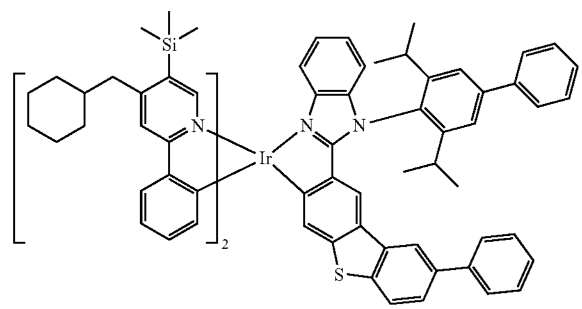
1551
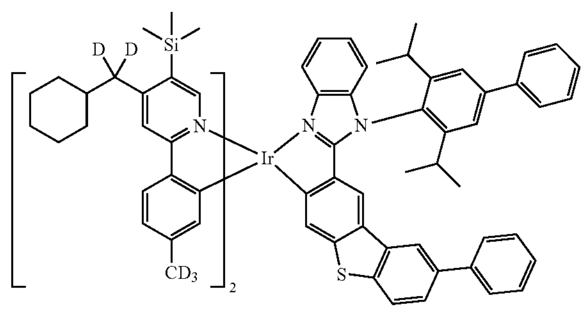
1552
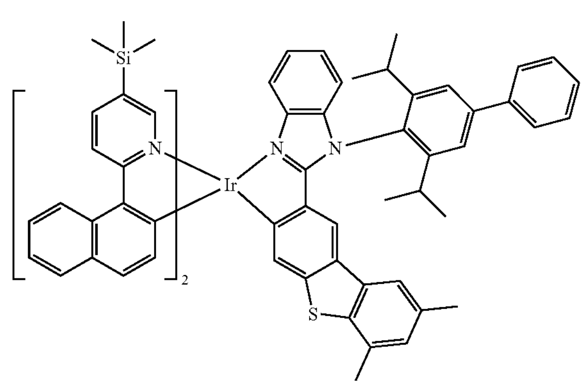

1553
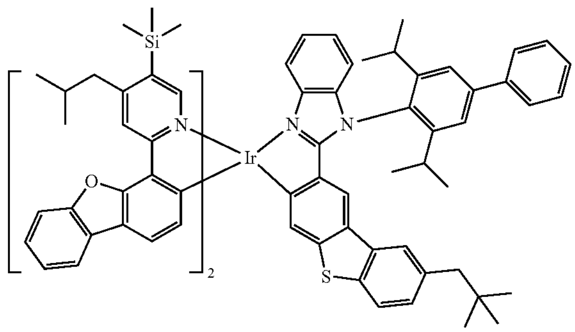
1554
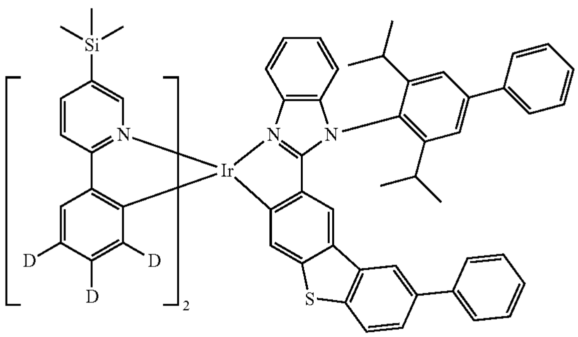
1555
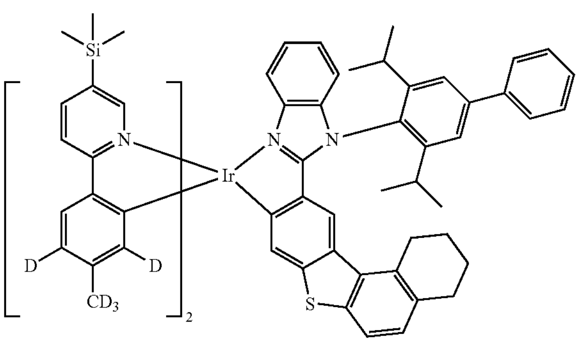
1556
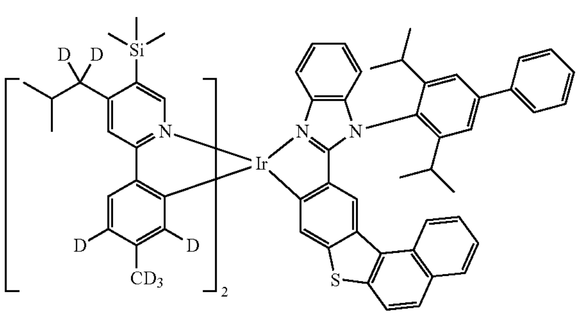
1557
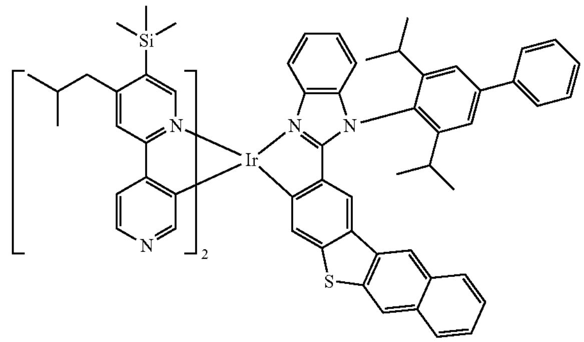
1558
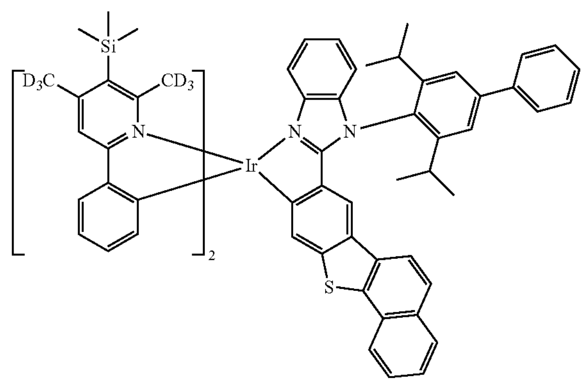
1559
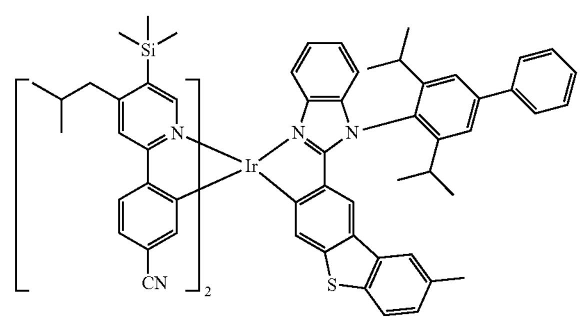
1560
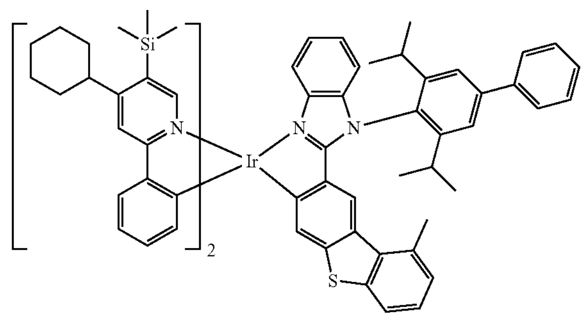

-continued
1561
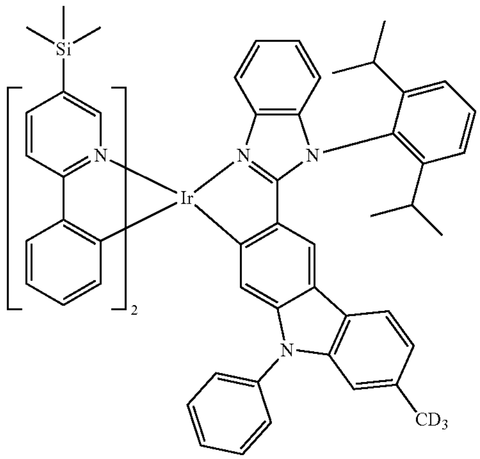
1562
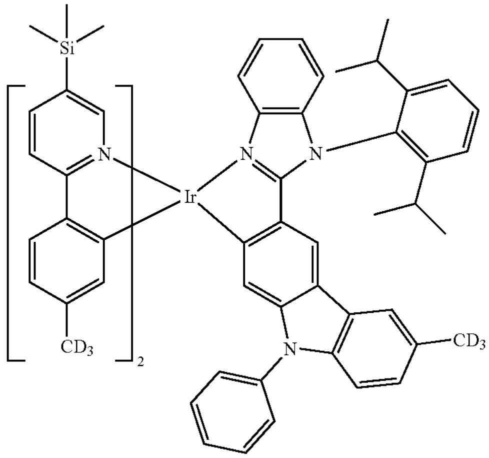
1563
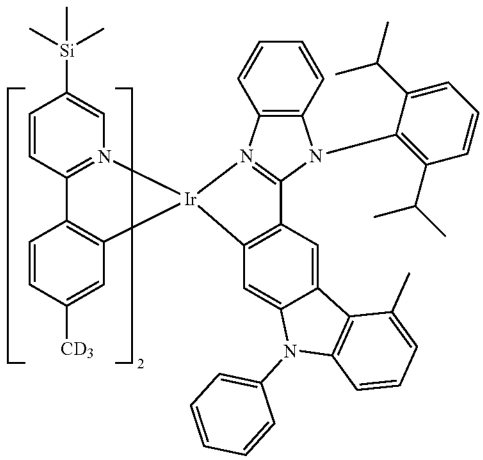
-continued
1564
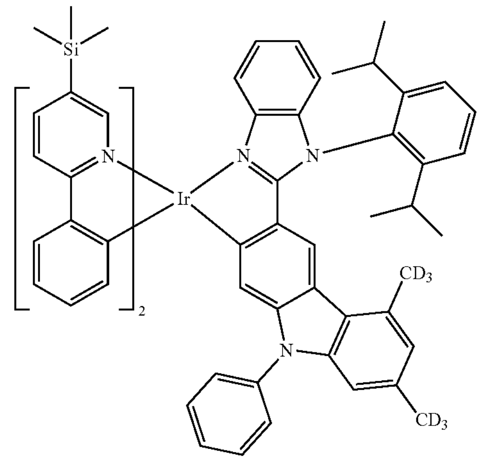
1565
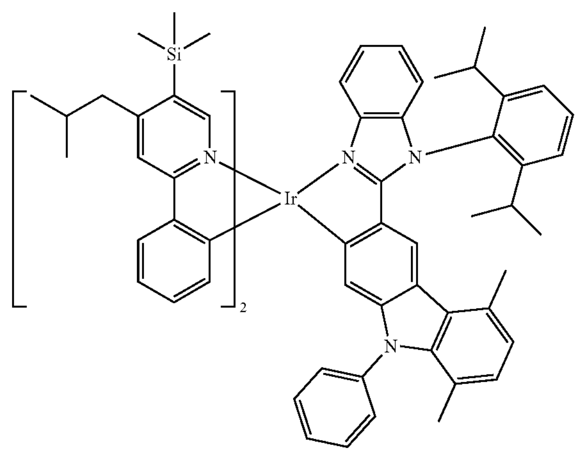
1566
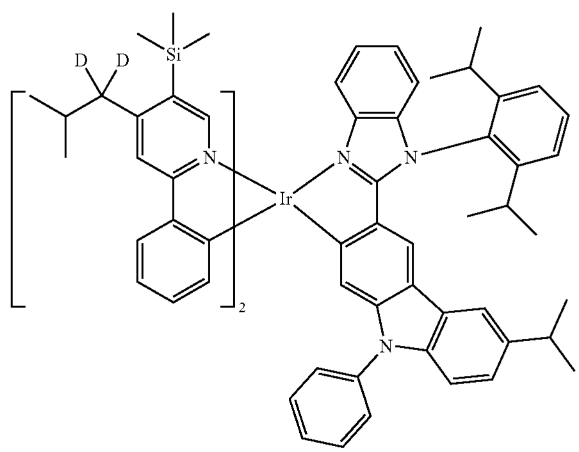

1567
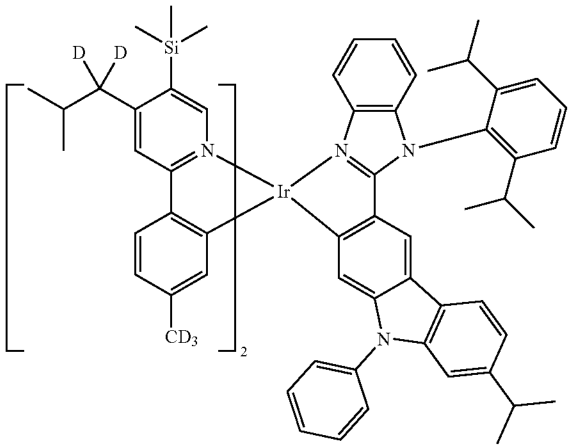
1568
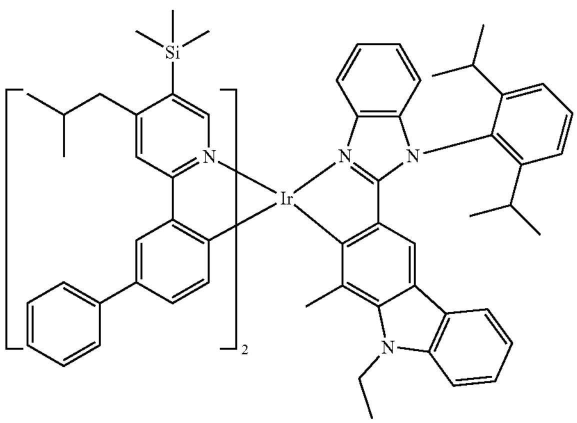
1569
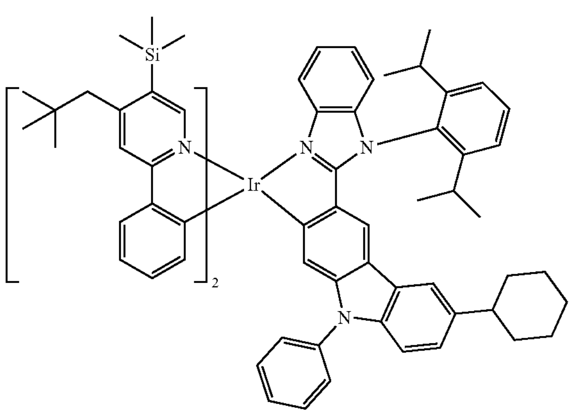
1570
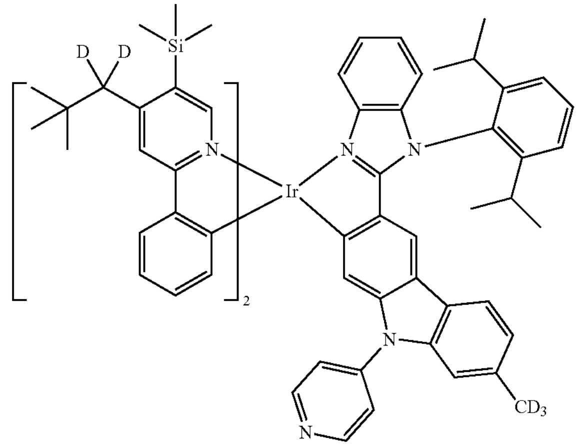
1571
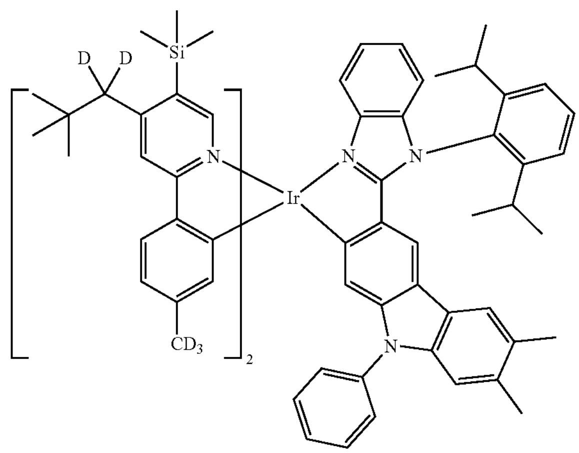
1572
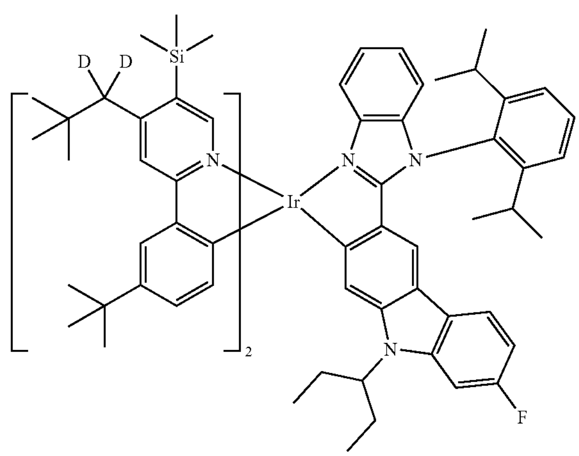

-continued
1573
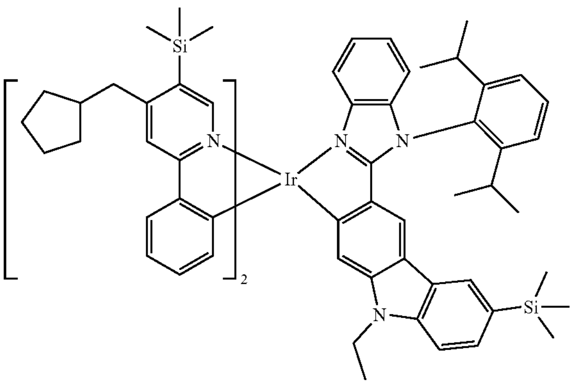
1574
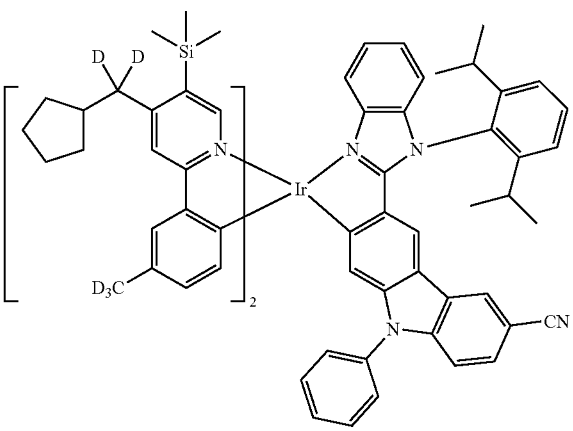
1575
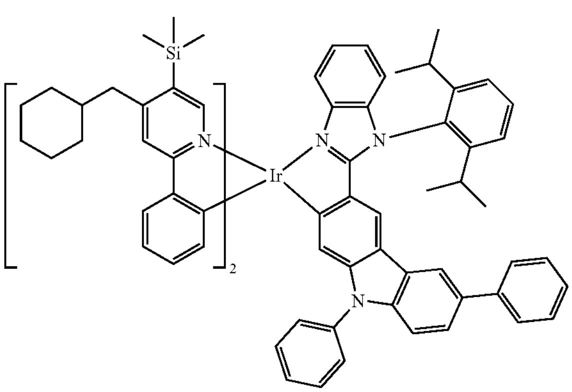
1576
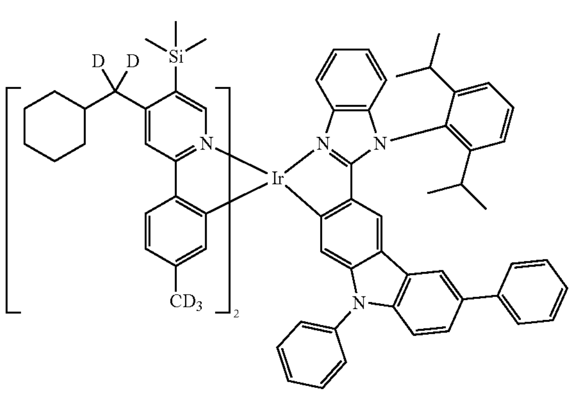
-continued
1577
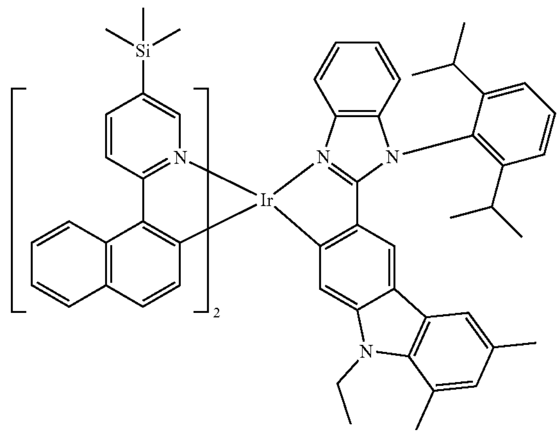
1578
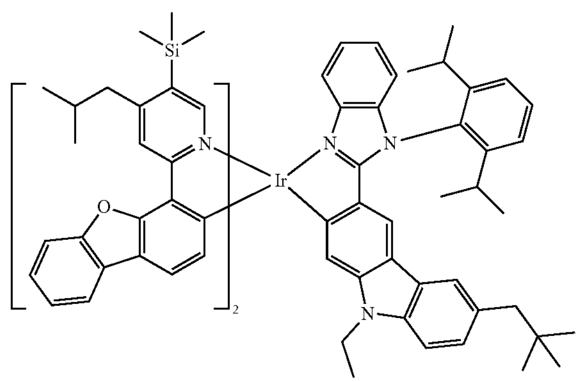
1579
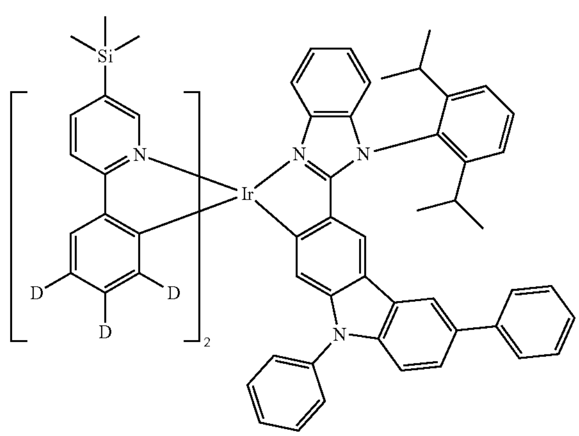

-continued
1580
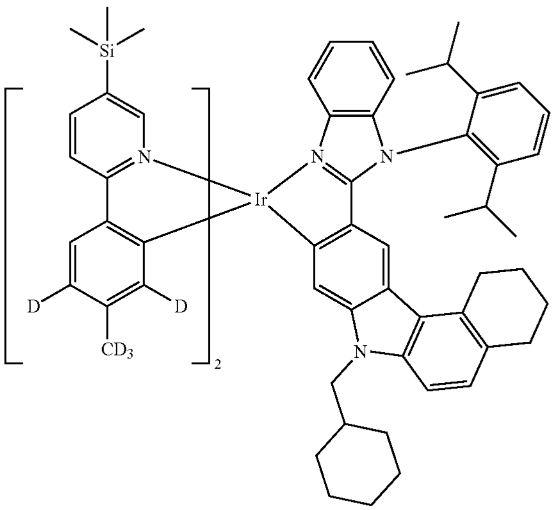
1581
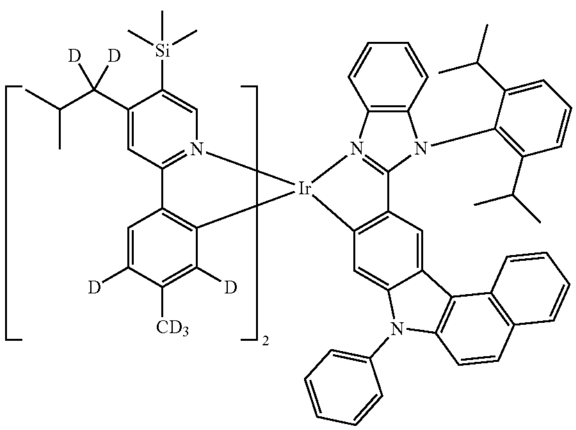
1582
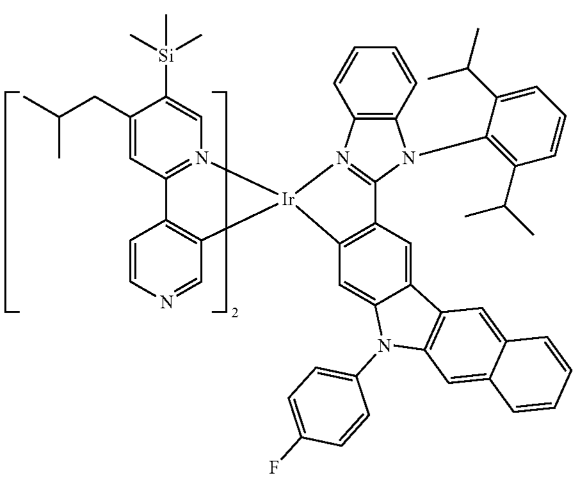
-continued
1583
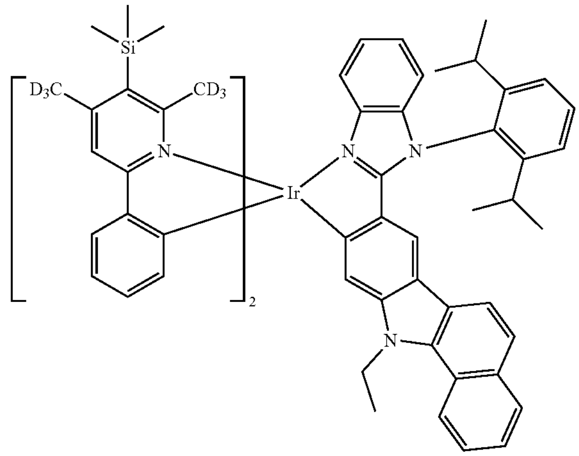
1584
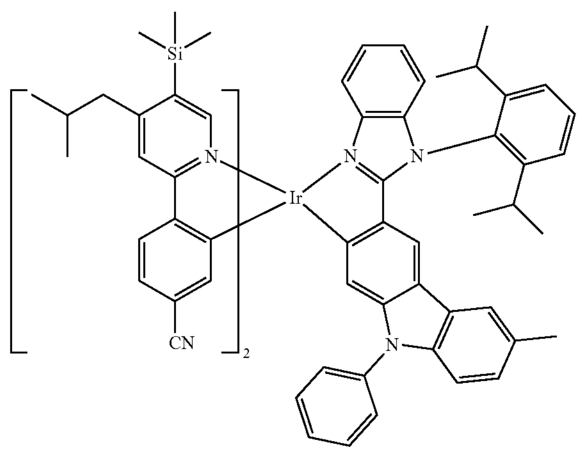
1585
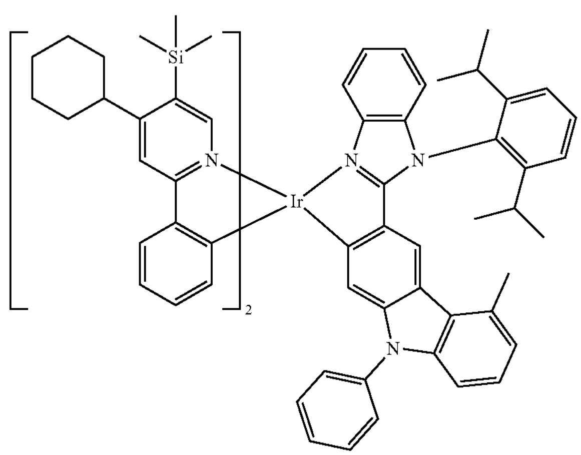

-continued
1586
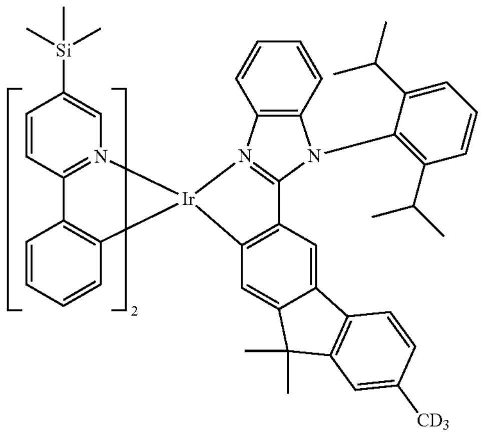
1587
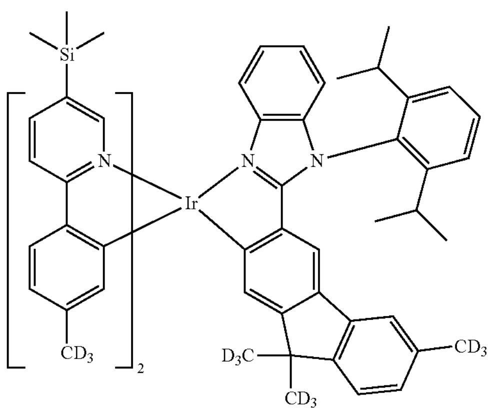
1588
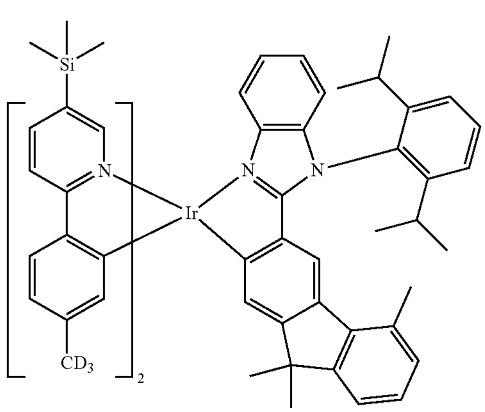
-continued
1589
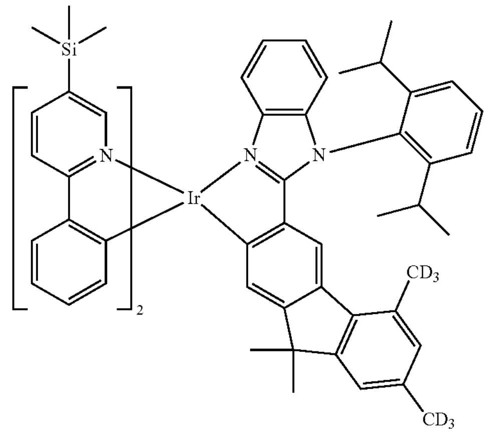
1590
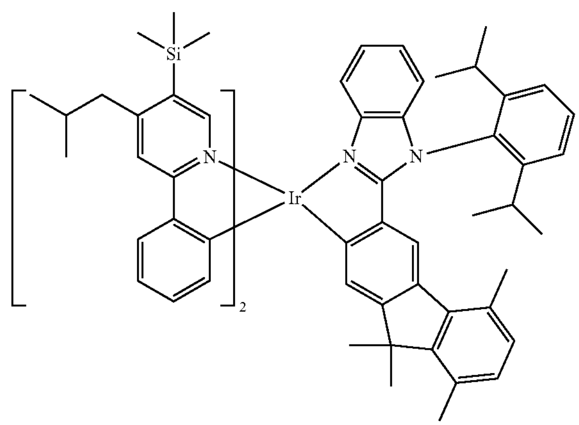
1591
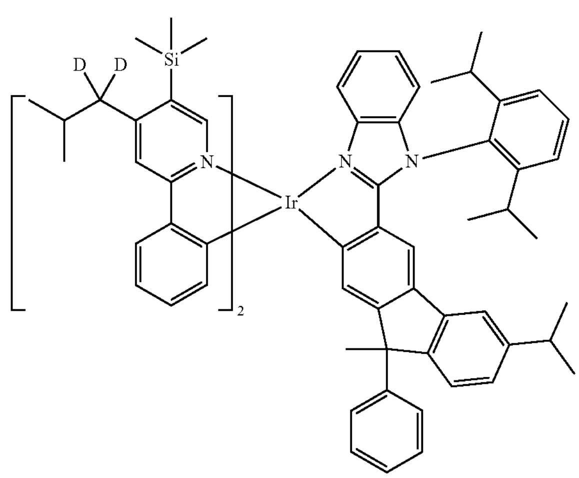

1592
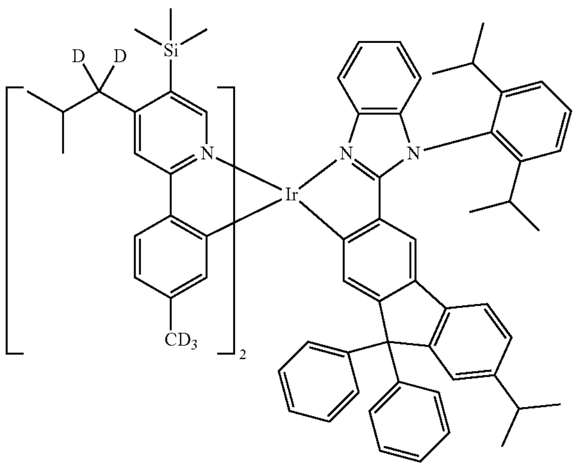
1593
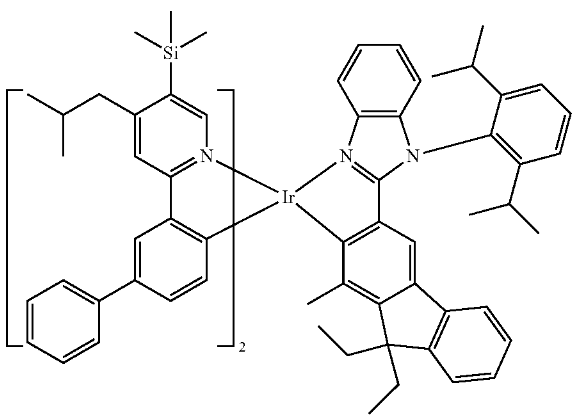
1594
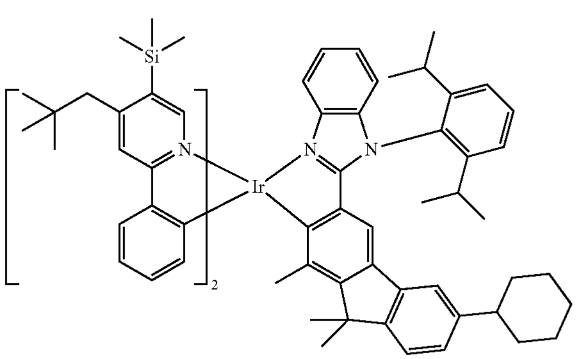
1595
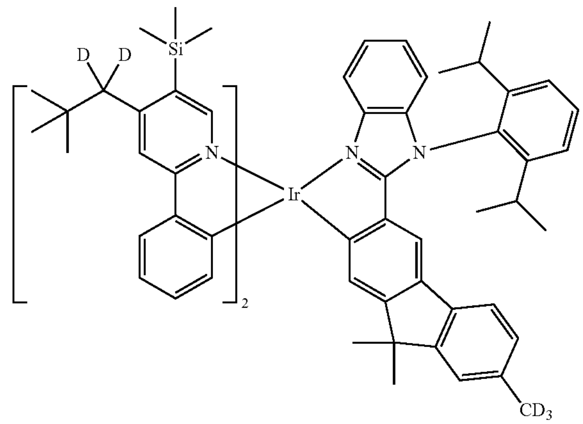
1596
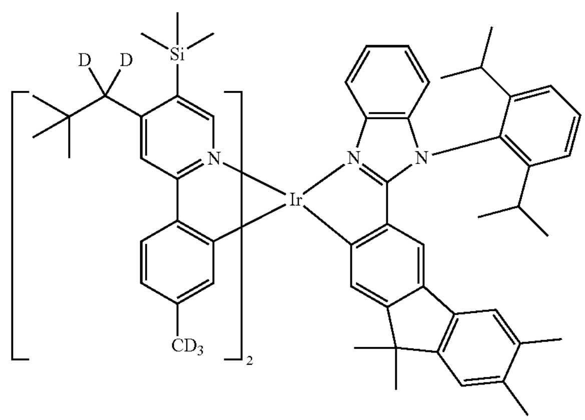
1597
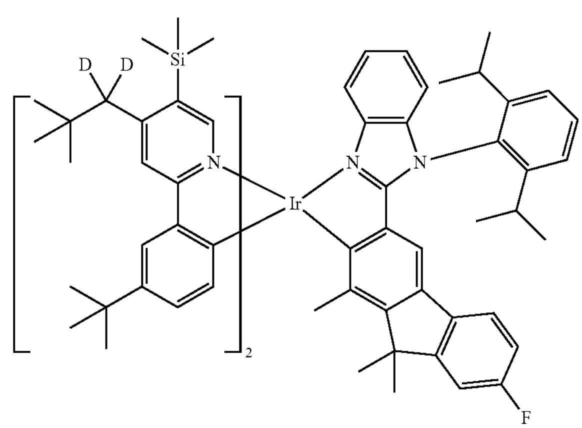

1598
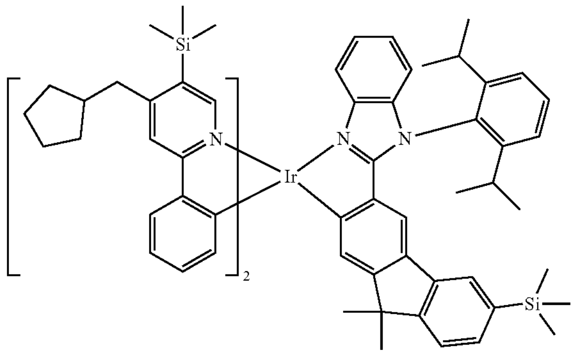
1599
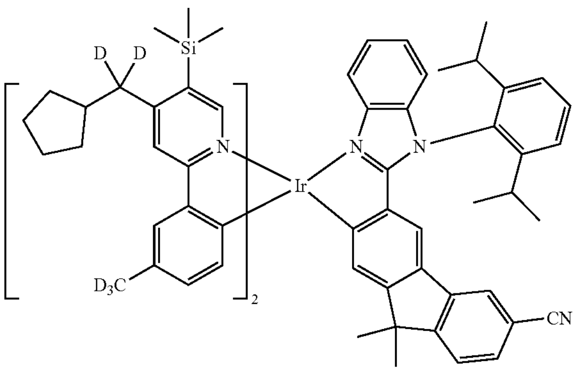
1600
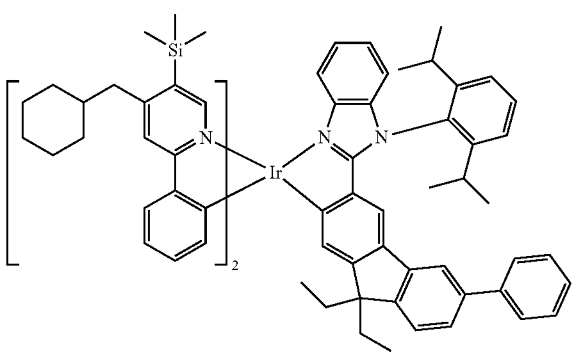
1601
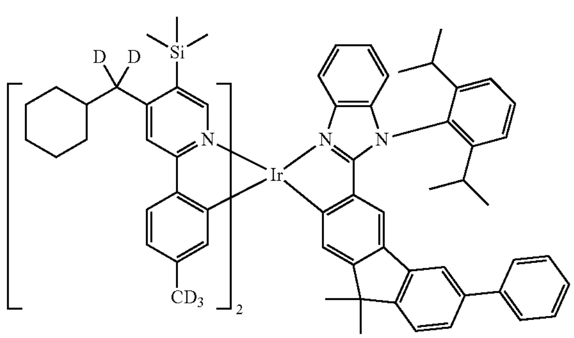
1602
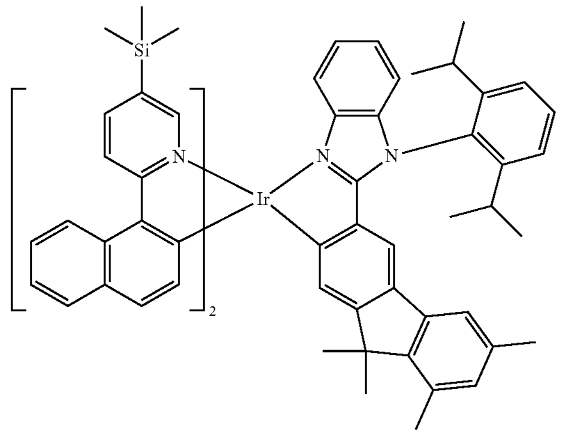
1603
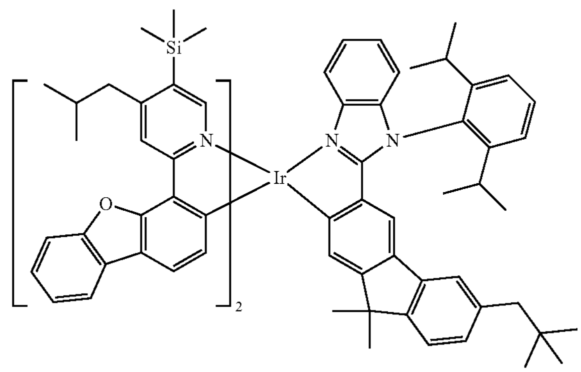
1604
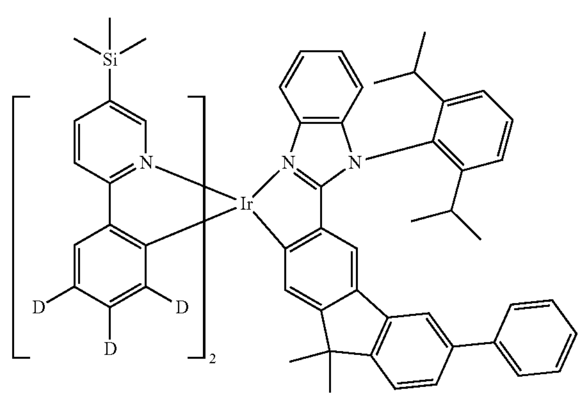

-continued
1605
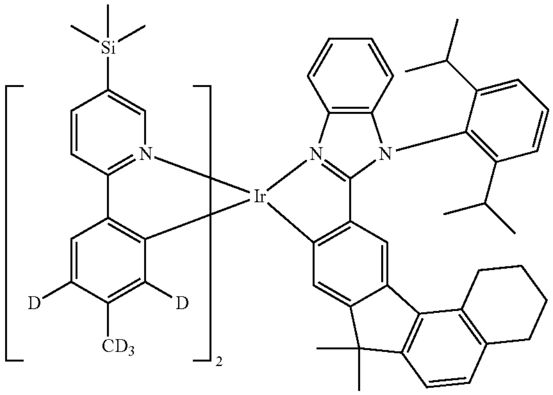
1606
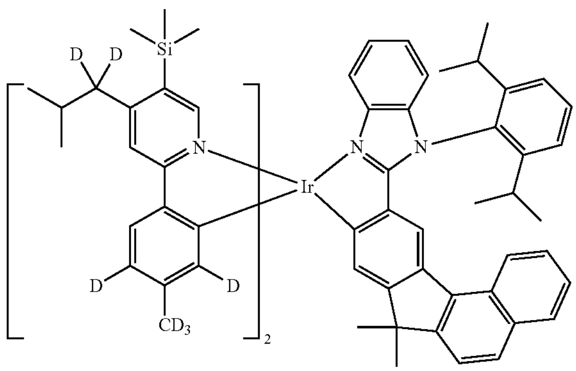
1607
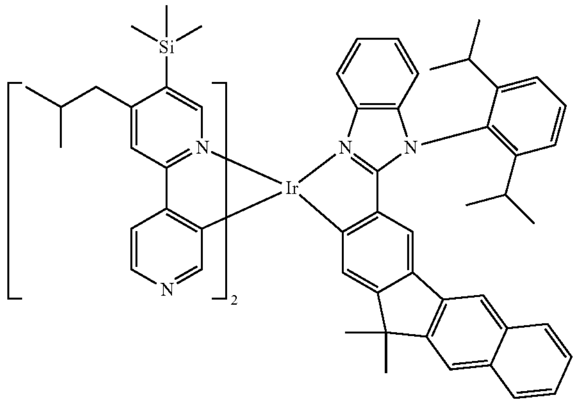
-continued
1608
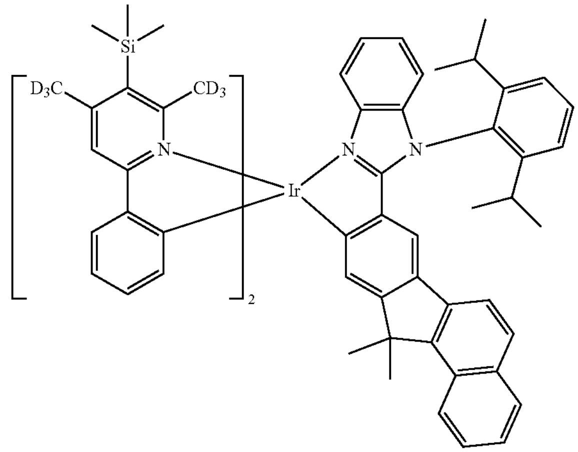
1609
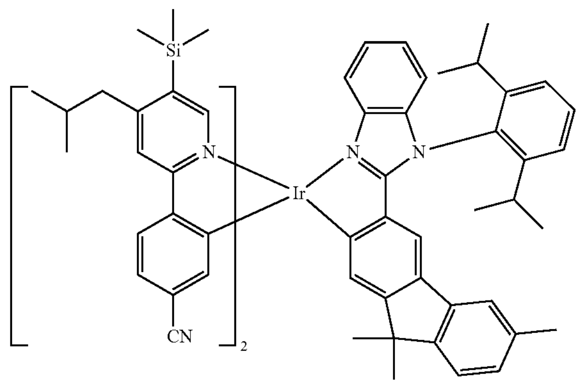
1610
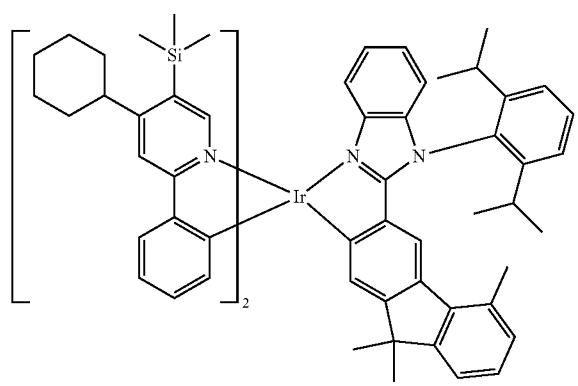
1611
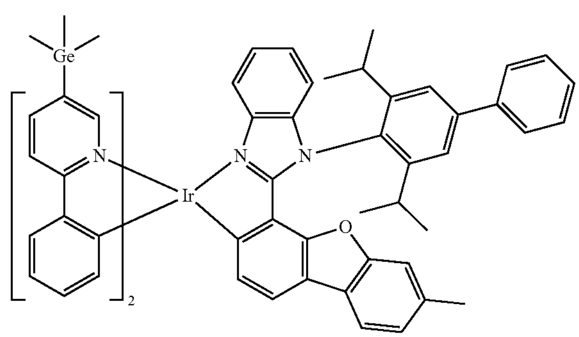

-continued
1612
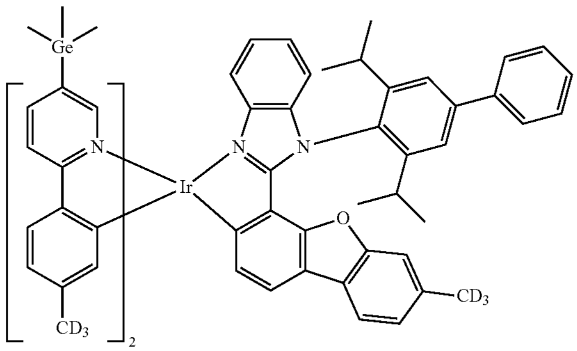
1613
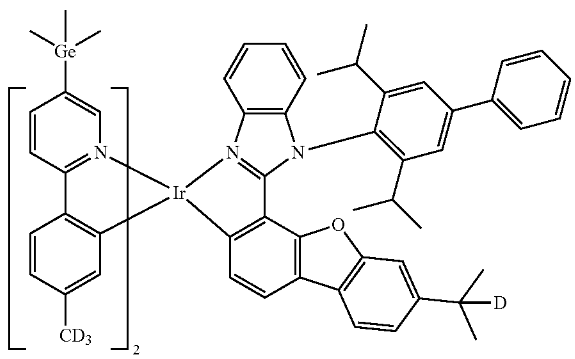
1614
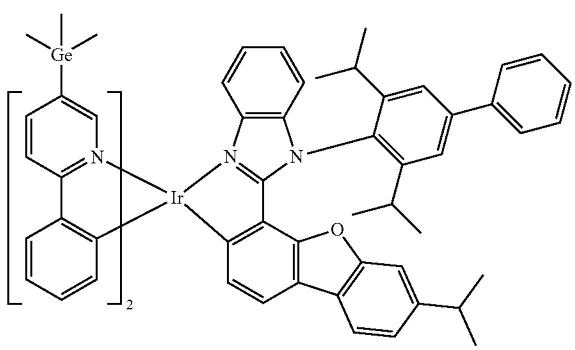
1615
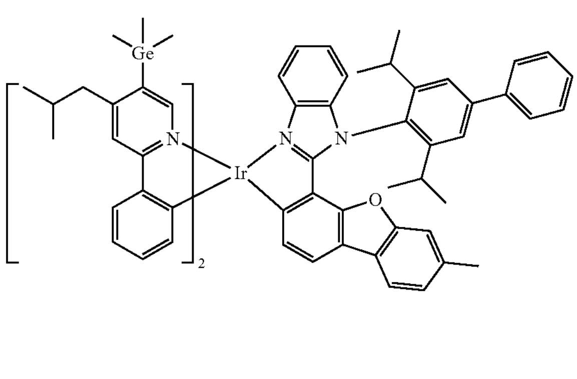
-continued
1616
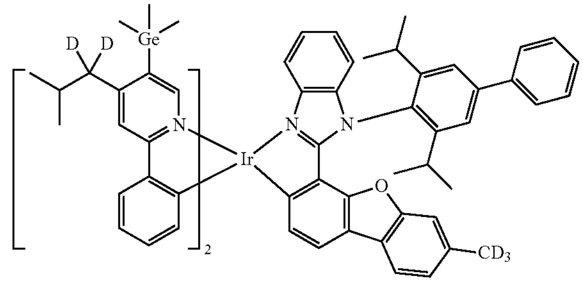
1617
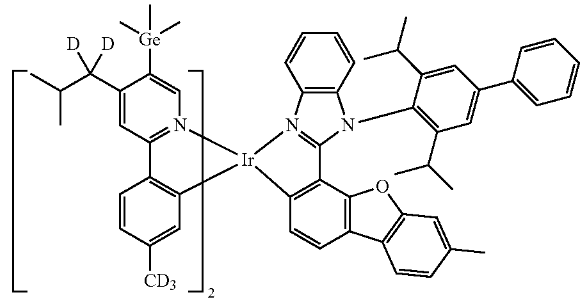
1618
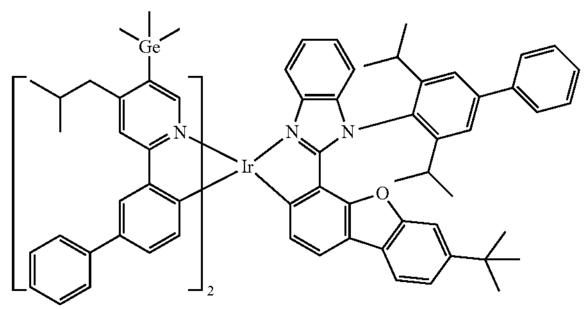
1619
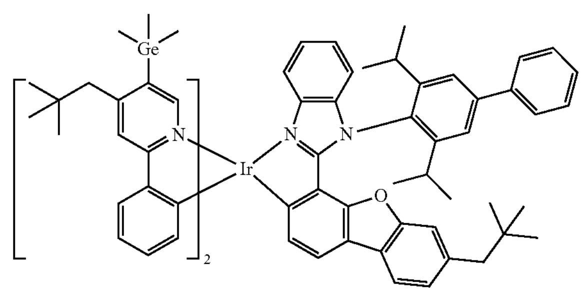
1620
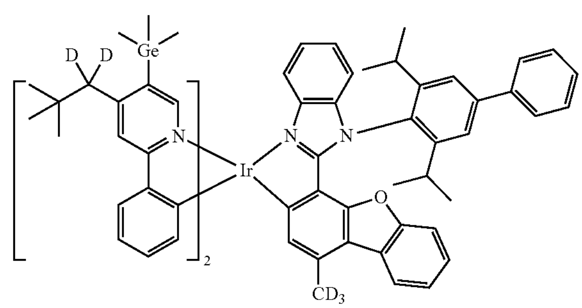

-continued
1621
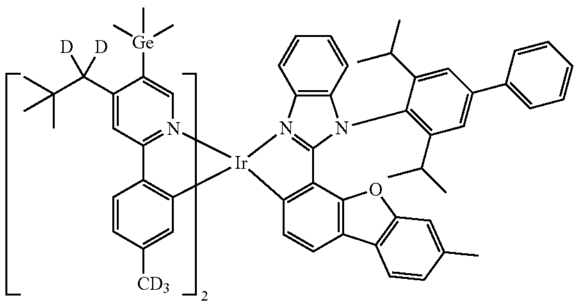
1622
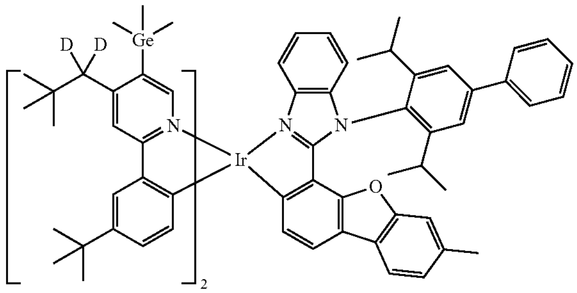
1623
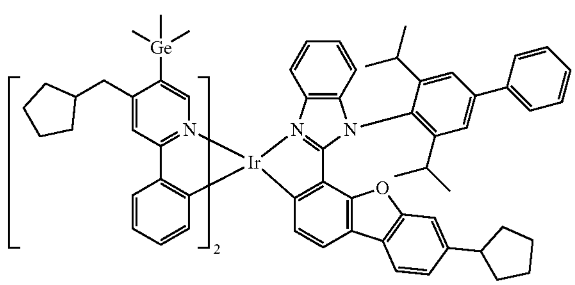
1624
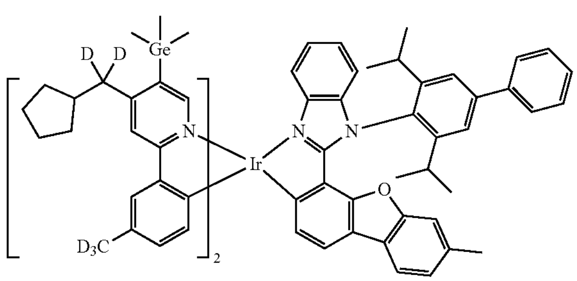
1625
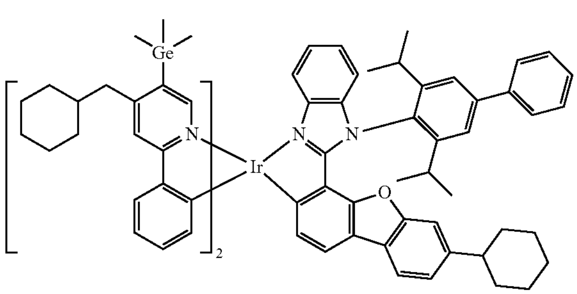
-continued
1626
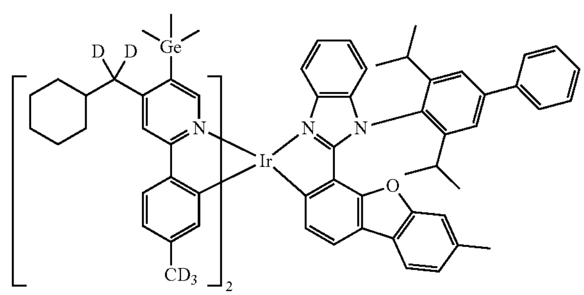
1627
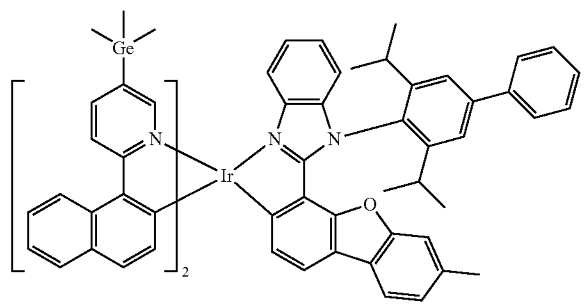
1628
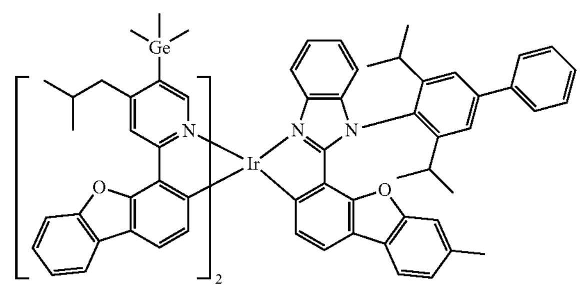
1629
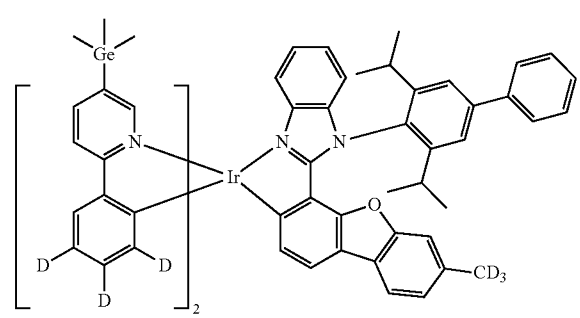
1630
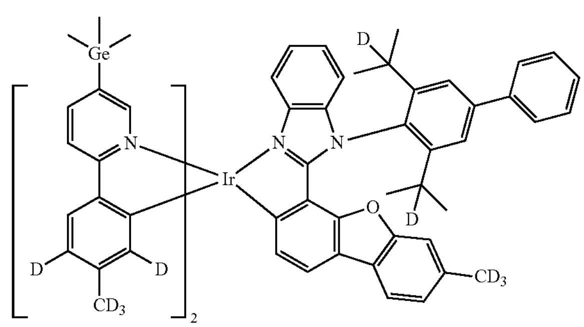

-continued
1631
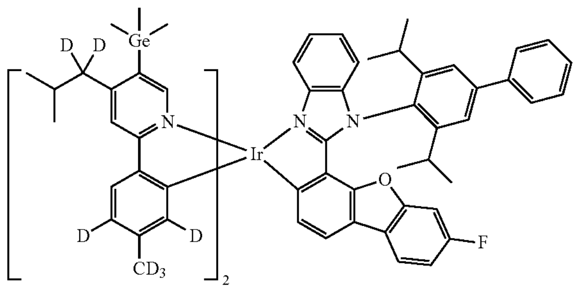
1632
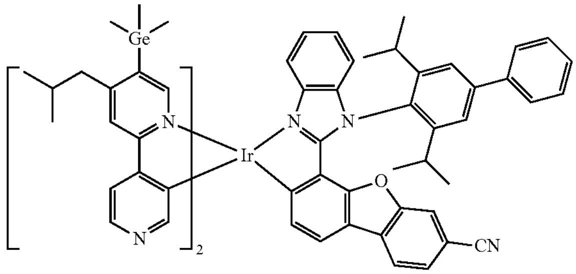
1633
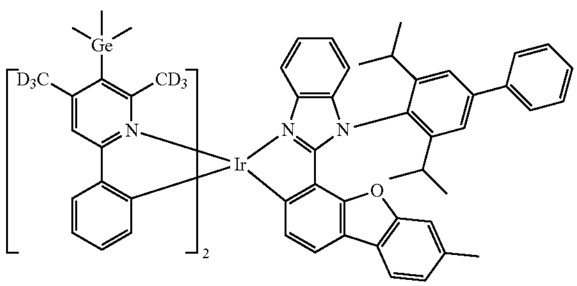
1634
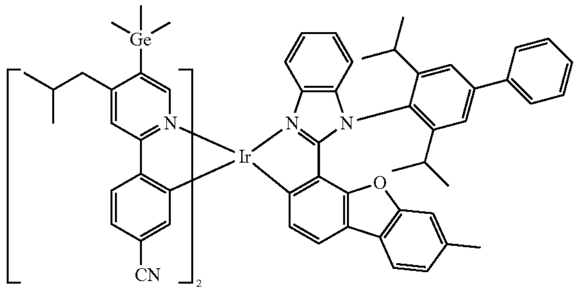
1635
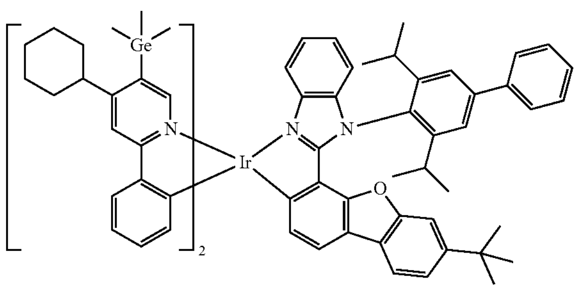
-continued
1636
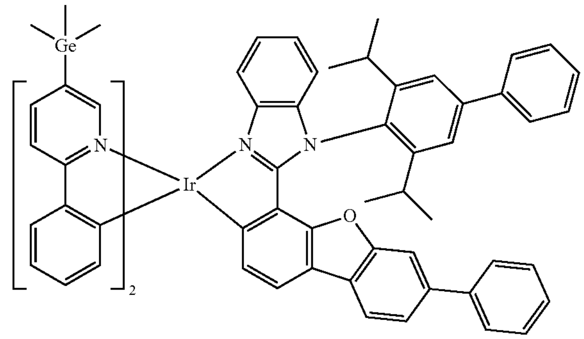
1637
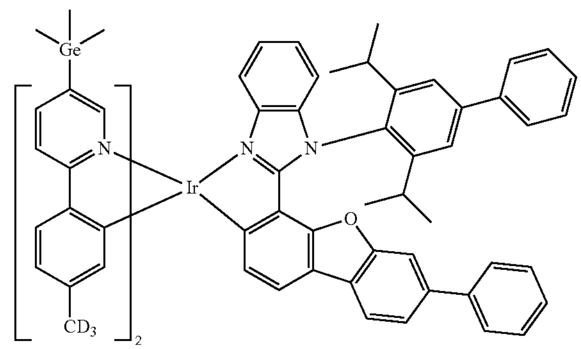
1638
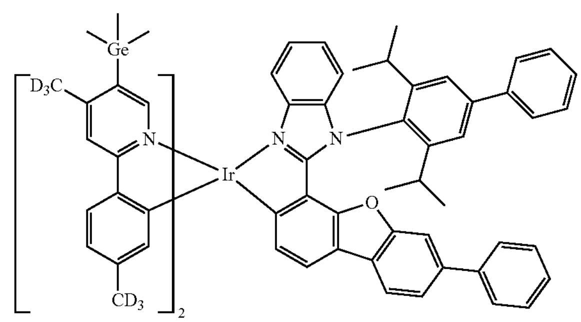
1639
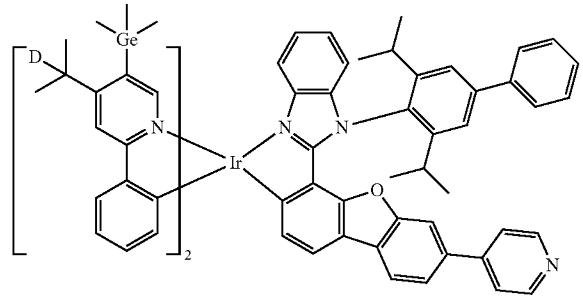

-continued
1640
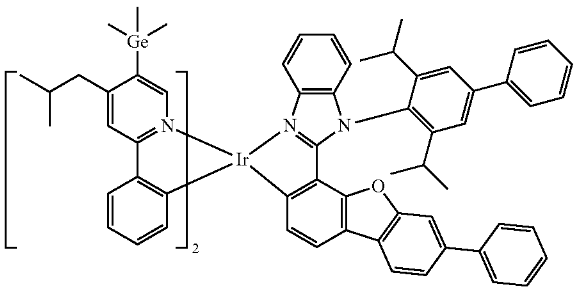
1641
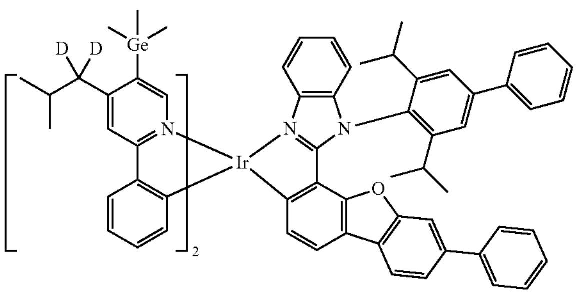
1642
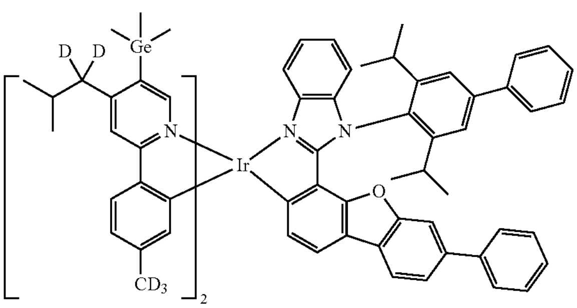
1643
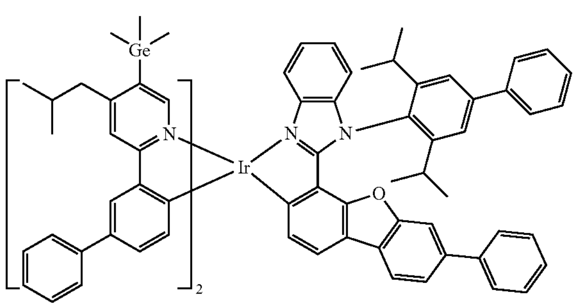
1644
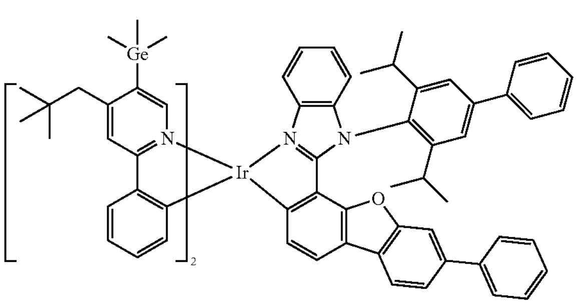
-continued
1645
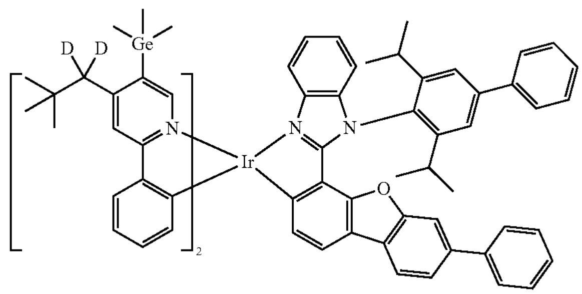
1646
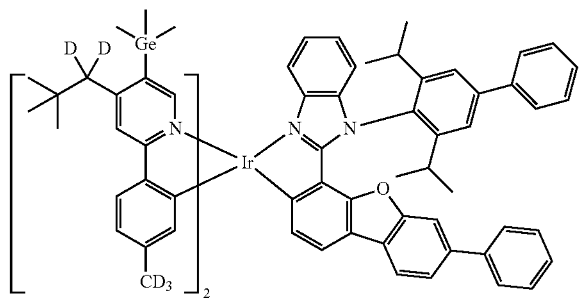
1647
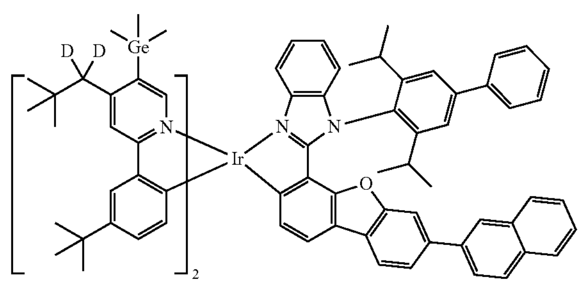
1648
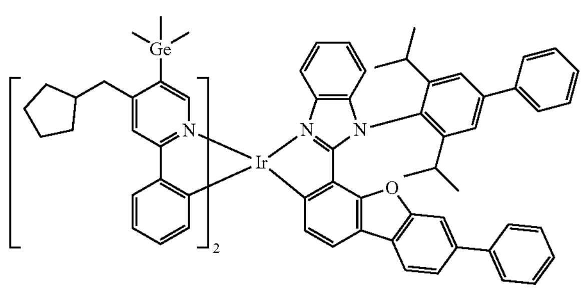
1649
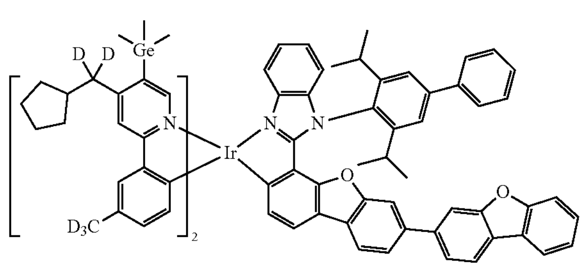

-continued
1650
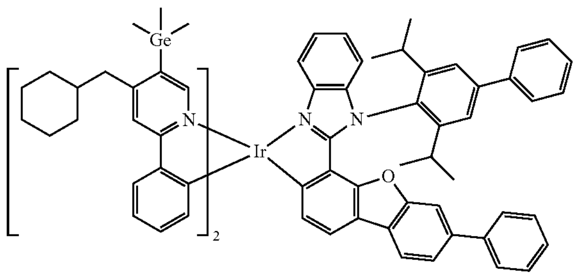
1651
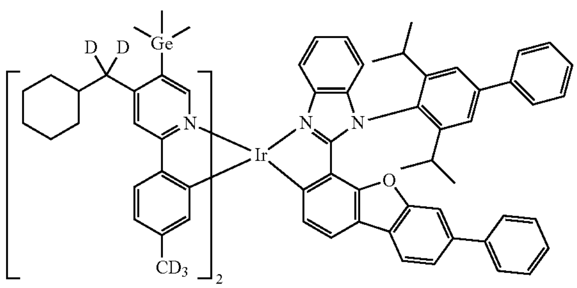
1652
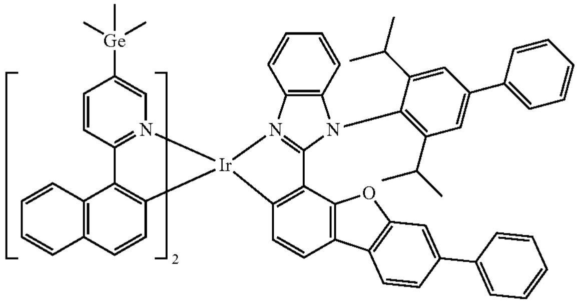
1653
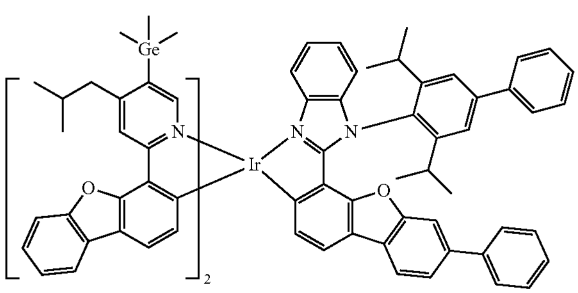
1654
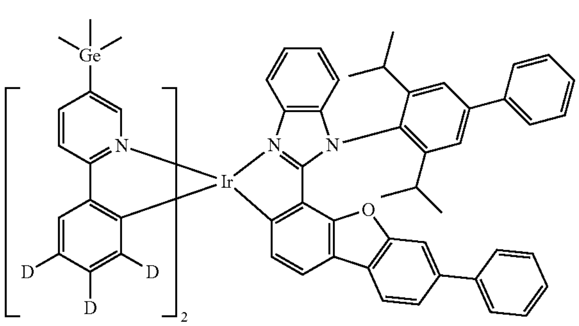
-continued
1655
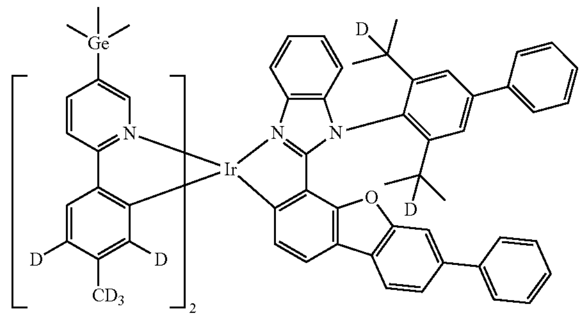
1656
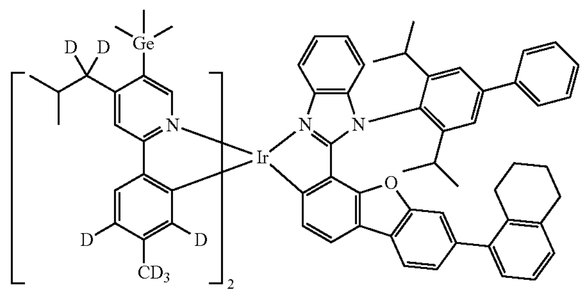
1657
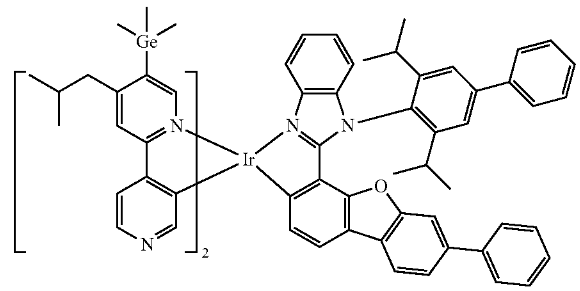
1658
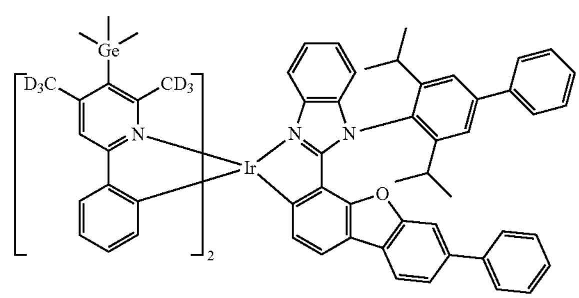
1659
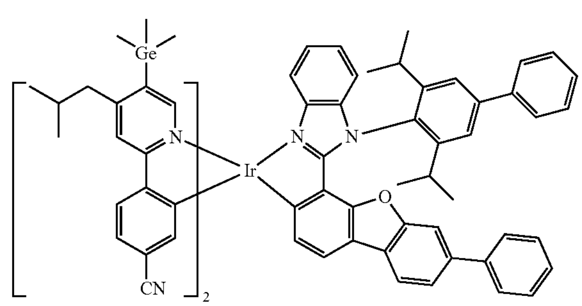

-continued
1660
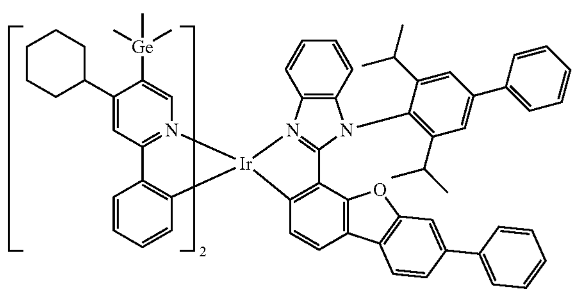
1661
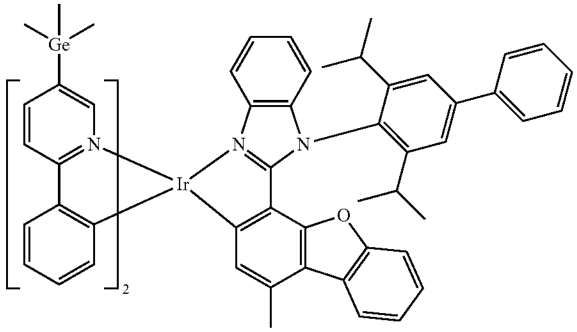
1662
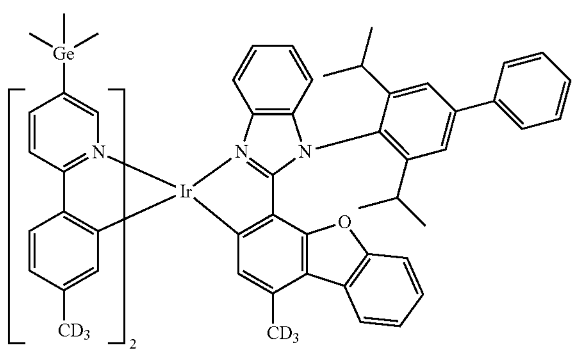
1663
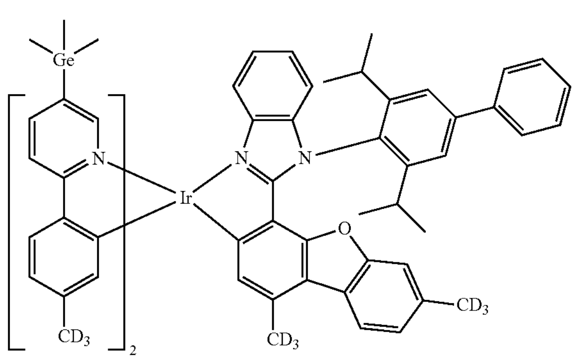
-continued
1664
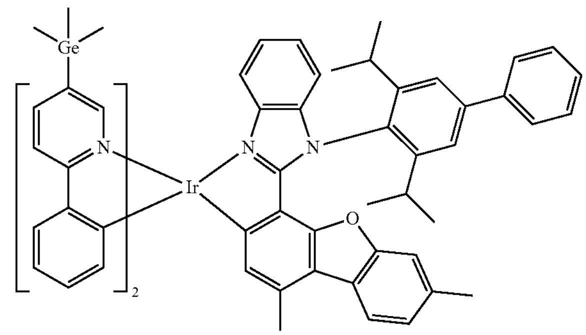
1665
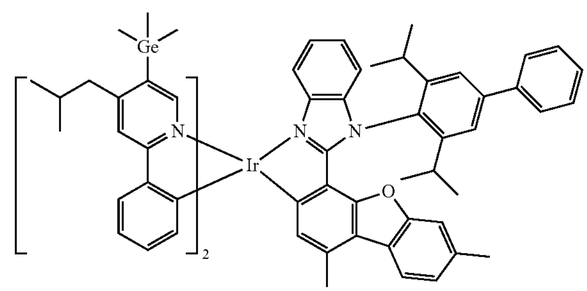
1666
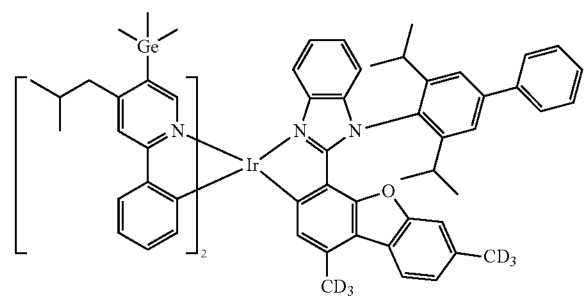
1667
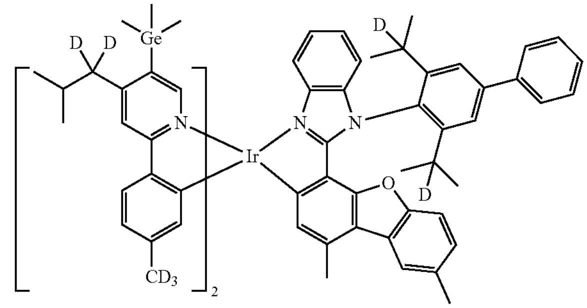
1668
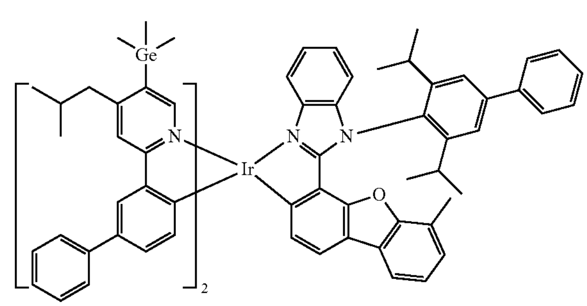

-continued
1669
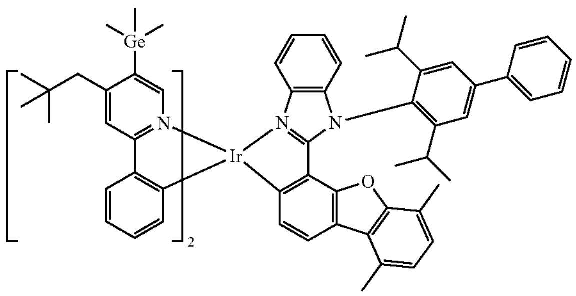
1670
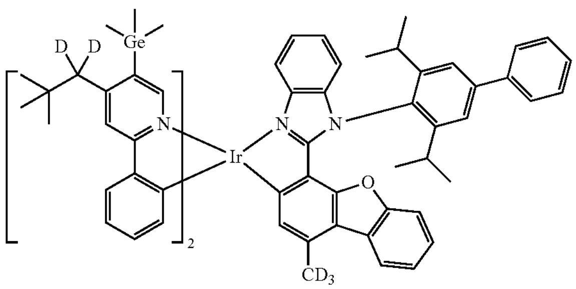
1671
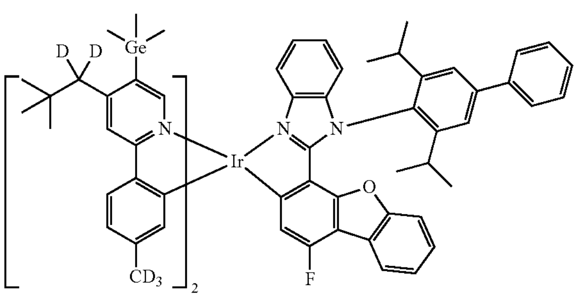
1672
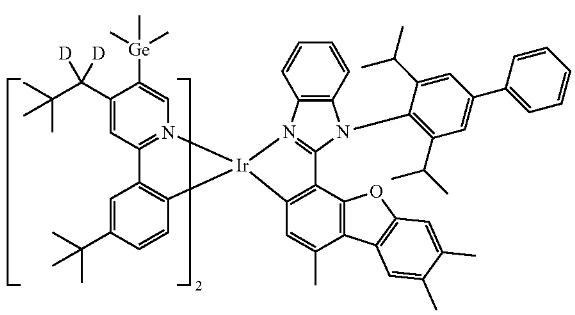
1673
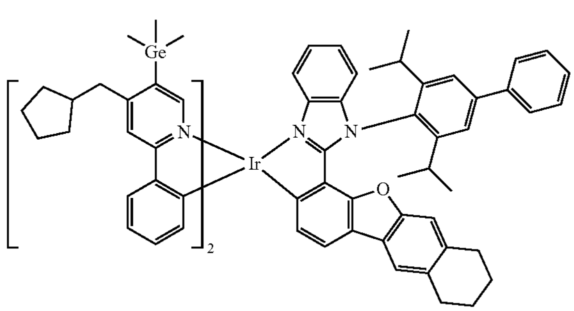
-continued
1674
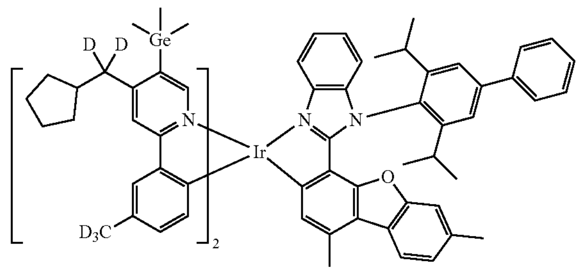
1675
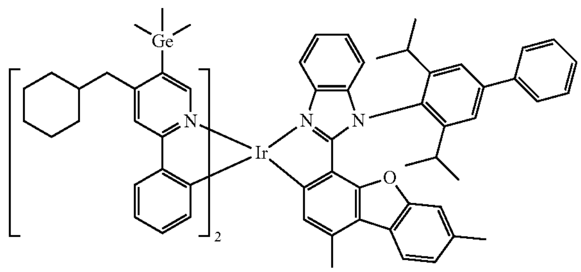
1676
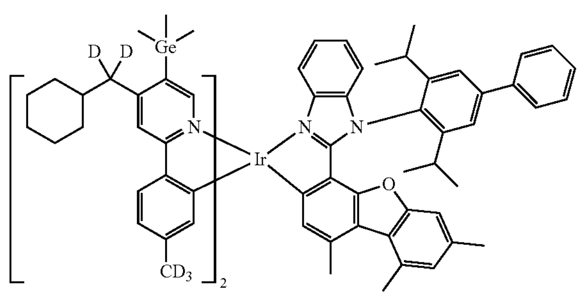
1677
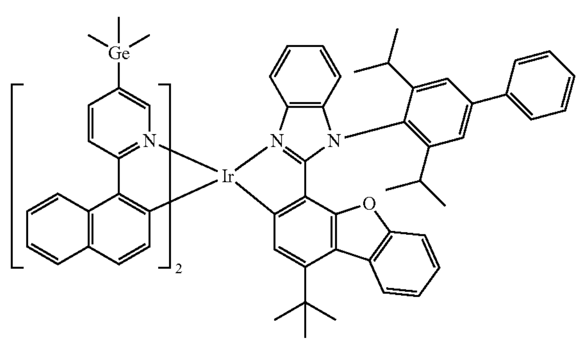
1678
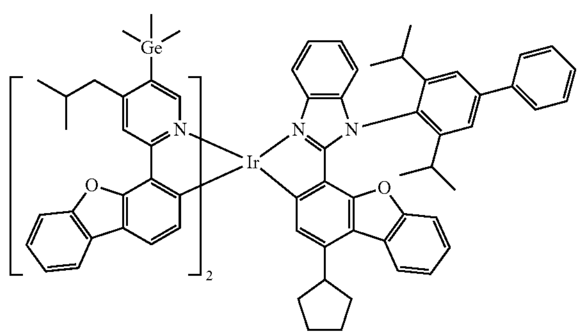

1679
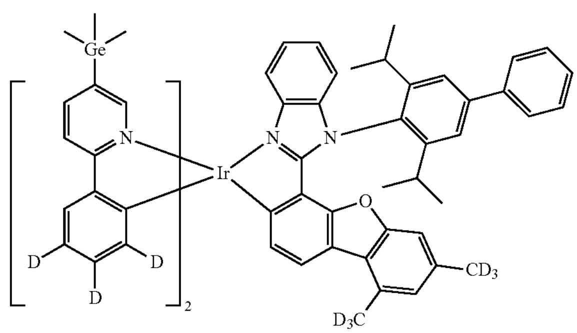
1680
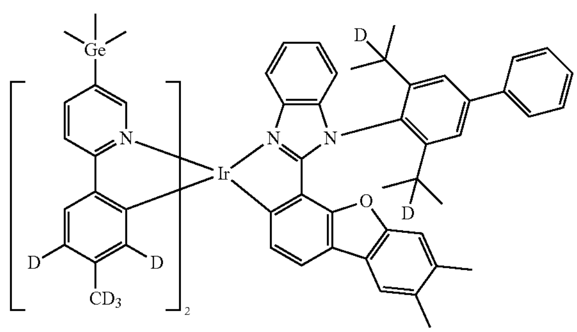
1681
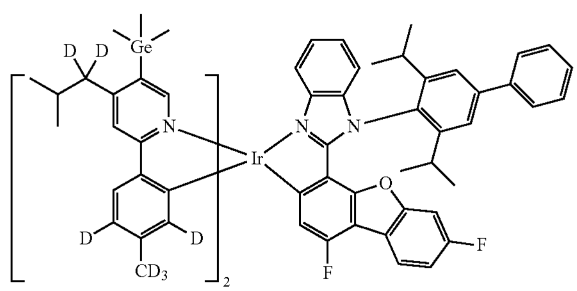
1682
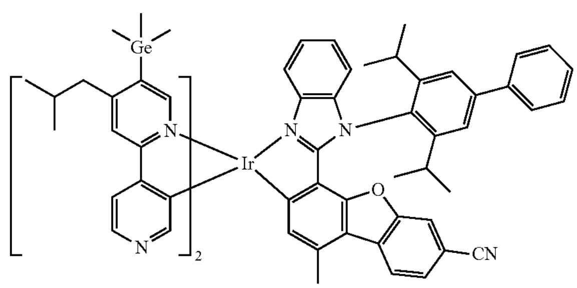
1683
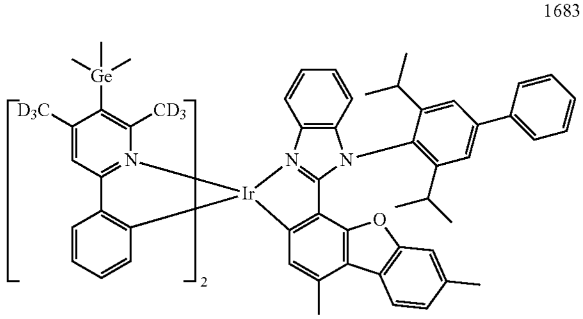
1684
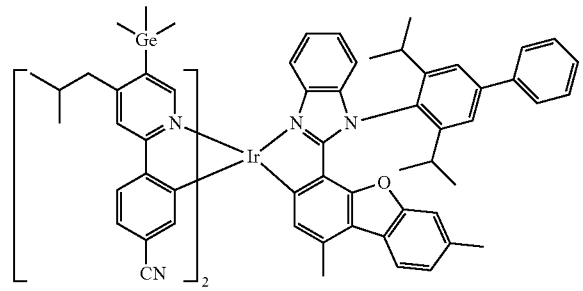
1685
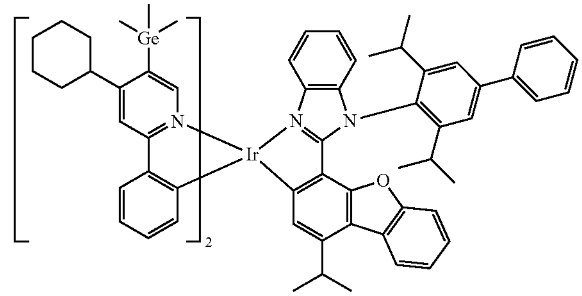
1686
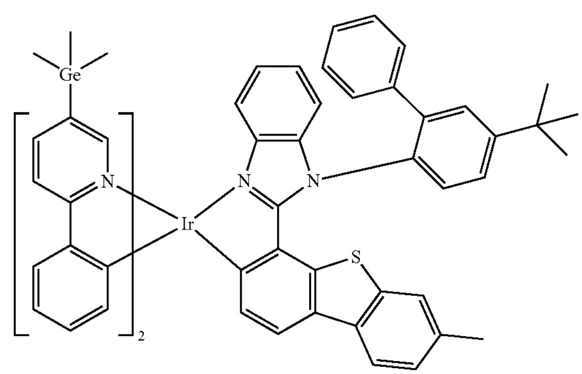
1687
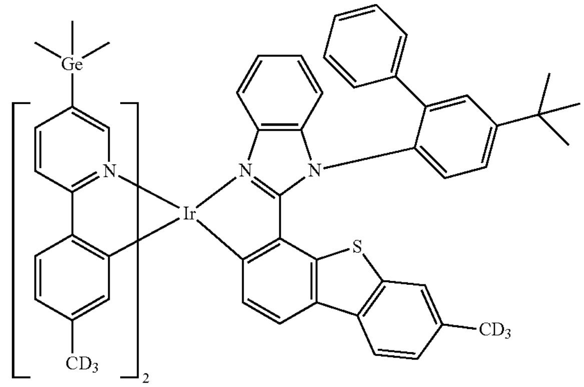

-continued
1688
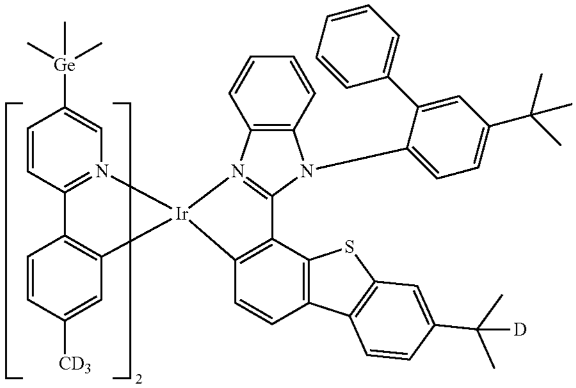
1689
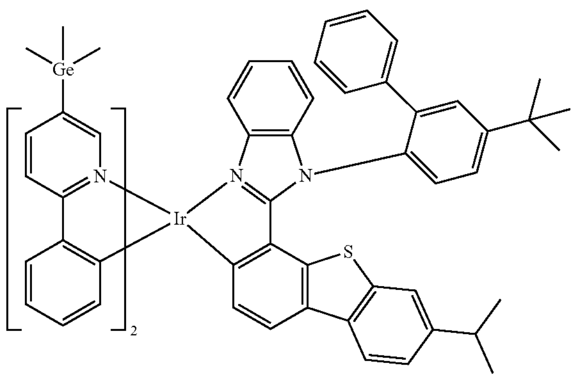
1690
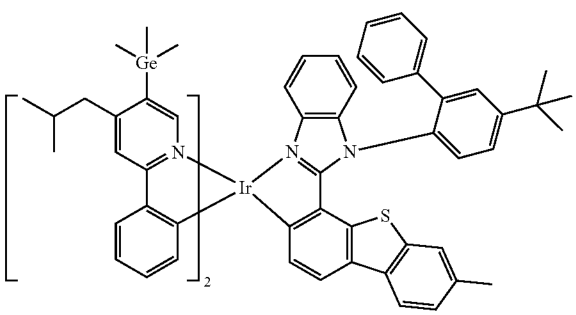
1691
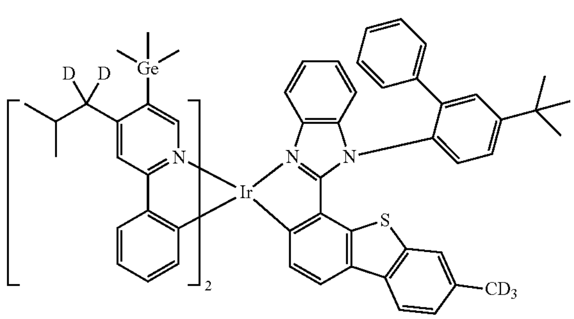
-continued
1692
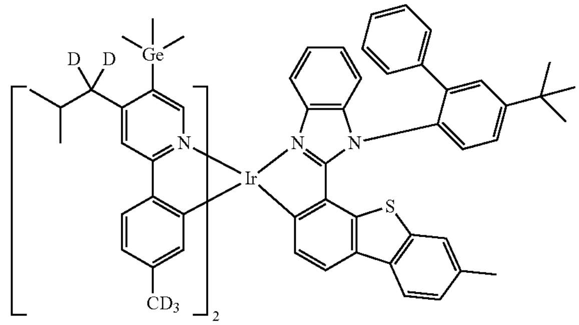
1693
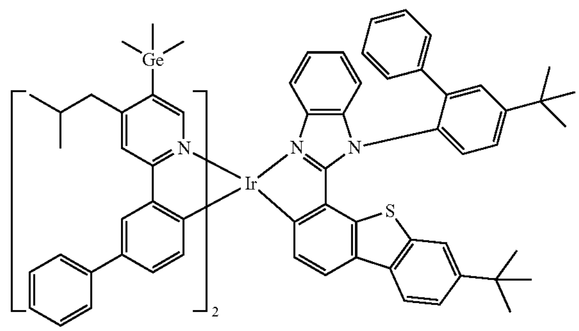
1694
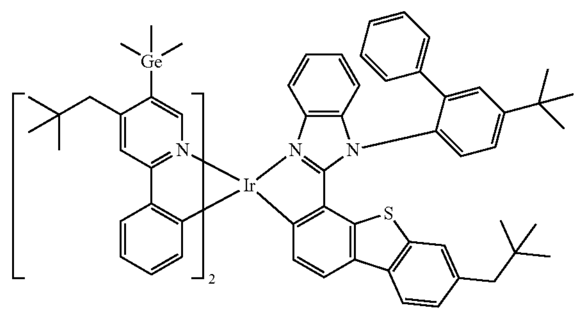
1695
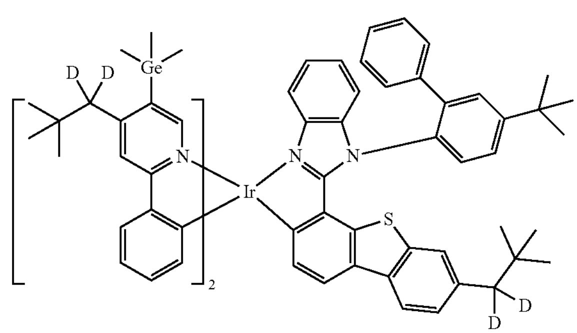

1696
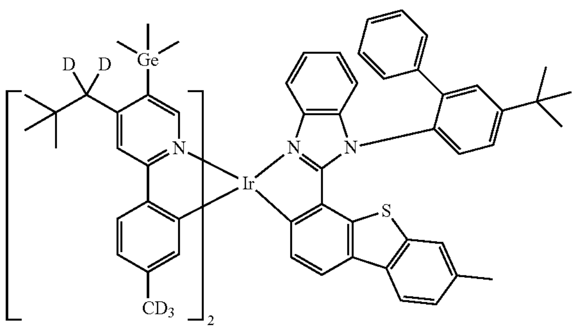
1697
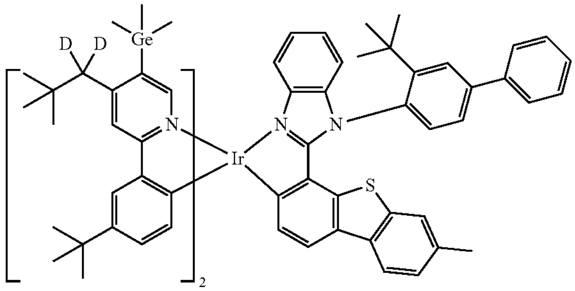
1698
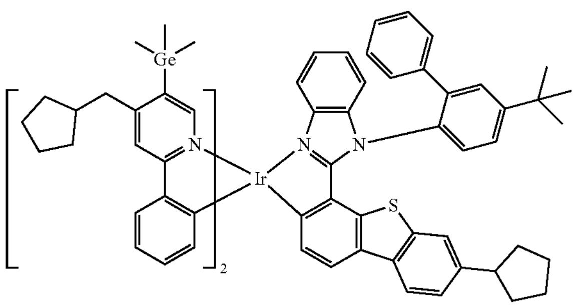
1699
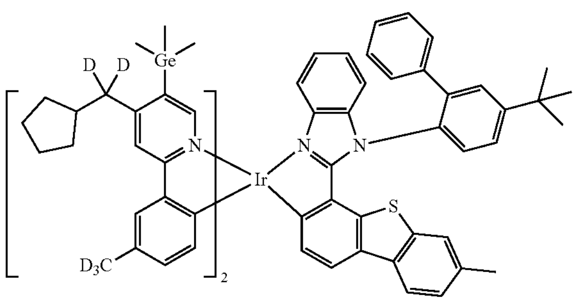
1700
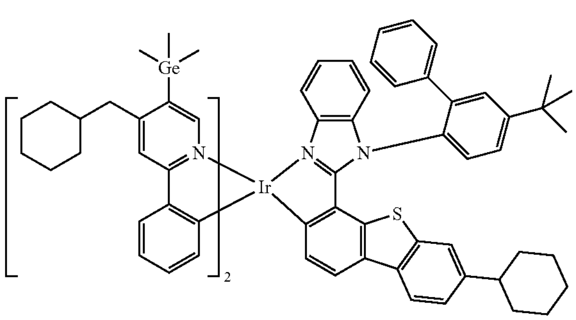
1701
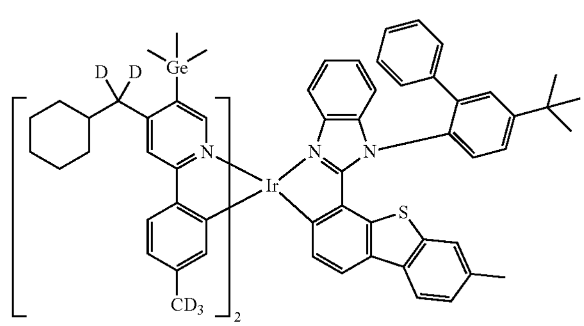
1702
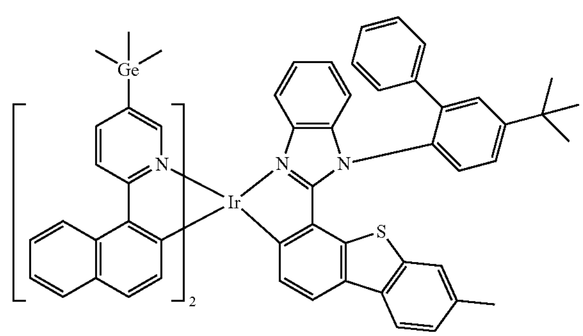
1703
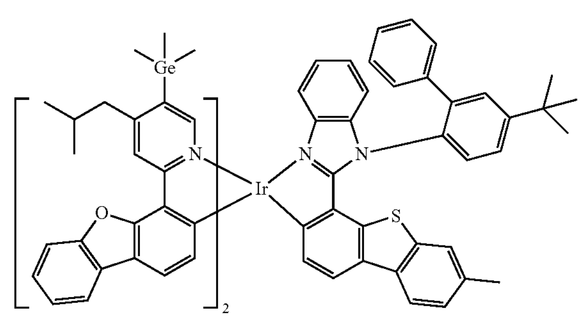
1704
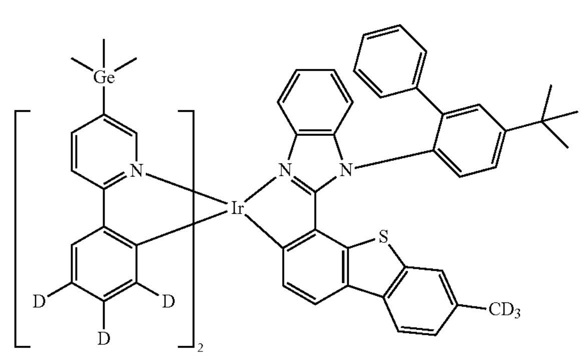

-continued
1705
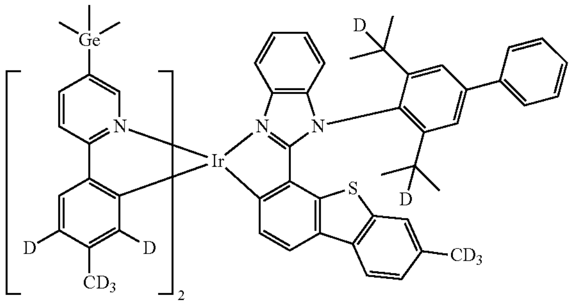
1706
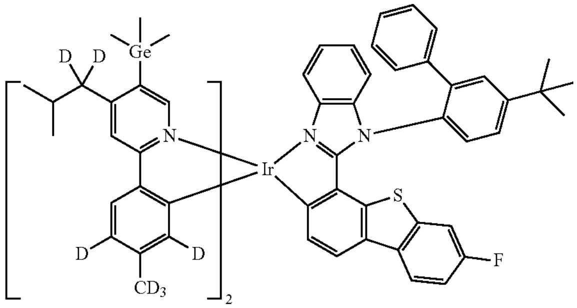
1707
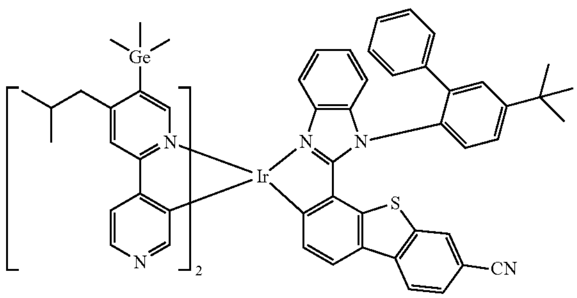
1708
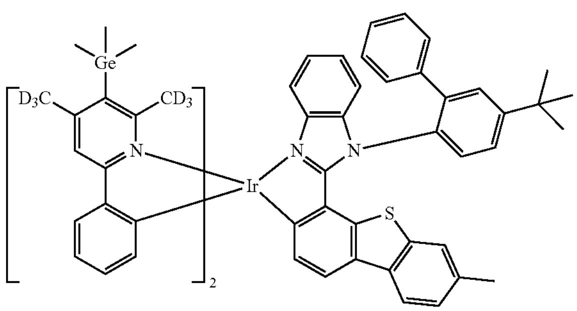
1709
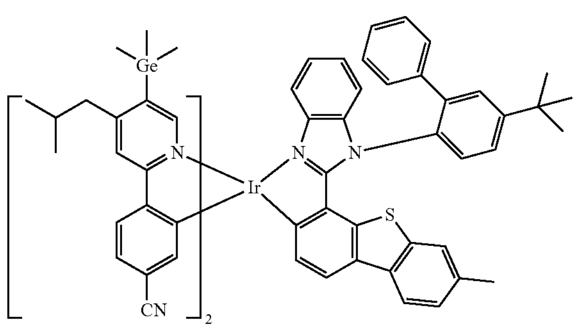
-continued
1710
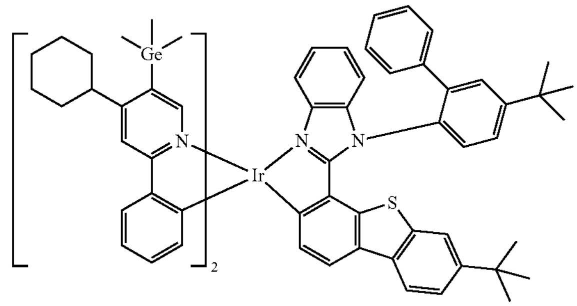
1711
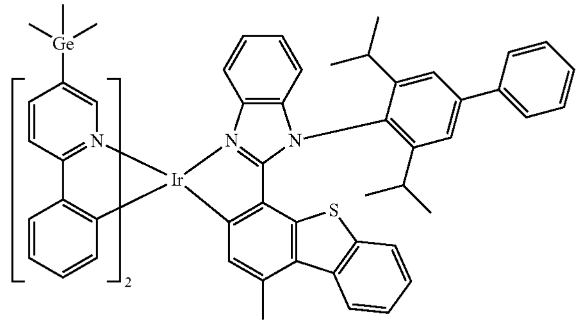
1712
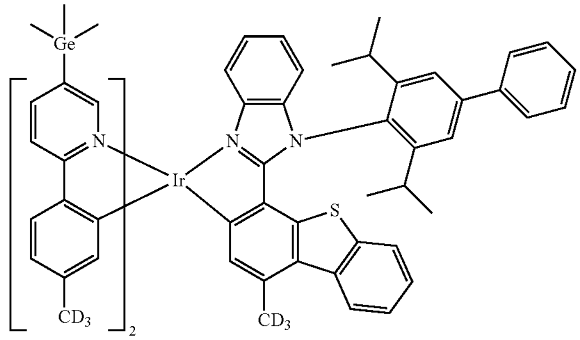
1713
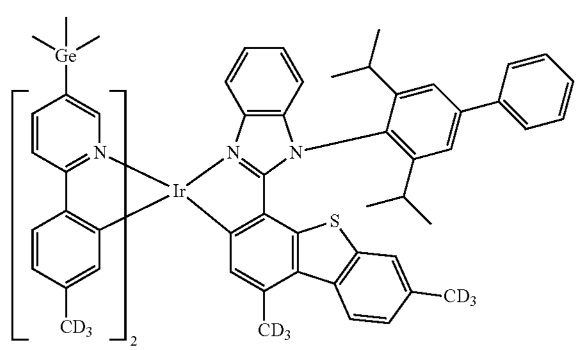

-continued
1714
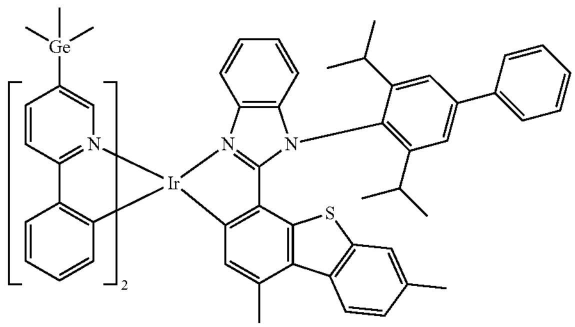
1715
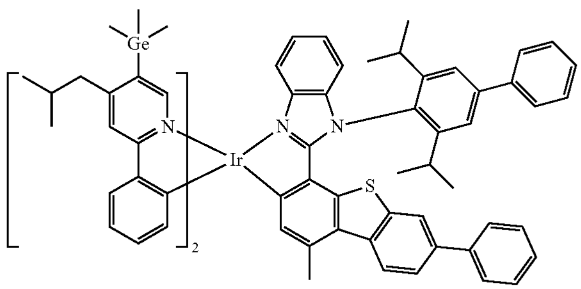
1716
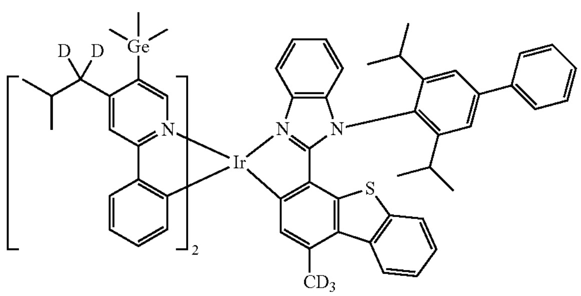
1717
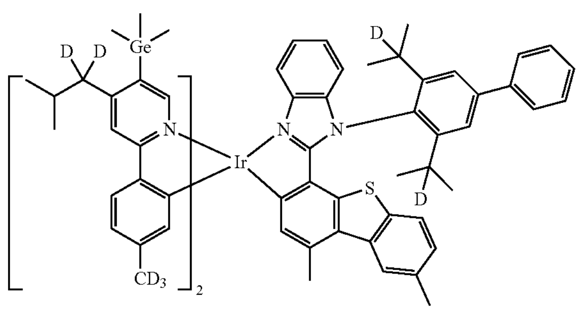
1718
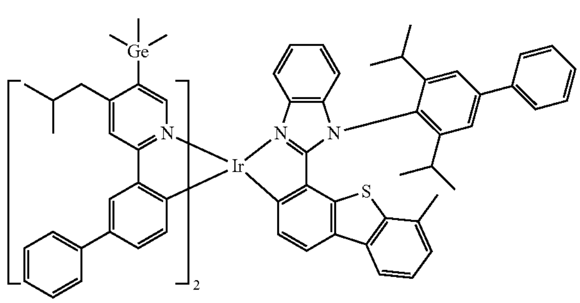
-continued
1719
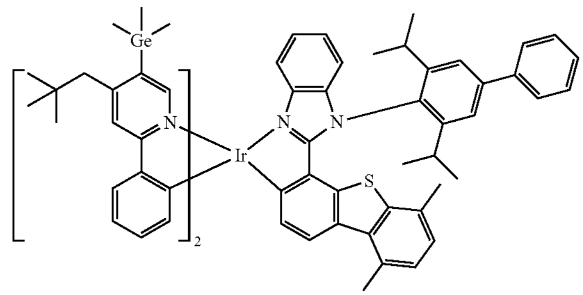
1720
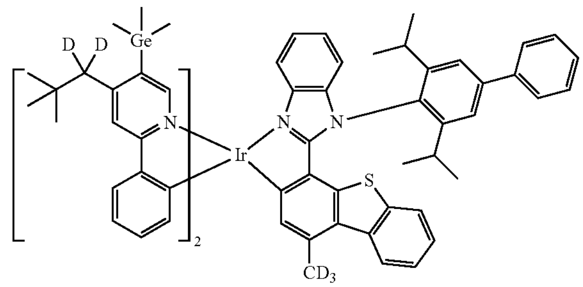
1721
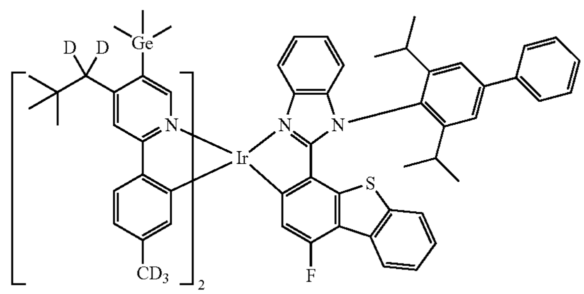
1722
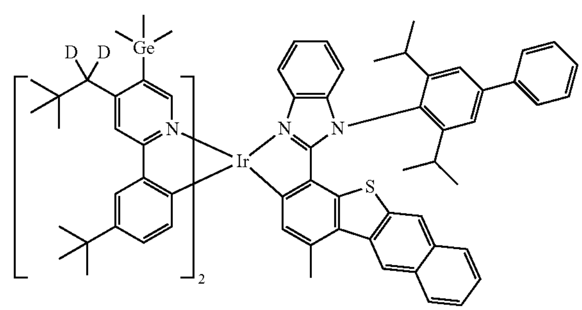
1723
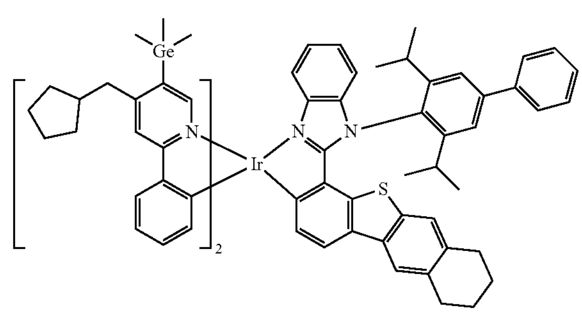

-continued
1724
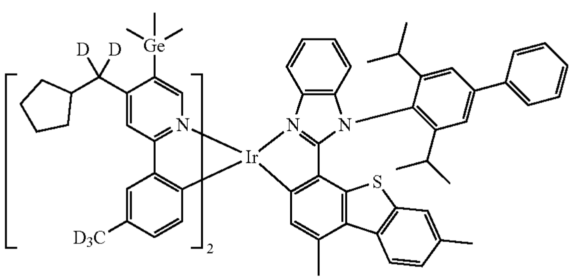
1725
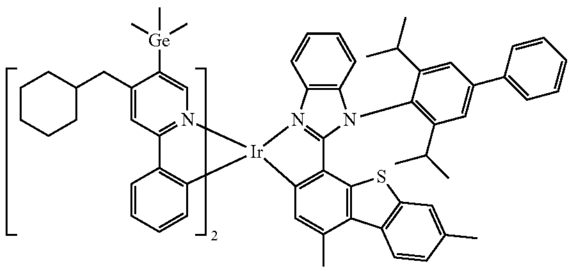
1726
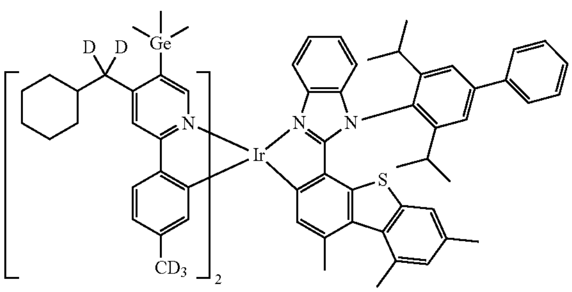
1727
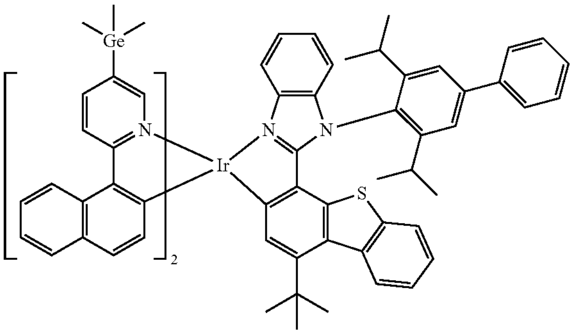
1728
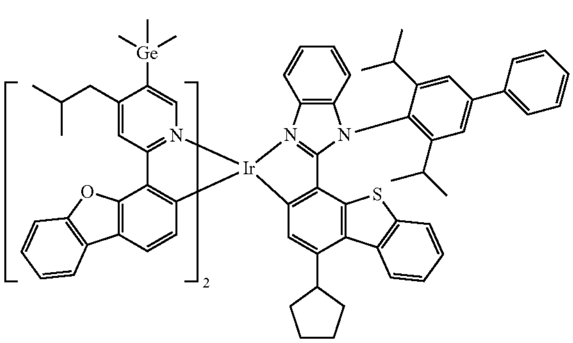
-continued
1729
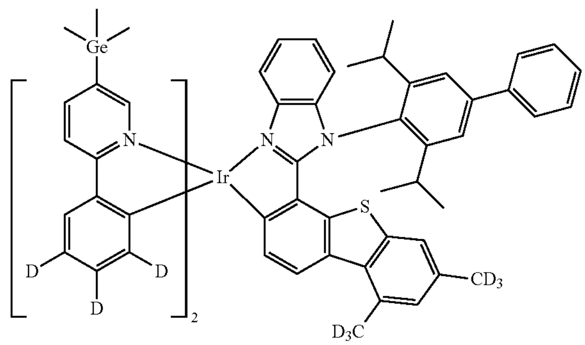
1730
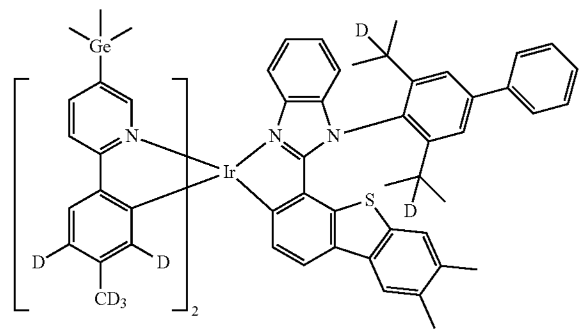
1731
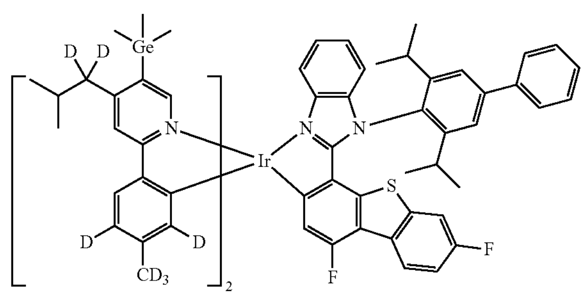
1732
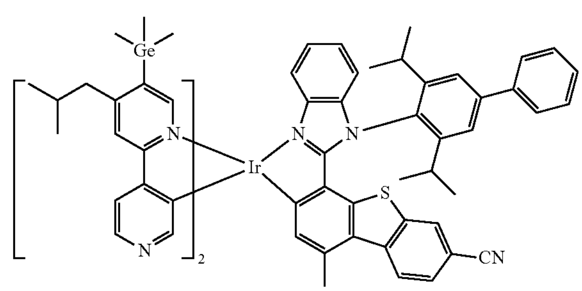

-continued
1733
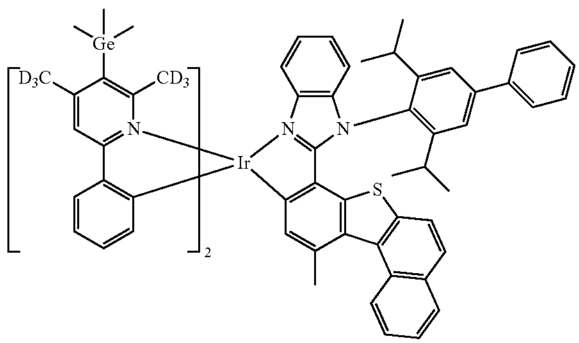
1734
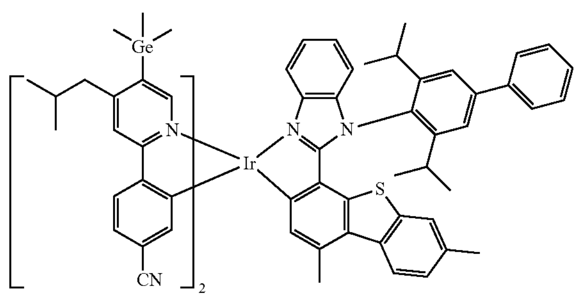
1735
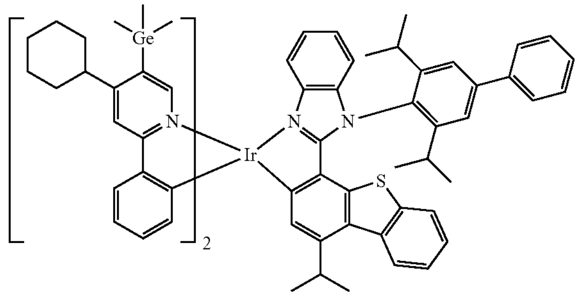
1736
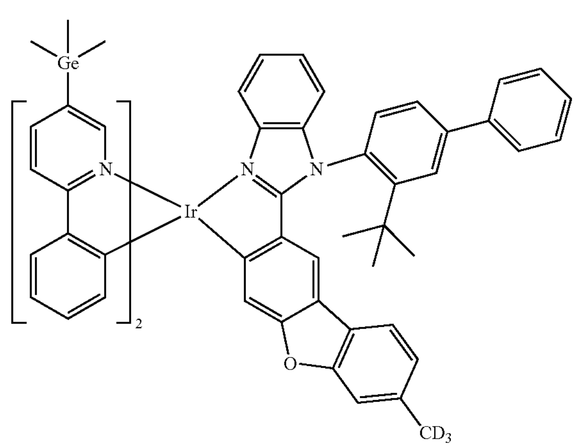
-continued
1737
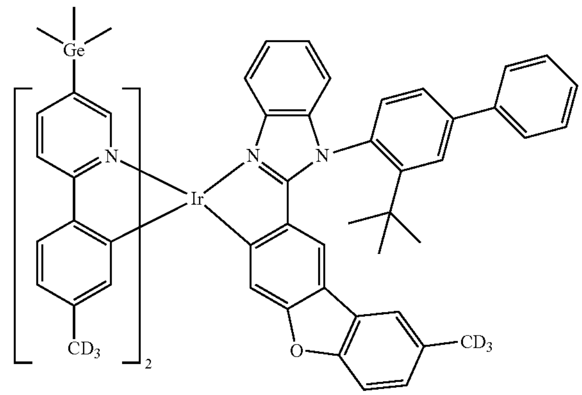
1738
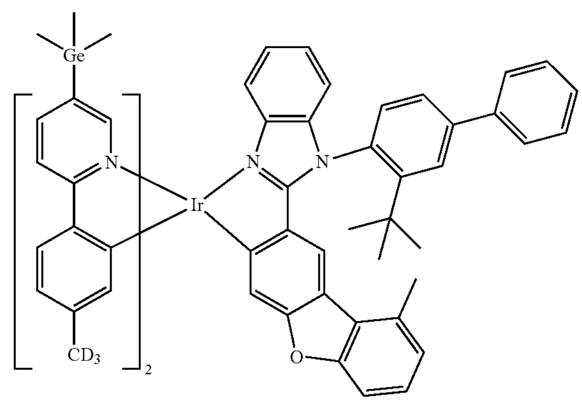
1739
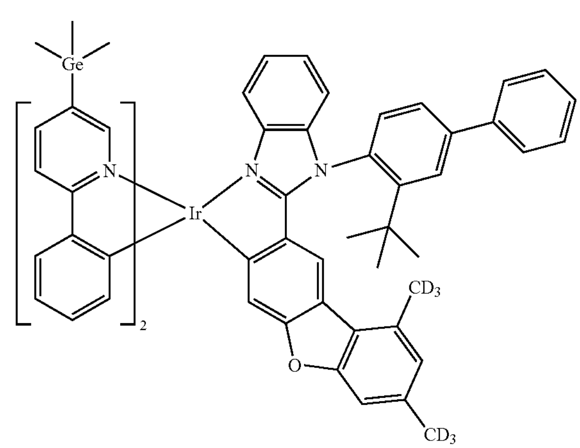

-continued
1740
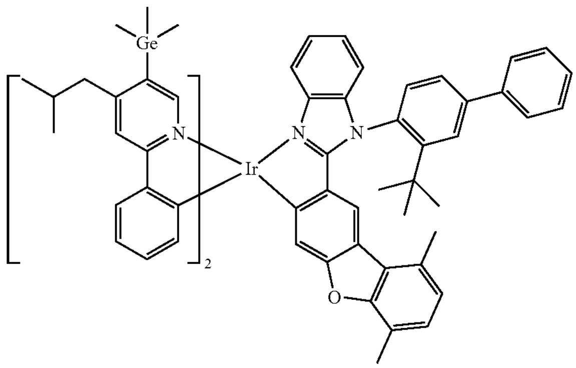
1741
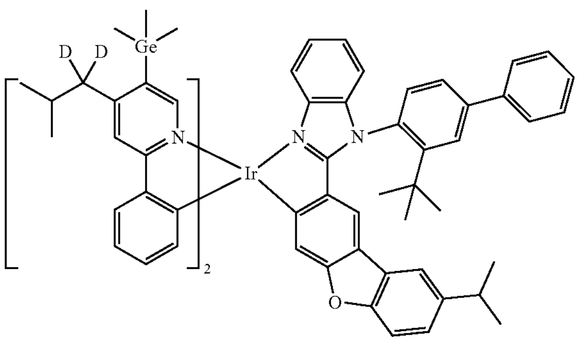
1742
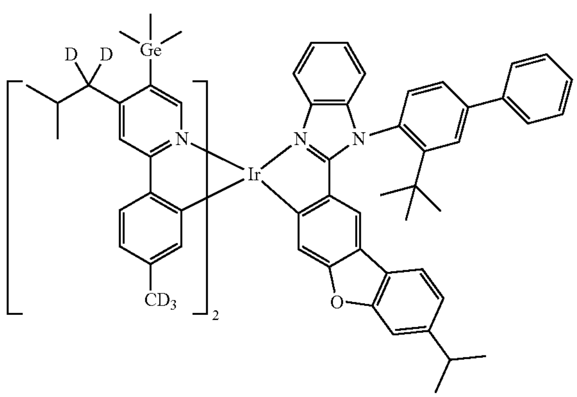
1743
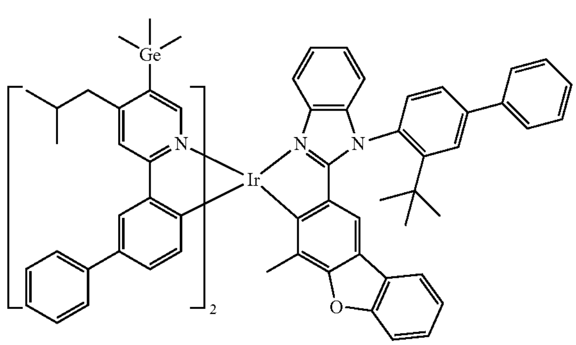
-continued
1744
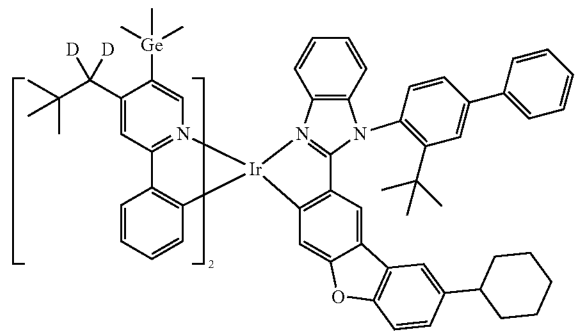
1745
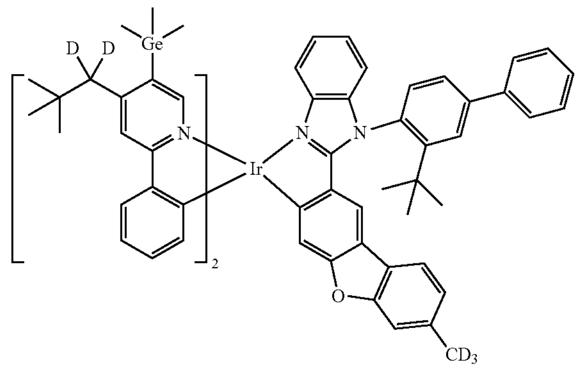
1746
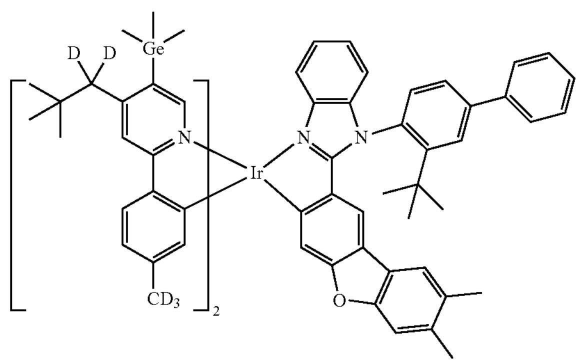
1747
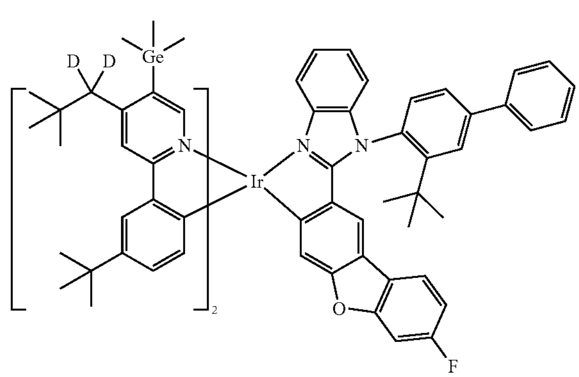

-continued
1748
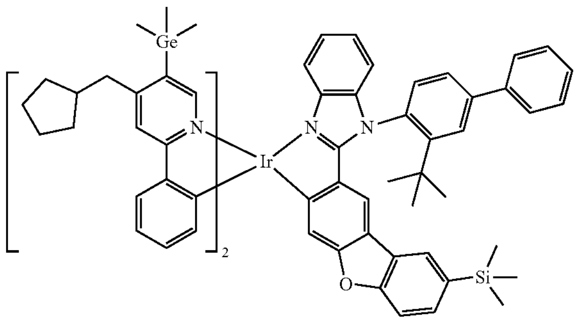
1749
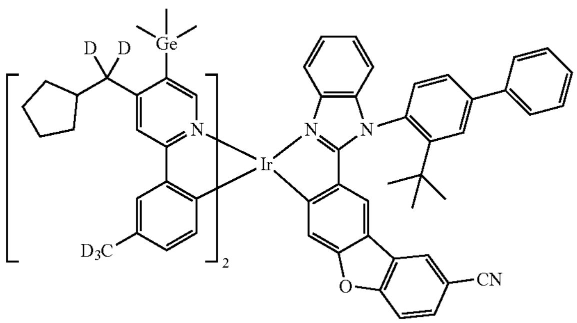
1750
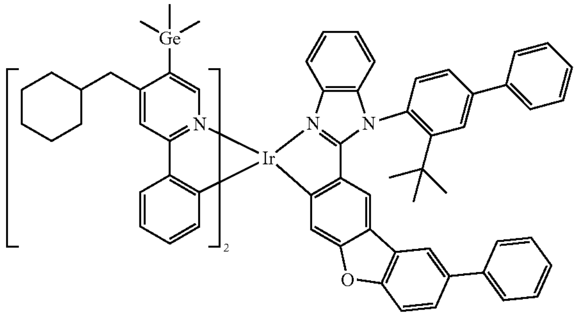
1751
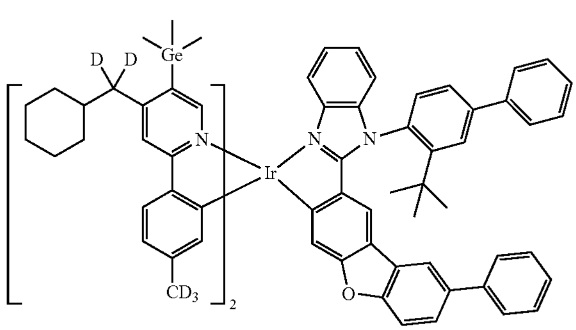
-continued
1752
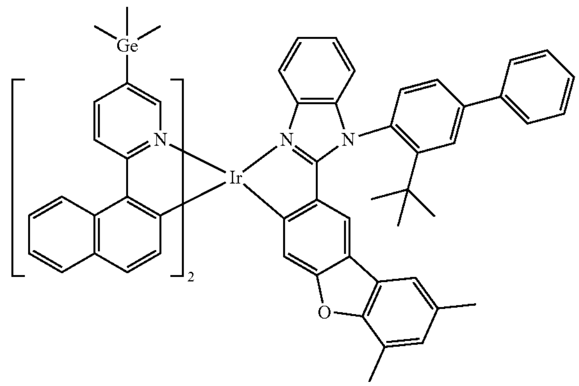
1753
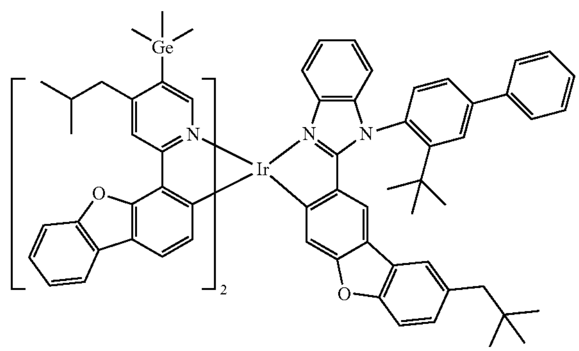
1754
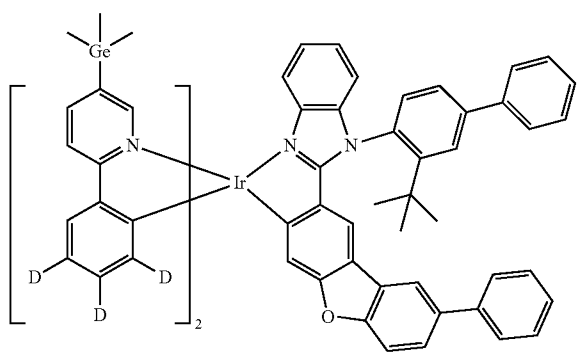
1755
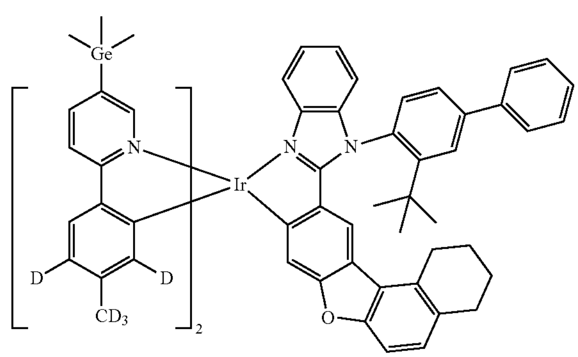

1756
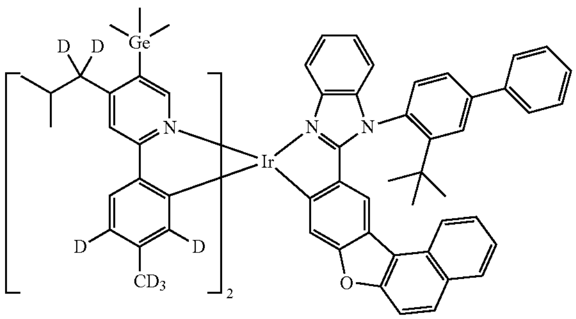
1757
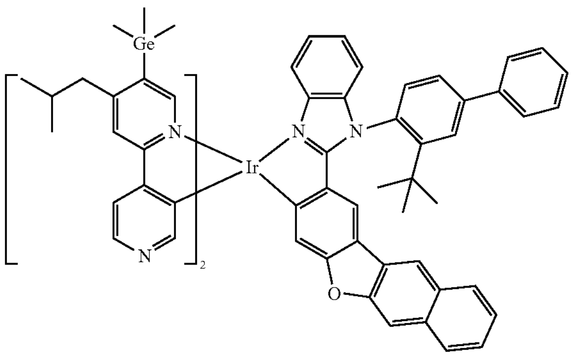
1758
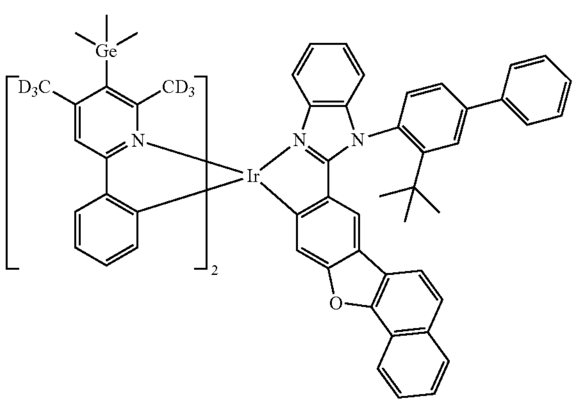
1759
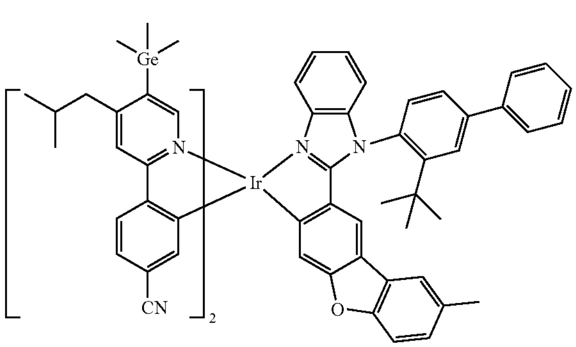
1760
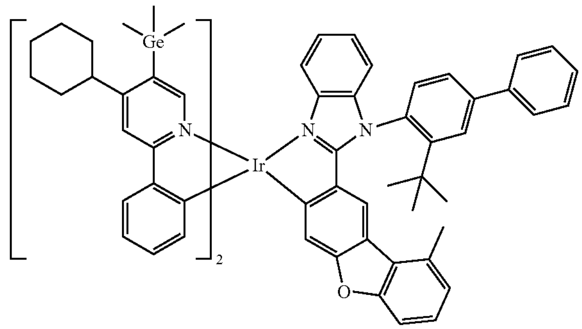
1761
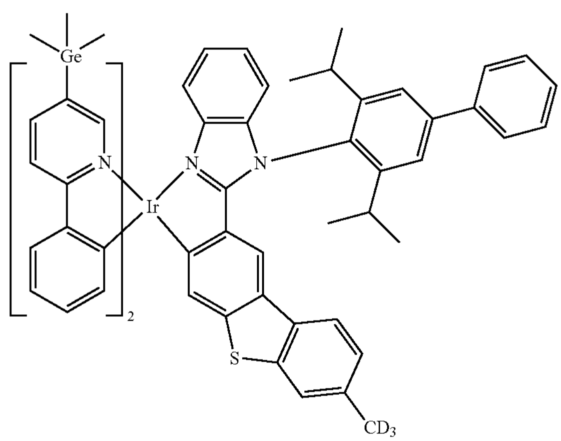
1762
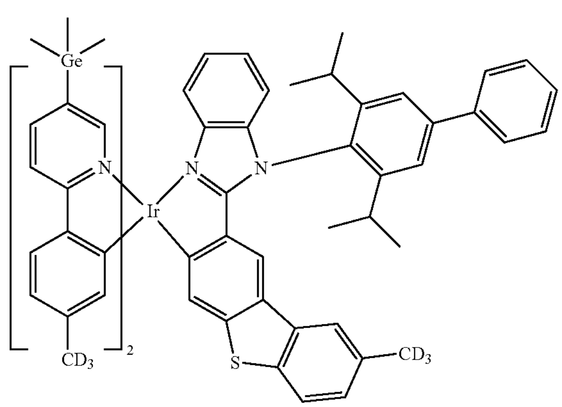

-continued
1763
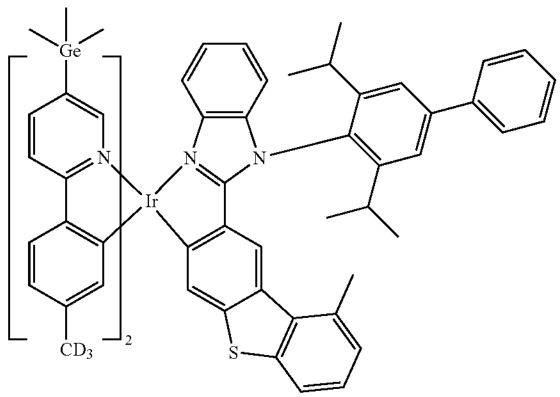
1764
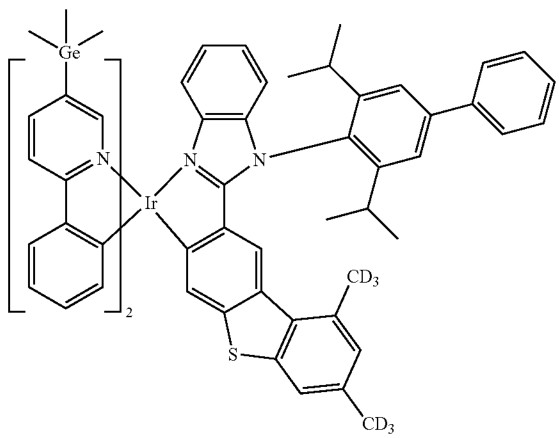
1765
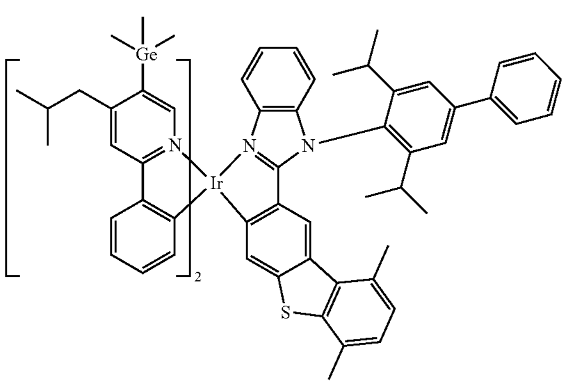
1766
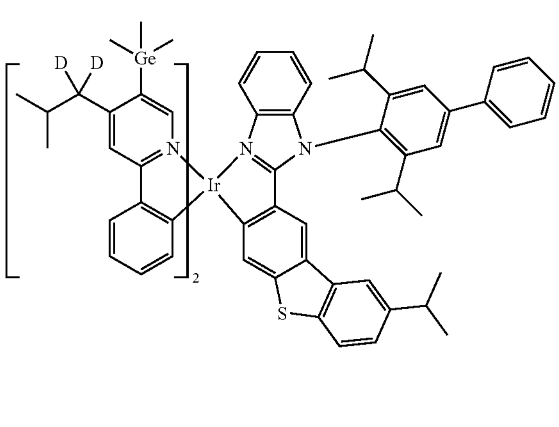
-continued
1767
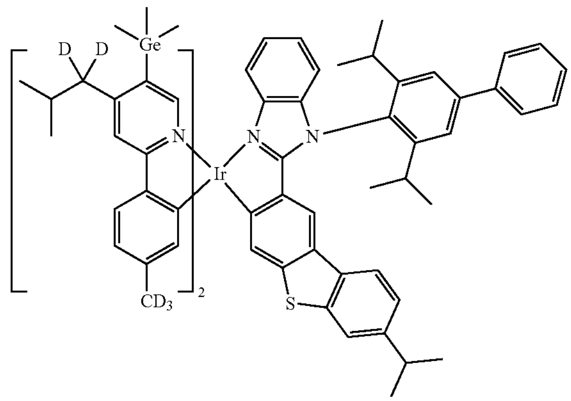
1768
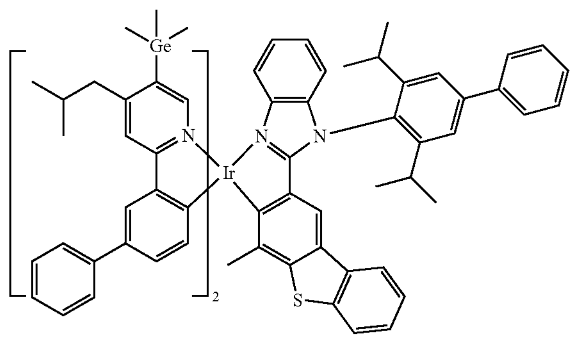
1769
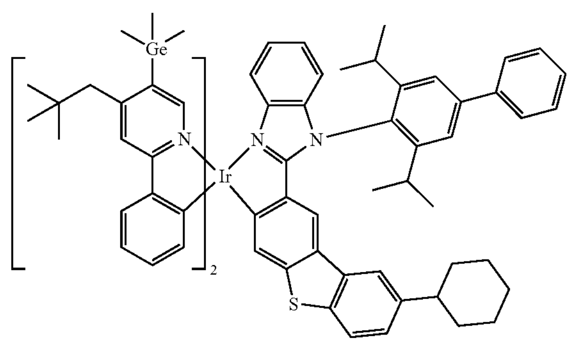
1770
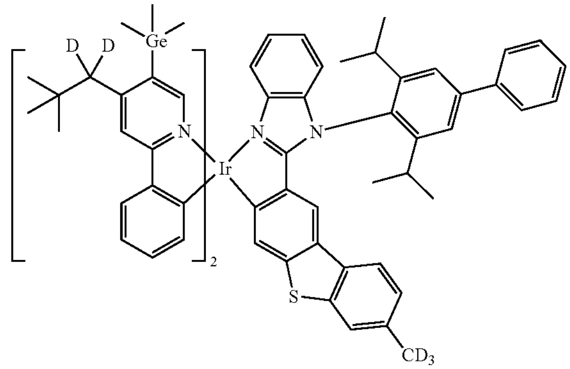

-continued
1771
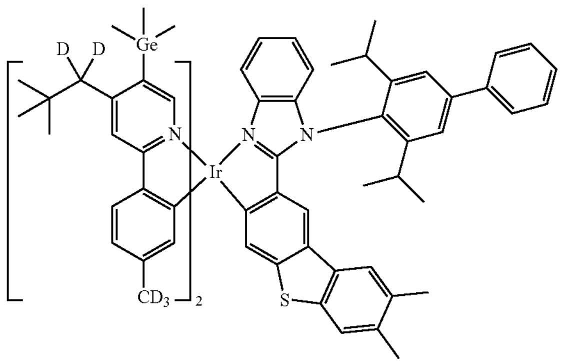
1772
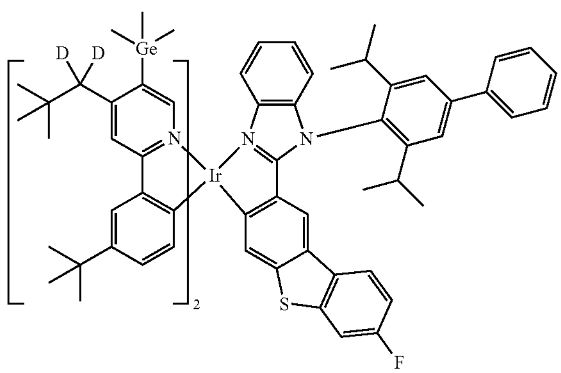
1773
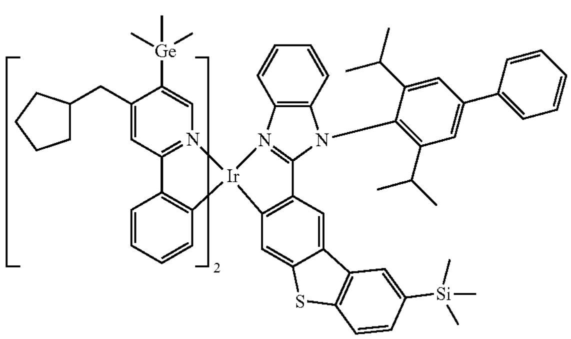
1774
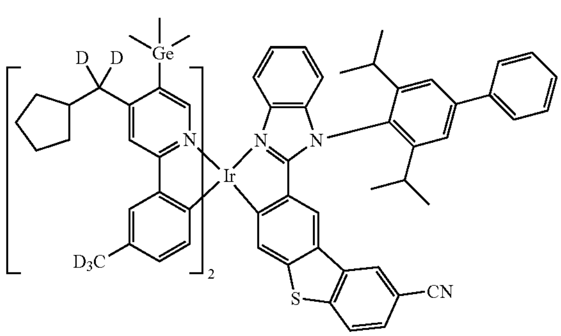
-continued
1775
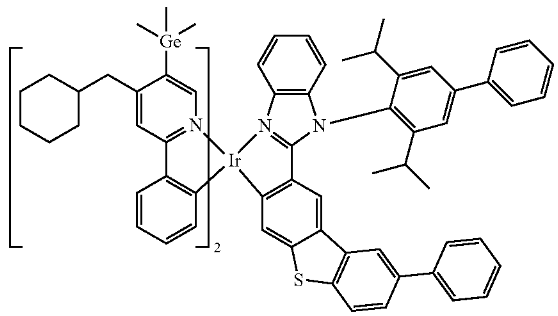
1776
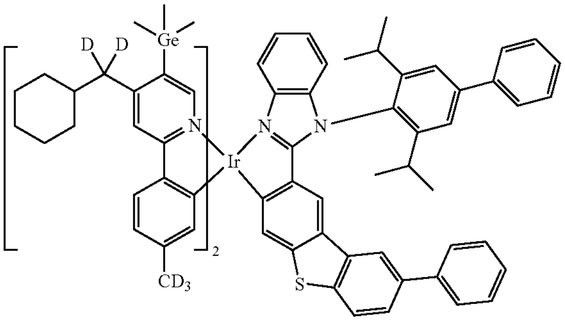
1777
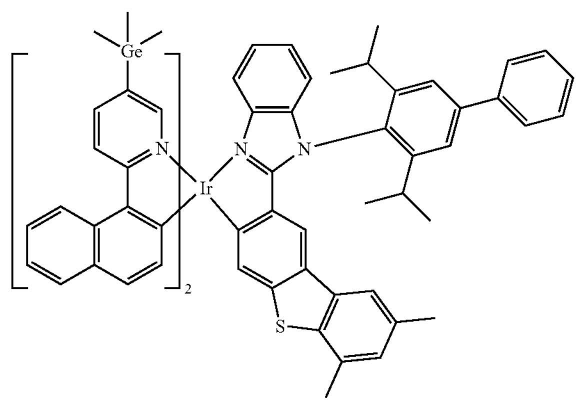
1778
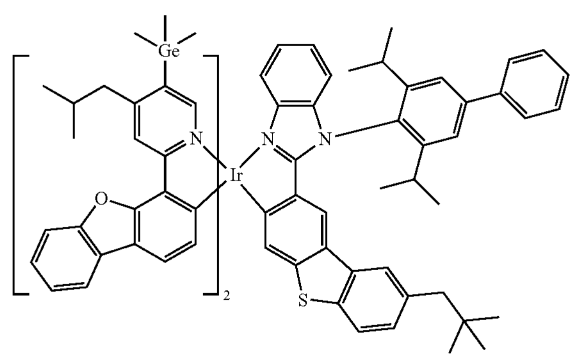

-continued
1779
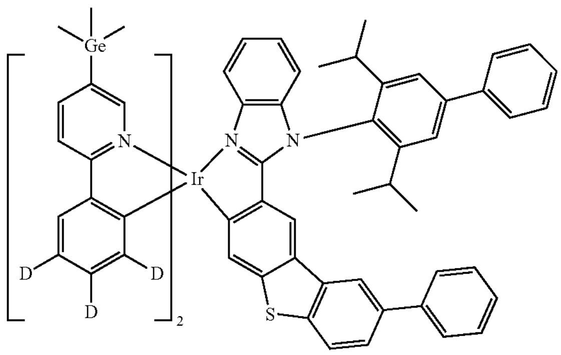
1780
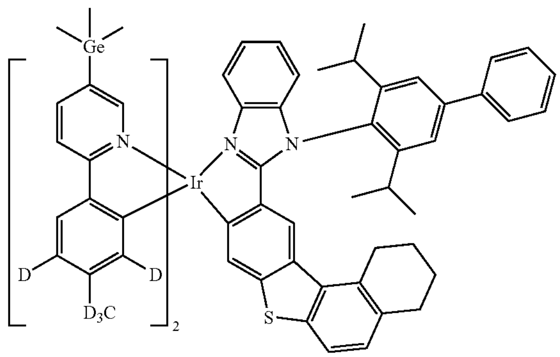
1781
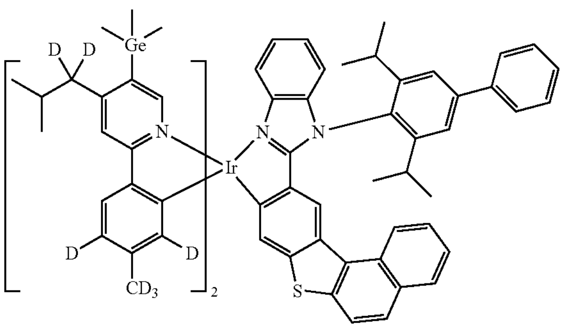
1782
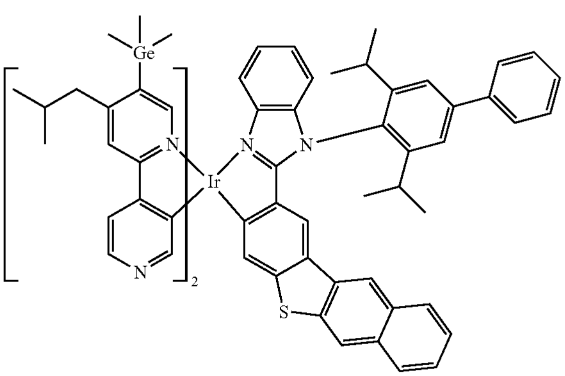
-continued
1783
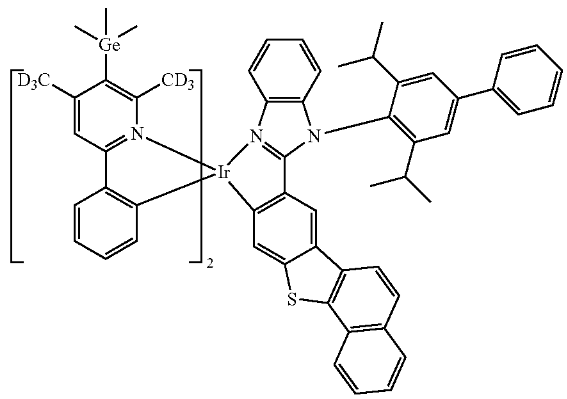
1784
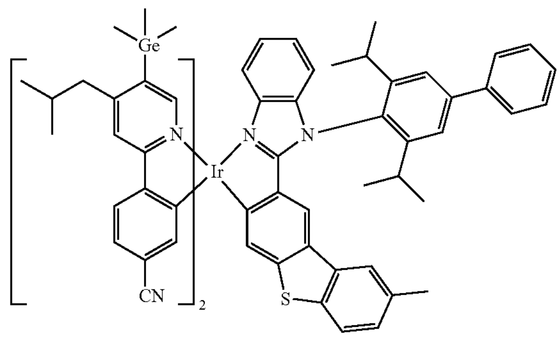
1785
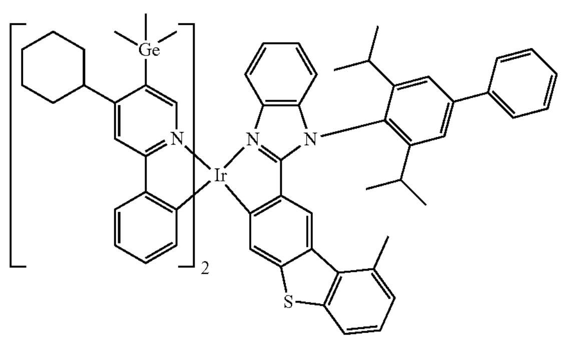
1786
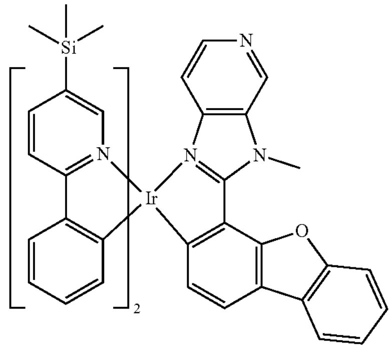

-continued
1787
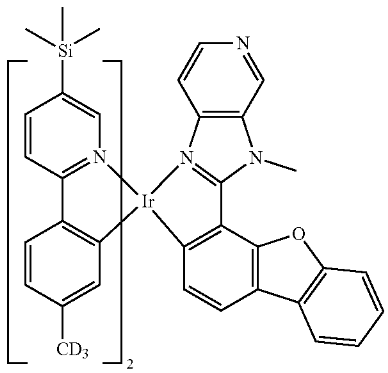
1788
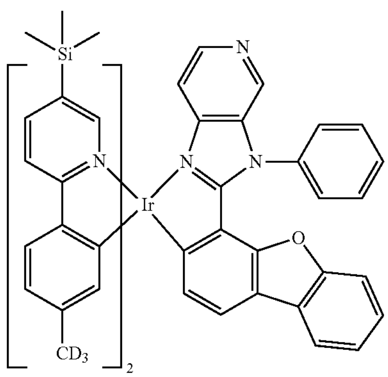
1789
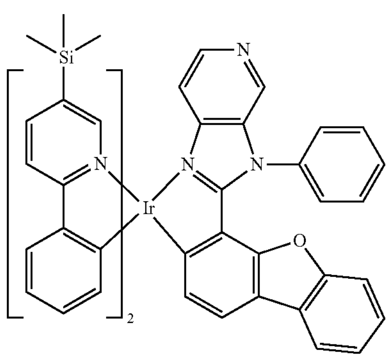
1790
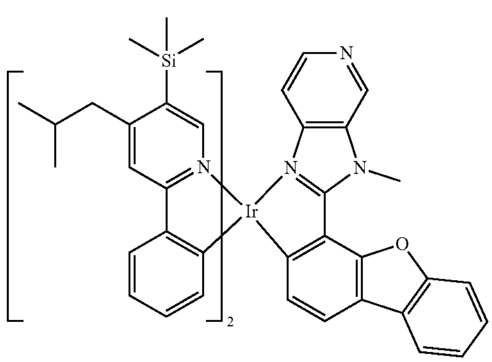
-continued
1791
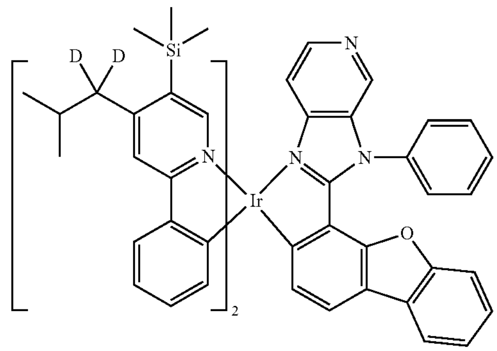
1792
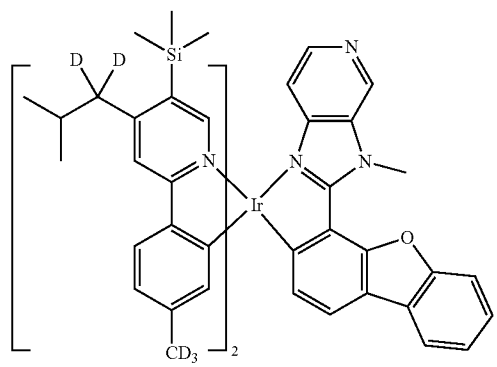
1793
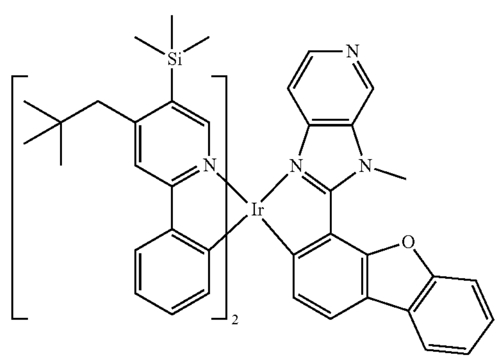
1794
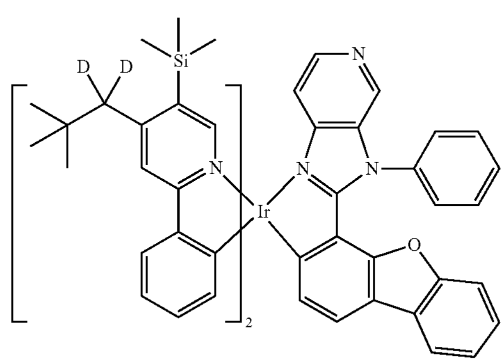

1795
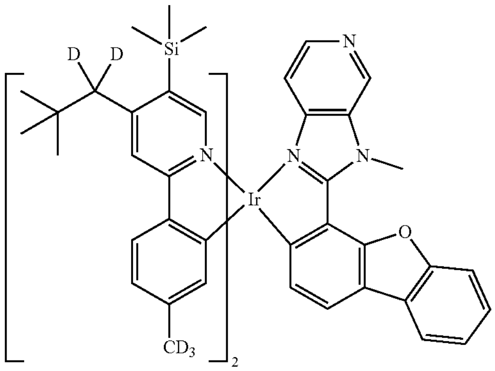
1796
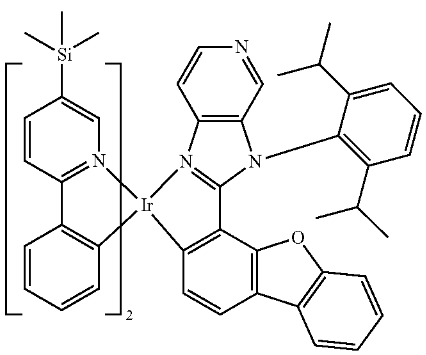
1797
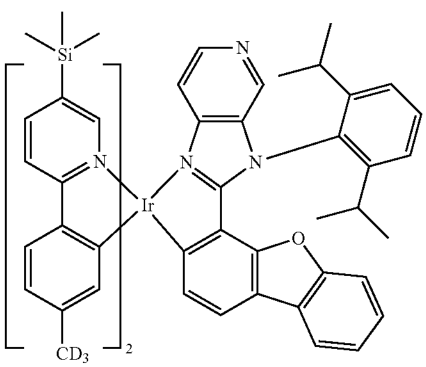
1798
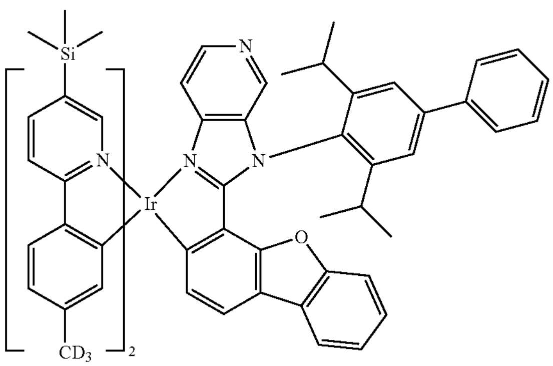
1799
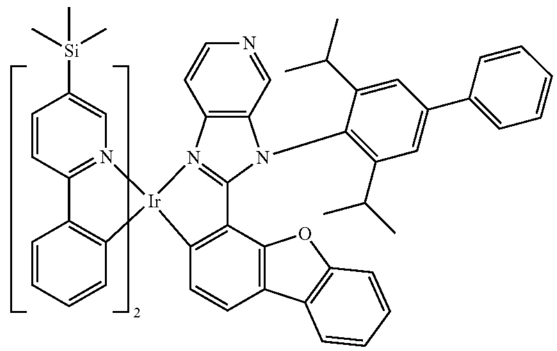
1800
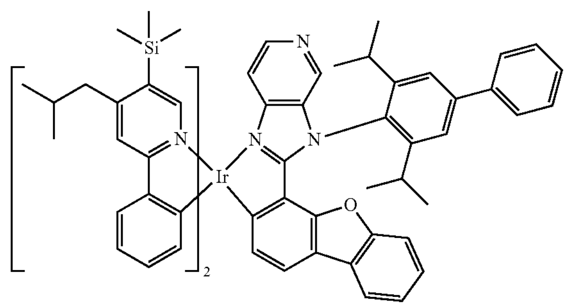
1801
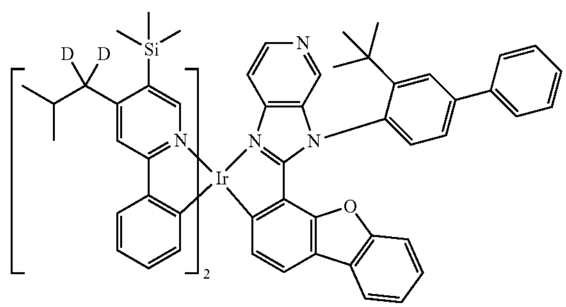
1802
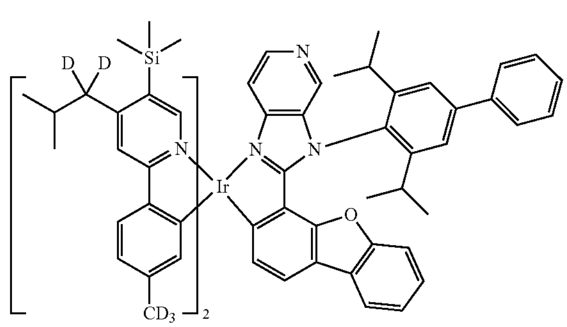

-continued
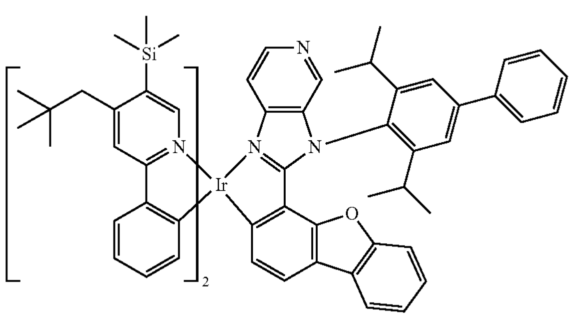
1803
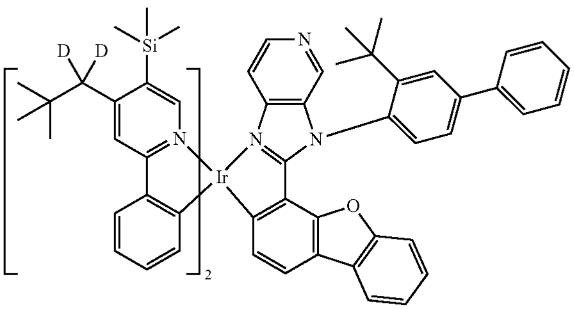
1804
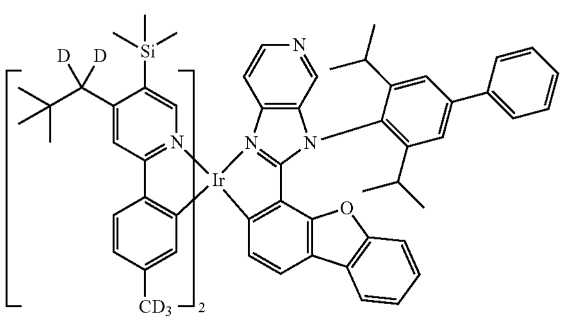
1805
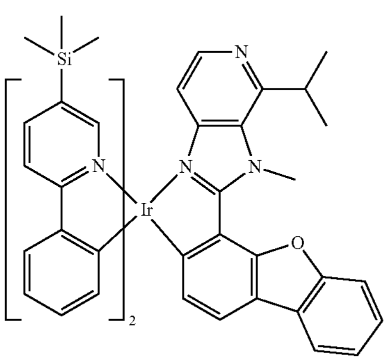
1806
-continued
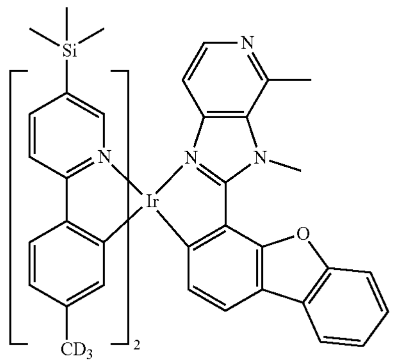
1807
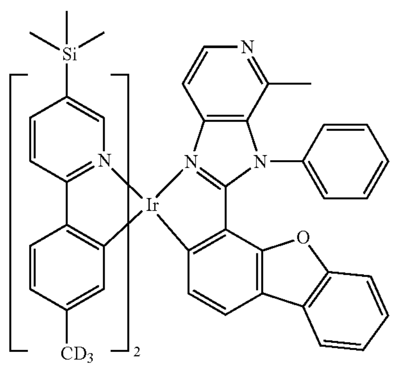
1808
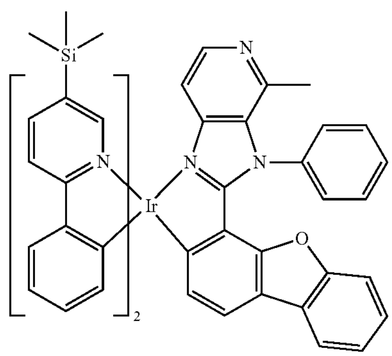
1809
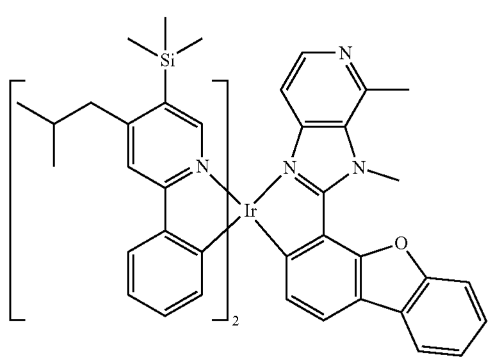
1810

-continued
1811
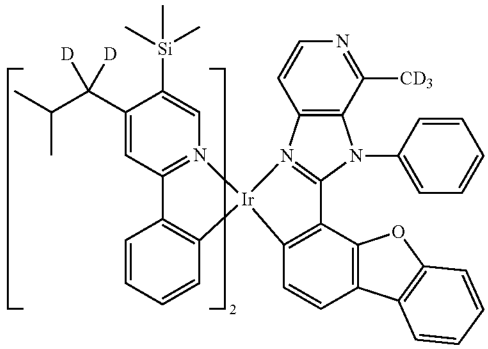
1812
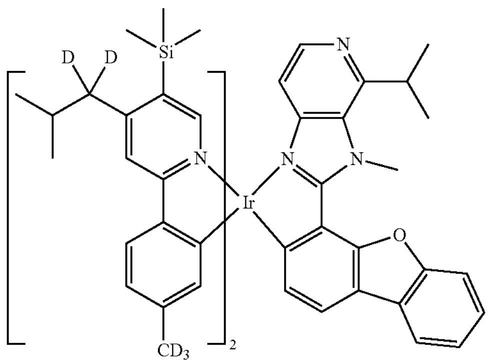
1813
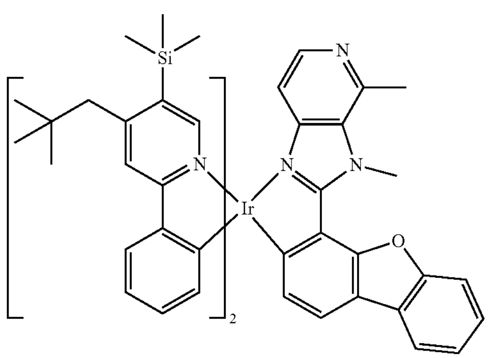
1814
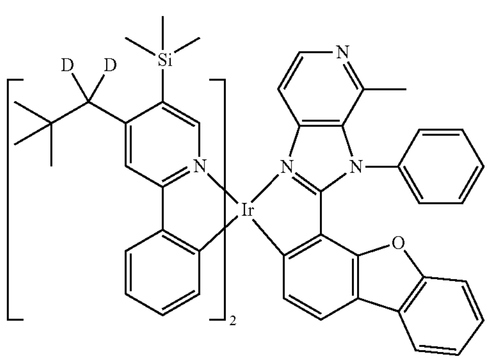
-continued
1815
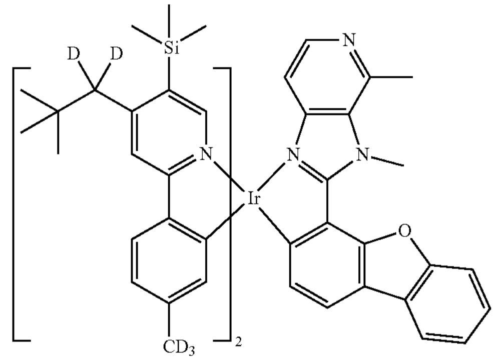
1816
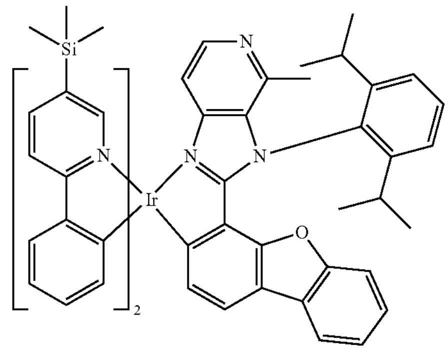
1817
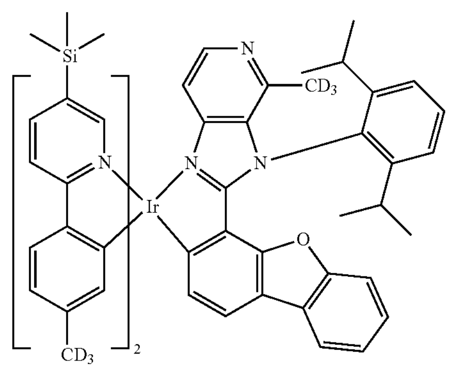
1818
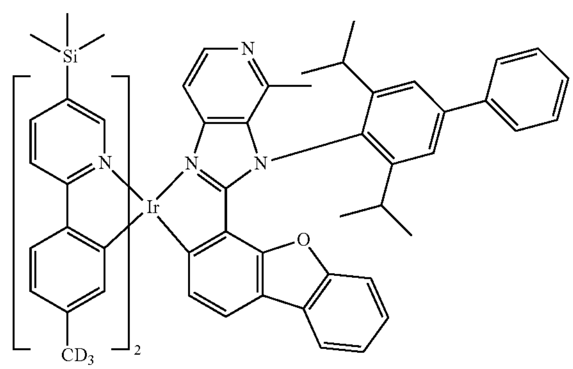

-continued
1819
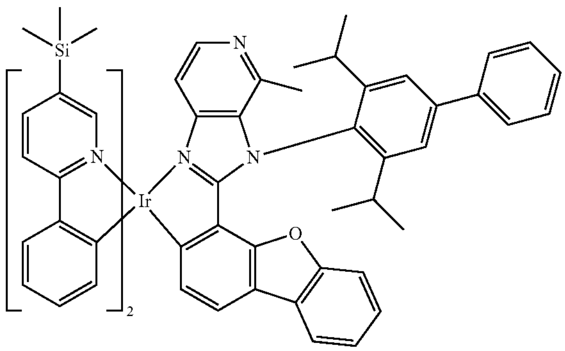
1820
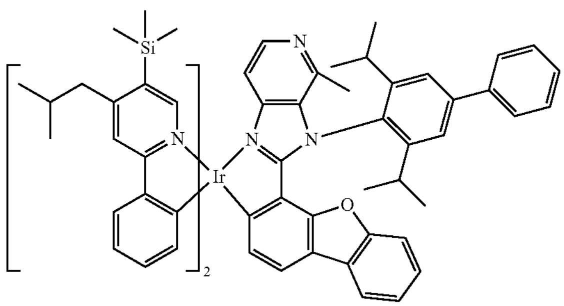
1821
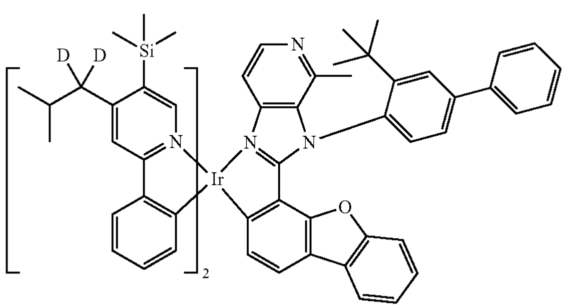
1822
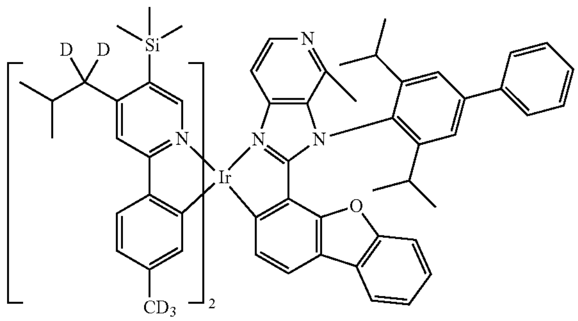
-continued
1823
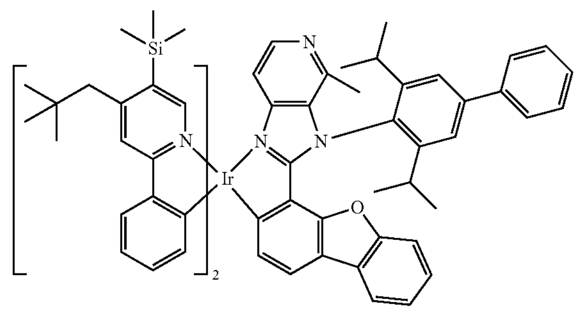
1824
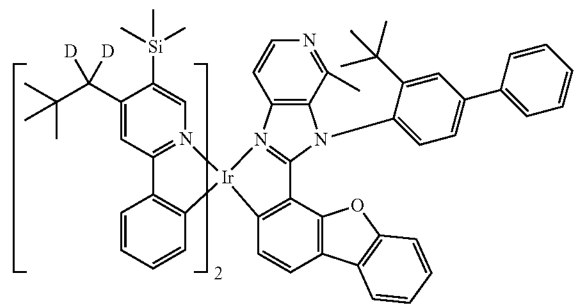
1825
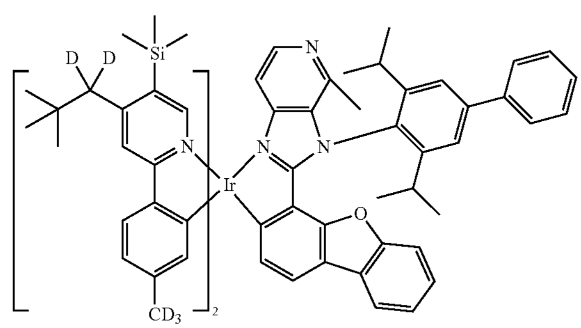
1826
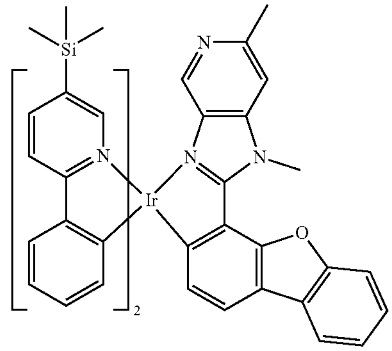

-continued
1827
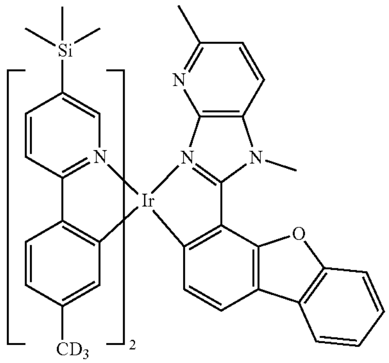
1828
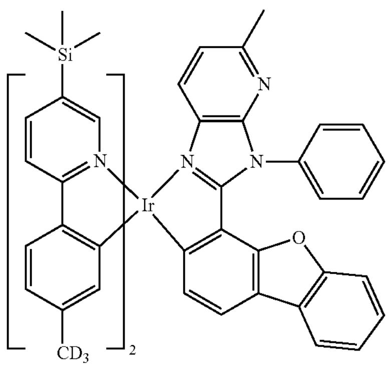
1829
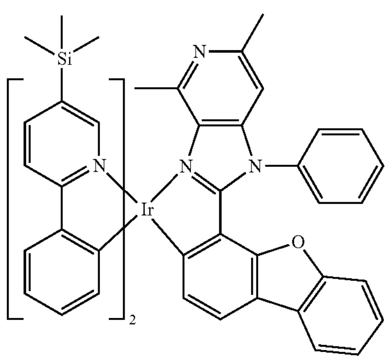
1830
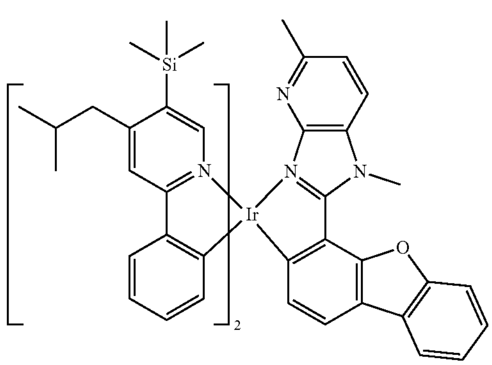
-continued
1831
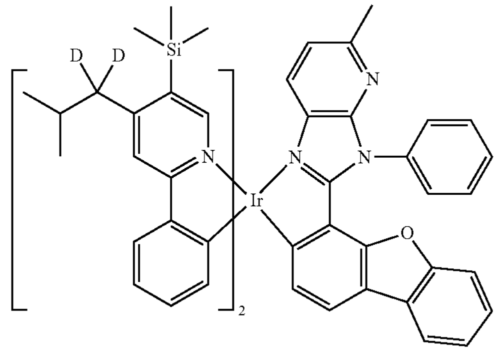
1832
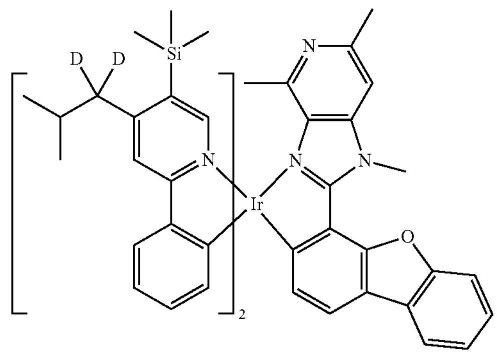
1833
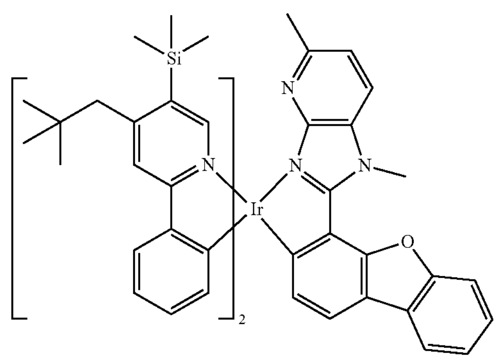
1834
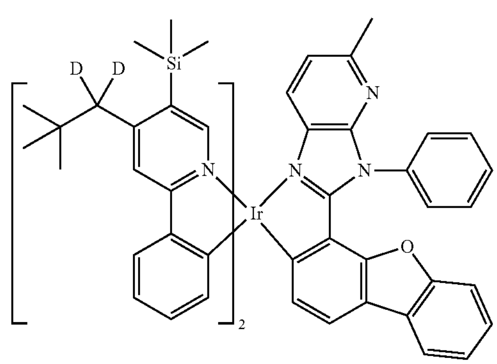

1835
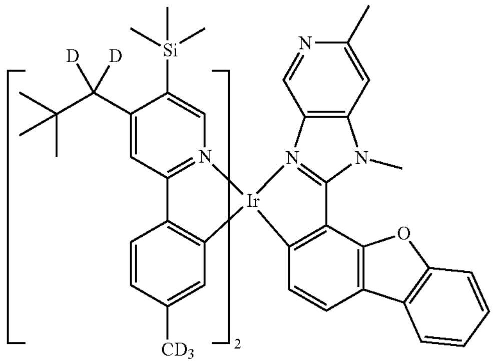
1836
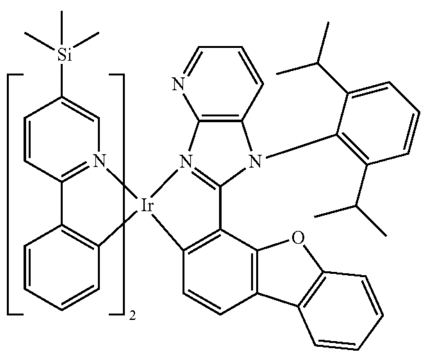
1837
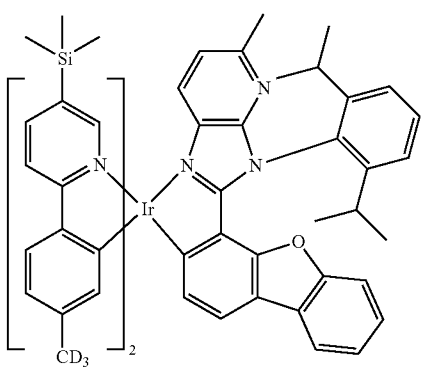
1838
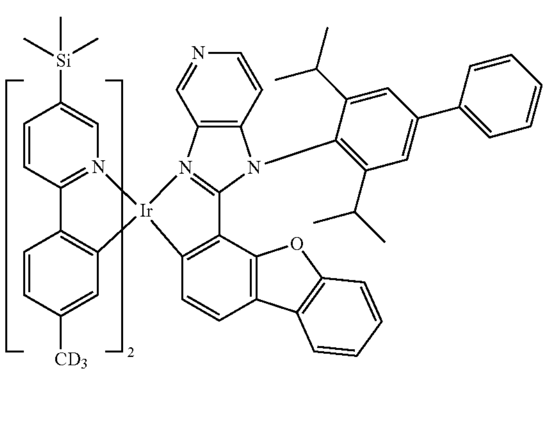
1839
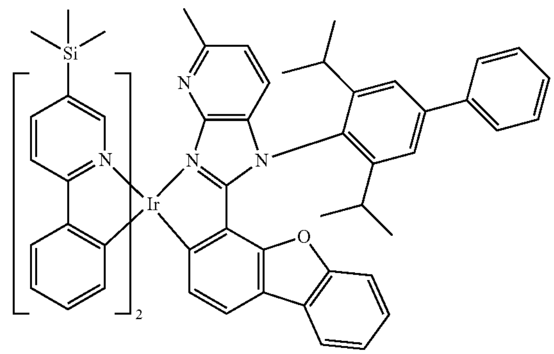
1840
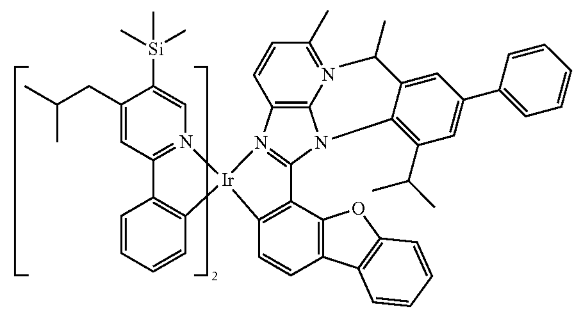
1841
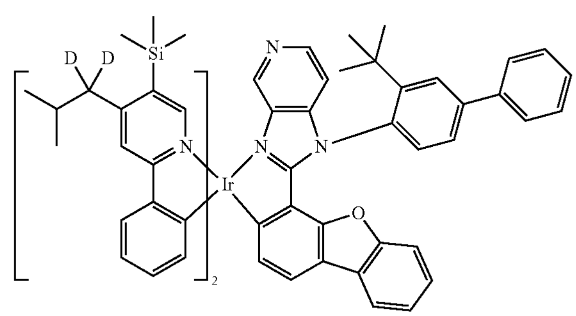
1842
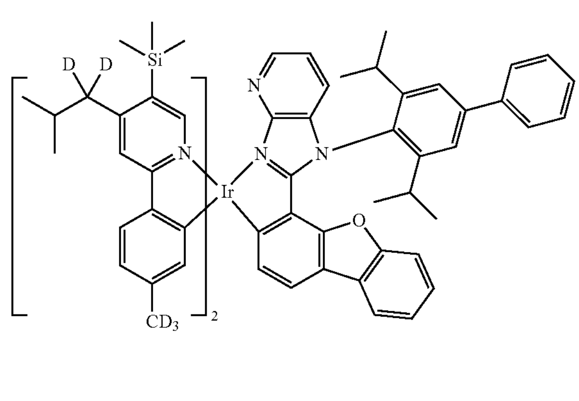

1843
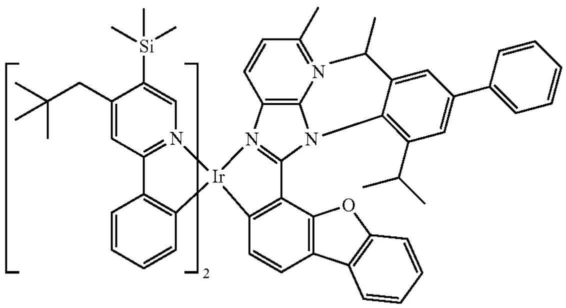
1844
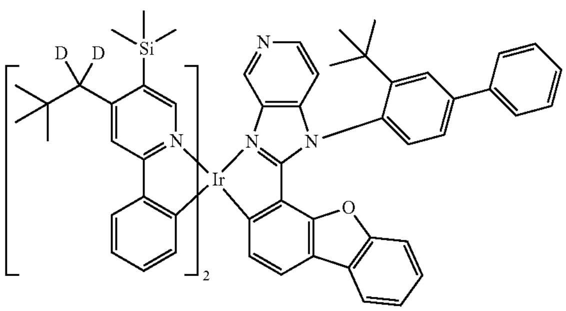
1845
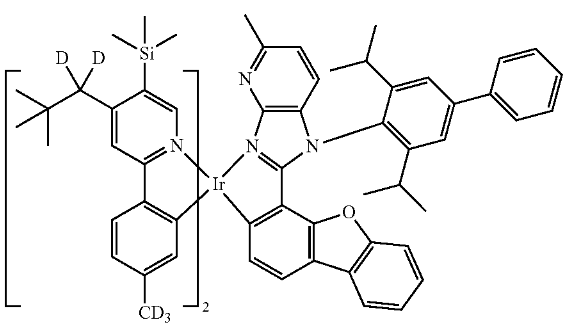
1846
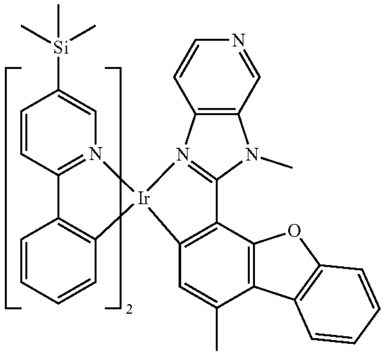
1847
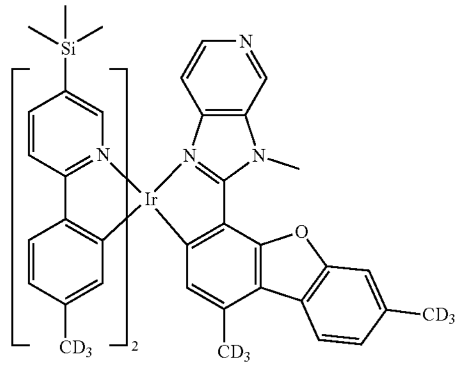
1848
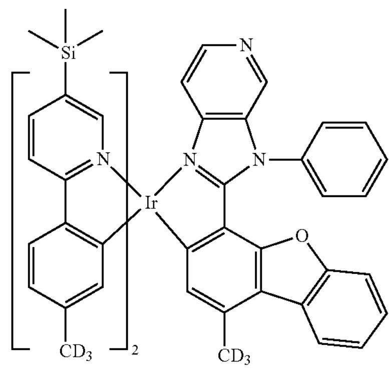
1849
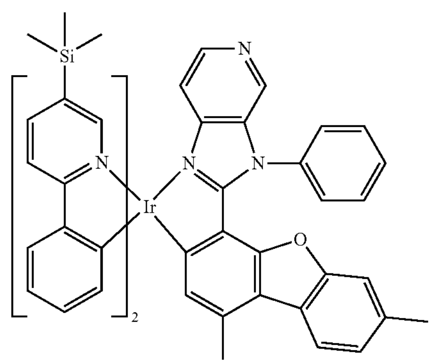
1850
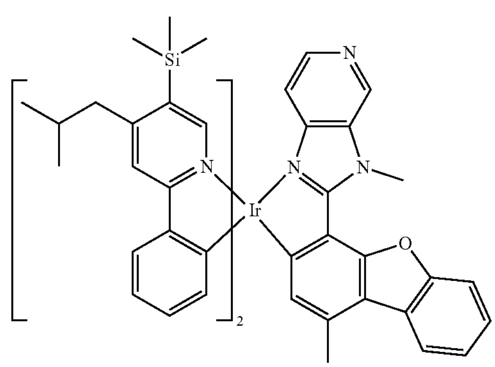

-continued
1851
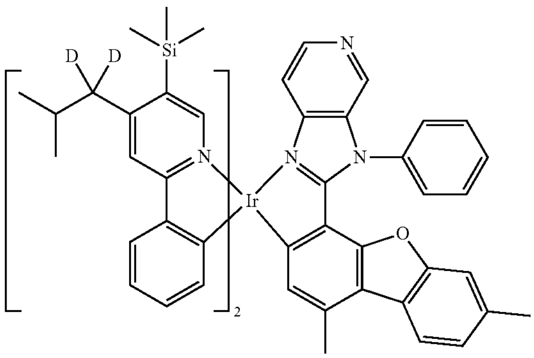
1852
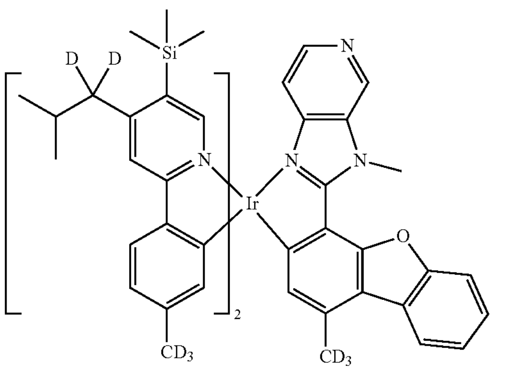
1853
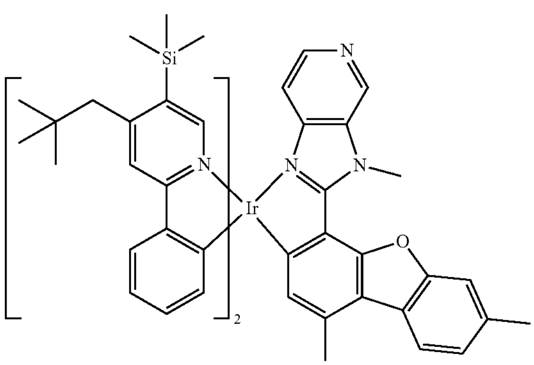
1854
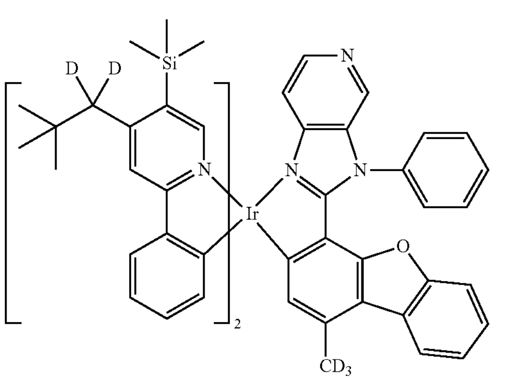
-continued
1855
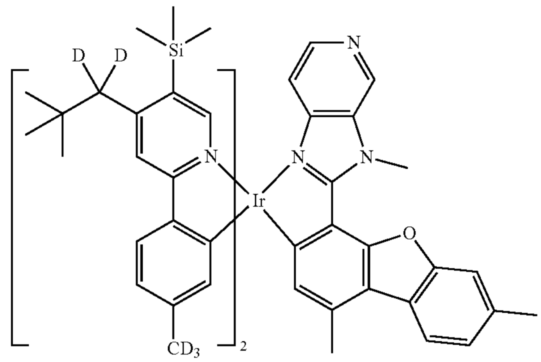
1856
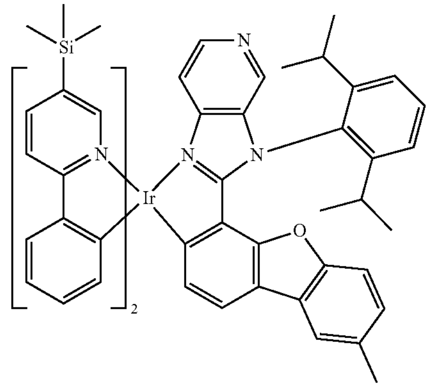
1857
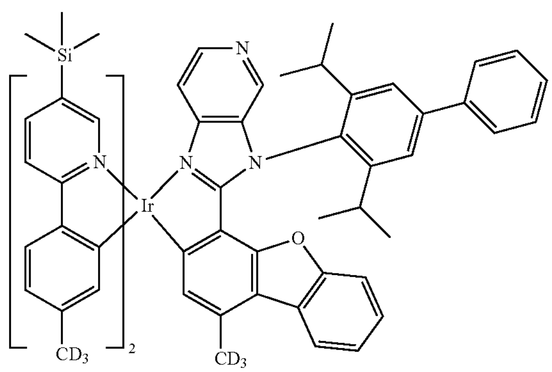
1858
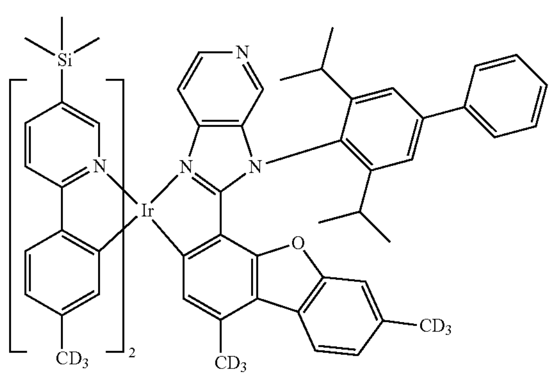

-continued
1859
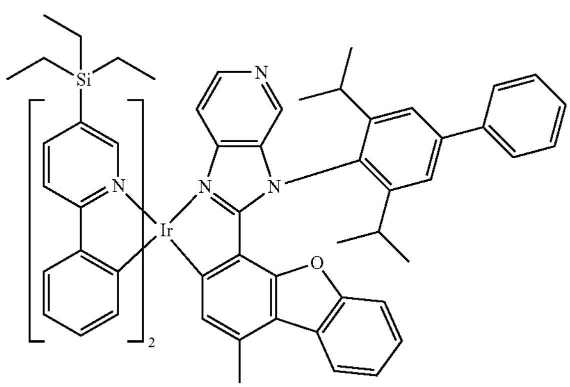
1860
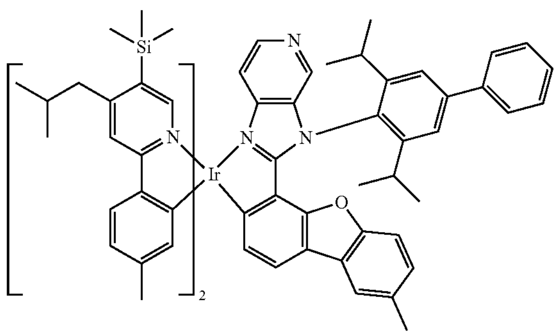
1861
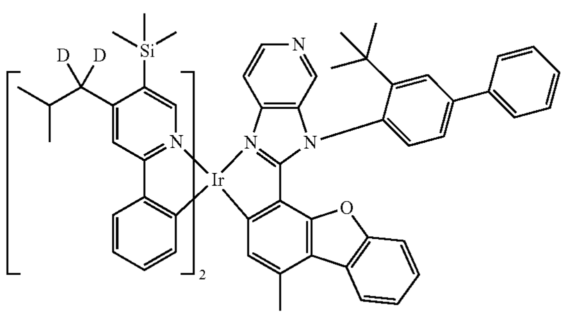
1862
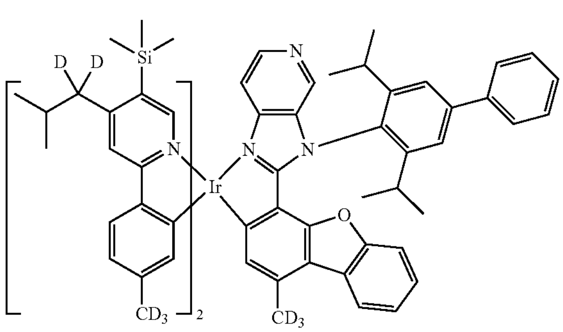
-continued
1863
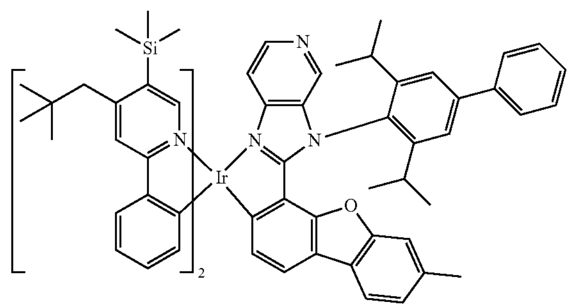
1864
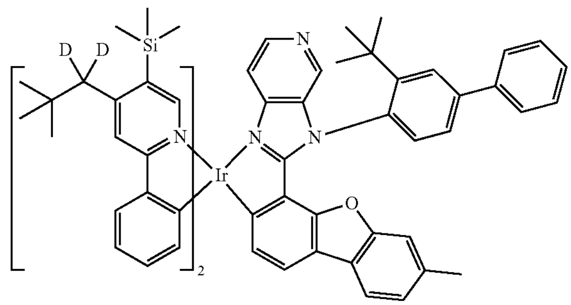
1865
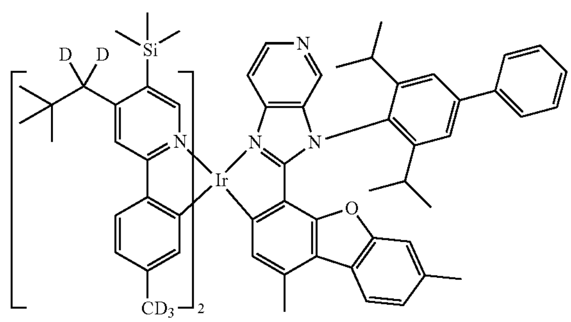
1866
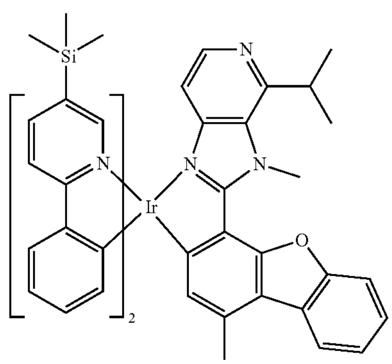

1867
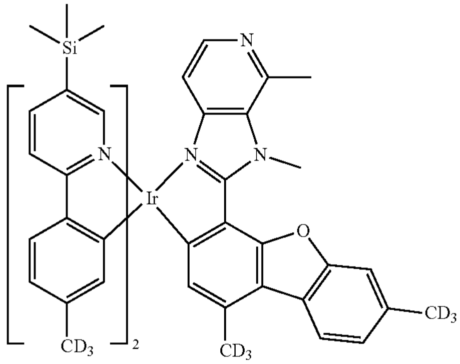
1868
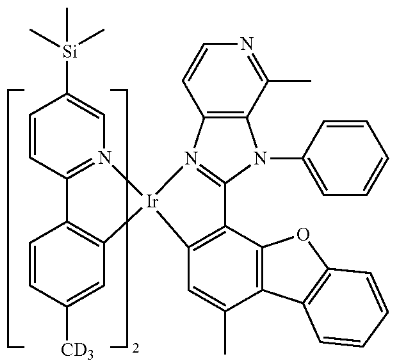
1869
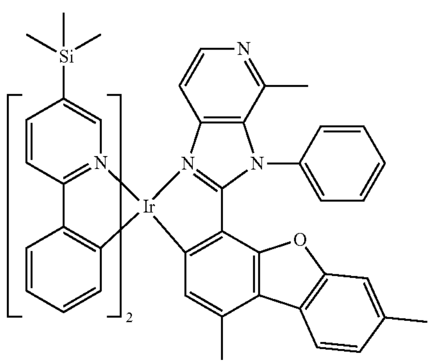
1870
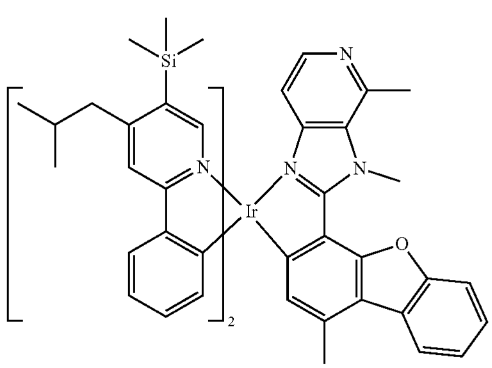
1871
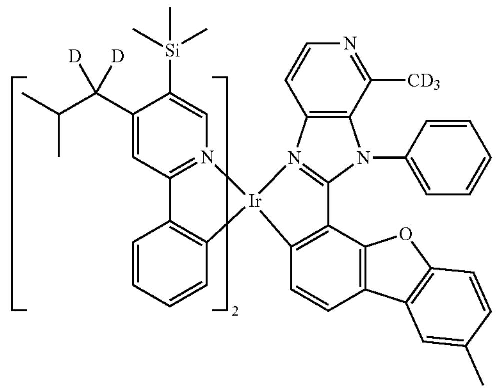
1872
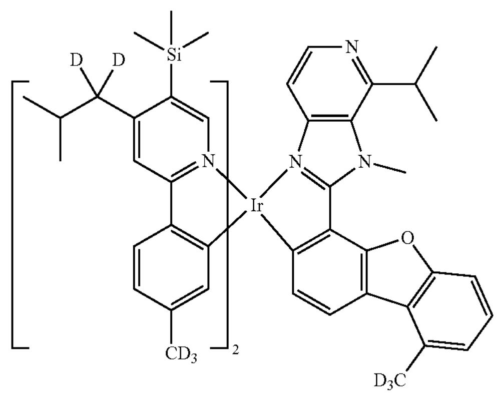
1873
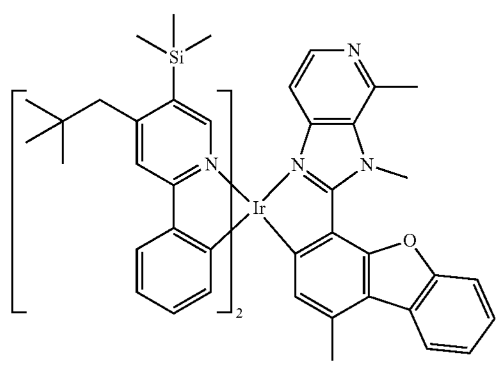
1874
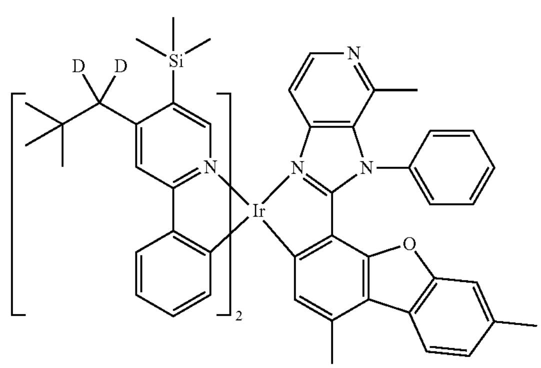

-continued
1875
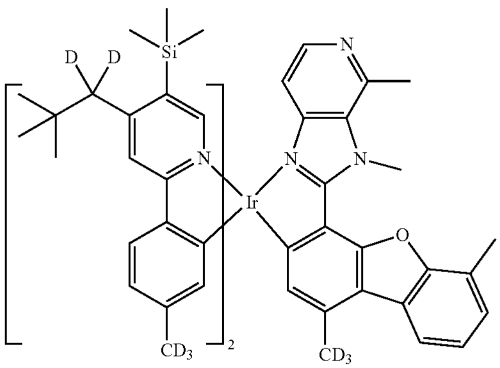
1876
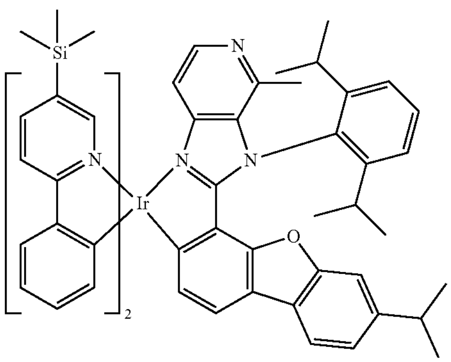
1877
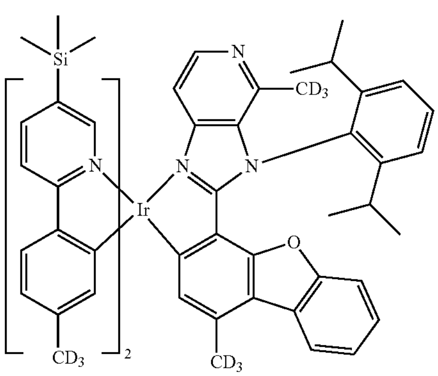
1878
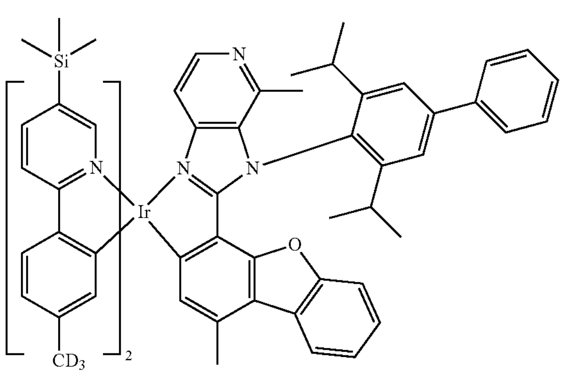
-continued
1879
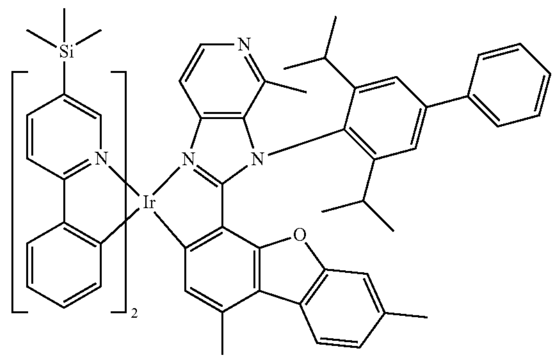
1880
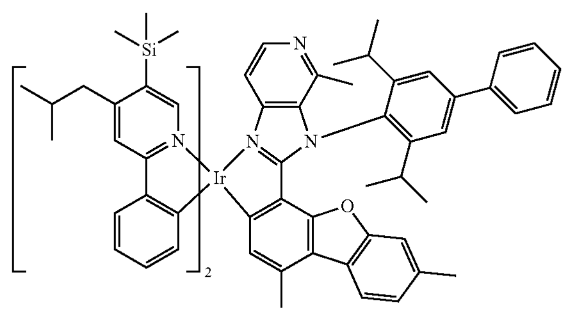
1881
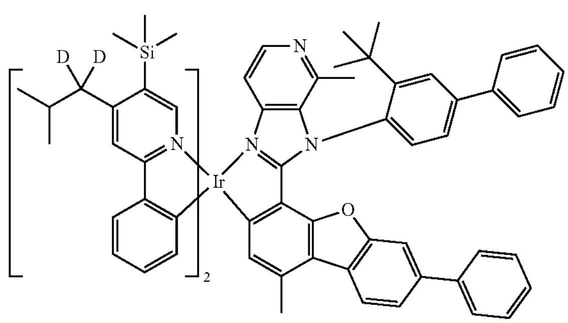
1882
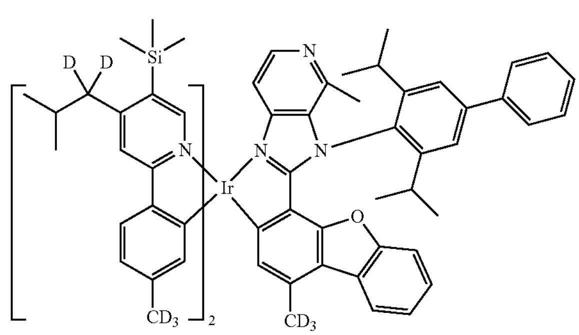

-continued
1883
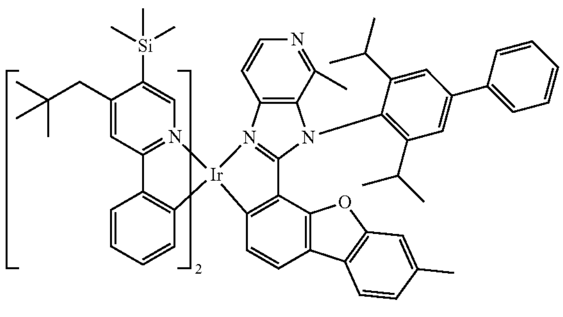
1884
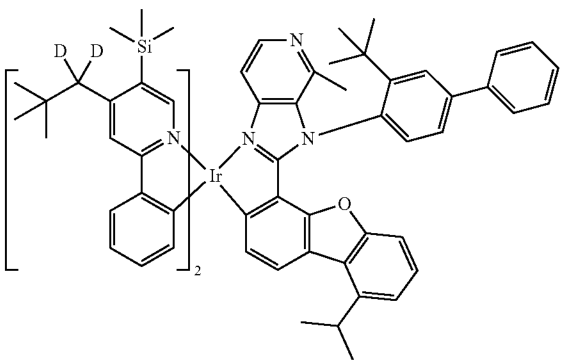
1885
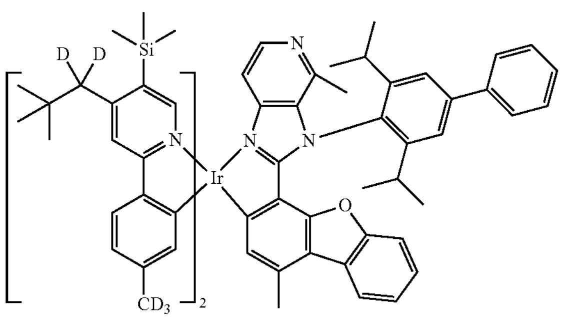
1886
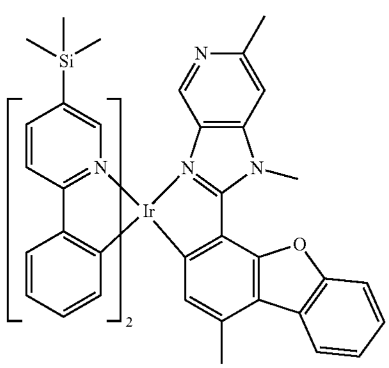
-continued
1887
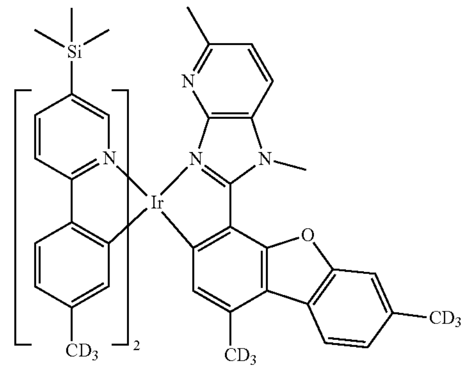
1888
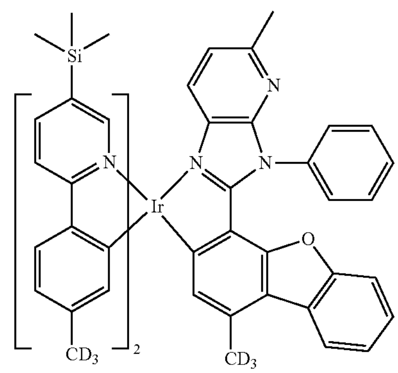
1889
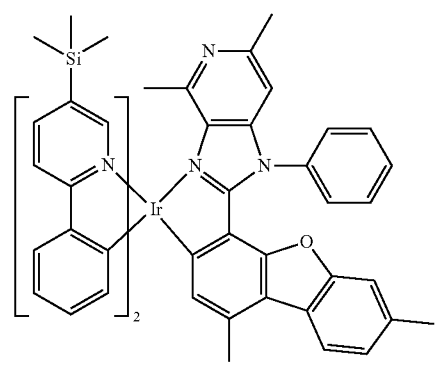
1890
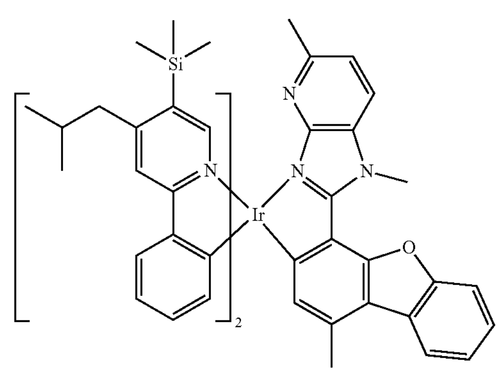

-continued
1891
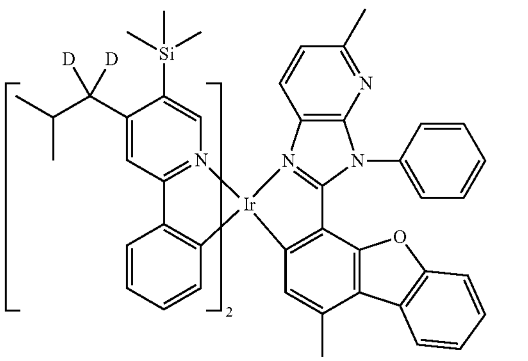
1892
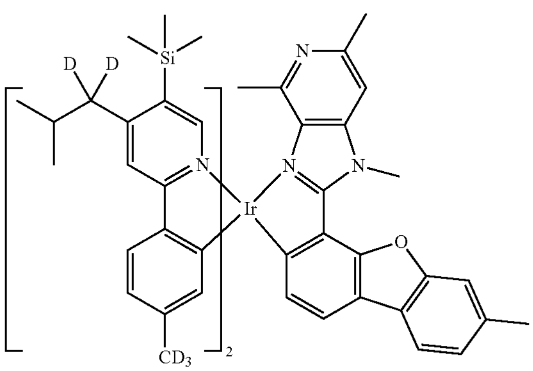
1893
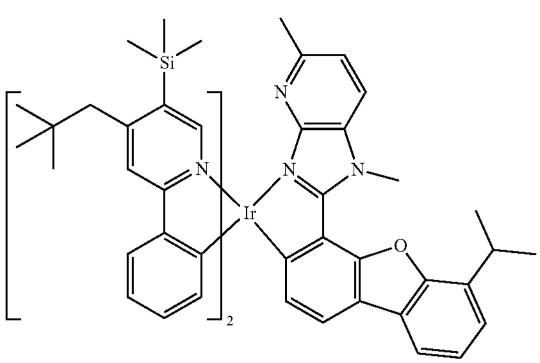
1894
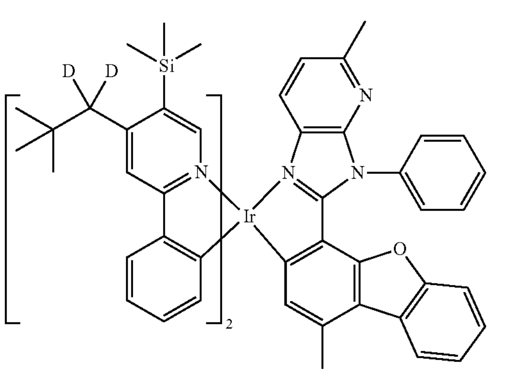
-continued
1895
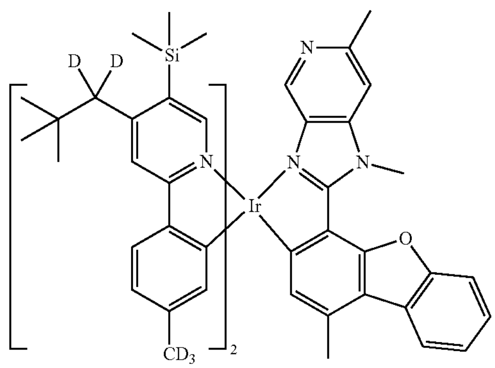
1896
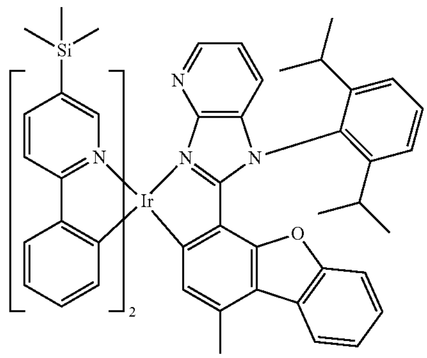
1897
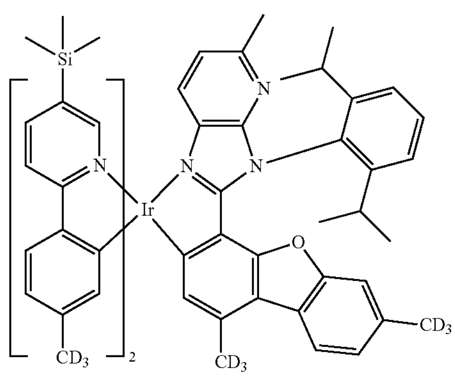
1898
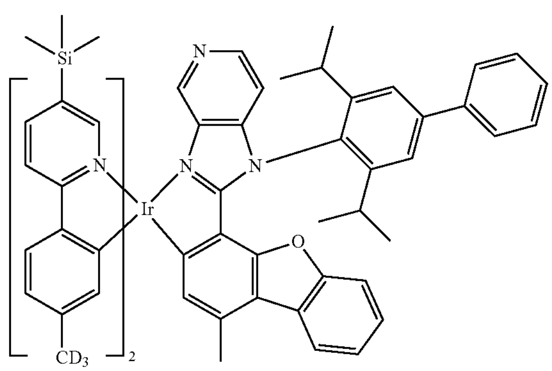

-continued
1899
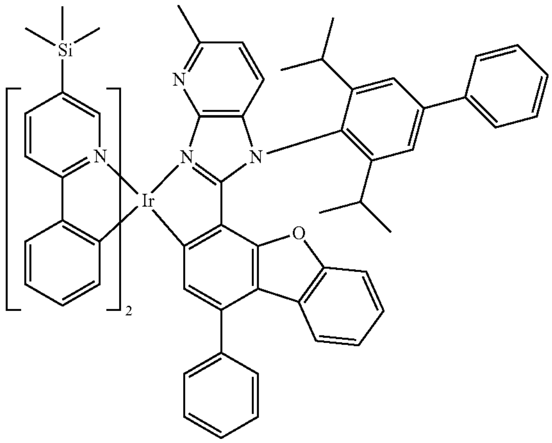
1900
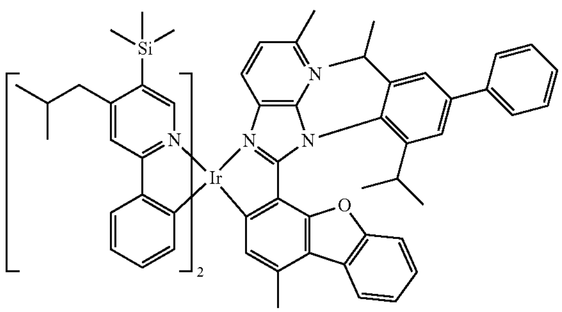
1901
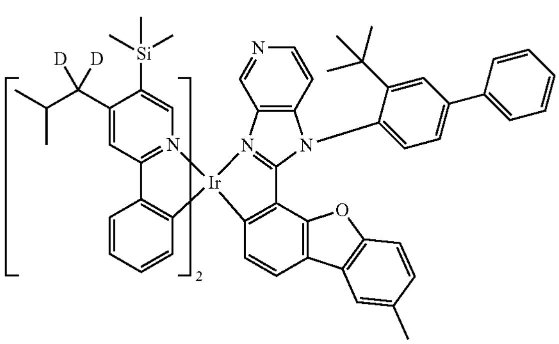
1902
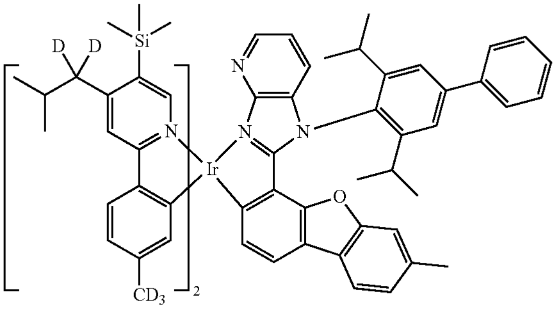
-continued
1903
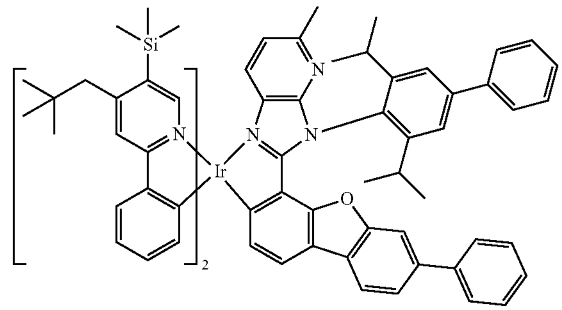
1904
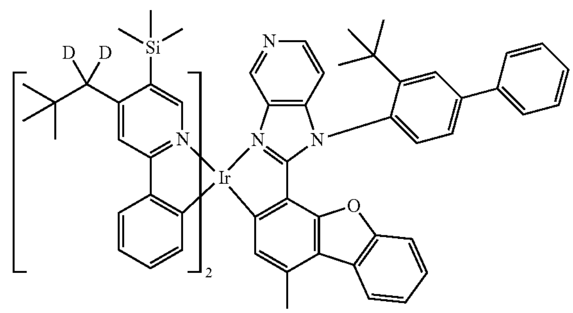
1905
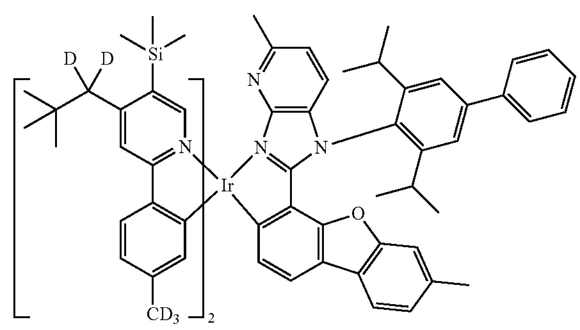
1906
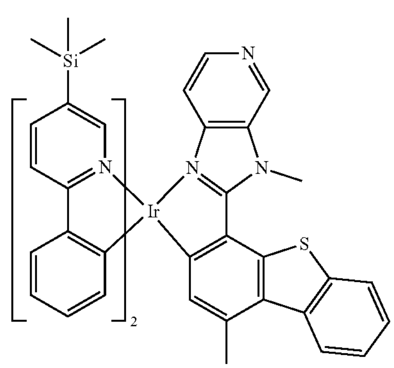

1907
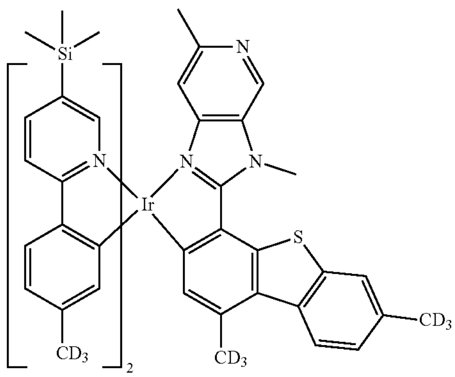
1908
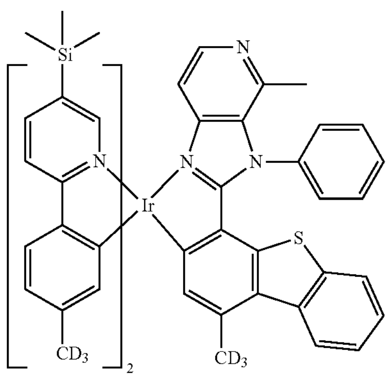
1909
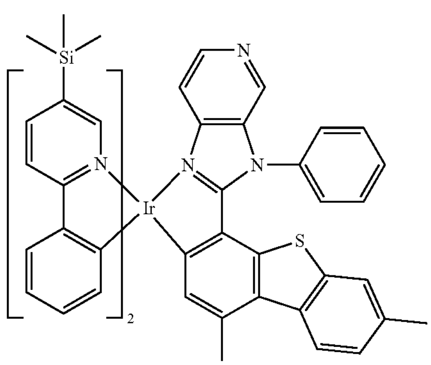
1910
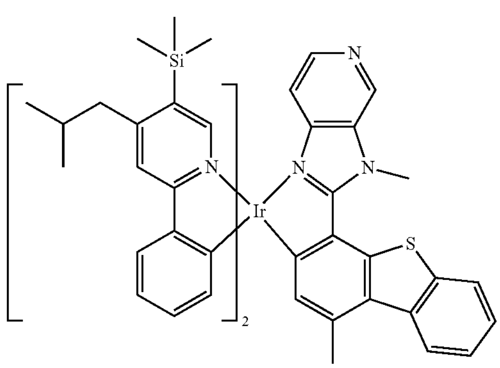
1911
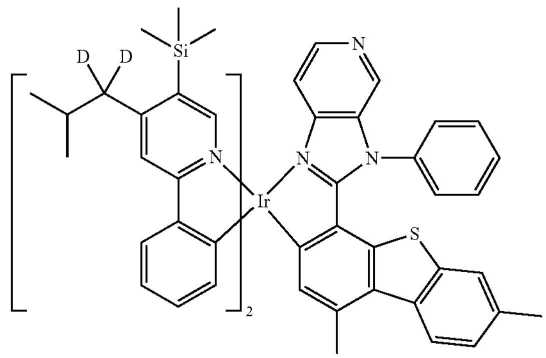
1912
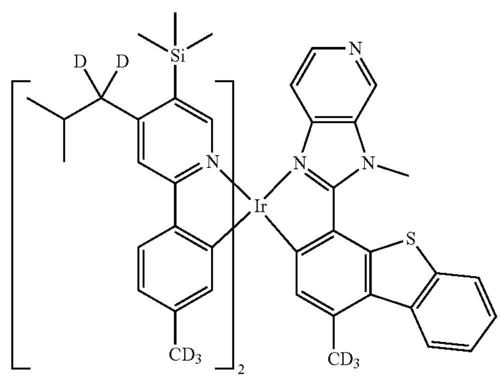
1913
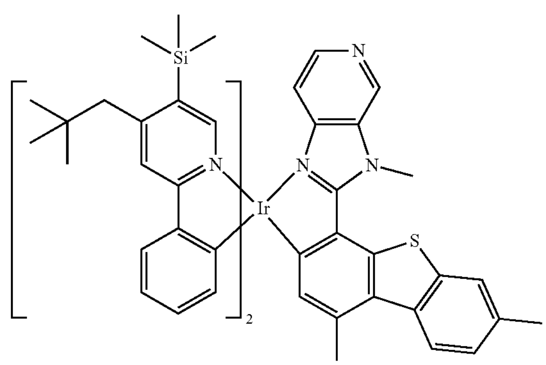
1914
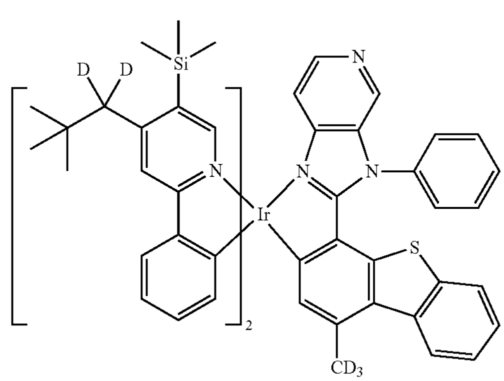

1915
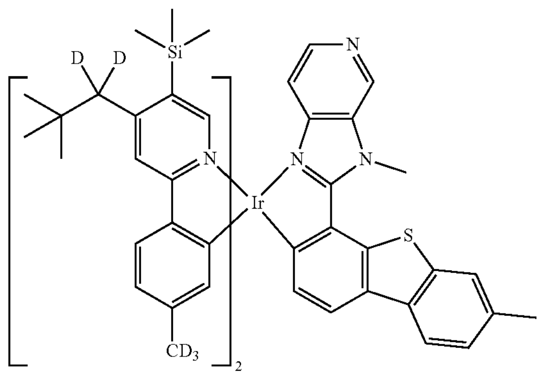
1916
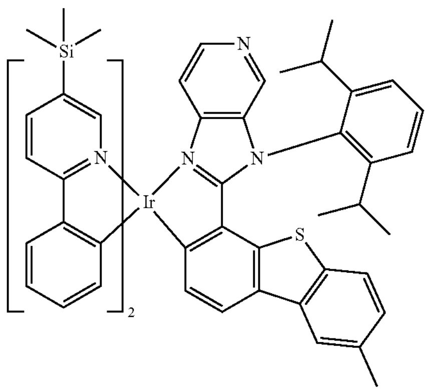
1917
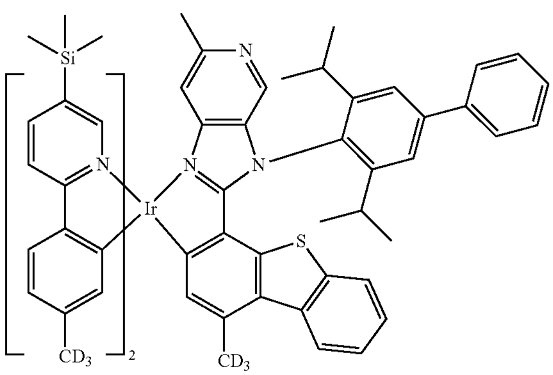
1918
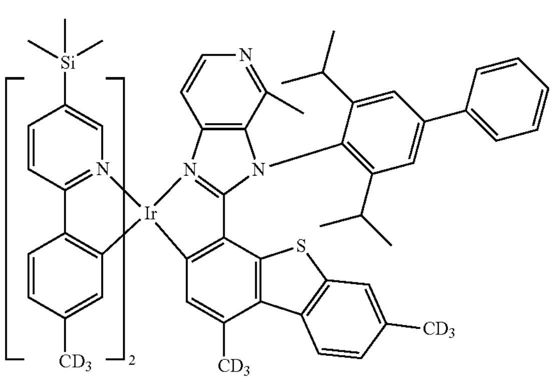
1919
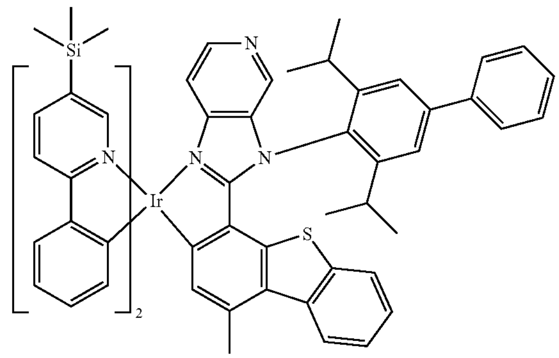
1920
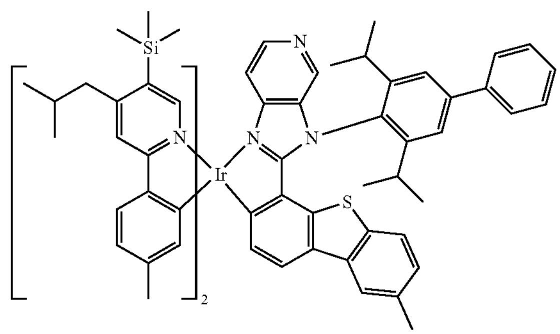
1921
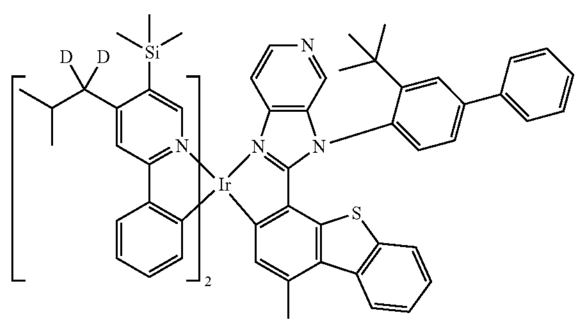
1922
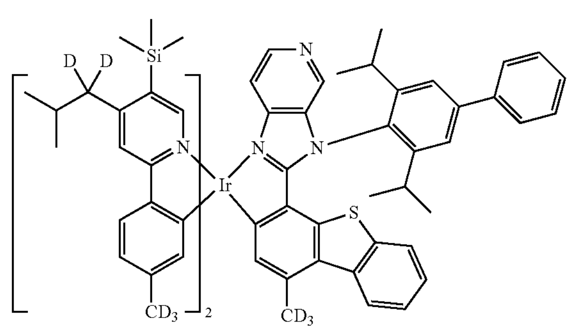

-continued
1923
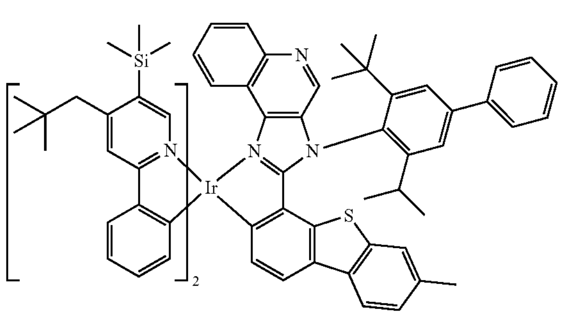
1924
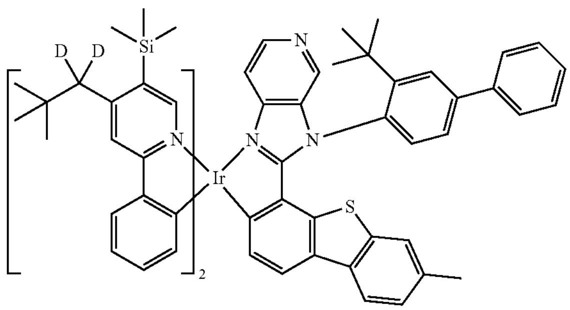
1925
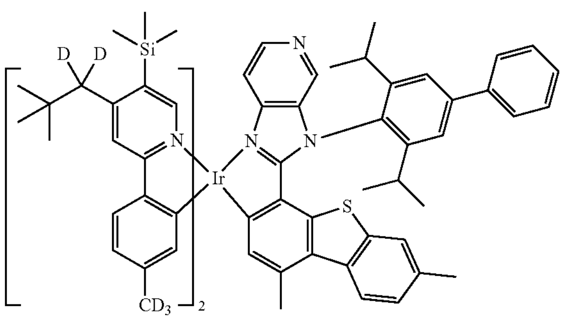
1926
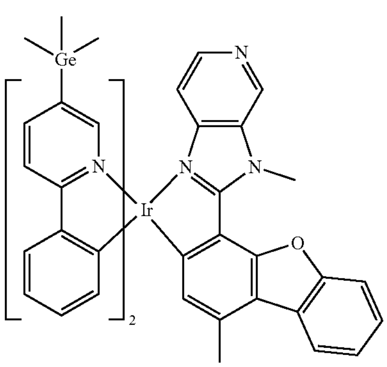
-continued
1927
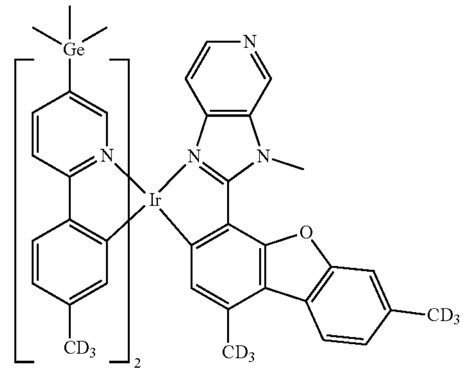
1928
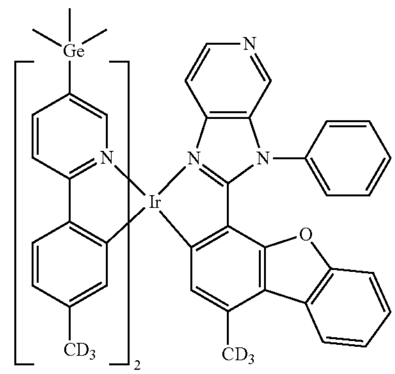
1929
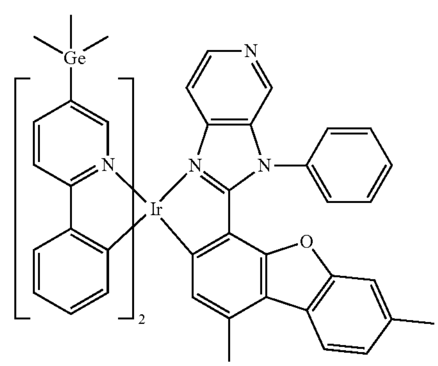
1930
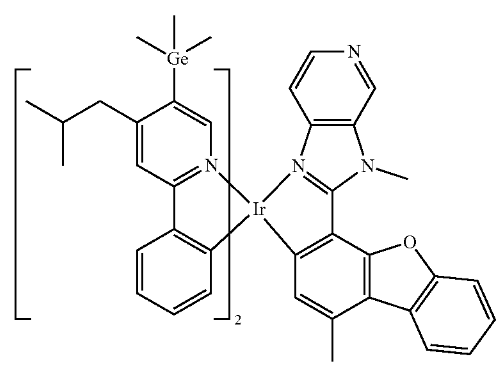

-continued
1931
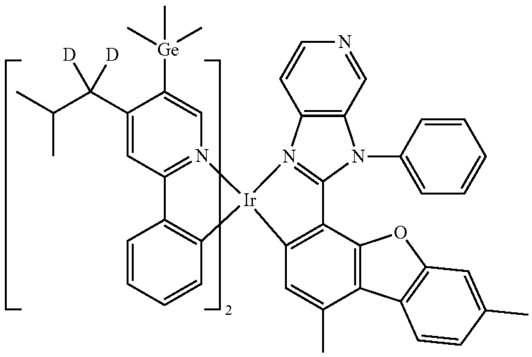
1932
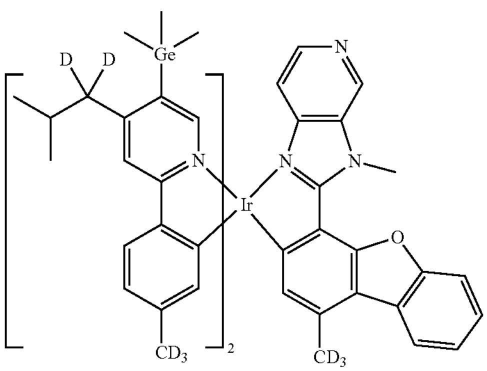
1933
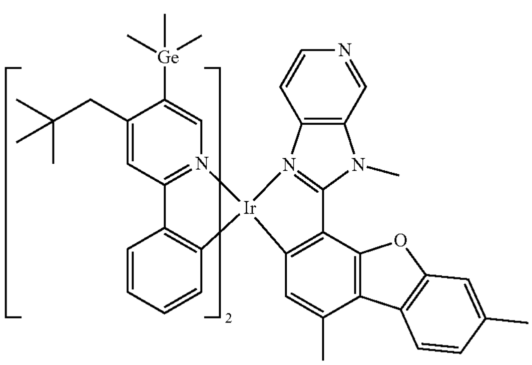
1934
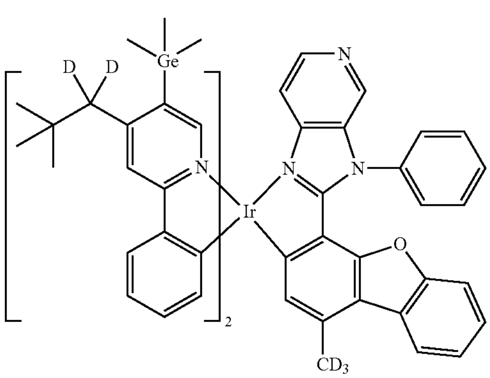
-continued
1935
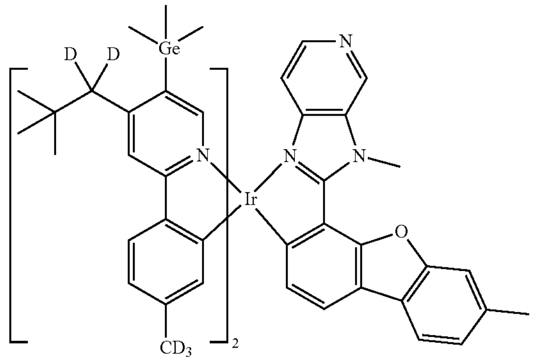
1936
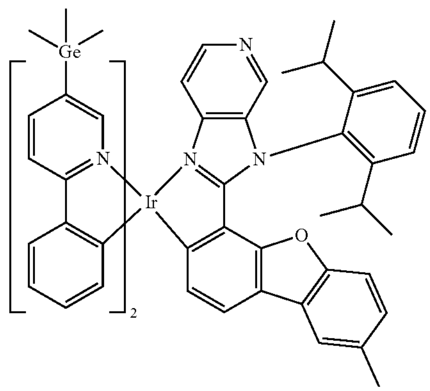
1937
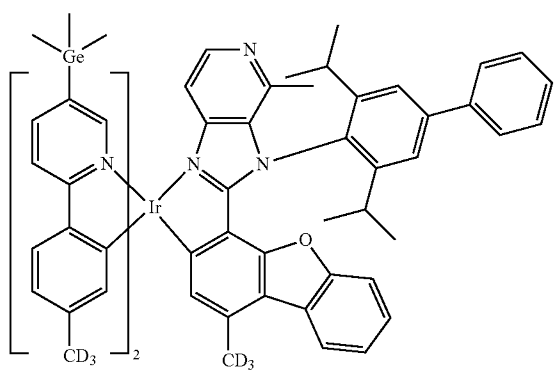
1938
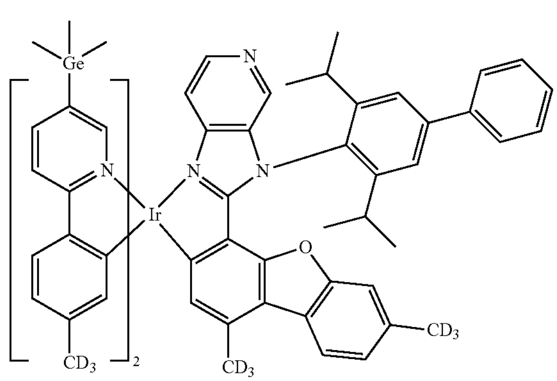

1939
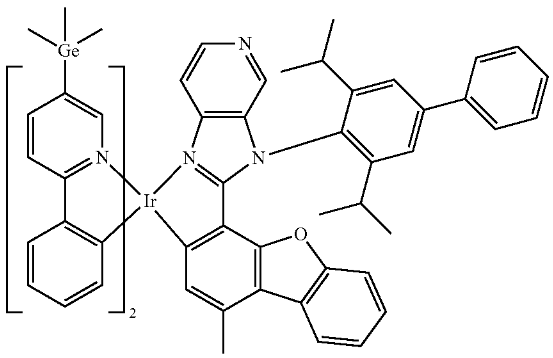
1940
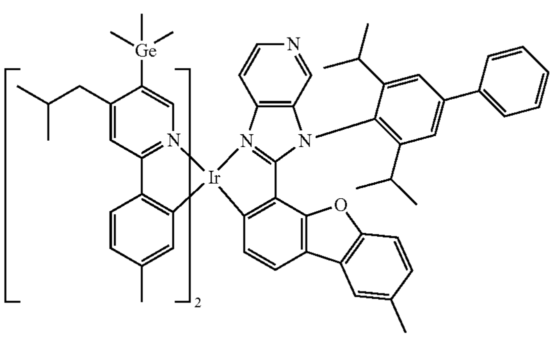
1941
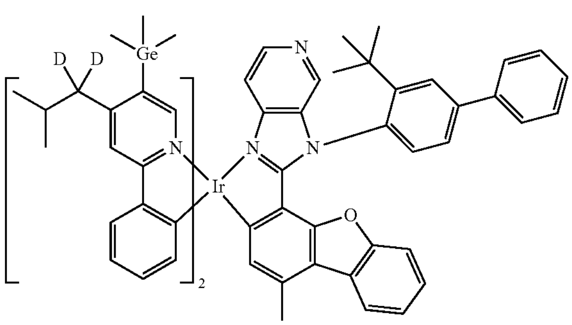
1942
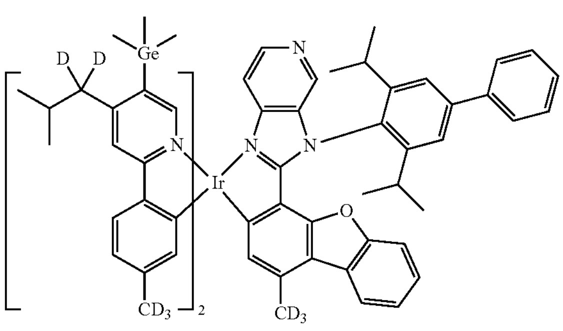
1943
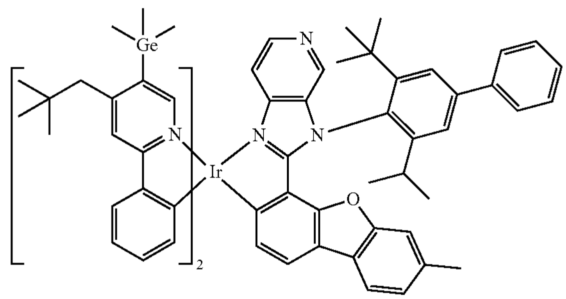
1944
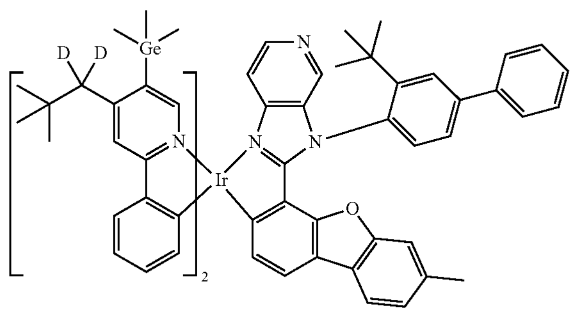
1945
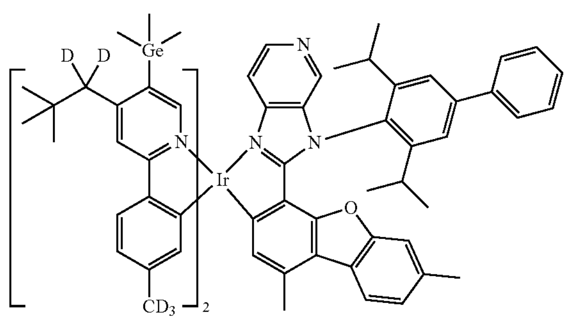
1946
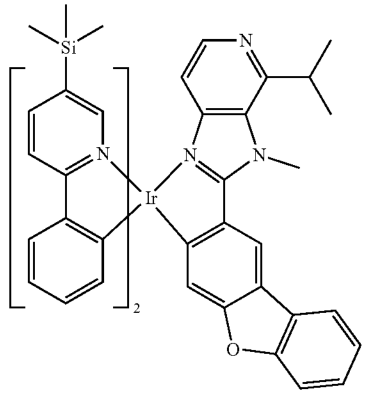

1947
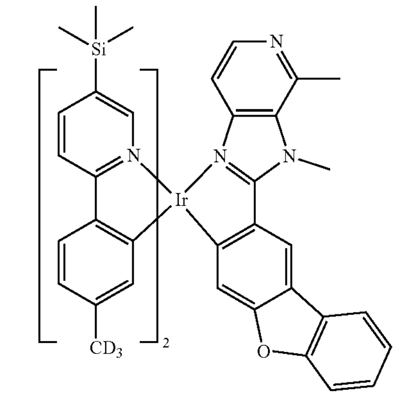
1948
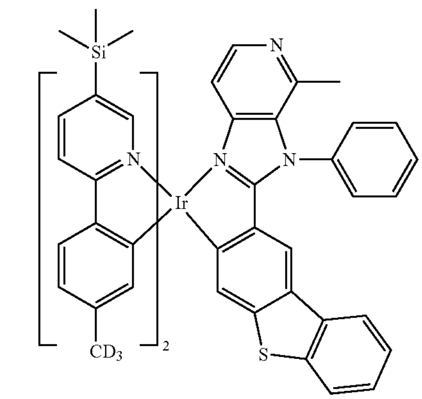
1949
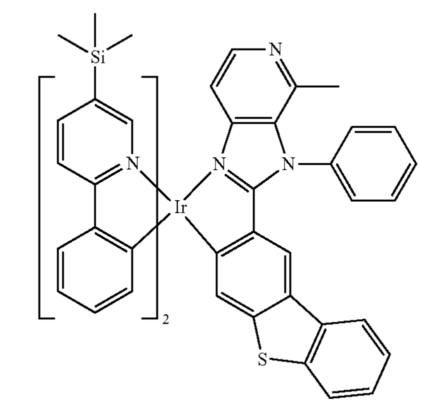
1950
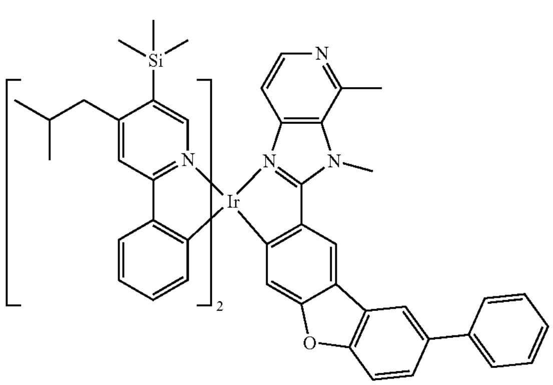
1951
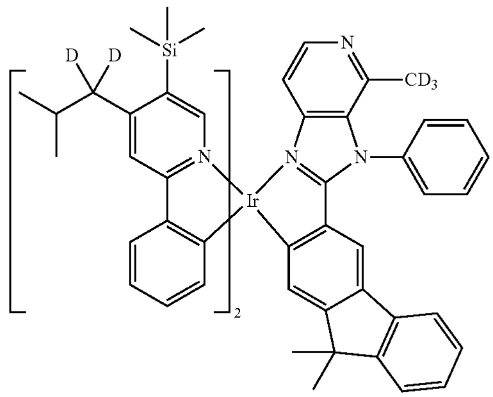
1952
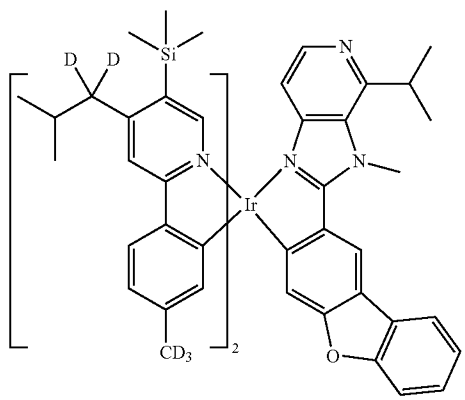
1953
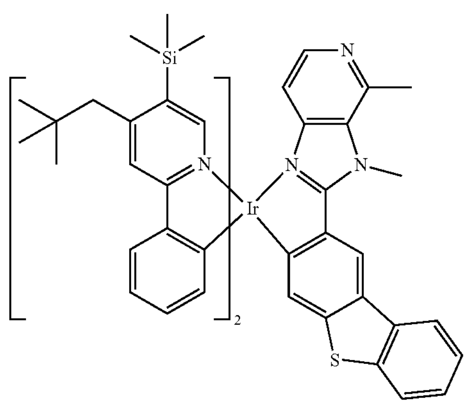
1954
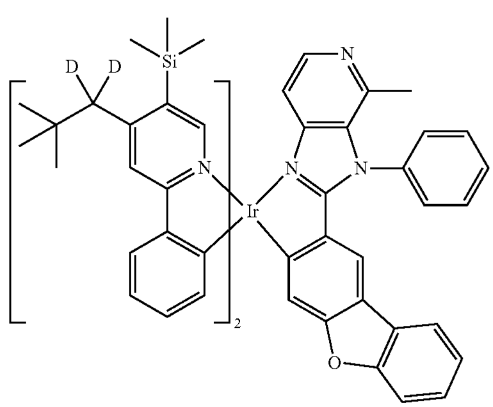

-continued
1955
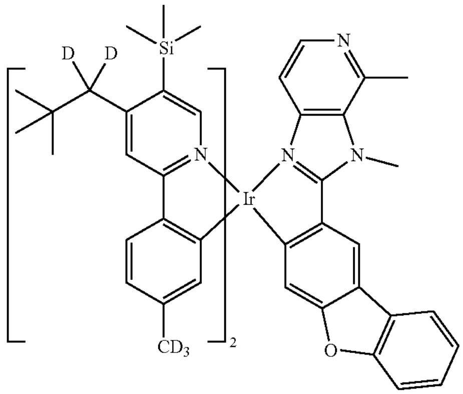
1956
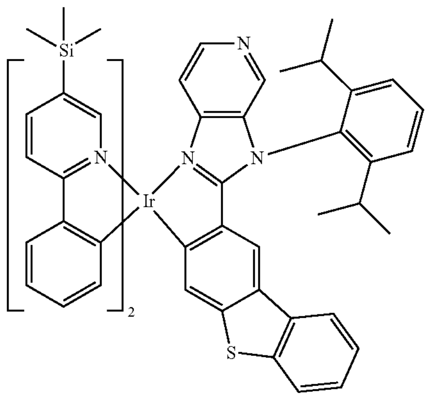
1957
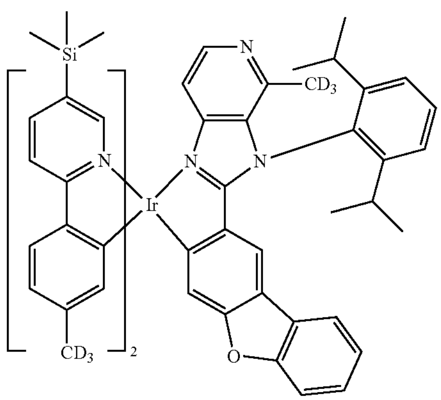
1958
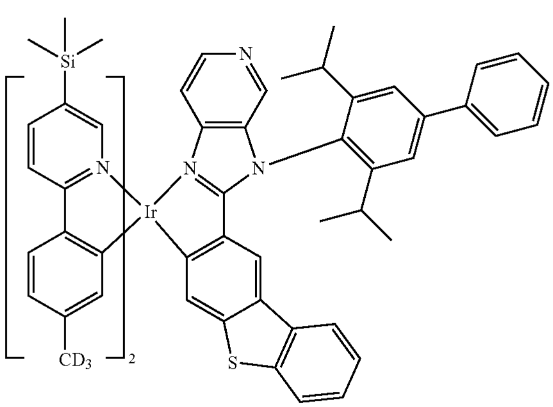
-continued
1959
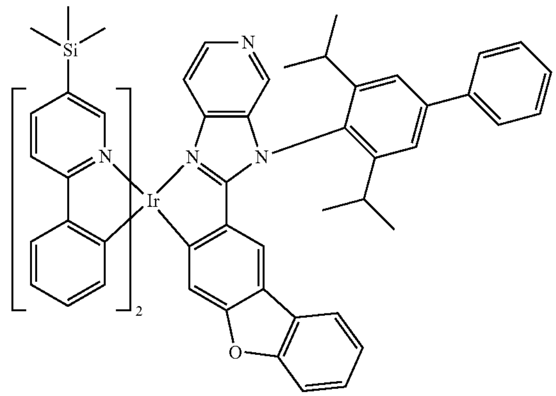
1960
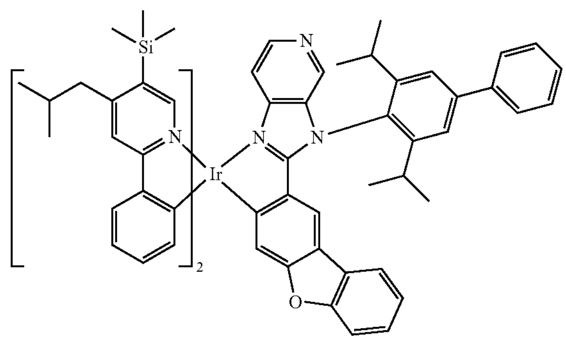
1961
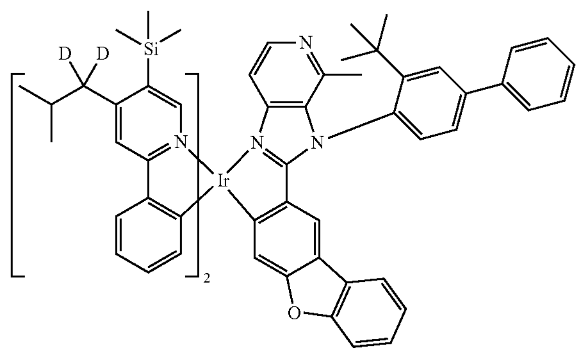
1962
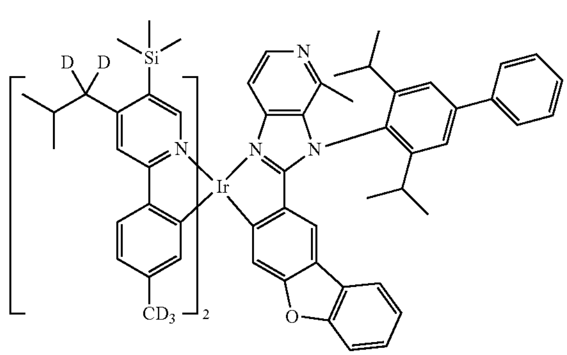

-continued
1963
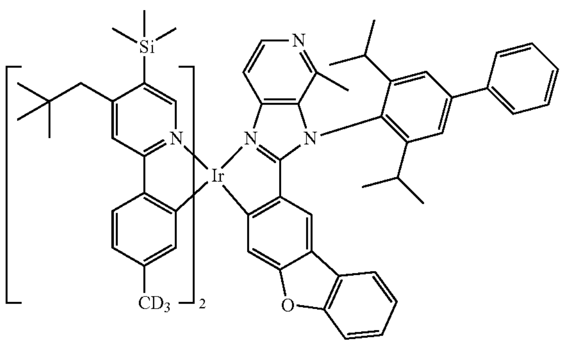
1964
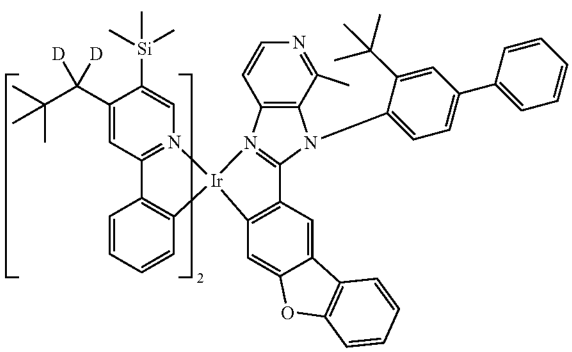
1965
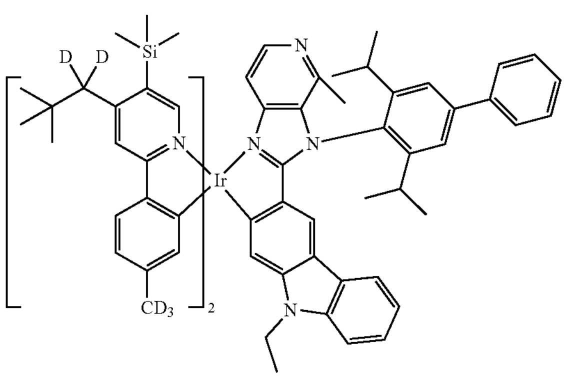
1966
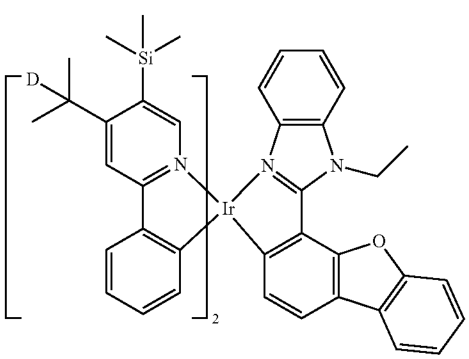
-continued
1967
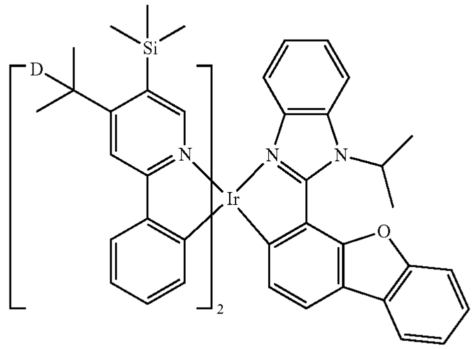
1968
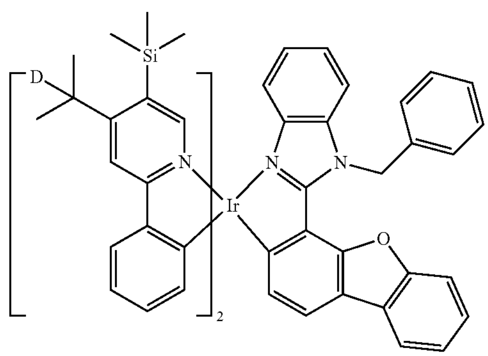
1969
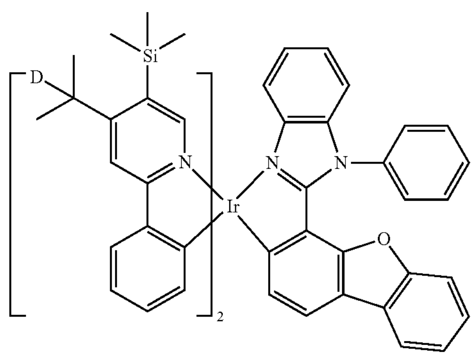
1970
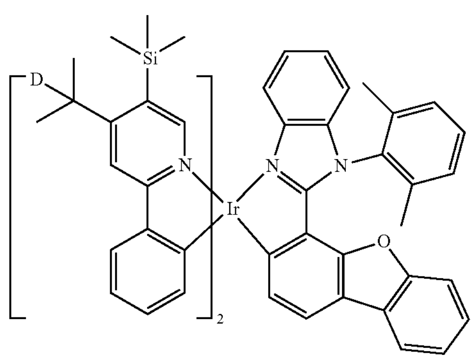

-continued
1971
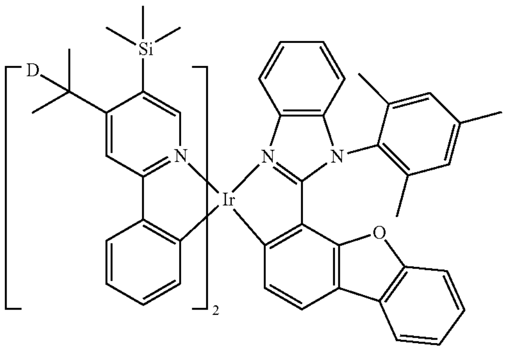
1972
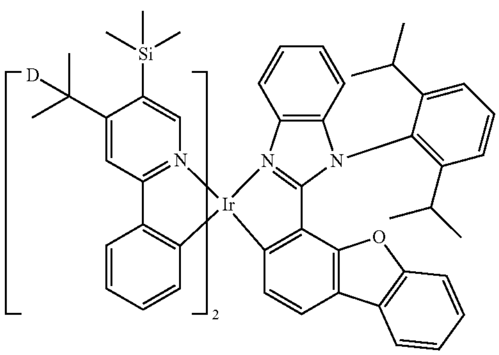
1973
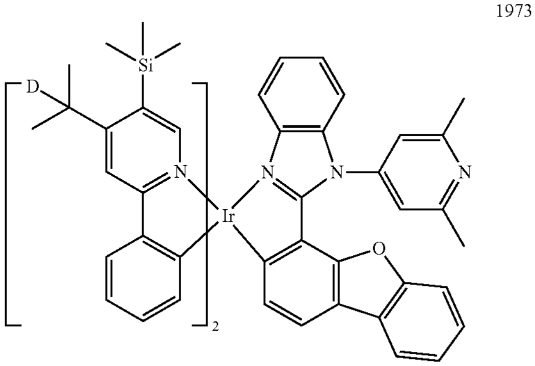
1974
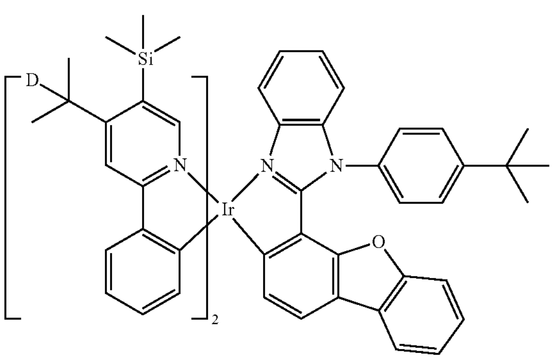
-continued
1975
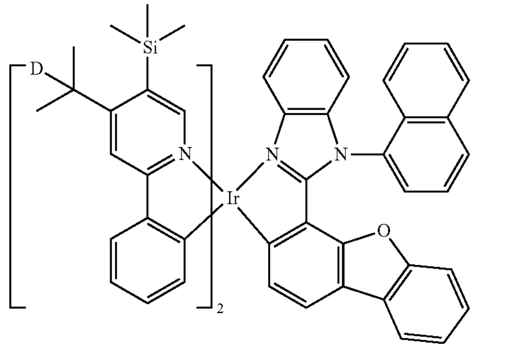
1976
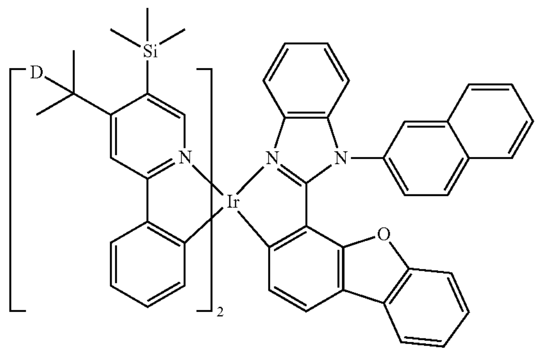
1977
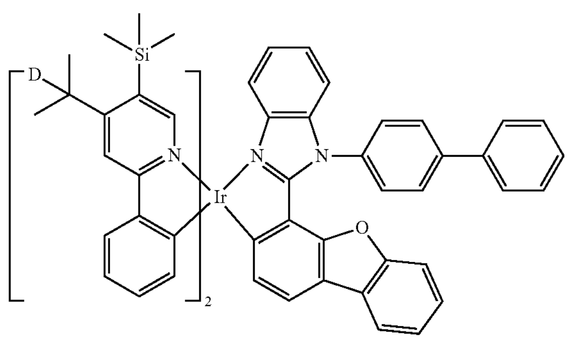
1978
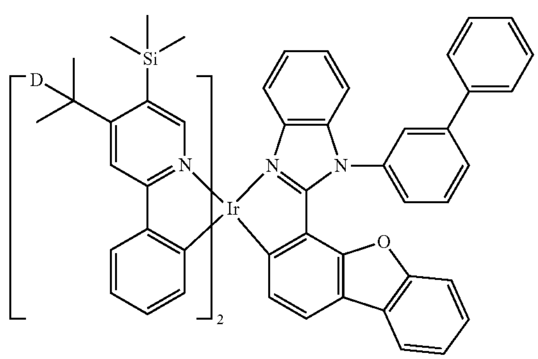

-continued
1979
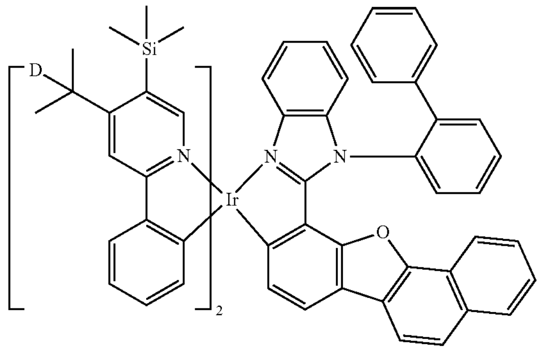
1980
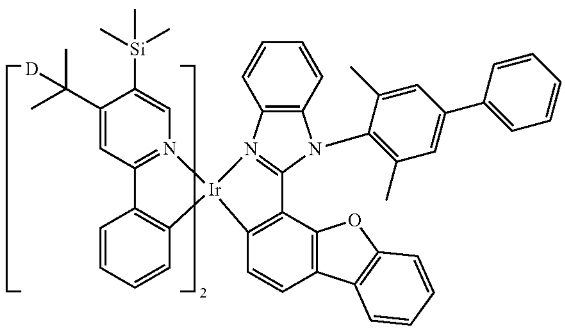
1981
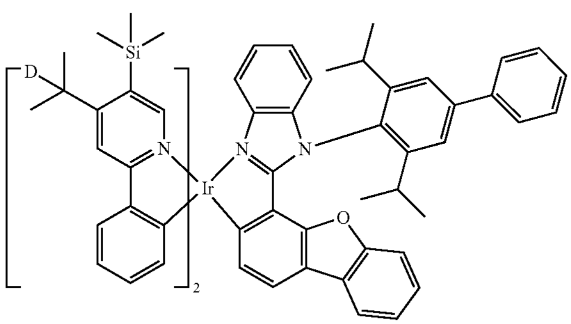
1982
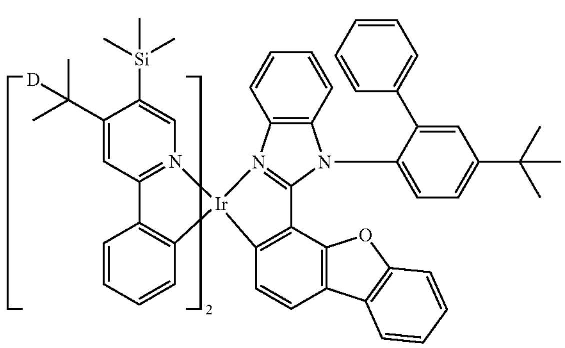
-continued
1983
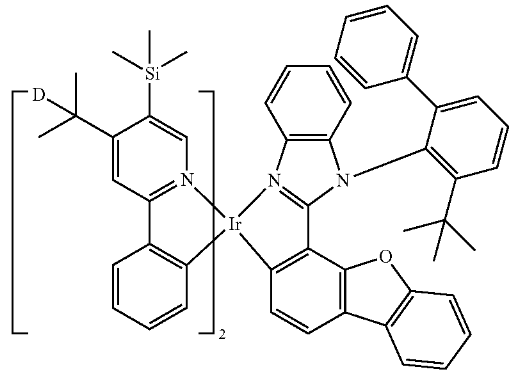
1984
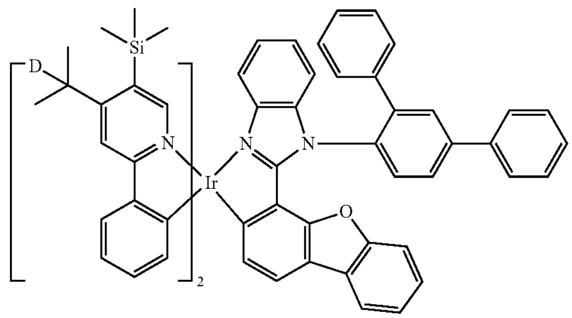
1985
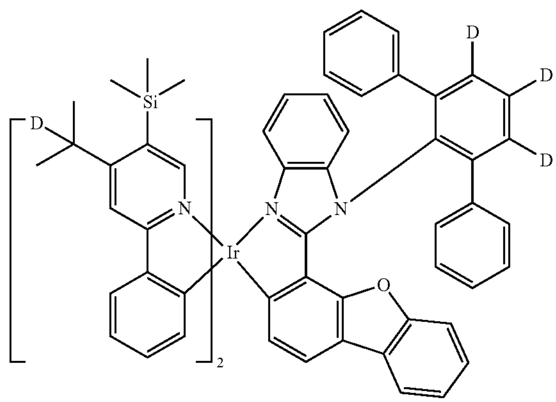
1986
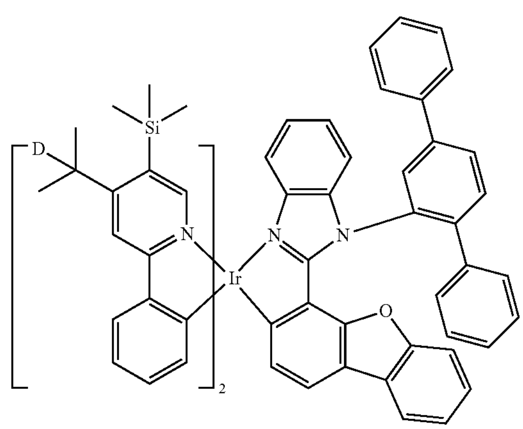

1987
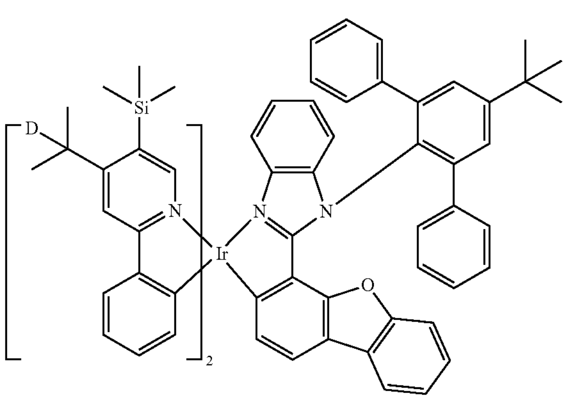
1988
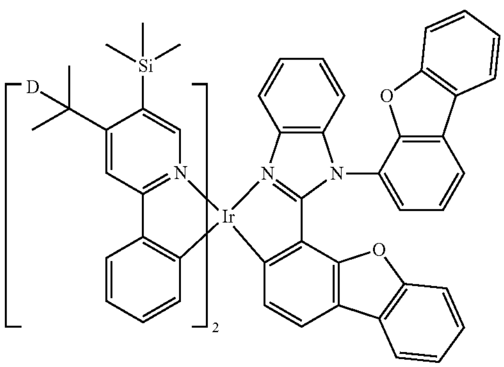
1989
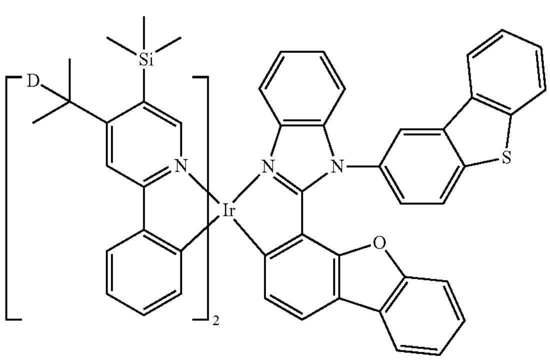
1990
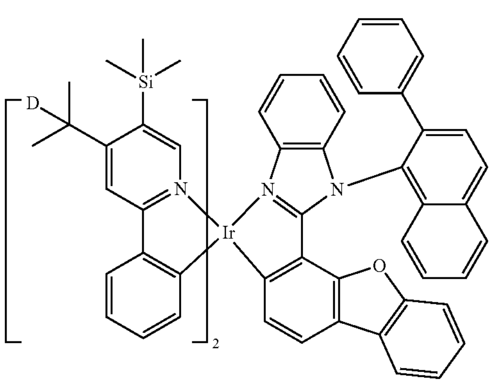
1991
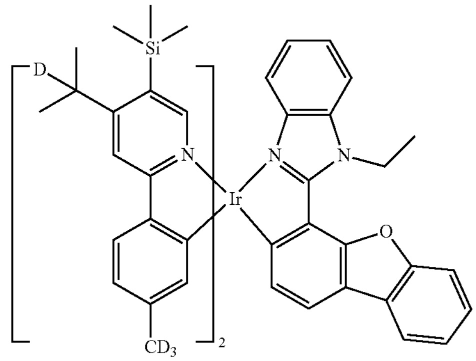
1992
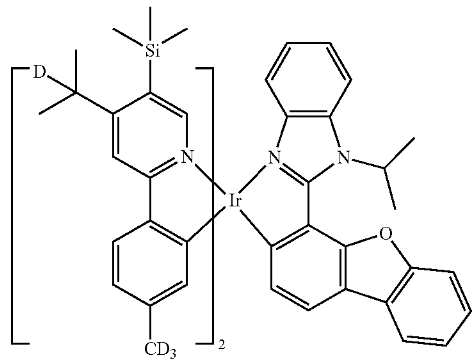
1993
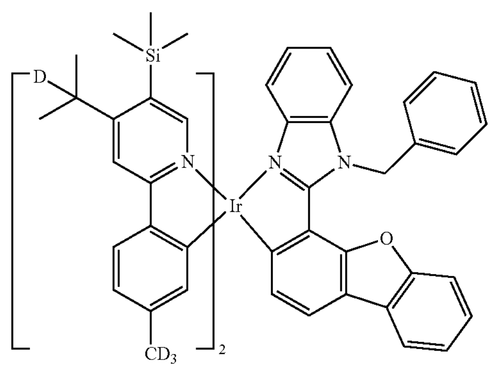
1994
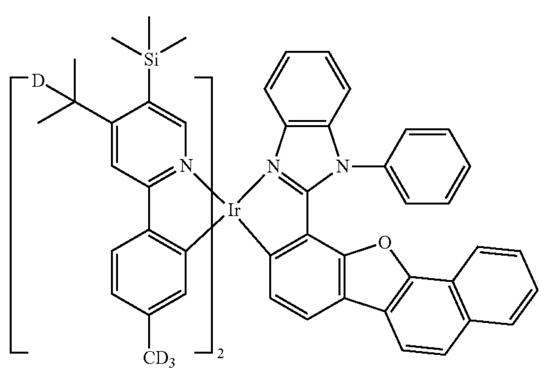

1995
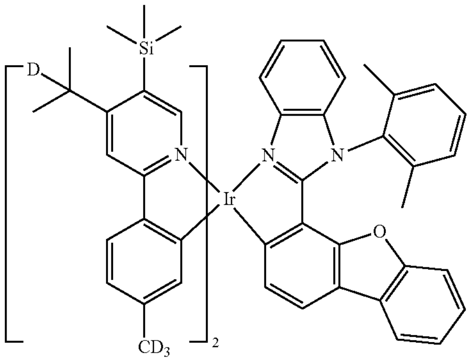
1996
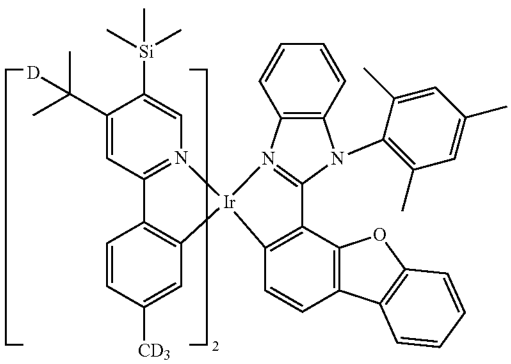
1997
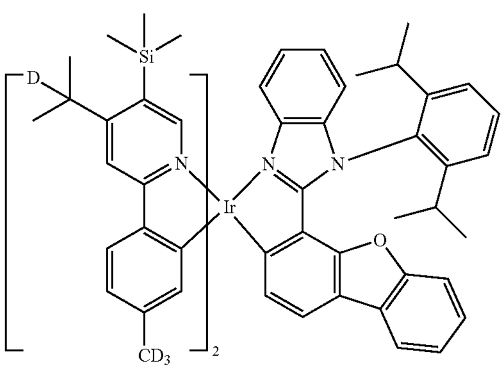
1998
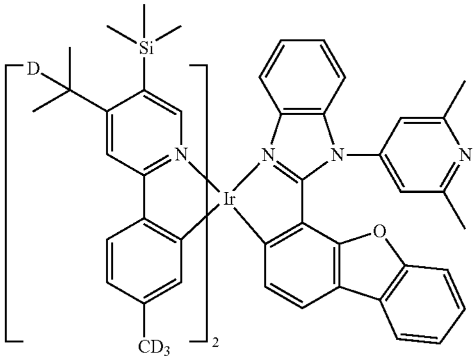
1999
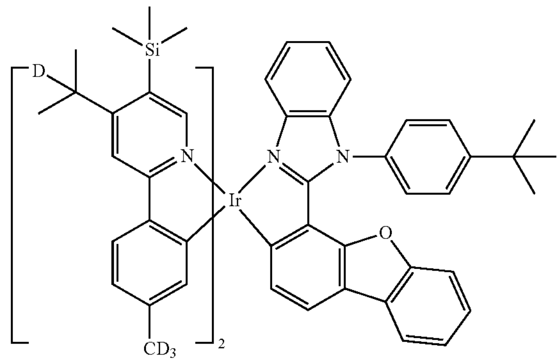
2000
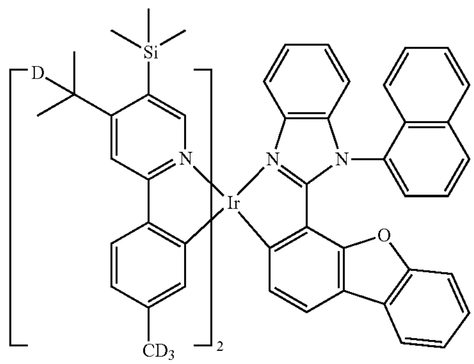
2001
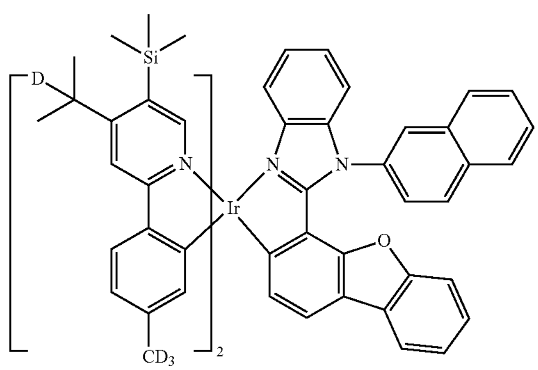
2002
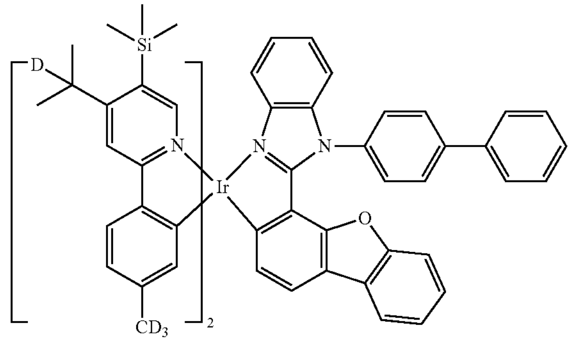

-continued
2003
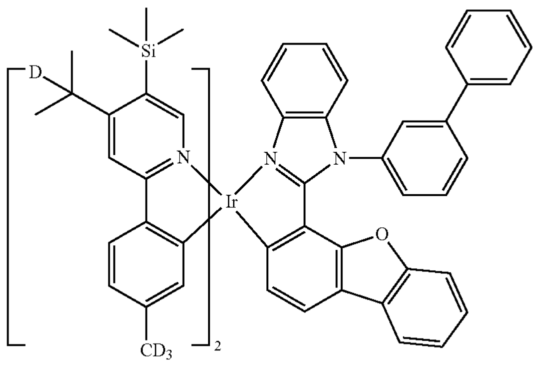
2004
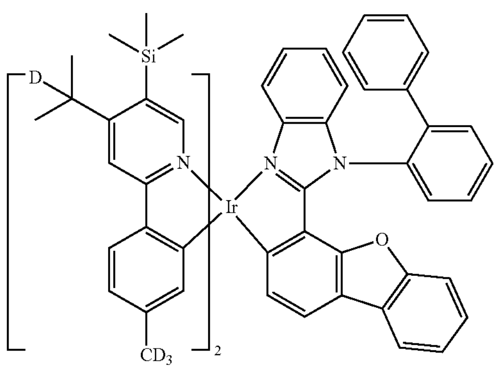
2005
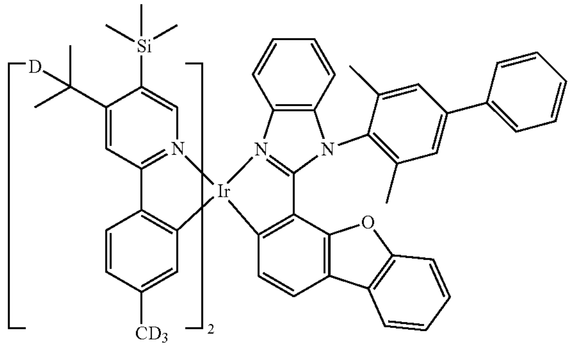
2006
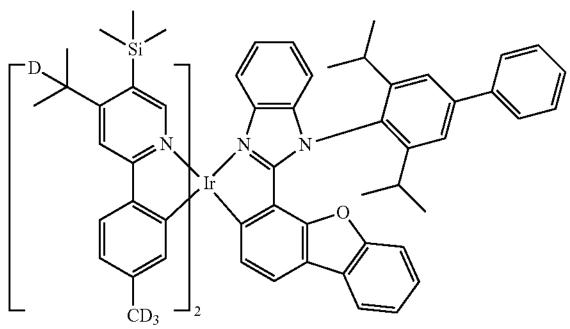
-continued
2007
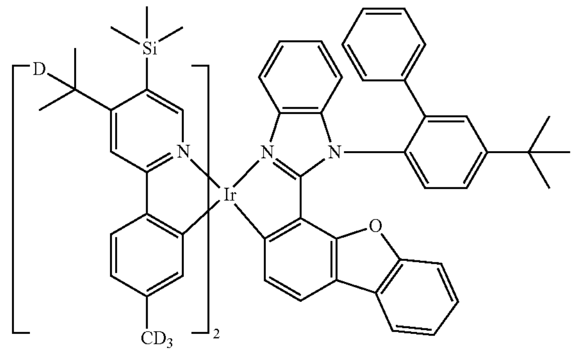
2008
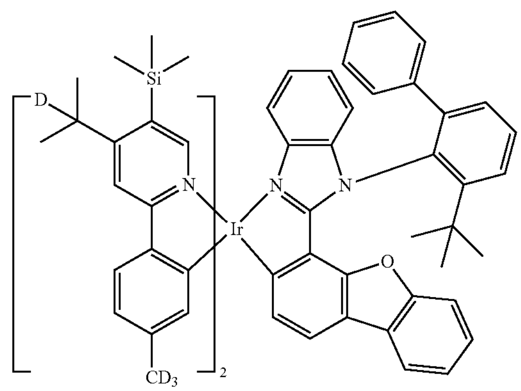
2009
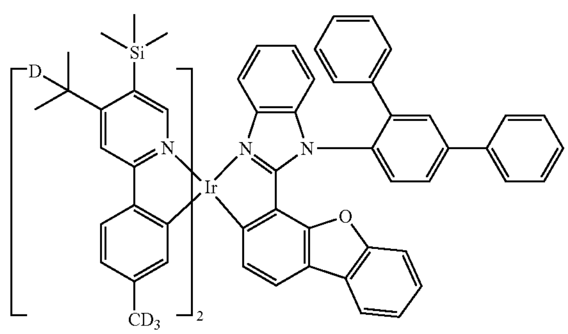
2010
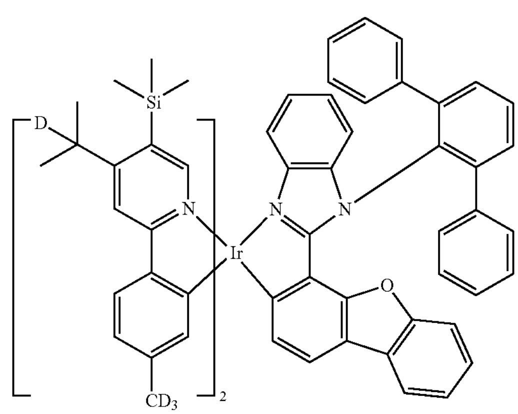

-continued
2011
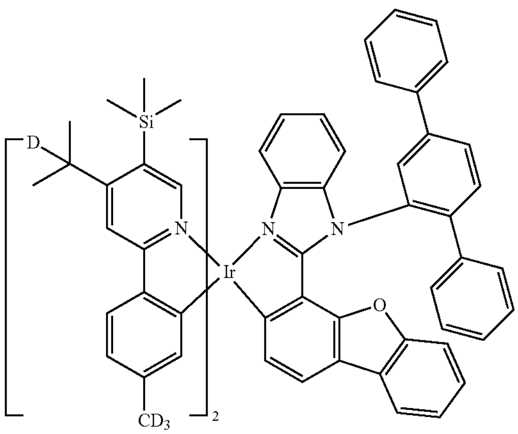
2012
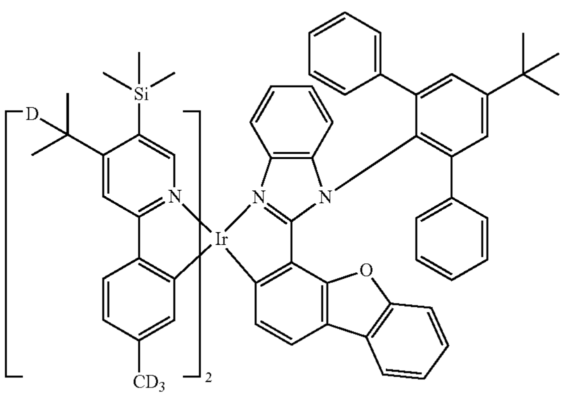
2013
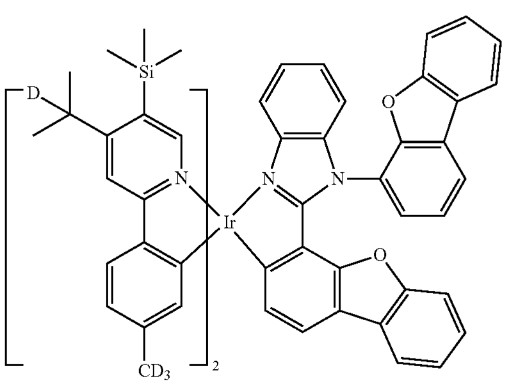
2014
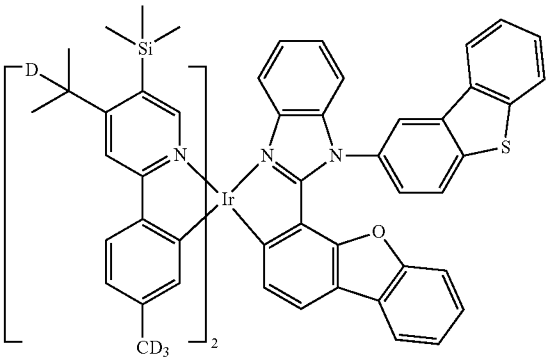
-continued
2015
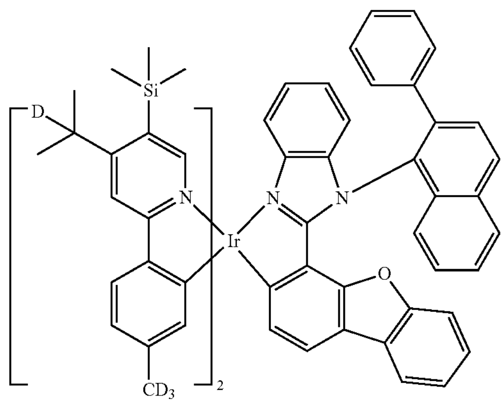
2016
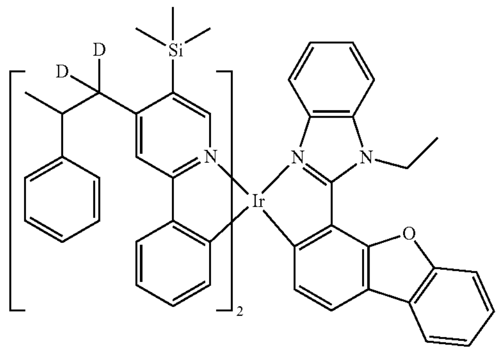
2017
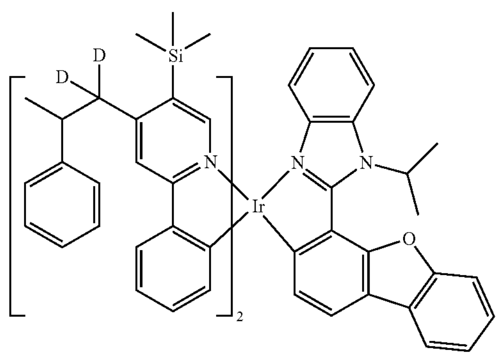
2018
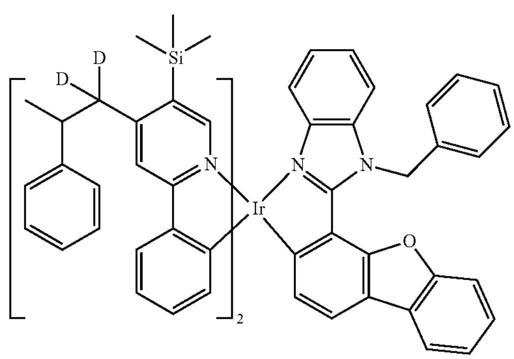

-continued
2019
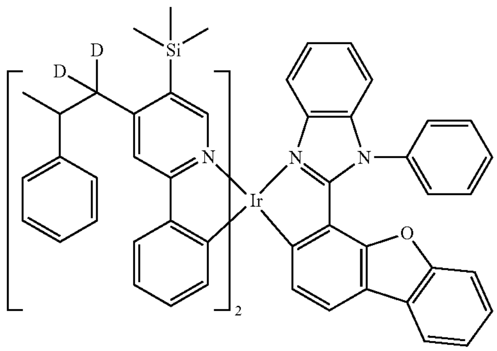
2020
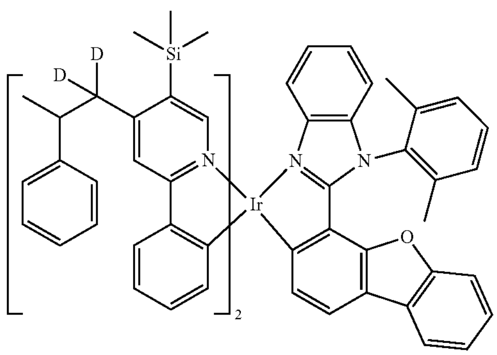
2021
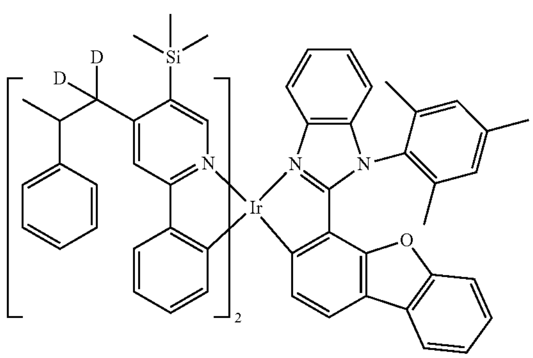
2022
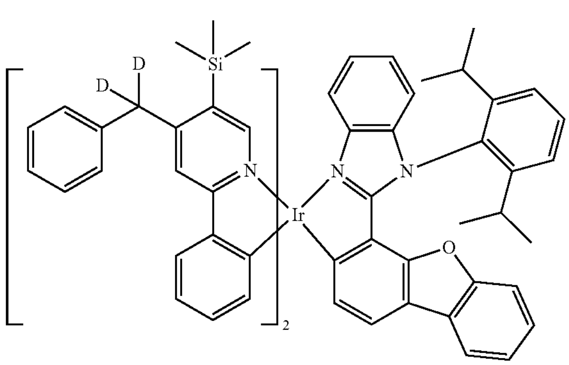
-continued
2023
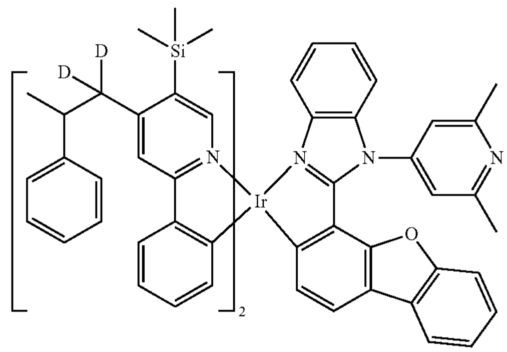
2024
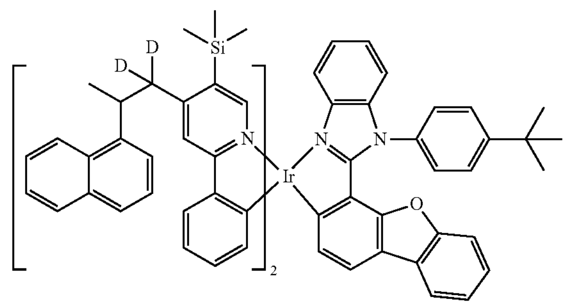
2025
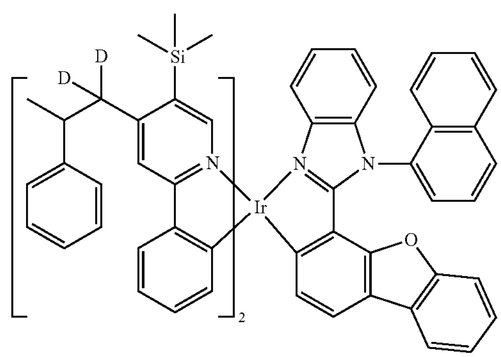
2026
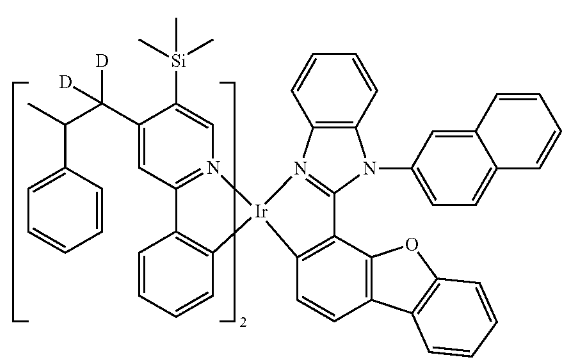

-continued
2027
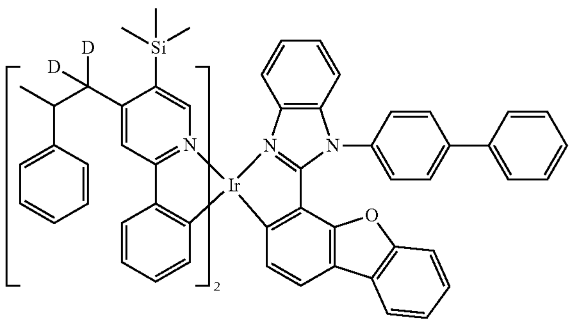
2028
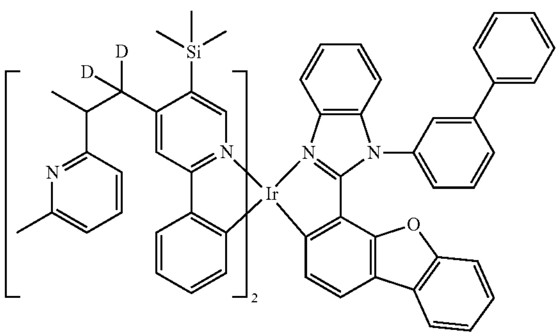
2029
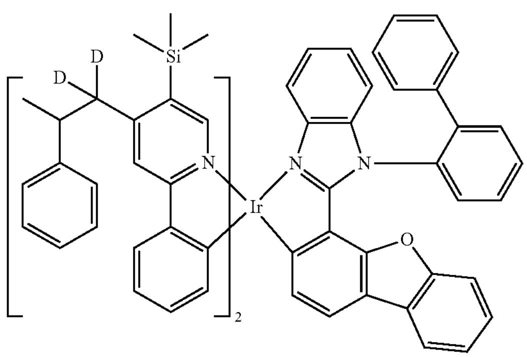
2030
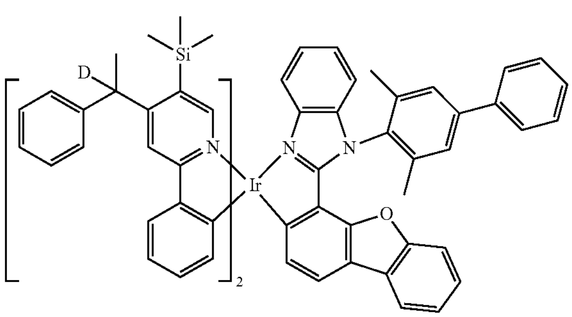
-continued
2031
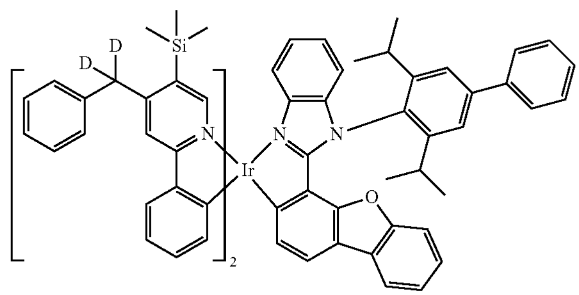
2032
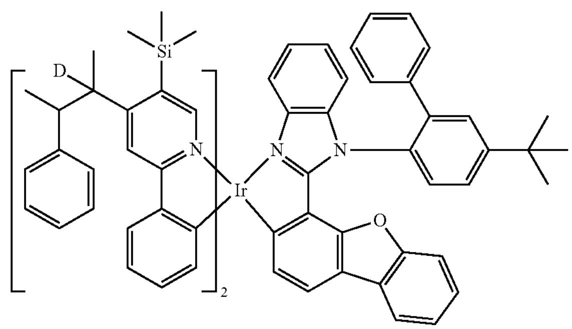
2033
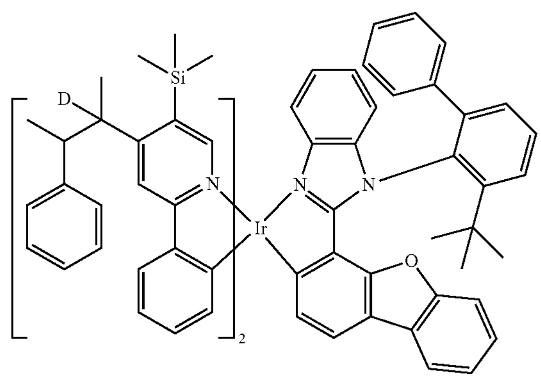
2034
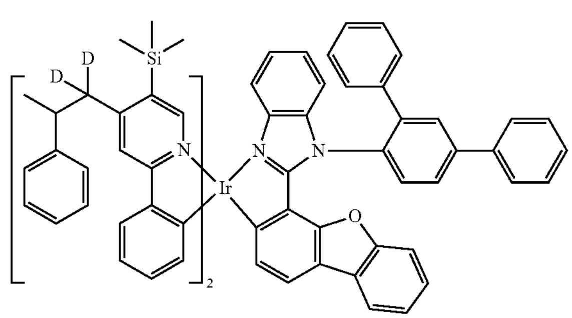

-continued
2035
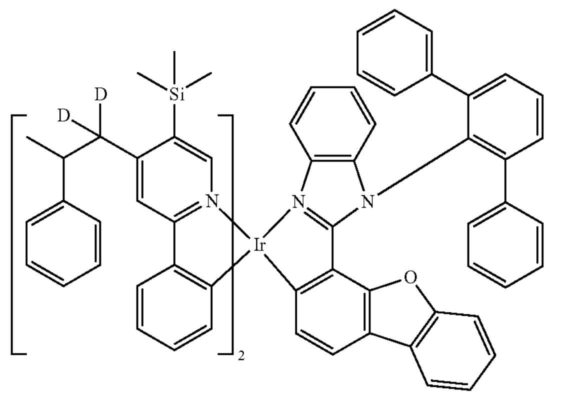
2036
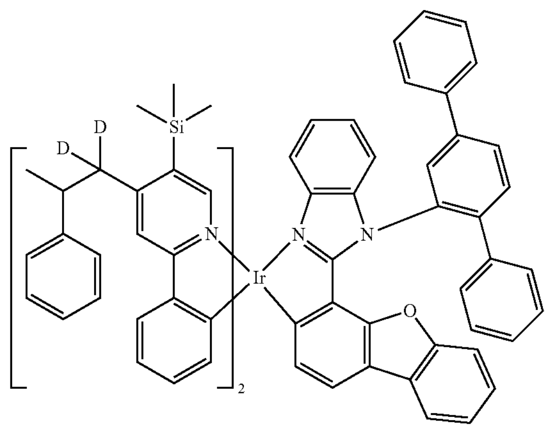
2037
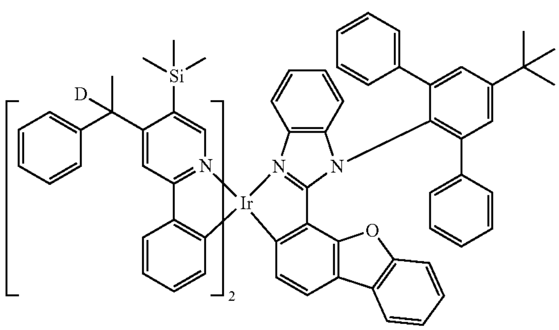
2038
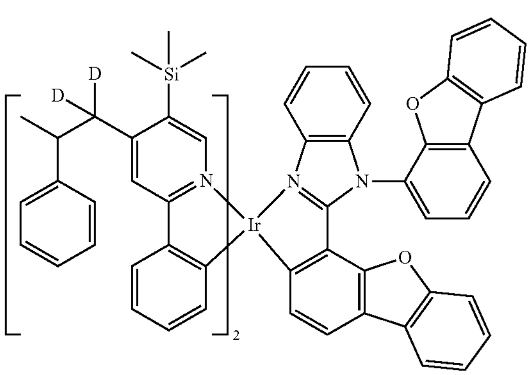
-continued
2039
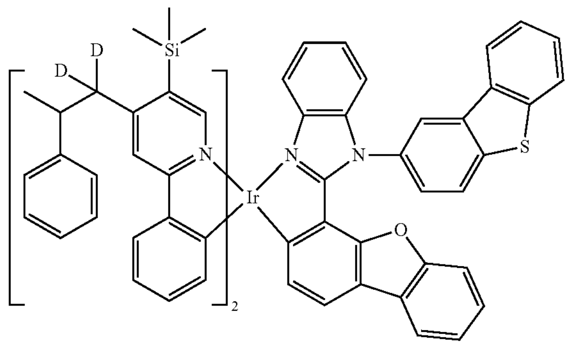
2040
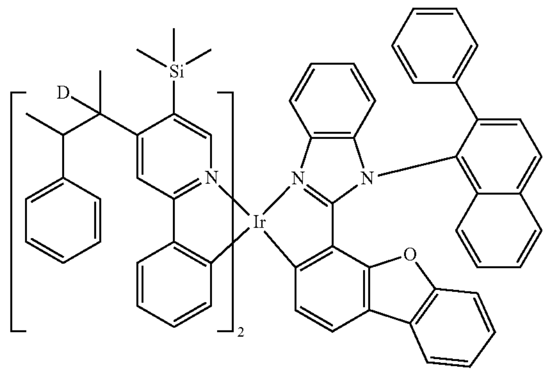
2041
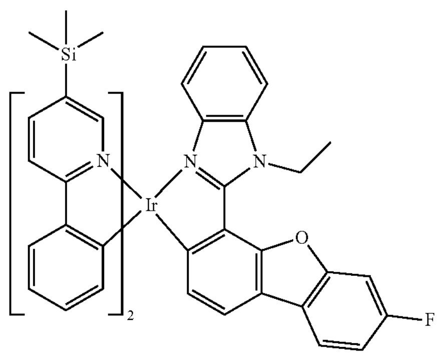
2042
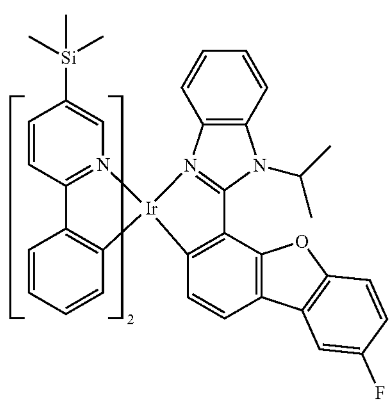

-continued
2043
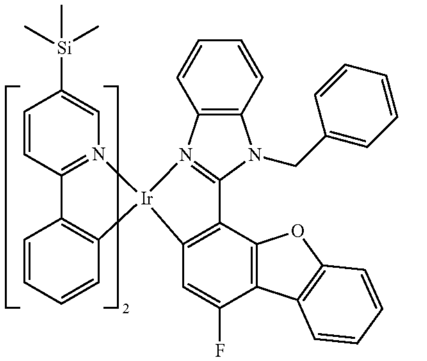
2044
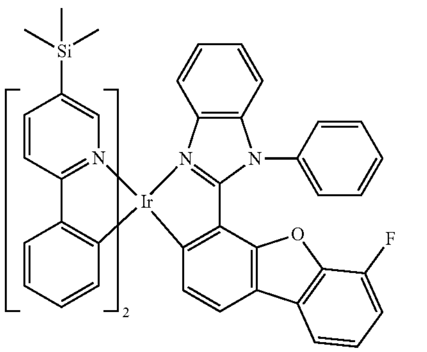
2045
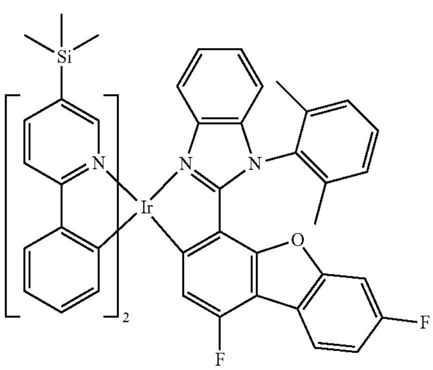
2046
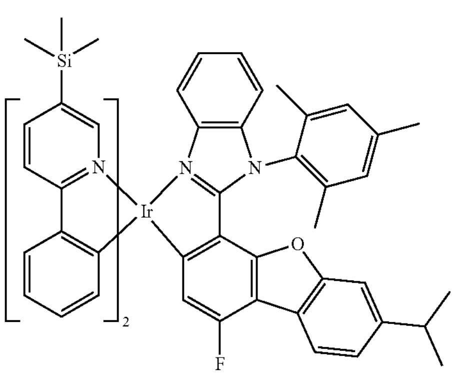
-continued
2047
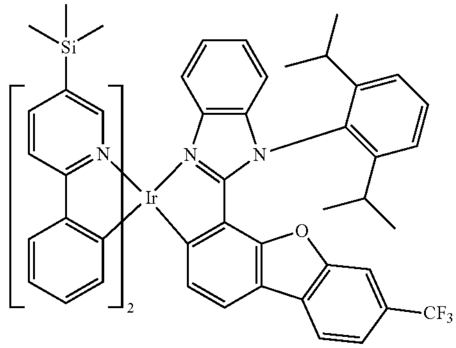
2048
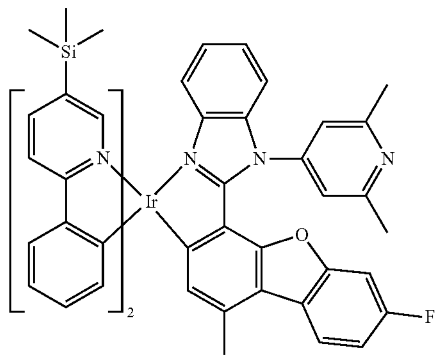
2049
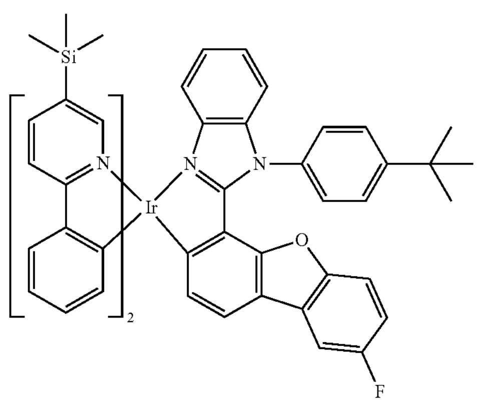
2050
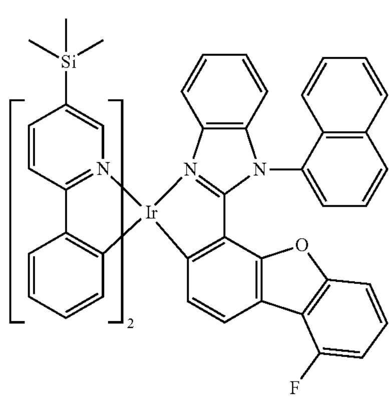

-continued
2051
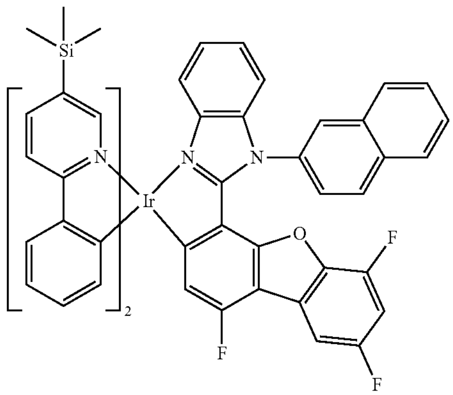
2052
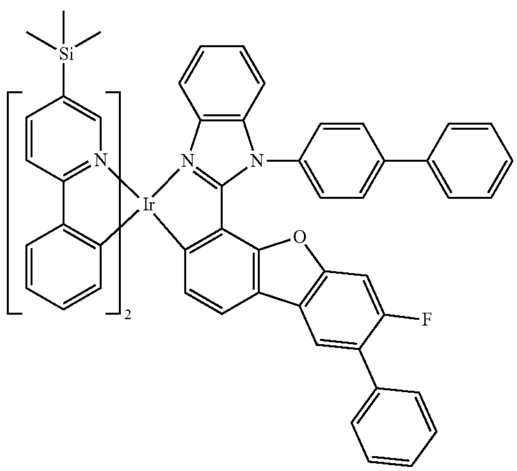
2053
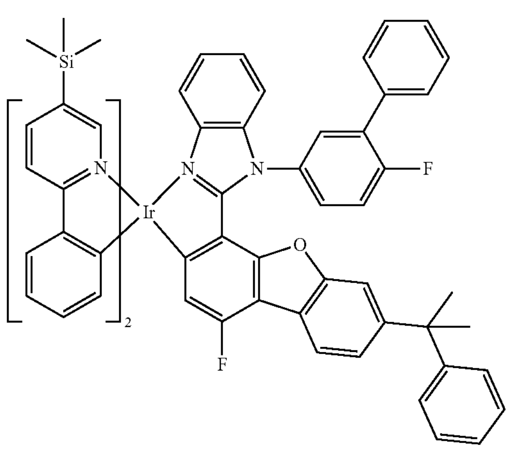
-continued
2054
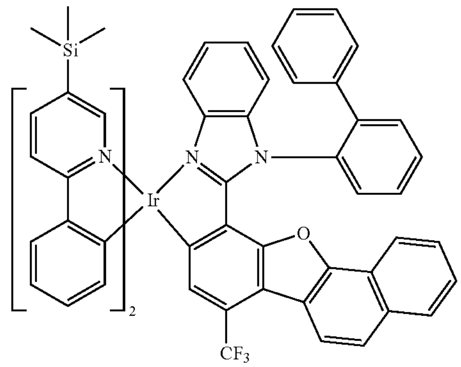
2055
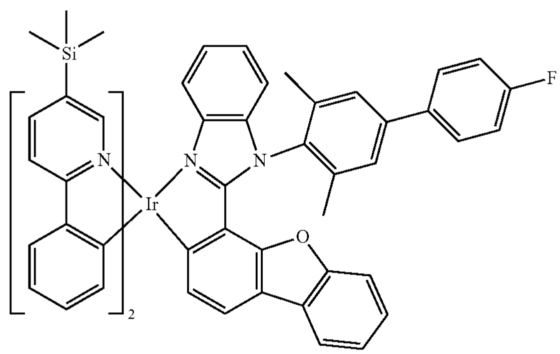
2056
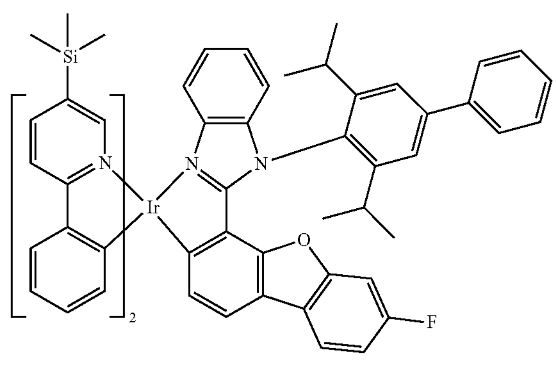
2057
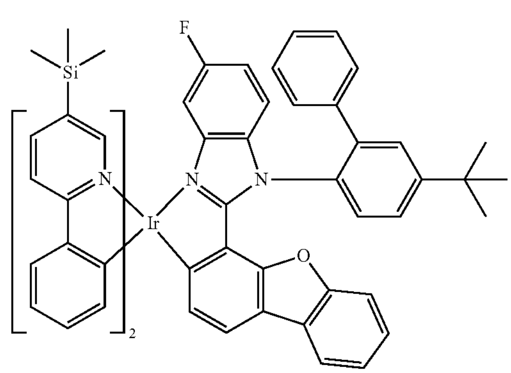

-continued
2058
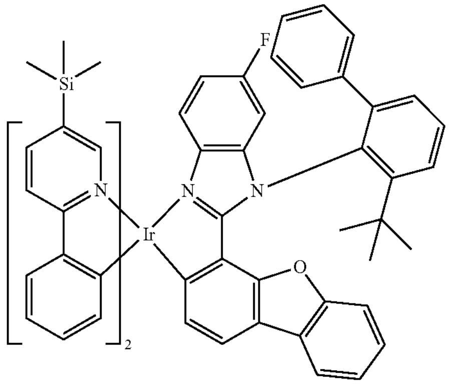
2059
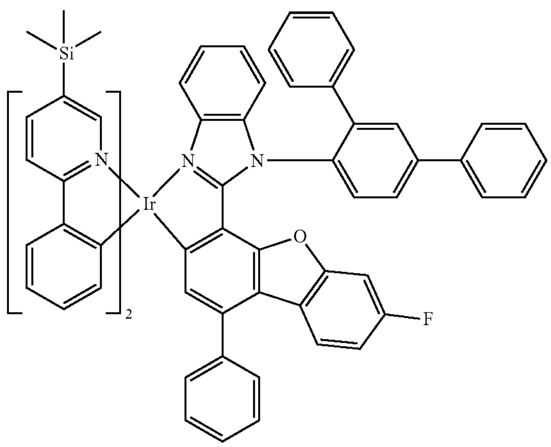
2060
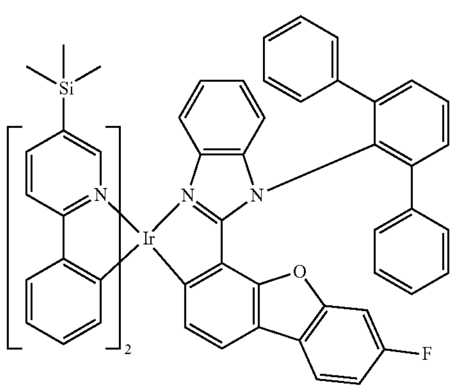
2061
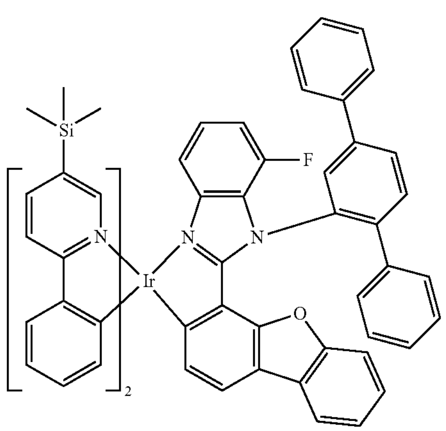
-continued
2062
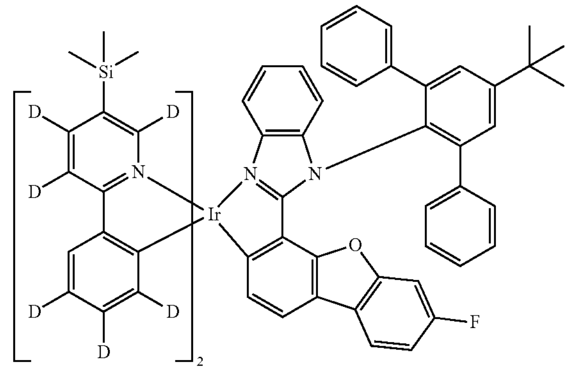
2063
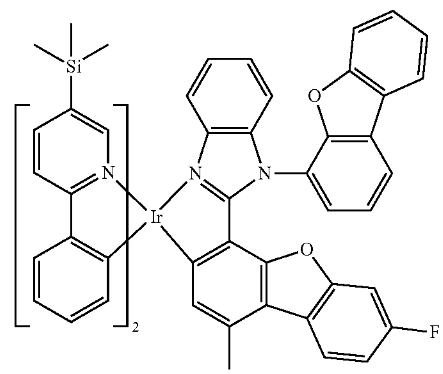
2064
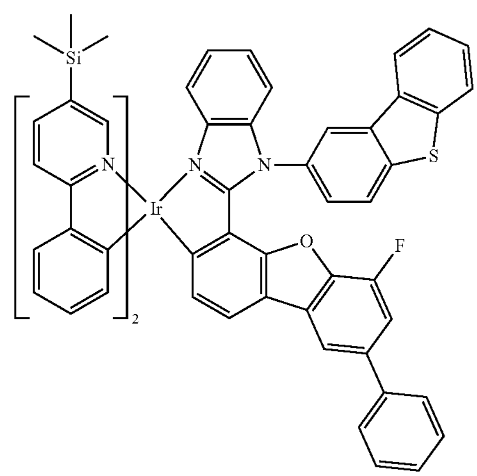
2065
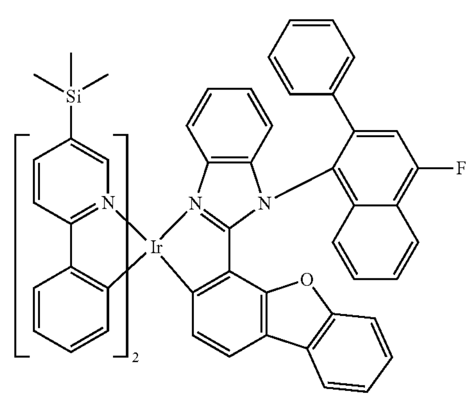

-continued
2066
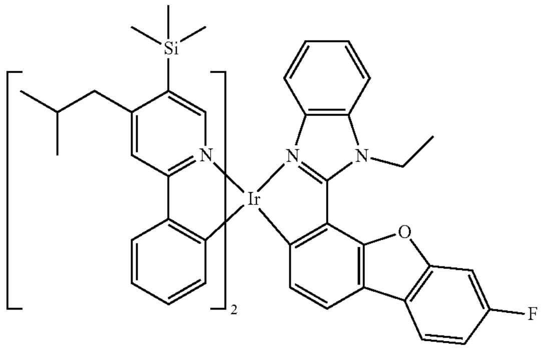
2067
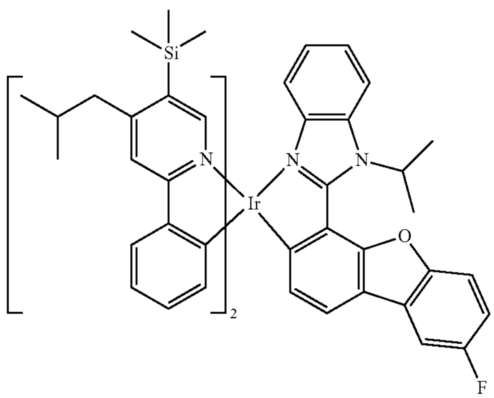
2068
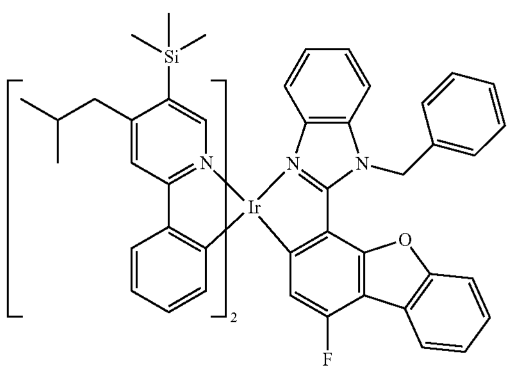
2069
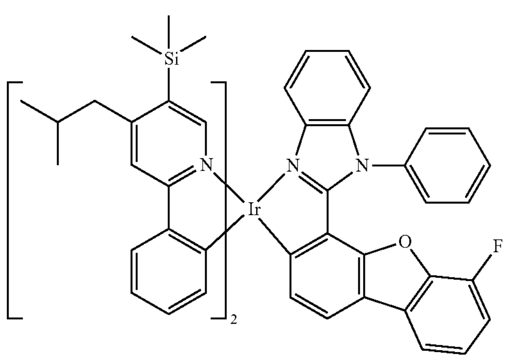
-continued
2070
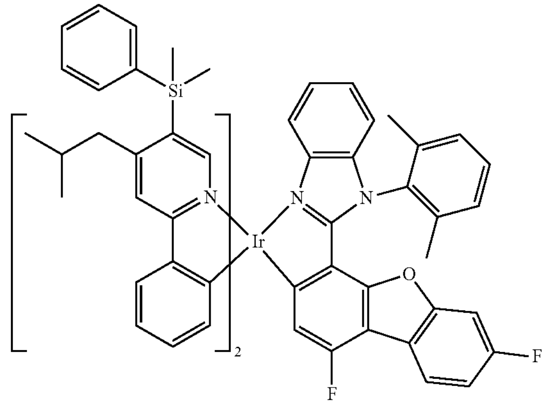
2071
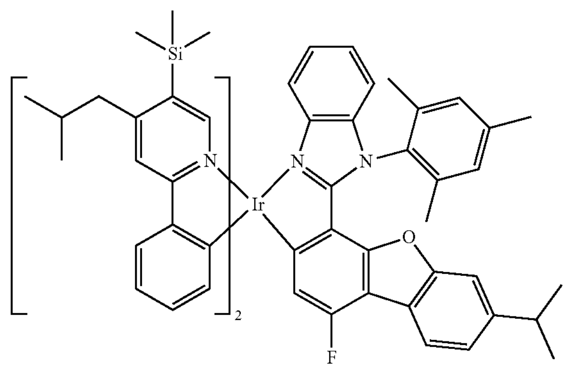
2072
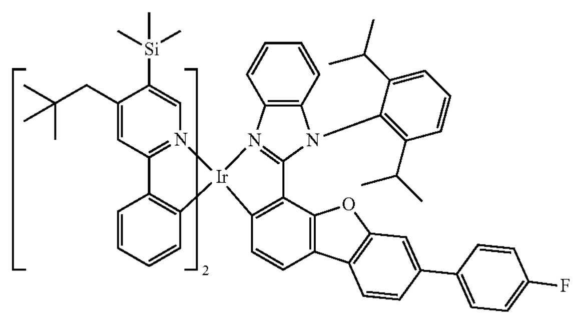
2073
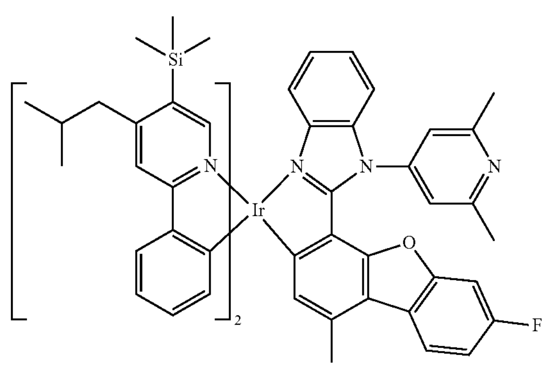

-continued
2074
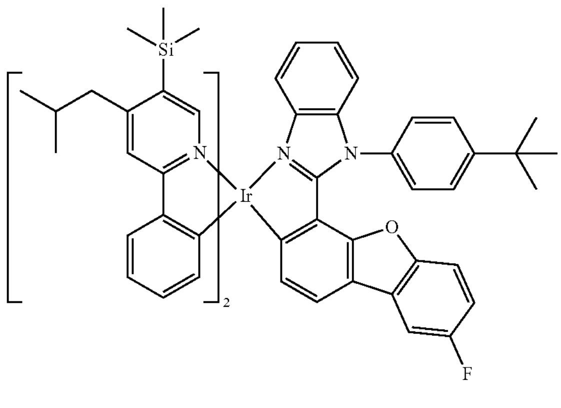
2075
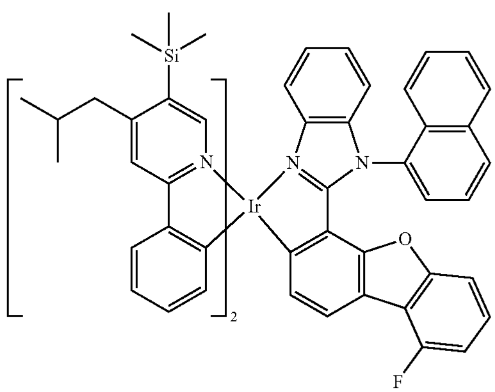
2076
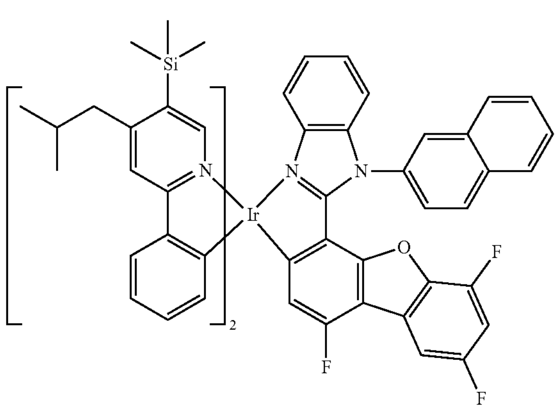
-continued
2077
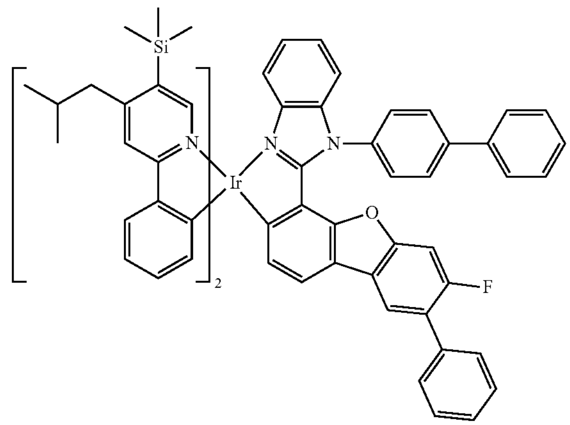
2078
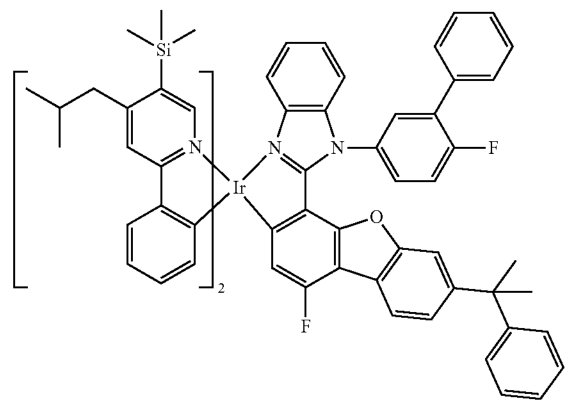
2079
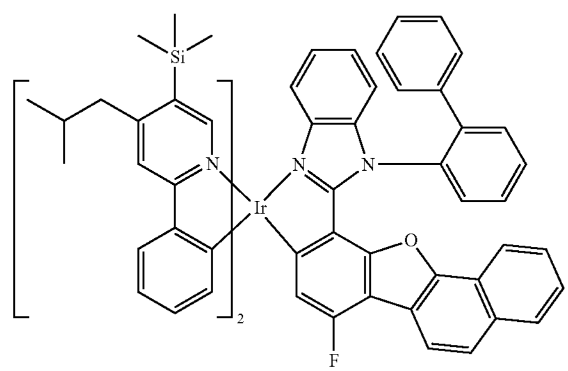
2080
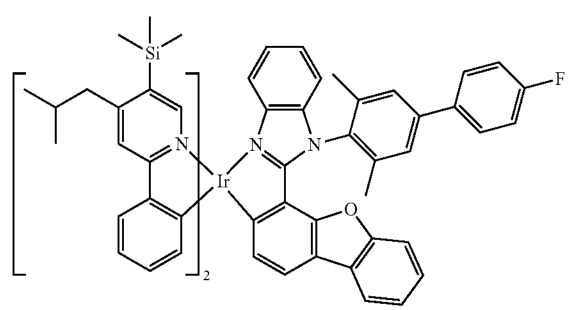

2081
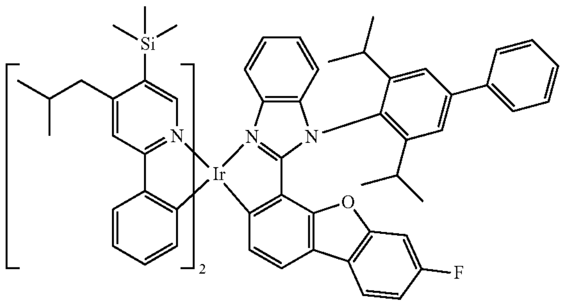
2082
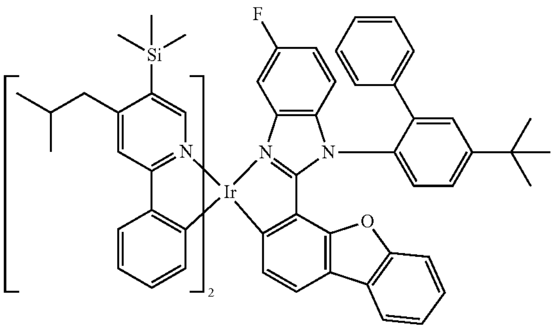
2083
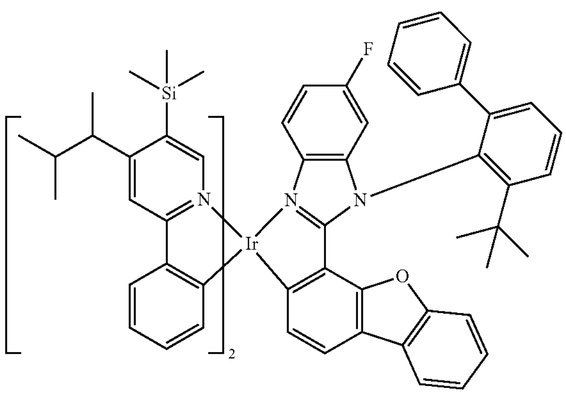
2084
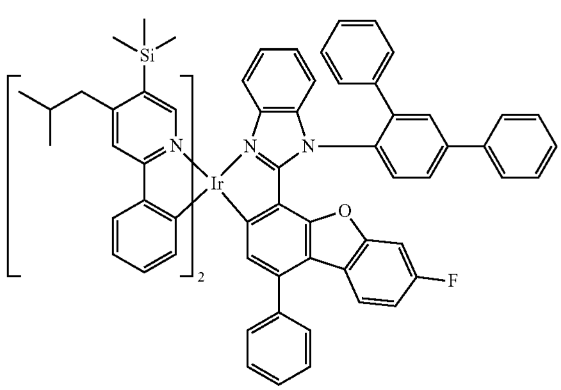
2085
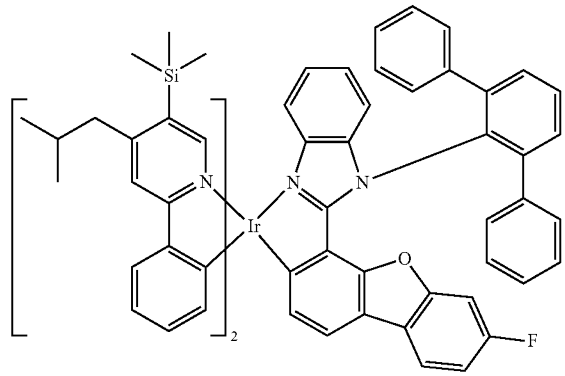
2086
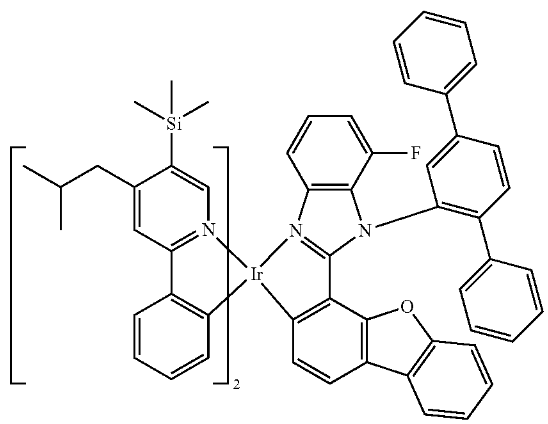
2087
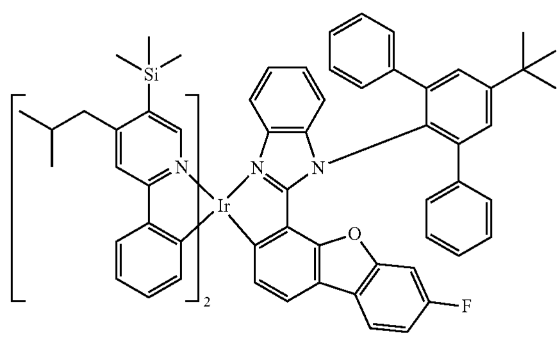
2088
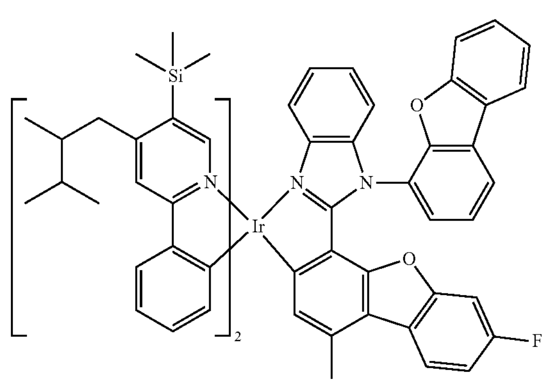

-continued
2089
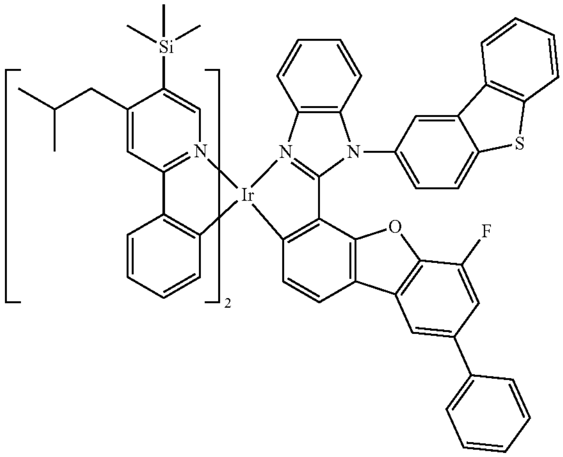
2090
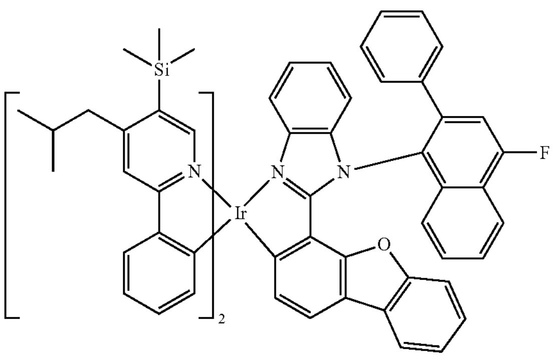
2091
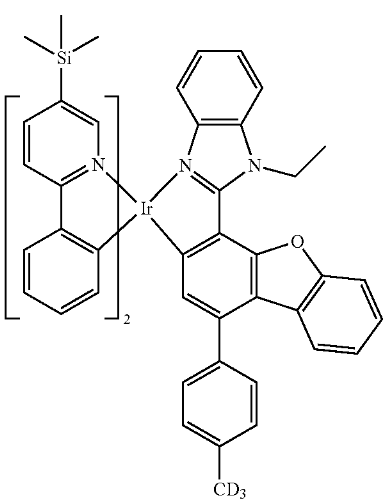
-continued
2092
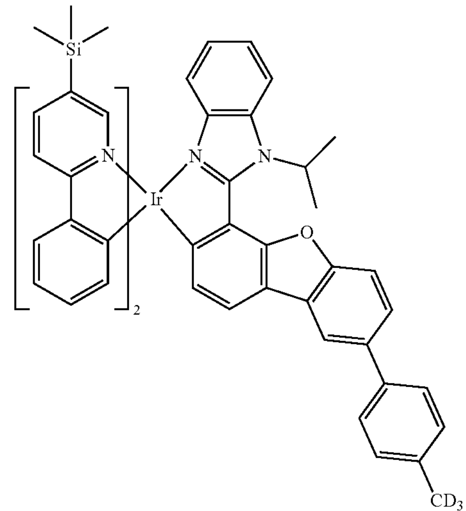
2093
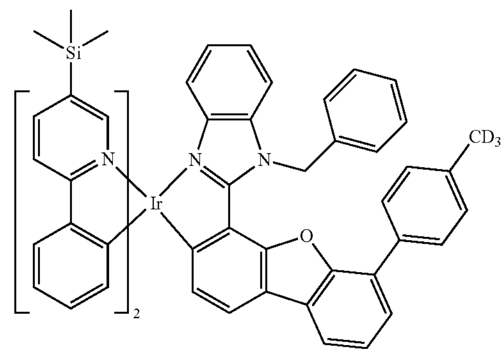
2094
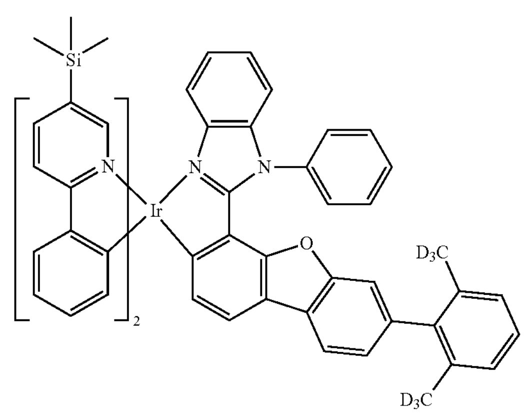

-continued
2095
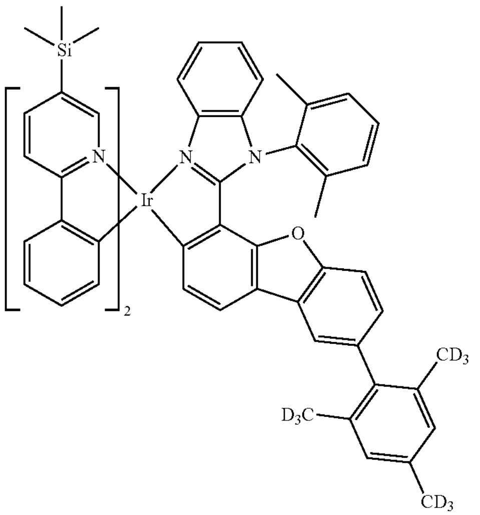
2096
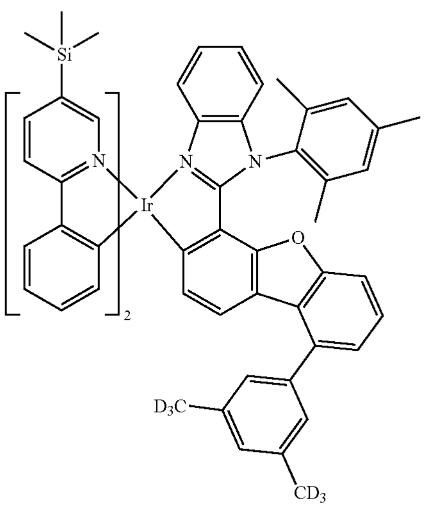
2097
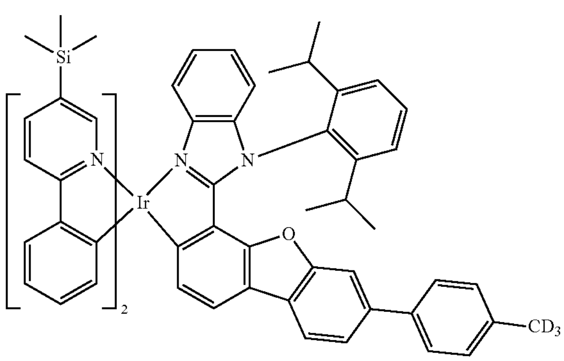
-continued
2098
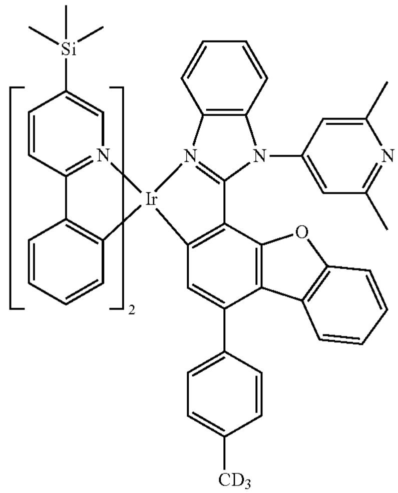
2099
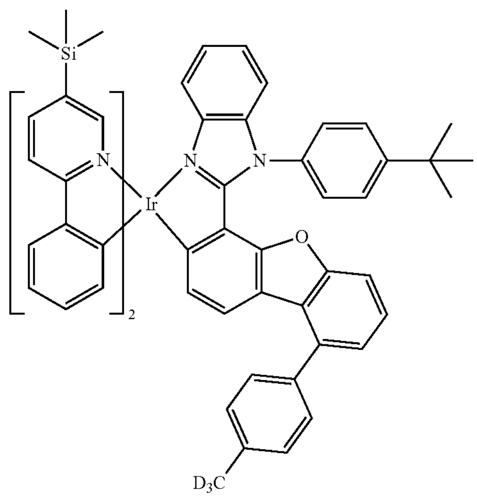
2100
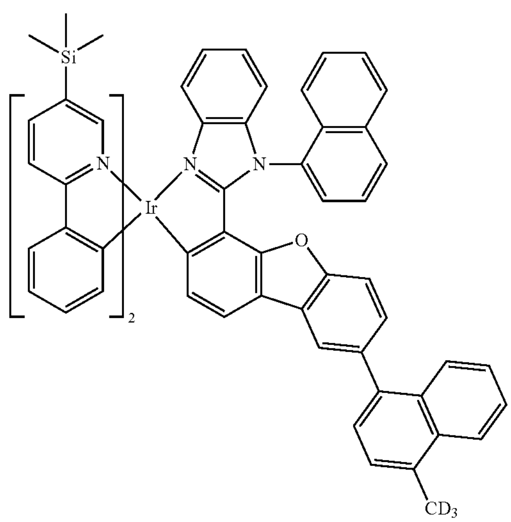

-continued
2101
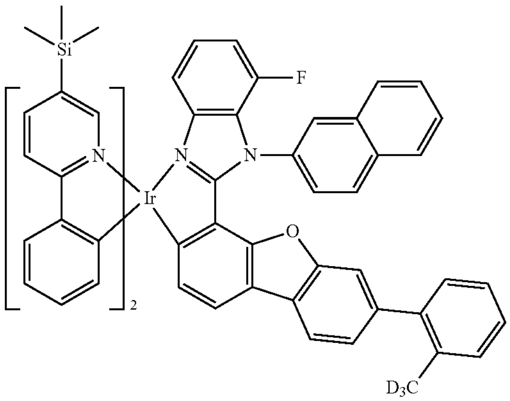
2102
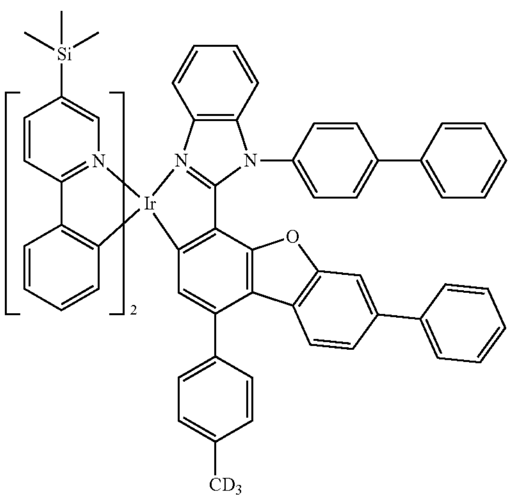
2103
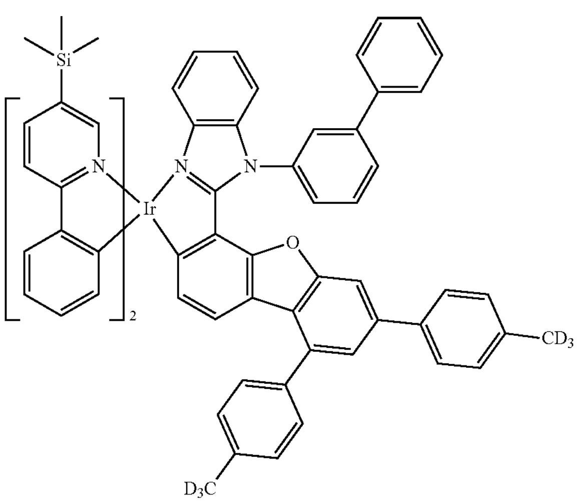
2104
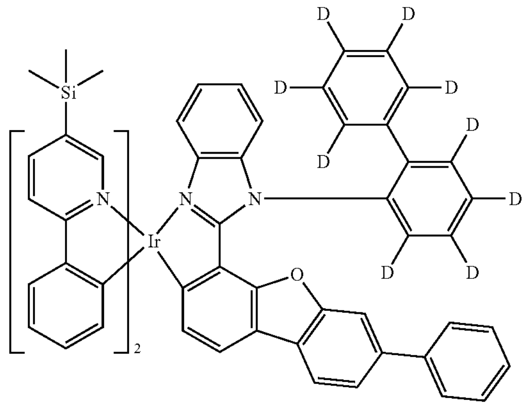
2105
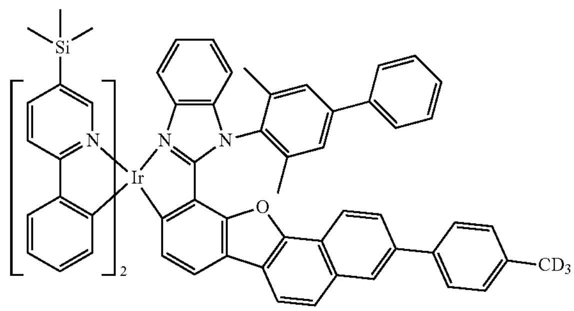
2106
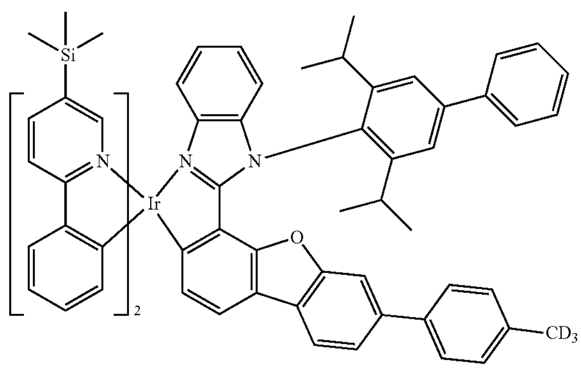
2107
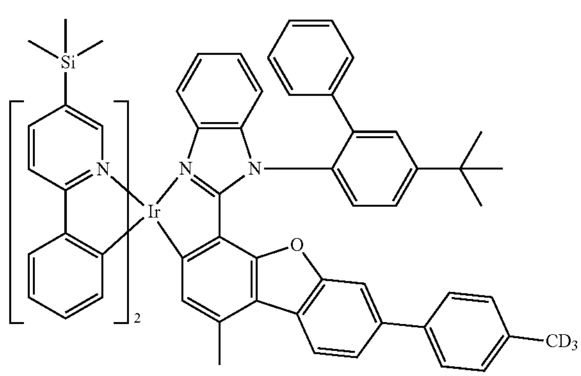

-continued
2108
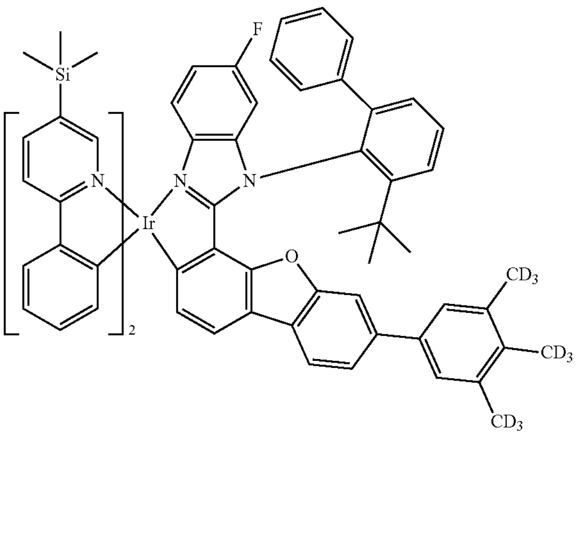
2109
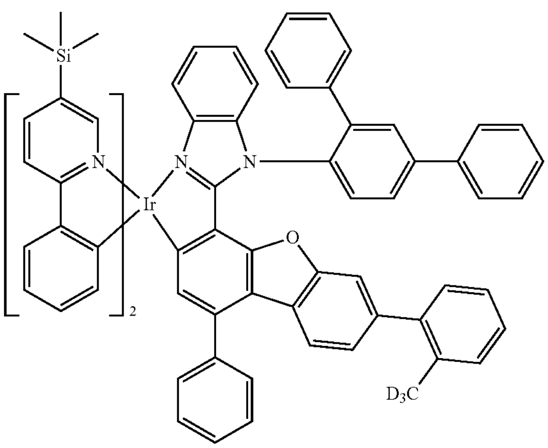
2110
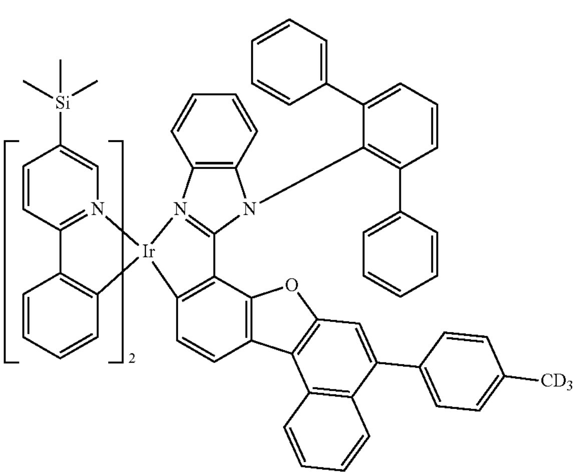
-continued
2111
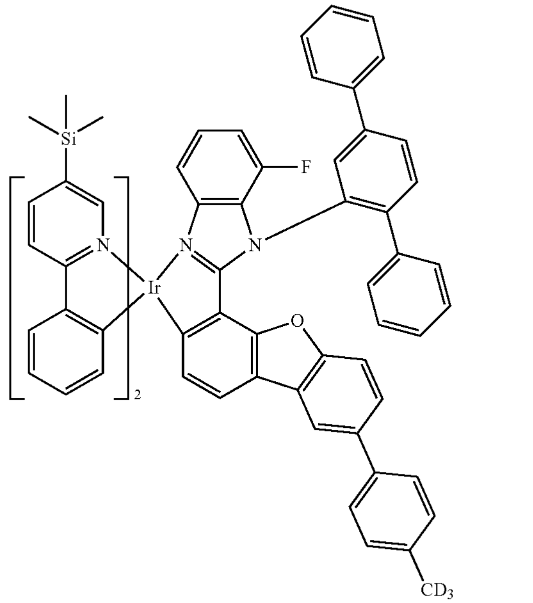
2112
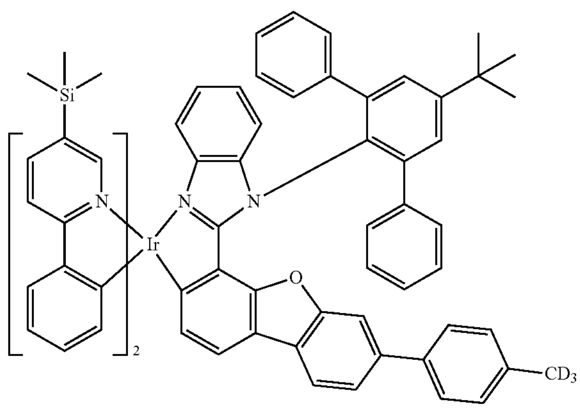
2113
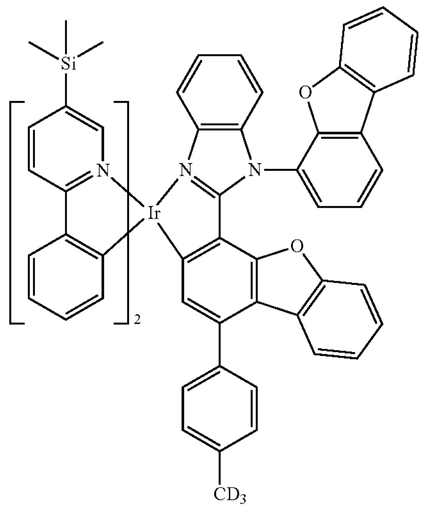

2114
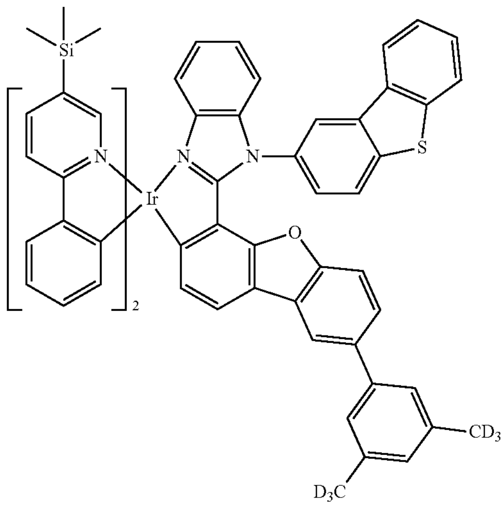
2115
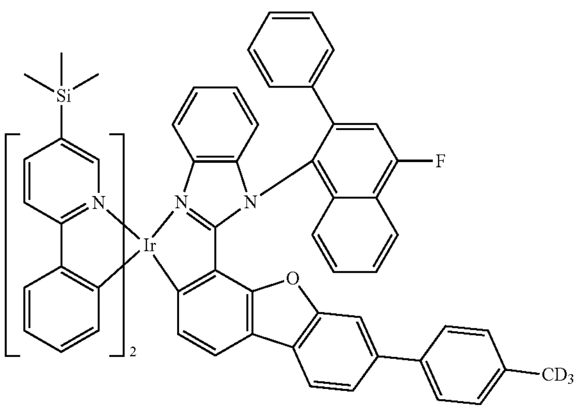
2116
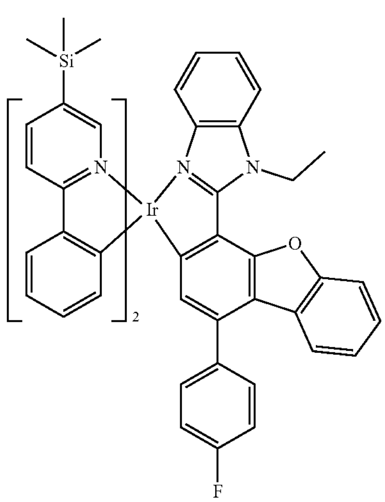
2117
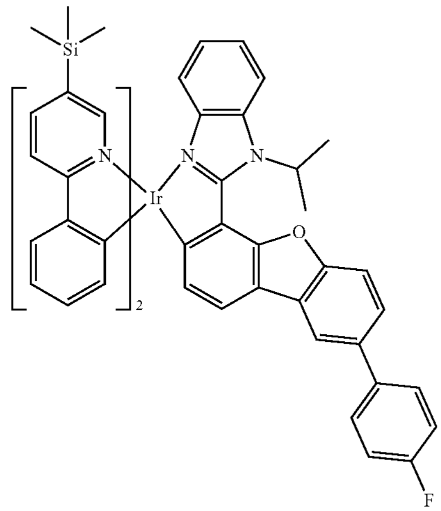
2118
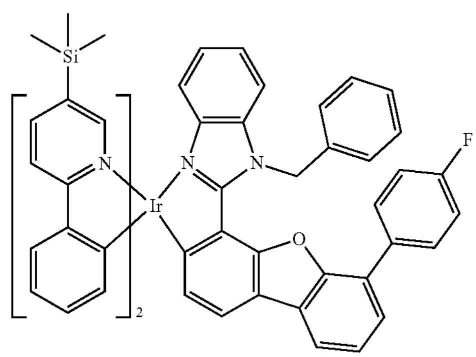
2119
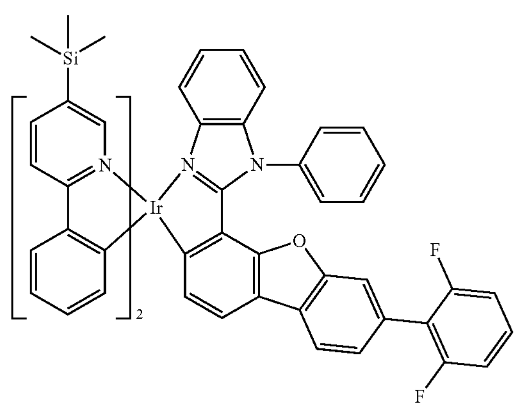

2120
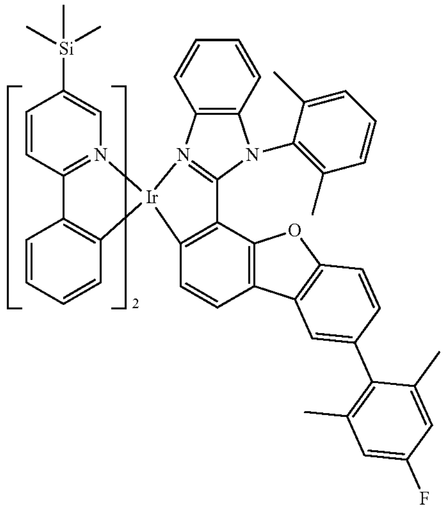
2121
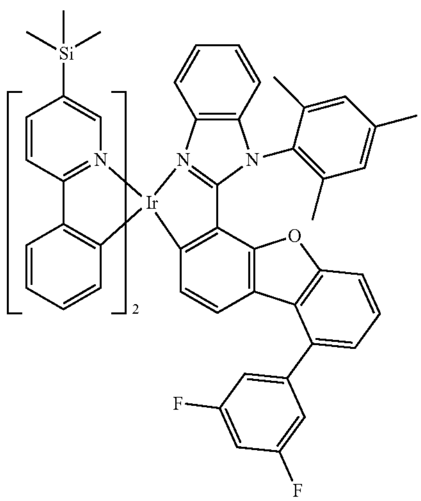
2122
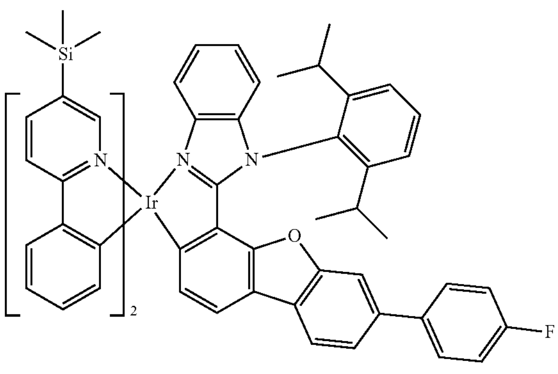
2123
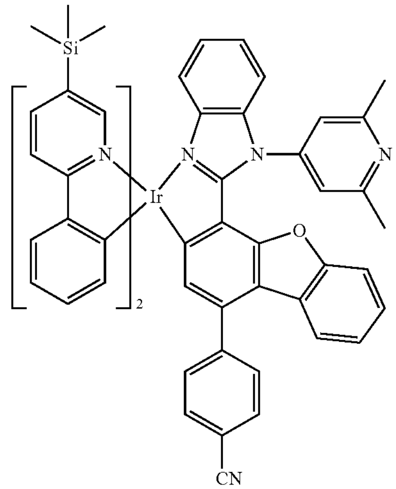
2124
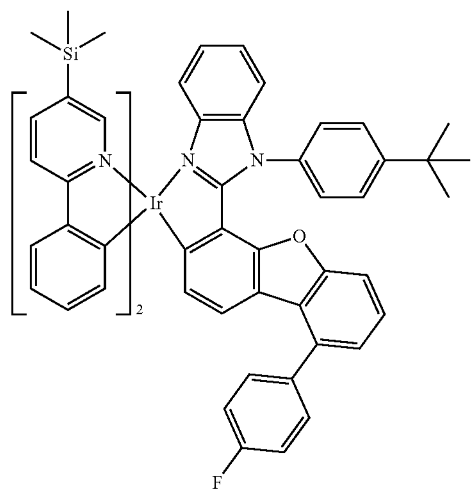
2125
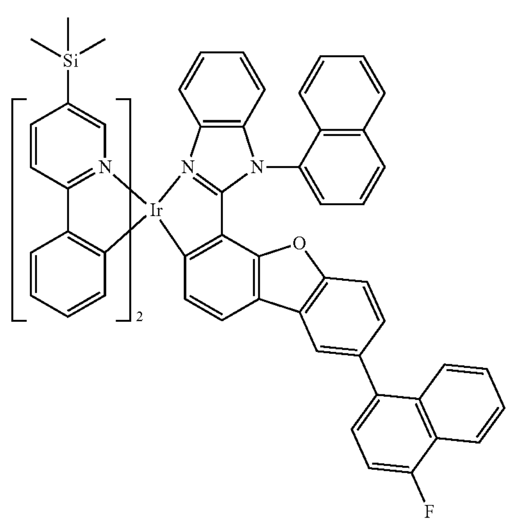

-continued
2126
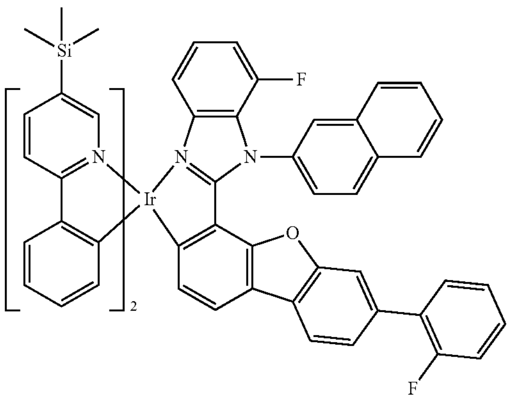
2127
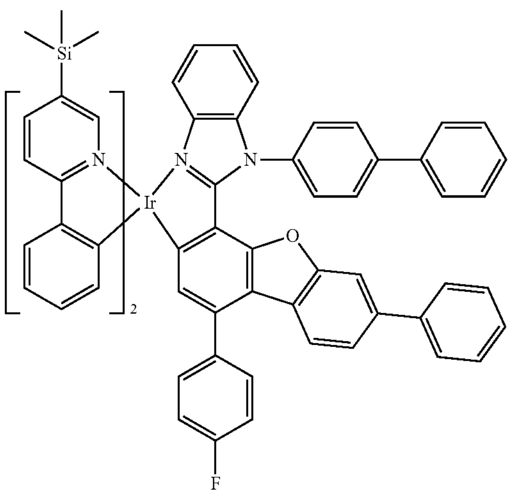
2128
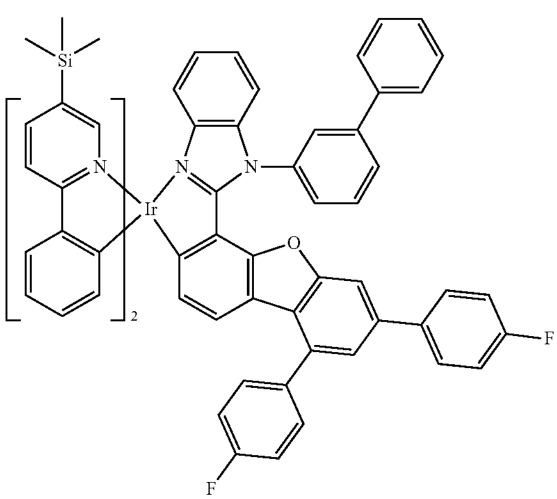
-continued
2129
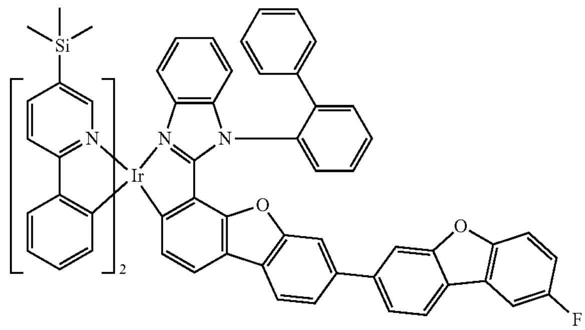
2130
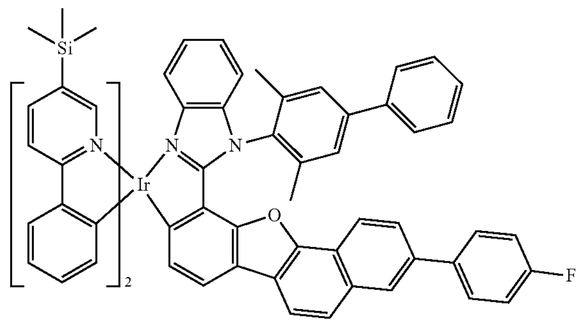
2131
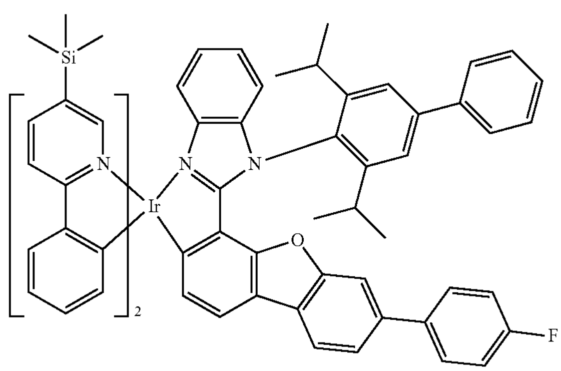
2132
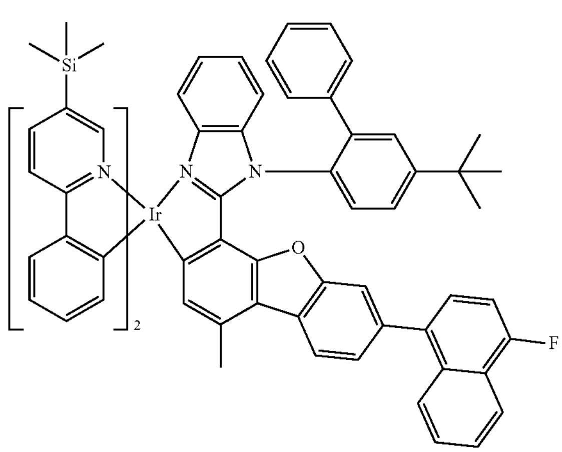

2133
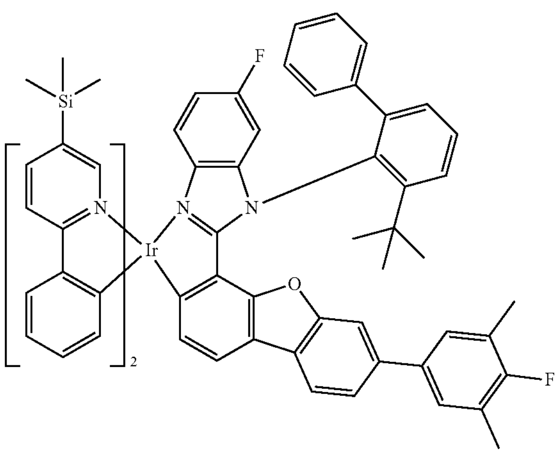
2134
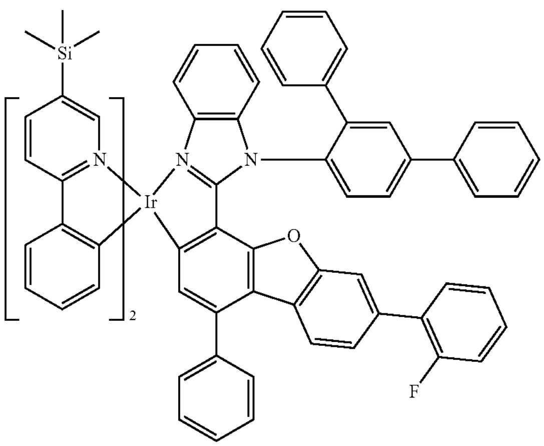
2135
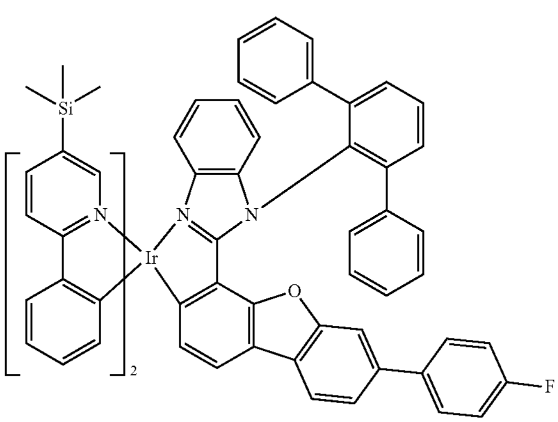
2136
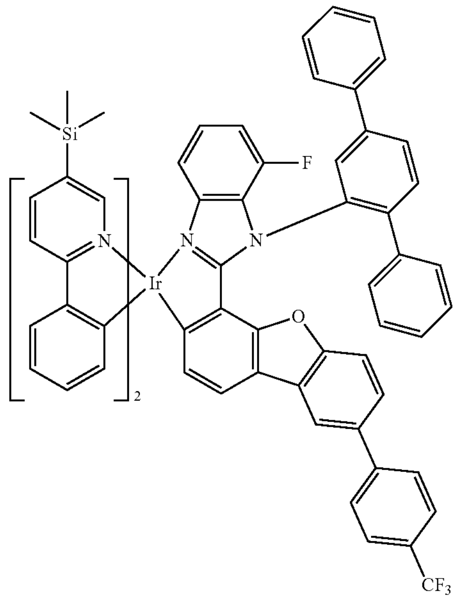
2137
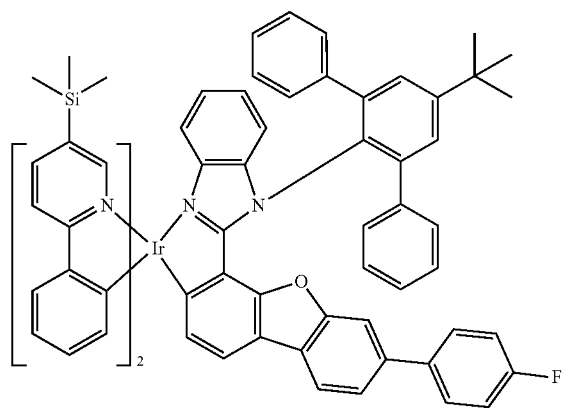
2138
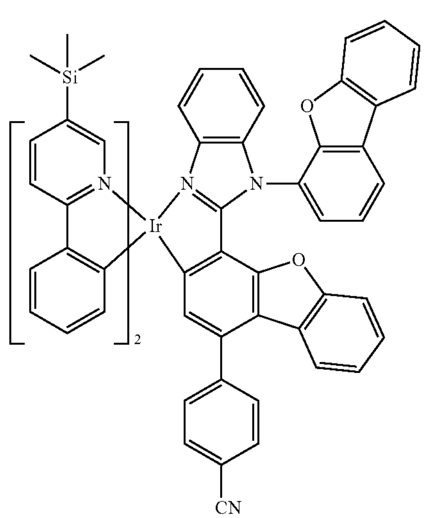

-continued
2139
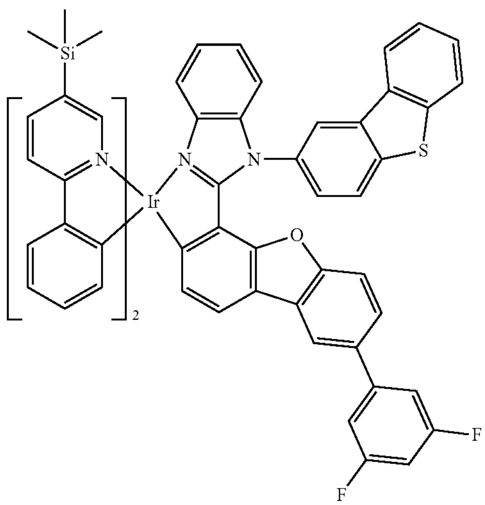
2140
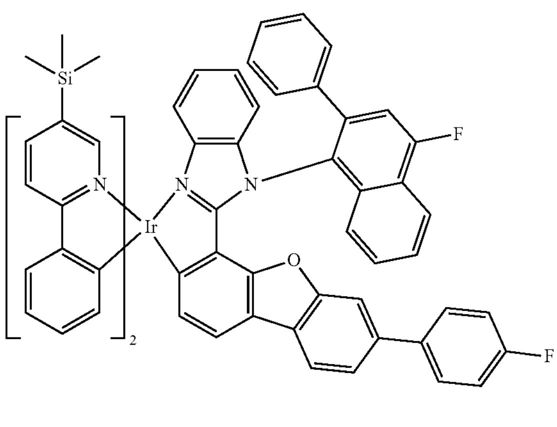
2141
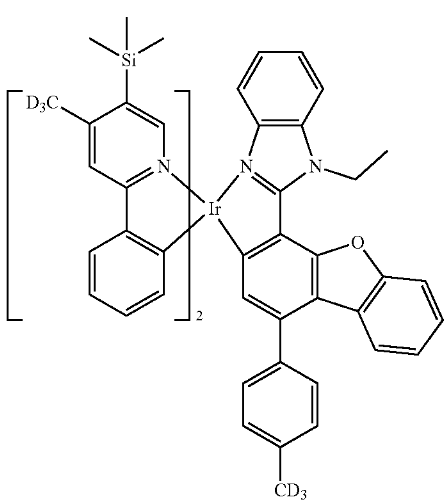
-continued
2142
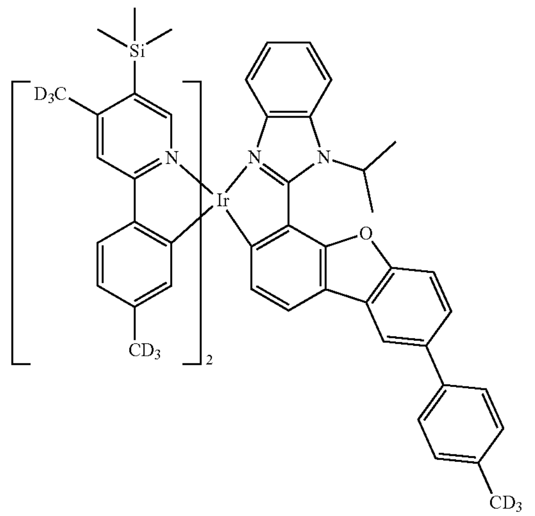
2143
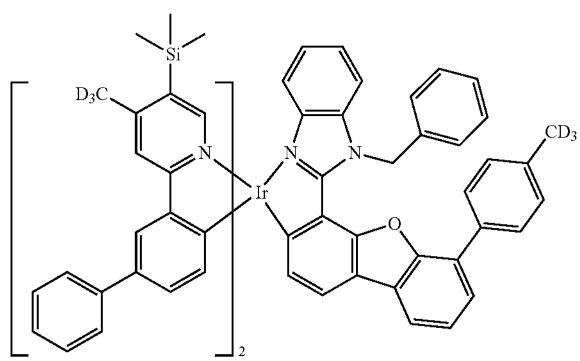
2144
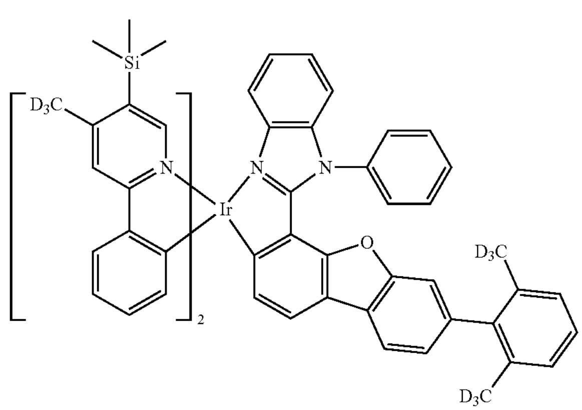

-continued
2145
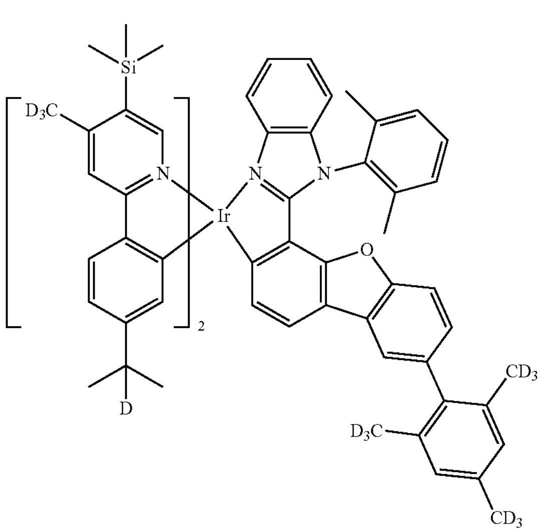
2146
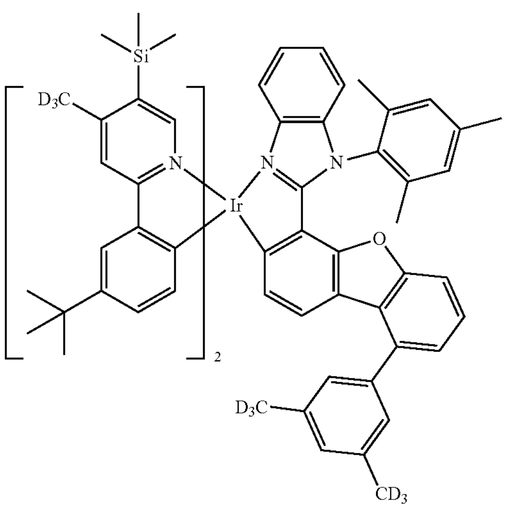
2147
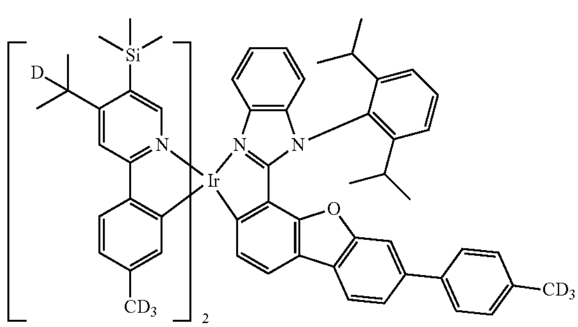
-continued
2148
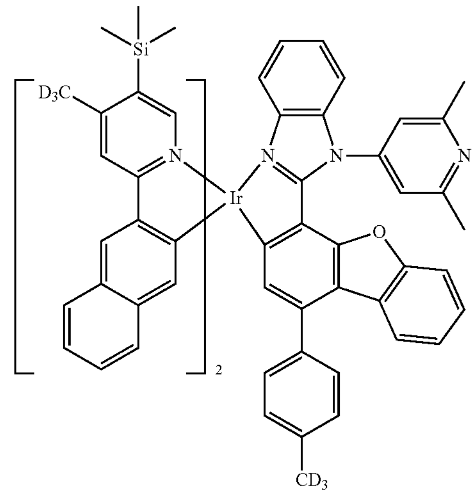
2149
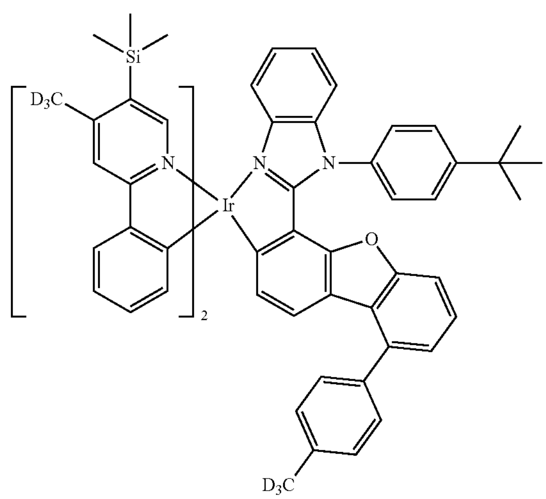
2150
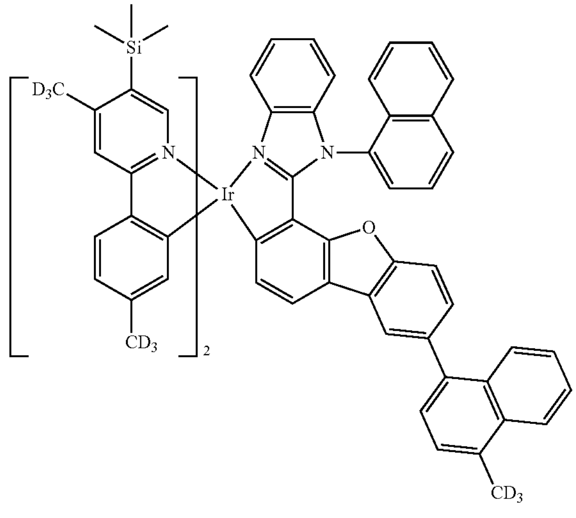

-continued
2151
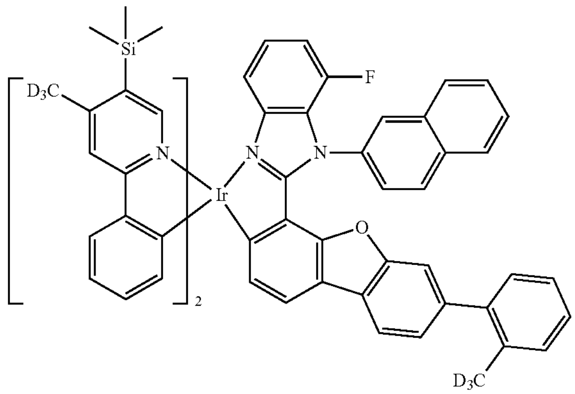
2152
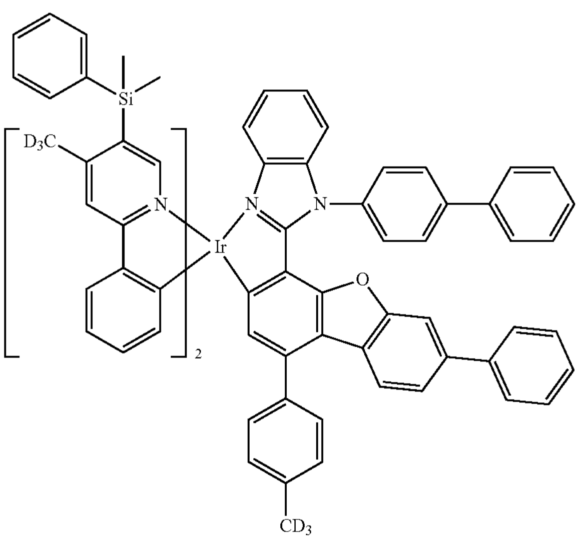
2153
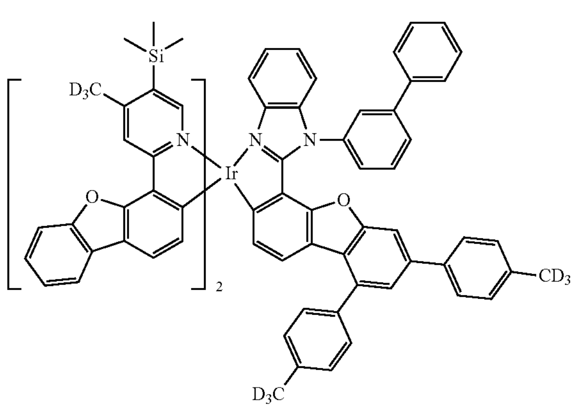
-continued
2154
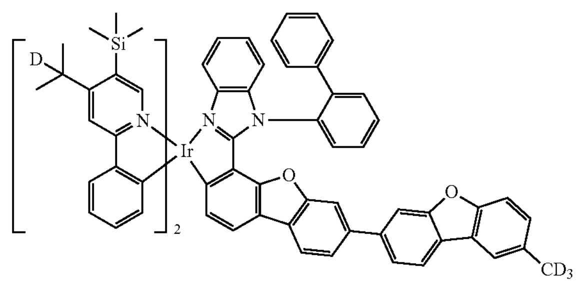
2155
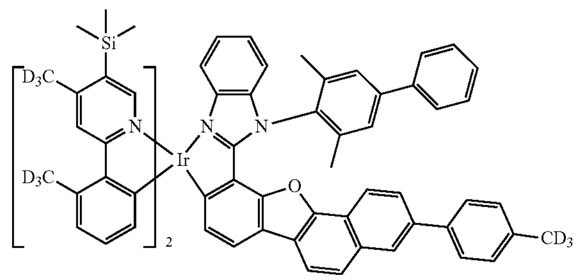
2156
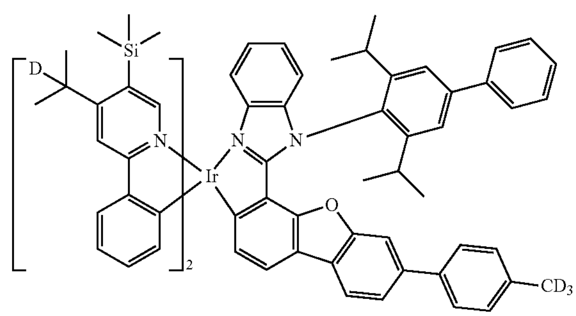
2157
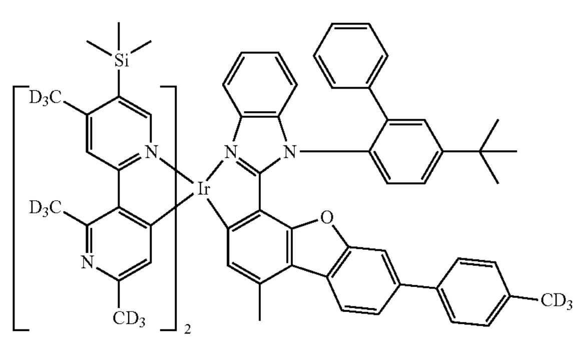

-continued
2158
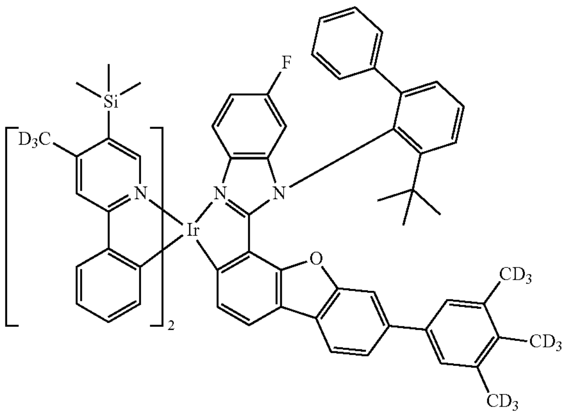
2159
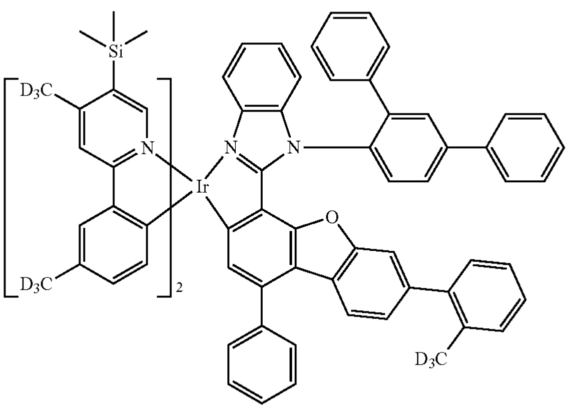
2160
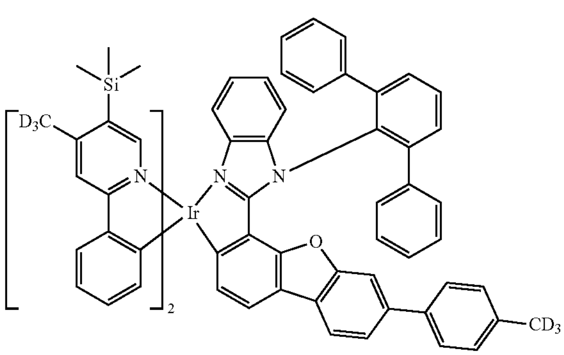
-continued
2161
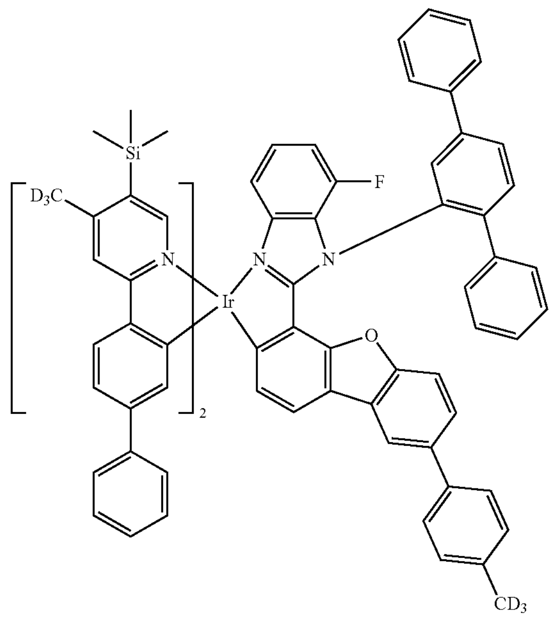
2162
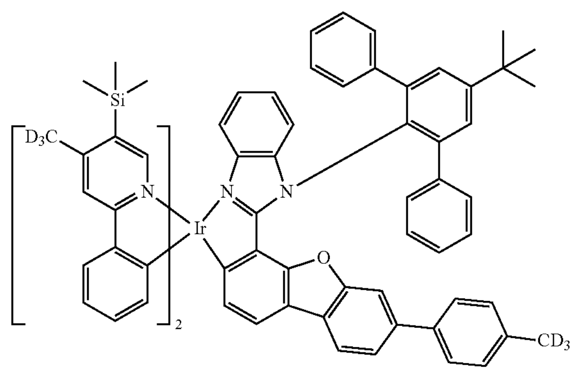
2163
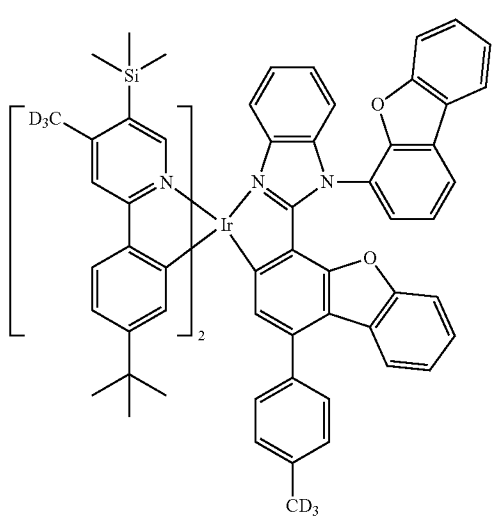

-continued
2164
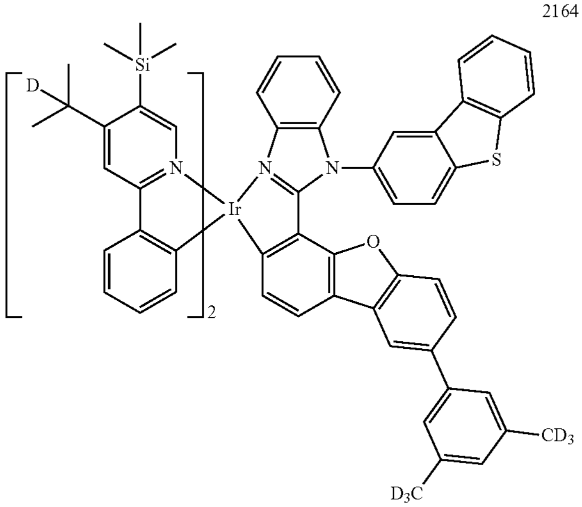
2165
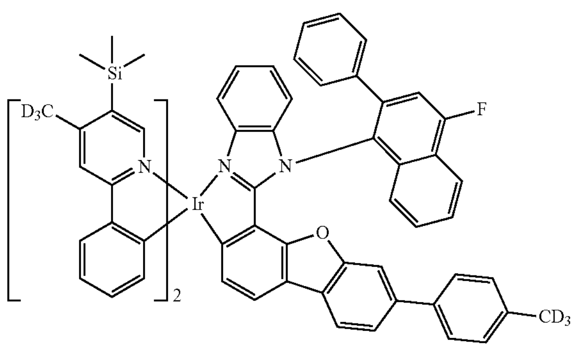
2166
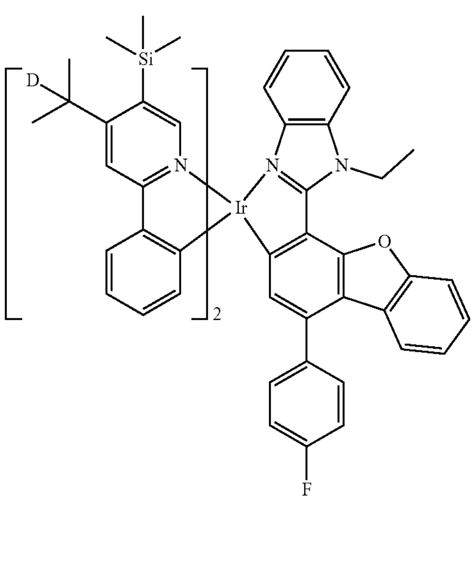
-continued
2167
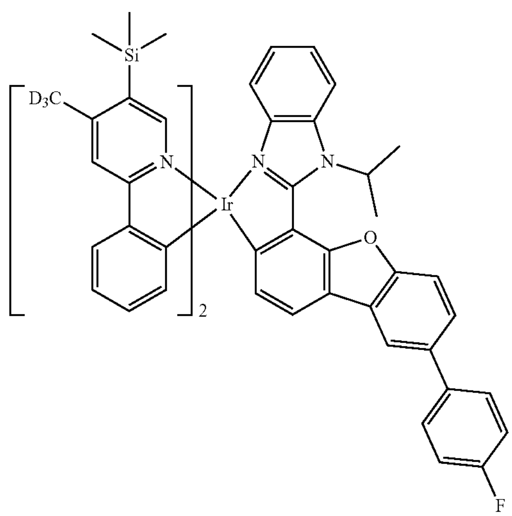
2168
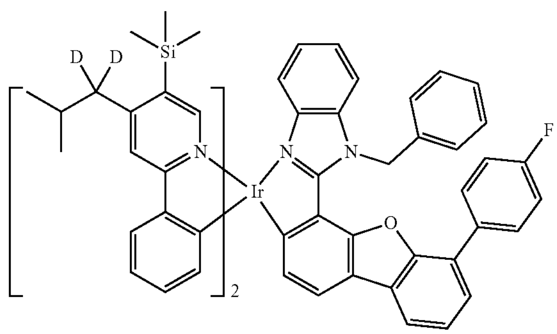
2169
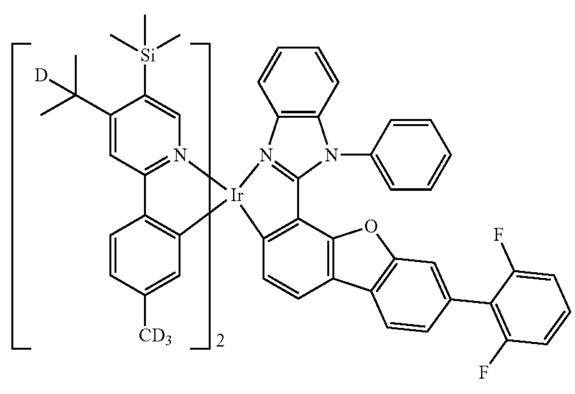

-continued
2170
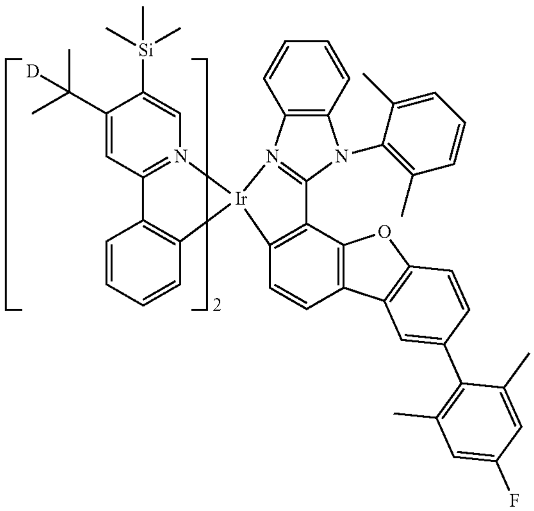
2171
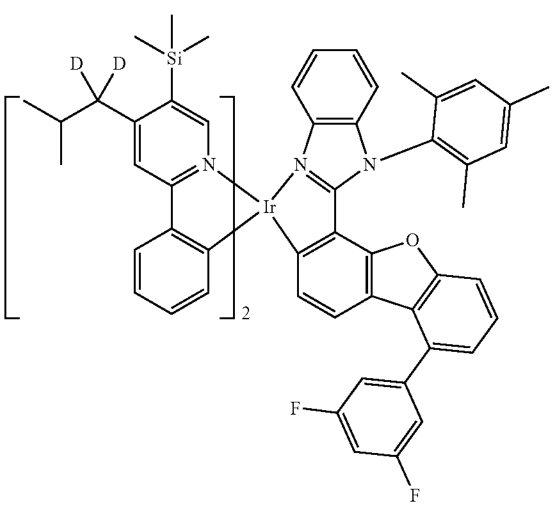
2172
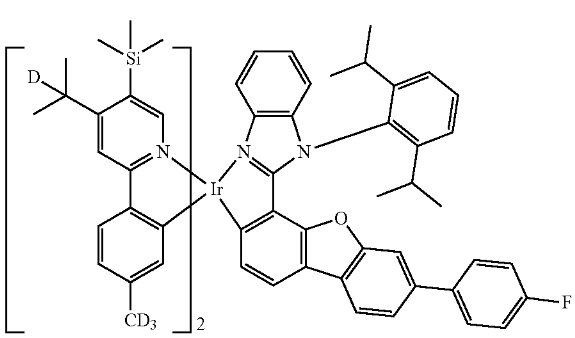
-continued
2173
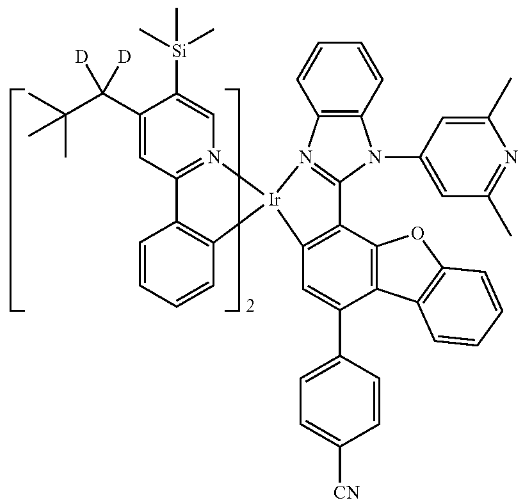
2174
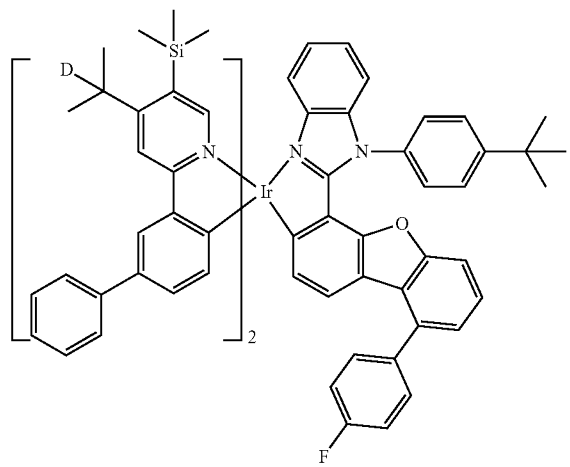
2175
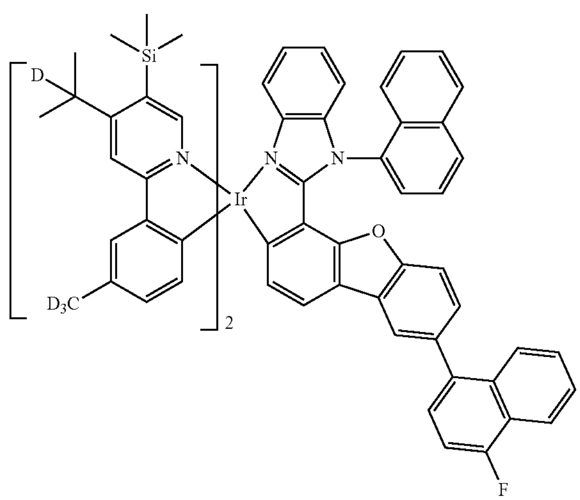

-continued
2176
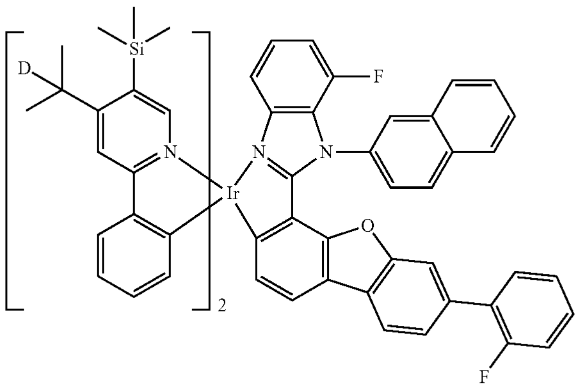
2177
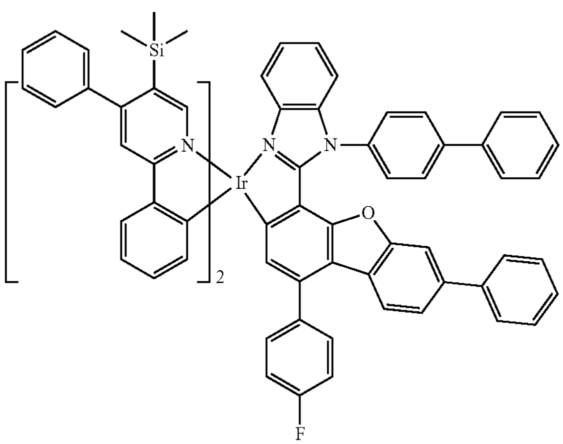
2178
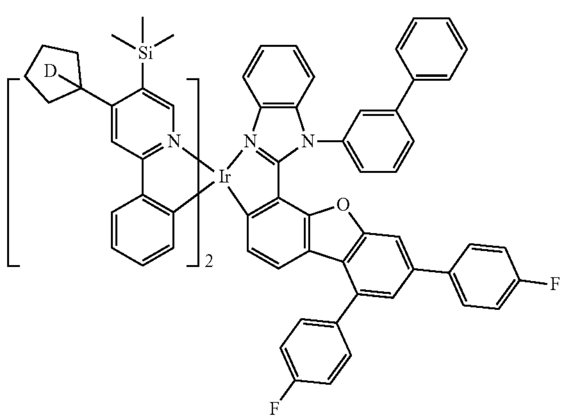
2179
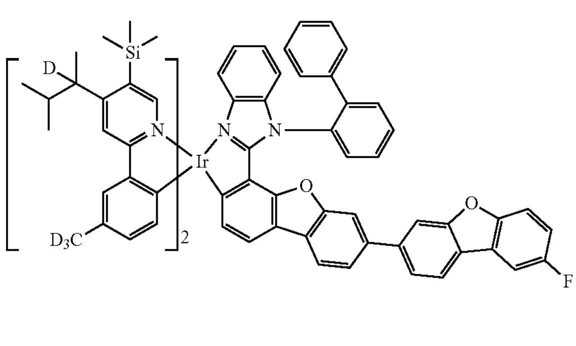
-continued
2180
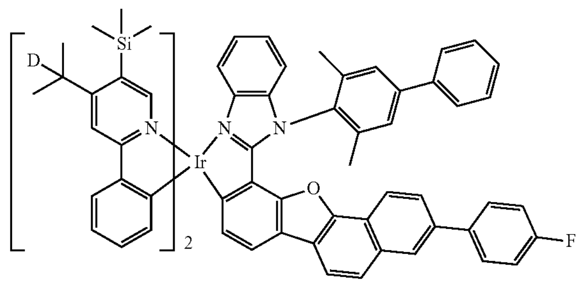
2181
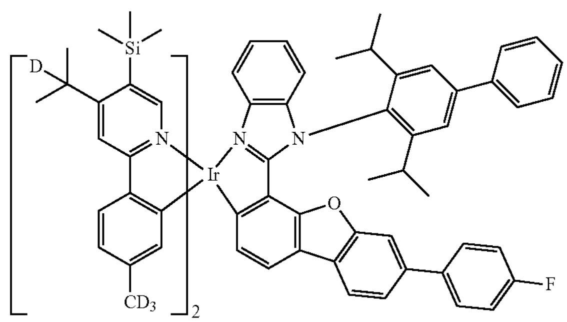
2182
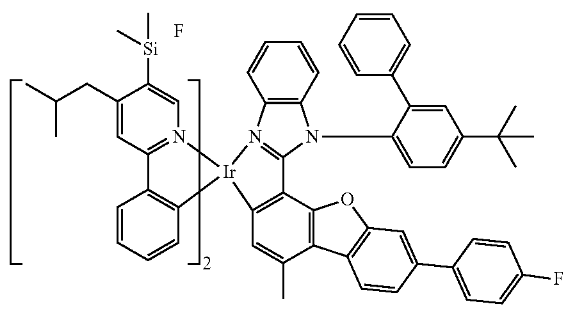
2183
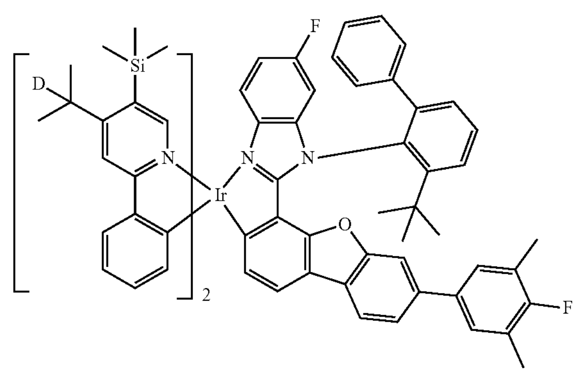

-continued
-continued
2184
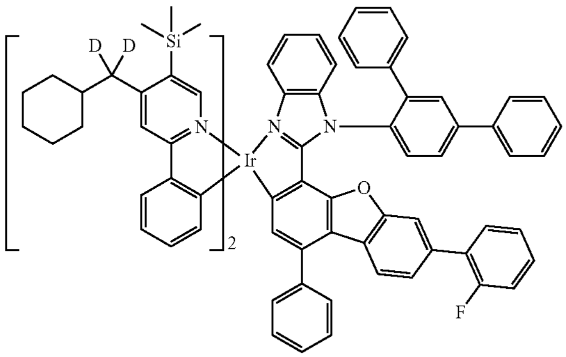
2185
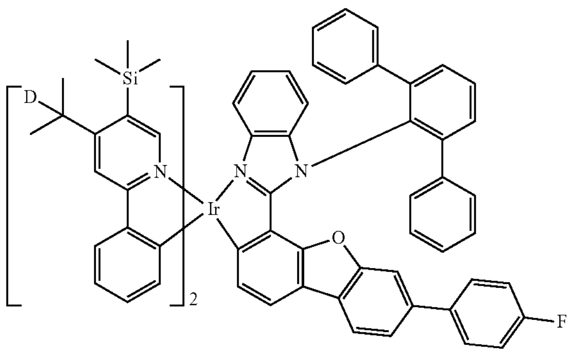
2186
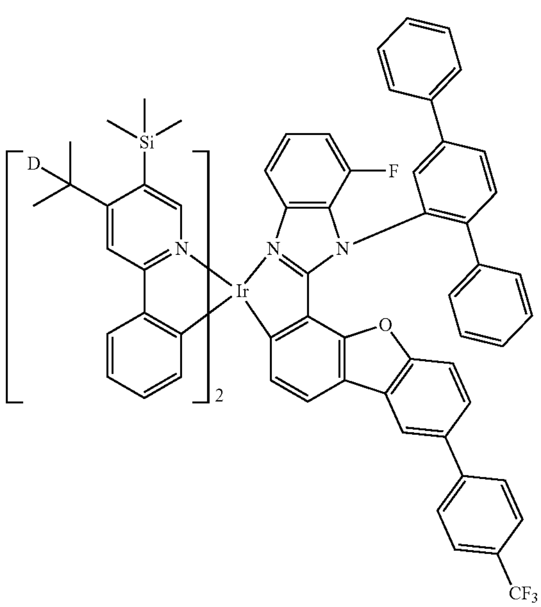
2187
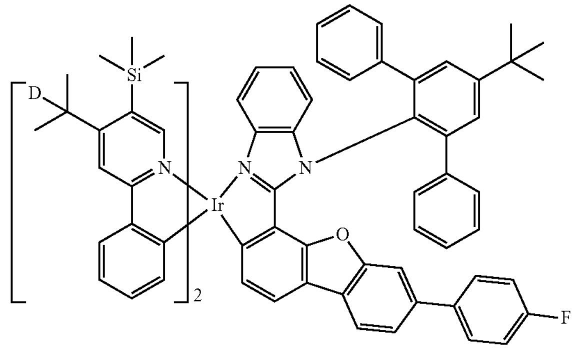
2188
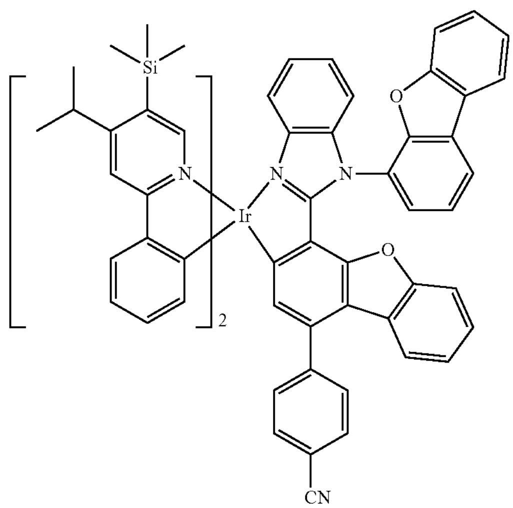
2189
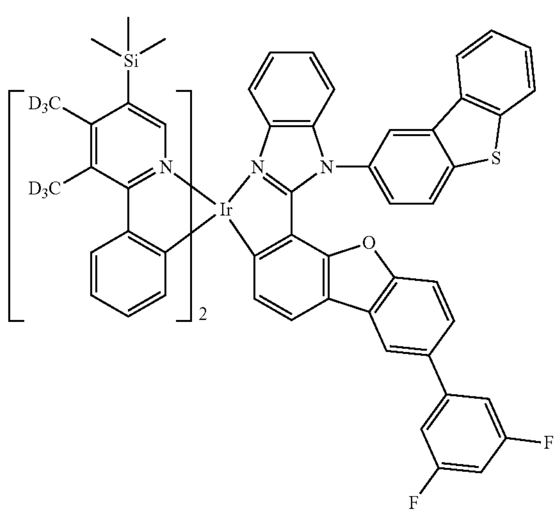

-continued
2190
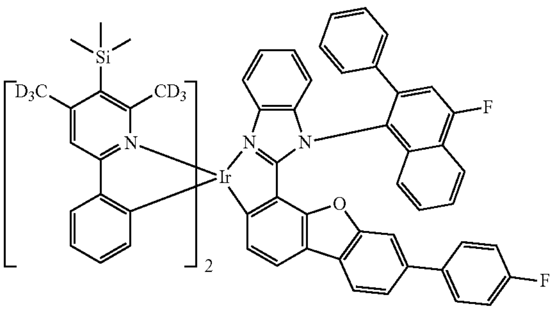
2191
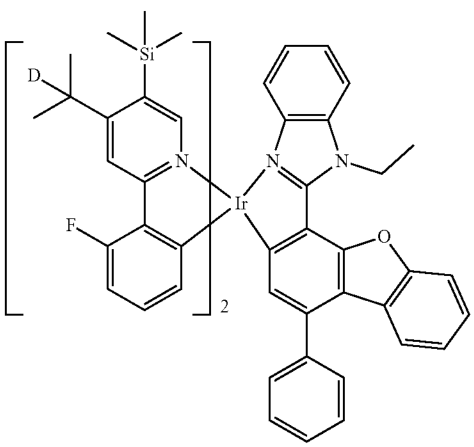
2192
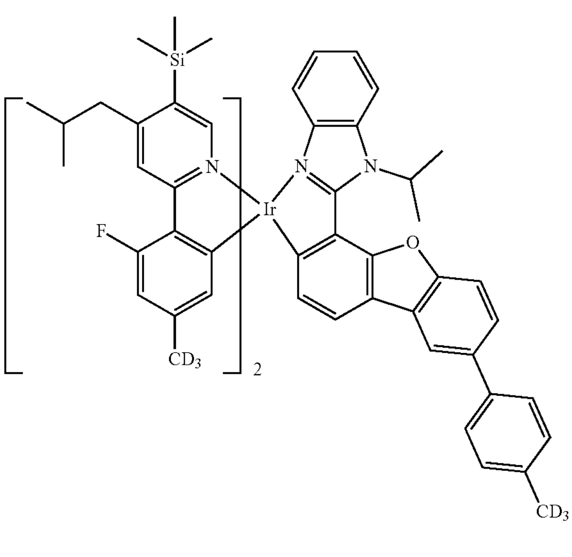
-continued
2193
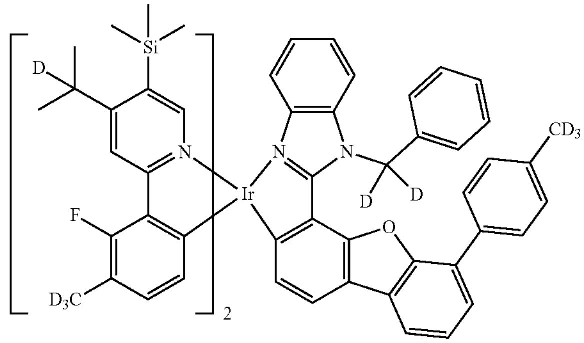
2194
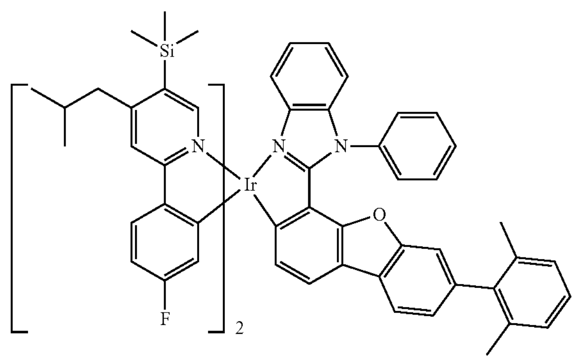
2195
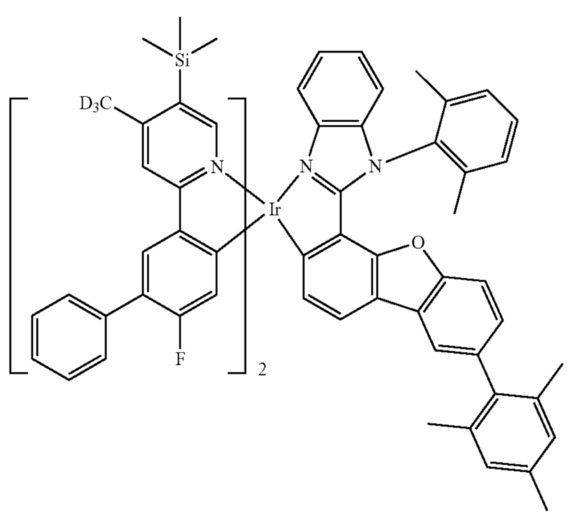

-continued
2196
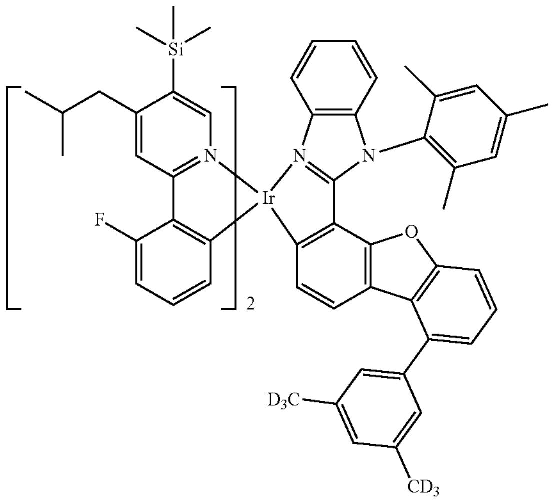
2197
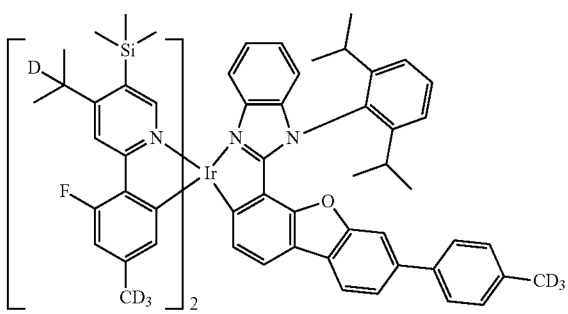
2198
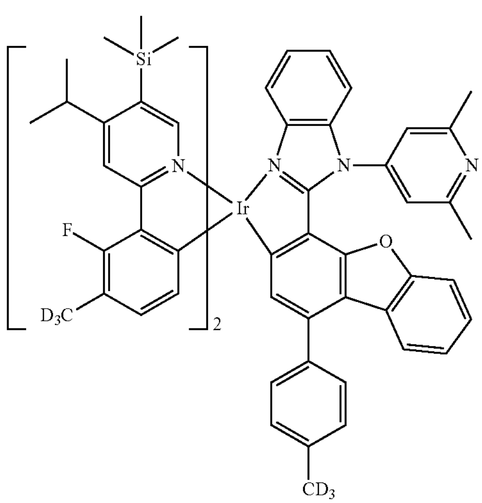
-continued
2199
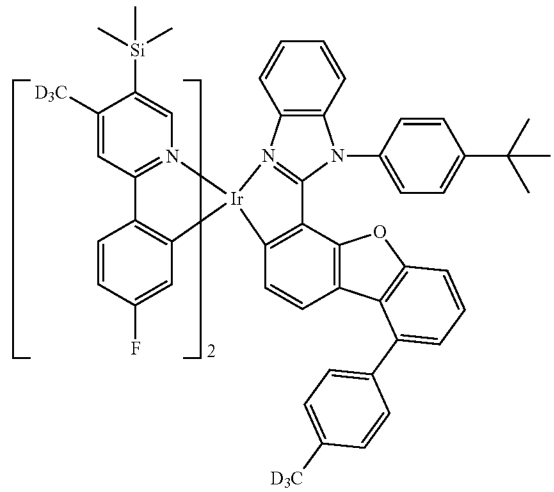
2200
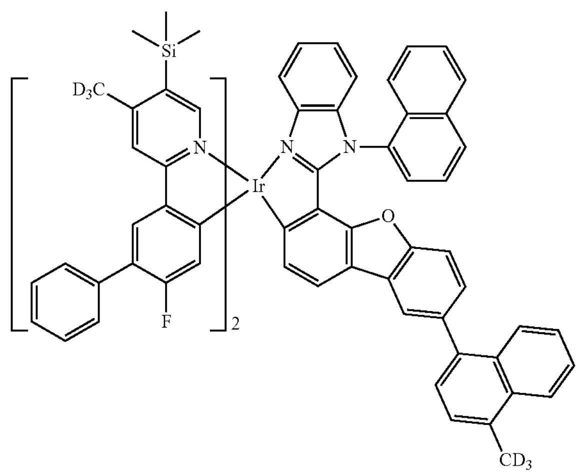
2201
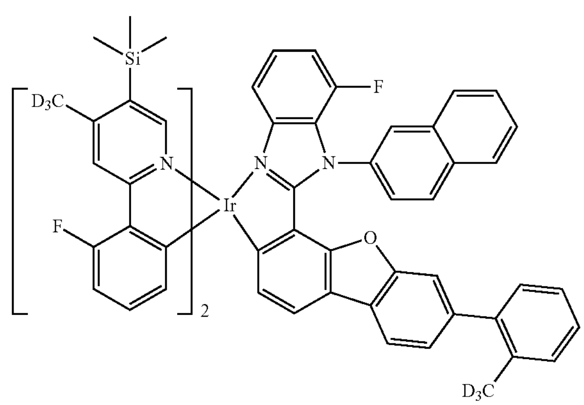

-continued
2202
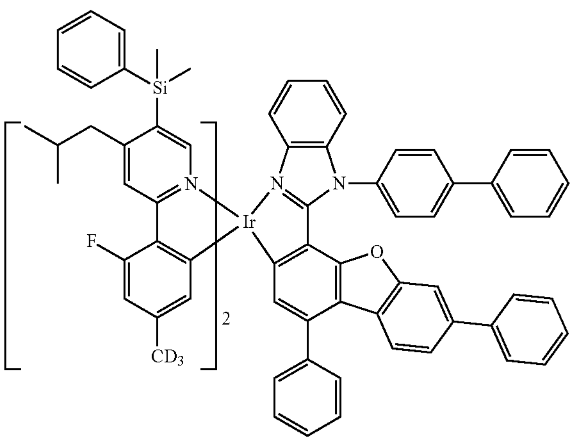
2203
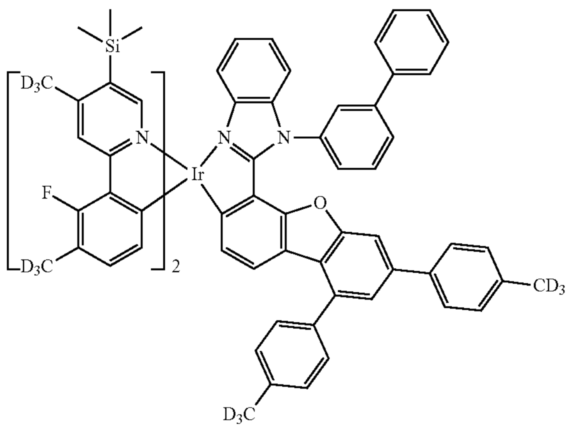
2204
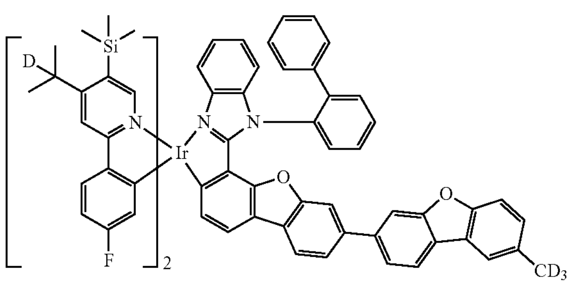
2205
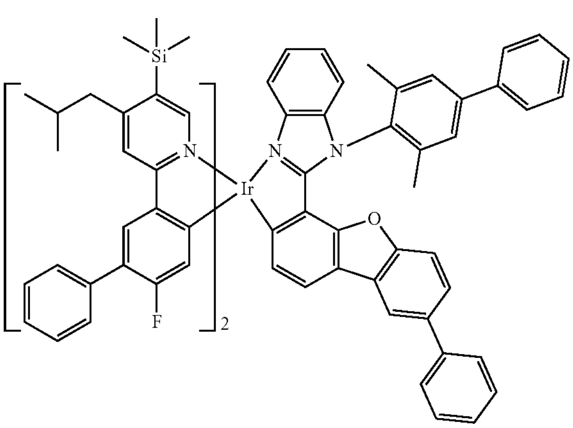
-continued
2206
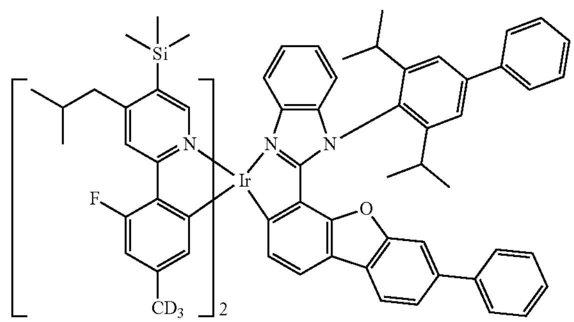
2207
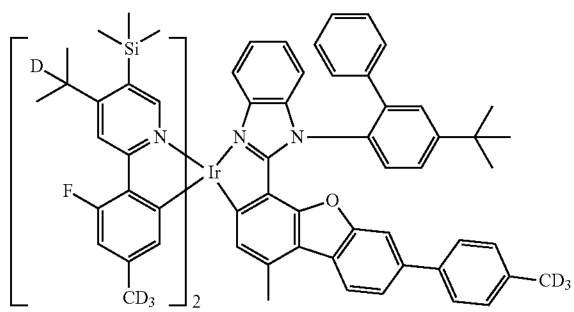
2208
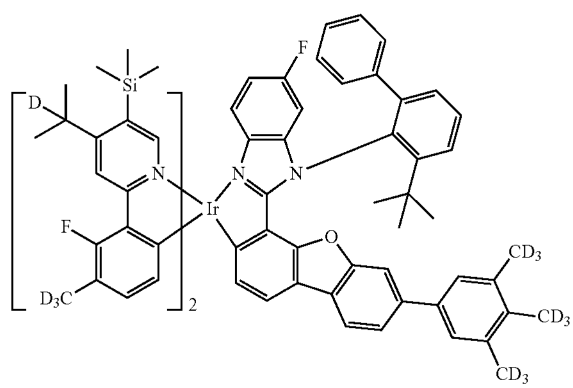
2209
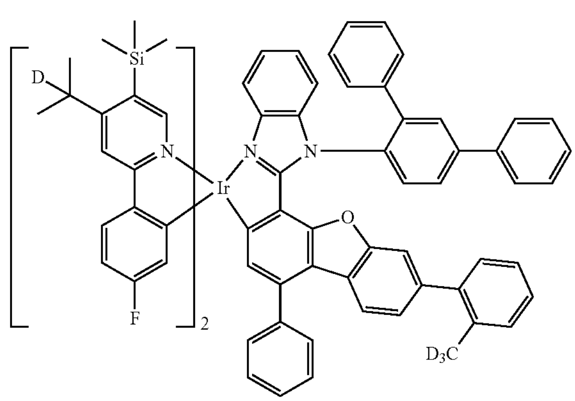

2210
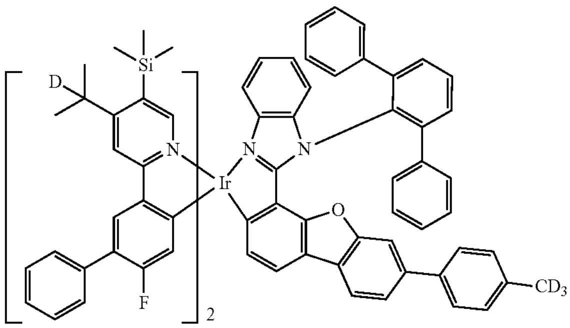
2211
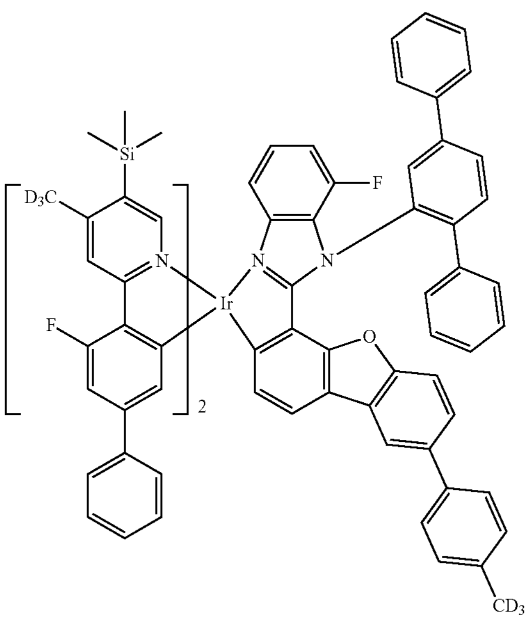
2212
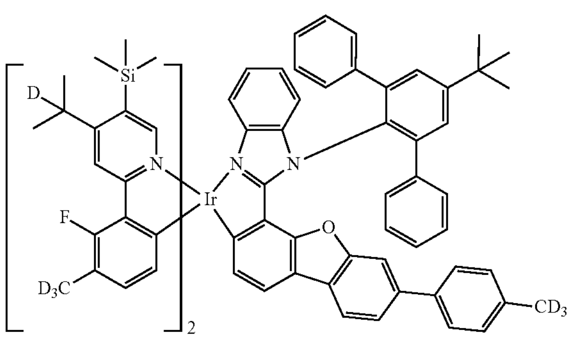
2213
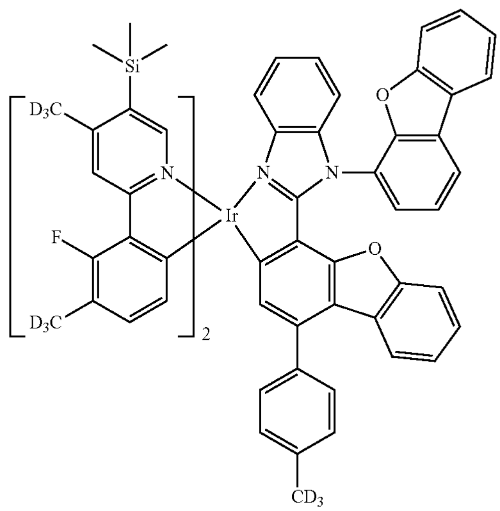
2214
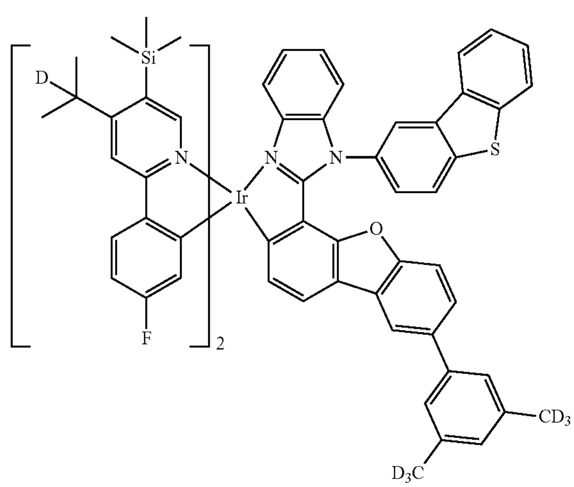
2215
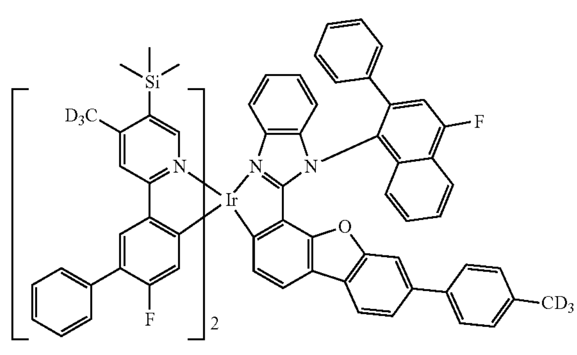

-continued
2216
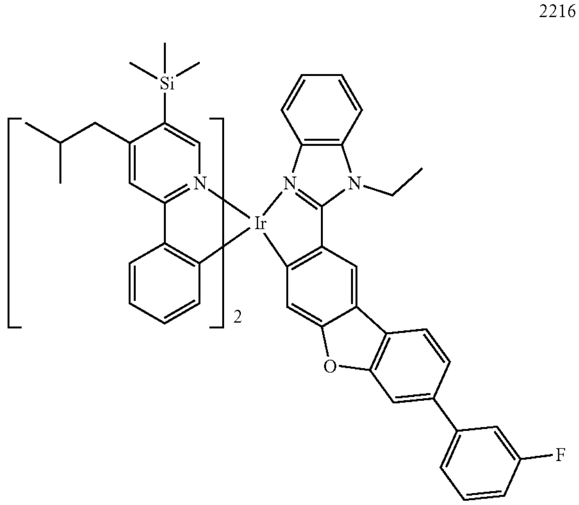
2217
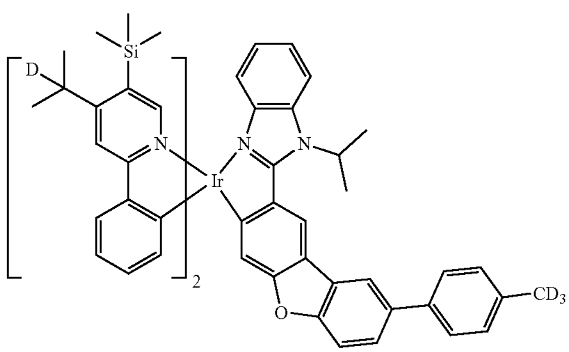
2218
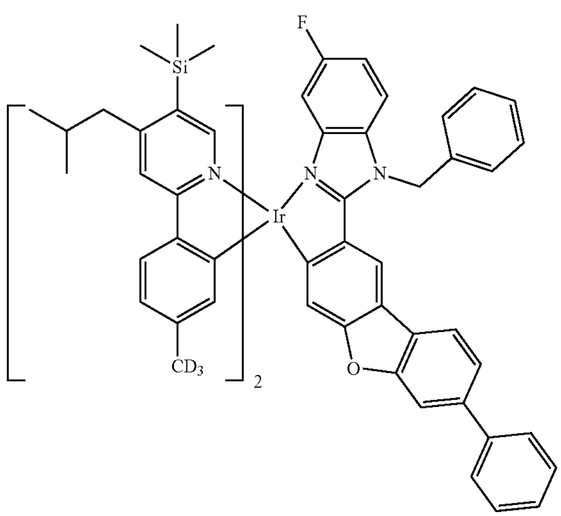
-continued
2219
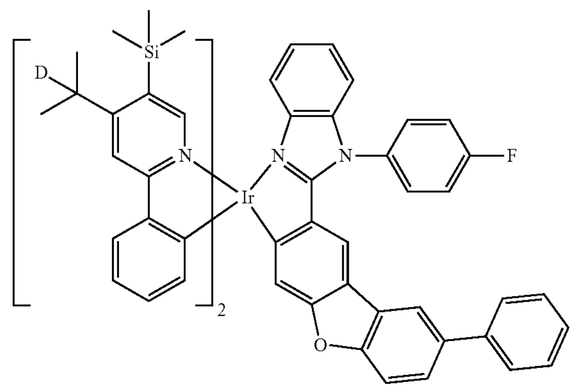
2220
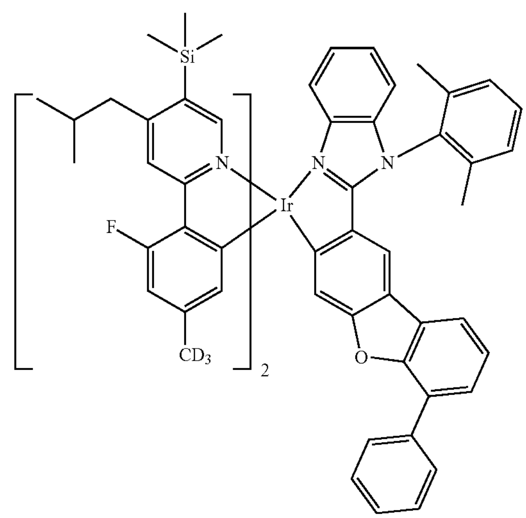
2221
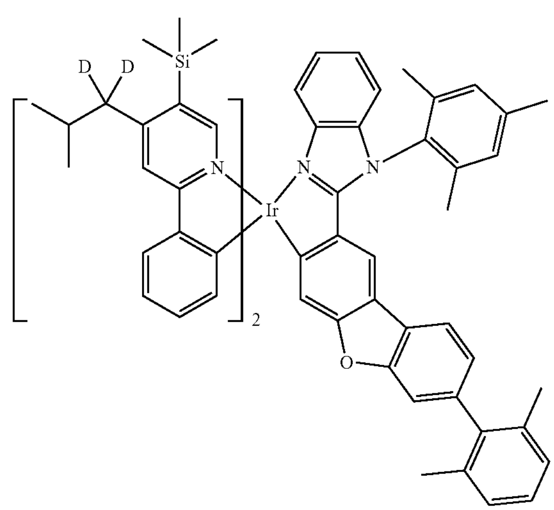

-continued
2222
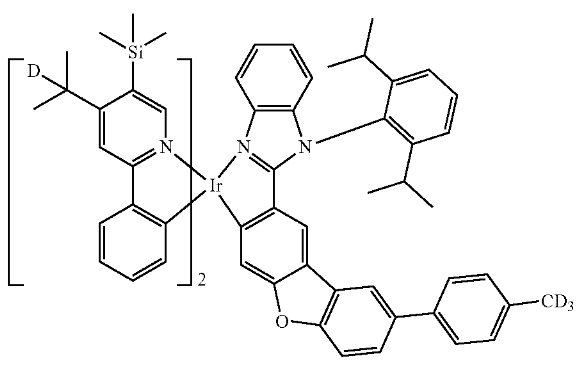
2223
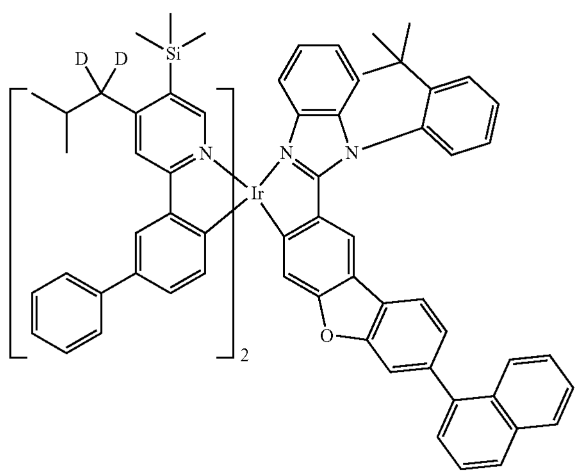
2224
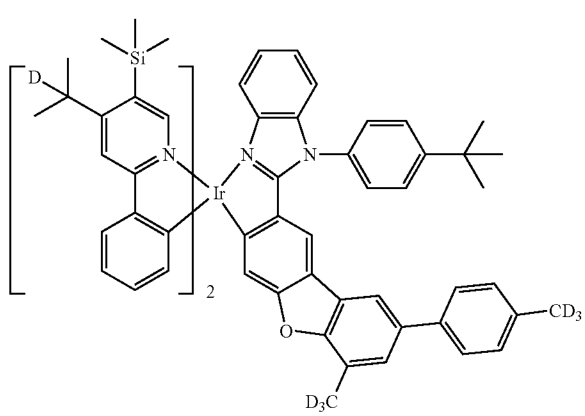
-continued
2225
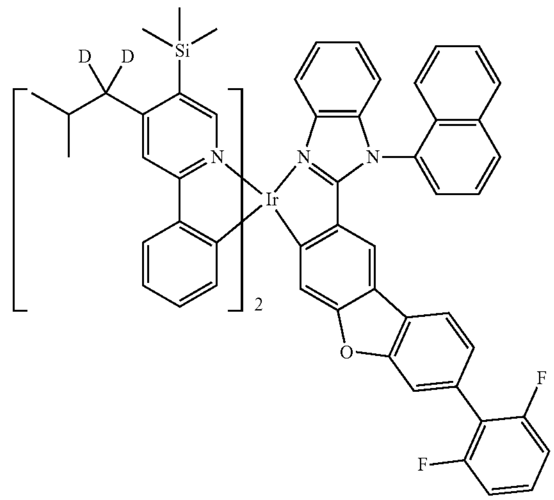
2226
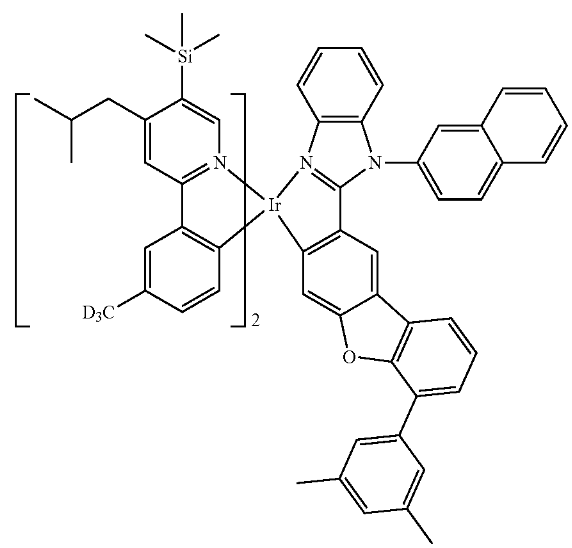
2227
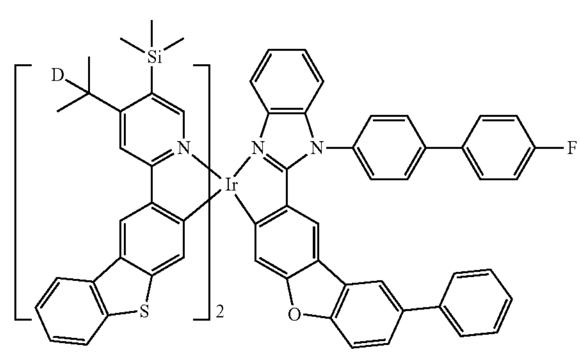

-continued
2228
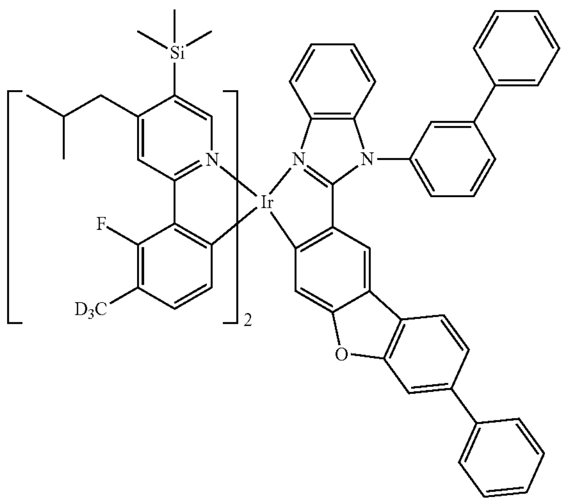
2229
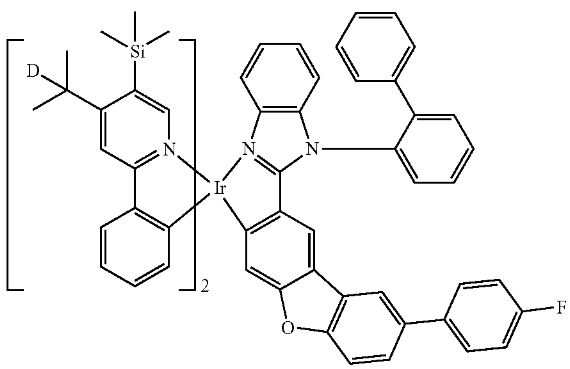
2230
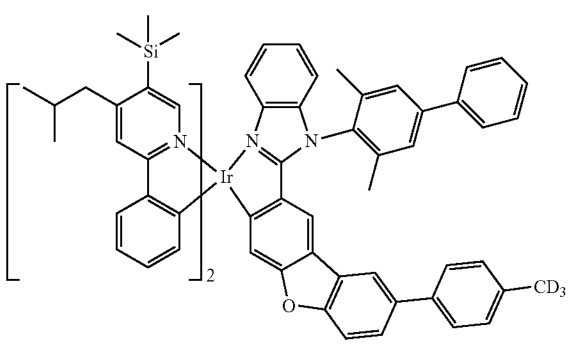
2231
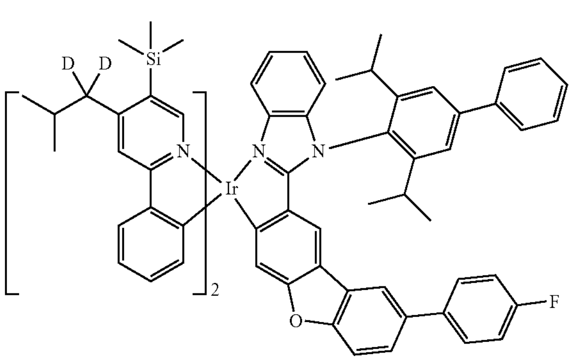
-continued
2232
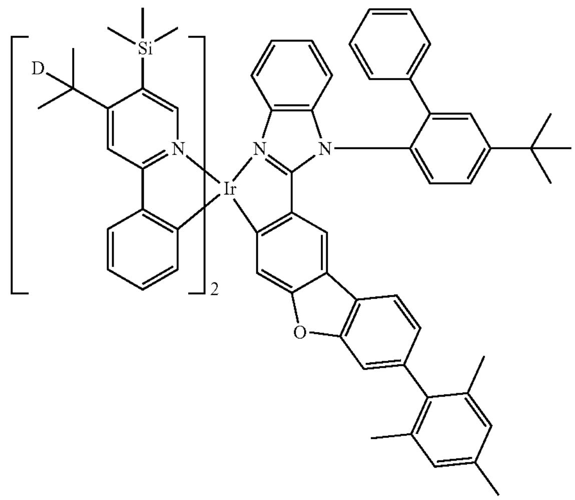
2242
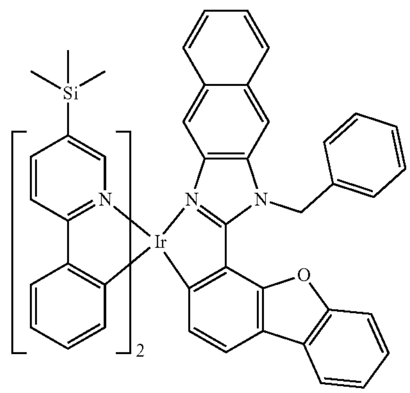
2243
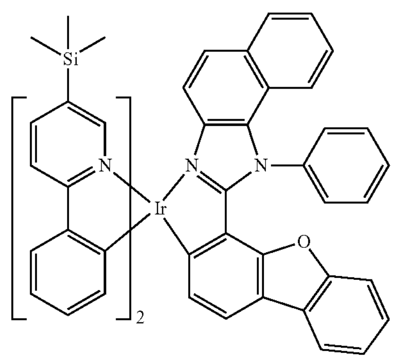
2244
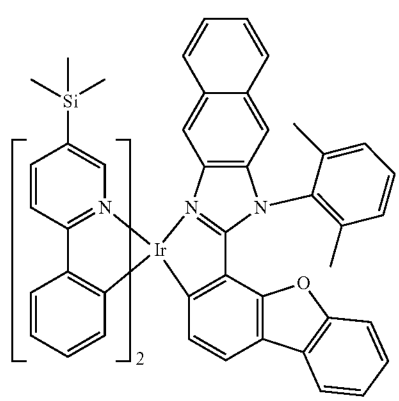

-continued
2245
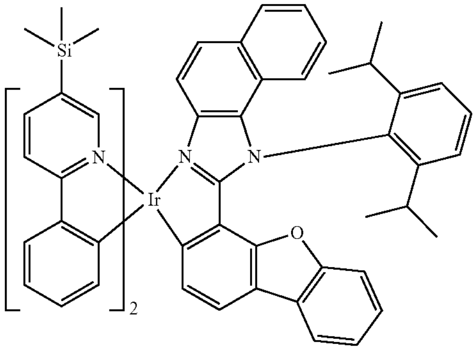
2246
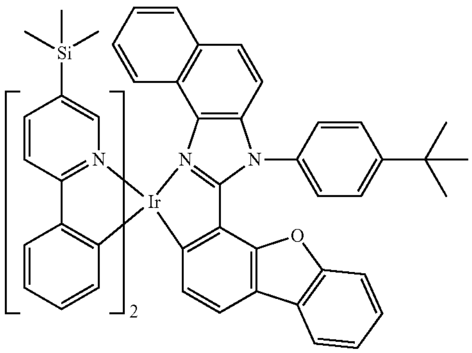
2247
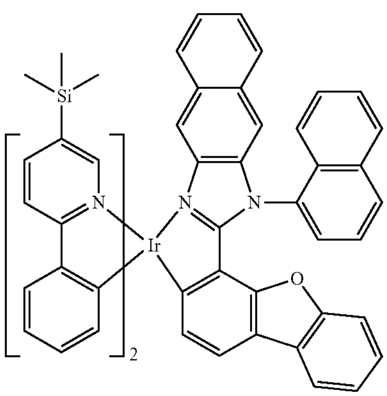
2248
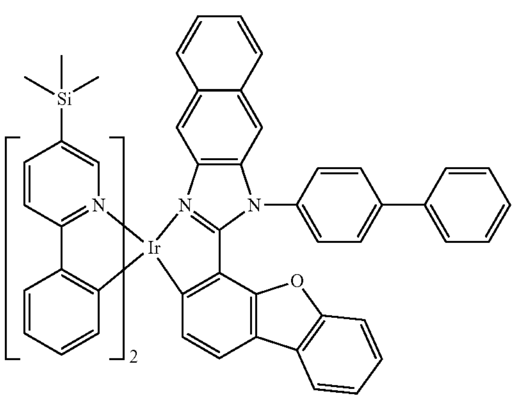
-continued
2249
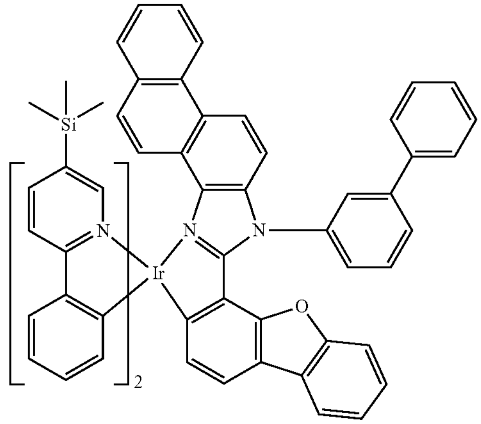
2250
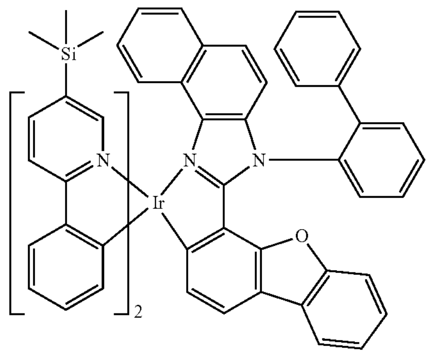
2251
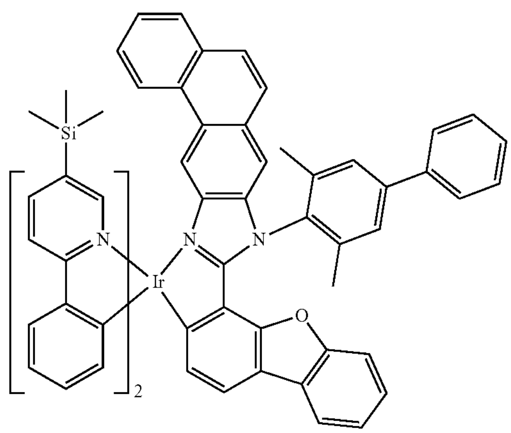
2252
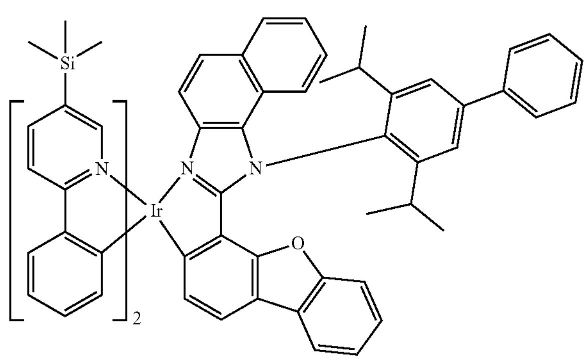

2253
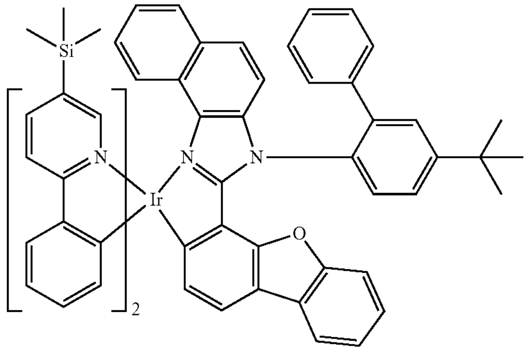
2254
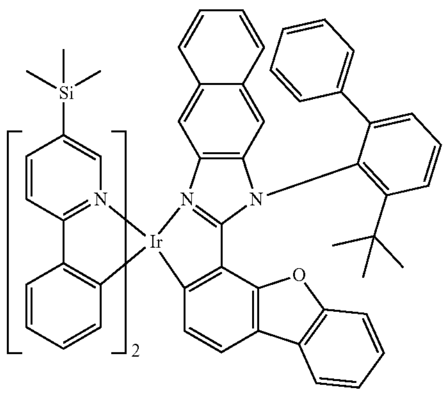
2255
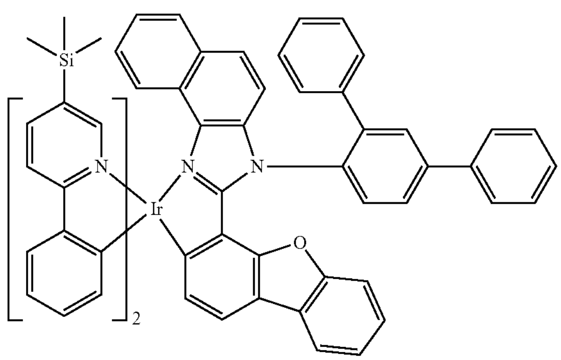
2256
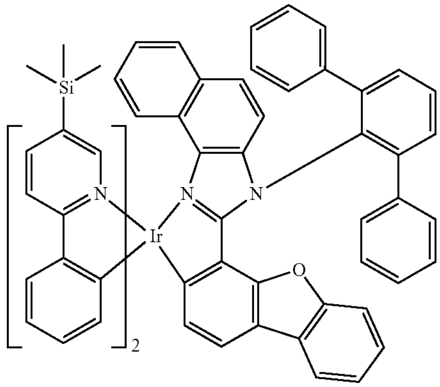
2257
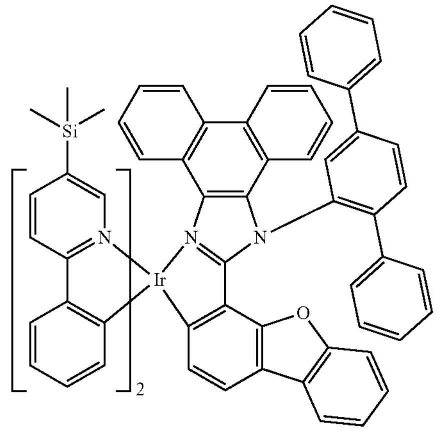
2258
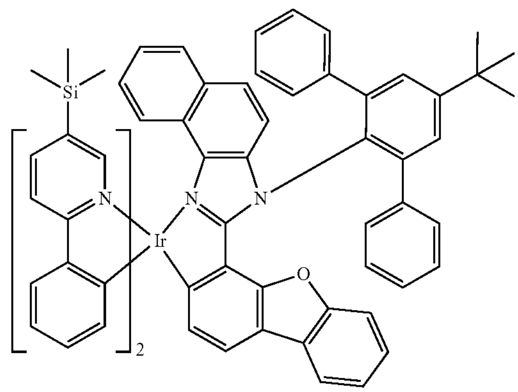
2259
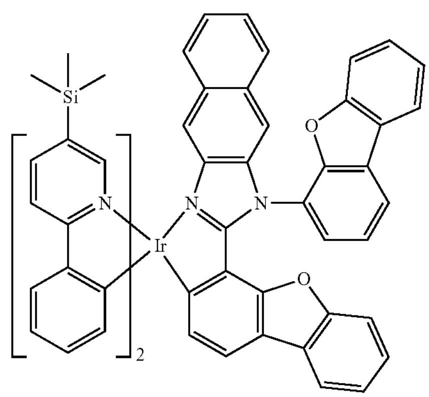
2260
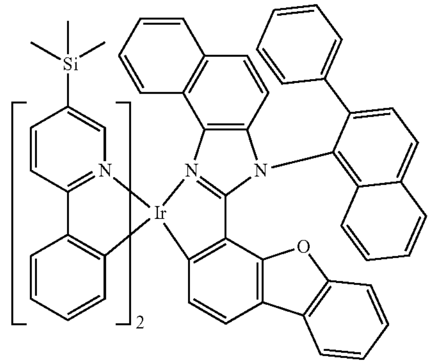

2261
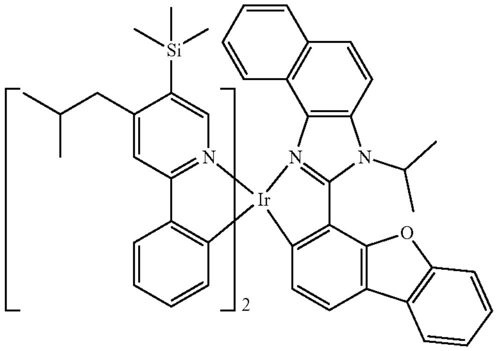
2262
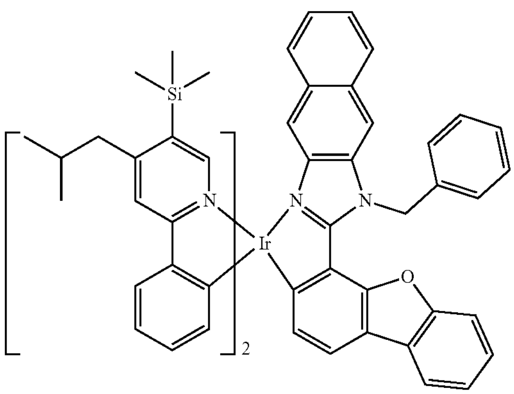
2263
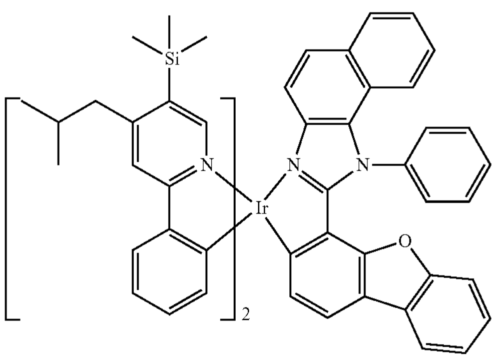
2264
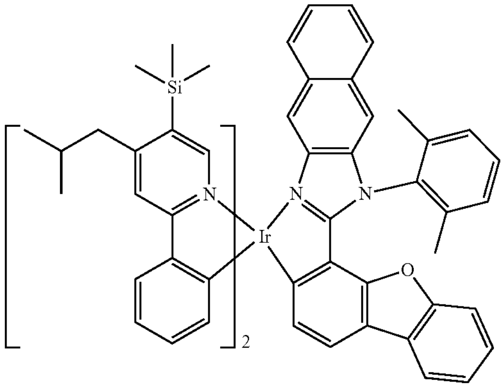
2265
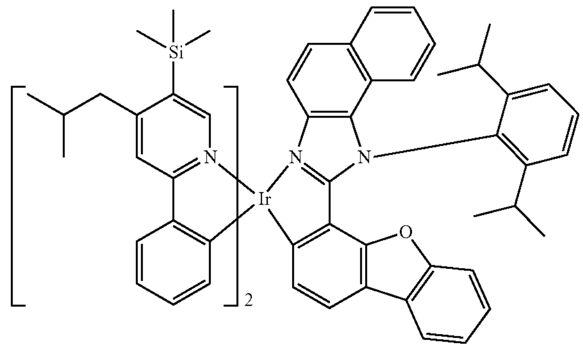
2266
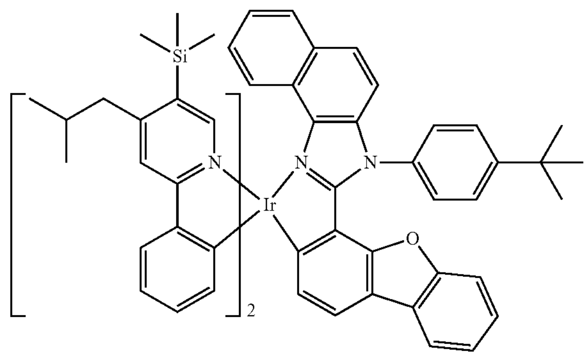
2267
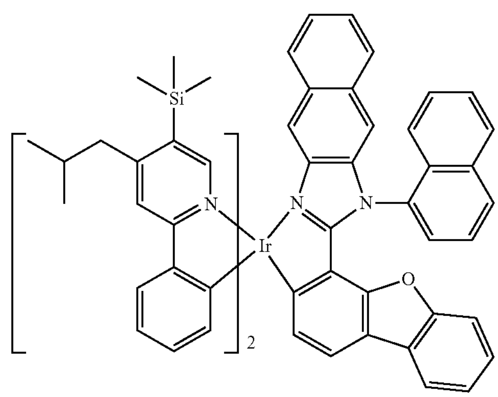
2268
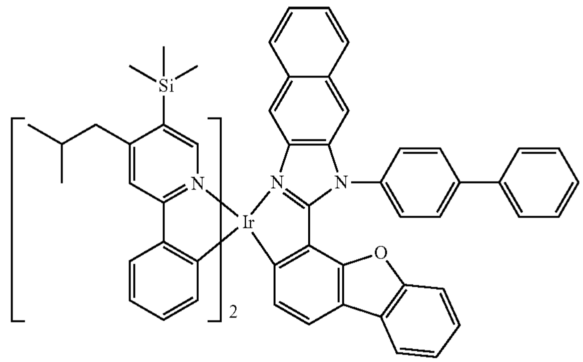

2269
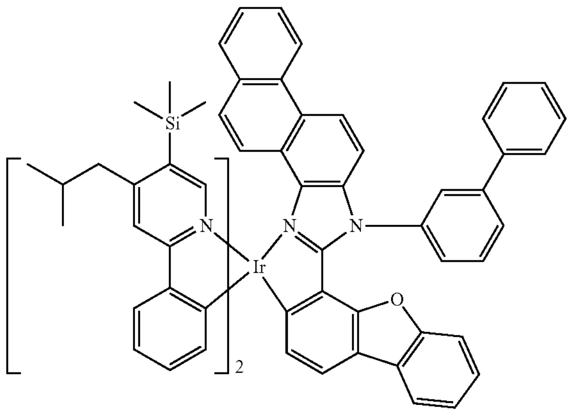
2270
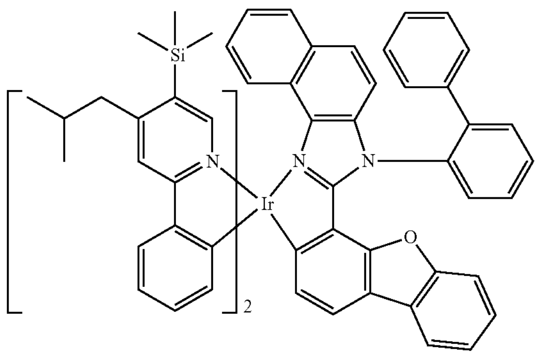
2271
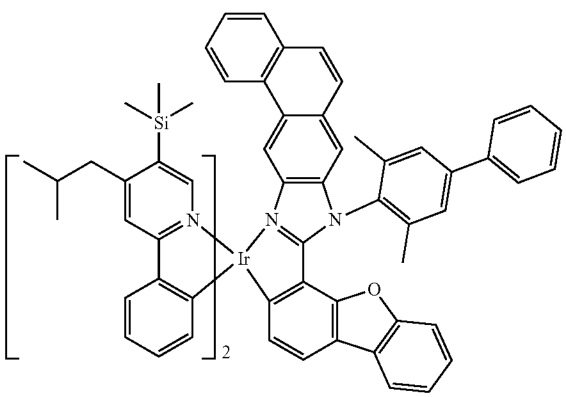
2272
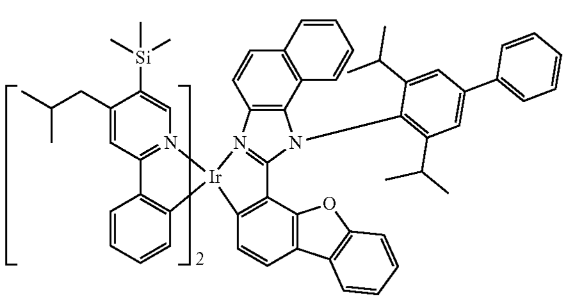
2273
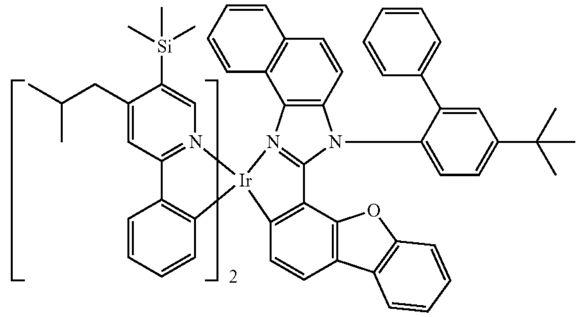
2274
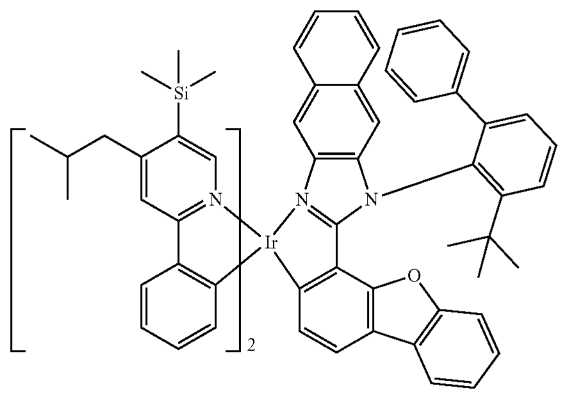
2275
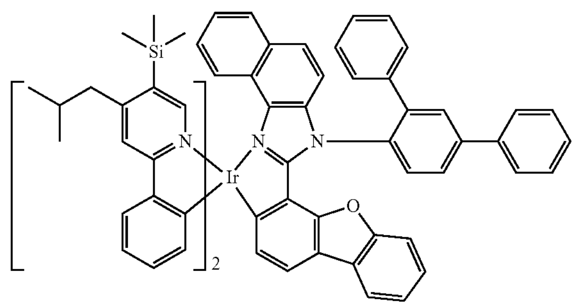
2276
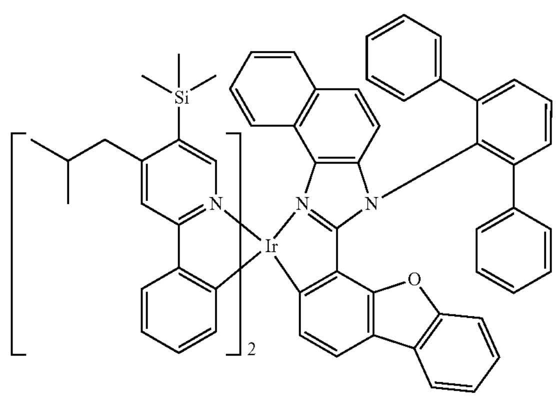

-continued
2277
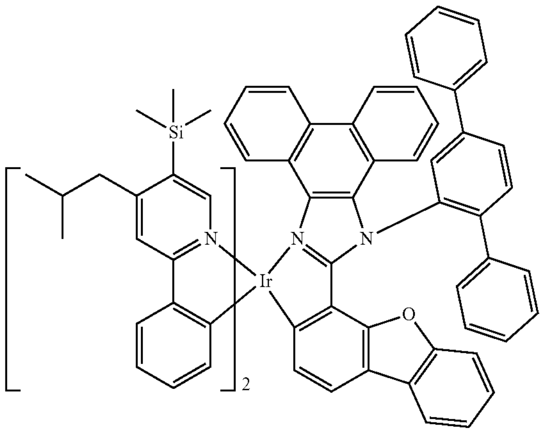
2278
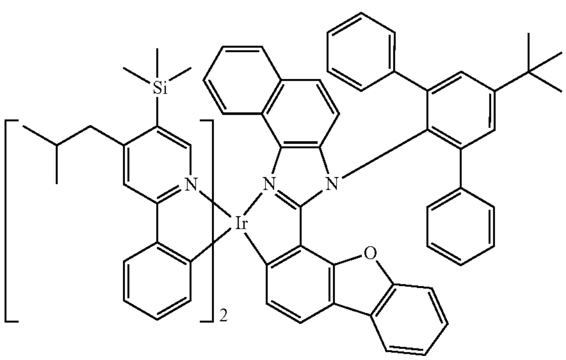
2279
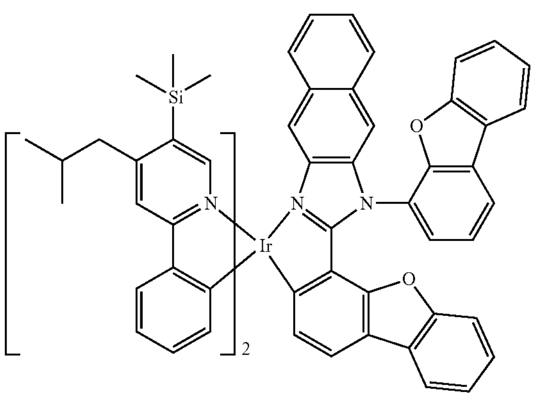
2280
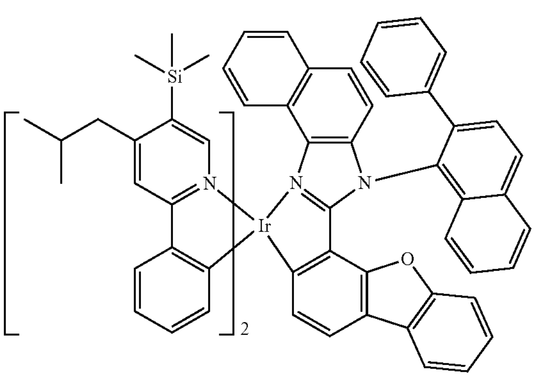
-continued
2281
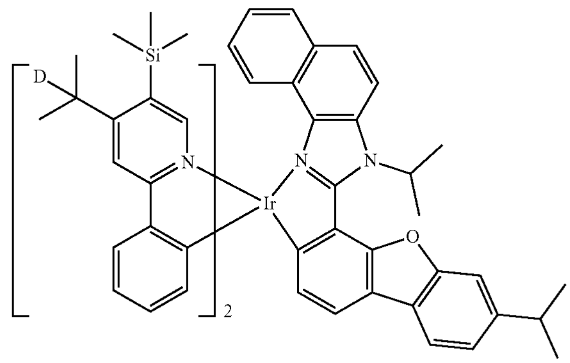
2282
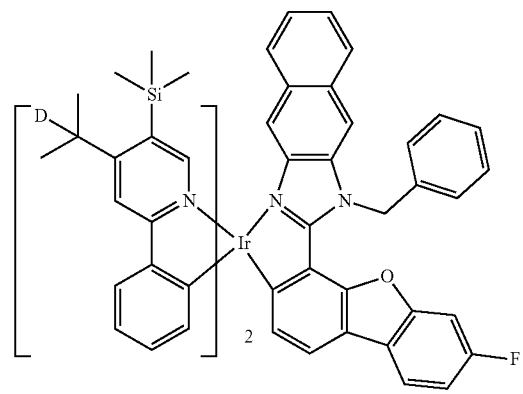
2283
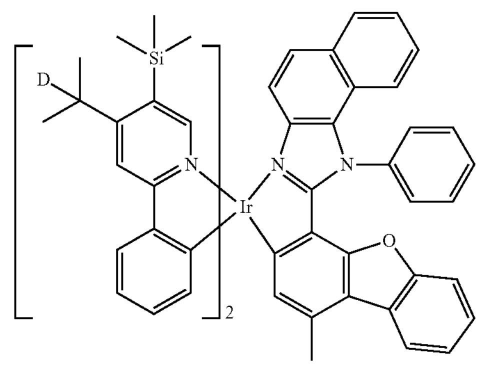
2284
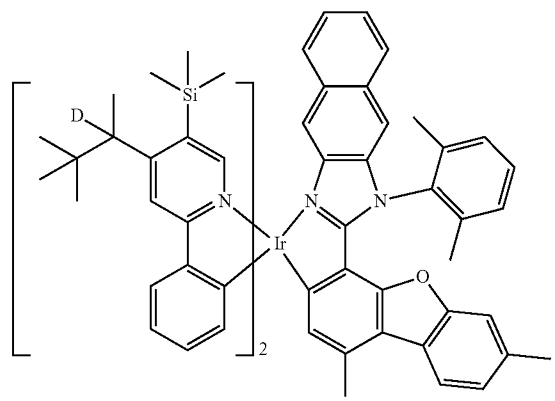

-continued
2285
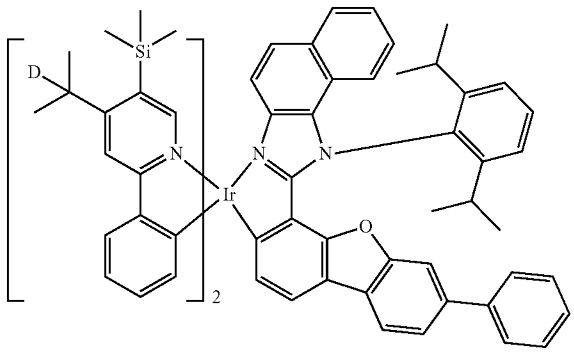
2286
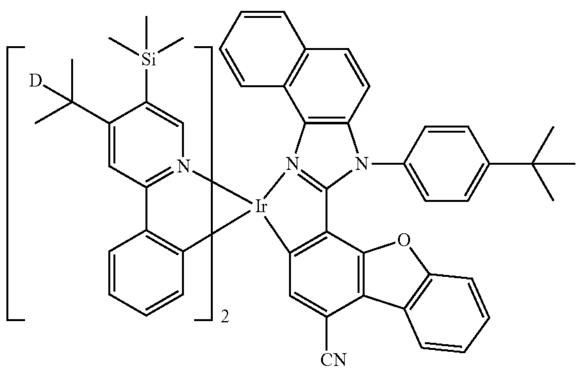
2287
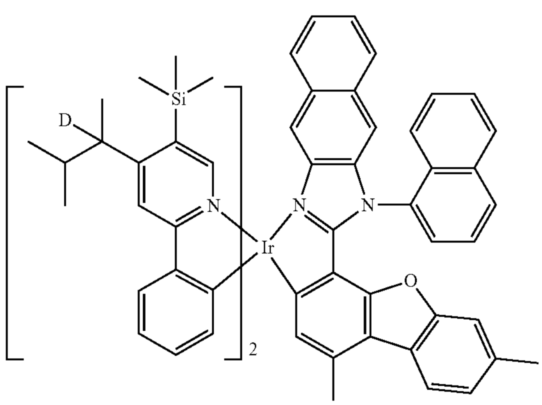
2288
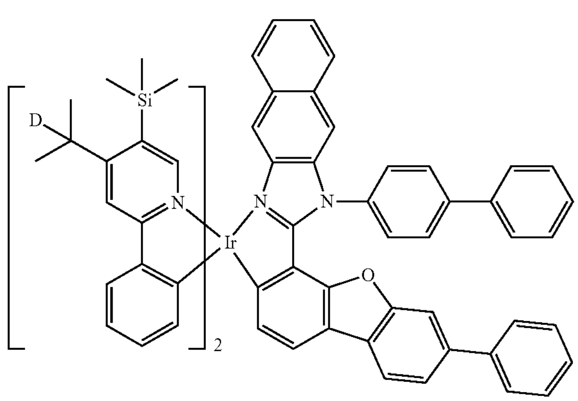
-continued
2289
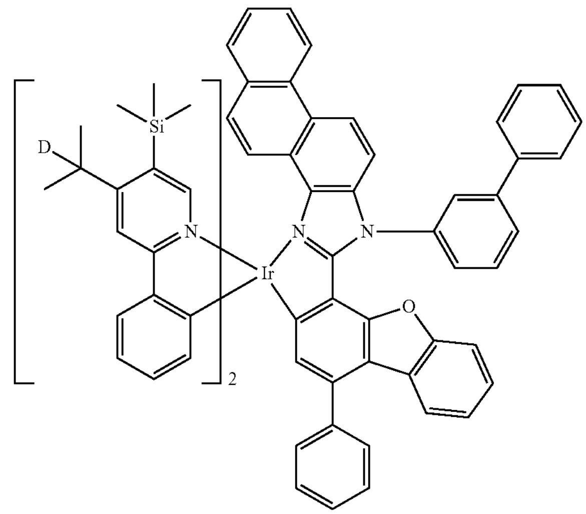
2290
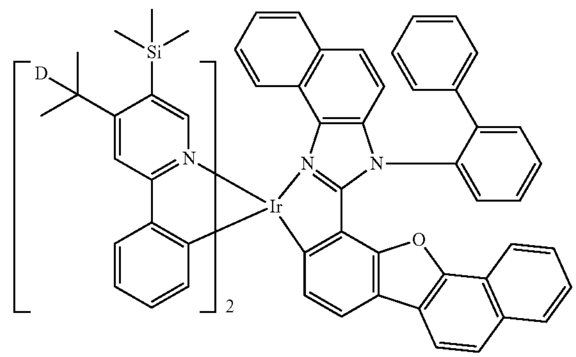
2291
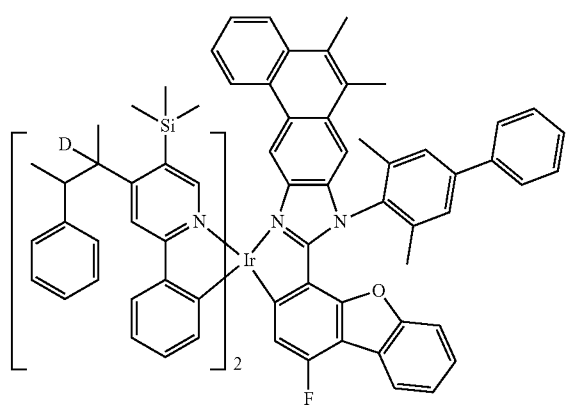
2292
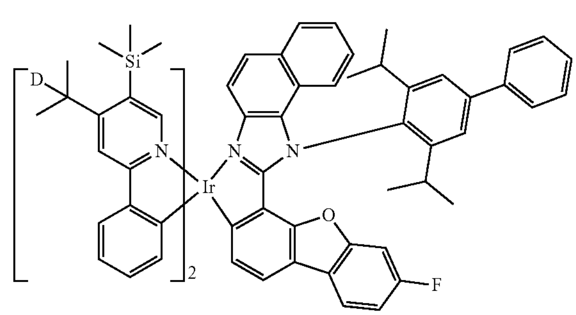

-continued
2293
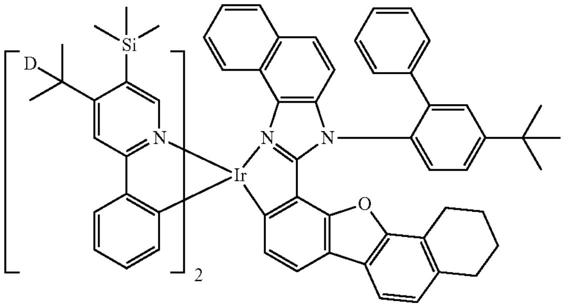
2294
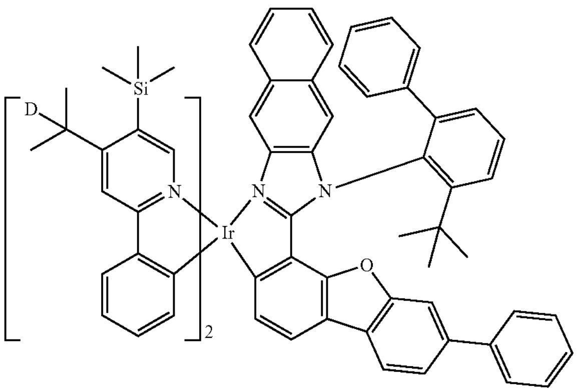
2295
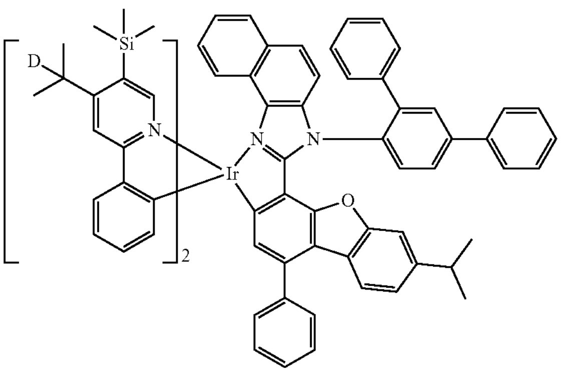
2296
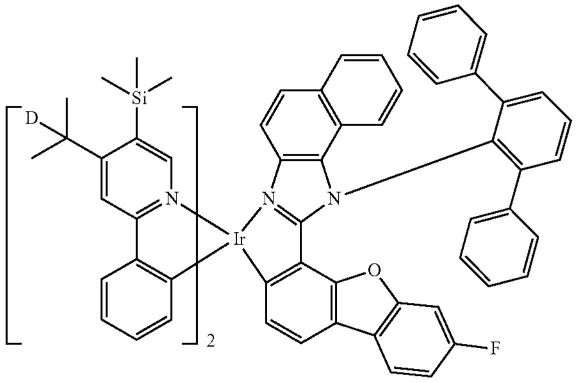
-continued
2297
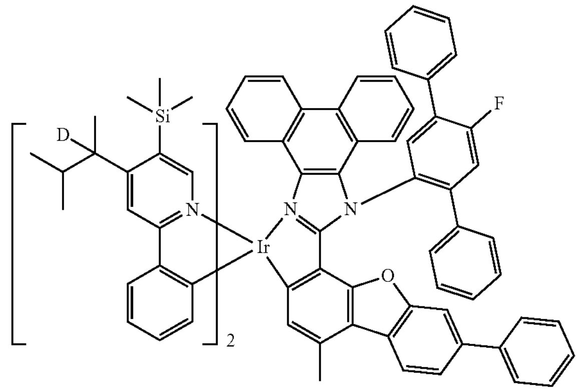
2298
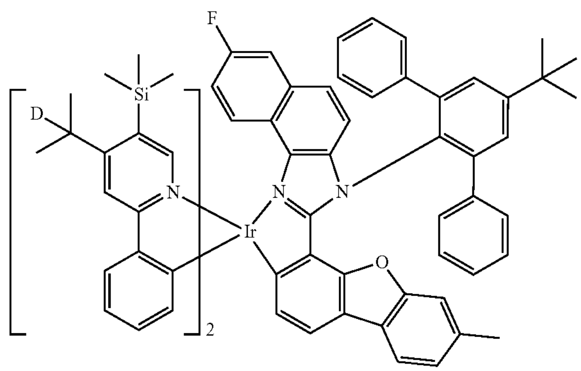
2299
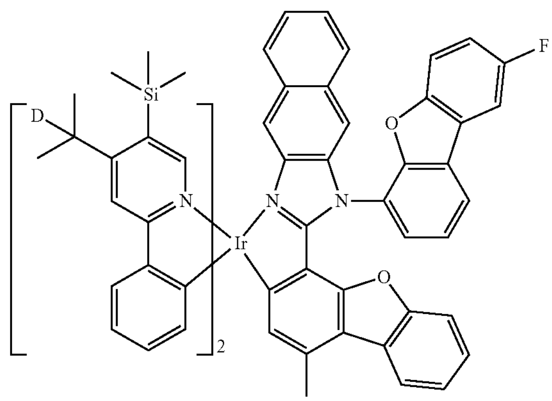
2300
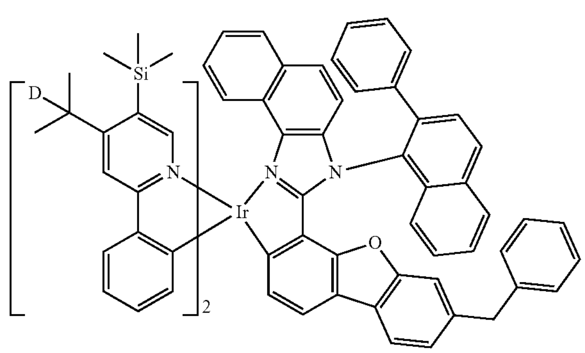

-continued
2301
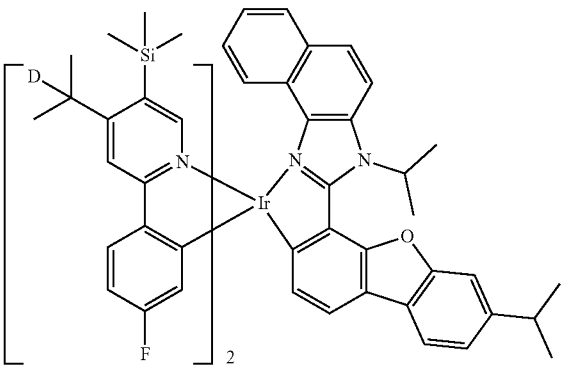
2302
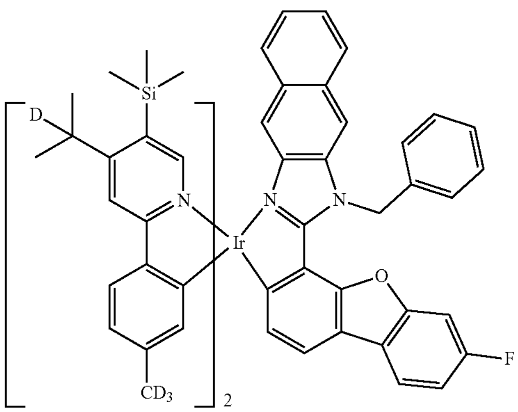
2303
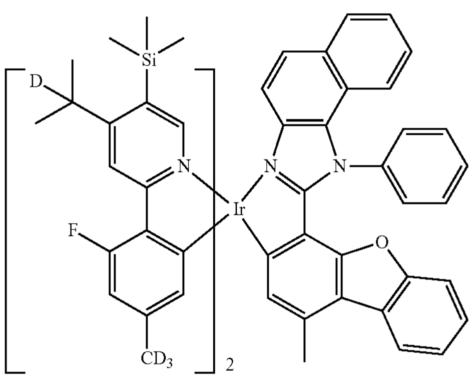
2304
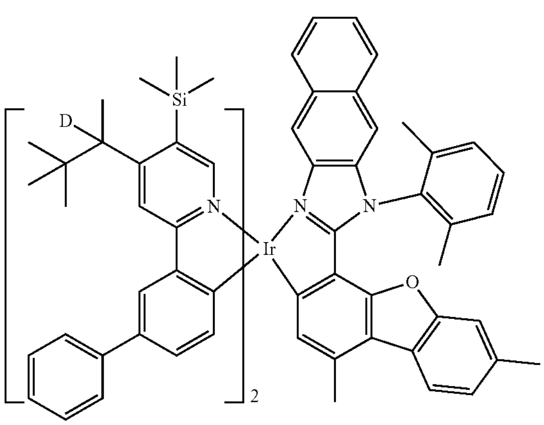
-continued
2305
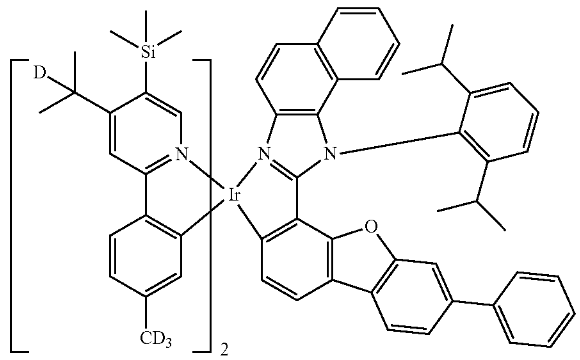
2306
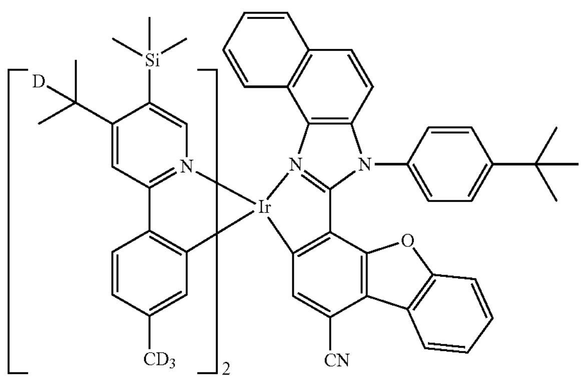
2307
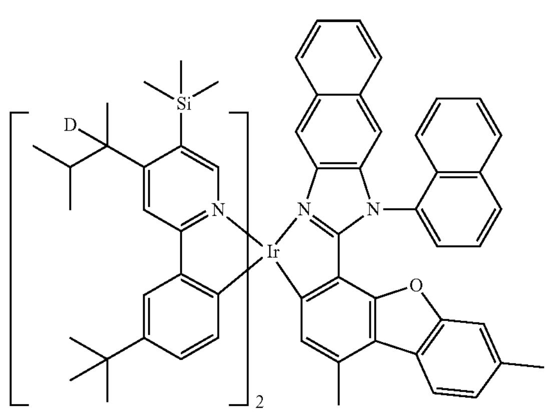

-continued
2308
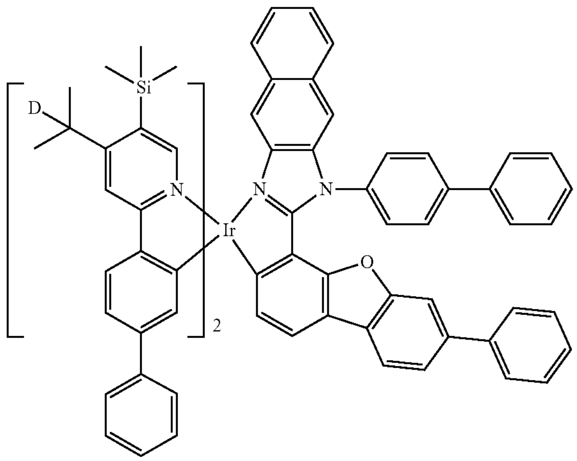
2309
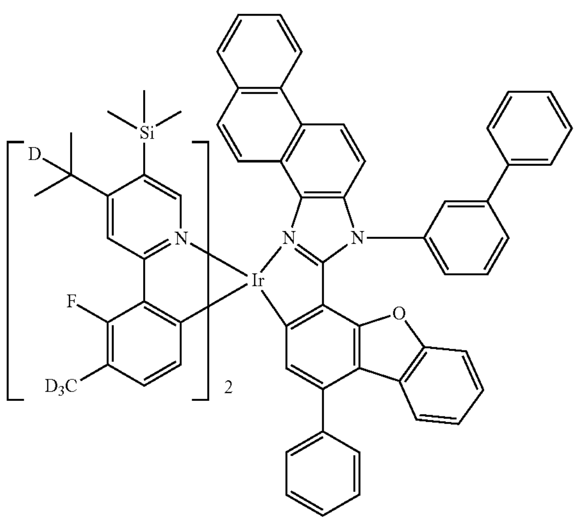
2310
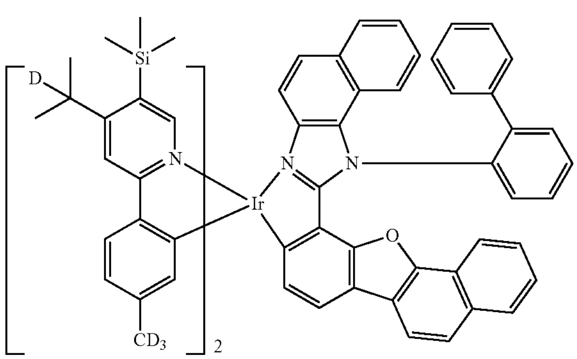
-continued
2311
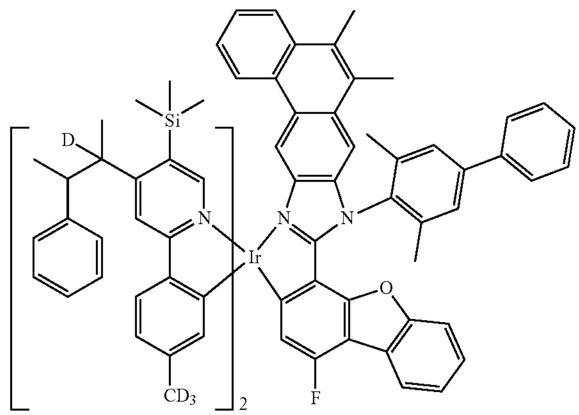
2312
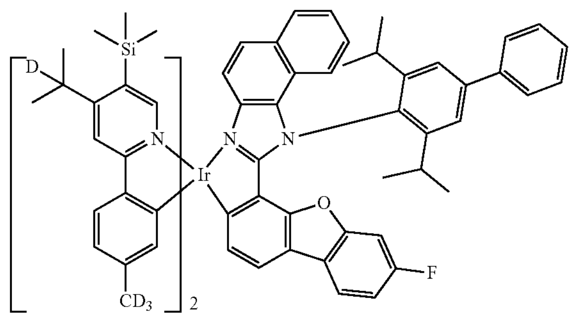
2313
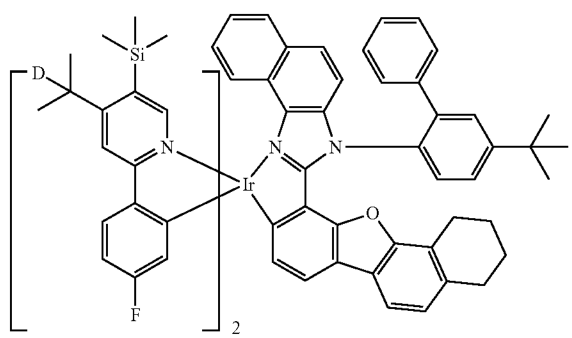
2314
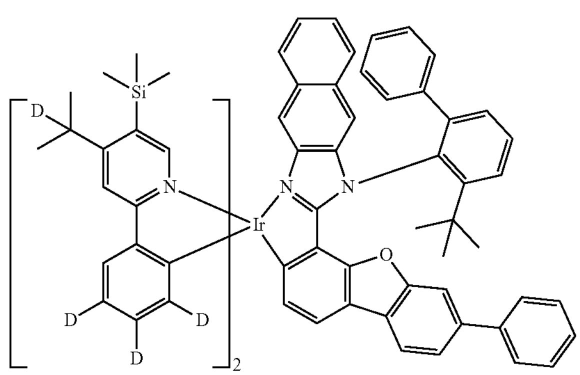

-continued
2315
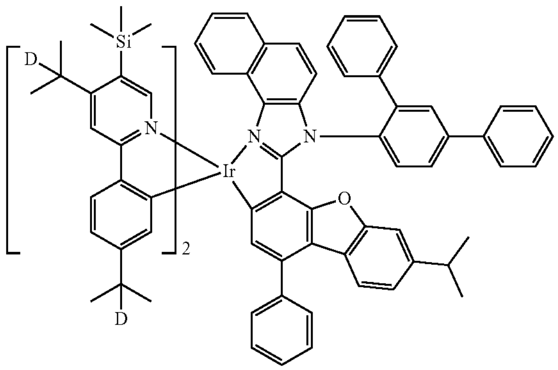
2316
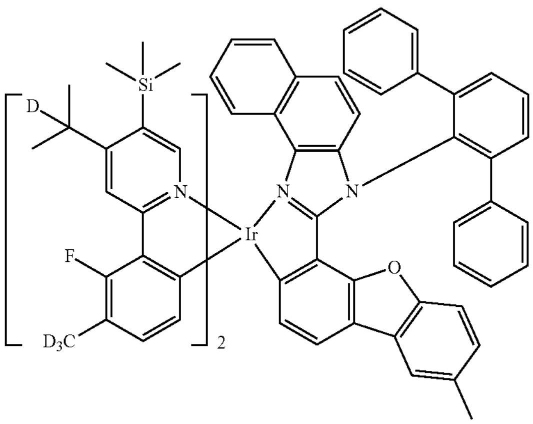
2317
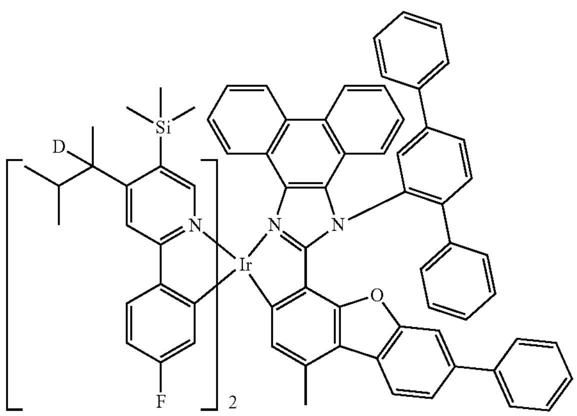
2318
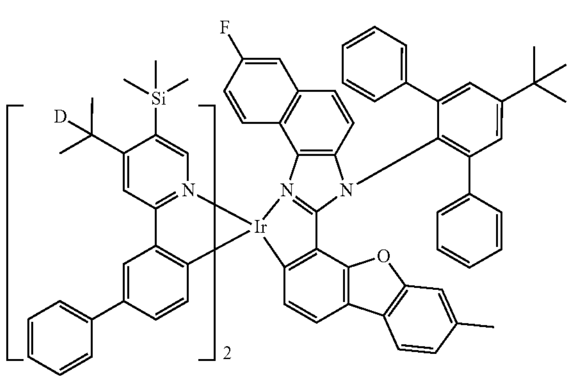
-continued
2319
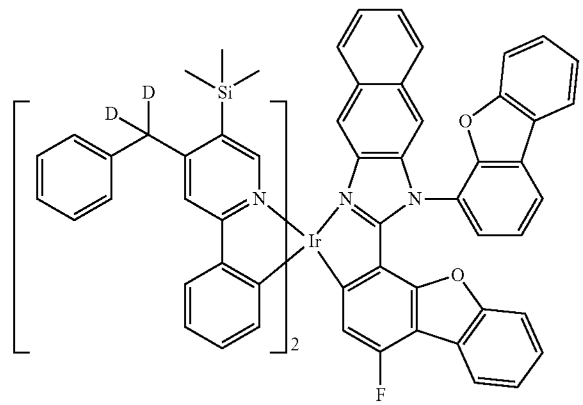
2320
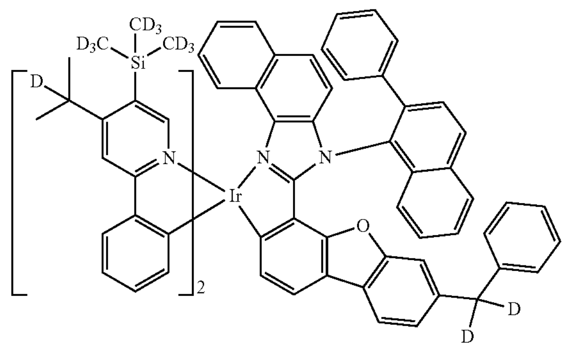
2321
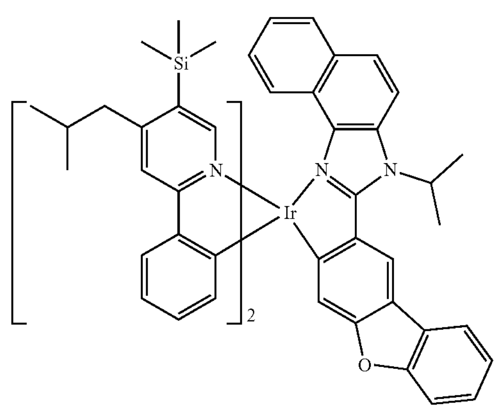

-continued
2322
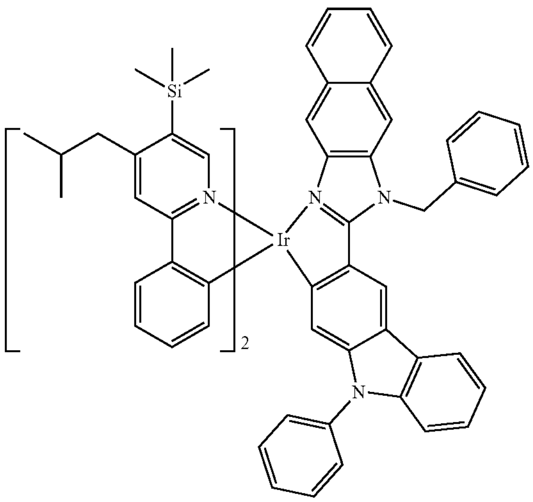
2323
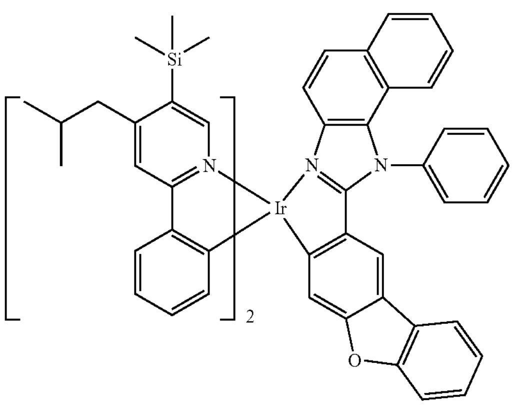
2324
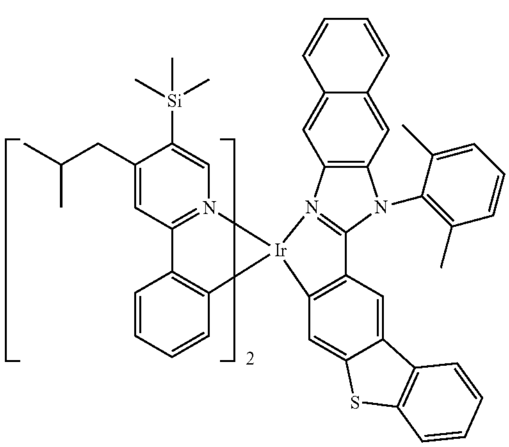
-continued
2325
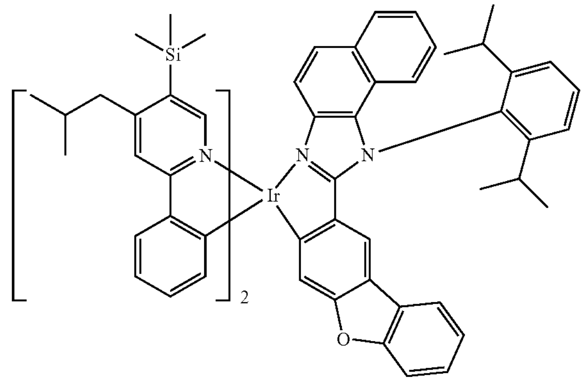
2326
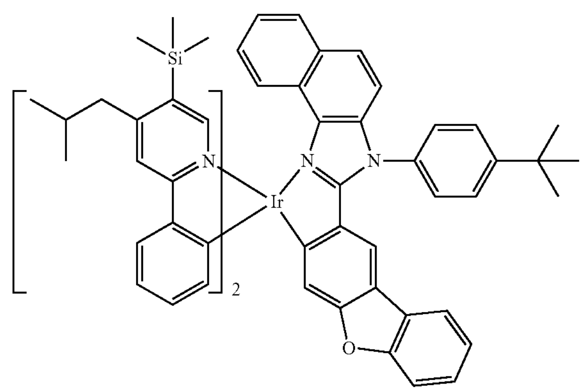
2327
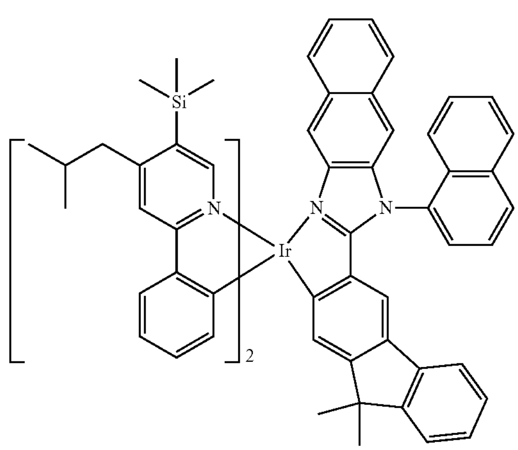

-continued
2328
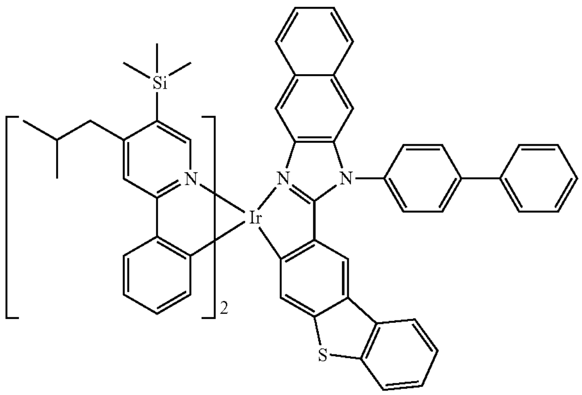
2329
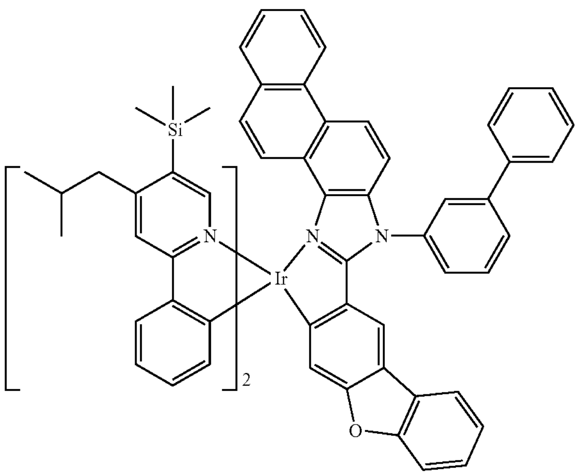
2330
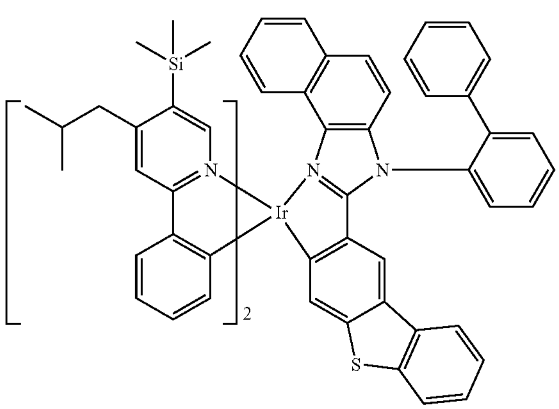
-continued
2331
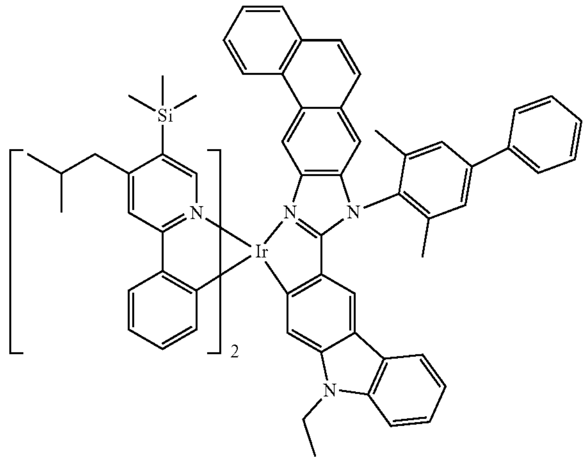
2332
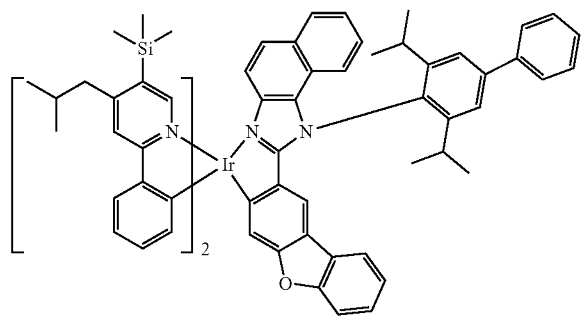
2333
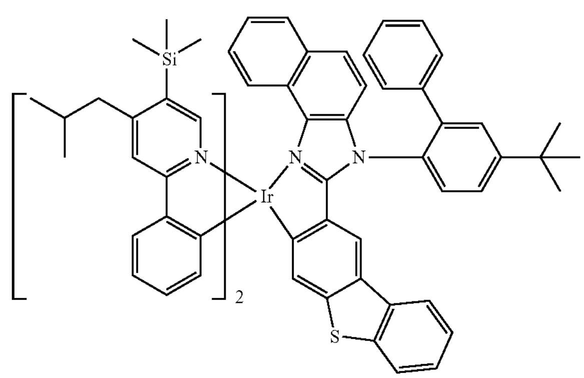

2334
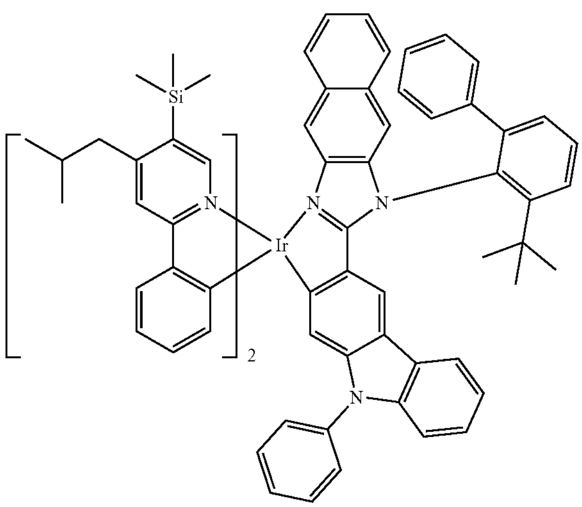
2335
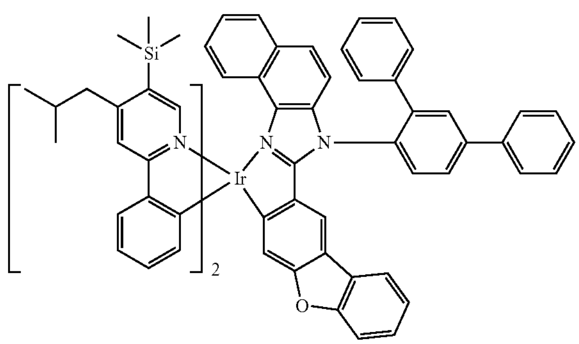
2336
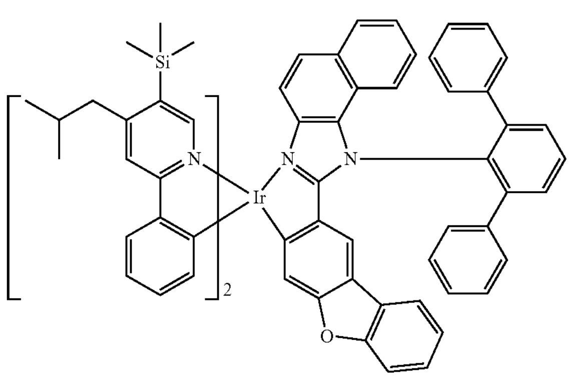
2337
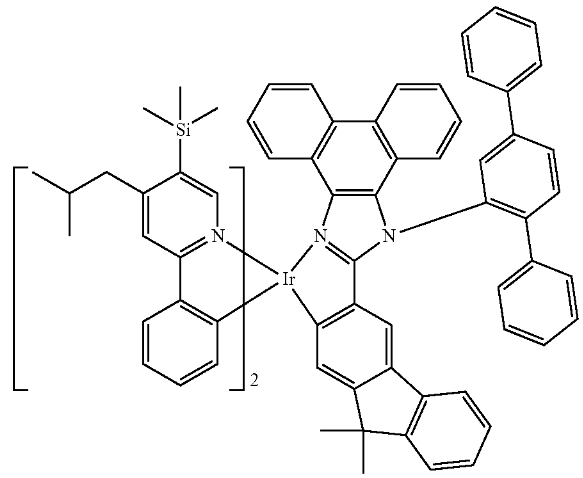
2338
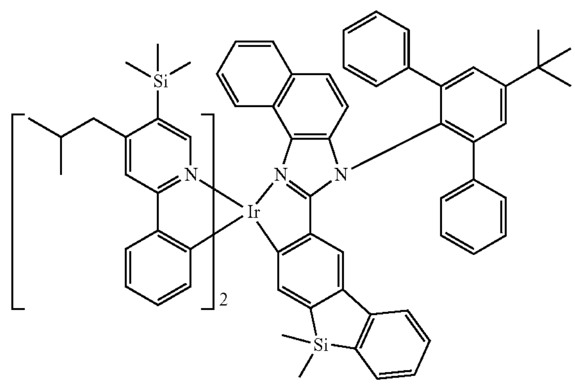
2339
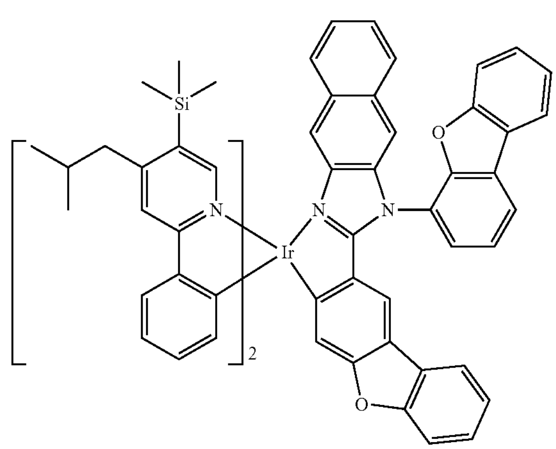

2340
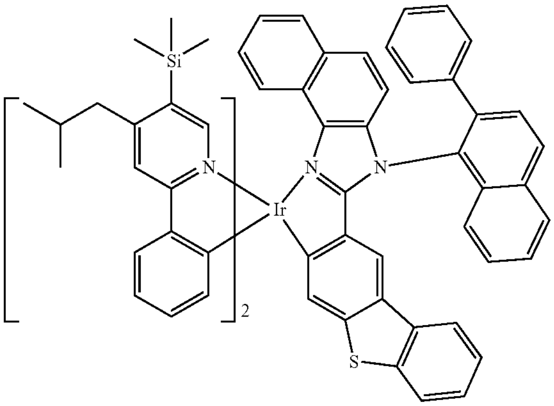
2341
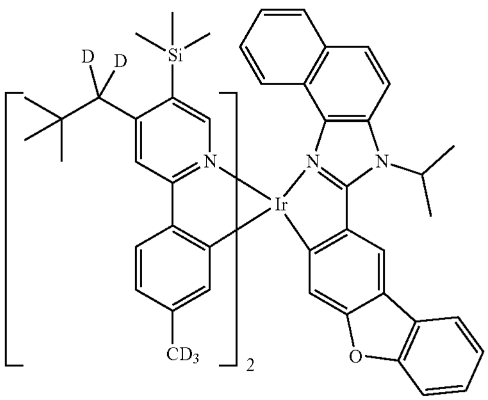
2342
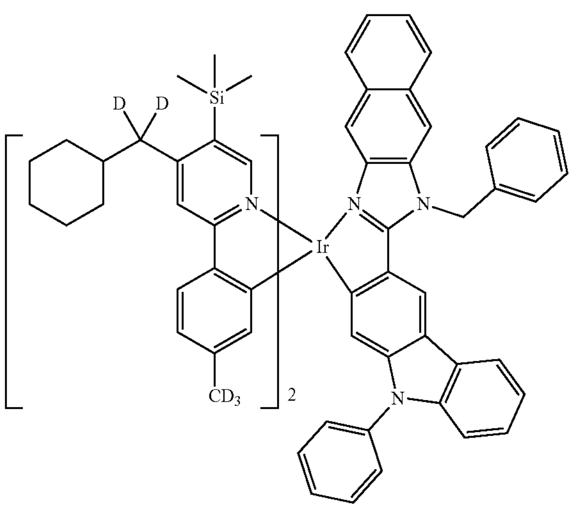
2343
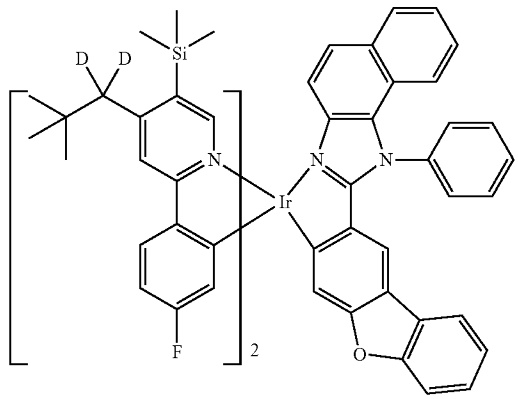
2344
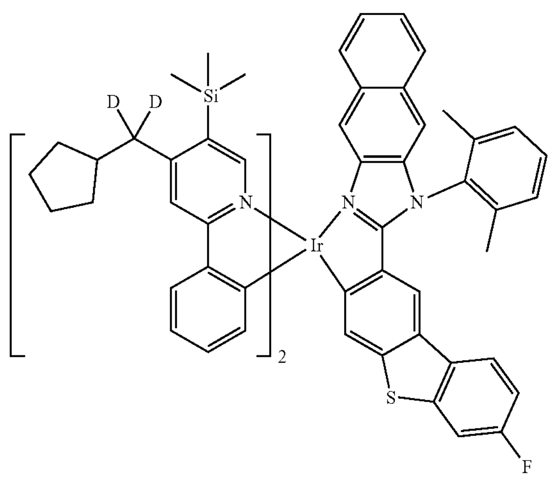
2345
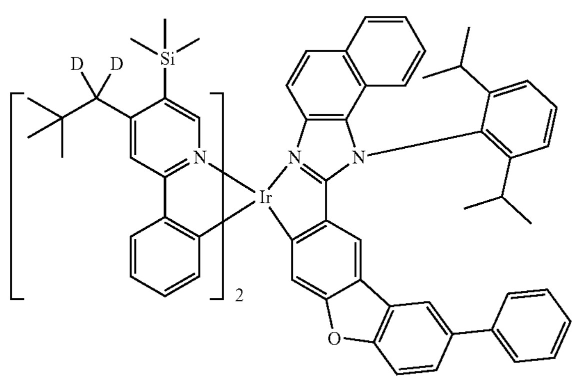

-continued
2346
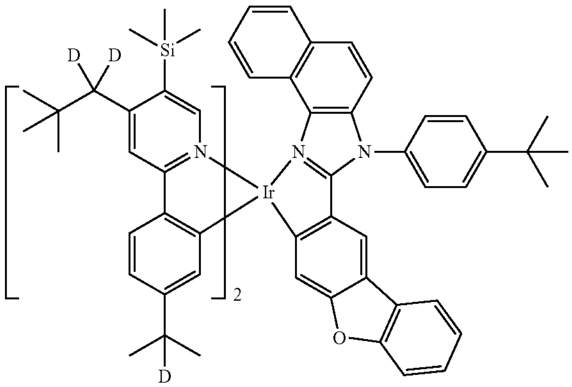
2347
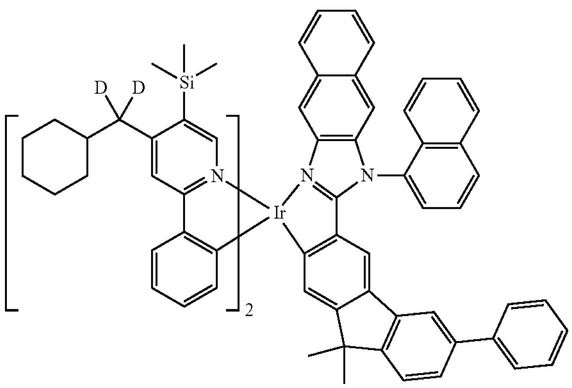
2348
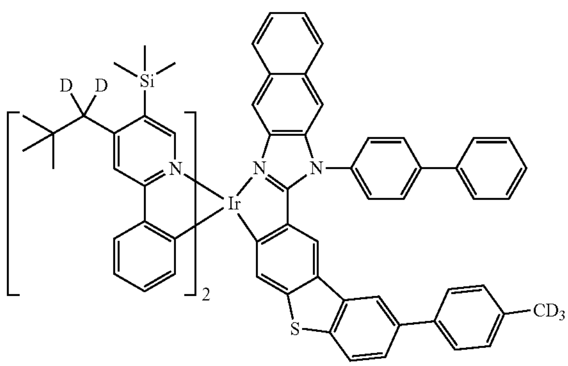
2349
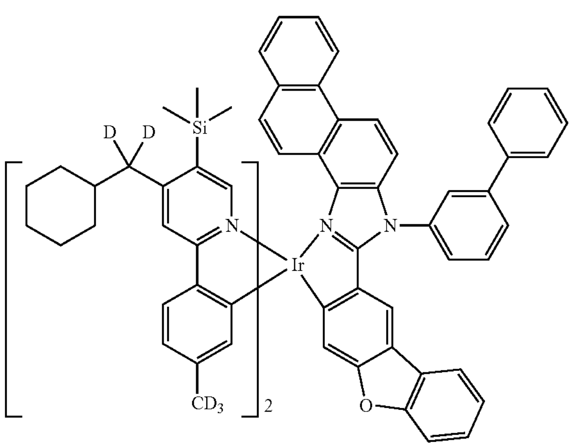
-continued
2350
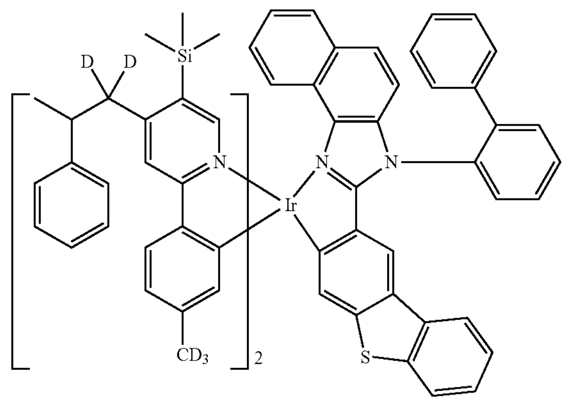
2351
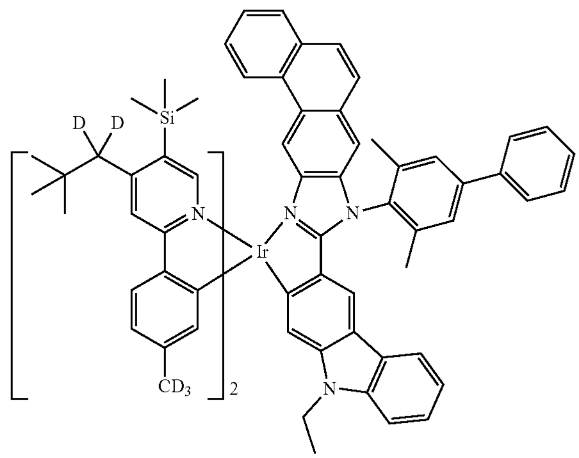
2352
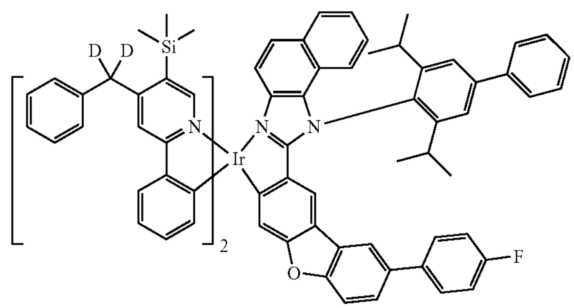

2353
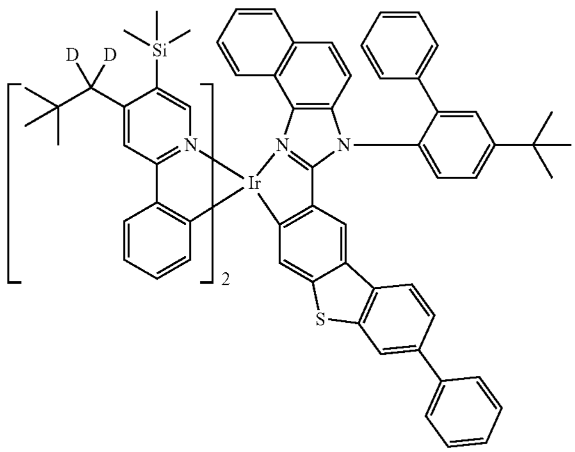
2354
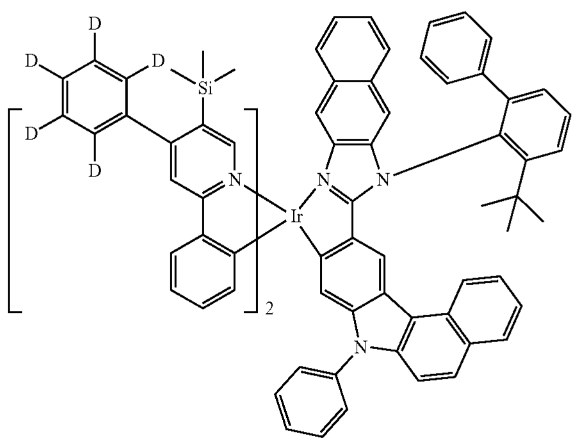
2355
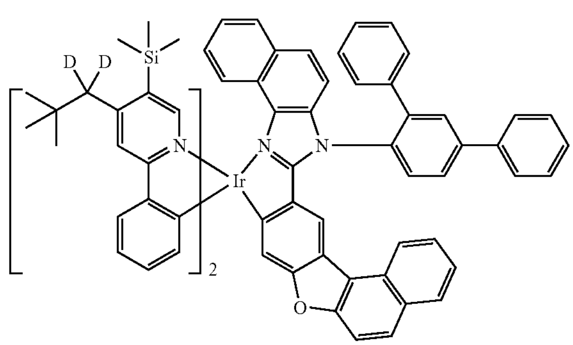
2356
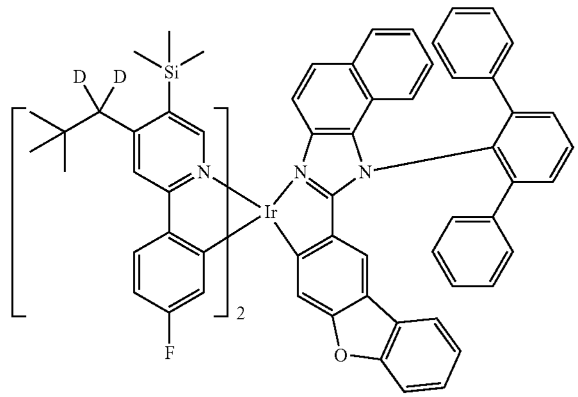
2357
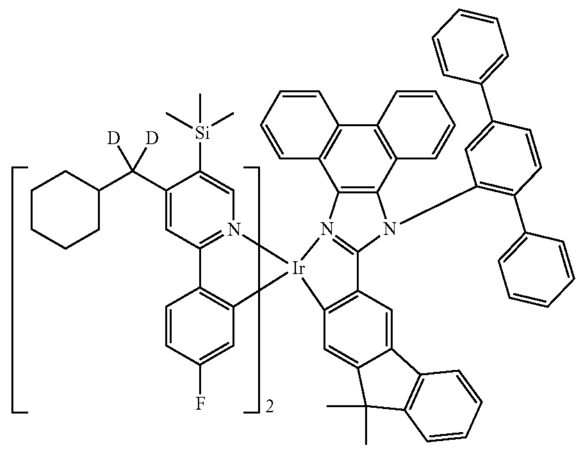
2358
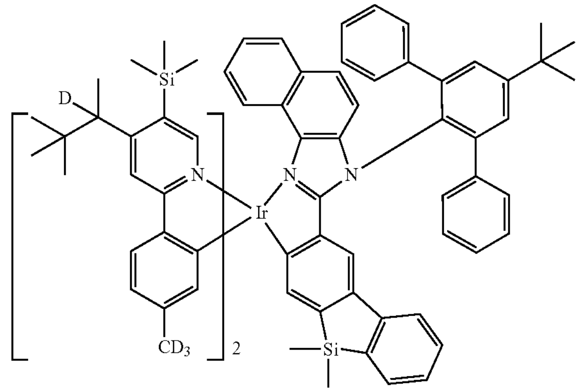

-continued
2359
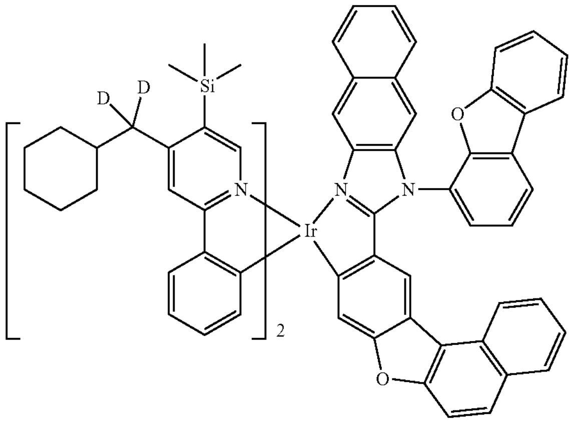
2360
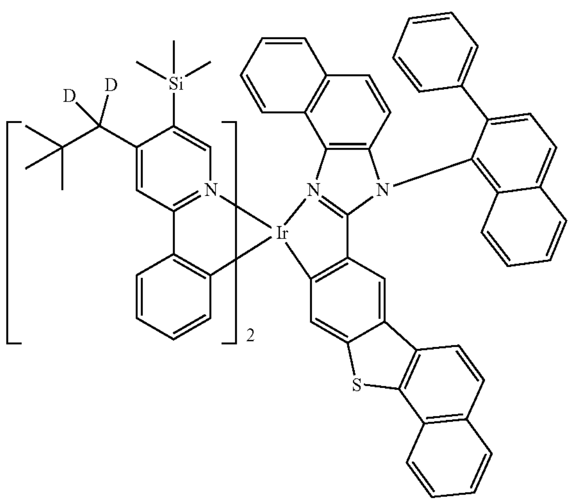
2361
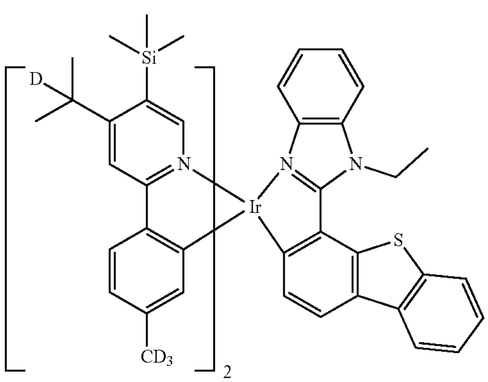
-continued
2362
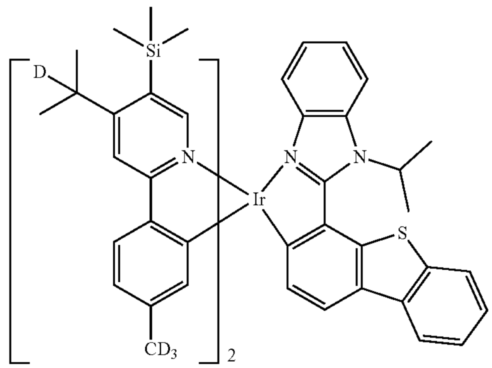
2363
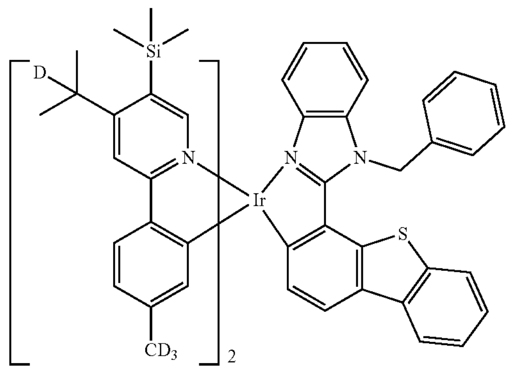
2364
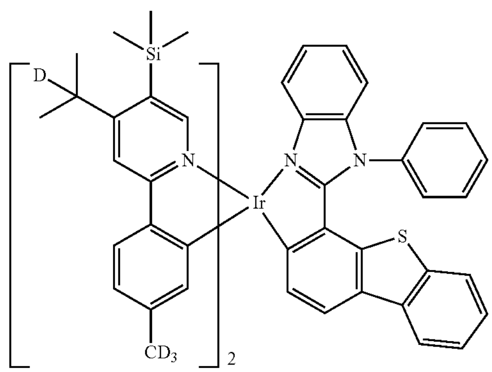
2365
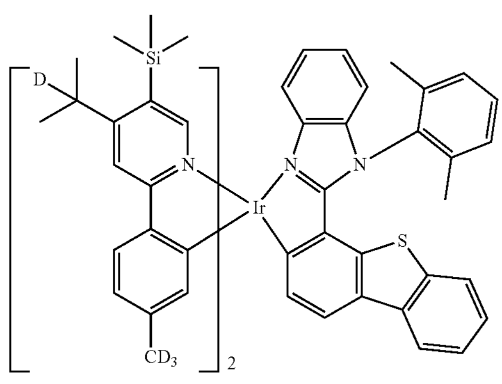

-continued
2366
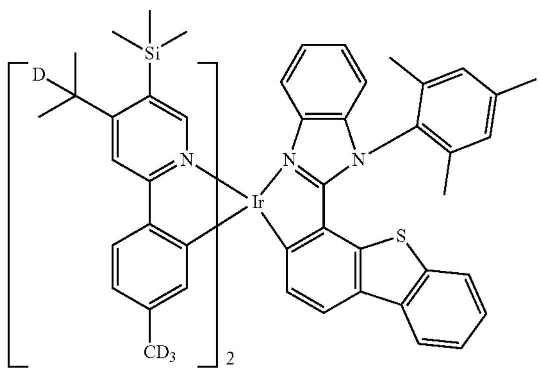
2367
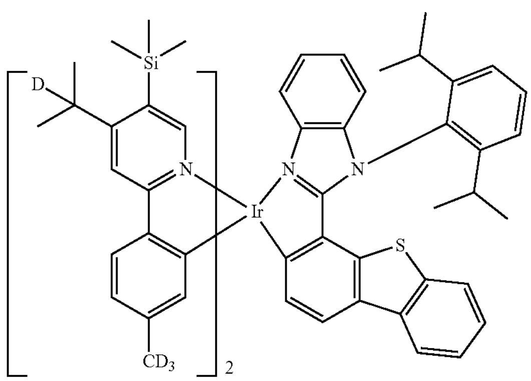
2368
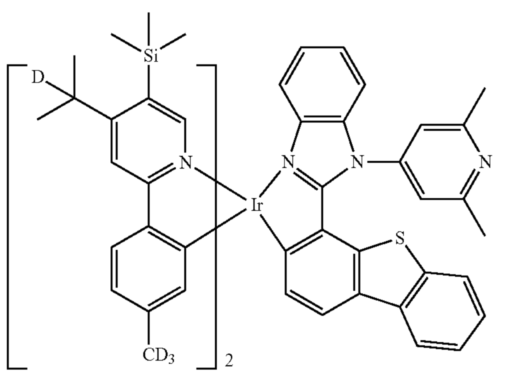
2369
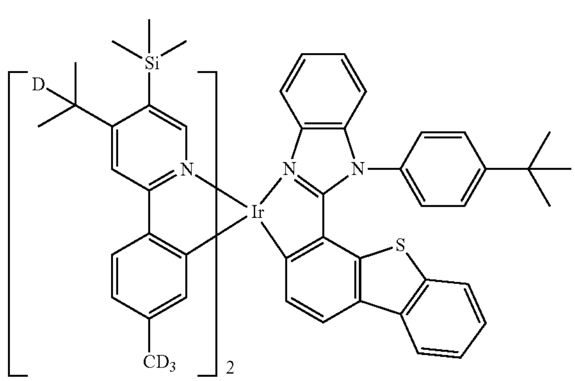
-continued
2370
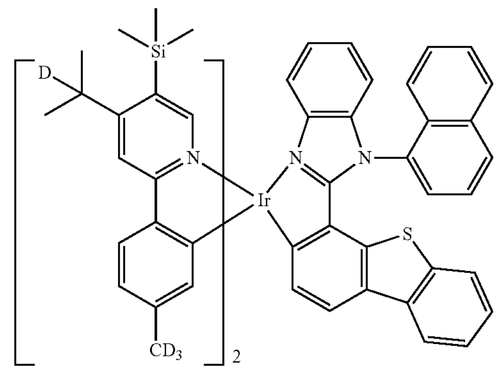
2371
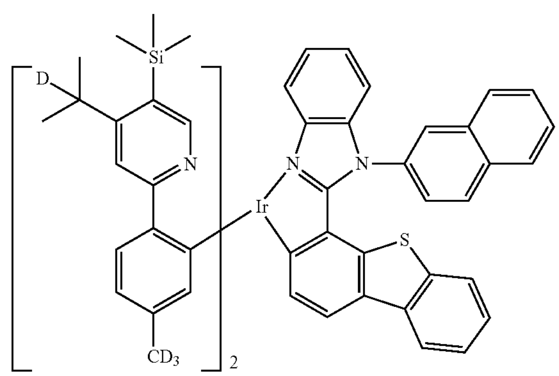
2372
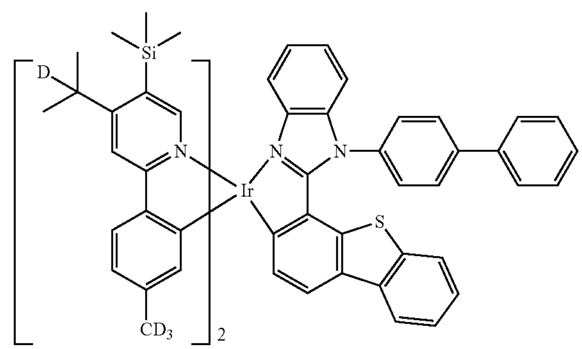
2373
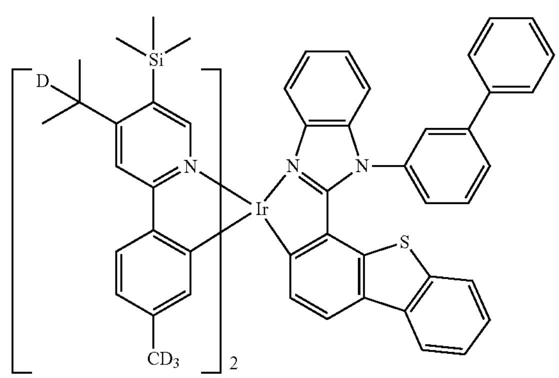

-continued
2374
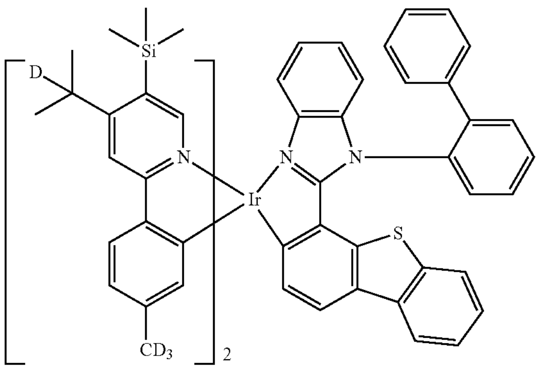
2375
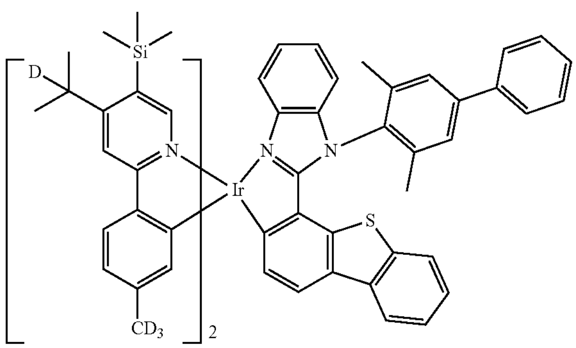
2376
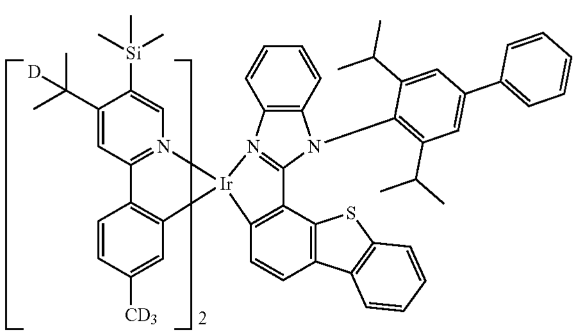
2377
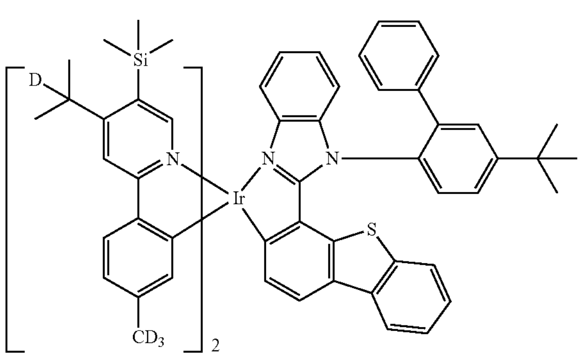
-continued
2378
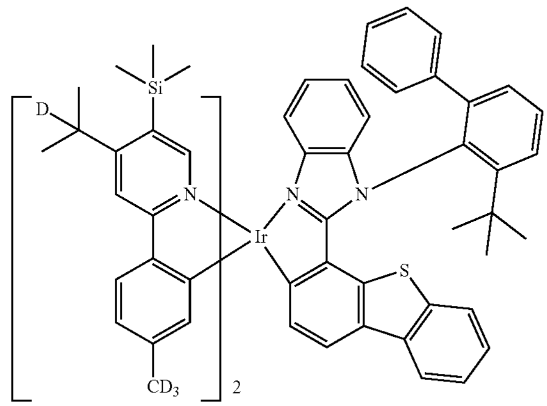
2379
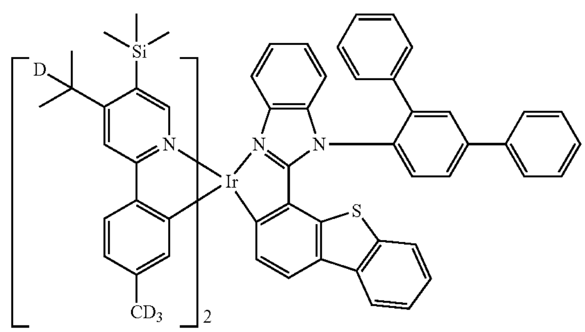
2380
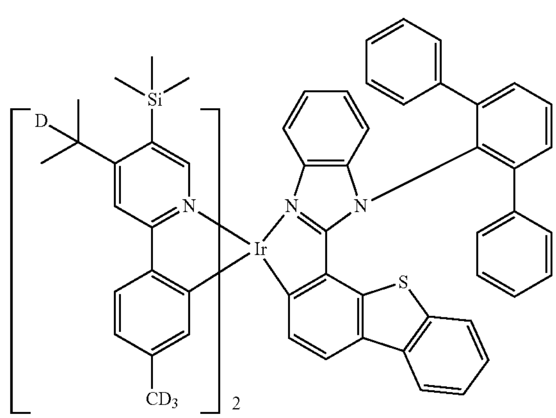

-continued
2381
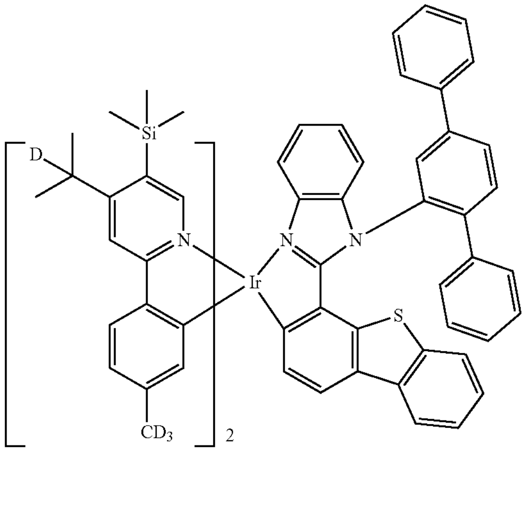
2382
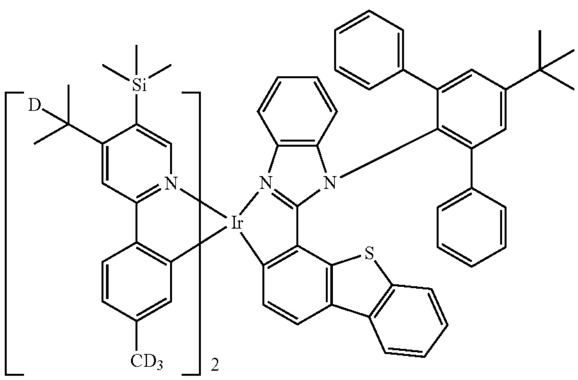
2383
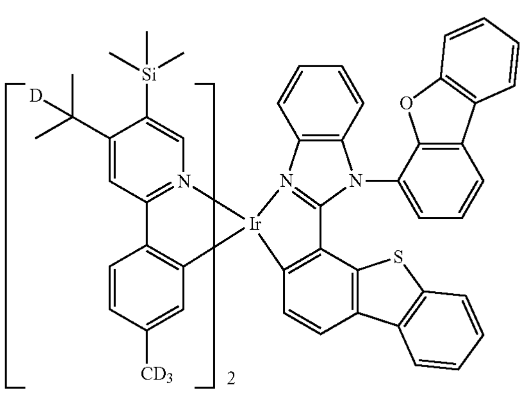
-continued
2384
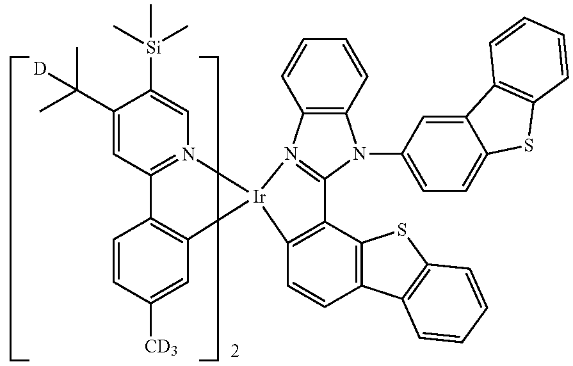
2385
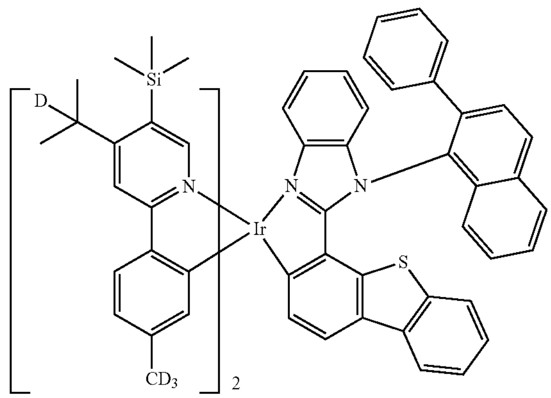
2386
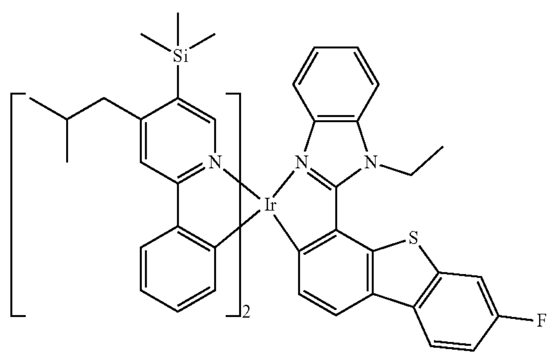
2387
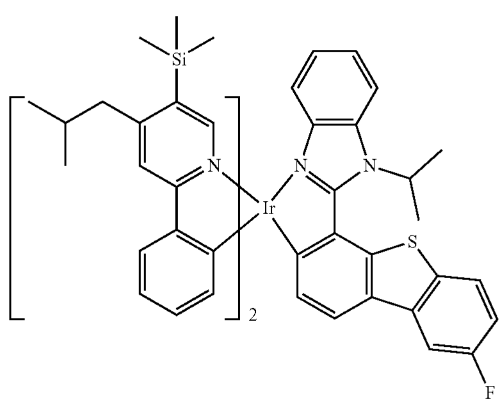

-continued
2388
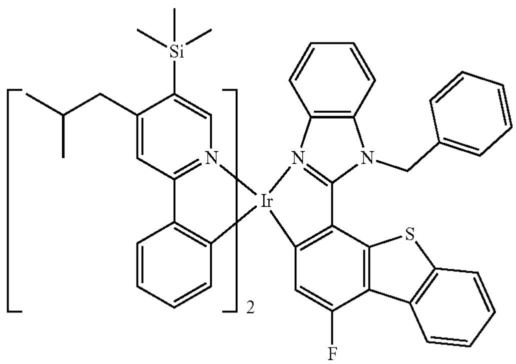
2389
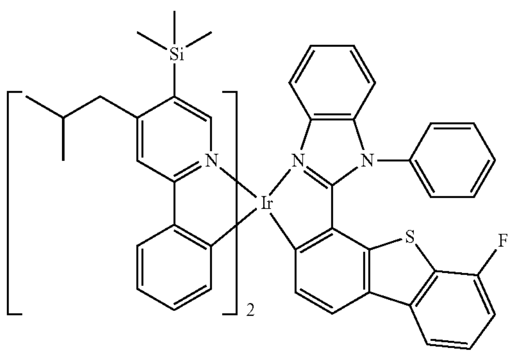
2390
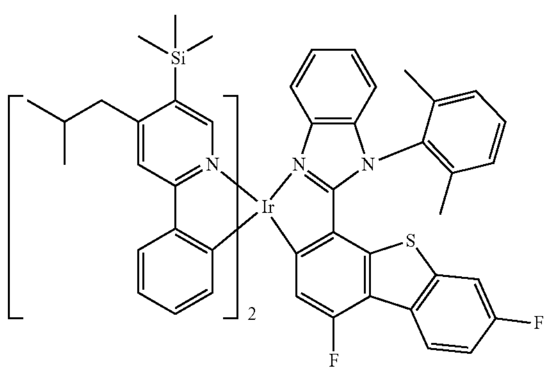
2391
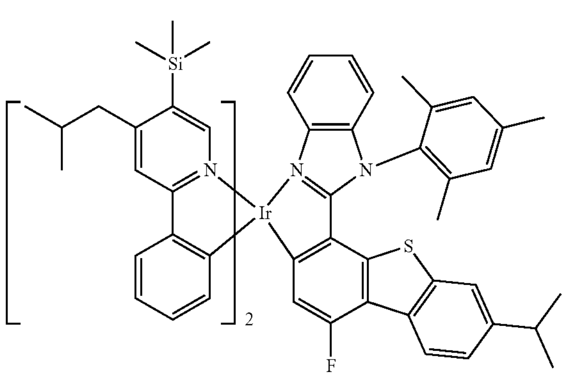
-continued
2392
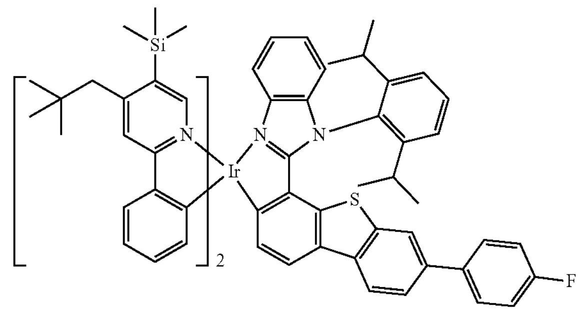
2393
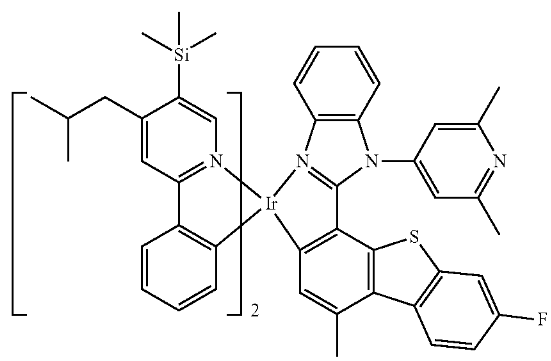
2394
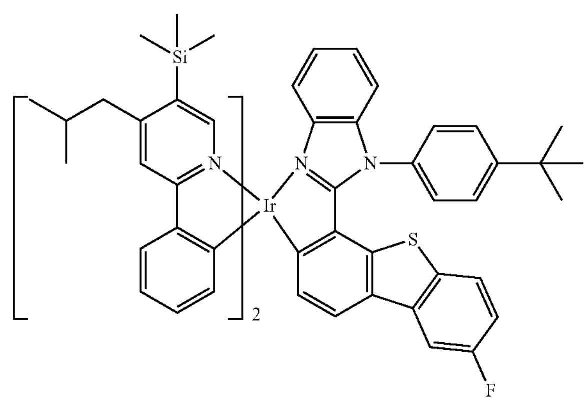
2395
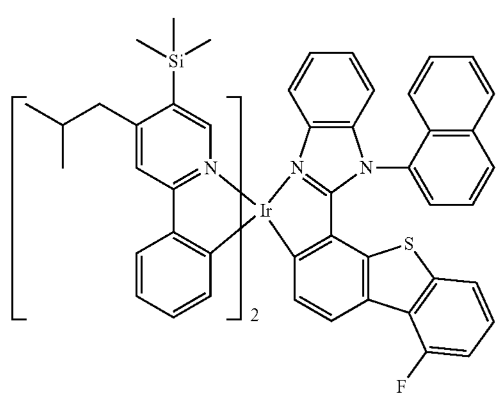

-continued
2396
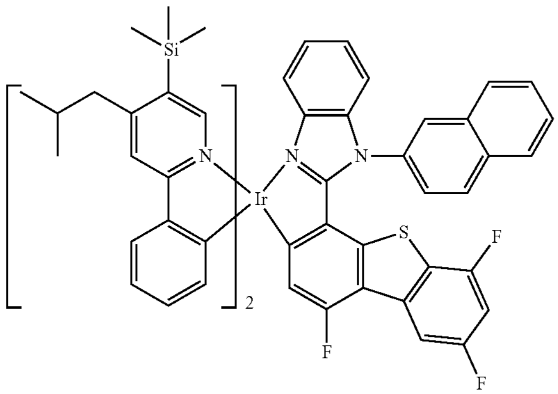
2397
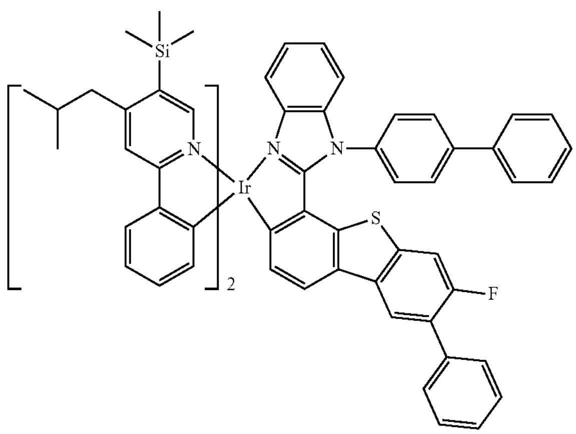
2398
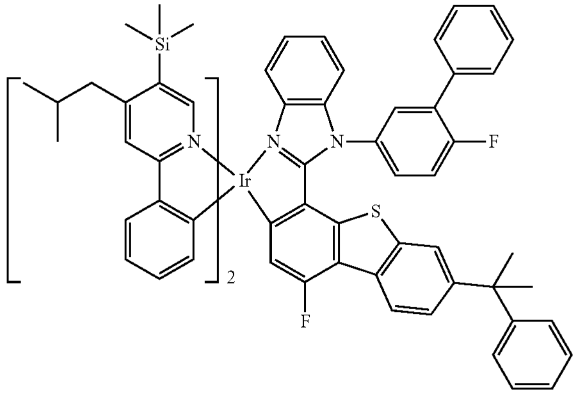
-continued
2399
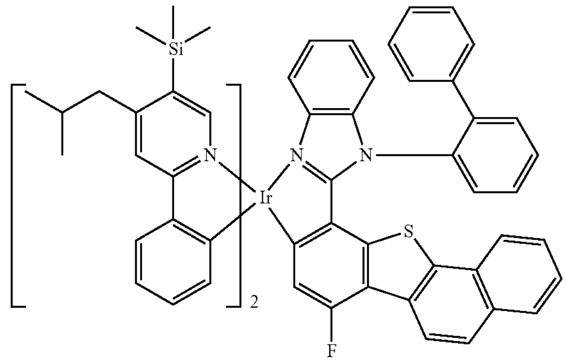
2400
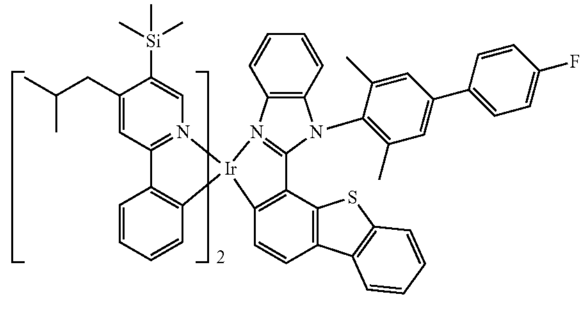

2401
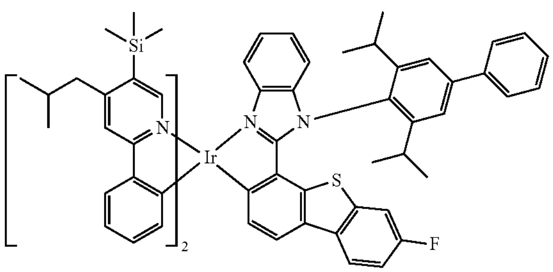
2402
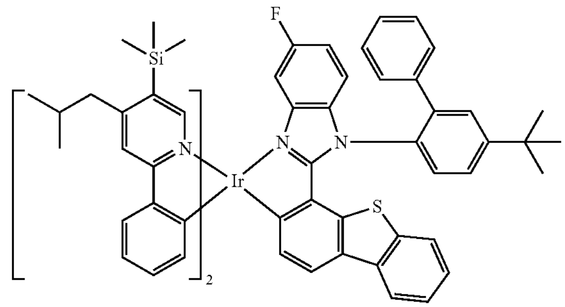
2403
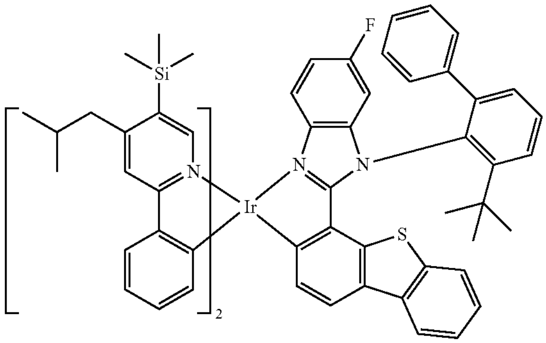
2404
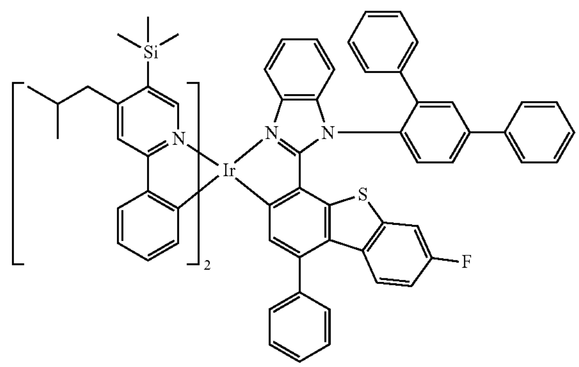
2405
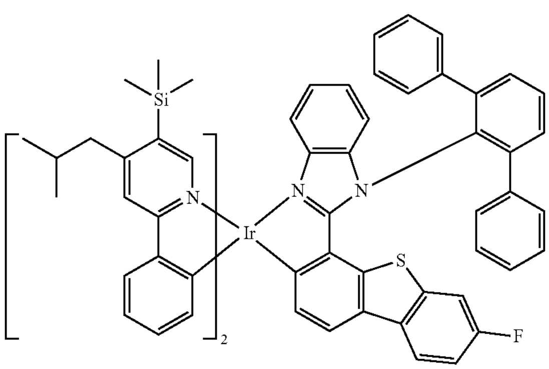
2406
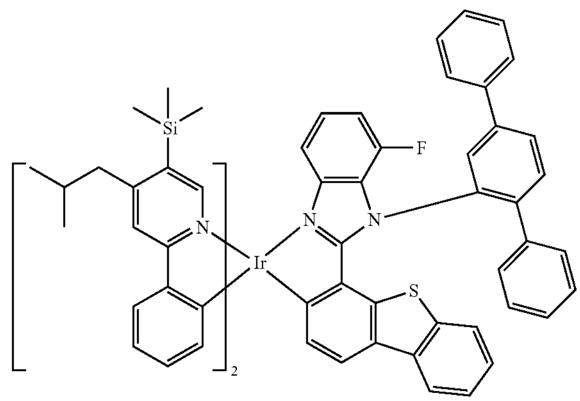
2407
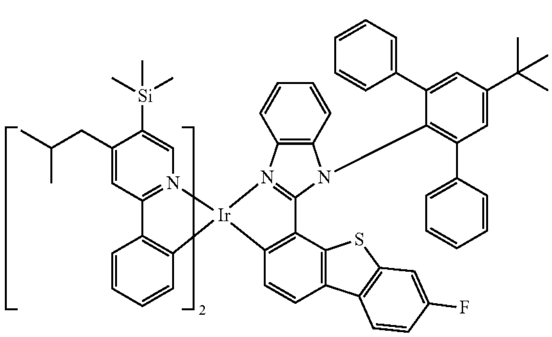
2408
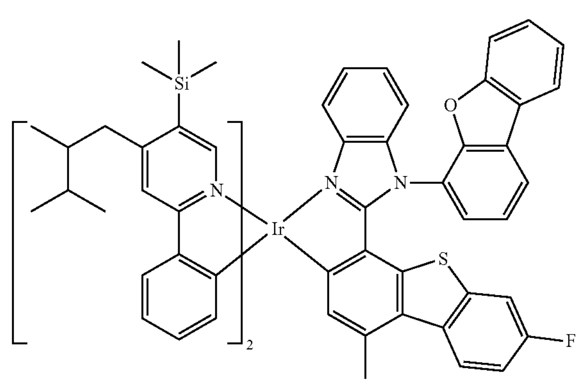

-continued
2409
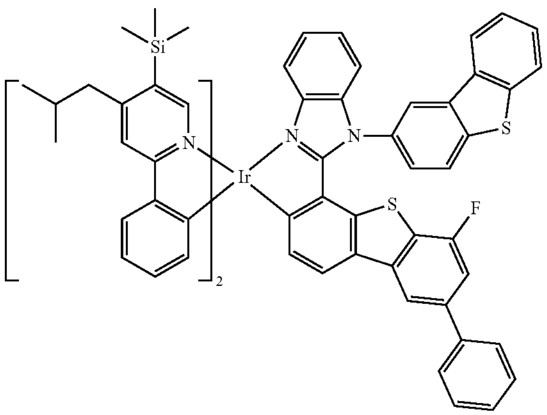
2410
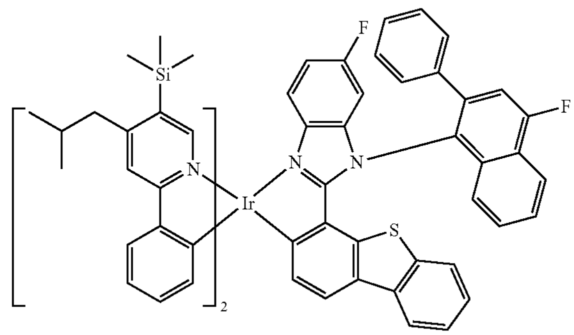
2411
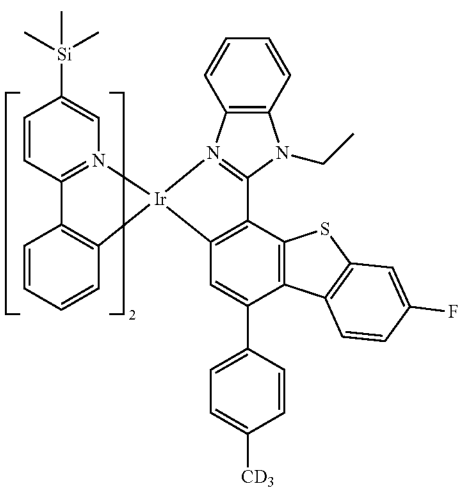
2412
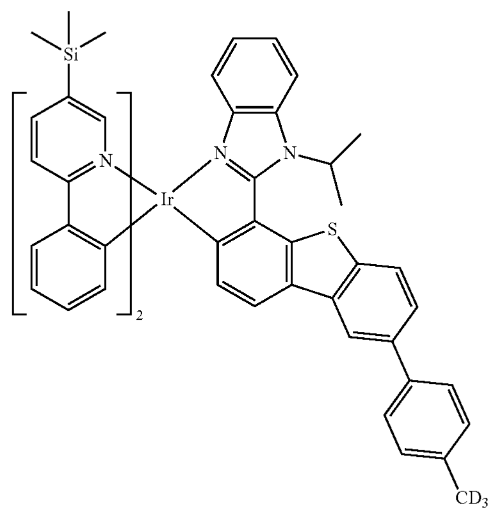
2413
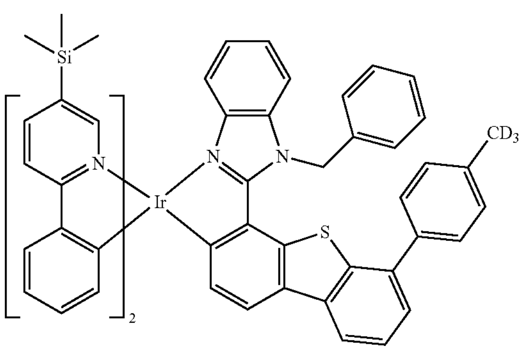
2414
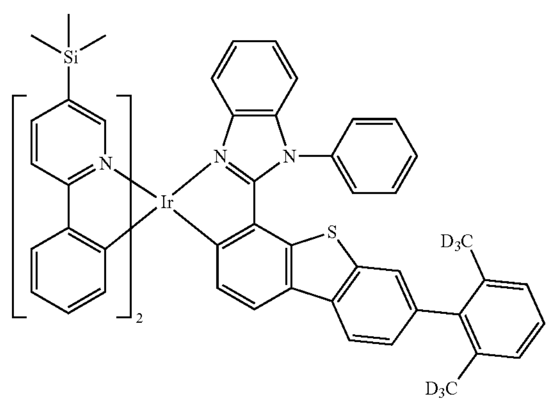

-continued
2415
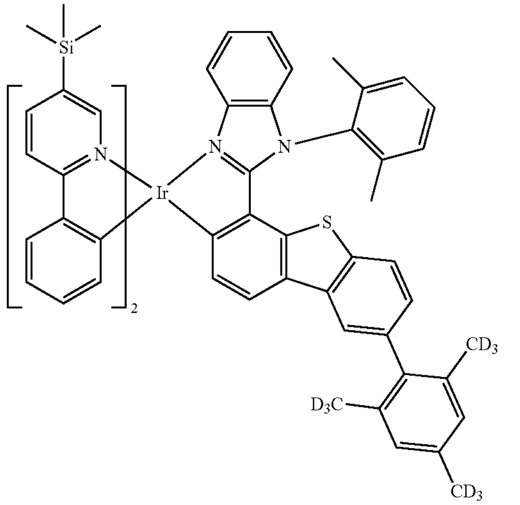
2416
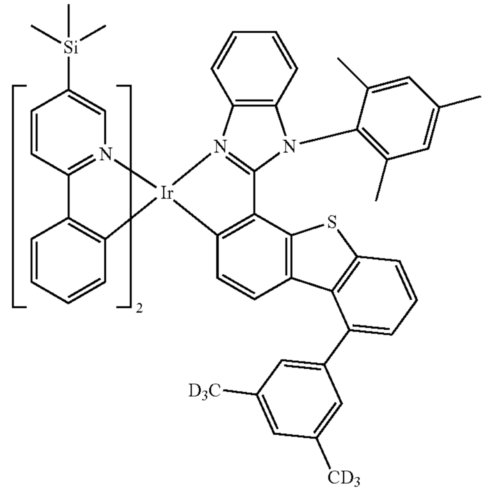
2417
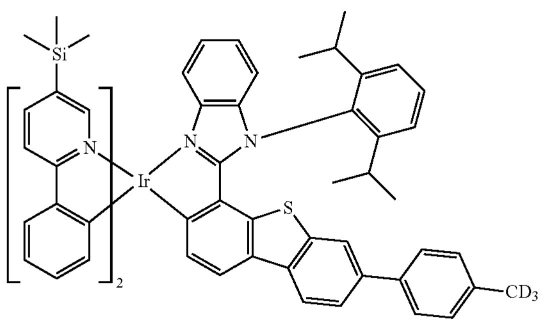
2418
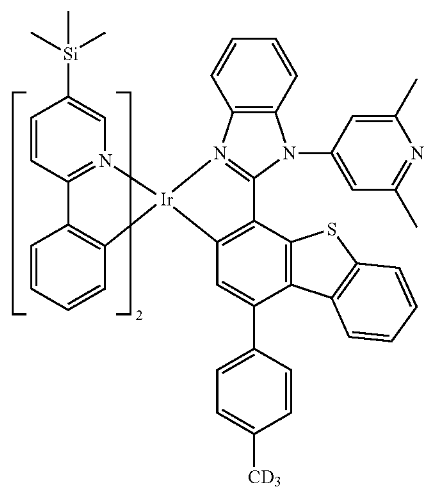
2419
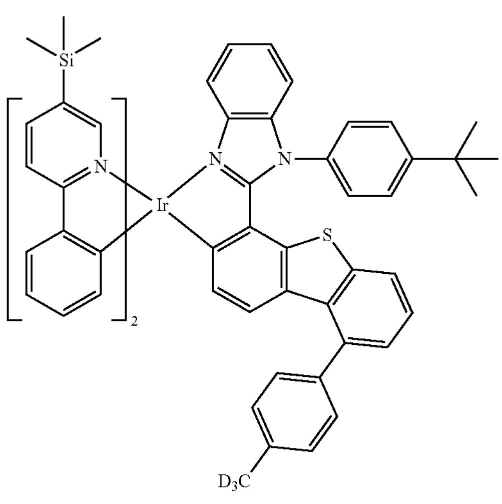
2420
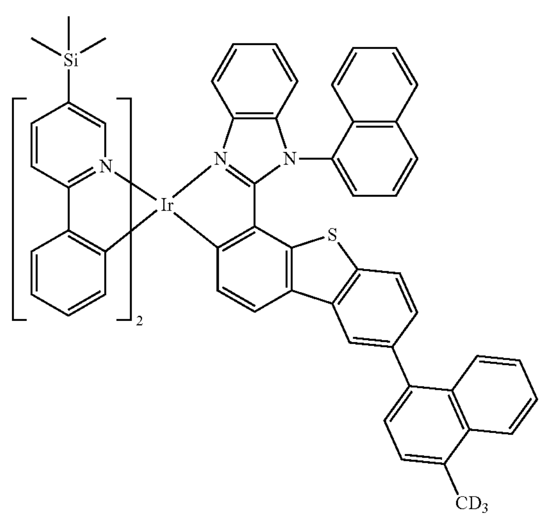

-continued
2421
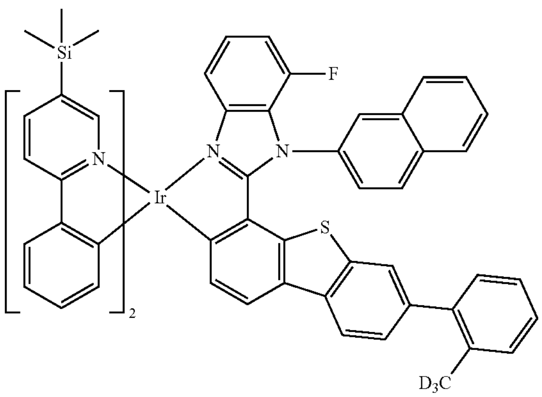
2422
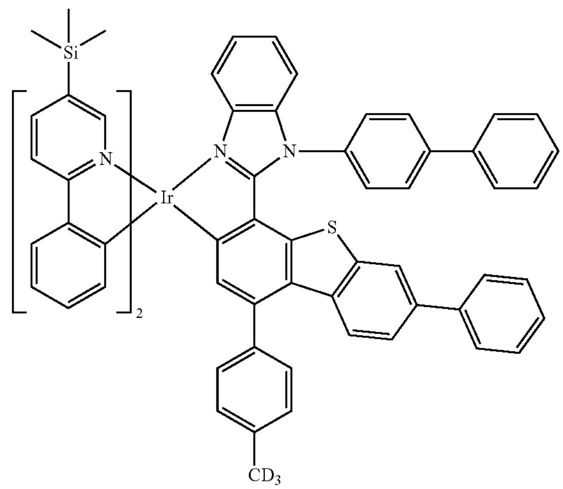
2423
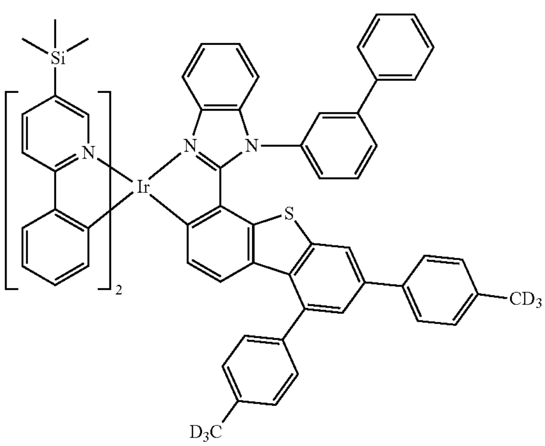
2424
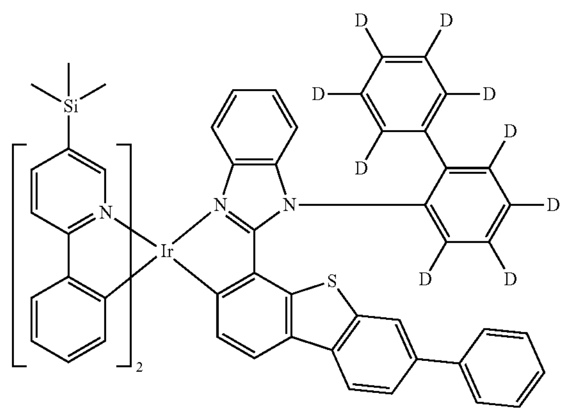
2425
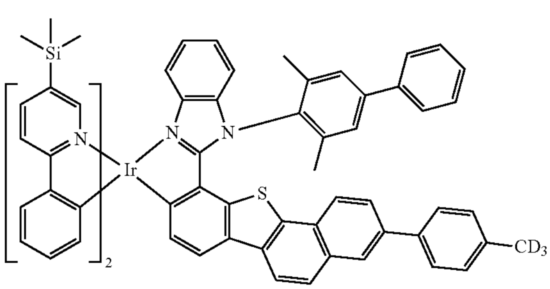
2426
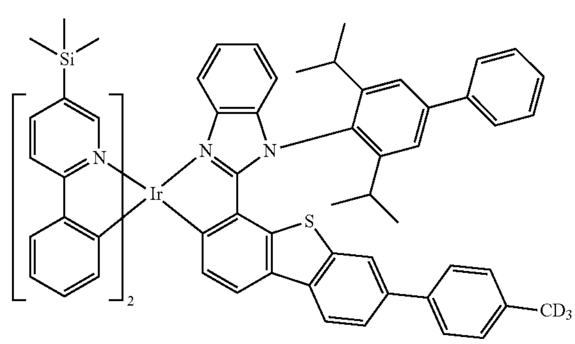

-continued
2427
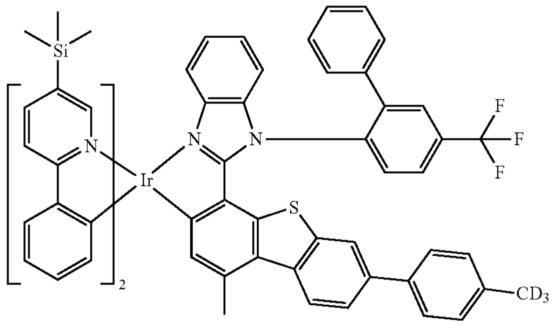
2428
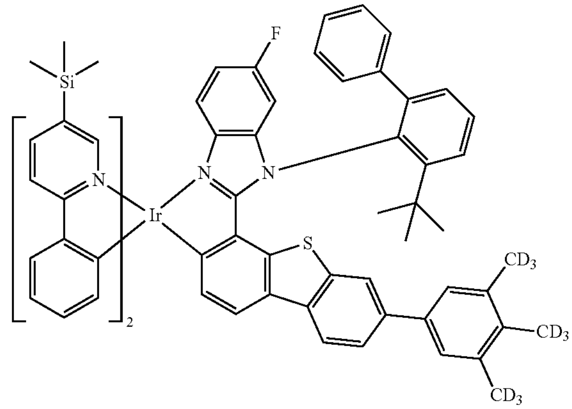
2429
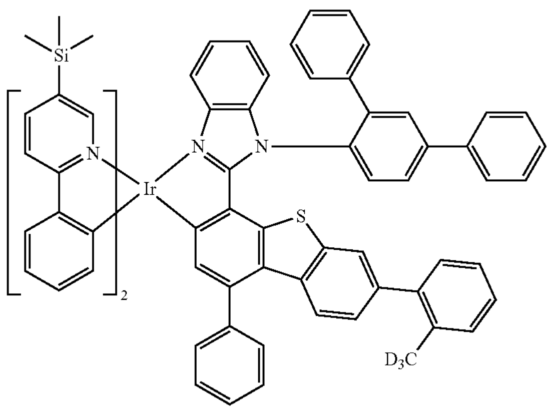
2430
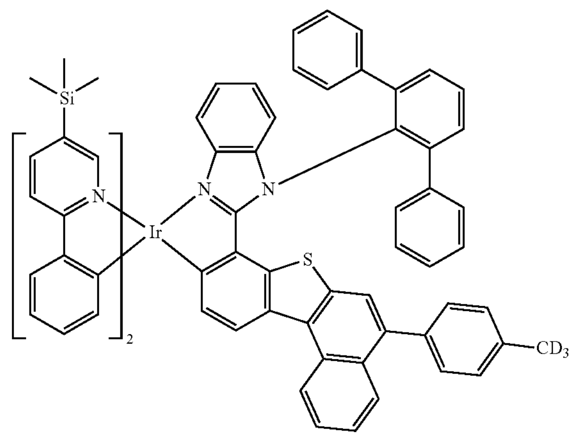
2431
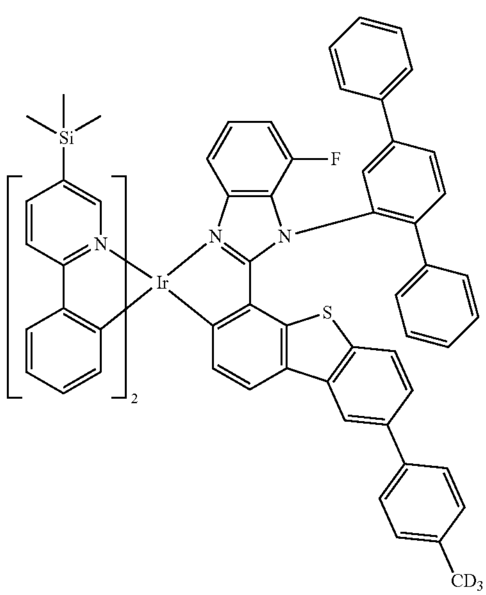
2432
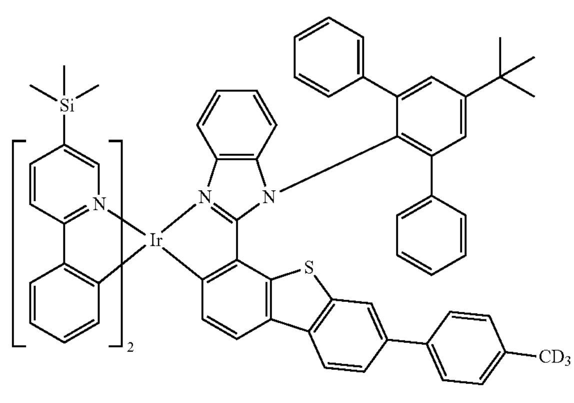

-continued
2433
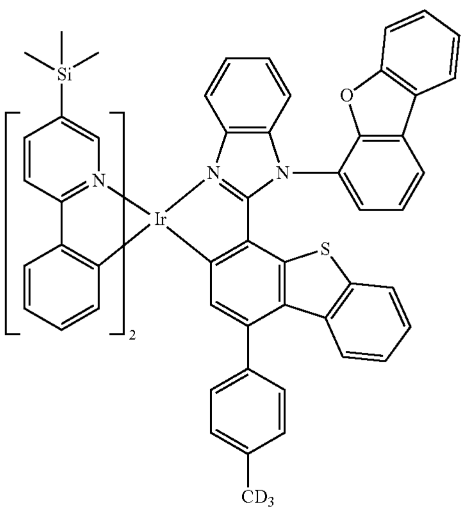
2434
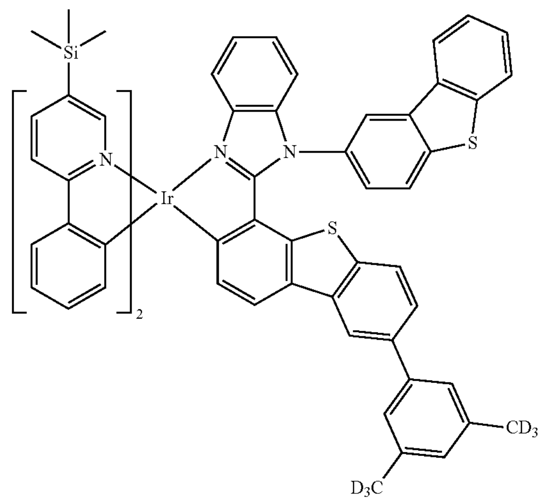
2435
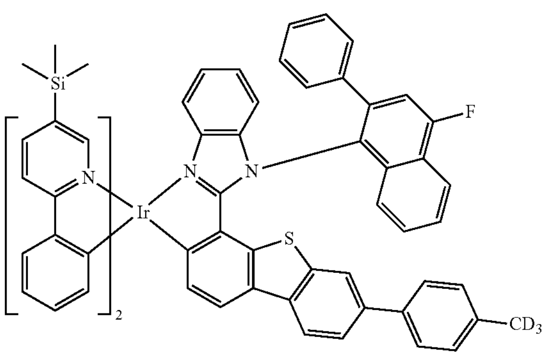
2436
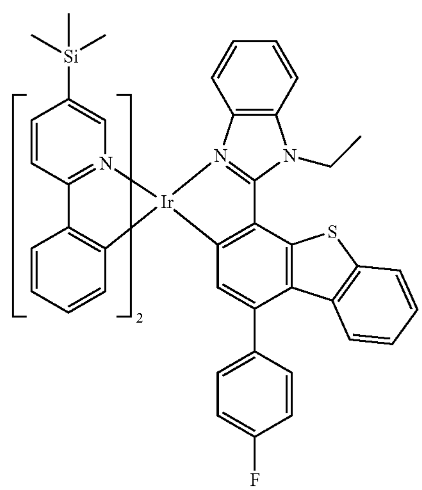
2437
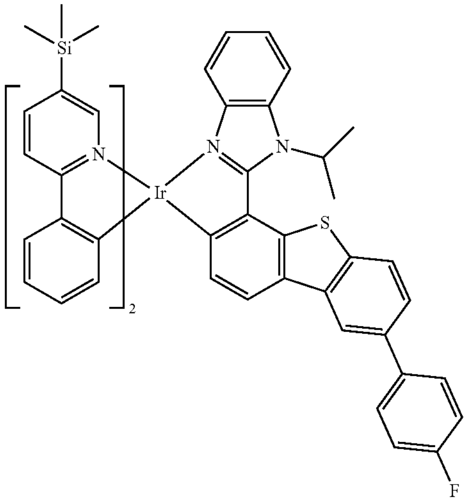
2438
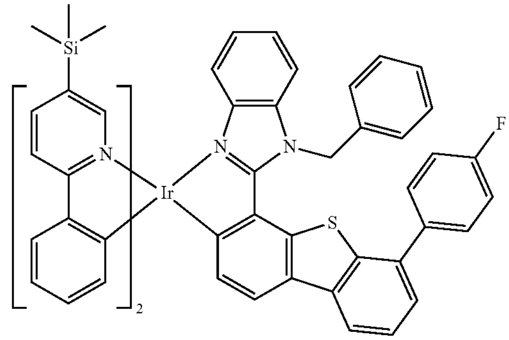

-continued
2439
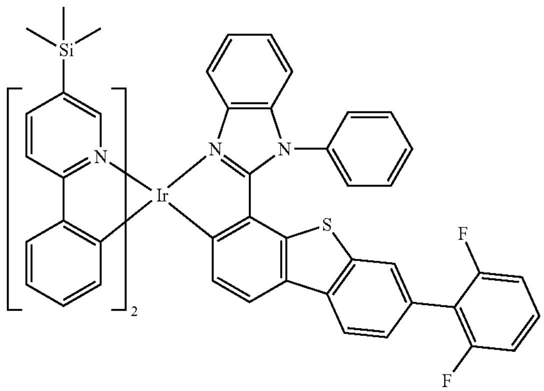
2440
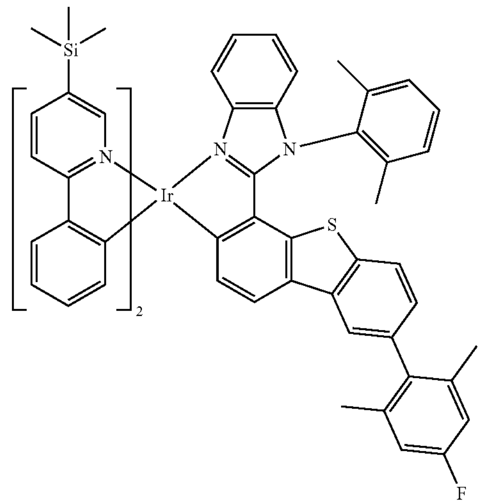
2441
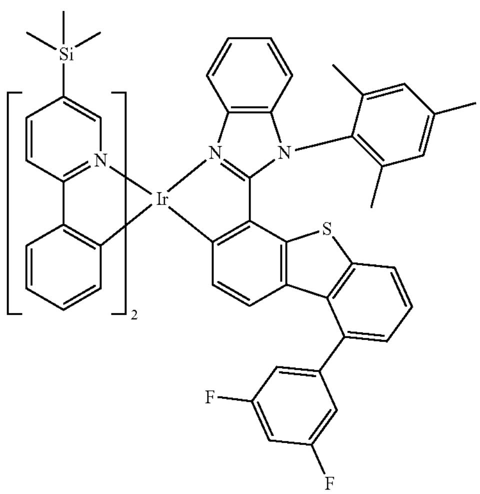
2442
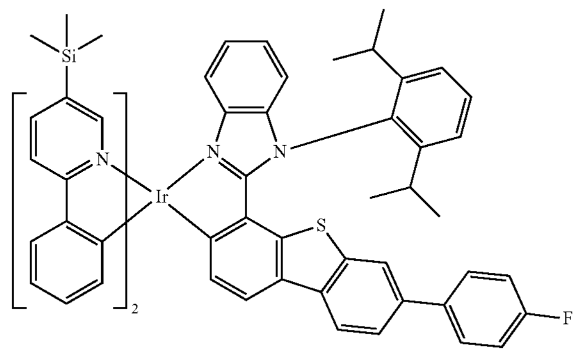
2443
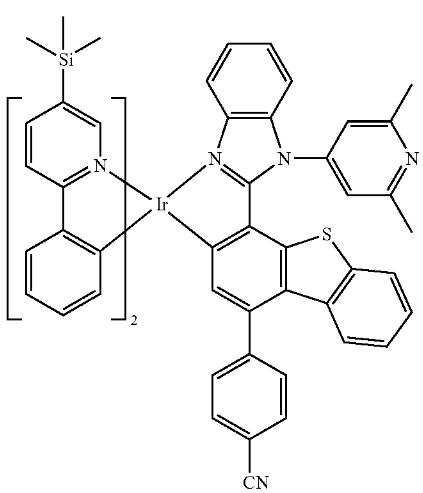
2444
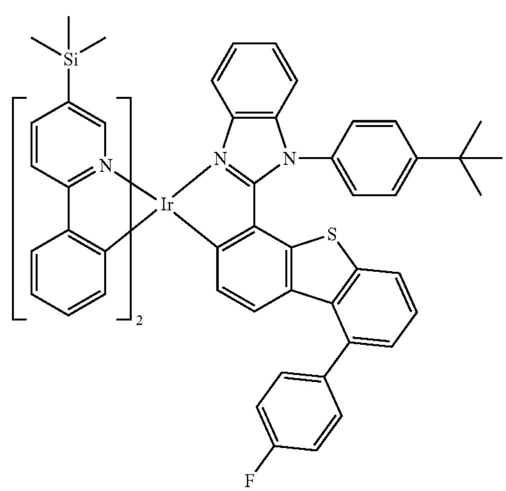

-continued
2445
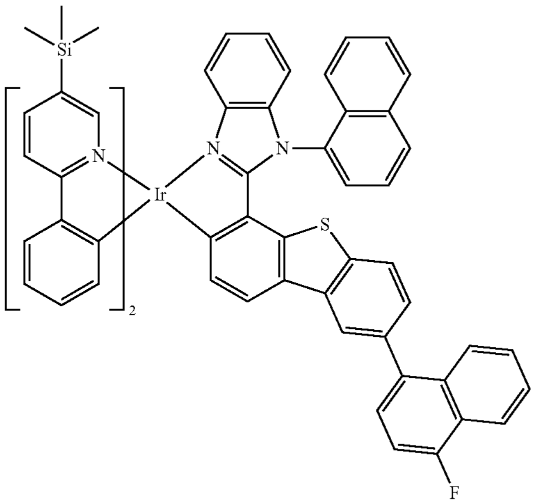
2446
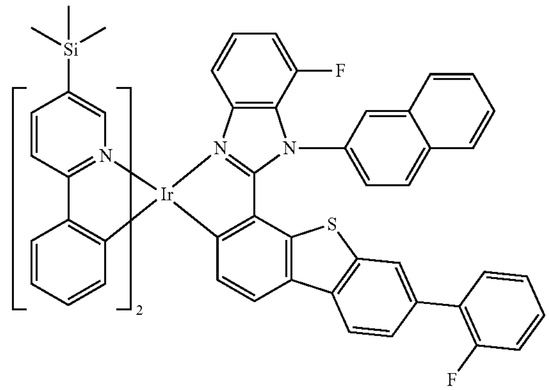
2447
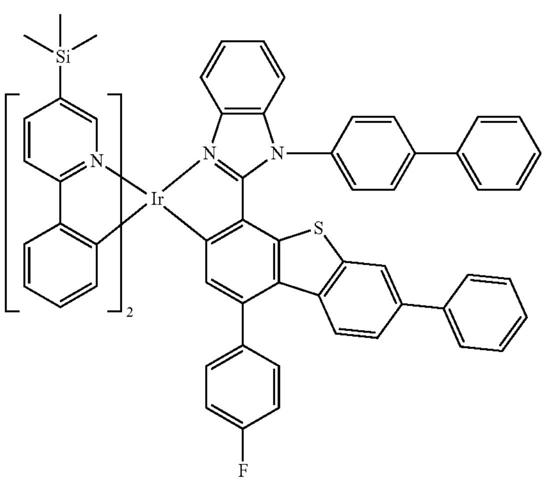
2448
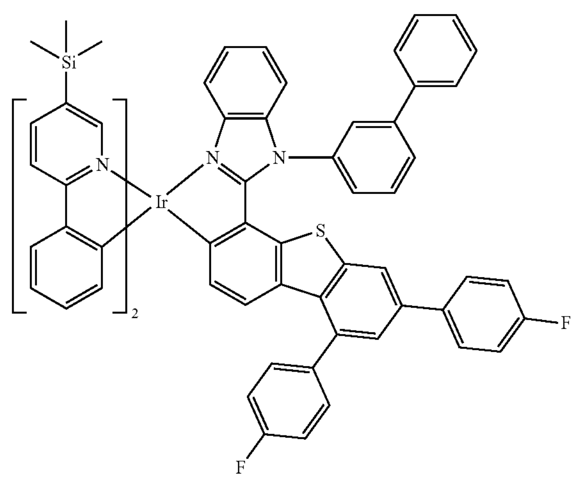
2449
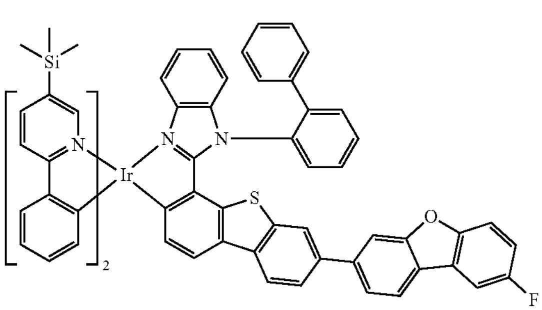
2450
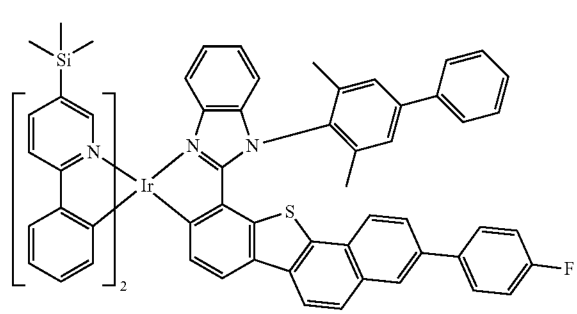

-continued
2451
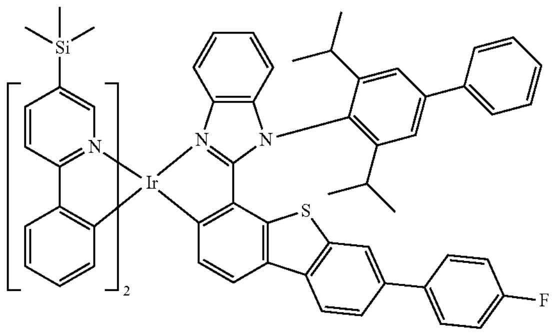
2452
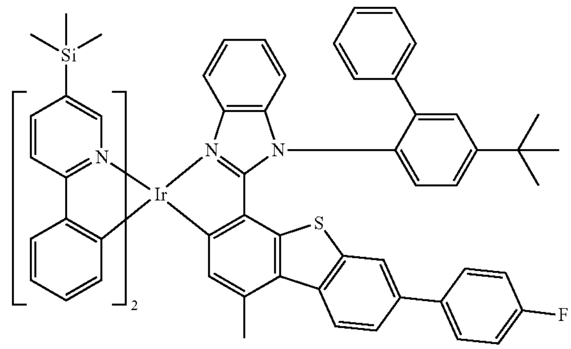
2453
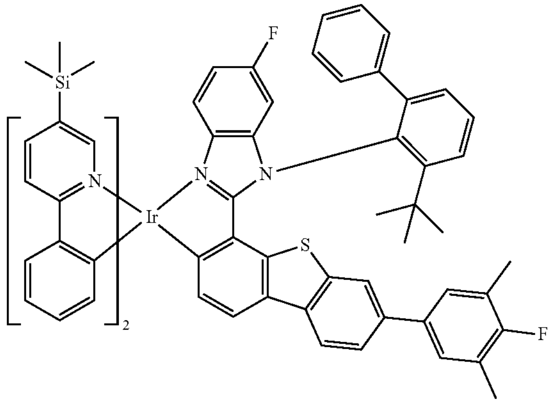
2454
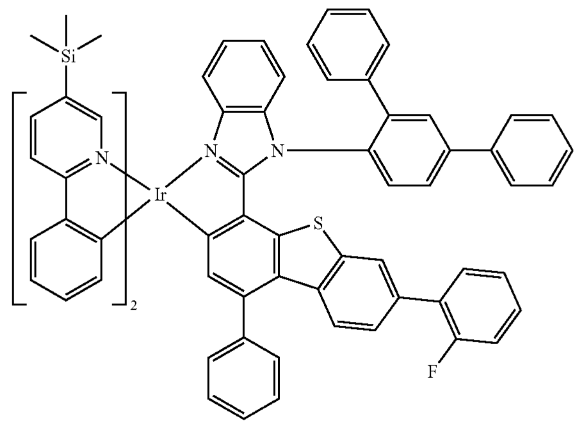
2455
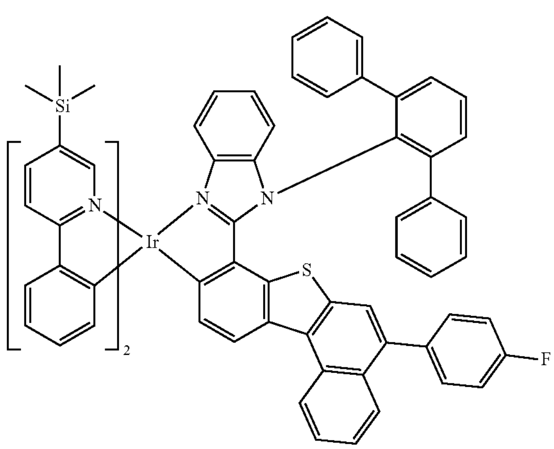
2456
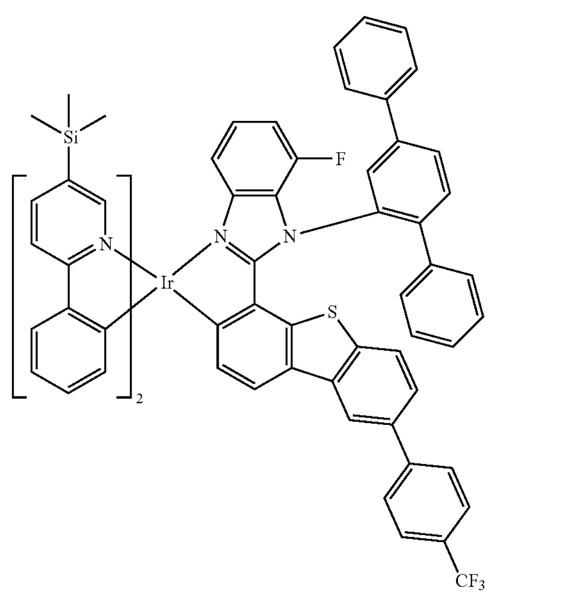

-continued
2457
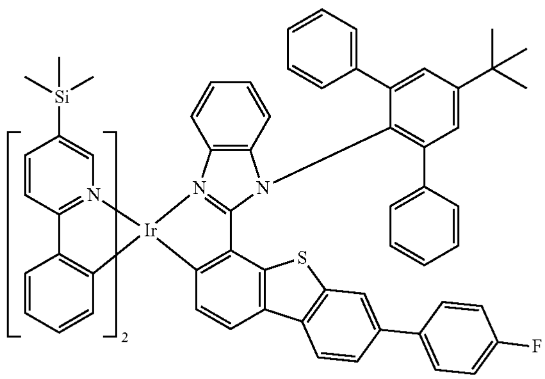
2458
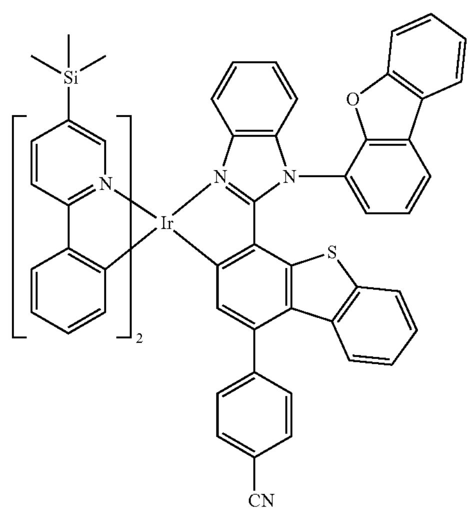
2459
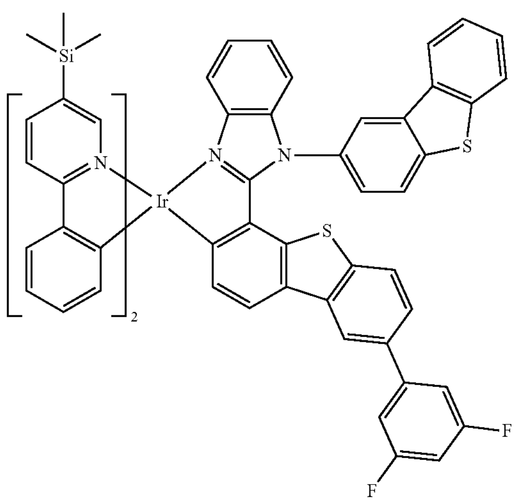
2460
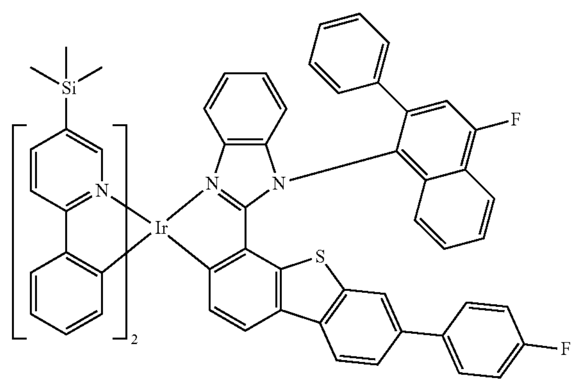
2461
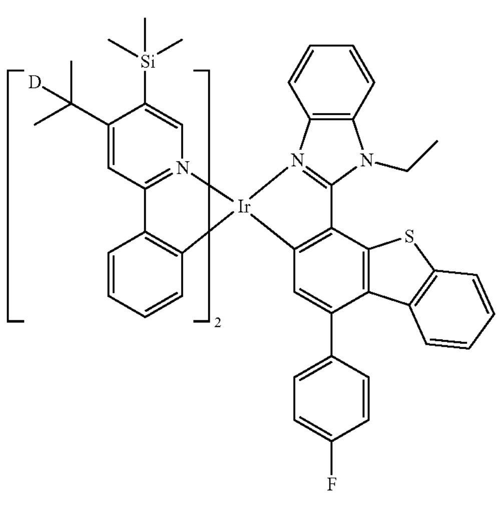
2462
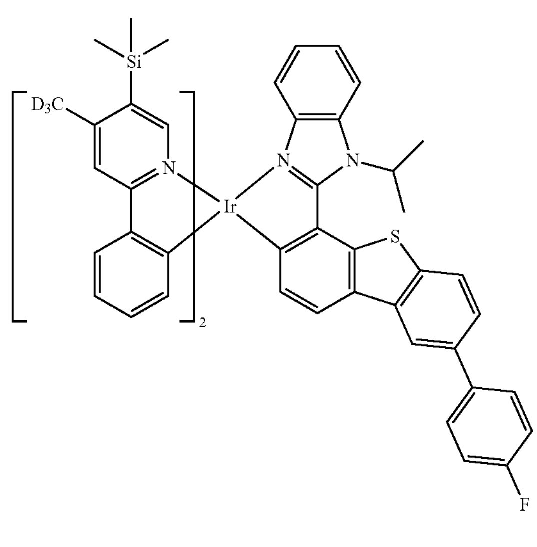

-continued
2463
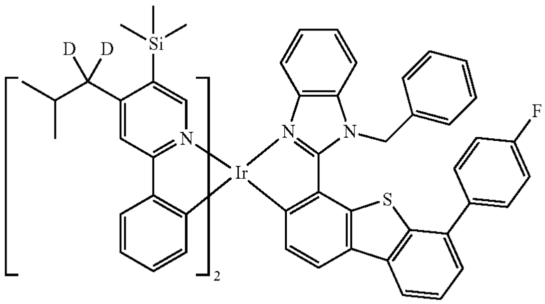
2464
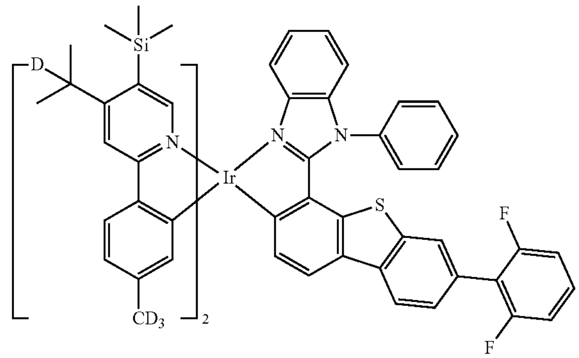
2465
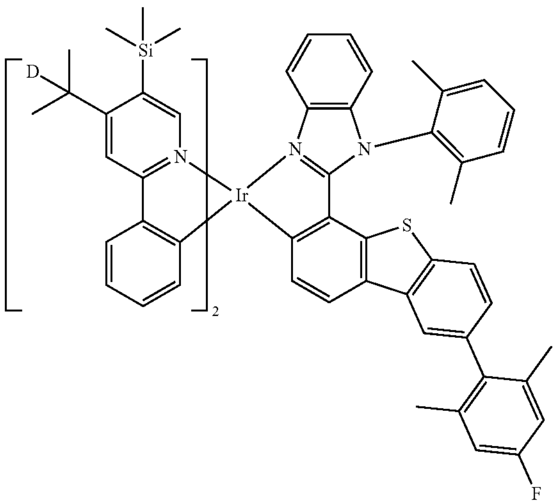
2466
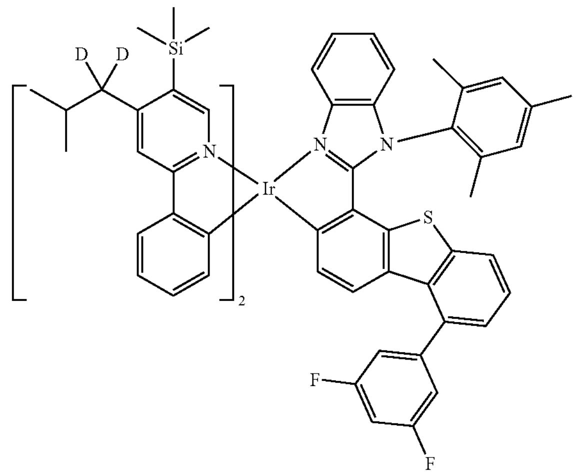
2467
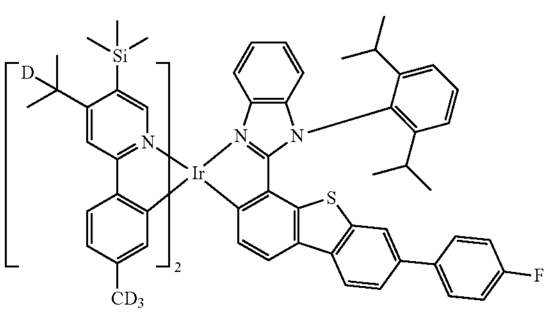
2468
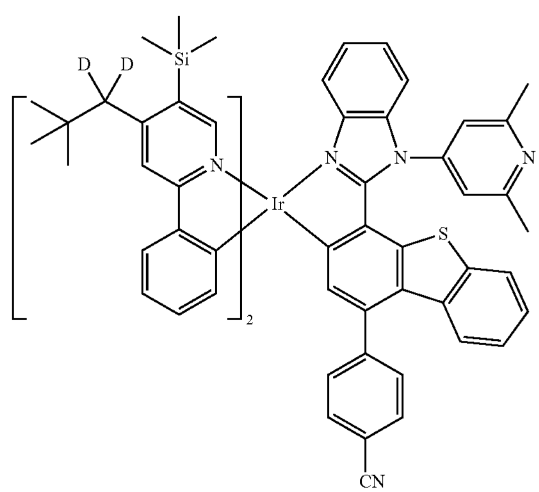

-continued
2469
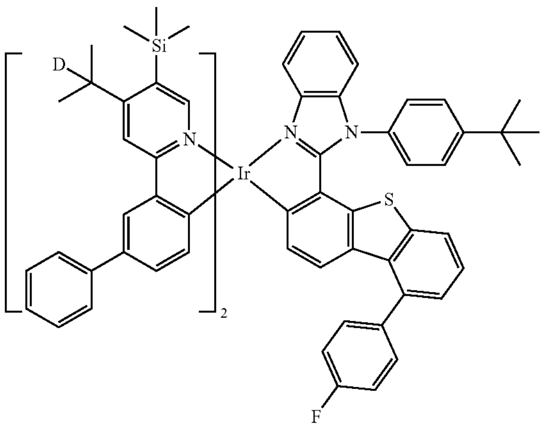
2470
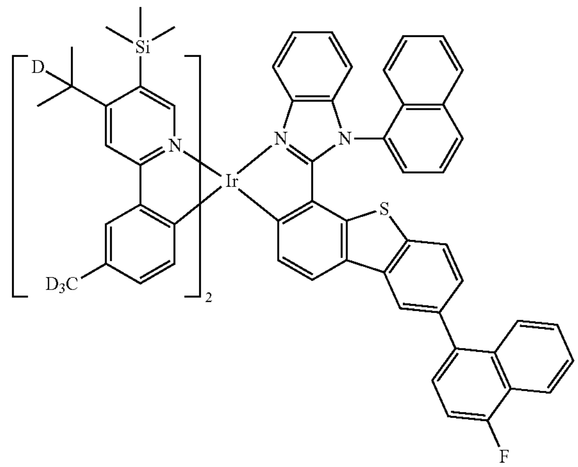
2471
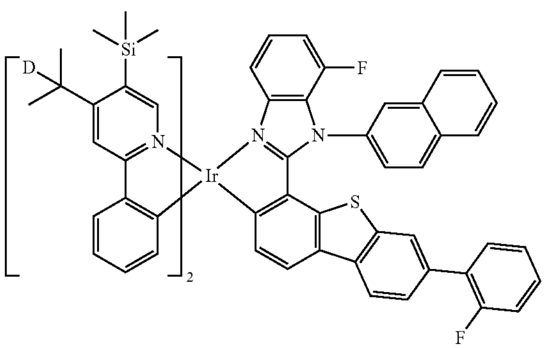
2472
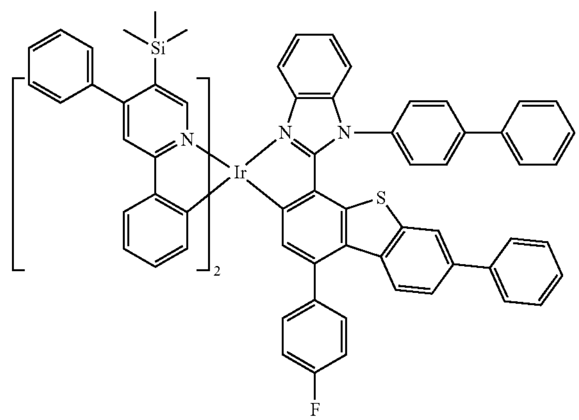
2473
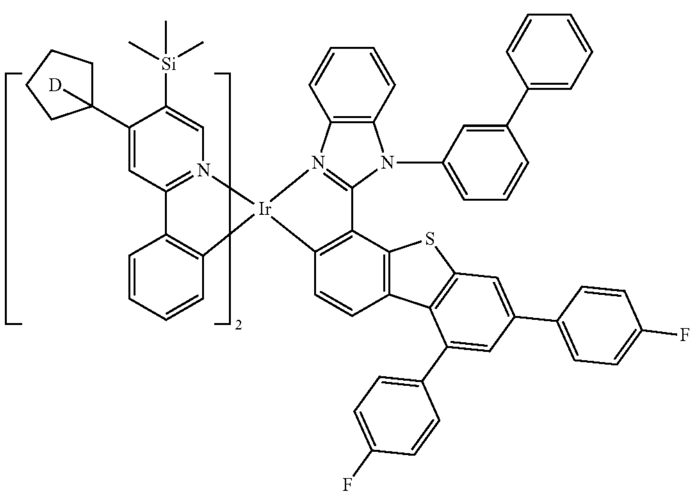

-continued
2474
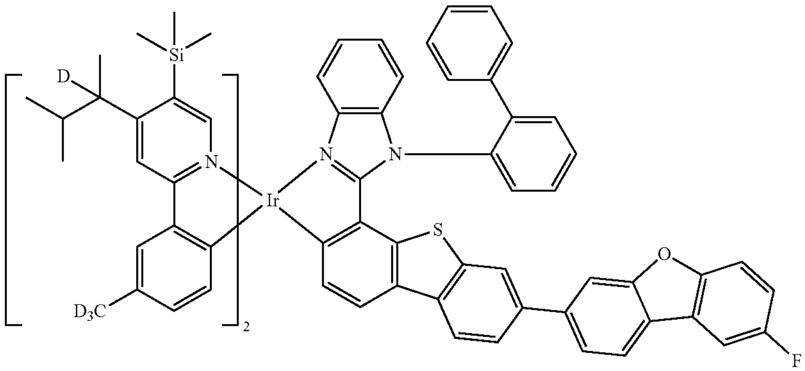
2475
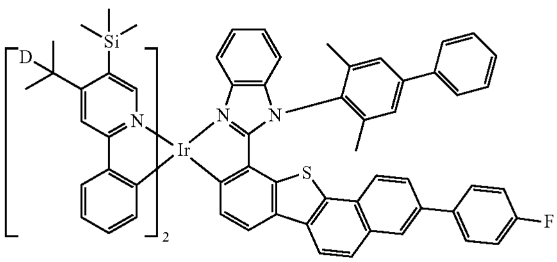
2476
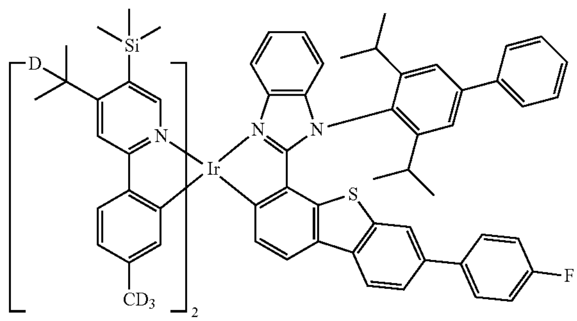
2477
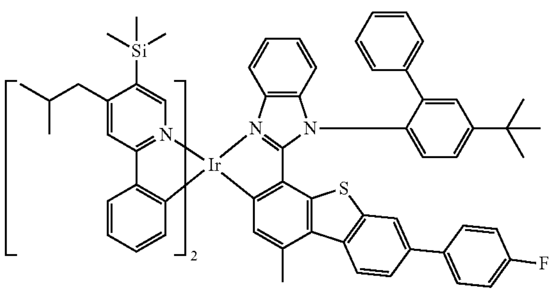
2478
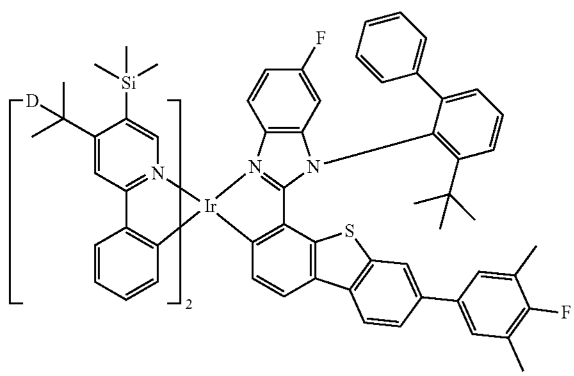
2479
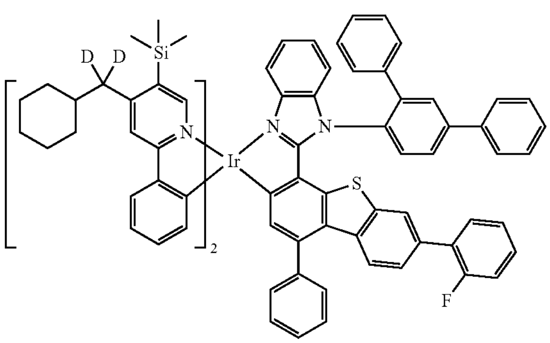
2480
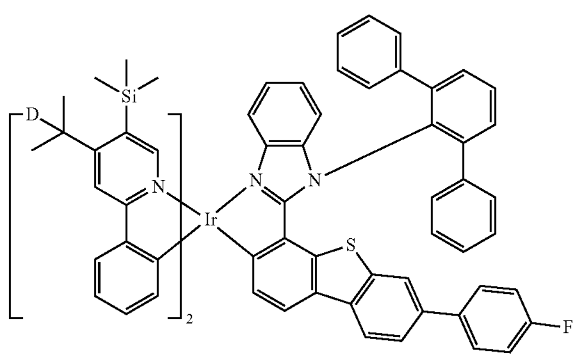

-continued
2481
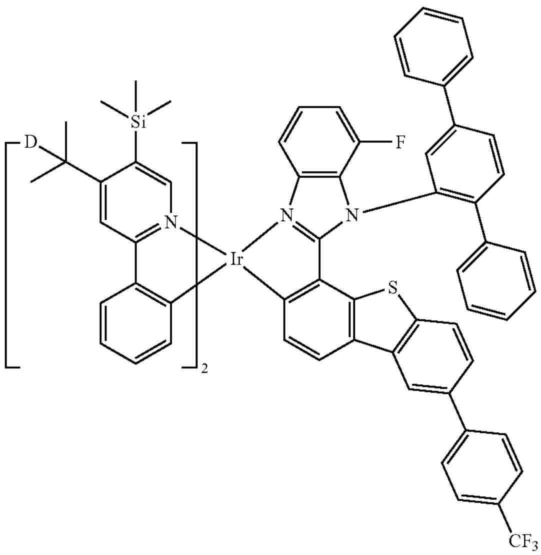
2482
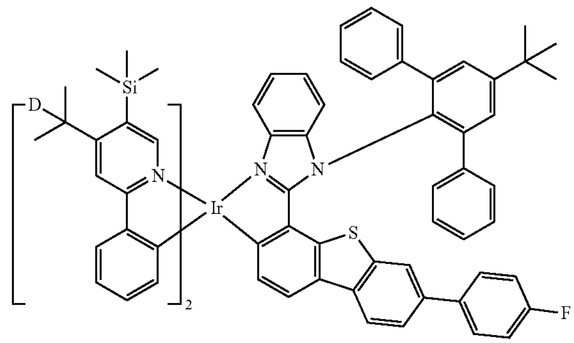
2483
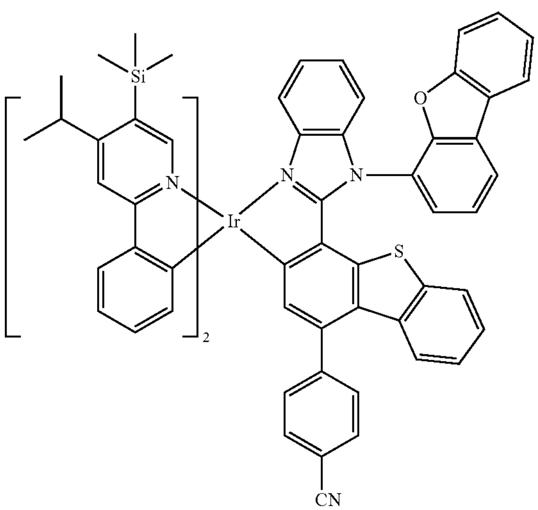
2484
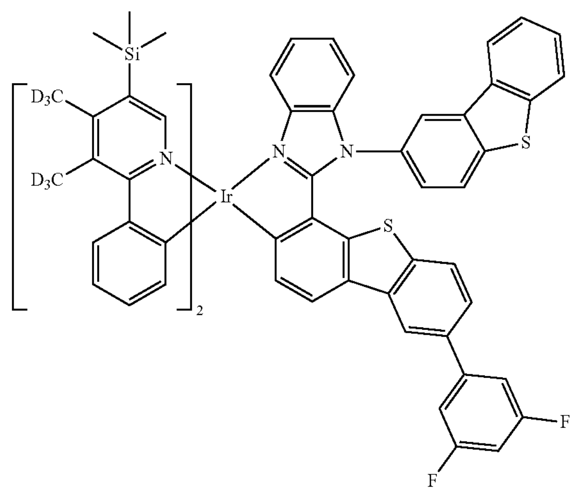
2485
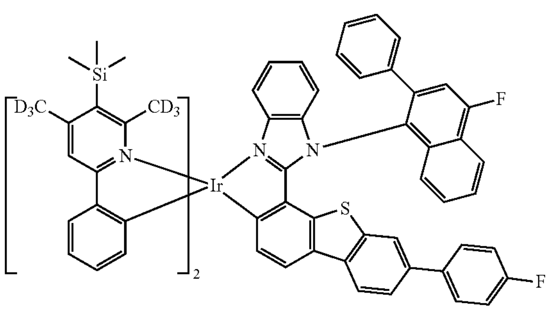
2486
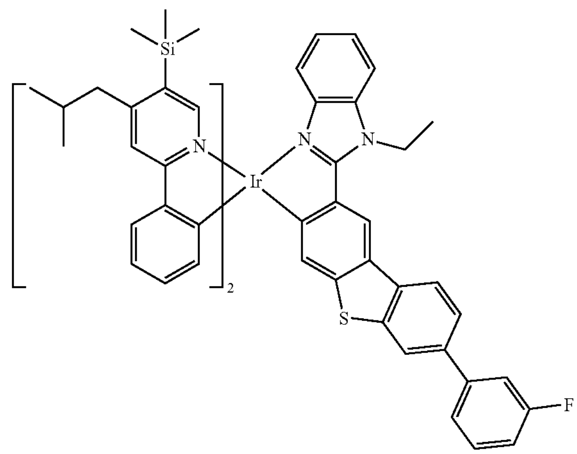

-continued
2487
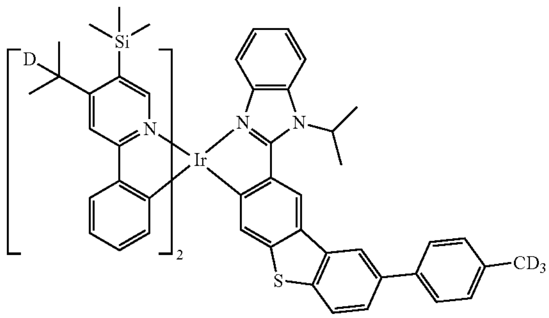
2488
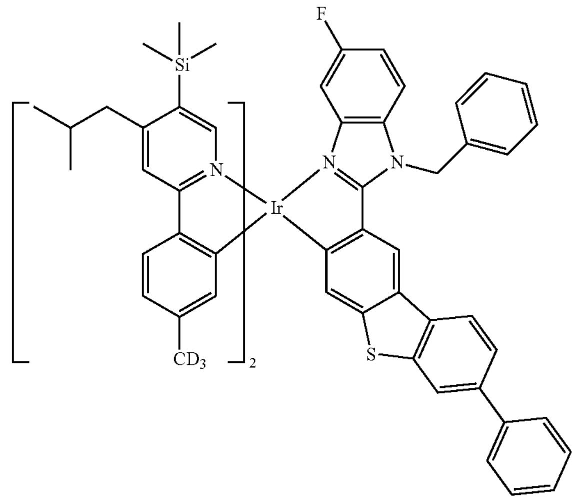
2489
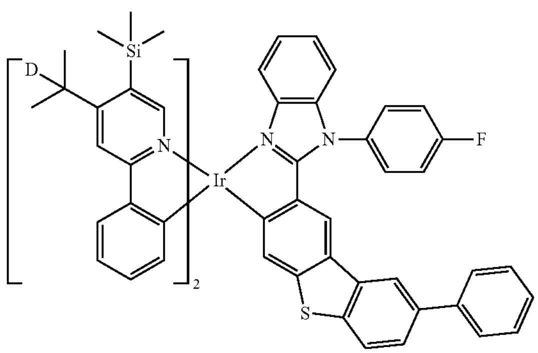
2490
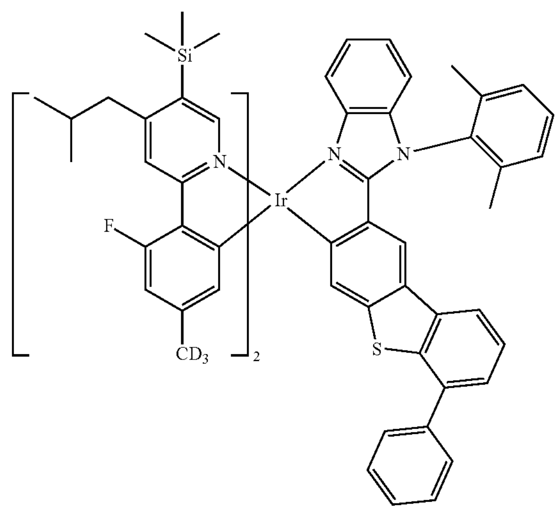
2491
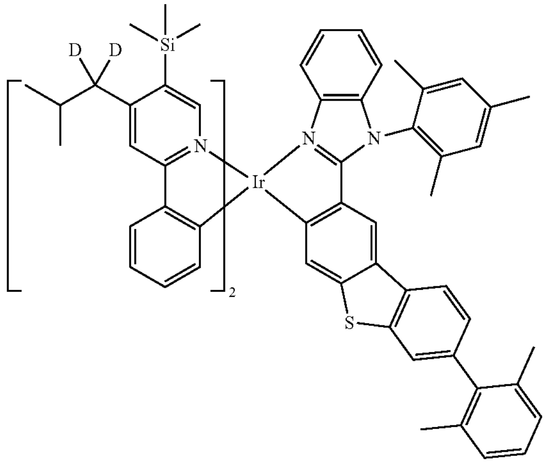
2492
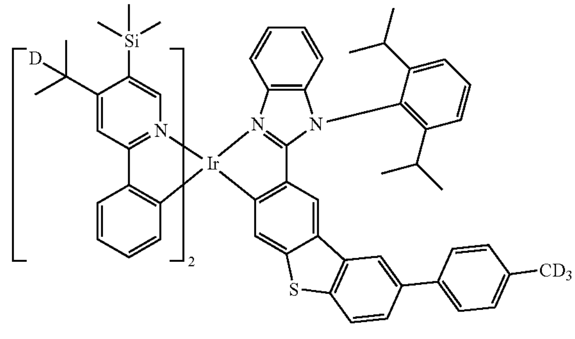

-continued
2493
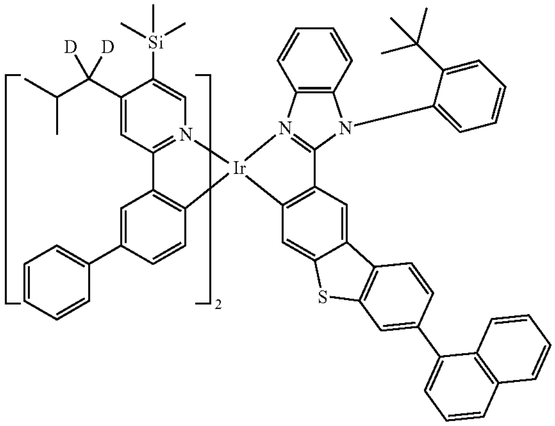
2494
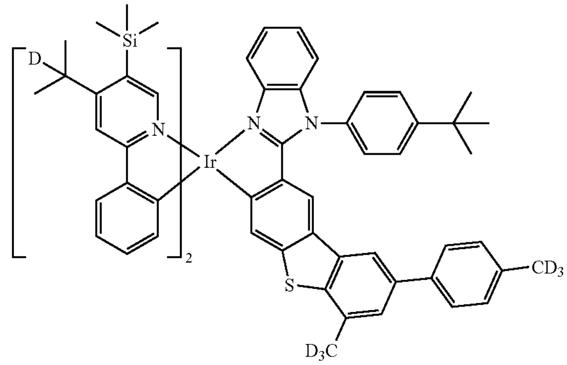
2495
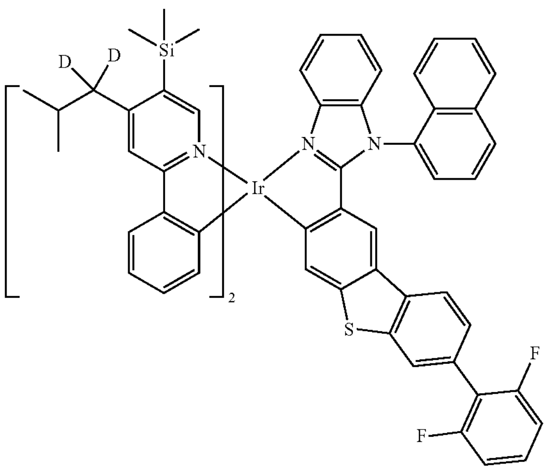
2496
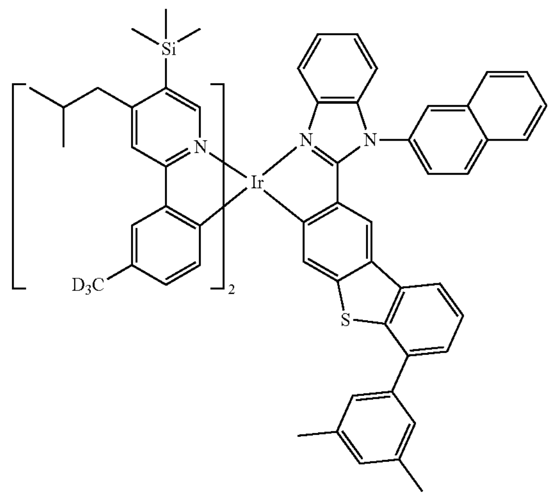
2497
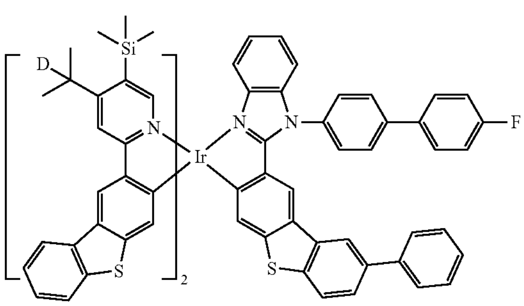
2498
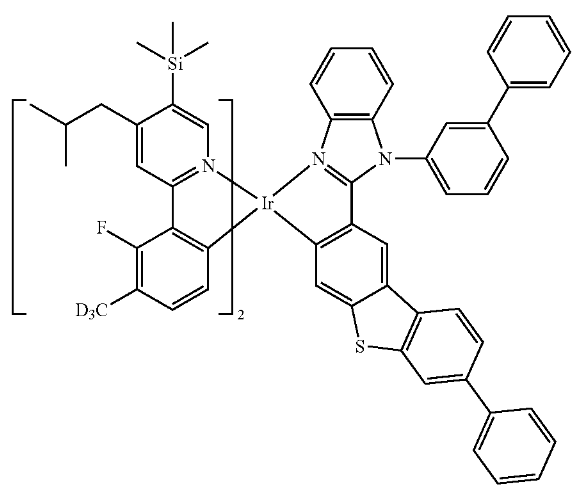

-continued
2499
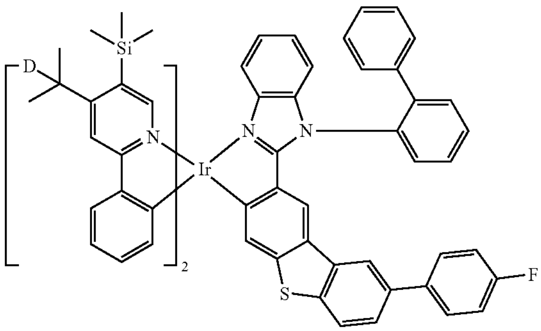
2500
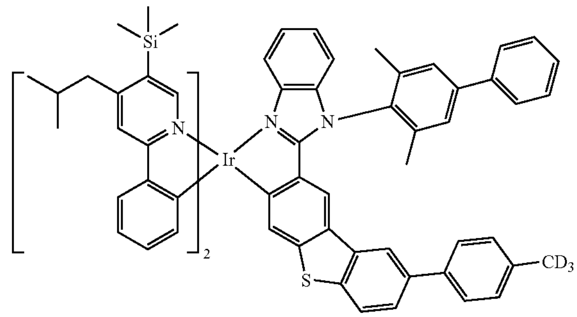
2501
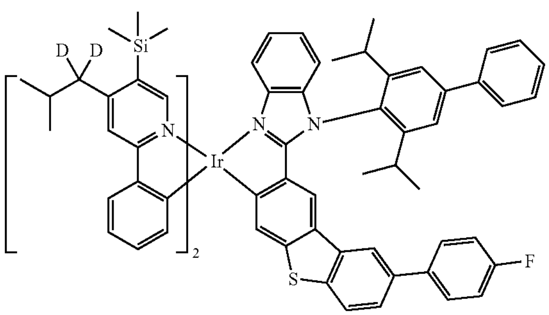
2502
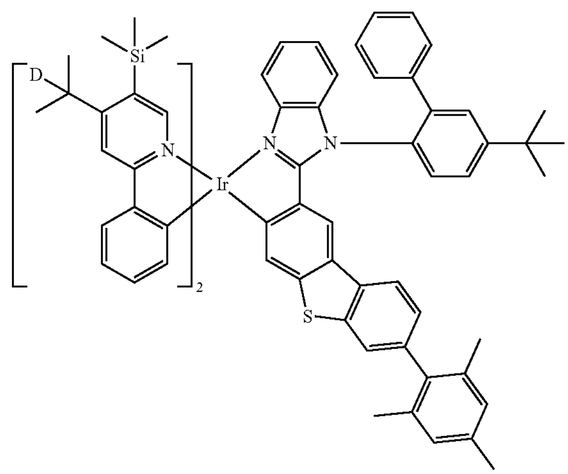
2503
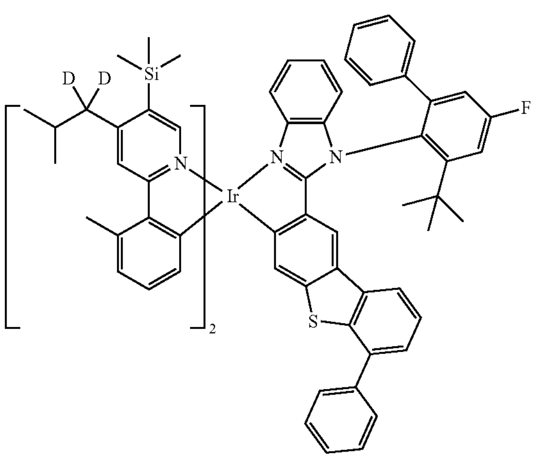
2504
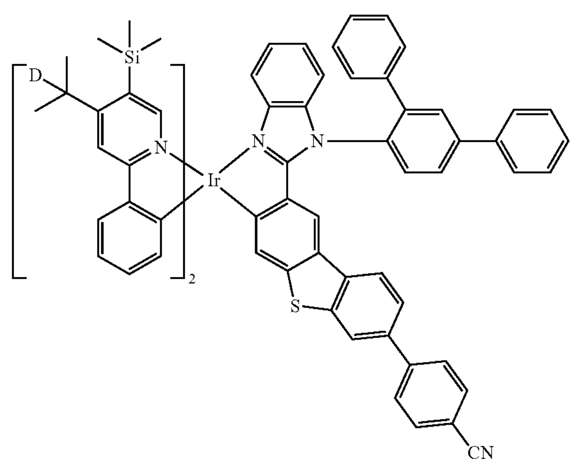

-continued
2505
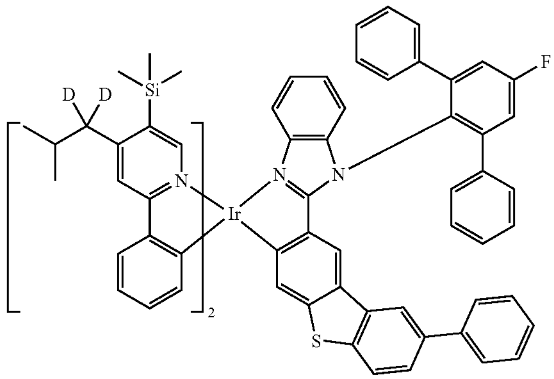
2506
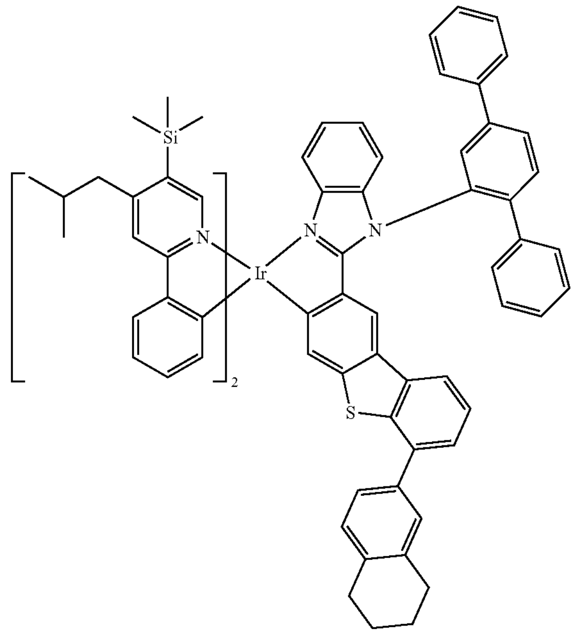
2507
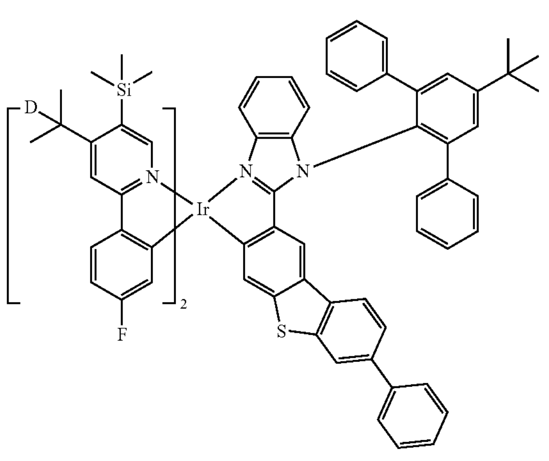
2508
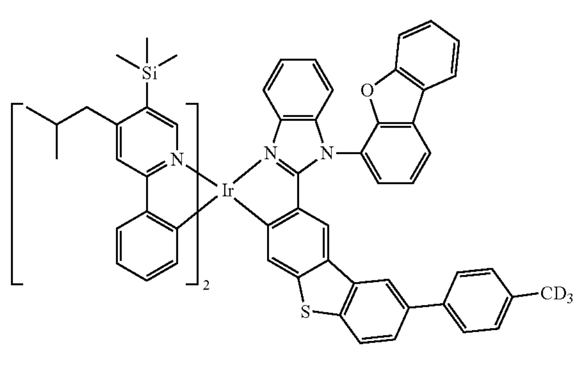

-continued
2509
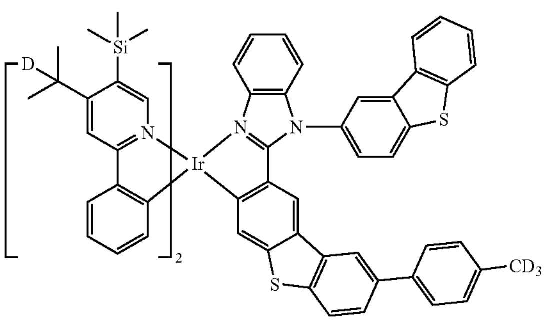
2510
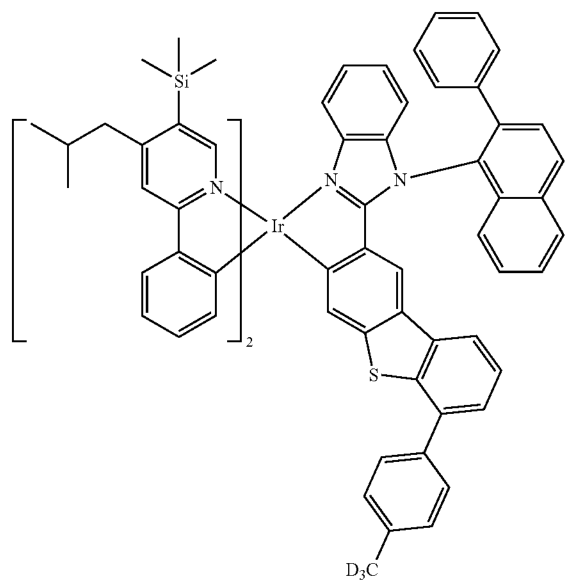
2511
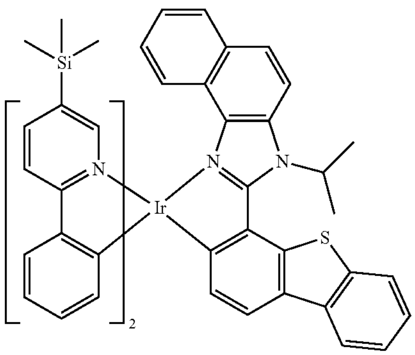
2512
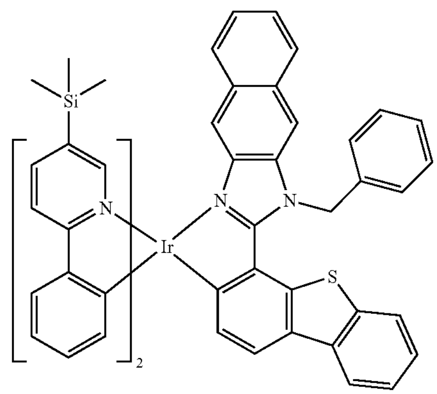
2513
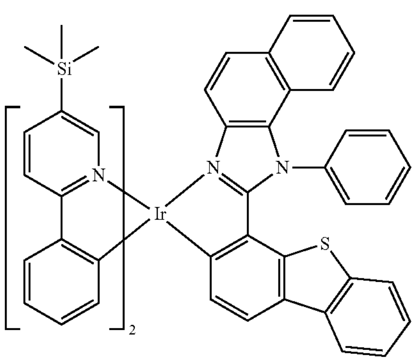
2514
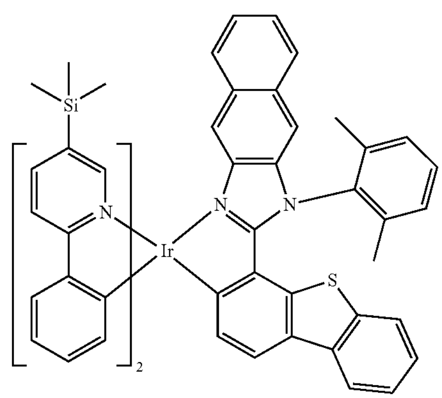

-continued
2515
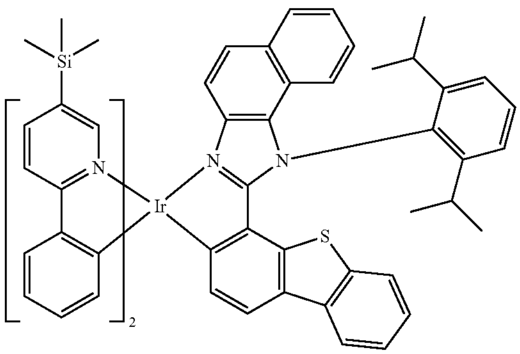
2516
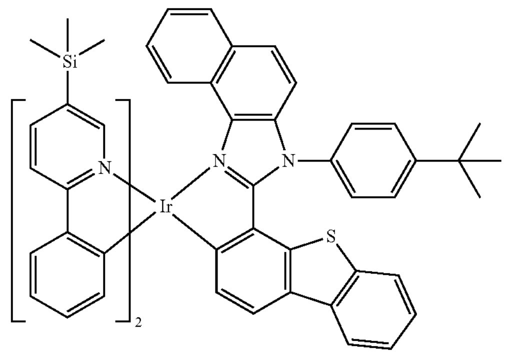
2517
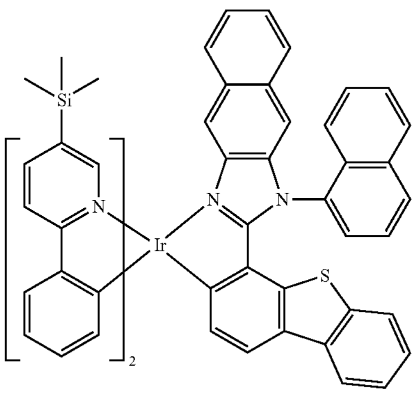
2518
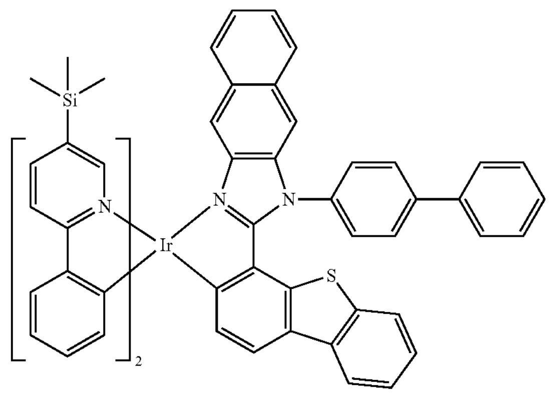
2519
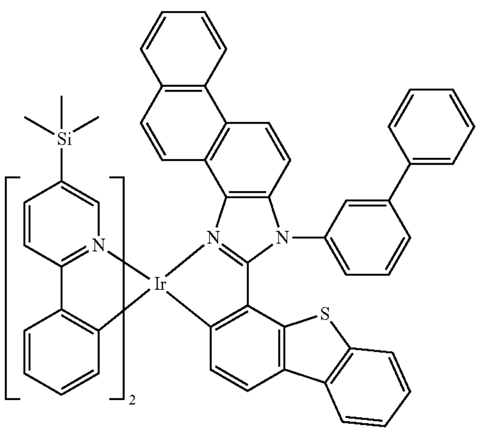
2520
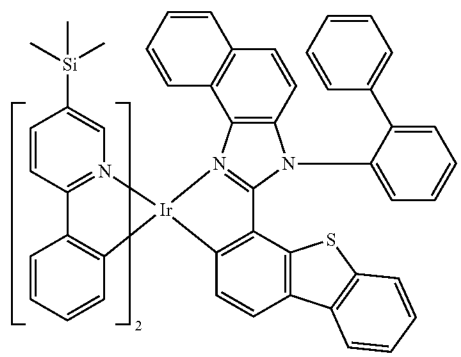
2521
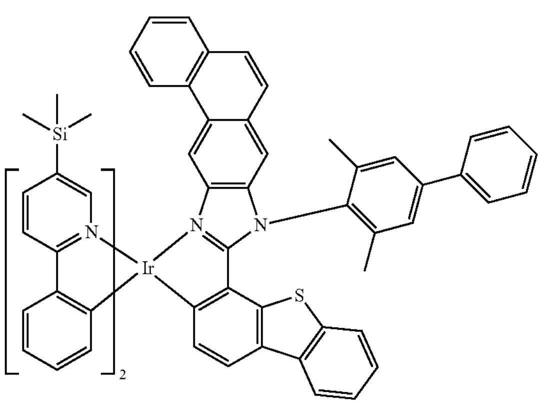
2522
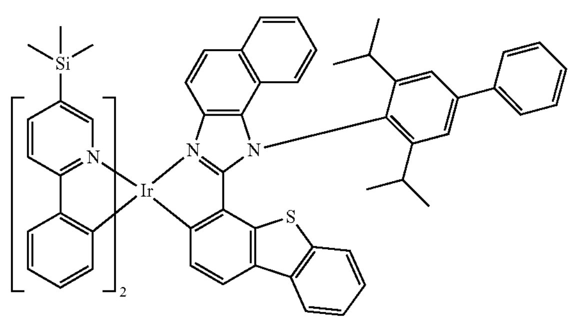

-continued
2523
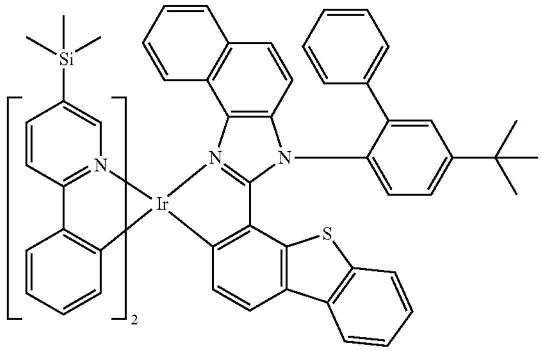
2524
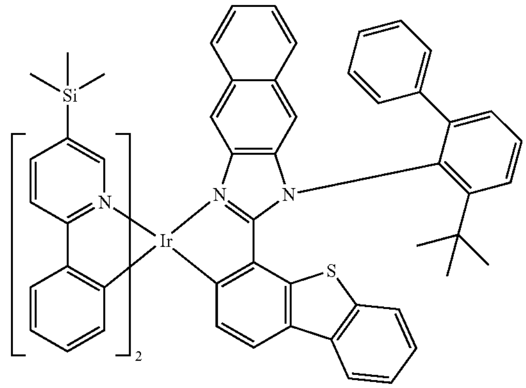
2525
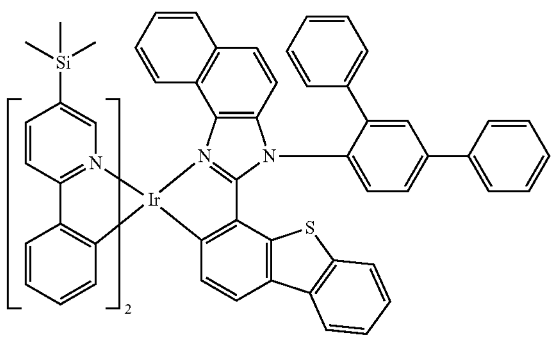
2526
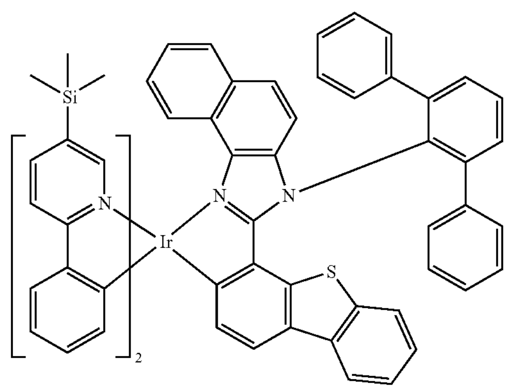
2527
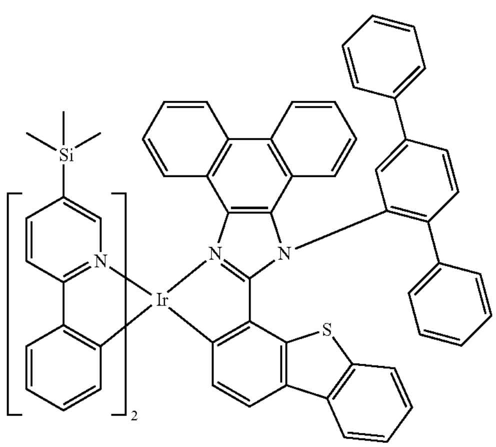
2528
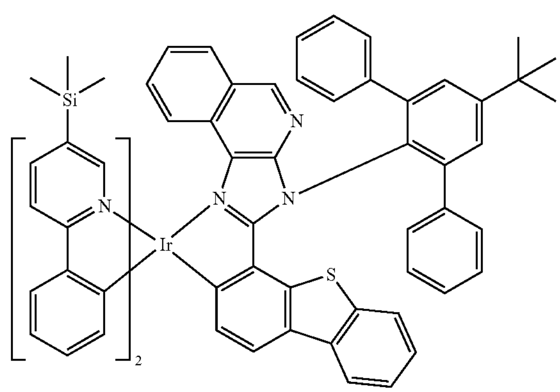

-continued
2529
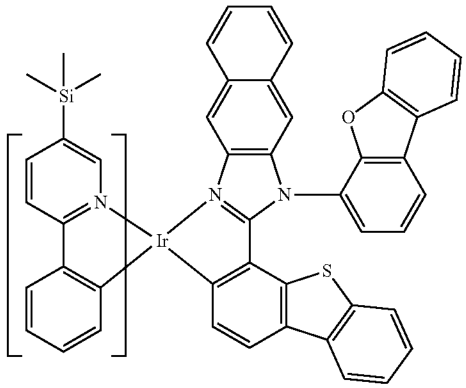
2530
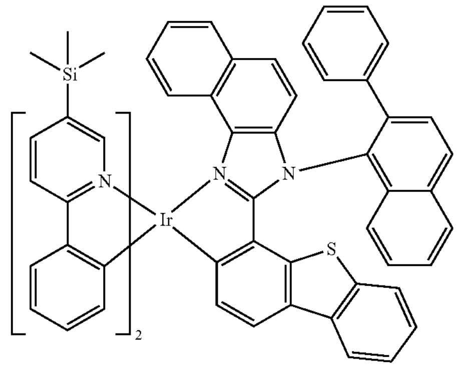
2531
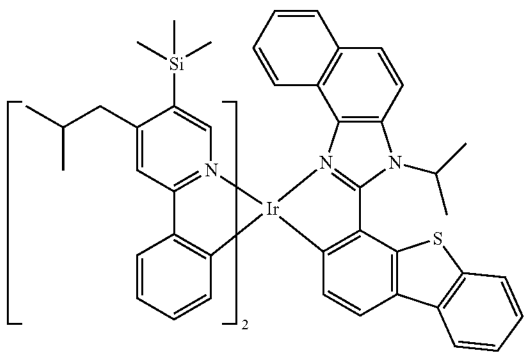
2532
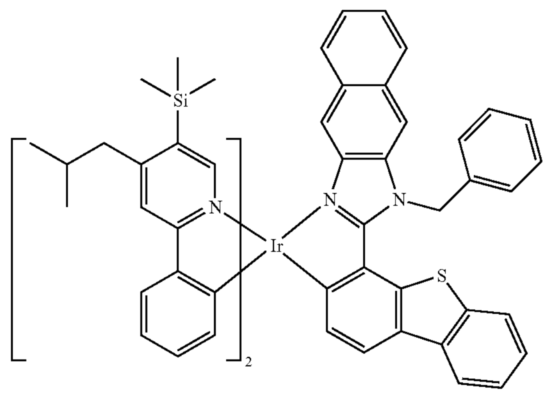
2533
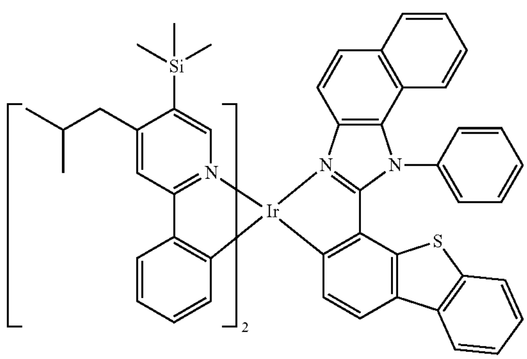
2534
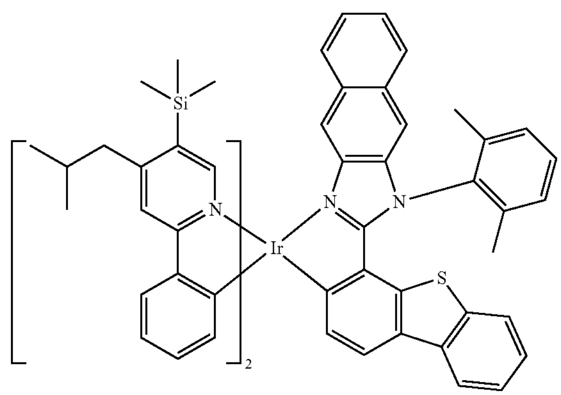
2535
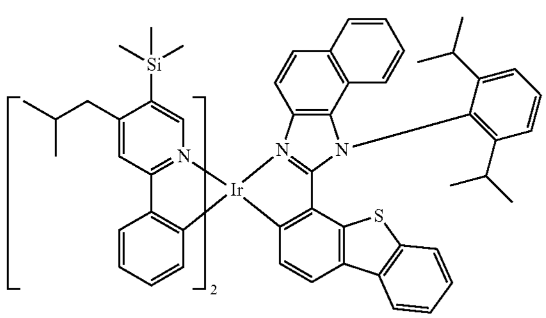
2536
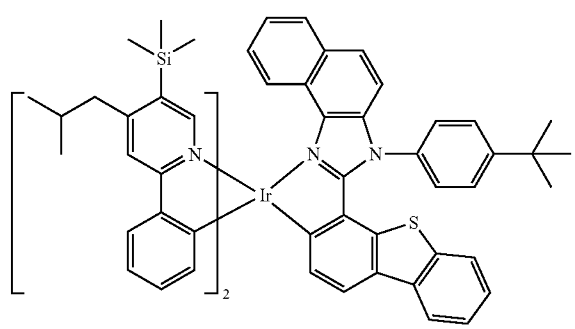

-continued
2537
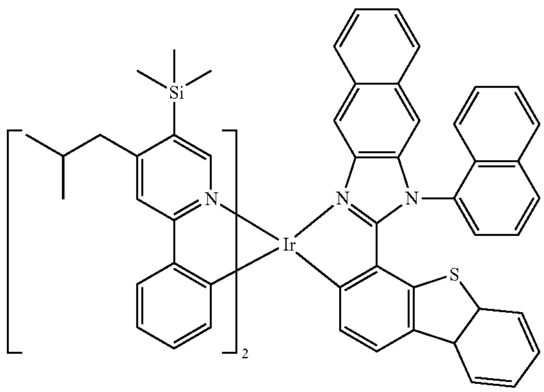
2538
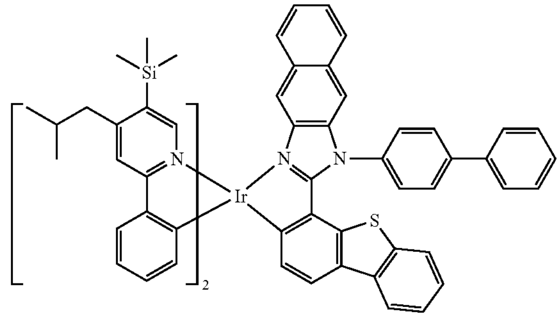
2539
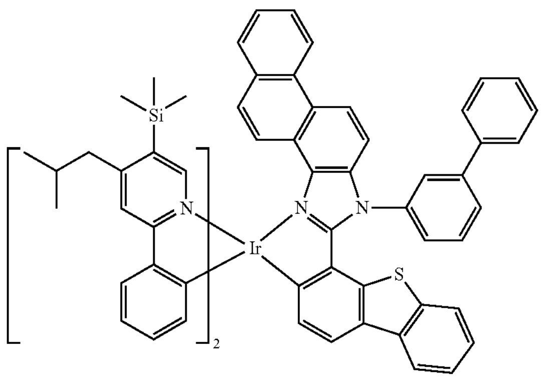
2540
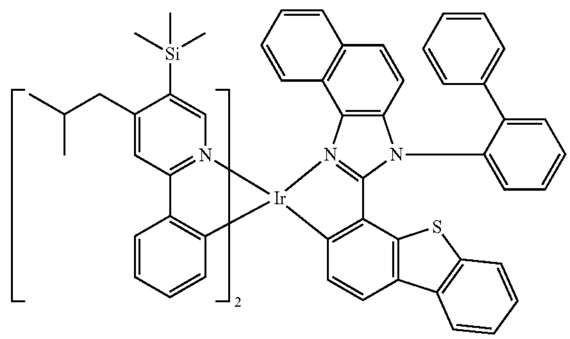
2541
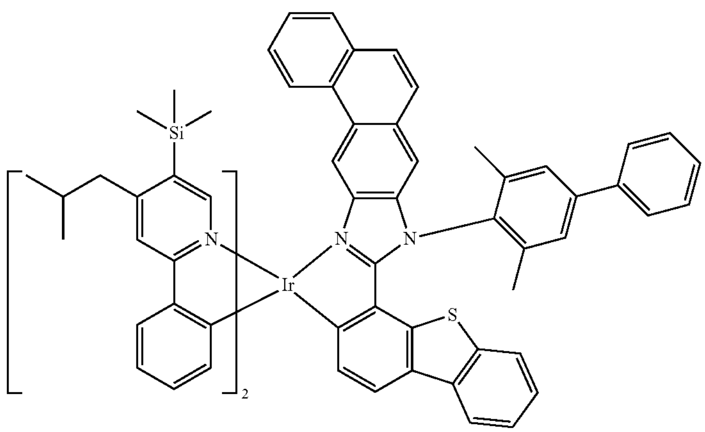
2542
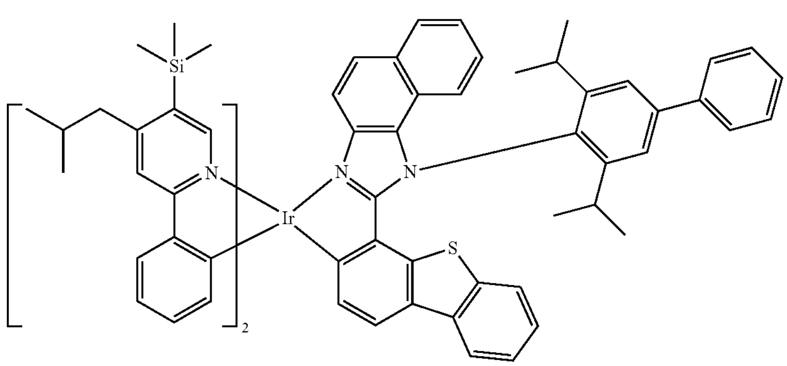

-continued
2543
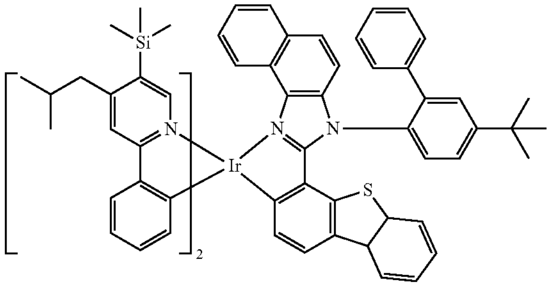
2544
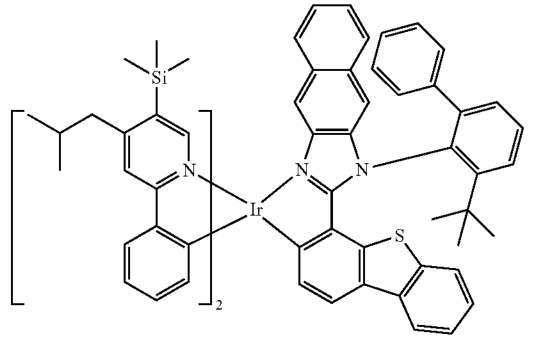
2545
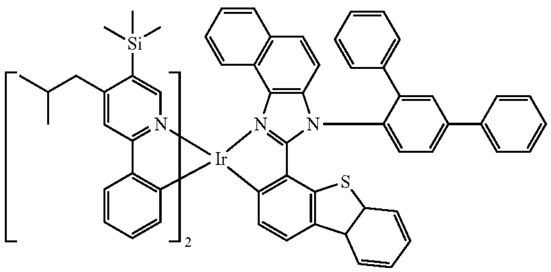
2546
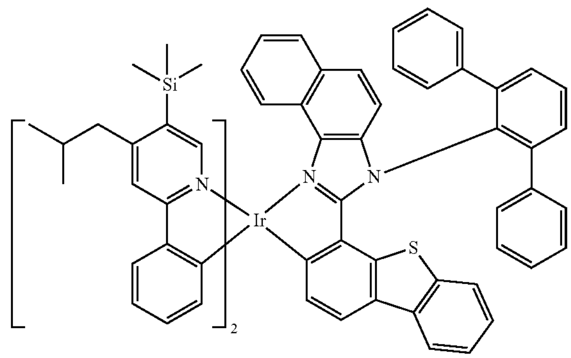
2547
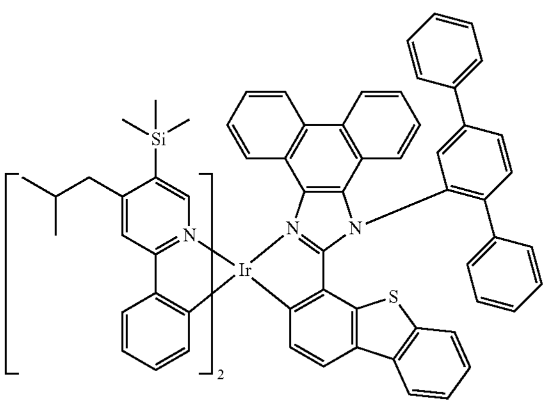
2548
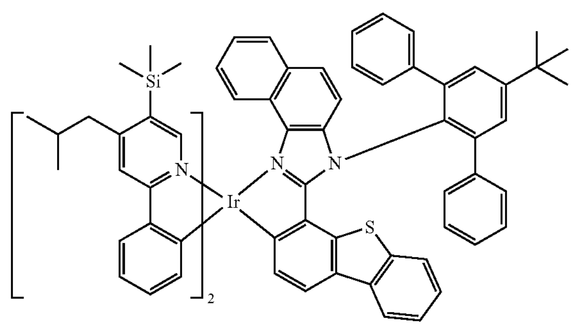
2549
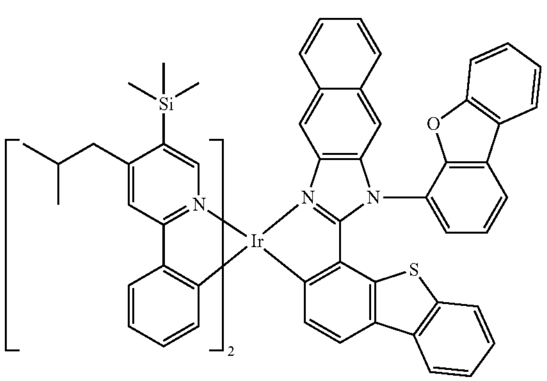
2550
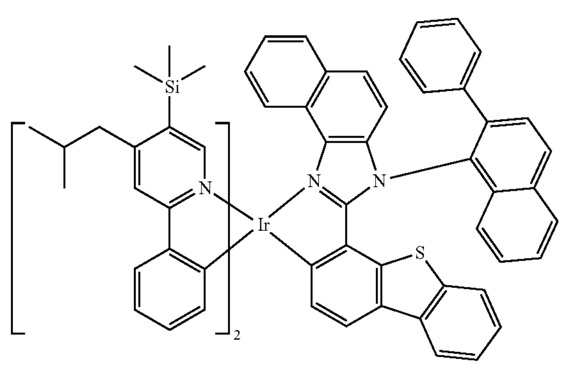

-continued
2551
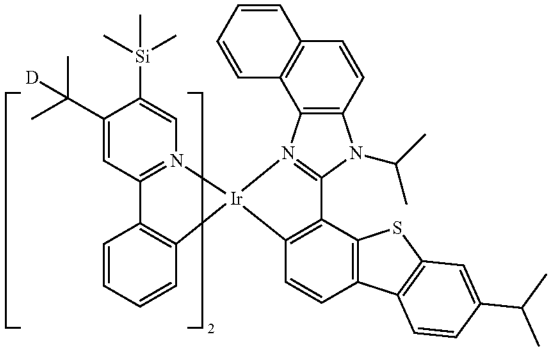
2552
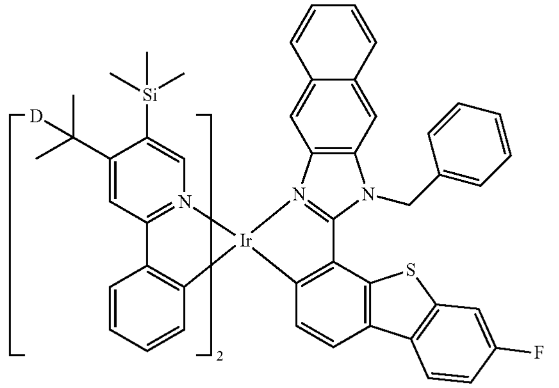
2553
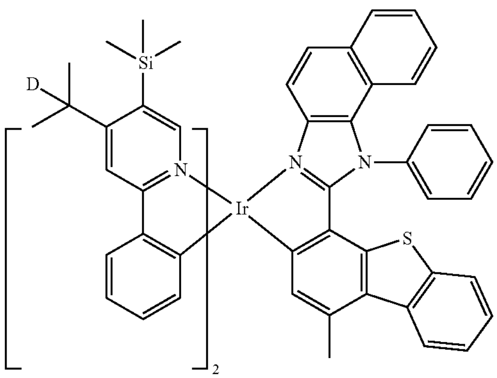
2554
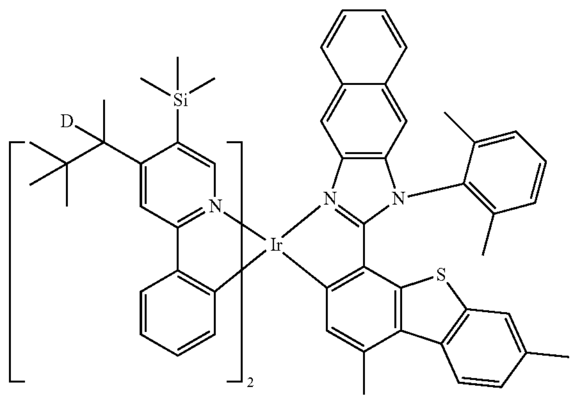
2555
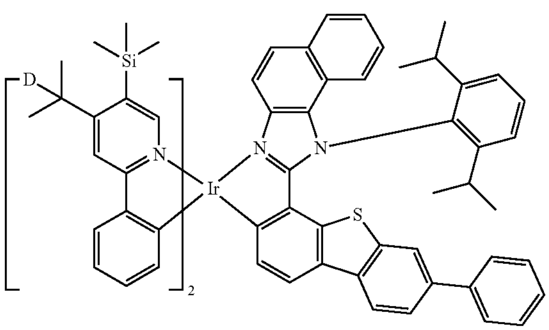
2556
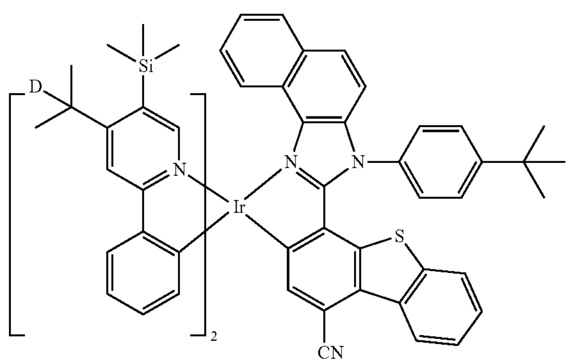
2557
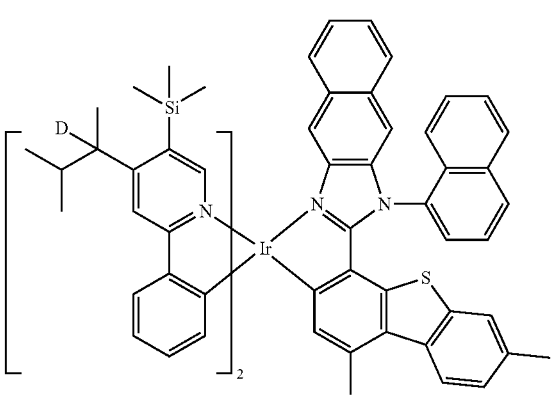
2558
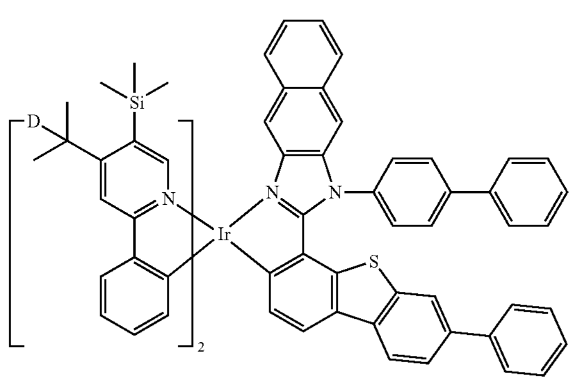

-continued
2559
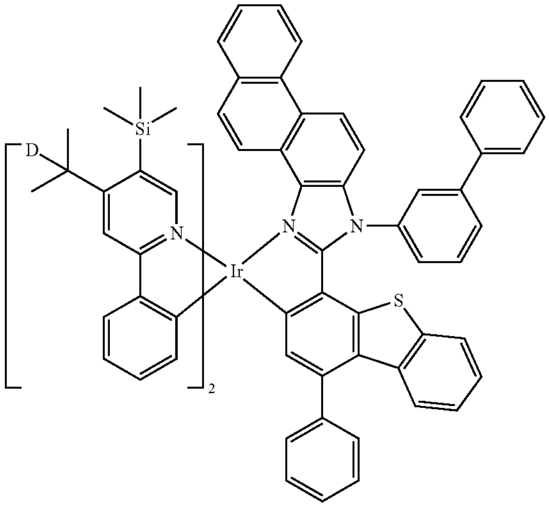
2560
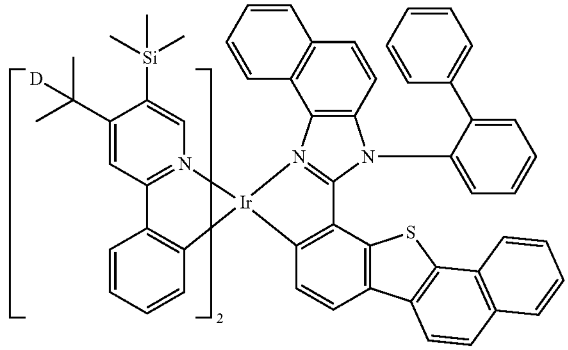
2561
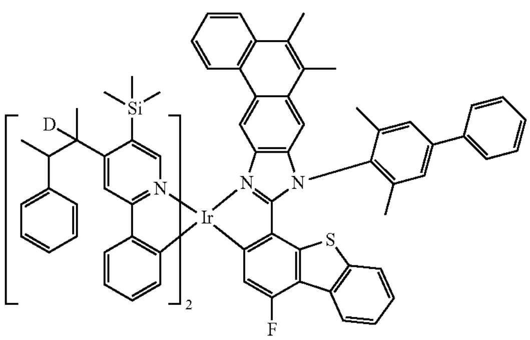
2562
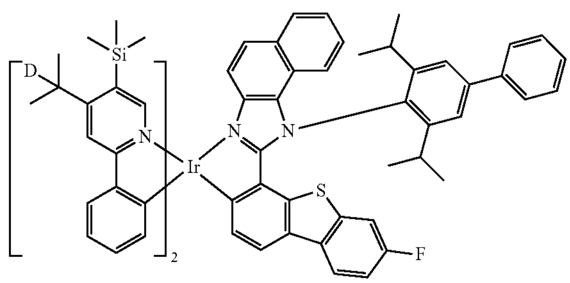
2563
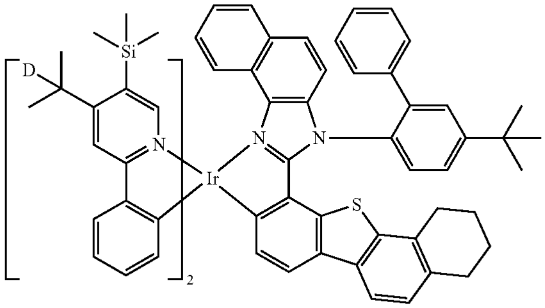
2564
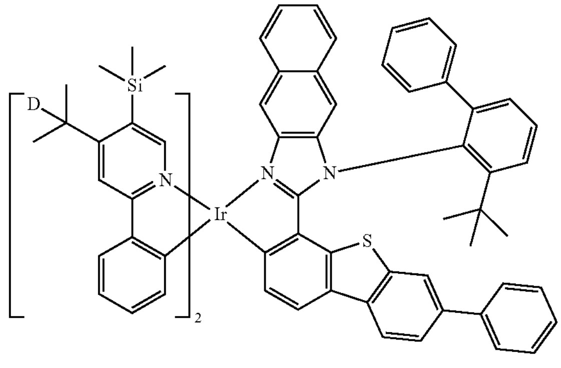

-continued
2565
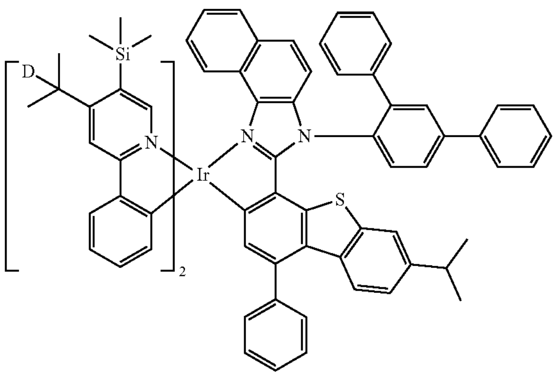
2566
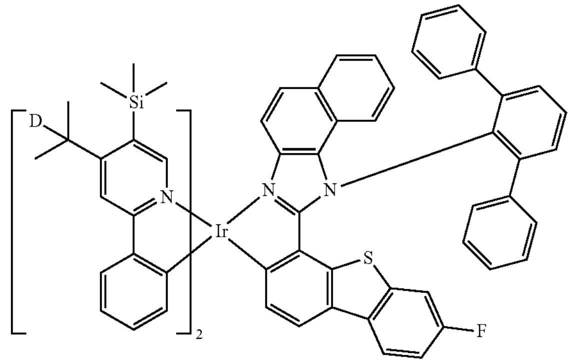
2567
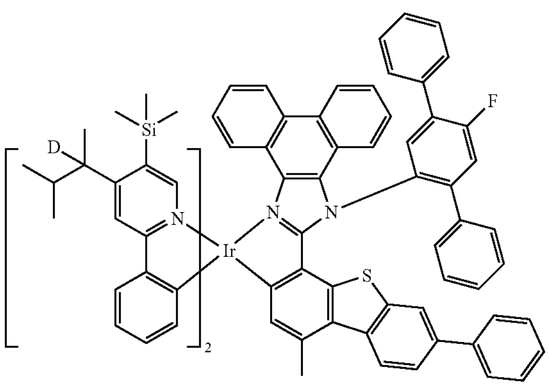
2568
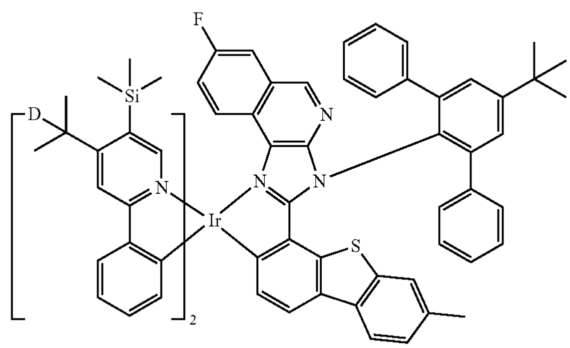
2569
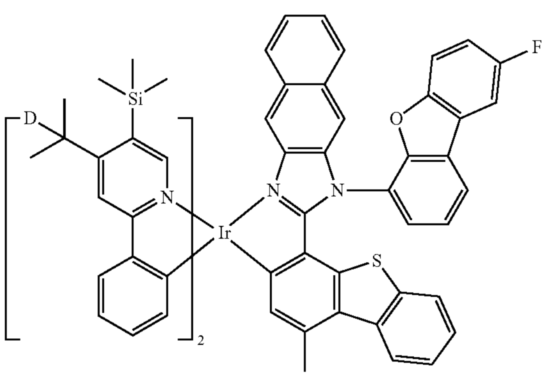
2570
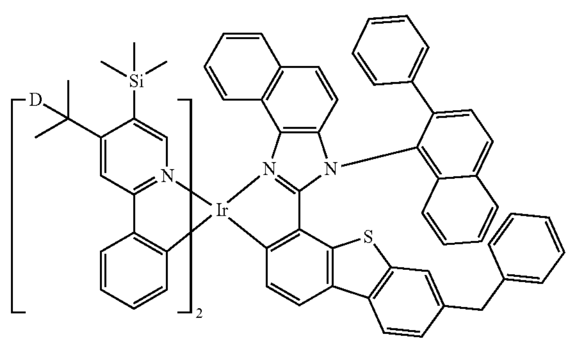
2571
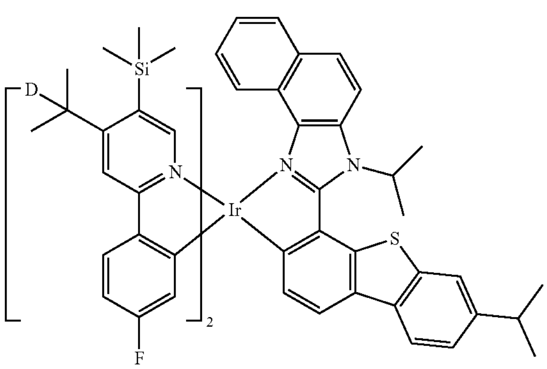
2572
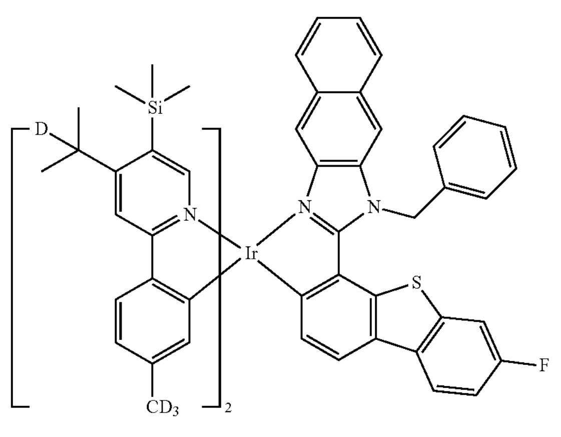

-continued
2573
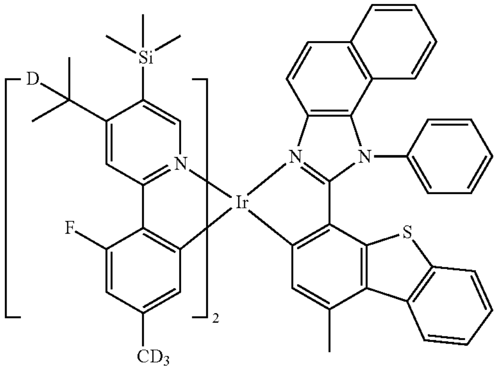
2574
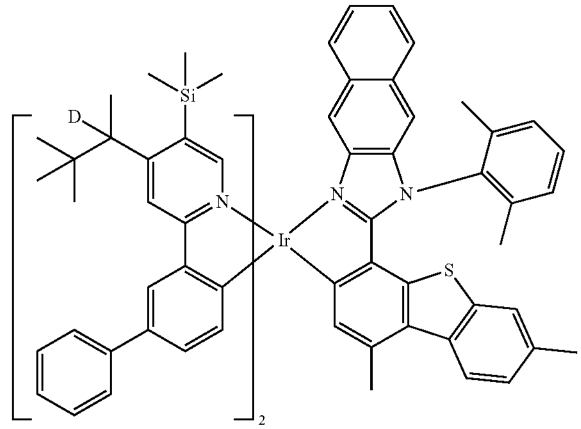
2575
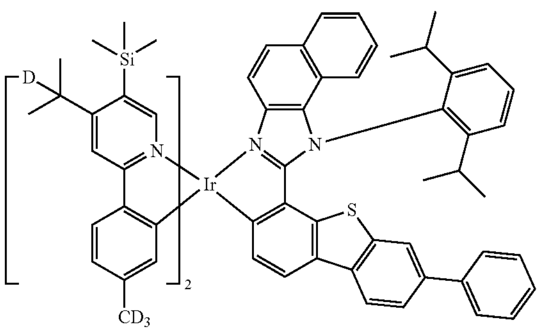
2576
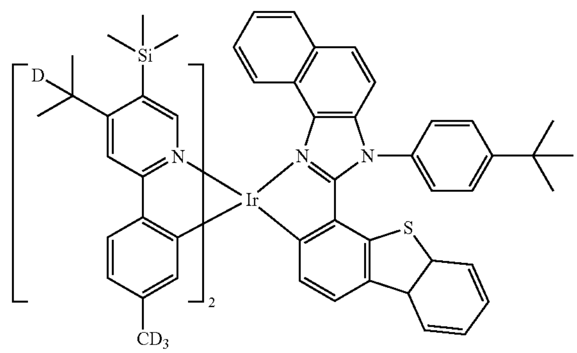
2577
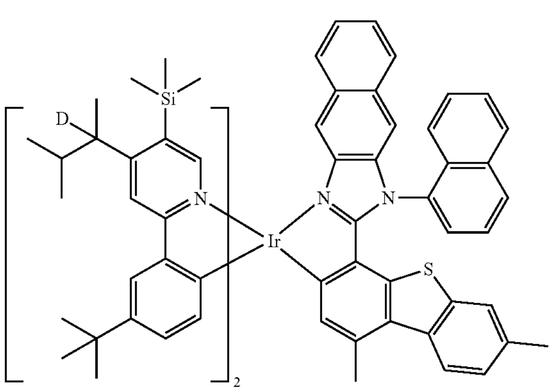
2578
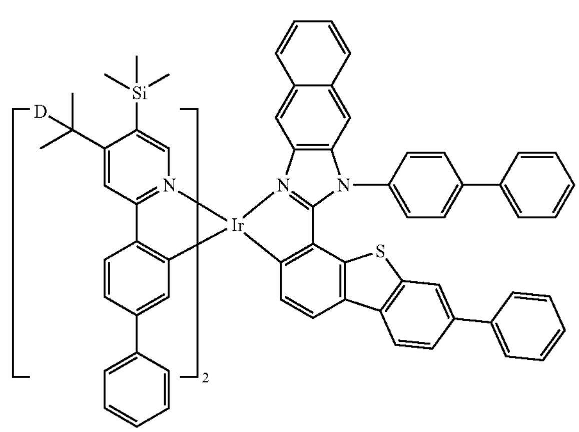

-continued
2579
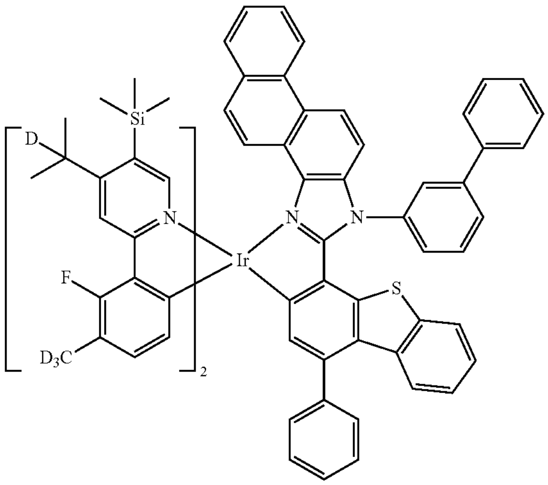
2580
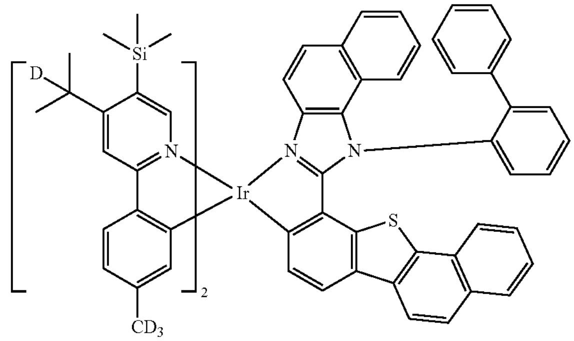
2581
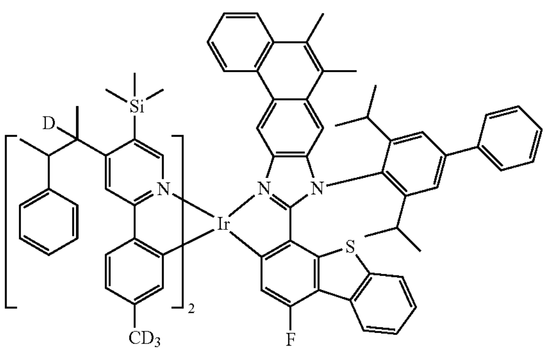
2582
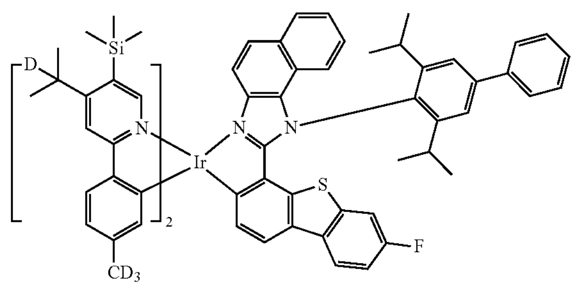
2583
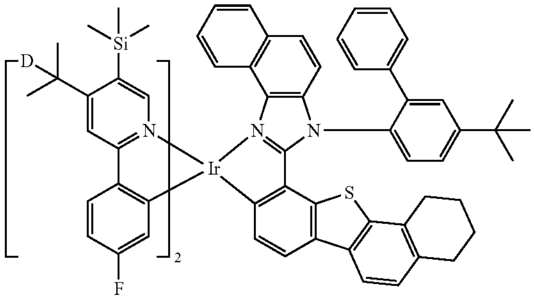
2584
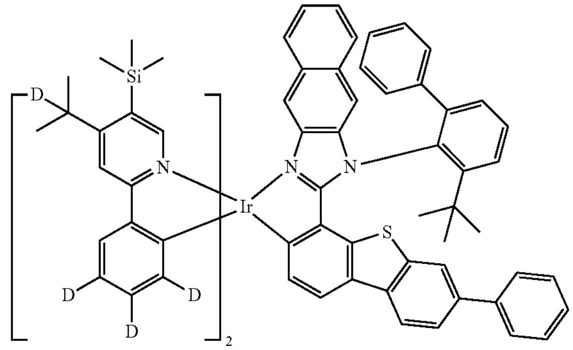

-continued
2585
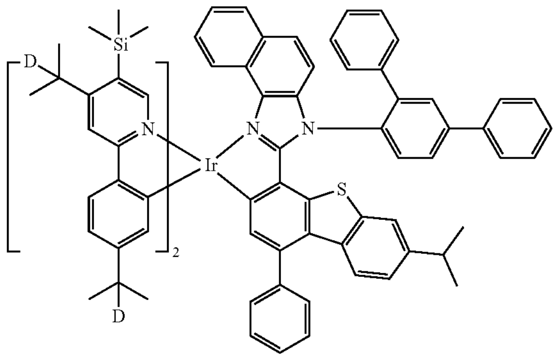
2586
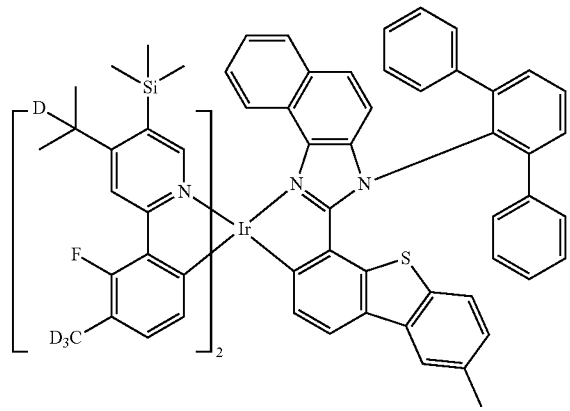
2587
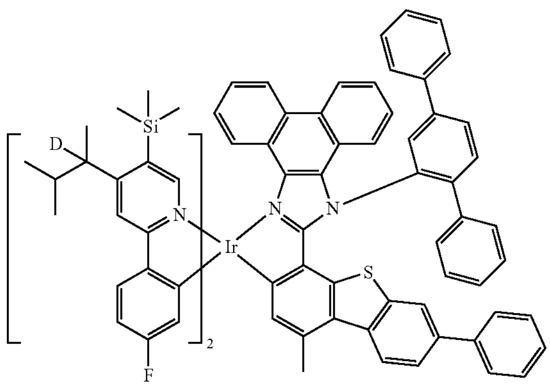
2588
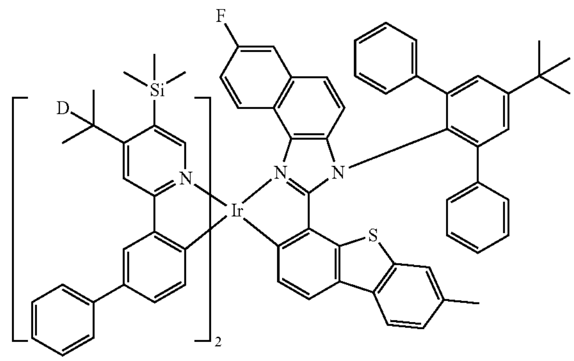
2589
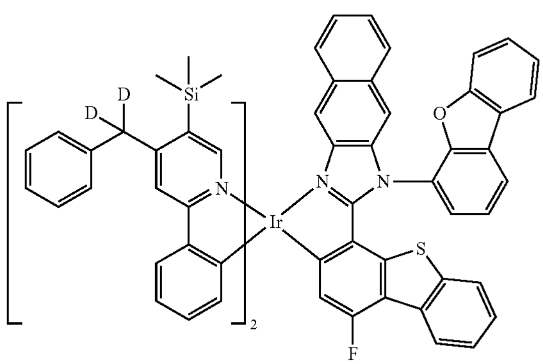
2590
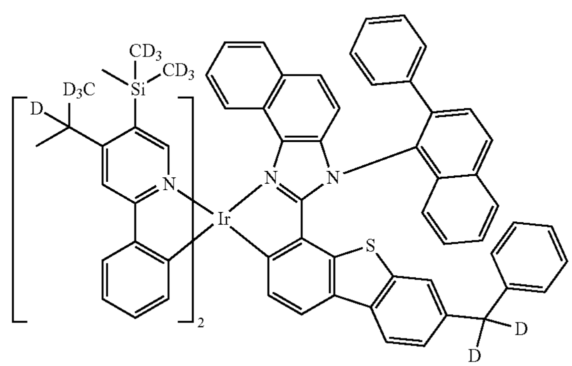
2591
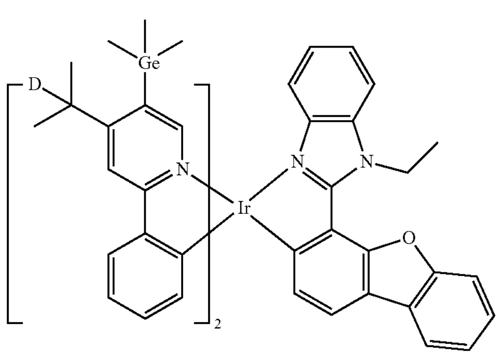
2592
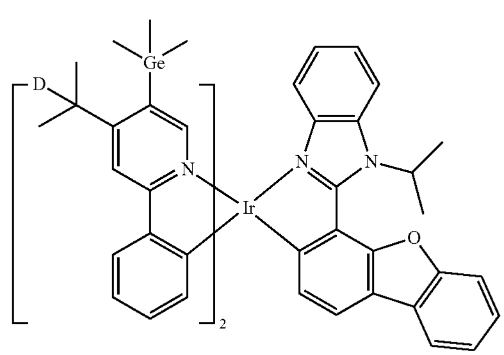

-continued
2593
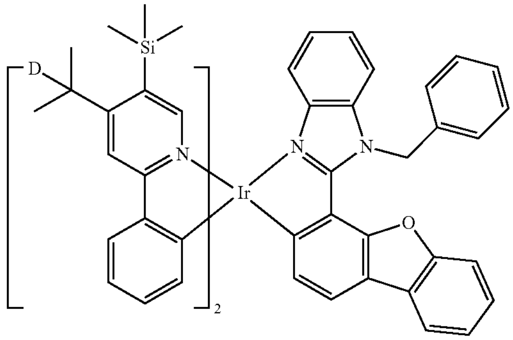
2594
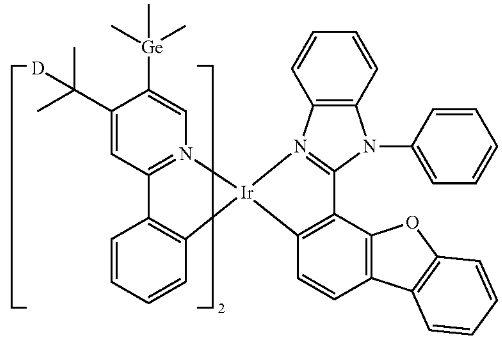
2595
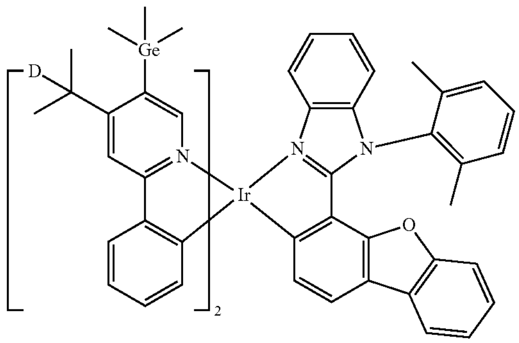
2596
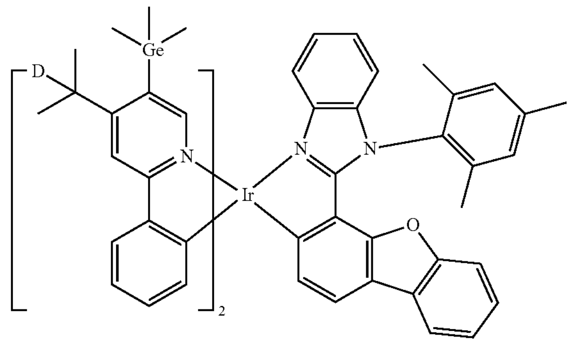
2597
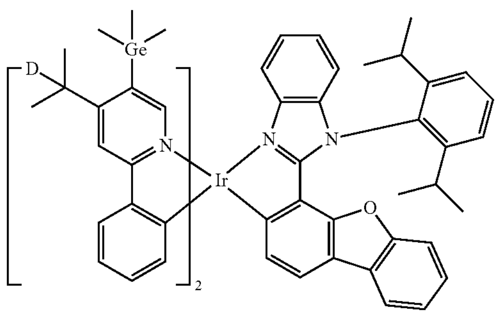
2598
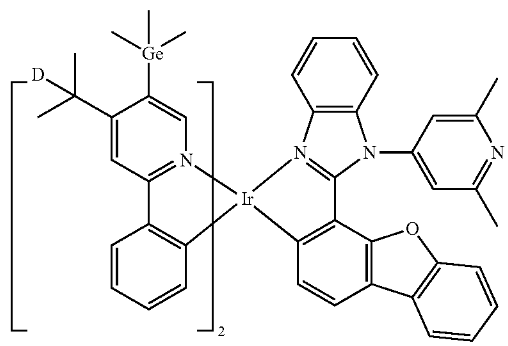
2599
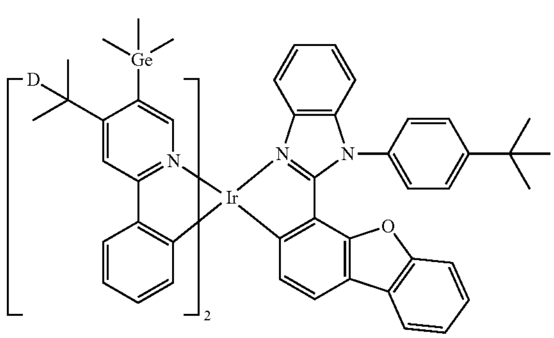
2600
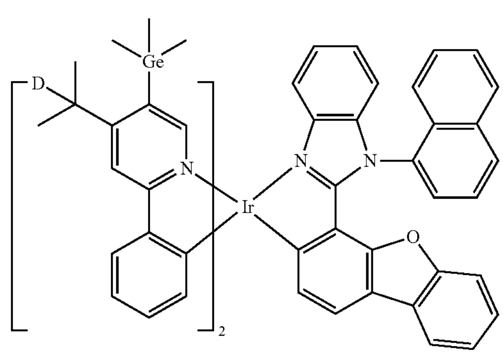

-continued
2601
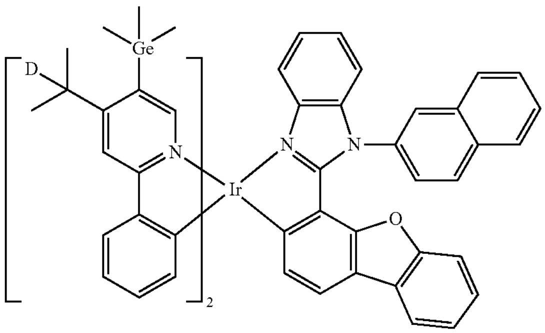
2602
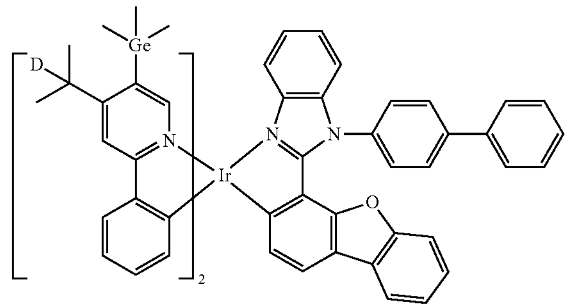
2603
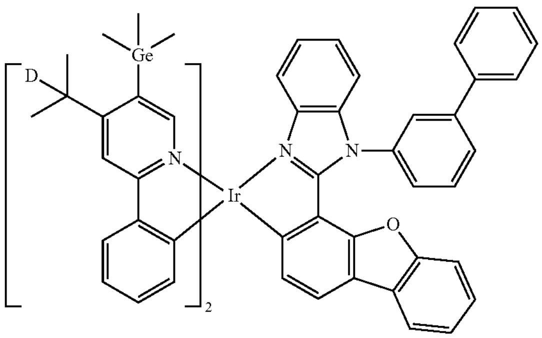
2604
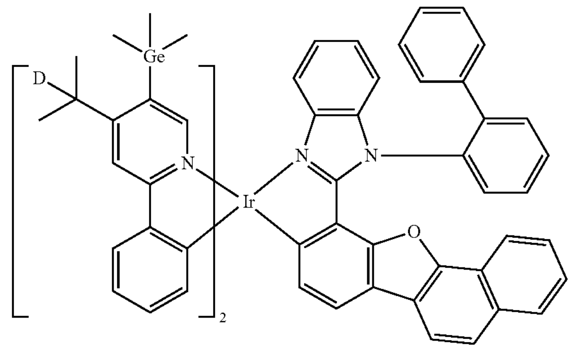
2605
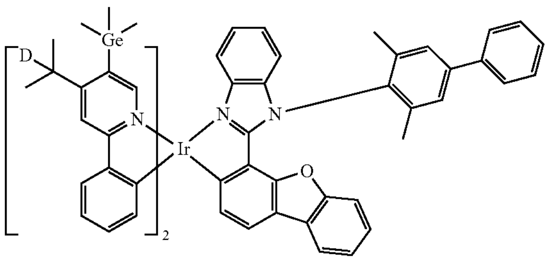
2606
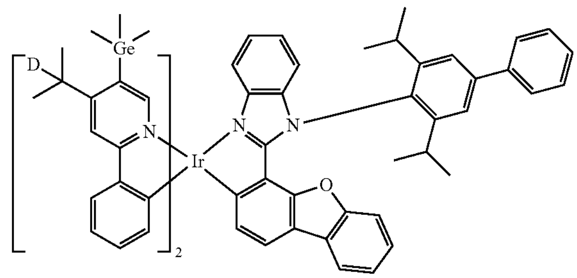
2607
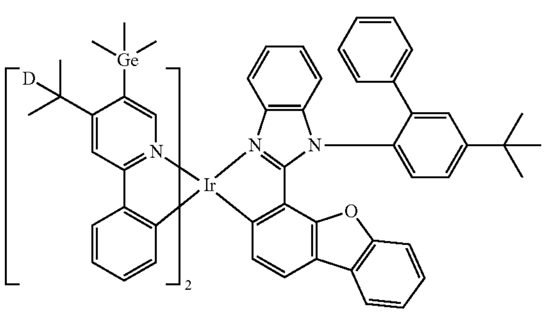
2608
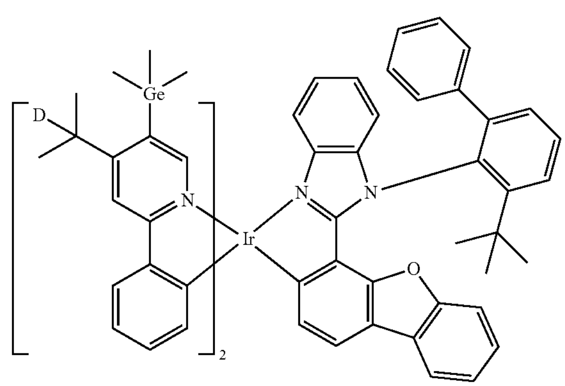

-continued
2609
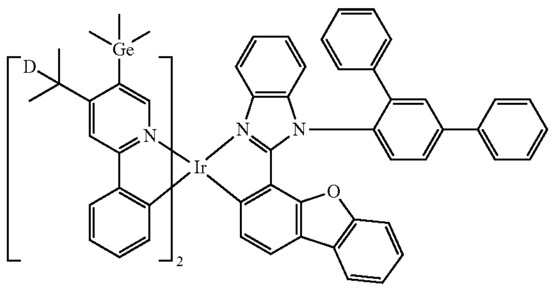
2610
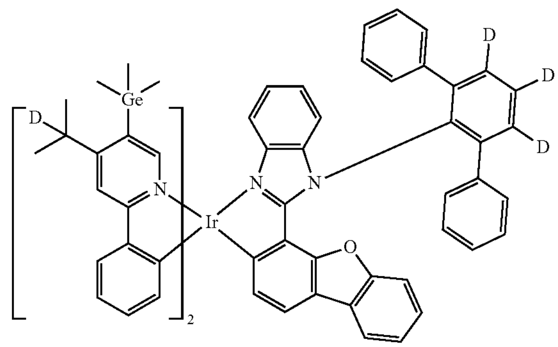
2611
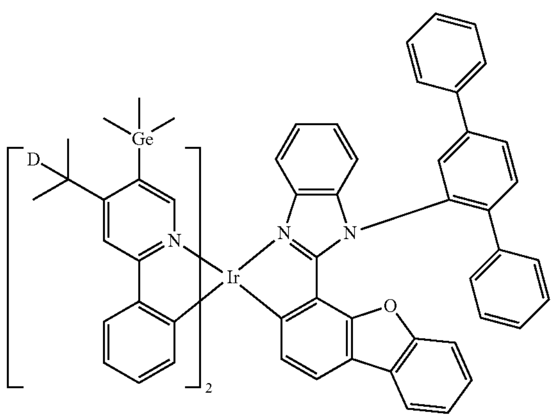
2612
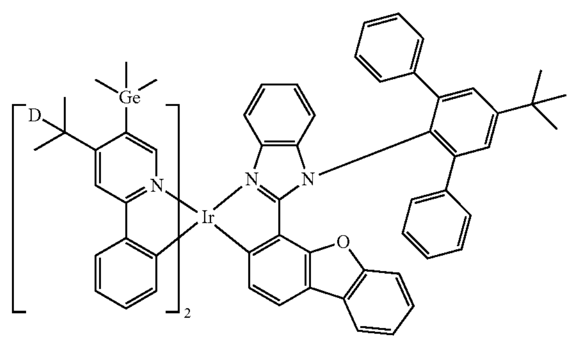
2613
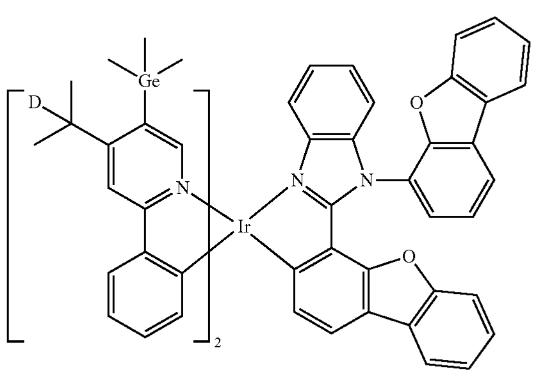
2614
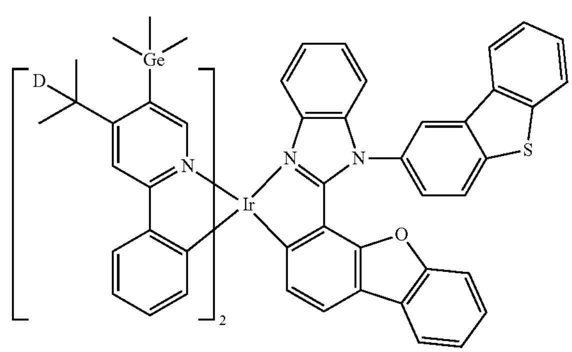
2615
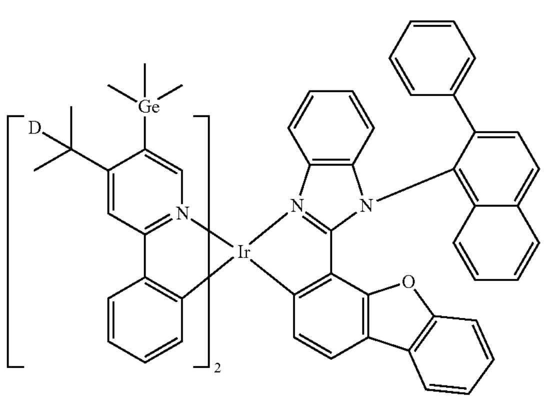
2616
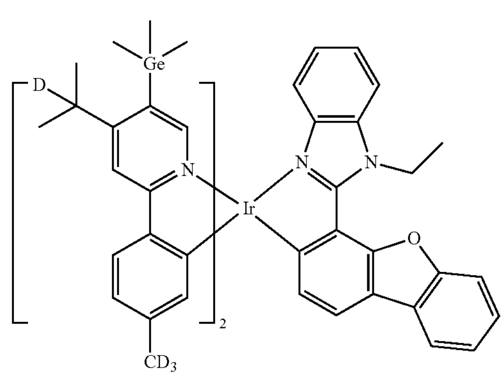

-continued
2617
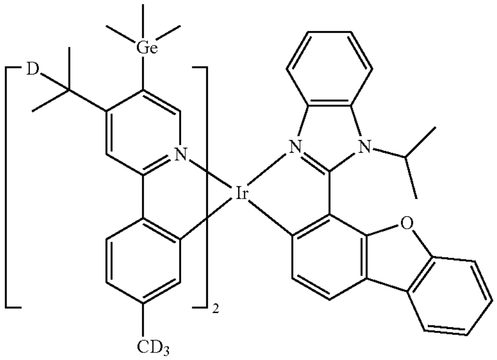
2618
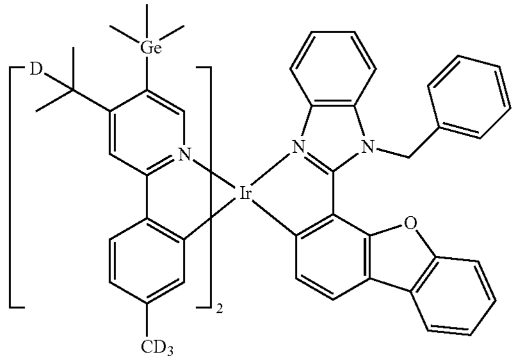
2619
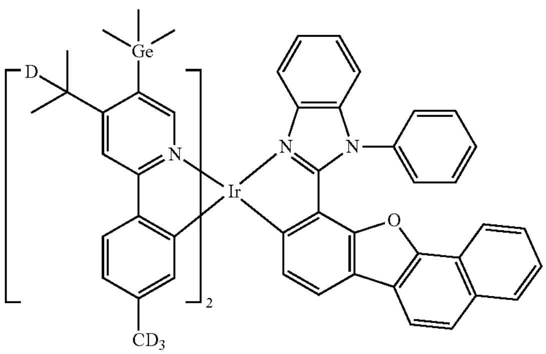
2620
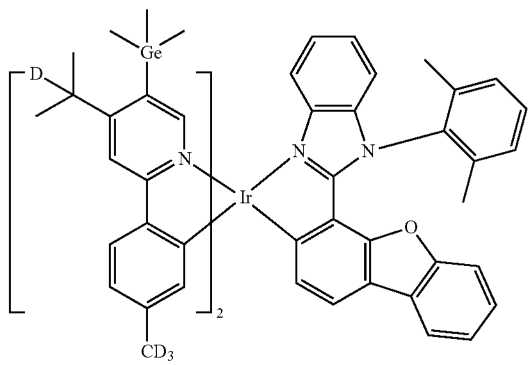
2621
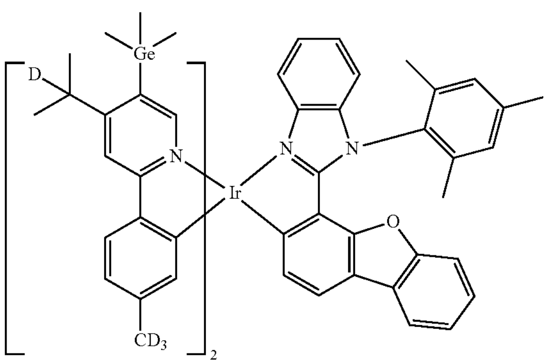
2622
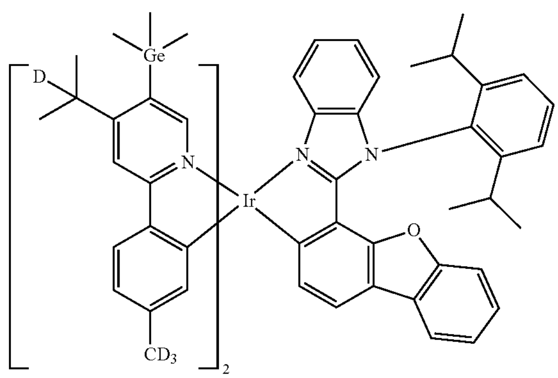
2623
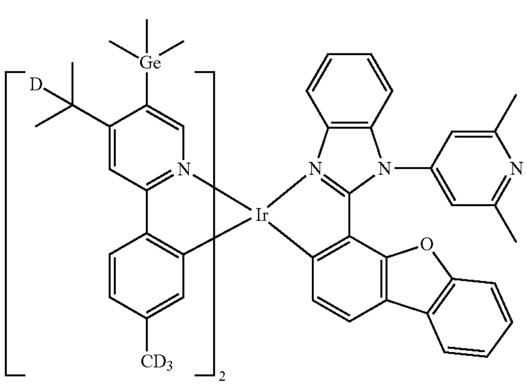
2624
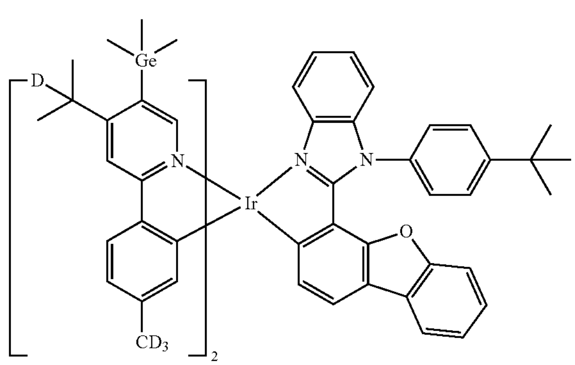

-continued
2625
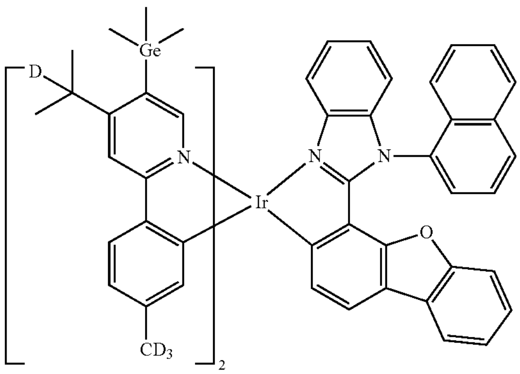
2626
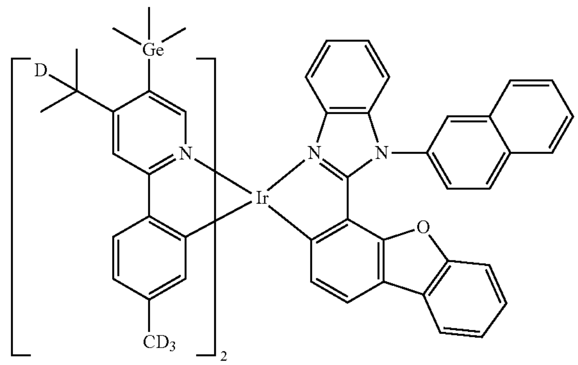
2627
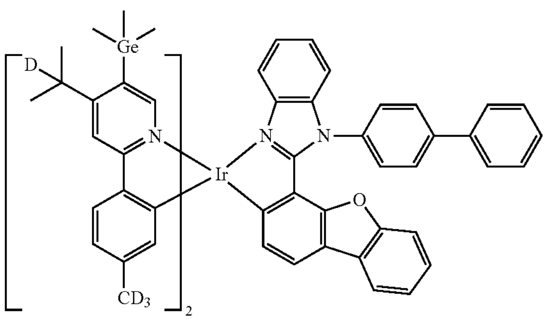
2628
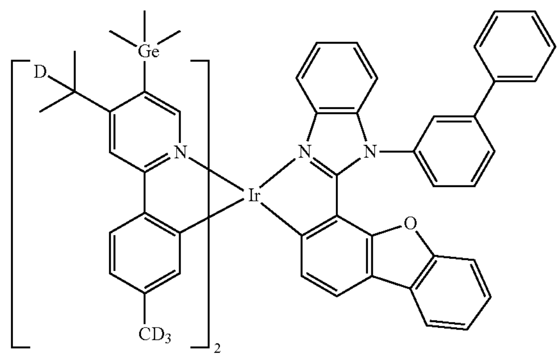
2629
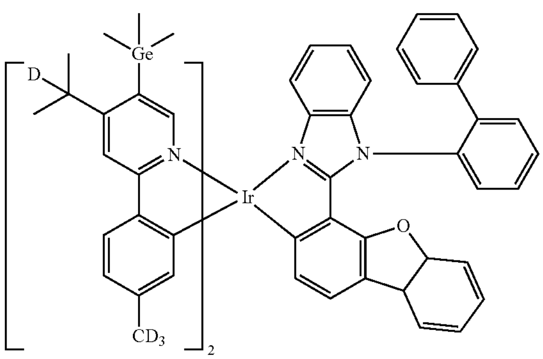
2630
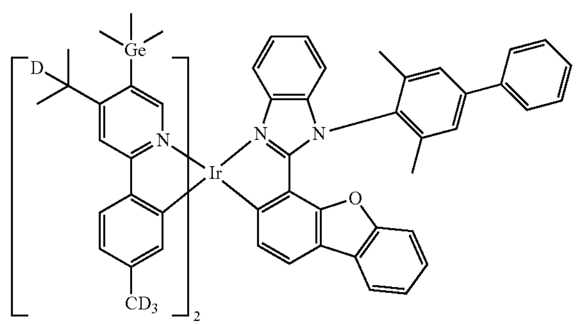
2631
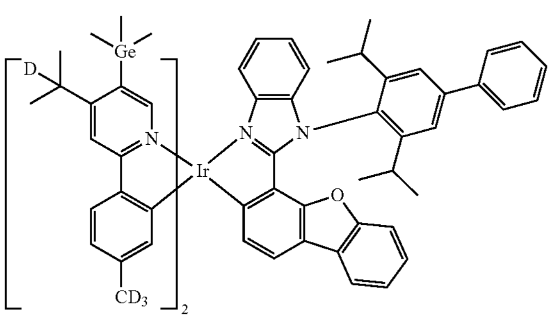
2632
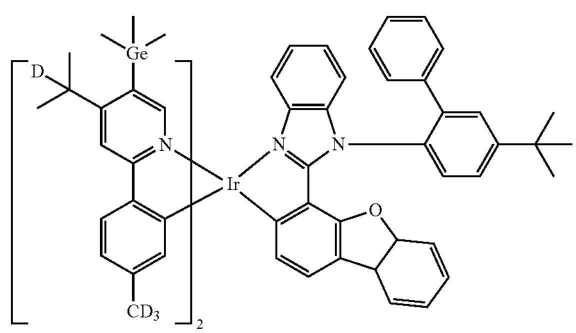

-continued
2633
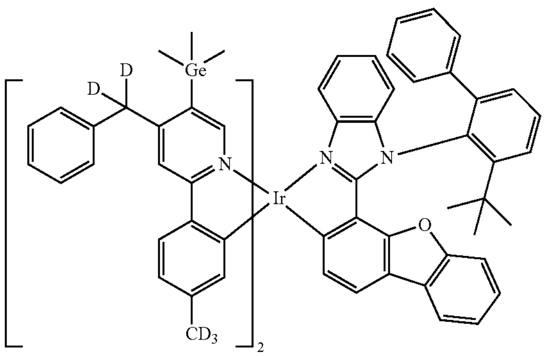
2634
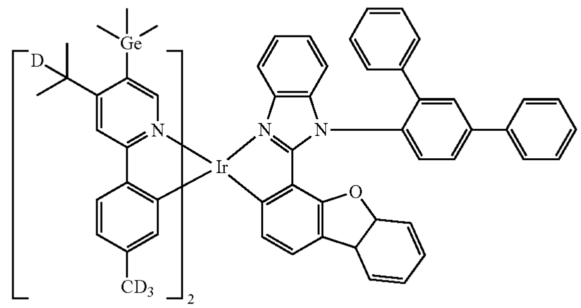
2635
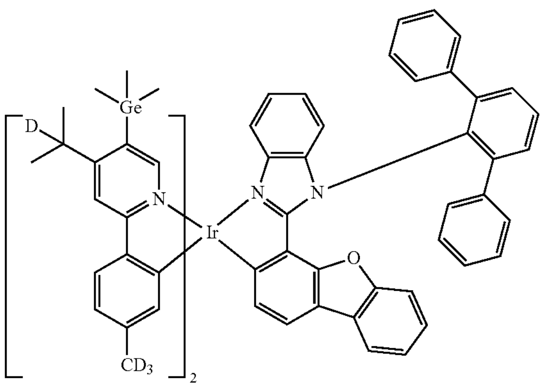
2636
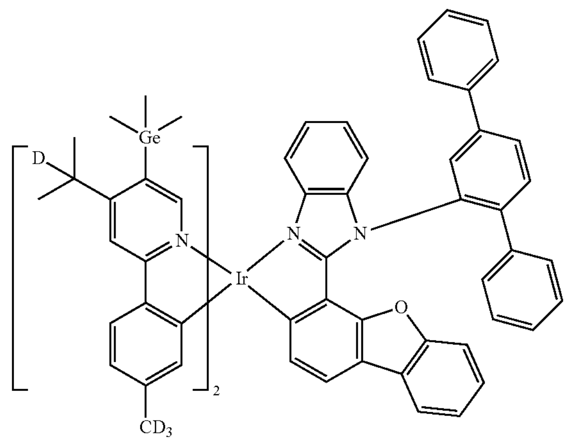
2637
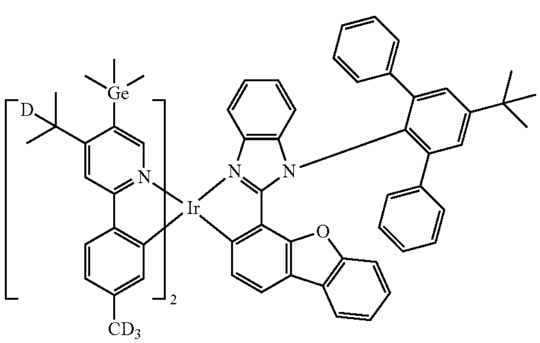
2638
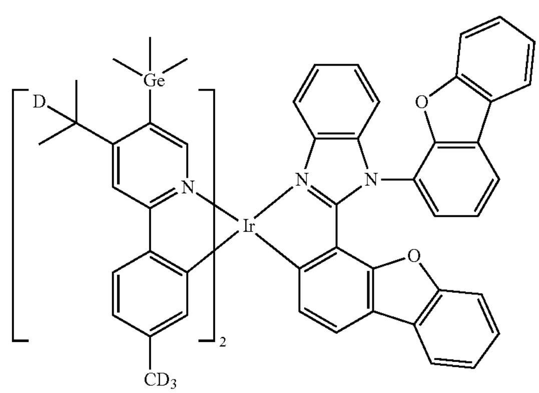

-continued
2639
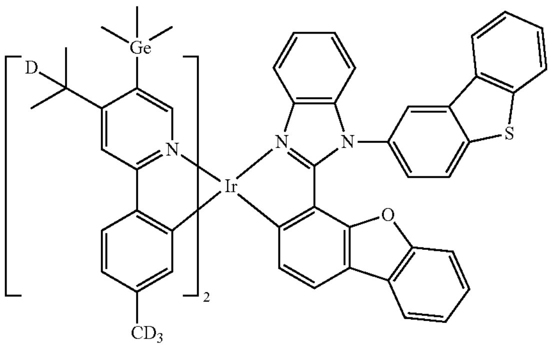
2640
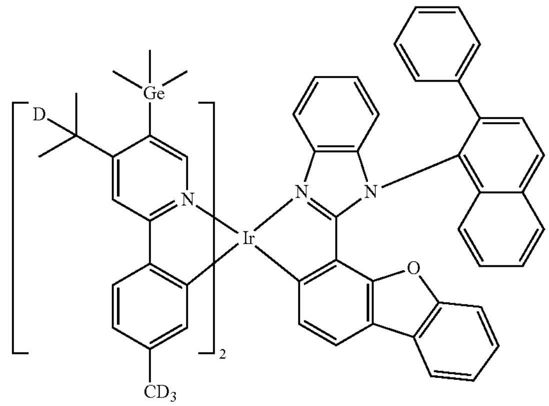
2641
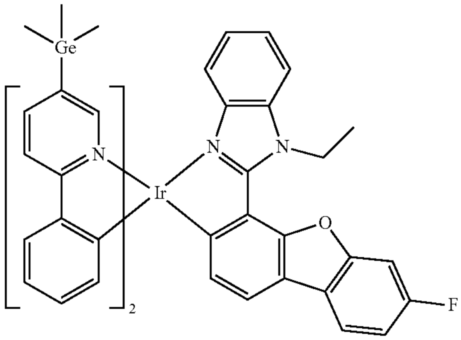
2642
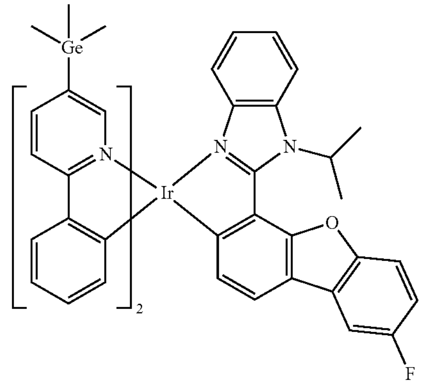
2643
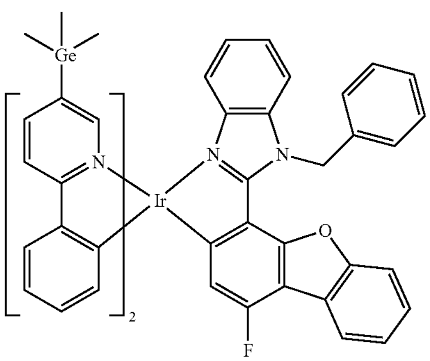
2644
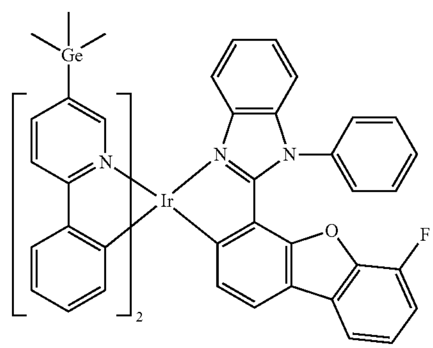
2645
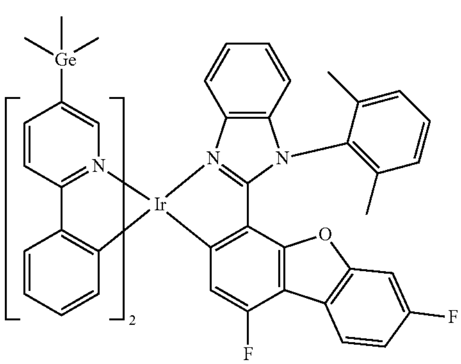
2646
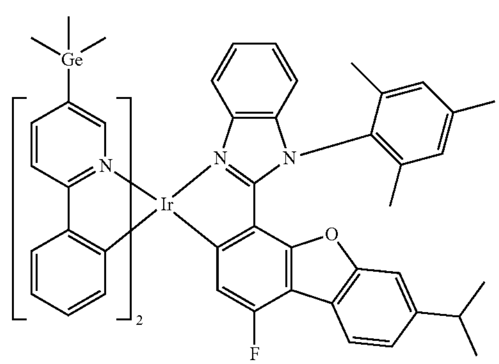

-continued
2647
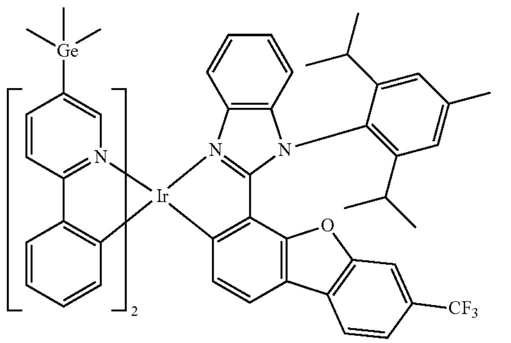
2648
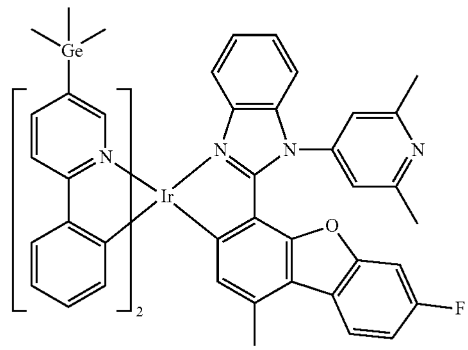
2649
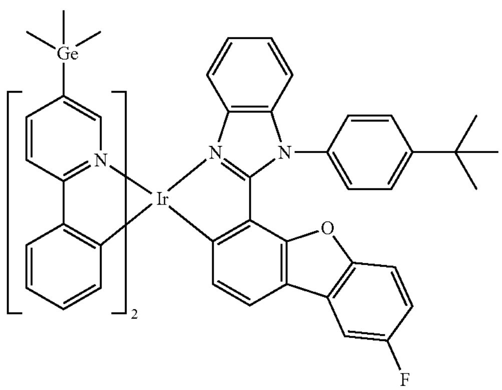
2650
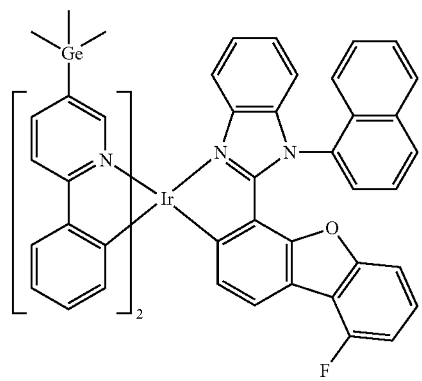
2651
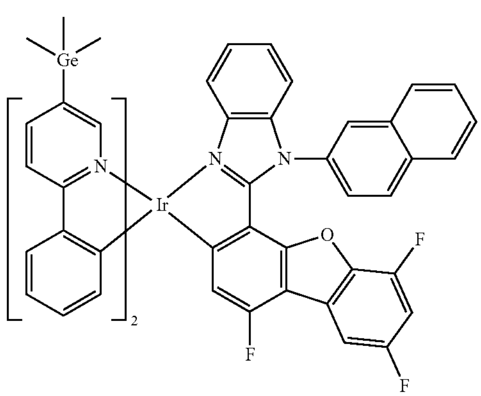
2652
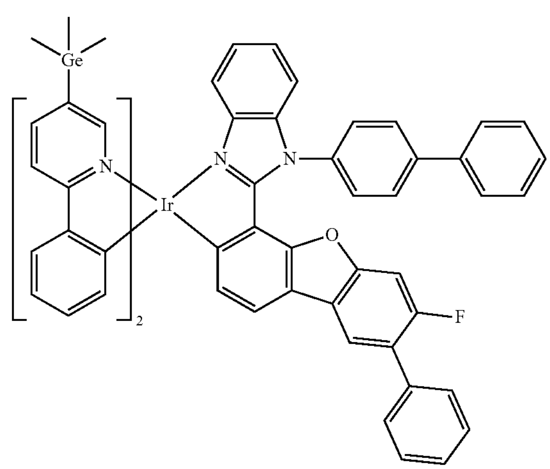

-continued
2653
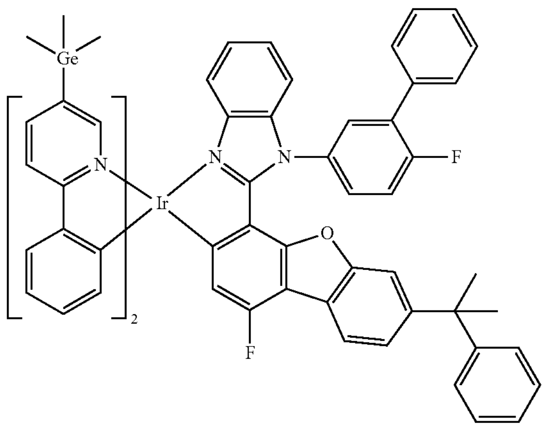
2654
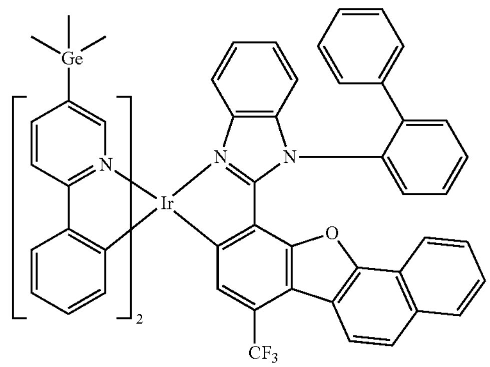
2655
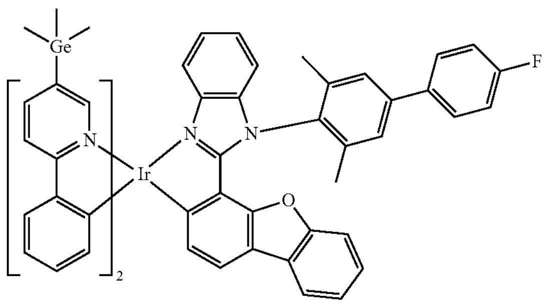
2656
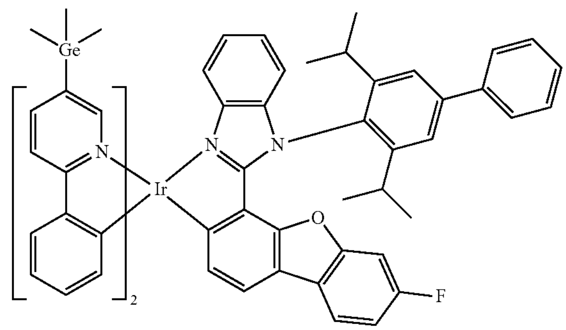
2657
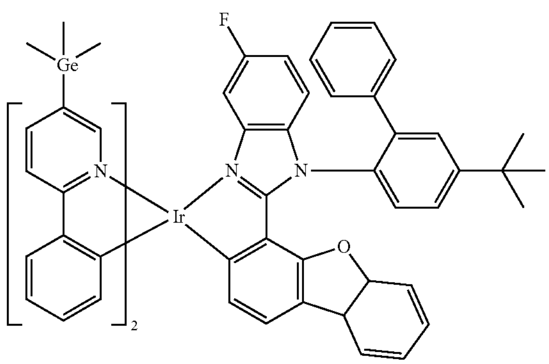
2658
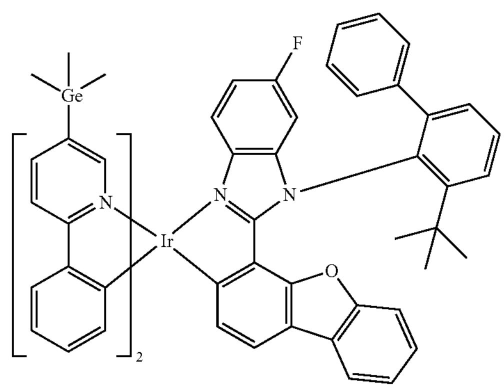
2659
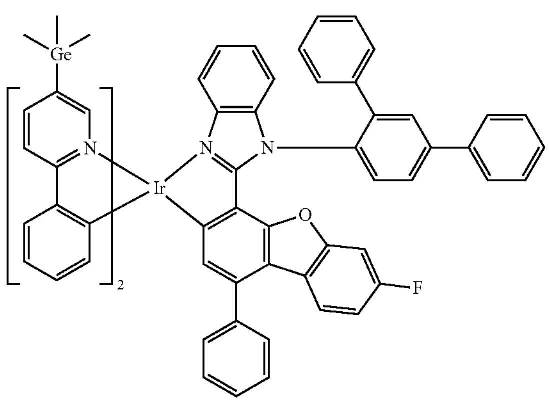
2660
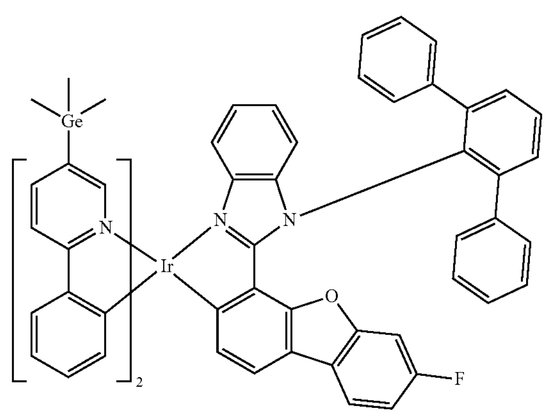

-continued
2661
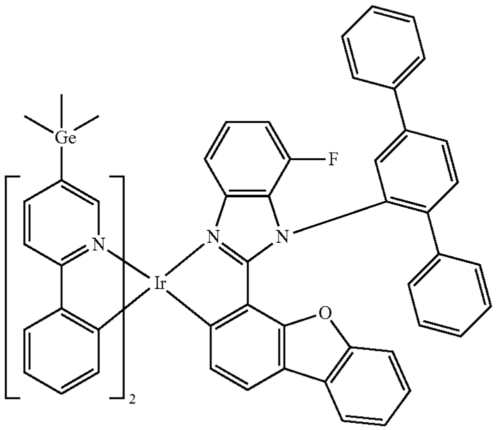
2662
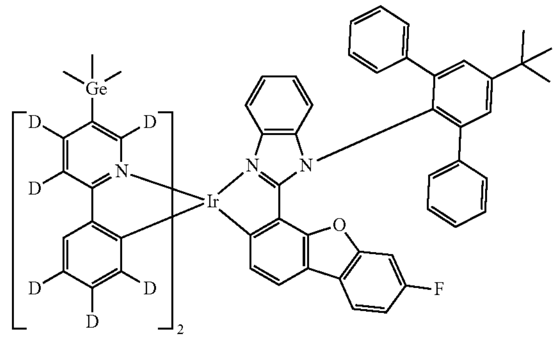
2663
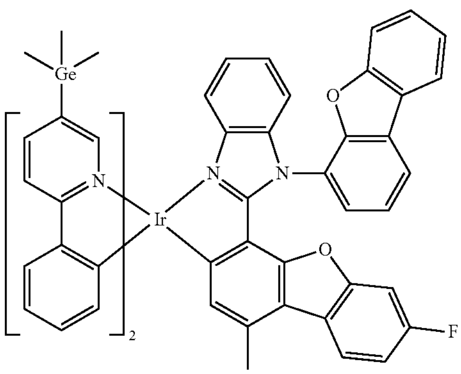
2664
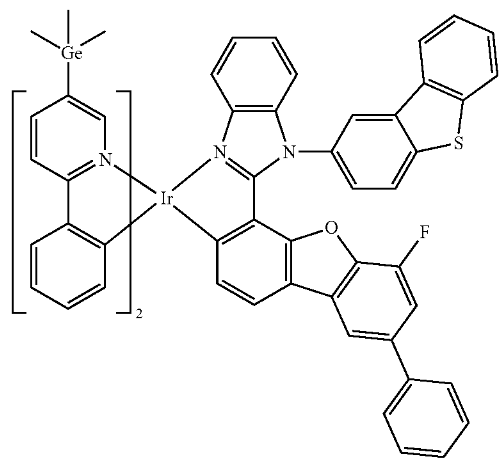
2665
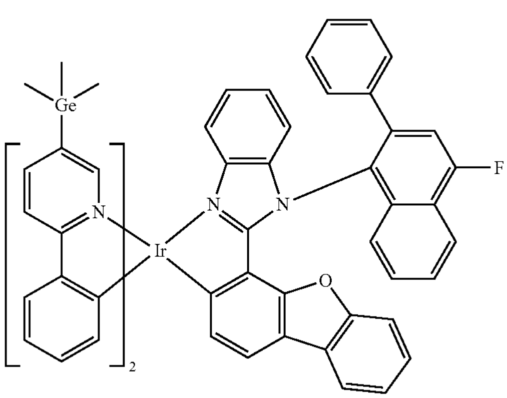
2666
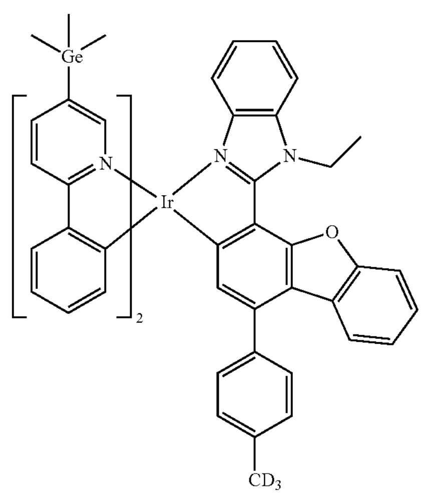

-continued
2667
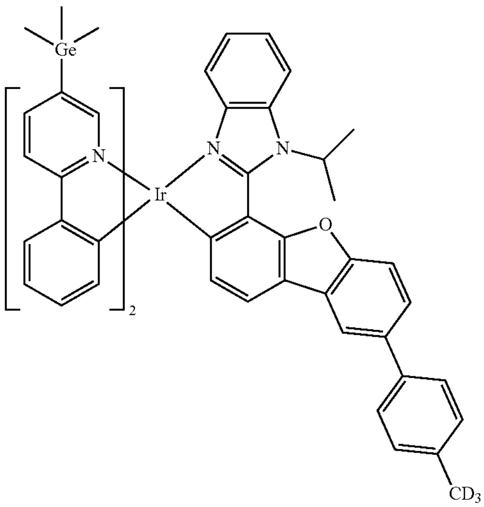
2668
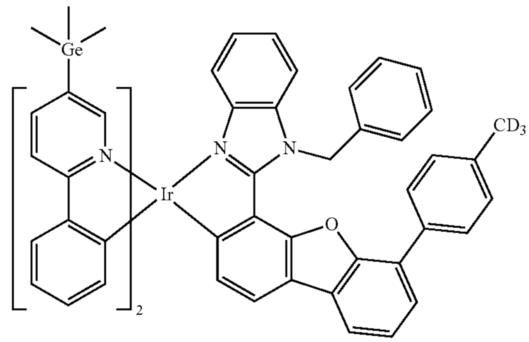
2669
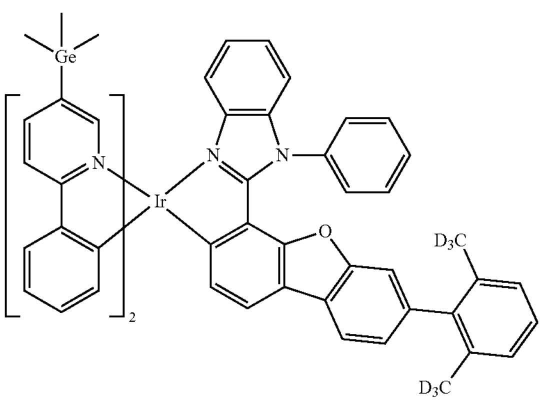
2670
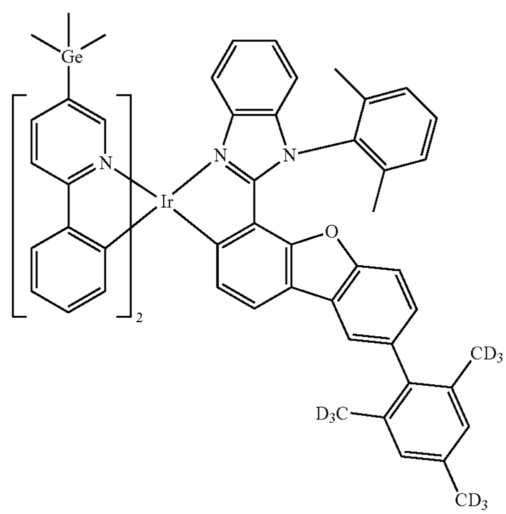
2671
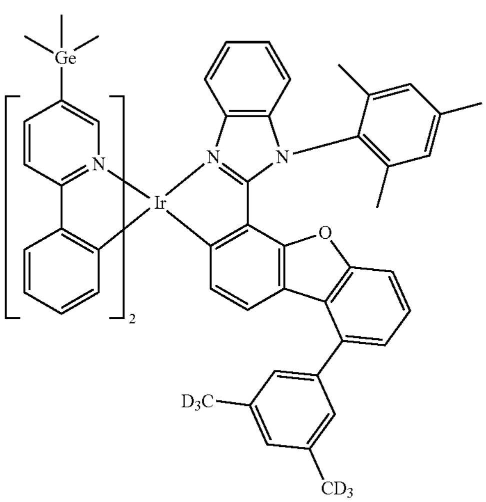
2672
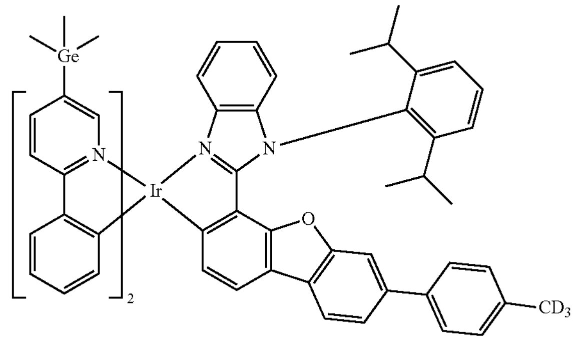

-continued
2673
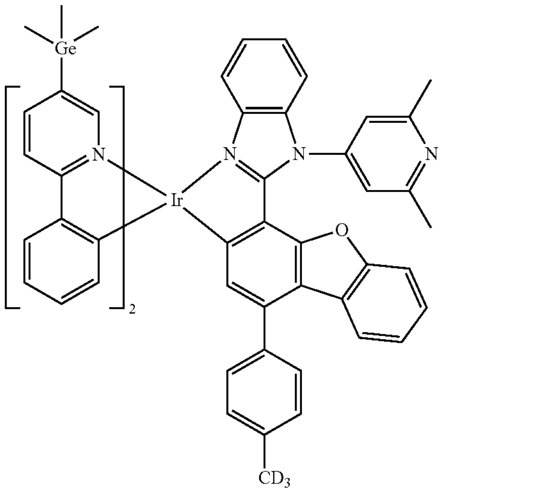
2674
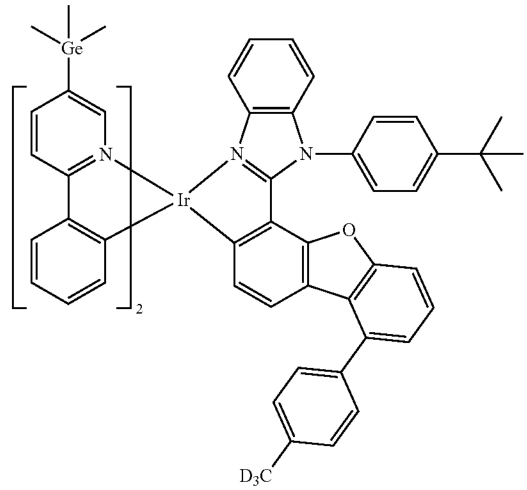
2675
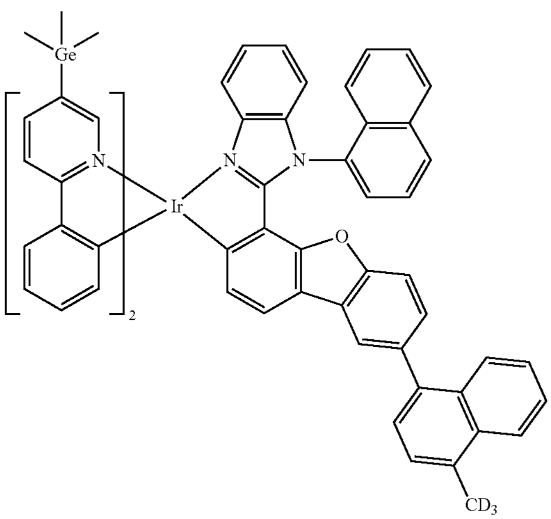
2676
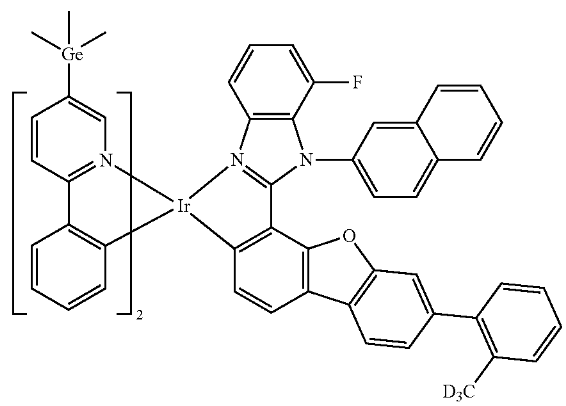
2677
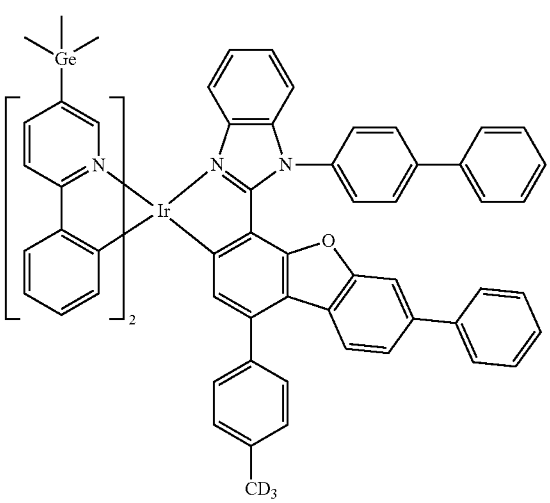
2678
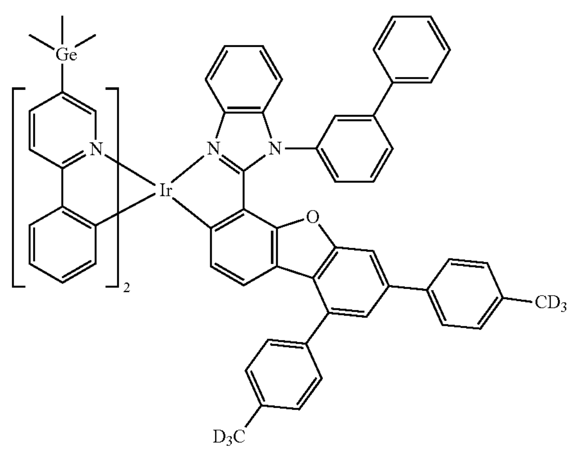

-continued
2679
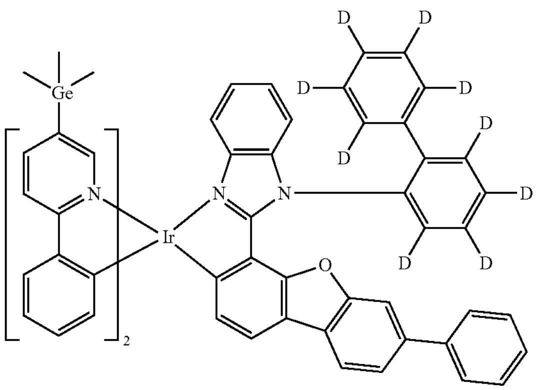
2680
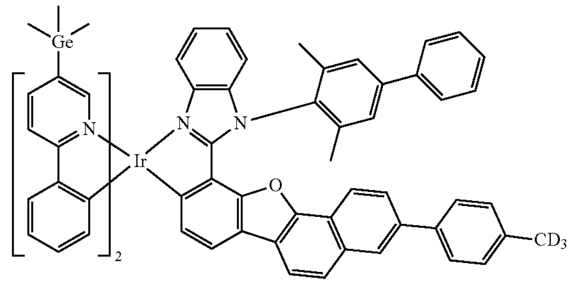
2681
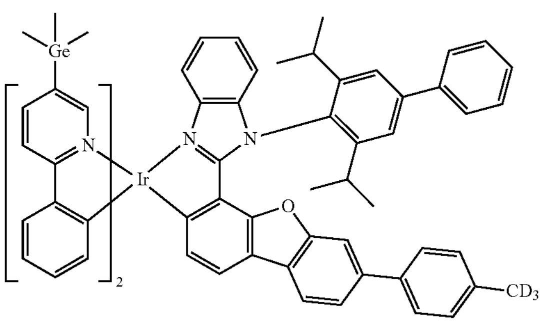
2682
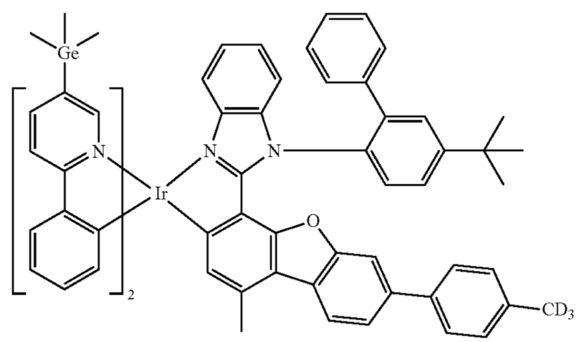
2683
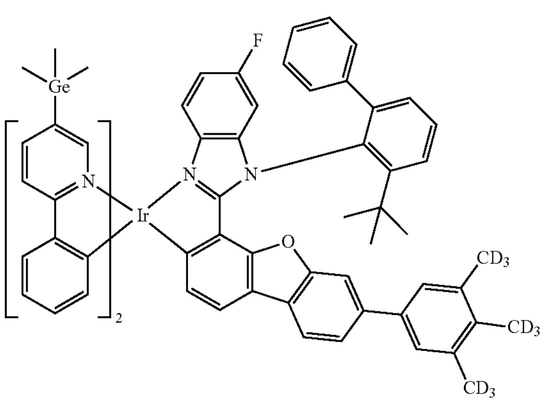
2684
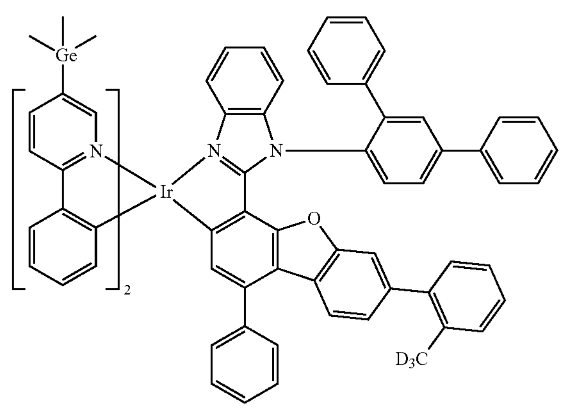

-continued
2685
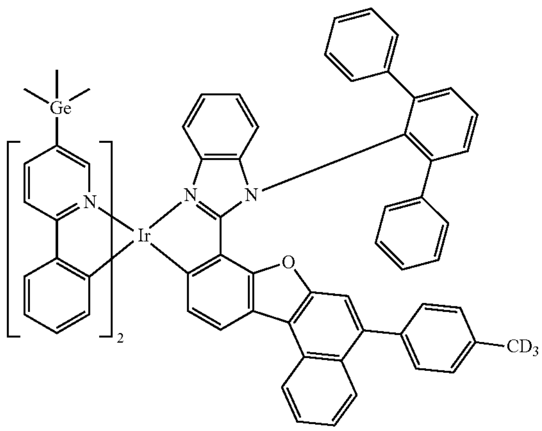
2686
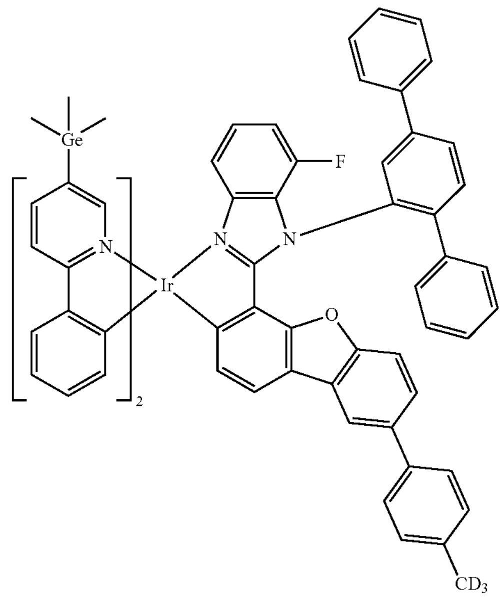
2687
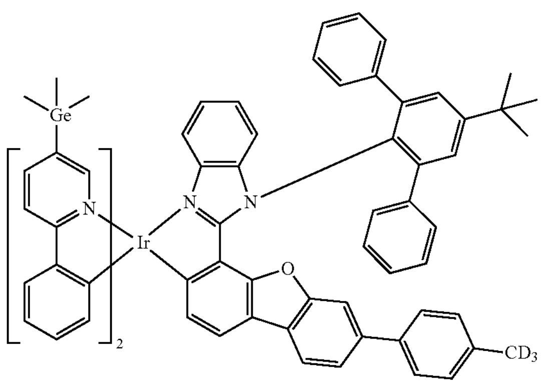
2688
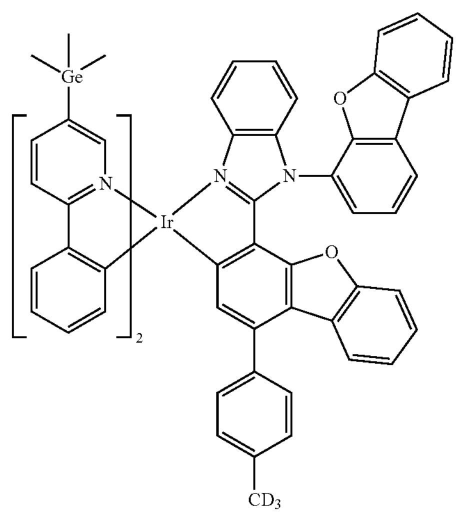
2689
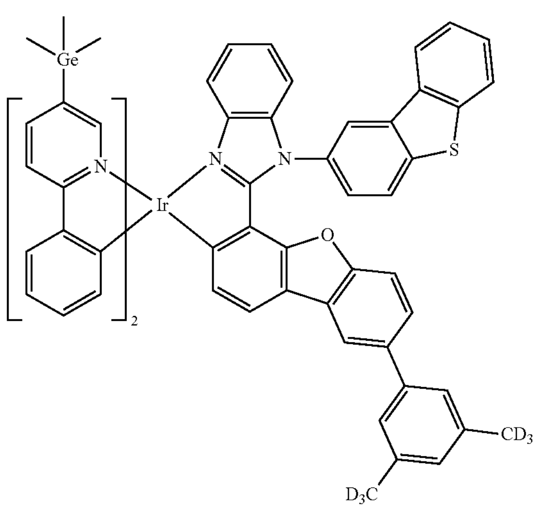
2690
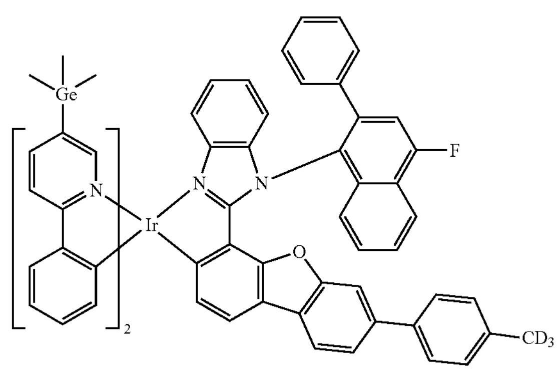

-continued
2691
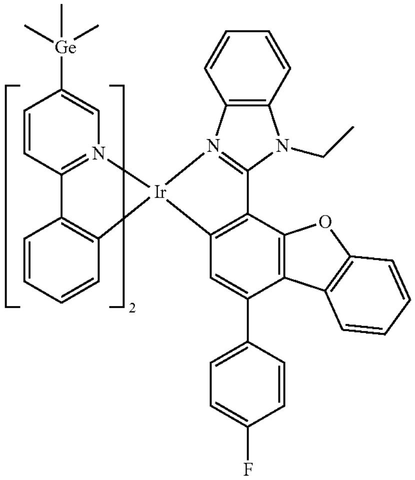
2692
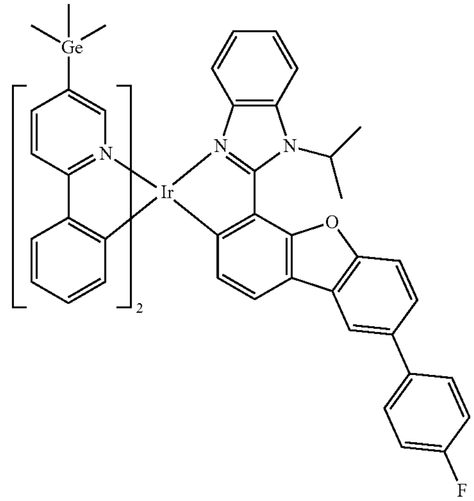
2693
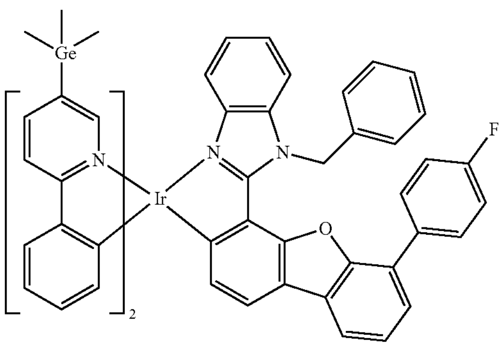
2694
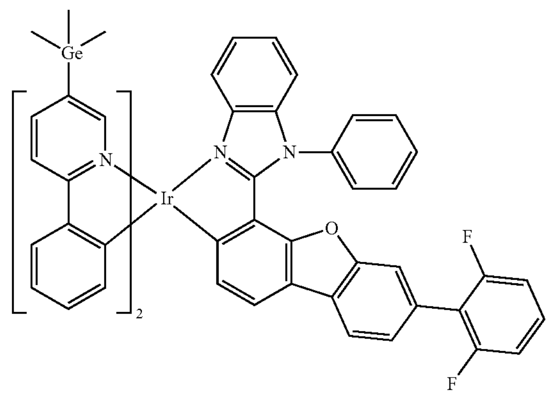
2695
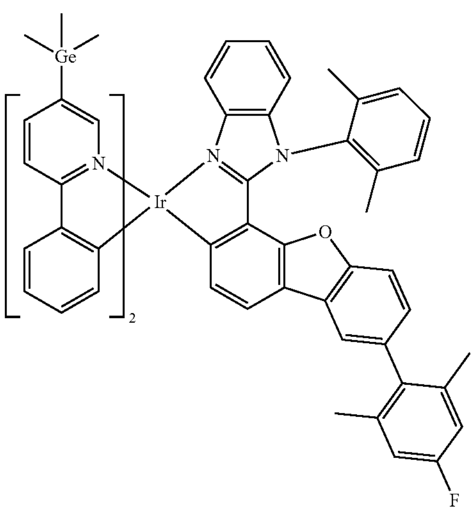
2696
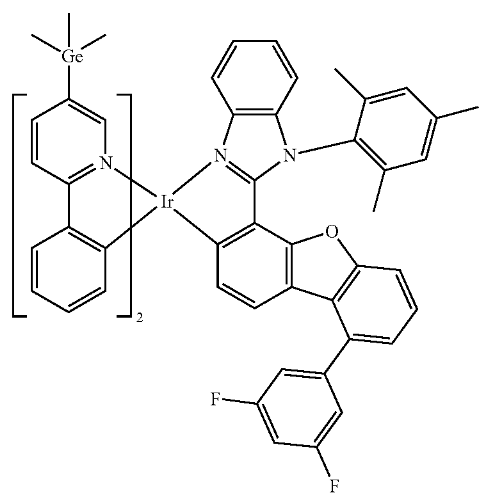

-continued
2697
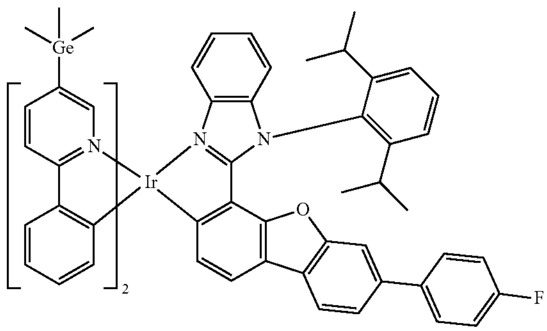
2698
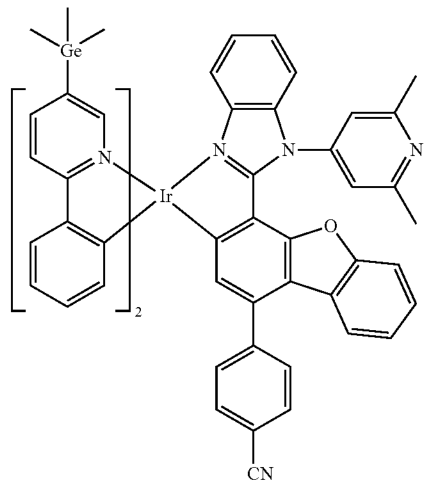
2699
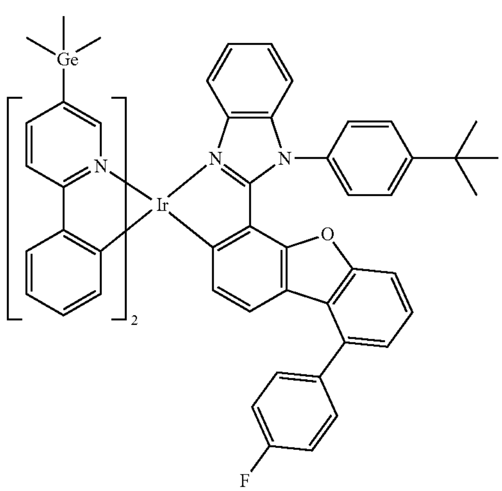
2700
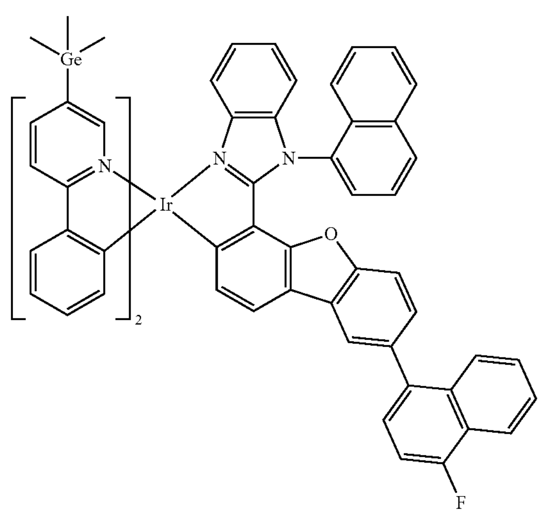

-continued
2701
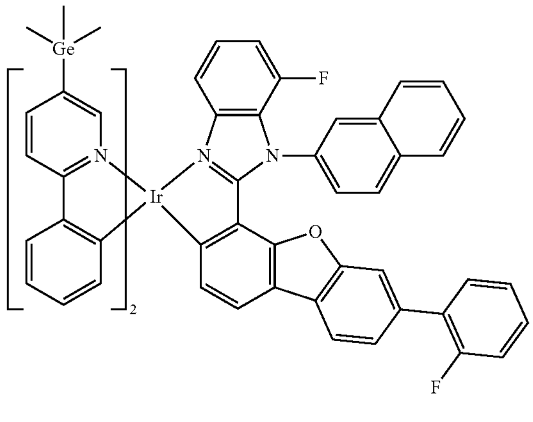
2702
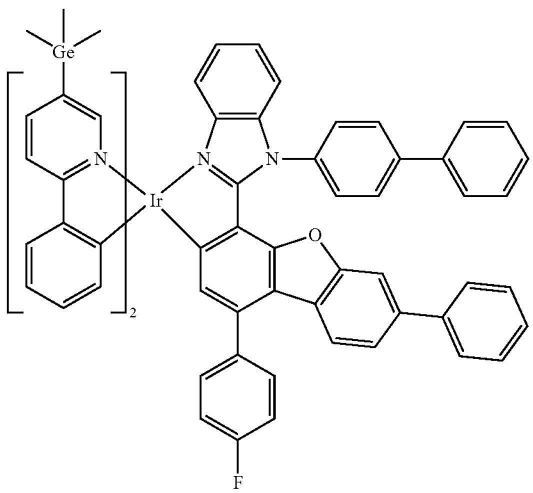
2703
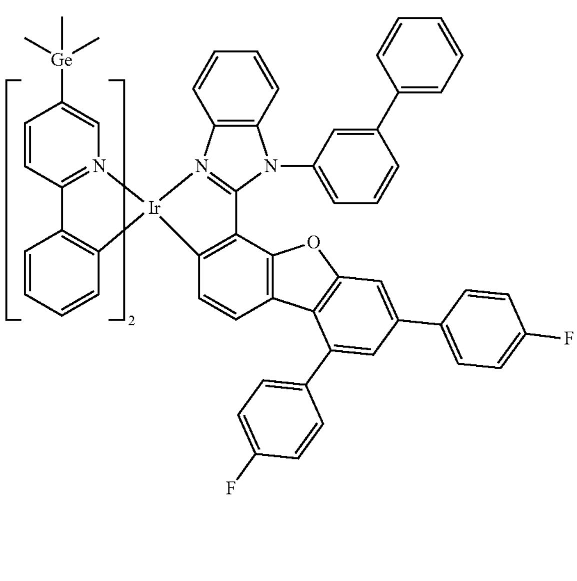
2704
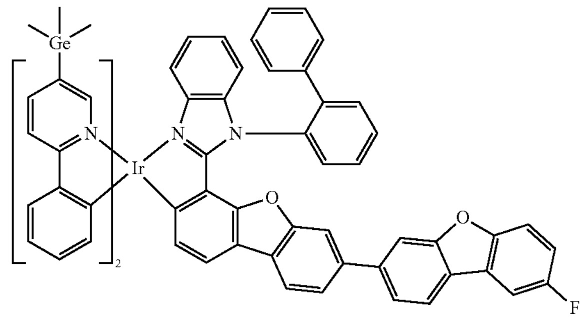
2705
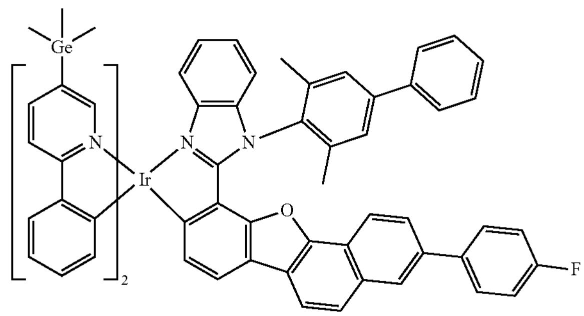
2706
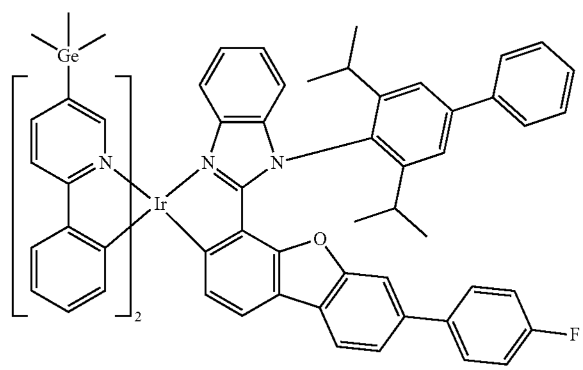
2707
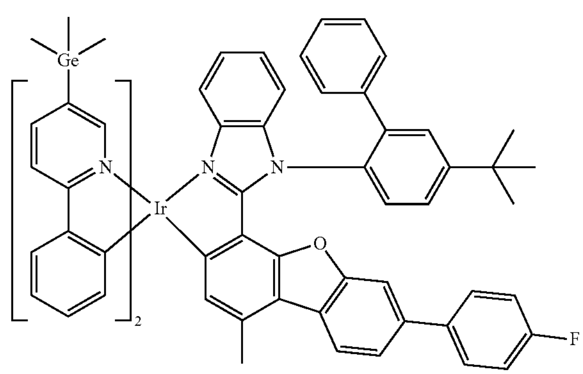

-continued
2708
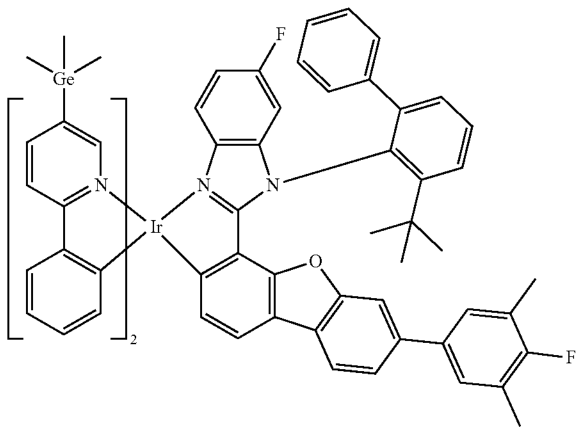
2709
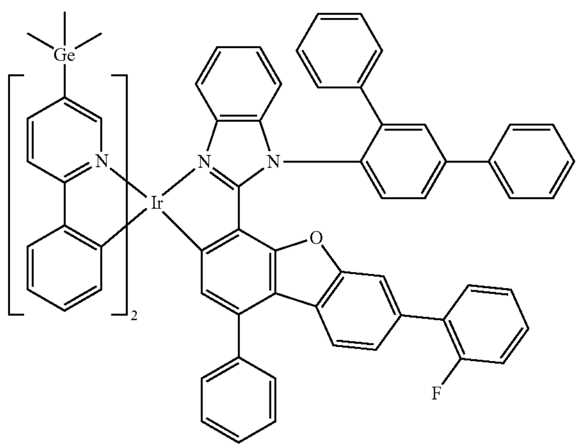
2710
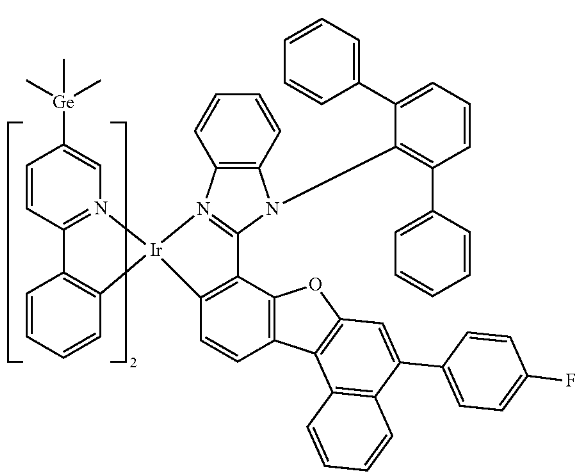
-continued
2711
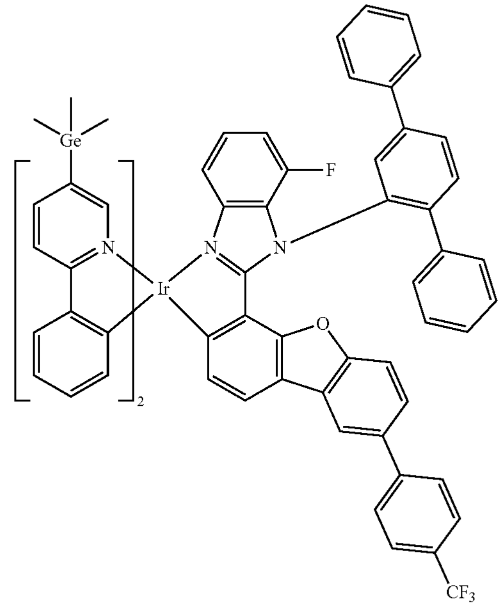
2712
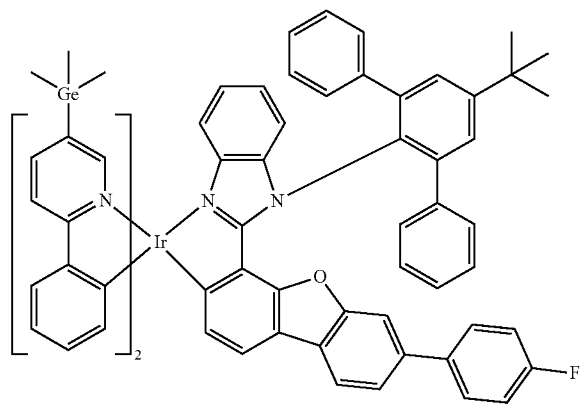
2713
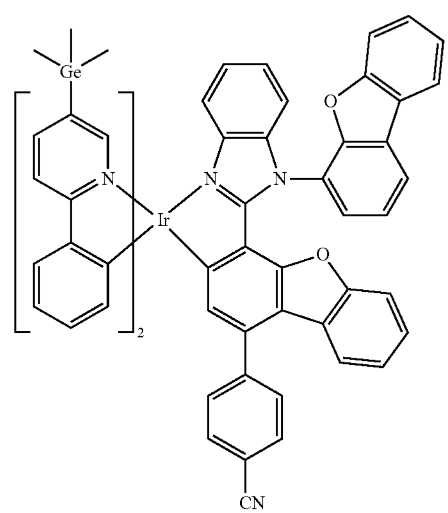

2714
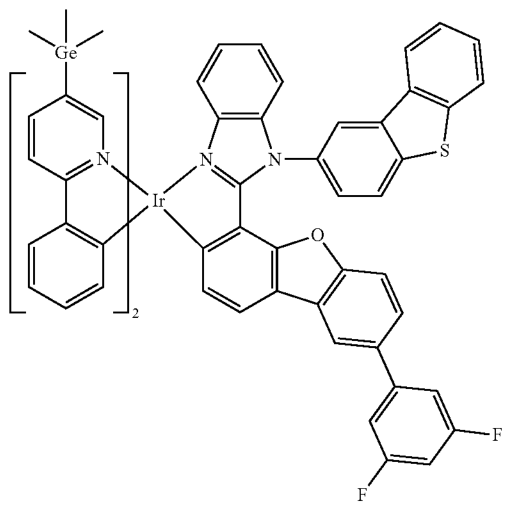
2715
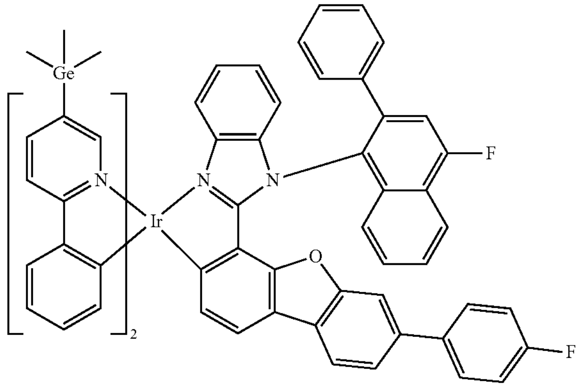
2716
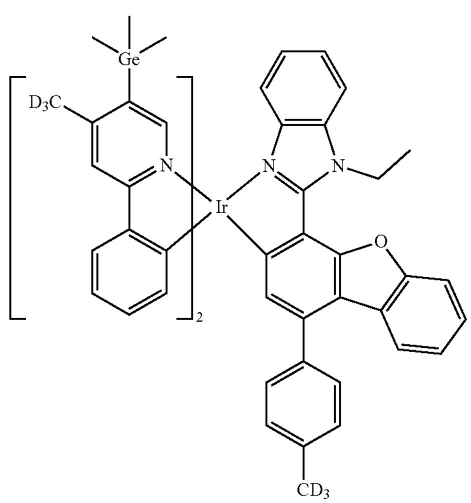
2717
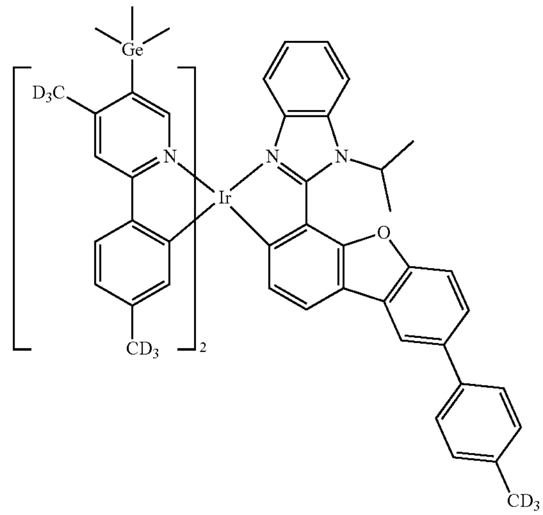
2718
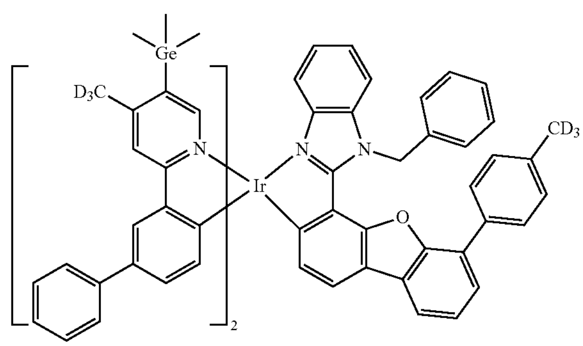
2719
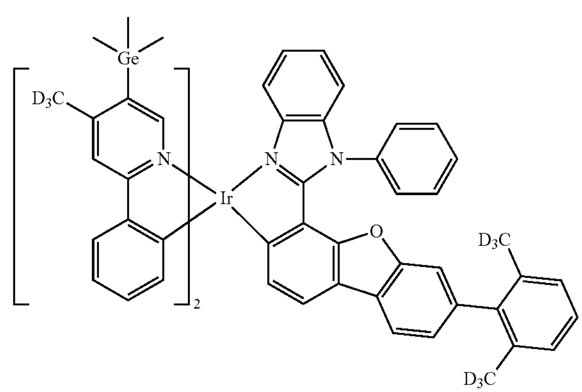

-continued
2720
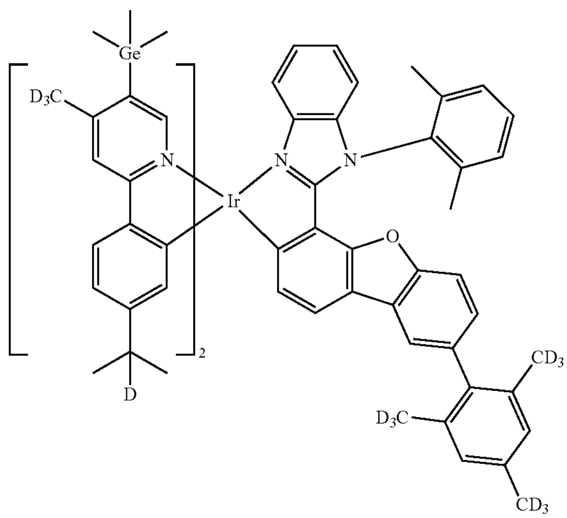
2721
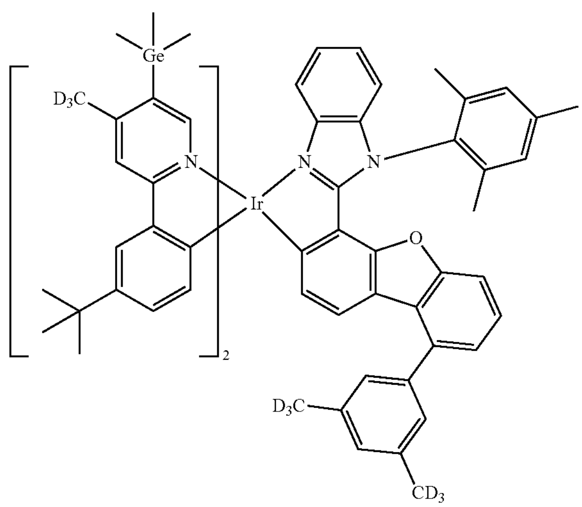
2722
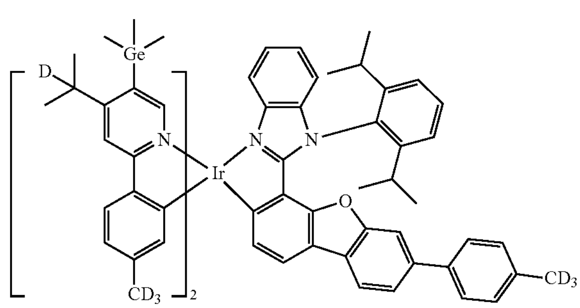
-continued
2723
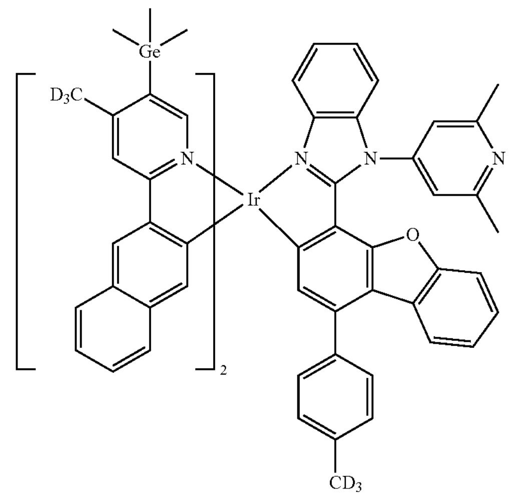
2724
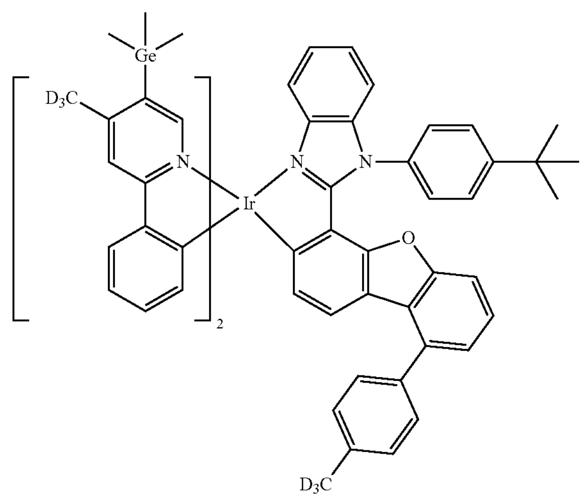
2725
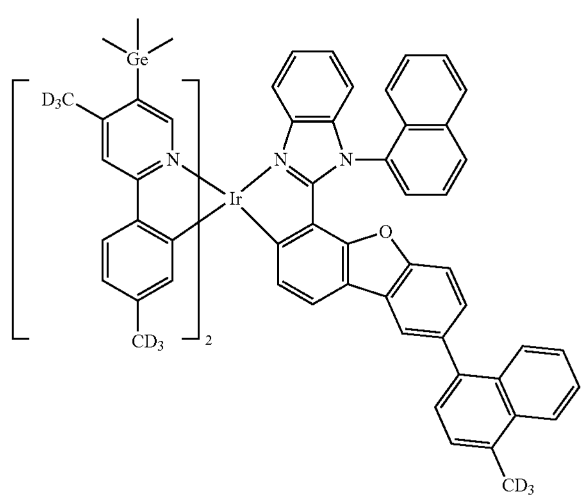

-continued
2726
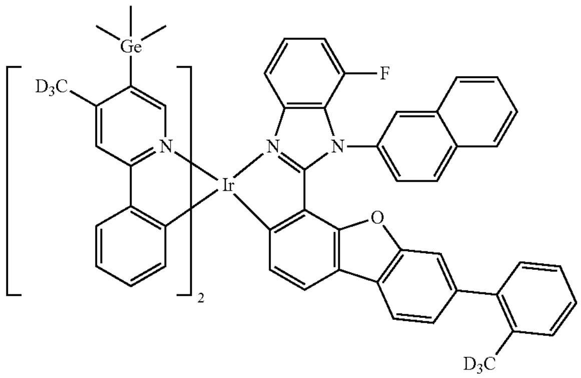
2727
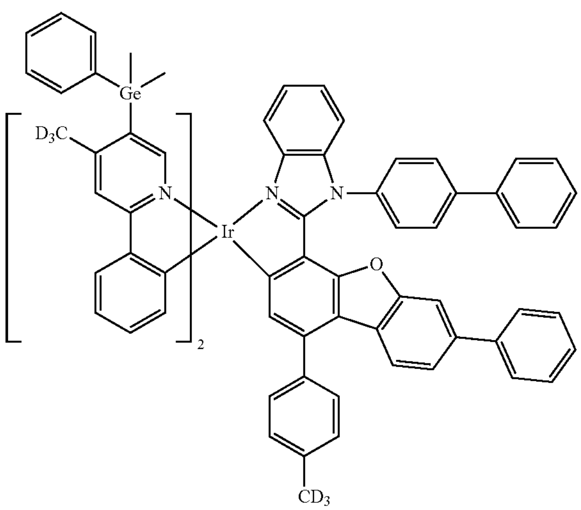
2728
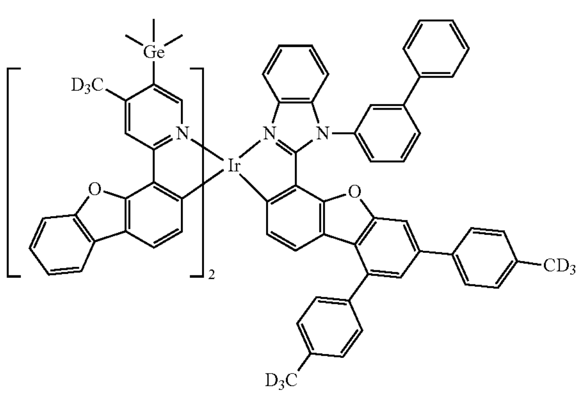
2729
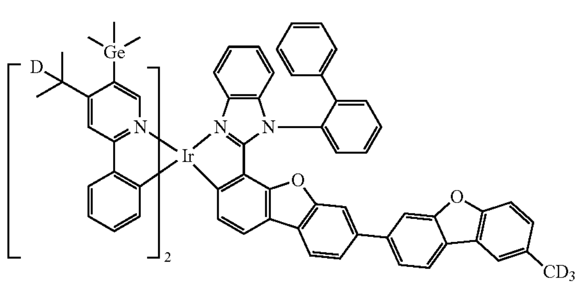
-continued
2730
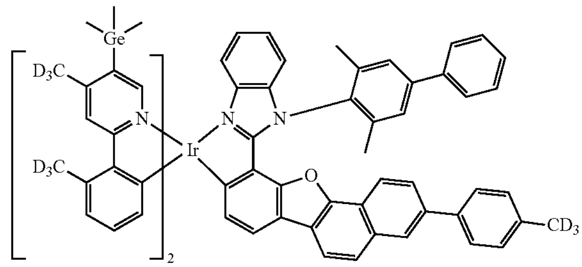
2731
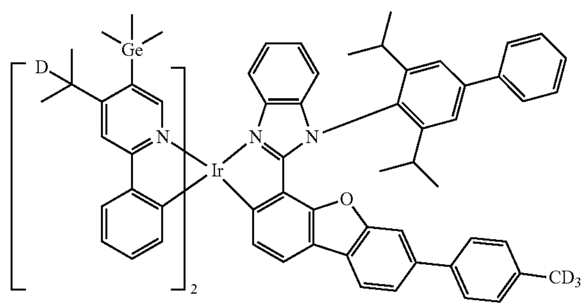
2732
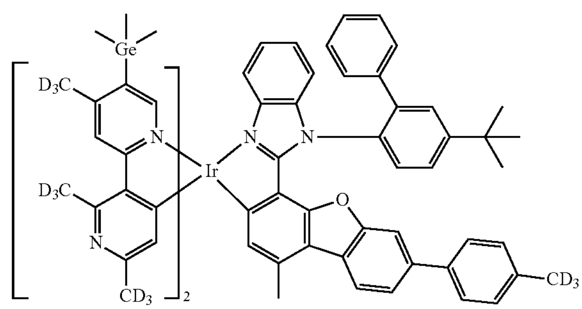
2733
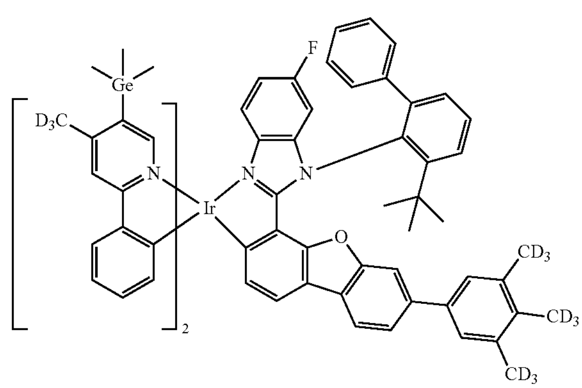

2734
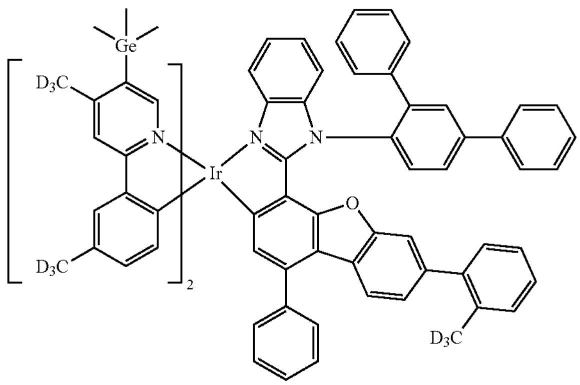
2735
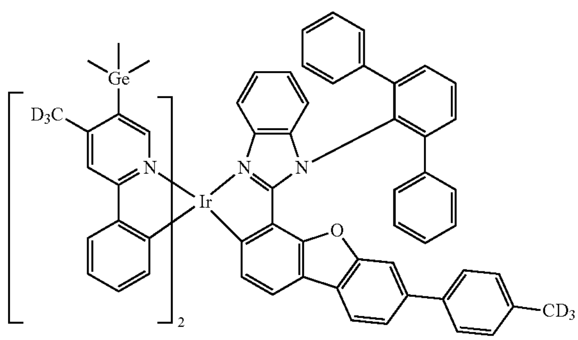
2736
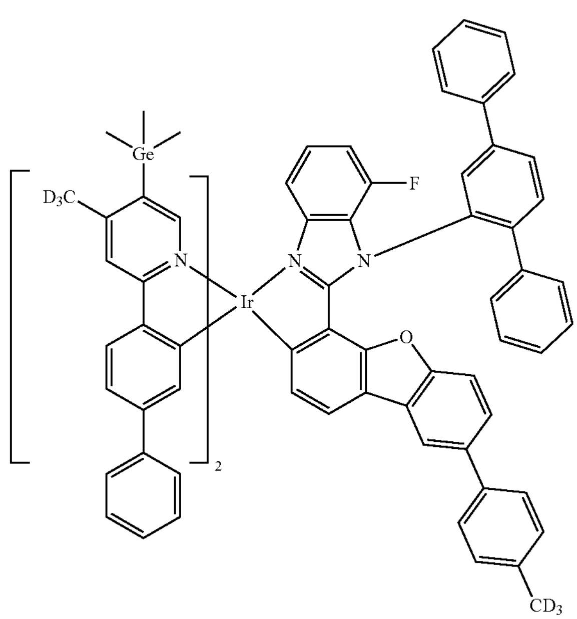
2737
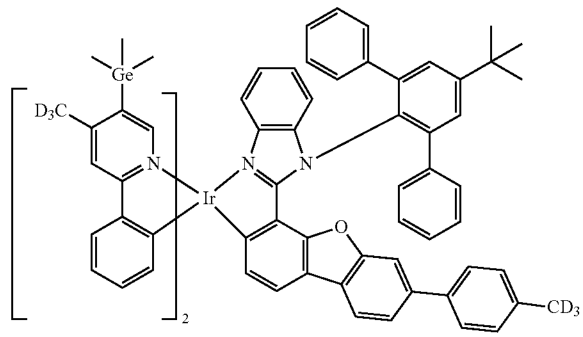
2738
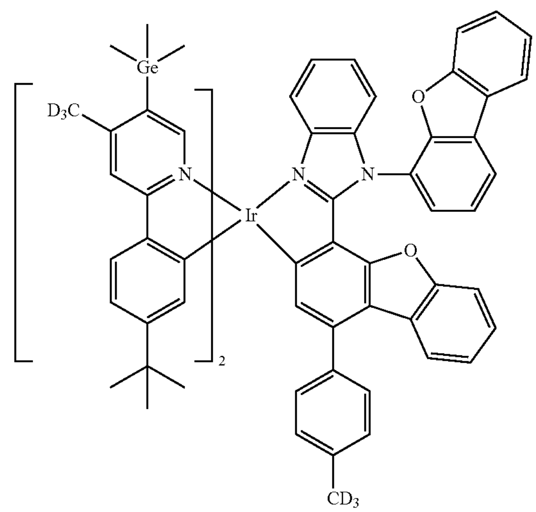
2739
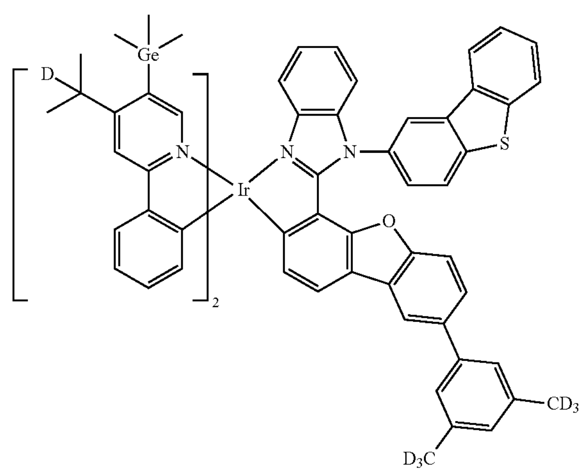

-continued
2740
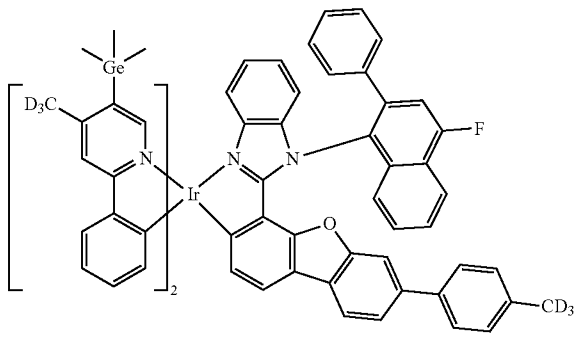
2741
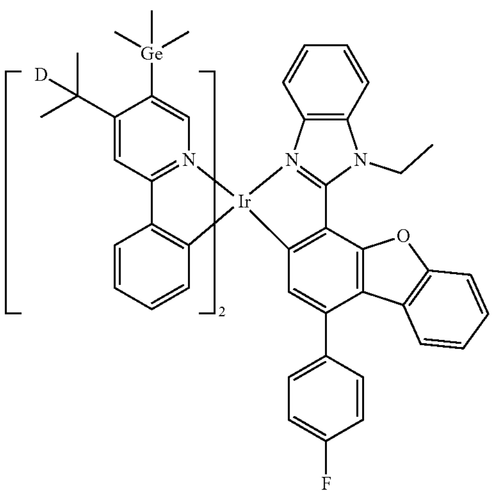
2742
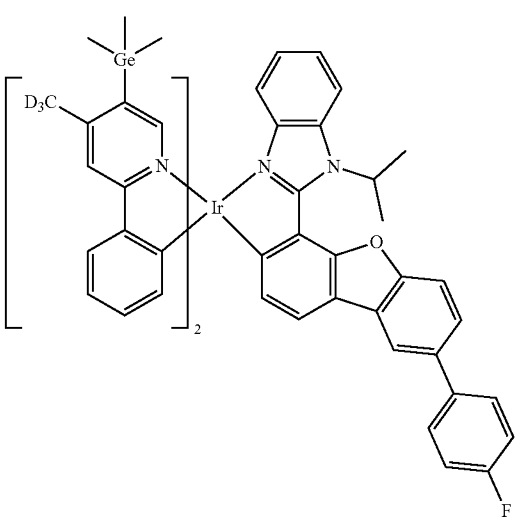
-continued
2743
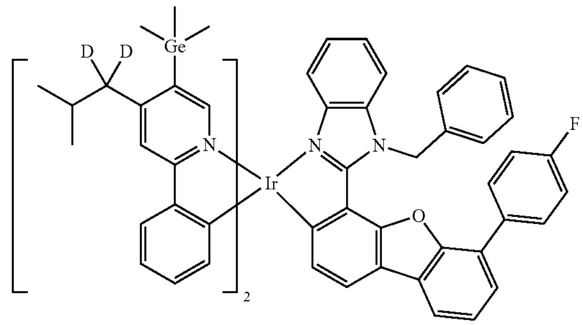
2744
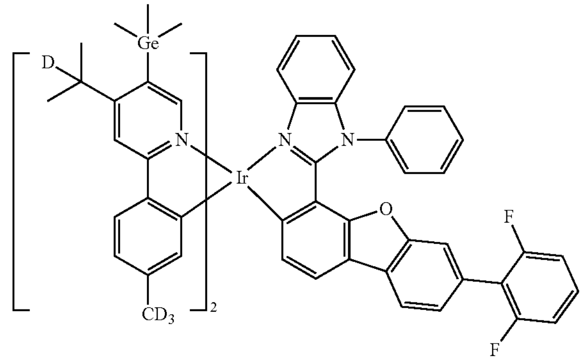
2745
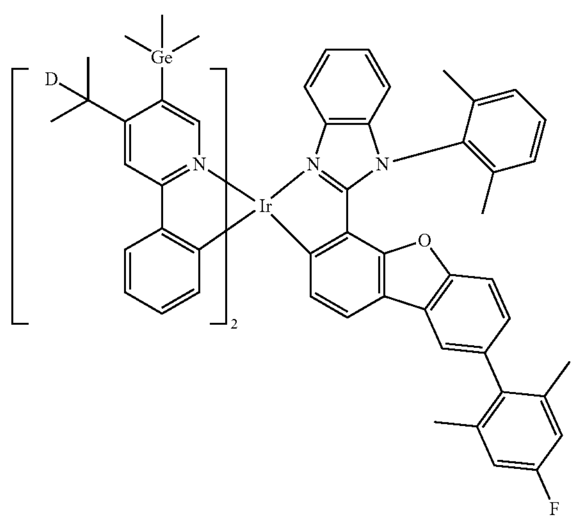

2746
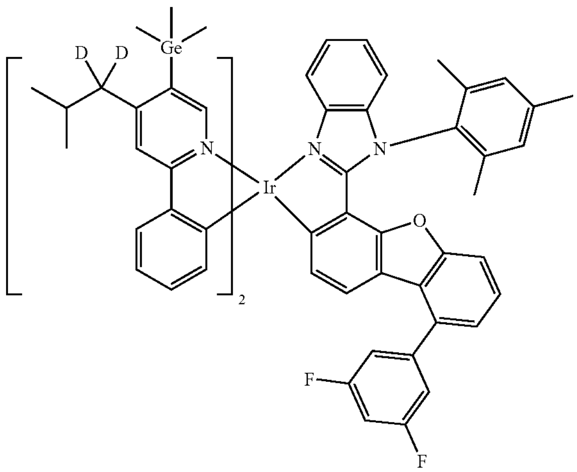
2747
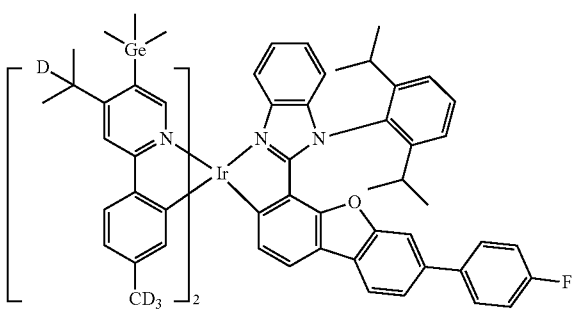
2748
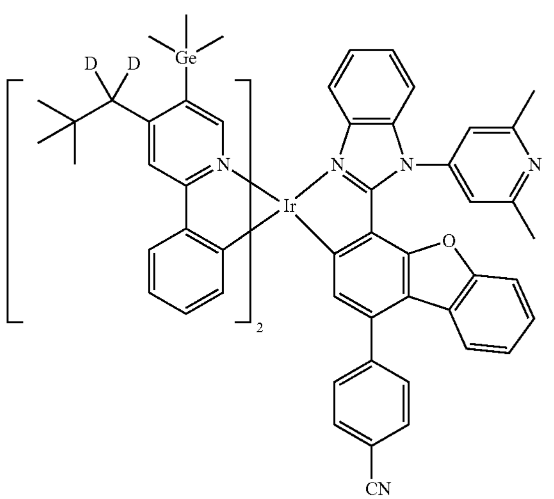
2749
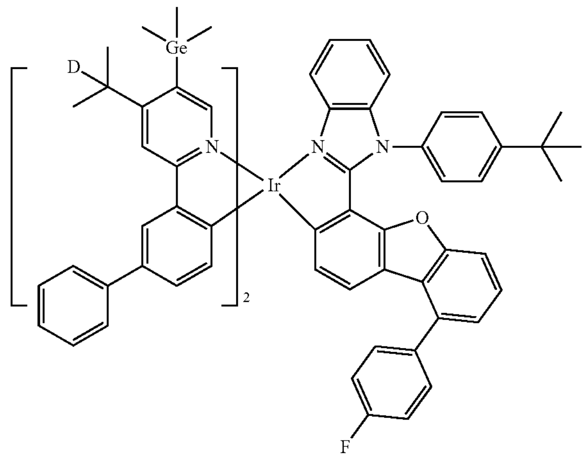
2750
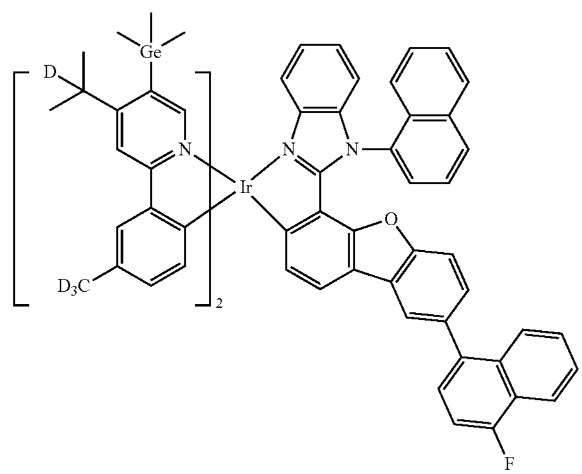
2751
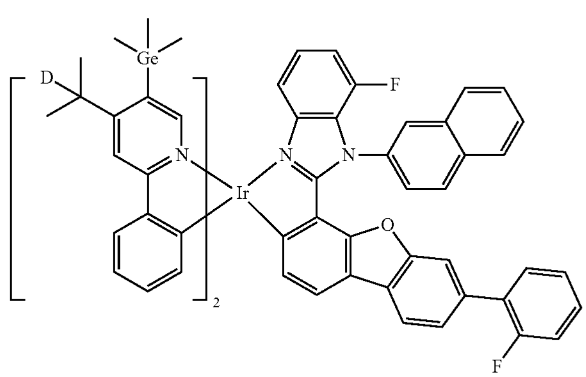

-continued
2752
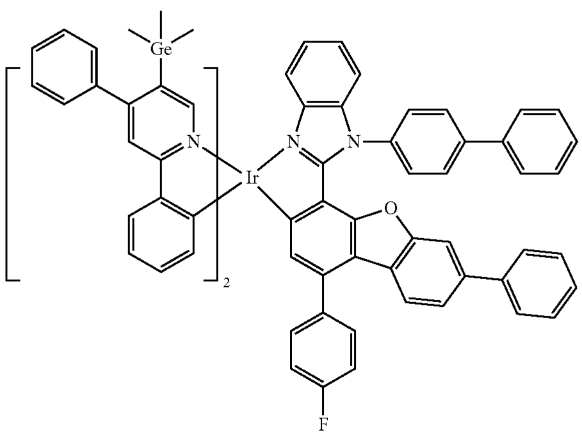
2753
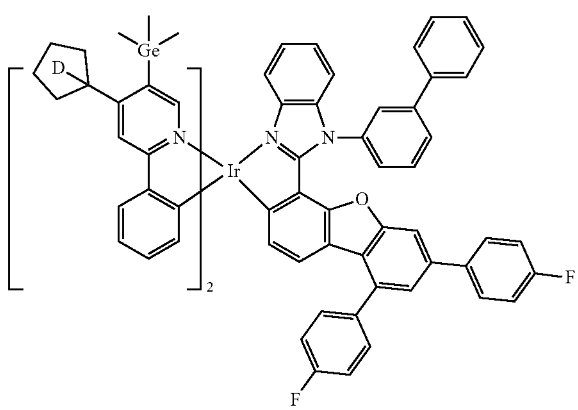
2754
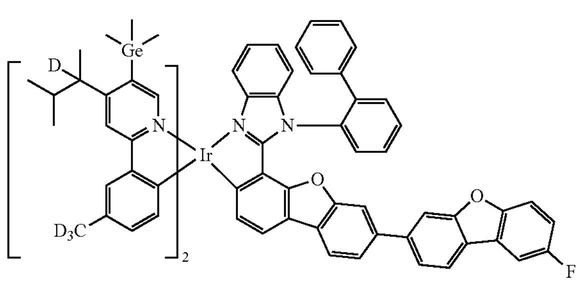
2755
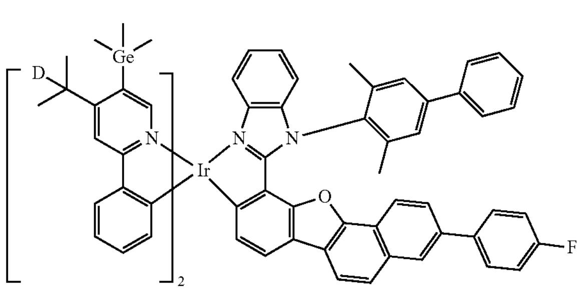
-continued
2756
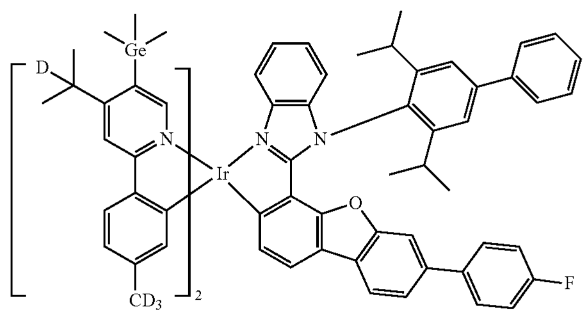
2757
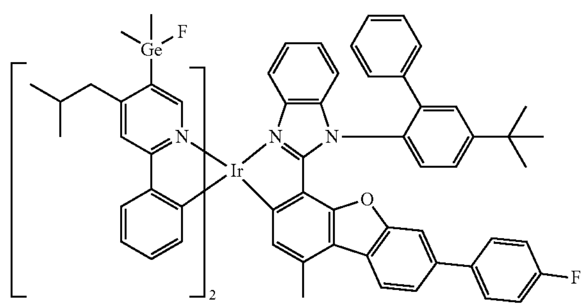
2758
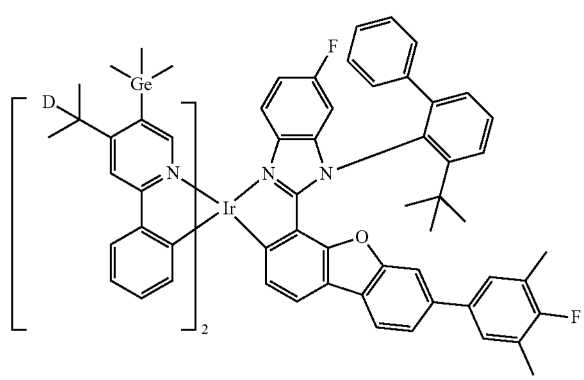
2759
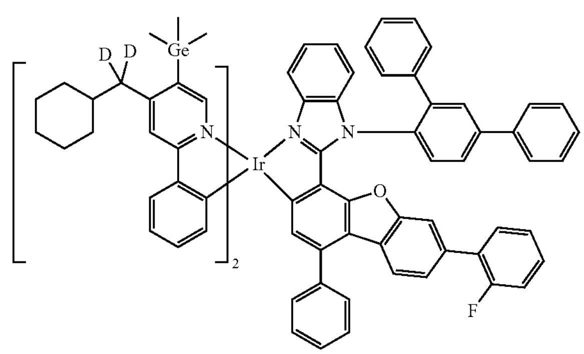

2760
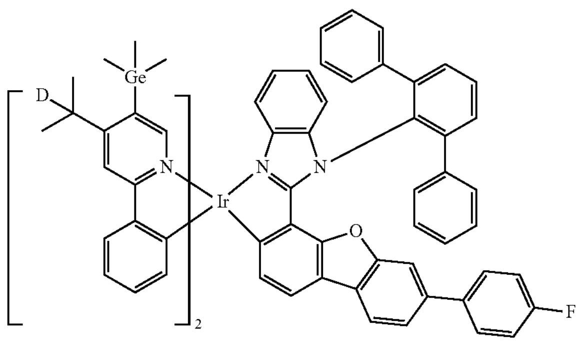
2761
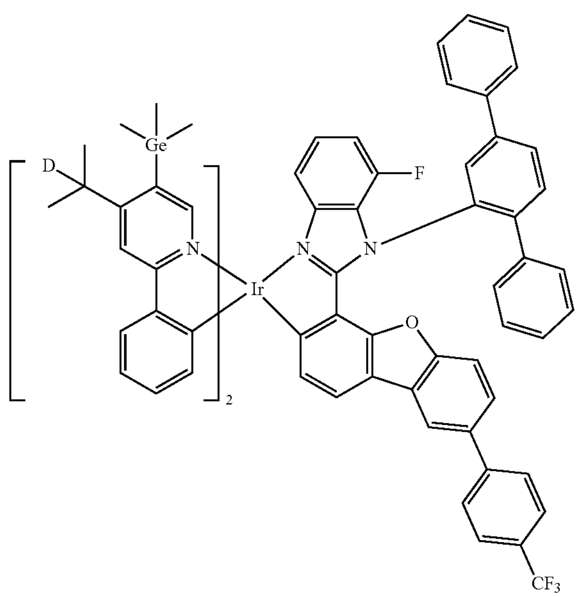
2762
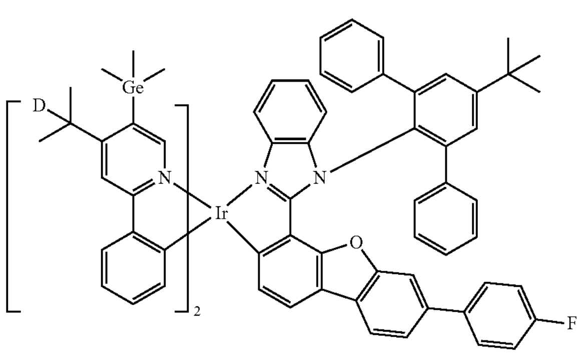
2763
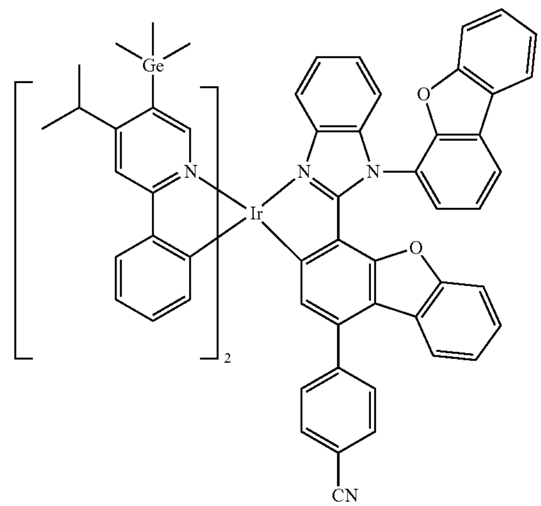
2764
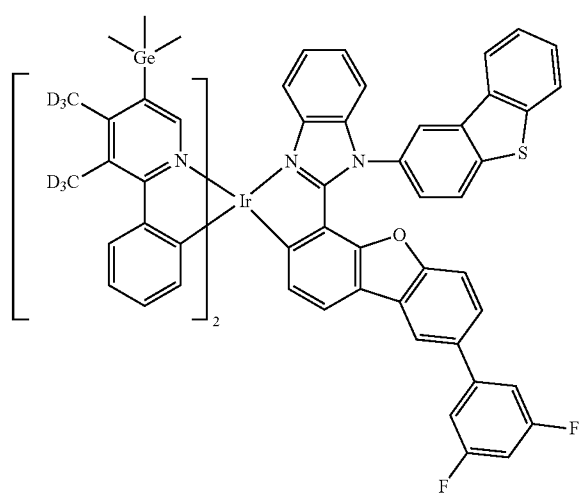
2765
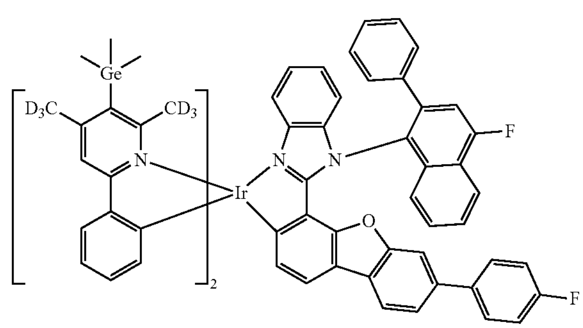

-continued
2766
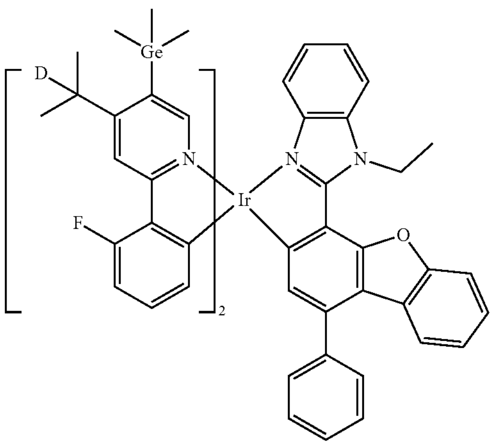
2767
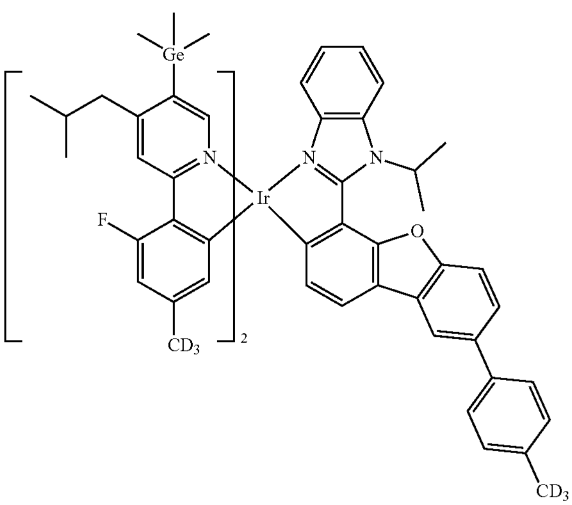
2768
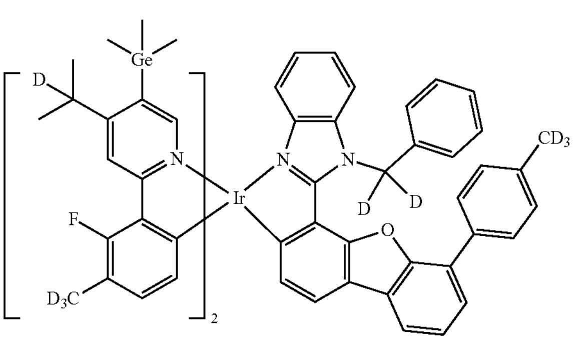
-continued
2769
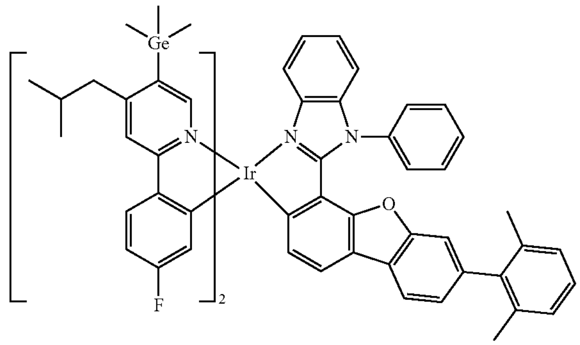
2770
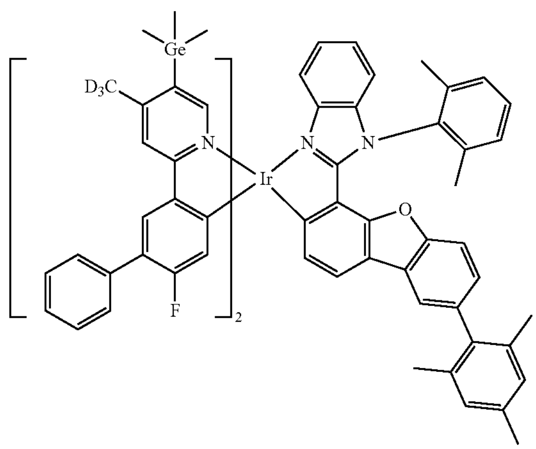
2771
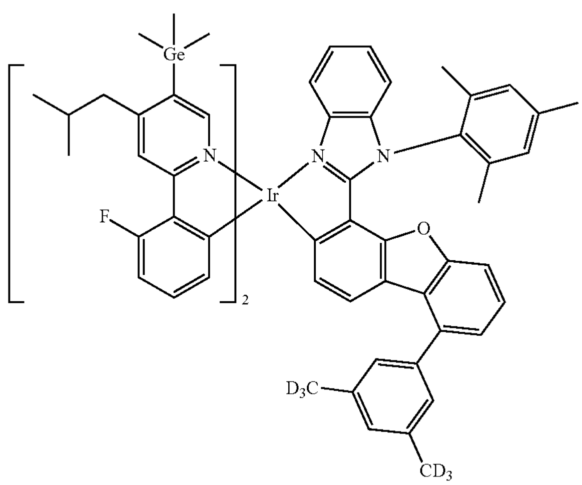
2772
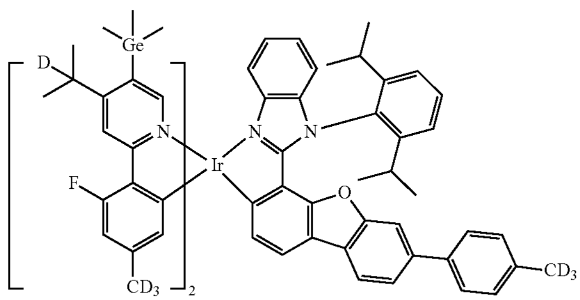

-continued
2773
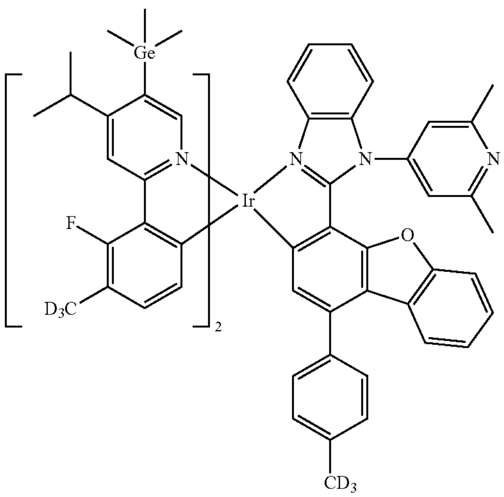
2774
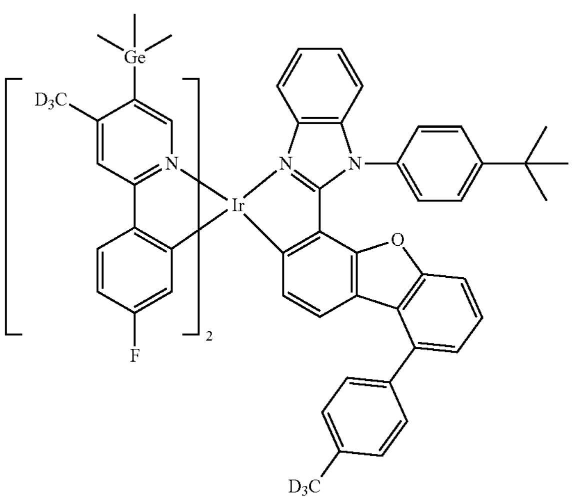
2775
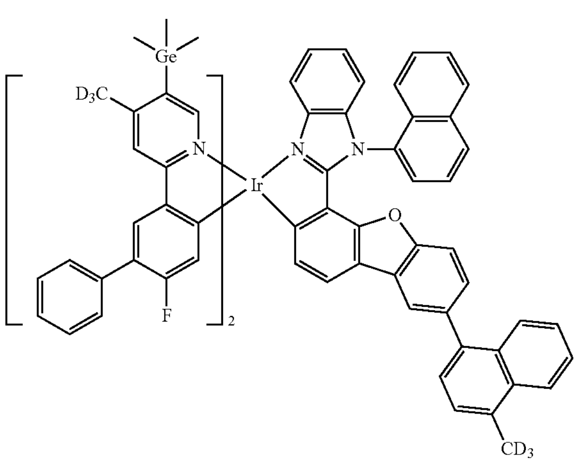
-continued
2776
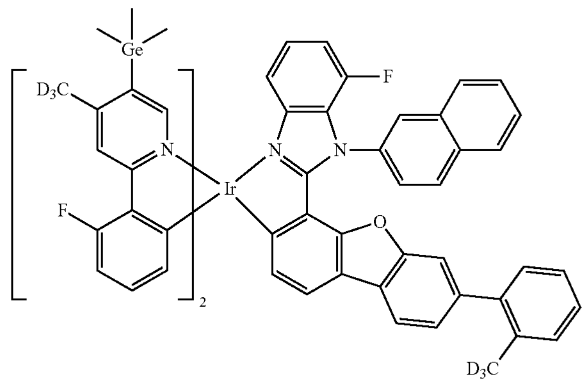
2777
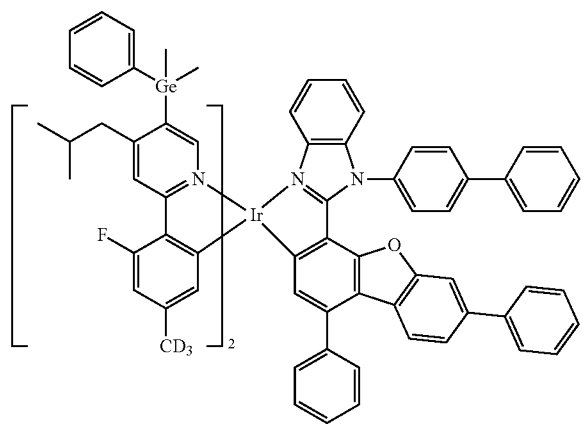
2778
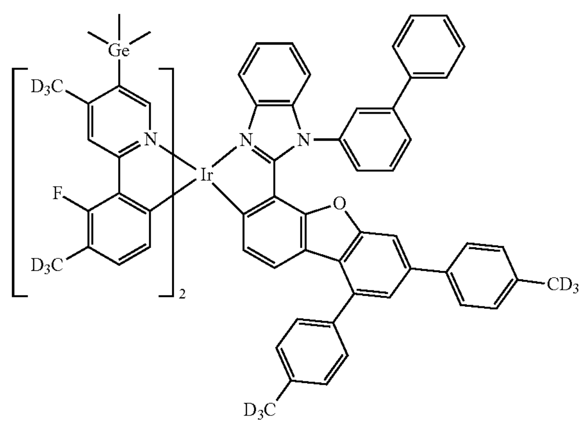
2779
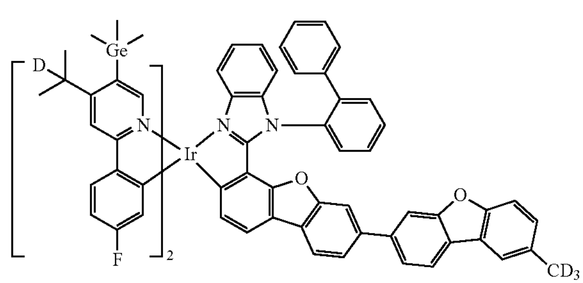

2780
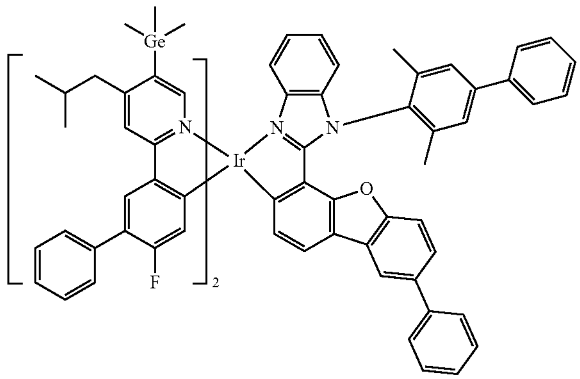
2781
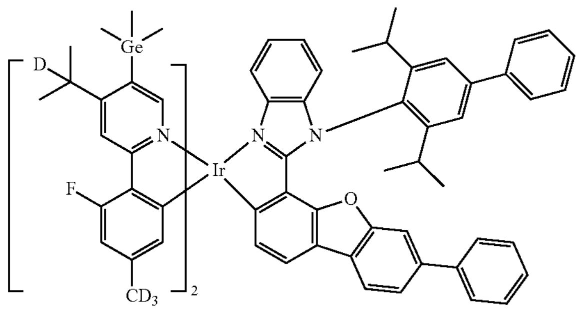
2782
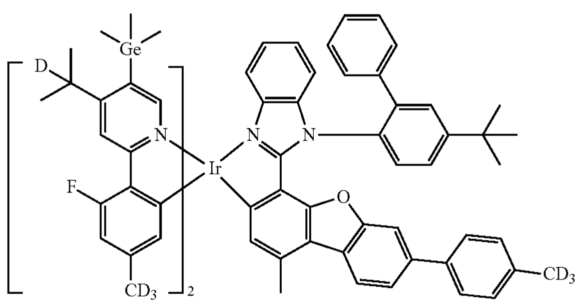
2783
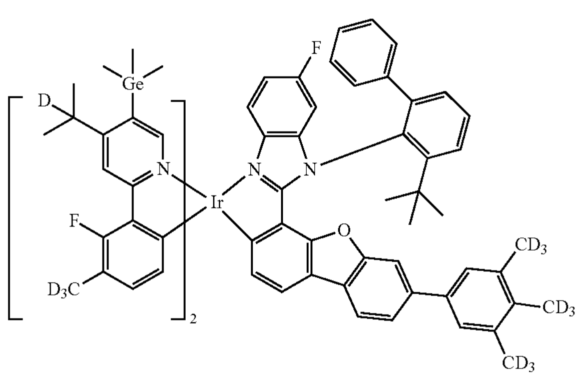
2784
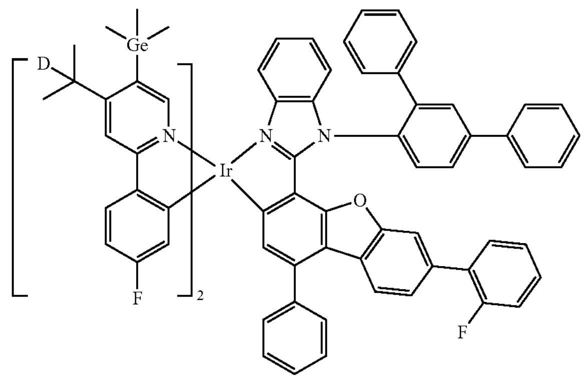
2785
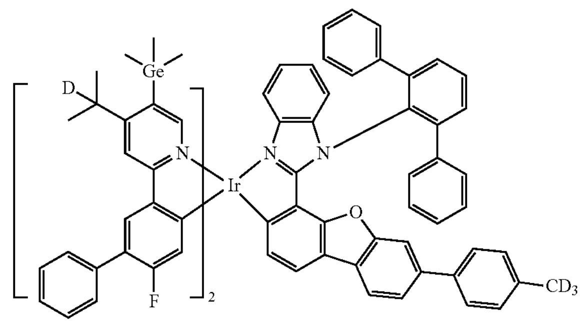
2786
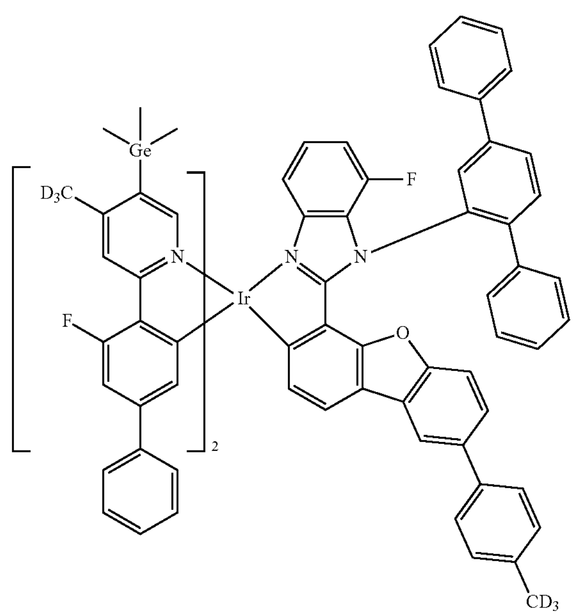

-continued
2787
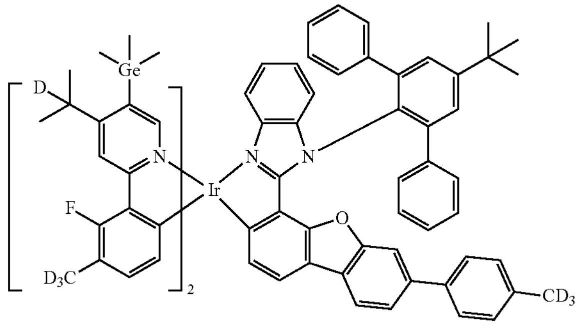
2788
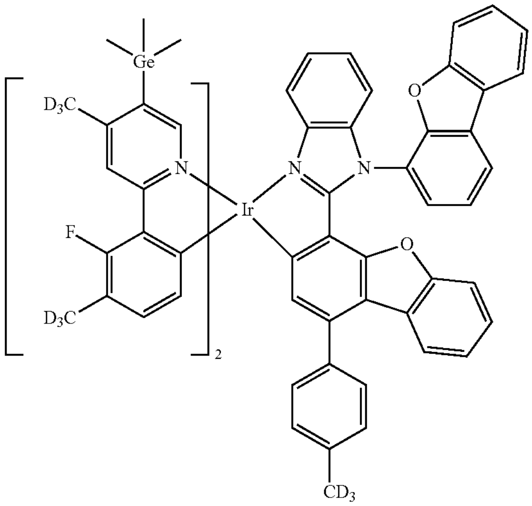
2789
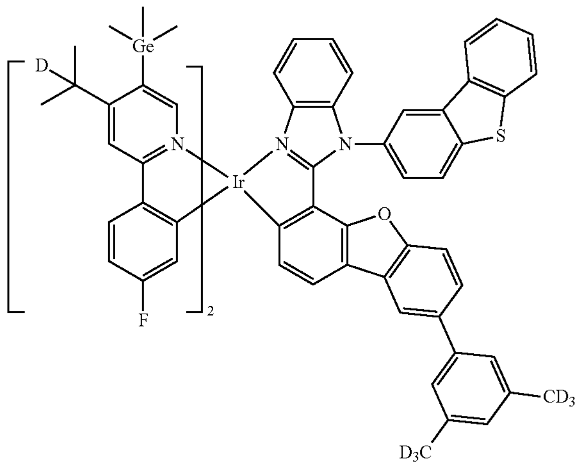
-continued
2790
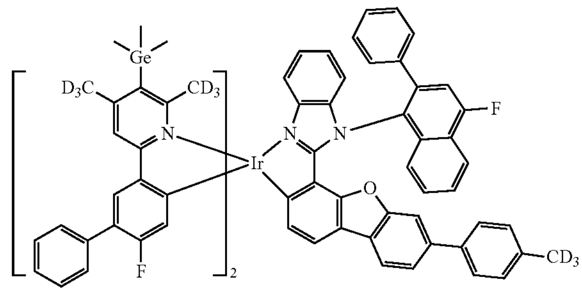
2791
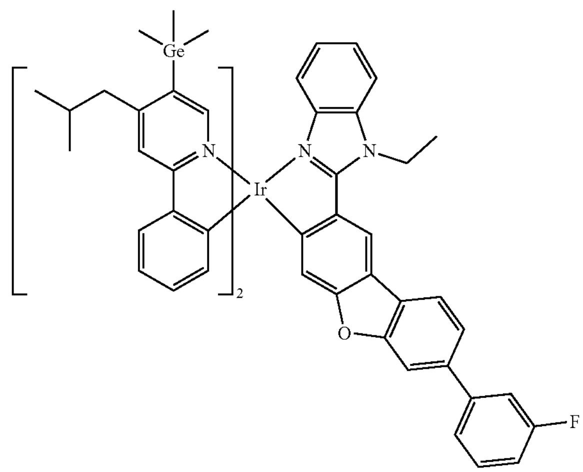
2792
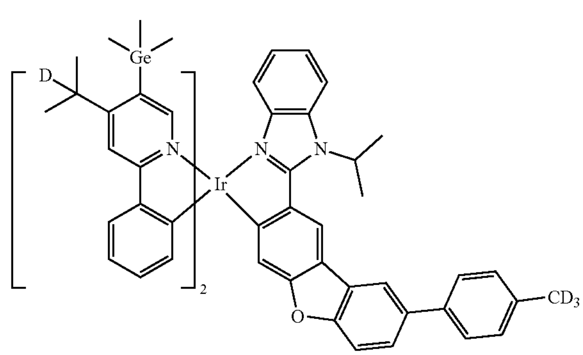

2793
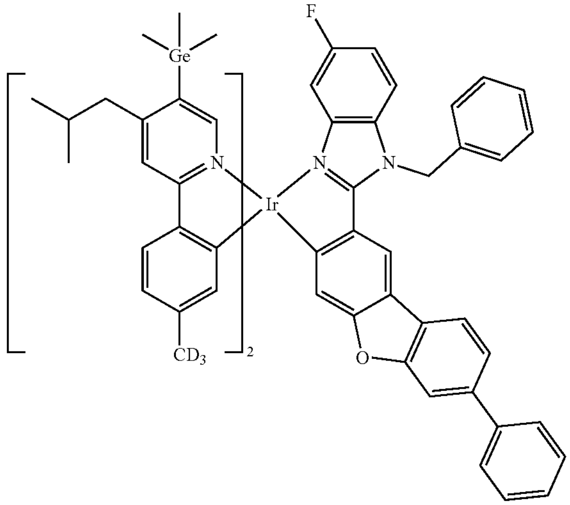
2794
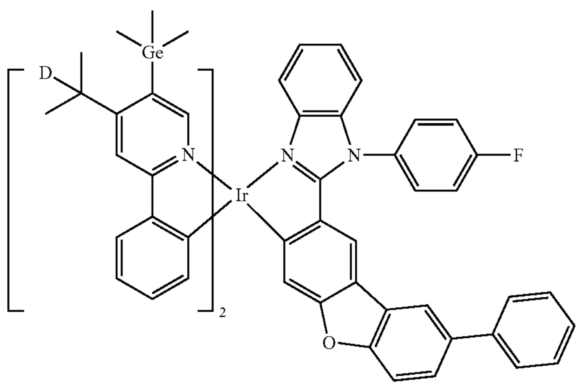
2795
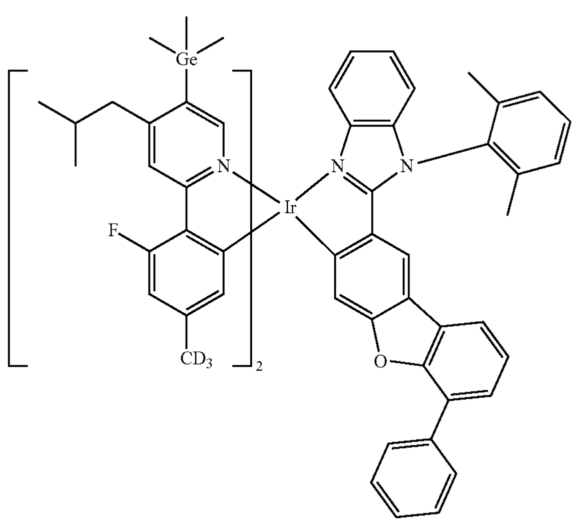
2796
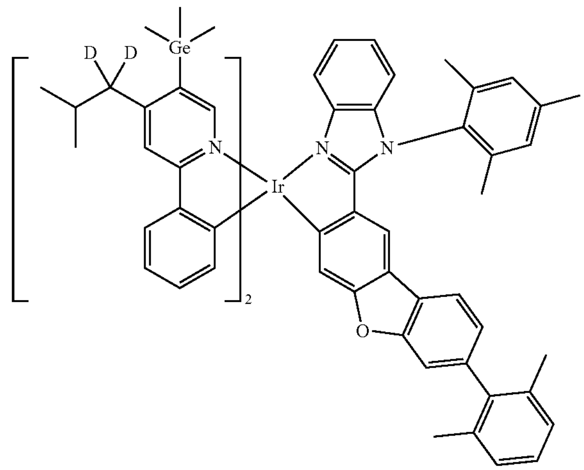
2797
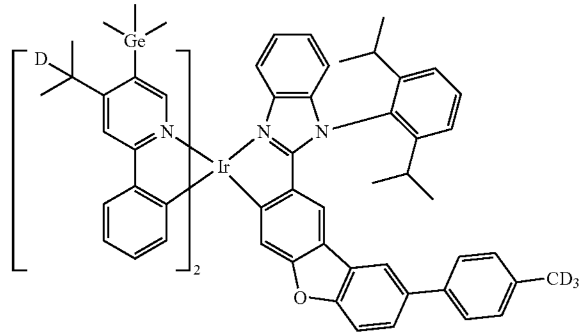
2798
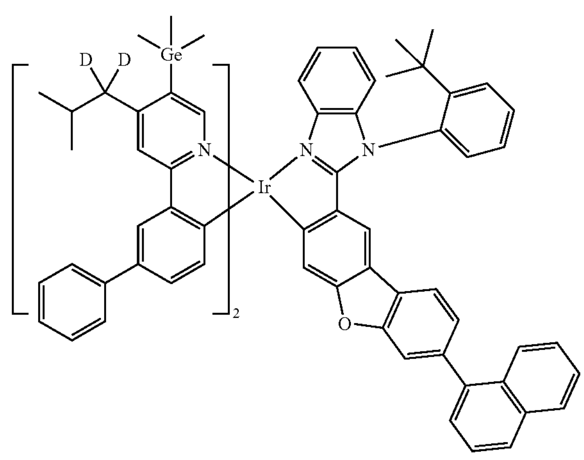

2799
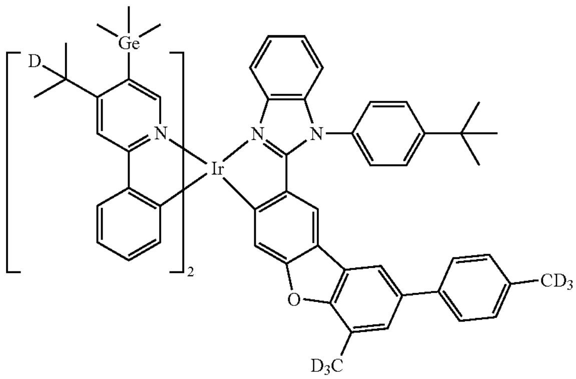
2800
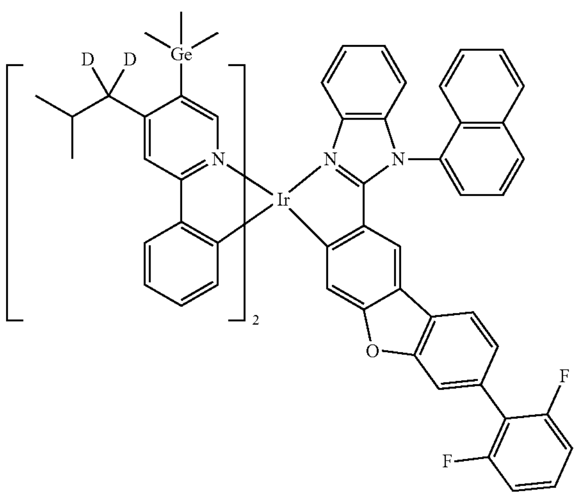
2801
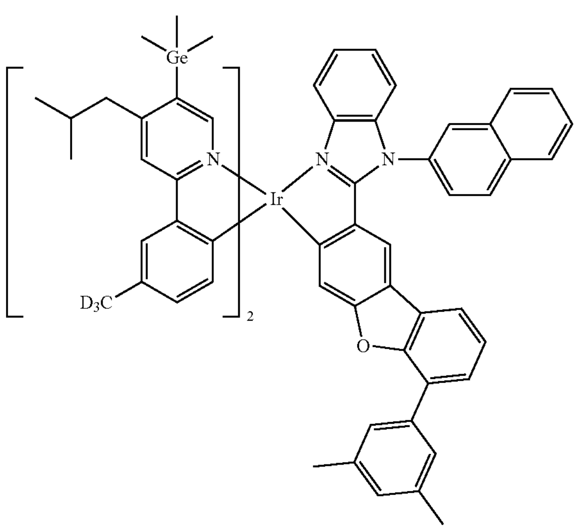
2802
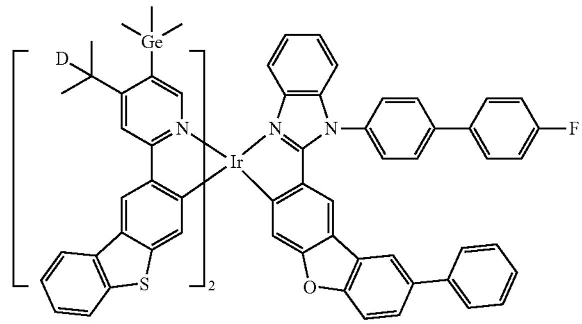
2803
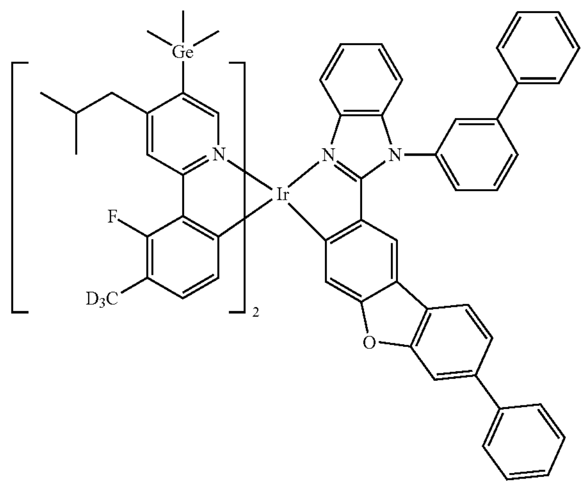
2804
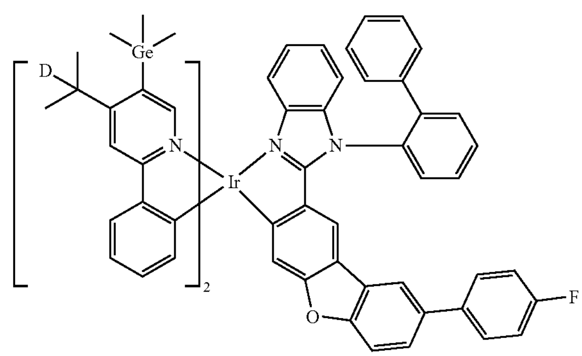
2805
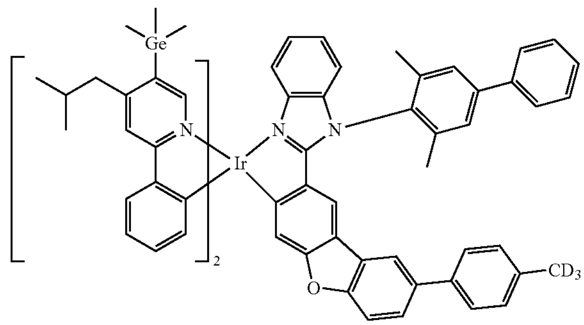

-continued
2806
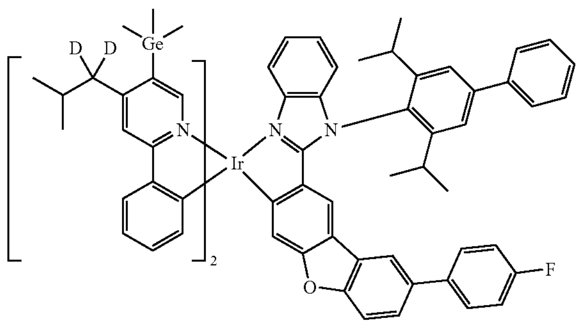
2807
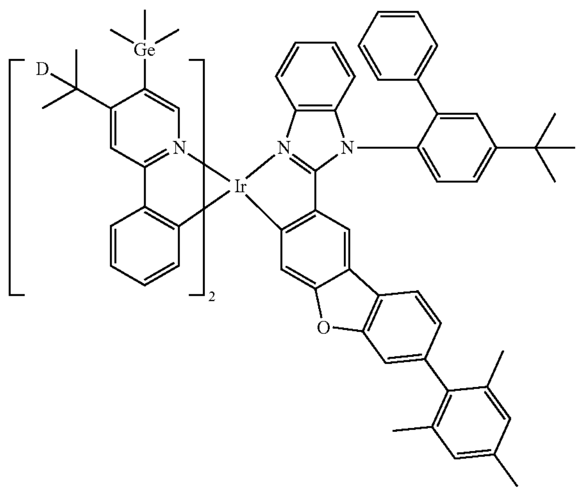
2808
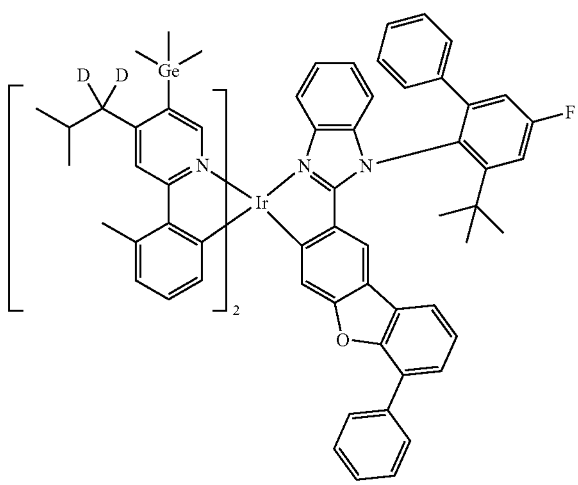
-continued
2809
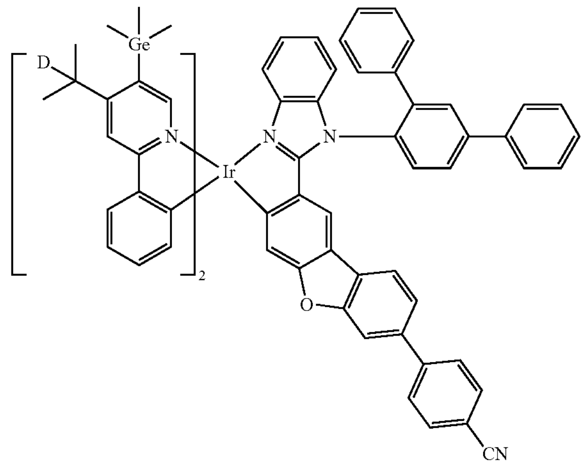
2810
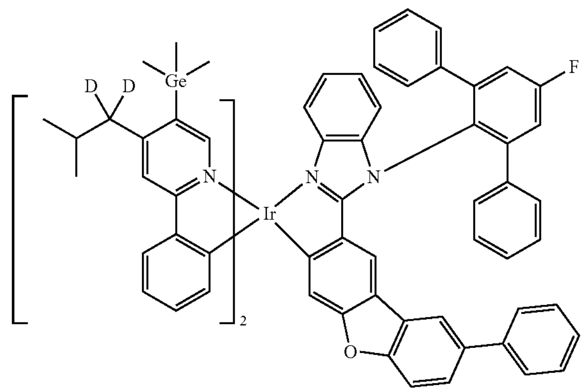
2811
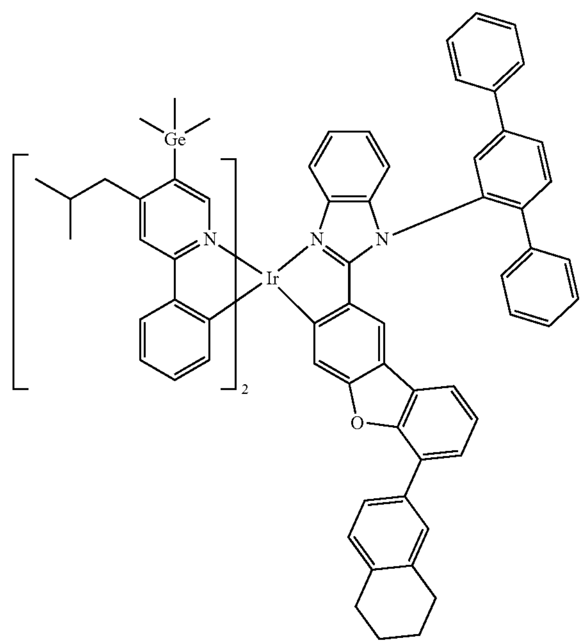

2812
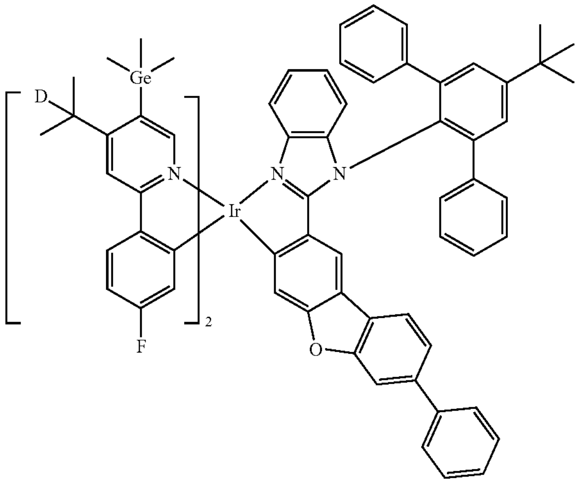
2813
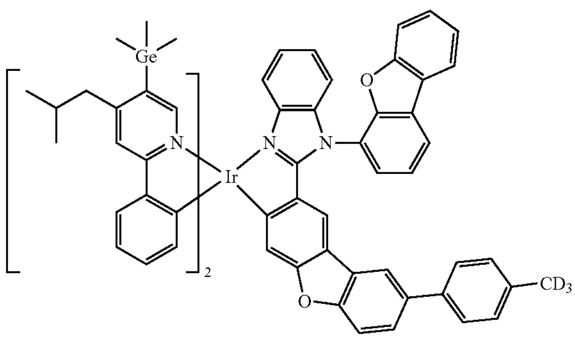
2814
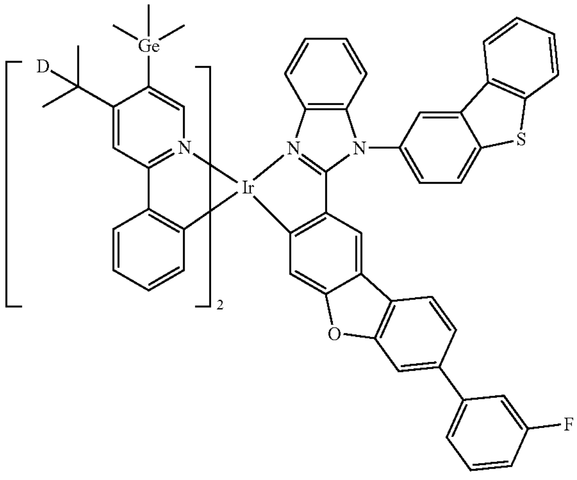
2815
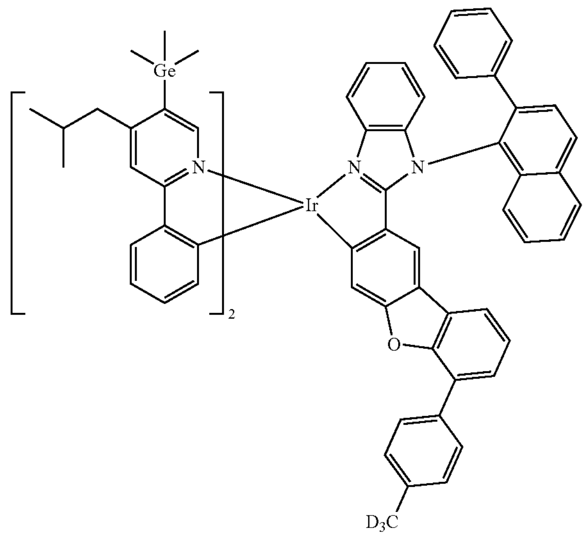
2816
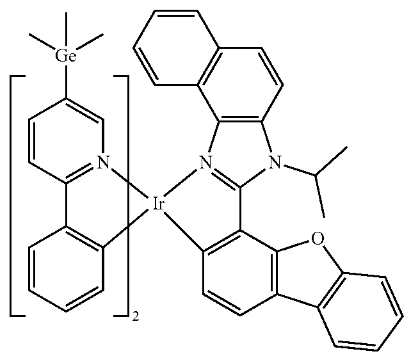
2817
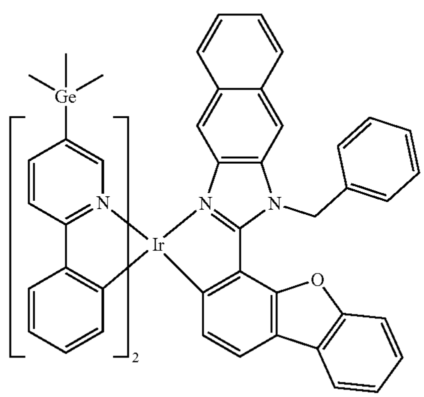
2818
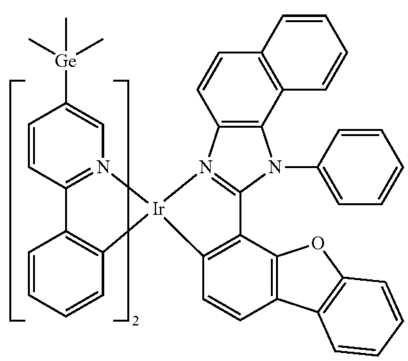

-continued
2819
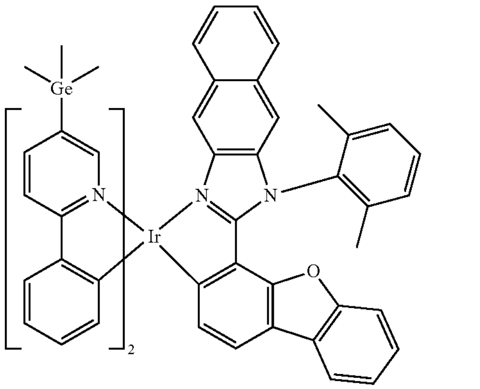
2820
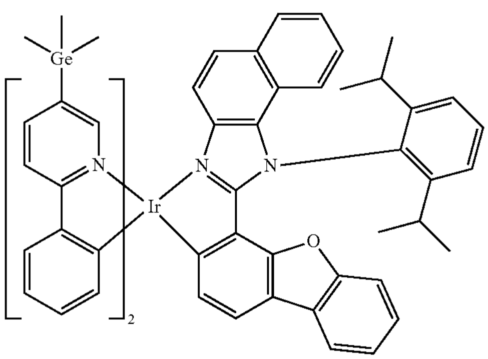
2821
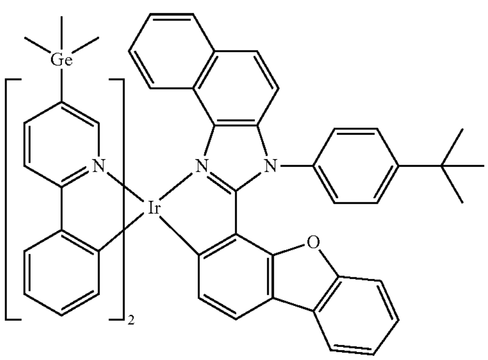
2822
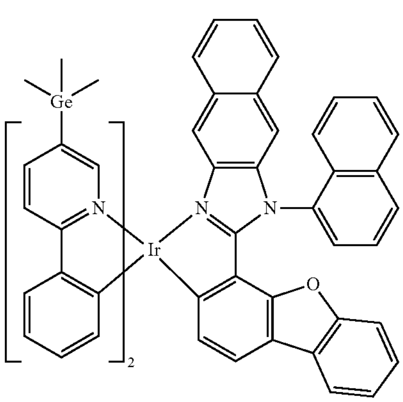
-continued
2823
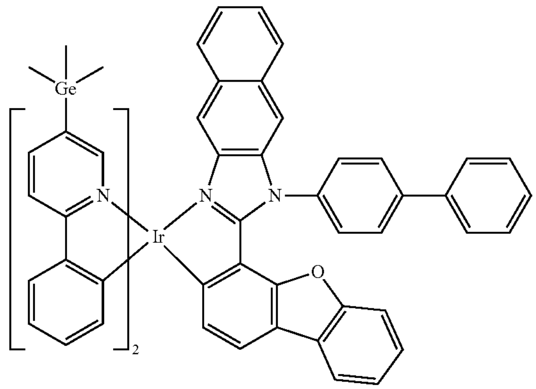
2824
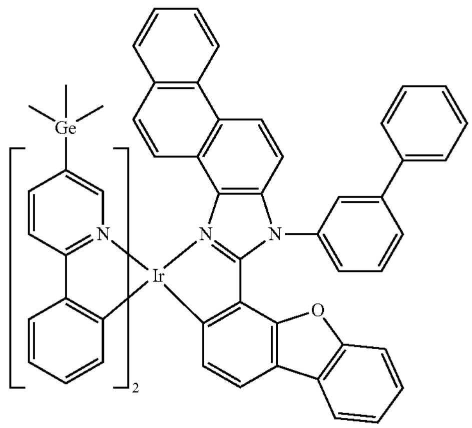
2825
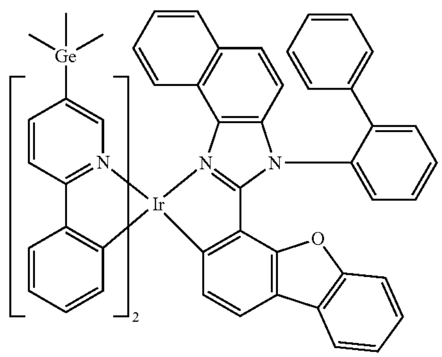
2826
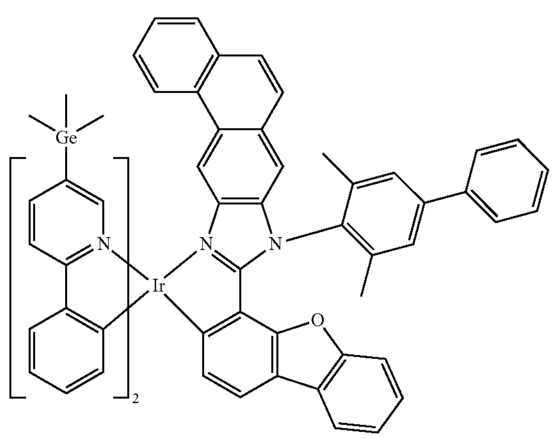

-continued
2827
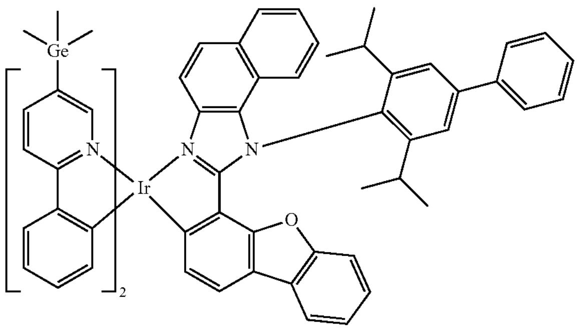
2828
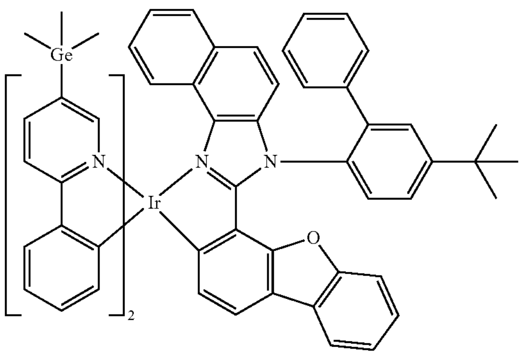
2829
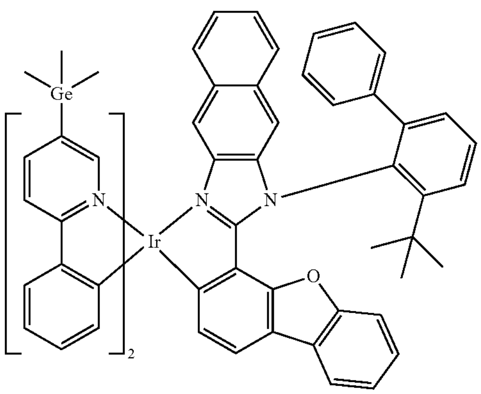
2830
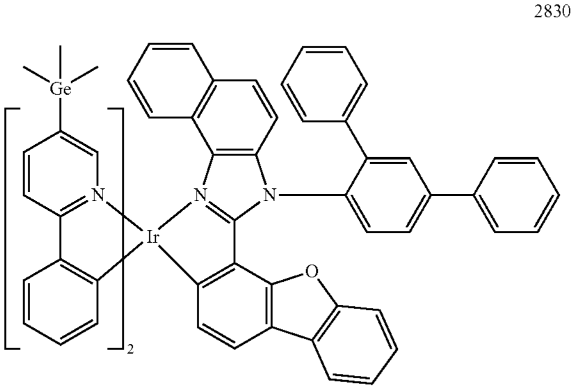
-continued
2831
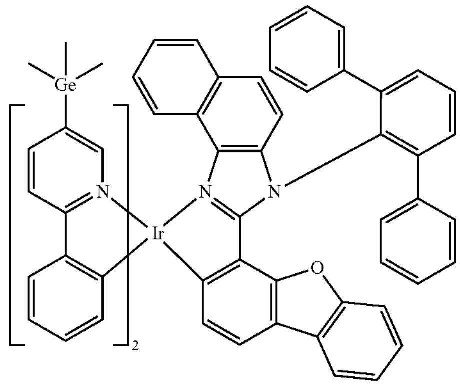
2832
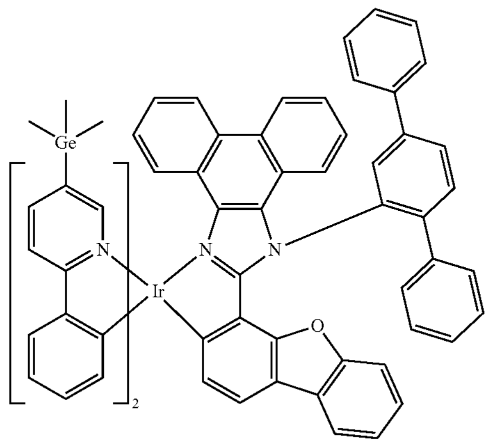
2833
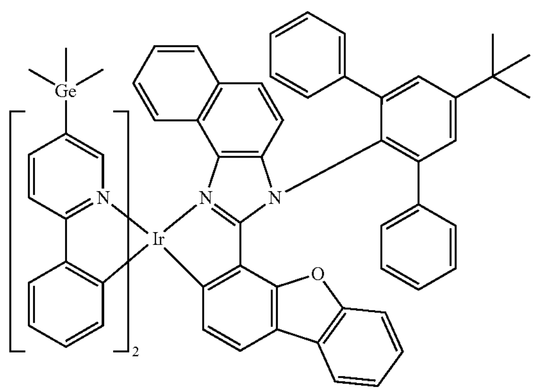
2834
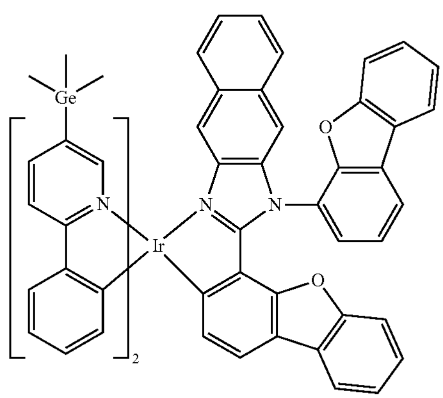

2835
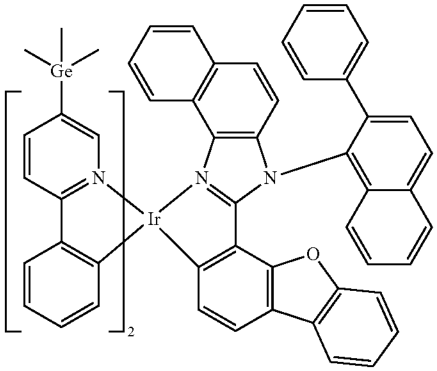
2836
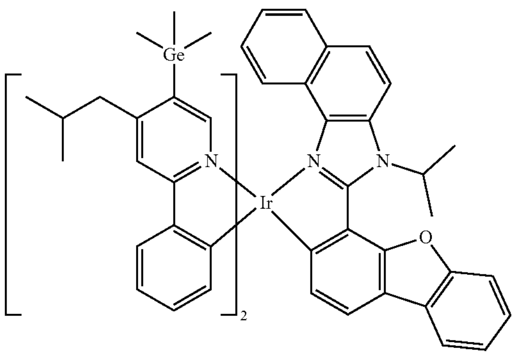
2837
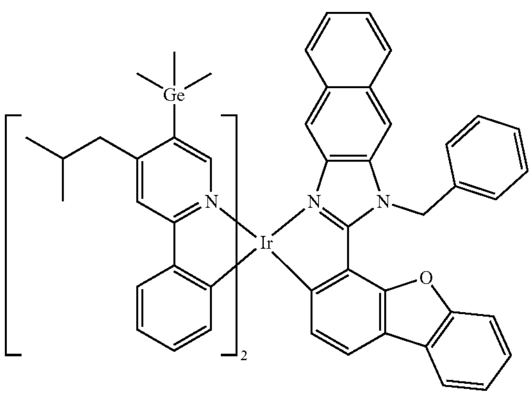
2838
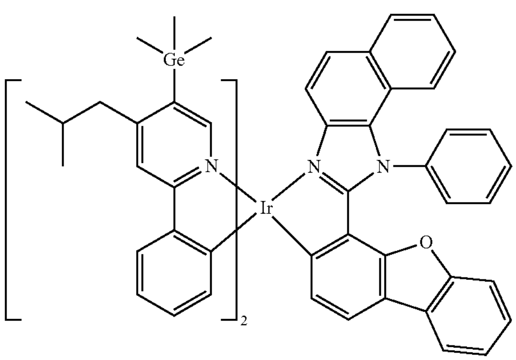
2839
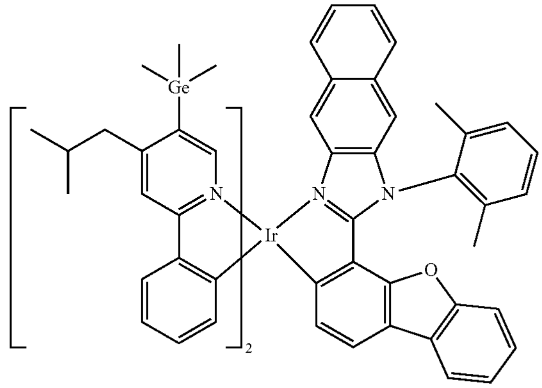
2840
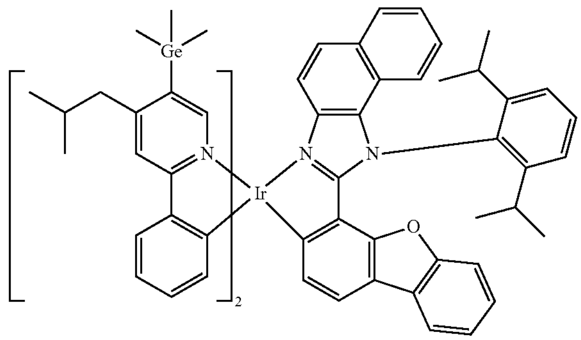
2841
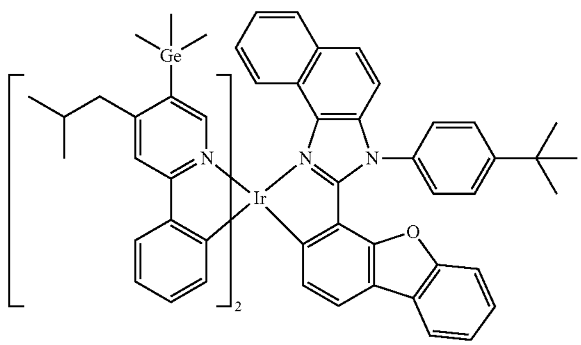
2842
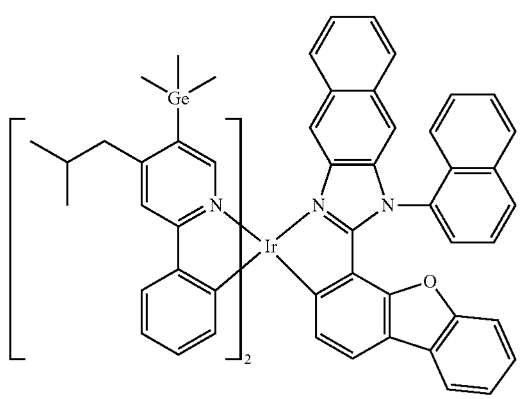

-continued
2843
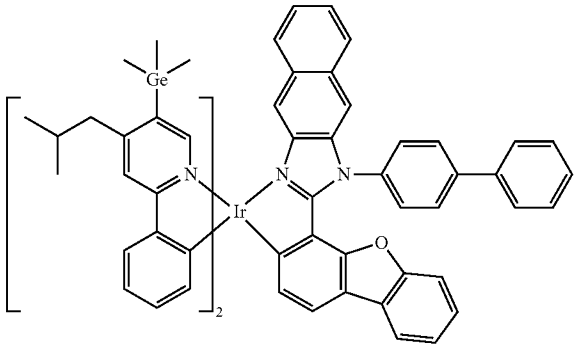
2844
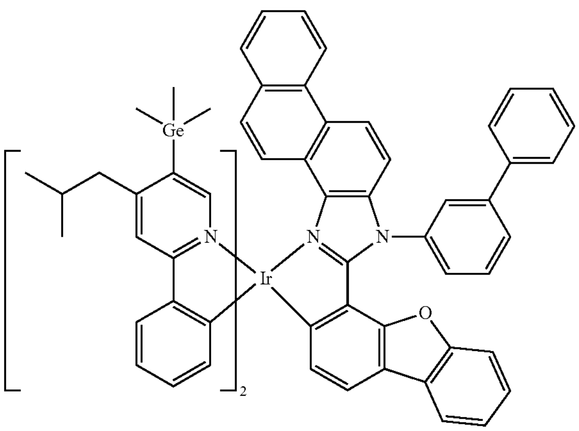
2845
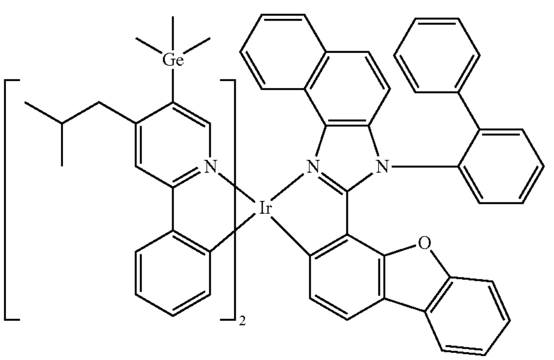
2846
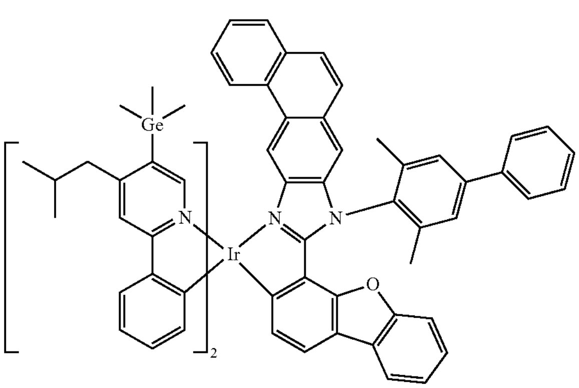
-continued
2847
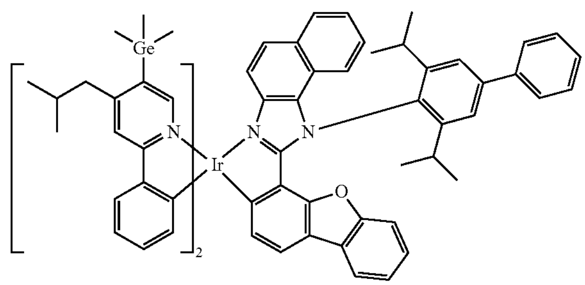
2848
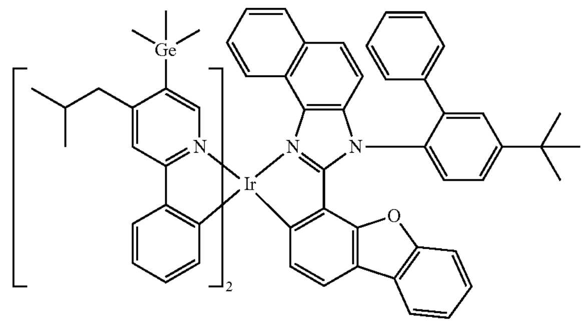
2849
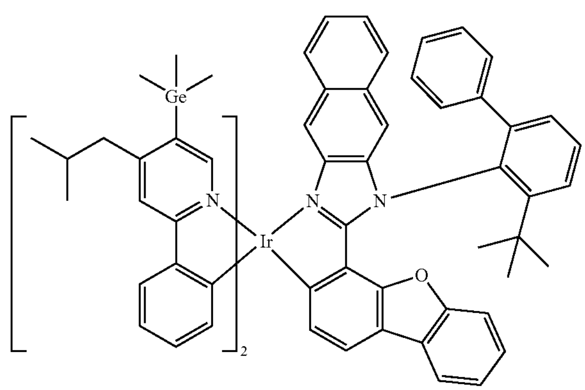
2850
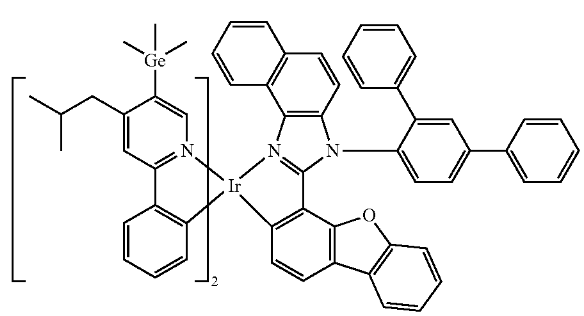

-continued
2851
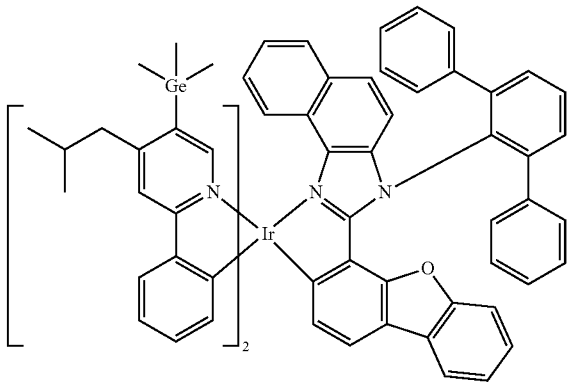
2852
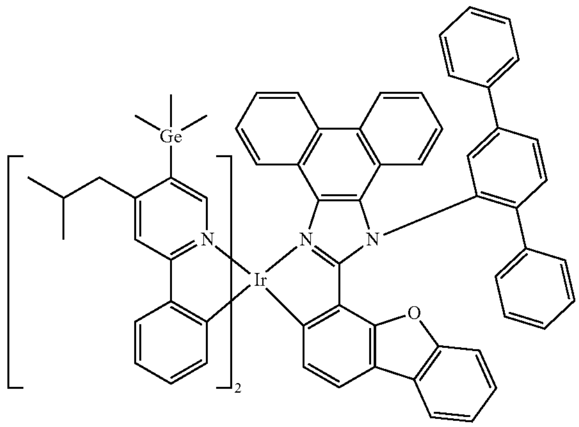
2853
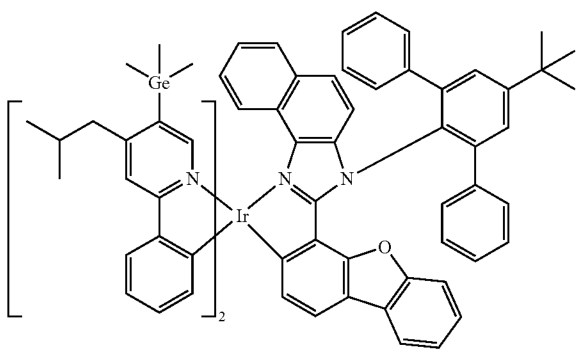
2854
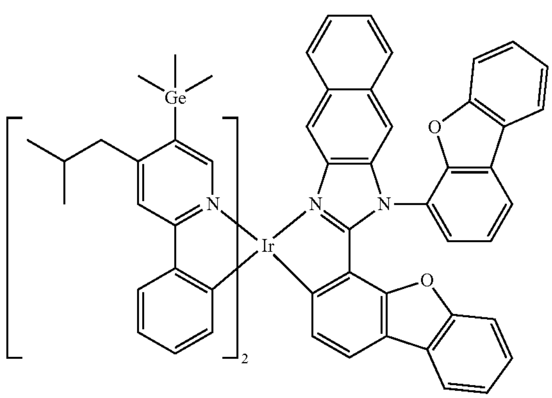
-continued
2855
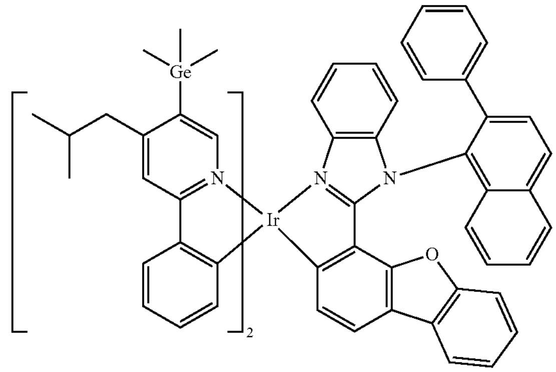
2856
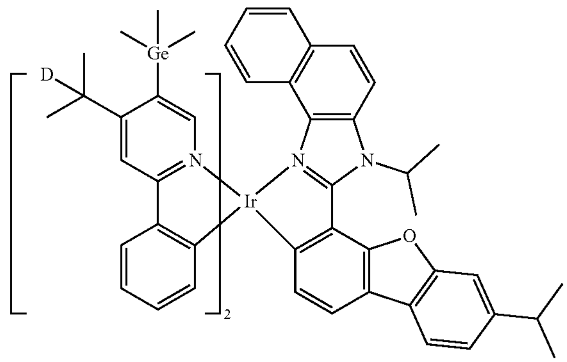
2857
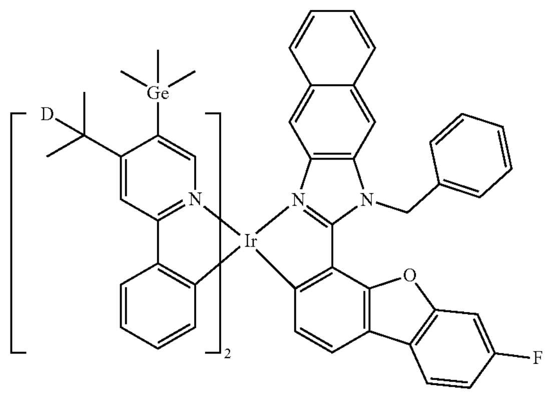
2858
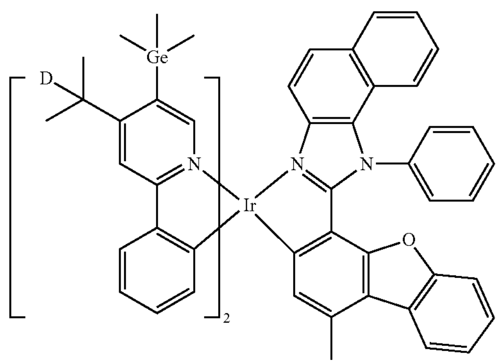

-continued
2859
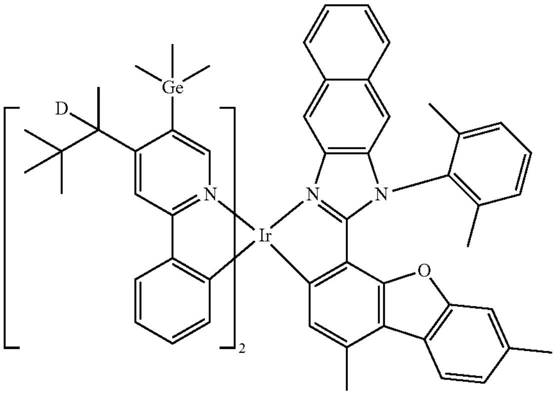
2860
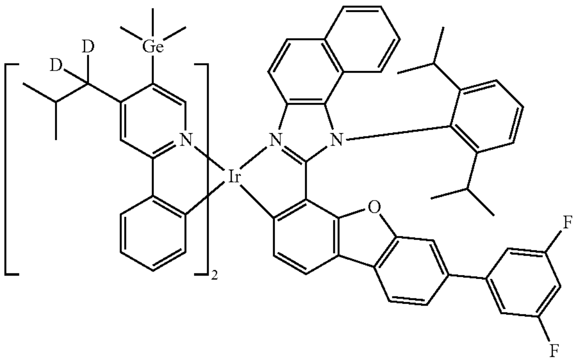
2861
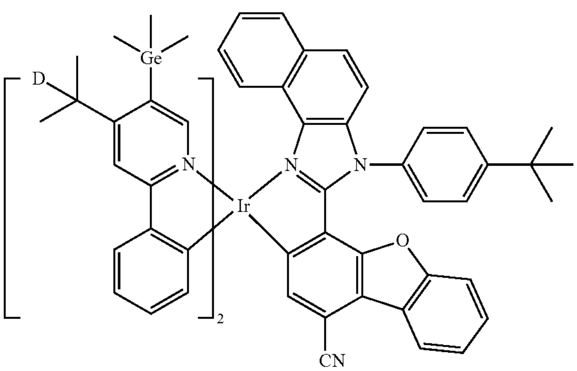
2862
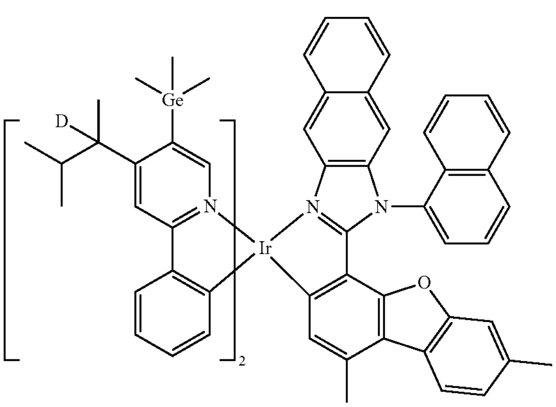
-continued
2863
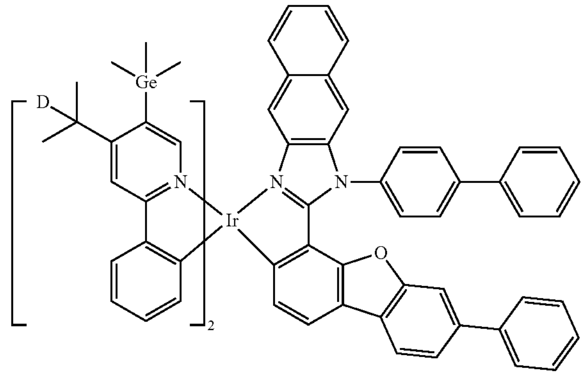
2864
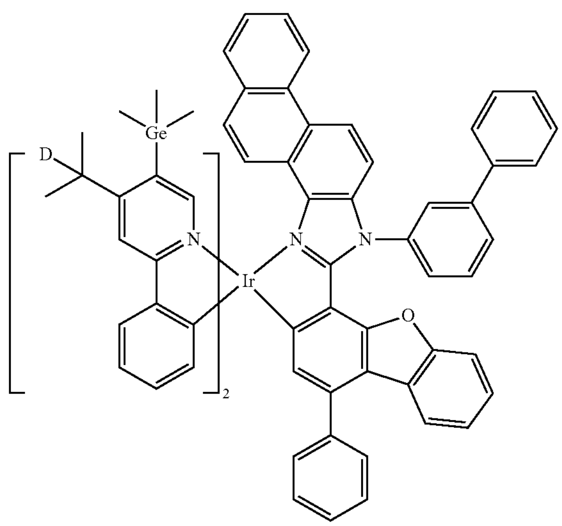
2865
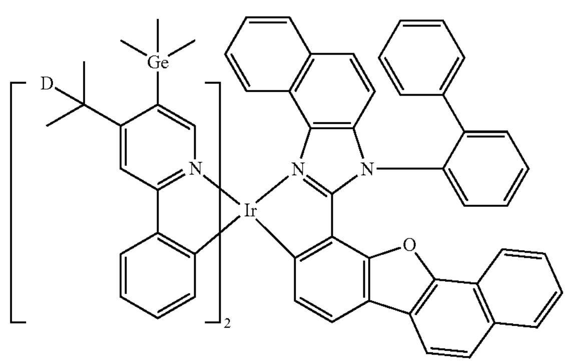

2866
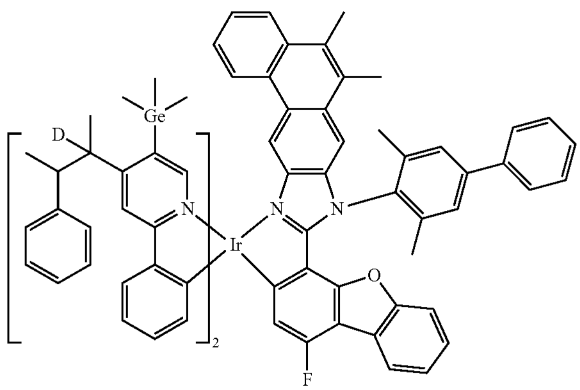
2867
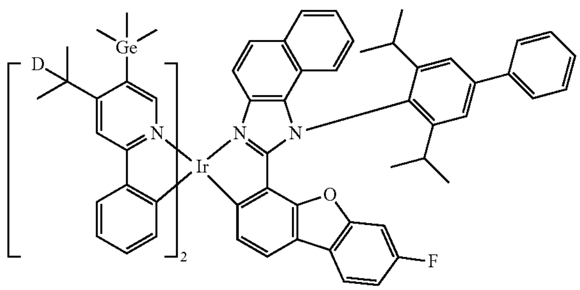
2868
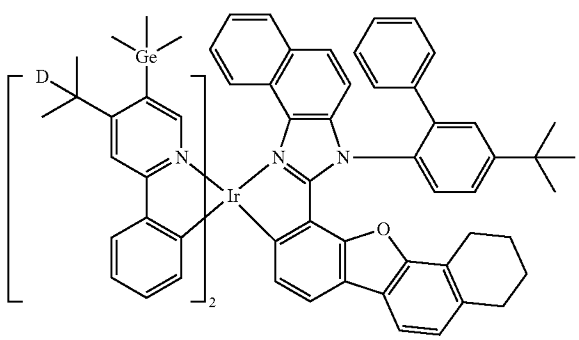
2869
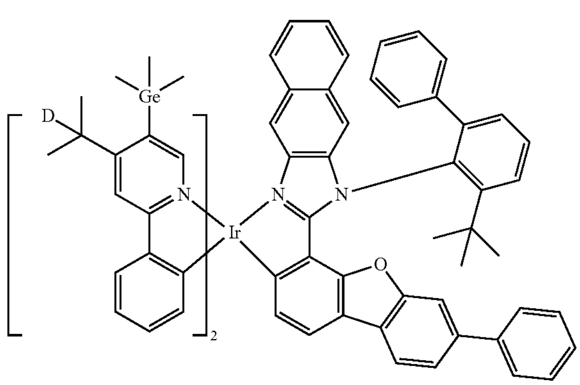
2870
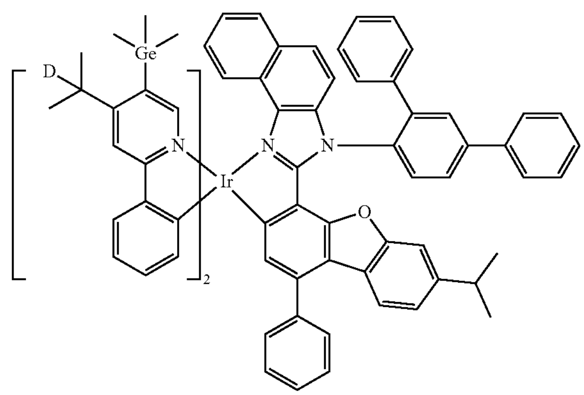
2871
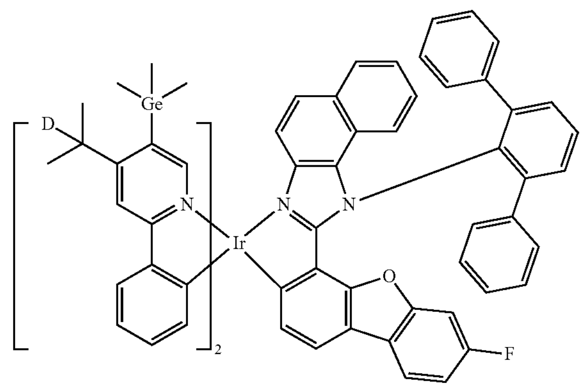
2872
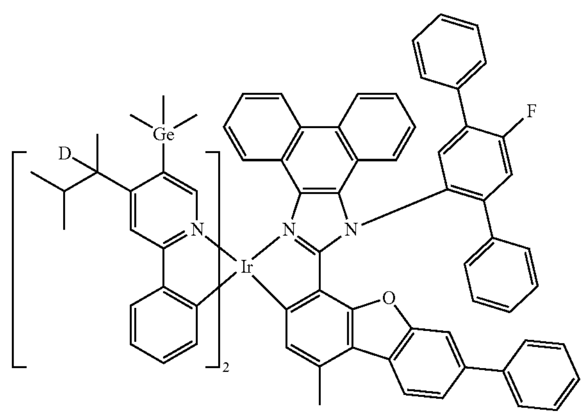
2873
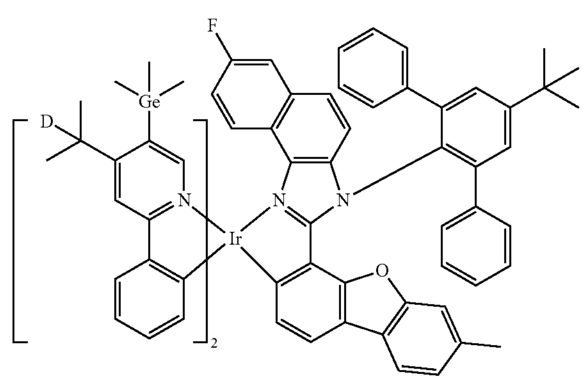

-continued
2874
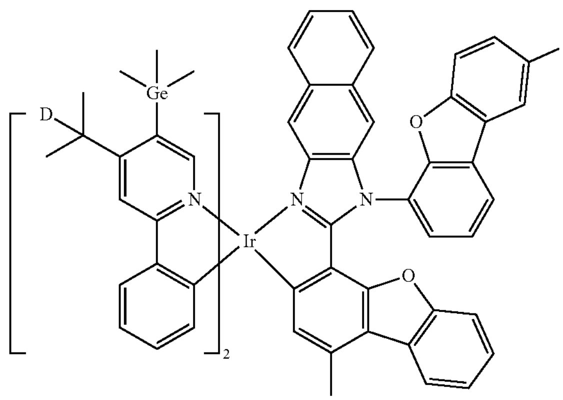
2875
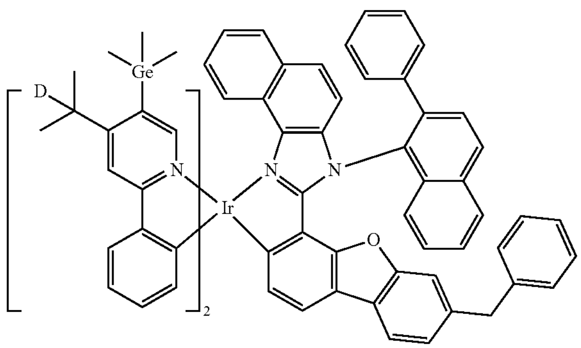
2876
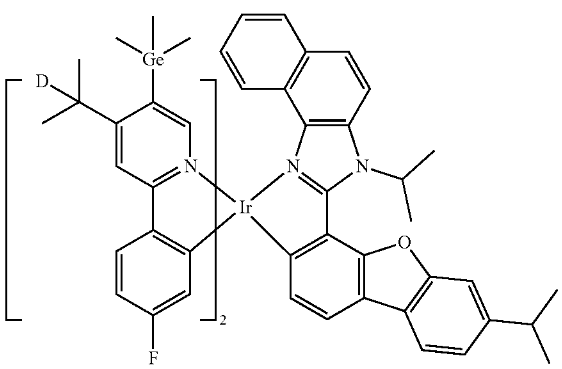
2877
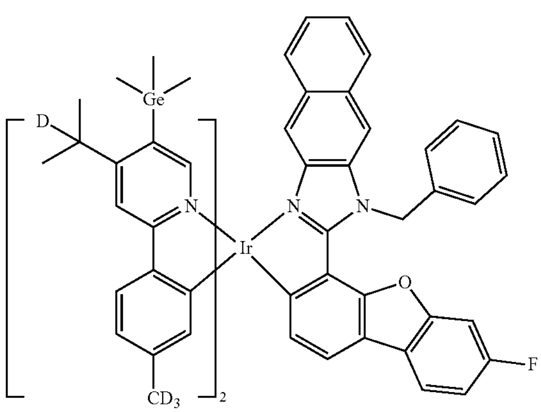
-continued
2878
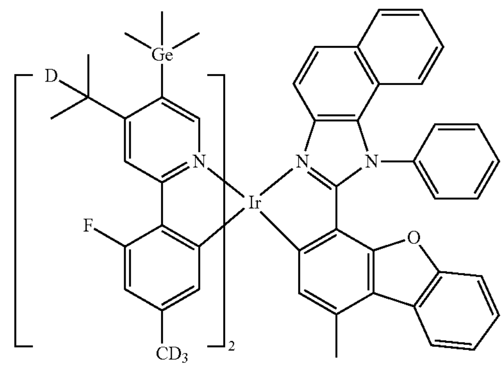
2879
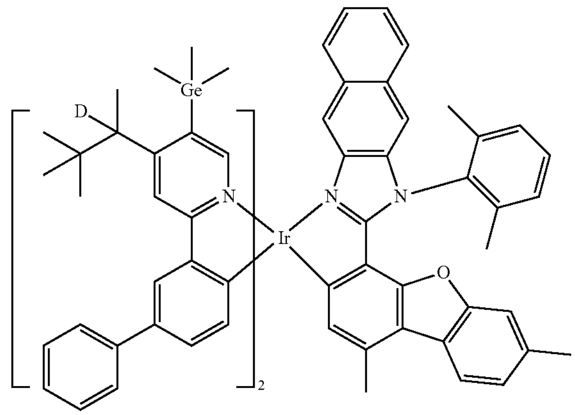
2880
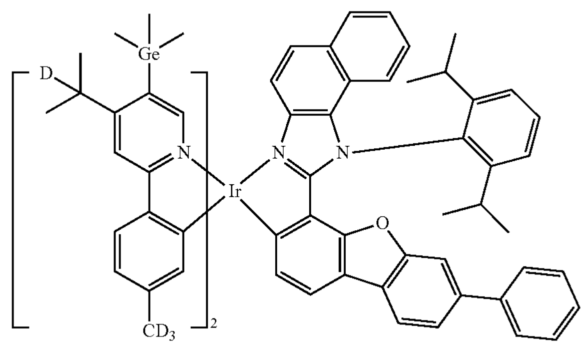
2881
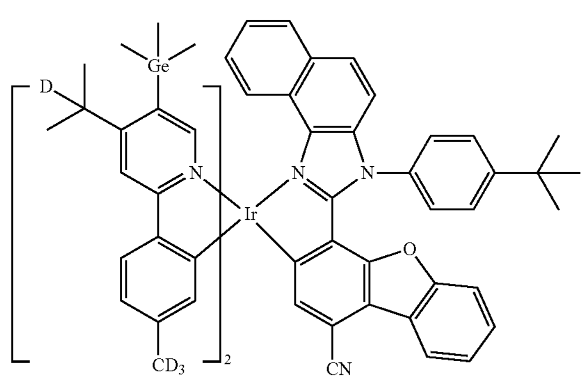

-continued
2882
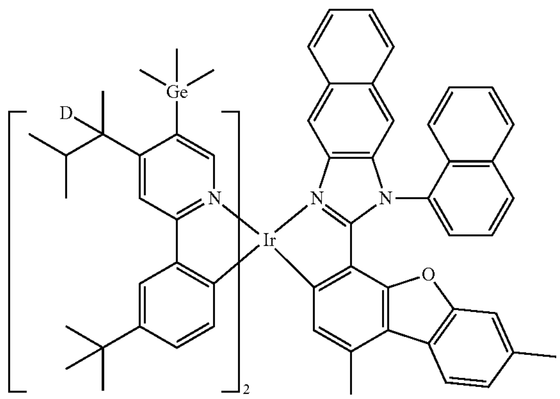
2883
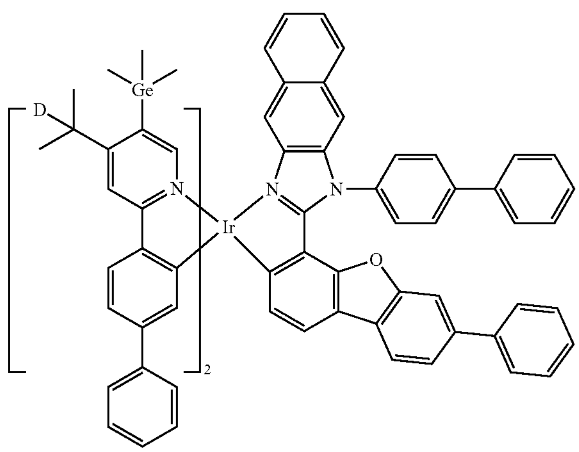
2884
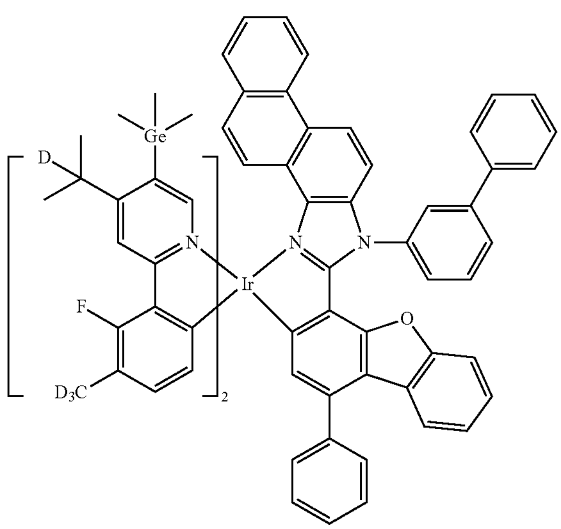
2885
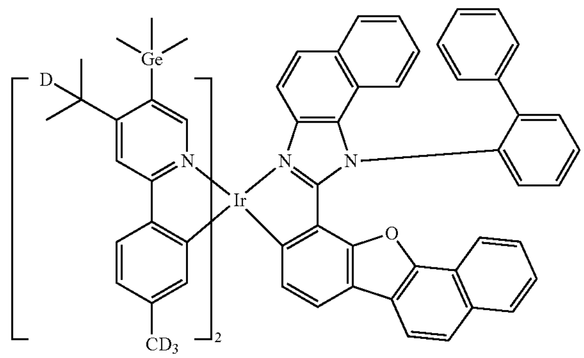
2886
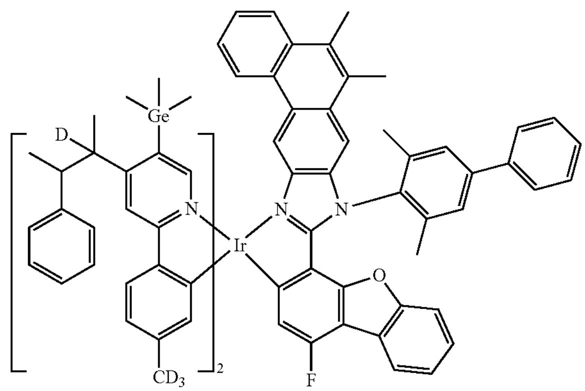
2887
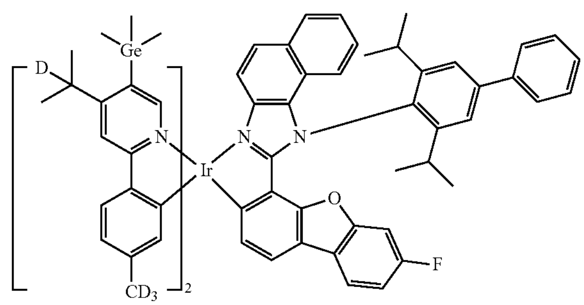
2888
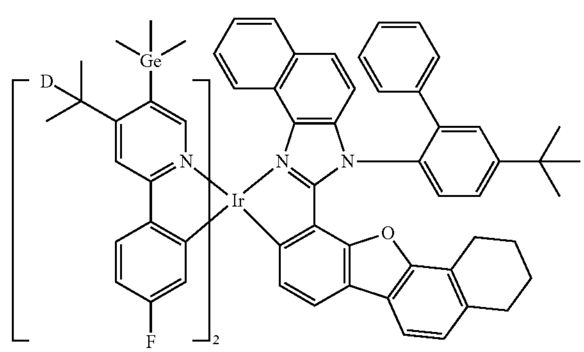

-continued
2889
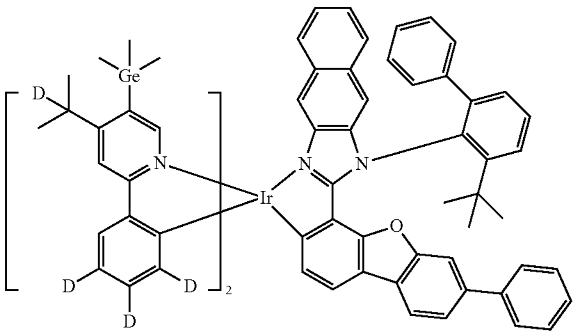
2791
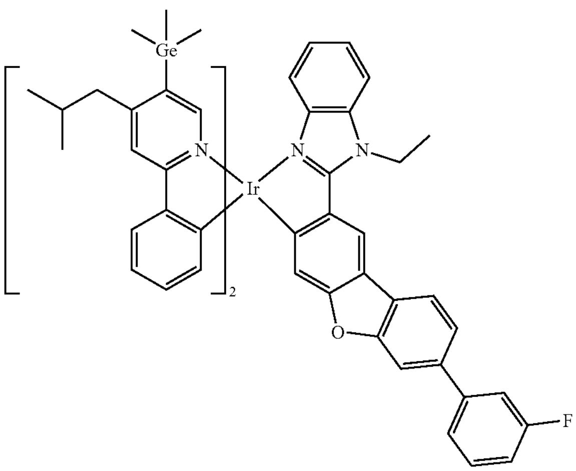
2792
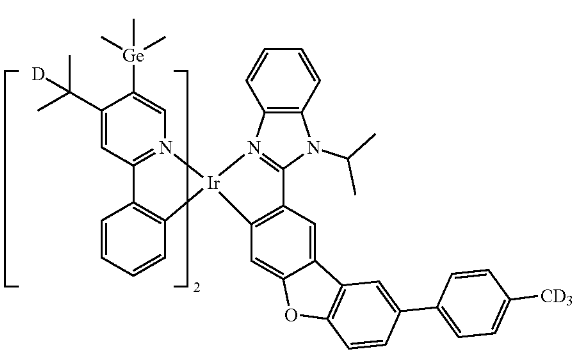
-continued
2793
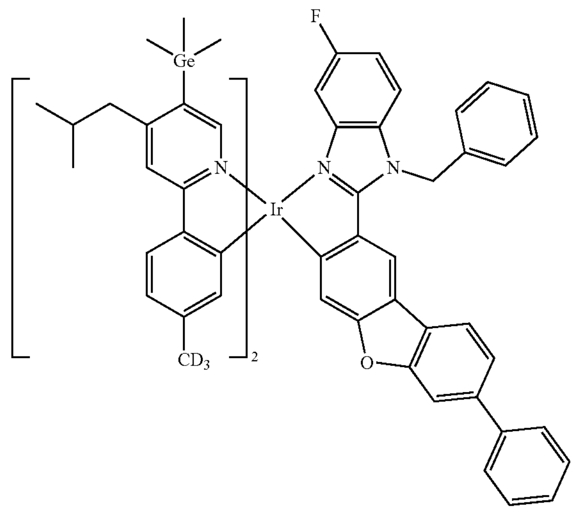
2794
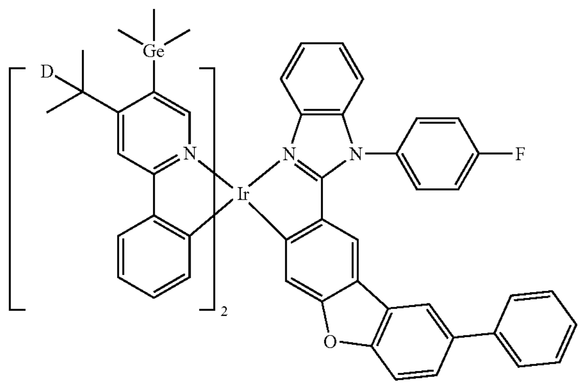
2795
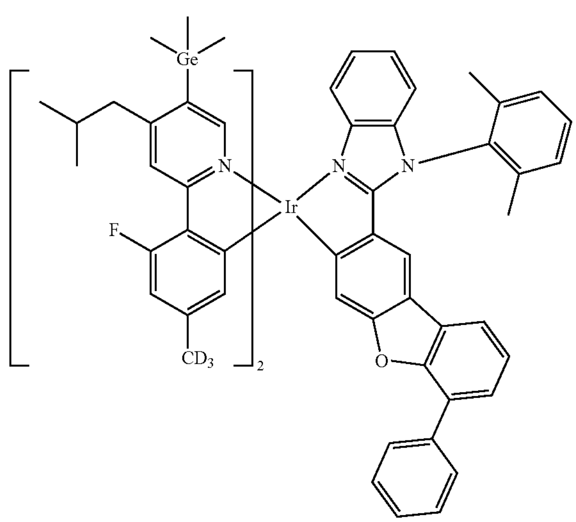

-continued
2796
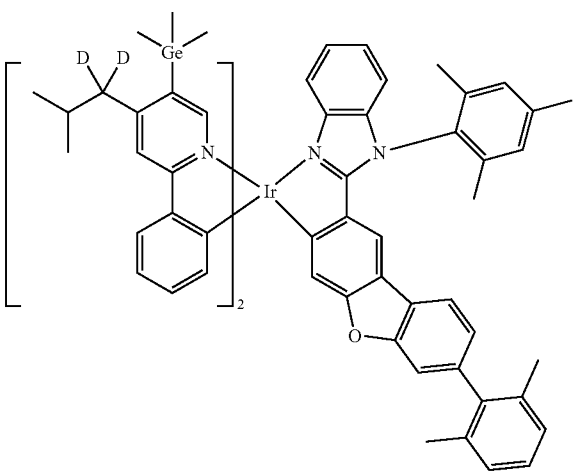
2797
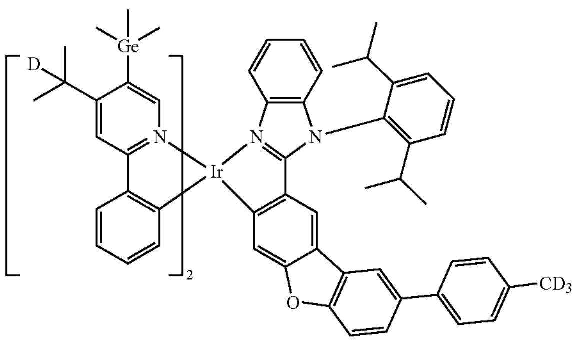
2798
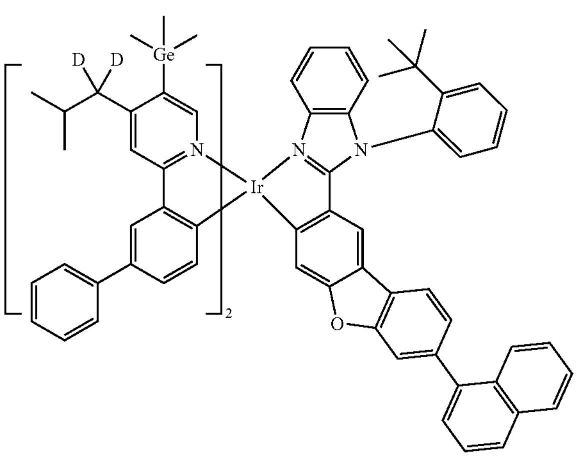
-continued
2799
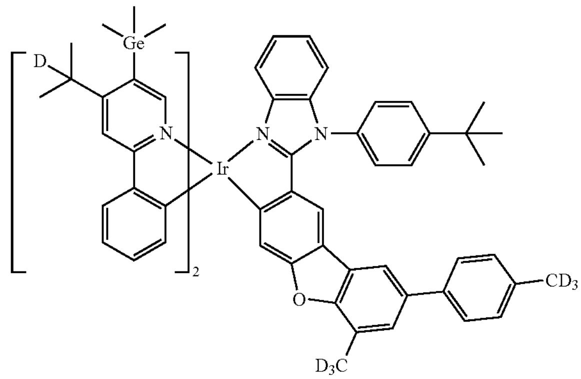
2800
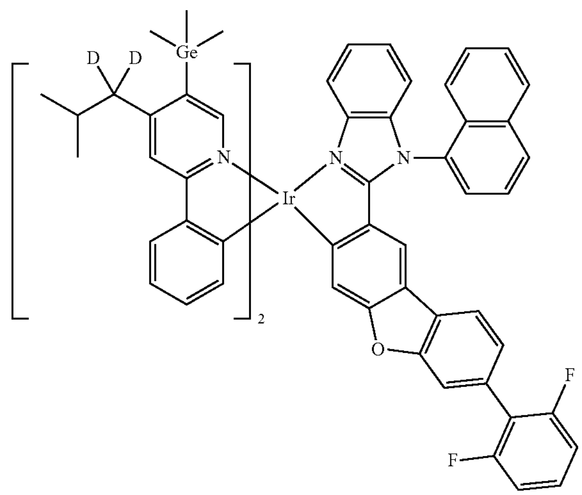
2801
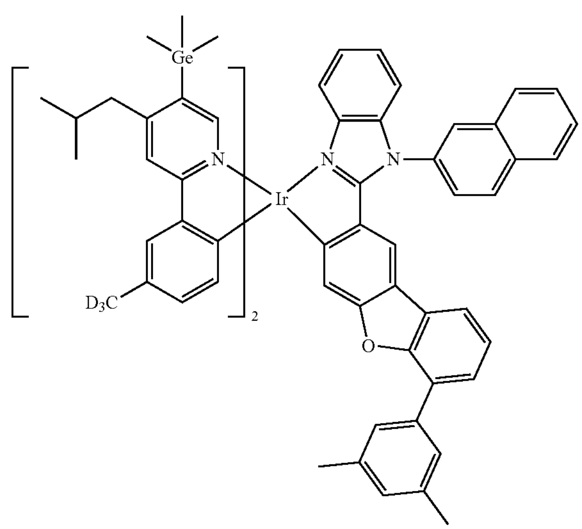

-continued
2802
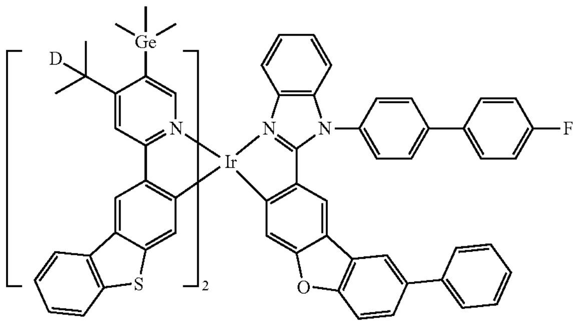
2803
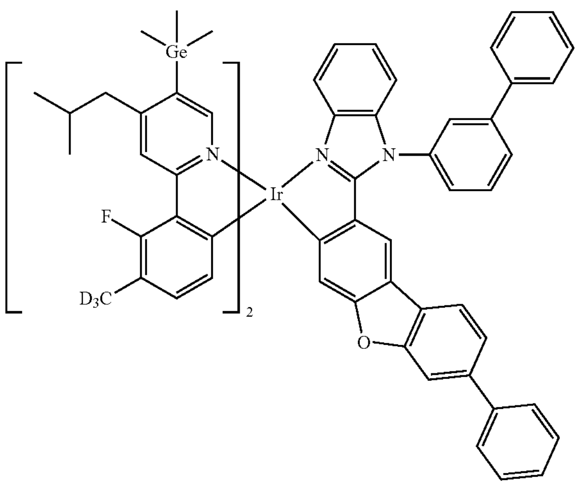
2804
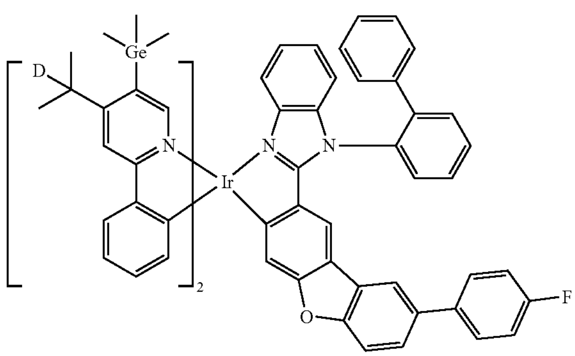
2805
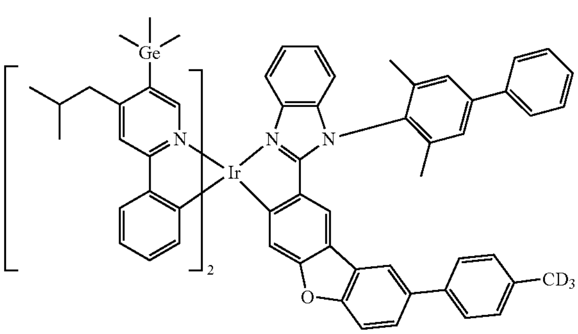
-continued
2806
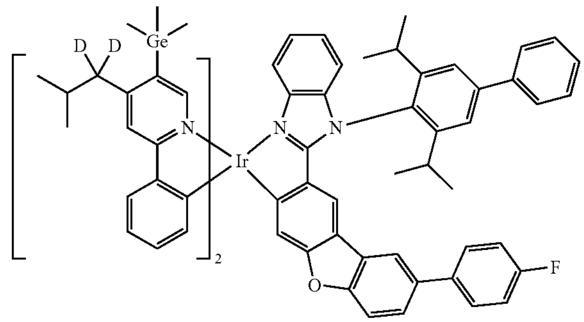
2807
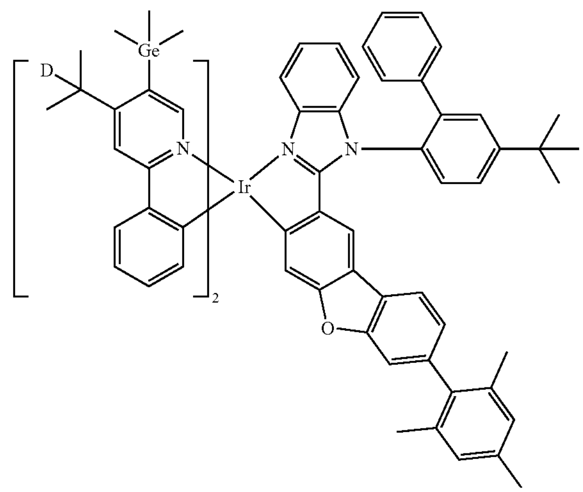
2808
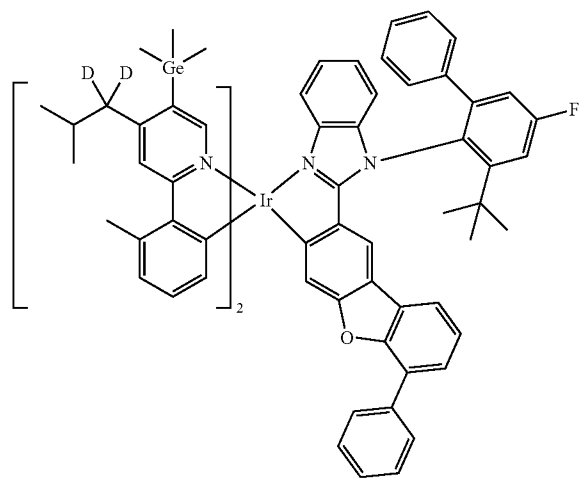

-continued
2809
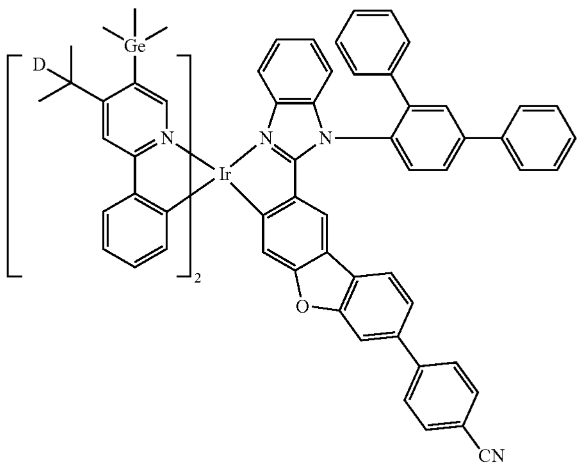
2810
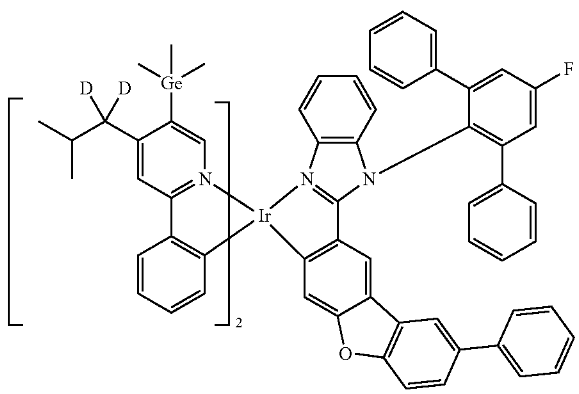
2811
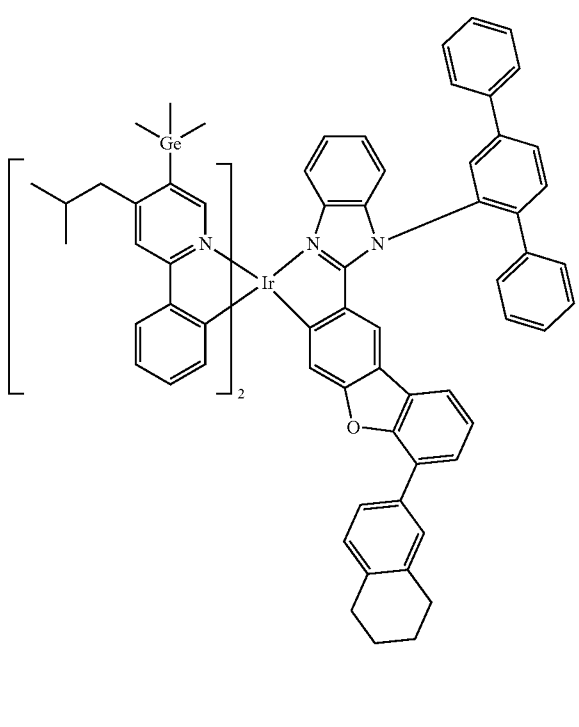
-continued
2812
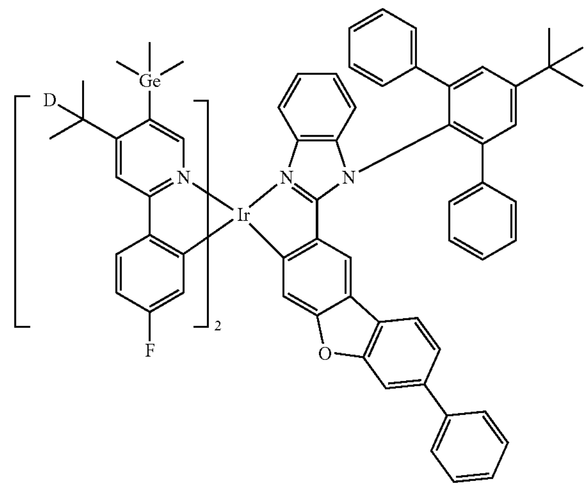
2813
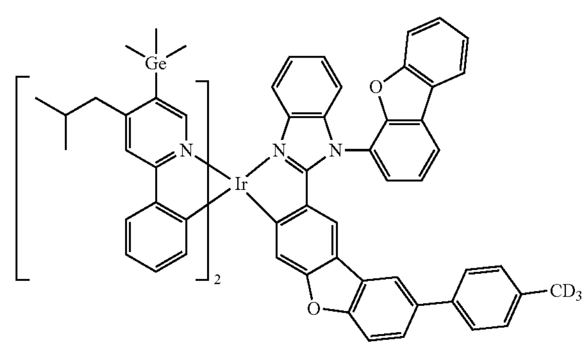
2814
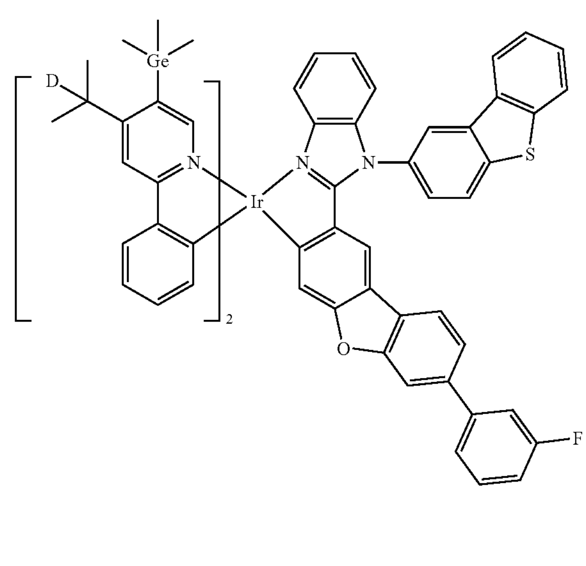

-continued
2815
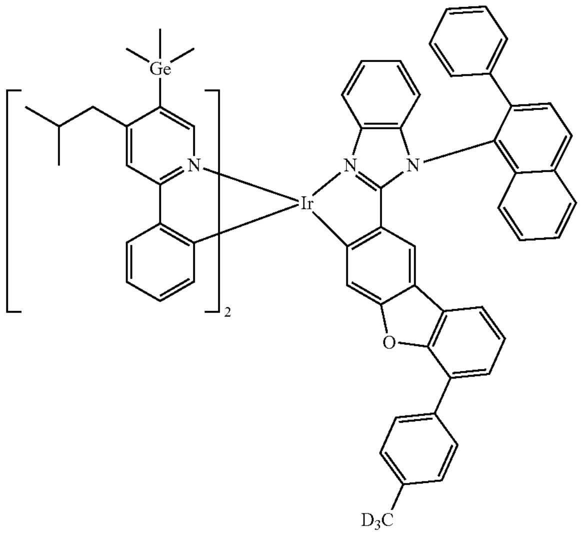
2816
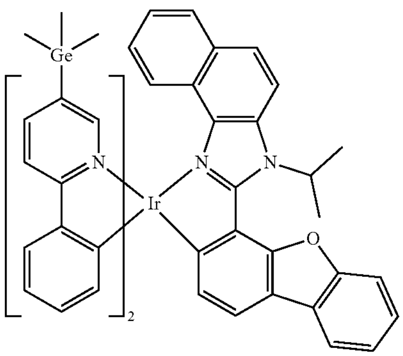
2817
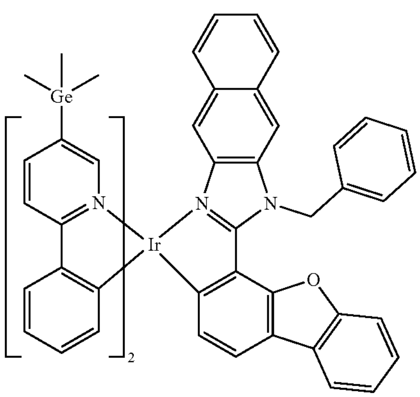
2818
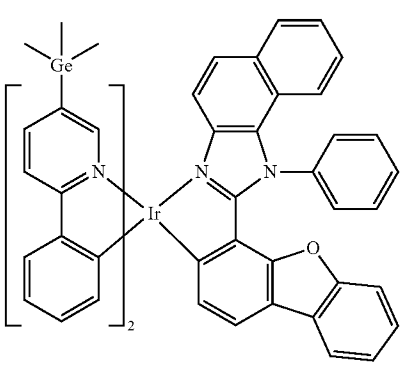
-continued
2819
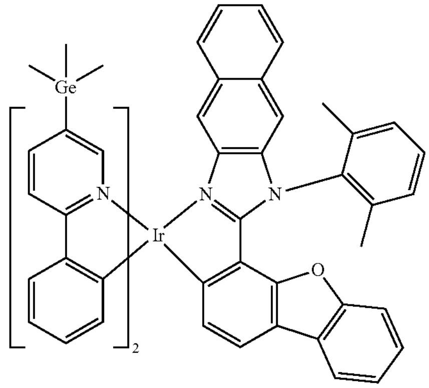
2820
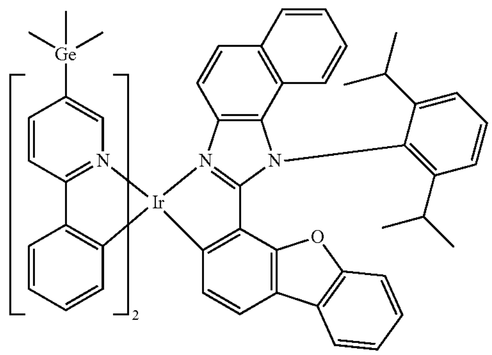
2821
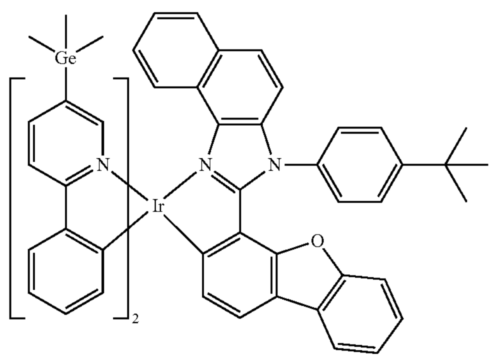
2822
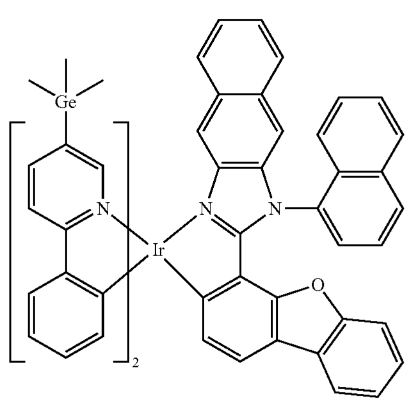

-continued
2823
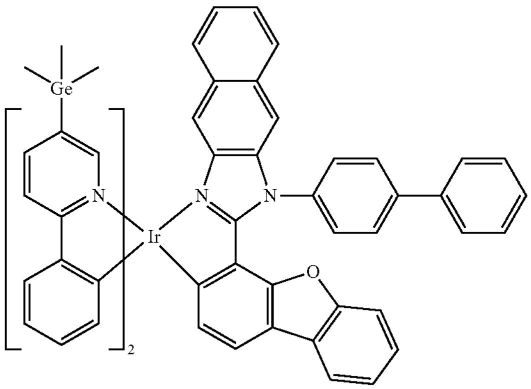
2824
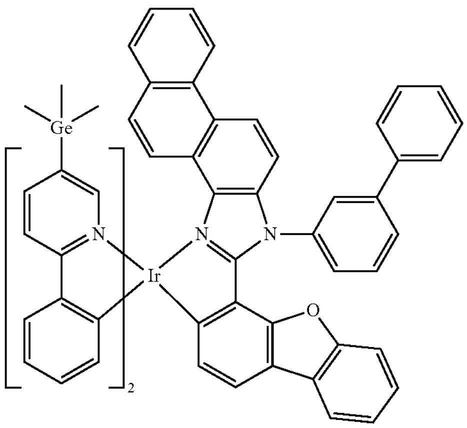
2825
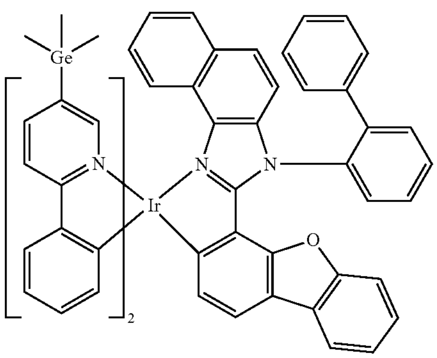
2826
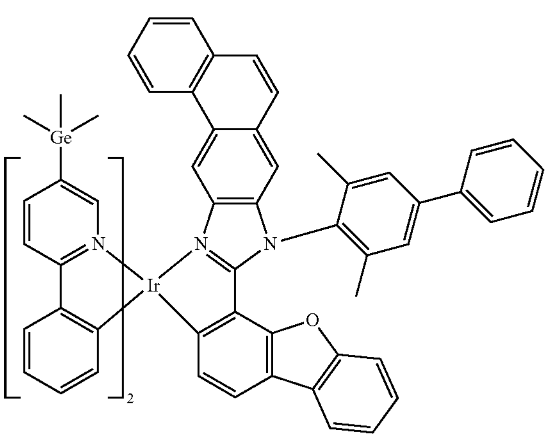
-continued
2827
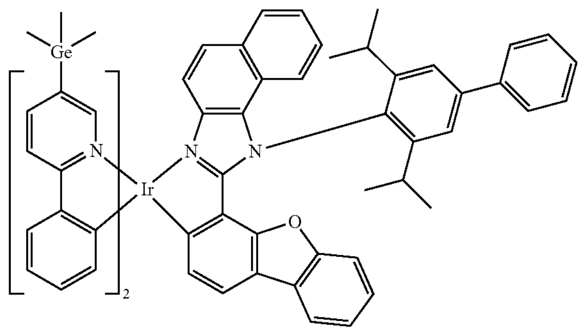
2828
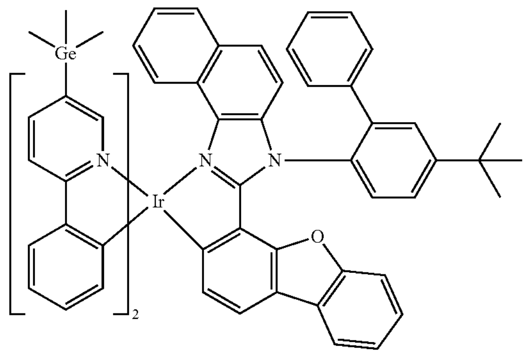
2829
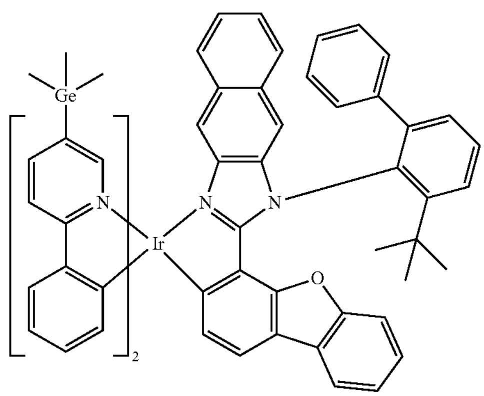
2830
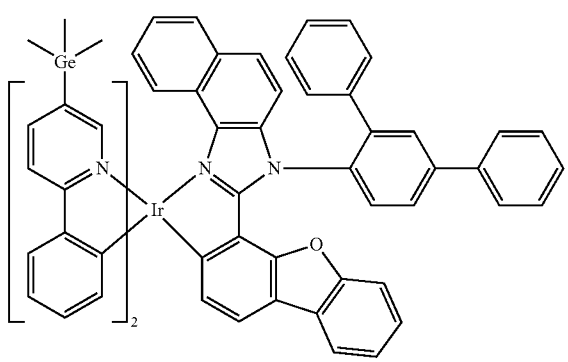

-continued
2831
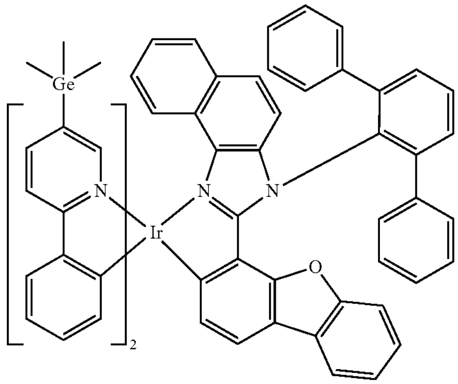
2832
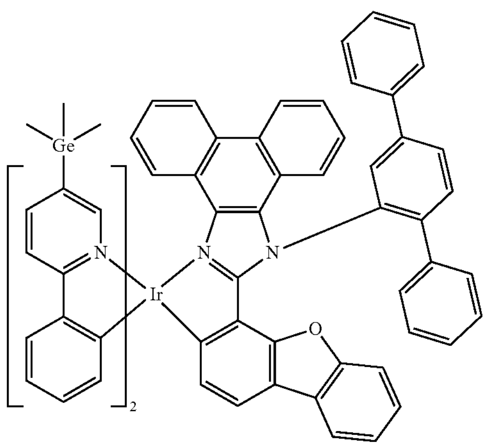
2833
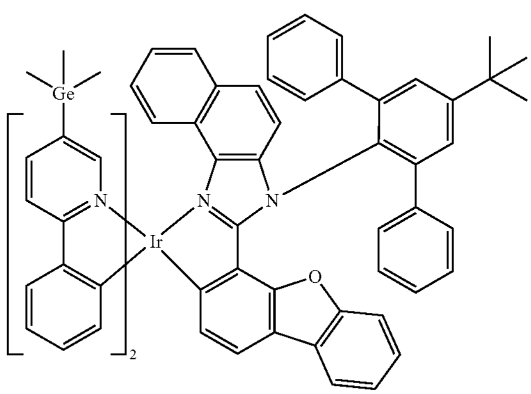
2834
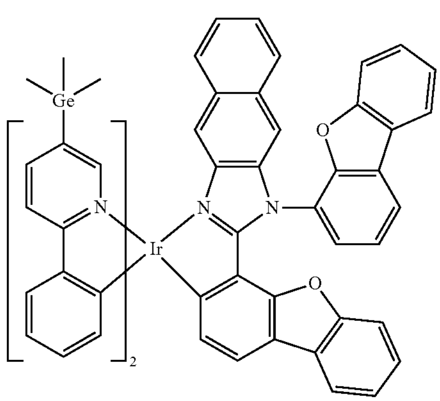
-continued
2835
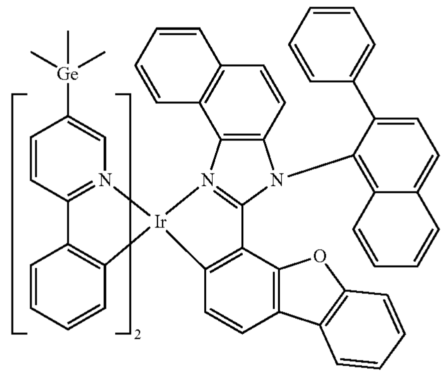
2836
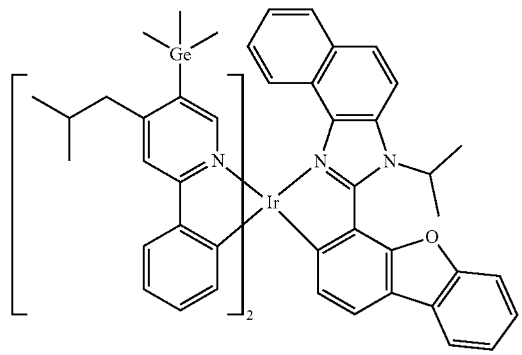
2837
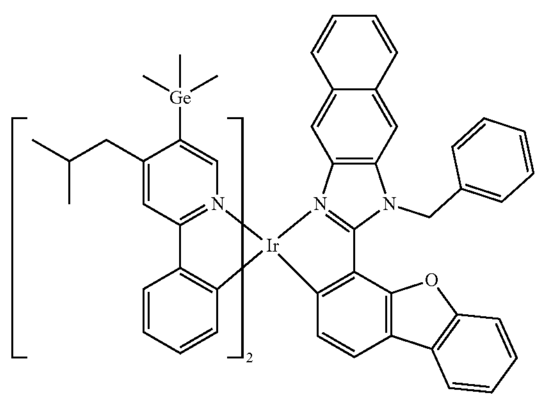
2838
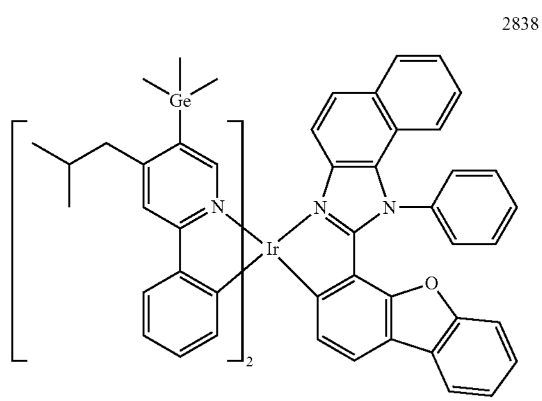

-continued
2839
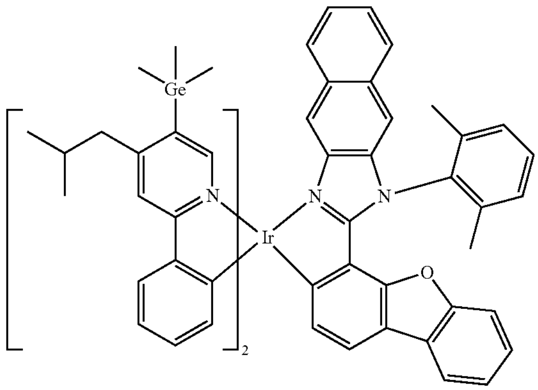
2840
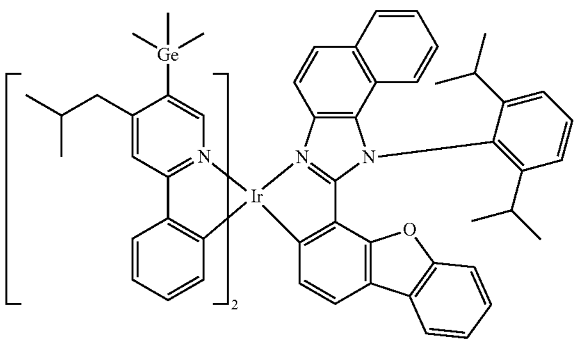
2841
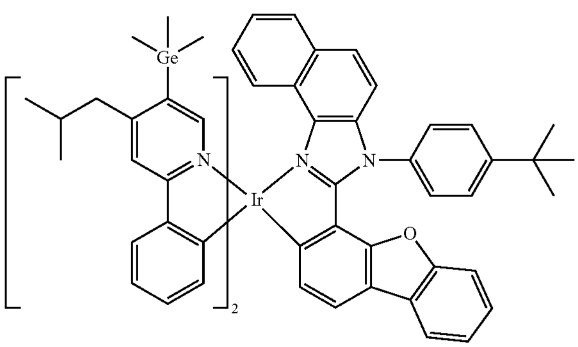
2842
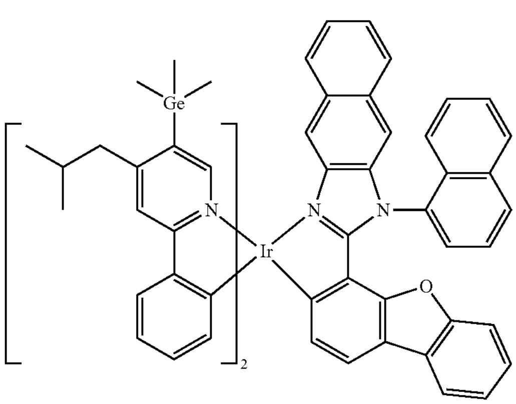
-continued
2843
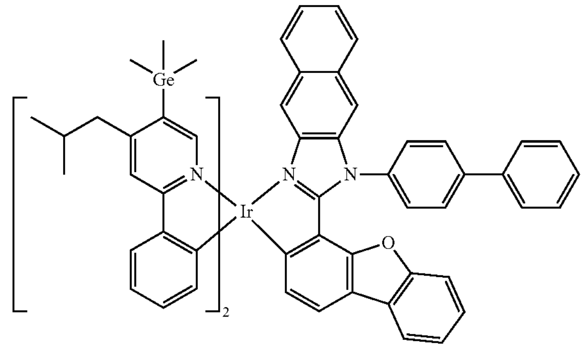
2844
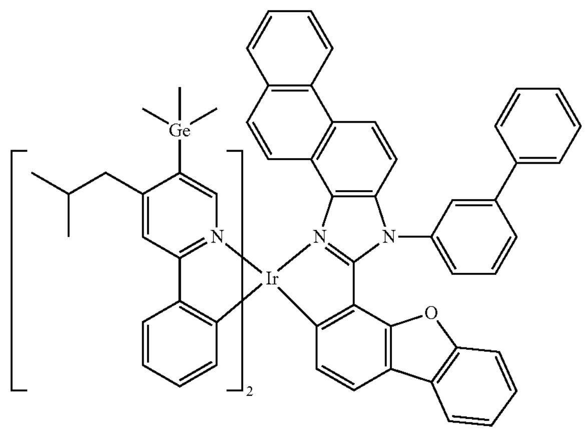
2845
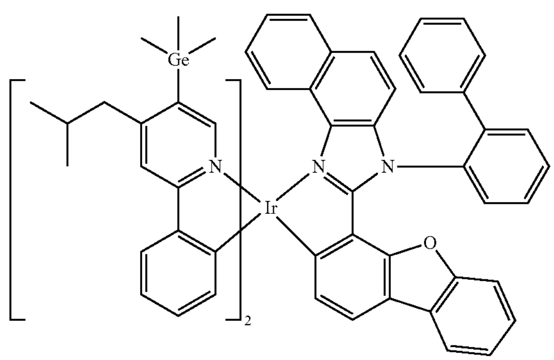
2846
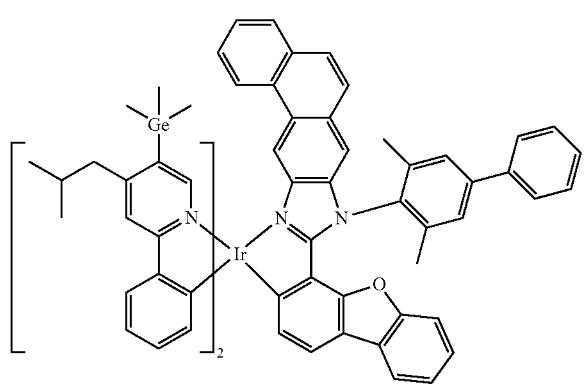

-continued
2847
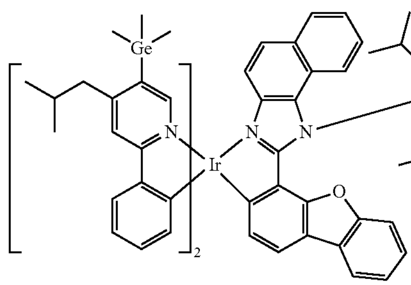
2848
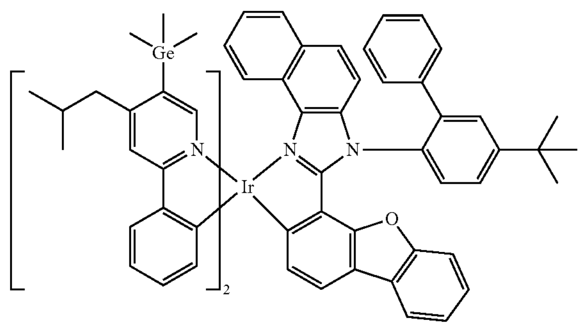
2849
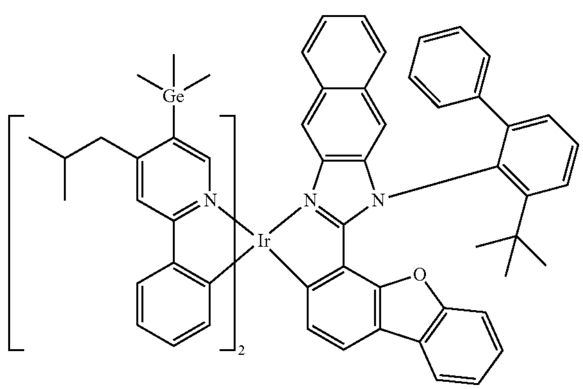
2850
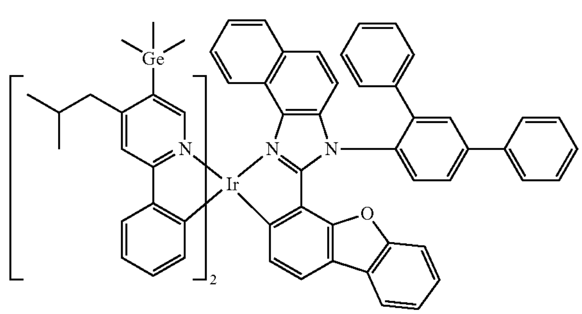
-continued
2851
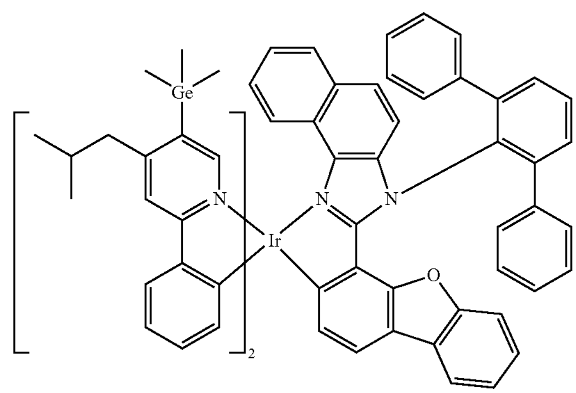
2852
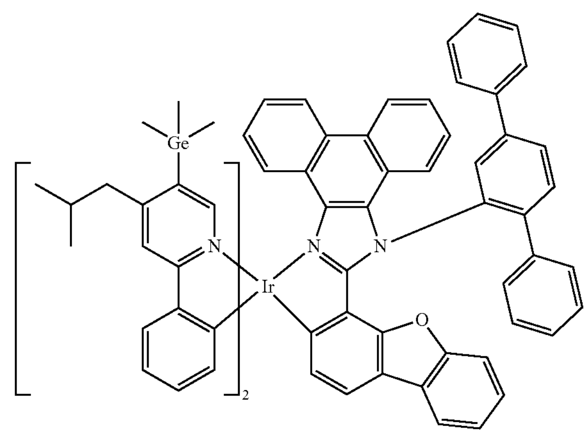
2853
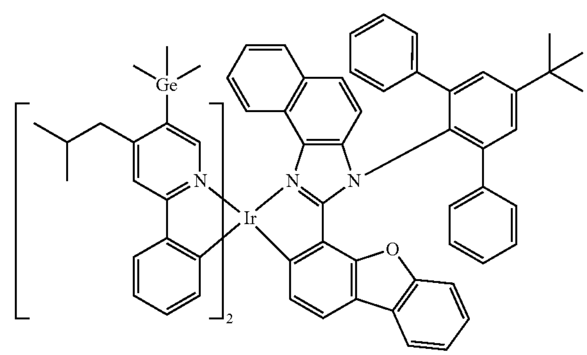
2854
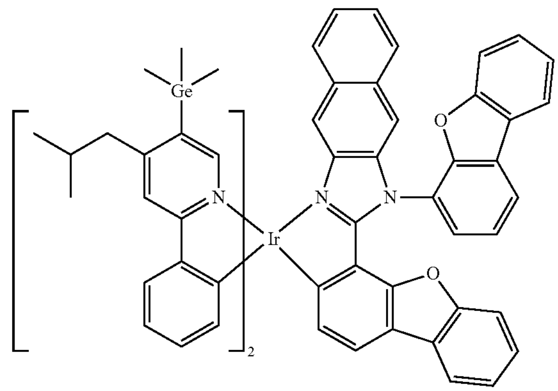

-continued
2855
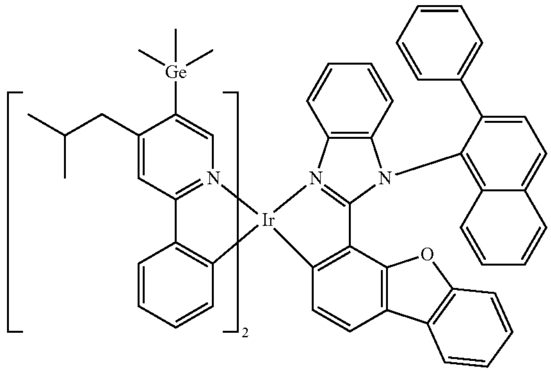
2856
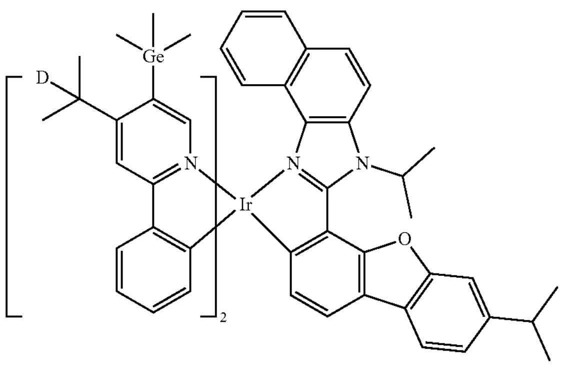
2857
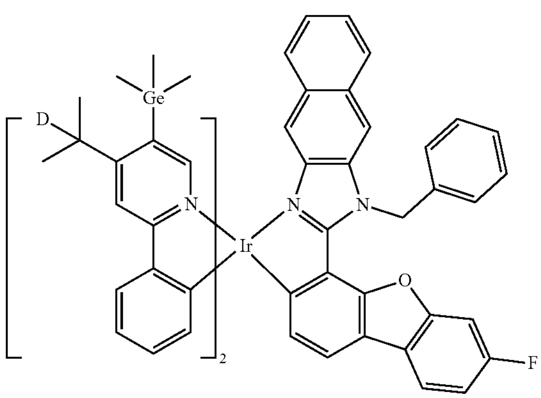
2858
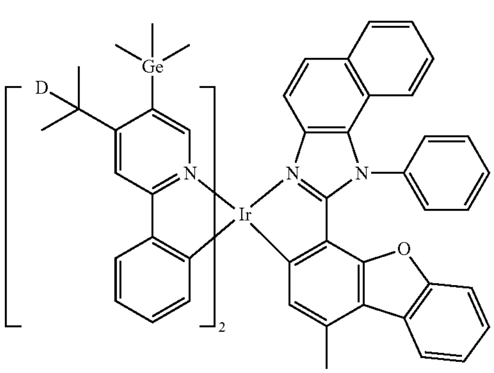
-continued
2859
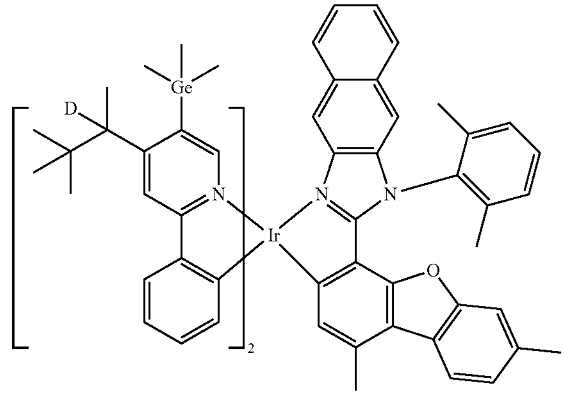
2860
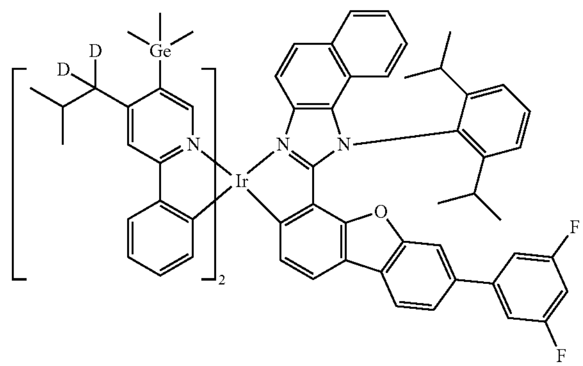
2861
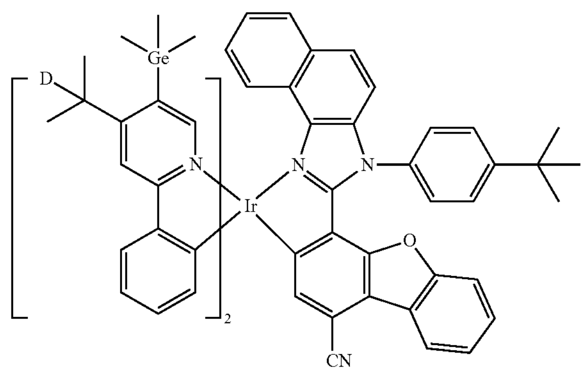
2862
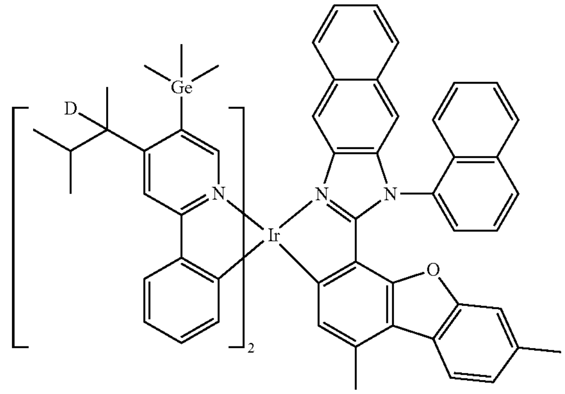

-continued
2863
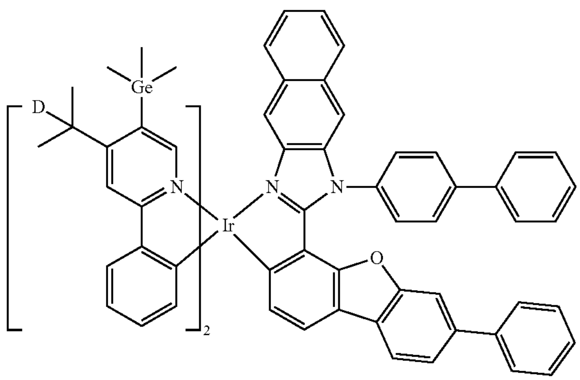
2864
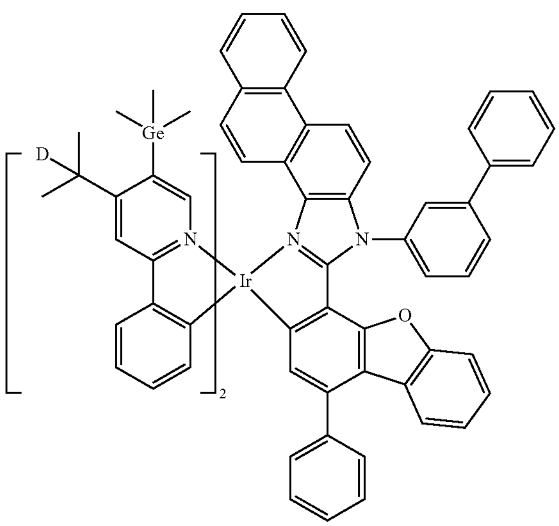
2865
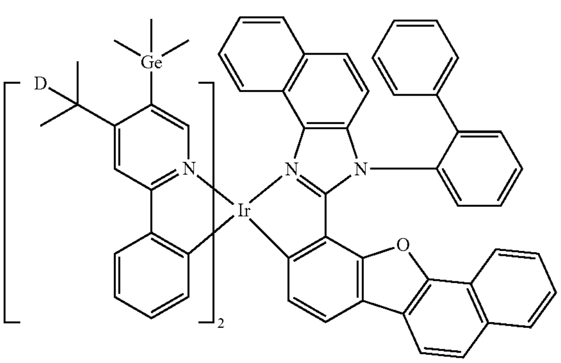
2866
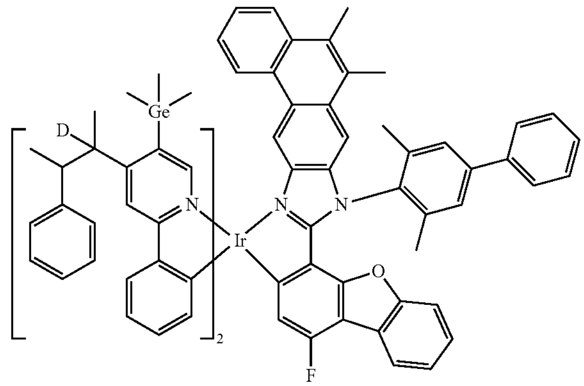
2867
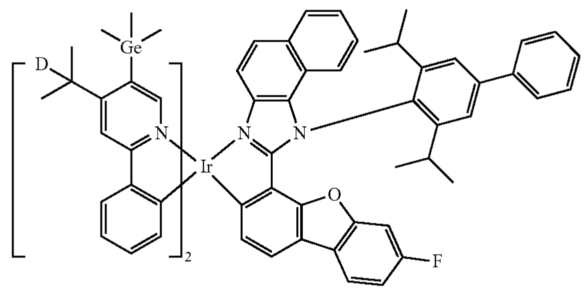
2868
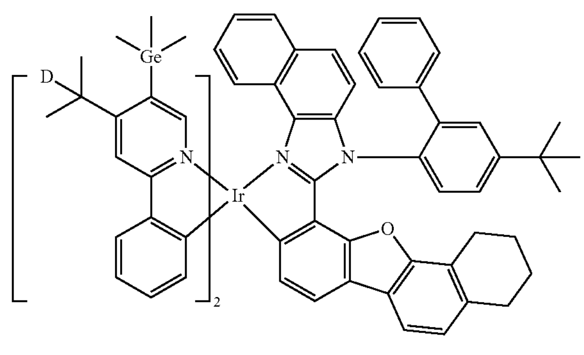
2869
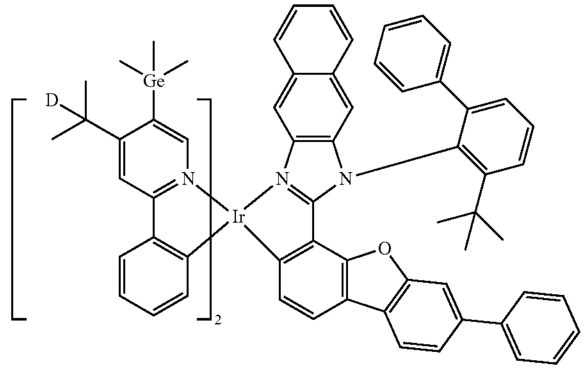

-continued
2870
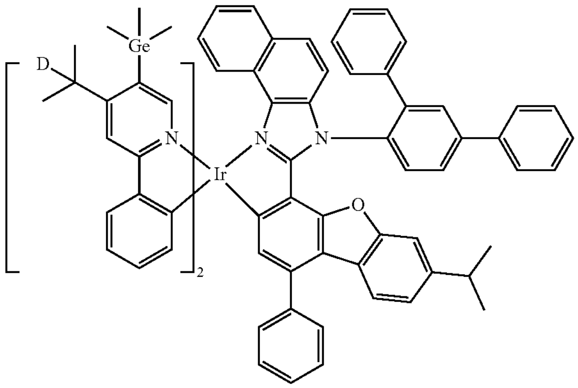
2871
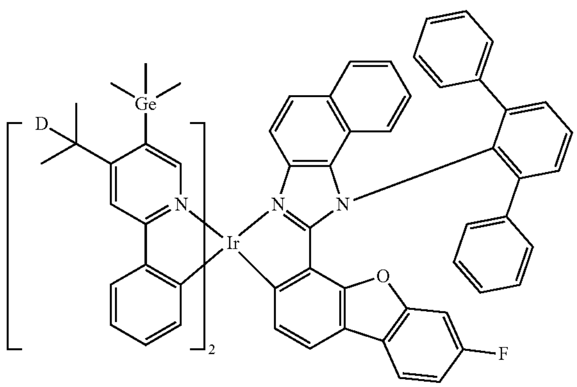
2872
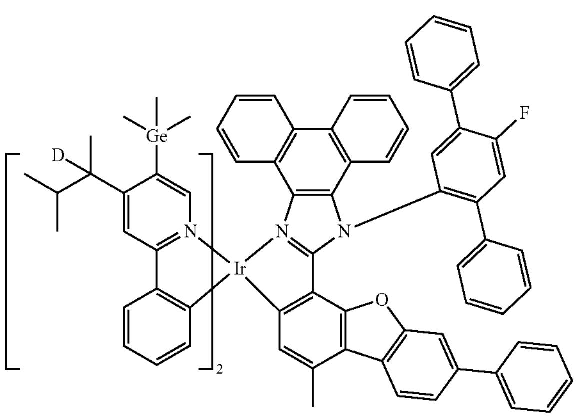
2873
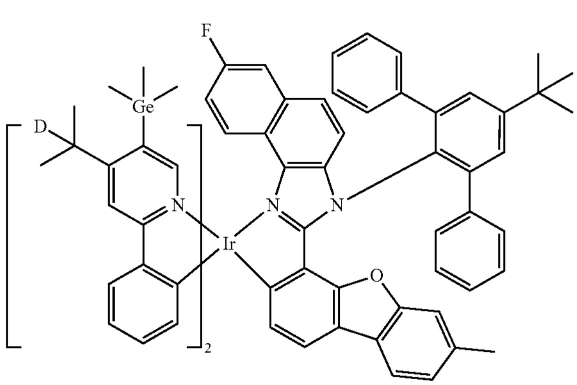
-continued
2874
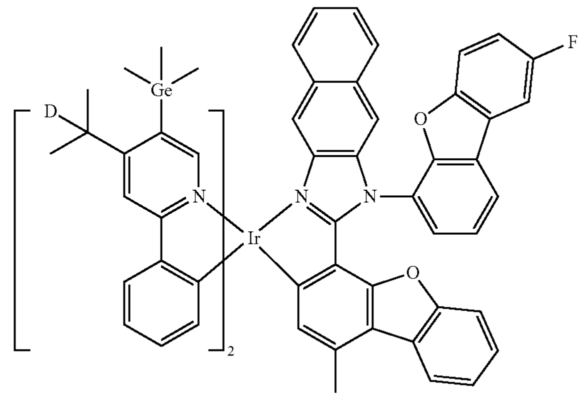
2875
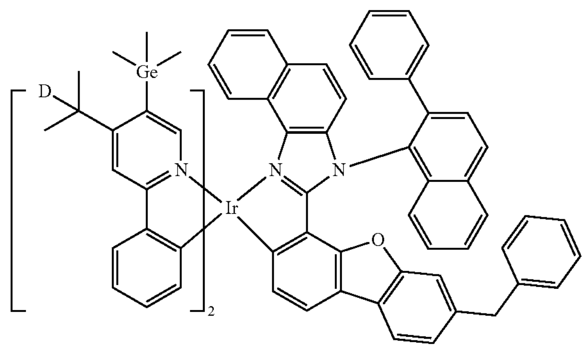
2876
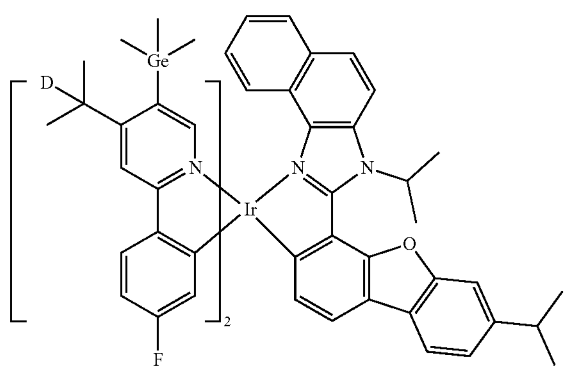
2877
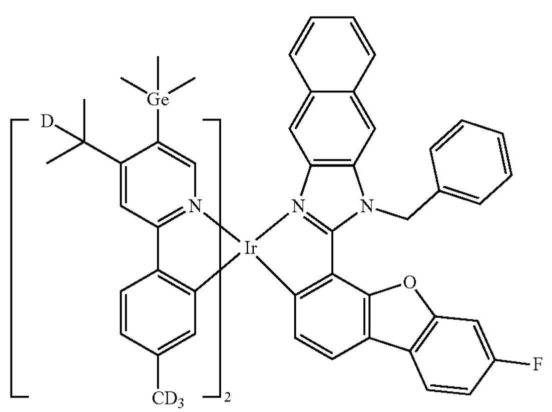

-continued
2878
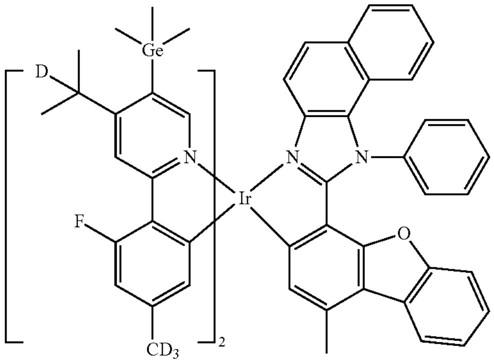
2879
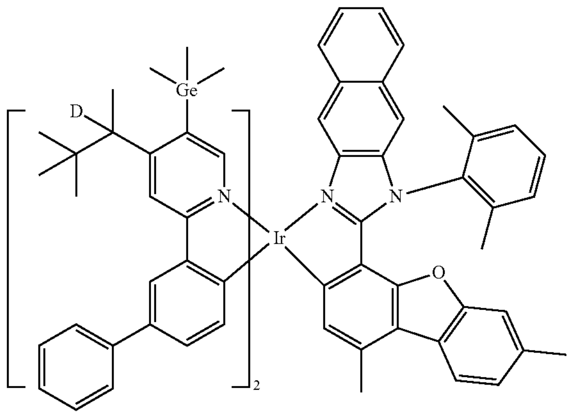
2880
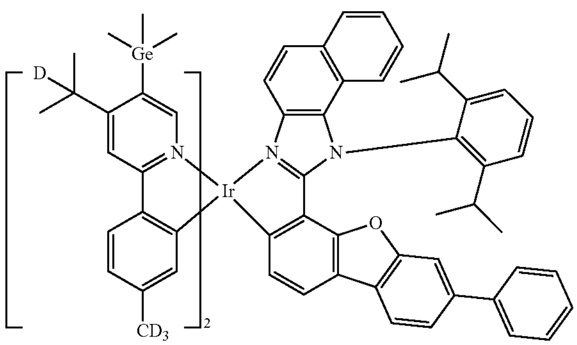
2881
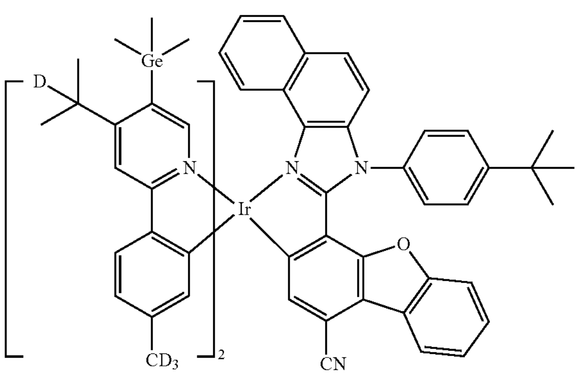
-continued
2882
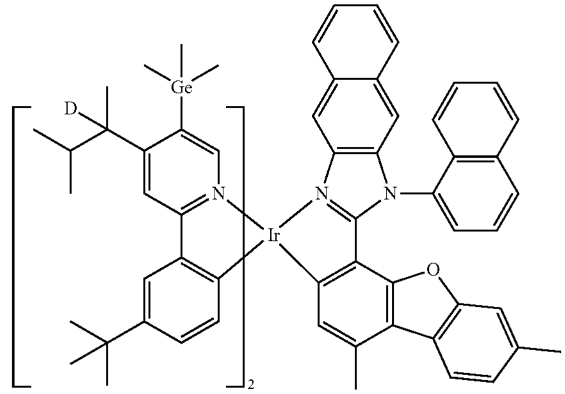
2883
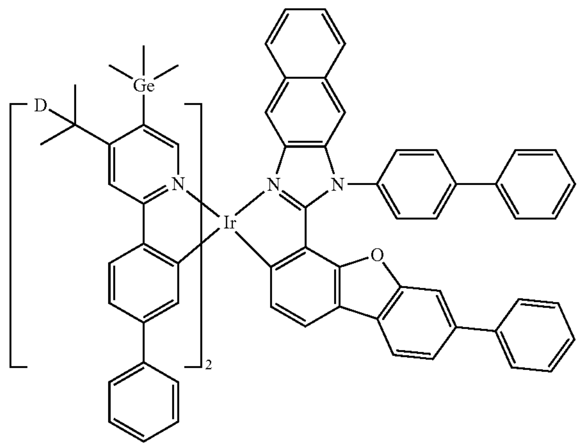
2884
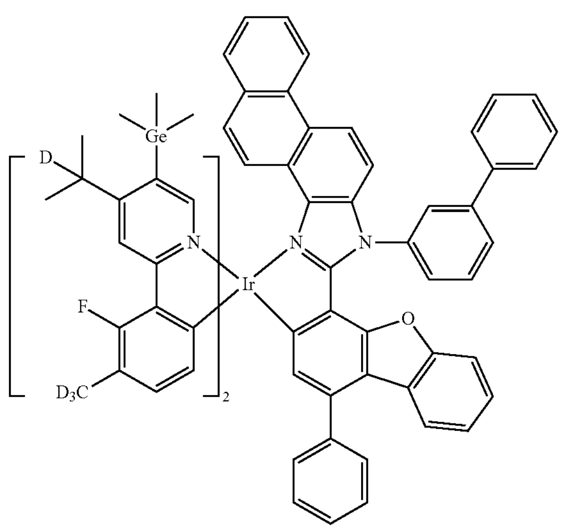

-continued
2885
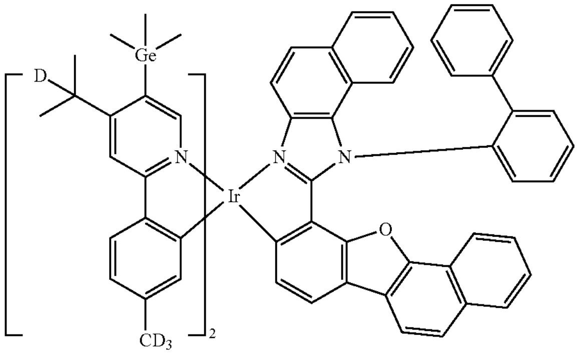
2886
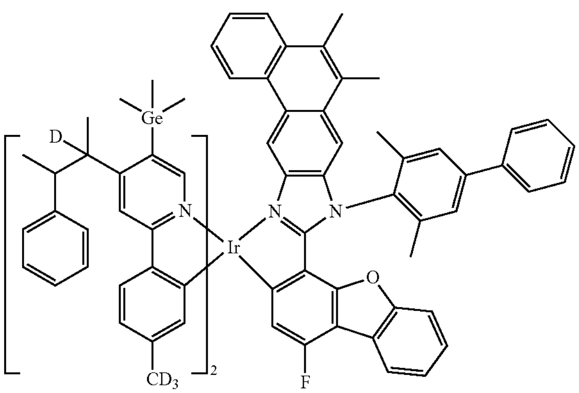
2887
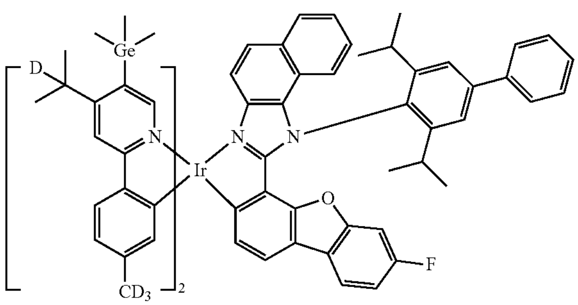
2888
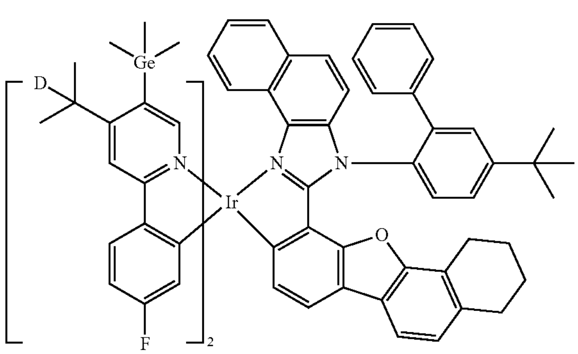
-continued
2889
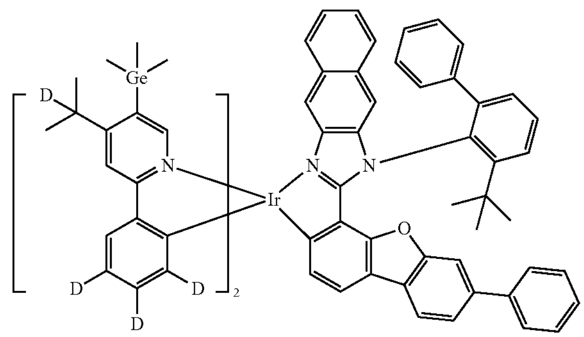
2890
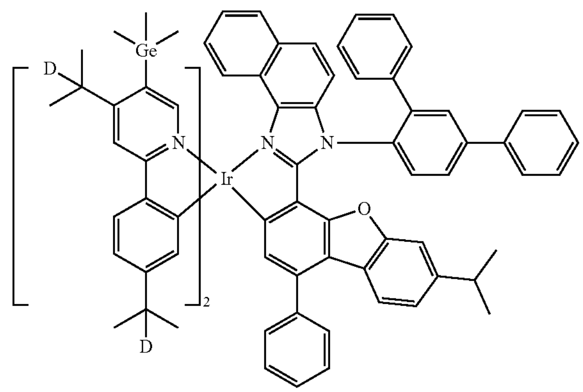
2891
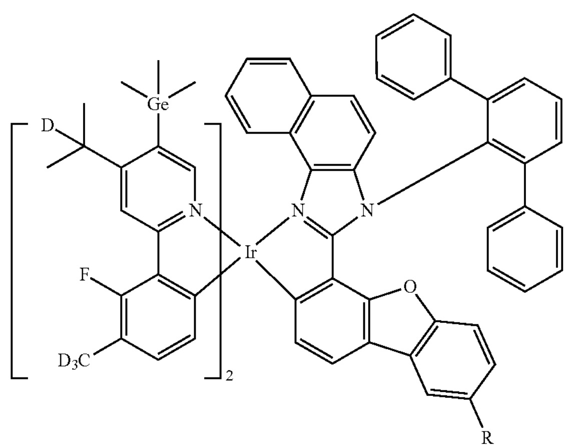
2892
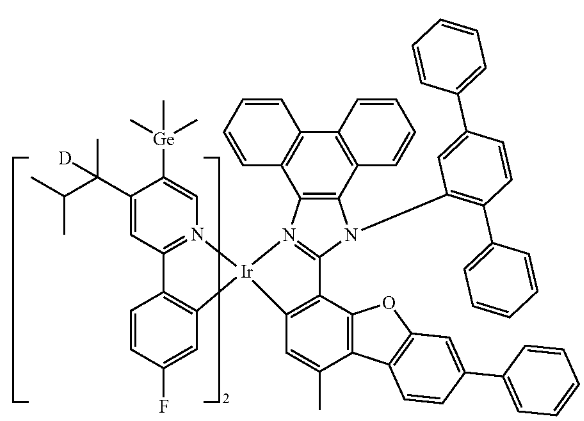

-continued
2893
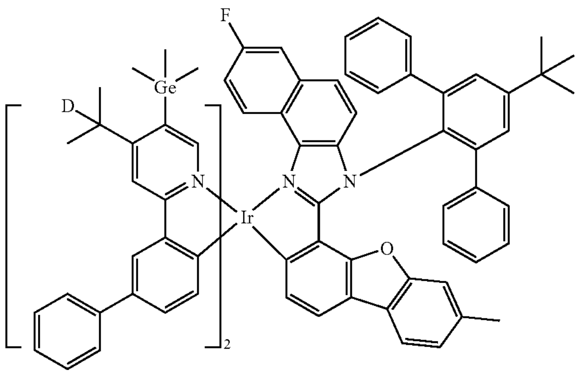
2894
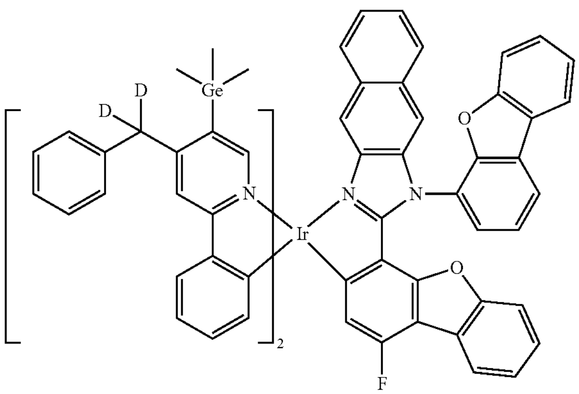
2895
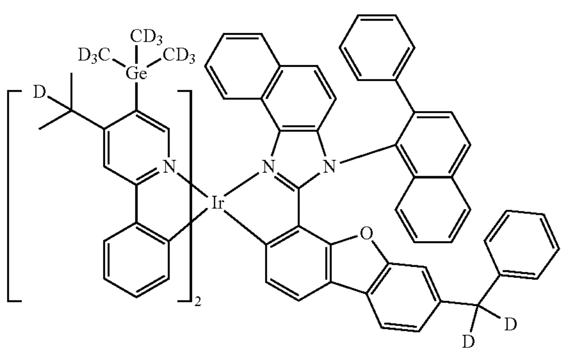
2896
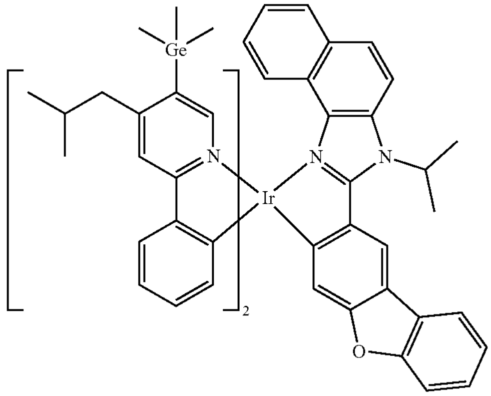
-continued
2897
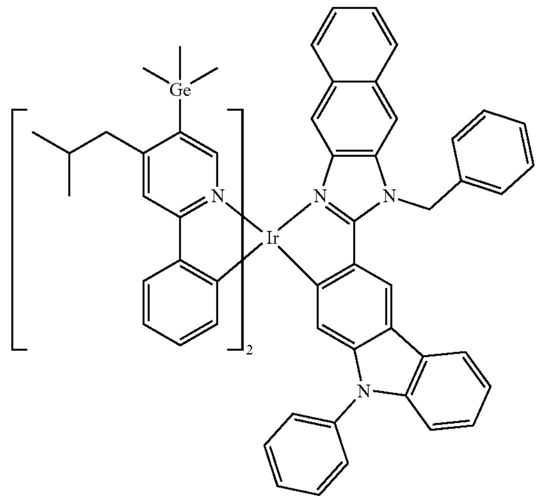
2898
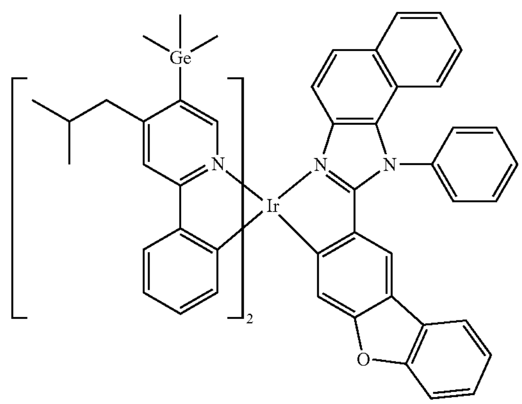
2899
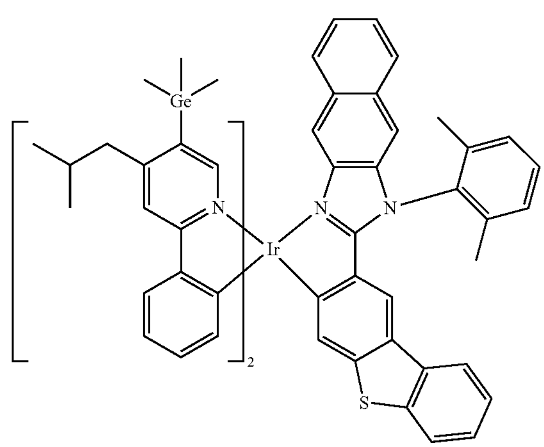

-continued
2900
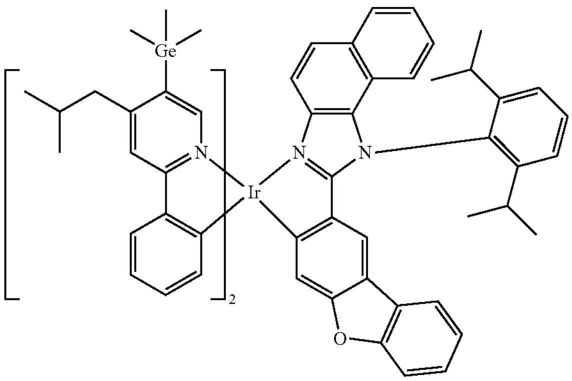
2901
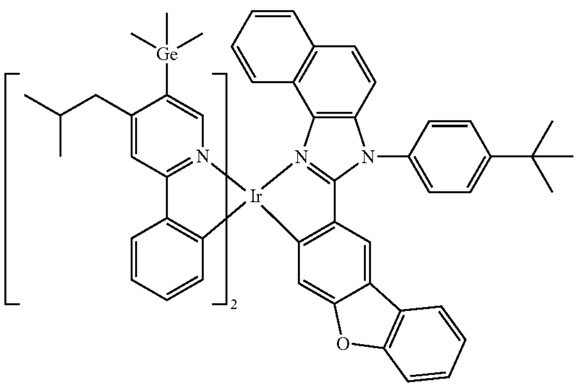
2902
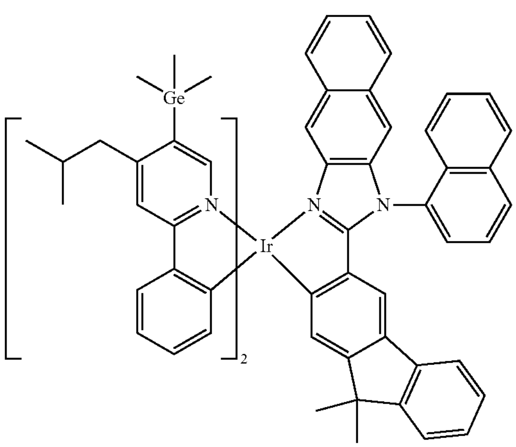
-continued
2903
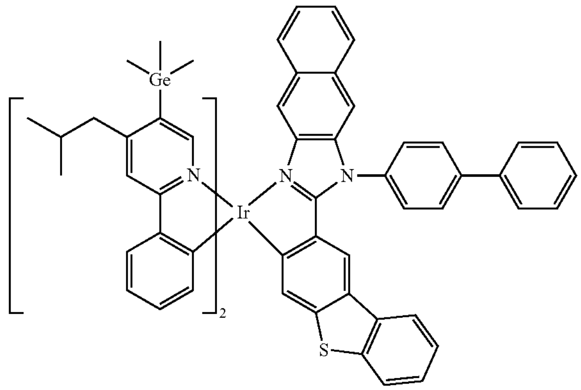
2904
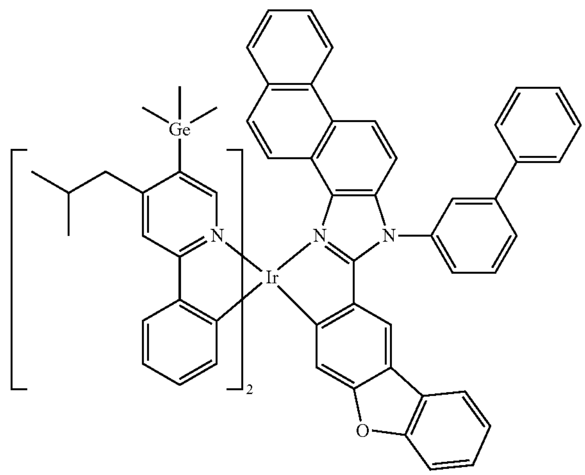
2905
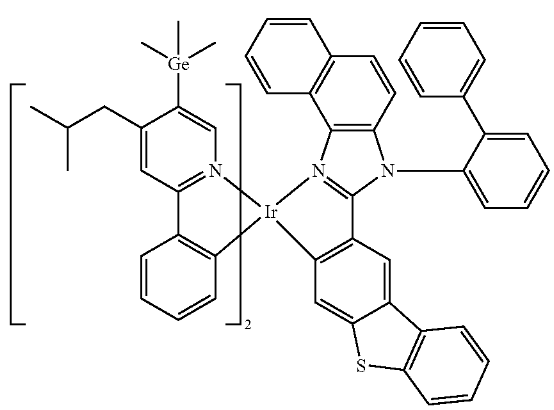

-continued
2906
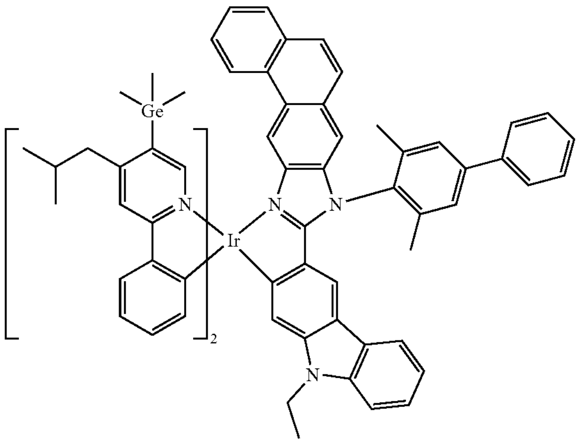
2907
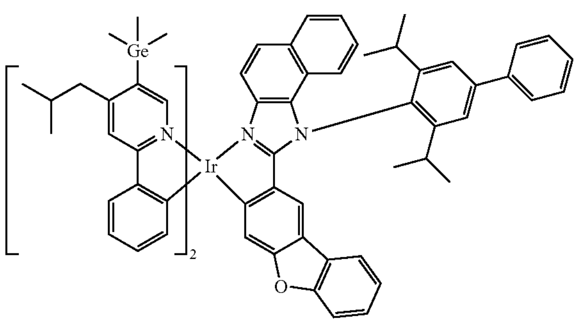
2908
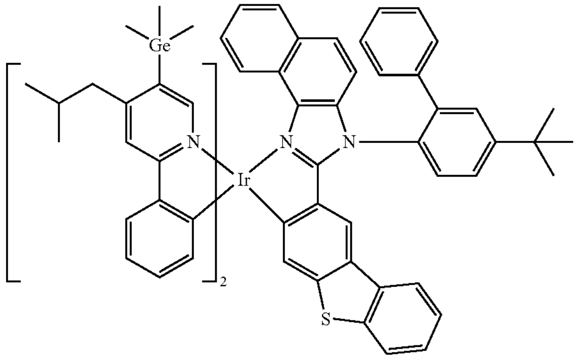
-continued
2909
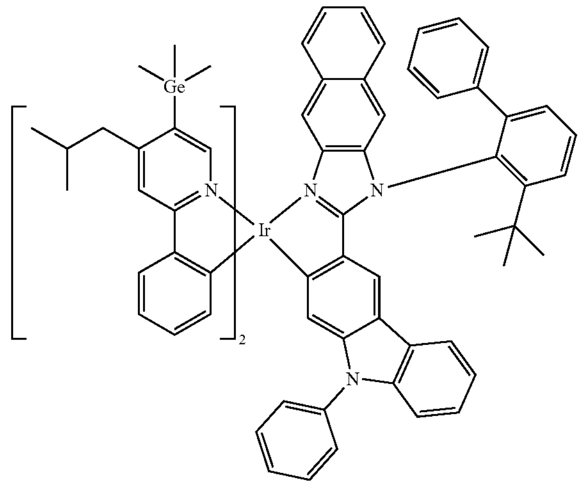
2910
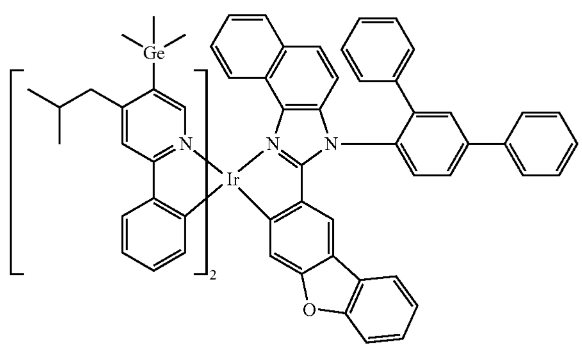
2911
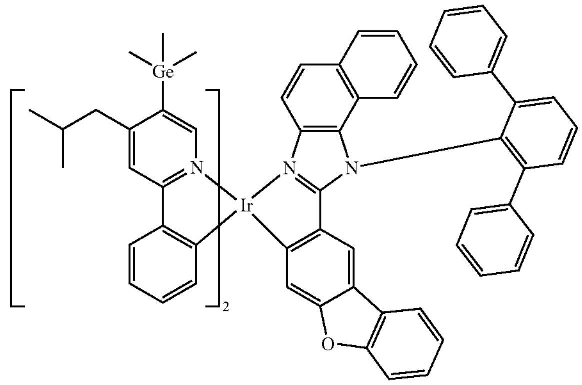

-continued
2912
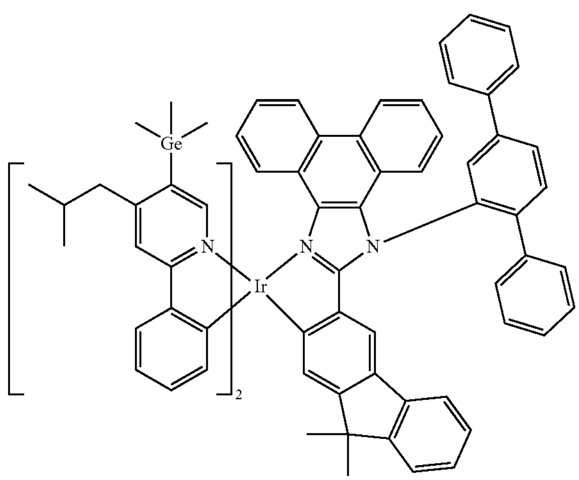
2913
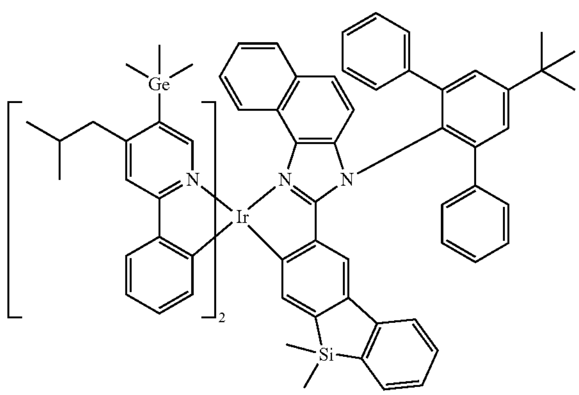
2914
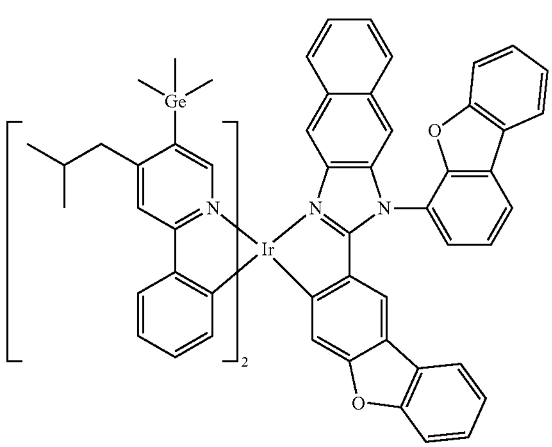
-continued
2915
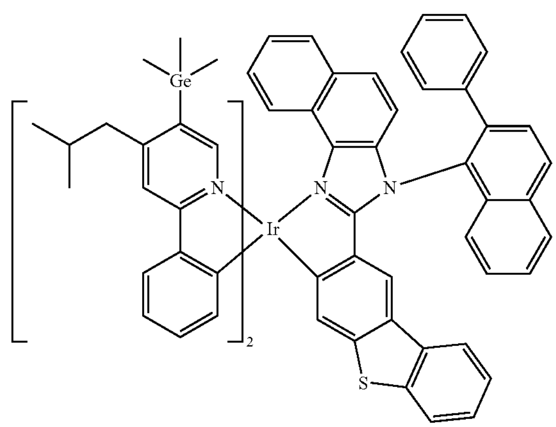
2916
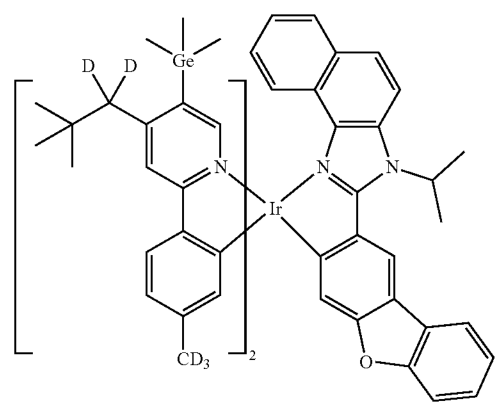
2917
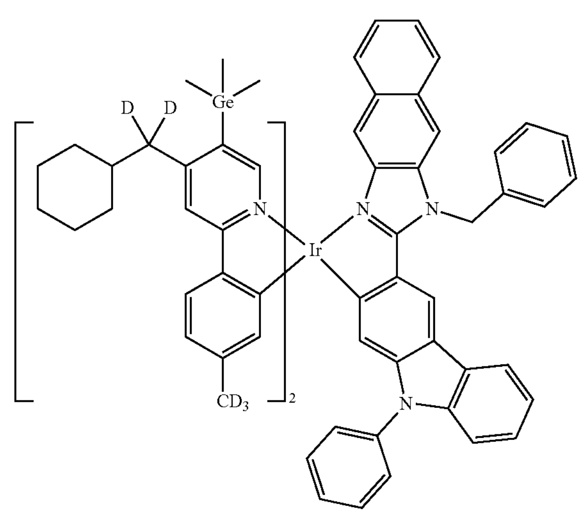

-continued
2918
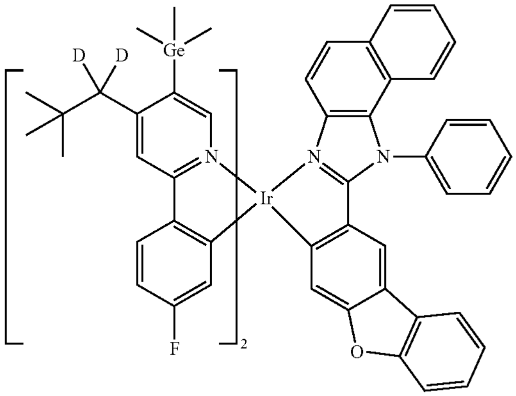
2919
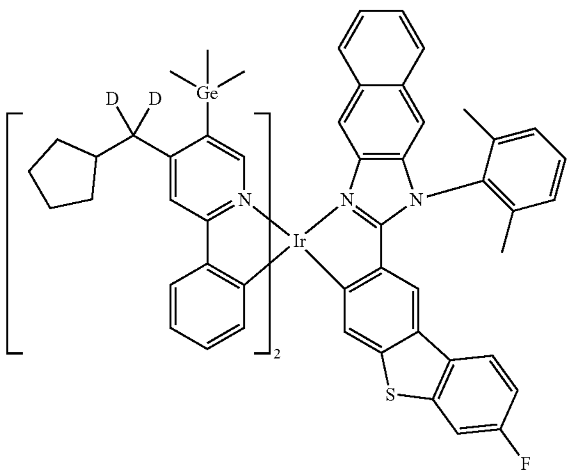
2920
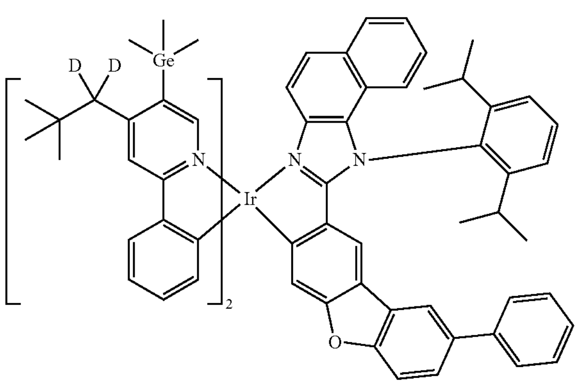
-continued
2921
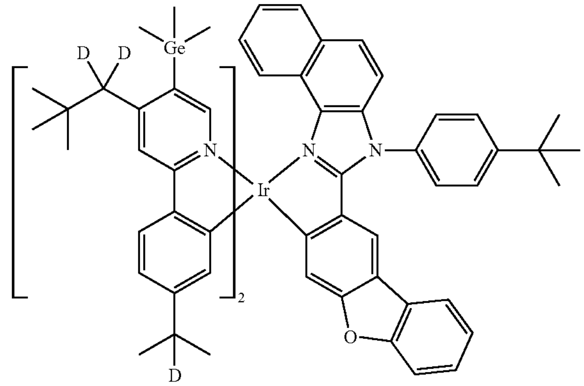
2922
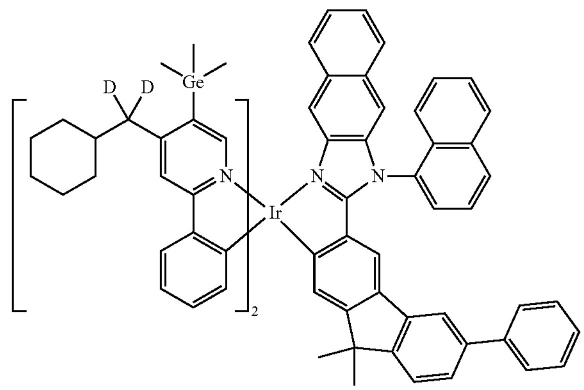
2923
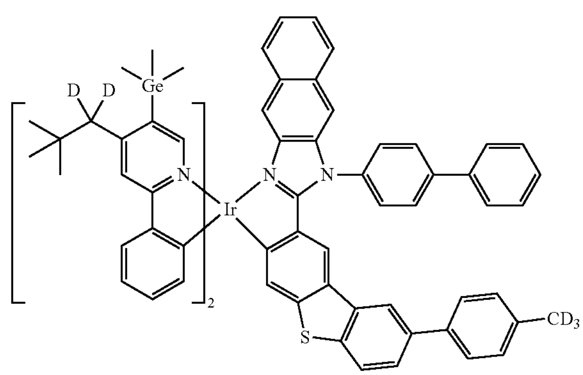

2924
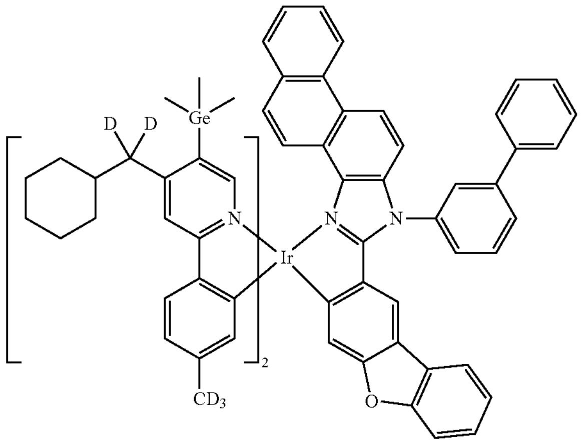
2925
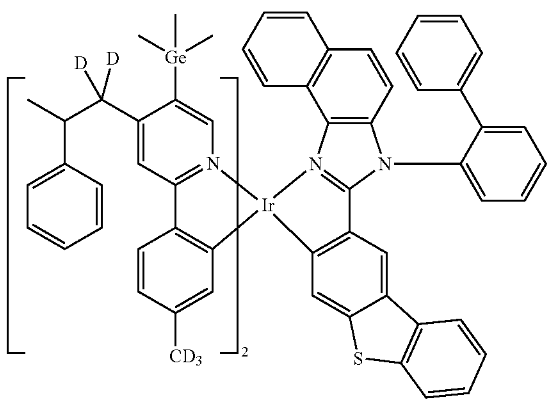
2926
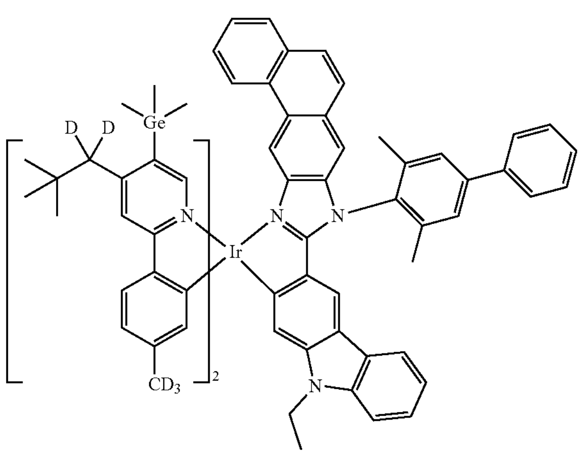
2927
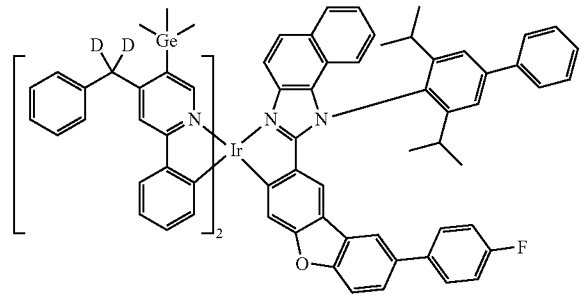
2928
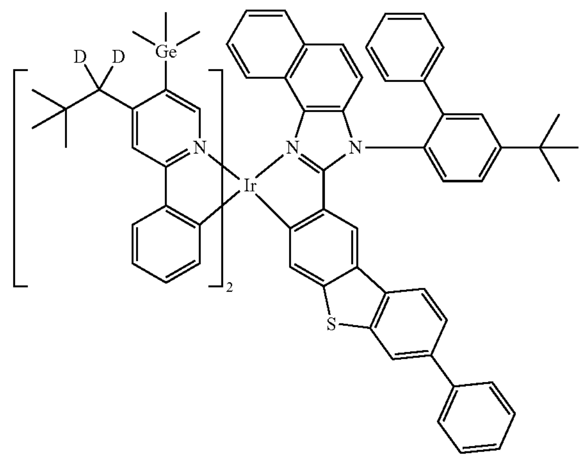
2929
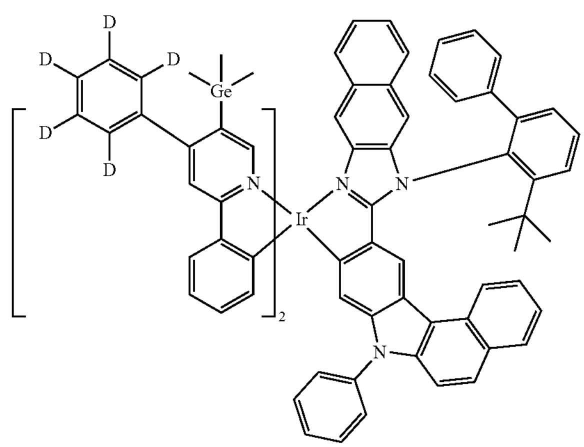
2930
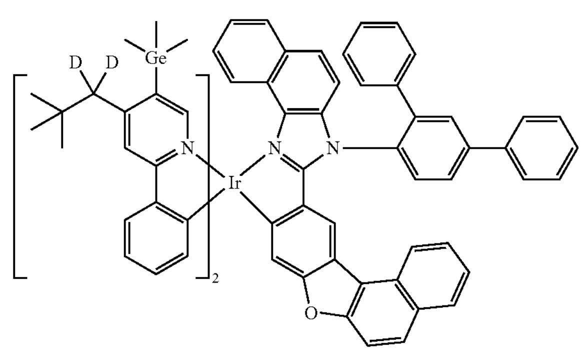

-continued
2931
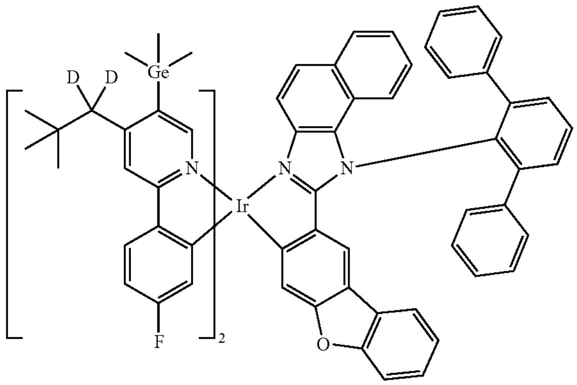
2932
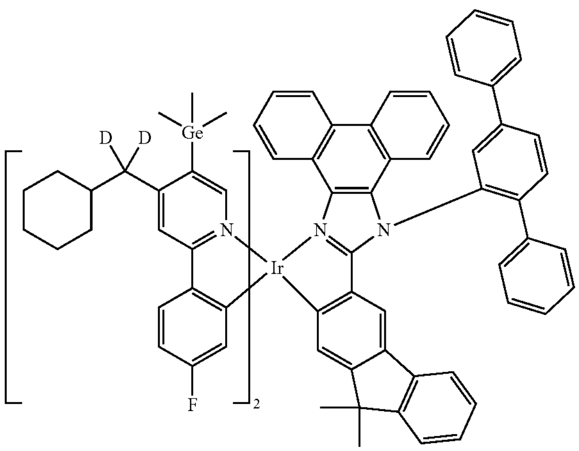
2933
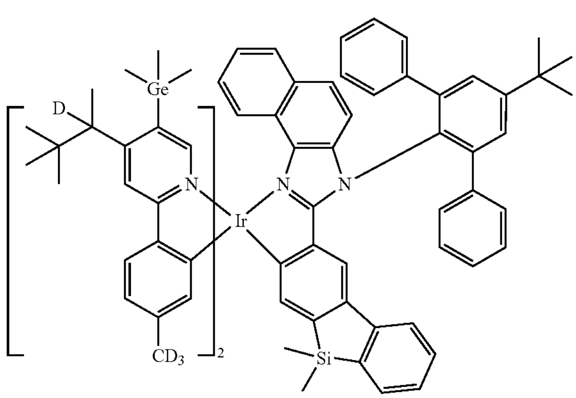
-continued
2934
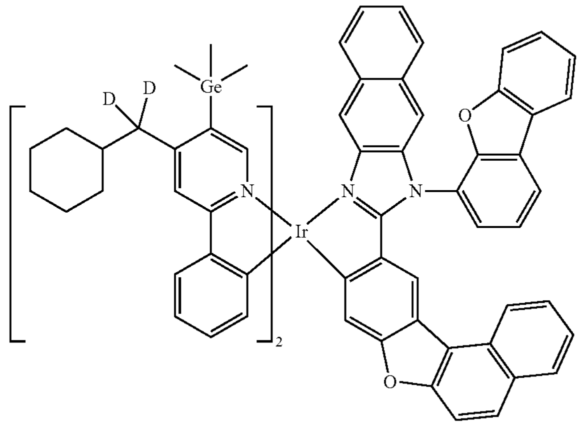
2935
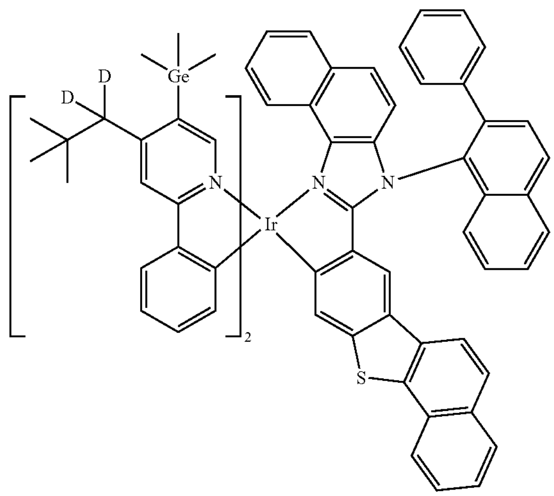
2936
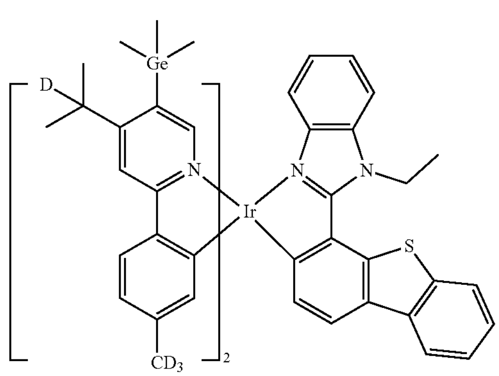

-continued
2937
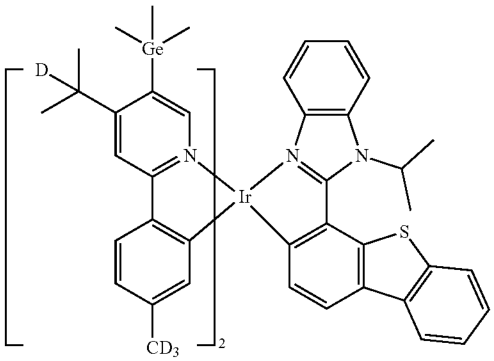
2938
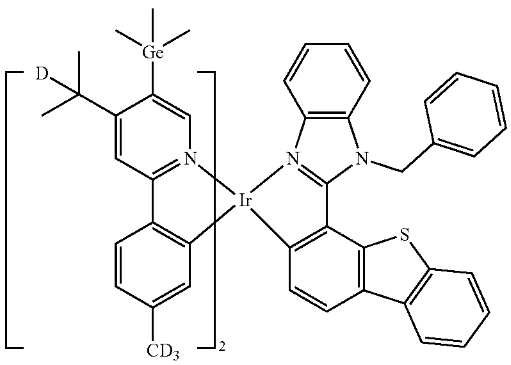
2939
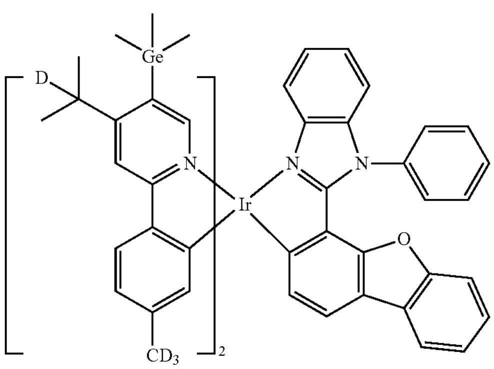
2940
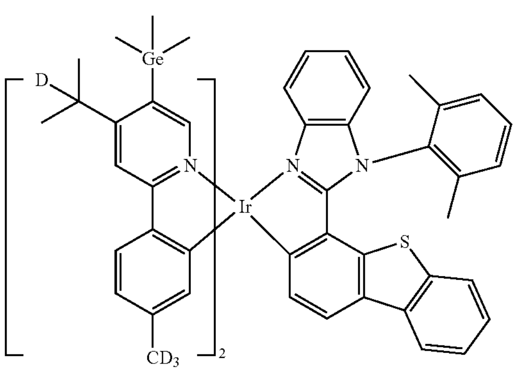
-continued
2941
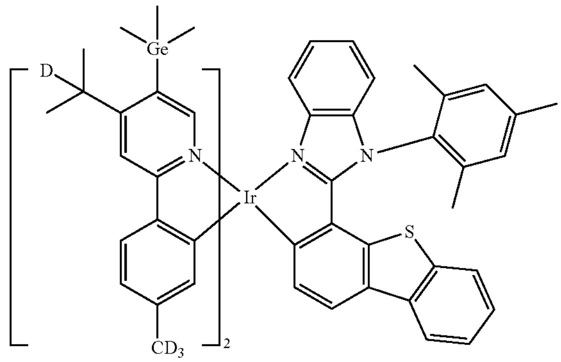
2942
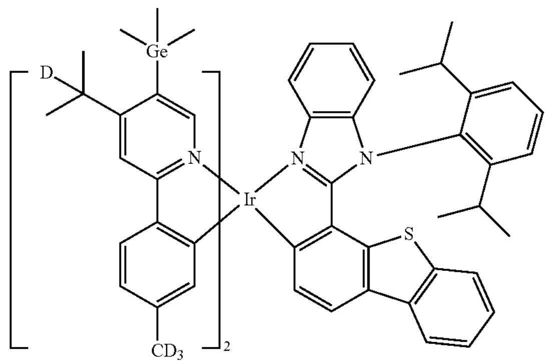
2943
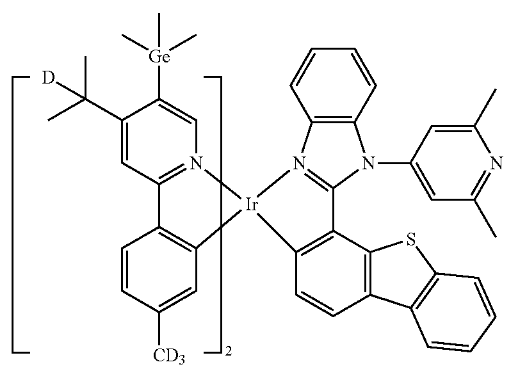
2944
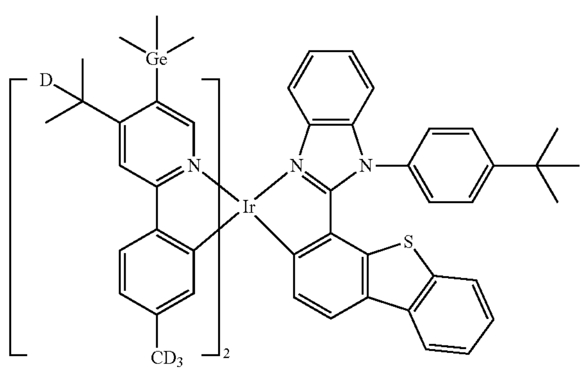

2945
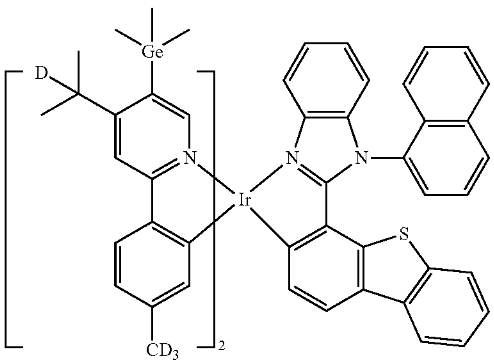
2946
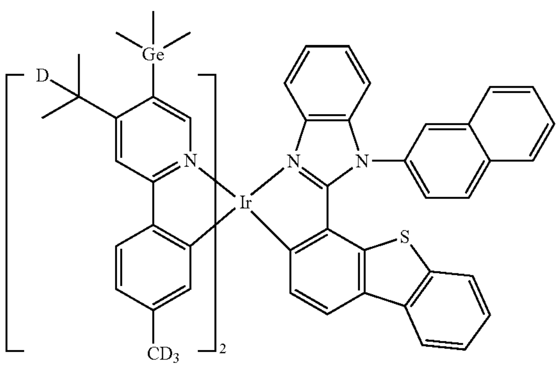
2947
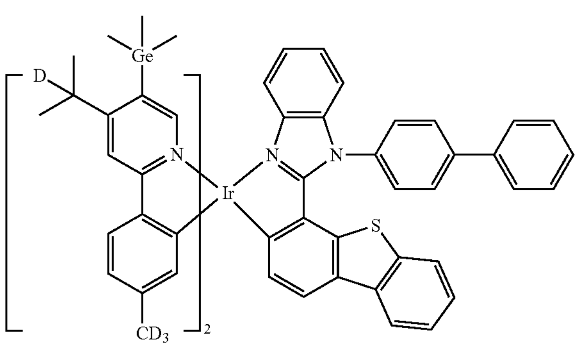
2948
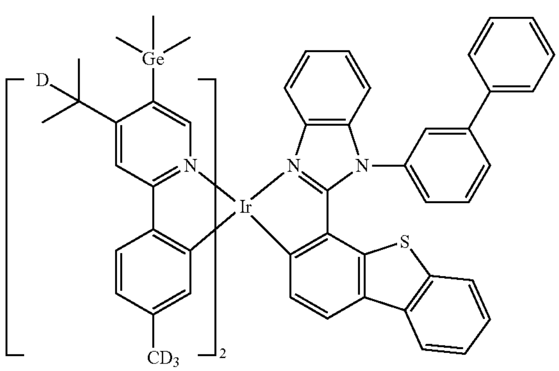
2949
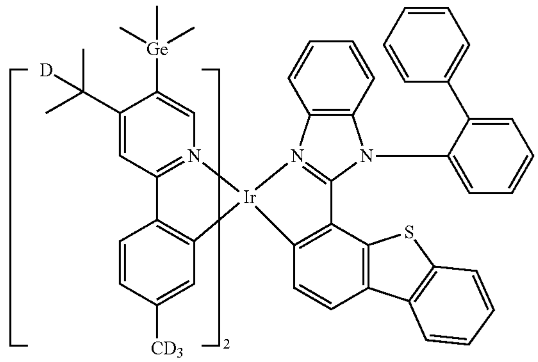
2950
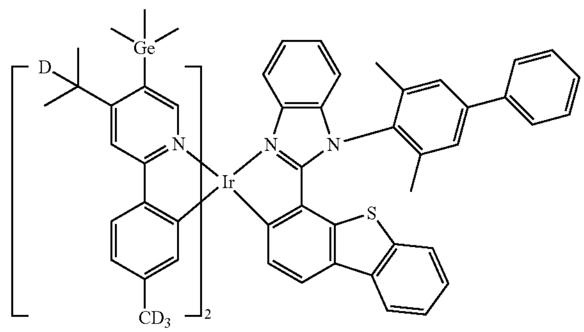
2951
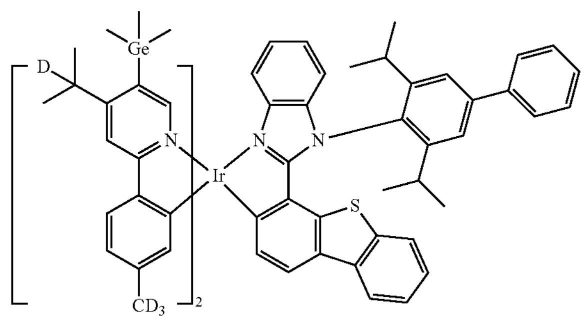
2952
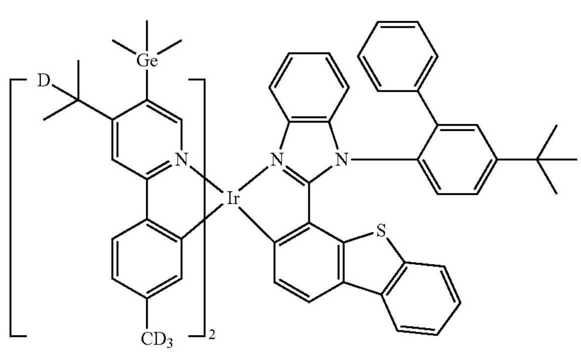

-continued
2953
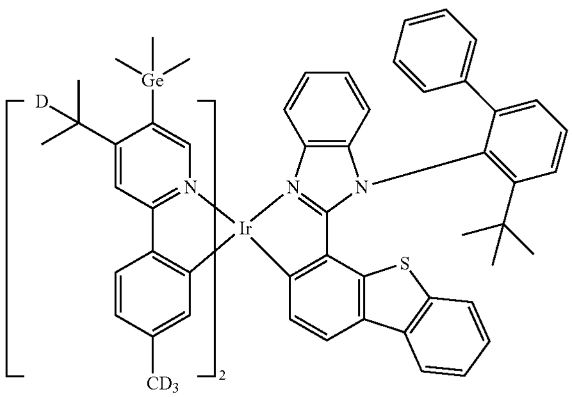
2954
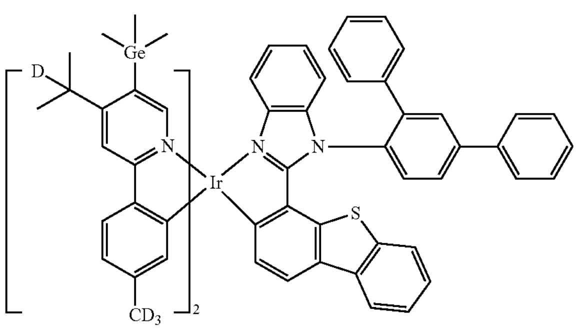
2955
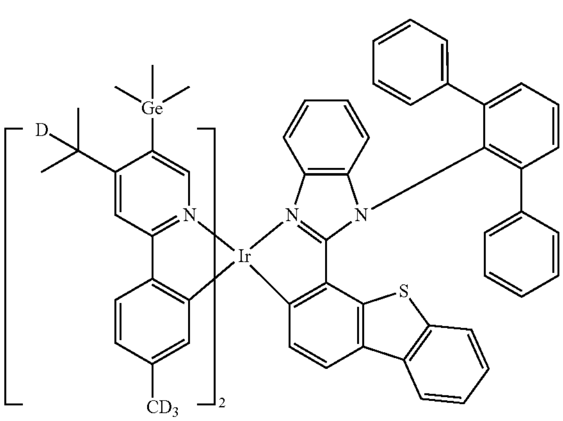
-continued
2956
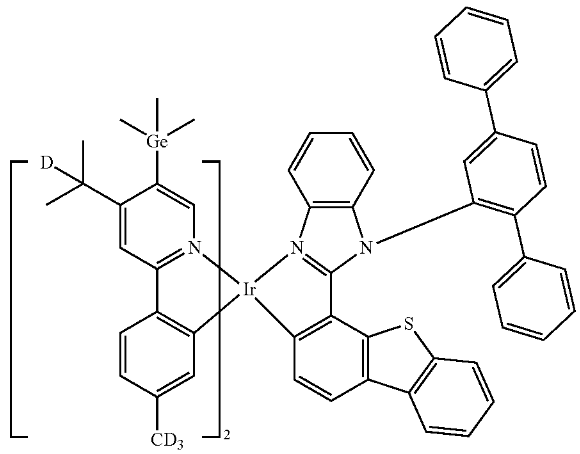
2957
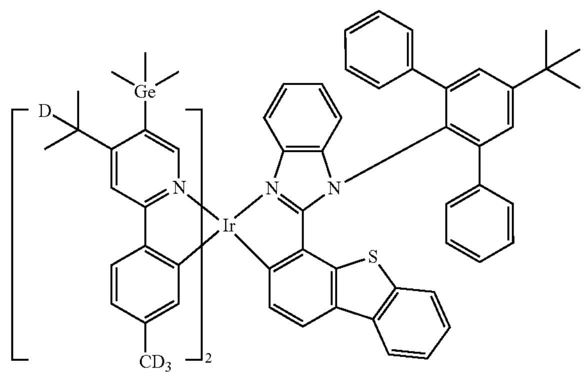
2958
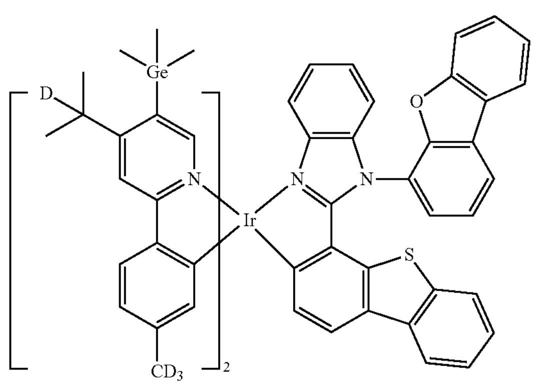
2959
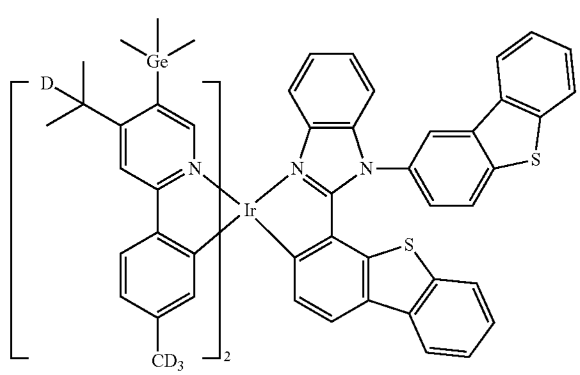

2960
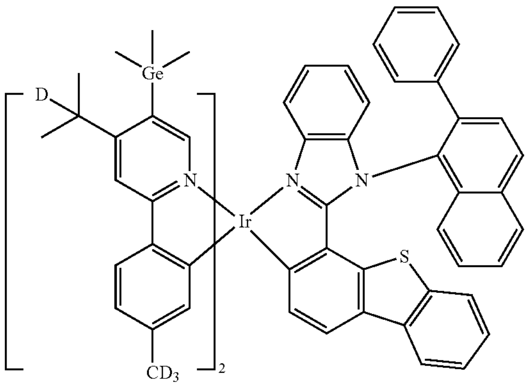
2961
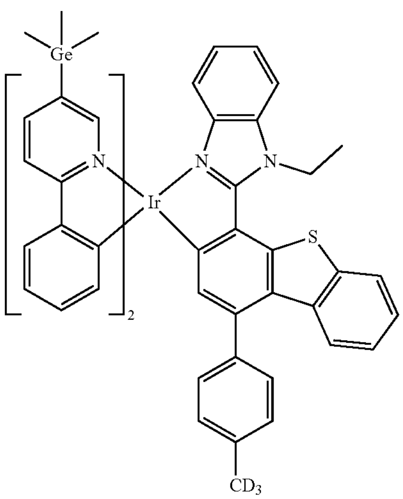
2962
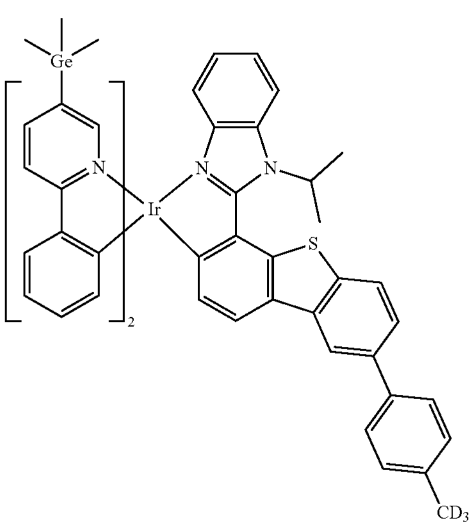
2963
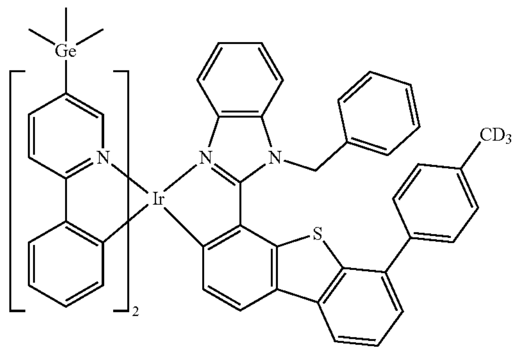
2964
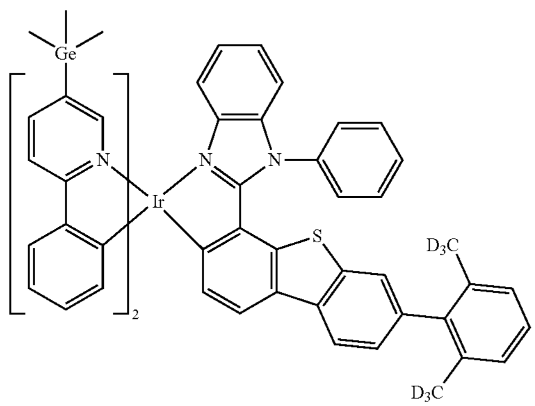
2965
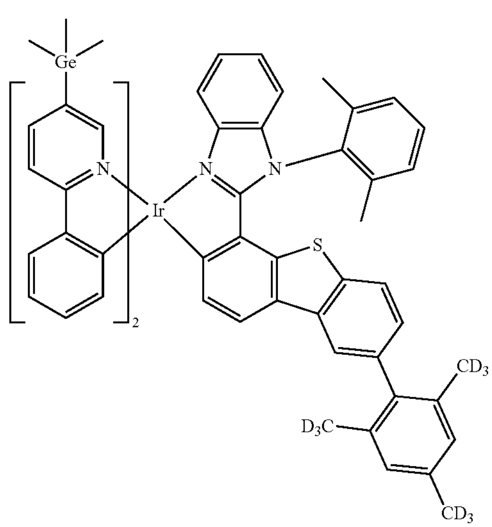

-continued
2966
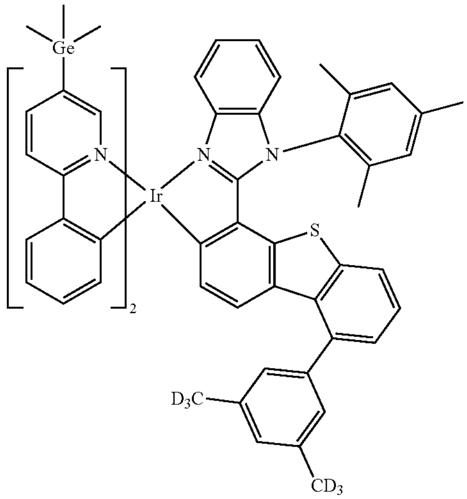
2967
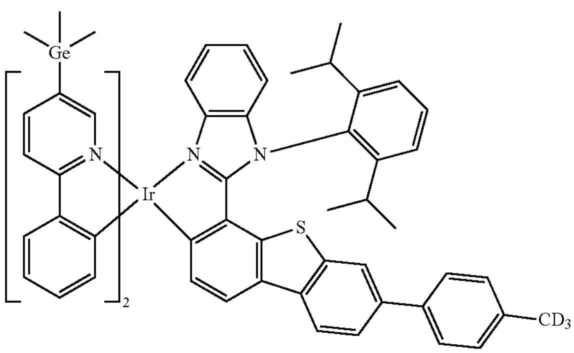
2968
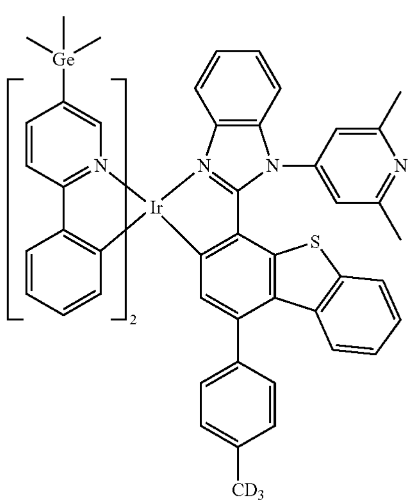
-continued
2969
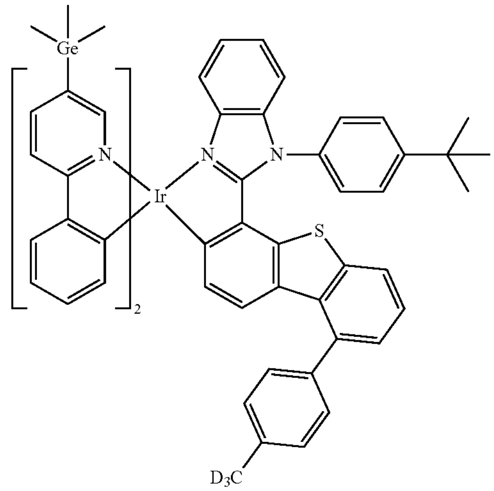
2971
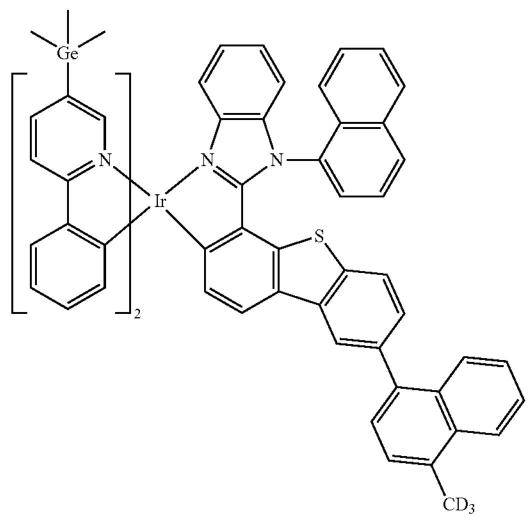
2971
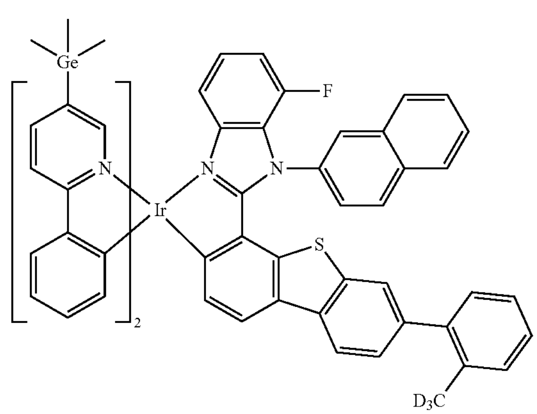

-continued
2972
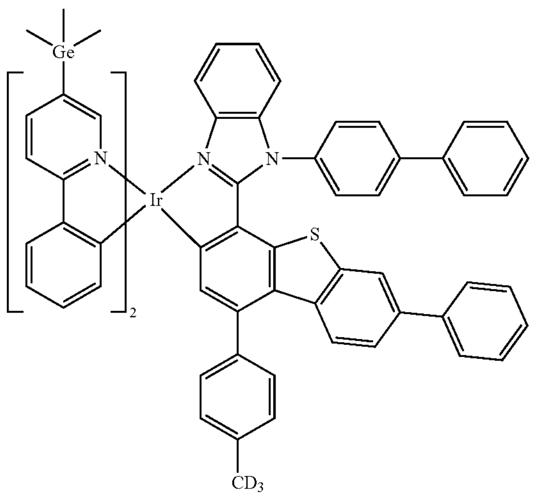
2973
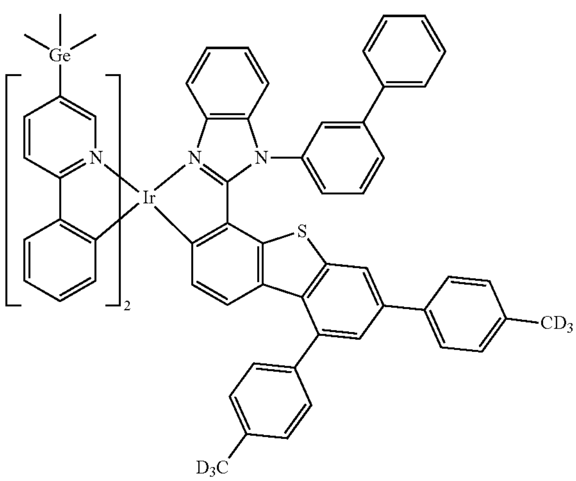
2974
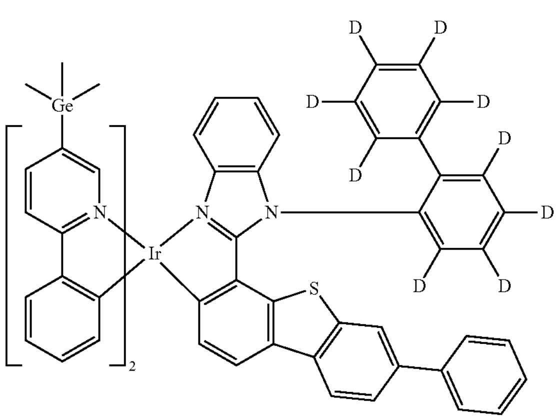
-continued
2975
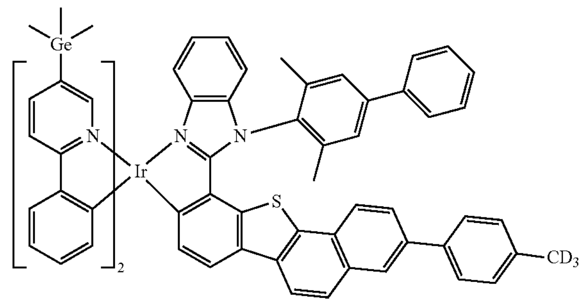
2976
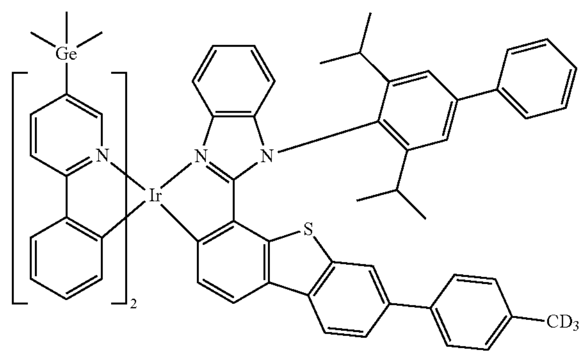
2977
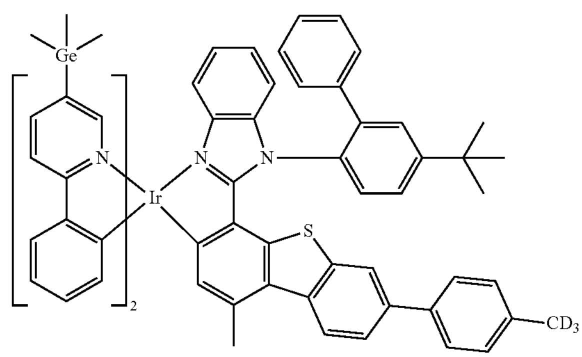
2978
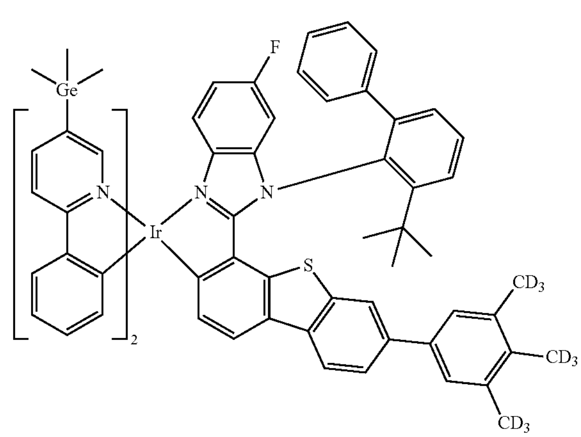

2979
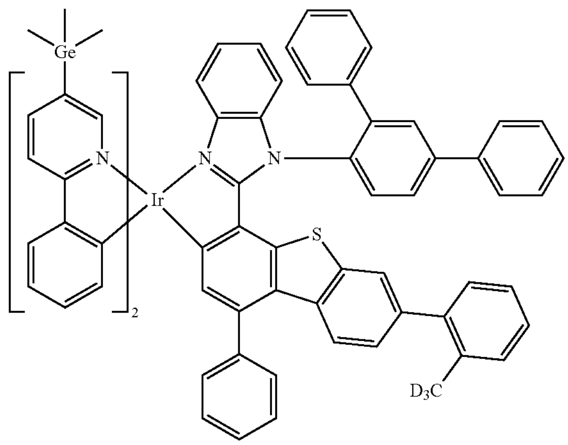
2980
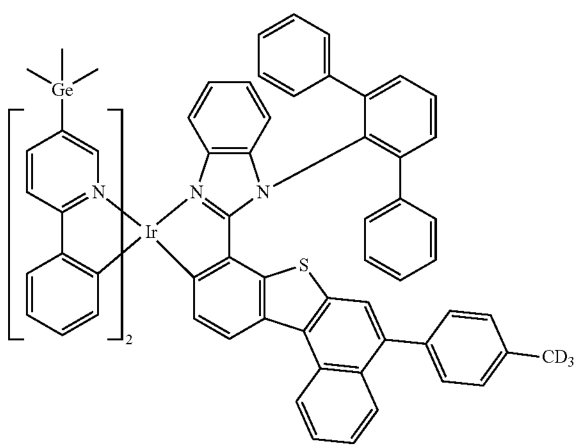
2981
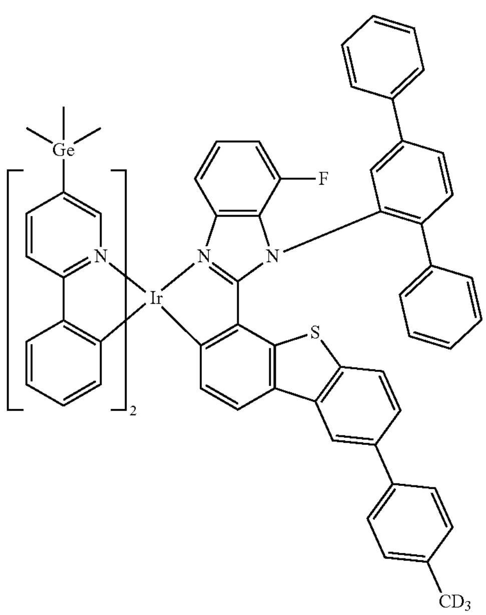
2982
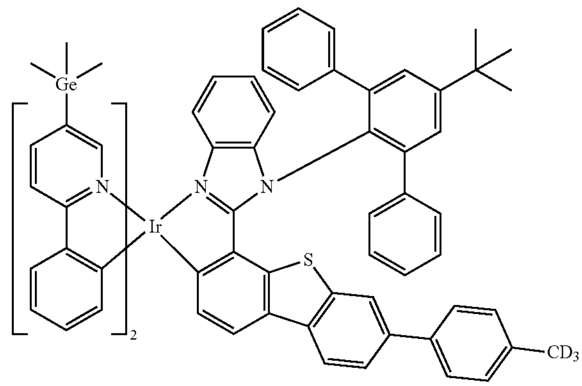
2983
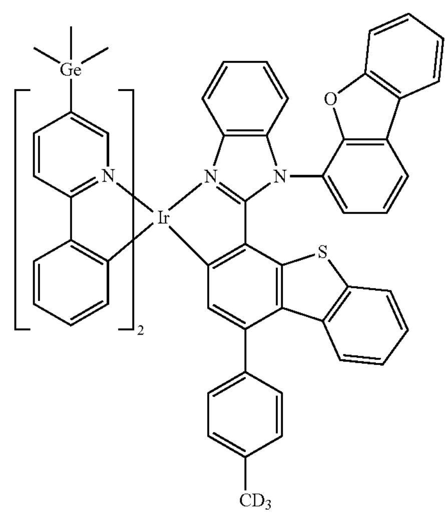
2984
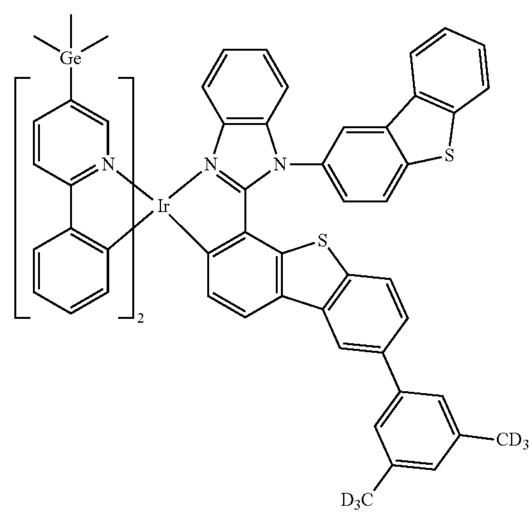

-continued
2985
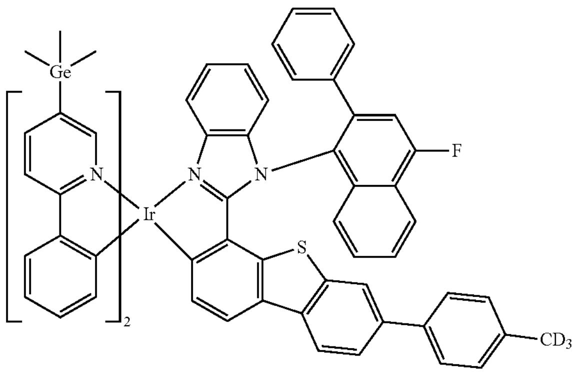
2986
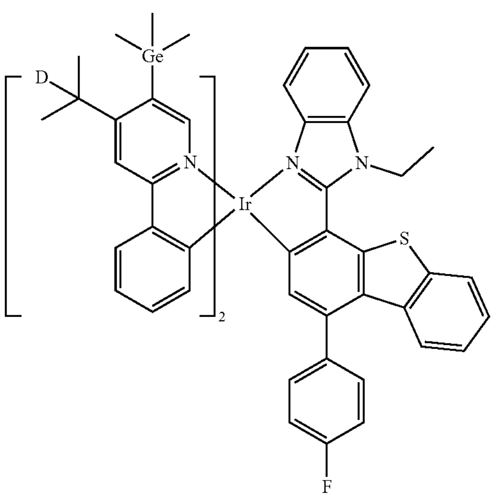
2987
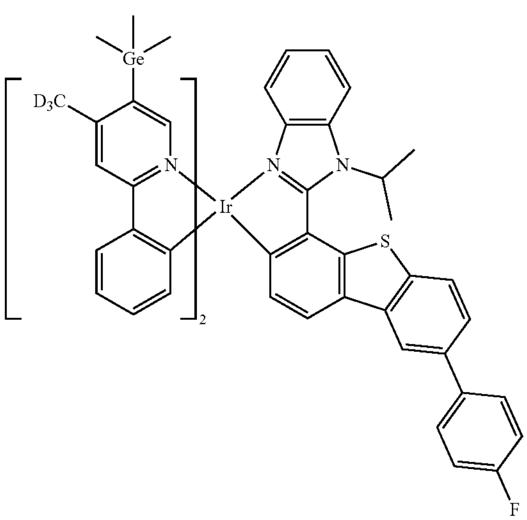
-continued
2988
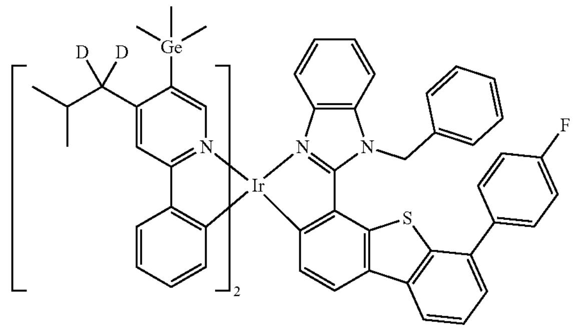
2989
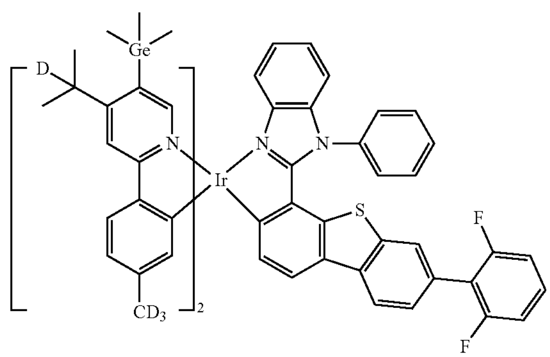
2990
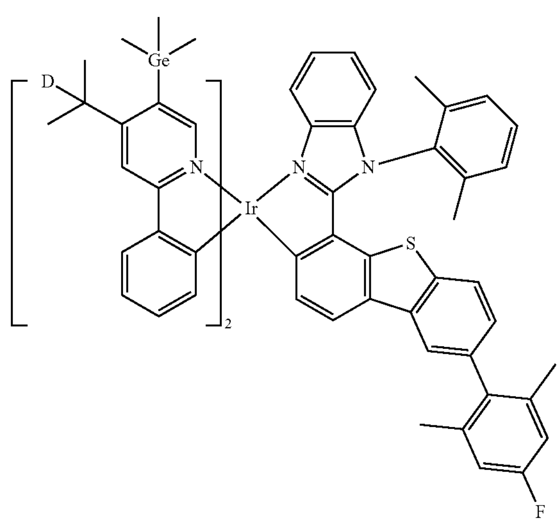

2991
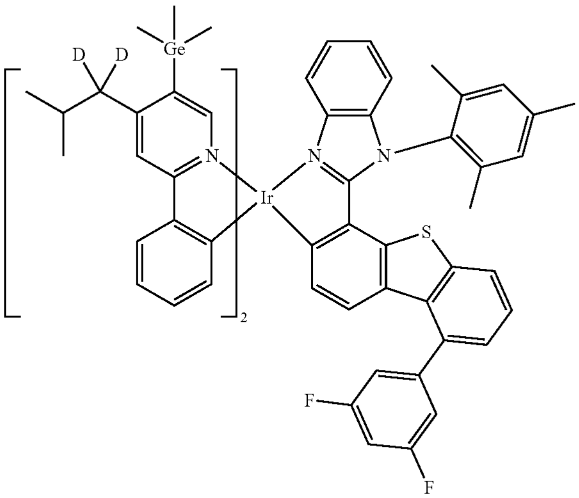
2992
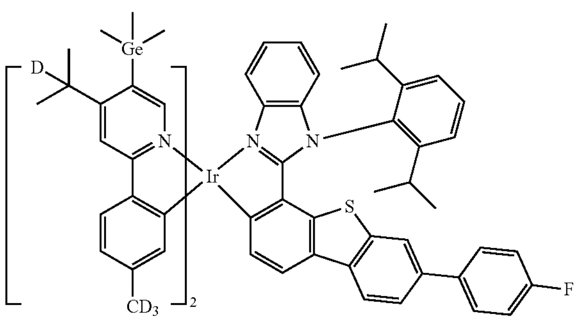
2993
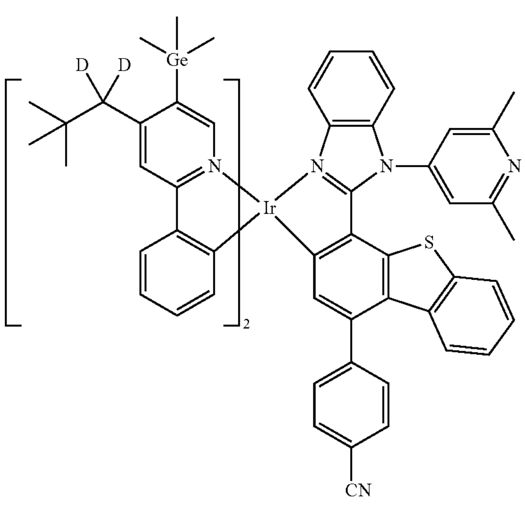
2994
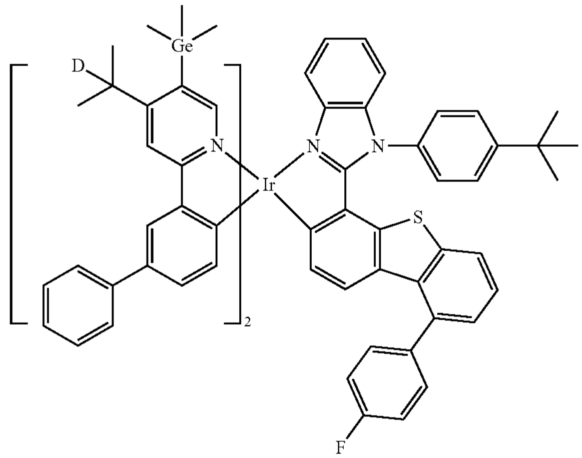
2995
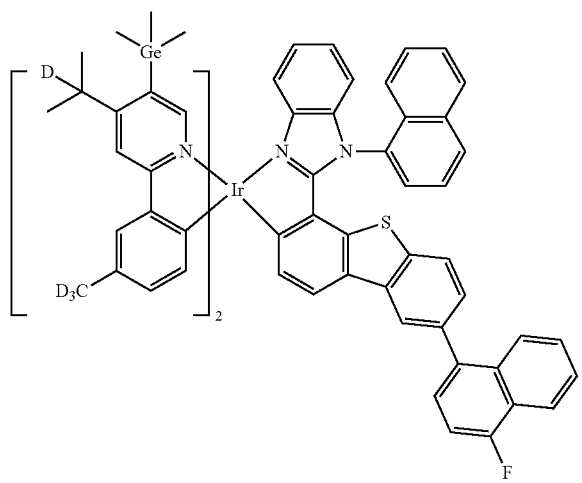
2996
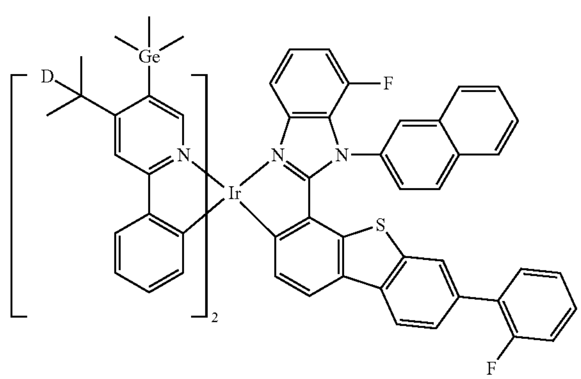

-continued
2997
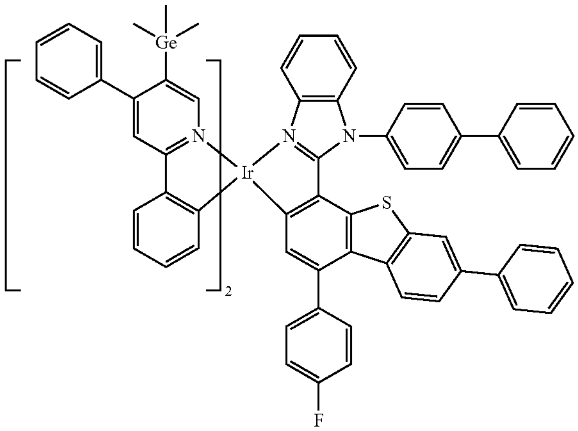
2998
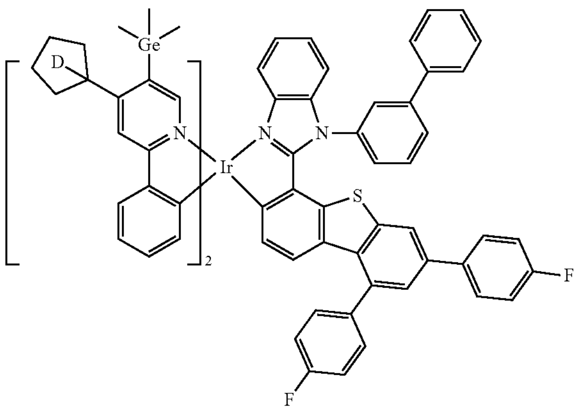
-continued
2999
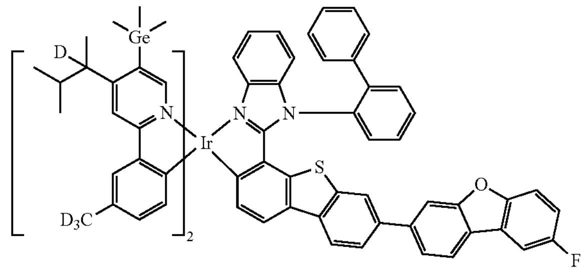
3000
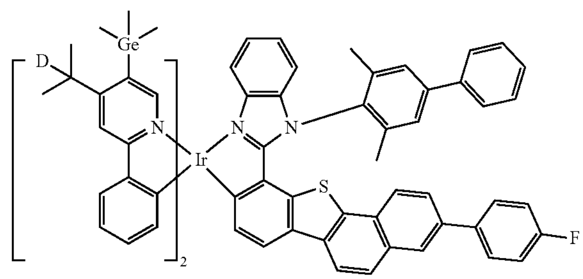
3001
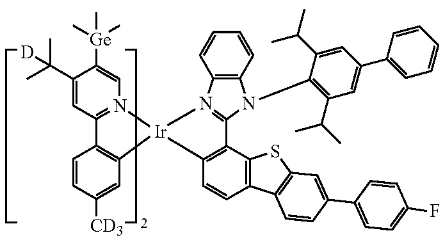
3002
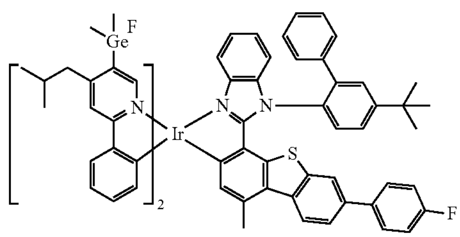
3003
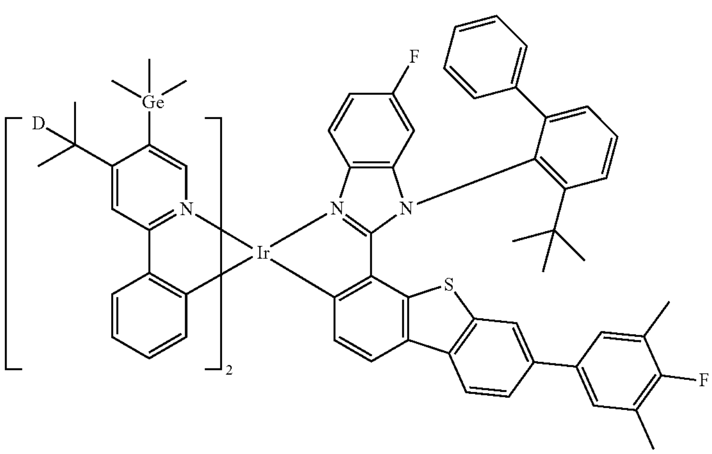

-continued
3004
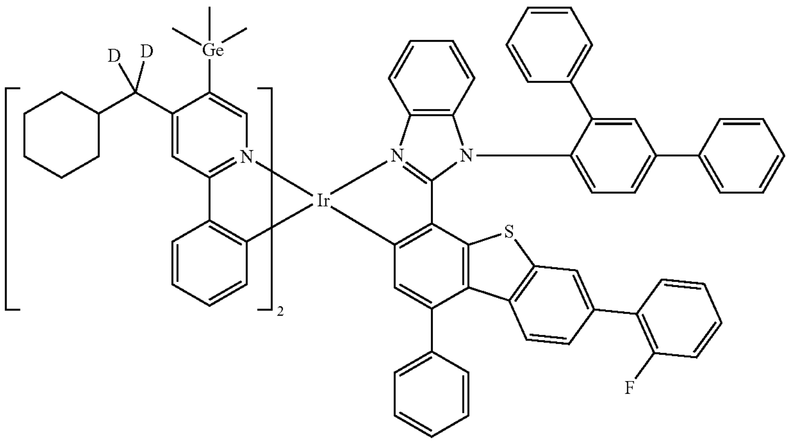
3005
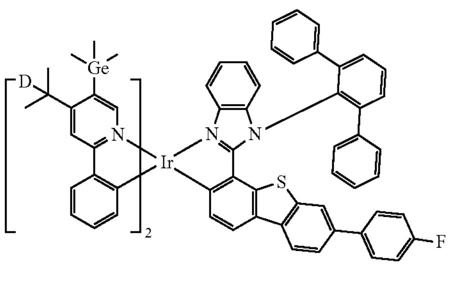
3006
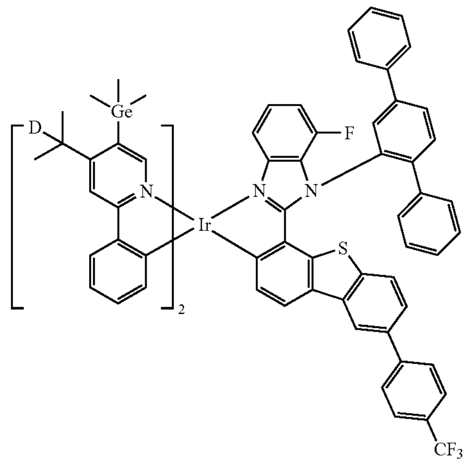
3007
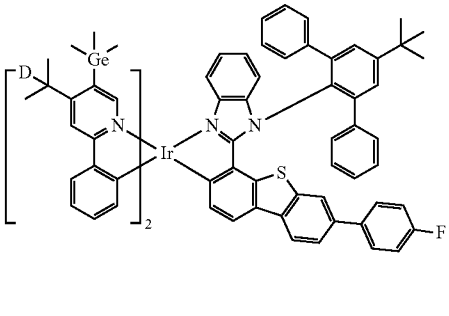
3008
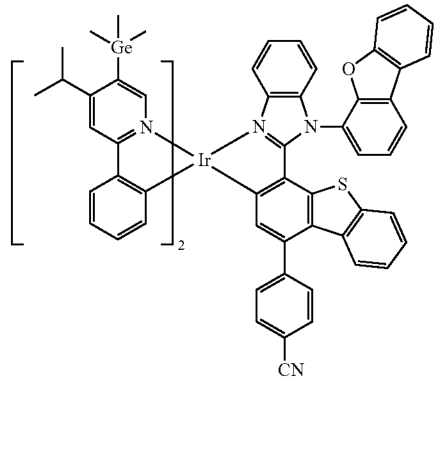

-continued
3009
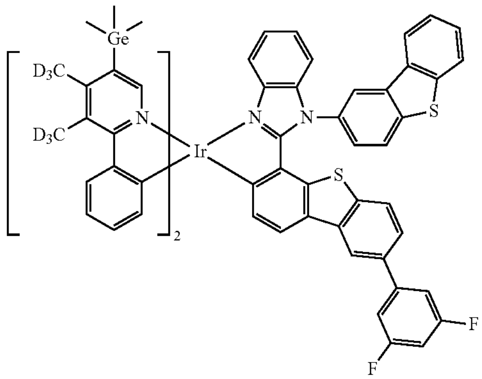
3010
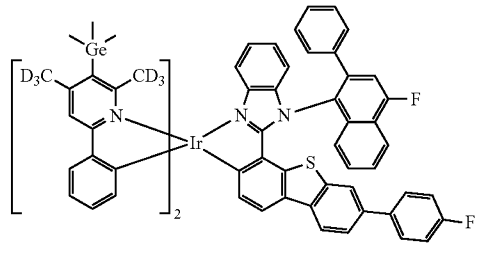
3011
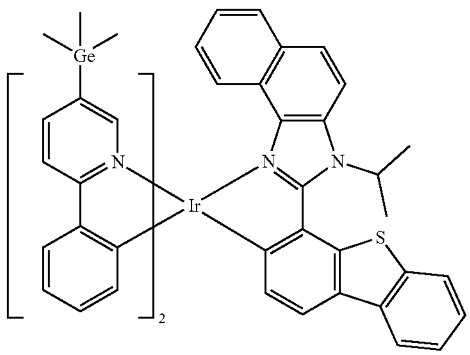
3012
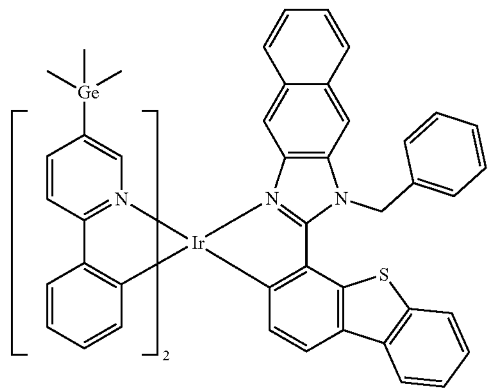
3013
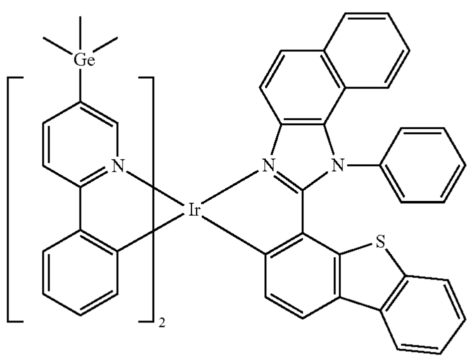
3014
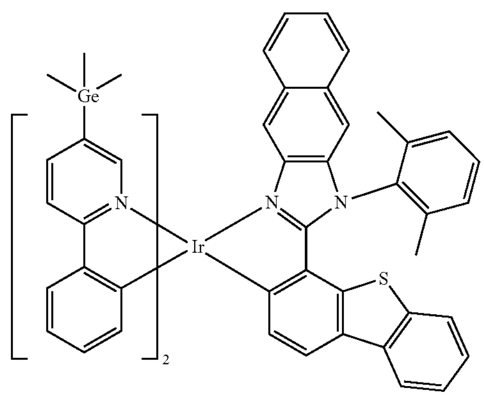
3015
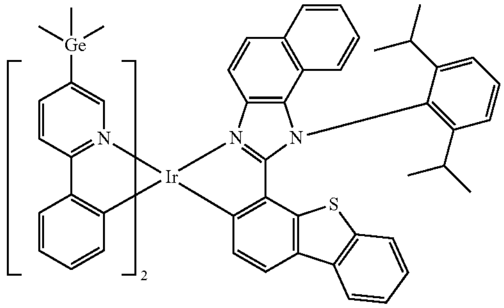
3016
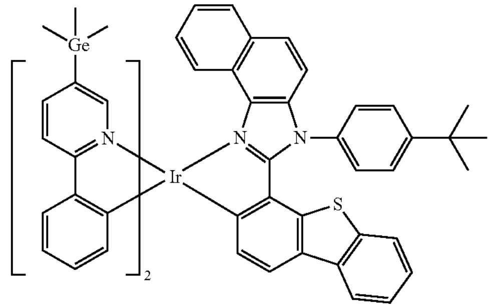

-continued
3017
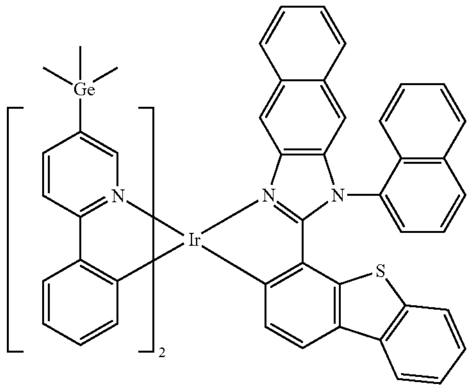
3018
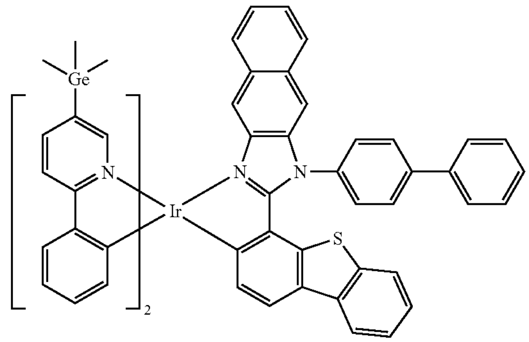
3019
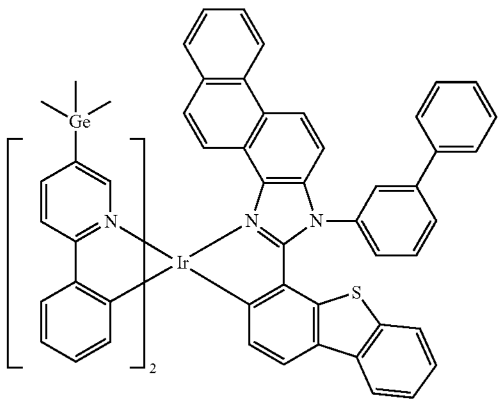
3020
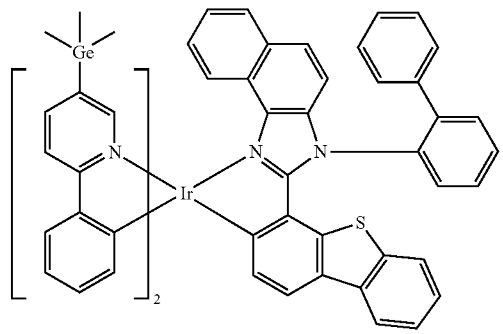
3021
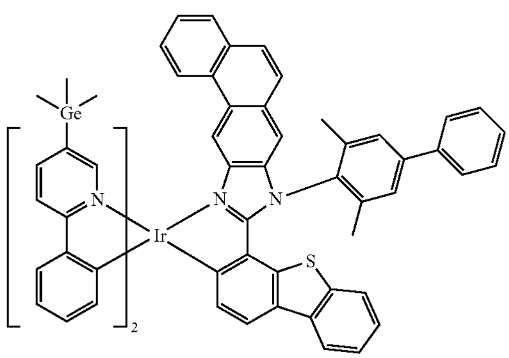
3022
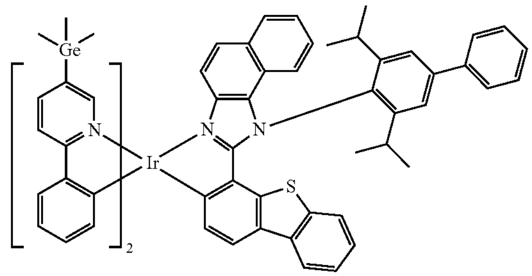
3023
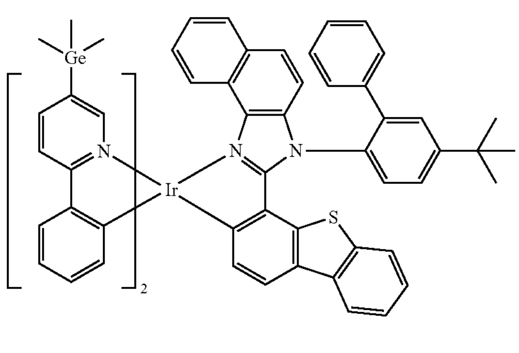
3024
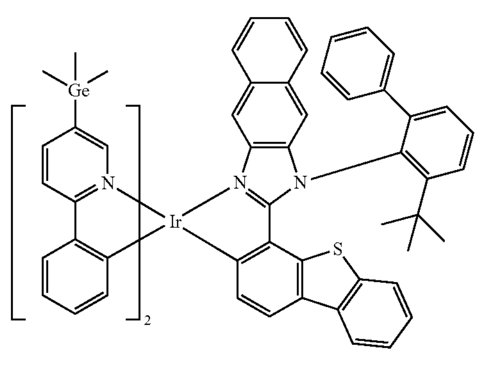

-continued
3025
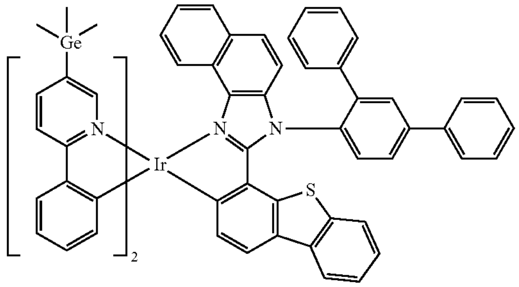
3026
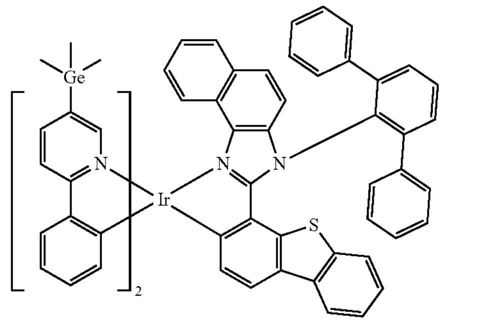
3027
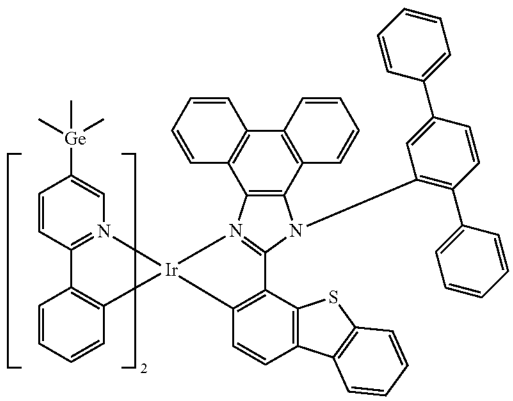
3028
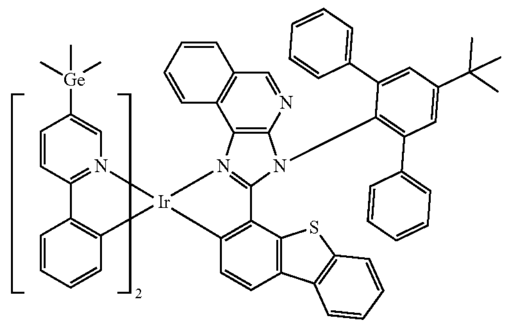
3029
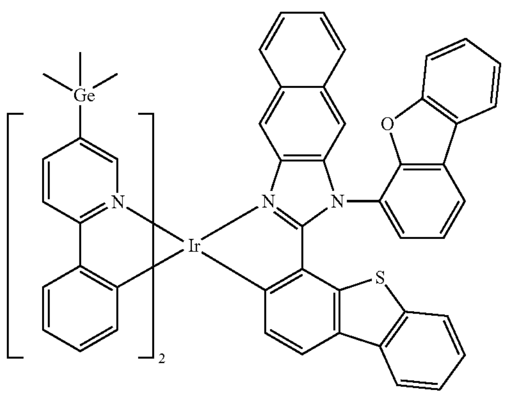
3030
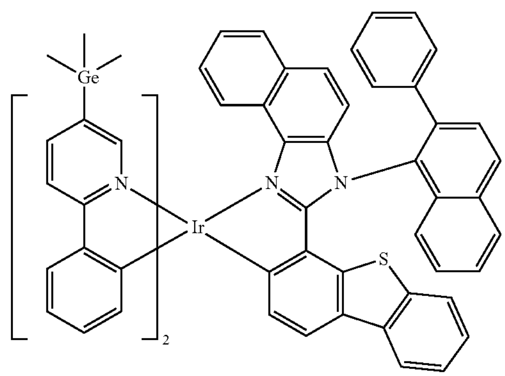
3031
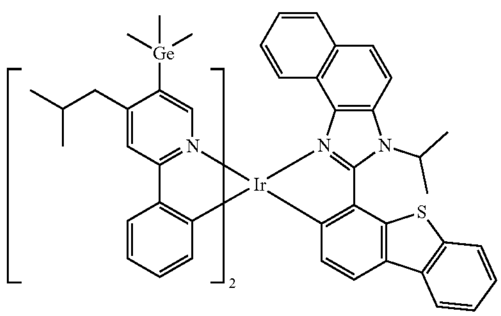
3032
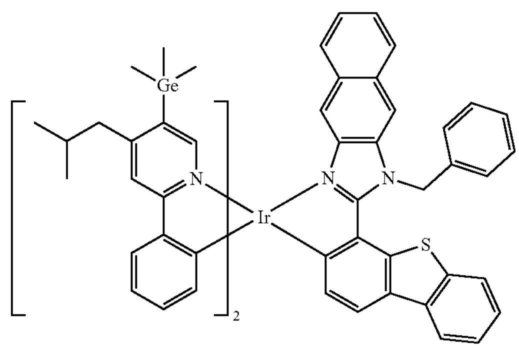

-continued
3033
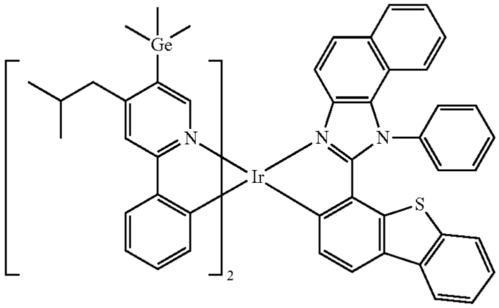
3034
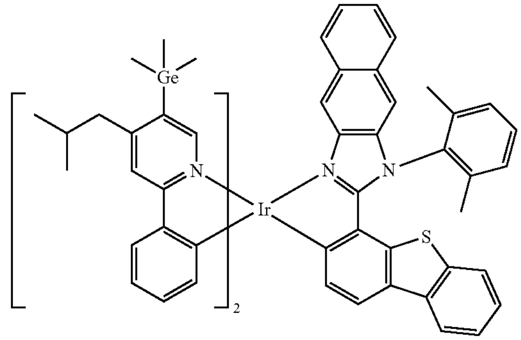
3035
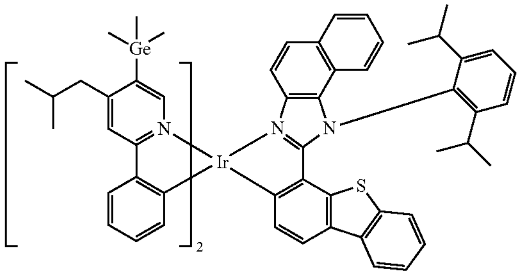
3036
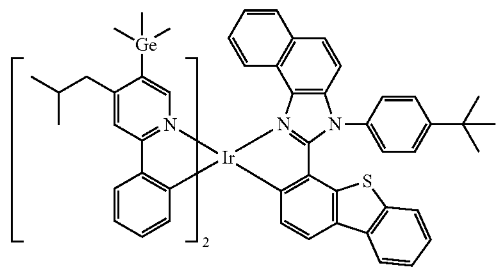
3037
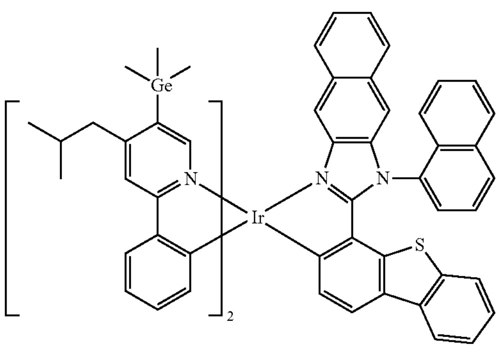
3038
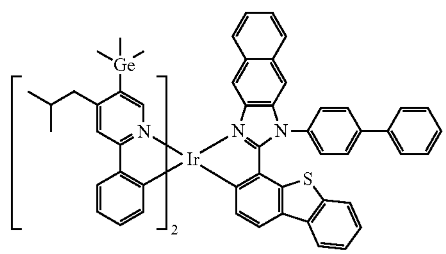
3039
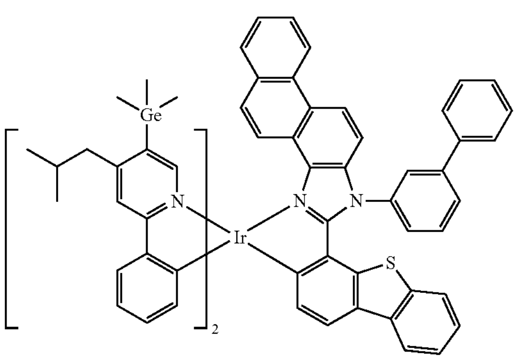
3040
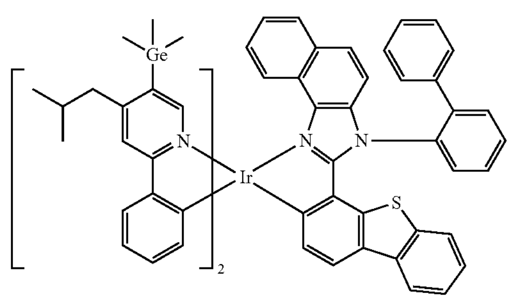

-continued
3041
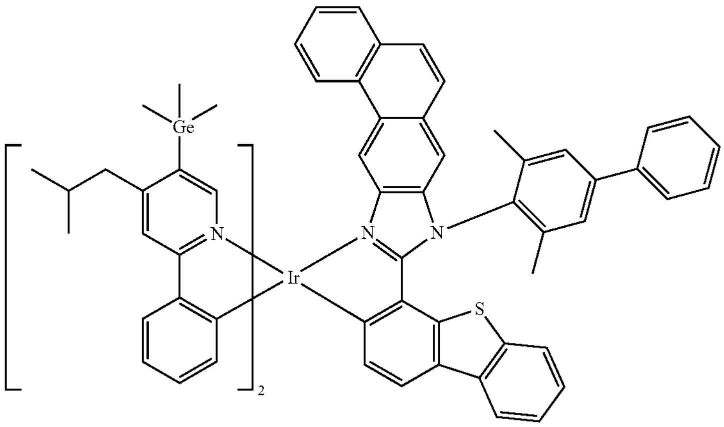
3042
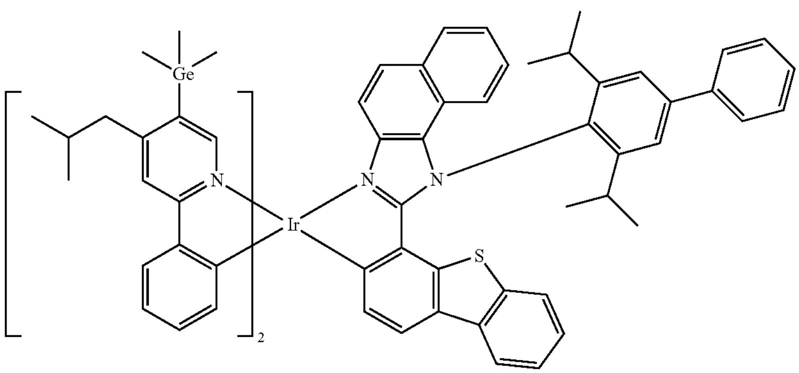
3043
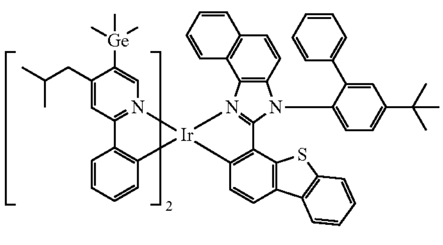
3044
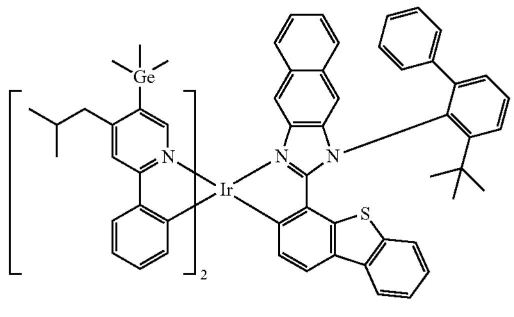
3045
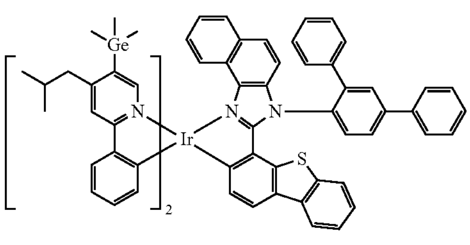
3046
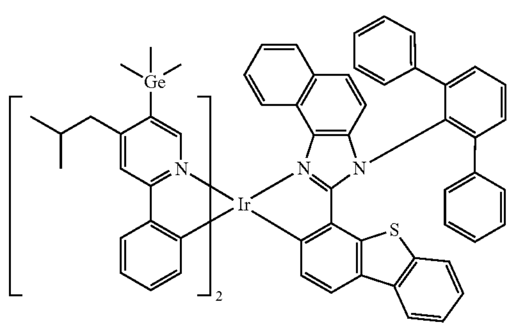

-continued
3047
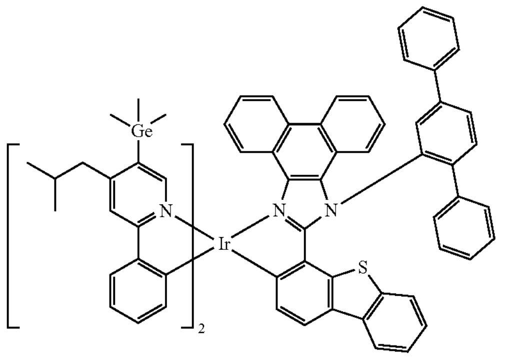
3048
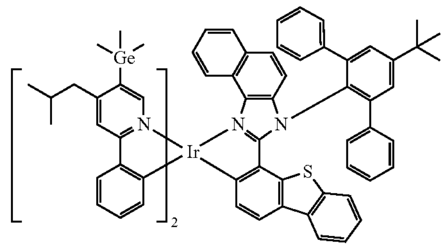
3049
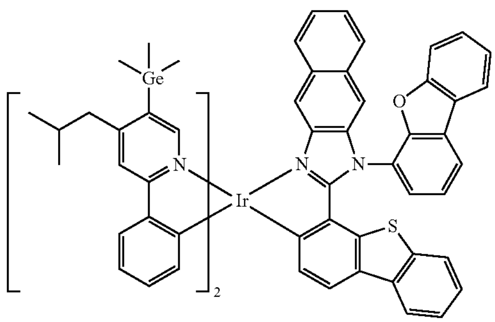
3050
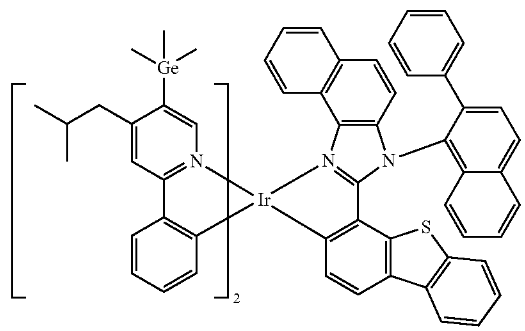
3051
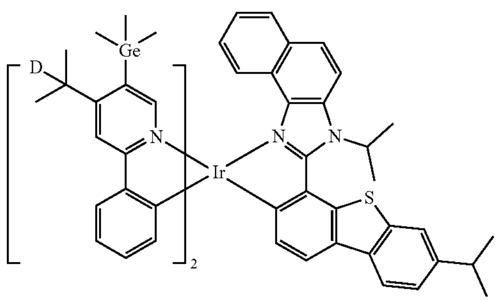
3052
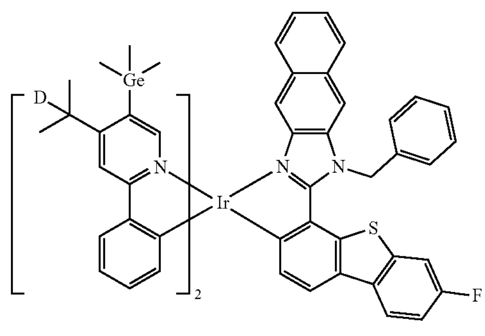
3053
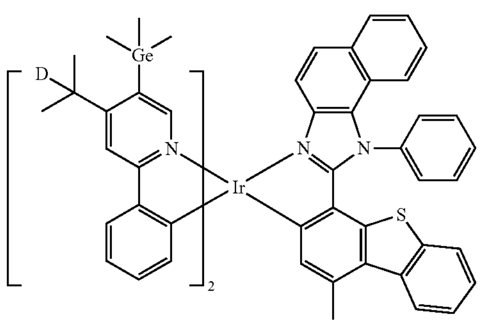
3054
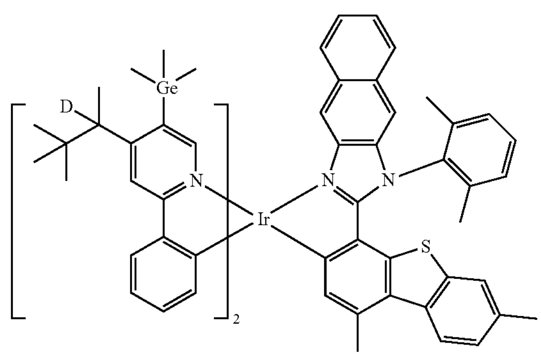

-continued
3055
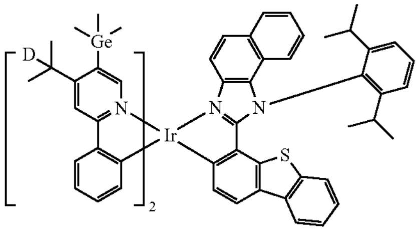
3056
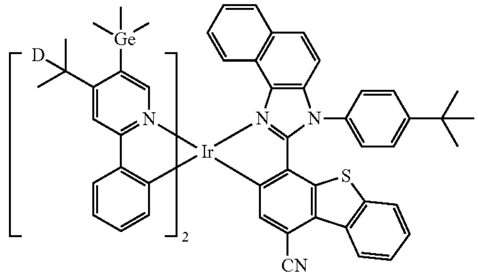
3057
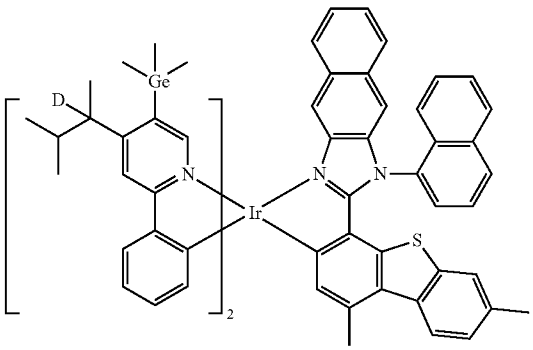
3058
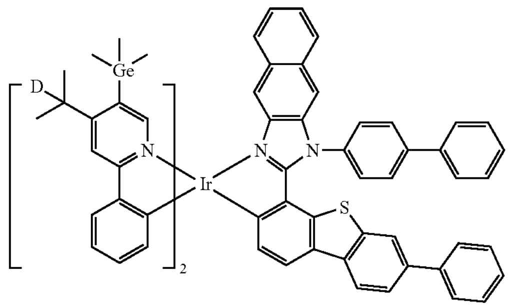
3059
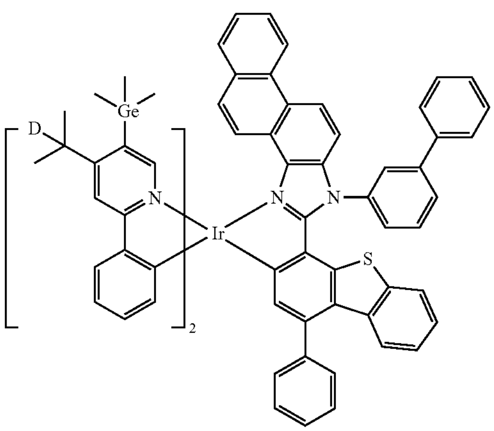
3060
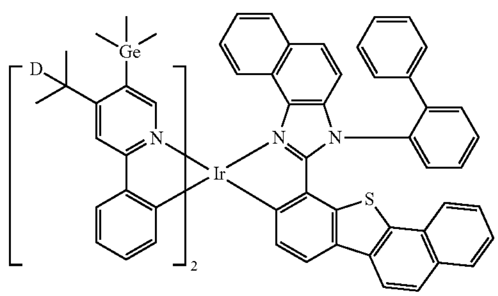
3061
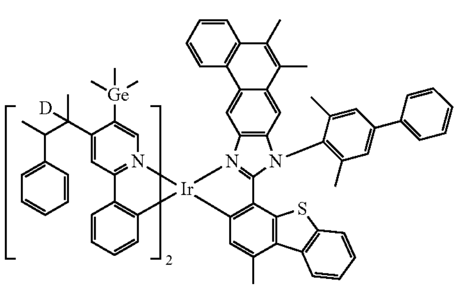
3062
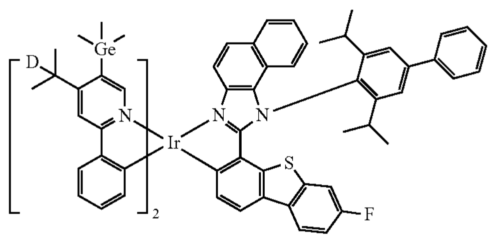

-continued
3063
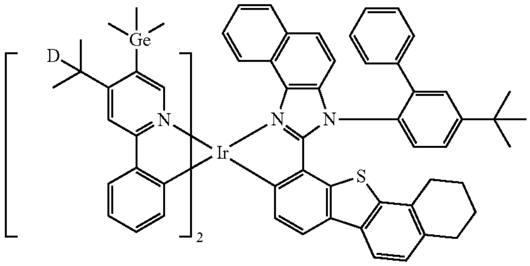
3064
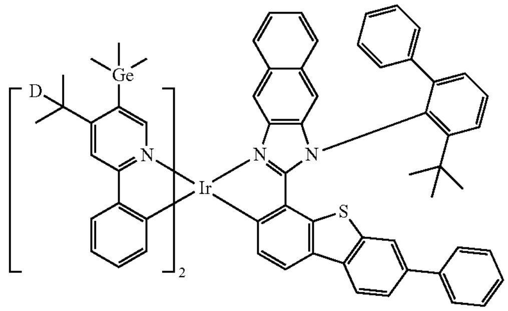
3065
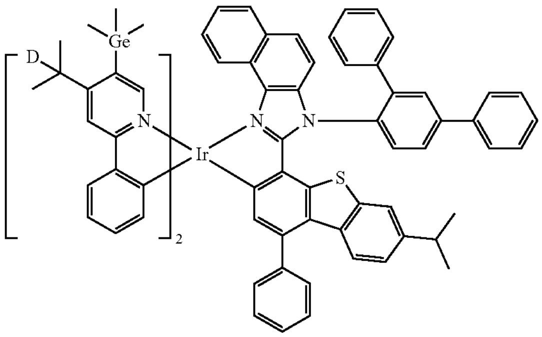
3066
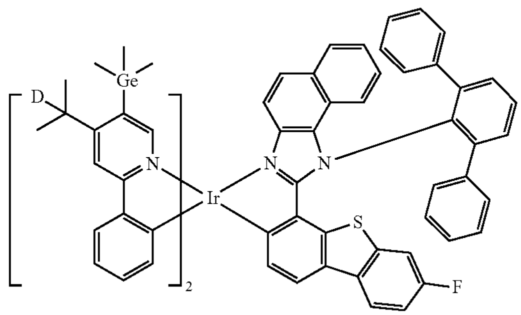
3067
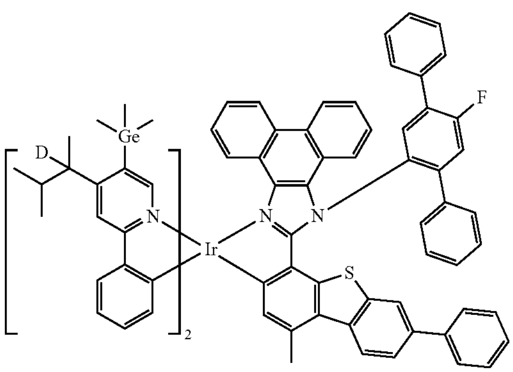
3068
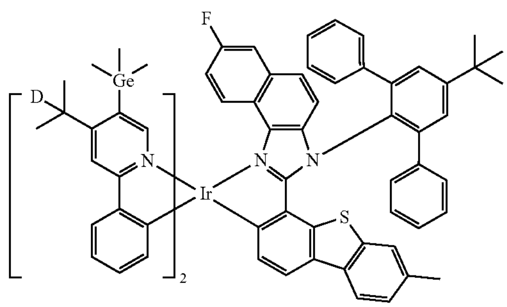
3069
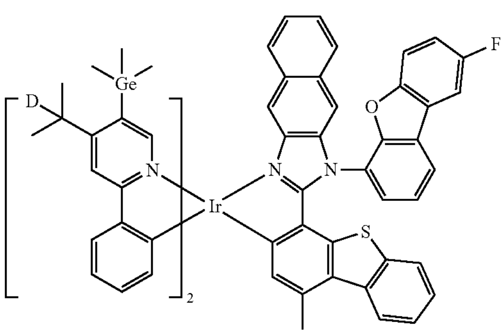
3070
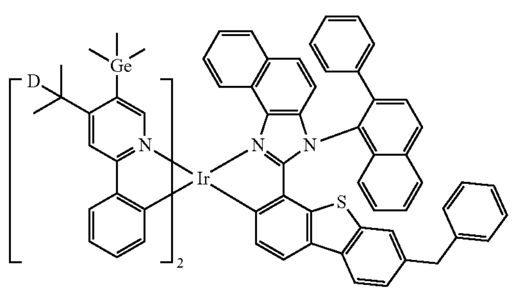

-continued
3071
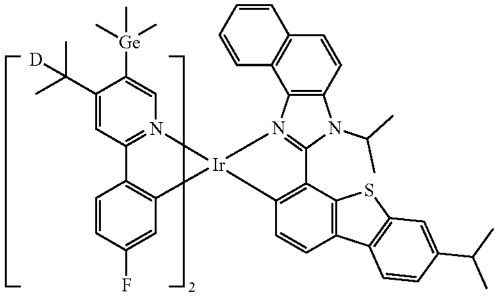
3072
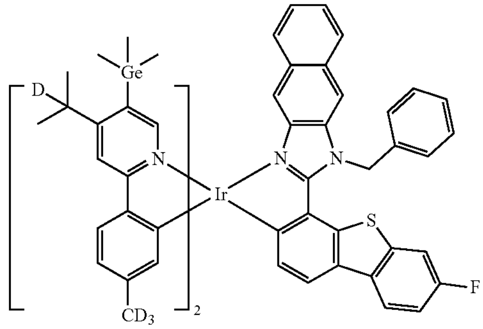
3073
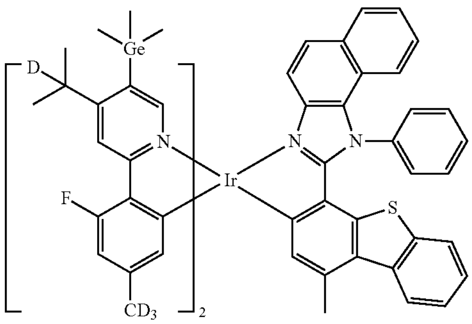
3074
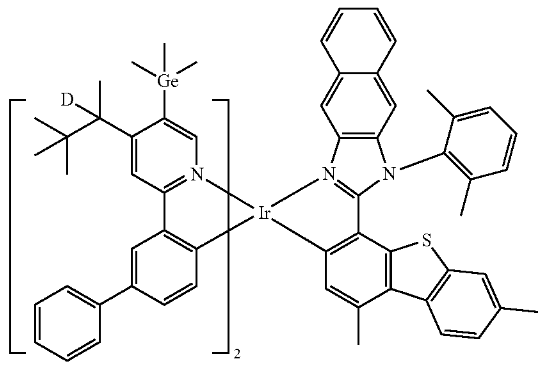
3075
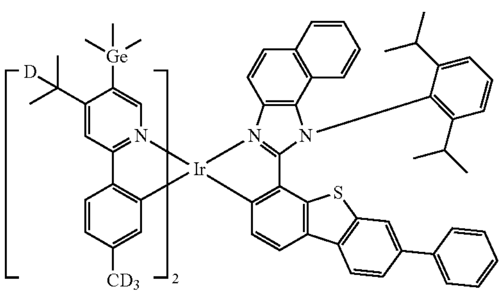
3076
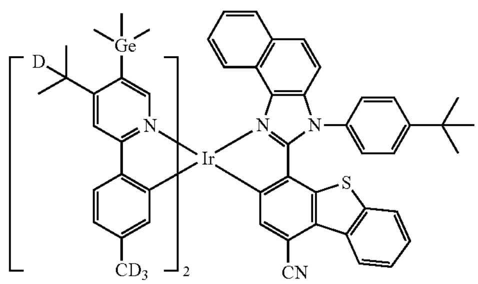
3077
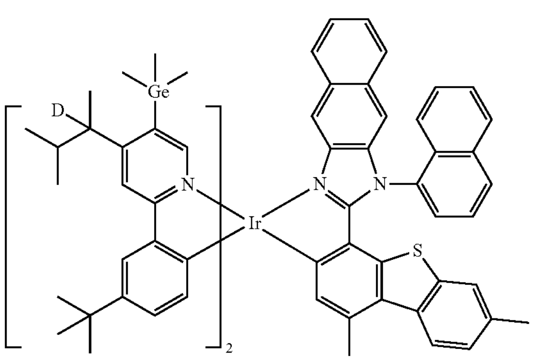
3078
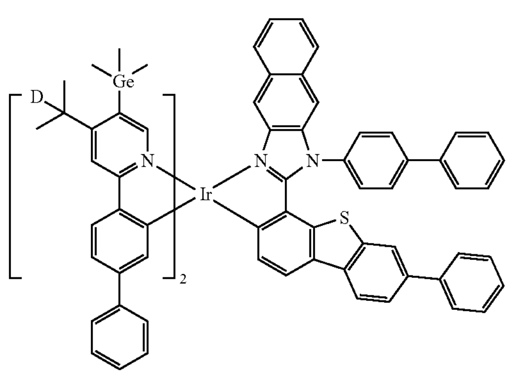

-continued
3079
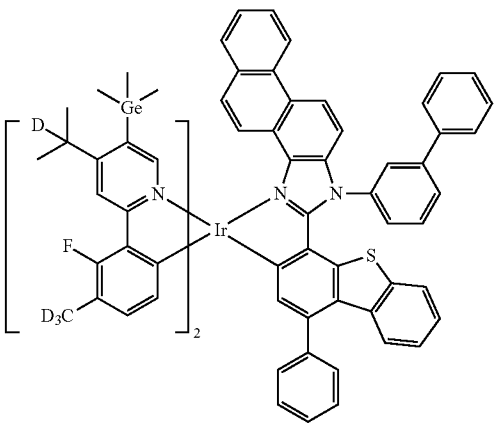
3080
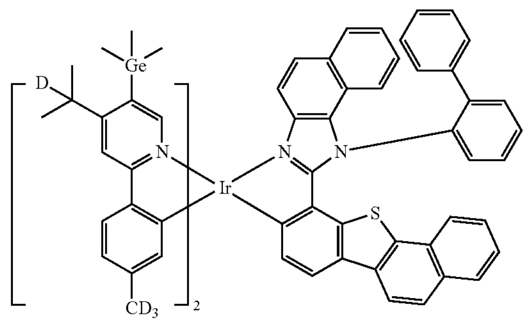
3081
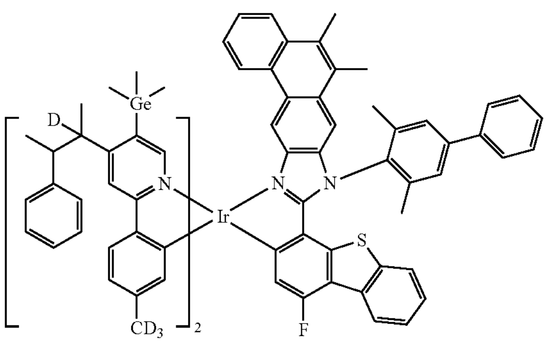
3082
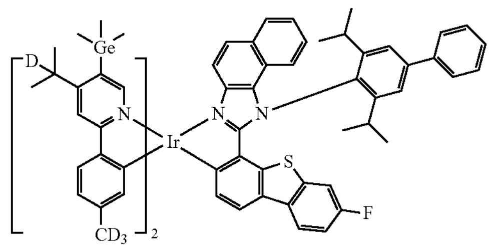
3083
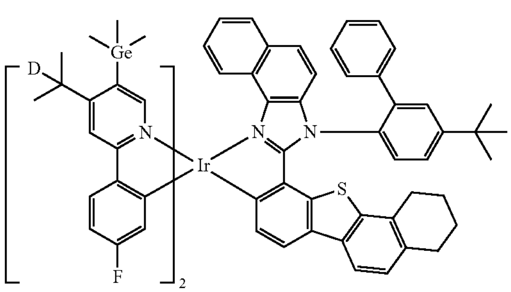
3084
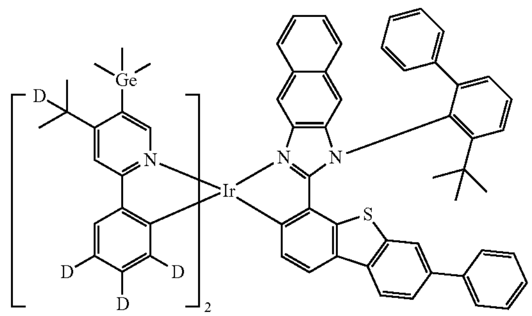
3085
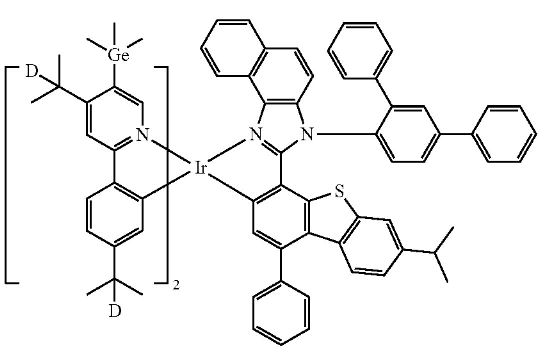
3086
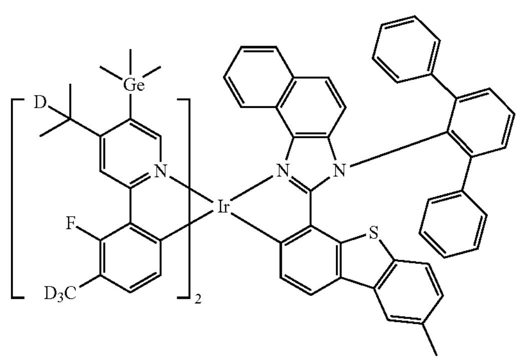

-continued
3087
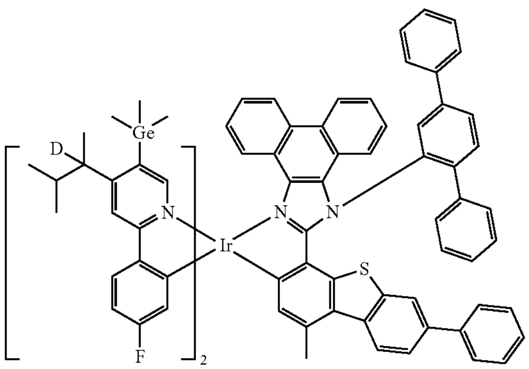
3088
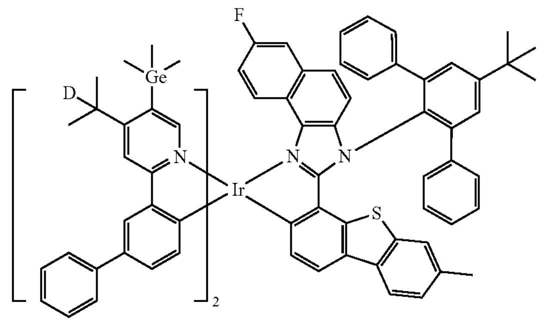
3089
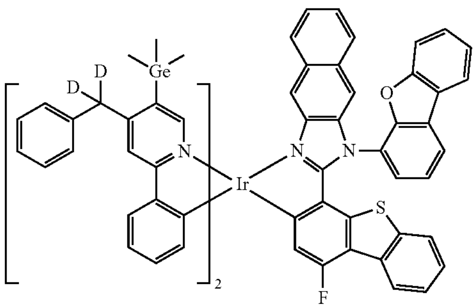
3090
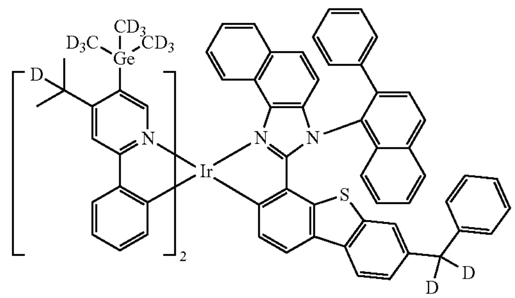
3091
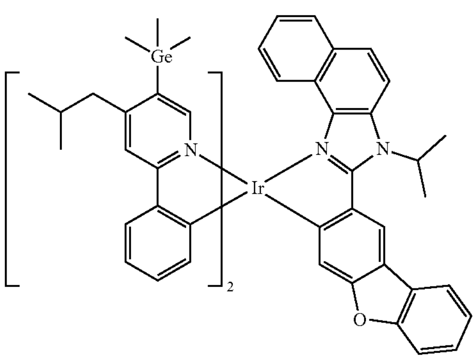
3092
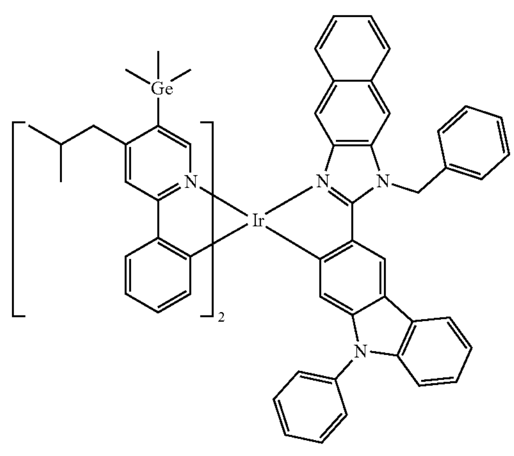
3093
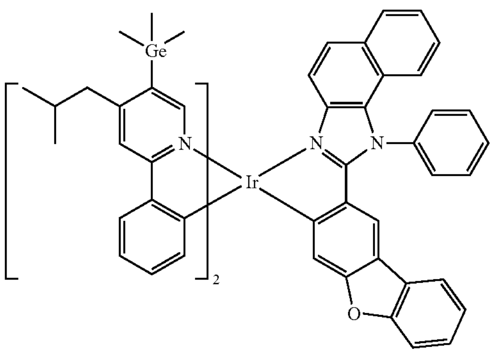
3094
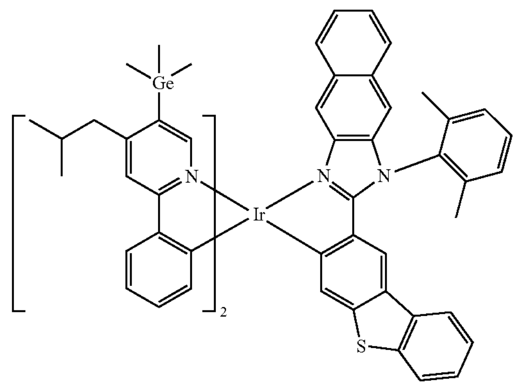

-continued
3095
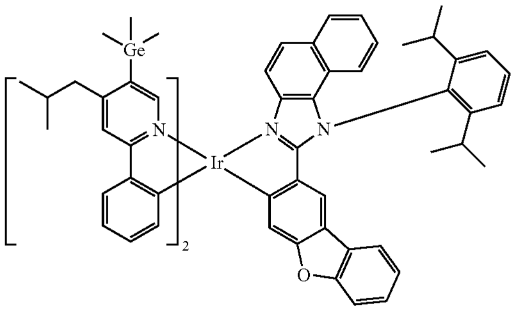
3096
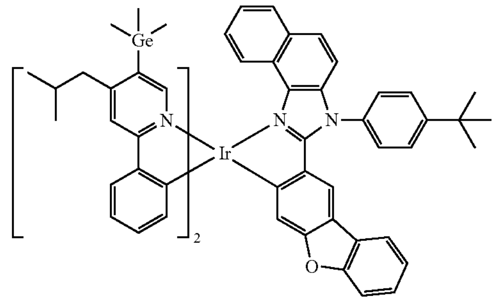
3097
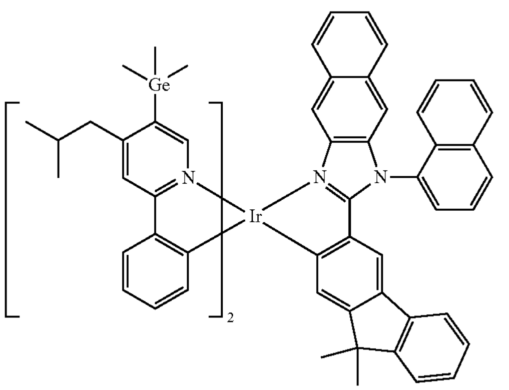
3098
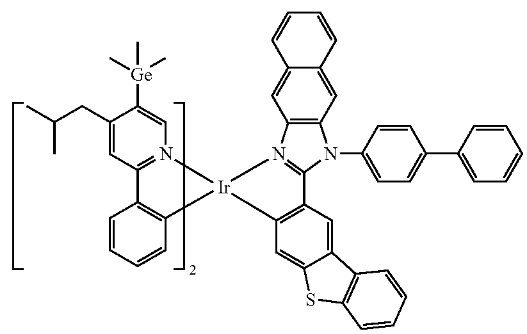
3099
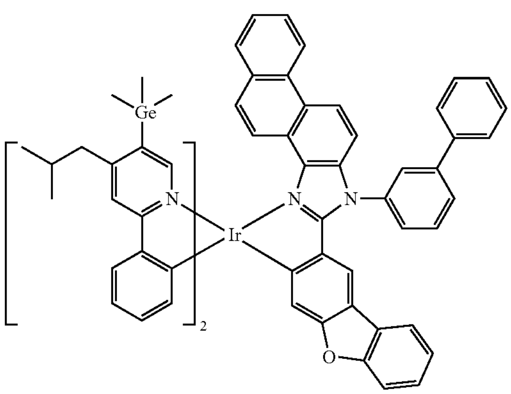
3100
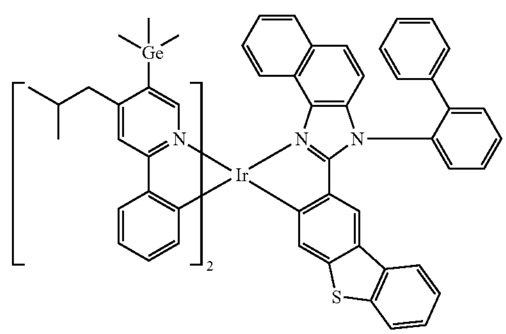
3101
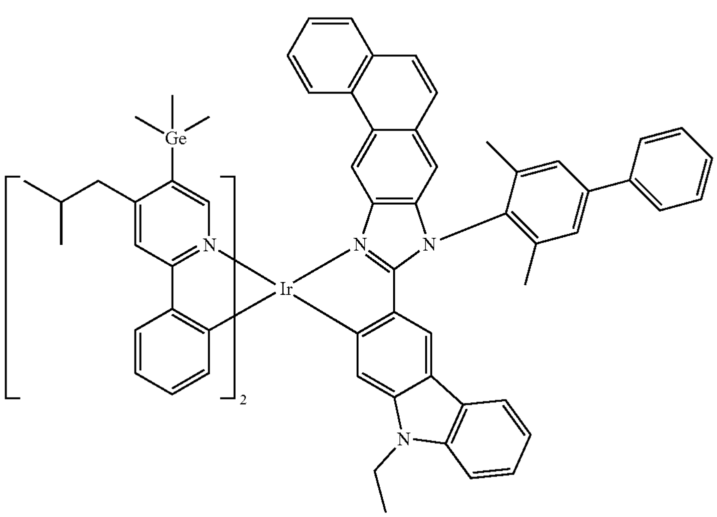

-continued
3102
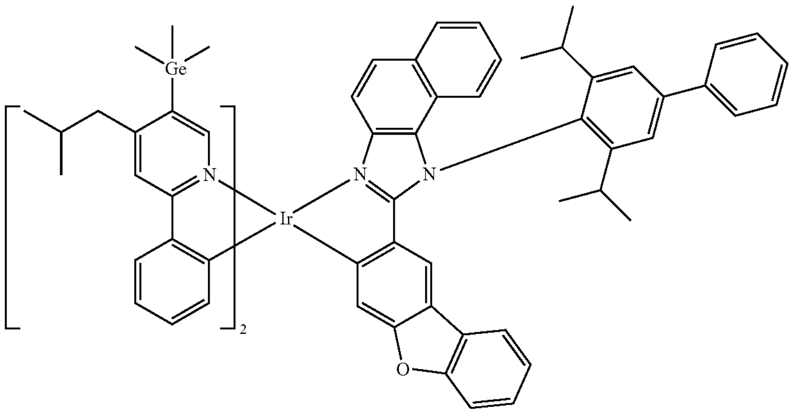
3103
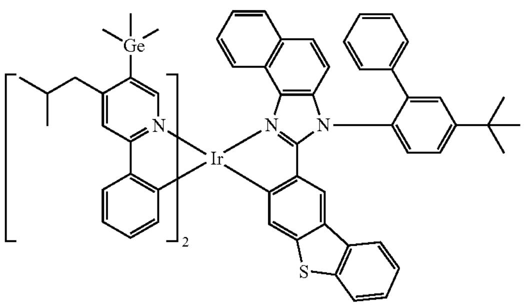
3104
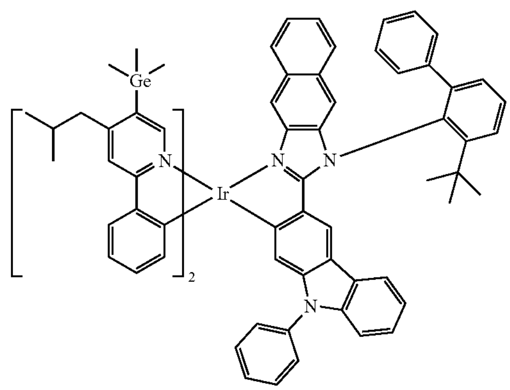
3105
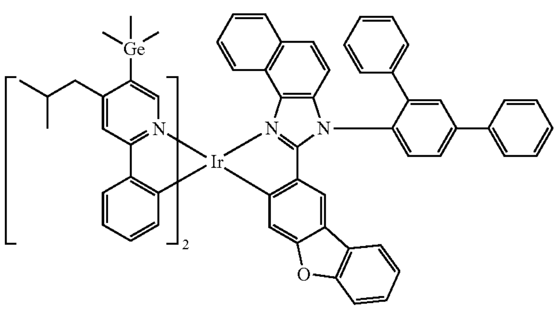
3106
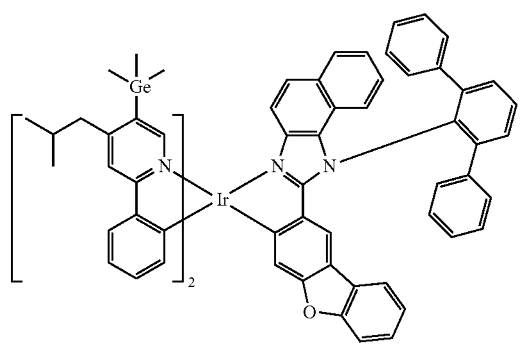
3107
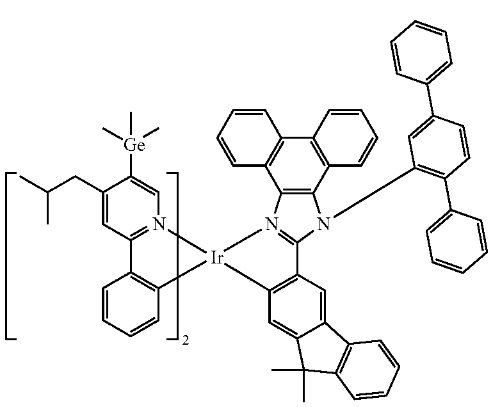
3108
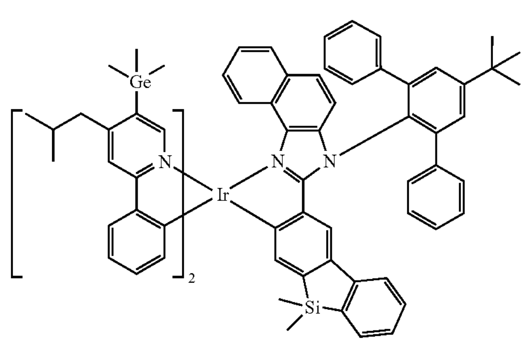

-continued
3109
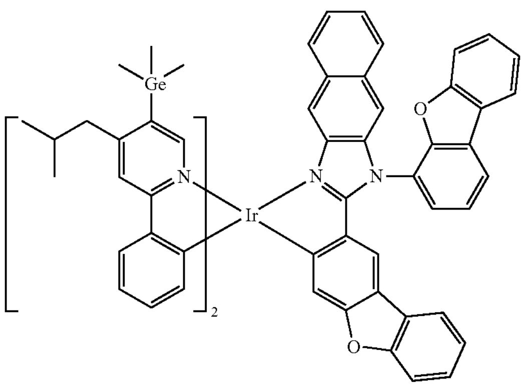
3110
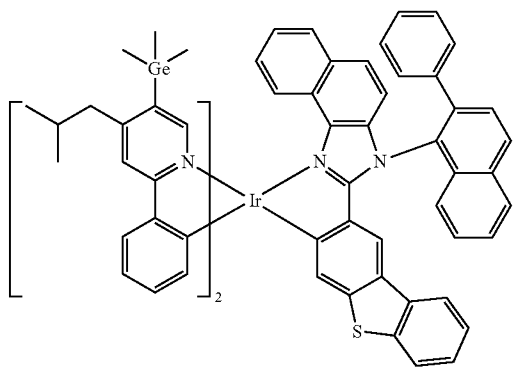
3111
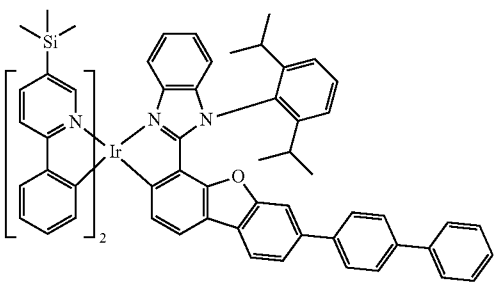
3112
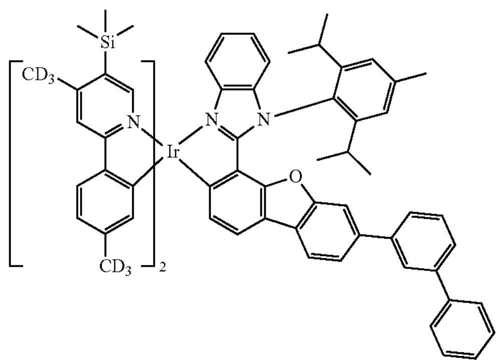
3113
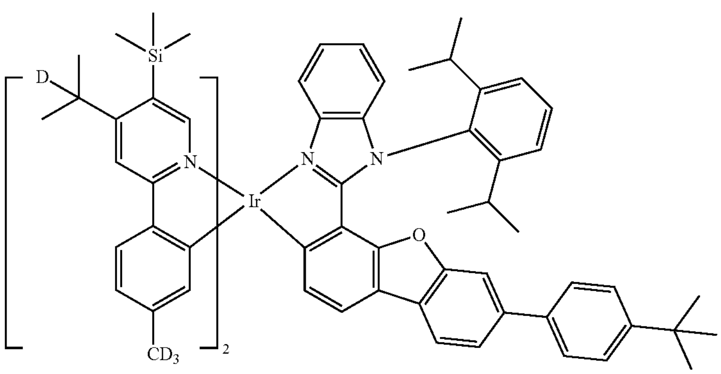
3114
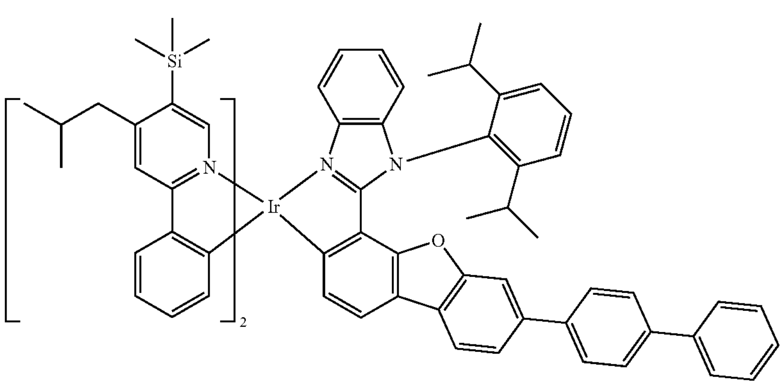

-continued
3115
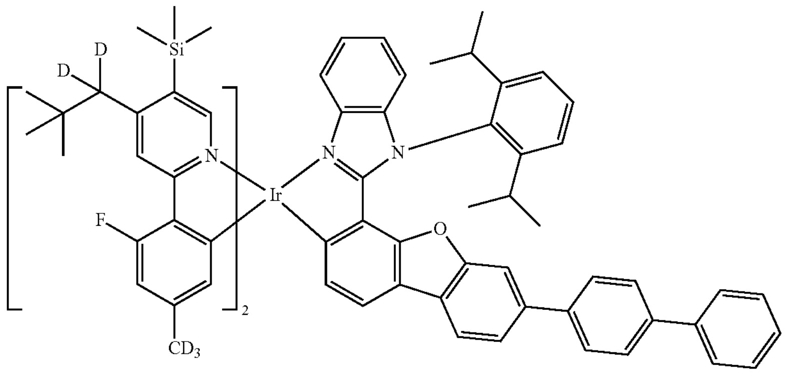
3116
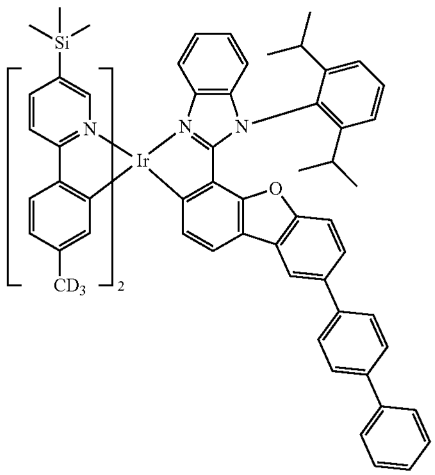
3117
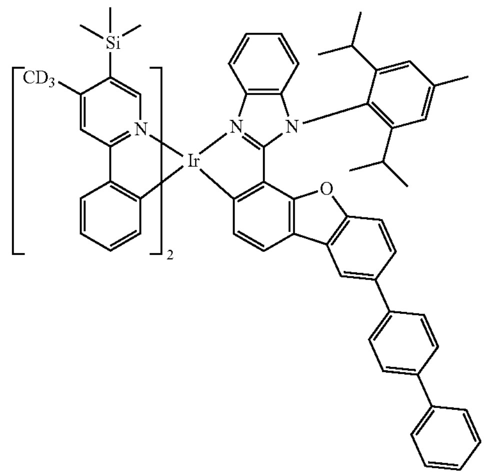
3118
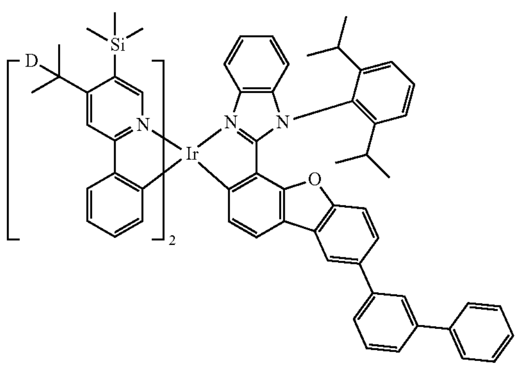
3119
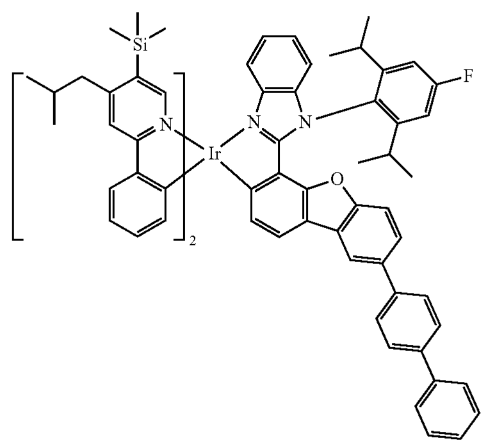
3120
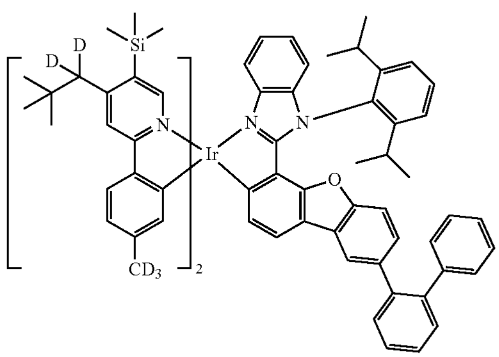
3121
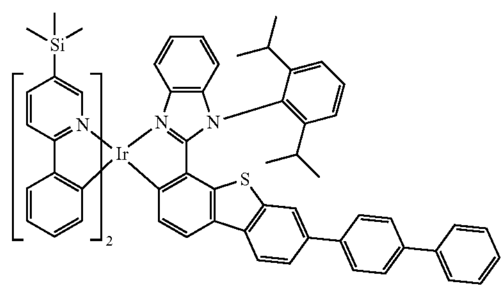

-continued
3122
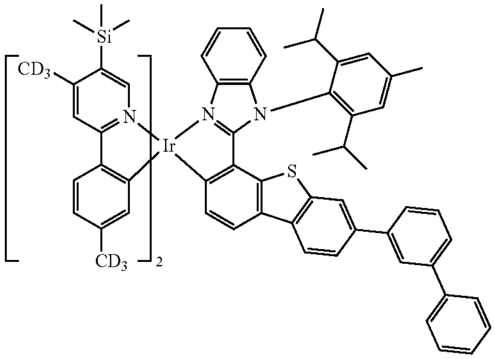
3123
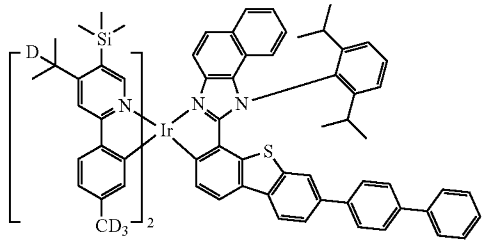
3124
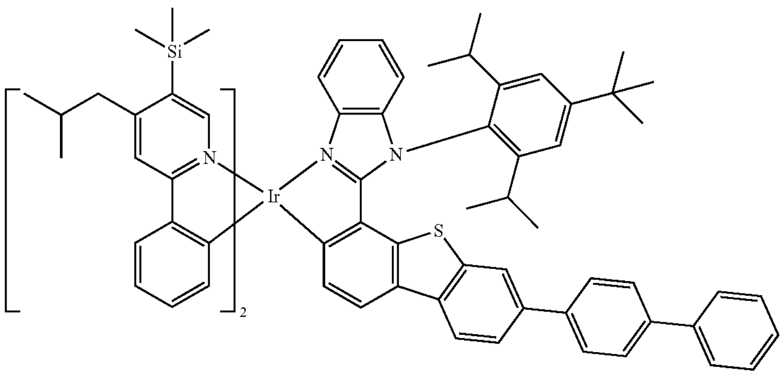
3125
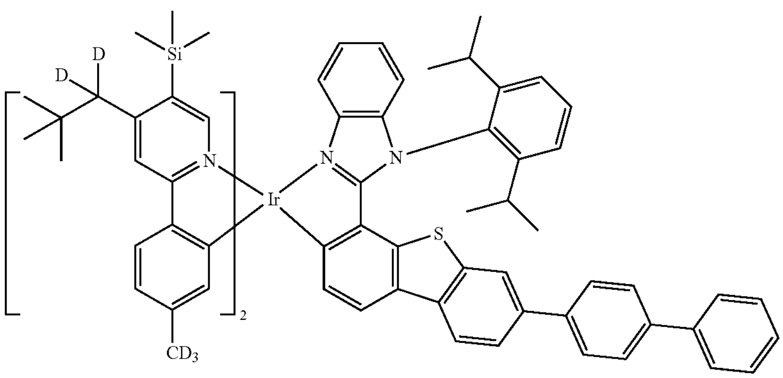
3126
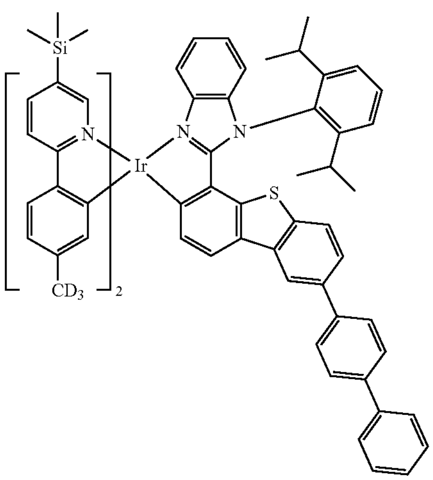
3127
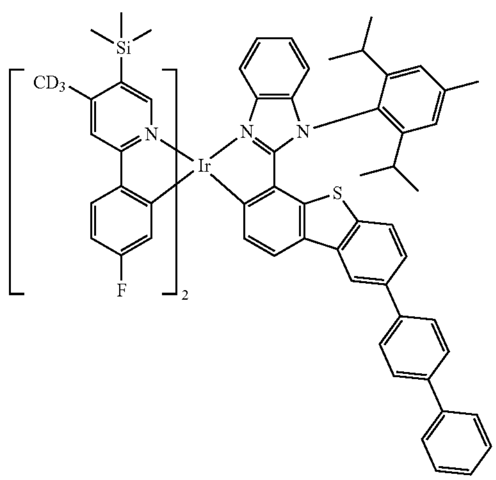

-continued
3128
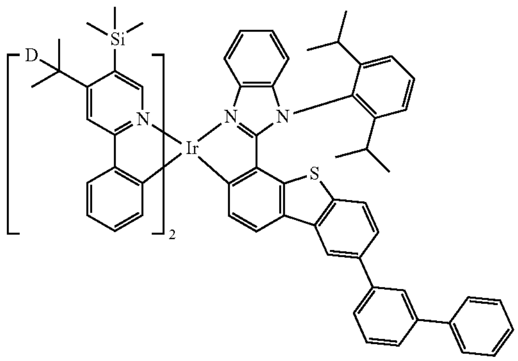
3129
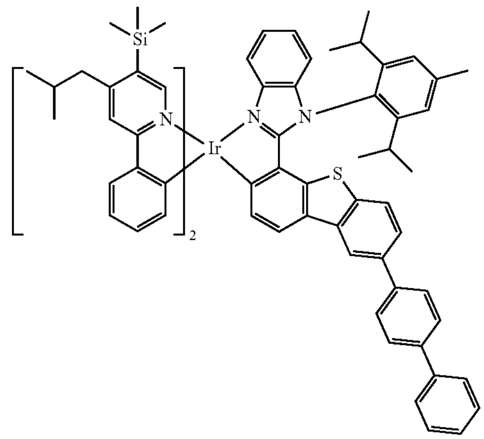
3130
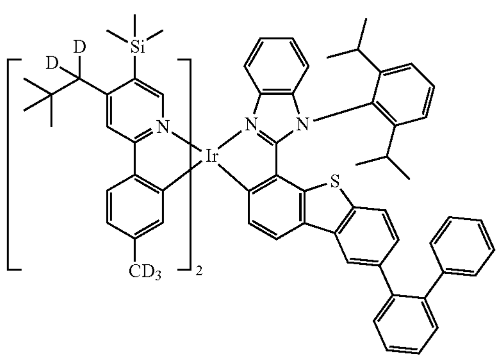
3131
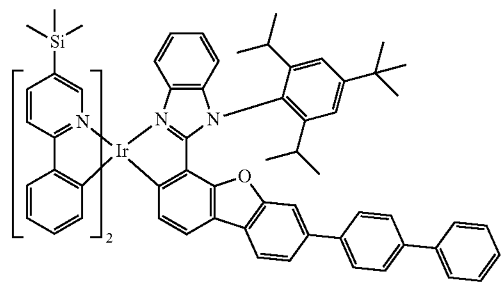
3132
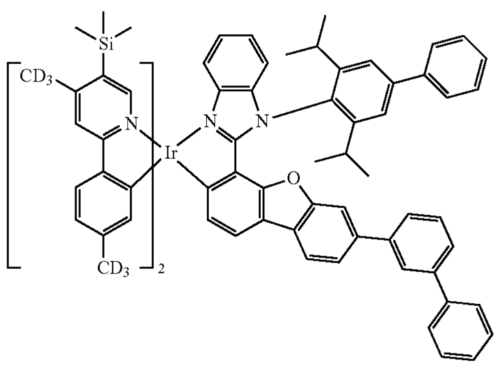
3133
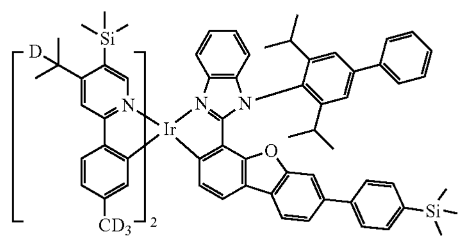
3134
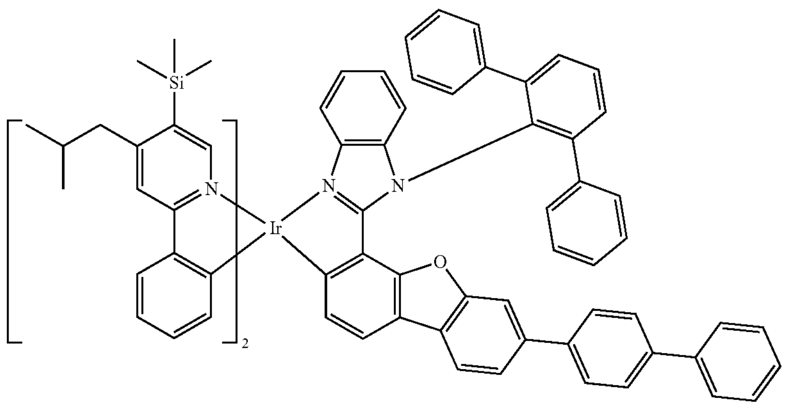

-continued
3135
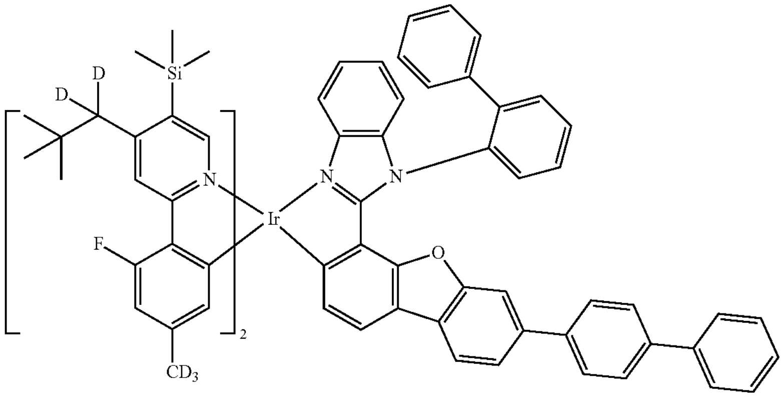
3136
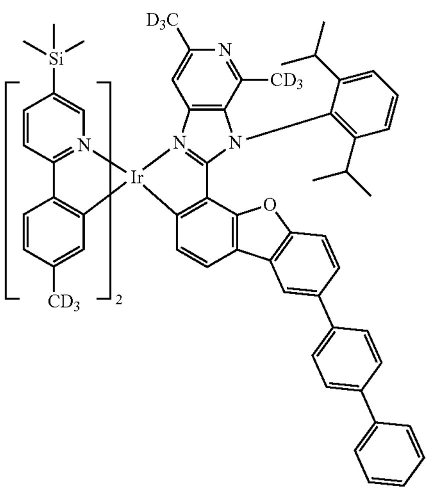
3137
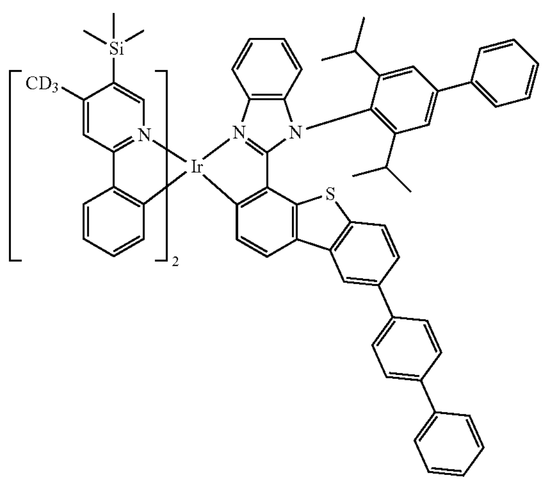
3138
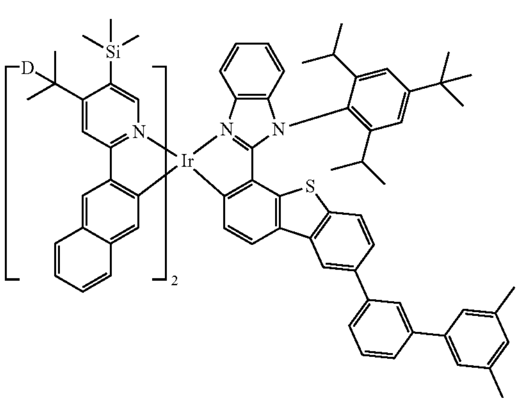
3139
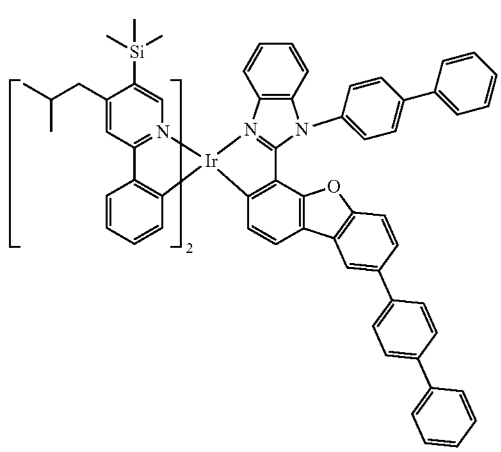

-continued
3140
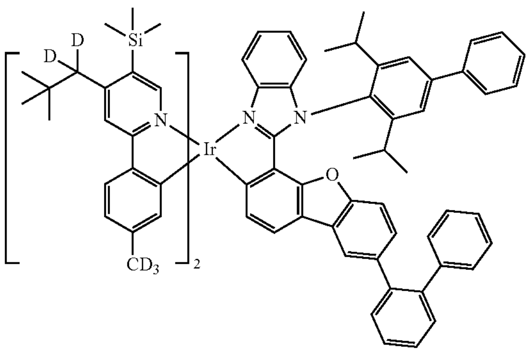
3141
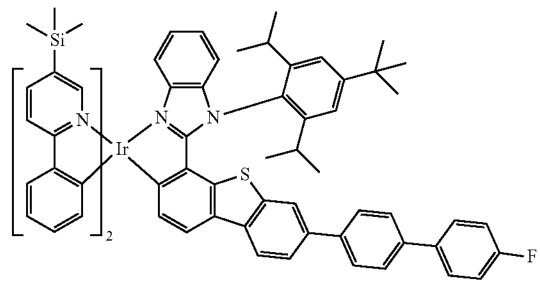
3142
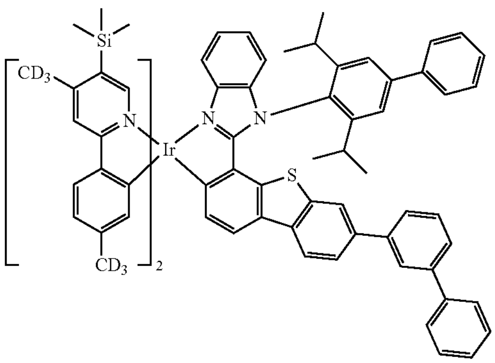
3143
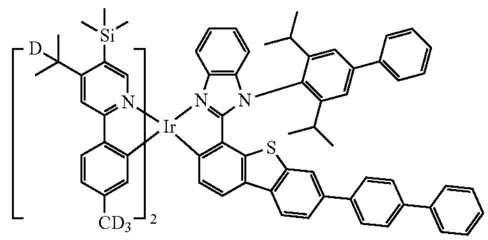
3144
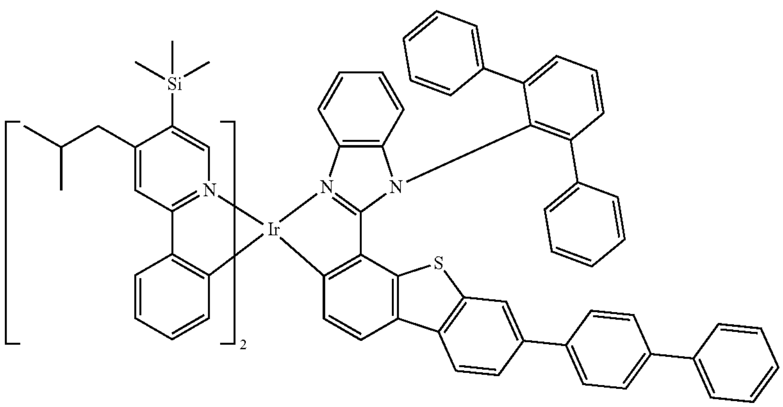
3145
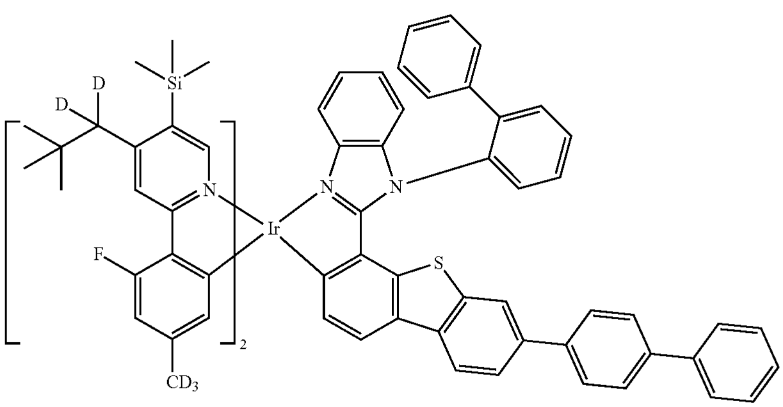

-continued
3146
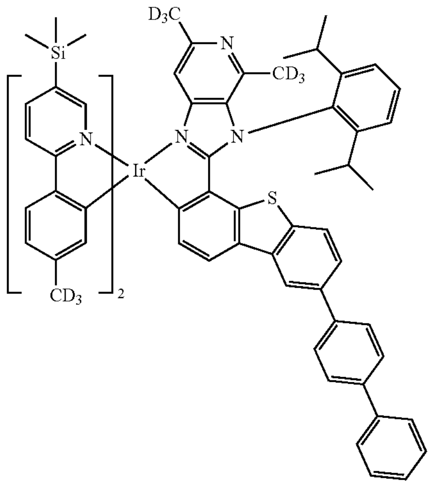
3147
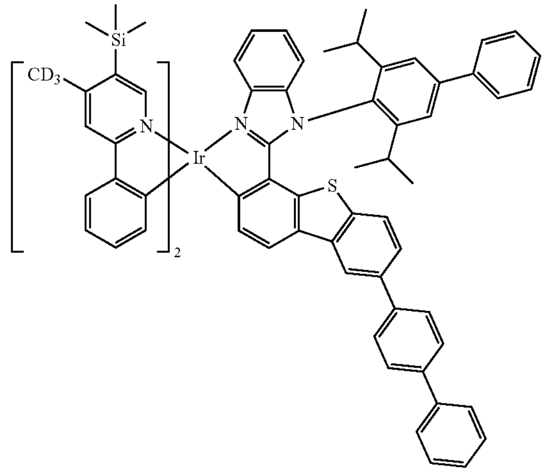
3148
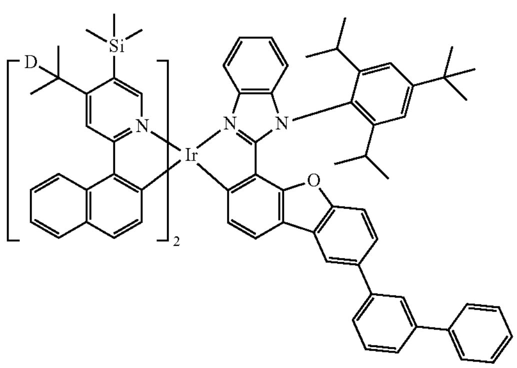
3149
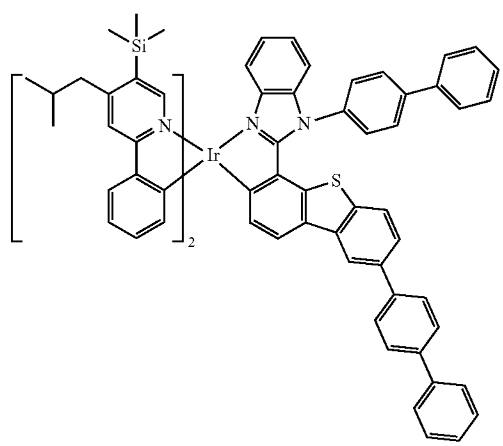
3150
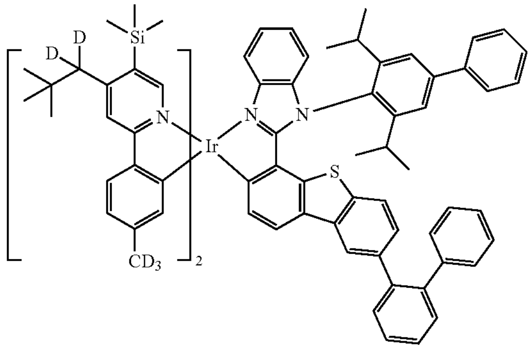
3151
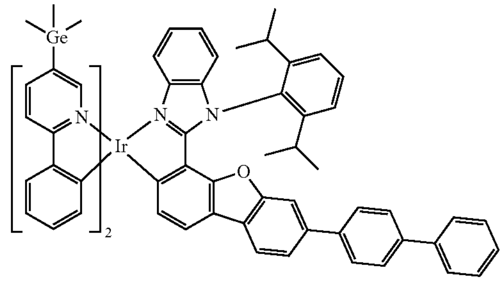

-continued
3152
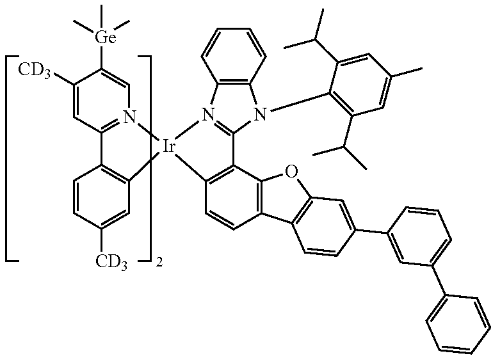
3153
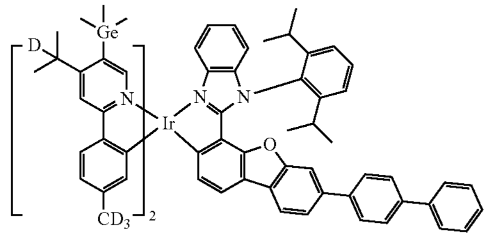
31154
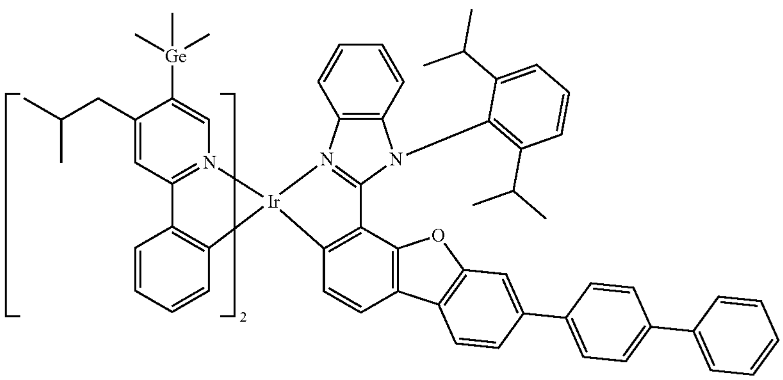
3155
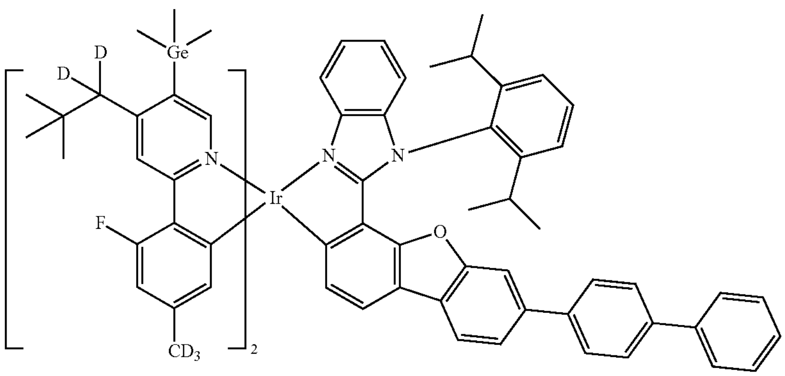
3156
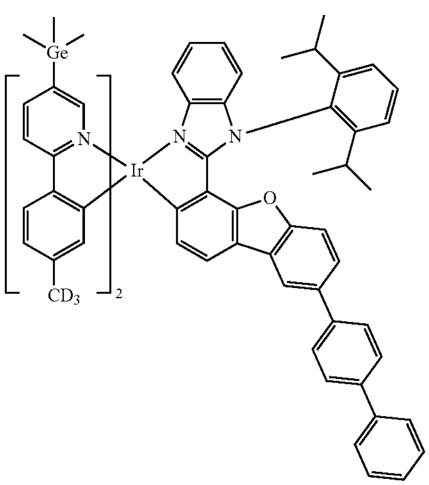
3157
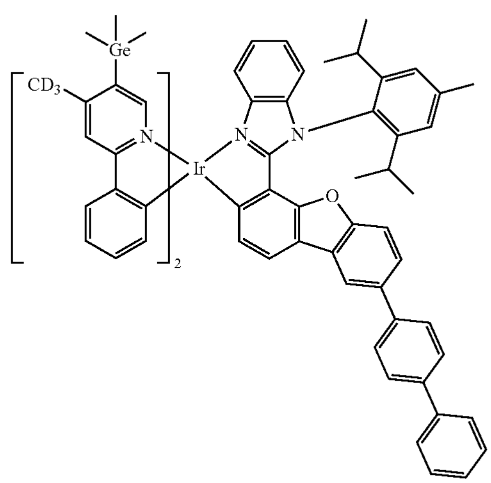

-continued
3158
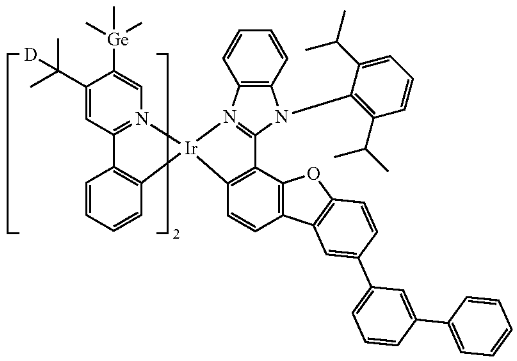
3159
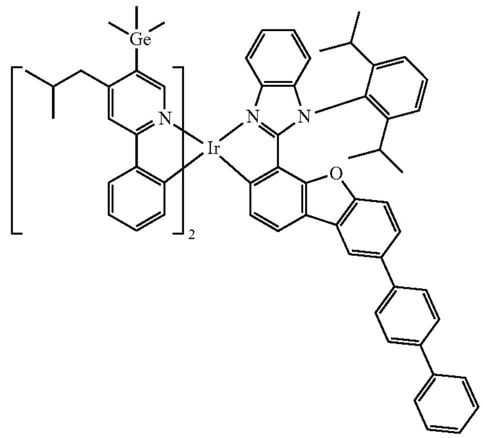
3160
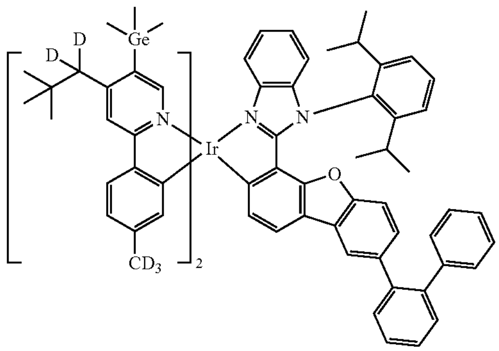
3161
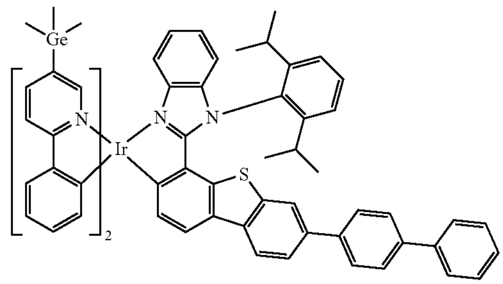
3162
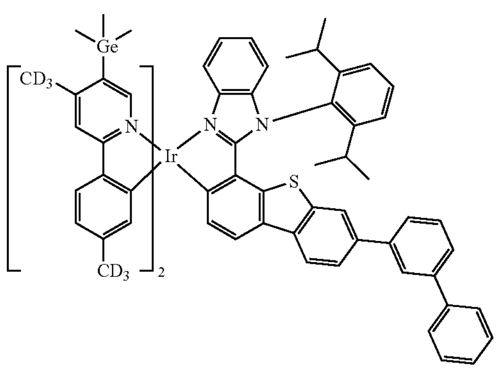
3163
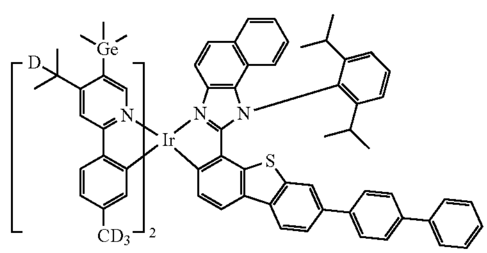
3164
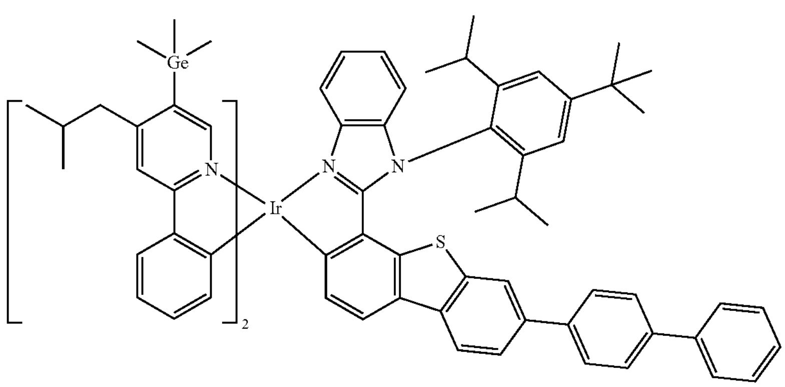

-continued
3165
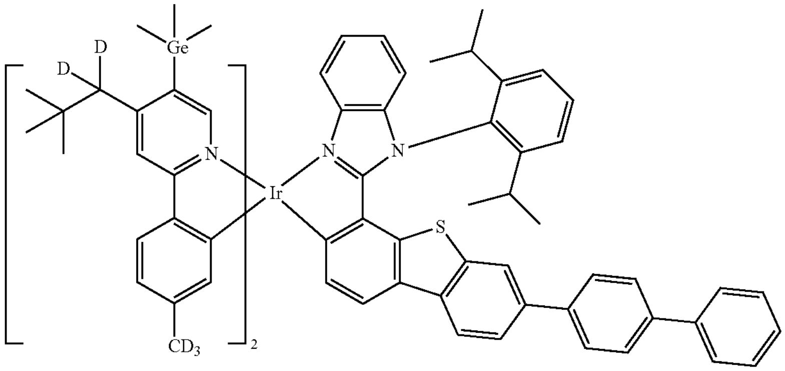
3166
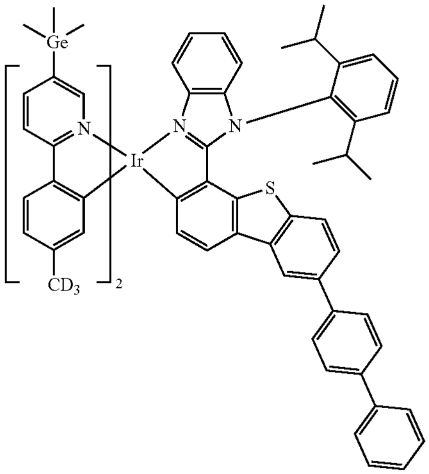
3167
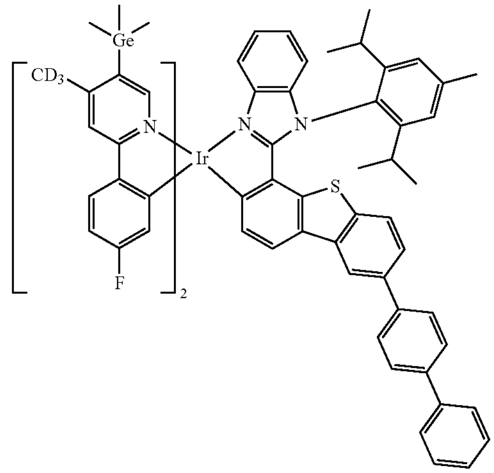
3168
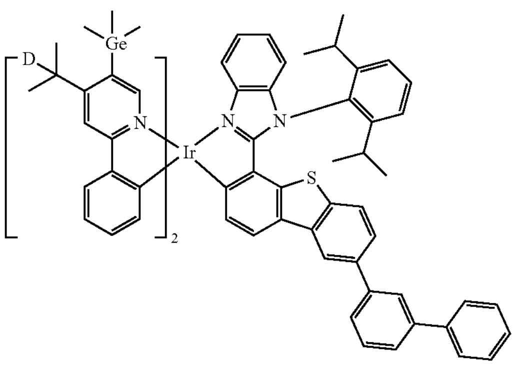
3169
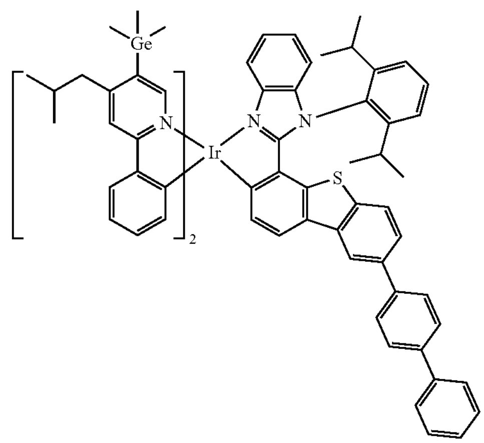
3170
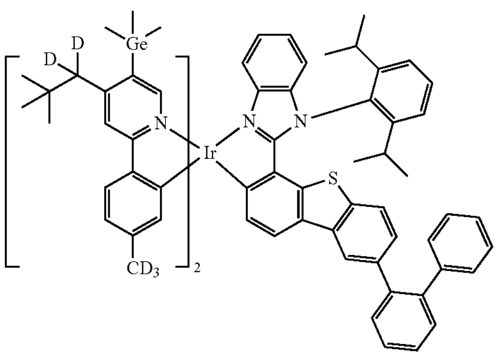
3171
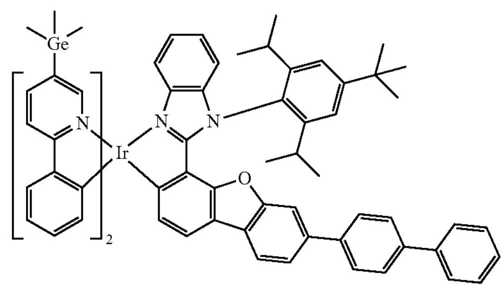

-continued
3172
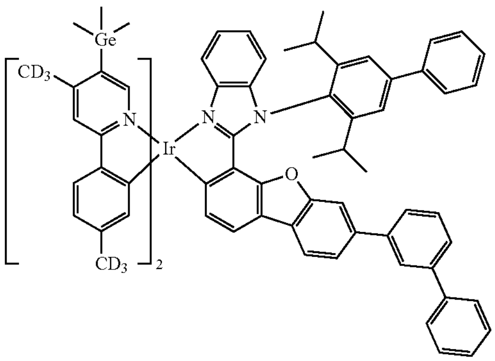
3173
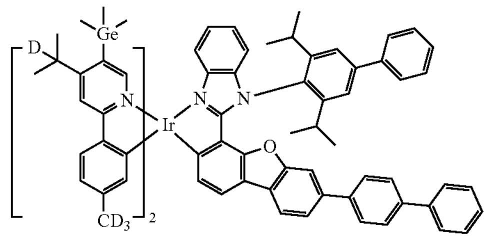
3174
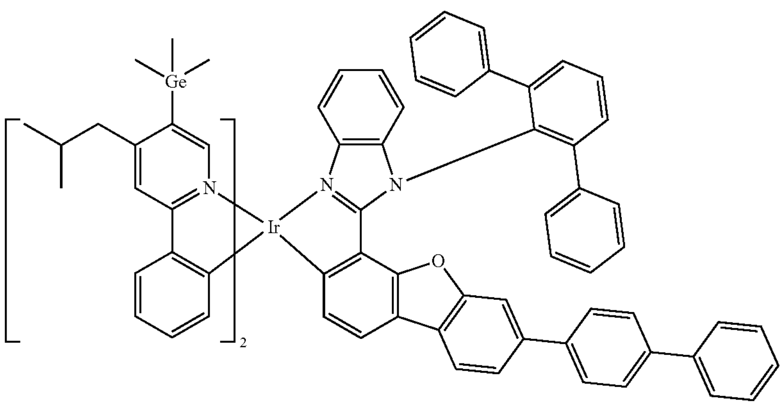
3175
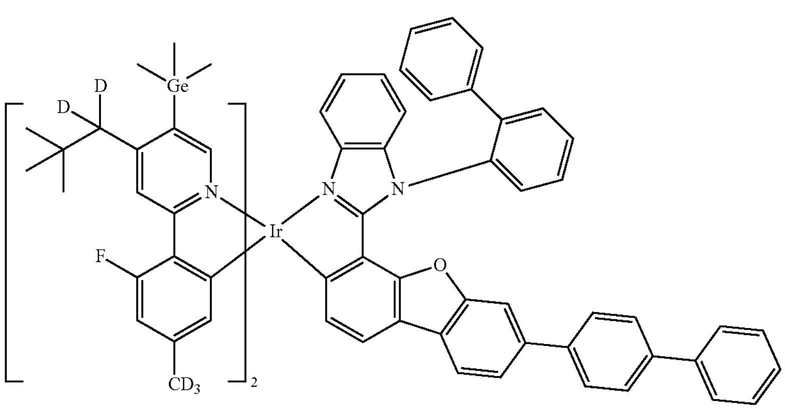

-continued
3176
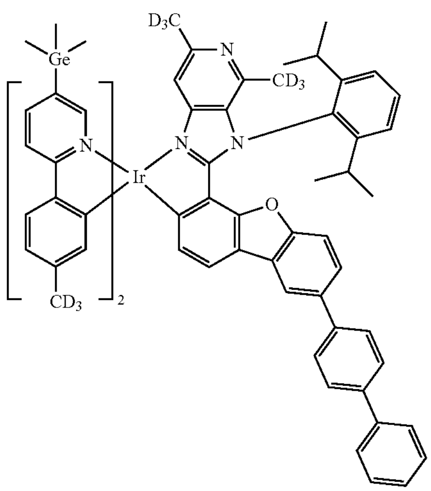
3177
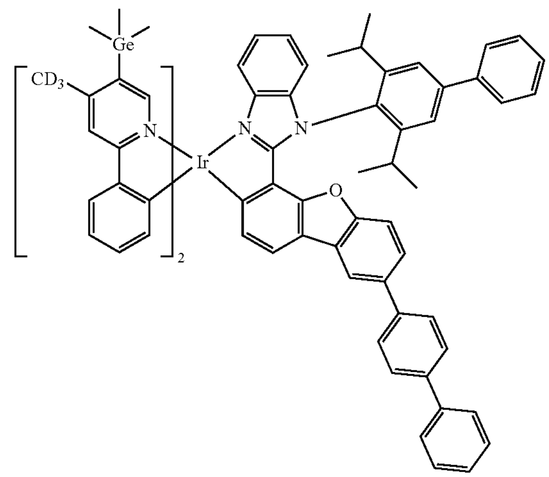
3178
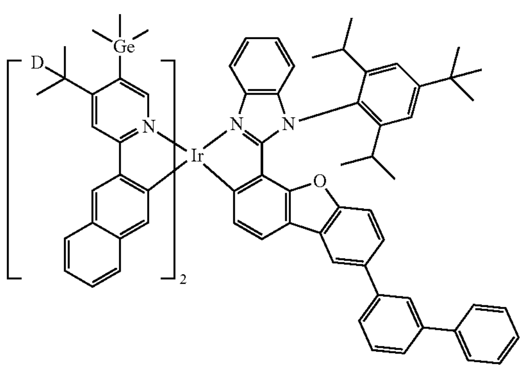
3179
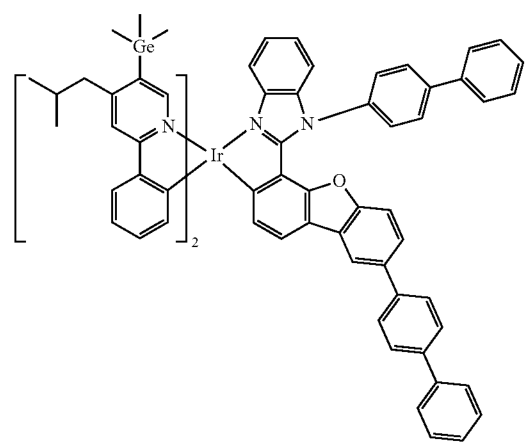
3180
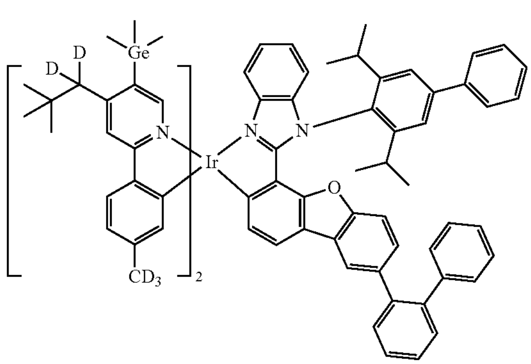
3181
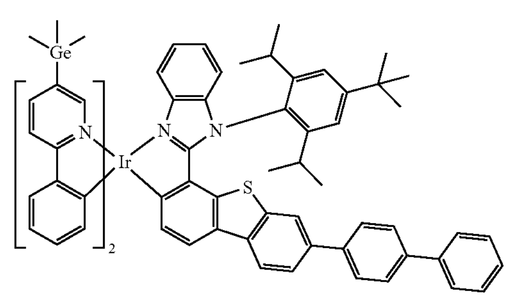

-continued
3182
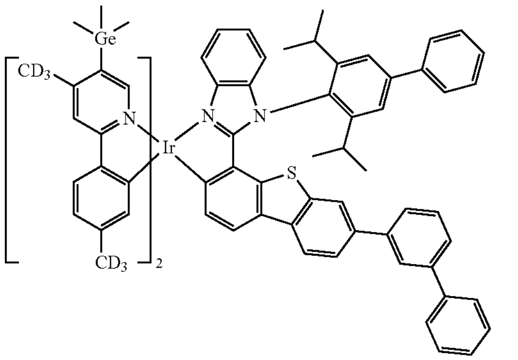
3183
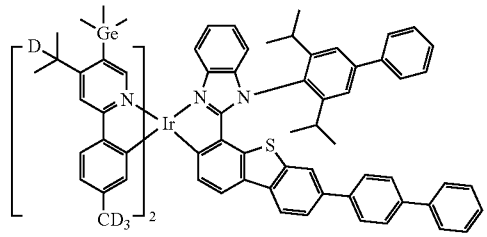
3184
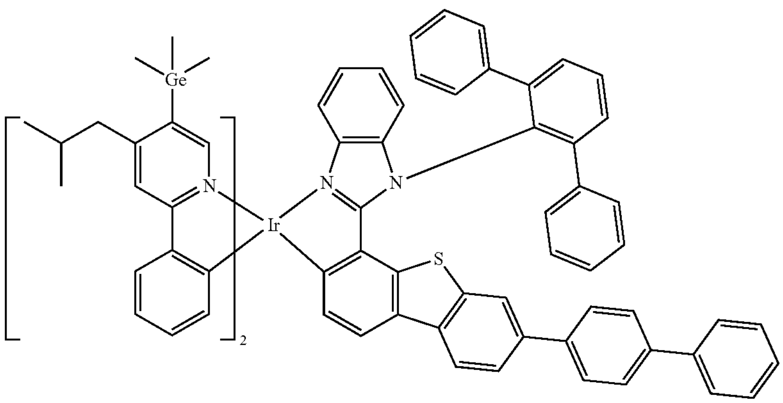
3185
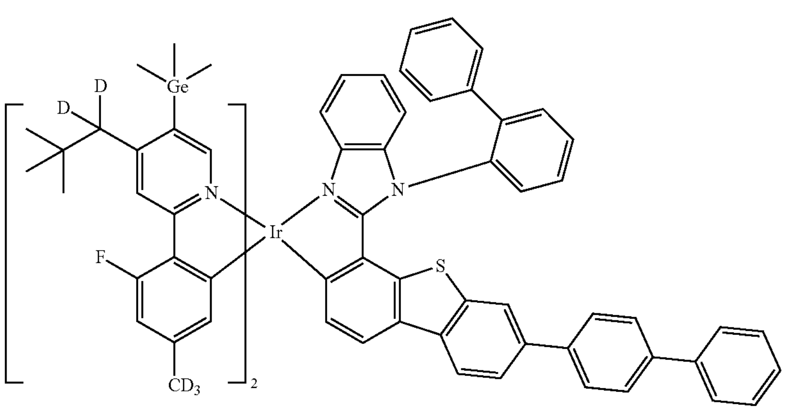

-continued
3186
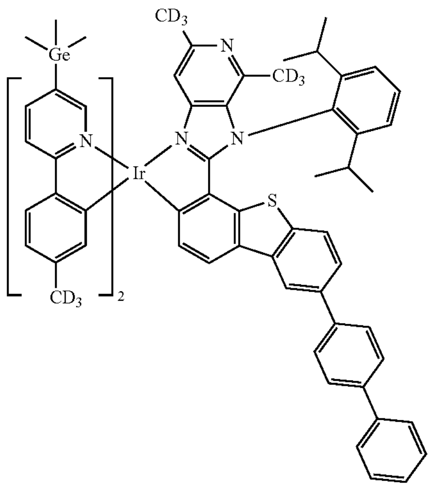
3187
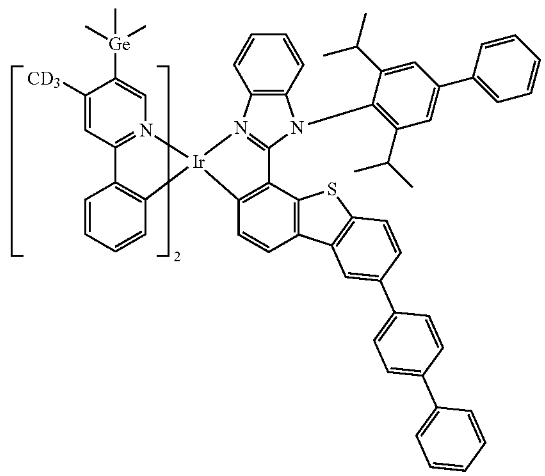
3188
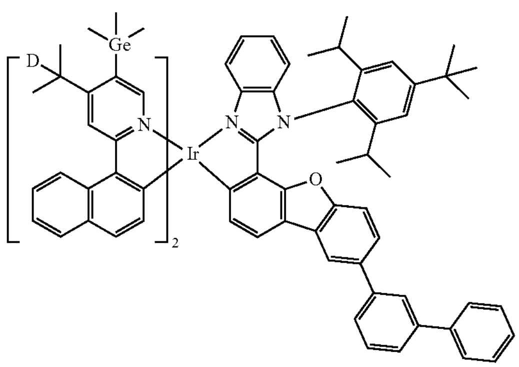
3189
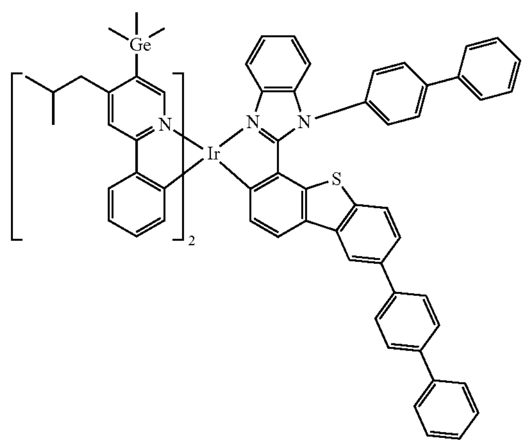
3190
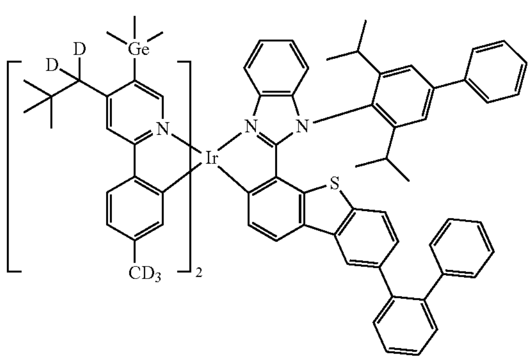
3191
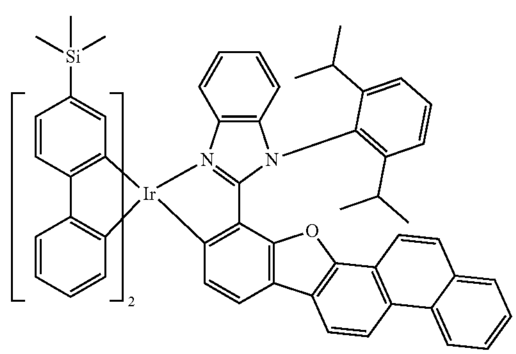
3192
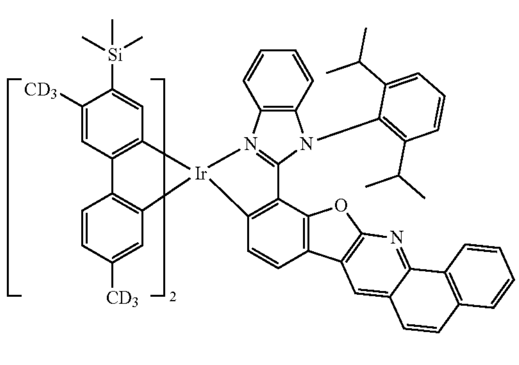
3193
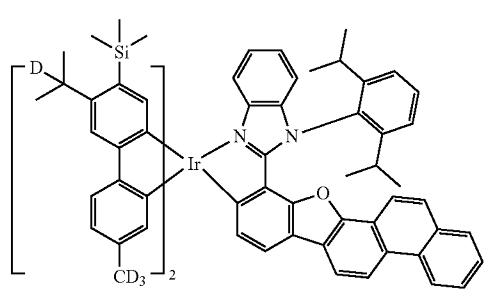

-continued
3194
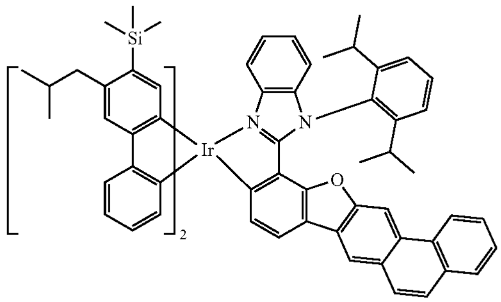
3195
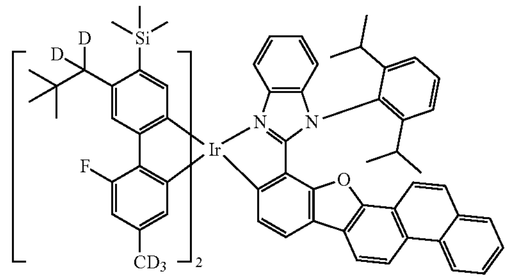
3196
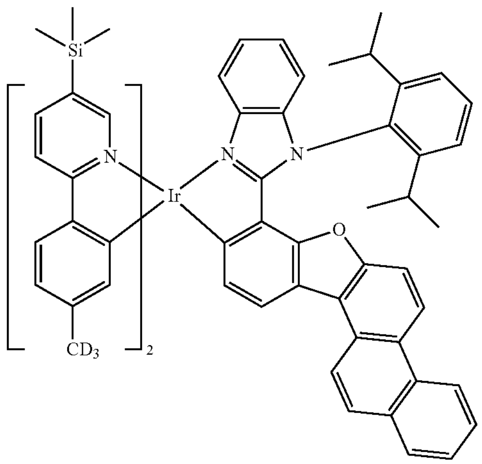
3197
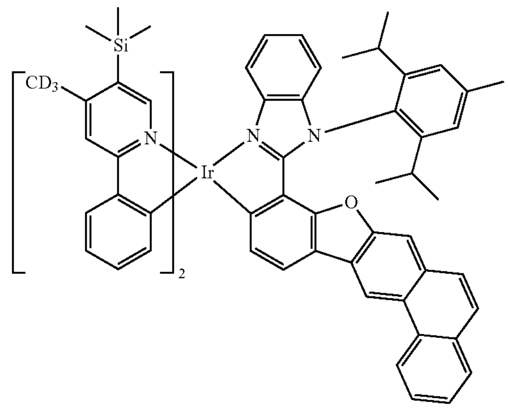
3198
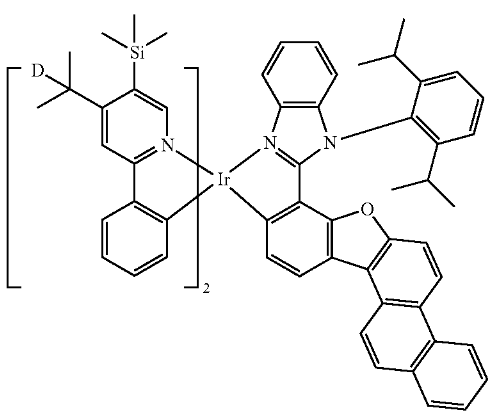
3199
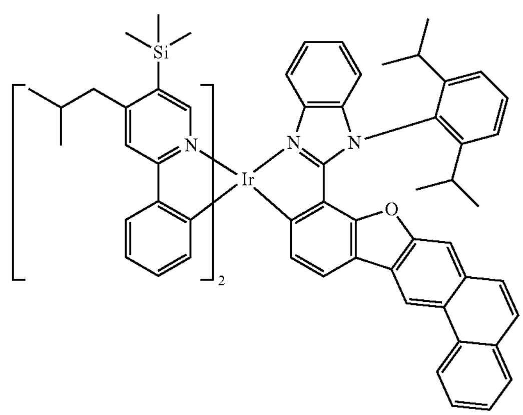
3200
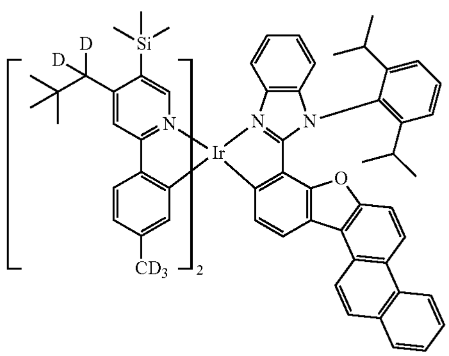
3201
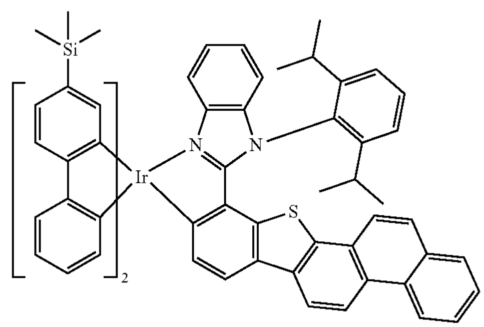

-continued
3202
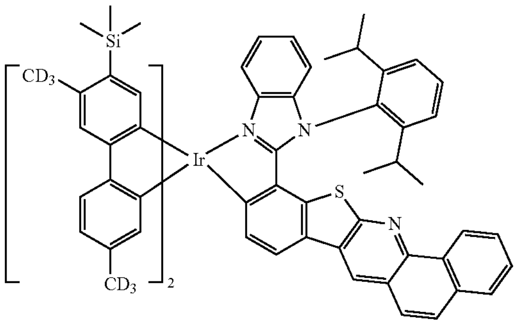
3203
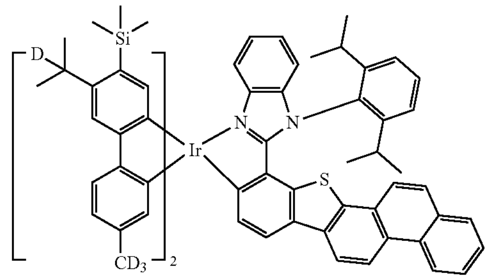
3204
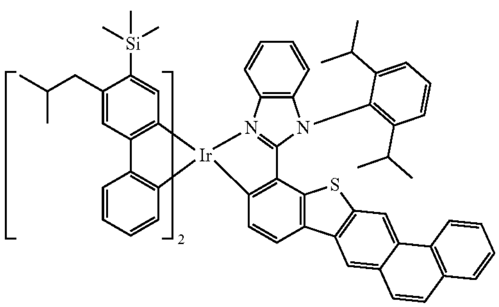
3205
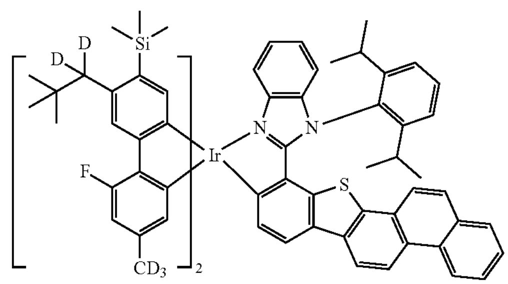
3206
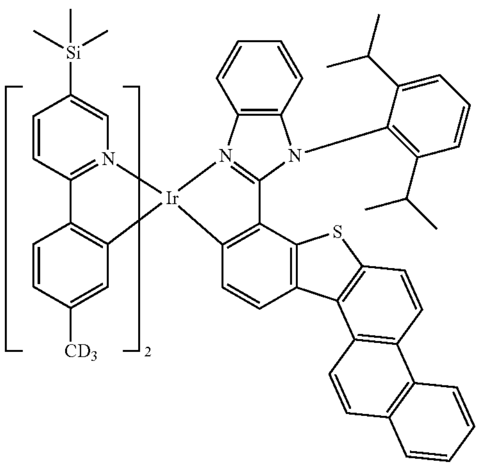
3207
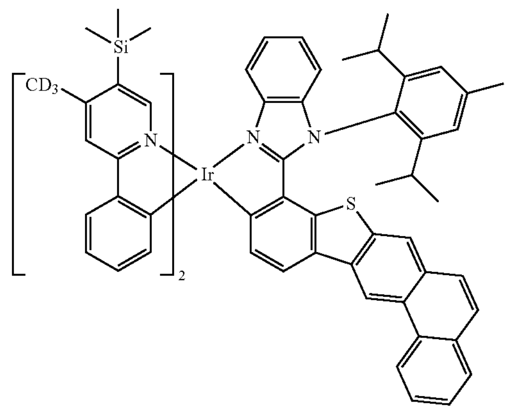
3208
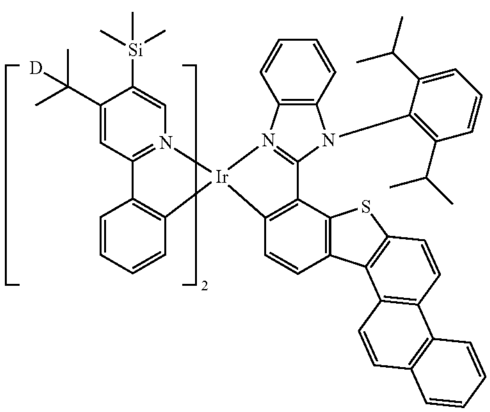
3209
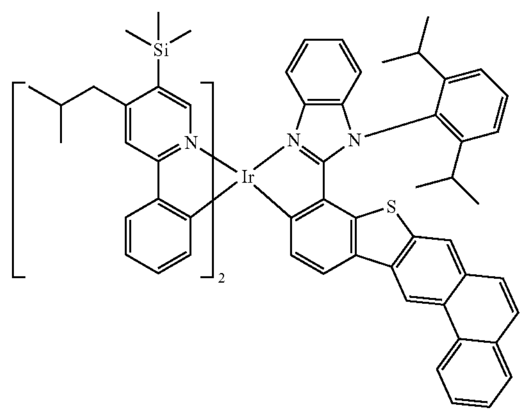

-continued
3210
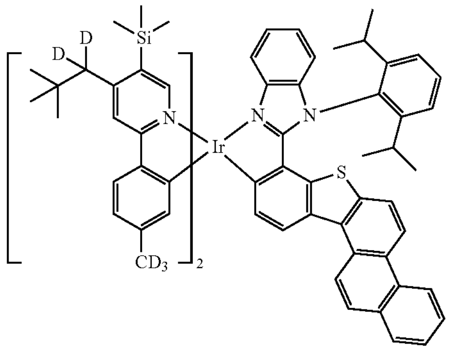
3211
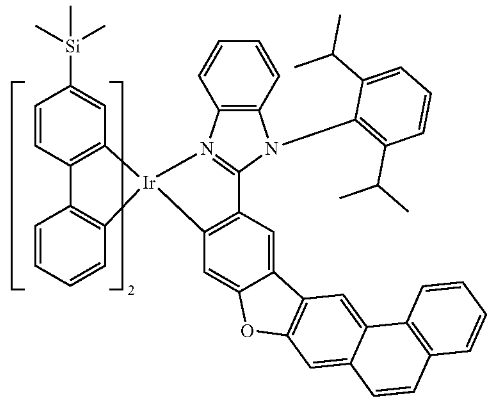
3212
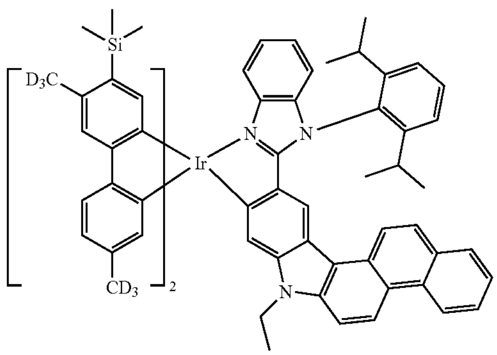
3213
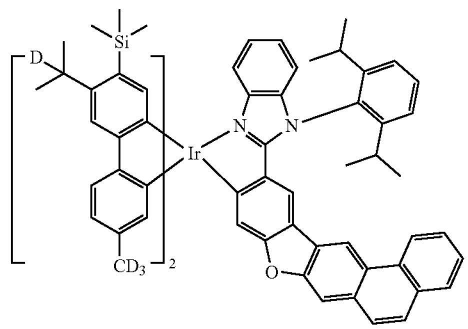
3214
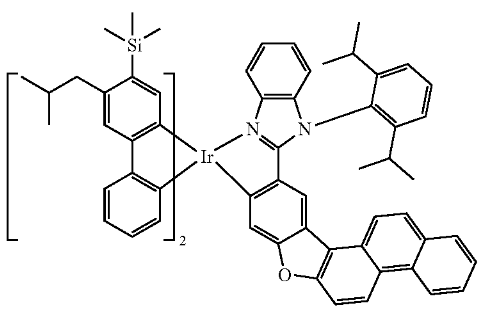
3215
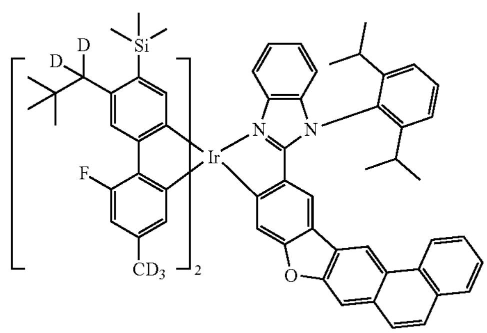
3216
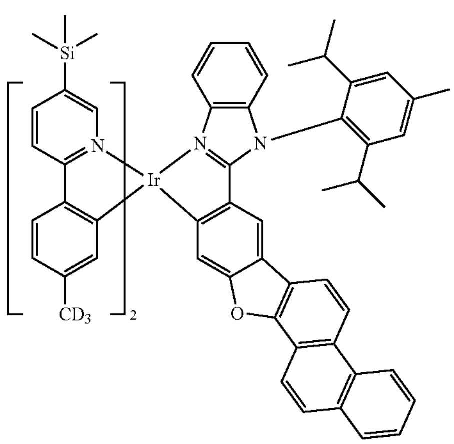
3217
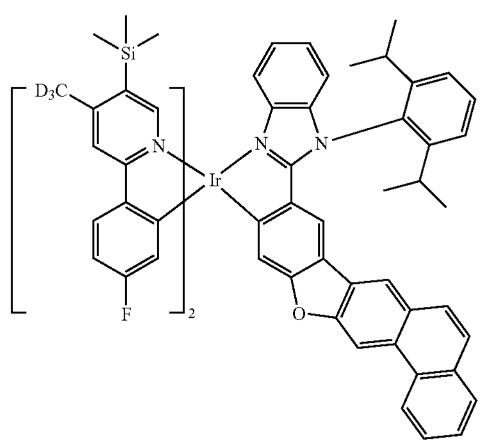

-continued
3218
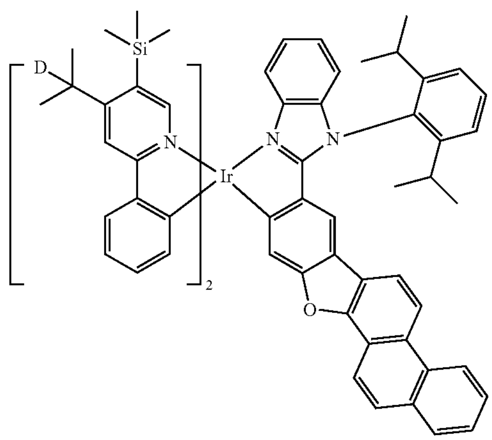
3219
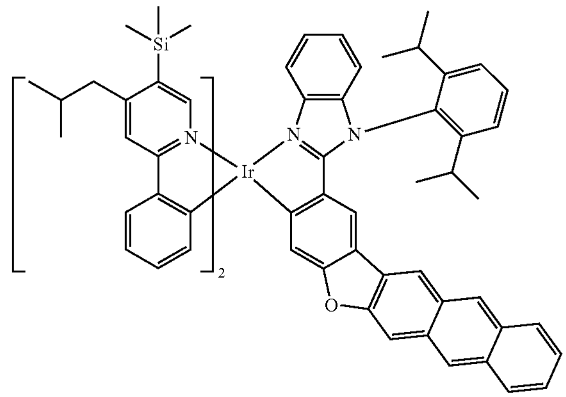
3220
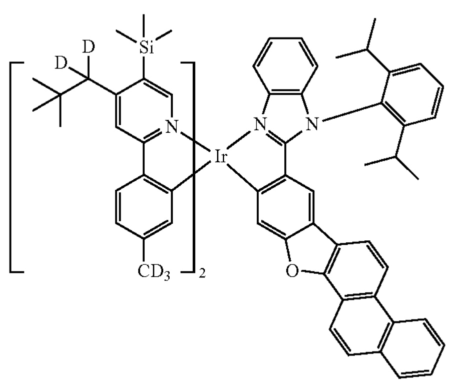
3221
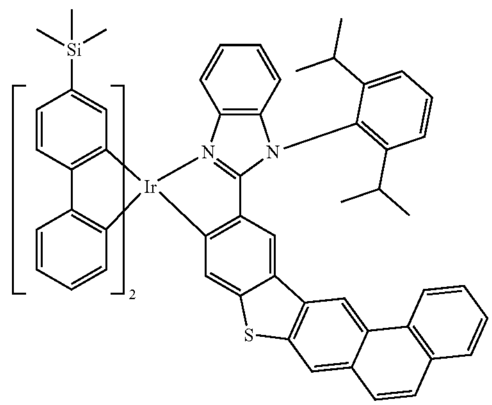
3222
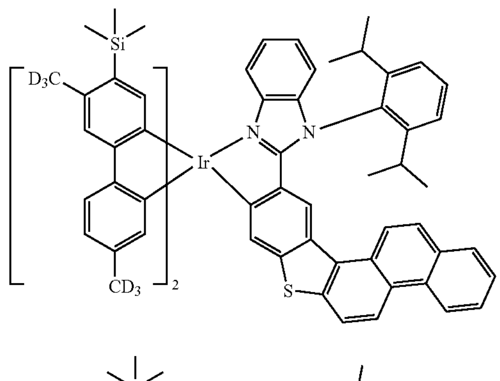
3223
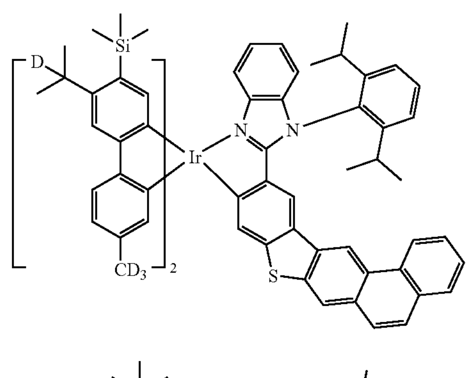
3224
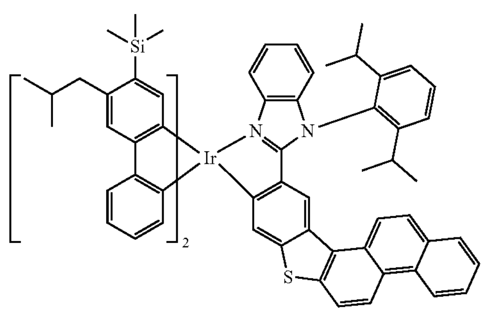
3225
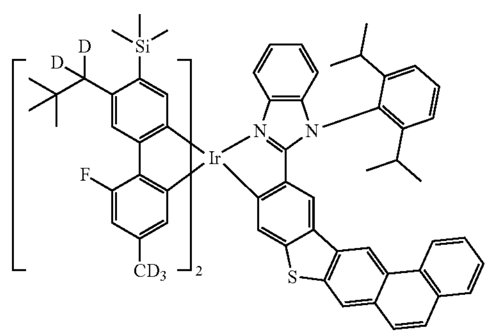

-continued
3226
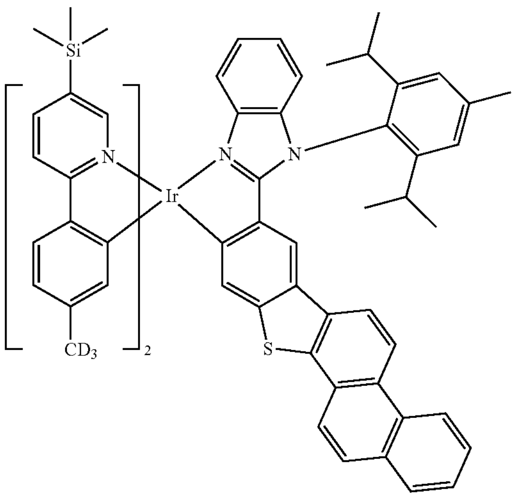
3227
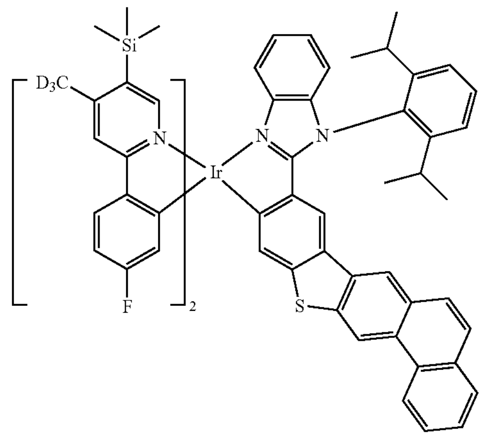
3228
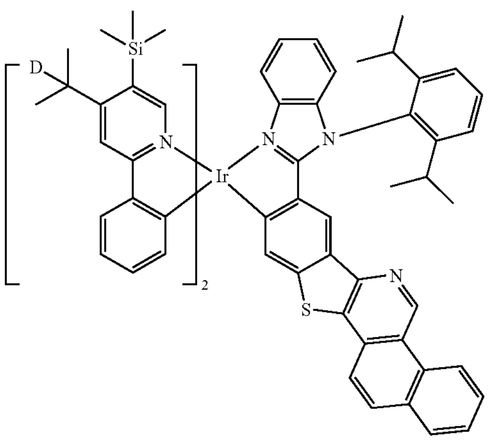
3229
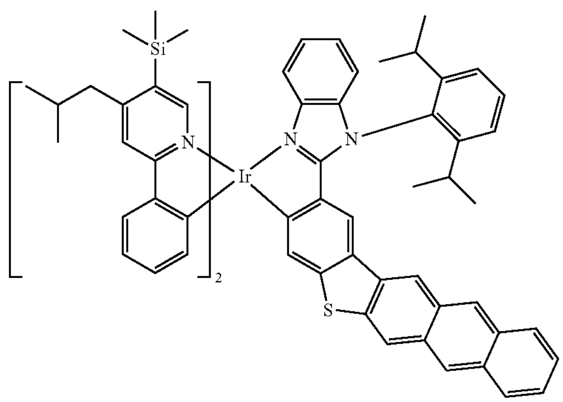
3230
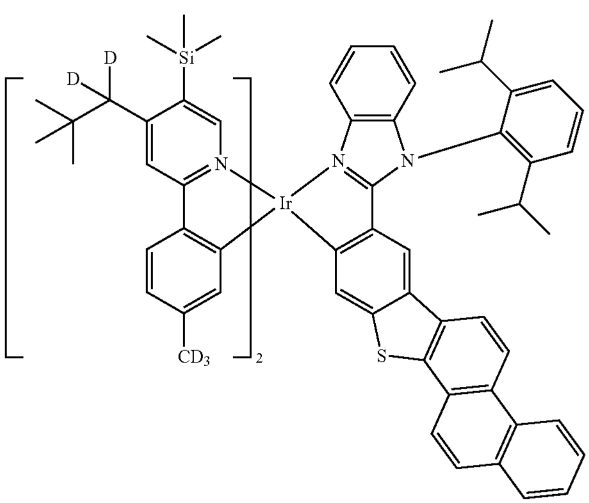

-continued
3231
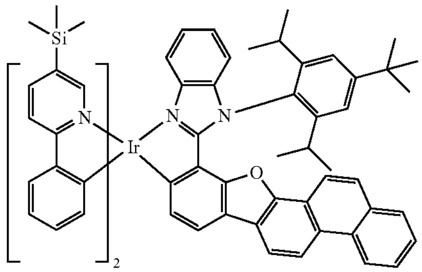
3232
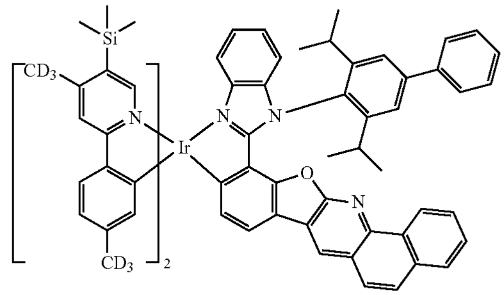
3233
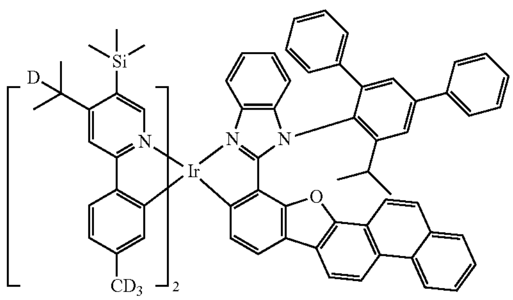
3234
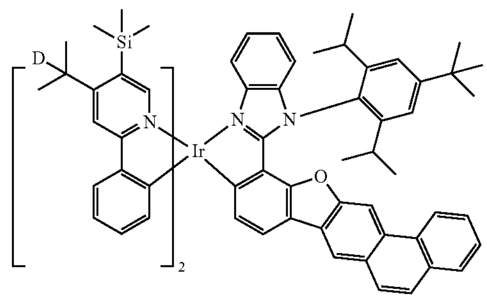
3235
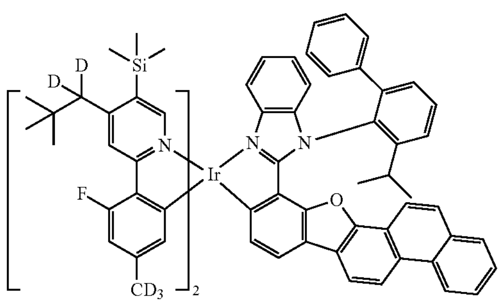
3236
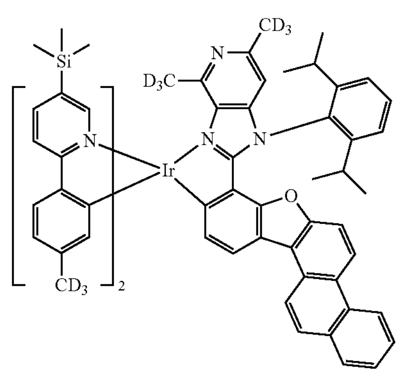
3237
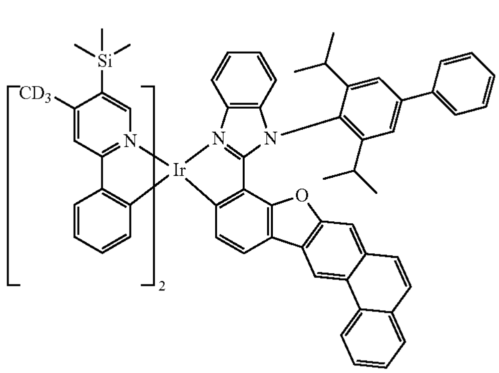
3238
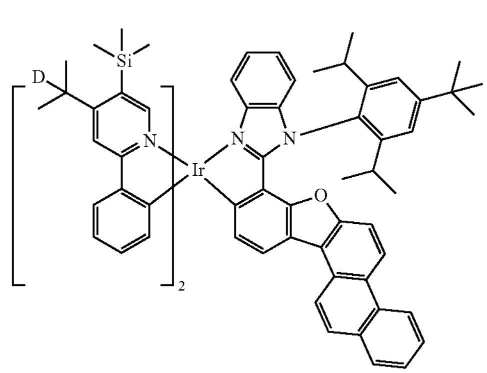

-continued
3239
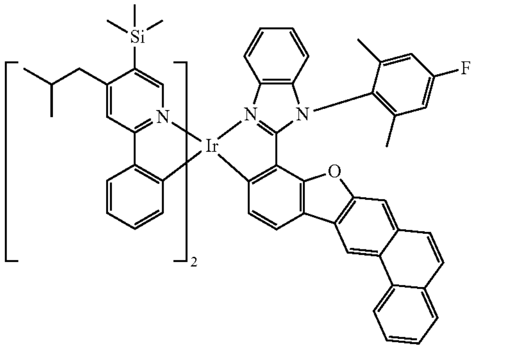
3240
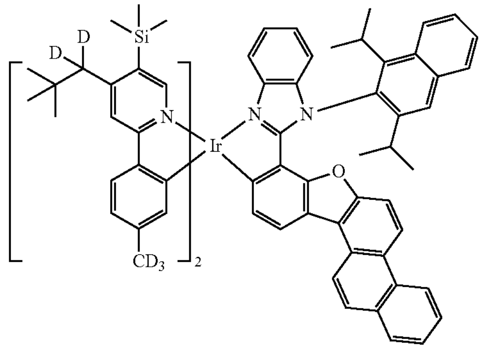
3241
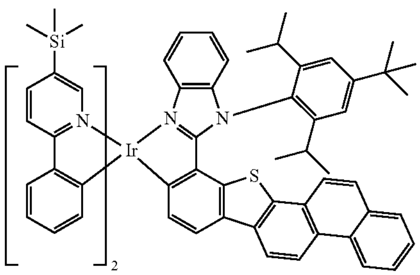
3242
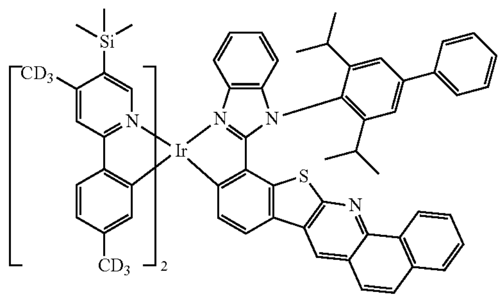
3243
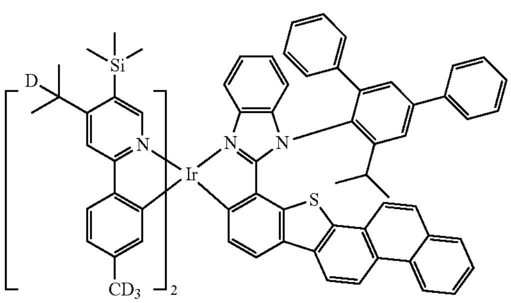
3244
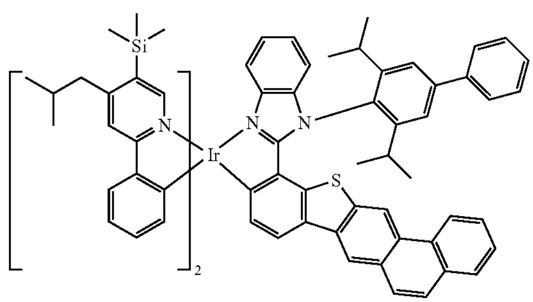
3245
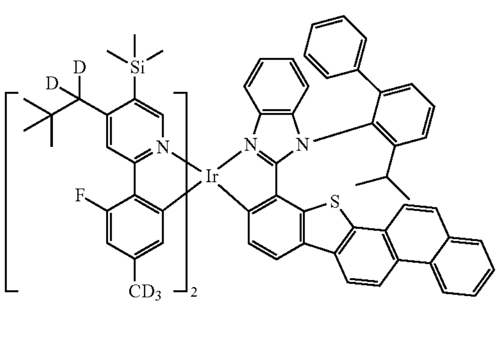
3246
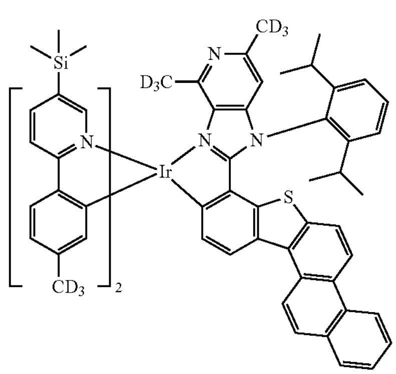

-continued
3247
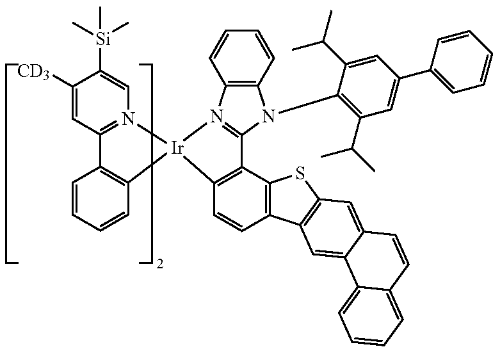
3248
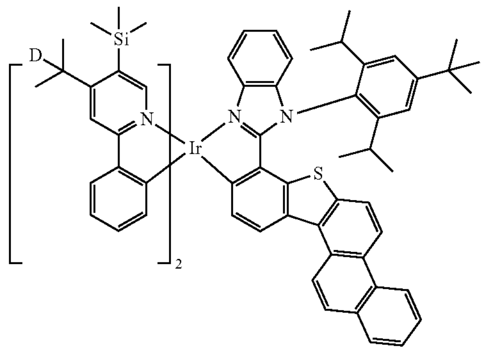
3249
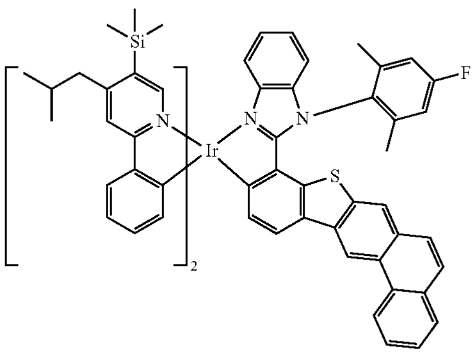
3250
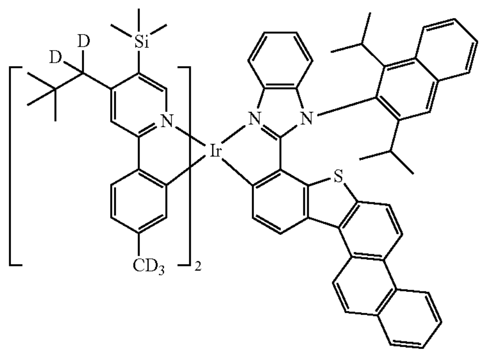
3251
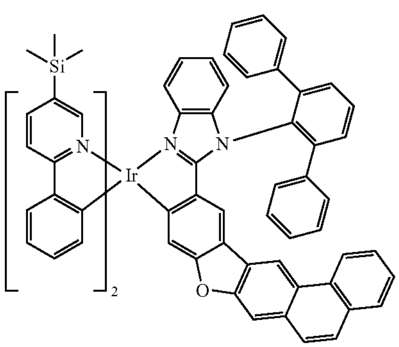
3252
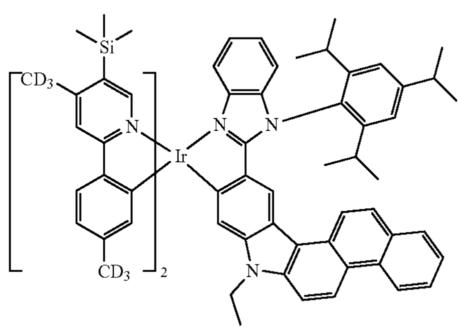
3253
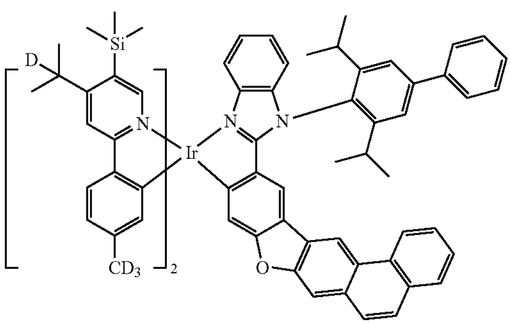
3254
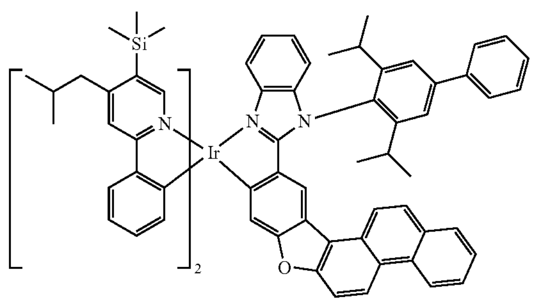

-continued
3255
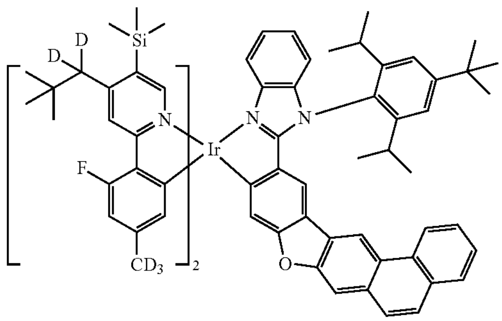
3256
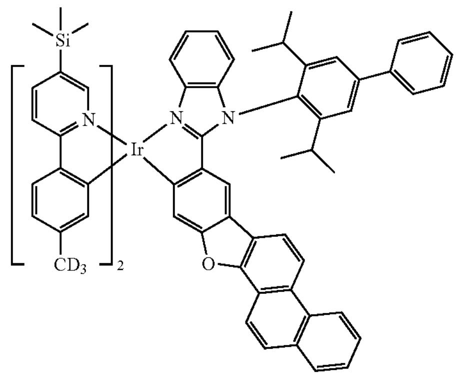
3257
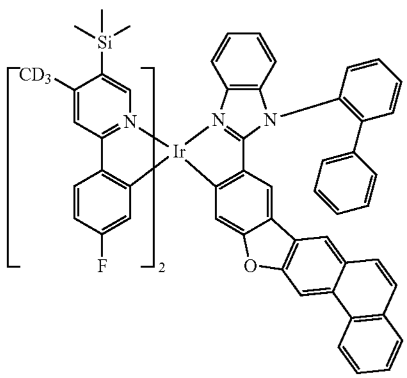
3258
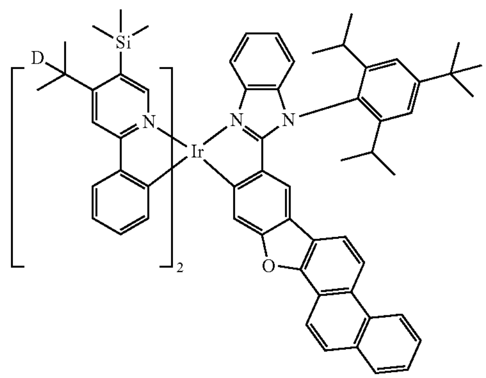
3259
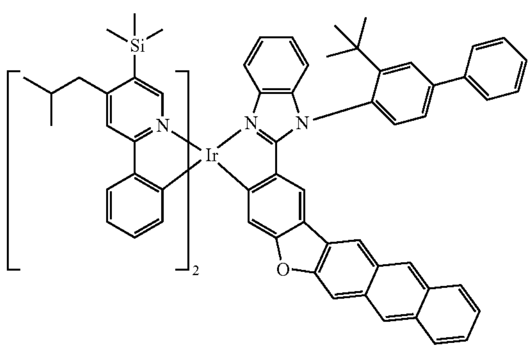
3260
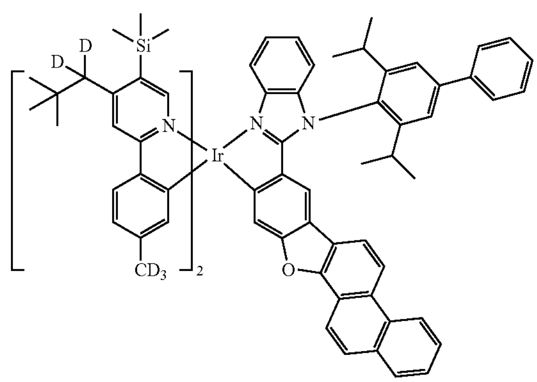
3261
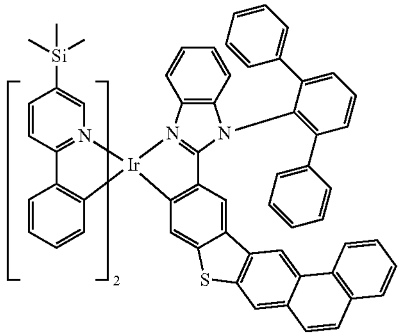
3262
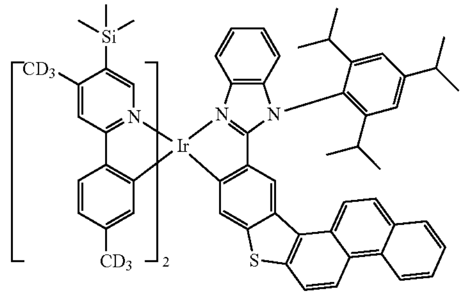

-continued
3263
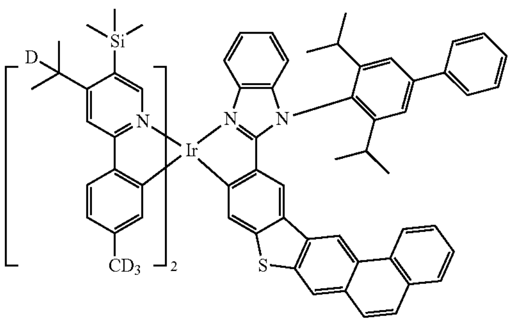
3264
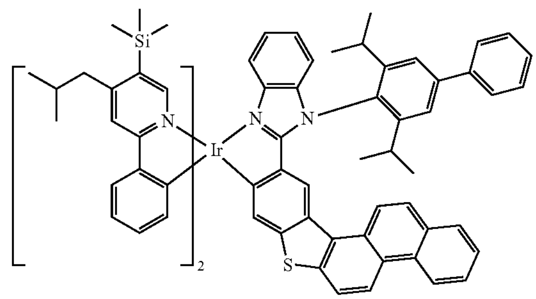
3265
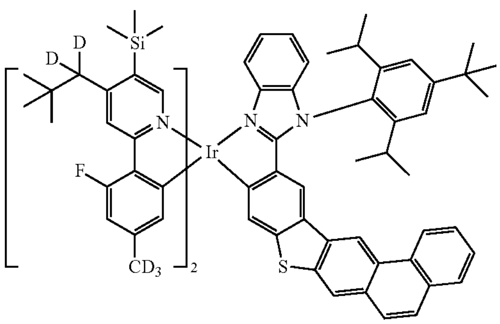
3266
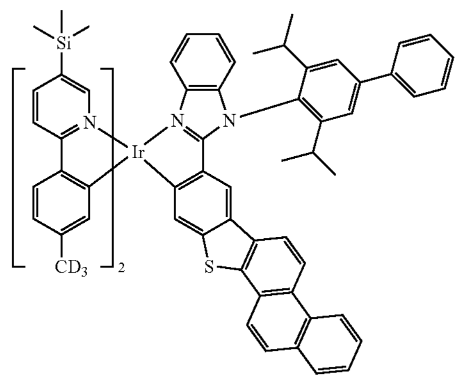
3267
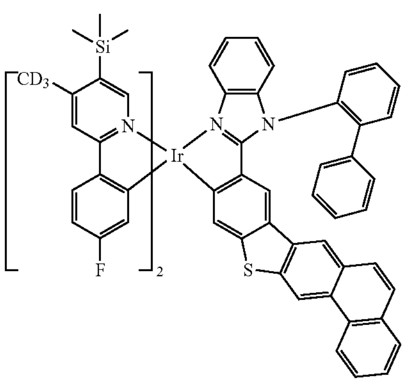
3268
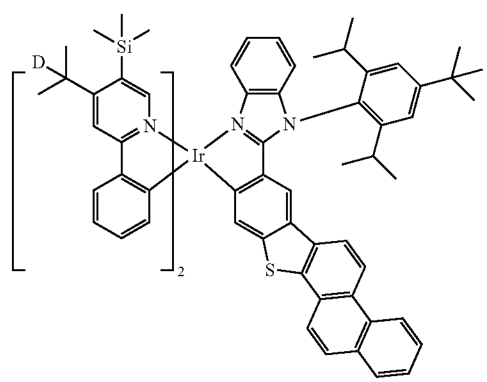
3269
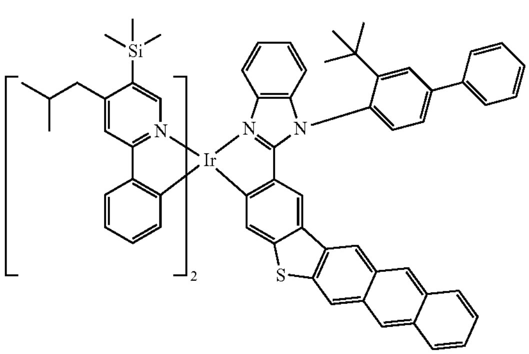
3270
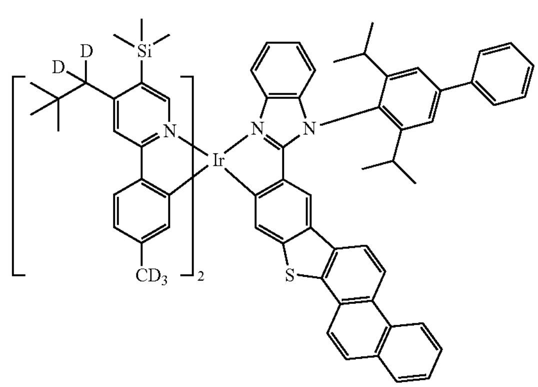

-continued
3271
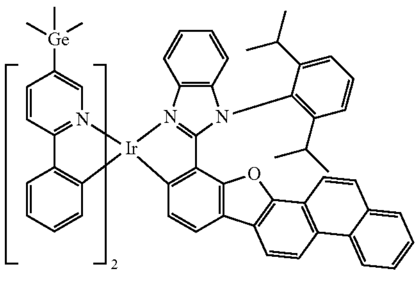
3272
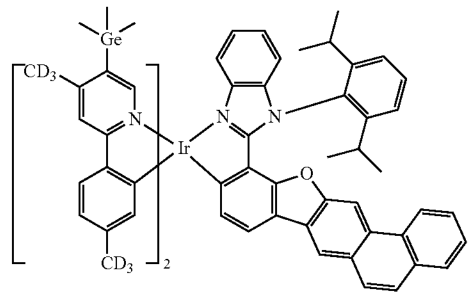
3273
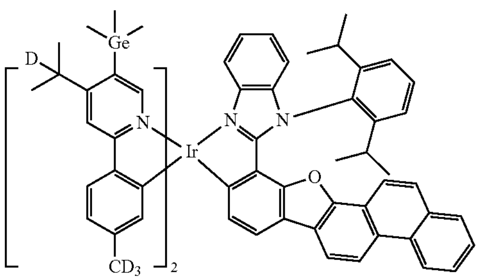
3274
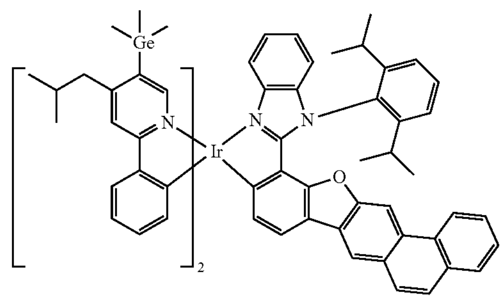
3275
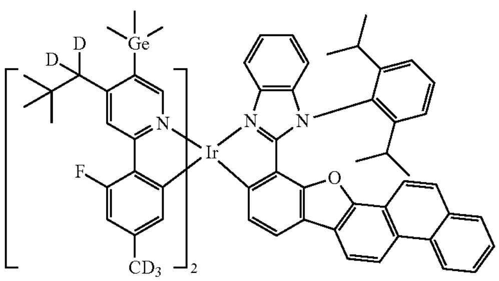
3276
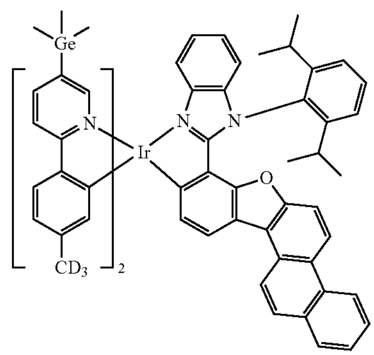
3277
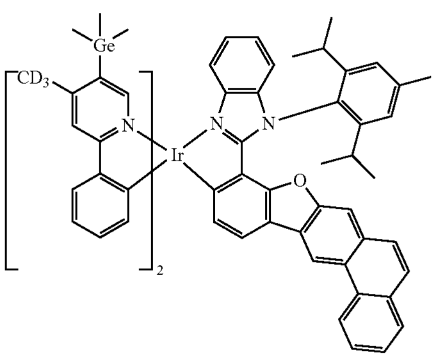
3278
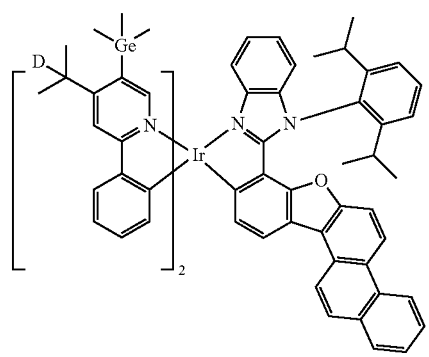

-continued
3279
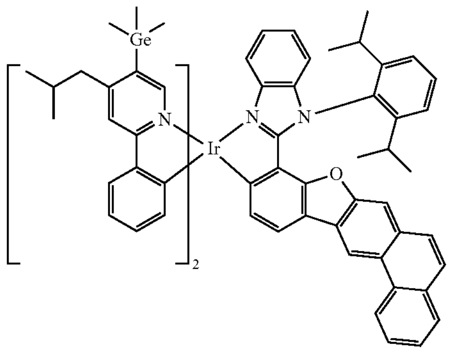
3280
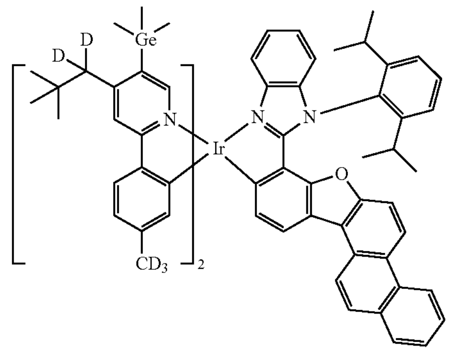
3281
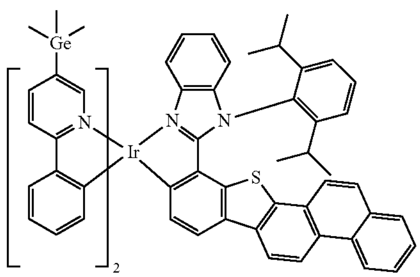
3282
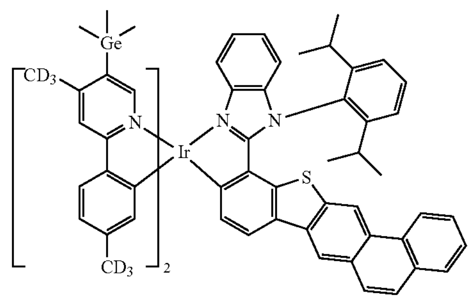
3283
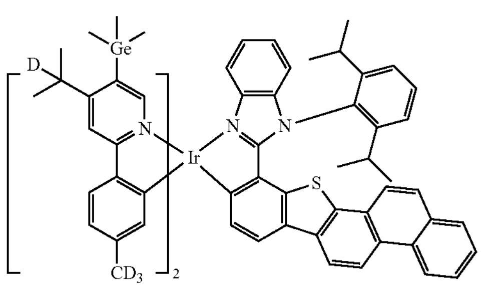
3284
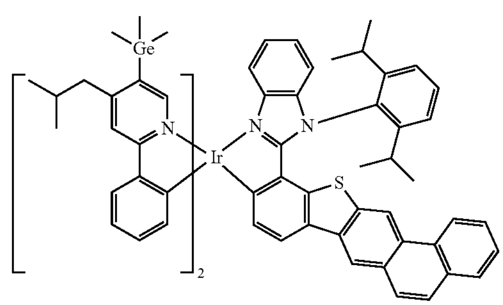
3285
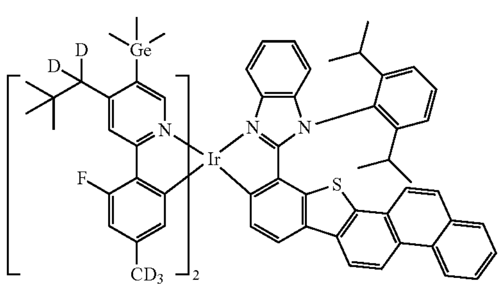
3286
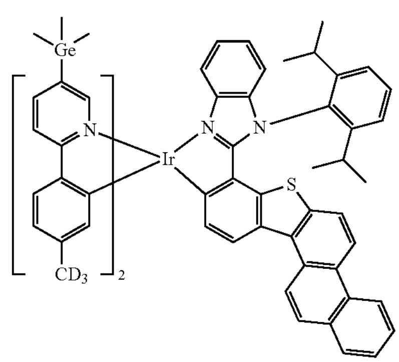

-continued
3287
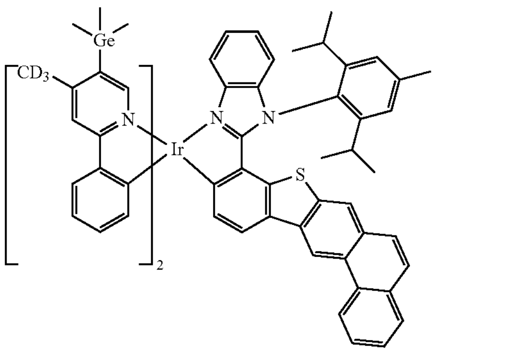
3288
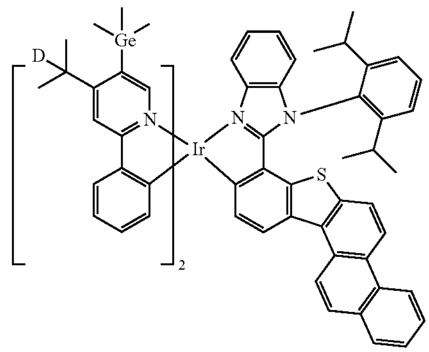
3289
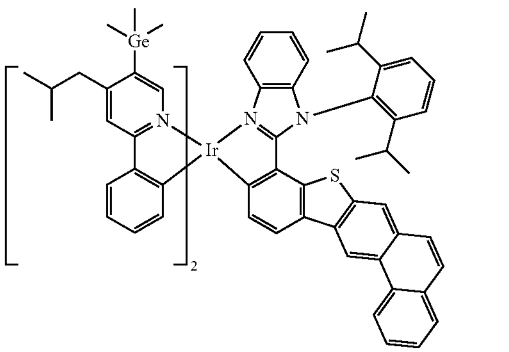
3290
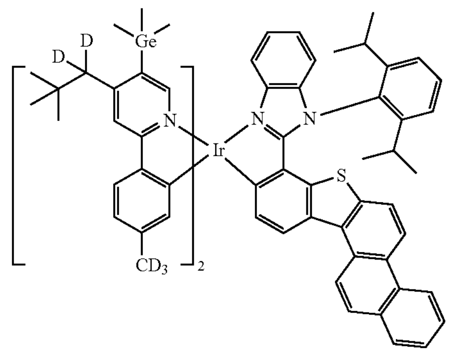
3291
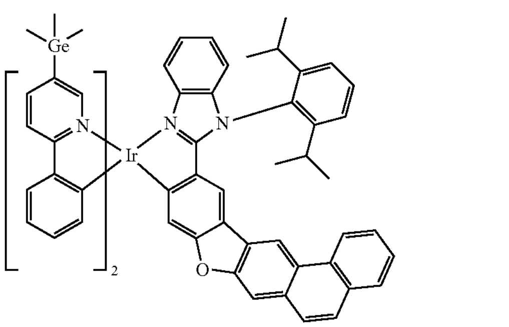
3292
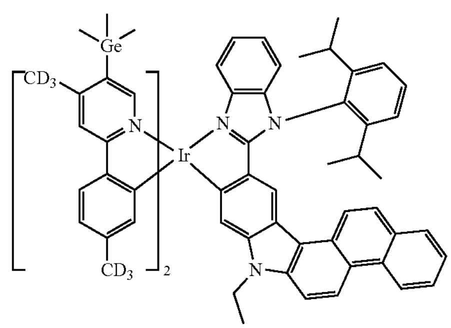
3293
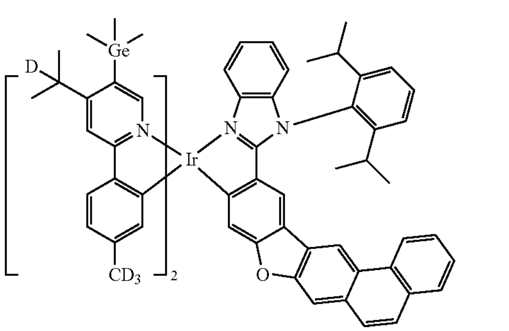
3294
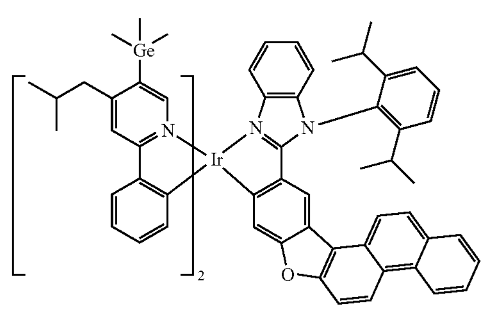

-continued
3295
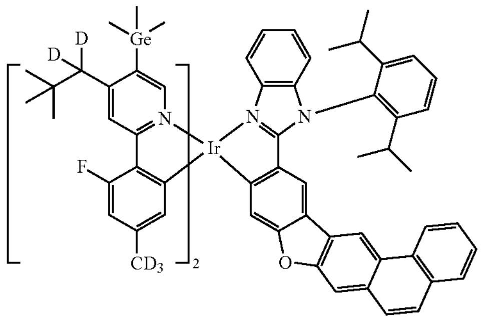
3296
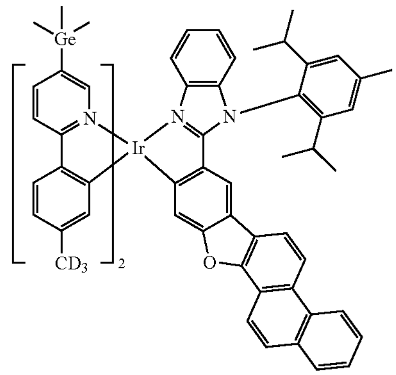
3297
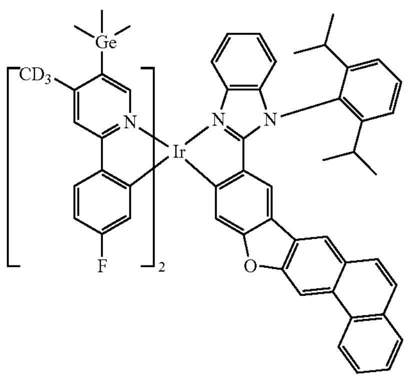
3298
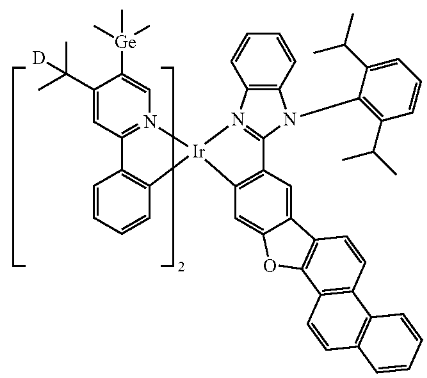
3299
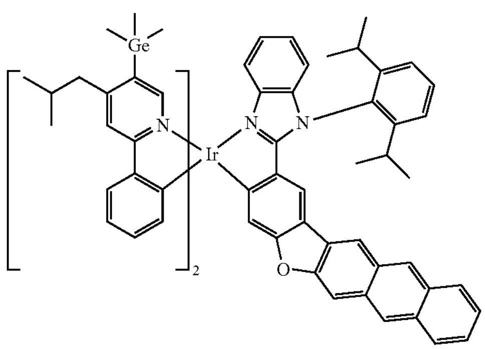
3300
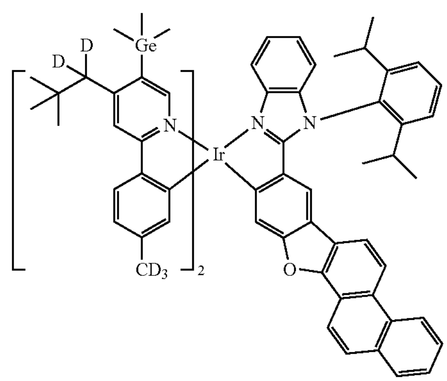
3301
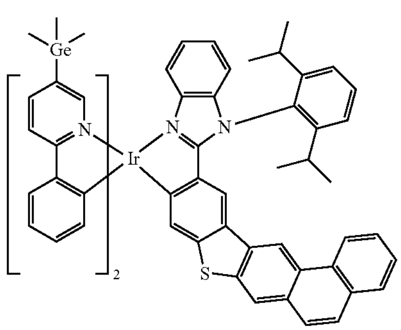
3302
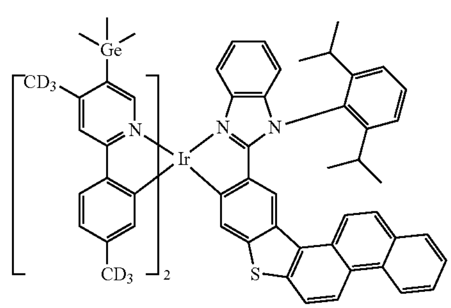

-continued
3303
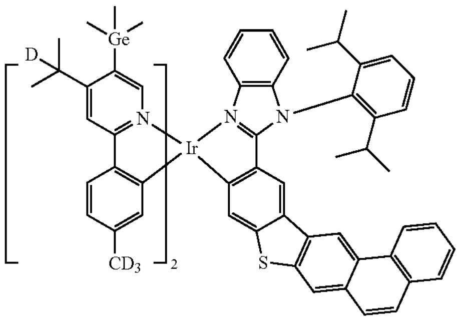
3304
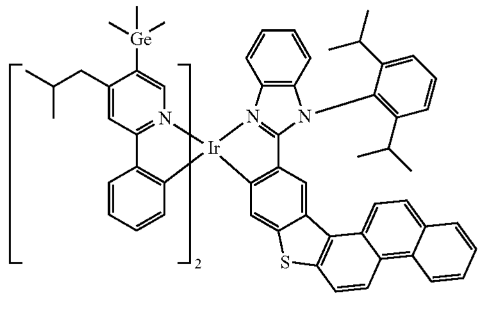
3305
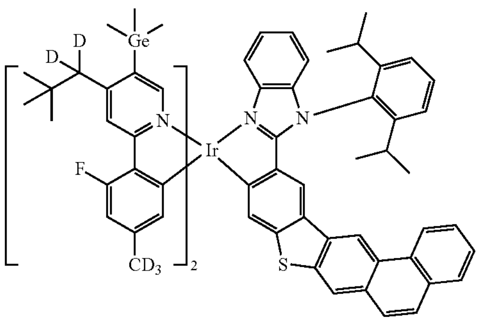
3306
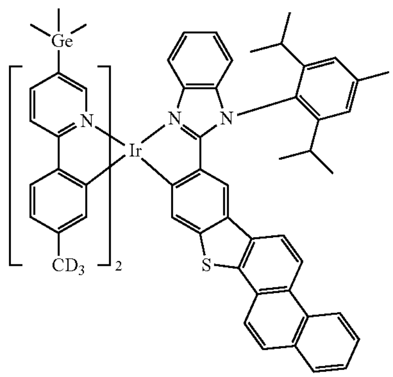
3307
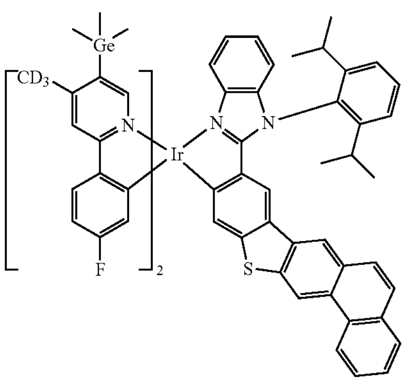
3308
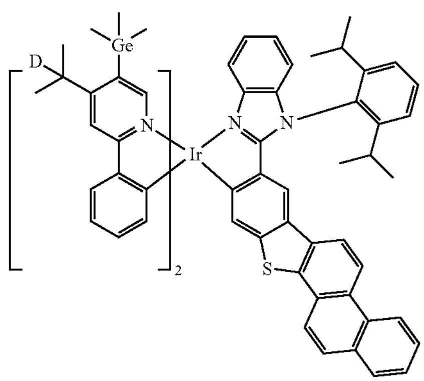
3309
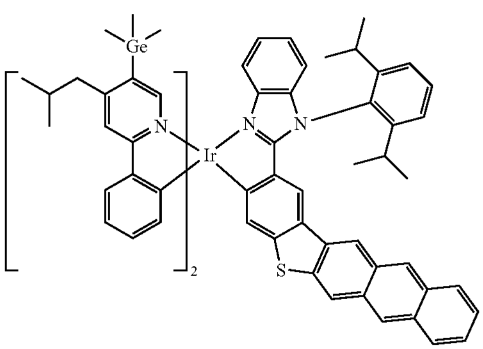
3310
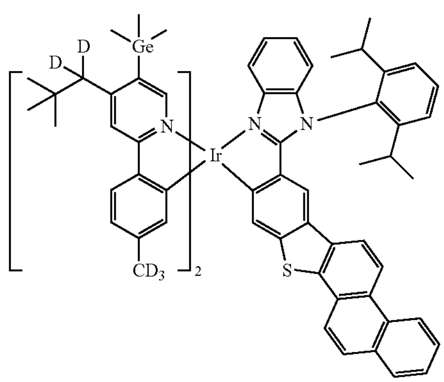

-continued
3311
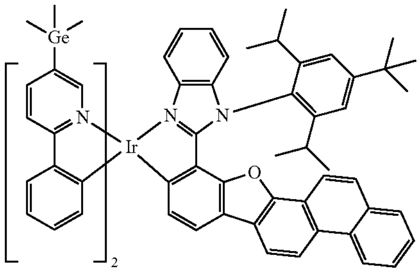
3312
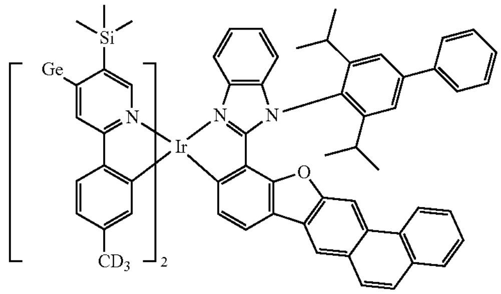
3313
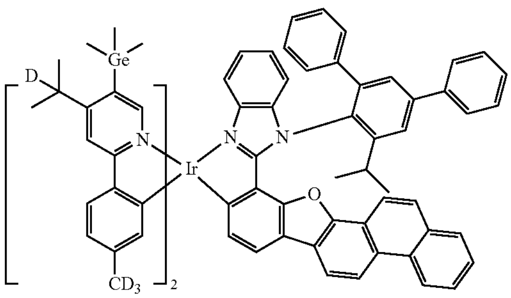
3314
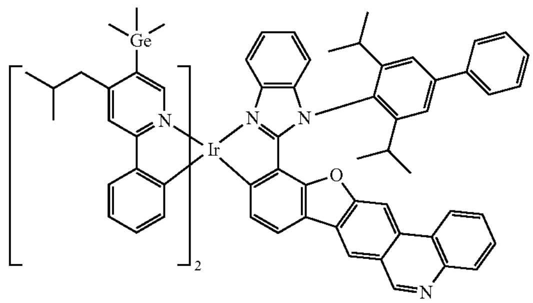
3315
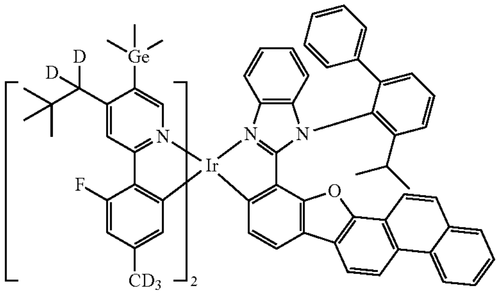
3316
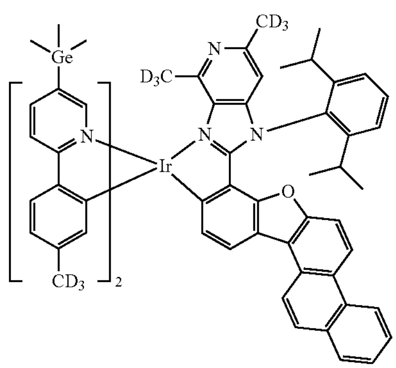
3317
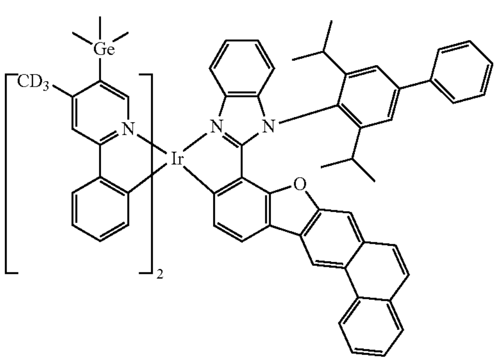
3318
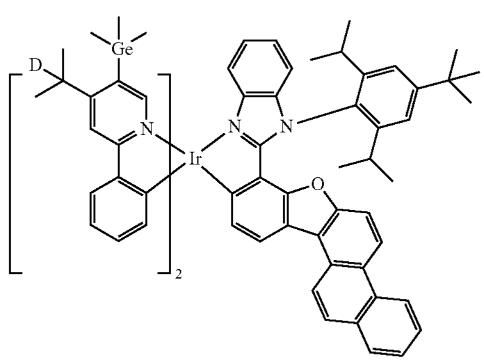

-continued
3319
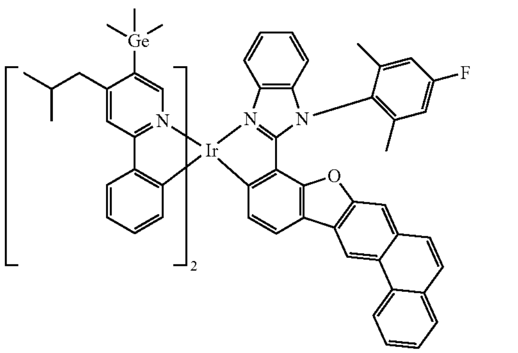
3320
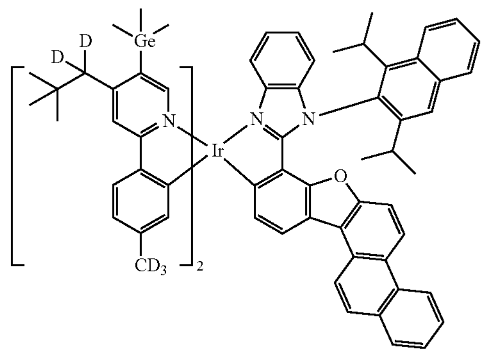
3321
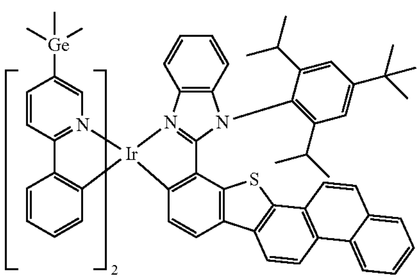
3322
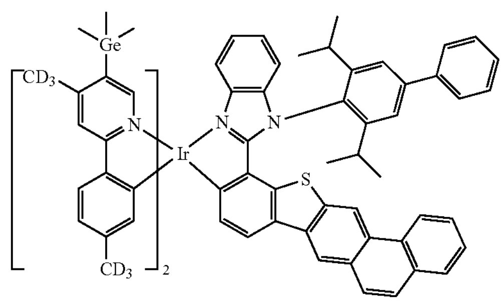
3323
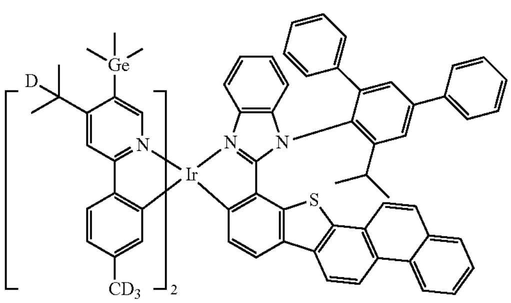
3324
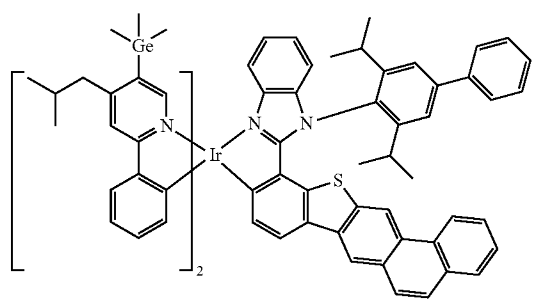
3325
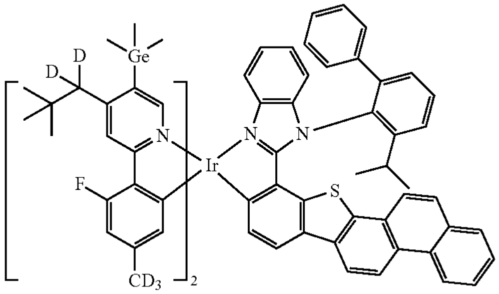
3326
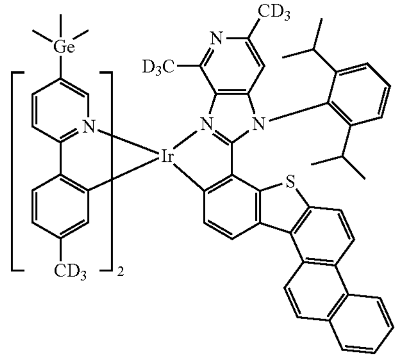

-continued
3327
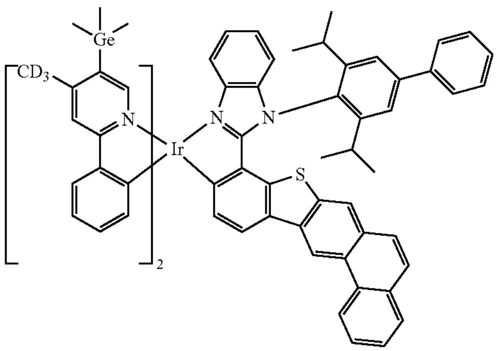
3328
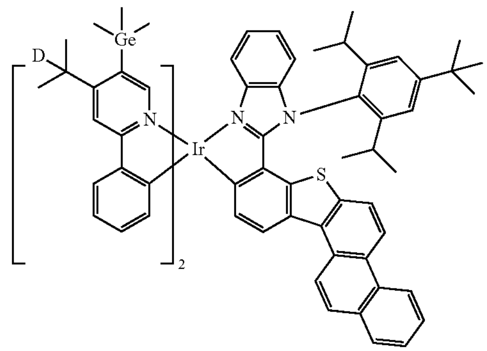
3329
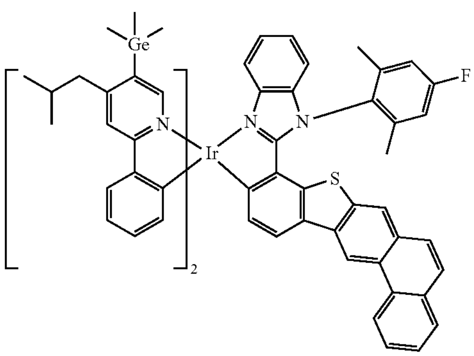
3330
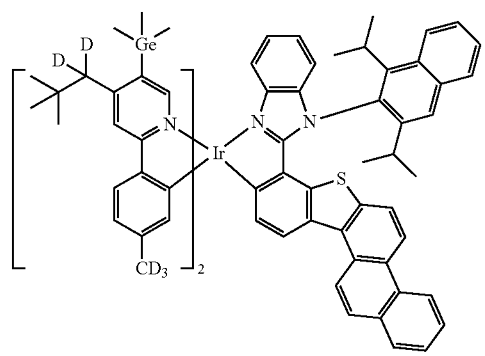
3331
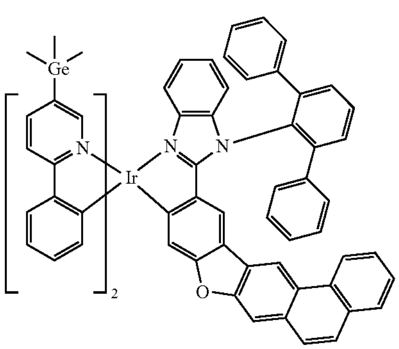
3332
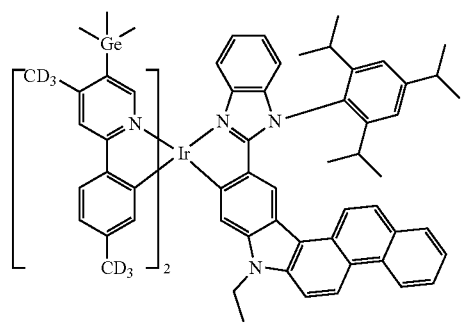
3333
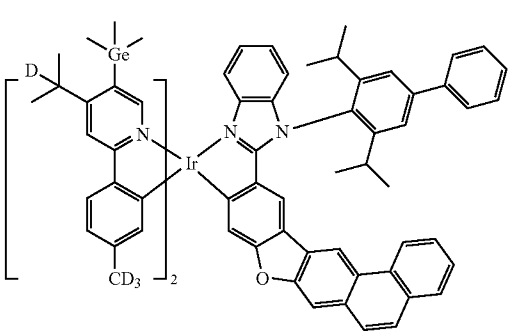
3334
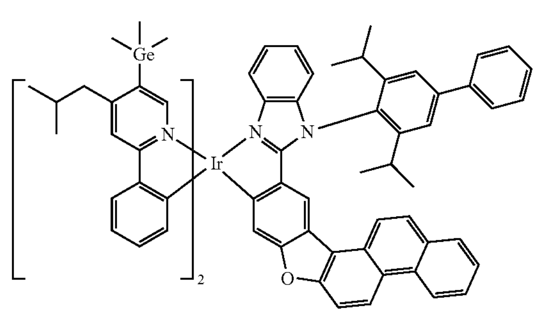

-continued
3335
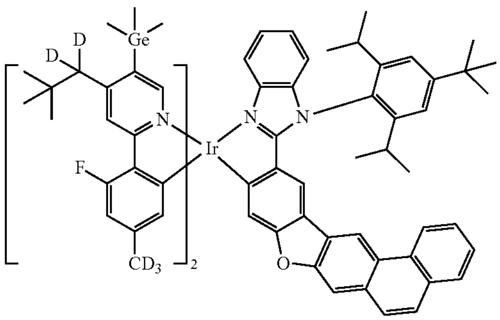
3336
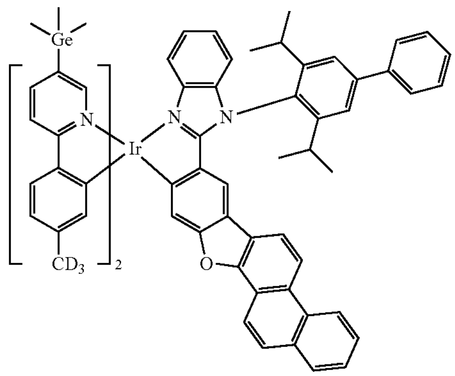
3337
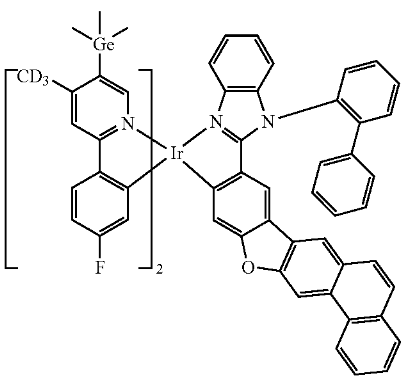
3338
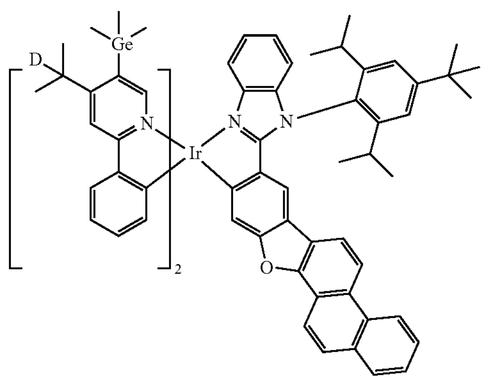
3339
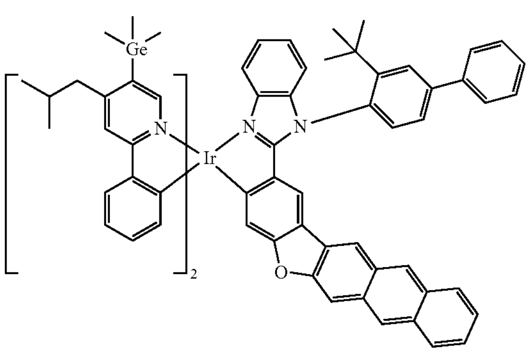
3340
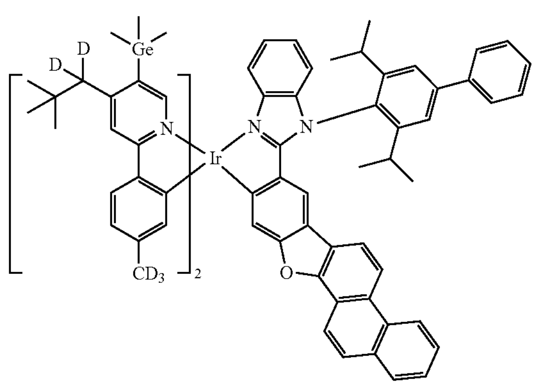
3341
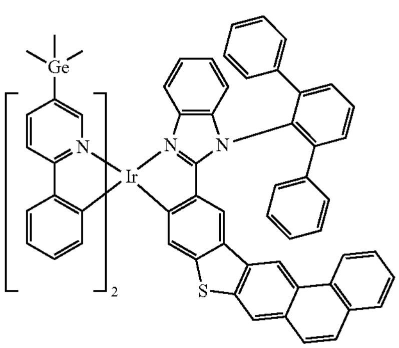
3342
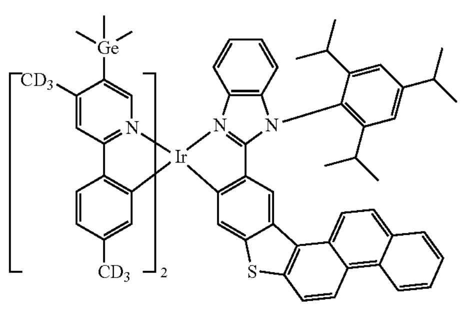

-continued

3343

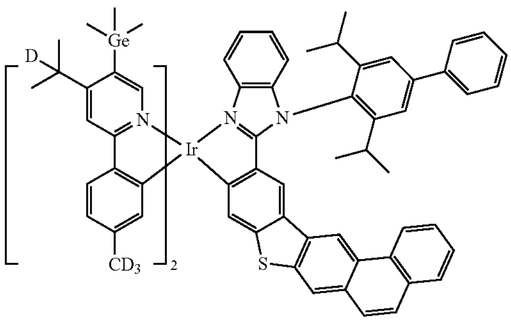

3344

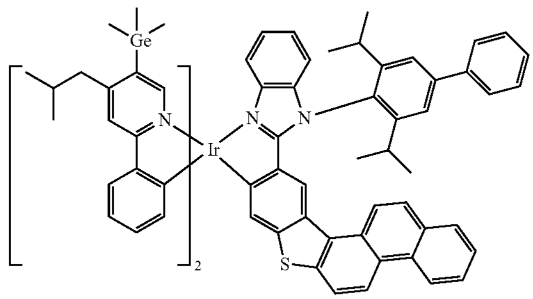

3345

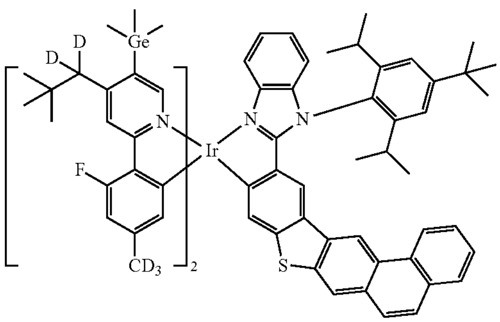

3346

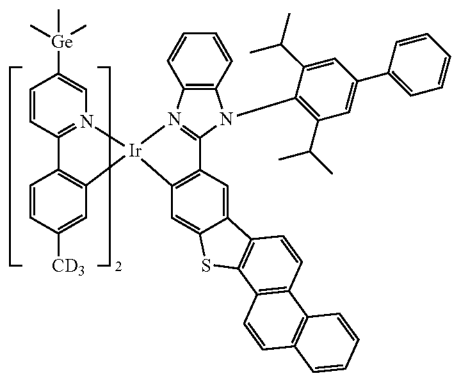

3347

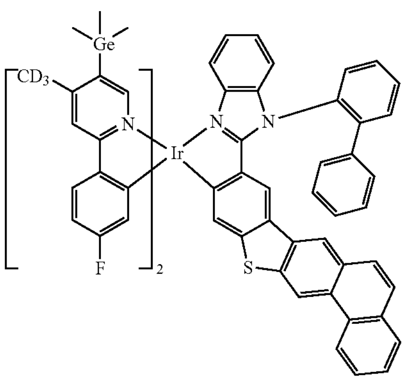

3348

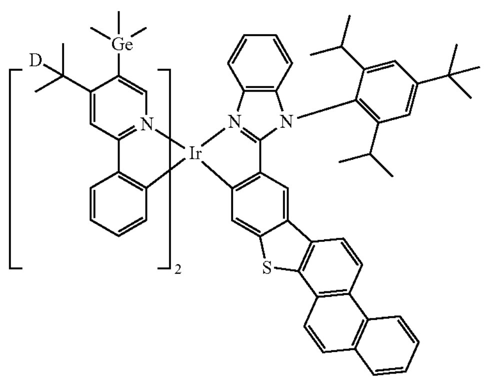

3349

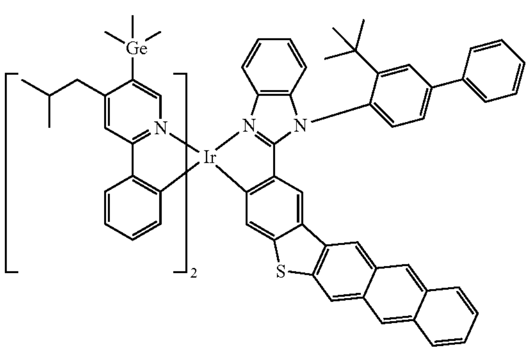

3350

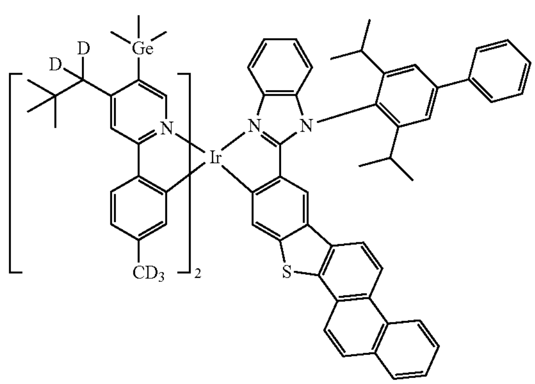

In the organometallic compound represented by Formula 1, $L_1$ and $L_2$ are ligands represented by Formulae 2 and 3, respectively, and n1 and n2, which are the number of $L_1$ and $L_2$, respectively, may each independently be 1 or 2. That is, the organometallic compound necessarily includes $L_1$(Formula 2) including a group represented by $*—X_{11}(R_{21})(R_{22})(R_{23})$ as a substituent and $L_2$(Formula 3). As a result, the molecular orientation and charge mobility of the organometallic compound represented by Formula 1 may be greatly improved, thereby improving the external quantum efficiency and lifespan of an electronic device, for example, an organic light-emitting device, including the organometallic compound represented by Formula 1.

The highest occupied molecular orbital (HOMO) energy level, lowest unoccupied molecular orbital (LUMO) energy level, $S_1$ energy level, and $T_1$ energy level of some of the organometallic compounds represented by Formula 1 are evaluated by using Gaussian 09 program which involves optimization of molecular structure by density functional theory (DFT) based on B3LYP. The evaluation results are shown in Table 1 below.

TABLE 1

| Compound No. | HOMO(eV) | LUMO(eV) | $S_1$(eV) | $T_1$(eV) |
|---|---|---|---|---|
| 16 | −4.750 | −1.239 | 2.812 | 2.538 |
| 91 | −4.703 | −1.154 | 2.855 | 2.534 |
| 1416 | −4.676 | −1.140 | 2.844 | 2.557 |
| 1491 | −4.683 | −1.140 | 2.846 | 2.539 |
| 1620 | −4.671 | −1.110 | 2.874 | 2.541 |
| 1800 | −4.830 | −1.319 | 2.814 | 2.496 |
| 2131 | −4.782 | −1.279 | 2.821 | 2.499 |
| 2252 | −4.724 | −1.244 | 2.800 | 2.552 |

From Table 1, it is confirmed that the organometallic compound represented by Formula 1 has such electric characteristics that are suitable for use as a dopant for an electronic device, for example, an organic light-emitting device.

Synthesis methods of the organometallic compound represented by Formula 1 may be recognizable by one of ordinary skill in the art by referring to Synthesis Examples provided below.

The organometallic compound represented by Formula 1 is suitable for use in an organic layer of an organic light-emitting device, for example, for use as a dopant in an emission layer of the organic layer. Thus, another aspect provides an organic light-emitting device that includes: a first electrode; a second electrode; and an organic layer including an emission layer and disposed between the first electrode and the second electrode, wherein the organic layer includes at least one of the organometallic compounds represented by Formula 1.

The organic light-emitting device has an organic layer containing the organometallic compound represented by Formula 1 as described above, thereby having improved external quantum efficiency and improved lifespan properties.

The organometallic compound of Formula 1 may be used between a pair of electrodes of an organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host). The emission layer may emit red light or green light, for example, red light or green light, each having a maximum emission wavelength of about 500 nm or more, for example, from about 500 nm or more and about 850 nm or less. For example, the organometallic compound may emit green light.

The expression "(an organic layer) includes at least one of organometallic compounds" used herein may include a case in which "(an organic layer) includes identical organometallic compounds represented by Formula 1" and a case in which "(an organic layer) includes two or more different organometallic compounds represented by Formula 1."

For example, the organic layer may include, as the organometallic compound, only Compound 1. In this regard, Compound 1 may exist in an emission layer of the organic light-emitting device. In one or more embodiments, the organic layer may include, as the organometallic compound, Compound 1 and Compound 2. In this regard, Compound 1 and Compound 2 may exist in an identical layer (for example, Compound 1 and Compound 2 all may exist in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In one or more embodiments, in the organic light-emitting device, the first electrode is an anode, and the second electrode is a cathode, and the organic layer further includes a hole transport region between the first electrode and the emission layer and an electron transport region between the emission layer and the second electrode, and the hole transport region includes a hole injection layer, a hole transport layer, an electron blocking layer, a buffer layer, or any combination thereof, and the electron transport region includes a hole blocking layer, an electron transport layer, an electron injection layer, or any combination thereof.

The term "organic layer" used herein refers to a single layer and/or a plurality of layers between the first electrode and the second electrode of the organic light-emitting device. The "organic layer" may include, in addition to an organic compound, an organometallic complex including metal.

FIGURE is a schematic view of an organic light-emitting device 10 in one or more embodiments. Hereinafter, the structure of an organic light-emitting device according to an embodiment and a method of manufacturing an organic light-emitting device according to an embodiment will be described in connection with FIGURE. The organic light-emitting device 10 includes a first electrode 11, an organic layer 15, and a second electrode 19, which are sequentially stacked.

A substrate may be additionally located under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

In one or more embodiments, the first electrode 11 may be formed by depositing or sputtering a material for forming the first electrode 11 on the substrate. The first electrode 11 may be an anode. The material for forming the first electrode 11 may include a material with a high work function to facilitate hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO.

The organic layer 15 is located on the first electrode 11.

The organic layer 15 may include a hole transport region, an emission layer, and an electron transport region.

The hole transport region may be between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

When the hole transport region includes a hole injection layer (HIL), the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100 to about 500° C., a vacuum pressure of about $10^{-8}$ torr to about $10^{-3}$ torr, and a deposition rate of about 0.01 Å/sec to about 100 Å/sec.

When the hole injection layer is formed using spin coating, coating conditions may vary according to the material used to form the hole injection layer, and the structure and thermal properties of the hole injection layer. For example, a coating speed may be from about 2,000 rpm to about 5,000 rpm, and a temperature at which a heat treatment is performed to remove a solvent after coating may be from about 80° C. to about 200° C.

Conditions for forming a hole transport layer and an electron blocking layer may be understood by referring to conditions for forming the hole injection layer.

The hole transport region may include m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201 below, a compound represented by Formula 202 below, or any combination thereof:

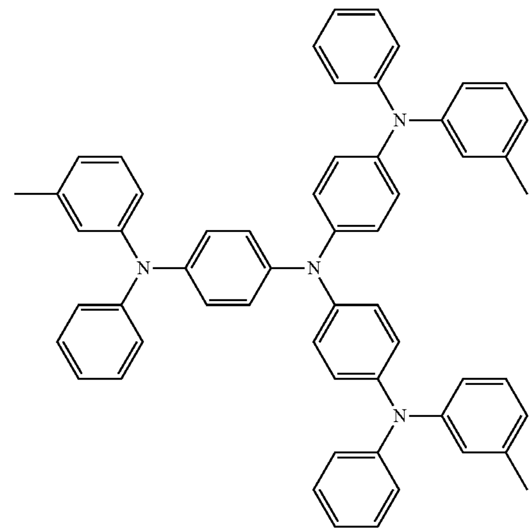

m-MTDATA

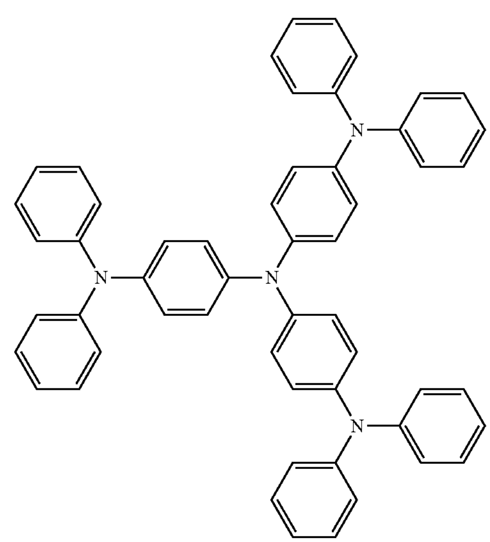

TDATA

-continued
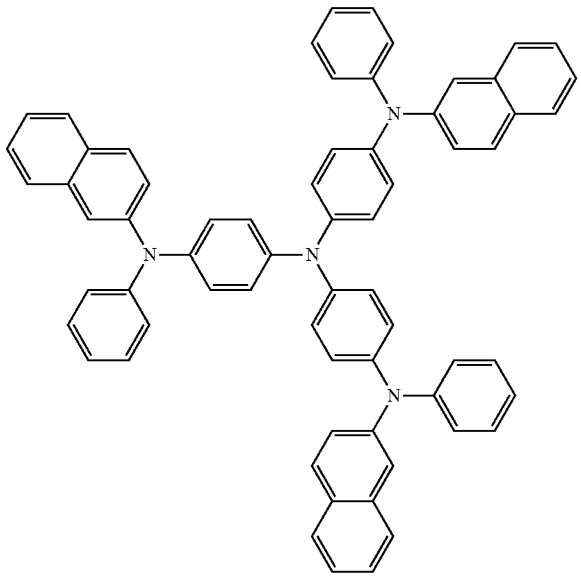
2-TNATA
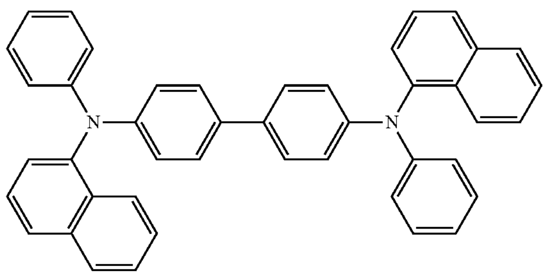
NPB
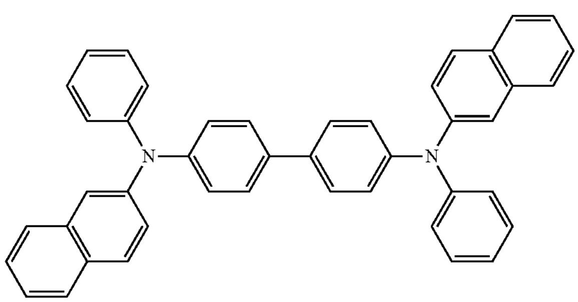
β-NPB
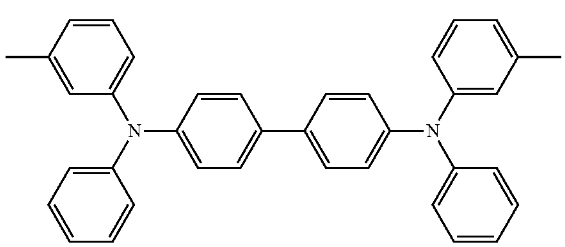
TPD
-continued
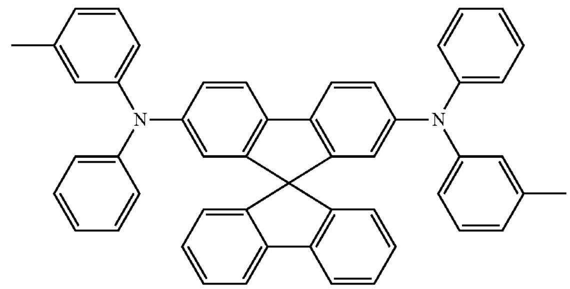
Spiro-TPD
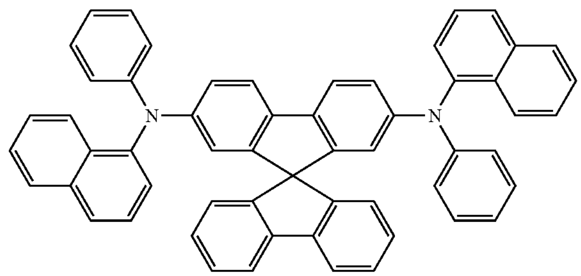
Spiro-NPB
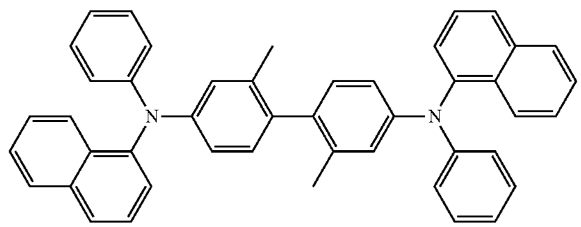
methylated NPB
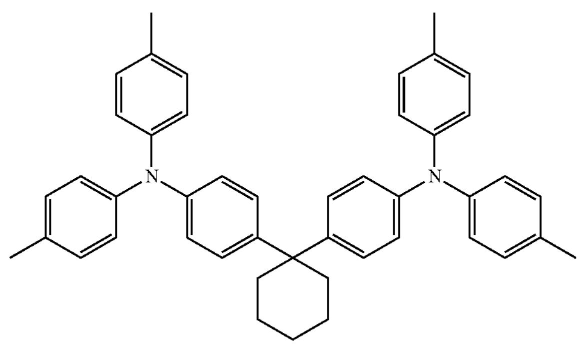
TAPC
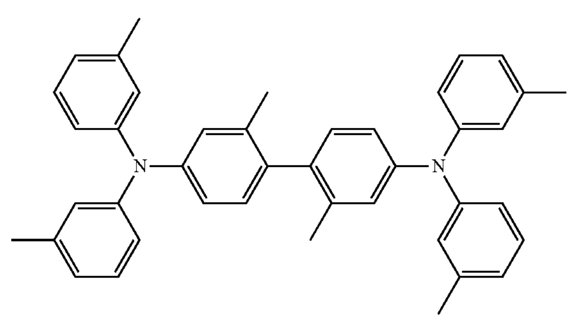
HMTPD -continued <Formula 201>

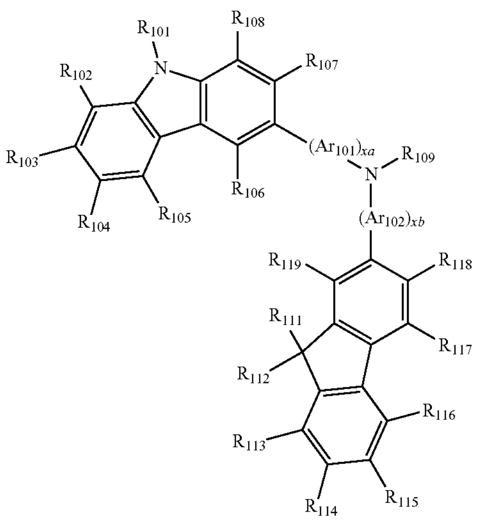

<Formula 202>

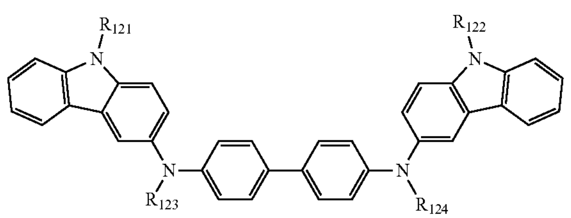

$Ar_{101}$ and $Ar_{102}$ in Formula 201 may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

xa and xb in Formula 201 may each independently be an integer from 0 to 5, or 0, 1 or 2. For example, xa may be 1 and xb may be 0.

$R_{101}$ to $R_{108}$, $R_{111}$ to $R_{119}$ and $R_{121}$ to $R_{124}$ in Formulae 201 and 202 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, or a hexyl group), or a $C_1$-$C_{10}$ alkoxy group (for example, a methoxy group, an ethoxy group, a propoxy group, a butoxy group, or a pentoxy group);

a $C_1$-$C_{10}$ alkyl group or a $C_1$-$C_{10}$ alkoxy group, each substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or any combination thereof; or a phenyl group, a naphthyl group, an anthracenyl group, a fluorenyl group, or a pyrenyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, or a $C_1$-$C_{10}$ alkoxy group.

$R_{109}$ in Formula 201 may be a phenyl group, a naphthyl group, an anthracenyl group, or a pyridinyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or any combination thereof.

According to an embodiment, the compound represented by Formula 201 may be represented by Formula 201A below:

<Formula 201A>

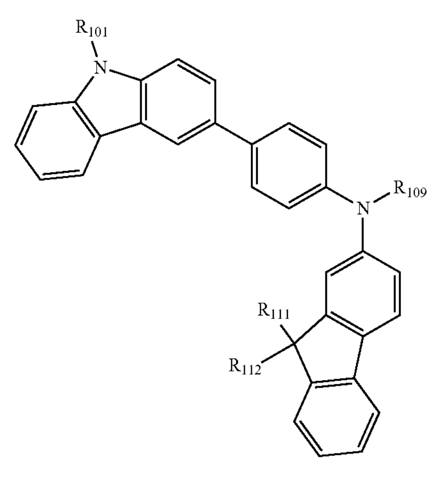

$R_{101}$, $R_{111}$, $R_{112}$, and $R_{109}$ in Formula 201A may be understood by referring to the description provided herein.

For example, the compound represented by Formula 201, and the compound represented by Formula 202 may include compounds HT1 to HT20 illustrated below:
HT1
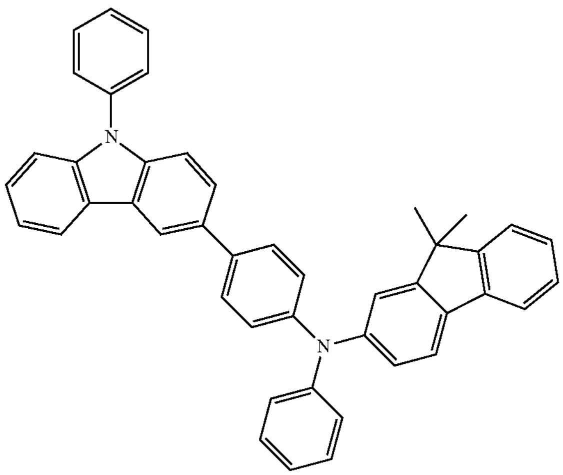
HT2
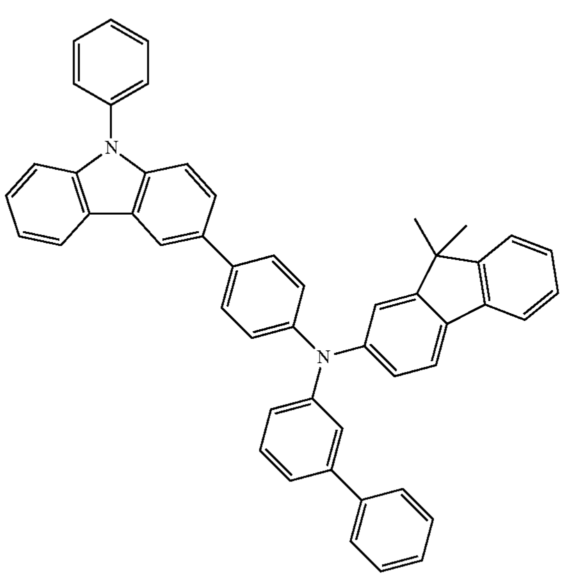
-continued
HT3
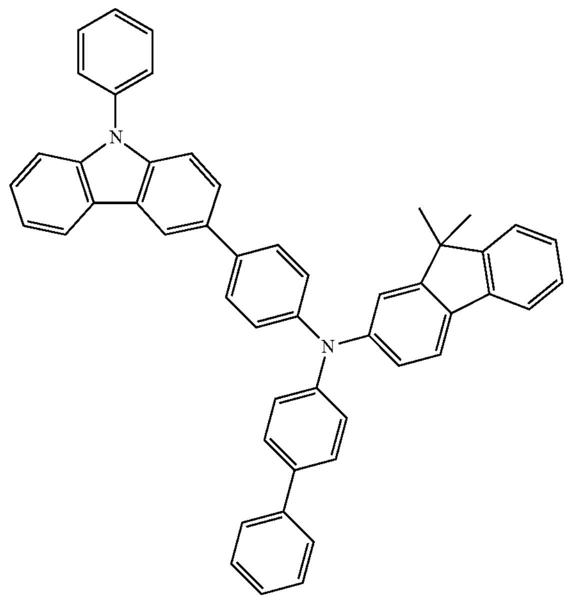
HT4
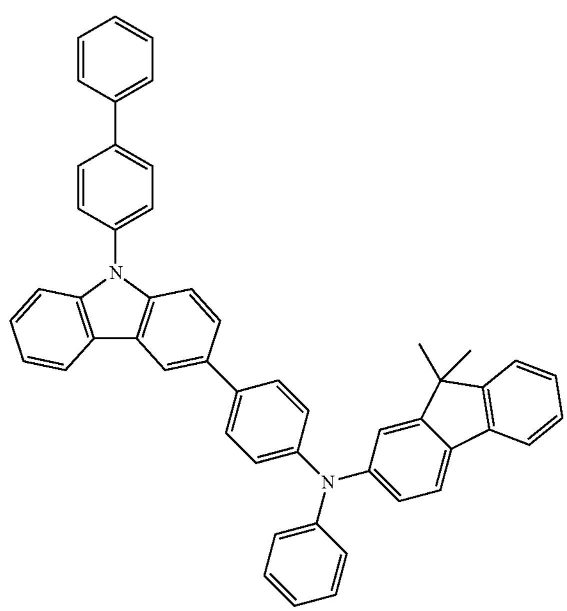

HT5
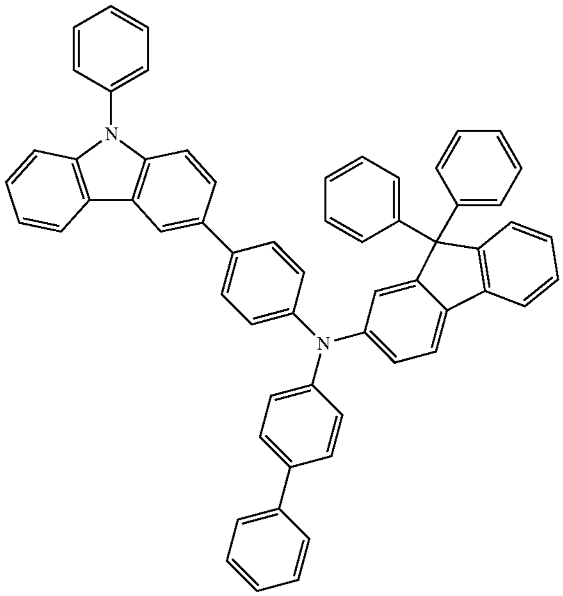
HT6
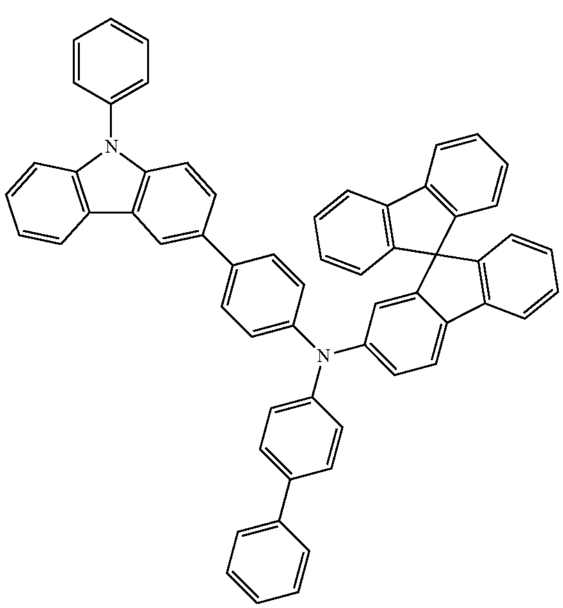
HT7
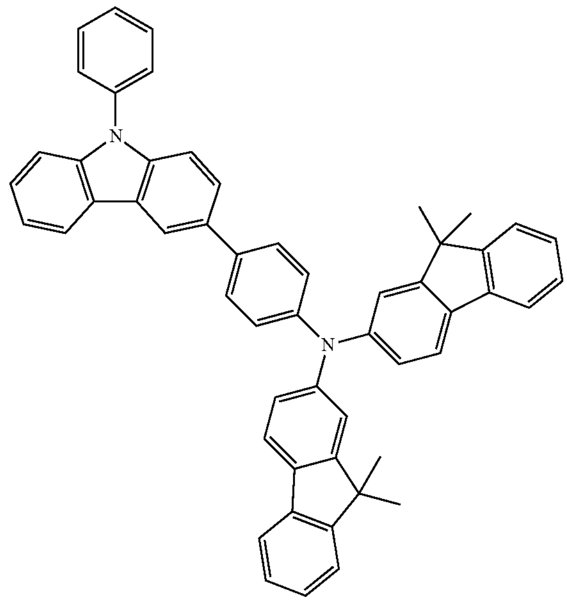
HT8
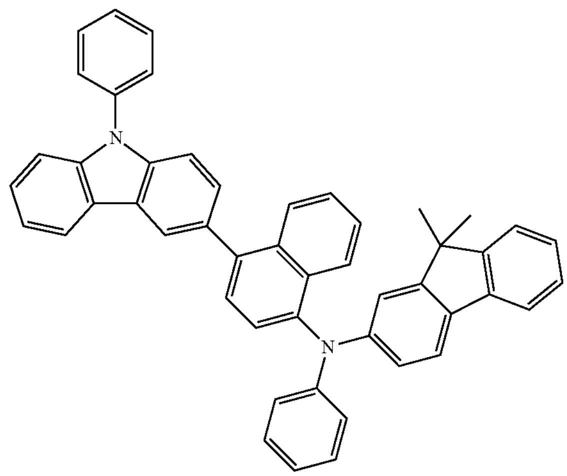
HT9
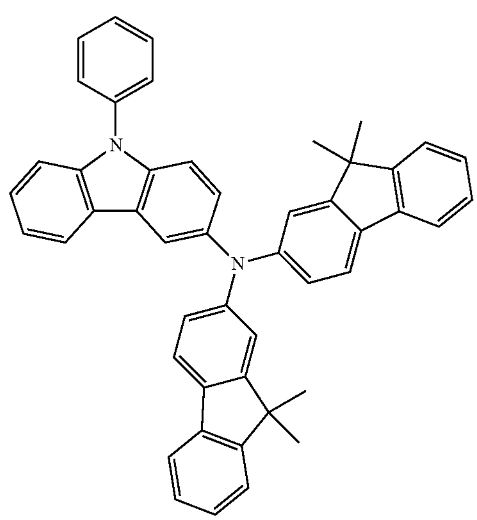

-continued
HT10
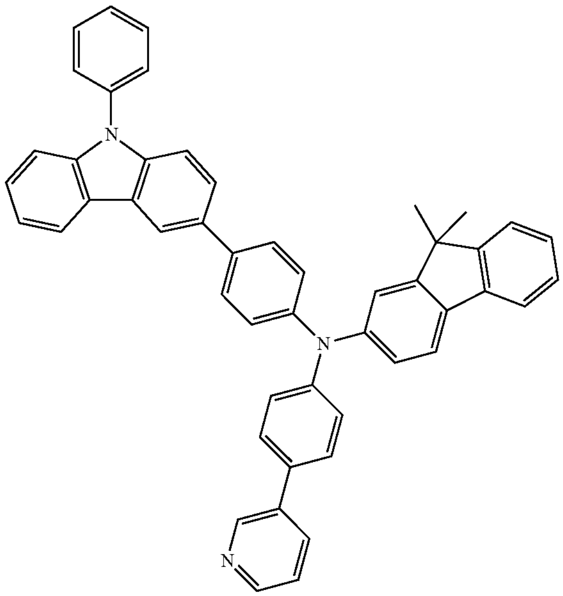
HT11
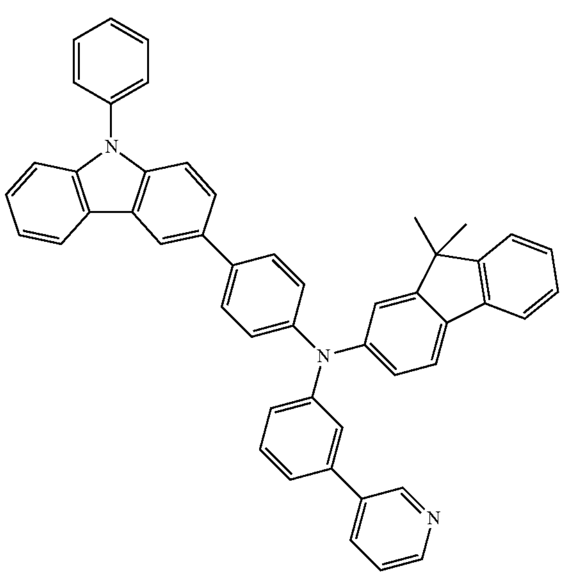
-continued
HT12
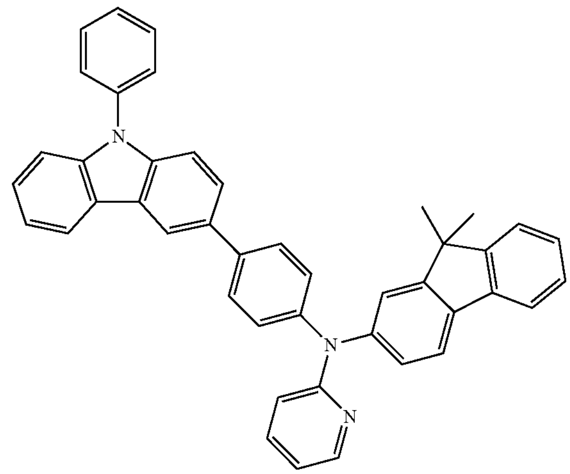
HT13
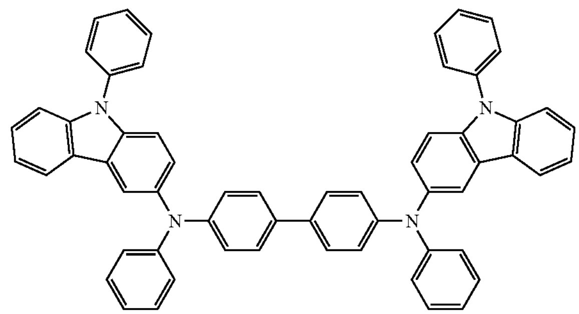
HT14
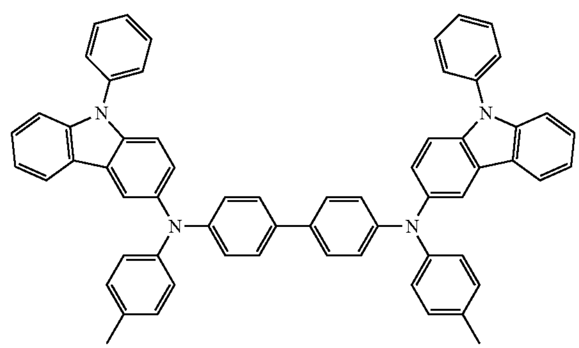
HT15
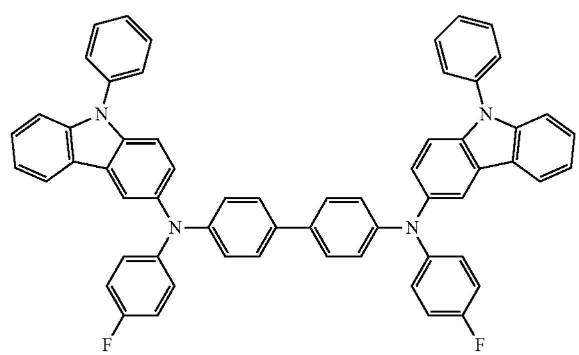

-continued

HT16

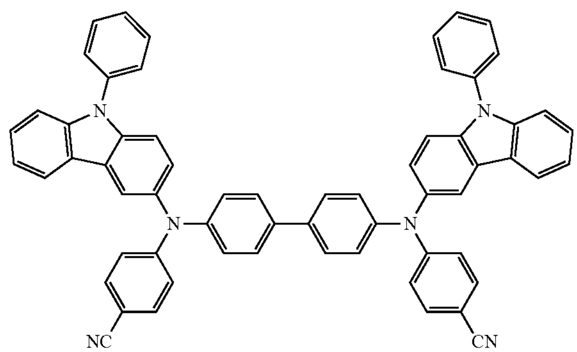

HT17

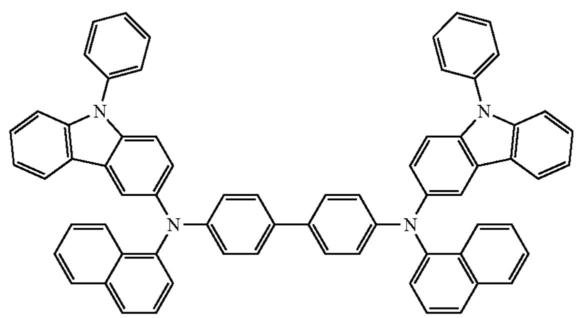

HT18

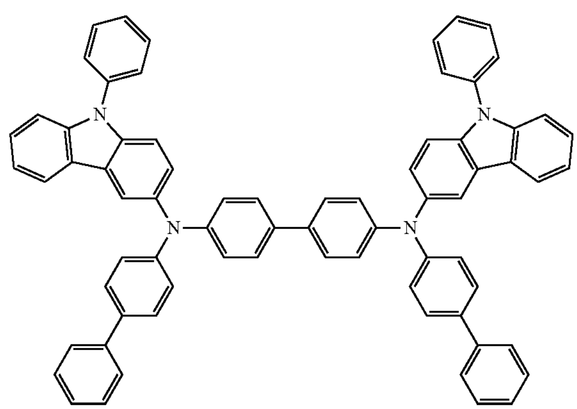

HT19

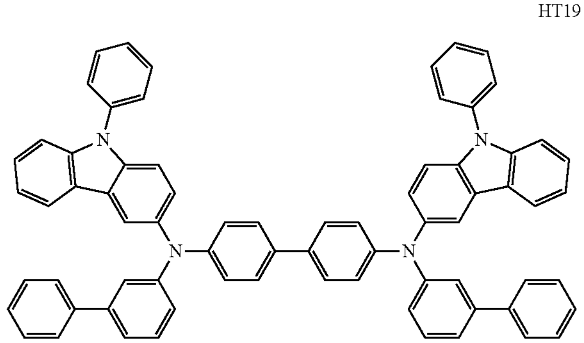

-continued

HT20

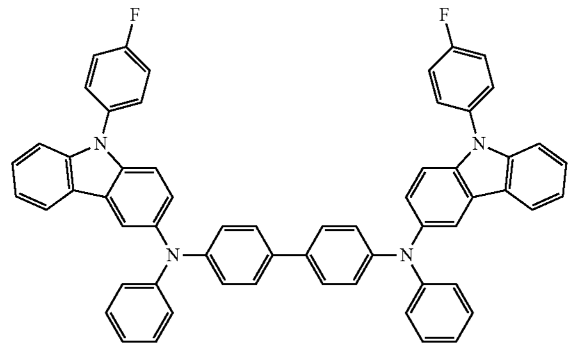

A thickness of the hole transport region may be in a range of about 100 Å to about 10,000 Å, for example, about 100 Å to about 1,000 Å. When the hole transport region includes at least one of a hole injection layer and a hole transport layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example about 100 Å to about 1,500 Å. When the thicknesses of the hole transport region, the hole injection layer and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one of a quinone derivative, a metal oxide, and a cyano group-containing compound. Non-limiting examples of the p-dopant are a quinone derivative, such as tetracyanoquinonedimethane (TCNQ), 2,3,5,6-tetrafluoro-tetracyano-1,4-benzoquinonedimethane (F4-TCNQ), or F6-TCNNQ; a metal oxide, such as a tungsten oxide or a molybdenum oxide; and a cyano group-containing compound, such as Compound HT-D1 below.

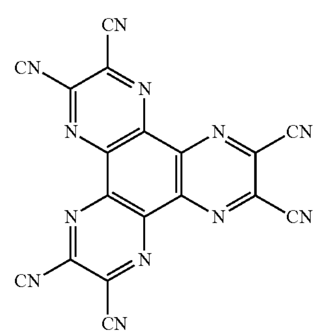

HT-D1

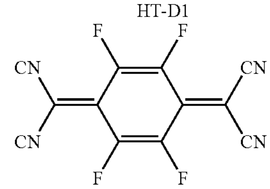

F4-TCNQ

-continued

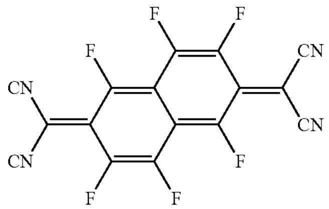

F6-TCNNQ

The hole transport region may include a buffer layer.

Also, the buffer layer may compensate for an optical resonance distance according to a wavelength of light emitted from the emission layer, and thus, efficiency of a formed organic light-emitting device may be improved.

Meanwhile, when the hole transport region includes an electron blocking layer, a material for the electron blocking layer may be a material for the hole transport region described above, a material for a host to be explained later, or any combination thereof. For example, when the hole transport region includes an electron blocking layer, a material for the electron blocking layer may be mCP, which will be explained later.

Then, an emission layer (EML) may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a material that is used to form the emission layer.

The emission layer may include a host and a dopant, and the dopant may include the organometallic compound represented by Formula 1.

The host may include TPBi, TBADN, ADN (also referred to as "DNA"), CBP, CDBP, TCP, mCP, Compound H50, Compound H51, Compound H52, or any combination thereof:

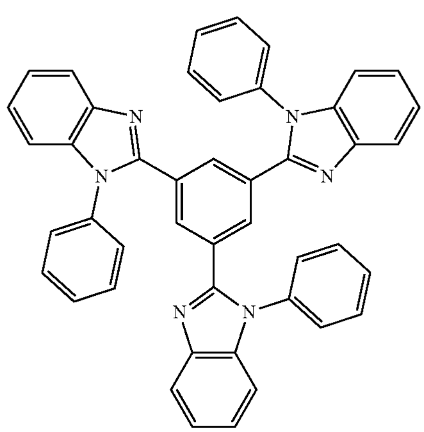

TPBi

-continued

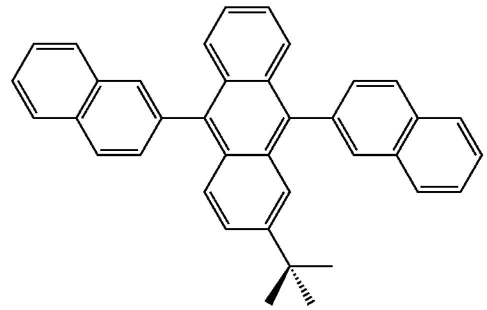

TBADN

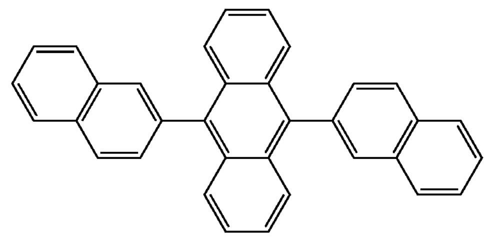

ADN

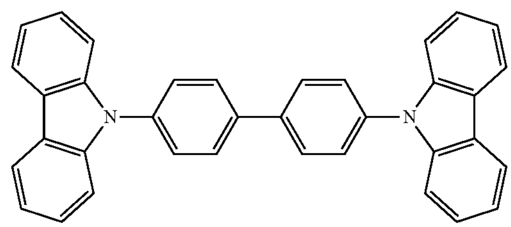

CBP

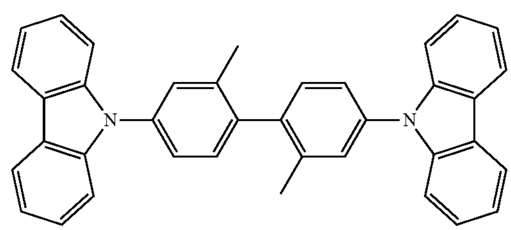

CDBP

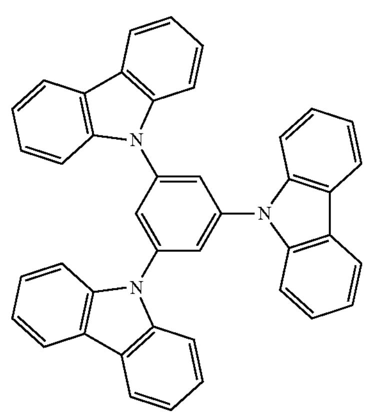

TCP

-continued

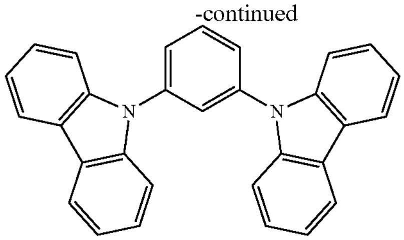

mCP

H50

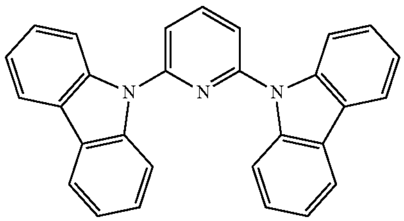

H51

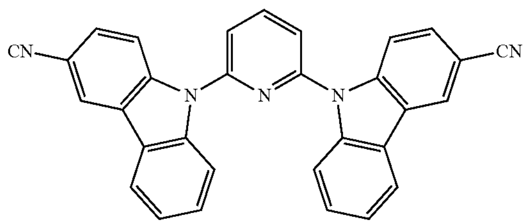

H52

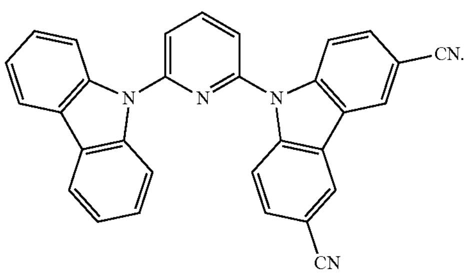

When the organic light-emitting device is a full-color organic light-emitting device, the emission layer may be patterned into a red emission layer, a green emission layer, and/or a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Then, an electron transport region may be located on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, BCP, Bphen, BAlq, or any combination thereof.

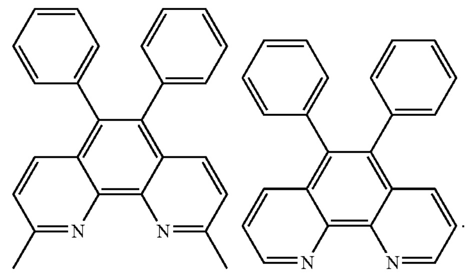

BCP BPhen

A thickness of the hole blocking layer may be in a range of about 20 Å to about 1,000 Å, for example, about 30 Å to about 300 Å. When the thickness of the hole blocking layer is within these ranges, the hole blocking layer may have excellent hole blocking characteristics without a substantial increase in driving voltage.

The electron transport layer may include BCP, Bphen, $Alq_3$, BAlq, TAZ, NTAZ, or any combination thereof.

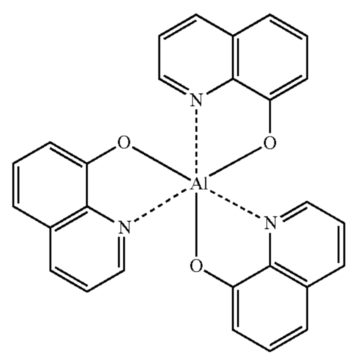

$Alq_3$

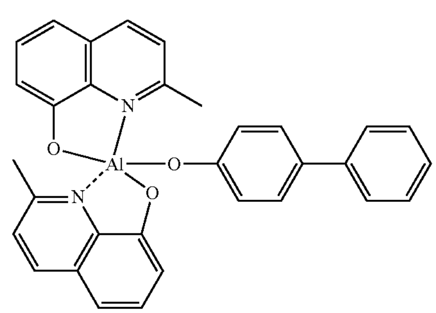

BAlq

-continued
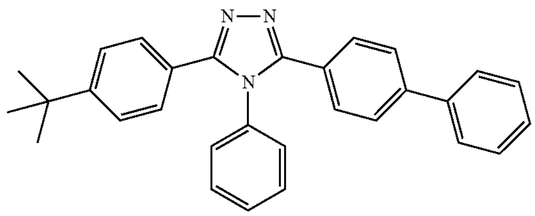
TAZ
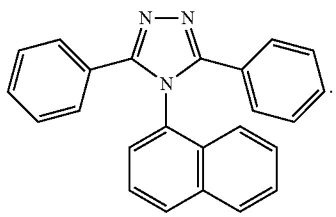
NTAZ
In one or more embodiments, the electron transport layer may include one or any combination of ET1 to ET25:
ET1
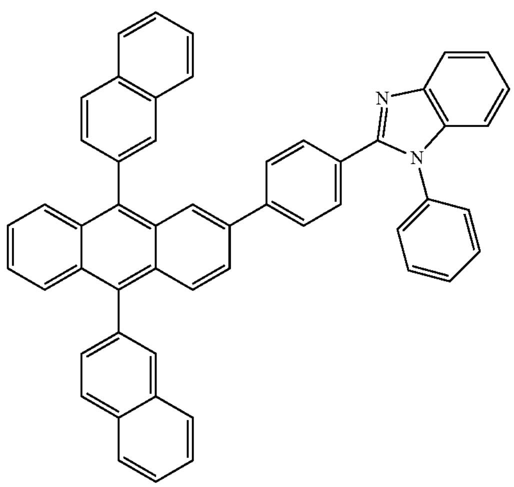
ET2
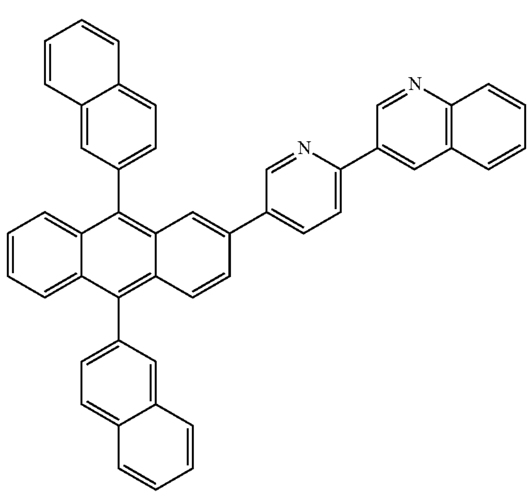
-continued
ET3
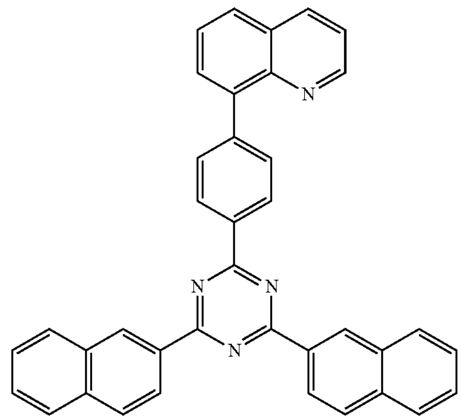
ET4
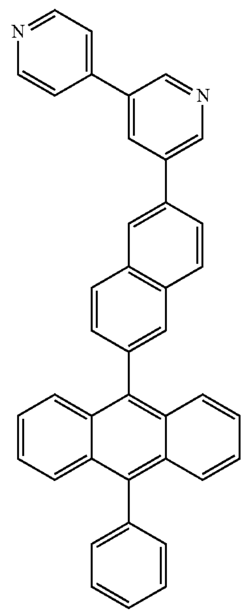
ET5
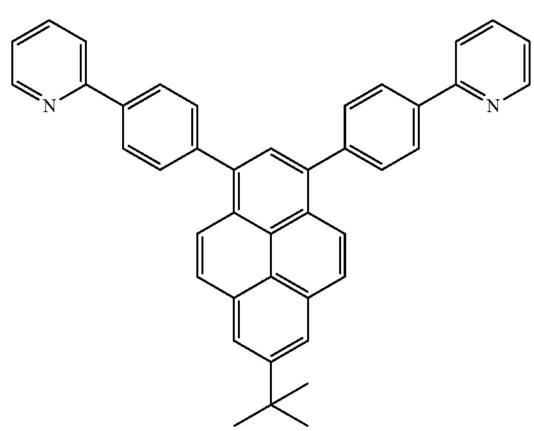

-continued
ET6
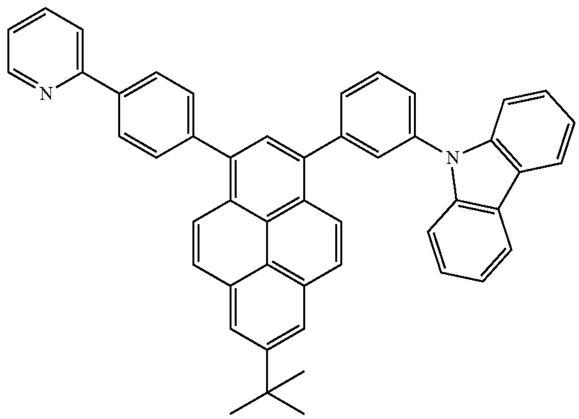
ET7
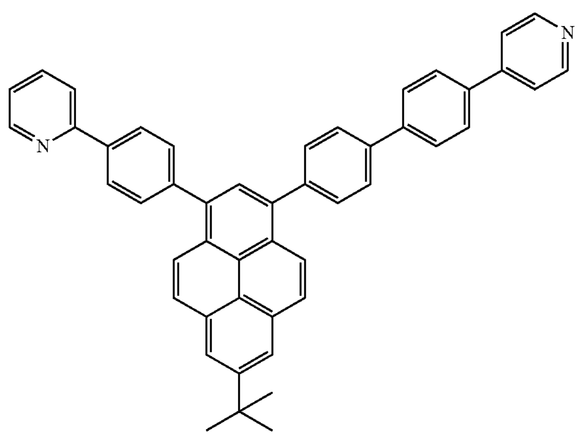
ET8
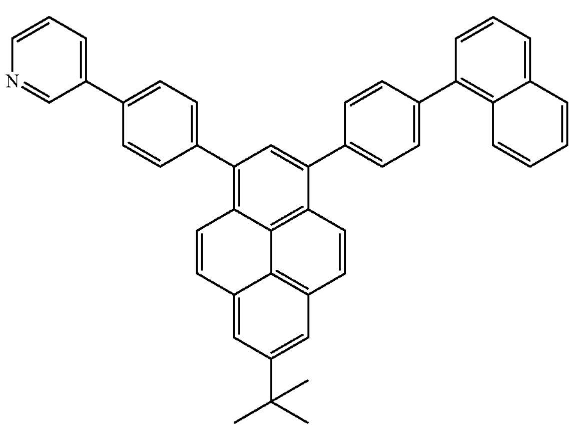
-continued
ET9
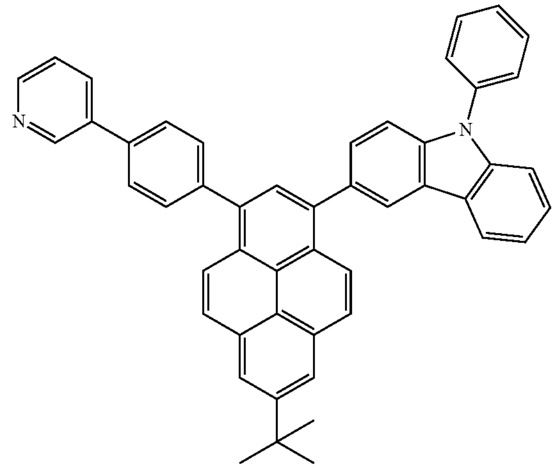
ET10
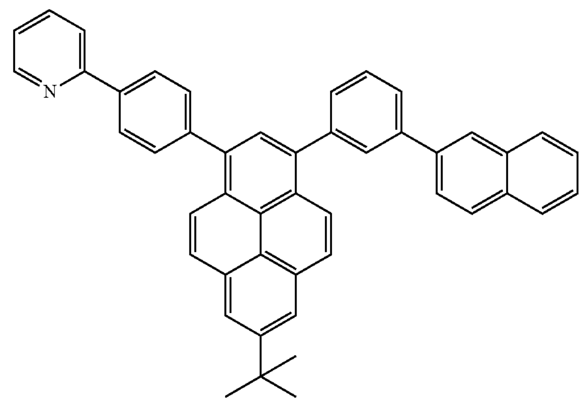
ET11
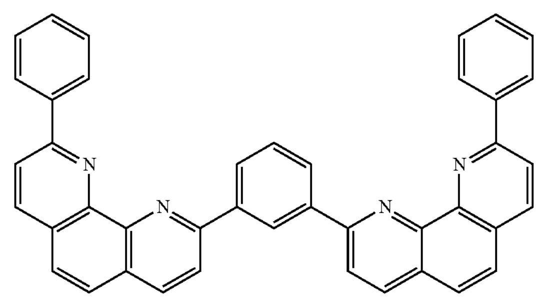
ET12
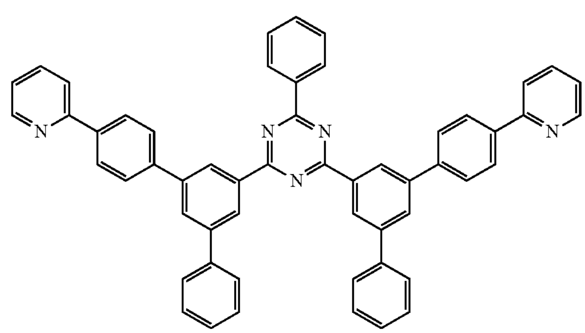

ET13
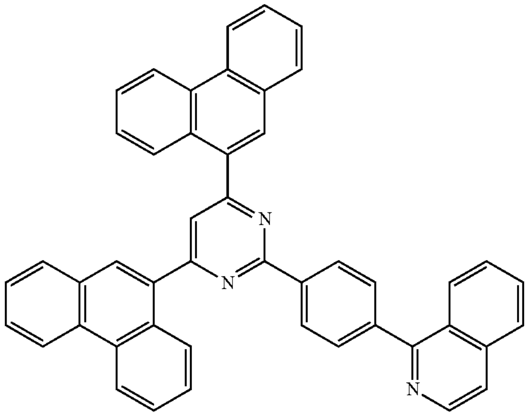
ET14
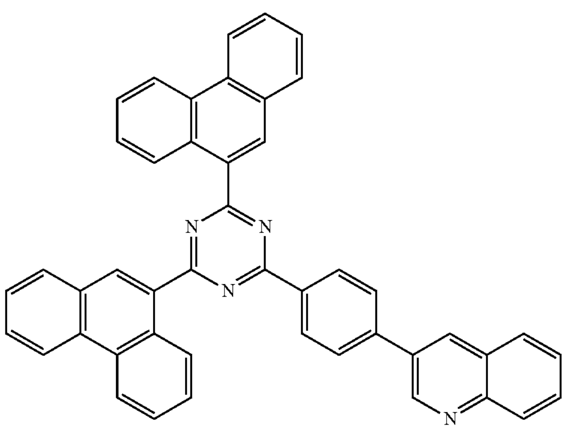
ET15
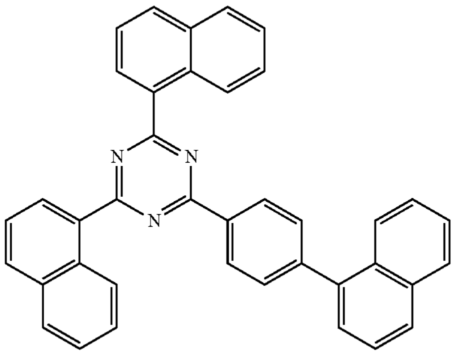
ET16
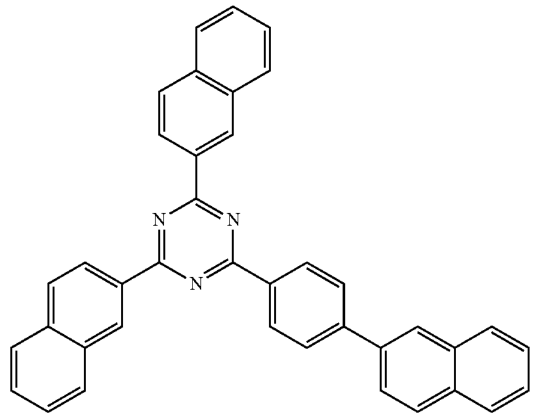
ET17
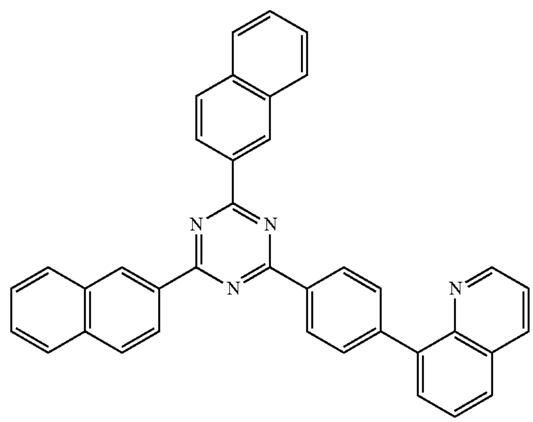
ET18
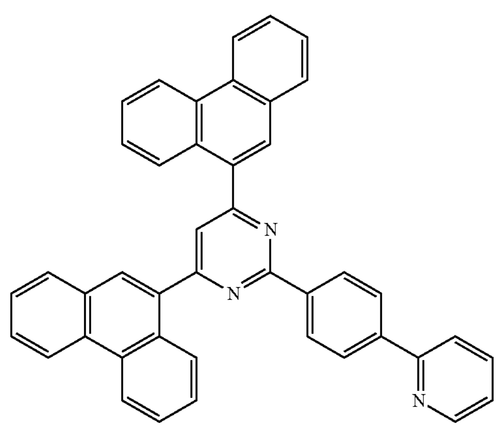

-continued
ET19
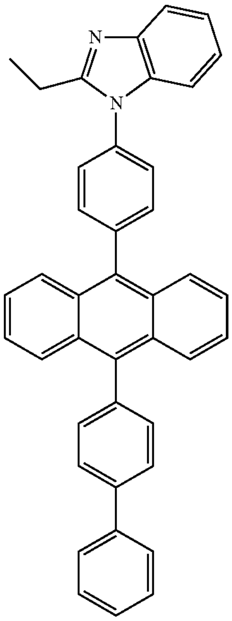
ET20
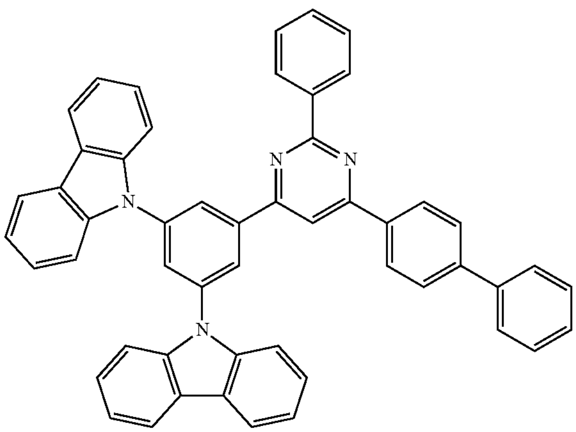
ET21
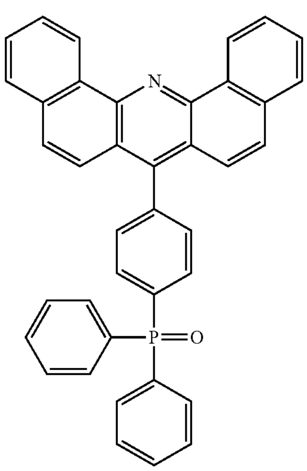
-continued
ET22
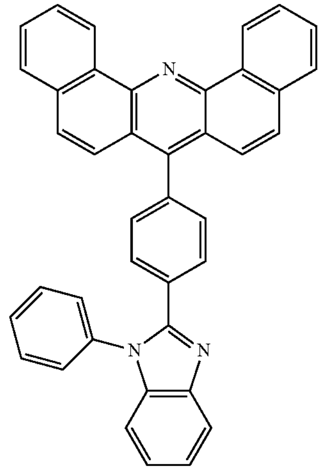
ET23
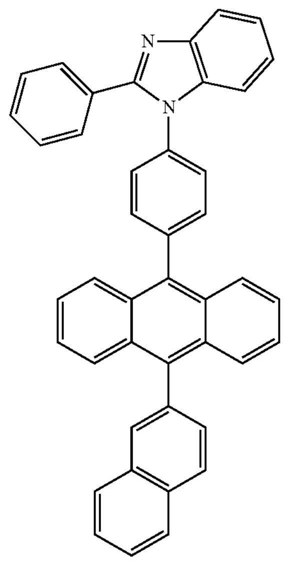
ET24
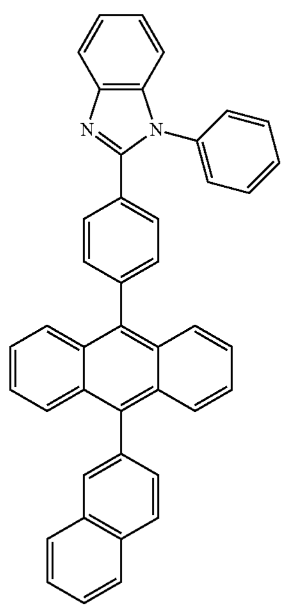

-continued

ET25

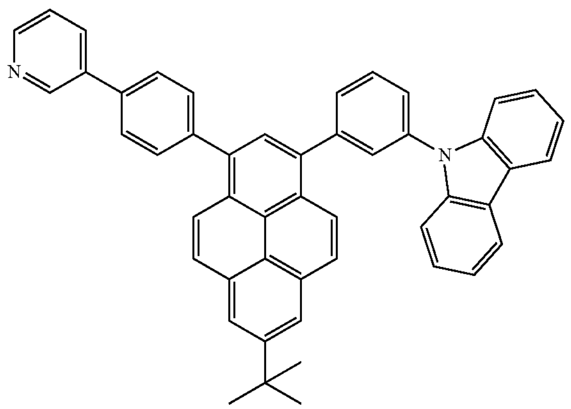

A thickness of the electron transport layer may be in a range of about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (LiQ) or ET-D2.

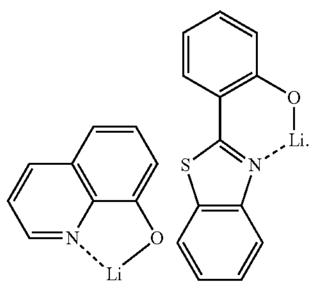

ET-D1 ET-D2

The electron transport region may include an electron injection layer (EIL) that promotes flow of electrons from the second electrode 19 thereinto.

The electron injection layer may include LiF, NaCl, CsF, $Li_2O$, BaO, or any combination thereof.

A thickness of the electron injection layer may be in a range of about 1 Å to about 100 Å, and, for example, about 3 Å to about 90 Å. When the thickness of the electron injection layer is within the range described above, the electron injection layer may have satisfactory electron injection characteristics without a substantial increase in driving voltage.

The second electrode 19 is located on the organic layer 15. The second electrode 19 may be a cathode. A material for forming the second electrode 19 may be metal, an alloy, an electrically conductive compound, or any combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be formed as the material for forming the second electrode 19. To manufacture a top-emission type light-emitting device, a transmissive electrode formed using ITO or IZO may be used as the second electrode 19.

Hereinbefore, the organic light-emitting device has been described with reference to FIGURE.

According to an aspect of another embodiment, an electronic apparatus including the organic light-emitting device may be provided. The electronic apparatus may be used for various purposes such as a display, lighting, and a mobile phone.

Another aspect provides a diagnostic composition including at least one organometallic compound represented by Formula 1.

The organometallic compound represented by Formula 1 provides high luminescence efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms. The term "$C_1$-$C_{60}$ alkylene group" as used herein refers to a divalent group having the same structure as the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group as used herein may include a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group or a tert-decyl group, each unsubstituted or substituted with a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, or any combination thereof. In some embodiments, Formula 9-33 may be a branched $C_6$ alkyl group. Formula 9-33 may be a tert-butyl group substituted with two methyl groups.

The term "$C_1$-$C_{60}$ alkoxy group" as used herein refers to a monovalent group represented by —$OA_{101}$ (wherein $A_{101}$ is a $C_1$-$C_{60}$ alkyl group). Examples of the $C_1$-$C_{60}$ alkoxy group, the $C_1$-$C_{20}$ alkoxy group, or the $C_1$-$C_{10}$ alkoxy group as used herein may include a methoxy group, an ethoxy group, a propoxy group, a butoxy group, or a pentoxy group.

The term "$C_2$-$C_{60}$ alkenyl group" as used herein refers to a group formed by placing at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a group formed by placing at least one carbon-carbon triple bond in the middle or at the terminus of the $C_2$-$C_{60}$ alkyl group. Examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent cyclic saturated hydrocarbon group including 3 to 10 carbon atoms. The term "$C_3$-$C_{10}$ cycloalkylene group" as used herein refers to a divalent group having the same structure as the $C_3$-$C_{10}$ cycloalkyl group.

Examples of the $C_3$-$C_{10}$ cycloalkyl group as used herein may include a cyclopropyl group, a cyclobutyl group, a cyclopentyl group, a cyclohexyl group, a cycloheptyl group, a cyclooctyl group, an adamantanyl group, a norbornanyl group (a bicyclo[2.2.1]heptyl group), a bicyclo[1.1.1]pentyl group, a bicyclo[2.1.1]hexyl group, or a bicyclo[2.2.2]octyl group.

The term "$C_1$-$C_{10}$ heterocycloalkyl group" as used herein refers to a monovalent monocyclic group including at least one heteroatom selected from N, O, P, Si, Se, Ge, B and S as a ring-forming atom and 1 to 10 carbon atoms. The term "$C_1$-$C_{10}$ heterocycloalkylene group" as used herein refers to a divalent group having the same structure as the $C_1$-$C_{10}$ heterocycloalkyl group.

Examples of the $C_1$-$C_{10}$ heterocycloalkyl group as used herein may include a silolanyl group, a silinanyl group, a tetrahydrofuranyl group, a tetrahydro-2H-pyranyl group, or a tetrahydrothiophenyl group.

The term "$C_3$-$C_{10}$ cycloalkenyl group" as used herein refers to a monovalent monocyclic group that has 3 to 10 carbon atoms and at least one carbon-carbon double bond in its ring, wherein the molecular structure as a whole is non-aromatic. Examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group including at least one heteroatom selected from N, O, P, Si, Se, Ge, B and S as a ring-forming atom, 1 to 10 carbon atoms, and at least one double bond in its ring, wherein the molecular structure as a whole is non-aromatic. Examples of the $C_1$-$C_{10}$ heterocycloalkenyl group include a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include a plurality of rings, the plurality of rings may be fused to each other.

The term "$C_7$-$C_{60}$ alkyl aryl group" as used herein refers to a $C_6$-$C_{60}$ aryl group substituted with at least one $C_1$-$C_{60}$ alkyl group.

The term "$C_1$-$C_{60}$ heteroaryl group" as used herein refers to a monovalent group having a heterocyclic aromatic system having at least one heteroatom selected from N, O, P, Si, Se, Ge, B and S as a ring-forming atom and 1 to 60 carbon atoms. The term "$C_1$-$C_{60}$ heteroarylene group" as used herein refers to a divalent group having a heterocyclic aromatic system having at least one heteroatom selected from N, O, P, Si, Se, Ge, B and S as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include a plurality of rings, the plurality of rings may be fused to each other.

The term "$C_2$-$C_{60}$ alkyl heteroaryl group" as used herein refers to a $C_1$-$C_{60}$ heteroaryl group substituted with at least one $C_1$-$C_{60}$ alkyl group.

The term "$C_6$-$C_{60}$ aryloxy group" as used herein is represented by —$OA_{102}$ (wherein $A_{102}$ is the $C_6$-$C_{60}$ aryl group). The term "$C_6$-$C_{60}$ arylthio group" as used herein is represented by —$SA_{103}$ (wherein $A_{103}$ is the $C_6$-$C_{60}$ aryl group). The term "$C_1$-$C_{60}$ alkylthio group" as used herein is represented by —$SA_{104}$ (wherein $A_{104}$ is the $C_1$-$C_{60}$ alkyl group).

The term "monovalent non-aromatic condensed polycyclic group" as used herein refers to a monovalent group that has two or more condensed rings and only carbon atoms (e.g., the number of carbon atoms may be in a range of 8 to 60) as ring-forming atoms, wherein the molecular structure as a whole is non-aromatic. Examples of the monovalent non-aromatic condensed polycyclic group include a fluorenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more condensed rings and a heteroatom selected from N, O, P, Si, Se, Ge, B and S and carbon atoms (e.g., the number of carbon atoms may be in a range of 1 to 60) as ring-forming atoms, wherein the molecular structure as a whole is non-aromatic. Examples of the monovalent non-aromatic condensed heteropolycyclic group include a carbazolyl group. The term "divalent non-aromatic condensed heteropolycyclic group" as used herein refers to a divalent group having substantially the same structure as the monovalent non-aromatic condensed heteropolycyclic group.

The term "$C_5$-$C_{30}$ carbocyclic group" as used herein refers to a saturated or unsaturated cyclic group including 5 to 30 carbon atoms only as ring-forming atoms. The $C_5$-$C_{30}$ carbocyclic group may be a monocyclic group or a polycyclic group. Examples of the "$C_5$-$C_{30}$ carbocyclic group (unsubstituted or substituted with at least one $R_{10a}$)" may include an adamantane group, a norbornene group, a norbornane group (a bicyclo[2.2.1]heptane group), a bicyclo[1.1.1]pentane group, a bicyclo[2.1.1]hexane group, a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, or a fluorene group, each (unsubstituted or substituted with at least one $R_{10a}$).

The term "$C_1$-$C_{30}$ heterocyclic group" as used herein refers to saturated or unsaturated cyclic group including 1 to 30 carbon atoms and at least one heteroatom selected from N, O, P, Si, Se, Ge, B and S as ring-forming atoms. The $C_1$-$C_{30}$ heterocyclic group may be a monocyclic group or a polycyclic group. Examples of the "$C_1$-$C_{30}$ heterocyclic group (unsubstituted or substituted with at least one $R_{10a}$)" may include a thiophene group, a furan group, a pyrrole group, a silole group, a borole group, a phosphole group, a selenophene group, a germole group, a benzothiophene group, a benzofuran group, an indole group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group, each (unsubstituted or substituted with at least one $R_{10a}$).

Examples of the terms "$C_5$-$C_{30}$ carbocyclic group" and "$C_1$-$C_{30}$ heterocyclic group" as used herein may include i) a first ring, ii) a second ring, iii) a condensed cyclic group in which two or more first rings are condensed with each other, iv) a condensed cyclic group in which two or more second rings are condensed with each other, or v) a condensed cyclic group in which at least one first ring is condensed with at least one second ring, the first ring may be a cyclopentane group, a cyclopentadiene group, a furan group, a thiophene group, a pyrrole group, a silole group, a germole group, a borole group, a selenophene group, a phosphole group, an oxazole group, an oxadiazole group, an oxatriazole group, a thiazole group, a thiadiazole group, a thiatriazole group, a pyrazole group, an imidazole group, a triazole group, a tetrazole group, an azasilole group, an azagermole group, an azaborole group, an azaselenophene group, or an azaphosphole group, and the second ring may be an adamantane group, a norbornane group (a bicyclo[2.2.1]heptane group), a norbornene group, a bicyclo[1.1.1]pentane group, a bicyclo[2.1.1]hexane group, a bicyclo[2.2.2]octane group, a cyclohexane group, a cyclohexene group, a benzene group, a pyridine group, a pyrimidine group, a pyrazine group, a pyridazine group, or a triazine group.

The "fluorinated $C_1$-$C_{60}$ alkyl group (or fluorinated $C_1$-$C_{20}$ alkyl group or the like)", "fluorinated $C_3$-$C_{10}$ cycloalkyl group", "fluorinated $C_1$-$C_{10}$ heterocycloalkyl group", and "fluorinated phenyl group" as used herein may respectively be a $C_1$-$C_{60}$ alkyl group (or $C_1$-$C_{20}$ alkyl group or the like), $C_3$-$C_{10}$ cycloalkyl group, a $C_1$-$C_{10}$ heterocycloalkyl group, and a phenyl group, each substituted with at least one fluoro group (—F). Examples of the "fluorinated $C_1$ alkyl group (i.e., a fluorinated methyl group)" may include —$CF_3$, —$CF_2H$, and —$CFH_2$. The "fluorinated $C_1$-$C_{60}$ alkyl group (or fluorinated $C_1$-$C_{20}$ alkyl group or the like)", "fluorinated $C_3$-$C_{10}$ cycloalkyl group", or "fluorinated $C_1$-$C_{10}$ heterocycloalkyl group" may respectively be: i) a fully fluorinated $C_1$-$C_{60}$ alkyl group (or fully fluorinated $C_1$-$C_{20}$ alkyl group or the like), fully fluorinated $C_3$-$C_{10}$ cycloalkyl group, or fully fluorinated $C_1$-$C_{10}$ heterocycloalkyl group, in which all hydrogen atoms are substituted with fluoro groups; or ii) a partially fluorinated $C_1$-$C_{60}$ alkyl group (or partially fluorinated $C_1$-$C_{20}$ alkyl group or the like), partially fluorinated $C_3$-$C_{10}$ cycloalkyl group, or partially fluorinated $C_1$-$C_{10}$ heterocycloalkyl group, in which some of hydrogen atoms are substituted with fluoro groups.

The "deuterated $C_1$-$C_{60}$ alkyl group (or deuterated $C_1$-$C_{20}$ alkyl group or the like)", "deuterated $C_3$-$C_{10}$ cycloalkyl group", "deuterated $C_1$-$C_{10}$ heterocycloalkyl group", and "deuterated phenyl group" as used herein may respectively be a $C_1$-$C_{60}$ alkyl group (or $C_1$-$C_{20}$ alkyl group or the like), $C_3$-$C_{10}$ cycloalkyl group, a $C_1$-$C_{10}$ heterocycloalkyl group, and a phenyl group, each substituted with at least one deuterium. Examples of the "deuterated $C_1$ alkyl group (i.e., a deuterated methyl group)" may include —$CD_3$, —$CD_2H$, and —$CDH_2$ and examples of the "deuterated $C_3$-$C_{10}$ cycloalkyl group" may refer to Formula 10-501 described in this disclosure. The "deuterated $C_1$-$C_{60}$ alkyl group (or deuterated $C_1$-$C_{20}$ alkyl group or the like)", "deuterated $C_3$-$C_{10}$ cycloalkyl group", or "deuterated $C_1$-$C_{10}$ heterocycloalkyl group" may respectively be: i) a fully deuterated $C_1$-$C_{60}$ alkyl group (or fully deuterated $C_1$-$C_{20}$ alkyl group or the like), fully deuterated $C_3$-$C_{10}$ cycloalkyl group, or fully deuterated $C_1$-$C_{10}$ heterocycloalkyl group, in which all hydrogen atoms are substituted with deuterium atoms; or ii) a partially deuterated $C_1$-$C_{60}$ alkyl group (or partially deuterated $C_1$-$C_{20}$ alkyl group or the like), partially deuterated $C_3$-$C_{10}$ cycloalkyl group, or partially deuterated $C_1$-$C_{10}$ heterocycloalkyl group, in which some of hydrogen atoms are substituted with deuterium(s).

The "($C_1$-$C_{20}$ alkyl)'X' group" refers to a 'X' group substituted with at least one $C_1$-$C_{20}$ alkyl group. For example, The "($C_1$-$C_{20}$ alkyl)$C_3$-$C_{10}$ cycloalkyl group" as used herein refers to a $C_3$-$C_{10}$ cycloalkyl group substituted with at least one $C_1$-$C_{20}$ alkyl group, and the "($C_1$-$C_{20}$ alkyl)phenyl group" as used herein refers to a phenyl group substituted with at least one $C_1$-$C_{20}$ alkyl group. Examples of the ($C_1$ alkyl)phenyl group may include a toluyl group.

In the present specification, "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, and an azadibenzothiophene 5,5-dioxide group" each refer to a hetero ring in which at least one ring-forming carbon atom is substituted with nitrogen atom and respectively having an identical backbone as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, and a dibenzothiophene 5,5-dioxide group".

A substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—Ge(Q_{13})(Q_{14})(Q_{15})$, $—B(Q_{16})(Q_{17})$, $—P(=O)(Q_{18})(Q_{19})$, $—P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—Ge(Q_{23})(Q_{24})(Q_{25})$, $—B(Q_{26})(Q_{27})$, $—P(=O)(Q_{28})(Q_{29})$, $—P(Q_{28})(Q_{29})$, or any combination thereof;

$—N(Q_{31})(Q_{32})$, $—Si(Q_{33})(Q_{34})(Q_{35})$, $—Ge(Q_{33})(Q_{34})(Q_{35})$, $—B(Q_{36})(Q_{37})$, $—P(=O)(Q_{38})(Q_{39})$, or $—P(Q_{38})(Q_{39})$; or any combination thereof.

In the present specification, $Q_1$ to $Q_9$, $Q_{11}$ to $Q_{19}$, $Q_{21}$ to $Q_{29}$, and $Q_{31}$ to $Q_{39}$ may each independently be: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group, unsubstituted or substituted with deuterium, —F, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group, unsubstituted or substituted with deuterium, —F, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

For example, $Q_1$ to $Q_9$, $Q_{11}$ to $Q_{19}$, $Q_{21}$ to $Q_{29}$, and $Q_{31}$ to $Q_{39}$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, 3-pentyl group, a sec-isopentyl group, a phenyl group, a biphenyl group, or a naphthyl group, each unsubstituted or substituted with deuterium, a $C_1$-$C_{20}$ alkyl group, a phenyl group, or any combination thereof.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1 (Compound 17)

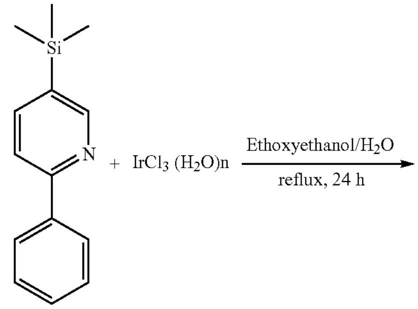

-continued

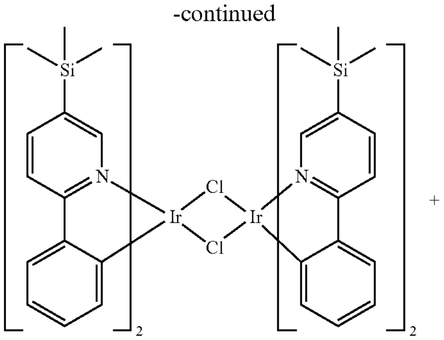

17A

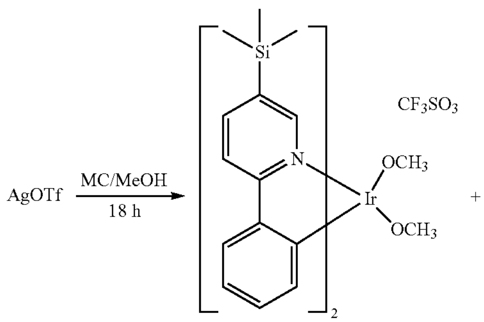

17B

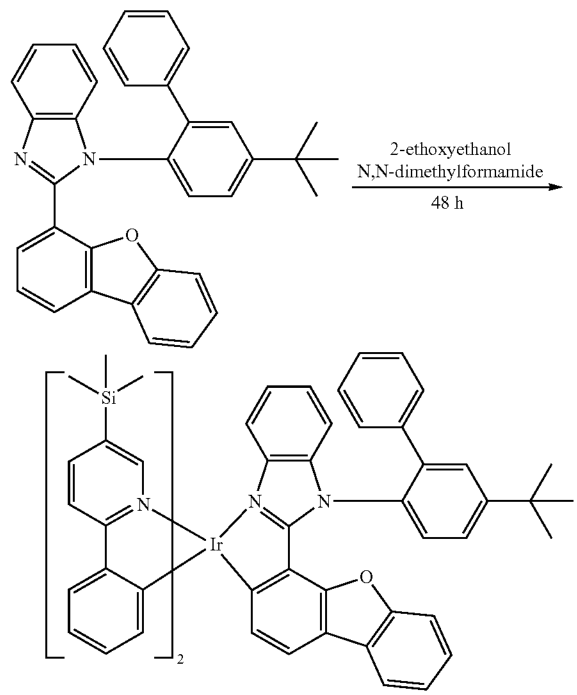

17

Synthesis of Compound 17A 2-phenyl-5-(trimethylsilyl)pyridine (7.5 g, 33.1 mmol) and iridium chloride (5.2 g, 14.7 mmol) were mixed with 120 mL of ethoxyethanol and 40 mL of distilled water, and then, the mixture was stirred under reflux for 24 hours, and then, the temperature was decreased to room temperature. The resulting solid was separated by filtration, and the solid was washed with water/methanol/hexane and dried in a vacuum oven to obtain 8.2 g (yield of 82%) of Compound 17A.

Synthesis of Compound 17B

Compound 17A (1.6 g, 1.2 mmol) was mixed with 45 mL of methylene chloride, and then, AgOTf (silver triflate, 0.6 g, 2.3 mmol) was added thereto after being mixed with 15 mL of methanol. Thereafter, the mixture was stirred for 18 hours at room temperature while blocking light with aluminum foil, and then the resulting solid was removed by Celite filtration and the filtrate was concentrated under reduced pressure. The obtained resultant (Compound 17B) was used for the next reaction without further purification.

Synthesis of Compound 17

Compound 17B (2.0 g, 2.3 mmol) and 1-(5-(tert-butyl)-[1,1'-biphenyl]-2-yl)-2-(dibenzo[b,d]furan-4-yl)-1H-benzo[d]imidazole (1.4 g, 2.8 mmol) were mixed with 50 mL of 2-ethoxyethanol and 50 mL of N,N-dimethylformamide, and then, the mixture was stirred under reflux for 48 hours and then, the temperature thereof was lowered to the room temperature. The resulting mixture was subjected to reduced pressure to obtain a solid, which was then subjected to column chromatography (eluent: MC (methylene chloride) and hexane) to obtain 1.1 g (yield of 42%) of Compound 17. The obtained material was confirmed by Mass Spectrometry and HPLC analysis.

HRMS(MALDI) calcd for $C_{63}H_{59}IrN_4OSi_2$: m/z 1136.3857 Found: 1136.3861

Synthesis Example 2 (Compound 91)

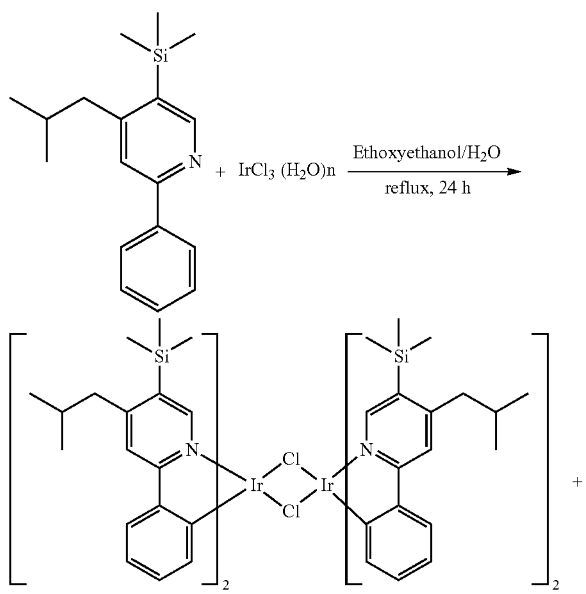

91A

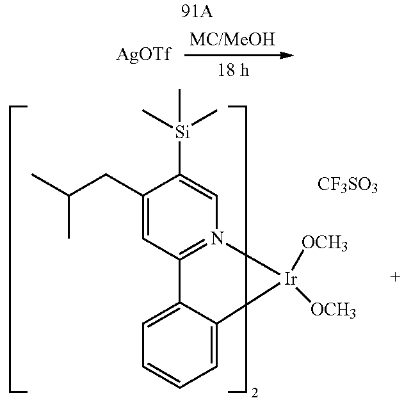

91B

-continued

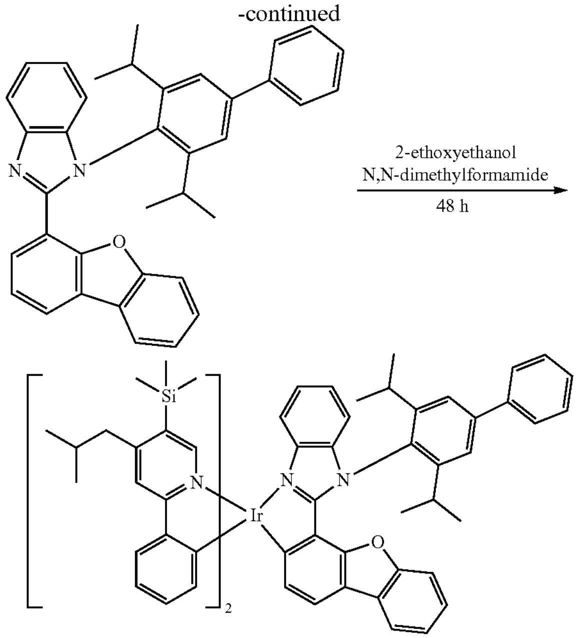

91

Synthesis of Compound 91A 7.4 g (yield of 74%) of Compound 91A was obtained in the same manner as used to synthesize Compound 17A of Synthesis Example 1, except that 4-isobutyl-2-phenyl-5-(trimethylsilyl)pyridine was used instead of 2-phenyl-5-(trimethylsilyl)pyridine.

Synthesis of Compound 91B

Compound 91B was obtained in the same manner as used to synthesize Compound 17B of Synthesis Example 1, except that Compound 91A was used instead of Compound 17A. The obtained Compound 91B was used in the next reaction without further purification.

Synthesis of Compound 91

0.8 g (yield of 35%) of Compound 91 was obtained in the same manner as used to synthesize Compound 17 of Synthesis Example 1, except that Compound 91B was used instead of Compound 17B, and 2-(dibenzo[b,d]furan-4-yl)-1-(3,5-diisopropyl-[1,1'-biphenyl]-4-yl)-1H-benzo[d]imidazole was used instead of 1-(5-(tert-butyl)-[1,1'-biphenyl]-2-yl)-2-(dibenzo[b,d]furan-4-yl)-1H-benzo[d]imidazole. The obtained material was confirmed by Mass Spectrometry and HPLC analysis.

HRMS(MALDI) calcd for $C_{73}H_{79}IrN_4OSi_2$: m/z 1276.5422 Found: 1276.5416

Synthesis Example 3 (Compound 102)

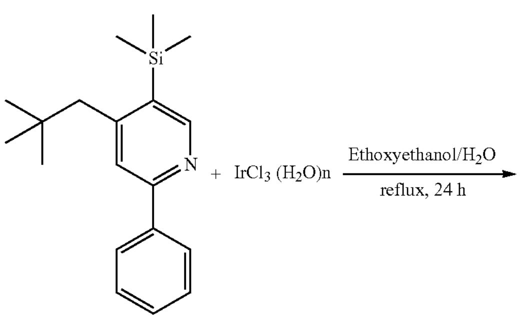

-continued

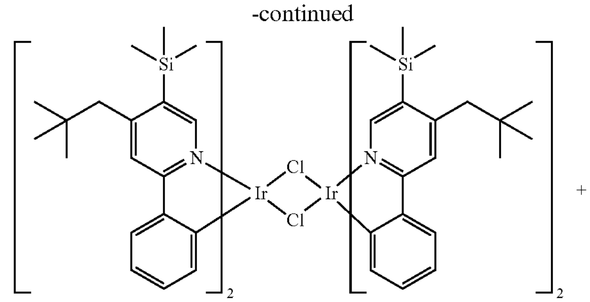

102A

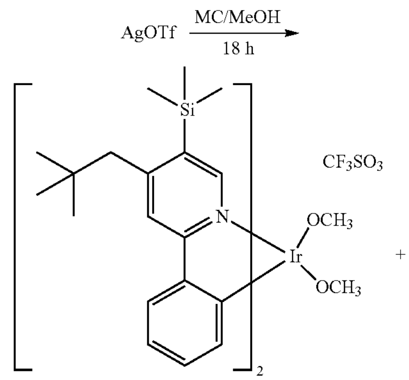

102B

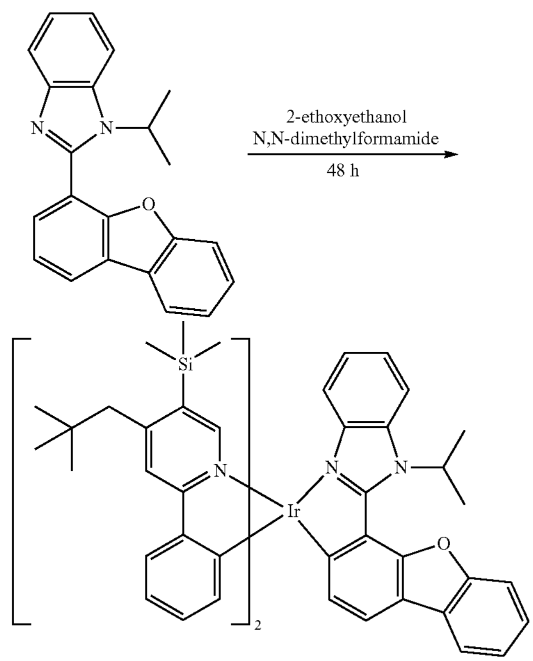

102

Synthesis of Compound 102A 7.1 g (yield of 71%) of Compound 102A was obtained in the same manner as used to synthesize Compound 17 Å of Synthesis Example 1, except that 4-neopentyl-2-phenyl-5-(trimethylsilyl)pyridine was used instead of 2-phenyl-5-(trimethylsilyl)pyridine.

Synthesis of Compound 102B

Compound 102B was obtained in the same manner as used to synthesize Compound 17B of Synthesis Example 1, except that Compound 102A was used instead of Compound 17A. The obtained Compound 102B was used in the next reaction without further purification.

Synthesis of Compound 102

0.6 g (yield of 26%) of Compound 102 was obtained in the same manner as used to synthesize Compound 17 of Synthesis Example 1, except that Compound 102B was used instead of Compound 17B, and 2-(dibenzo[b,d]furan-4-yl)-1-isopropyl-1H-benzo[d]imidazole was used instead of 1-(5-(tert-butyl)-[1,1'-biphenyl]-2-yl)-2-(dibenzo[b,d]furan-4-yl)-1H-benzo[d]imidazole. The obtained material was confirmed by Mass Spectrometry and HPLC analysis.

HRMS(MALDI) calcd for $C_{60}H_{69}IrN_4OSi_2$: m/z 1110.4639 Found: 1110.4635

Synthesis Example 4 (Compound 472)

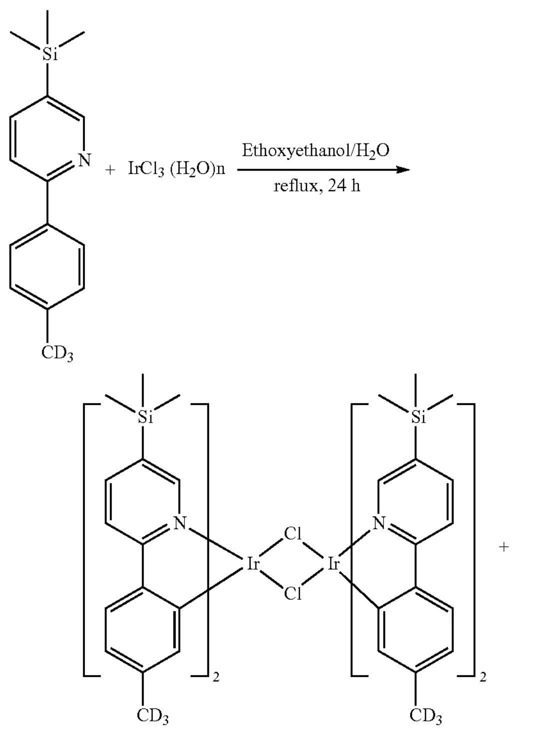

472A

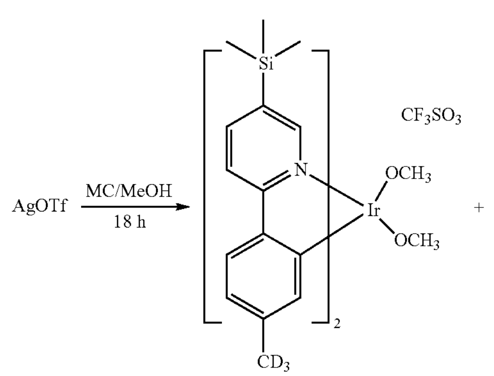

472B

-continued

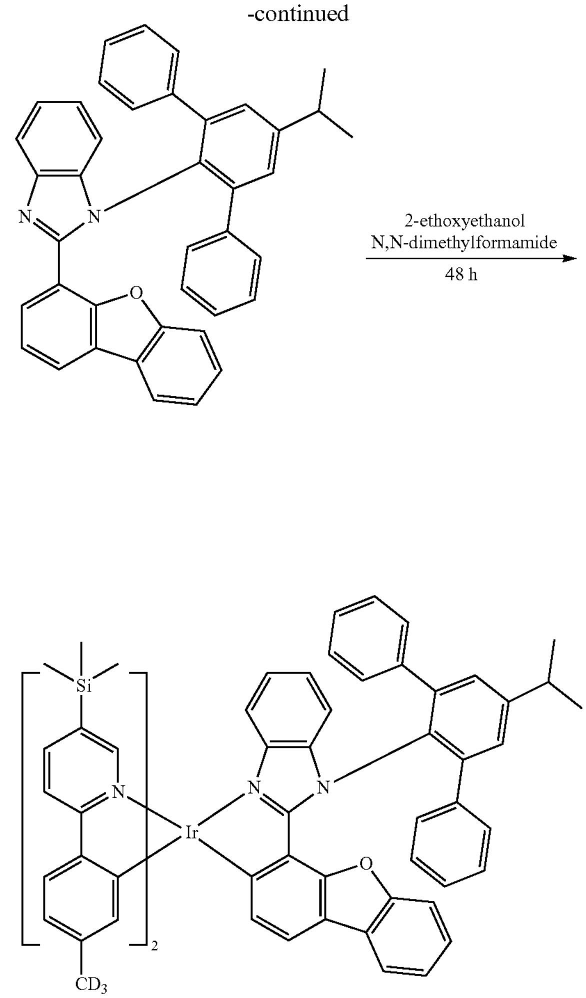

472

Synthesis of Compound 472A 5.3 g (yield of 79%) of Compound 472A was obtained in the same manner as used to synthesize Compound 17A of Synthesis Example 1, except that 2-(p-tolyl-$D_3$)-5-(trimethylsilyl)pyridine was used instead of 2-phenyl-5-(trimethylsilyl)pyridine.

Synthesis of Compound 472B

Compound 472B was obtained in the same manner as used to synthesize Compound 17B of Synthesis Example 1, except that Compound 472A was used instead of Compound 17A. The obtained Compound 472B was used in the next reaction without further purification.

Synthesis of Compound 472

0.4 g (yield of 33%) of Compound 472 was obtained in the same manner as used to synthesize Compound 17 of Synthesis Example 1, except that Compound 472B was used instead of Compound 17B, and 1-(5'-(tert-butyl)-[1,1':3',1"-terphenyl]-2'-yl)-2-(dibenzo[b,d]furan-4-yl)-1H-benzo[d]imidazole was used instead of 1-(5-(tert-butyl)-[1,1'-biphenyl]-2-yl)-2-(dibenzo[b,d]furan-4-yl)-1H-benzo[d]imidazole. The obtained material was confirmed by Mass Spectrometry and HPLC analysis.

HRMS(MALDI) calcd for $C_{71}H_{61}D_6IrN_4OSi_2$: m/z 1246.4859 Found: 1246.4856

Synthesis Example 5 (Compound 532)

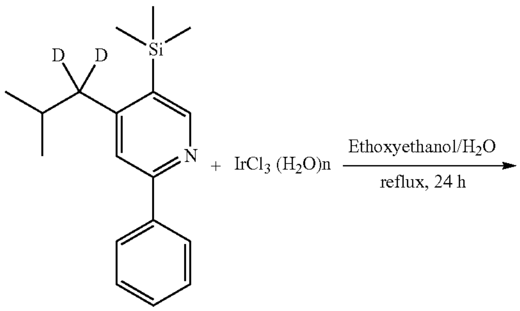

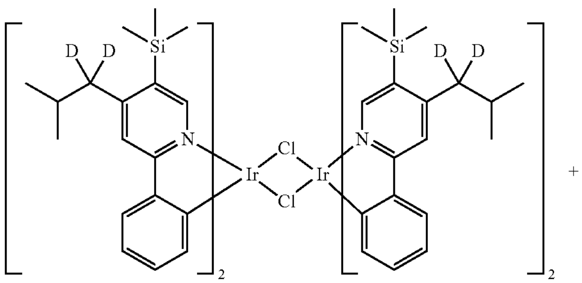

532A

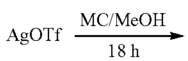

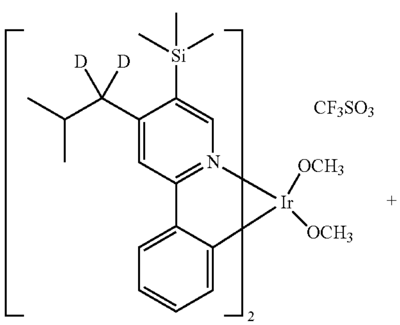

532B

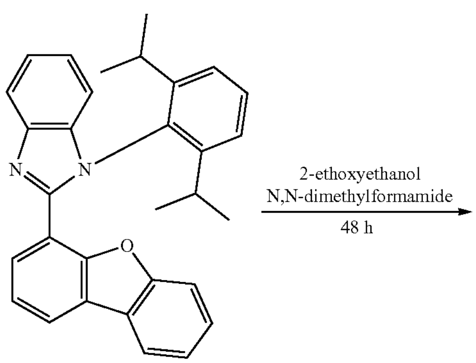

-continued

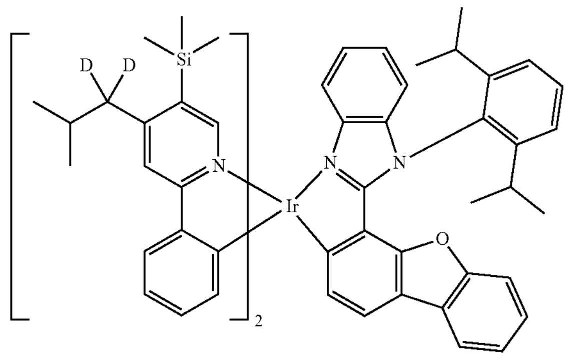

532

Synthesis of Compound 532A 2.5 g (yield of 68%) of Compound 532A was obtained in the same manner as used to synthesize Compound 17A of Synthesis Example 1, except that 4-isobutyl($D_2$)-2-phenyl-5-(trimethylsilyl)pyridine was used instead of 2-phenyl-5-(trimethylsilyl)pyridine.

Synthesis of Compound 532B

Compound 532B was obtained in the same manner as used to synthesize Compound 17B of Synthesis Example 1, except that Compound 532A was used instead of Compound 17A. The obtained Compound 532B was used in the next reaction without further purification.

Synthesis of Compound 532

0.31 g (yield of 39%) of Compound 532 was obtained in the same manner as used to synthesize Compound 17 of Synthesis Example 1, except that Compound 532B was used instead of Compound 17B, and 2-(dibenzo[b,d]furan-4-yl)-1-(2,6-diisopropylphenyl)-1H-benzo[d]imidazole was used instead of 1-(5-(tert-butyl)-[1,1'-biphenyl]-2-yl)-2-(dibenzo[b,d]furan-4-yl)-1H-benzo[d]imidazole. The obtained material was confirmed by Mass Spectrometry and HPLC analysis.

HRMS(MALDI) calcd for $C_{67}H_{71}D_4IrN_4OSi_2$: m/z 1204.5360 Found: 1204.5364

Synthesis Example 6 (Compound 666)

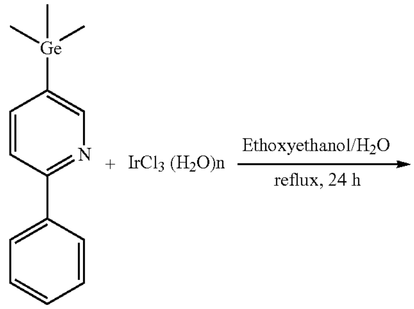

-continued

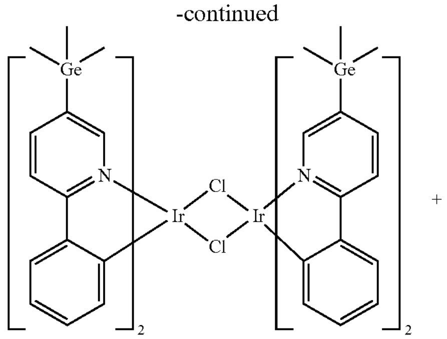

666A

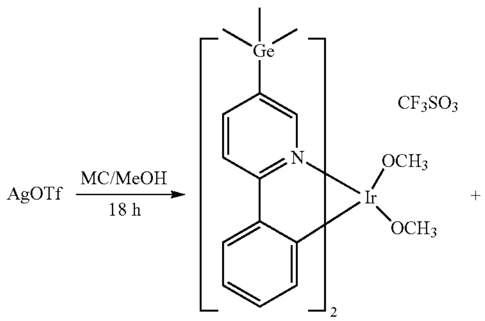

666B

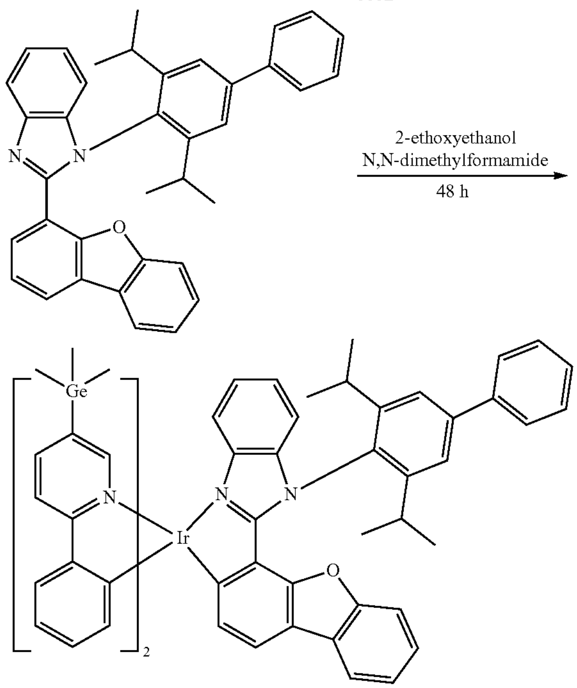

666

Synthesis of Compound 666A 2.1 g (yield of 61%) of Compound 666A was obtained in the same manner as used to synthesize Compound 17A of Synthesis Example 1, except that 2-phenyl-5-(trimethylgermyl)pyridine was used instead of 2-phenyl-5-(trimethylsilyl)pyridine.

Synthesis of Compound 666B

Compound 666B was obtained in the same manner as used to synthesize Compound 17B of Synthesis Example 1, except that Compound 666A was used instead of Compound 17A. The obtained Compound 666B was used in the next reaction without further purification.

Synthesis of Compound 666

0.33 g (yield of 42%) of Compound 666 was obtained in the same manner as used to synthesize Compound 17 of Synthesis Example 1, except that Compound 666B was used instead of Compound 17B, and 2-(dibenzo[b,d]furan-4-yl)-1-(3,5-diisopropyl-[1,1'-biphenyl]-4-yl)-1H-benzo[d]imidazole was used instead of 1-(5-(tert-butyl)-[1,1'-biphenyl]-2-yl)-2-(dibenzo[b,d]furan-4-yl)-1H-benzo[d]imidazole. The obtained material was confirmed by Mass Spectrometry and HPLC analysis.

HRMS(MALDI) calcd for $C_{65}H_{63}Ge_2IrN_4O$: m/z 1256.3055 Found: 1256.3049

Synthesis Example 7 (Compound 812)

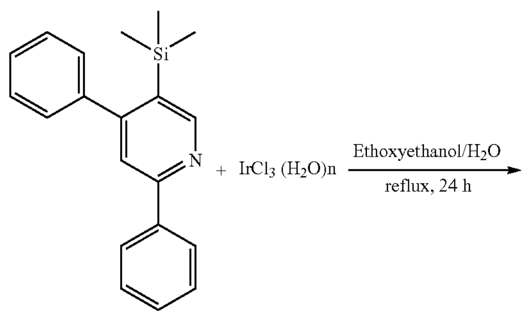

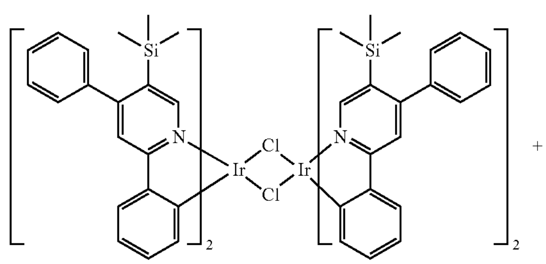

812A

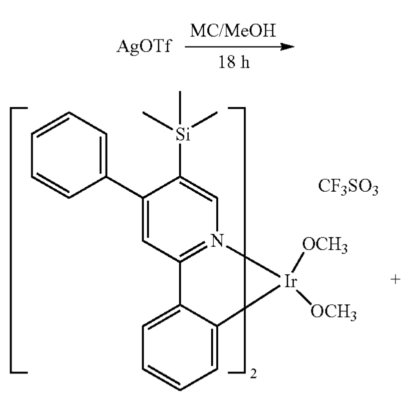

812B

-continued

812

Synthesis of Compound 812A 3.4 g (yield of 74%) of Compound 812A was obtained in the same manner as used to synthesize Compound 17A of Synthesis Example 1, except that 2,4-diphenyl-5-(trimethylsilyl)pyridine was used instead of 2-phenyl-5-(trimethylsilyl)pyridine.

Synthesis of Compound 812B

Compound 812B was obtained in the same manner as used to synthesize Compound 17B of Synthesis Example 1, except that Compound 812A was used instead of Compound 17A. The obtained Compound 812B was used in the next reaction without further purification.

Synthesis of Compound 812

0.50 g (yield of 45%) of Compound 812 was obtained in the same manner as used to synthesize Compound 17 of Synthesis Example 1, except that Compound 812B was used instead of Compound 17B, and 1-(4-(tert-butyl)phenyl)-2-(dibenzo[b,d]furan-4-yl)-1H-benzo[d]imidazole was used instead of 1-(5-(tert-butyl)-[1,1'-biphenyl]-2-yl)-2-(dibenzo[b,d]furan-4-yl)-1H-benzo[d]imidazole. The obtained material was confirmed by Mass Spectrometry and HPLC analysis.

HRMS(MALDI) calcd for $C_{69}H_{63}IrN_4OSi_2$: m/z 1256.3055 Found: 1256.3049

Synthesis Example 8 (Compound 980)

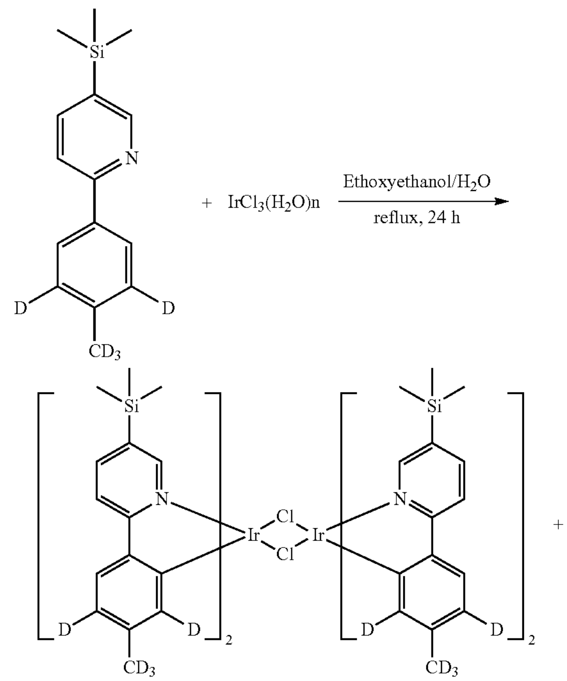

980A

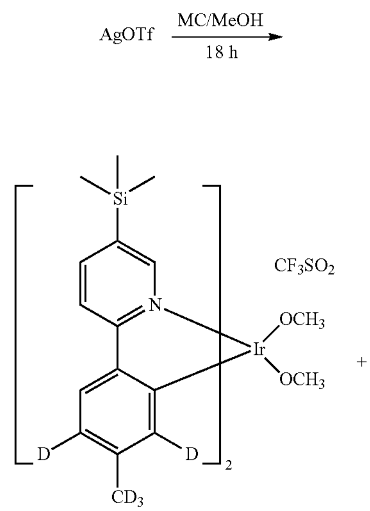

980B

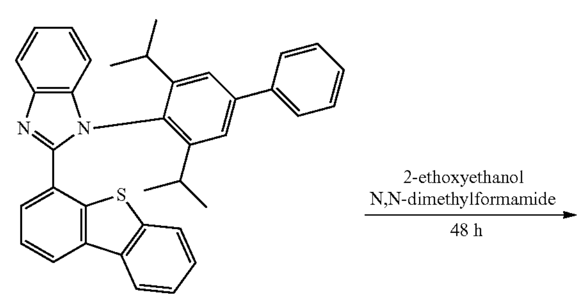

-continued

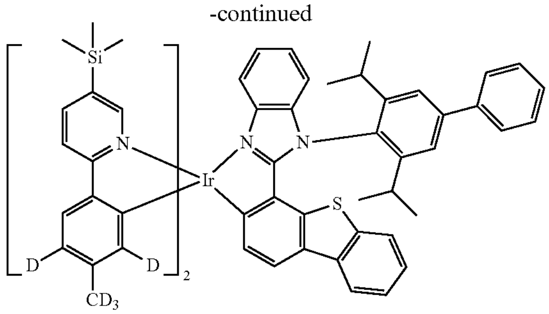

980

Synthesis of Compound 980A 2.4 g (yield of 64%) of Compound 980A was obtained in the same manner as used to synthesize Compound 17A of Synthesis Example 1, except that 2-(p-tolyl-$D_5$)-5-(trimethylsilyl)pyridine was used instead of 2-phenyl-5-(trimethylsilyl)pyridine.

Synthesis of Compound 980B

Compound 980B was obtained in the same manner as used to synthesize Compound 17B of Synthesis Example 1, except that Compound 980A was used instead of Compound 17A. The obtained Compound 980B was used in the next reaction without further purification.

Synthesis of Compound 980

0.23 g (yield of 37%) of Compound 980 was obtained in the same manner as used to synthesize Compound 17 of Synthesis Example 1, except that Compound 980B was used instead of Compound 17B, and 2-(dibenzo[b,d]thiophen-4-yl)-1-(3,5-diisopropyl-[1,1'-biphenyl]-4-yl)-1H-benzo[d]imidazole was used instead of 1-(5-(tert-butyl)-[1,1'-biphenyl]-2-yl)-2-(dibenzo[b,d]furan-4-yl)-1H-benzo[d]imidazole. The obtained material was confirmed by Mass Spectrometry and HPLC analysis.

HRMS(MALDI) calcd for $C_{67}H_{57}D_{10}IrN_4SSi_2$: m/z 1218.4882 Found: 1218.4888

Synthesis Example 9 (Compound 1020)

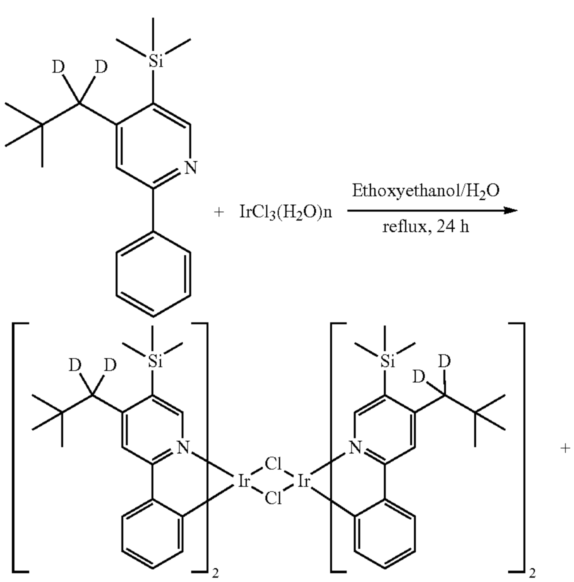

1020A

-continued

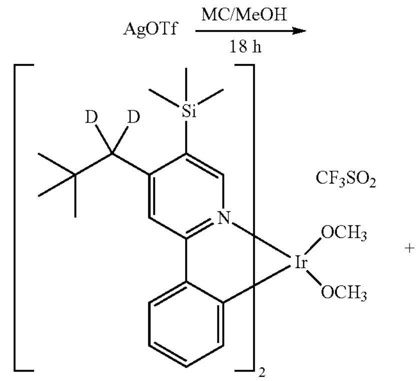

1020B

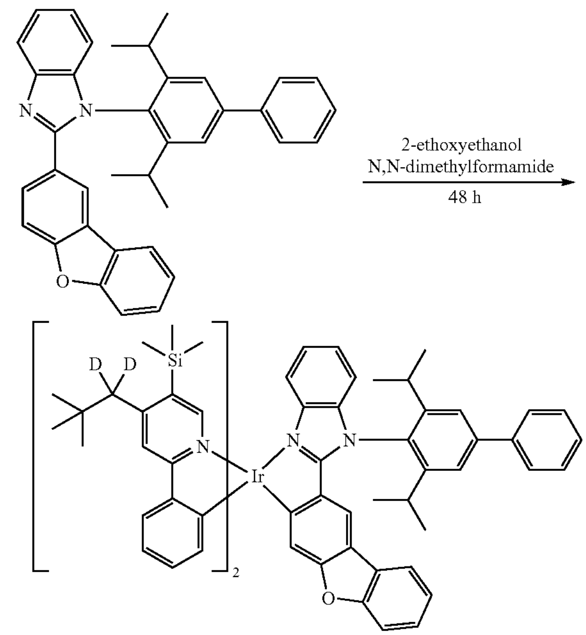

1020

Synthesis of Compound 1020A 4.2 g (yield of 81%) of Compound 1020A was obtained in the same manner as used to synthesize Compound 17A of Synthesis Example 1, except that 4-neopentyl($D_2$)-2-phenyl-5-(trimethylsilyl)pyridine was used instead of 2-phenyl-5-(trimethylsilyl)pyridine.

Synthesis of Compound 1020B

Compound 1020B was obtained in the same manner as used to synthesize Compound 17B of Synthesis Example 1, except that Compound 1020A was used instead of Compound 17A. The obtained Compound 1020B was used in the next reaction without further purification.

Synthesis of Compound 1020

0.48 g (yield of 35%) of Compound 1020 was obtained in the same manner as used to synthesize Compound 17 of Synthesis Example 1, except that Compound 1020B was used instead of Compound 17B, and 2-(dibenzo[b,d]furan-2-yl)-1-(3,5-diisopropyl-[1,1'-biphenyl]-4-yl)-1H-benzo[d]imidazole was used instead of 1-(5-(tert-butyl)-[1,1'-biphenyl]-2-yl)-2-(dibenzo[b,d]furan-4-yl)-1H-benzo[d]imidazole. The obtained material was confirmed by Mass Spectrometry and HPLC analysis.

HRMS(MALDI) calcd for $C_{75}H_{79}D_4IrN_4OSi_2$: m/z 1308.5986 Found: 1308.5981

Synthesis Example 10 (Compound 1390)

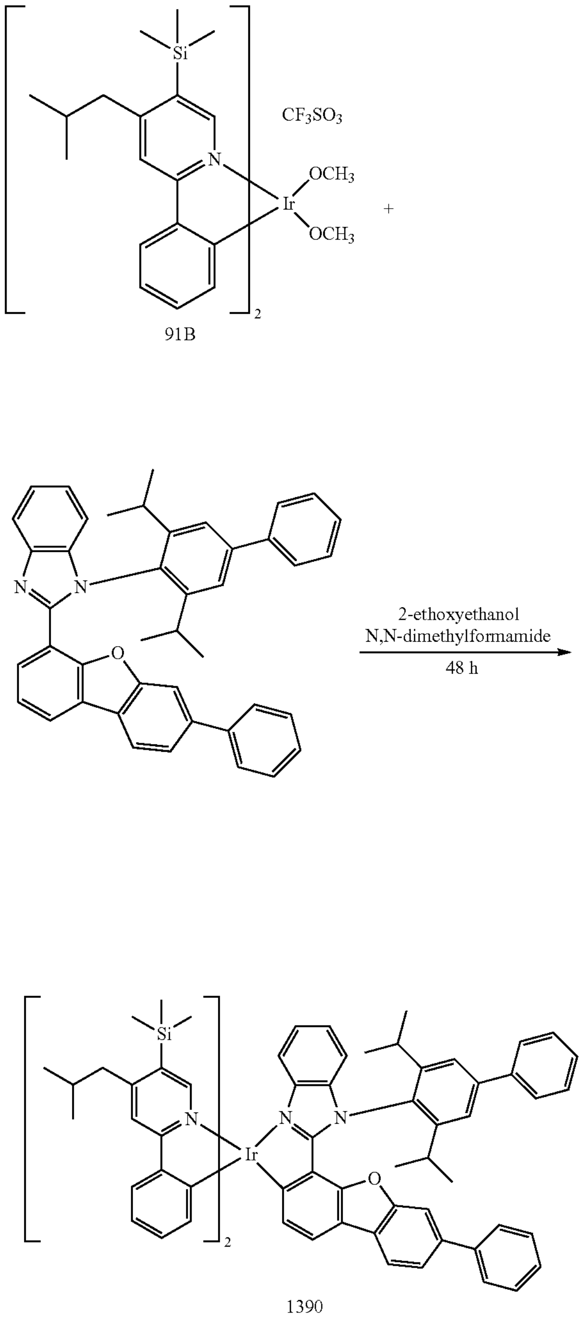

0.56 g (yield of 39%) of Compound 1390 was obtained in the same manner as used to synthesize Compound 17 of Synthesis Example 1, except that Compound 91B was used instead of Compound 17B, and 1-(3,5-diisopropyl-[1,1'-biphenyl]-4-yl)-2-(7-phenyldibenzo[b,d]furan-4-yl)-1H-benzo[d]imidazole was used instead of 1-(5-(tert-butyl)-[1,1'-biphenyl]-2-yl)-2-(dibenzo[b,d]furan-4-yl)-1H-benzo[d]imidazole. The obtained material was confirmed by Mass Spectrometry and HPLC analysis.

HRMS(MALDI) calcd for $C_7H_{83}IrN_4OSi_2$: m/z 1352.5735 Found: 1352.5733

Synthesis Example 11 (Compound 1666)

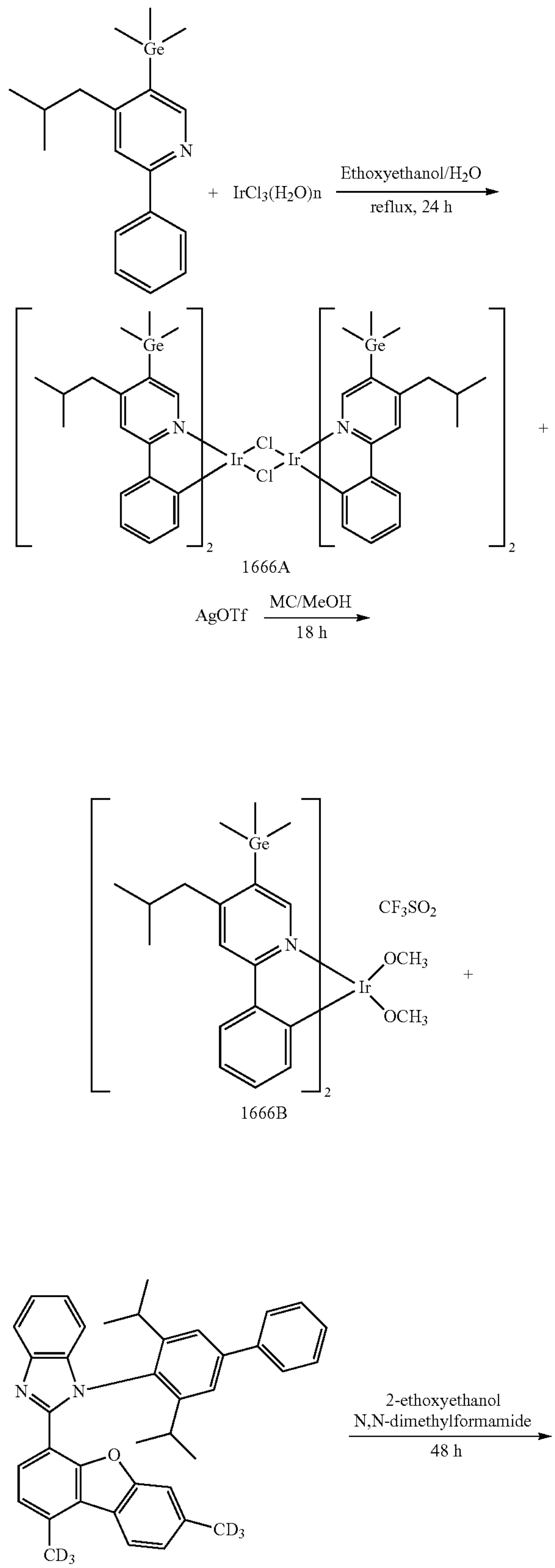

-continued

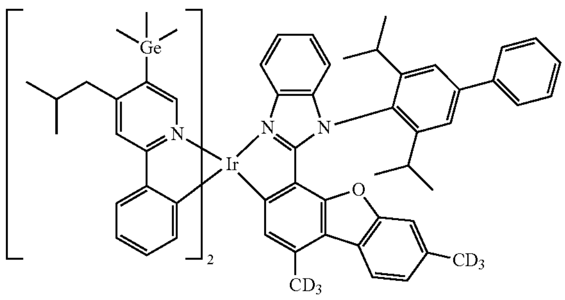

1666

Synthesis of Compound 1666A 3.3 g (yield of 65%) of Compound 1666A was obtained in the same manner as used to synthesize Compound 17A of Synthesis Example 1, except that 4-isobutyl-2-phenyl-5-(trimethylgermyl)pyridine was used instead of 2-phenyl-5-(trimethylsilyl)pyridine.

Synthesis of Compound 1666B

Compound 1666B was obtained in the same manner as used to synthesize Compound 17B of Synthesis Example 1, except that Compound 1666A was used instead of Compound 17A. The obtained Compound 1666B was used in the next reaction without further purification.

Synthesis of Compound 1666

0.42 g (yield of 27%) of Compound 1666 was obtained in the same manner as used to synthesize Compound 17 of Synthesis Example 1, except that Compound 1666B was used instead of Compound 17B, and 1-(3,5-diisopropyl-[1,1'-biphenyl]-4-yl)-2-(1,7-di(methyl-d3)dibenzo[b,d]furan-4-yl)-1H-benzo[d]imidazole was used instead of 1-(5-(tert-butyl)-[1,1'-biphenyl]-2-yl)-2-(dibenzo[b,d]furan-4-yl)-1H-benzo[d]imidazole. The obtained material was confirmed by Mass Spectrometry and HPLC analysis.

HRMS(MALDI) calcd for $C_{75}H_{77}D_6Ge_2IrN_4O$: m/z 1402.4996 Found: 1402.4991

Synthesis Example 12 (Compound 1857)

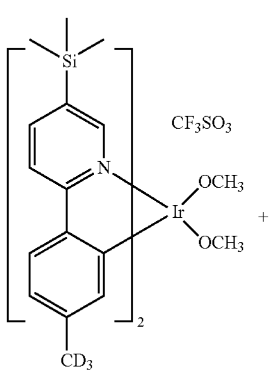

472B

-continued

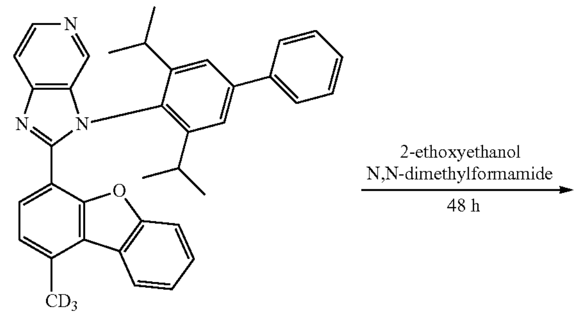

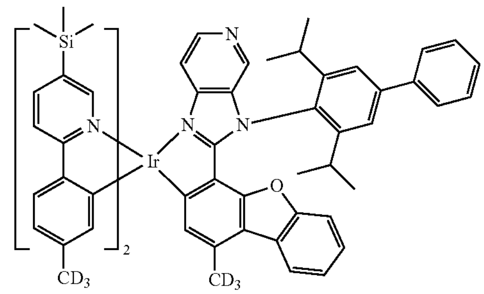

1857

0.22 g (yield of 25%) of Compound 1857 was obtained in the same manner as used to synthesize Compound 17 of Synthesis Example 1, except that Compound 472B was used instead of Compound 17B, and 3-(3,5-diisopropyl-[1,1'-biphenyl]-4-yl)-2-(1-(methyl-d3)dibenzo[b,d]furan-4-yl)-3H-imidazo[4,5-c]pyridine was used instead of 1-(5-(tert-butyl)-[1,1'-biphenyl]-2-yl)-2-(dibenzo[b,d]furan-4-yl)-1H-benzo[d]imidazole. The obtained material was confirmed by Mass Spectrometry and HPLC analysis.

HRMS(MALDI) calcd for $C_{67}H_{59}D_9IrN_5OSi_2$: m/z 1216.5157 Found: 1216.5159

Synthesis Example 13 (Compound 2010)

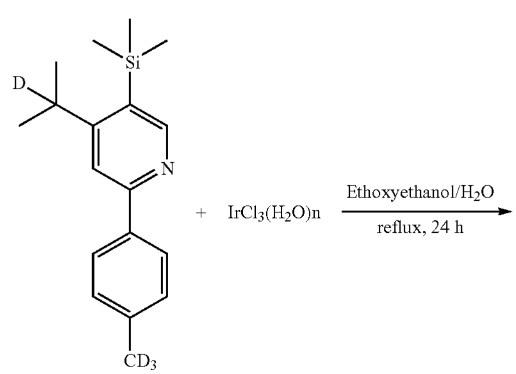

-continued

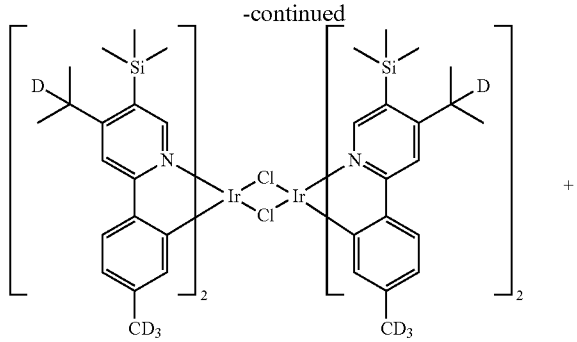

2010A

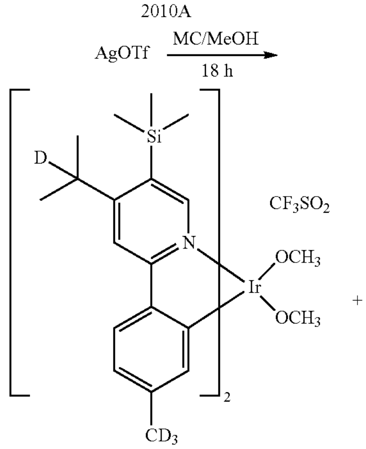

2010B

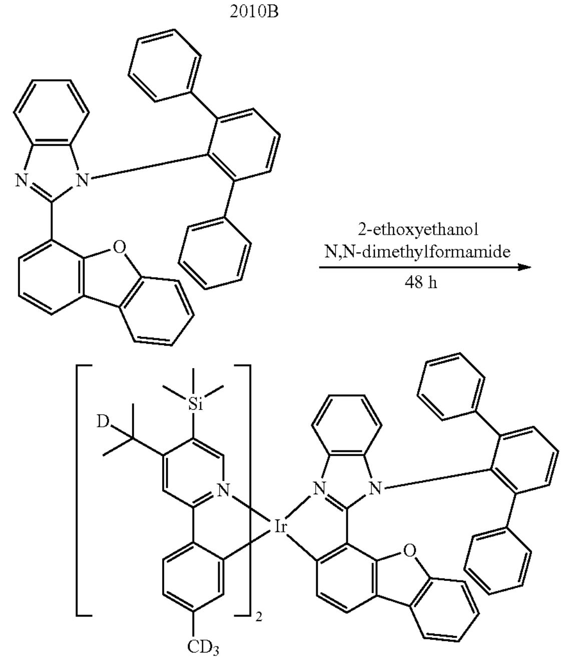

2010

Synthesis of Compound 2010A 3.1 g (yield of 74%) of Compound 2010A was obtained in the same manner as used to synthesize Compound 17A of Synthesis Example 1, except that 2-(4-(methyl-d3)phenyl)-4-(propan-2-yl-2-d)-5-(trimethylsilyl)pyridine was used instead of 2-phenyl-5-(trimethylsilyl)pyridine.

Synthesis of Compound 2010B

Compound 2010B was obtained in the same manner as used to synthesize Compound 17B of Synthesis Example 1, except that Compound 2010A was used instead of Compound 17A. The obtained Compound 2010B was used in the next reaction without further purification.

Synthesis of Compound 2010

0.45 g (yield of 42%) of Compound 2010 was obtained in the same manner as used to synthesize Compound 17 of Synthesis Example 1, except that Compound 2010B was used instead of Compound 17B, and 1-([1,1':3',1"-terphenyl]-2'-yl)-2-(dibenzo[b,d]furan-4-yl)-1H-benzo[d]imidazole was used instead of 1-(5-(tert-butyl)-[1,1'-biphenyl]-2-yl)-2-(dibenzo[b,d]furan-4-yl)-1H-benzo[d]imidazole. The obtained material was confirmed by Mass Spectrometry and HPLC analysis.

HRMS(MALDI) calcd for $C_{73}H_{63}D_8IrN_4OSi_2$: m/z 1276.5298 Found: 1276.5291

Synthesis Example 14 (Compound 2122)

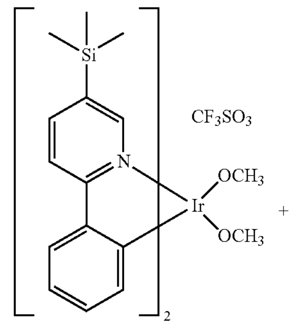

17B

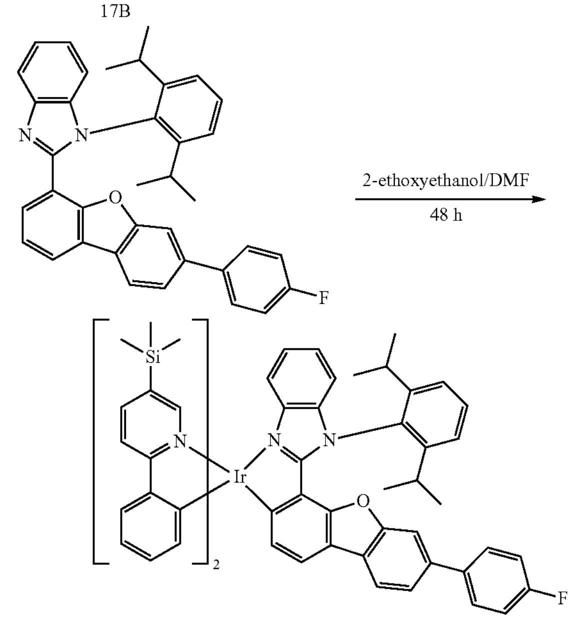

2122

0.28 g (yield of 31%) of Compound 2122 was obtained in the same manner as used to synthesize Compound 17 of Synthesis Example 1, except that 1-(2,6-diisopropylphenyl)-2-(7-(4-fluorophenyl)dibenzo[b,d]furan-4-yl)-1H-benzo[d]imidazole was used instead of 1-(5-(tert-butyl)-[1,1'-biphenyl]-2-yl)-2-(dibenzo[b,d]furan-4-yl)-1H-benzo[d]imidazole. The obtained material was confirmed by Mass Spectrometry and HPLC analysis.

HRMS(MALDI) calcd for $C_{65}H_{62}FIrN_4OSi_2$: m/z 1182.4075 Found: 1182.4082

Synthesis Example 15 (Compound 2206)

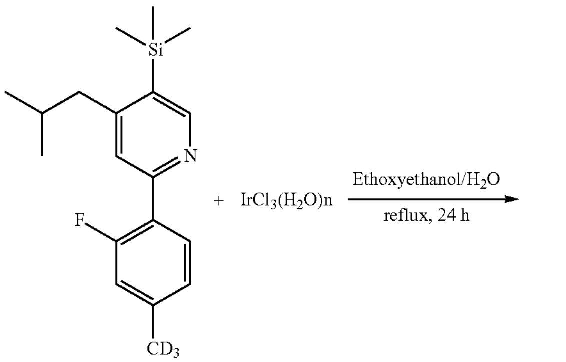

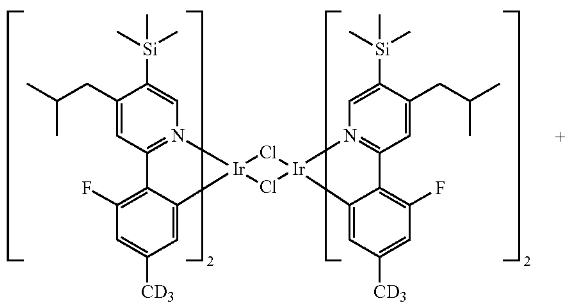

2206A

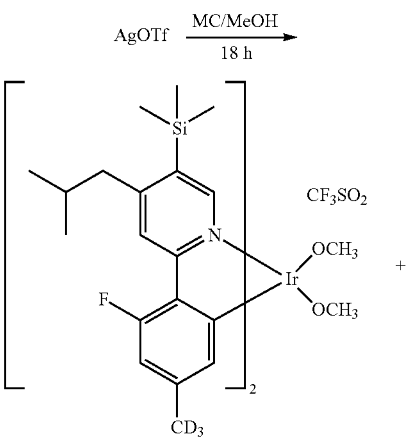

2206B

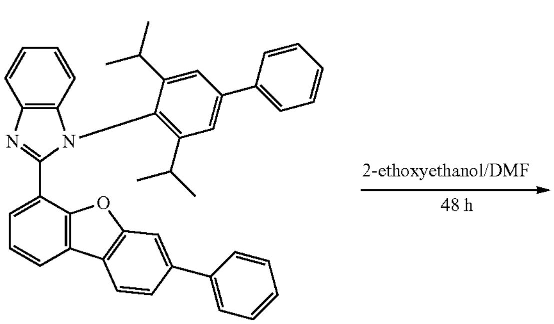

-continued

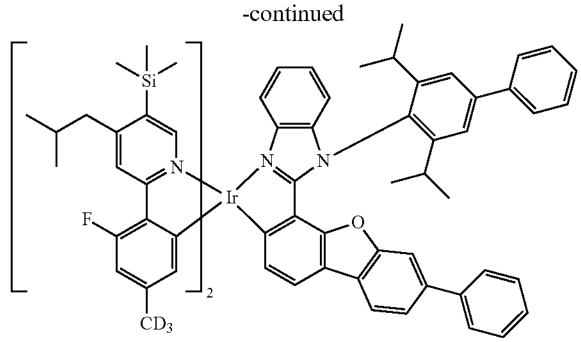

2206

Synthesis of Compound 2206A 2.8 g (yield of 64%) of Compound 2206A was obtained in the same manner as used to synthesize Compound 17A of Synthesis Example 1, except that 2-(2-fluoro-4-(methyl-d3)phenyl)-4-isobutyl-5-(trimethylsilyl)pyridine was used instead of 2-phenyl-5-(trimethylsilyl)pyridine.

Synthesis of Compound 2206B

Compound 2206B was obtained in the same manner as used to synthesize Compound 17B of Synthesis Example 1, except that Compound 2206A was used instead of Compound 17A. The obtained Compound 2206B was used in the next reaction without further purification.

Synthesis of Compound 2206

0.49 g (yield of 37%) of Compound 2206 was obtained in the same manner as used to synthesize Compound 17 of Synthesis Example 1, except that Compound 2206B was used instead of Compound 17B, and 1-(3,5-diisopropyl-[1,1'-biphenyl]-4-yl)-2-(7-phenyldibenzo[b,d]furan-4-yl)-1H-benzo[d]imidazole was used instead of 1-(5-(tert-butyl)-[1,1'-biphenyl]-2-yl)-2-(dibenzo[b,d]furan-4-yl)-1H-benzo[d]imidazole. The obtained material was confirmed by Mass Spectrometry and HPLC analysis.

HRMS(MALDI) calcd for $C_{81}H_{79}D_6F_2IrN_4OSi_2$: m/z 1422.6236 Found: 1422.6240

Synthesis Example 16 (Compound 2292)

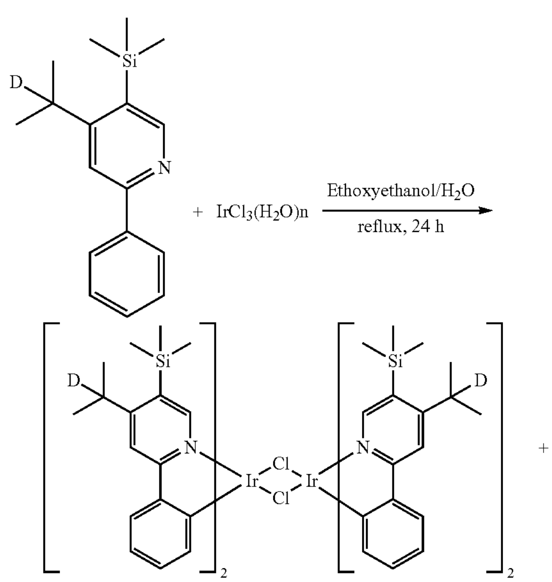

2292A

-continued

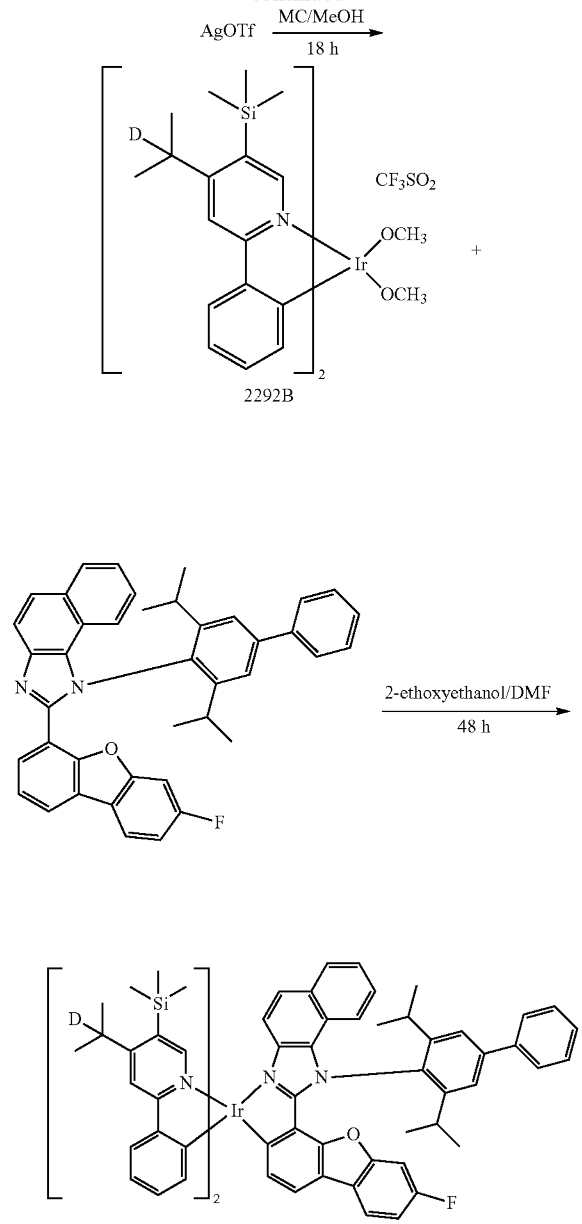

2292B

2292

Synthesis of Compound 2292A 5.4 g (yield of 84%) of Compound 2292A was obtained in the same manner as used to synthesize Compound 17A of Synthesis Example 1, except that 2-phenyl-4-(propan-2-yl-2-d)-5-(trimethylsilyl)pyridine was used instead of 2-phenyl-5-(trimethylsilyl)pyridine.

Synthesis of Compound 2292B

Compound 2292B was obtained in the same manner as used to synthesize Compound 17B of Synthesis Example 1, except that Compound 2292A was used instead of Compound 17A. The obtained Compound 2292B was used in the next reaction without further purification.

Synthesis of Compound 2292

0.61 g (yield of 35%) of Compound 2292 was obtained in the same manner as used to synthesize Compound 17 of Synthesis Example 1, except that Compound 2292B was used instead of Compound 17B, and 1-(3,5-diisopropyl-[1,1'-biphenyl]-4-yl)-2-(7-fluorodibenzo[b,d]furan-4-yl)-1H-naphtho[1,2-d]imidazole was used instead of 1-(5-(tert-butyl)-[1,1'-biphenyl]-2-yl)-2-(dibenzo[b,d]furan-4-yl)-1H-benzo[d]imidazole. The obtained material was confirmed by Mass Spectrometry and HPLC analysis.

HRMS(MALDI) calcd for $C_{75}H_{74}D_2FIrN_4OSi_2$: m/z 1318.5296 Found: 1318.5304

Synthesis Example 17 (Compound 2417)

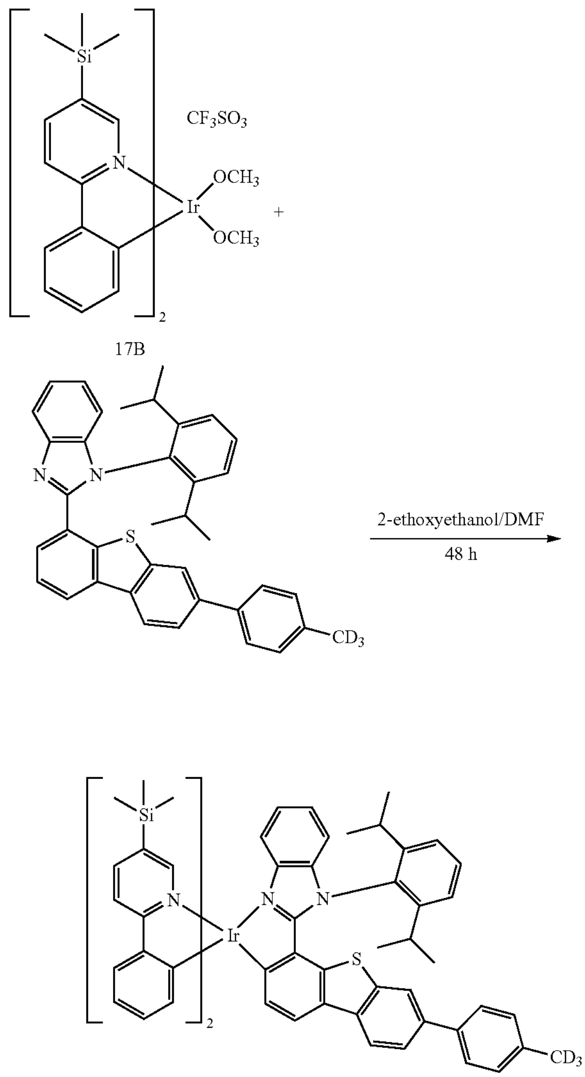

17B

2417

0.31 g (yield of 29%) of Compound 2417 was obtained in the same manner as used to synthesize Compound 17 of Synthesis Example 1, except that 1-(2,6-diisopropylphenyl)-2-(7-(4-(methyl-d3)phenyl)dibenzo[b,d]thiophen-4-yl)-1H-benzo[d]imidazole was used instead of 1-(5-(tert-butyl)-[1,1'-biphenyl]-2-yl)-2-(dibenzo[b,d]furan-4-yl)-1H-benzo[d]imidazole. The obtained material was confirmed by Mass Spectrometry and HPLC analysis.

HRMS(MALDI) calcd for $C_{66}H_{62}D_3IrN_4SSi_2$: m/z 1197.4286 Found: 1197.4281

Synthesis Example 18 (Compound 2860)

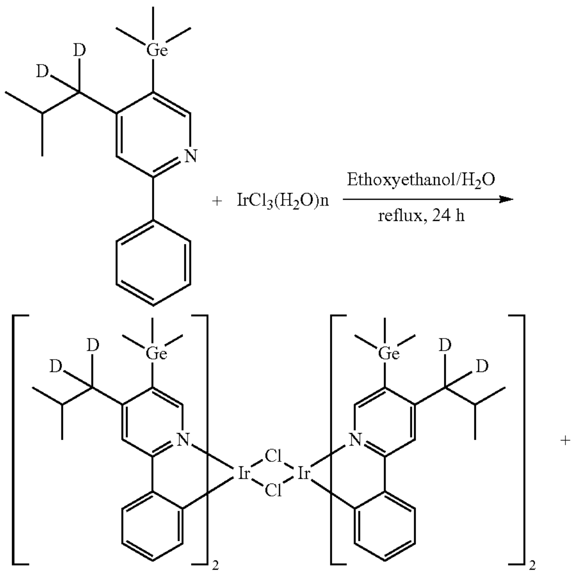

2860A

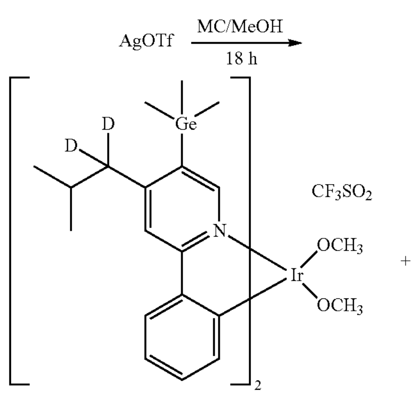

2860B

-continued

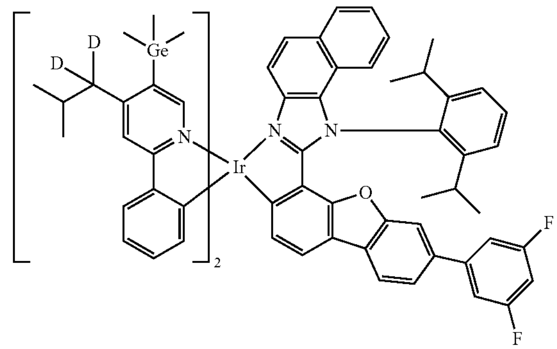

2860

Synthesis of Compound 2860A 4.4 g (yield of 74%) of Compound 2860A was obtained in the same manner as used to synthesize Compound 17A of Synthesis Example 1, except that 4-(2-methylpropyl-1,1-d2)-2-phenyl-5-(trimethylgermyl)pyridine was used instead of 2-phenyl-5-(trimethylsilyl)pyridine.

Synthesis of Compound 2860B

Compound 2860B was obtained in the same manner as used to synthesize Compound 17B of Synthesis Example 1, except that Compound 2860A was used instead of Compound 17A. The obtained Compound 2860B was used in the next reaction without further purification.

Synthesis of Compound 2860

0.39 g (yield of 28%) of Compound 2860 was obtained in the same manner as used to synthesize Compound 17 of Synthesis Example 1, except that Compound 2860B was used instead of Compound 17B, and 2-(7-(3,5-difluorophenyl)dibenzo[b,d]furan-4-yl)-1-(2,6-diisopropylphenyl)-1H-naphtho[1,2-d]imidazole was used instead of 1-(5-(tert-butyl)-[1,1'-biphenyl]-2-yl)-2-(dibenzo[b,d]furan-4-yl)-1H-benzo[d]imidazole. The obtained material was confirmed by Mass Spectrometry and HPLC analysis.

HRMS(MALDI) calcd for $C_{77}H_{75}D_4F_2Ge_2IrN_4O$: m/z 1458.4526 Found: 1458.4530

Synthesis Example 19 (Compound 3114)

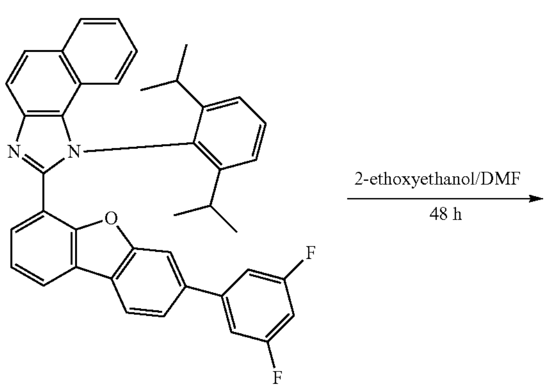

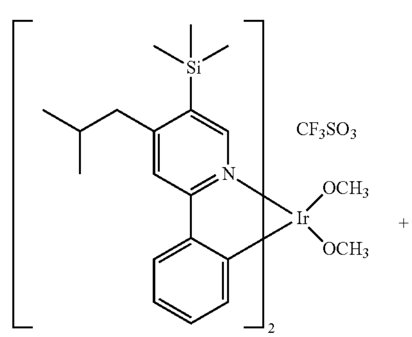

91B

-continued

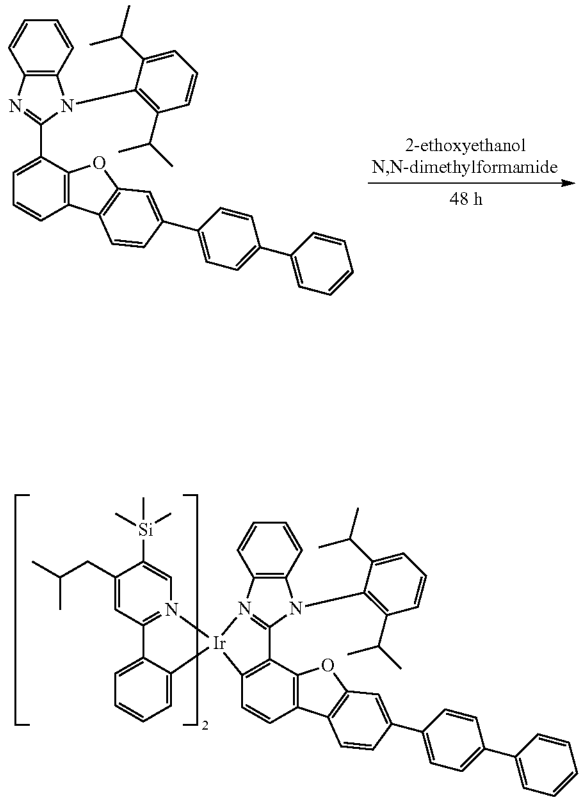

3114

0.33 g (yield of 29%) of Compound 3114 was obtained in the same manner as used to synthesize Compound 17 of Synthesis Example 1, except that Compound 91B was used instead of Compound 17B, and 2-(7-([1,1'-biphenyl]-4-yl) dibenzo[b,d]furan-4-yl)-1-(2,6-diisopropylphenyl)-1H-benzo[d]imidazole was used instead of 1-(5-(tert-butyl)-[1,1'-biphenyl]-2-yl)-2-(dibenzo[b,d]furan-4-yl)-1H-benzo[d] imidazole. The obtained material was confirmed by Mass Spectrometry and HPLC analysis.

HRMS(MALDI) calcd for $C_7H_{83}IrN_4OSi_2$: m/z 1352.5735 Found: 1352.5740

Synthesis Example 20 (Compound 3234)

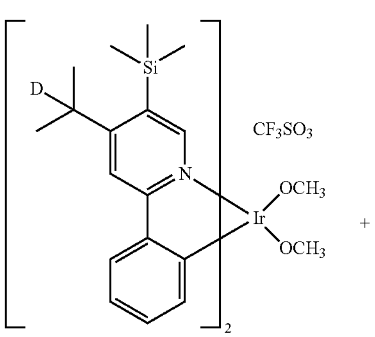

2292B

-continued

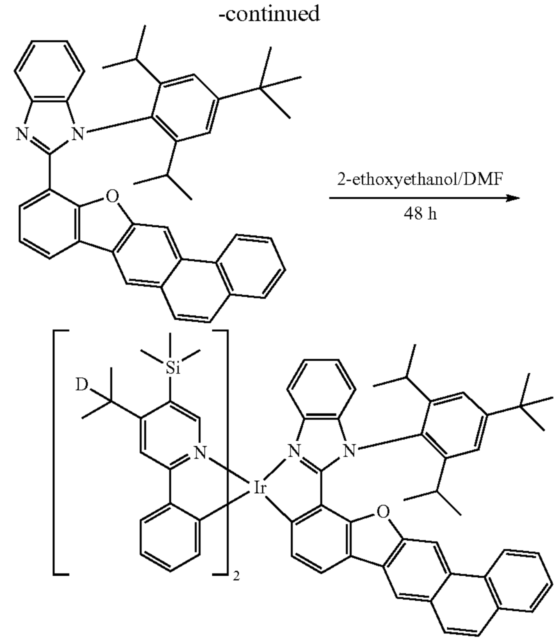

3234

0.61 g (yield of 41%) of Compound 3114 was obtained in the same manner as used to synthesize Compound 17 of Synthesis Example 1, except that Compound 2292B was used instead of Compound 17B, and 1-(4-(tert-butyl)-2,6-diisopropylphenyl)-2-(phenanthro[3,2-b]benzofuran-11-yl)-1H-benzo[d]imidazole was used instead of 1-(5-(tert-butyl)-[1,1'-biphenyl]-2-yl)-2-(dibenzo[b,d]furan-4-yl)-1H-benzo [d]imidazole. The obtained material was confirmed by Mass Spectrometry and HPLC analysis.

HRMS(MALDI) calcd for $C_{77}H_{81}D_2IrN_4OSi_2$: m/z 1330.5860 Found: 1330.5850

Comparative Synthesis Example A (Compound A)

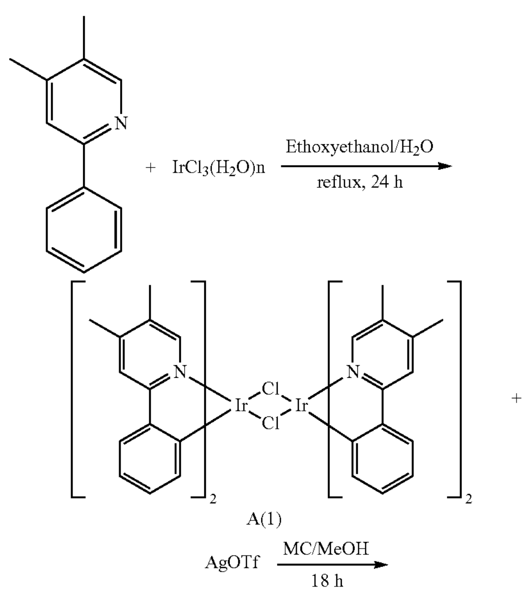

-continued

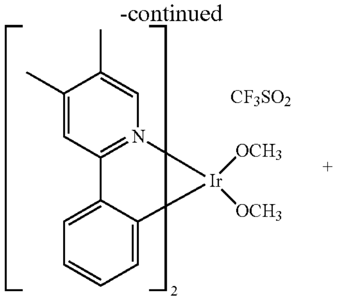

A(2)

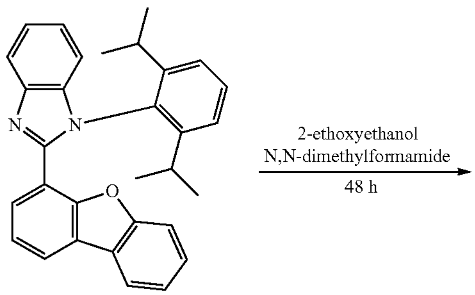

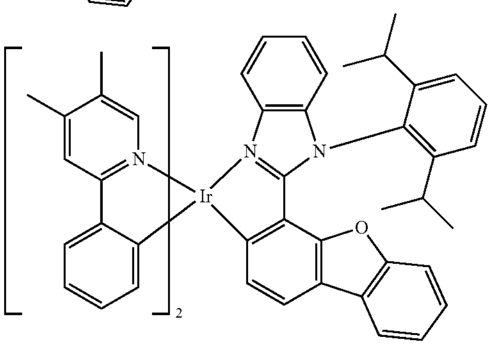

A

Synthesis of Compound A(1)

2.0 g (yield of 70%) of Compound A(1) was obtained in the same manner as used to synthesize Compound 17A of Synthesis Example 1, except that 4,5-dimethyl-2-phenylpyridine was used instead of 2-phenyl-5-(trimethylsilyl) pyridine.

Synthesis of Compound A(2)

Compound A(2) was obtained in the same manner as used to synthesize Compound 17B of Synthesis Example 1, except that Compound A(1) was used instead of Compound 17A. The obtained Compound A(2) was used in the next reaction without further purification.

Synthesis of Compound A 0.27 g (yield of 34%) of Compound A was obtained in the same manner as used to synthesize Compound 17 of Synthesis Example 1, except that Compound A(2) was used instead of Compound 17B, and 2-(dibenzo[b,d]furan-4-yl)-1-(2,6-diisopropylphenyl)-1H-benzo[d]imidazole was used instead of 1-(5-(tert-butyl)-[1,1'-biphenyl]-2-yl)-2-(dibenzo[b,d]furan-4-yl)-1H-benzo[d]imidazole. The obtained material was confirmed by Mass Spectrometry and HPLC analysis.

HRMS(MALDI) calcd for $C_{57}H_{51}IrN_4O$: m/z 1000.3692 Found: 1000.3690 Comparative Synthesis Example C (Compound C)

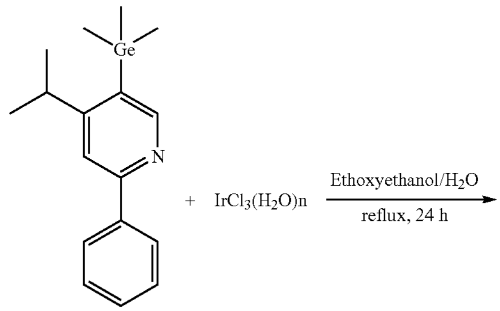

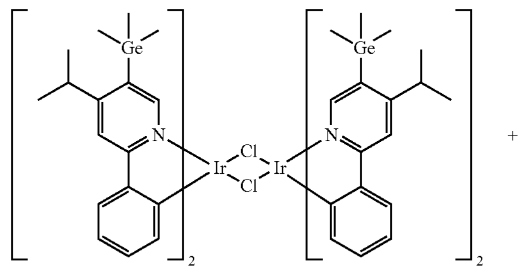

C(1)

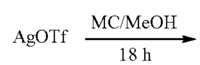

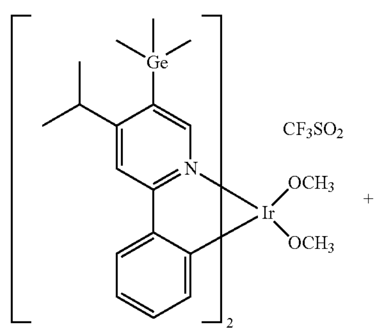

C(2)

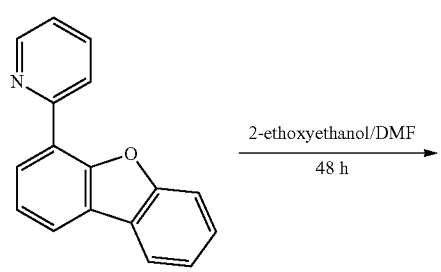

-continued

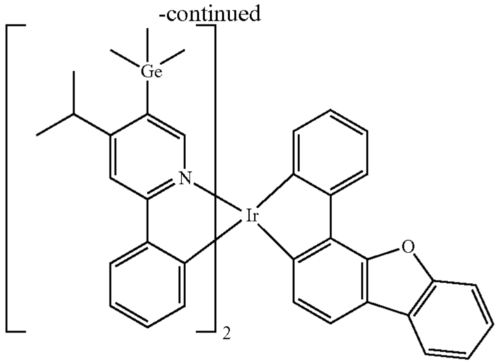

C

Synthesis of Compound C(1)

1.9 g (yield of 65%) of Compound C(1) was obtained in the same manner as used to synthesize Compound 17A of Synthesis Example 1, except that 4-isopropyl-2-phenyl-5-(trimethylgermyl)pyridine was used instead of 2-phenyl-5-(trimethylsilyl)pyridine.

Synthesis of Compound C(2)

Compound C(2) was obtained in the same manner as used to synthesize Compound 17B of Synthesis Example 1, except that Compound C(1) was used instead of Compound 17A. The obtained Compound C(2) was used in the next reaction without further purification.

Synthesis of Compound C 0.29 g (yield of 31%) of Compound C was obtained in the same manner as used to synthesize Compound 17 of Synthesis Example 1, except that Compound C(2) was used instead of Compound 17B, and 2-(dibenzo[b,d]furan-4-yl) pyridine was used instead of 1-(5-tert-butyl)-[1,1'-biphenyl]-2-yl)-2-(dibenzo[b,d]furan-4-yl)-1H-benzo[d]imidazole. The obtained material was confirmed by Mass Spectrometry and HPLC analysis.

HRMS(MALDI) calcd for $C_{51}H_{54}Ge_2IrN_3O$: m/z 1065.2320 Found: 1065.2312

Example 1

The glass substrate on which ITO was patterned as an anode was cut to a size of 50 mm×50 mm×0.5 mm and sonicated using isopropyl alcohol and deionized water, each for 5 minutes, and then ultraviolet rays were irradiated thereon for 30 minutes and exposed to ozone to be cleaned and mounted in a vacuum deposition apparatus.

Compound HT3 and F6-TCNNQ were vacuum co-deposited at a weight ratio of 98: 2 on the anode to form a hole injection layer having a thickness of 100 Å, and Compound HT3 was vacuum deposited on the hole injection layer to form a hole transport layer having a thickness of 1650 Å.

Subsequently, Compound CBP (host) and Compound 17 (dopant) were co-deposited on the hole transport layer at a weight ratio of 95:5 to form an emission layer having a thickness of 400 Å.

Then, Compound ET3 and ET-$D_1$ were co-deposited at a volume ratio of 50: 50 on the emission layer to form an electron transport layer having a thickness of 350 Å, ET-D1 was vacuum-deposited on the electron transport layer to form an electron injection layer having a thickness of 10 Å, and Al was vacuum-deposited on the electron injection layer to form a cathode having a thickness of 1000 Å, thereby completing the manufacture of an organic light-emitting device.

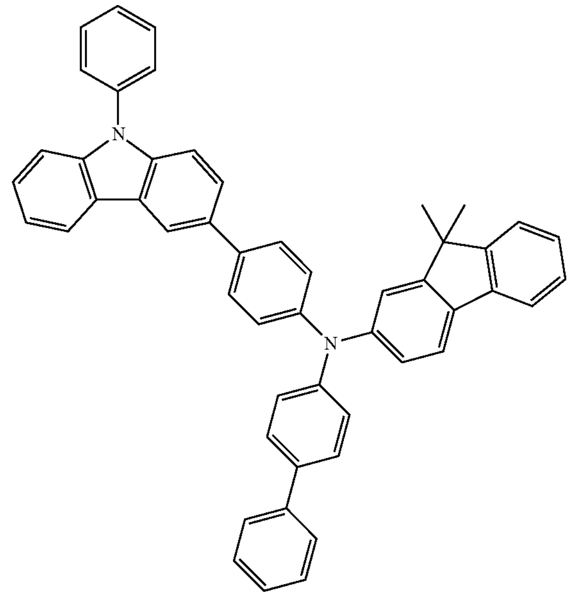

HT3

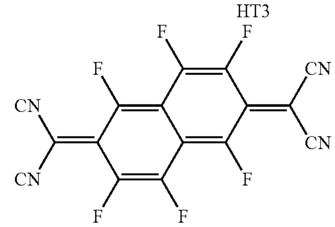

F6-TCNNQ

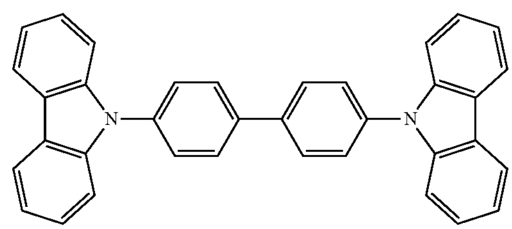

CBP

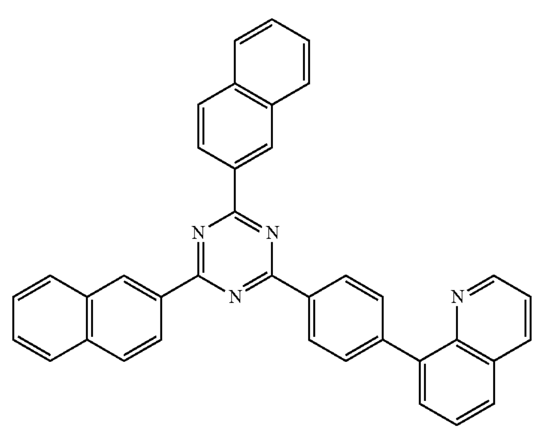

ET3

-continued

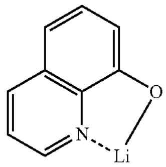

ET-D1

Examples 2 to 20 and Comparative Examples A to C

Organic light-emitting devices were manufactured in the same manner as in Example 1, except that the compounds shown in Table 2 were used instead of Compound 17 as dopants when forming the emission layer.

Evaluation Example 1: Evaluation of Properties of Organic Light-Emitting Devices For each of the organic light-emitting devices manufactured in Examples 1 to 20 and Comparative Examples A to C, the maximum value of external quantum efficiency (Max EQE) and lifespan ($LT_{97}$) were evaluated. The results are shown in Table 2. A current-voltmeter (Keithley 2400) and a luminance meter (Minolta Cs-1000A) were used as an evaluation device, and the lifespan ($LT_{97}$) (at 8000 nit) was expressed as a relative value (%) by evaluating the time (hr) for the luminance of 97% with respect to the initial luminance of 100%.

TABLE 2

| | Dopant in emission layer Compound No. | Max EQE (%) | $LT_{97}$ (%) (at 8000 nit) (a relative value, %) |
|---|---|---|---|
| Example 1 | 17 | 97 | 125 |
| Example 2 | 91 | 103 | 105 |
| Example 3 | 102 | 90 | 85 |
| Example 4 | 472 | 96 | 115 |
| Example 5 | 532 | 100 | 100 |
| Example 6 | 666 | 96 | 100 |
| Example 7 | 812 | 100 | 80 |
| Example 8 | 980 | 98 | 120 |
| Example 9 | 1020 | 96 | 110 |
| Example 10 | 1390 | 105 | 100 |
| Example 11 | 1666 | 101 | 120 |
| Example 12 | 1857 | 97 | 90 |
| Example 13 | 2010 | 103 | 130 |
| Example 14 | 2122 | 100 | 150 |
| Example 15 | 2206 | 106 | 135 |
| Example 16 | 2292 | 103 | 110 |
| Example 17 | 2417 | 101 | 145 |
| Example 18 | 2860 | 104 | 105 |
| Example 19 | 3114 | 108 | 120 |
| Example 20 | 3234 | 107 | 145 |
| Comparative Example A | A | 85 | 45 |
| Comparative Example B | B | 72 | 28 |
| Comparative Example C | C | 72 | 20 |

17

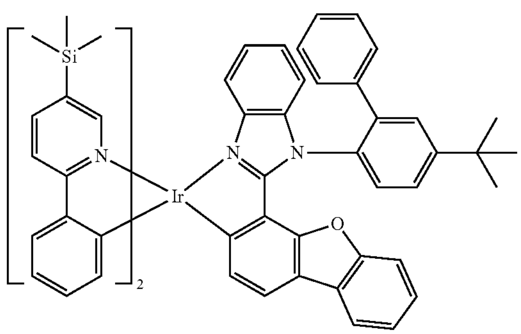

91

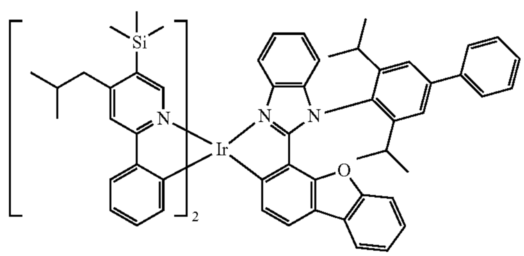

102

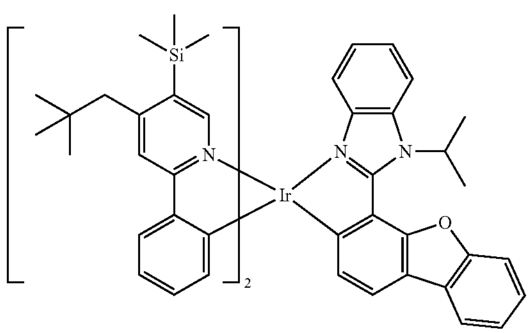

472

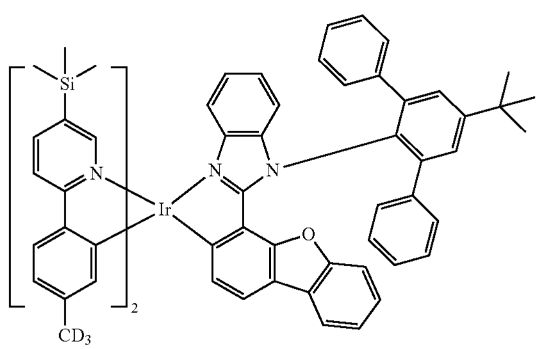

-continued
532
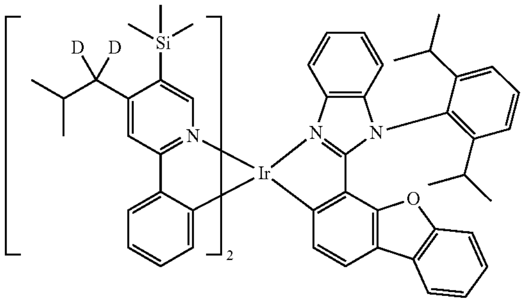
666
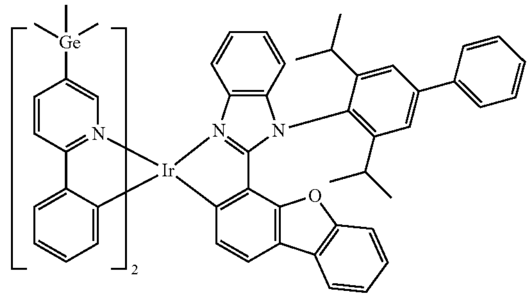
812
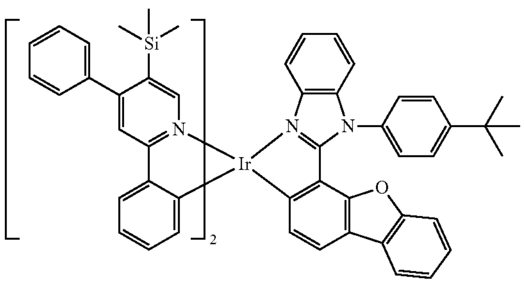
980
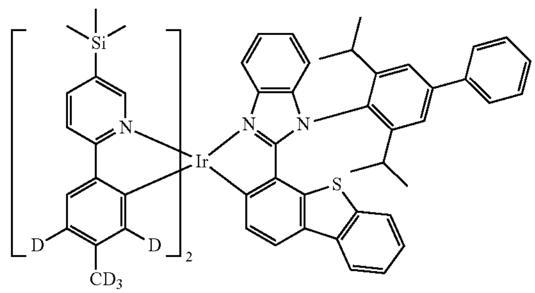
1020
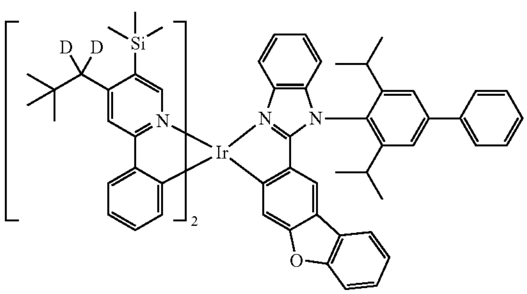
1390
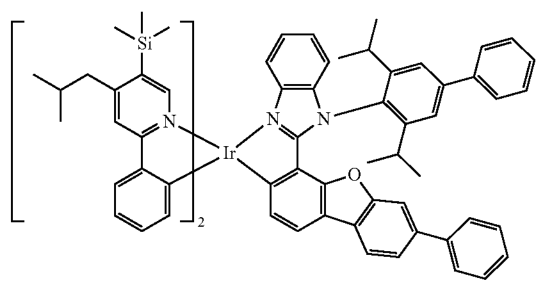
1666
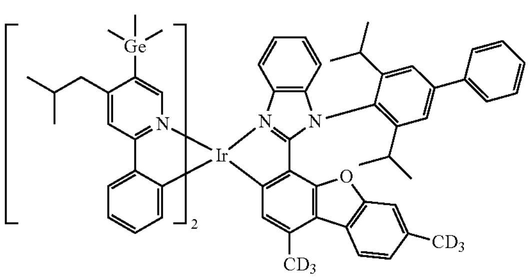
1857
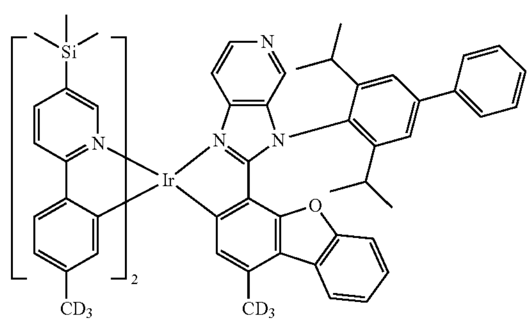
2010
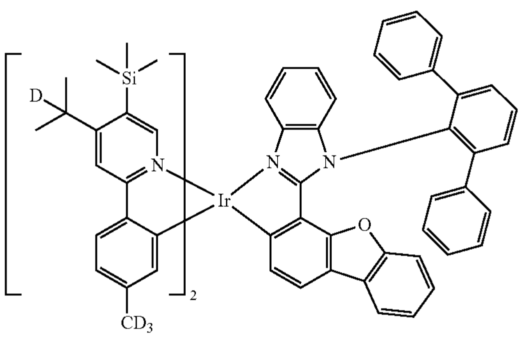
2122
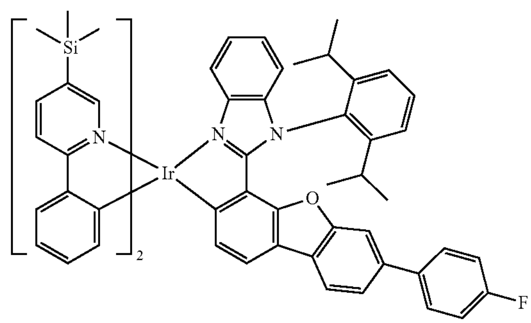

-continued
2206
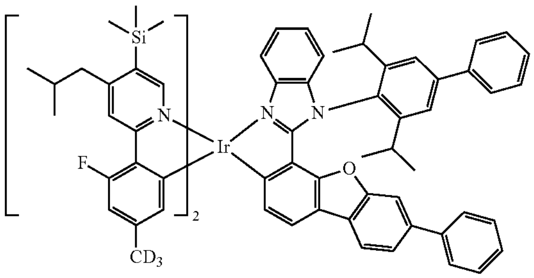
2292
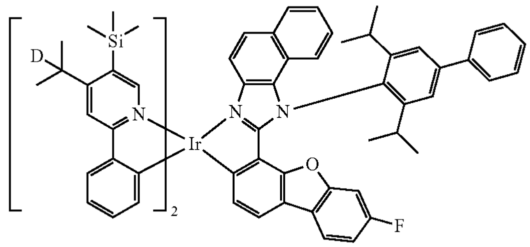
2417
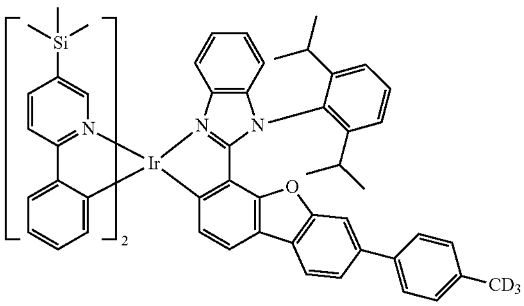
2860
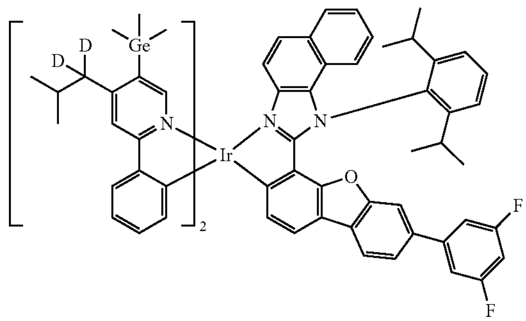
3114
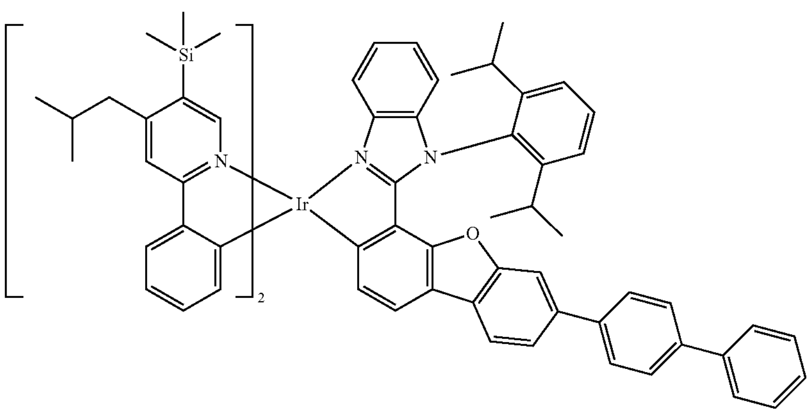
3234
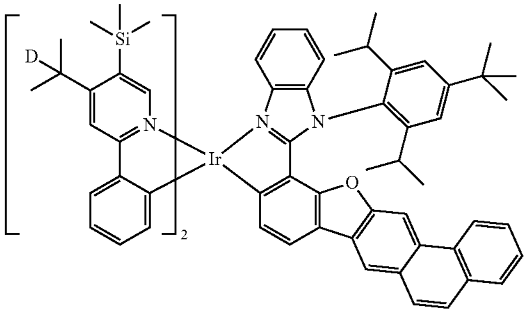
A
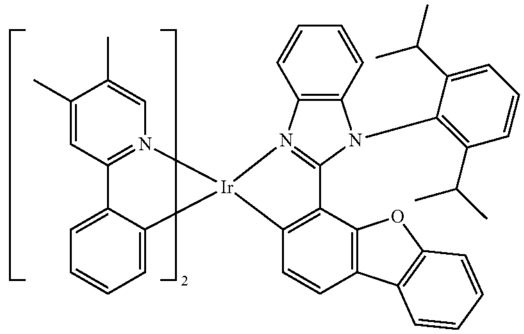

-continued

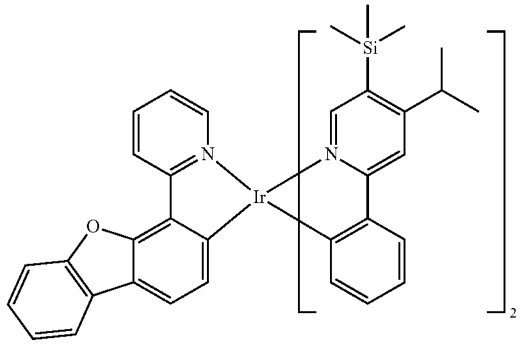

B

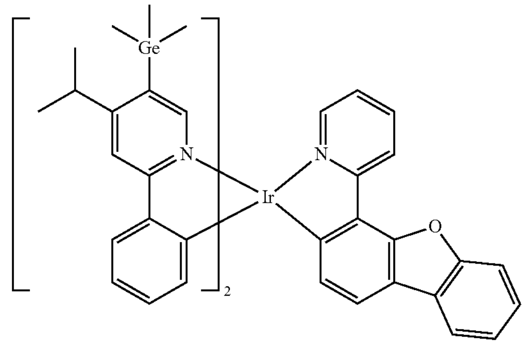

C

From Table 2, it can be seen that the organic light-emitting devices of Examples 1 to 20 emit green light and have an improved external quantum luminescence efficiency and improved lifespan characteristics compared to the organic light-emitting devices of Comparative Examples A to C.

The organometallic compound has excellent electrical properties, an electronic device, for example, organic light-emitting device using the organometallic compound can have improved external quantum efficiency and improved lifespan property, and an electronic apparatus having a high-quality by using the organic light-emitting device.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An organometallic compound represented by Formula 1:

$$M(L_1)_{n-1}(L_2)_{n-2}$$ <Formula 1> wherein, in Formula 1,

M is a transition metal, $L_1$ is a ligand represented by Formula 2, $L_2$ is a ligand represented by Formula 3, n1 and n2 are each independently 1 or 2, wherein when n1 is 2, two $L_1$(s) are identical to or different from each other, and when n2 is 2, two $L_2$(s) are identical to or different from each other, <Formula 2>

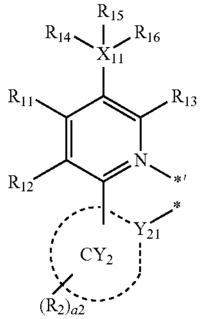

-continued

<Formula 3>

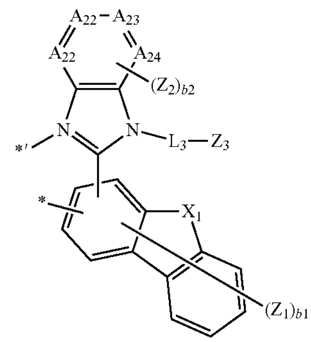

wherein, in Formulae 2 and 3, $Y_{21}$ is C or N, ring $CY_2$ is a $C_5$-$C_{30}$ carbocyclic group or a $C_1$-$C_{30}$ heterocyclic group, $X_{11}$ is Si, $X_1$ is O, S, Se, $N(Z_{19})$, $C(Z_{19})(Z_{20})$, or $Si(Z_{19})(Z_{20})$, $A_{21}$ to $A_{24}$ are each independently C or N, $L_3$ is a single bond, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, $R_2$, $R_{11}$ to $R_{16}$, $Z_1$ to $Z_3$, $Z_{19}$, and $Z_{20}$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P({=}O)(Q_8)(Q_9)$, or —$P(Q_8)(Q_9)$, a2 is an integer from 0 to 20, and when a2 is 2 or more, two or more $R_2$(s) are identical to or different from each other, b1 is an integer from 0 to 6, and when b1 is 2 or more, two or more $Z_1$(s) are identical to or different from each other, b2 is an integer from 0 to 4, and when b2 is 2 or more, two or more $Z_2$(s) are identical to or different from each other, $R_{11}$ and $R_{12}$ are optionally linked to form a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, two or more of a plurality of $R_2$(s) are optionally linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two or more of a plurality of $Z_1$(s) are optionally linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two or more of a plurality of $Z_2$(s) are optionally linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $R_{10a}$ is the same as defined in connection with $Z_1$,

* and *' each indicate a binding site to M in Formula 1, provided that at least one of i) to v) is true:

i) b1 is at least one and the at least one $Z_1$ is $C_1$-$C_3$ alkyl group unsubstituted or substituted with at least one deuterium, ii) b2 is at least one and the at least one $Z_2$ is —$CD_3$,—$CD_2H$, —$CDH_2$ or —CH3, iii) at least one of $R_2$, $R_{11}$, $R_{12}$ and $R_{13}$ is deuterium; —$CD_3$; —$CD_2H$; —$CDH_2$; a substituted or unsubstituted $C_2$-$C_{60}$ alkyl group; or a substituted or unsubstituted $C_6$-$C_{60}$ aryl group, iv) $R_2$ is deuterium, a substituted or unsubstituted $C_1$-$C_{60}$ alkyl group, a substituted or unsubstituted $C_2$-$C_{60}$ alkenyl group, a substituted or unsubstituted $C_3$-$C_{10}$ cycloalkyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, and at least one of $R_{11}$, $R_{12}$ and $R_{13}$ is deuterium, a substituted or unsubstituted $C_1$-$C_{60}$ alkyl group, a substituted or unsubstituted $C_2$-$C_{60}$ alkenyl group, a substituted or unsubstituted $C_3$-$C_{10}$ cycloalkyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, v) a group represented by *-$L_3$-$Z_3$ is a group represented Formula 9-3, 10-12, 10-19, 10-45, 10-48, 10-59, 10-62, 10-70 or 10-121, 9-3

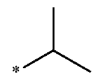

10-12

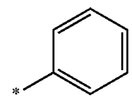

10-19

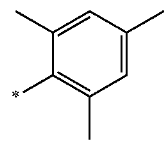

10-45

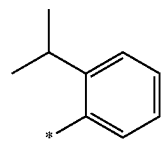

10-48

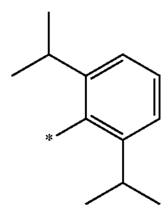

10-59

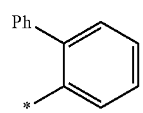

10-62

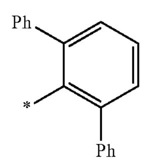

10-70

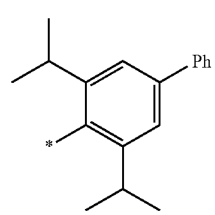

10-121

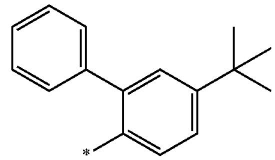

a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with deuterium, —F, —Cl , —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$) ($Q_{15}$), —Ge($Q_{13}$)($Q_{14}$)($Q_{15}$), —B($Q_{16}$)($Q_{17}$), —P(═O)($Q_{18}$)($Q_{19}$), —P($Q_{18}$)($Q_{19}$), or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-C60 aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P(═O)($Q_{28}$)($Q_{29}$), —P($Q_{28}$)($Q_{29}$), or any combination thereof;

—N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(═O)($Q_{38}$)($Q_{39}$), or —P($Q_{38}$)($Q_{39}$); or any combination thereof, wherein $Q_1$ to $Q_9$, $Q_{11}$ to $Q_{19}$, $Q_{21}$ to $Q_{29}$, and $Q_{31}$ to $Q_{39}$ are each independently hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group, unsubstituted or substituted with deuterium, —F, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group, unsubstituted or substituted with deuterium, —F, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

2. The organometallic compound of claim 1, wherein ring $CY_2$ is a benzene group, a naphthalene group, an anthracene group, a phenanthrene group, a 1,2,3,4-tetrahydronaphthalene group, a carbazole group, a fluorene group, a dibenzosilole group, a dibenzothiophene group, or a dibenzofuran group.

3. The organometallic compound of claim 1, wherein $L_3$ in Formula 1 is:

a single bond; or a benzene group, a naphthalene group, a dibenzofuran group, or a dibenzothiophene group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated phenyl group, a fluorinated phenyl group, a ($C_1$-$C_{20}$ alkyl) phenyl group, a naphthyl group, a pyridinyl group, a furanyl group, a thiophenyl group, a benzofuranyl group, a benzothiophenyl group, a dibenzofuranyl group, a dibenzothiophenyl group, or any combination thereof.

4. The organometallic compound of claim 1, wherein $R_2$, $R_{11}$ to $R_{13}$, $Z_1$ to $Z_3$, $Z_{19}$ and $Z_{20}$ in Formulae 2 and 3 are each independently:

hydrogen, deuterium, —F, or a cyano group; or a $C_1$-$C_{20}$ alkyl group, a $C_3$-$C_{10}$ cycloalkyl group, a phenyl group, a naphthyl group, a pyridinyl group, a furanyl group, a thiophenyl group, a benzofuranyl group, a benzothiophenyl group, a dibenzofuranyl group, or a dibenzothiophenyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated phenyl group, a fluorinated phenyl group, a ($C_1$-$C_{20}$ alkyl) phenyl group, a naphthyl group, a pyridinyl group, a furanyl group, a thiophenyl group, a benzofuranyl group, a benzothiophenyl group, a dibenzofuranyl group, a dibenzothiophenyl group, —Si($Q_{33}$)($Q_{34}$)($Q_{35}$), —Ge($Q_{33}$)($Q_{34}$)($Q_{35}$), or any combination thereof, and $R_{14}$ to $R_{16}$ in Formula 2 are each independently a $C_1$-$C_{20}$ alkyl group, a $C_3$-$C_{10}$ cycloalkyl group, a phenyl group, a naphthyl group, a pyridinyl group, a furanyl group, a thiophenyl group, a benzofuranyl group, a benzothiophenyl group, a dibenzofuranyl group, or a dibenzothiophenyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated phenyl group, a fluorinated phenyl group, a ($C_1$-$C_{20}$ alkyl)phenyl group, a naphthyl group, a pyridinyl group, a furanyl group, a thiophenyl group, a benzofuranyl group, a benzothiophenyl group, a dibenzofuranyl group, a dibenzothiophenyl group, or any combination thereof.

5. The organometallic compound of claim 1, wherein $R_{11}$ is not hydrogen.

6. The organometallic compound of claim 1, wherein satisfying at least one of <Condition A>and <Condition B>:

<Condition A>

$L_3$ is a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, <Condition B>

$Z_3$ is a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

7. The organometallic compound of claim 1, wherein a group represented by

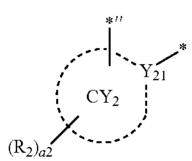

in Formulae 2 is a group represented by one of Formulae CY2-1 to CY2-33:

CY2-1

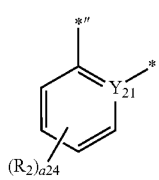

CY2-2

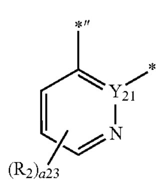

-continued

CY2-3

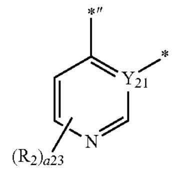

CY2-4

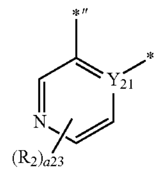

CY2-5

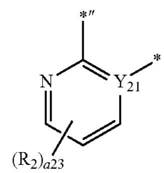

CY2-6

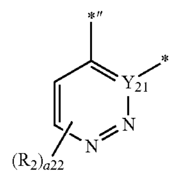

CY2-7

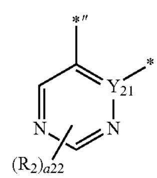

CY2-8

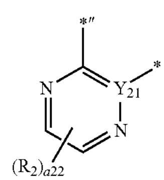

CY2-9

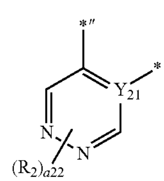

CY2-10

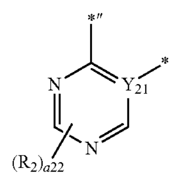

-continued
CY2-11
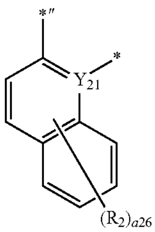
CY2-12
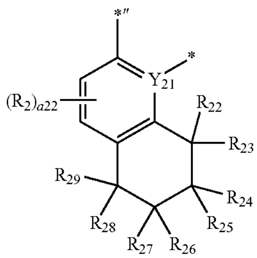
CY2-13
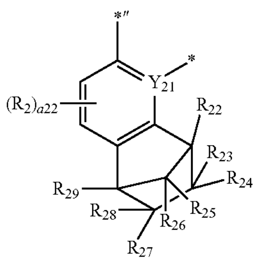
CY2-14
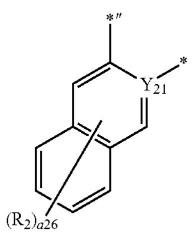
CY2-15
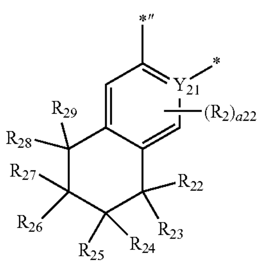
CY2-16
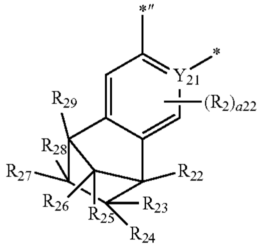
-continued
CY2-17
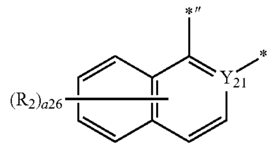
CY2-18
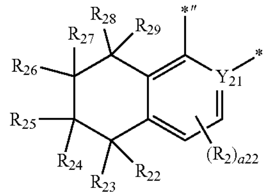
CY2-19
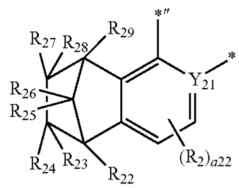
CY2-20
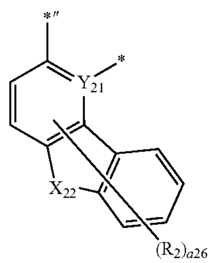
CY2-21
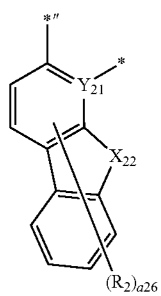
CY2-22
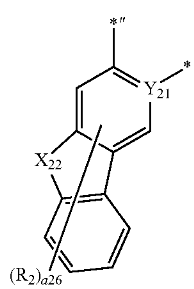
CY2-23
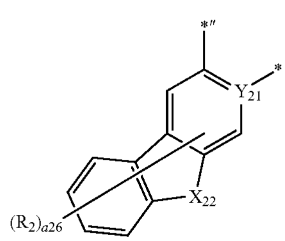

-continued

CY2-24

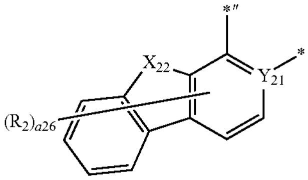

CY2-25

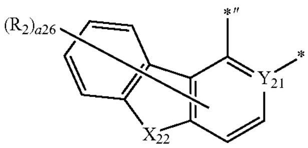

CY2-26

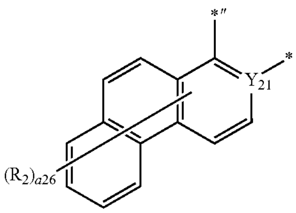

CY2-27

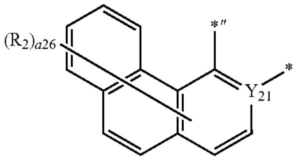

CY2-28

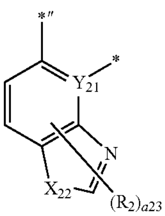

CY2-29

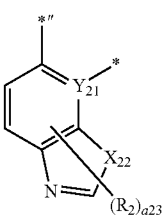

CY2-30

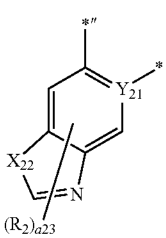

CY2-31

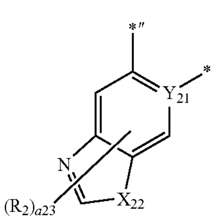

-continued

CY2-32

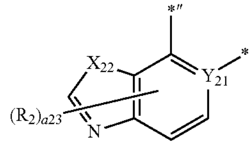

CY2-33

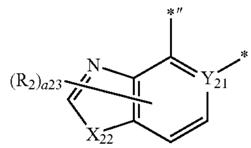

wherein, in Formulae CY2-1 to CY2-33, $Y_{21}$ and $R_2$ are the same as described in claim 1, $X_{22}$ is $C(R_{22})(R_{23})$, $N(R_{22})$, O, S, or $Si(R_{22})(R_{23})$, $R_{22}$ to $R_{29}$ are the same as described in connection with $R_2$ in claim 1, a28 is an integer from 0 to 8, a26 is an integer from 0 to 6, a24 is an integer from 0 to 4, a23 is an integer from 0 to 3, a22 is an integer from 0 to 2,

*" indicates a binding site to a neighboring atom in Formula 2, and

* indicates a binding site to M in Formula 1.

8. The organometallic compound of claim 1, wherein a group represented by

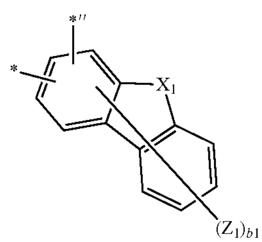

in Formula 3 is a group represented by one of Formulae CY3-1 to CY3-6:

CY3-1

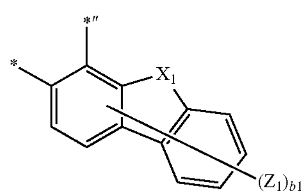

CY3-2

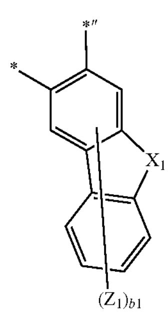

-continued

CY3-3

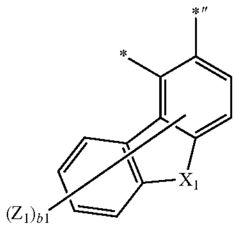

CY3-4

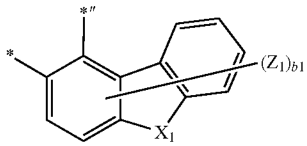

CY3-5

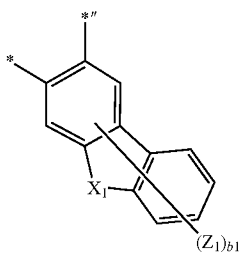

CY3-6

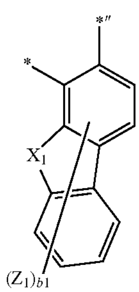

wherein, in Formulae CY3-1 to CY3-6, $X_1$, $Z_1$, and b1 are the same as described in claim 1,

* indicates a binding site to M in Formula 1, and

*" indicates a binding site to a neighboring atom in Formula 3.

9. The organometallic compound of claim 1, wherein a group represented by

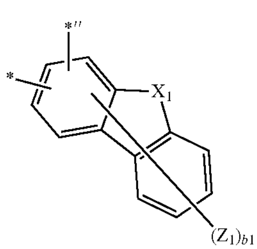

in Formula 3 is a group represented by one of Formulae CY3-1A to CY3-1D, CY3-2A to CY3-2D, CY3-3A to CY3-3D, CY3-4A to CY3-4D, CY3-5A to CY3-5D, and CY3-6A to CY3-6D:

CY3-1A

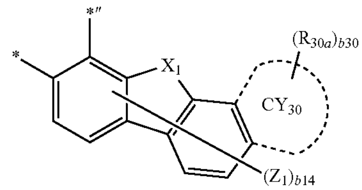

CY3-1B

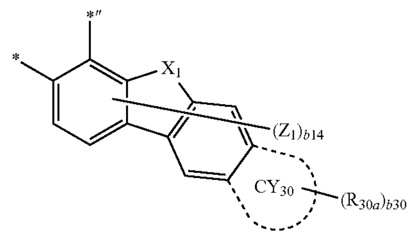

CY3-1C

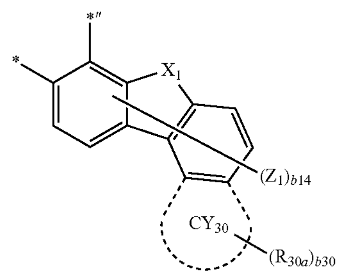

CY3-1D

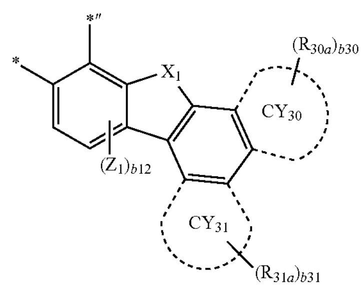

CY3-2A

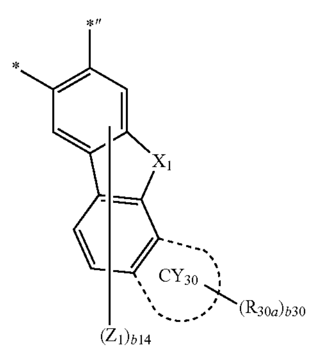

-continued
CY3-2B
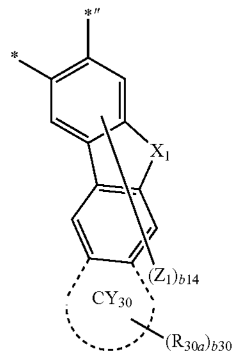
CY3-2C
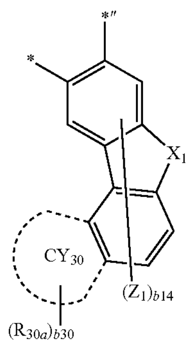
CY3-2D
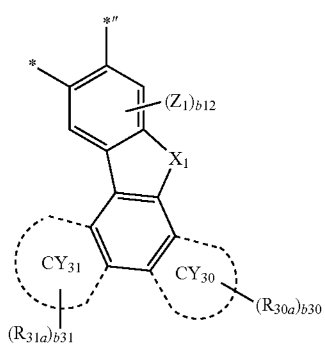
CY3-3A
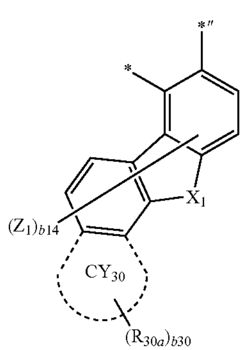
-continued
CY3-3B
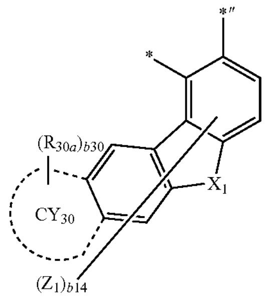
CY3-3C
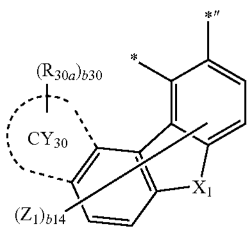
CY3-3D
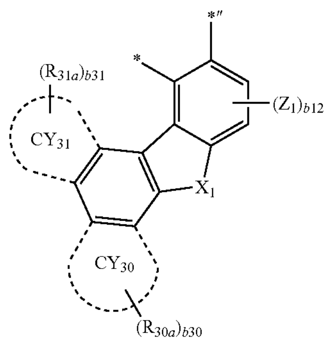
CY3-4A
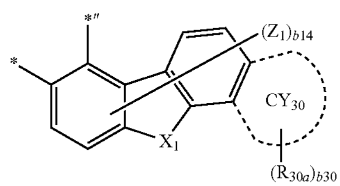
CY3-4B
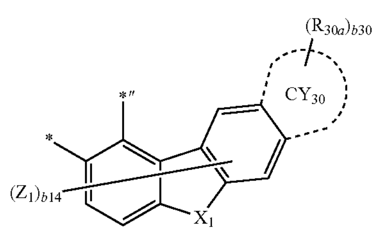
CY3-4C
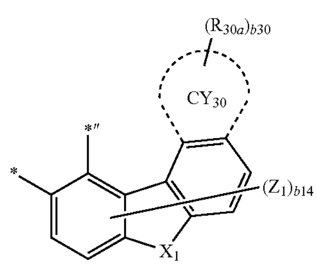

-continued

CY3-4D

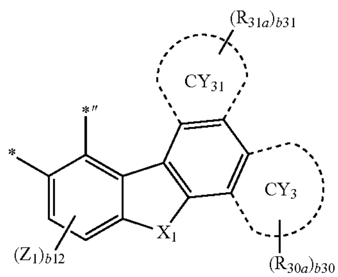

CY3-5A

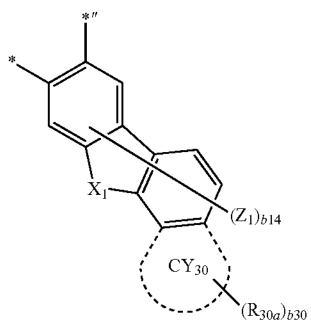

CY3-5B

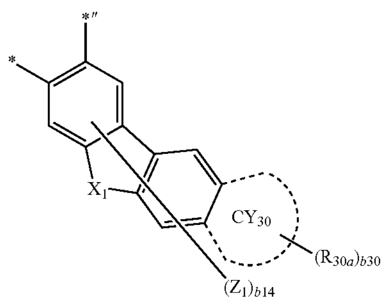

CY3-5C

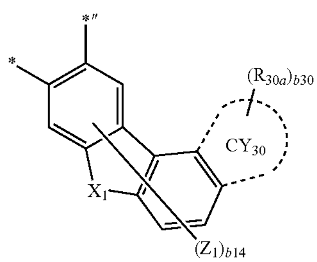

CY3-5D

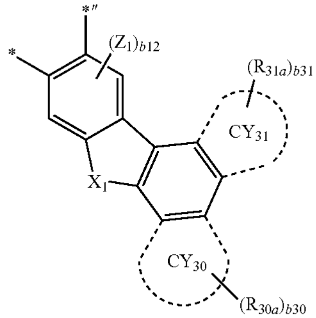

-continued

CY3-6A

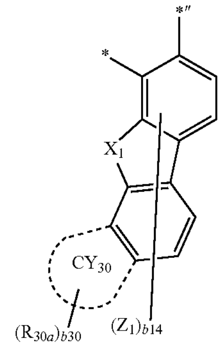

CY3-6B

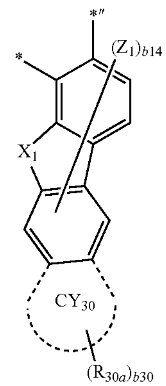

CY3-6C

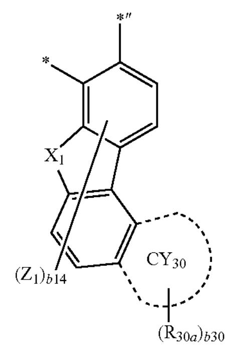

CY3-6D

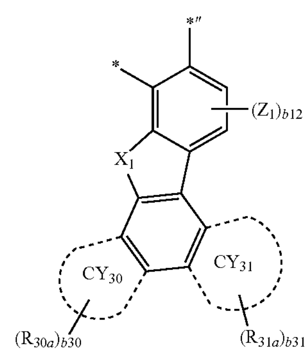

wherein, in Formulae CY3-1A to CY3-1D, CY3-2A to CY3-2D, CY3-3A to CY3-3D, CY3-4A to CY3-4D, CY3-5A to CY3-5D, and CY3-6A to CY3-6D, $X_1$ and $Z_1$ are the same as described in claim 1, ring $CY_{30}$ and ring $CY_{31}$ are each independently a $C_5$-$C_{30}$ carbocyclic group or a $C_1$-$C_{30}$ heterocyclic group, $R_{30a}$ and $R_{31a}$ are each the same as described in connection with $R_{10a}$ in claim 1, b12 may be an integer from 0 to 2, b14 may be an integer from 0 to 4, b30 and b31 may each independently be an integer from 0 to 20, when b30 is 2 or more, two or more $R_{30a}$(s) may be identical to or different from each other, and when b31 is 2 or more, two or more $R_{31a}$(s) may be identical to or different from each other,

* indicates a binding site to M in Formula 1, and

*" indicates a binding site to a neighboring atom in Formula 3.

10. The organometallic compound of claim 1, wherein a group represented by

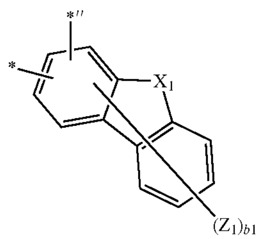

in Formula 3 is a group represented by one of Formulae CY3(1) to CY3(132):

CY3(1)

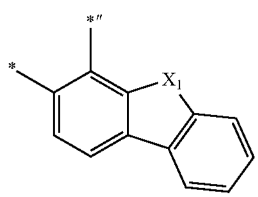

CY3(2)

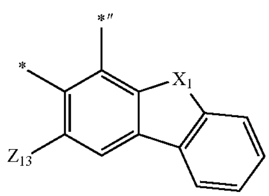

CY3(3)

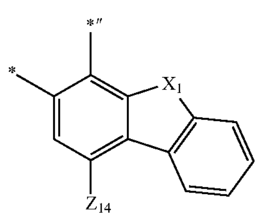

CY3(4)

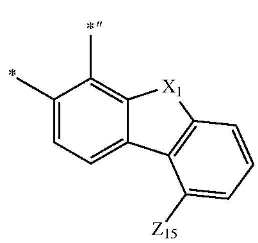

-continued

CY3(5)

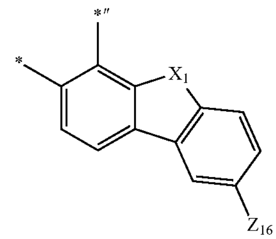

CY3(6)

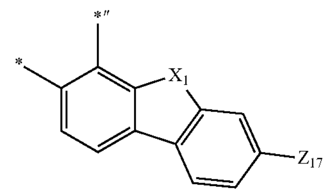

CY3(7)

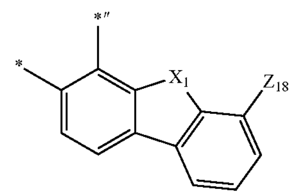

CY3(8)

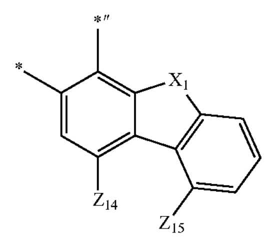

CY3(9)

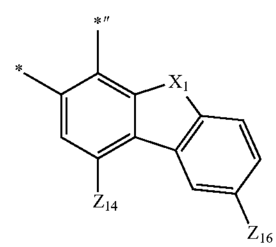

CY3(10)

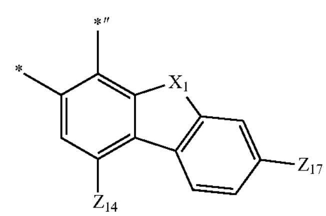

CY3(11)

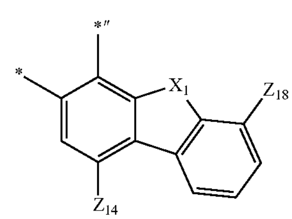

-continued
CY3(12)
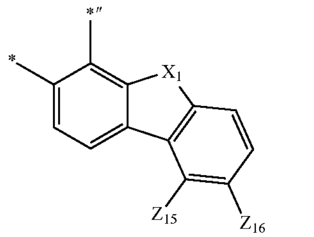
CY3(13)
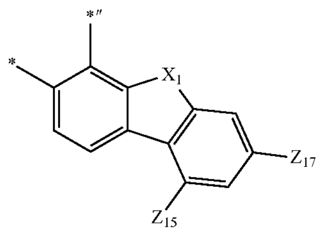
CY3(14)
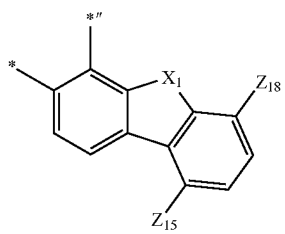
CY3(15)
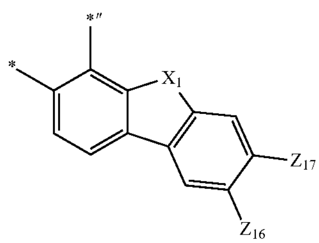
CY3(16)
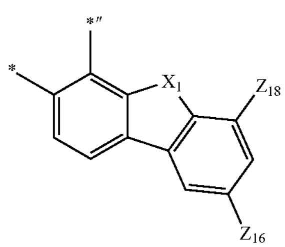
CY3(17)
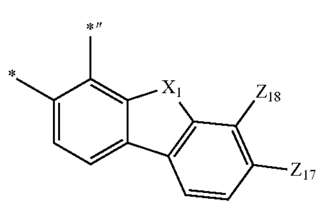
-continued
CY3(18)
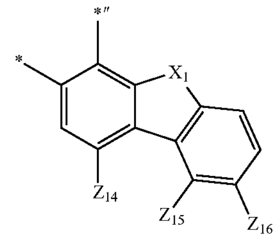
CY3(19)
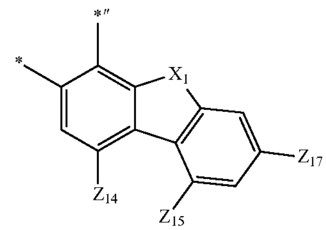
CY3(20)
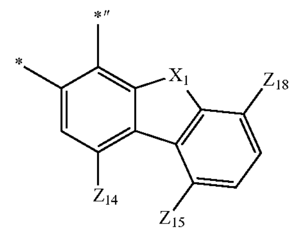
CY3(21)
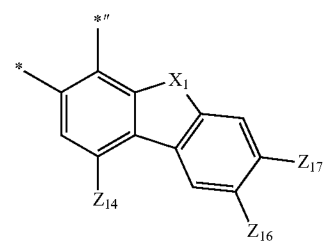
CY3(22)
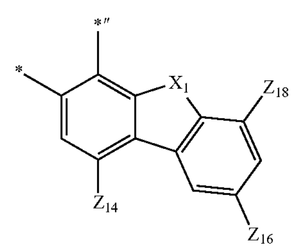
CY3(23)
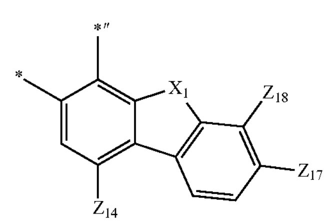

CY3(24)
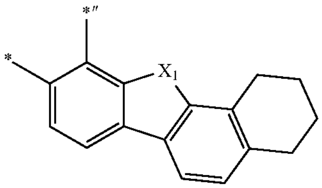
CY3(25)
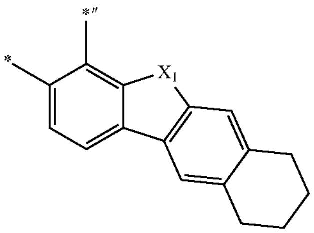
CY3(26)
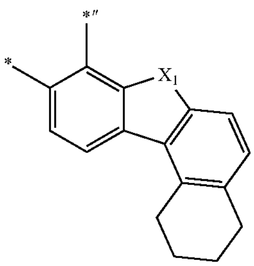
CY3(27)
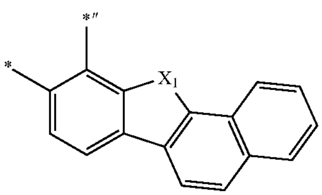
CY3(28)
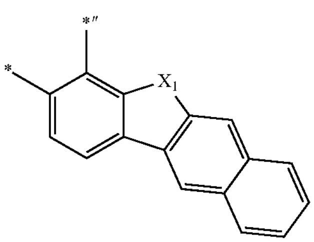
CY3(29)
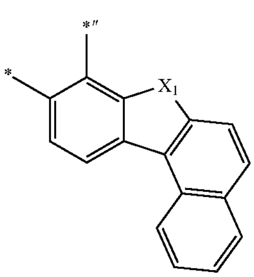
CY3(30)
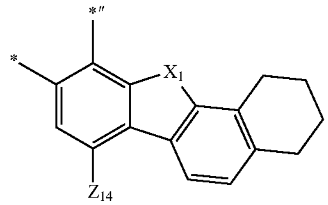
CY3(31)
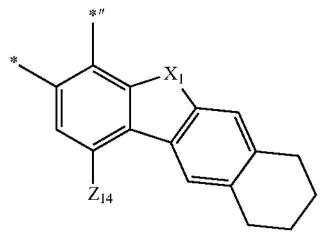
CY3(32)
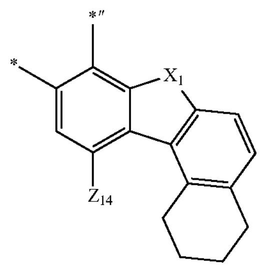
CY3(33)
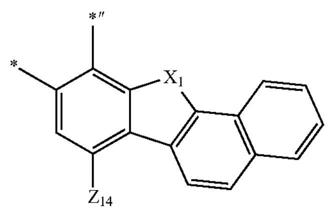
CY3(34)
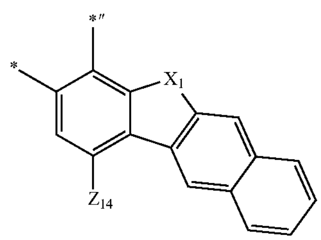
CY3(35)
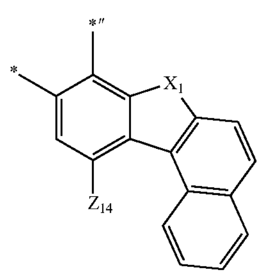

CY3(36)
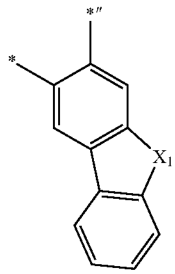
CY3(37)
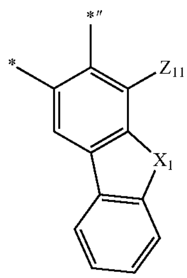
CY3(38)
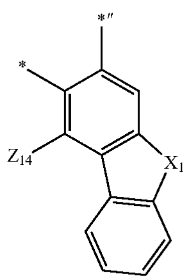
CY3(39)
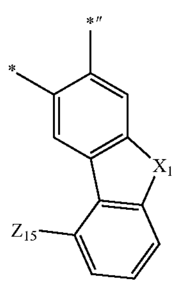
CY3(40)
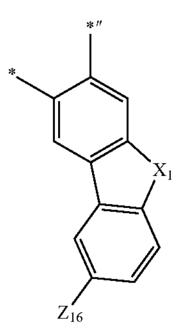
CY3(41)
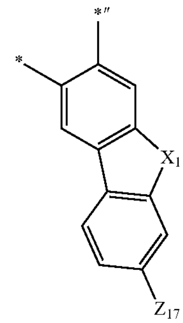
CY3(42)
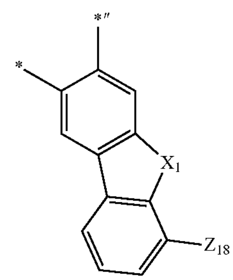
CY3(43)
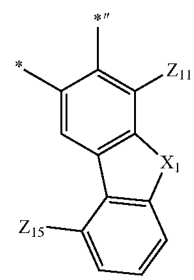
CY3(44)
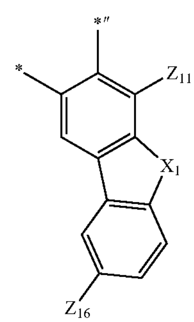
CY3(45)
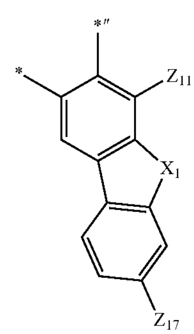

-continued
CY3(46)
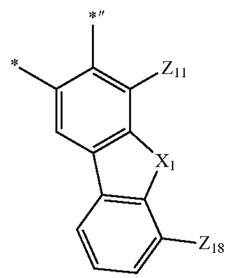
CY3(47)
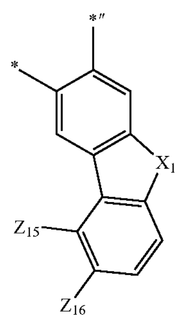
CY3(48)
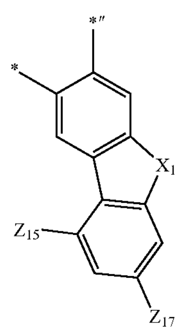
CY3(49)
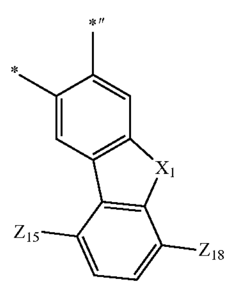
CY3(50)
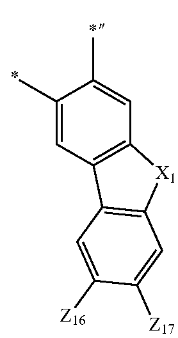
-continued
CY3(51)
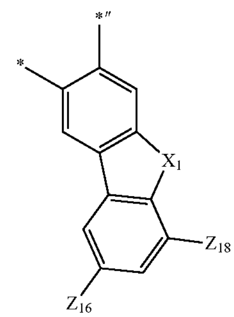
CY3(52)
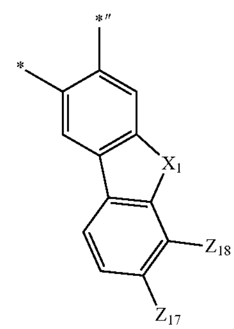
CY3(53)
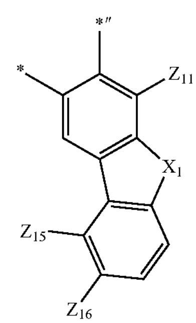
CY3(54)
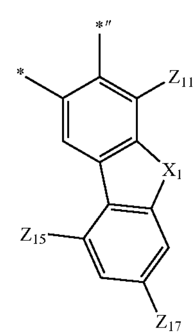
CY3(55)
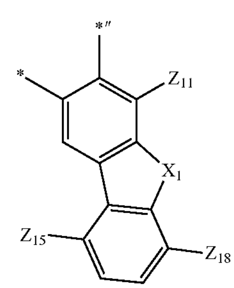

-continued
CY3(56)
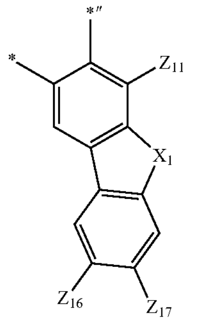
CY3(57)
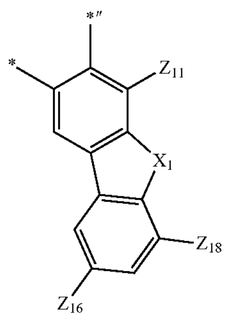
CY3(58)
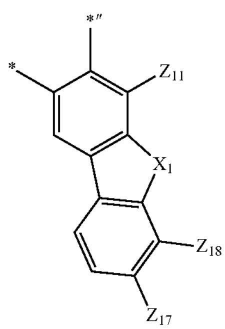
CY3(59)
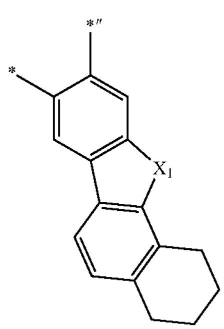
-continued
CY3(60)
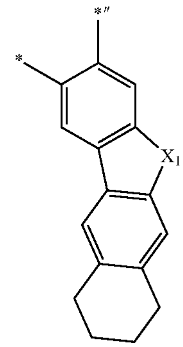
CY3(61)
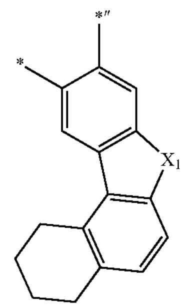
CY3(62)
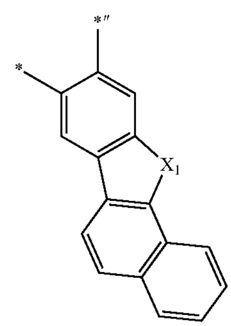
CY3(63)
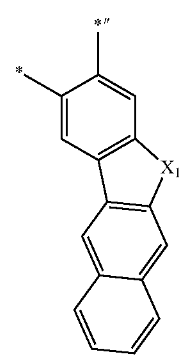

CY3(64)
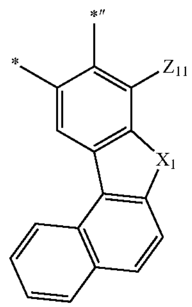
CY3(65)
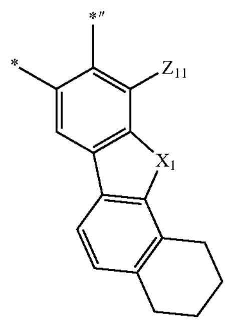
CY3(66)
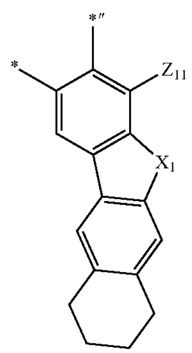
CY3(67)
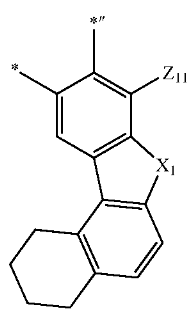
CY3(68
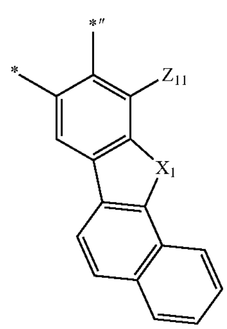
CY3(69)
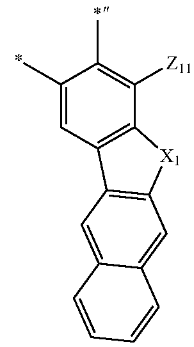
CY3(70)
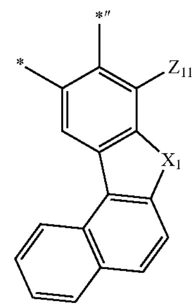
CY3(71)
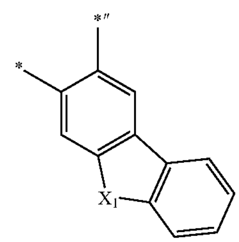
CY3(72)
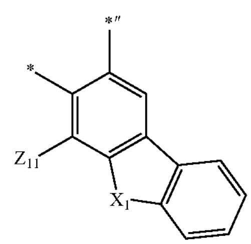
CY3(73)
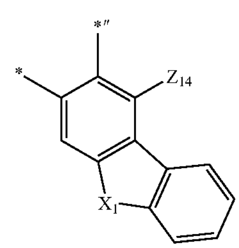

-continued
CY3(74)
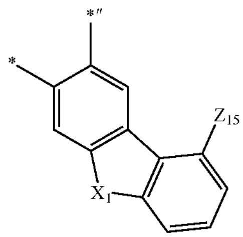
CY3(75)
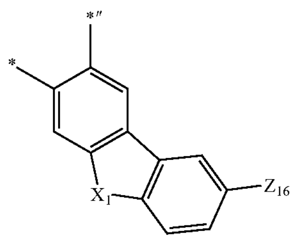
CY3(76)
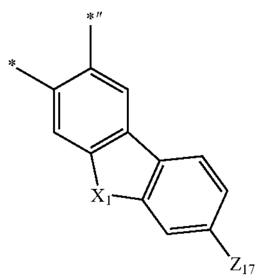
CY3(77)
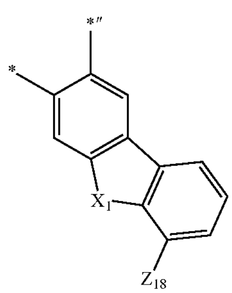
CY3(78)
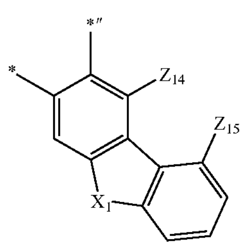
CY3(79)
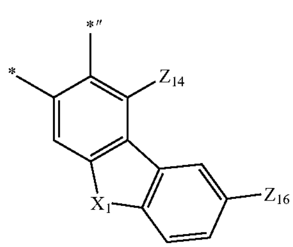
-continued
CY3(80)
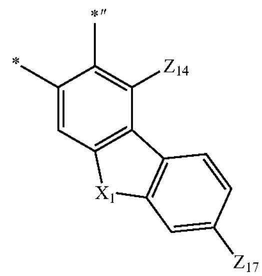
CY3(81)
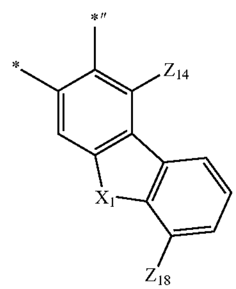
CY3(82)
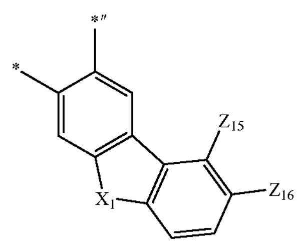
CY3(83)
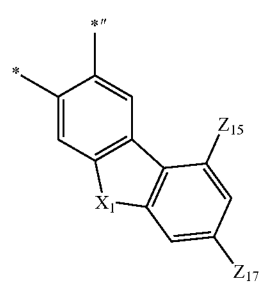
CY3(84)
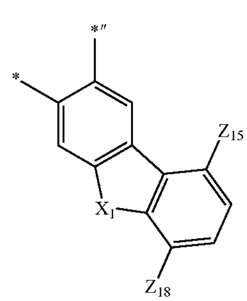

-continued
CY3(85)
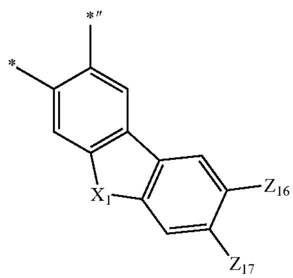
CY3(86)
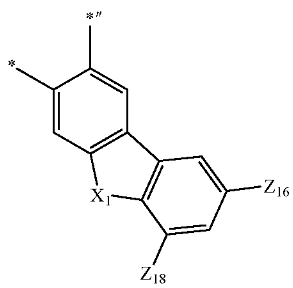
CY3(87)
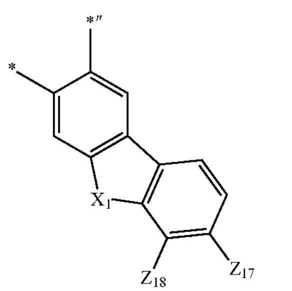
CY3(88)
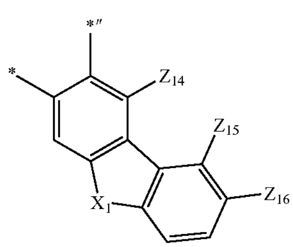
CY3(89)
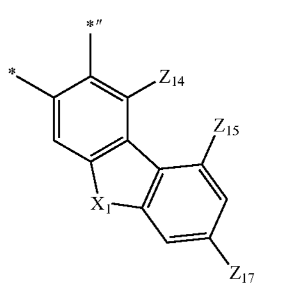
-continued
CY3(90)
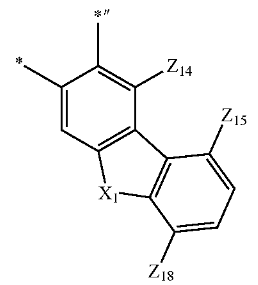
CY3(91)
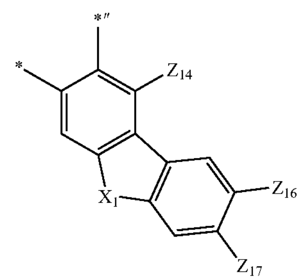
CY3(92)
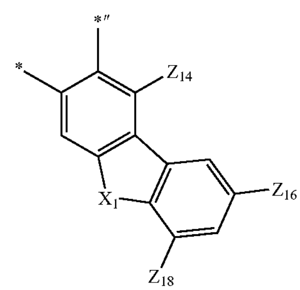
CY3(93)
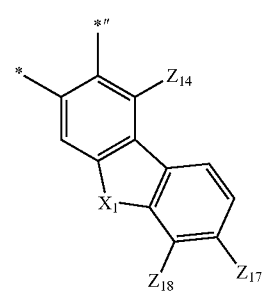
CY3(94)
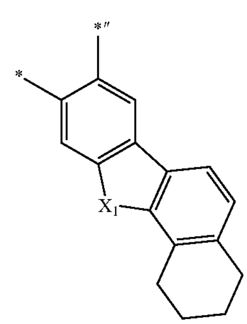

-continued
CY3(95)
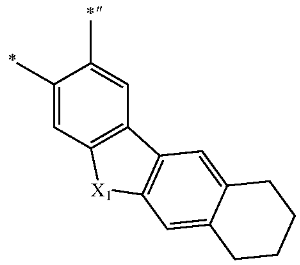
CY3(96)
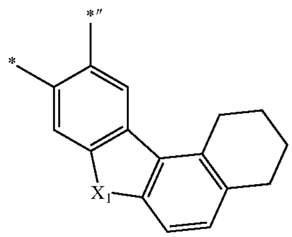
CY3(97)
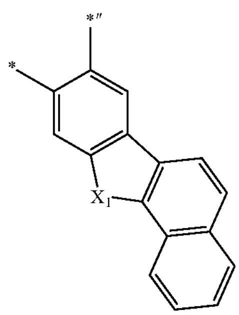
CY3(98)
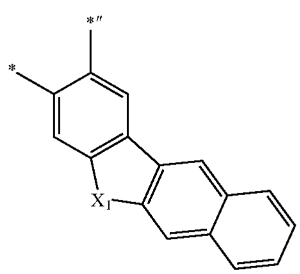
CY3(99)
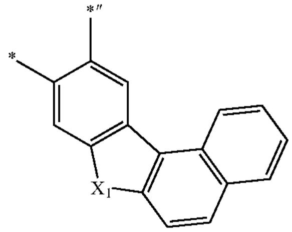
-continued
CY3(100)
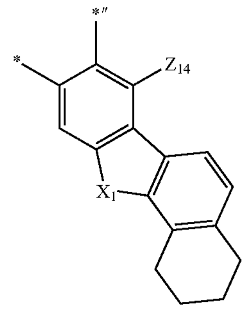
CY3(101)
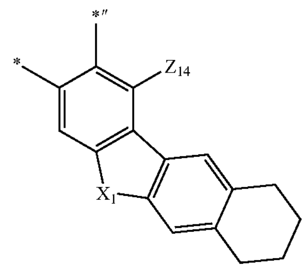
CY3(102)
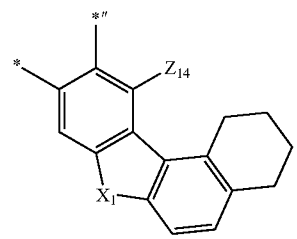
CY3(103)
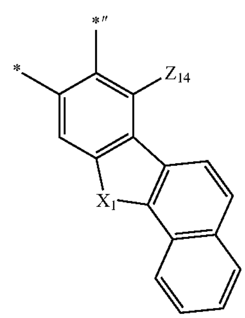
CY3(104)
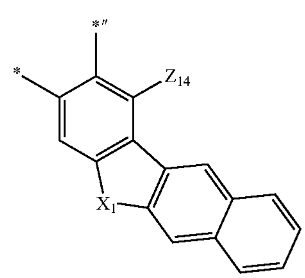

-continued
CY3(105)
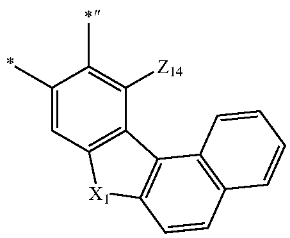
CY3(106)
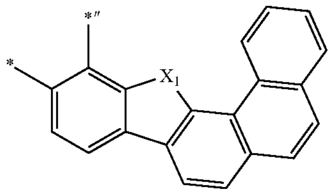
CY3(107)
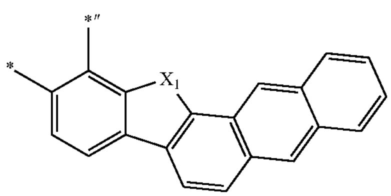
CY3(108)
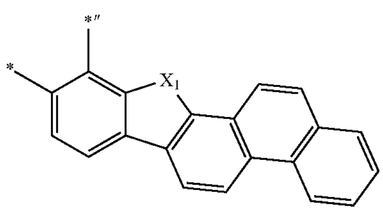
CY3(109)
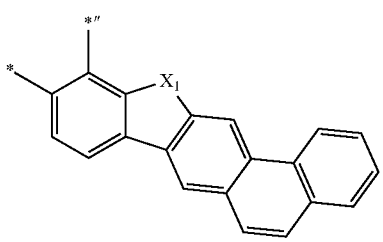
CY3(110)
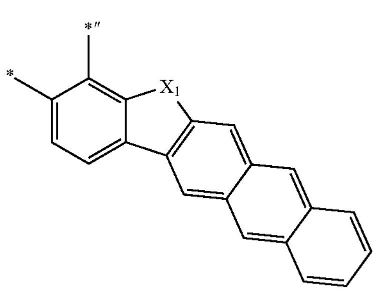
-continued
CY3(111)
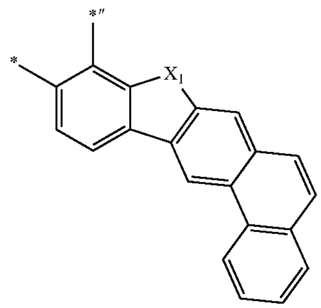
CY3(112)
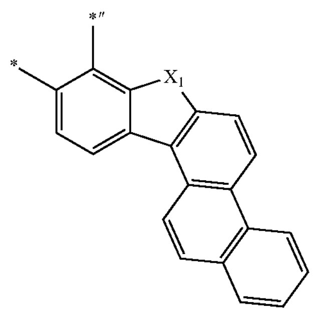
CY3(113)
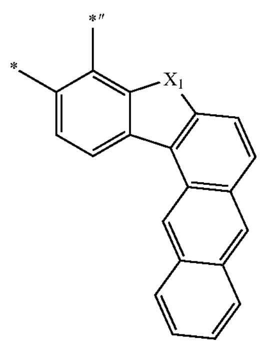
CY3(114)
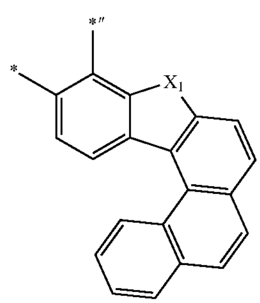
CY3(115)
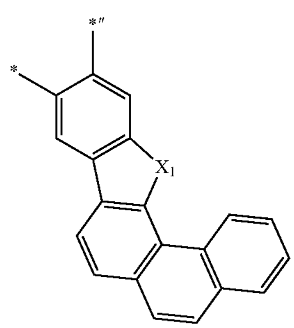

-continued
CY3(116)
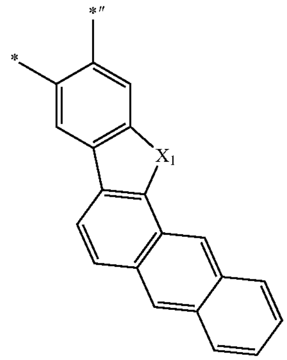
CY3(117)
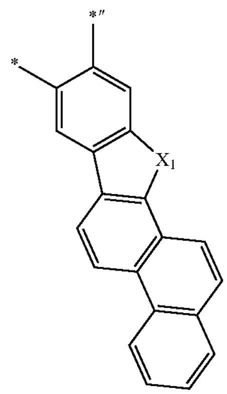
CY3(118)
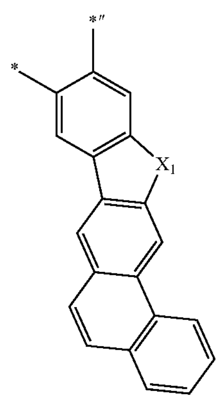
CY3(119)
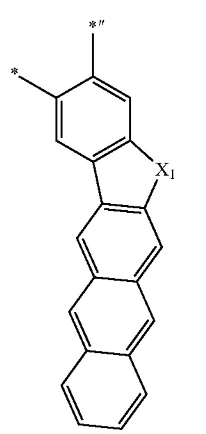
-continued
CY3(120)
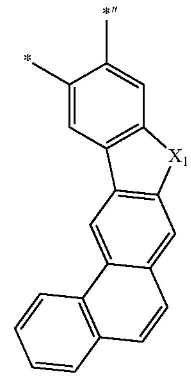
CY3(121)
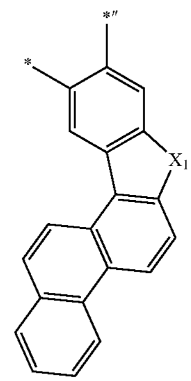
CY3(122)
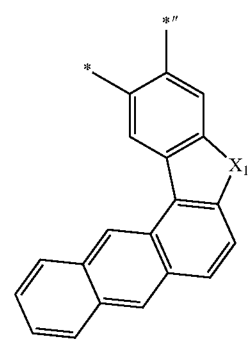
CY3(123)
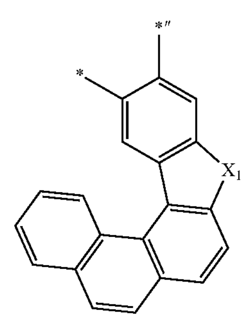

-continued
CY3(124)
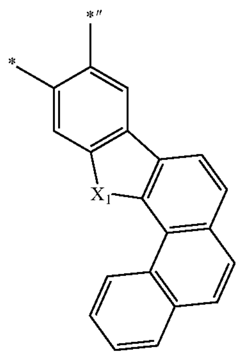
CY3(125)
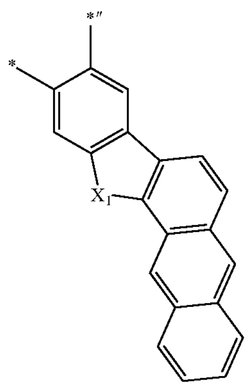
CY3(126)
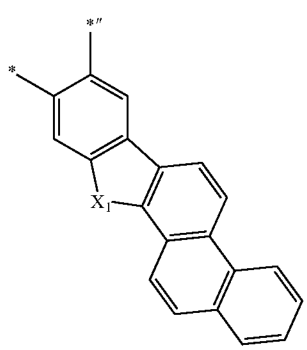
CY3(127)
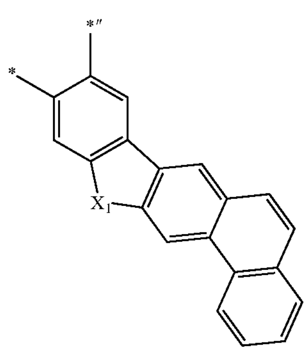
-continued
CY3(128)
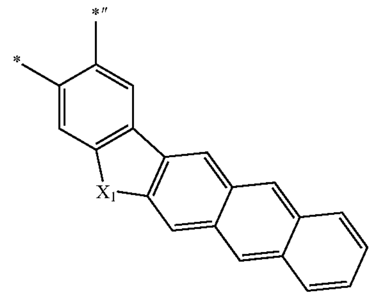
CY3(129)
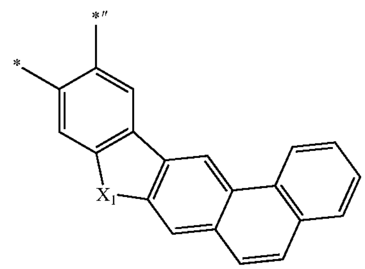
CY3(130)
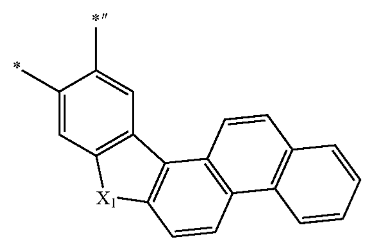
CY3(131)
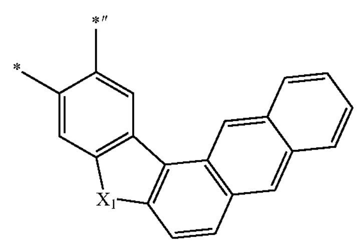
CY3(132)
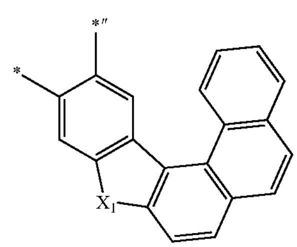
wherein, in Formulae CY3(1) to CY3(132),
$X_1$ is the same as described in claim 1,
$Z_{11}$ to $Z_{18}$ are the same as described in connection with $Z_1$ in claim 1, and each of $Z_{11}$ to $Z_{18}$ is not hydrogen,
* indicates a binding site to M in Formula 1, and
*" indicates a binding site to a neighboring atom in Formula 3.

11. The organometallic compound of claim 1, wherein a group represented by
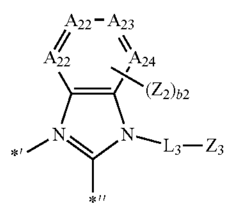
in Formula 3 is a group represented by one of Formulae CY4-1 to CY4-60:
CY4-1
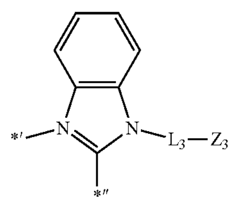
CY4-2
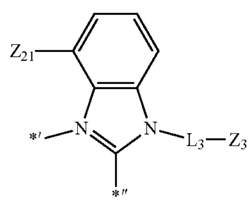
CY4-3
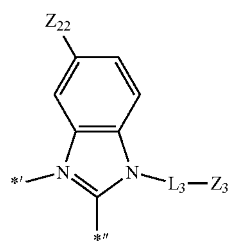
CY4-4
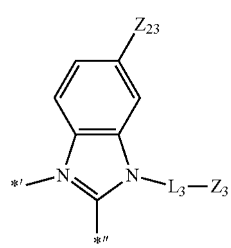
CY4-5
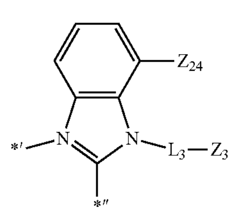
-continued
CY4-6
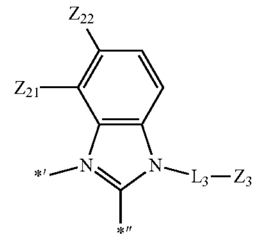
CY4-7
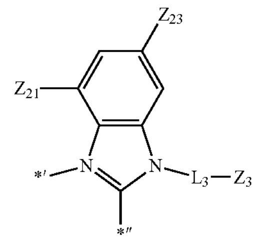
CY4-8
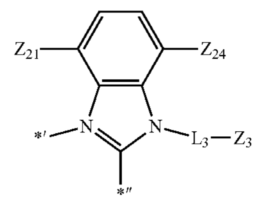
CY4-9
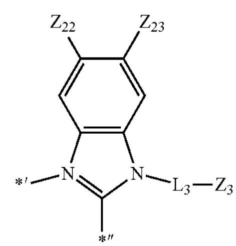
CY4-10
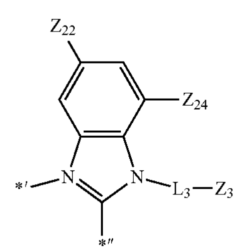
CY4-11
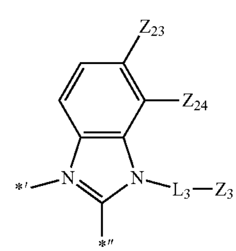

CY4-12
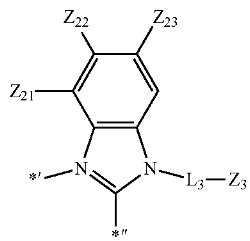
CY4-13
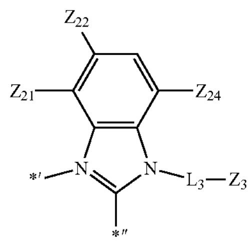
CY4-14
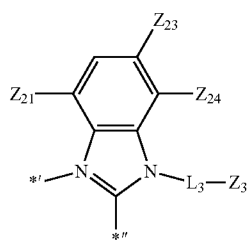
CY4-15
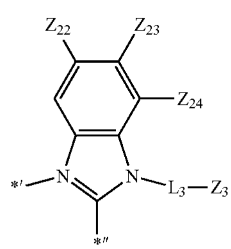
CY4-16
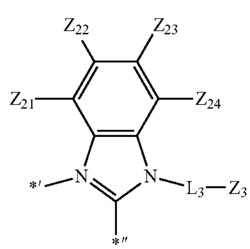
CY4-17
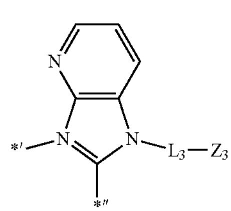
CY4-18
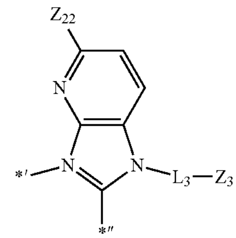
CY4-19
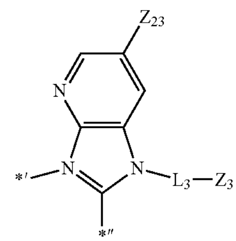
CY4-20
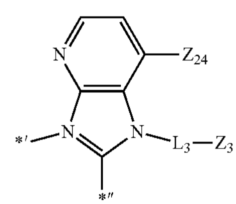
CY4-21
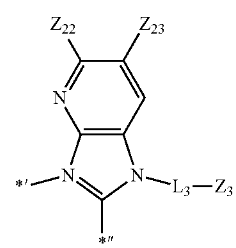
CY4-22
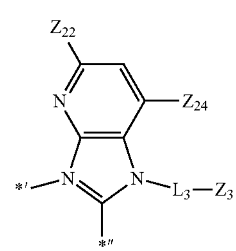
CY4-23
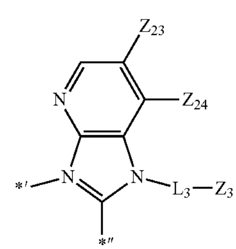

-continued
CY4-24
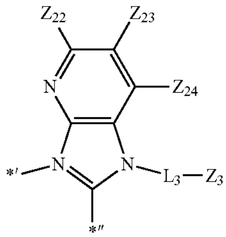
CY4-25
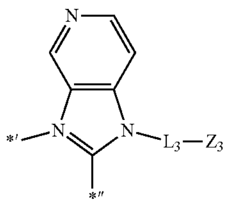
CY4-26
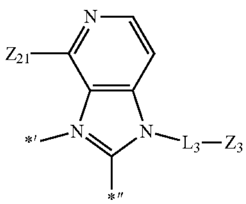
CY4-27
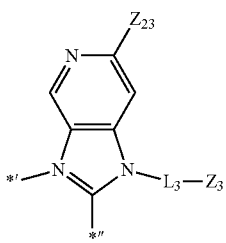
CY4-28
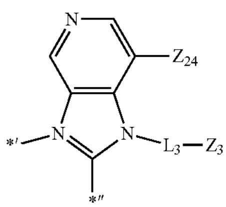
CY4-29
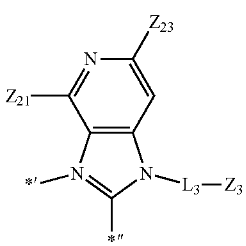
CY4-30
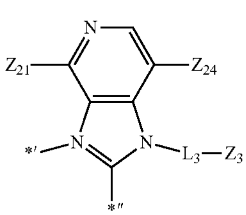
-continued
CY4-31
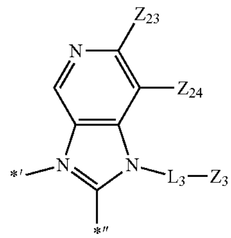
CY4-32
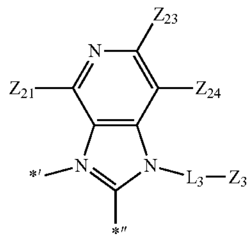
CY4-33
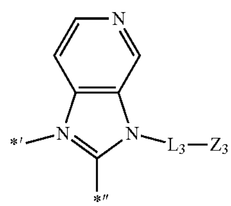
CY4-34
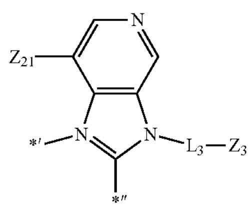
CY4-35
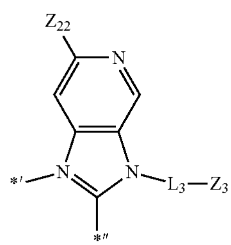
CY4-36
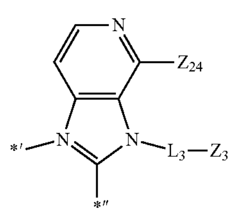
CY4-37
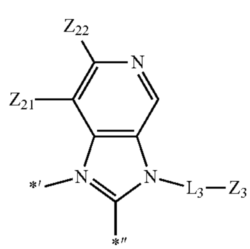

CY4-38
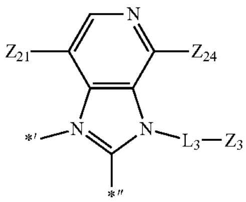
CY4-39
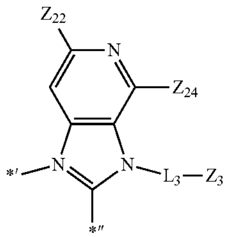
CY4-40
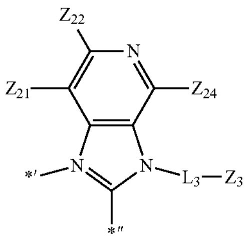
CY4-41
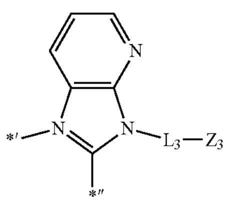
CY4-42
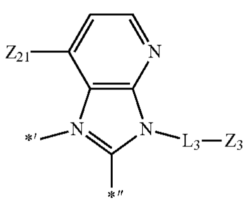
CY4-43
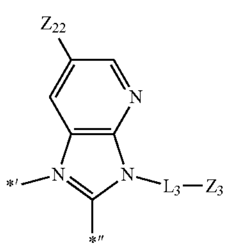
CY4-44
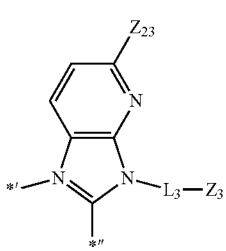
CY4-45
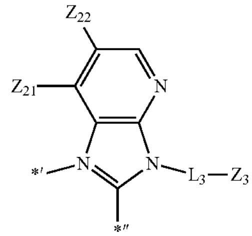
CY4-46
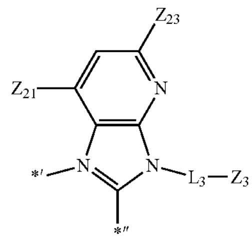
CY4-47
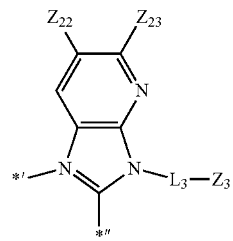
CY4-48
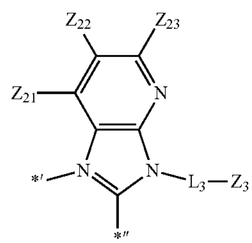
CY4-49
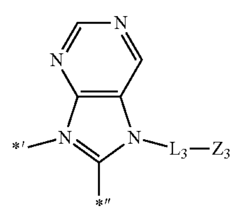
CY4-50
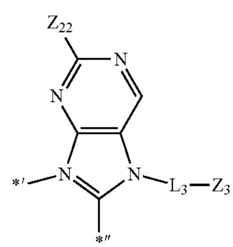
CY4-51
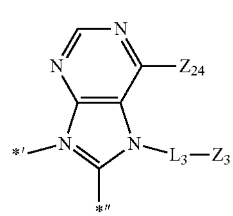

-continued

CY4-52

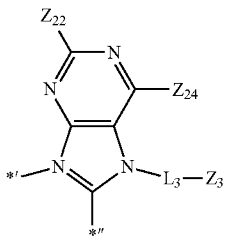

CY4-53

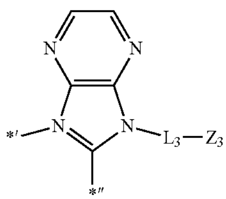

CY4-54

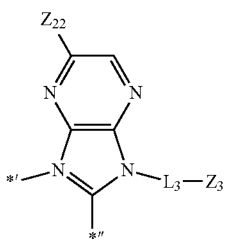

CY4-55

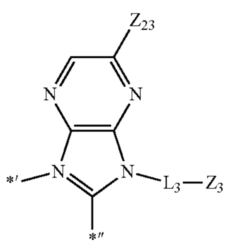

CY4-56

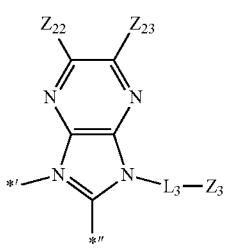

CY4-57

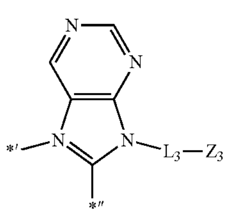

CY4-58

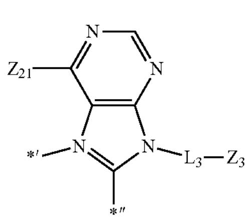

-continued

CY4-59

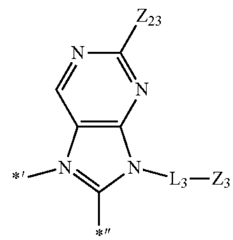

CY4-60

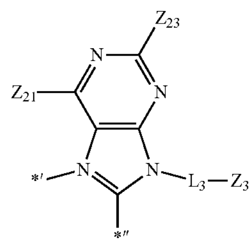

wherein, in Formulae CY4-1 to CY4-60, $L_3$ and $Z_3$ are the same as described in claim 1, $Z_{21}$ to $Z_{24}$ are the same as described in connection with $Z_2$ in claim 1, and each of $Z_{21}$ to $Z_{24}$ is not hydrogen,

*' indicates a binding site to M in Formula 1, and

*" indicates a binding site to a neighboring atom in Formula 3.

12. The organometallic compound of claim 1, wherein a group represented by

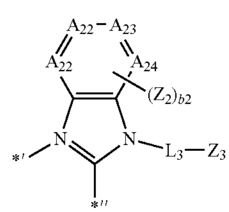

in Formula 3 is a group represented by one of Formulae CY4(1) to CY4(4):

CY4(1)

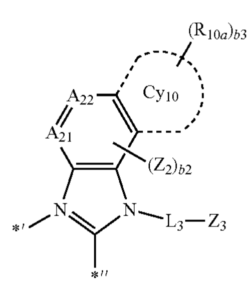

-continued

CY4(2)

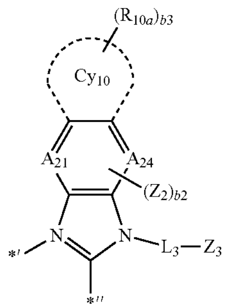

CY4(3)

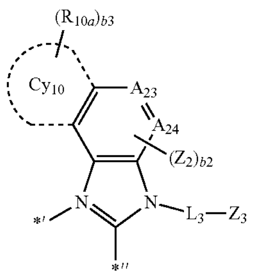

CY4(4)

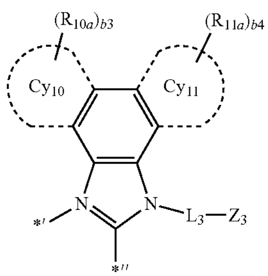

wherein, in Formulae CY4(1) to CY4(4), $A_{21}$ to $A_{24}$, $L_3$, $Z_2$, $Z_3$ and $R_{10a}$ are the same as described in claim 1, b22 is an integer from 0 to 2, ring $CY_{10}$ and ring $CY_{11}$ are each independently a $C_5$-$C_{30}$ carbocyclic group or a $C_1$-$C_{30}$ heterocyclic group, $R_{11a}$ is the same as described in connection with $R_{10a}$, b3 and b4 are each independently an integer from 0 to 20, when b3 is 2 or more, two or more $R_{10a}$(s) are identical to or different from each other, and when b4 is 2 or more, two or more $R_{11a}$(s) are identical to or different from each other,

*' indicates a binding site to M in Formula 1, and

*" indicates a binding site to a neighboring atom in Formula 3.

13. The organometallic compound of claim 1, wherein a group represented by

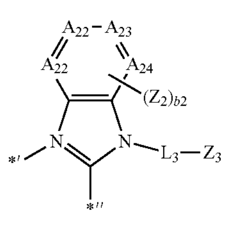

in Formula 3 is a group represented by one of Formulae CY4(1)-1 to CY4(1)-4, CY4(2)-1 to CY4(2)-4, CY4 (3)-1 to CY4(3)-4 and CY4(4)-1:

CY4(1)-1

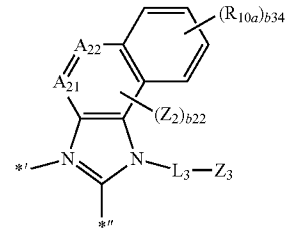

CY4(1)-2

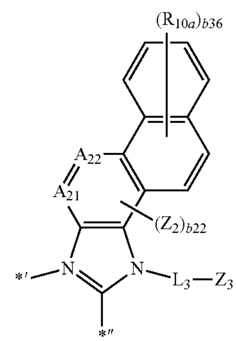

CY4(1)-3

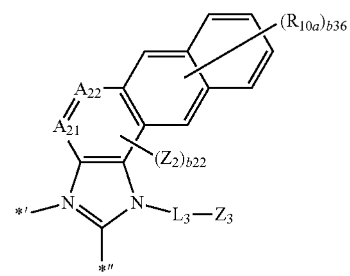

CY4(1)-4

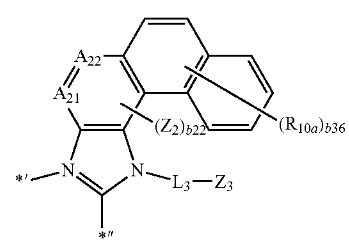

CY4(2)-1

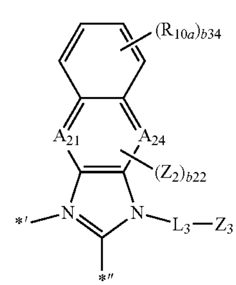

-continued

CY4(2)-2

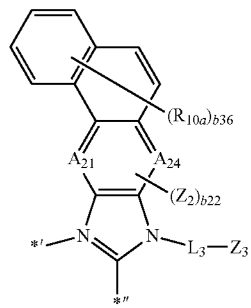

CY4(2)-3

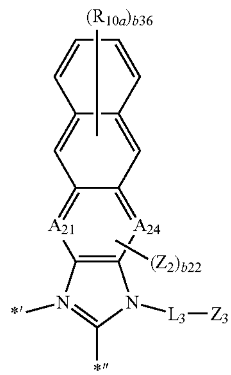

CY4(2)-4

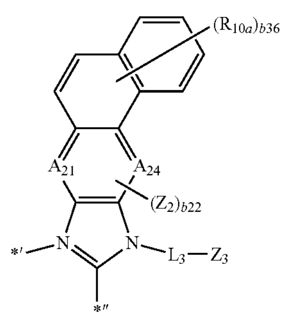

CY4(3)-1

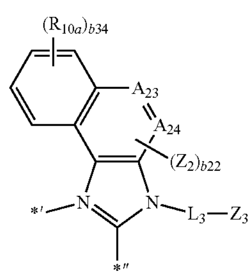

CY4(3)-2

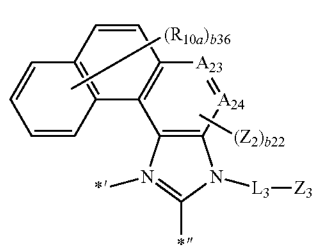

-continued

CY4(3)-3

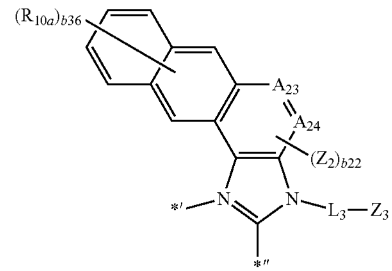

CY4(3)-4

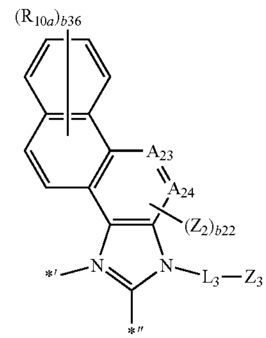

CY4(4)-1

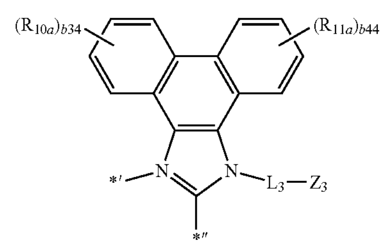

wherein, in Formulae CY4(1)-1 to CY4(1)-4, CY4(2)-1 to CY4(2)-4, CY4(3)-1 to CY4(3)-4 and CY4(4)-1, $A_{21}$ to $A_{24}$, $L_3$, $Z_2$, $Z_3$ and $R_{10a}$ are the same as described in claim 1, b22 is an integer from 0 to 2, $R_{11a}$ is the same as described in connection with $R_{10a}$, b34 and b44 may each independently be an integer from 0 to 4, when b34 is 2 or more, two or more $R_{10a}$(s) may be identical to or different from each other, and when b44 is 2 or more, two or more $R_{11a}$(s) may be identical to or different from each other, b36 may be an integer from 0 to 6, when b36 is 2 or more, two or more $R_{10a}$(s) may be identical to or different from each other,

*' indicates a binding site to M in Formula 1, and

*" indicates a binding site to a neighboring atom in Formula 3.

14. The organometallic compound of claim 1, wherein an absolute value of a difference of a highest occupied molecular orbital energy level of the organometallic compound and a lowest unoccupied molecular orbital energy level of the organometallic compound is about 3.48 eV and or more.

15. The organometallic compound of claim 1, wherein an absolute value of a difference of a highest occupied molecular orbital energy level of the organometallic compound and a lowest unoccupied molecular orbital energy level of the organometallic compound divided by $T_1$ energy level of the organometallic compound is about 1.364 eV and or more.

16. An organic light-emitting device comprising:

a first electrode;

a second electrode; and an organic layer located between the first electrode and the second electrode and comprising an emission layer, wherein the organic layer comprises at least one of the organometallic compound of claim 1.

17. The organic light-emitting device of claim 16, wherein the first electrode is an anode, the second electrode is a cathode, the organic layer comprises a hole transport region between the first electrode and the emission layer and an electron transport region between the emission layer and the second electrode, the hole transport region comprises a hole injection layer, a hole transport layer, an electron blocking layer, a buffer layer, or any combination thereof, and the electron transport region comprises a hole blocking layer, an electron transport layer, an electron injection layer, or any combination thereof.

18. The organic light-emitting device of claim 16, wherein the organometallic compound is included in the emission layer.

19. The organic light-emitting device of claim 18, wherein the emission layer emits green light.

20. The organic light-emitting device of claim 18, wherein the emission layer further comprises a host and the amount of the host is greater than the amount of the organometallic compound.

* * * * *